US012610732B2

(12) United States Patent
Thompson et al.

(10) Patent No.: US 12,610,732 B2
(45) **Date of Patent: *Apr. 21, 2026**

(54) ORGANIC ELECTROLUMINESCENT MATERIALS AND DEVICES

(71) Applicant: UNIVERSAL DISPLAY CORPORATION, Ewing, PA (US)

(72) Inventors: Nicholas J. Thompson, New Hope, PA (US); Morgan C. MacInnis, Yardley, PA (US); Hsiao-Fan Chen, Lawrence Township, NJ (US); Noah Horwitz, Mount Laurel, NJ (US); Peter Wolohan, Princeton Junction, NJ (US); Wystan Neil Palmer, Frenchtown, NJ (US); Elena Sheina, Langhorne, PA (US); Rasha Hamze, Philadelphia, PA (US)

(73) Assignee: UNIVERSAL DISPLAY CORPORATION, Ewing, NJ (US)

( * ) Notice: Subject to any disclaimer, the term of this patent is extended or adjusted under 35 U.S.C. 154(b) by 980 days.

This patent is subject to a terminal disclaimer.

(21) Appl. No.: 17/842,117

(22) Filed: Jun. 16, 2022

(65) Prior Publication Data

US 2023/0115552 A1 Apr. 13, 2023

Related U.S. Application Data

(63) Continuation-in-part of application No. 17/477,809, filed on Sep. 17, 2021.

(Continued)

(51) Int. Cl.
*H01L 51/00* (2006.01)
*C07F 15/00* (2006.01)
(Continued)

(52) U.S. Cl.
CPC ....... *H10K 85/346* (2023.02); *C07F 15/0086* (2013.01); *C09K 11/06* (2013.01);
(Continued)

(58) Field of Classification Search
CPC .......................... C07F 15/0086; H10K 85/346
See application file for complete search history.

(56) References Cited

U.S. PATENT DOCUMENTS 4,769,292 A 9/1988 Tang et al.
5,061,569 A 10/1991 VanSlyke et al.
(Continued)

FOREIGN PATENT DOCUMENTS

CN 115448932 12/2022
EP 0650955 5/1995
(Continued)

OTHER PUBLICATIONS

English translation of WO 2007/058255, pp. 1-34.*
(Continued)

*Primary Examiner* — Alexander C Kollias
(74) *Attorney, Agent, or Firm* — DUANE MORRIS LLP

(57) ABSTRACT

Provided are organometallic compounds that include a ligand $L_A$ of
(Continued)

Formula I

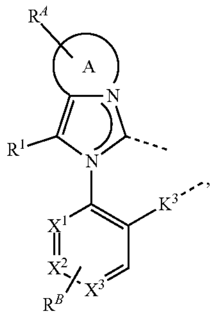

or

Formula II

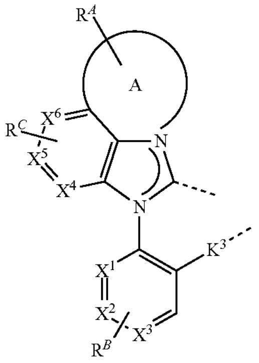

that are useful as emitters in OLEDs. Also provided are formulations comprising these organometallic compounds. Further provided are OLEDs and related consumer products that utilize these organometallic compounds.

20 Claims, 2 Drawing Sheets

Related U.S. Application Data

(60) Provisional application No. 63/193,755, filed on May 27, 2021, provisional application No. 63/087,062, filed on Oct. 2, 2020.

(51) Int. Cl.
*C09K 11/06* (2006.01)
*H10K 85/30* (2023.01)
*H10K 50/11* (2023.01)
*H10K 101/10* (2023.01)

(52) U.S. Cl.
CPC *C09K 2211/1044* (2013.01); *C09K 2211/185* (2013.01); *H10K 50/11* (2023.02); *H10K 2101/10* (2023.02)

(56) References Cited

U.S. PATENT DOCUMENTS

| | | | |
|---|---|---|---|
| 5,247,190 | A | 9/1993 | Friend et al. |
| 5,703,436 | A | 12/1997 | Forrest et al. |
| 5,707,745 | A | 1/1998 | Forrest et al. |
| 5,834,893 | A | 11/1998 | Bulovic et al. |
| 5,844,363 | A | 12/1998 | Gu et al. |
| 6,013,982 | A | 1/2000 | Thompson et al. |
| 6,087,196 | A | 7/2000 | Sturm et al. |
| 6,091,195 | A | 7/2000 | Forrest et al. |
| 6,097,147 | A | 8/2000 | Baldo et al. |
| 6,294,398 | B1 | 9/2001 | Kim et al. |
| 6,303,238 | B1 | 10/2001 | Thompson et al. |
| 6,337,102 | B1 | 1/2002 | Forrest et al. |
| 6,468,819 | B1 | 10/2002 | Kim et al. |
| 6,528,187 | B1 | 3/2003 | Okada |
| 6,687,266 | B1 | 2/2004 | Ma et al. |
| 6,835,469 | B2 | 12/2004 | Kwong et al. |
| 6,921,915 | B2 | 7/2005 | Takiguchi et al. |
| 7,087,321 | B2 | 8/2006 | Kwong et al. |
| 7,090,928 | B2 | 8/2006 | Thompson et al. |
| 7,154,114 | B2 | 12/2006 | Brooks et al. |
| 7,250,226 | B2 | 7/2007 | Tokito et al. |
| 7,279,704 | B2 | 10/2007 | Walters et al. |
| 7,332,232 | B2 | 2/2008 | Ma et al. |
| 7,338,722 | B2 | 3/2008 | Thompson et al. |
| 7,393,599 | B2 | 7/2008 | Thompson et al. |
| 7,396,598 | B2 | 7/2008 | Takeuchi et al. |
| 7,431,968 | B1 | 10/2008 | Shtein et al. |
| 7,445,855 | B2 | 11/2008 | Mackenzie et al. |
| 7,534,505 | B2 | 5/2009 | Lin et al. |
| 2002/0034656 | A1 | 3/2002 | Thompson et al. |
| 2002/0134984 | A1 | 9/2002 | Igarashi |
| 2002/0158242 | A1 | 10/2002 | Son et al. |
| 2003/0138657 | A1 | 7/2003 | Li et al. |
| 2003/0152802 | A1 | 8/2003 | Tsuboyama et al. |
| 2003/0162053 | A1 | 8/2003 | Marks et al. |
| 2003/0175553 | A1 | 9/2003 | Thompson et al. |
| 2003/0230980 | A1 | 12/2003 | Forrest et al. |
| 2004/0036077 | A1 | 2/2004 | Ise |
| 2004/0137267 | A1 | 7/2004 | Igarashi et al. |
| 2004/0137268 | A1 | 7/2004 | Igarashi et al. |
| 2004/0174116 | A1 | 9/2004 | Lu et al. |
| 2005/0025993 | A1 | 2/2005 | Thompson et al. |
| 2005/0112407 | A1 | 5/2005 | Ogasawara et al. |
| 2005/0238919 | A1 | 10/2005 | Ogasawara |
| 2005/0244673 | A1 | 11/2005 | Satoh et al. |
| 2005/0260441 | A1 | 11/2005 | Thompson et al. |
| 2005/0260449 | A1 | 11/2005 | Walters et al. |
| 2006/0008670 | A1 | 1/2006 | Lin et al. |
| 2006/0202194 | A1 | 9/2006 | Jeong et al. |
| 2006/0240279 | A1 | 10/2006 | Adamovich et al. |
| 2006/0251923 | A1 | 11/2006 | Lin et al. |
| 2006/0263635 | A1 | 11/2006 | Ise |
| 2006/0280965 | A1 | 12/2006 | Kwong et al. |
| 2007/0190359 | A1 | 8/2007 | Knowles et al. |
| 2007/0278938 | A1 | 12/2007 | Yabunouchi et al. |
| 2008/0015355 | A1 | 1/2008 | Schafer et al. |
| 2008/0018221 | A1 | 1/2008 | Egen et al. |
| 2008/0106190 | A1 | 5/2008 | Yabunouchi et al. |
| 2008/0124572 | A1 | 5/2008 | Mizuki et al. |
| 2008/0220265 | A1 | 9/2008 | Xia et al. |
| 2008/0233410 | A1 | 9/2008 | Mashima |
| 2008/0297033 | A1 | 12/2008 | Knowles et al. |
| 2009/0008605 | A1 | 1/2009 | Kawamura et al. |
| 2009/0009065 | A1 | 1/2009 | Nishimura et al. |
| 2009/0017330 | A1 | 1/2009 | Iwakuma et al. |
| 2009/0030202 | A1 | 1/2009 | Iwakuma et al. |
| 2009/0039776 | A1 | 2/2009 | Yamada et al. |
| 2009/0045730 | A1 | 2/2009 | Nishimura et al. |
| 2009/0045731 | A1 | 2/2009 | Nishimura et al. |
| 2009/0101870 | A1 | 4/2009 | Prakash et al. |
| 2009/0108737 | A1 | 4/2009 | Kwong et al. |
| 2009/0115316 | A1 | 5/2009 | Zheng et al. |
| 2009/0165846 | A1 | 7/2009 | Johannes et al. |
| 2009/0167162 | A1 | 7/2009 | Lin et al. |
| 2009/0179554 | A1 | 7/2009 | Kuma et al. |
| 2010/0237334 | A1* | 9/2010 | Ma .................... H10K 85/6576 546/281.1 |
| 2011/0253988 | A1 | 10/2011 | Molt |
| 2015/0105556 | A1 | 4/2015 | Li |
| 2015/0129840 | A1 | 5/2015 | Tsai |
| 2015/0171350 | A1 | 6/2015 | Strassner |
| 2019/0280222 | A1 | 9/2019 | Kim et al. |

FOREIGN PATENT DOCUMENTS

| | | |
|---|---|---|
| EP | 1725079 | 11/2006 |
| EP | 2034538 | 3/2009 |
| JP | 2007123392 | 5/2007 |
| JP | 2007254297 | 10/2007 |

(56) References Cited

FOREIGN PATENT DOCUMENTS

| | | |
|---|---|---|
| JP | 2008074939 | 4/2008 |
| JP | 2014170820 | 9/2014 |
| JP | 2014197607 | 10/2014 |
| WO | 01/39234 | 5/2001 |
| WO | 02/02714 | 1/2002 |
| WO | 02015654 | 2/2002 |
| WO | 03040257 | 5/2003 |
| WO | 03060956 | 7/2003 |
| WO | 2004093207 | 10/2004 |
| WO | 2004107822 | 12/2004 |
| WO | 200511610 | 1/2005 |
| WO | 2005014551 | 2/2005 |
| WO | 2005019373 | 3/2005 |
| WO | 2005030900 | 4/2005 |
| WO | 2005089025 | 9/2005 |
| WO | 2005123873 | 12/2005 |
| WO | 2006009024 | 1/2006 |
| WO | 2006056418 | 6/2006 |
| WO | 2006072002 | 7/2006 |
| WO | 2006082742 | 8/2006 |
| WO | 2006098120 | 9/2006 |
| WO | 2006100298 | 9/2006 |
| WO | 2006103874 | 10/2006 |
| WO | 2006114966 | 11/2006 |
| WO | 2006132173 | 12/2006 |
| WO | 2007002683 | 1/2007 |
| WO | 2007004380 | 1/2007 |
| WO | 2007058255 | 5/2007 |
| WO | 2007063754 | 6/2007 |
| WO | 2007063796 | 6/2007 |
| WO | 2008056746 | 5/2008 |
| WO | 2008101842 | 8/2008 |
| WO | 2008132085 | 11/2008 |
| WO | 2009000673 | 12/2008 |
| WO | 2009003898 | 1/2009 |
| WO | 2009008311 | 1/2009 |
| WO | 2009018009 | 2/2009 |
| WO | 2009021126 | 2/2009 |
| WO | 2009050290 | 4/2009 |
| WO | 2009062578 | 5/2009 |
| WO | 2009063833 | 5/2009 |
| WO | 2009066778 | 5/2009 |
| WO | 2009066779 | 5/2009 |
| WO | 2009086028 | 7/2009 |
| WO | 2009100991 | 8/2009 |
| WO | 2012004765 | 1/2012 |
| WO | 2012020327 | 2/2012 |

OTHER PUBLICATIONS

Adachi, Chihaya et al., "Organic Electroluminescent Device Having a Hole Conductor as an Emitting Layer," Appl. Phys. Lett., 55(15): 1489-1491 (1989).

Adachi, Chihaya et al., "Nearly 100% Internal Phosphorescence Efficiency in an Organic Light Emitting Device," J. Appl. Phys., 90(10): 5048-5051 (2001).

Adachi, Chihaya et al., "High-Efficiency Red Electrophosphorescence Devices," Appl. Phys. Lett., 78(11)1622-1624 (2001).

Aonuma, Masaki et al., "Material Design of Hole Transport Materials Capable of Thick-Film Formation in Organic Light Emitting Diodes," Appl. Phys. Lett., 90, Apr. 30, 2007, 183503-1-183503-3.

Baldo et al., Highly Efficient Phosphorescent Emission from Organic Electroluminescent Devices, Nature, vol. 395, 151-154, (1998).

Baldo et al., Very high-efficiency green organic light-emitting devices based on electrophosphorescence, Appl. Phys. Lett., vol. 75, No. 1, 4-6 (1999).

Gao, Zhiqiang et al., "Bright-Blue Electroluminescence From a Silyl-Substituted ter-(phenylene-vinylene) derivative," Appl. Phys. Lett., 74(6): 865-867 (1999).

Guo, Tzung-Fang et al., "Highly Efficient Electrophosphorescent Polymer Light-Emitting Devices," Organic Electronics, 1: 15-20 (2000).

Hamada, Yuji et al., "High Luminance in Organic Electroluminescent Devices with Bis(10-hydroxybenzo[h]quinolinato) beryllium as an Emitter," Chem. Lett., 905-906 (1993).

Holmes, R.J. et al., "Blue Organic Electrophosphorescence Using Exothermic Host-Guest Energy Transfer," Appl. Phys. Lett., 82(15):2422-2424 (2003).

Hu, Nan-Xing et al., "Novel High Tg Hole-Transport Molecules Based on Indolo[3,2-b]carbazoles for Organic Light-Emitting Devices," Synthetic Metals, 111-112:421-424 (2000).

Huang, Jinsong et al., "Highly Efficient Red-Emission Polymer Phosphorescent Light-Emitting Diodes Based on Two Novel Tris(1-phenylisoquinolinato-C2,N)iridium(III) Derivatives," Adv. Mater., 19:739-743 (2007).

Huang, Wei-Sheng et al., "Highly Phosphorescent Bis-Cyclometalated Iridium Complexes Containing Benzoimidazole-Based Ligands," Chem. Mater., 16(12):2480-2488 (2004).

Hung, L.S. et al., "Anode Modification in Organic Light-Emitting Diodes by Low-Frequency Plasma Polymerization of CHF3," Appl. Phys. Lett., 78(5):673-675 (2001).

Ikai, Masamichi et al., "Highly Efficient Phosphorescence From Organic Light-Emitting Devices with an Exciton-Block Layer," Appl. Phys. Lett., 79(2):156-158 (2001).

Ikeda, Hisao et al., "P-185 Low-Drive-Voltage OLEDs with a Buffer Layer Having Molybdenum Oxide," SID Symposium Digest, 37:923-926 (2006).

Inada, Hiroshi and Shirota, Yasuhiko, "1,3,5-Tris[4-(diphenylamino)phenyl]benzene and its Methylsubstituted Derivatives as a Novel Class of Amorphous Molecular Materials," J. Mater. Chem., 3(3):319-320 (1993).

Kanno, Hiroshi et al., "Highly Efficient and Stable Red Phosphorescent Organic Light-Emitting Device Using bis[2-(2-benzothiazoyl)phenolato]zinc(II) as host material," Appl. Phys. Lett., 90:123509-1-123509-3 (2007).

Kido, Junji et al., 1,2,4-Triazole Derivative as an Electron Transport Layer in Organic Electroluminescent Devices, Jpn. J. Appl. Phys., 32:L917-L920 (1993).

Kuwabara, Yoshiyuki et al., "Thermally Stable Multilayered Organic Electroluminescent Devices Using Novel Starburst Molecules, 4,4',4"-Tri(N-carbazolyl)triphenylamine (TCTA) and 4,4',4"-Tris(3-methylphenylphenyl-amino) triphenylamine (m-MTDATA), as Hole-Transport Materials," Adv. Mater., 6(9):677-679 (1994).

Kwong, Raymond C. et al., "High Operational Stability of Electrophosphorescent Devices," Appl. Phys. Lett., 8(1) 162-164 (2002).

Lamansky, Sergey et al., "Synthesis and Characterization of Phosphorescent Cyclometalated Iridium Complexes," Inorg. Chem., 40(7):1704-1711 (2001).

Lee, Chang-Lyoul et al., "Polymer Phosphorescent Light-Emitting Devices Doped with Tris(2-phenylpyridine) Iridium as a Triplet Emitter," Appl. Phys. Lett., 77(15):2280-2282 (2000).

Lo, Shih-Chun et al., "Blue Phosphorescence from Iridium(III) Complexes at Room Temperature," Chem. Mater., 18(21)5119-5129 (2006).

Ma, Yuguang et al., "Triplet Luminescent Dinuclear-Gold(I) Complex-Based Light-Emitting Diodes with Low Turn-On voltage," Appl. Phys. Lett., 74(10):1361-1363 (1999).

Mi, Bao-Xiu et al., "Thermally Stable Hole-Transporting Material for Organic Light-Emitting Diode an Isoindole Derivative," Chem. Mater., 15(16):3148-3151 (2003).

Nishida, Jun-ichi et al., "Preparation, Characterization, and Electroluminescence Characteristics of α-Diimine-type Platinum(II) Complexes with Perfluorinated Phenyl Groups as Ligands," Chem. Lett., 34(4): 592-593 (2005).

Niu, Yu-Hua et al., "Highly Efficient Electrophosphorescent Devices with Saturated Red Emission from a Neutral Osmium Complex," Chem. Mater., 17(13):3532-3536 (2005).

Noda, Tetsuya and Shirota, Yasuhiko, "5,5'-Bis(dimesitylboryl)-2,2'-bithiophene and 5,5"-Bis(dimesitylboryl)-2,2'5',2"-terthiophene as a Novel Family of Electron-Transporting Amorphous Molecular Materials," J. Am. Chem. Soc., 120 (37):9714-9715 (1998).

Okumoto, Kenji et al., "Green Fluorescent Organic Light-Emitting Device with External Quantum Efficiency of Nearly 10%," Appl. Phys. Lett., 89:063504-1-063504-3 (2006).

(56) References Cited

OTHER PUBLICATIONS

Palilis, Leonidas C., "High Efficiency Molecular Organic Light-Emitting Diodes Based On Silole Derivatives And Their Exciplexes," Organic Electronics, 4:113-121 (2003).
Paulose, Betty Marie Jennifer S. et al., "First Examples of Alkenyl Pyridines as Organic Ligands for Phosphorescent ridium Complexes," Adv. Mater., 16(22):2003-2007 (2004).
Ranjan, Sudhir et al., "Realizing Green Phosphorescent Light-Emitting Materials from Rhenium(I) Pyrazolato Diimine Complexes," Inorg. Chem., 42(4):1248-1255 (2003).
Sakamoto, Youichi et al., "Synthesis, Characterization, and Electron-Transport Property of Perfluorinated Phenylene Dendrimers," J. Am. Chem. Soc., 122(8):1832-1833 (2000).
Salbeck, J. et al., "Low Molecular Organic Glasses for Blue Electroluminescence," Synthetic Metals, 91: 209-215 (1997).
Shirota, Yasuhiko et al., "Starburst Molecules Based on pi-Electron Systems as Materials for Organic Electroluminescent Devices," Journal of Luminescence, 72-74:985-991 (1997).
Sotoyama, Wataru et al., "Efficient Organic Light-Emitting Diodes with Phosphorescent Platinum Complexes Containing N^C^N-Coordinating Tridentate Ligand," Appl. Phys. Lett., 86:153505-1-153505-3 (2005).
Sun, Yiru and Forrest, Stephen R., "High-Efficiency White Organic Light Emitting Devices with Three Separate Phosphorescent Emission Layers," Appl. Phys. Lett., 91:263503-1-263503-3 (2007).
T. Östergård et al., "Langmuir-Blodgett Light-Emitting Diodes Of Poly(3-Hexylthiophene) Electro-Optical Characteristics Related to Structure," Synthetic Metals, 88:171-177 (1997).
Takizawa, Shin-ya et al., "Phosphorescent Iridium Complexes Based on 2-Phenylimidazo[1,2-α]pyridine Ligands Tuning of Emission Color toward the Blue Region and Application to Polymer Light-Emitting Devices," Inorg. Chem., 46(10):4308-4319 (2007).
Tang, C.W. and VanSlyke, S.A., "Organic Electroluminescent Diodes," Appl. Phys. Lett., 51(12):913-915 (1987).
Tung, Yung-Liang et al., "Organic Light-Emitting Diodes Based on Charge-Neutral Ru II PHosphorescent Emitters," Adv. Mater., 17(8)1059-1064 (2005).
Van Slyke, S. A. et al., "Organic Electroluminescent Devices with Improved Stability," Appl. Phys. Lett., 69(15):2160-2162 (1996).
Wang, Y. et al., "Highly Efficient Electroluminescent Materials Based on Fluorinated Organometallic Iridium Compounds," Appl. Phys. Lett., 79(4):449-451 (2001).
Wong, Keith Man-Chung et al., A Novel Class of Phosphorescent Gold(III) Alkynyl-Based Organic Light-Emitting Devices with Tunable Colour, Chem. Commun., 2906-2908 (2005).
Wong, Wai-Yeung, "Multifunctional Iridium Complexes Based on Carbazole Modules as Highly Efficient Electrophosphors," Angew. Chem. Int. Ed., 45:7800-7803 (2006).
Chien, C.H., et al., "Stepwise and one-pot syntheses of Ir(III) Complexes with imidazolium-based carbene ligands," Dalton Trans., 2008, pp. 916-923.
Li, Y., et al., "An N-heterocyclic carbene iridium catalysts with metal-centered chirality for enantioselective transfer hydrogenation of imines," Chem. Commun., 2017, vol. 53, pp. 8089-8092.
Tronnier, A., et al., "(C^C*)-cyclometalated platinum(II) imidazo[1,5-a]pyridine NHC complexes—Synthesis and characterization," Journal of Organometallic Chemistry, 2015, vol. 775, pp. 155-163.
Schleicher, D., et al., "Cyclometalated Ruthenium(II) NHC Complexes with Imidazo[1,5-a]pyridine-Based (C^C*) Ligands—Synthesis and Characterization," Eur. J. Inorg. Chem., 2019, pp. 1956-1965.
Li, L., et al., "Complementing Pyridin-2,6-bis(oxazoline) with Cyclometalated N-Heterocyclic Carbene for Asymmetric Ruthenium Catalysis," Angew. Chem. Int., Ed., 2020, vol. 59, pp. 12392-12395.

* cited by examiner

ORGANIC ELECTROLUMINESCENT MATERIALS AND DEVICES

This application is a continuation-in-part of U.S. patent application Ser. No. 17/477,809, filed Sep. 17, 2021, which claims priority under 35 U.S.C. § 119(e) to U.S. Provisional Application No. 63/087,062, filed on Oct. 2, 2020, and to U.S. Provisional Application No. 63/193,755, filed on May 27, 2021, the entire contents of all the above applications are incorporated herein by reference.

FIELD

The present disclosure generally relates to organometallic compounds and formulations and their various uses including as emitters in devices such as organic light emitting diodes and related electronic devices.

BACKGROUND

Opto-electronic devices that make use of organic materials are becoming increasingly desirable for various reasons. Many of the materials used to make such devices are relatively inexpensive, so organic opto-electronic devices have the potential for cost advantages over inorganic devices. In addition, the inherent properties of organic materials, such as their flexibility, may make them well suited for particular applications such as fabrication on a flexible substrate. Examples of organic opto-electronic devices include organic light emitting diodes/devices (OLEDs), organic phototransistors, organic photovoltaic cells, and organic photodetectors. For OLEDs, the organic materials may have performance advantages over conventional materials.

OLEDs make use of thin organic films that emit light when voltage is applied across the device. OLEDs are becoming an increasingly interesting technology for use in applications such as flat panel displays, illumination, and backlighting.

One application for phosphorescent emissive molecules is a full color display. Industry standards for such a display call for pixels adapted to emit particular colors, referred to as "saturated" colors. In particular, these standards call for saturated red, green, and blue pixels. Alternatively, the OLED can be designed to emit white light. In conventional liquid crystal displays emission from a white backlight is filtered using absorption filters to produce red, green and blue emission. The same technique can also be used with OLEDs. The white OLED can be either a single emissive layer (EML) device or a stack structure. Color may be measured using CIE coordinates, which are well known to the art.

SUMMARY

In one aspect, the present disclosure provides a compound comprising a ligand $L_A$ of Formula I

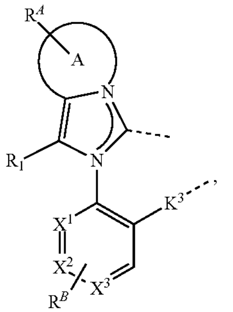

, or

Formula II

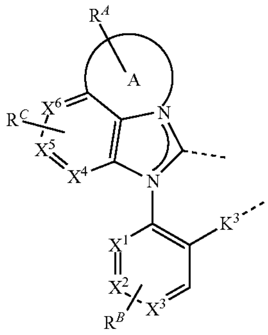

, wherein ring A is independently a 5-membered heterocyclic ring up to a 10-membered heterocyclic ring; $X^1$-$X^6$ are each independently C or N; $K^3$ is a direct bond, O, or S; the maximum number of N atoms that connect to each other within a ring is two; $R^A$, $R^B$, and $R^C$ each independently represents zero, mono, or up to the maximum allowed number of substitutions to its associated ring; and each of $R_1$, $R^A$, $R^B$, $R^C$ is independently a hydrogen or a substituent selected from the group consisting of the general substituents defined herein, wherein the ligand $L_A$ is complexed to a metal M through the two indicated dashed lines; M is Ru, Os, Ir, Pd, Pt, Cu, Ag, or Au, and can be coordinated to other ligands; the ligand $L_A$ can be joined with other ligands to form a tridentate, tetradentate, pentadentate, or hexadentate ligand; and any two adjacent $R^A$, $R^B$, $R^C$, or $R^1$ can be joined or fused to form a ring, with a condition that the compound does not comprise either one of the structures indicated below:

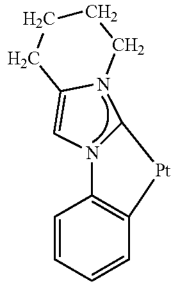

or

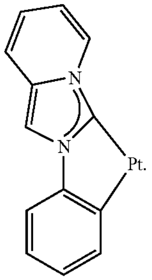

.

In another aspect, the present disclosure provides a formulation of a compound comprising a ligand $L_A$ of Formula I or Formula II as described herein.

In yet another aspect, the present disclosure provides an OLED having an organic layer comprising a compound comprising a ligand $L_A$ of Formula I or Formula II as described herein.

In yet another aspect, the present disclosure provides a consumer product comprising an OLED with an organic layer comprising a compound comprising a ligand $L_A$ of Formula I or Formula II as described herein.

DETAILED DESCRIPTION

A. Terminology

Figure 1:
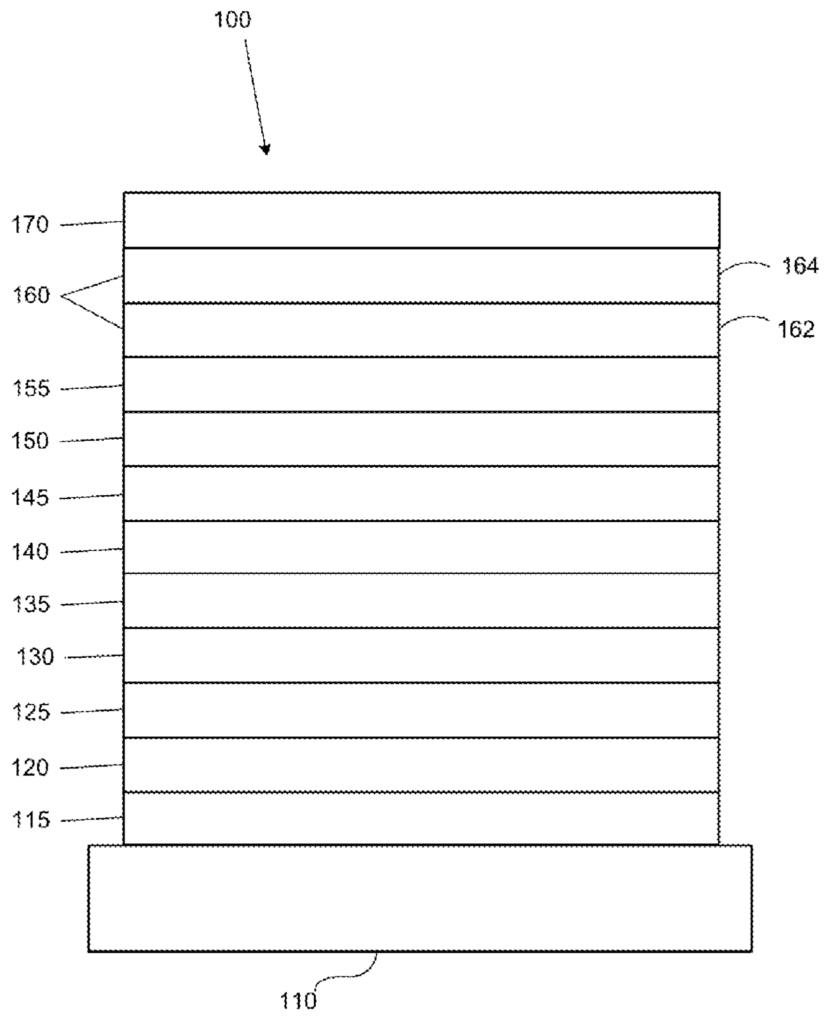
FIG. 1 shows an organic light emitting device.

Unless otherwise specified, the below terms used herein are defined as follows:

As used herein, the term "organic" includes polymeric materials as well as small molecule organic materials that may be used to fabricate organic opto-electronic devices. "Small molecule" refers to any organic material that is not a polymer, and "small molecules" may actually be quite large. Small molecules may include repeat units in some circumstances. For example, using a long chain alkyl group as a substituent does not remove a molecule from the "small molecule" class. Small molecules may also be incorporated into polymers, for example as a pendent group on a polymer backbone or as a part of the backbone. Small molecules may also serve as the core moiety of a dendrimer, which consists of a series of chemical shells built on the core moiety. The core moiety of a dendrimer may be a fluorescent or phosphorescent small molecule emitter. A dendrimer may be a "small molecule," and it is believed that all dendrimers currently used in the field of OLEDs are small molecules.

As used herein, "top" means furthest away from the substrate, while "bottom" means closest to the substrate. Where a first layer is described as "disposed over" a second layer, the first layer is disposed further away from substrate. There may be other layers between the first and second layer, unless it is specified that the first layer is "in contact with" the second layer. For example, a cathode may be described as "disposed over" an anode, even though there are various organic layers in between.

As used herein, "solution processable" means capable of being dissolved, dispersed, or transported in and/or deposited from a liquid medium, either in solution or suspension form.

A ligand may be referred to as "photoactive" when it is believed that the ligand directly contributes to the photoactive properties of an emissive material. A ligand may be referred to as "ancillary" when it is believed that the ligand does not contribute to the photoactive properties of an emissive material, although an ancillary ligand may alter the properties of a photoactive ligand.

As used herein, and as would be generally understood by one skilled in the art, a first "Highest Occupied Molecular Orbital" (HOMO) or "Lowest Unoccupied Molecular Orbital" (LUMO) energy level is "greater than" or "higher than" a second HOMO or LUMO energy level if the first energy level is closer to the vacuum energy level. Since ionization potentials (IP) are measured as a negative energy relative to a vacuum level, a higher HOMO energy level corresponds to an IP having a smaller absolute value (an IP that is less negative). Similarly, a higher LUMO energy level corresponds to an electron affinity (EA) having a smaller absolute value (an EA that is less negative). On a conventional energy level diagram, with the vacuum level at the top, the LUMO energy level of a material is higher than the HOMO energy level of the same material. A "higher" HOMO or LUMO energy level appears closer to the top of such a diagram than a "lower" HOMO or LUMO energy level.

As used herein, and as would be generally understood by one skilled in the art, a first work function is "greater than" or "higher than" a second work function if the first work function has a higher absolute value. Because work functions are generally measured as negative numbers relative to vacuum level, this means that a "higher" work function is more negative. On a conventional energy level diagram, with the vacuum level at the top, a "higher" work function is illustrated as further away from the vacuum level in the downward direction. Thus, the definitions of HOMO and LUMO energy levels follow a different convention than work functions.

The terms "halo," "halogen," and "halide" are used interchangeably and refer to fluorine, chlorine, bromine, and iodine.

The term "acyl" refers to a substituted carbonyl radical ($C(O)—R_s$).

The term "ester" refers to a substituted oxycarbonyl ($—O—C(O)—R_s$ or $—C(O)—O—R_s$) radical.

The term "ether" refers to an $—OR_s$ radical.

The terms "sulfanyl" or "thio-ether" are used interchangeably and refer to a $—SR_s$ radical.

The term "selenyl" refers to a $—SeR_s$ radical.

The term "sulfinyl" refers to a $—S(O)—R_s$ radical.

The term "sulfonyl" refers to a $—SO_2—R_s$ radical.

The term "phosphino" refers to a $—P(R_s)_3$ radical, wherein each $R_s$ can be same or different.

The term "silyl" refers to a $—Si(R_s)_3$ radical, wherein each $R_s$ can be same or different.

The term "germyl" refers to a $—Ge(R_s)_3$ radical, wherein each $R_s$ can be same or different.

The term "boryl" refers to a $—B(R_s)_2$ radical or its Lewis adduct $—B(R_s)_3$ radical, wherein $R_s$ can be same or different.

In each of the above, $R_s$ can be hydrogen or a substituent selected from the group consisting of deuterium, halogen, alkyl, cycloalkyl, heteroalkyl, heterocycloalkyl, arylalkyl, alkoxy, aryloxy, amino, silyl, alkenyl, cycloalkenyl, heteroalkenyl, alkynyl, aryl, heteroaryl, and combination thereof. Preferred $R_s$, is selected from the group consisting of alkyl, cycloalkyl, aryl, heteroaryl, and combination thereof.

The term "alkyl" refers to and includes both straight and branched chain alkyl radicals. Preferred alkyl groups are those containing from one to fifteen carbon atoms and includes methyl, ethyl, propyl, 1-methylethyl, butyl, 1-methylpropyl, 2-methylpropyl, pentyl, 1-methylbutyl, 2-methylbutyl, 3-methylbutyl, 1,1-dimethylpropyl, 1,2-dimethylpropyl, 2,2-dimethylpropyl, and the like. Additionally, the alkyl group may be optionally substituted.

The term "cycloalkyl" refers to and includes monocyclic, polycyclic, and spiro alkyl radicals. Preferred cycloalkyl groups are those containing 3 to 12 ring carbon atoms and includes cyclopropyl, cyclopentyl, cyclohexyl, bicyclo [3.1.1]heptyl, spiro[4.5]decyl, spiro[5.5]undecyl, adamantyl, and the like. Additionally, the cycloalkyl group may be optionally substituted.

The terms "heteroalkyl" or "heterocycloalkyl" refer to an alkyl or a cycloalkyl radical, respectively, having at least one carbon atom replaced by a heteroatom. Optionally the at least one heteroatom is selected from O, S, N, P, B, Si and Se, preferably, O, S or N. Additionally, the heteroalkyl or heterocycloalkyl group may be optionally substituted.

The term "alkenyl" refers to and includes both straight and branched chain alkene radicals. Alkenyl groups are essentially alkyl groups that include at least one carbon-carbon double bond in the alkyl chan. Cycloalkenyl groups are essentially cycloalkyl groups that include at least one carbon-carbon double bond in the cycloalkyl ring. The term "heteroalkenyl" as used herein refers to an alkenyl radical having at least one carbon atom replaced by a heteroatom. Optionally the at least one heteroatom is selected from O, S, N, P, B, Si, and Se, preferably, O, S, or N. Preferred alkenyl, cycloalkenyl, or heteroalkenyl groups are those containing two to fifteen carbon atoms. Additionally, the alkenyl, cycloalkenyl, or heteroalkenyl group may be optionally substituted.

The term "alkynyl" refers to and includes both straight and branched chain alkyne radicals. Alkynyl groups are essentially alkyl groups that include at least one carbon-carbon triple bond in the alkyl chain. Preferred alkynyl groups are those containing two to fifteen carbon atoms. Additionally, the alkynyl group may be optionally substituted.

The terms "aralkyl" or "arylalkyl" are used interchangeably and refer to an alkyl group that is substituted with an aryl group. Additionally, the aralkyl group may be optionally substituted.

The term "heterocyclic group" refers to and includes aromatic and non-aromatic cyclic radicals containing at least one heteroatom. Optionally the at least one heteroatom is selected from O, S, N, P, B, Si, and Se, preferably, O, S, or N. Hetero-aromatic cyclic radicals may be used interchangeably with heteroaryl. Preferred hetero-non-aromatic cyclic groups are those containing 3 to 7 ring atoms which includes at least one hetero atom, and includes cyclic amines such as morpholino, piperidino, pyrrolidino, and the like, and cyclic ethers/thio-ethers, such as tetrahydrofuran, tetrahydropyran, tetrahydrothiophene, and the like. Additionally, the heterocyclic group may be optionally substituted.

The term "aryl" refers to and includes both single-ring aromatic hydrocarbyl groups and polycyclic aromatic ring systems. The polycyclic rings may have two or more rings in which two carbons are common to two adjoining rings (the rings are "fused") wherein at least one of the rings is an aromatic hydrocarbyl group, e.g., the other rings can be cycloalkyls, cycloalkenyls, aryl, heterocycles, and/or heteroaryls. Preferred aryl groups are those containing six to thirty carbon atoms, preferably six to twenty carbon atoms, more preferably six to twelve carbon atoms. Especially preferred is an aryl group having six carbons, ten carbons or twelve carbons. Suitable aryl groups include phenyl, biphenyl, triphenyl, triphenylene, tetraphenylene, naphthalene, anthracene, phenalene, phenanthrene, fluorene, pyrene, chrysene, perylene, and azulene, preferably phenyl, biphenyl, triphenyl, triphenylene, fluorene, and naphthalene. Additionally, the aryl group may be optionally substituted.

The term "heteroaryl" refers to and includes both single-ring aromatic groups and polycyclic aromatic ring systems that include at least one heteroatom. The heteroatoms include, but are not limited to O, S, N, P, B, Si, and Se. In many instances, O, S, or N are the preferred heteroatoms. Hetero-single ring aromatic systems are preferably single rings with 5 or 6 ring atoms, and the ring can have from one to six heteroatoms. The hetero-polycyclic ring systems can have two or more rings in which two atoms are common to two adjoining rings (the rings are "fused") wherein at least one of the rings is a heteroaryl, e.g., the other rings can be cycloalkyls, cycloalkenyls, aryl, heterocycles, and/or heteroaryls. The hetero-polycyclic aromatic ring systems can have from one to six heteroatoms per ring of the polycyclic aromatic ring system. Preferred heteroaryl groups are those containing three to thirty carbon atoms, preferably three to twenty carbon atoms, more preferably three to twelve carbon atoms. Suitable heteroaryl groups include dibenzothiophene, dibenzofuran, dibenzoselenophene, furan, thiophene, benzofuran, benzothiophene, benzoselenophene, carbazole, indolocarbazole, pyridylindole, pyrrolodipyridine, pyrazole, imidazole, triazole, oxazole, thiazole, oxadiazole, oxatriazole, dioxazole, thiadiazole, pyridine, pyridazine, pyrimidine, pyrazine, triazine, oxazine, oxathiazine, oxadiazine, indole, benzimidazole, indazole, indoxazine, benzoxazole, benzisoxazole, benzothiazole, quinoline, isoquinoline, cinnoline, quinazoline, quinoxaline, naphthyridine, phthalazine, pteridine, xanthene, acridine, phenazine, phenothiazine, phenoxazine, benzofuropyridine, furodipyridine, benzothienopyridine, thienodipyridine, benzoselenophenopyridine, and selenophenodipyridine, preferably dibenzothiophene, dibenzofuran, dibenzoselenophene, carbazole, indolocarbazole, imidazole, pyridine, triazine, benzimidazole, 1,2-azaborine, 1,3-azaborine, 1,4-azaborine, borazine, and aza-analogs thereof. Additionally, the heteroaryl group may be optionally substituted.

Of the aryl and heteroaryl groups listed above, the groups of triphenylene, naphthalene, anthracene, dibenzothiophene, dibenzofuran, dibenzoselenophene, carbazole, indolocarbazole, imidazole, pyridine, pyrazine, pyrimidine, triazine, and benzimidazole, and the respective aza-analogs of each thereof are of particular interest.

The terms alkyl, cycloalkyl, heteroalkyl, heterocycloalkyl, alkenyl, cycloalkenyl, heteroalkenyl, alkynyl, aralkyl, heterocyclic group, aryl, and heteroaryl, as used herein, are independently unsubstituted, or independently substituted, with one or more general substituents.

In many instances, the general substituents are selected from the group consisting of deuterium, halogen, alkyl, cycloalkyl, heteroalkyl, heterocycloalkyl, arylalkyl, alkoxy, aryloxy, amino, silyl, germyl, boryl, selenyl, alkenyl, cycloalkenyl, heteroalkenyl, alkynyl, aryl, heteroaryl, acyl, carboxylic acid, ether, ester, nitrile, isonitrile, sulfanyl, sulfinyl, sulfonyl, phosphino, and combinations thereof.

In some instances, the preferred general substituents are selected from the group consisting of deuterium, fluorine, alkyl, cycloalkyl, heteroalkyl, alkoxy, aryloxy, amino, silyl, boryl, alkenyl, cycloalkenyl, heteroalkenyl, aryl, heteroaryl, nitrile, isonitrile, sulfanyl, and combinations thereof.

In some instances, the preferred general substituents are selected from the group consisting of deuterium, fluorine, alkyl, cycloalkyl, alkoxy, aryloxy, amino, silyl, boryl, aryl, heteroaryl, sulfanyl, and combinations thereof.

In yet other instances, the more preferred general substituents are selected from the group consisting of deuterium, fluorine, alkyl, cycloalkyl, aryl, heteroaryl, and combinations thereof.

The terms "substituted" and "substitution" refer to a substituent other than H that is bonded to the relevant position, e.g., a carbon or nitrogen. For example, when $R^1$ represents mono-substitution, then one $R^1$ must be other than H (i.e., a substitution). Similarly, when $R^1$ represents di-substitution, then two of $R^1$ must be other than H. Similarly, when $R^1$ represents zero or no substitution, $R^1$, for example, can be a hydrogen for available valencies of ring atoms, as in carbon atoms for benzene and the nitrogen atom in pyrrole, or simply represents nothing for ring atoms with fully filled valencies, e.g., the nitrogen atom in pyridine. The maximum number of substitutions possible in a ring structure will depend on the total number of available valencies in the ring atoms.

As used herein, "combinations thereof" indicates that one or more members of the applicable list are combined to form a known or chemically stable arrangement that one of ordinary skill in the art can envision from the applicable list. For example, an alkyl and deuterium can be combined to form a partial or fully deuterated alkyl group; a halogen and alkyl can be combined to form a halogenated alkyl substituent; and a halogen, alkyl, and aryl can be combined to form a halogenated arylalkyl. In one instance, the term substitution includes a combination of two to four of the listed groups. In another instance, the term substitution includes a combination of two to three groups. In yet another instance, the term substitution includes a combination of two groups. Preferred combinations of substituent groups are those that contain up to fifty atoms that are not hydrogen or deuterium, or those which include up to forty atoms that are not hydrogen or deuterium, or those that include up to thirty atoms that are not hydrogen or deuterium. In many instances, a preferred combination of substituent groups will include up to twenty atoms that are not hydrogen or deuterium.

The "aza" designation in the fragments described herein, i.e. aza-dibenzofuran, aza-dibenzothiophene, etc. means that one or more of the C—H groups in the respective aromatic ring can be replaced by a nitrogen atom, for example, and without any limitation, azatriphenylene encompasses both dibenzo[f,h]quinoxaline and dibenzo[f,h]quinoline. One of ordinary skill in the art can readily envision other nitrogen analogs of the aza-derivatives described above, and all such analogs are intended to be encompassed by the terms as set forth herein.

As used herein, "deuterium" refers to an isotope of hydrogen. Deuterated compounds can be readily prepared using methods known in the art. For example, U.S. Pat. No. 8,557,400, Patent Pub. No. WO 2006/095951, and U.S. Pat. Application Pub. No. US 2011/0037057, which are hereby incorporated by reference in their entireties, describe the making of deuterium-substituted organometallic complexes. Further reference is made to Ming Yan, et al., Tetrahedron 2015, 71, 1425-30 and Atzrodt et al., *Angew. Chem. Int. Ed.* (*Reviews*) 2007, 46, 7744-65, which are incorporated by reference in their entireties, describe the deuteration of the methylene hydrogens in benzyl amines and efficient pathways to replace aromatic ring hydrogens with deuterium, respectively.

It is to be understood that when a molecular fragment is described as being a substituent or otherwise attached to another moiety, its name may be written as if it were a fragment (e.g. phenyl, phenylene, naphthyl, dibenzofuryl) or as if it were the whole molecule (e.g. benzene, naphthalene, dibenzofuran). As used herein, these different ways of designating a substituent or attached fragment are considered to be equivalent.

In some instance, a pair of adjacent substituents can be optionally joined or fused into a ring. The preferred ring is a five, six, or seven-membered carbocyclic or heterocyclic ring, includes both instances where the portion of the ring formed by the pair of substituents is saturated and where the portion of the ring formed by the pair of substituents is unsaturated. As used herein, "adjacent" means that the two substituents involved can be on the same ring next to each other, or on two neighboring rings having the two closest available substitutable positions, such as 2, 2' positions in a biphenyl, or 1, 8 position in a naphthalene, as long as they can form a stable fused ring system.

B. The Compounds of the Present Disclosure

In one aspect, the present disclosure provides a compound comprising a ligand $L_A$ of Formula I

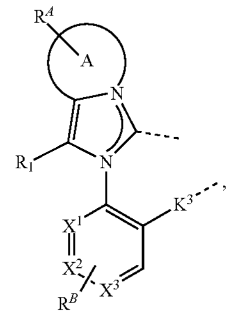

or

Formula II

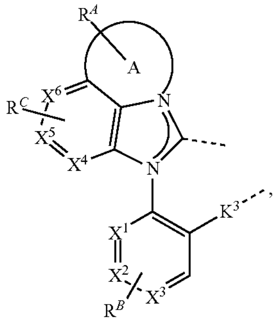

, wherein:

ring A is independently a 5-membered heterocyclic ring up to a 10-membered heterocyclic ring;

$X^1$-$X^6$ are each independently C or N;

$K^3$ is a direct bond, O, or S;

the maximum number of N atoms that connect to each other within a ring is two;

$R^A$, $R^B$, and $R^C$ each independently represent zero, mono, or up to the maximum allowed number of substitutions to its associated ring; and each of $R_1$, $R^A$, $R^B$, $R^C$ is independently a hydrogen or a substituent selected from the group consisting of deuterium, halogen, alkyl, cycloalkyl, heteroalkyl, heterocycloalkyl, arylalkyl, alkoxy, aryloxy, amino, silyl, germyl, boryl, selenyl, alkenyl, cycloalkenyl, heteroalkenyl, alkynyl, aryl, heteroaryl, acyl, carboxylic acid, ether, ester, nitrile, isonitrile, sulfanyl, sulfinyl, sulfonyl, phosphino, and combinations thereof, wherein:

the ligand $L_A$ is complexed to a metal M through the two indicated dashed lines;

M is Ir, Rh, Re, Ru, Os, Pt, Pd, Ag, Au, or Cu, and can be coordinated to other ligands;

the ligand $L_A$ can be joined with other ligands to form a tridentate, tetradentate, pentadentate, or hexadentate ligand; and any two $R^A$, $R^B$, $R^C$, or $R^1$ can be joined or fused to form a ring, with a condition that the compound does not comprise either one of the structures indicated below:

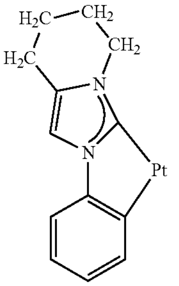 or 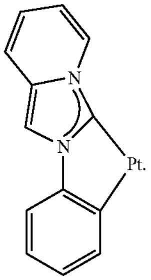

In some embodiments of ligand $L_A$, each of $R_1$, $R^A$ and $R^B$ can be independently a hydrogen or a substituent selected from the group consisting of deuterium, fluorine, alkyl, cycloalkyl, heteroalkyl, alkoxy, aryloxy, amino, silyl, boryl, alkenyl, cycloalkenyl, heteroalkenyl, aryl, heteroaryl, nitrile, isonitrile, sulfanyl, and combinations thereof.

In some embodiments, each $X^1$-$X^3$ can be C. In some embodiments, each $X^4$-$X^6$ can be C. In some embodiments, each $X^1$-$X^6$ can be C.

In some embodiments, two adjacent $R^A$ substituents can be joined to form a fused ring to ring A. In some embodiments, four adjacent $R^A$ substituents can be joined to form two fused rings to ring A when ring A is a 7-membered, 8-membered, 9-membered, or 10-membered ring. In some embodiments, a total of 6 adjacent $R^A$ substituents can be joined to form three separate rings all fused to ring A when ring A is an 8-membered, 9-membered, or 10-membered ring. In some embodiments, the fused rings can be each independently 5-membered or 6-membered aromatic rings. In some embodiments, the fused rings can be each independently benzene, pyridine, pyrimidine, pyridazine, pyrazine, imidazole, pyrazole, pyrrole, oxazole, furan, thiophene, or thiazole. In some embodiments, the fused rings can be each independently benzene or imidazole. In some embodiments, the fused rings can be all benzene.

In some embodiments, $R_1$ and one $R^B$ substituent of Formula I can be joined to form a ring. In some embodiments, $R_1$ and one $R^A$ substituent of Formula I can be joined to form a ring. In some embodiments, one $R^C$ substituent and one $R^B$ substituent of Formula II can be joined to form a ring. In some embodiments, one $R^C$ substituent and one $R^A$ substituent of Formula II can be joined to form a ring. In some embodiments, two adjacent $R^B$ substituents can be joined to form a fused ring. In some embodiments, two adjacent $R^C$ substituents can be joined to form a fused ring.

In some embodiments, two $R^B$ are joined to form a polycyclic fused ring structure. In some of these embodiments, the polycyclic fused ring structure can comprise at least three fused rings. In some of these embodiments, the polycyclic fused ring structure can have two 6-membered rings and one 5-membered ring. In some of these embodiments, the polycyclic fused ring structure can comprise at least four fused rings. In some embodiments, the polycyclic fused ring structure can comprise three 6-membered rings and one 5-membered ring. In some embodiments, the polycyclic fused ring structure can comprise at least five fused rings. In some of these embodiments, the polycyclic fused ring structure can comprise four 6-membered rings and one 5-membered ring or three 6-membered rings and two 5-membered rings. In some embodiments comprising two 5-membered rings, the 5-membered rings can be fused together. In some embodiments comprising two 5-membered rings, the 5-membered rings can be separated by at least one 6-membered ring. In some of these embodiments, the polycyclic fused ring structure can be an aza version of the fused rings as described above. In some such embodiments, the polycyclic fused ring structure can contain exactly one aza N atom. In some such embodiments, the polycyclic fused ring structure can contain exactly two aza N atoms, which can be in one ring, or in two different rings.

In some embodiments, the ligand $L_A$ can be selected from the group consisting of:

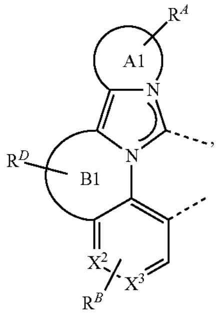

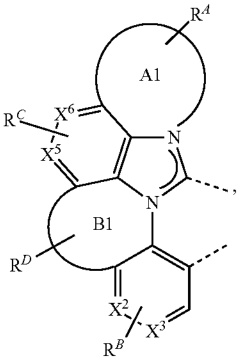

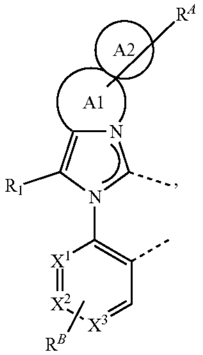

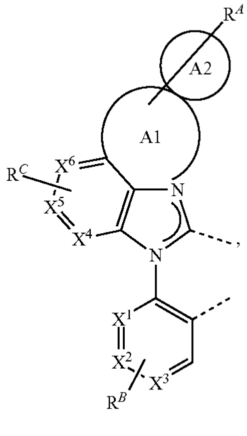

-continued

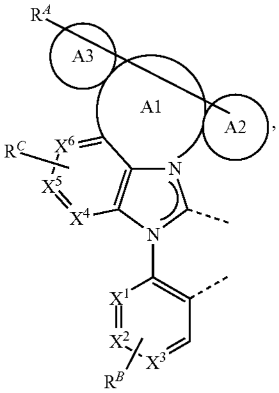
,

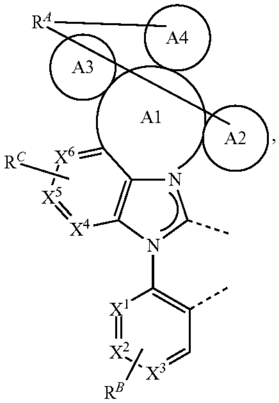
,

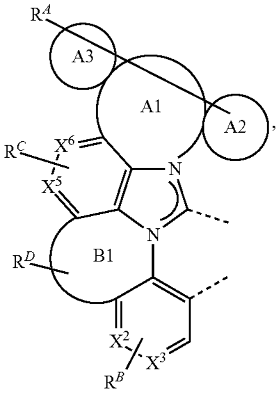
,

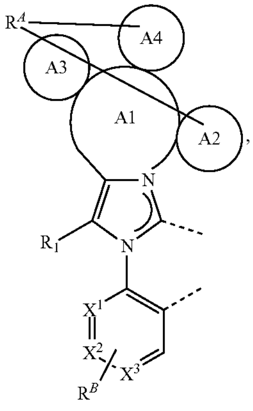
,

-continued

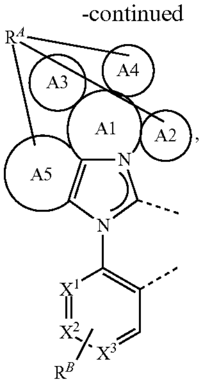
, and

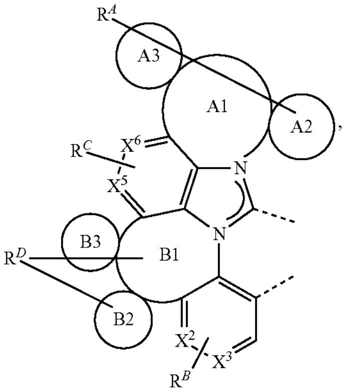
, wherein ring A1 is independently a 5-membered up to 10-membered heterocyclic ring; each of rings A2, A3, A4, A5, B2, and B3 is independently a 5-membered or 6-membered carbocyclic or heterocyclic ring; ring B1 is independently a 5-membered up to 9-membered carbocyclic or heterocyclic ring; and all remaining variables are as defined for Formula I and Formula II.

In some embodiments, the ligand $L_A$ can be selected from the group consisting of:

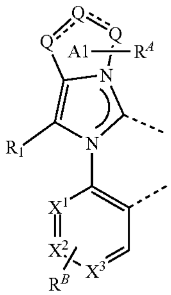
,

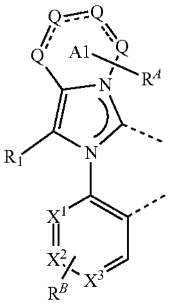
,

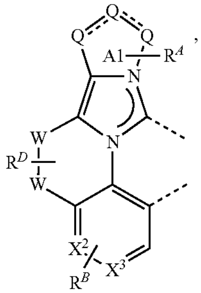
,

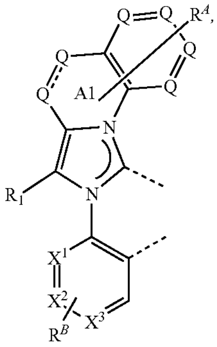
,

-continued
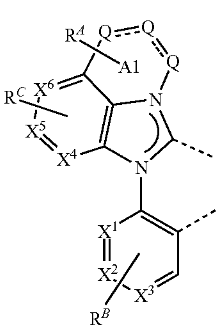
,
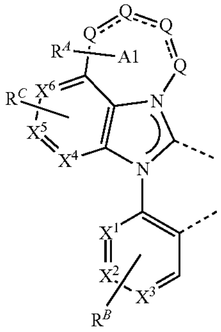
,
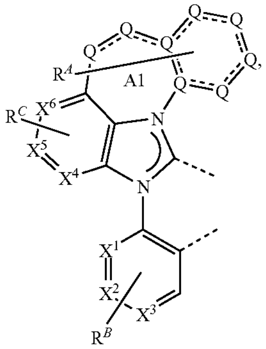
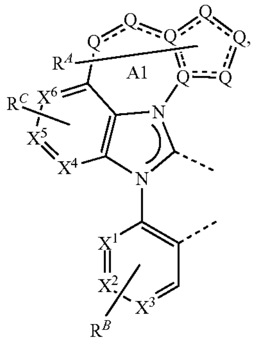
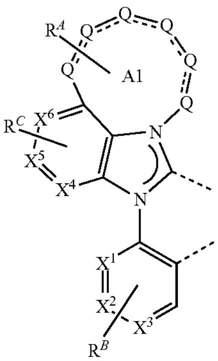
,
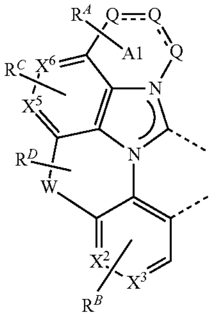
,
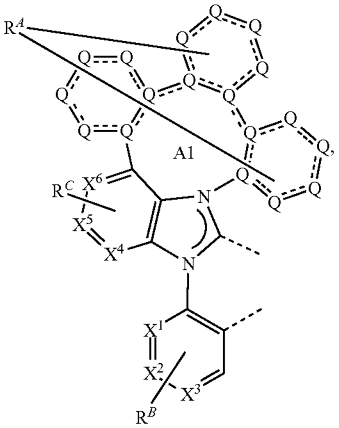
-continued
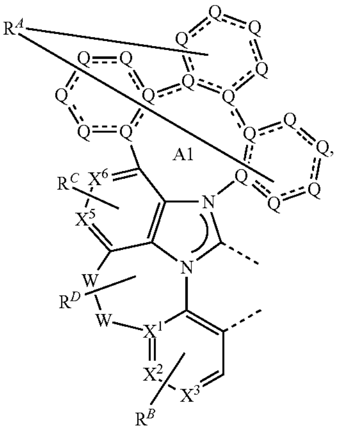
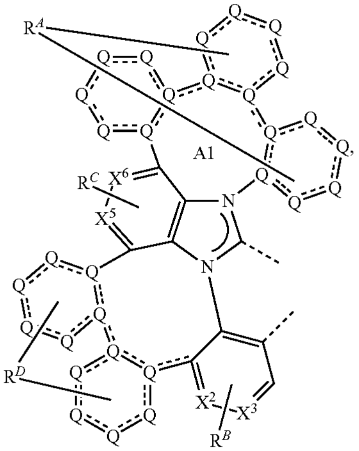
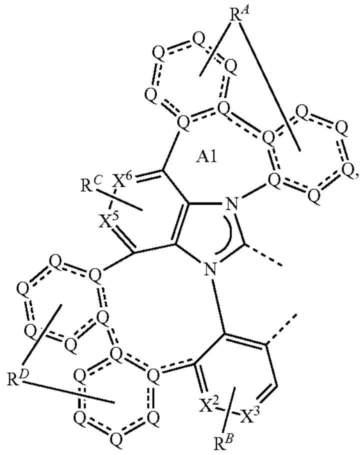

-continued

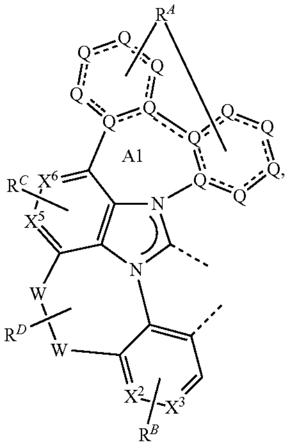

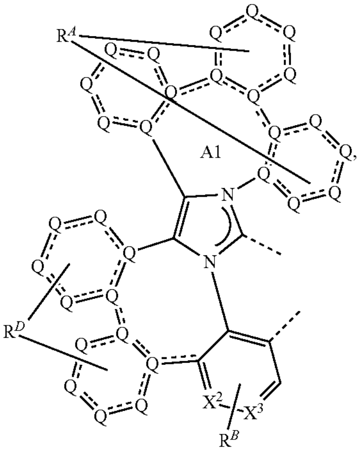

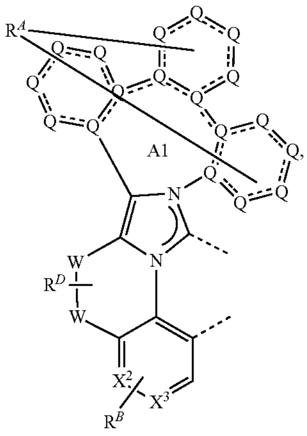

-continued

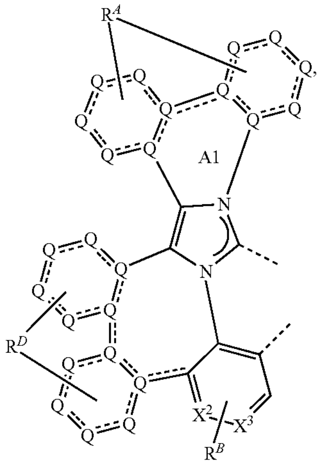

and

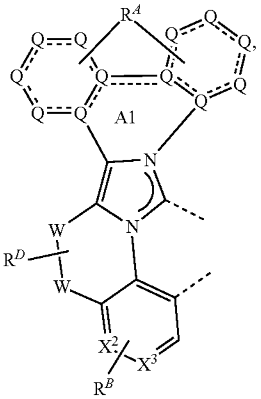

wherein each Q is independently C, N, B, Si, or O; and each W is independently BR, BRR', NR, PR, O, S, Se, C═O, S═O, $SO_2$, C═CRR', C═NR, CRR', SiRR', or GeRR', wherein R and R' are each independently a hydrogen or a substituent selected from the group consisting of the general substitutents defined herein; and all remaining variables are as defined for Formula I and Formula II.

In some embodiments, the ligand $L_A$ can be

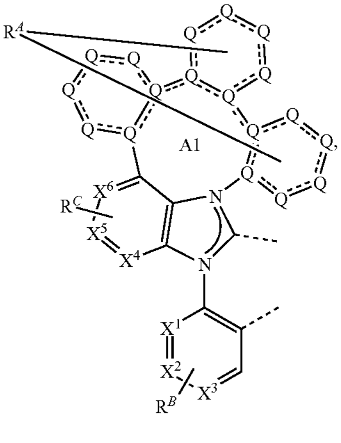

where all variables are as defined for Formula I and Formula II. In some embodiments, the ligand $L_A$ can be selected from the group consisting of

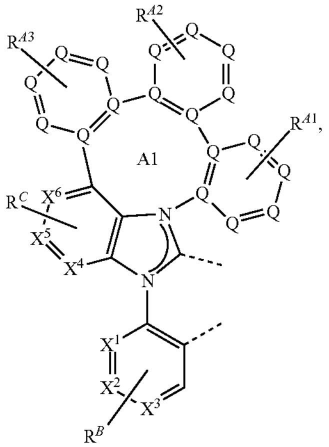
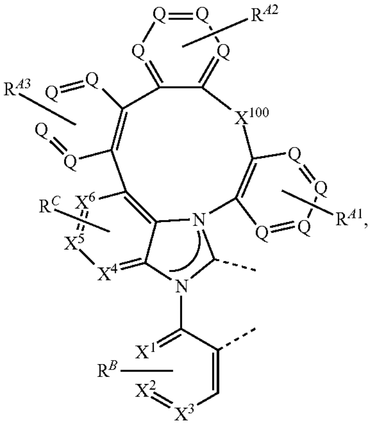
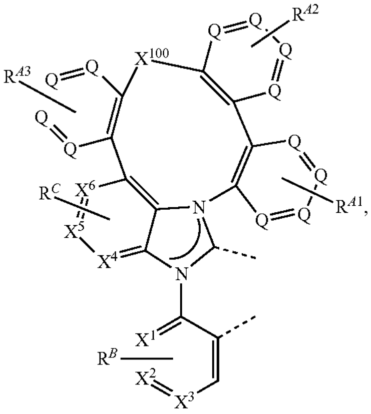
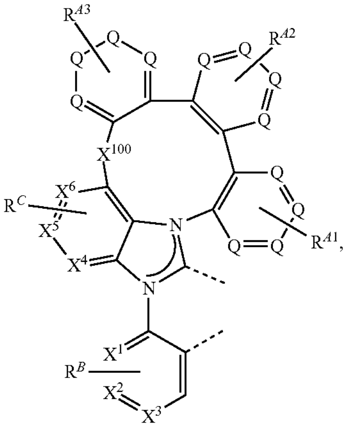
-continued
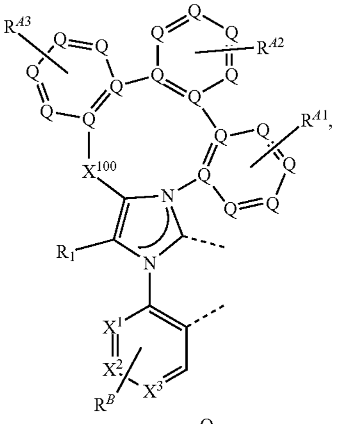
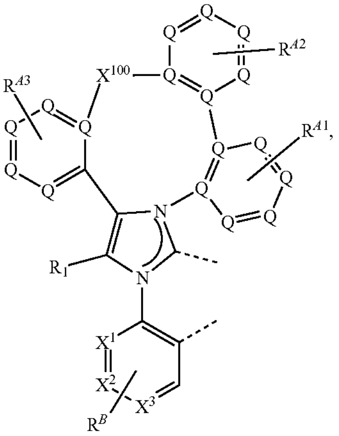
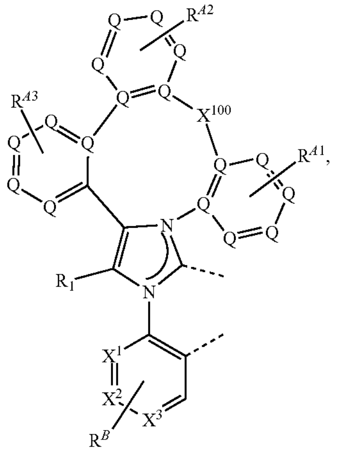
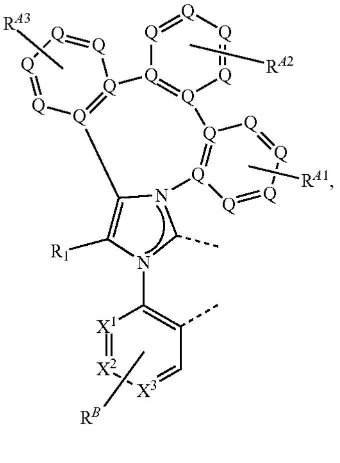
and -continued

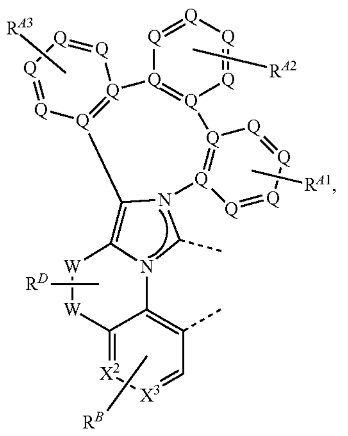

Wherein $R^{A1}$, $R^{A2}$, and $R^{A3}$ each independently represents zero, mono, or up to the maximum allowed number of substitutions to its associated ring; $X^{100}$ for each occurrence is independently BR, BRR', NR, PR, O, S, Se, C═O, S═O, $SO_2$, C═CRR', C═NR, CRR', SiRR', or GeRR'; and each of R, R', $R^{A1}$, $R^{A2}$, and each $R^{A3}$ is independently a hydrogen or a substituent selected from the group consisting of the general substituents defined herein; and any two R, $R^B$, $R^C$, $R^D$, $R^{A1}$, $R^{A2}$, and $R^{A3}$ can be joined to form a ring or a polycyclic fused ring system, and all remaining variables are as defined for Formula I and Formula II. In some of the above embodiments, R can be an alkyl, cycloalkyl, aryl, heteroaryl, or their combinations. In some of the above embodiments, R can be joined with $R^{A1}$ to form a fused ring system. In some of the above embodiments, R can be joined with $R^{A2}$ to form a fused ring system. In some of the above embodiments, R can be joined with $R^{A2}$ to form a fused ring system. In some of these embodiments, the fused ring system can be a bicyclic structure. In some of these embodiments, the fused ring system can be a tricyclic structure. In some of these embodiments, the fused ring system can comprise a carbazole structure. In some of the above embodiments, each W can be CRR'. In some embodiments, $X^{100}$ can be BR or NR.

In some embodiments, the ligand $L_A$ can be selected from the group consisting of:

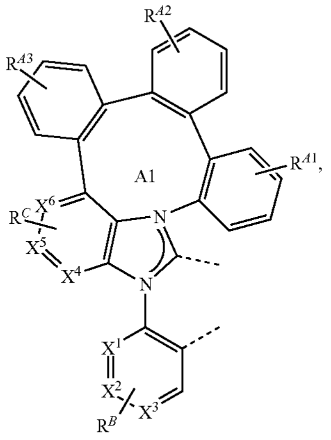

-continued

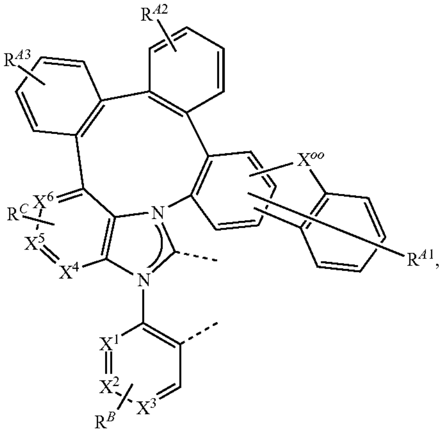

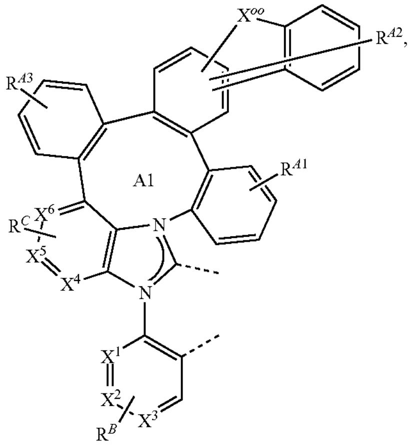

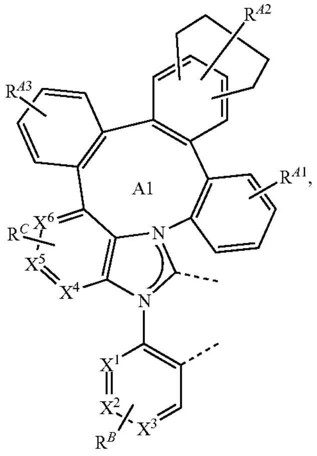

-continued
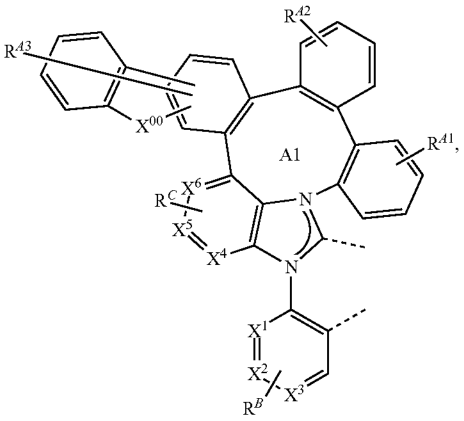
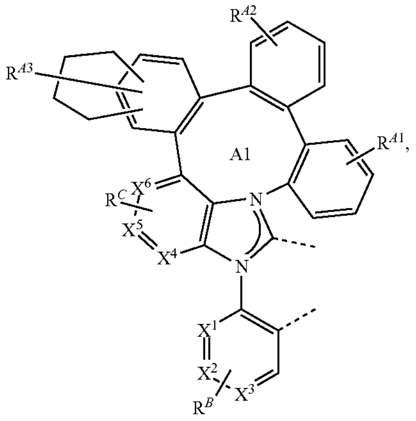
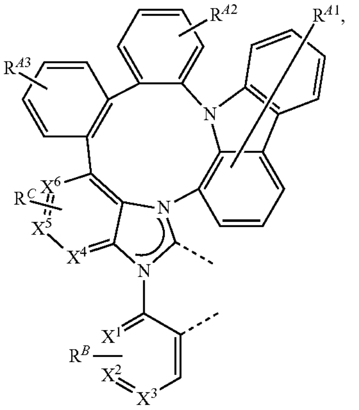
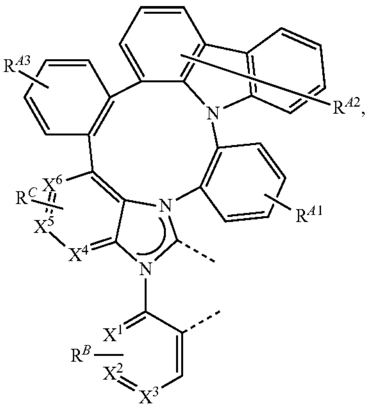
-continued
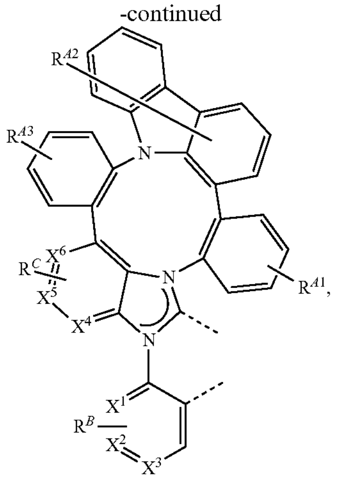
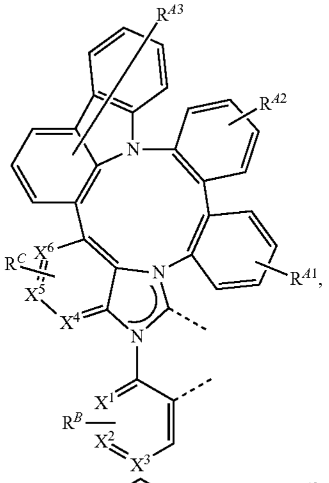
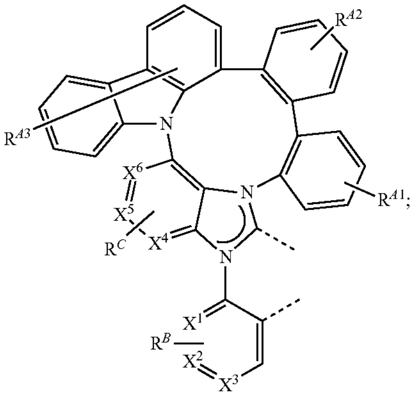
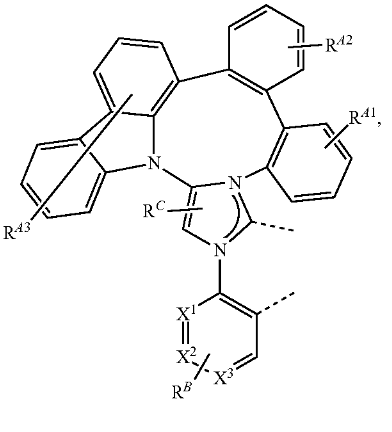

-continued
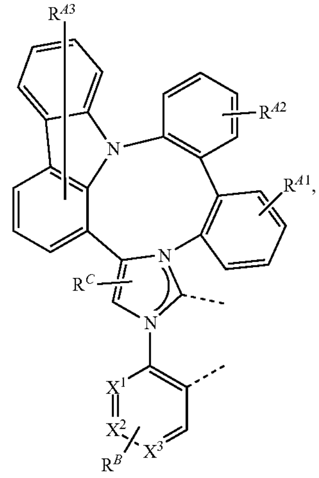
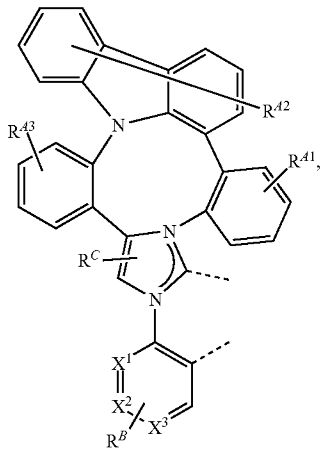
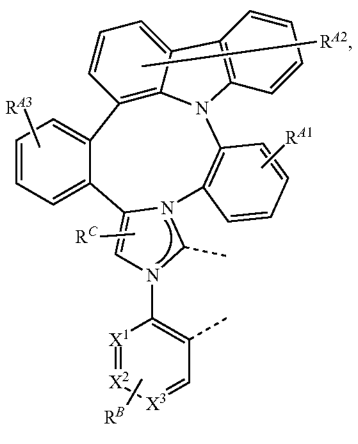
-continued
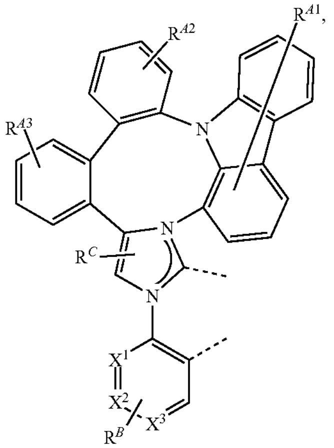
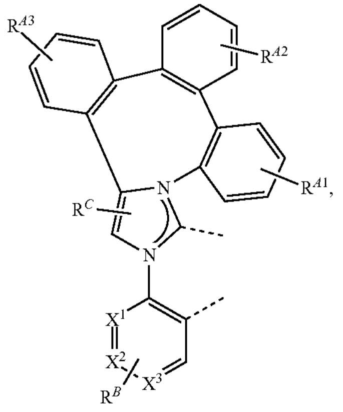
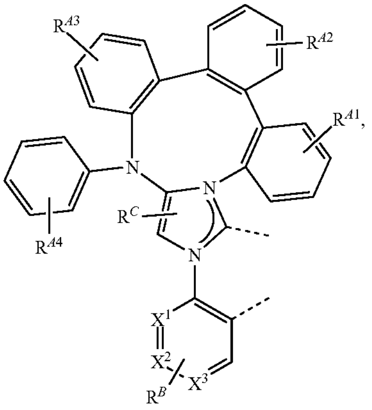
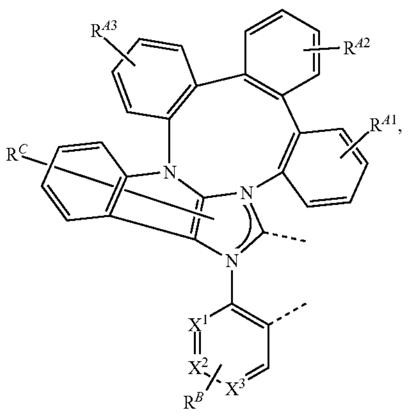

-continued

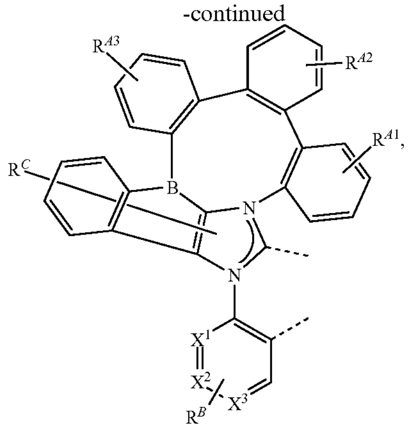

and

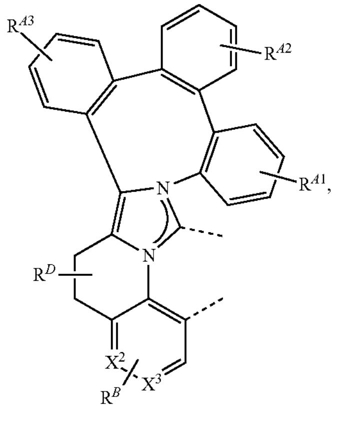

wherein $R^{A4}$ represents zero, mono, or up to the maximum allowed number of substitutions to its associated ring; and each $R^{A4}$ can be independently a hydrogen or a substituent selected from the group consisting of the general substituents defined herein; wherein $X^{00}$ is NR, O, S, or Se, and the remaining variables are the same as defined for Formula I and Formula II.

In some of the above embodiments, each of $X^1$ to $X^6$ can be independently C. In some of the above embodiments, one of $X^1$ to $X^6$ can be N. In some of the above embodiments, one of $X^1$ to $X^3$ can be N. In some of the above embodiments, one of $X^3$ to $X^6$ can be N.

In some of the above embodiments, one of $R^{A1}$, $R^{A2}$, $R^{A3}$, and $R^C$ can be an alkyl, cycloalkyl, fluorine, deuterium, aryl, heteroaryl, or combinations thereof. In some of the above embodiments, one of $R^{A1}$ can be an alkyl, cycloalkyl, fluorine, deuterium, aryl, heteroaryl, or combinations thereof. In some of the above embodiments, one of $R^{A2}$ can be an alkyl, cycloalkyl, fluorine, deuterium, aryl, heteroaryl, or combinations thereof. In some of the above embodiments, one of $R^{A3}$ can be an alkyl, cycloalkyl, fluorine, deuterium, aryl, heteroaryl, or combinations thereof. In some of the above embodiments, one of $R^C$ can be an alkyl, cycloalkyl, fluorine, deuterium, aryl, heteroaryl, or combinations thereof. In some of the above embodiments, one of $R^{A1}$, $R^{A2}$ and $R^{A3}$ can be t-butyl, or phenyl.

In some of the above embodiments, one of $R^{A1}$, $R^{A2}$ and $R^{A3}$ can be an unsubstituted or substituted phenyl. In some of the above embodiments, one of $R^{A1}$, $R^{A2}$ and $R^{A3}$ can be a meta-substituted phenyl. In some of the above embodiments, one of $R^{A1}$, $R^{A2}$ and $R^{A3}$ can be a phenyl which is meta-substituted with a phenyl. In some of the above embodiments, one of $R^{A1}$, $R^{A2}$ and $R^{A3}$ can be a phenyl which is meta-substituted with silyl group.

In some of the above embodiments, any two $R^{A1}$ are joined to form a ring. In some of the above embodiments, any two $R^{A1}$ are joined to form a 6-membered aliphatic ring. In some of the above embodiments, any two $R^{A1}$ are joined to form a 6-membered substituted aliphatic ring. In these embodiments, the 6-membered apliphatic ring may be fully deuterated. In some of the above embodiments, any two $R^{A2}$ are joined to form a 6-membered aliphatic ring. In some of the above embodiments, any two $R^{A2}$ are joined to forma 6-membered substituted aliphatic ring. In these embodiments, the 6-membered apliphatic ring may be fully deuterated. In some of the above embodiments, any two $R^{A3}$ are joined to form a 6-membered aliphatic ring. In some of the above embodiments, any two $R^{A3}$ are joined to form a 6-membered substituted aliphatic ring. In these embodiments, the 6-membered aliphatic ring may be fully deuterated. In some of the above embodiments, one of $R^{A1}$ is substituted at the ortho position with respect to the carbon atom attached to the N atom of the imidazole of the structure. In some of the above embodiments, one of $R^{A1}$, $R^{A2}$ and $R^{A3}$ can be silyl group. In some of the above embodiments, one of $R^{A1}$, $R^{A2}$ and $R^{A3}$ can be a germyl group.

In some of the above embodiments, one of $R^{A1}$ can be t-butyl, or substituted or unsubstituted phenyl. In some of the above embodiments, one of $R^{A2}$ can be t-butyl, or substituted or unsubstituted phenyl. In some of the above embodiments, one of $R^{A3}$ can be t-butyl, or substituted or unsubstituted phenyl. In some of the above embodiments, one of $R^C$ can be t-butyl, or substituted or unsubstituted phenyl.

In some of the above embodiments, one of $R^{A1}$ can be fully deuterated phenyl. In some of the above embodiments, one of $R^{A2}$ can be fully deuterated phenyl. In some of the above embodiments, one of $R^{A3}$ can be fully deuterated phenyl. In some of the above embodiments, each $R^{A1}$ is independently deuterium. In some of the above embodiments, each $R^{A2}$ is independently deuterium. In some of the above embodiments, each $R^{A3}$ is independently deuterium. In some of the above embodiments, each $R^C$ is independently deuterium. In some of the above embodiments, each of $R^{A1}$, $R^{A2}$, $R^{A3}$, and $R^C$ is independently deuterium. In some of the above embodiments, each of $R^{A1}$, $R^{A2}$, $R^{A3}$, and $R^C$ is independently H. In some of the above embodiments, two $R^B$ can be joined to form a 5-membered or 6-membered aromatic ring. In some of the above embodiments, one $R^C$ and one $R^B$ can be joined to form a ring.

In some embodiments, the ligand $L_A$ can be selected from the group consisting of: $L_A$1-(Rs)(Rt)(RU), $L_A$2-(Rs)(Rt)(Ru), $L_A$3-(Rs)(Rt)(Ru), $L_A$4-(Rs)(Rt)(Ru), $L_A$5-(Rs)(Rt)(RU), $L_A$6-(Rs)(Rt)(RU), $L_A$7-(Rs)(Rt)(Ru), $L_A$8-(Rs)(Rt)(Ru), $L_A$9-(Rs)(Rt)(Ru), $L_A$10-(Rs)(Rt)(Ru), $L_A$11-(Rs)(Rt)(Ru), $L_A$12-(Rs)(Rt)(Ru), $L_A$13-(Rs)(Rt)(Ru), $L_A$14-(Rs)(Rt)(Ru), $L_A$15-(Rs)(Rt)(Ru), $L_A$16-(Rs)(Rt)(Ru), $L_A$17-(Rs)(Rt)(Ru), $L_A$18-(Rs)(Rt)(Ru), $L_A$19-(Rs)(Rt)(Ru), $L_A$20-(Rs)(Rt)(Ru), $L_A$20-(Rs)(Rt)(Pu), $L_A$22-(Rs)(Rt)(Ru), $L_A$23-(Rs)(Rt)(Ru), $L_A$24-(Rs)(Rt)(Ru), $L_A$25-(Rs)(Rt)(Ru), $L_A$26-(Rs)(Rt)(Ru), $L_A$27-(Rs)(Rt)(Ru), $L_A$28-(Rs)(Rt)(Ru), $L_A$29-(Rs)(Rt)(Ru), $L_A$30-(Rs)(Rt)(Ru), $L_A$31-(Rs)(Rt)(Ru), and $L_A$32-(Rs)(Rt)(Ru), wherein s, t, and u are each independently an integer from 1 to 132, wherein:

-continued

| Ligand $L_A$ | Structure of $L_A$ |
|---|---|
| $L_A1$-(R1)(R1)(R1) to $L_A1$-(R132)(R132)(R132) having the structure | 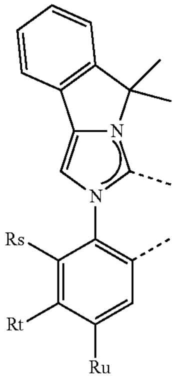 |
| $L_A2$-(R1)(R1)(R1) to $L_A2$-(R132)(R132)(R132) having the structure | 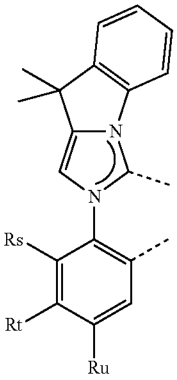 |
| $L_A3$-(R1)(R1)(R1) to $L_A3$-(R132)(R132)(R132) having the structure | 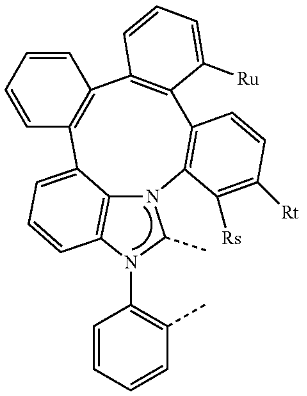 |
| $L_A4$-(R1)(R1)(R1) to $L_A4$-(R132)(R132)(R132) having the structure | 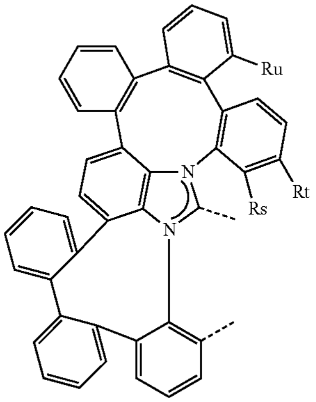 |
| $L_A5$-(R1)(R1)(R1) to $L_A5$-(R132)(R132)(R132) having the structure | 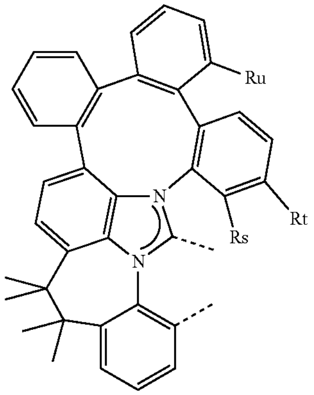 |
| $L_A6$-(R1)(R1)(R1) to $L_A6$-(R132)(R132)(R132) having the structure | 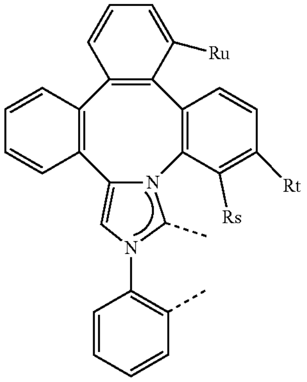 |
| $L_A7$-(R1)(R1)(R1) to $L_A7$-(R132)(R132)(R132) having the structure | 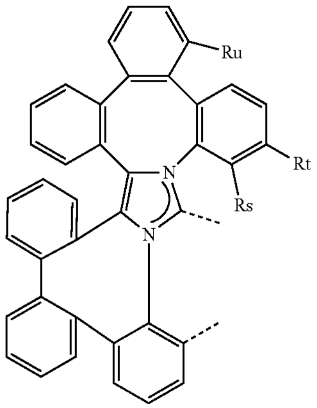 |
| $L_A8$-(R1)(R1)(R1) to $L_A8$-(R132)(R132)(R132) having the structure | 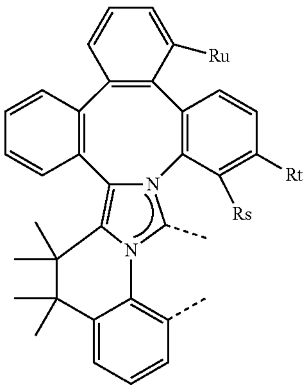 |

-continued

| Ligand $L_A$ | Structure of $L_A$ |
| --- | --- |
| $L_A9$-(R1)(R1)(R1) to $L_A9$-(R132)(R132)(R132) having the structure | 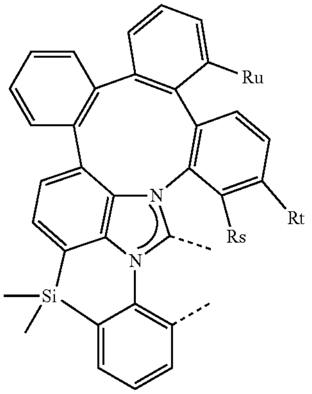 |
| $L_A10$-(R1)(R1)(R1) to $L_A10$-(R132)(R132)(R132) having the structure | 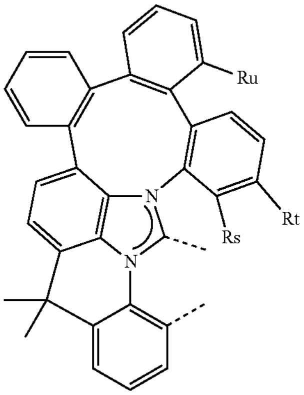 |
| $L_A11$-(R1)(R1)(R1) to $L_A11$-(R132)(R132)(R132) having the structure | 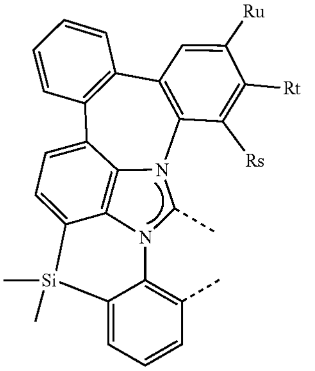 |
| $L_A12$-(R1)(R1)(R1) to $L_A12$ -(R132)(R132)(R132) having the structure | 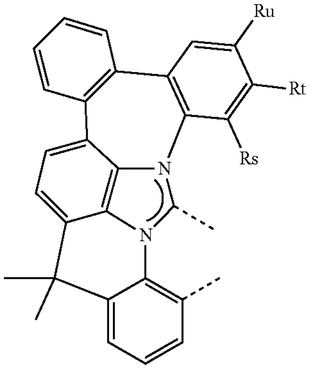 |

-continued

| Ligand $L_A$ | Structure of $L_A$ |
| --- | --- |
| $L_A13$-(R1)(R1)(R1) to $L_A13$-(R132)(R132)(R132) having the structure | 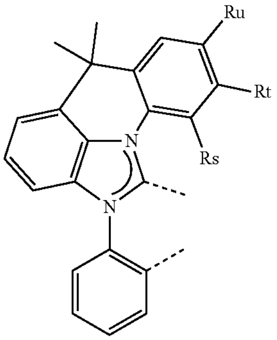 |
| $L_A14$-(R1)(R1)(R1) to $L_A14$-(R132)(R132)(R132) having the structure | 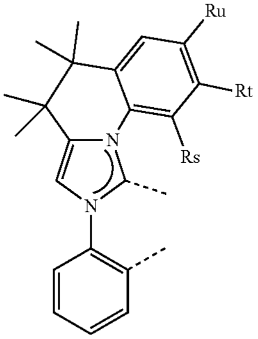 |
| $L_A15$-(R1)(R1)(R1) to $L_A15$-(R132)(R132)(R132) having the structure | 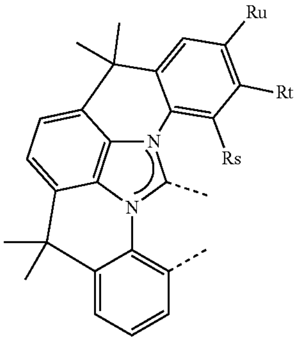 |
| $L_A16$-(R1)(R1)(R1) to $L_A16$-(R132)(R132)(R132) having the structure | 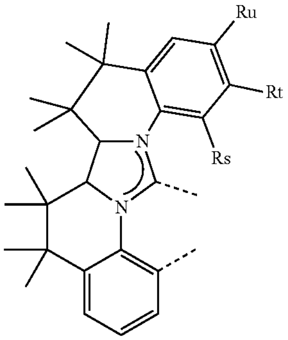 |

-continued

| Ligand $L_A$ | Structure of $L_A$ |
|---|---|
| $L_A$17-(R1)(R1)(R1) to $L_A$17-(R132)(R132)(R132) having the structure | 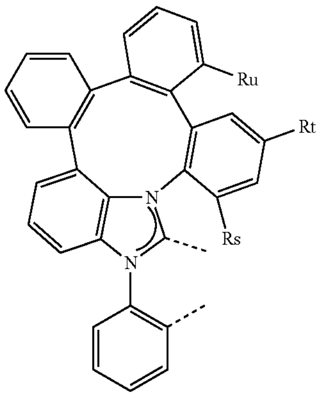 |
| $L_A$18-(R1)(R1)(R1) to $L_A$18-(R132)(R132)(R132) having the structure | 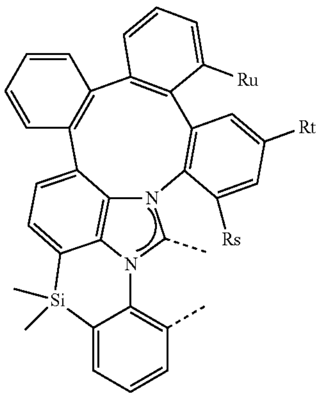 |
| $L_A$19-(R1)(R1)(R1) to $L_A$19-(R132)(R132)(R132) having the structure | 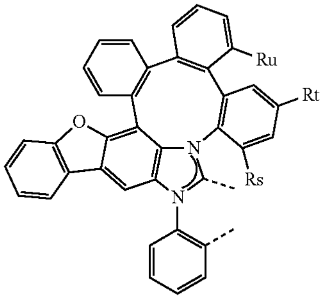 |
| $L_A$20-(R1)(R1)(R1) to $L_A$20-(R132)(R132)(R132) having the structure | 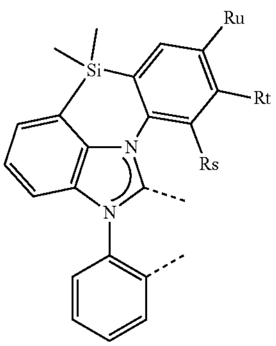 |
| $L_A$21-(R1)(R1)(R1) to $L_A$21-(R132)(R132)(R132) having the structure | 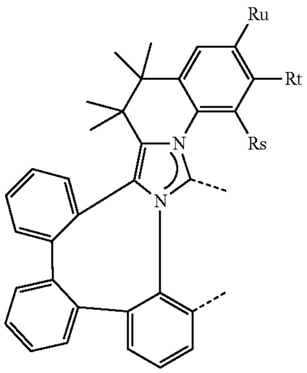 |
| $L_A$22-(R1)(R1)(R1) to $L_A$22-(R132)(R132)(R132) having the structure | 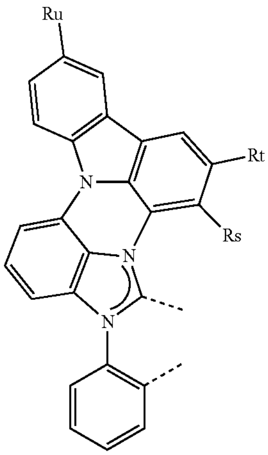 |
| $L_A$23-(R1)(R1)(R1) to $L_A$23-(R132)(R132)(R132) having the structure | 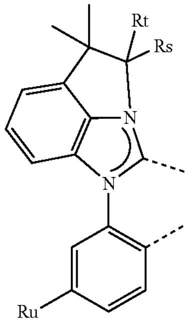 |
| $L_A$24-(R1)(R1)(R1) to $L_A$24-(R132)(R132)(R132) having the structure | 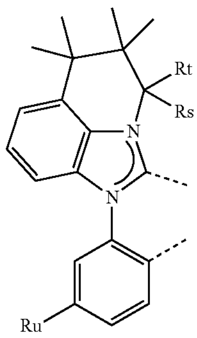 |

-continued

| Ligand $L_A$ | Structure of $L_A$ |
| --- | --- |
| $L_A25$-(R1)(R1)(R1) to $L_A25$-(R132)(R132)(R132) having the structure | 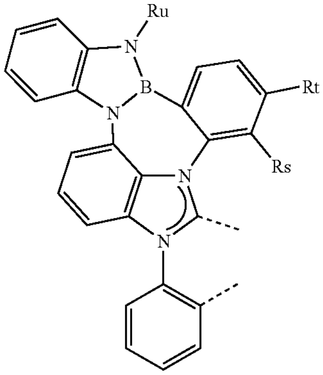 |
| $L_A26$-(R1)(R1)(R1) to $L_A26$-(R132)(R132)(R132) having the structure | 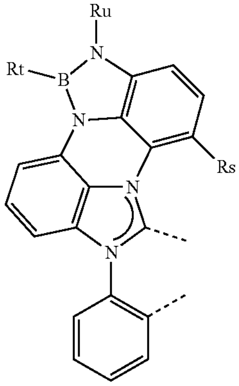 |
| $L_A27$-(R1)(R1)(R1) to $L_A27$-(R132)(R132)(R132) having the structure | 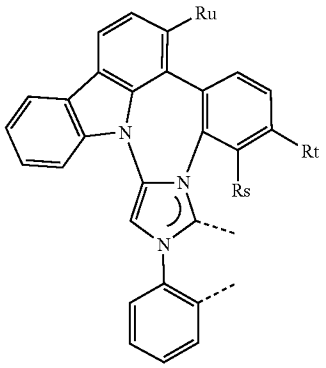 |
| $L_A28$-(R1)(R1)(R1) to $L_A28$-(R132)(R132)(R132) having the structure | 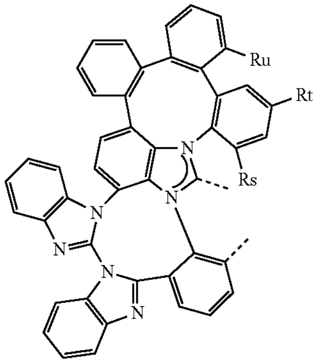 |

-continued

| Ligand $L_A$ | Structure of $L_A$ |
| --- | --- |
| $L_A29$-(R1)(R1)(R1) to $L_A29$-(R132)(R132)(R132) having the structure | 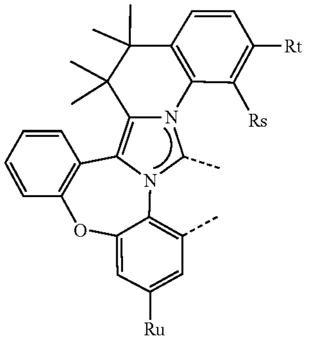 |
| $L_{A30}$-(R1)(R1)(R1) to $L_A30$-(R132)(R132)(R132) having the structure | 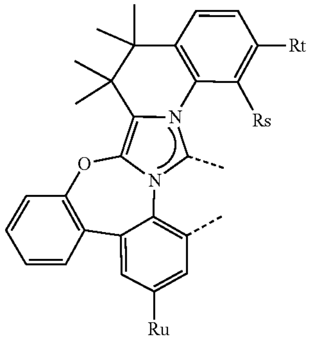 |
| $L_A31$-(R1)(R1)(R1) to $L_A31$-(R132)(R132)(R132) having the structure | 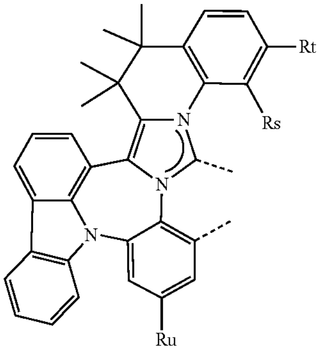 |
| $L_A32$-(R1)(R1)(R1) to $L_A32$-(R132)(R132)(R132) having the structure | 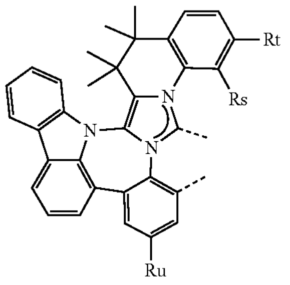 |

-continued

| Ligand $L_A$ | Structure of $L_A$ |
|---|---|
| $L_A$33-(R1)(R1)(R1) to $L_A$33-(R132)(R132)(R132) having the structure | 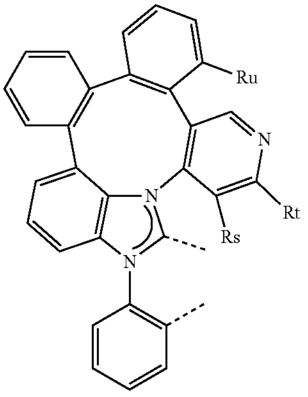 |
| $L_A$34-(R1)(R1)(R1) to $L_A$34-(R132)(R132)(R132) having the structure | 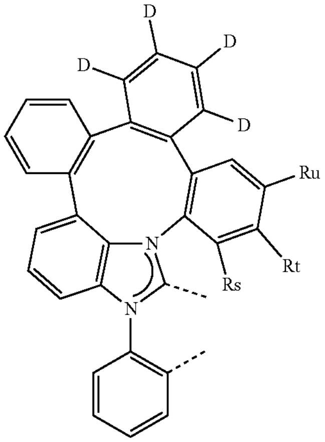 |
| $L_A$35-(R1)(R1)(R1) to $L_A$35-(R132)(R132)(R132) having the structure | 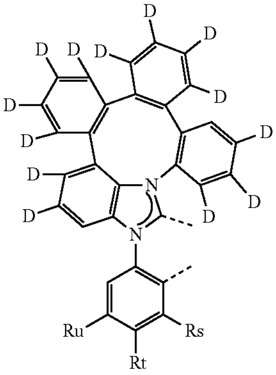 |

-continued

| Ligand $L_A$ | Structure of $L_A$ |
|---|---|
| $L_A$36-(R1)(R1)(R1) to $L_A$36-(R132)(R132)(R132) having the structure | 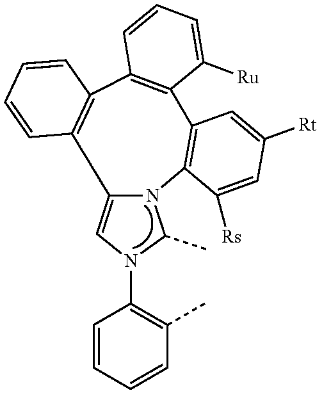 |
| $L_A$37-(R1)(R1)(R1) to $L_A$37-(R132)(R132)(R132) having the structure | 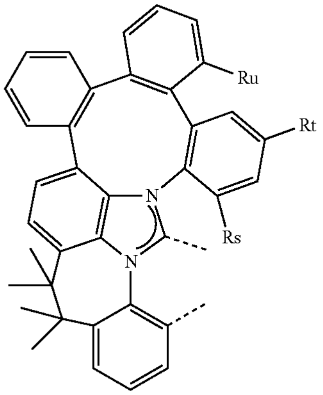 |
| $L_A$38-(R1)(R1)(R1) to $L_A$38-(R132)(R132)(R132) having the structure | 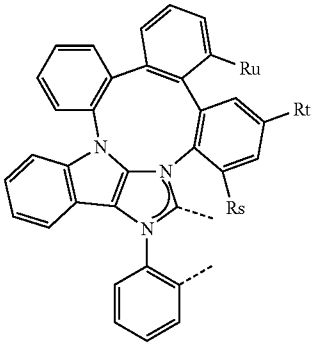 |

wherein R1 to R132 have the structures in the following LIST 1:

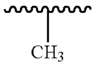
, R1

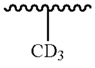
, R2

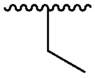
, R3

-continued
R4
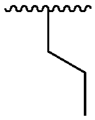,
R5
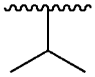,
R6
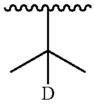,
R7
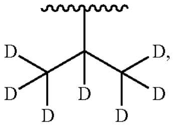
R8
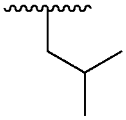,
R9
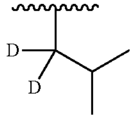,
R10
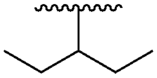,
R11
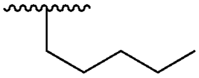,
R12
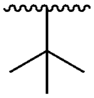,
R13
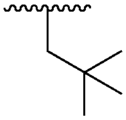,
R14
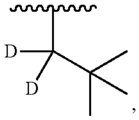,
R15
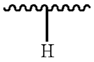,
R16
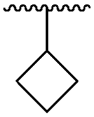,
-continued
R17
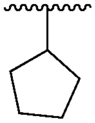,
R18
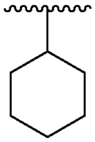,
R19
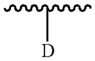,
R20
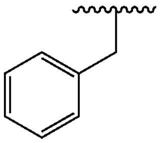,
R21
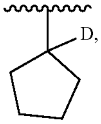
R22
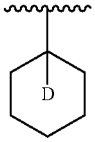,
R23
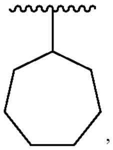,
R24
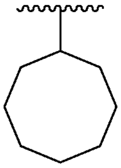,
R25
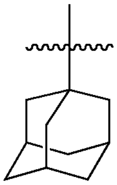,
R26
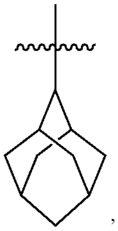, -continued
R27
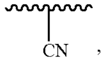
,
R28
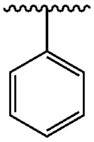
,
R29
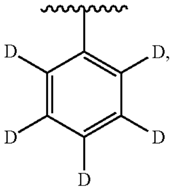
R30
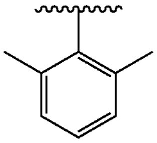
,
R31
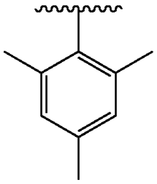
,
R32
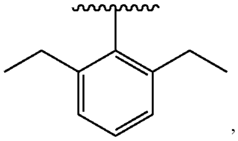
,
R33
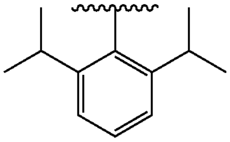
,
R34
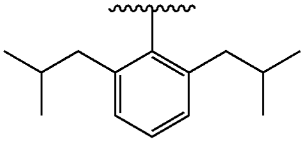
,
R35
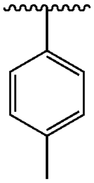
,
R36
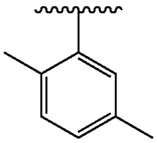
,
-continued
R37
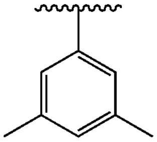
,
R38
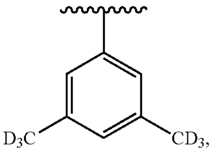
R39
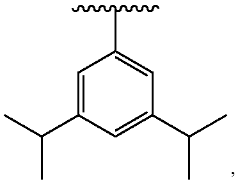
,
R40
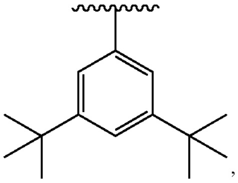
,
R41
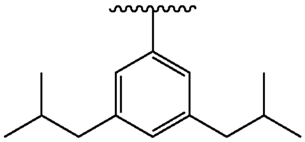
,
R42
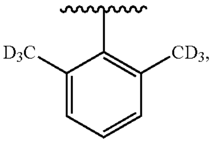
R43
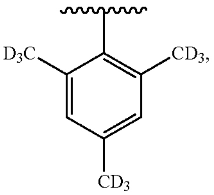
R44
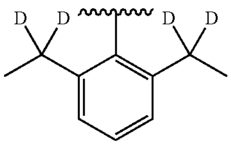
,
R45
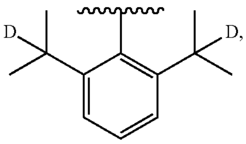

-continued
R46
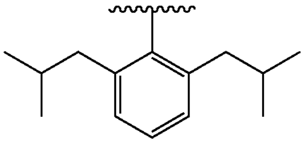
,
R47
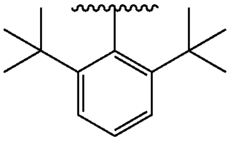
,
R48
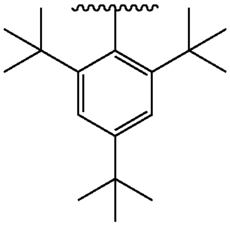
,
R49
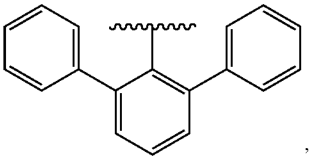
,
R50
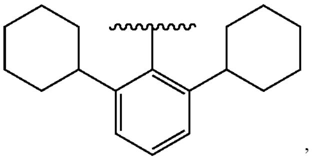
,
R51
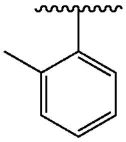
,
R52
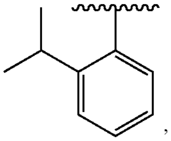
,
R53
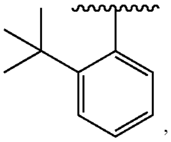
,
R54
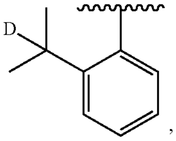
,
-continued
R55
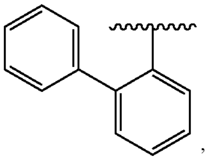
,
R56
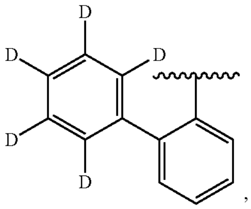
,
R57
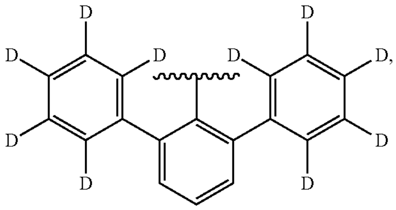
R58
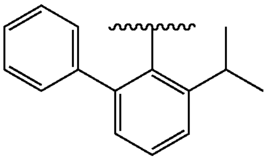
,
R59
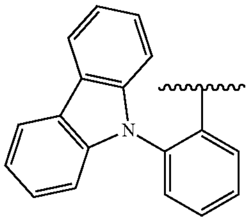
,
R60
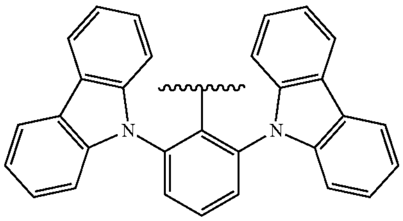
,
R61
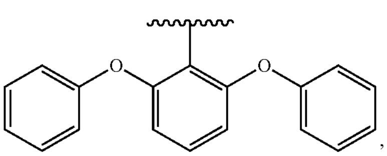
,
R62
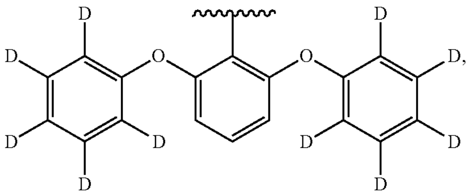

-continued
R63
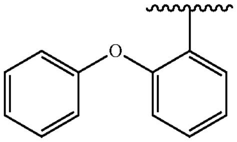
,
R64
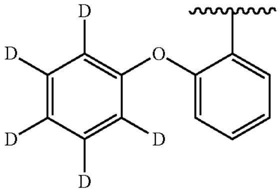
,
R65
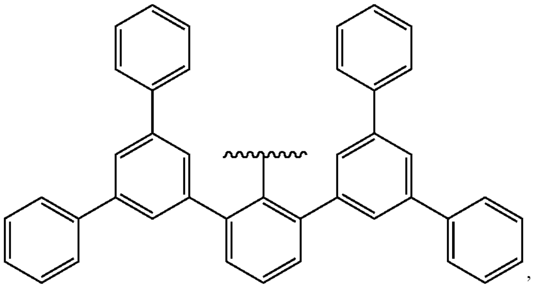
,
R66
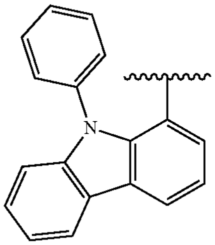
,
R67
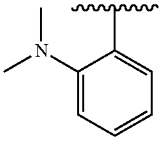
,
R68
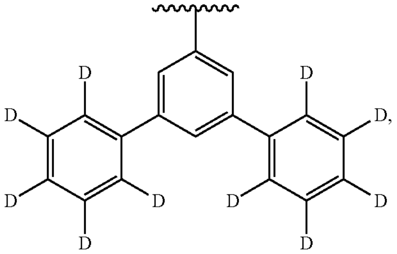
R69
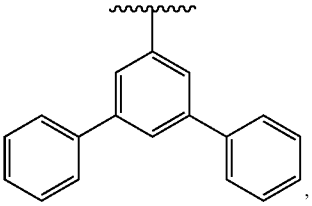
,
-continued
R70
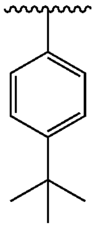
,
R71
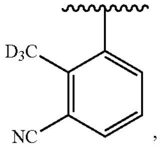
,
R72
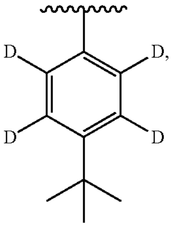
R73
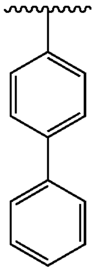
,
R74
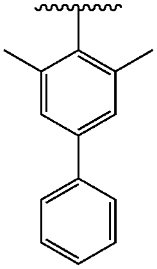
,
R75
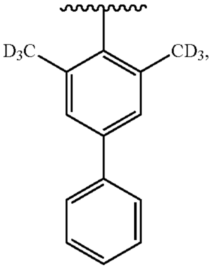

-continued
R76
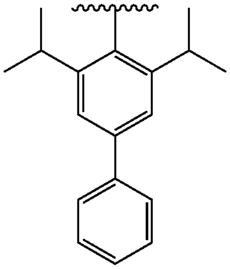,
R77
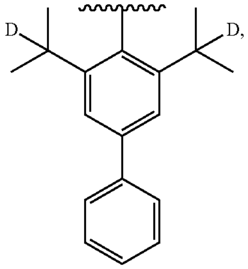
R78
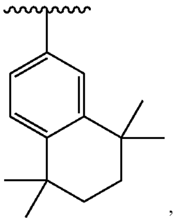,
R79
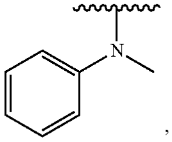,
R80
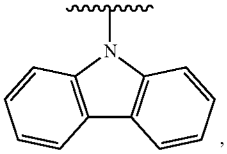,
R81
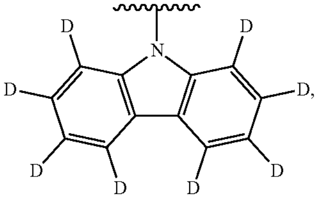
R82
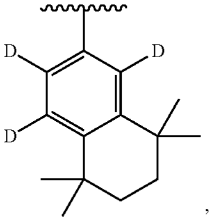,
-continued
R83
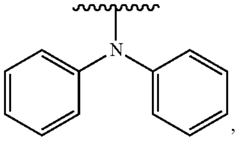,
R84
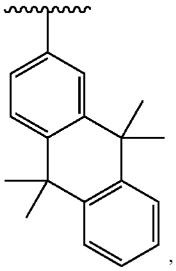,
R85
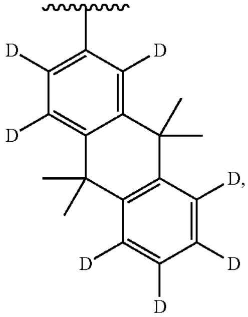
R86
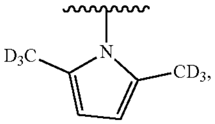
R87
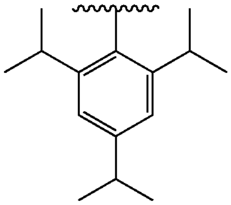,
R88
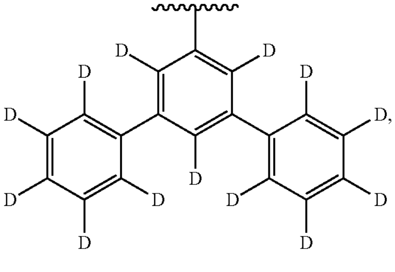
R89
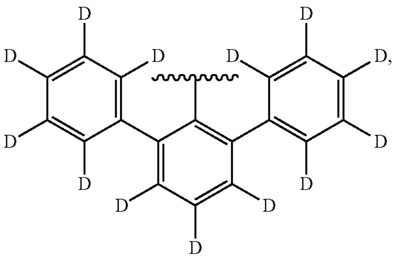

-continued
R90
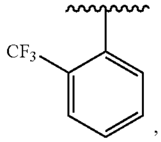
,
R91
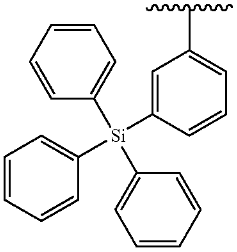
,
R92
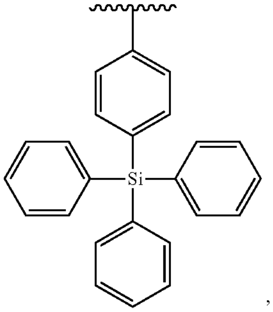
,
R93
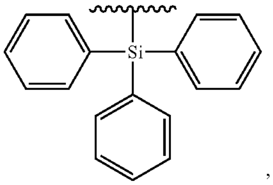
,
R94
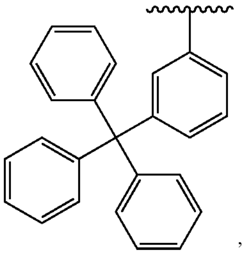
,
R95
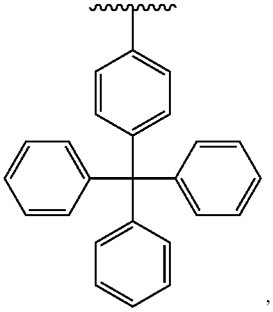
,
-continued
R96
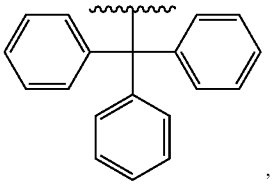
,
R97
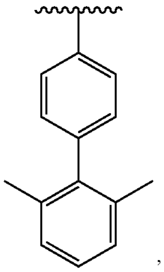
,
R98
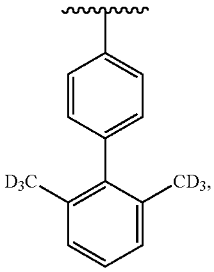
R99
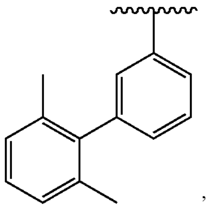
,
R100
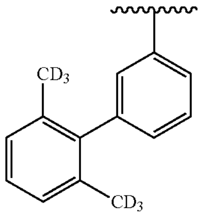
,
R101
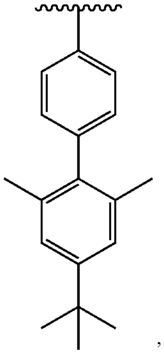
, -continued
R102
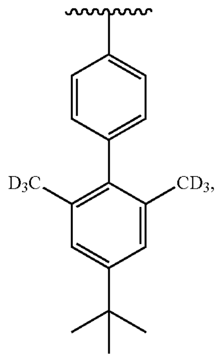
R103
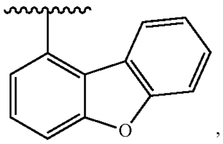
,
R104
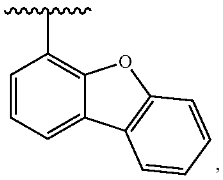
,
R105
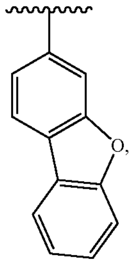
R106
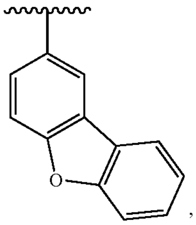
,
R107
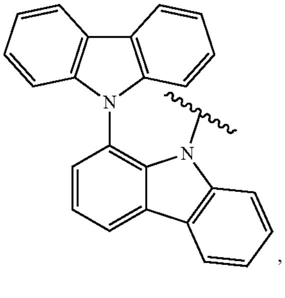
,
-continued
R108
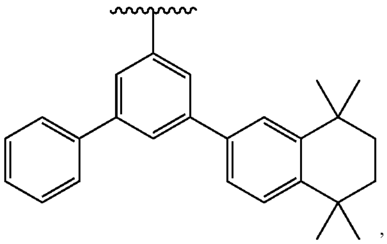
,
R109
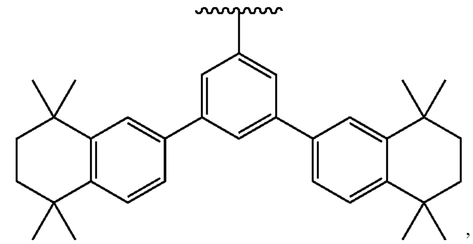
,
R110
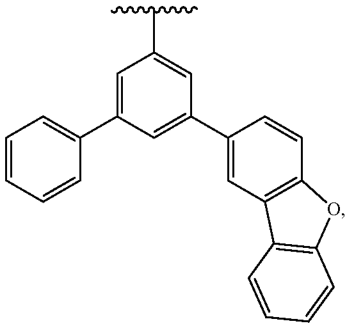
R111
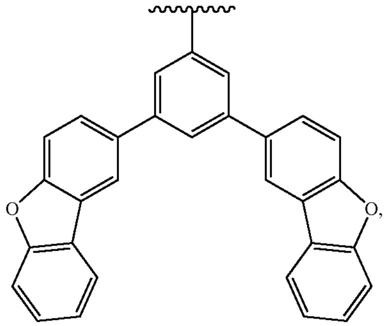
R112
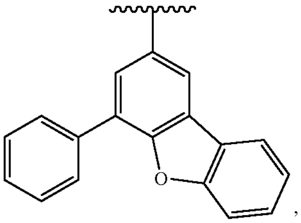
,
R113
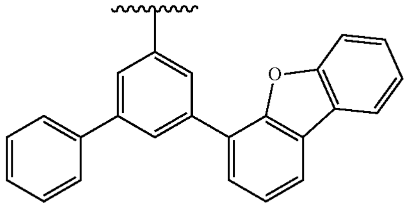
, -continued
R114
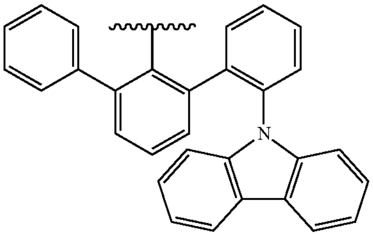
,
R115
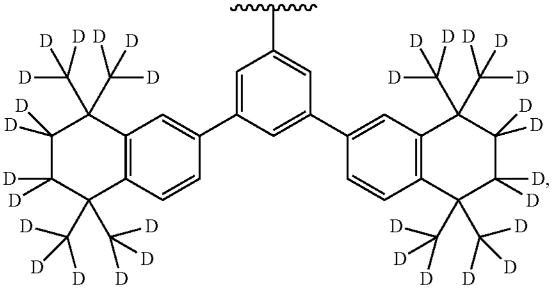
R116
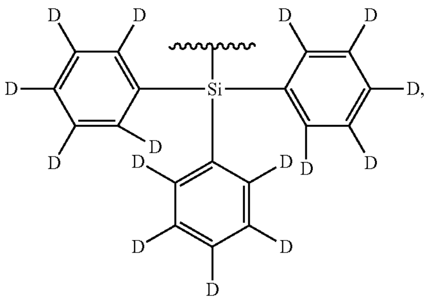
R117
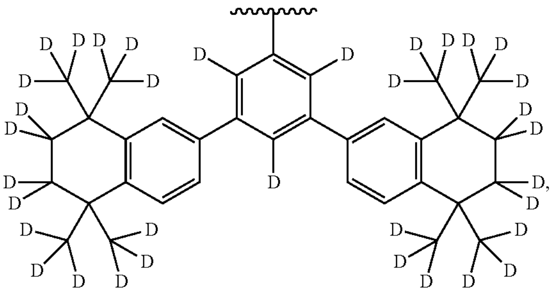
R118
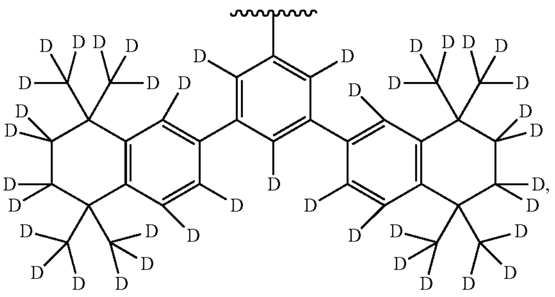
-continued
R119
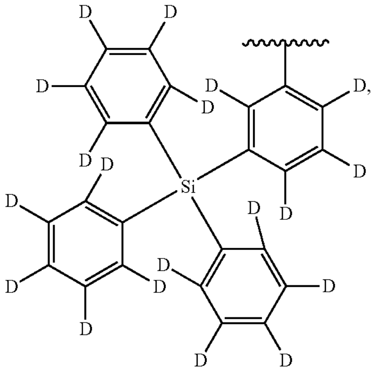
R120
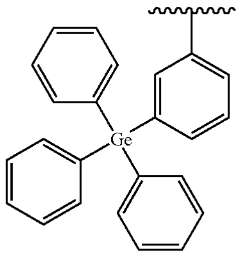
,
R121
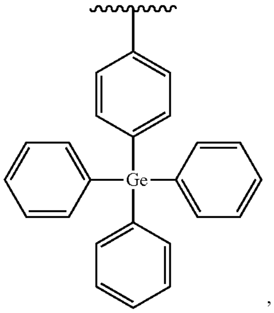
,
R122
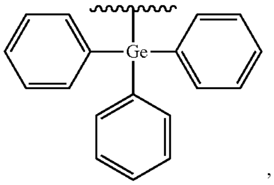
,
R123
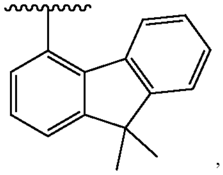
,
R124
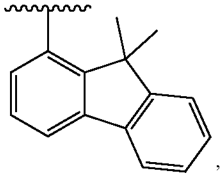
, -continued

R125

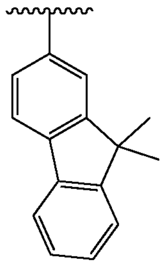

,

R126

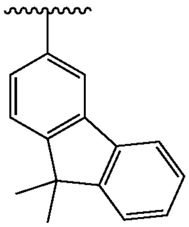

,

R127

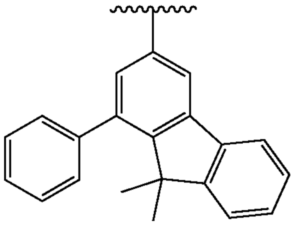

,

R128

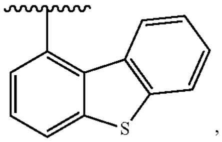

,

R129

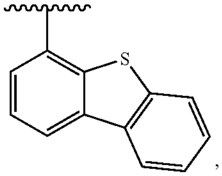

,

R130

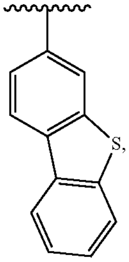

R131

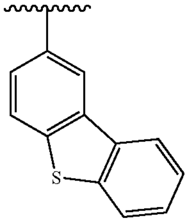

, and

-continued

R132

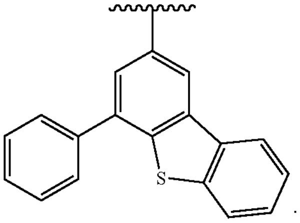

.

In some embodiments, the compound can have a formula of $M(L_A)_p(L_B)_q(L_C)_r$, wherein $L_B$ and $L_C$ are each a bidentate ligand; and wherein p is 1, 2, or 3; q is 0, 1, or 2; r is 0, 1, or 2; and p+q+r is the oxidation state of the metal M.

In some embodiments, the compound can have a formula selected from the group consisting of $Ir(L_A)_3$, $Ir(L_A)(L_B)_2$, $Ir(L_A)_2(L_B)$, $Ir(L_A)_2(L_C)$, and $Ir(L_A)(L_B)(L_C)$; and wherein $L_A$, $L_B$, and $L_C$ are different from each other.

In some embodiments, $L_B$ may be a substituted or unsubstituted phenylpyridine, and $L_C$ may be a substituted or unsubstituted acetylacetonate.

In some embodiments, the compound can have a formula of $Pt(L_A)(L_B)$; and wherein $L_A$ and $L_B$ can be same or different. In some embodiments, $L_A$ and $L_B$ are connected to form a tetradentate ligand.

In some embodiments, $L_B$ and $L_C$ can be each independently selected from the group consisting of:

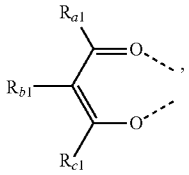

,

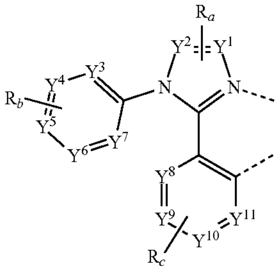

,

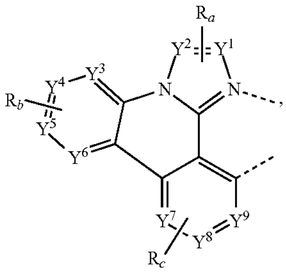

,

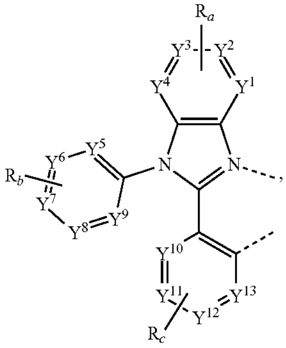

,

-continued
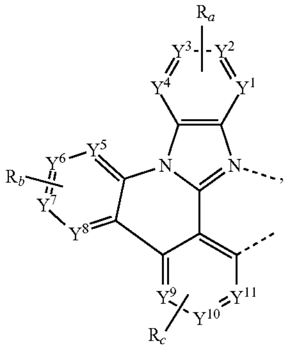
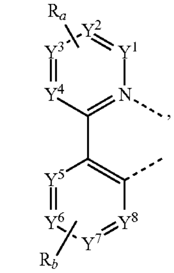
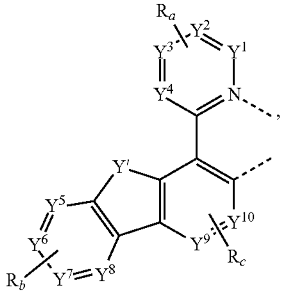
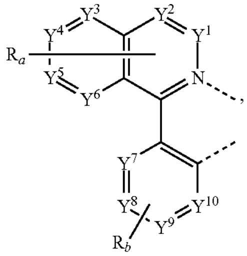
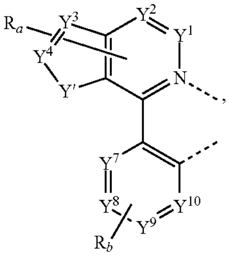
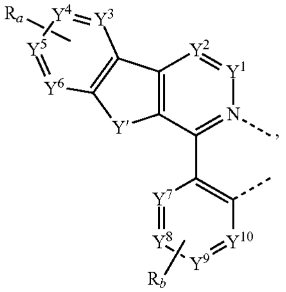
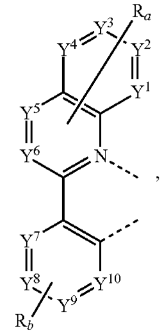
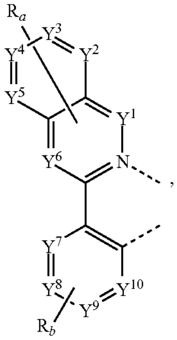
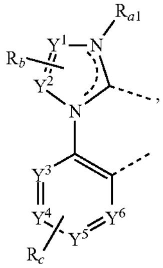
-continued
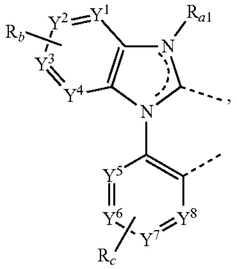
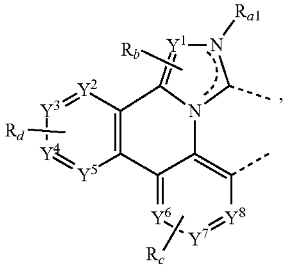
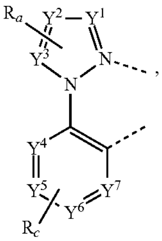
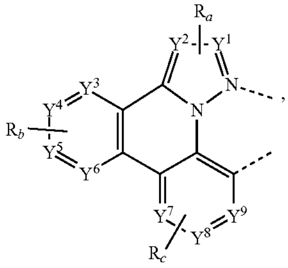
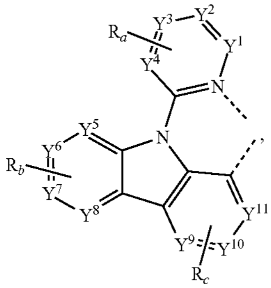
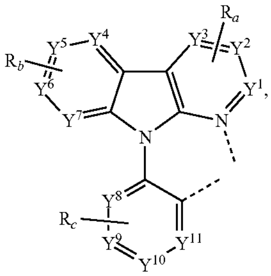
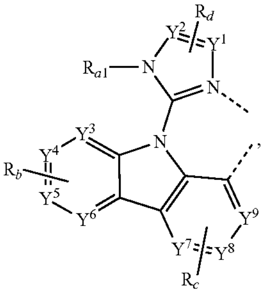
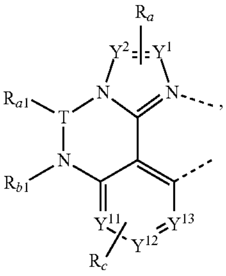
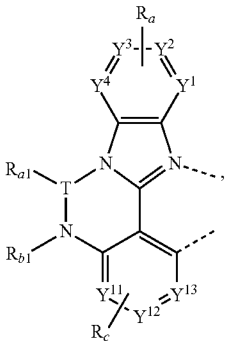

-continued

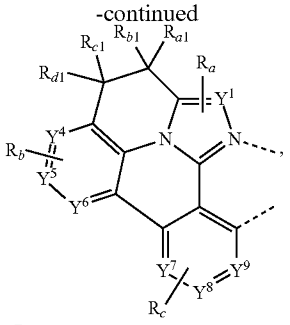

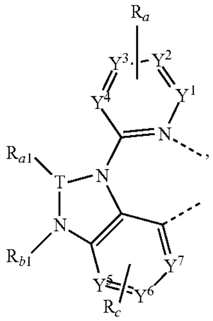

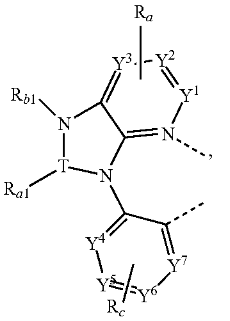

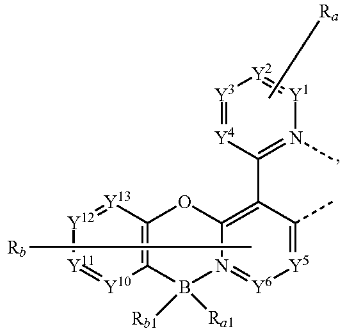

and

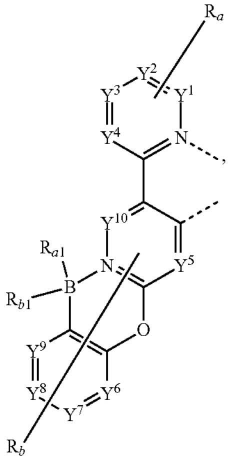

wherein: T is selected from the group consisting of B, Al, Ga, and In;

each of $Y^1$ to $Y^{13}$ is independently selected from the group consisting of carbon and nitrogen;

Y' is selected from the group consisting of $BR_e$, $NR_e$, $PR_e$, O, S, Se, C=O, S=O, $SO_2$, $CR_eR_f$, $SiR_eR_f$, and $GeR_eR_f$, $R_e$ and $R_f$ can be fused or joined to form a ring;

each $R_a$, $R_b$, $R_c$, and $R_d$ independently represents zero, mono, or up to a maximum allowed number of substitutions to its associated ring; each of $R_{a1}$, $R_{b1}$, $R_{c1}$, $R_{d1}$, $R_a$, $R_b$, $R_c$, $R_d$, $R_e$, and $R_f$ is independently a hydrogen or a substituent selected from the group consisting of deuterium, halide, alkyl, cycloalkyl, heteroalkyl, arylalkyl, alkoxy, aryloxy, amino, silyl, germyl, boryl, selenyl, alkenyl, cycloalkenyl, heteroalkenyl, alkynyl, aryl, heteroaryl, acyl, carbonyl, carboxylic acid, ester, nitrile, isonitrile, sulfanyl, sulfinyl, sulfonyl, phosphino, and combinations thereof; the general substituents defined herein; and any two $R_a$, $R_b$, $R_c$, $R_d$, $R_e$, and $R_f$ can be fused or joined to form a ring or form a multidentate ligand.

In some embodiments, $L_B$ and $L_C$ can be each independently selected from the group consisting of:

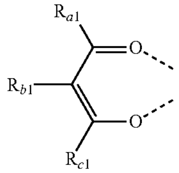

,

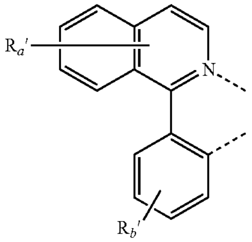

,

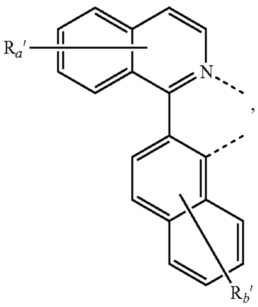

,

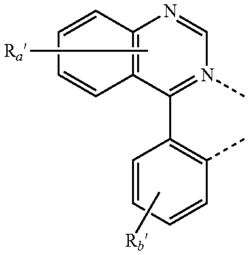

,

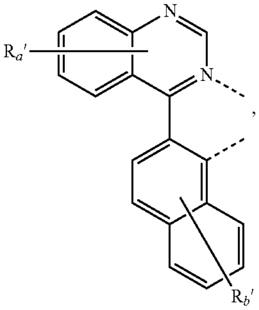

,

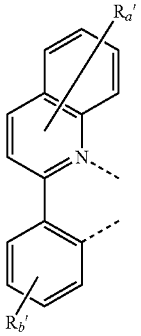

,

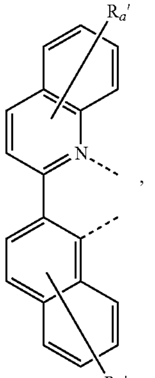

,

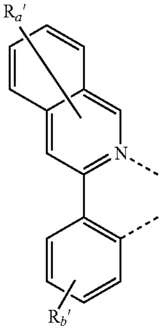

,

-continued
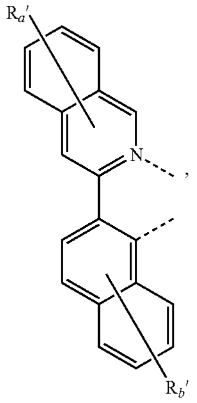
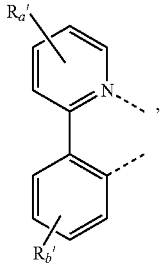
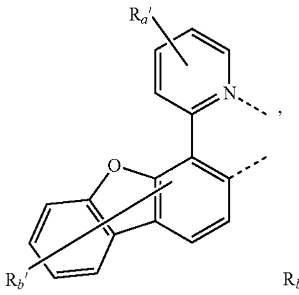
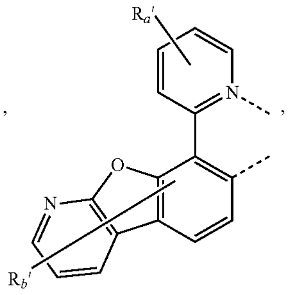
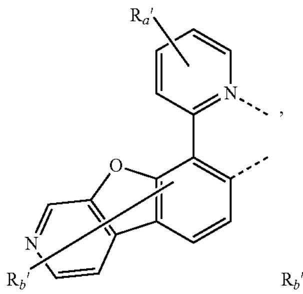
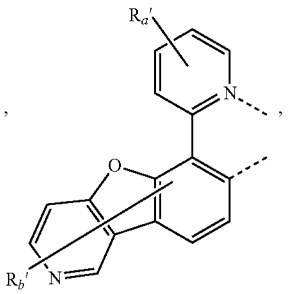
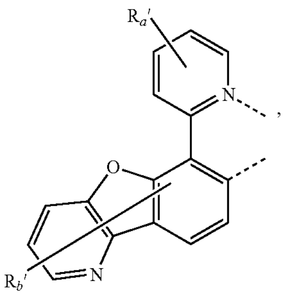
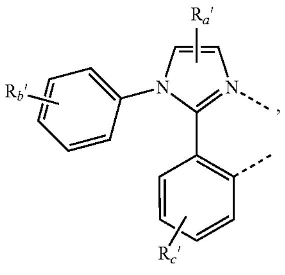
-continued
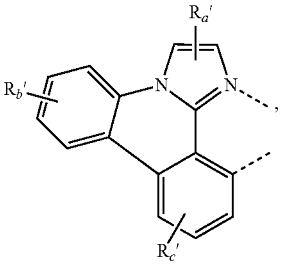
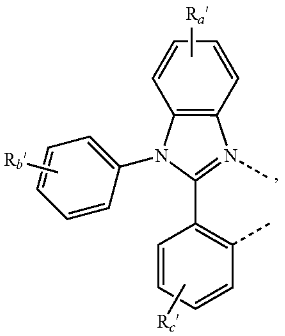
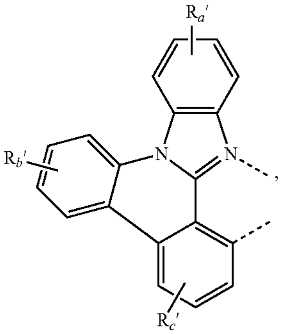
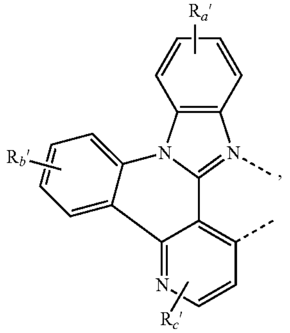
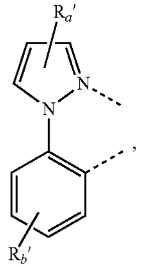
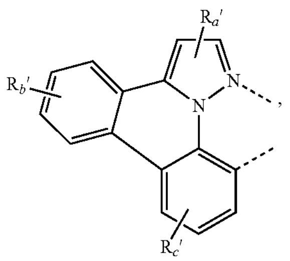
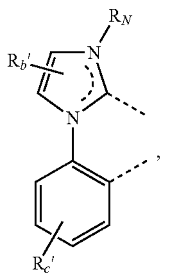

-continued
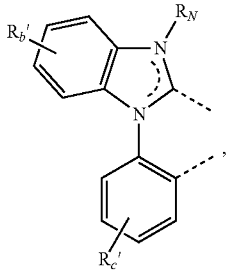
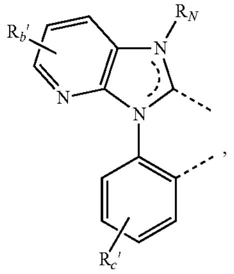
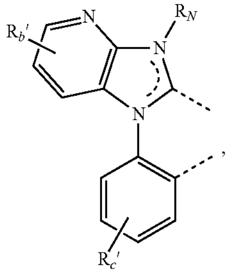
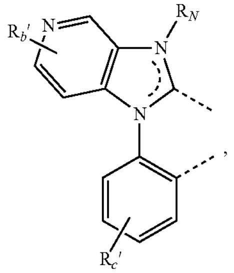
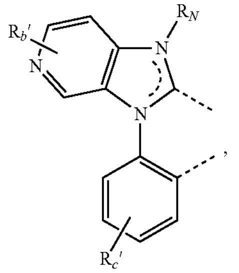
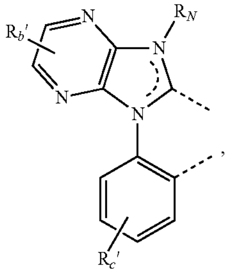
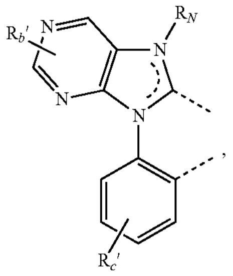
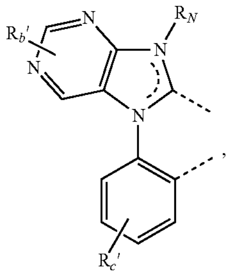
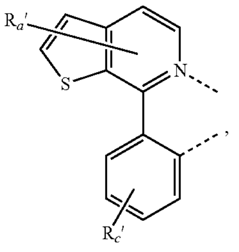
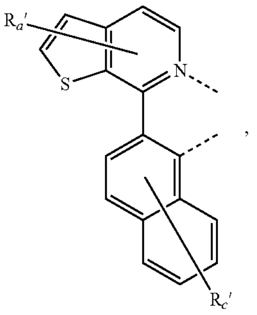
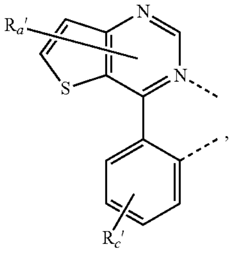
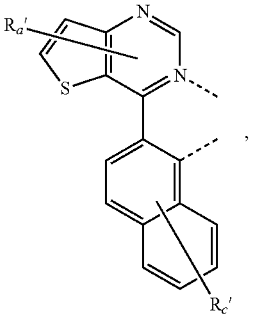
-continued
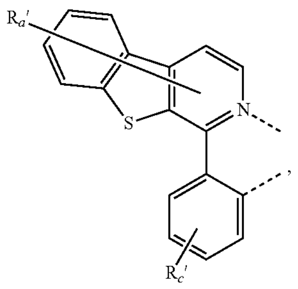
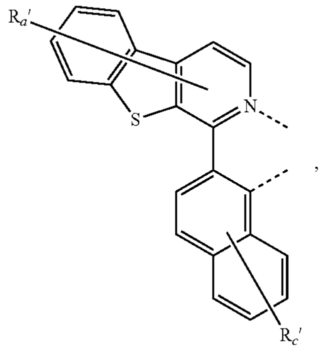
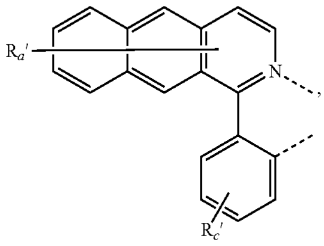
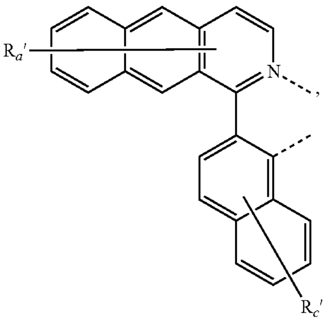
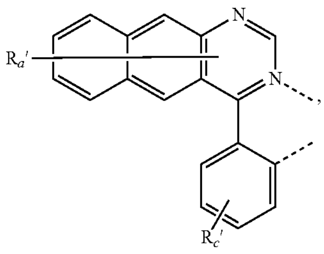

-continued
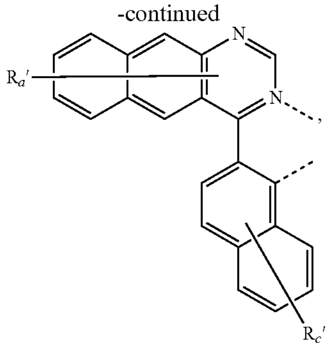
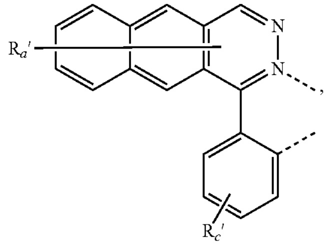
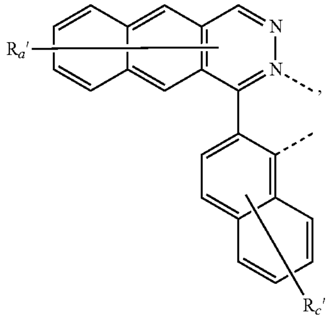
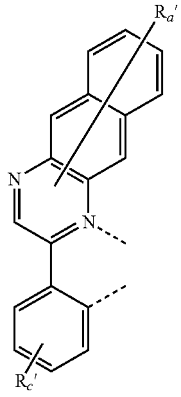
,
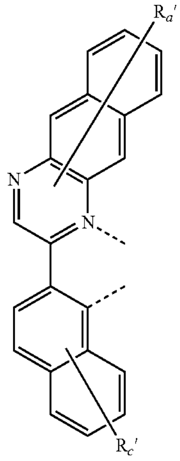
,
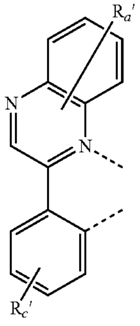
,
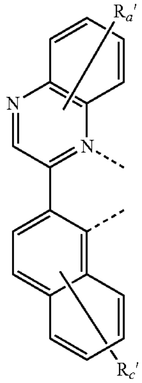
,
-continued
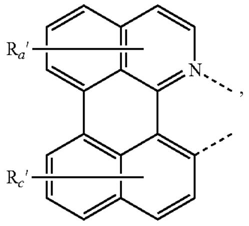
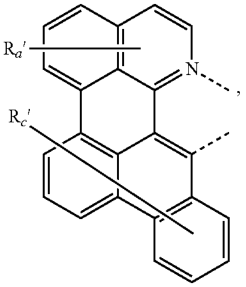
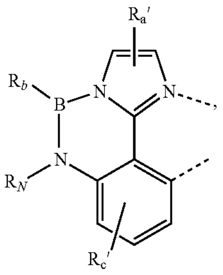
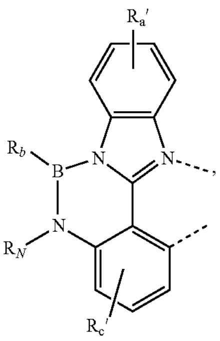
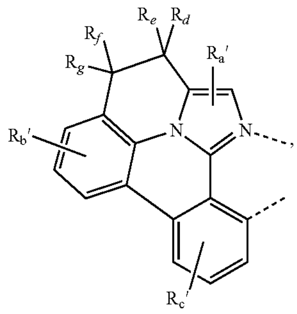
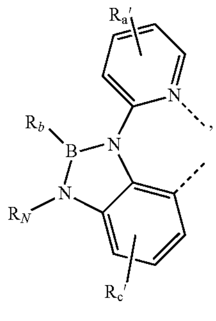

-continued

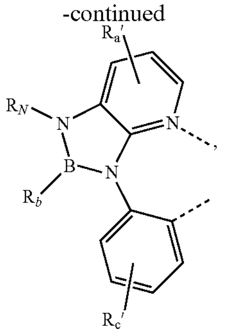

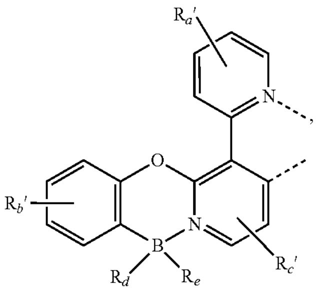

and

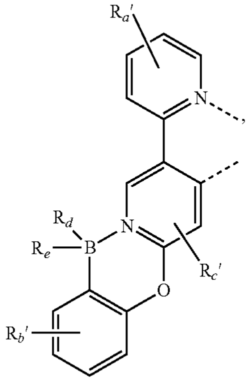

wherein: $R_a'$, $R_b'$, and $R_c'$ each independently represents zero, mono, or up to a maximum allowed number of substitutions to its associated ring; each of $R_{a1}$, $R_{b1}$, $R_{c1}$, $R_a$, $R_b$, $R_c$, $R_N$, $R_a'$, $R_b'$, and $R_c'$ is independently hydrogen or a substituent selected from the group consisting of deuterium, halide, alkyl, cycloalkyl, heteroalkyl, arylalkyl, alkoxy, aryloxy, amino, silyl, germyl, boryl, selenyl, alkenyl, cycloalkenyl, heteroalkenyl, alkynyl, aryl, heteroaryl, acyl, carbonyl, carboxylic acid, ester, nitrile, isonitrile, sulfanyl, sulfinyl, sulfonyl, phosphino, and combinations thereof; and any two $R_a'$, $R_b'$, and $R_c'$ can be fused or joined to form a ring or form a multidentate ligand.

In some embodiments, the compound can be selected from the group consisting of $Ir(L_A)_3$, $Ir(L_A)(L_{Bk})_2$, $Ir(L_A)_2(L_{Bk})$, $Ir(L_A)_2(L_{Cj-I})$, and $Ir(L_A)_2(L_{Cj-II})$, wherein $L_A$ is a ligand as defined herein; wherein k is an integer from 1 to 545, and each $L_{Bk}$ is defined below in LIST 2:

$L_{B1}$

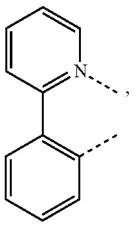

$L_{B2}$

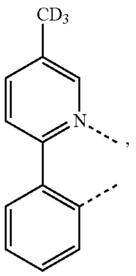

$L_{B3}$

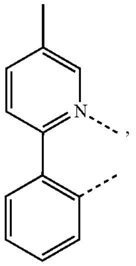

$L_{B4}$

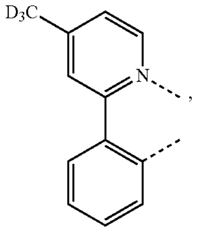

$L_{B5}$

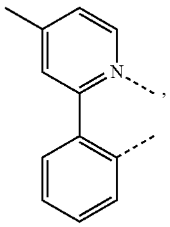

$L_{B6}$

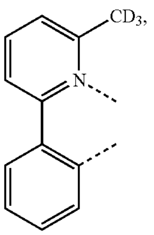

$L_{B7}$
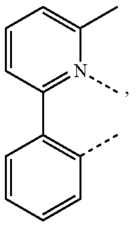
$L_{B8}$
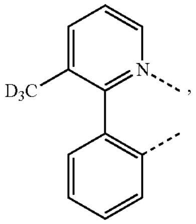
$L_{B9}$
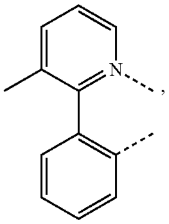
$L_{B10}$
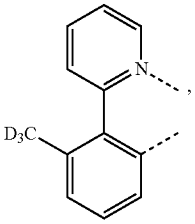
$L_{B11}$
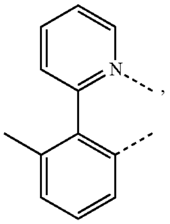
$L_{B12}$
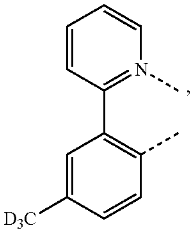
$L_{B13}$
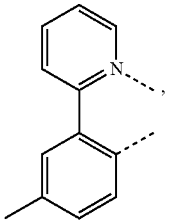
$L_{B14}$
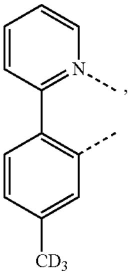
$L_{B15}$
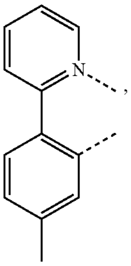
$L_{B16}$
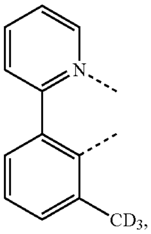
$L_{B17}$
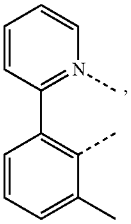
$L_{B18}$
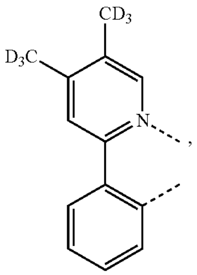

$L_{B19}$
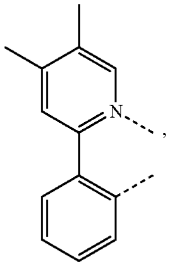
$L_{B20}$
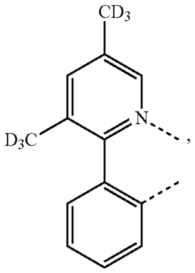
$L_{B21}$
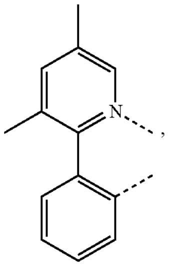
$L_{B22}$
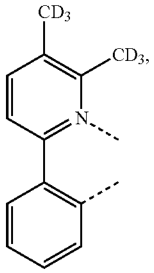
$L_{B23}$
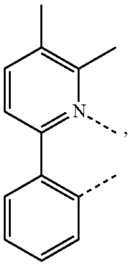
$L_{B24}$
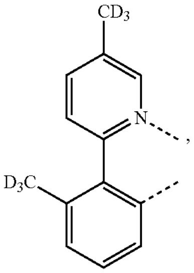
$L_{B25}$
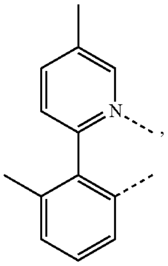
$L_{B26}$
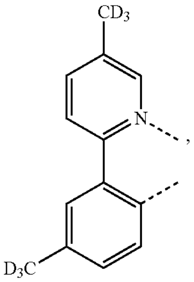
$L_{B27}$
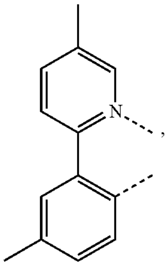
$L_{B28}$
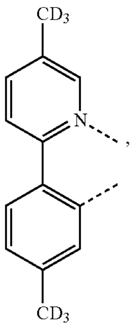

-continued
$L_{B29}$
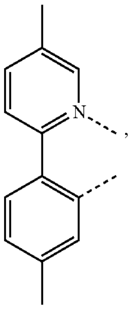
$L_{B30}$
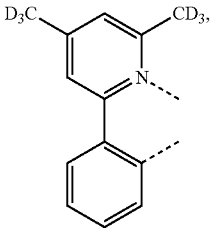
$L_{B31}$
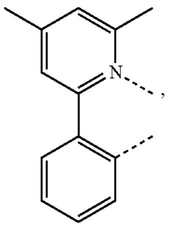
$L_{B32}$
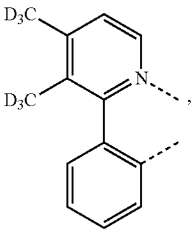
$L_{B33}$
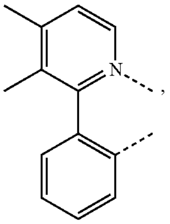
$L_{B34}$
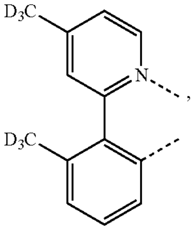
-continued
$L_{B35}$
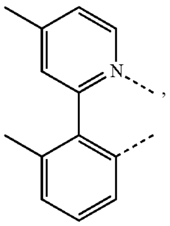
$L_{B36}$
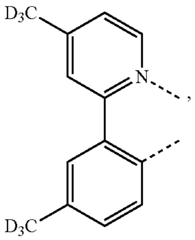
$L_{B37}$
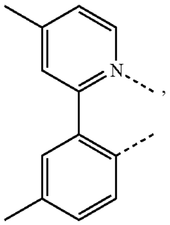
$L_{B38}$
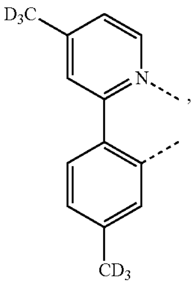
$L_{B39}$
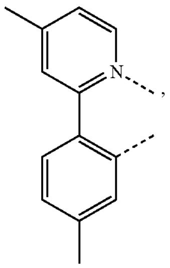
$L_{B40}$
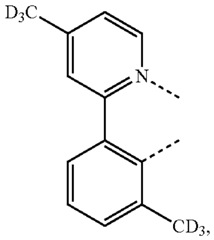

-continued
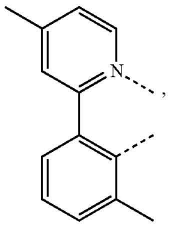
$L_{B41}$
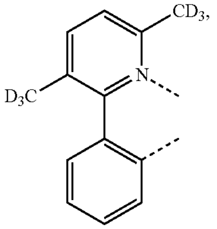
$L_{B42}$
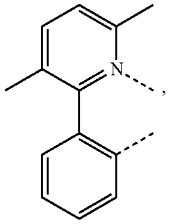
$L_{B43}$
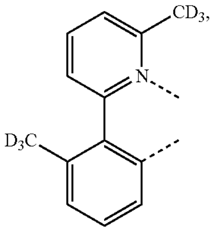
$L_{B44}$
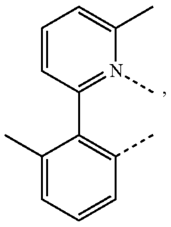
$L_{B45}$
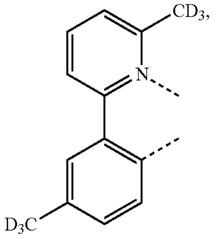
$L_{B46}$
-continued
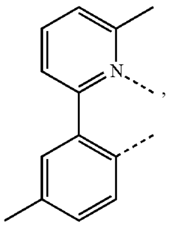
$L_{B47}$
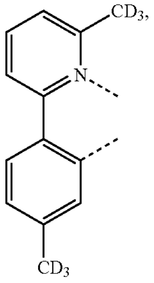
$L_{B48}$
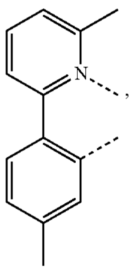
$L_{B49}$
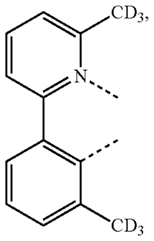
$L_{B50}$
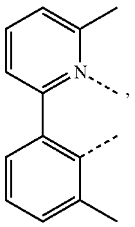
$L_{B51}$
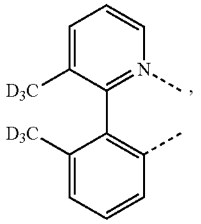
$L_{B52}$ -continued
$L_{B53}$
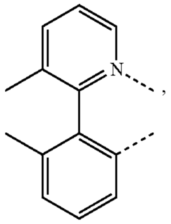
$L_{B54}$
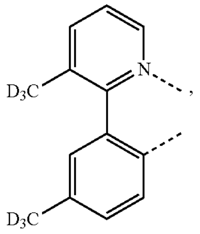
$L_{B55}$
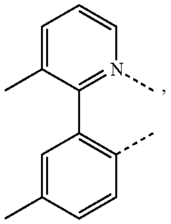
$L_{B56}$
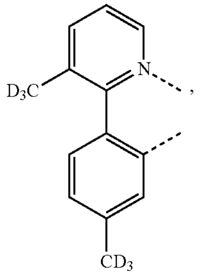
$L_{B57}$
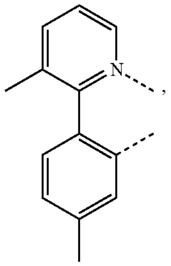
$L_{B58}$
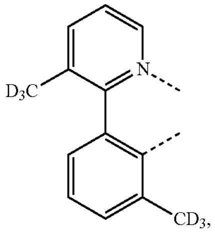
-continued
$L_{B59}$
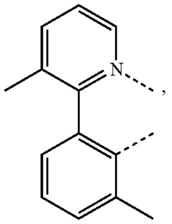
$L_{B60}$
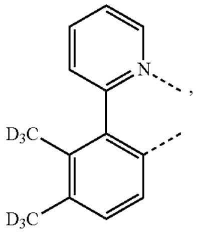
$L_{B61}$
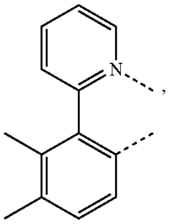
$L_{B62}$
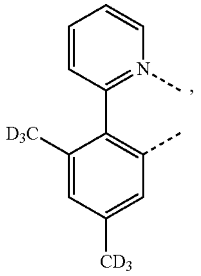
$L_{B63}$
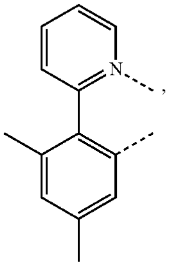
$L_{B64}$
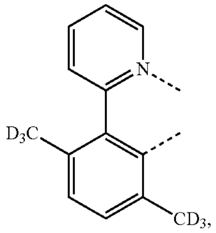

-continued
$L_{B65}$
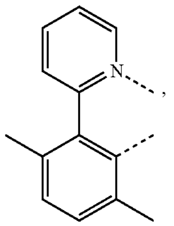
$L_{B66}$
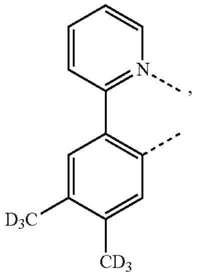
$L_{B67}$
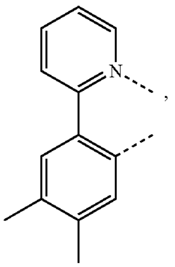
$L_{B68}$
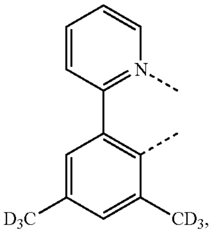
$L_{B69}$
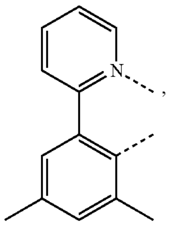
$L_{B70}$
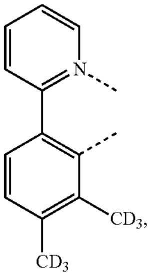
-continued
$L_{B71}$
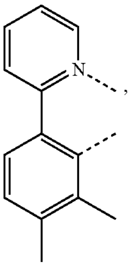
$L_{B72}$
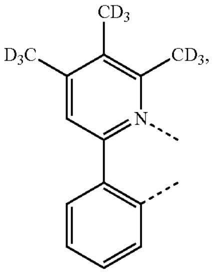
$L_{B73}$
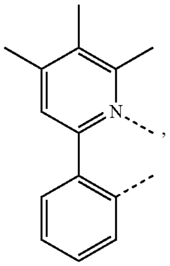
$L_{B74}$
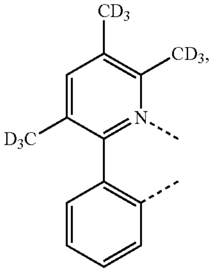
$L_{B75}$
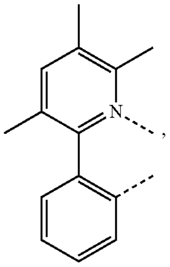

-continued
$L_{B76}$
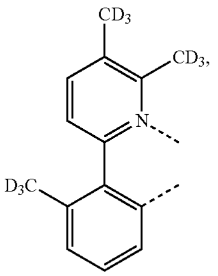
$L_{B77}$
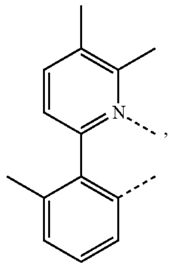
$L_{B78}$
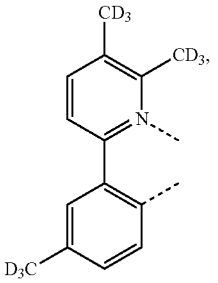
$L_{B79}$
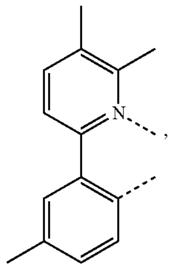
$L_{B80}$
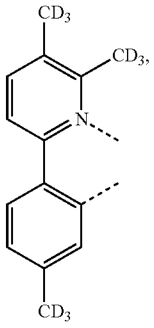
-continued
$L_{B81}$
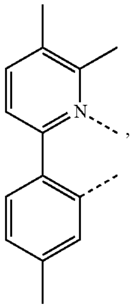
$L_{B82}$
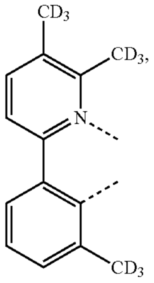
$L_{B83}$
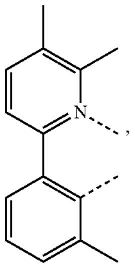
$L_{B84}$
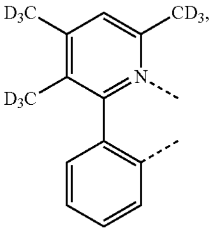
$L_{B85}$
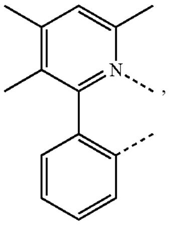
$L_{B86}$
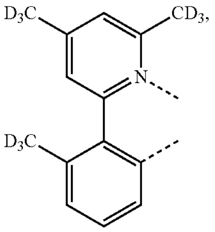

-continued
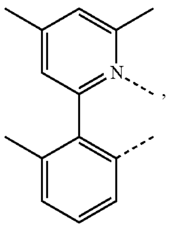
$L_{B87}$
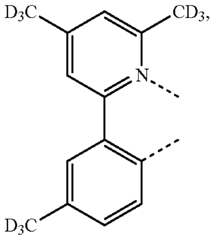
$L_{B88}$
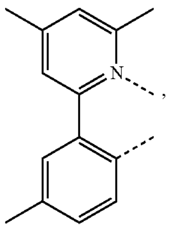
$L_{B89}$
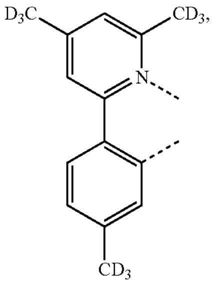
$L_{B90}$
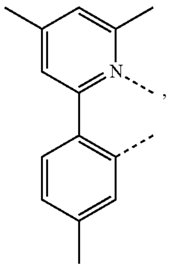
$L_{B91}$
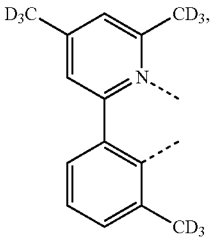
$L_{B92}$
-continued
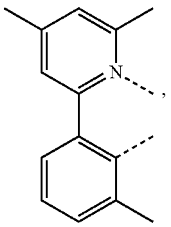
$L_{B93}$
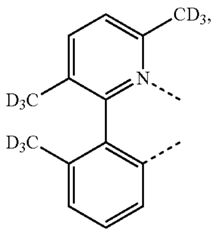
$L_{B94}$
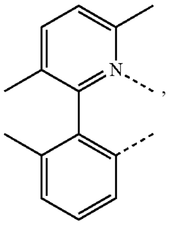
$L_{B95}$
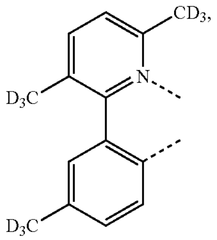
$L_{B96}$
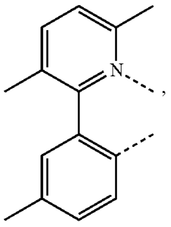
$L_{B97}$
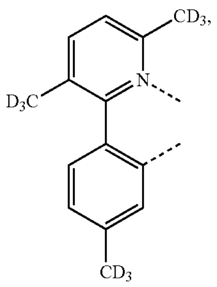
$L_{B98}$ -continued
$L_{B99}$
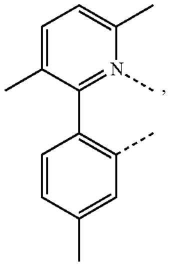
$L_{B100}$
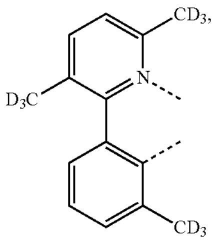
$L_{B101}$
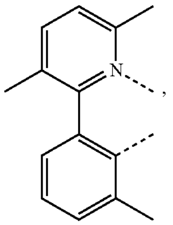
$L_{B102}$
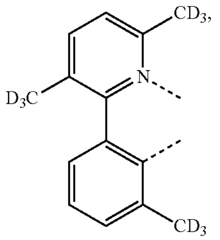
$L_{B103}$
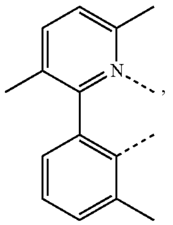
$L_{B104}$
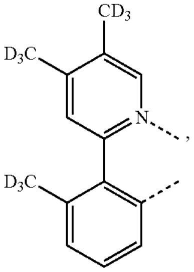
-continued
$L_{B105}$
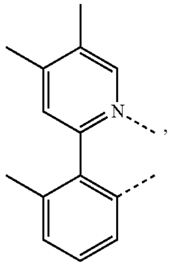
$L_{B106}$
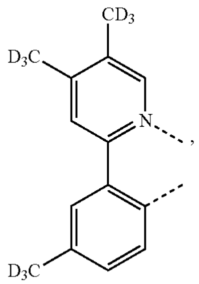
$L_{B107}$
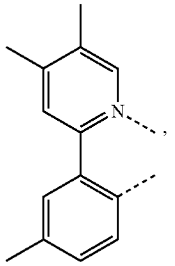
$L_{B108}$
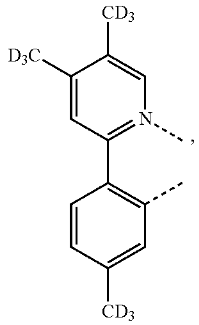
$L_{B109}$
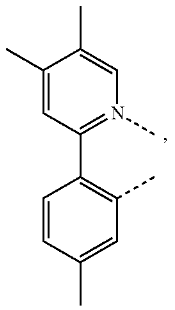

-continued
$L_{B110}$
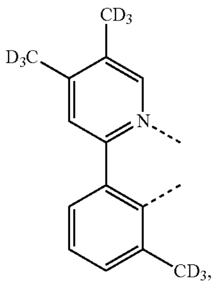
$L_{B111}$
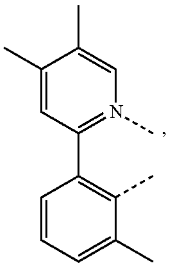
$L_{B112}$
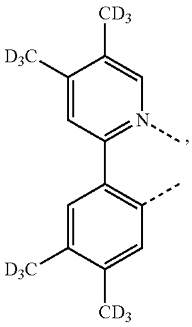
$L_{B113}$
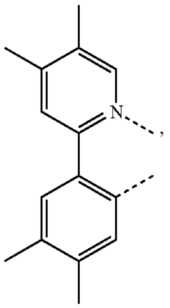
$L_{B114}$
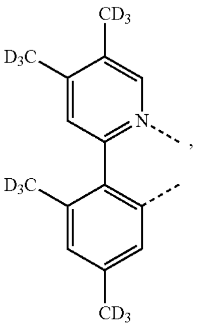
-continued
$L_{B115}$
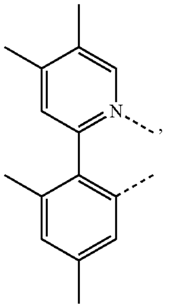
$L_{B116}$
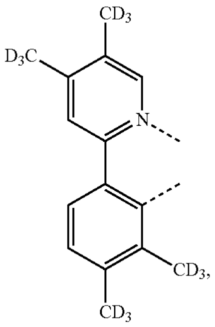
$L_{B117}$
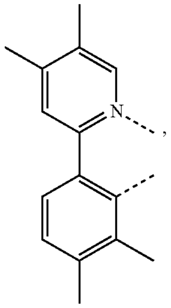
$L_{B118}$
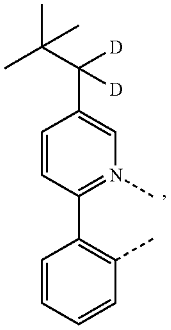
$L_{B119}$
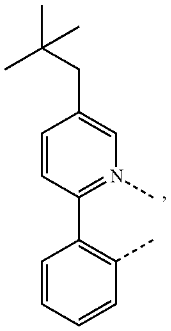

-continued
$L_{B120}$
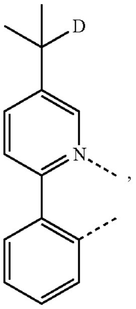
$L_{B121}$
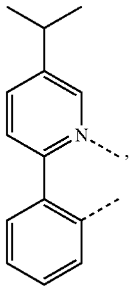
$L_{B122}$
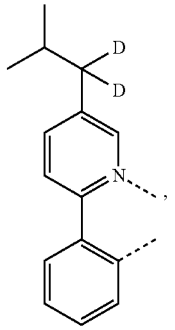
$L_{B123}$
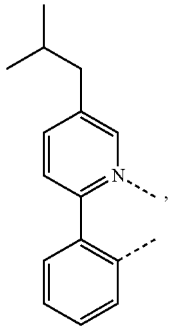
$L_{B124}$
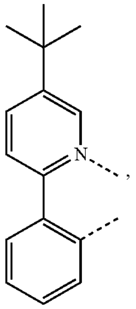
-continued
$L_{B125}$
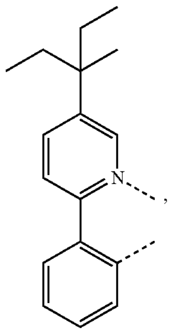
$L_{B126}$
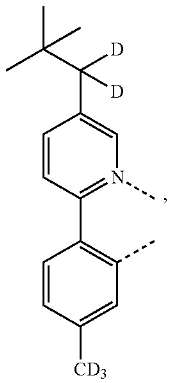
$L_{B127}$
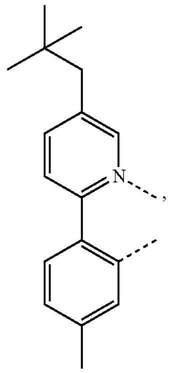
$L_{B128}$
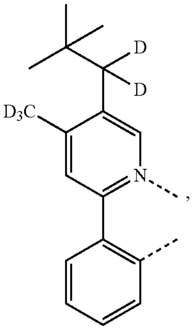

-continued
$L_{B129}$
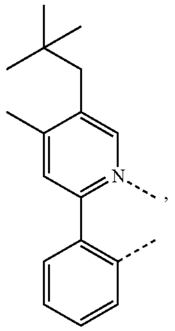
$L_{B130}$
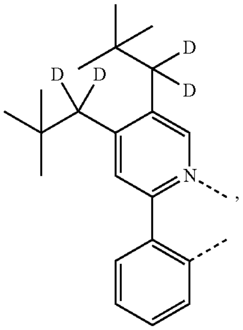
$L_{B131}$
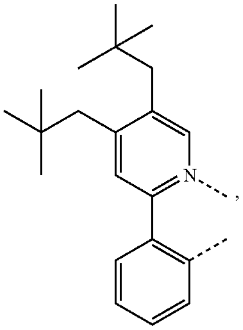
$L_{B132}$
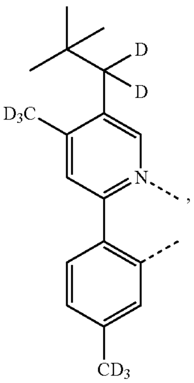
-continued
$L_{B133}$
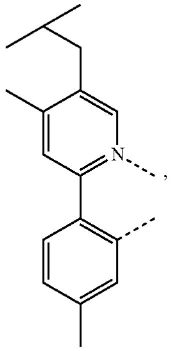
$L_{B134}$
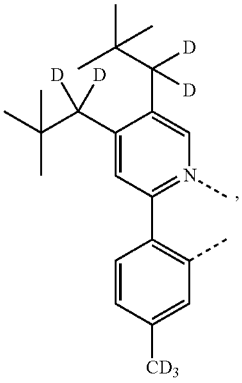
$L_{B135}$
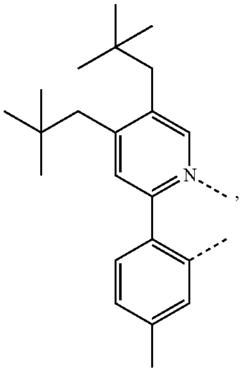
$L_{B136}$
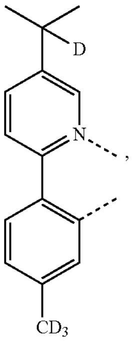

-continued
$L_{B137}$
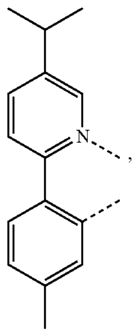
$L_{B138}$
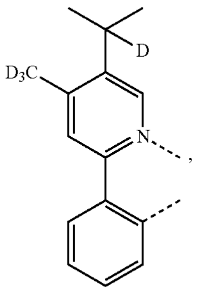
$L_{B139}$
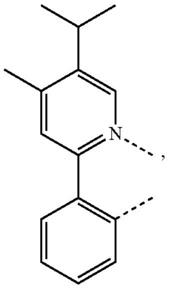
$L_{B140}$
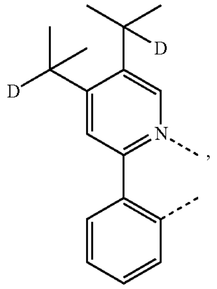
$L_{B141}$
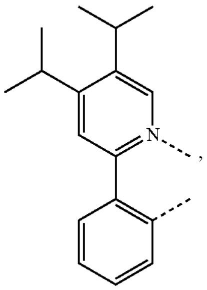
-continued
$L_{B142}$
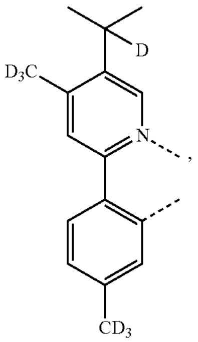
$L_{B143}$
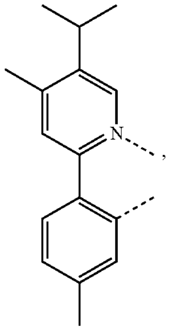
$L_{B144}$
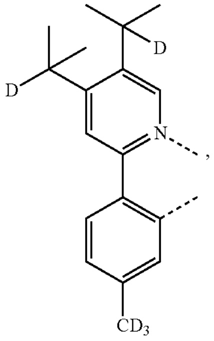
$L_{B145}$
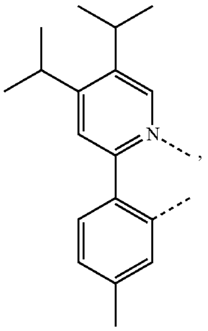

-continued
$L_{B146}$
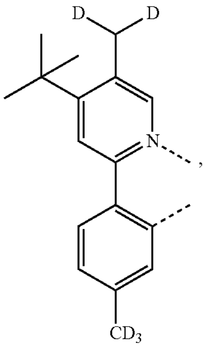
$L_{B147}$
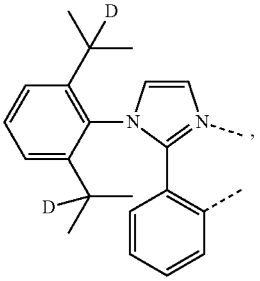
$L_{B148}$
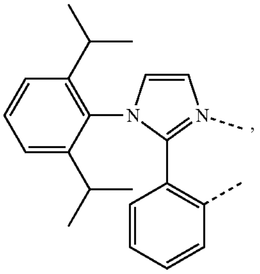
$L_{B149}$
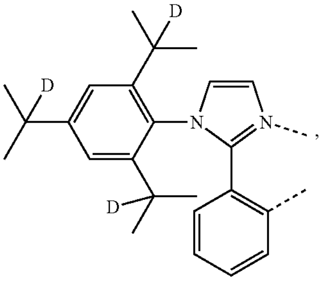
$L_{B150}$
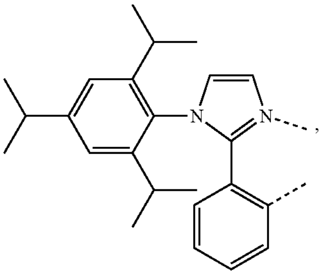
-continued
$L_{B151}$
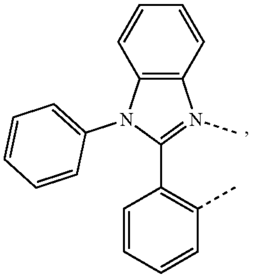
$L_{B152}$
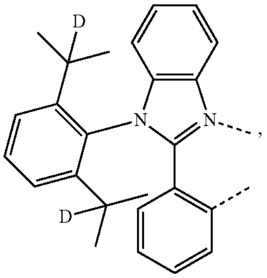
$L_{B153}$
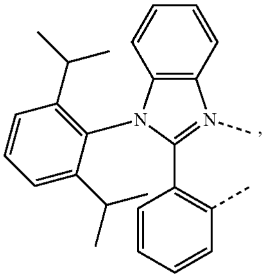
$L_{B154}$
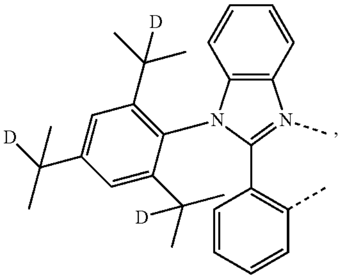
$L_{B155}$
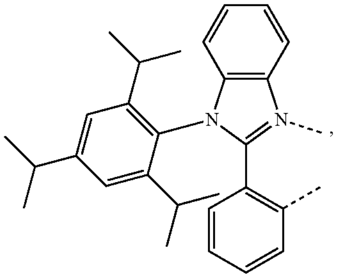

-continued
$L_{B156}$
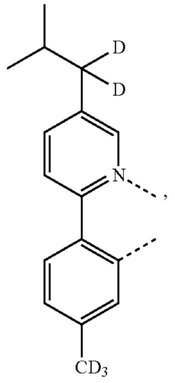
$L_{B157}$
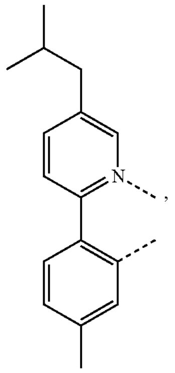
$L_{B158}$
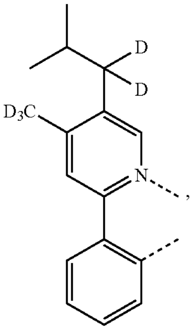
$L_{B159}$
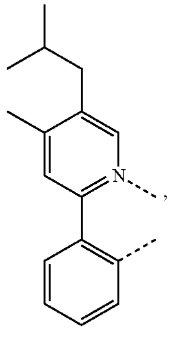
-continued
$L_{B160}$
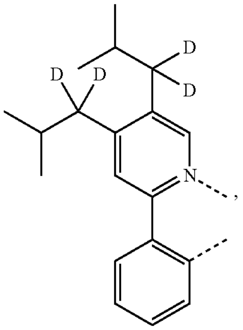
$L_{B161}$
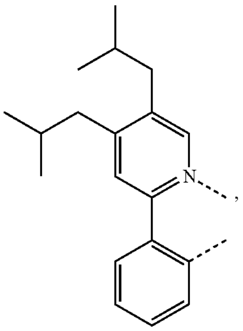
$L_{B162}$
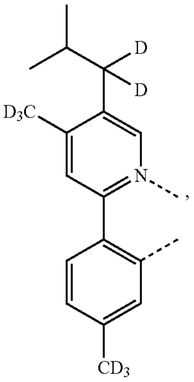
$L_{B163}$
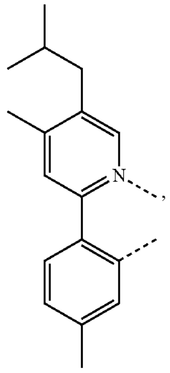

-continued
LB164
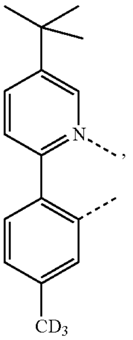
LB165
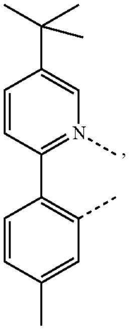
LB166
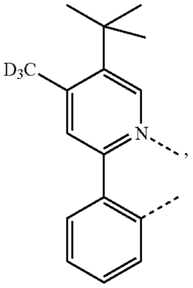
LB167
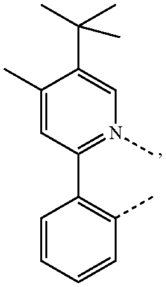
LB168
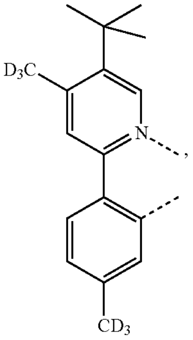
-continued
LB169
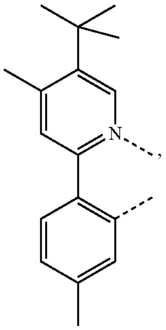
LB170
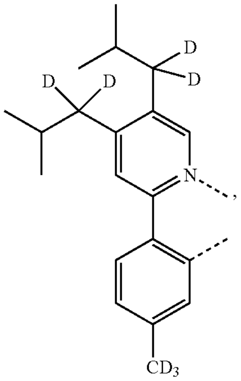
LB171
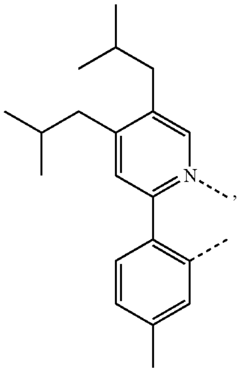
LB172
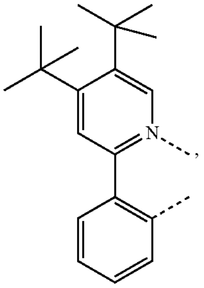

-continued
$L_{B173}$
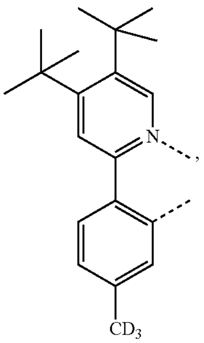
$L_{B174}$
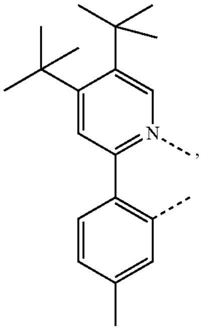
$L_{B175}$
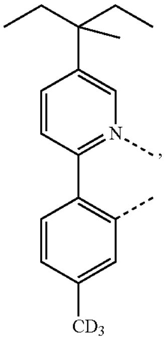
$L_{B176}$
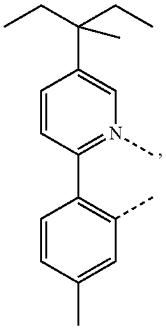
-continued
$L_{B177}$
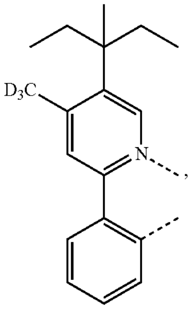
$L_{B178}$
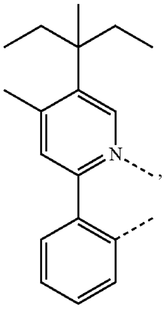
$L_{B179}$
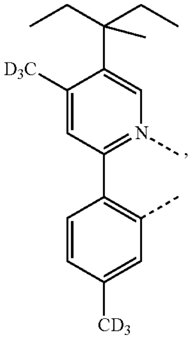
$L_{B180}$
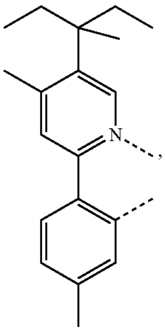
$L_{B181}$
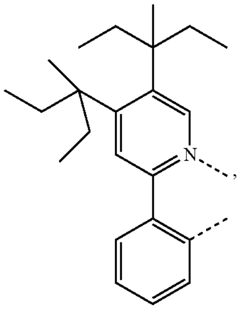

-continued
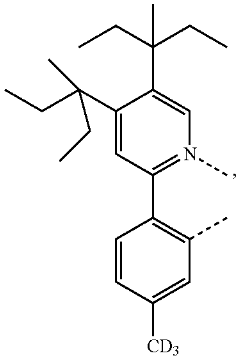
$L_{B182}$
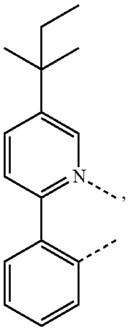
$L_{B183}$
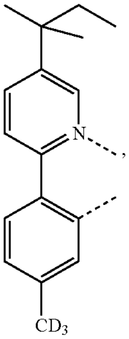
$L_{B184}$
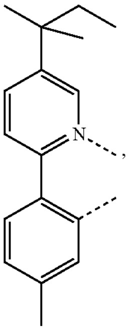
$L_{B185}$
-continued
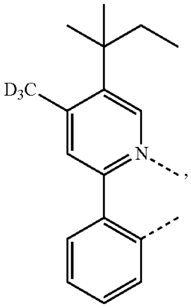
$L_{B186}$
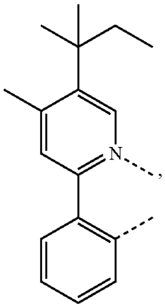
$L_{B187}$
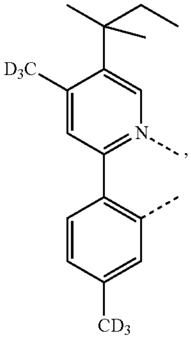
$L_{B188}$
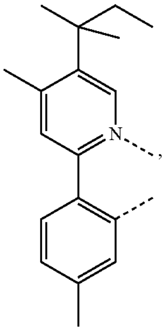
$L_{B189}$
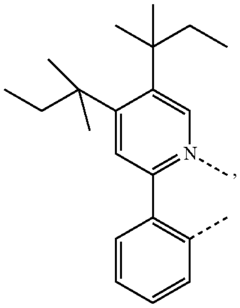
$L_{B190}$ -continued
$L_{B191}$
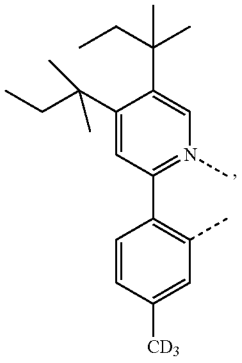
$L_{B192}$
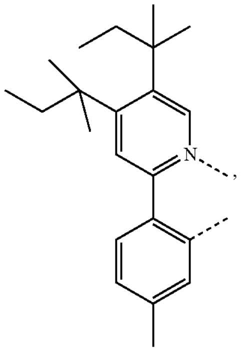
$L_{B193}$
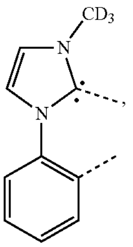
$L_{B194}$
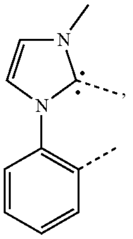
$L_{B195}$
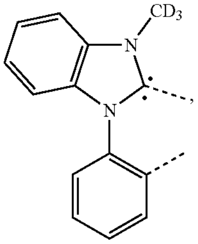
-continued
$L_{B196}$
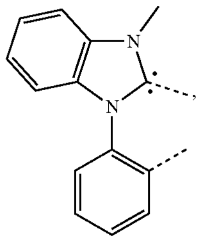
$L_{B197}$
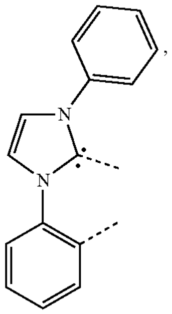
$L_{B198}$
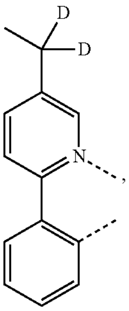
$L_{B199}$
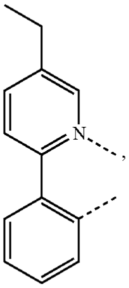
$L_{B200}$
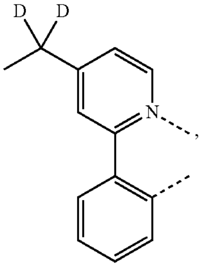

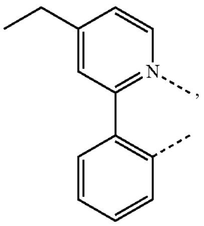
$L_{B201}$
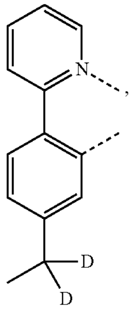
$L_{B202}$
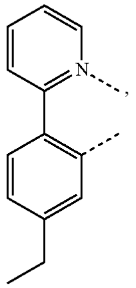
$L_{B203}$
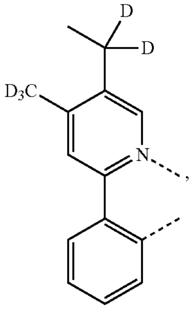
$L_{B204}$
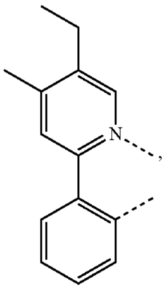
$L_{B205}$
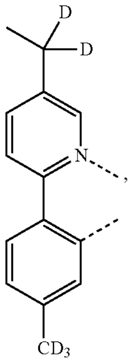
$L_{B206}$
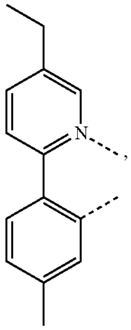
$L_{B207}$
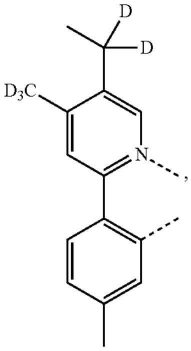
$L_{B208}$
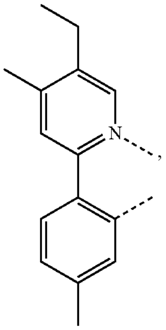
$L_{B209}$ -continued
$L_{B210}$
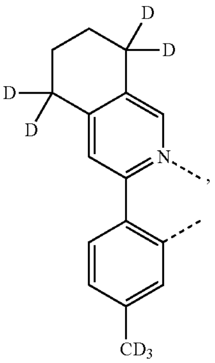
$L_{B211}$
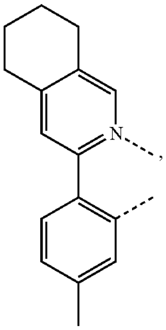
$L_{B212}$
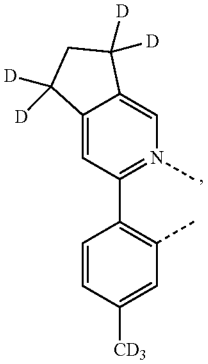
$L_{B213}$
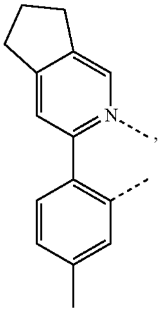
-continued
$L_{B214}$
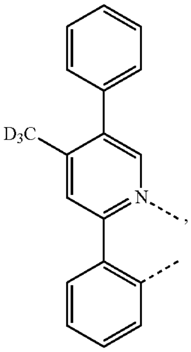
$L_{B215}$
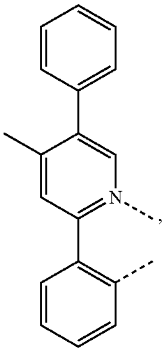
$L_{B216}$
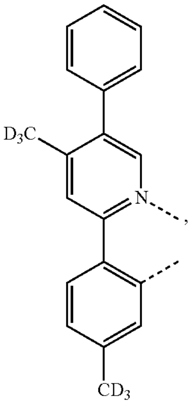
$L_{B217}$
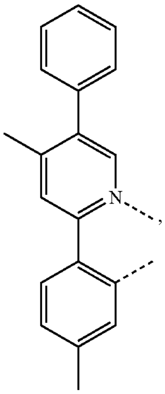

-continued
L$_{B218}$
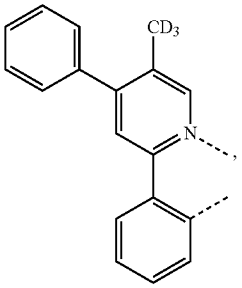
L$_{B219}$
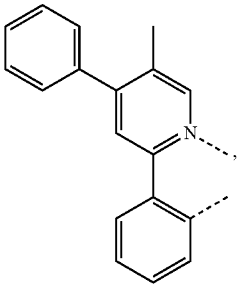
L$_{B220}$
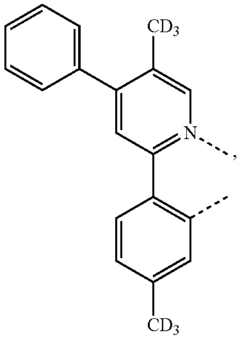
L$_{B221}$
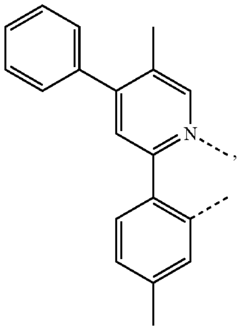
-continued
L$_{B222}$
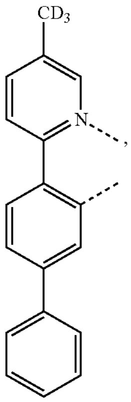
L$_{B223}$
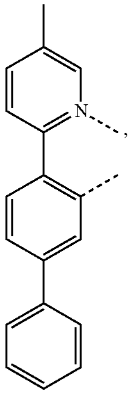
L$_{B224}$
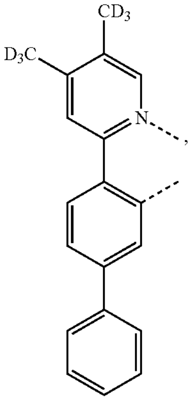
L$_{B225}$
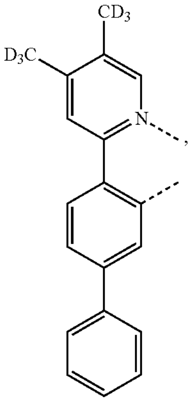

-continued
$L_{B226}$
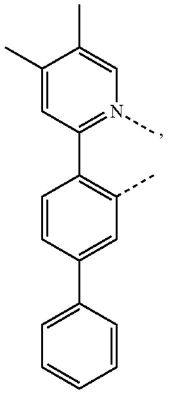
$L_{B227}$
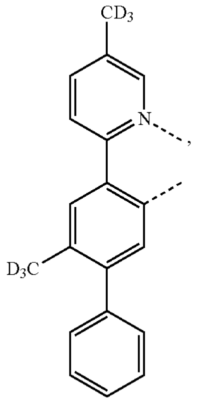
$L_{B228}$
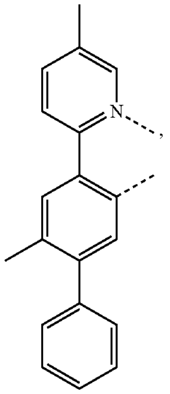
$L_{B229}$
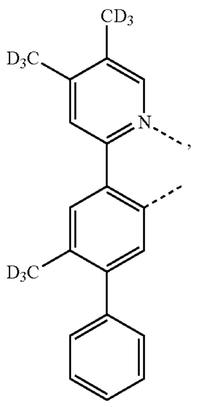
-continued
$L_{B230}$
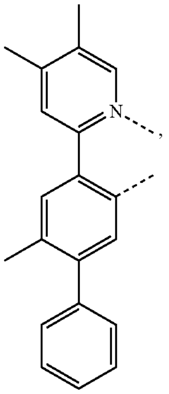
$L_{B231}$
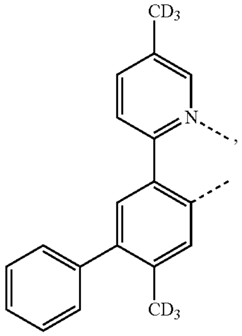
$L_{B232}$
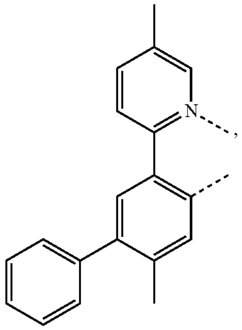
$L_{B233}$
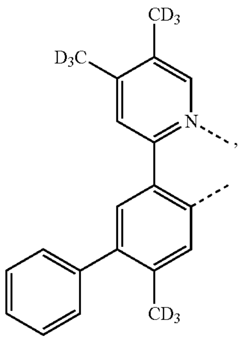

-continued
L$_{B234}$
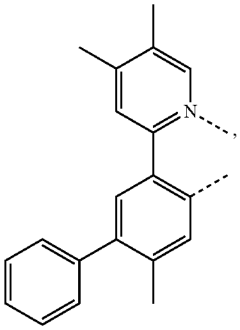
L$_{B235}$
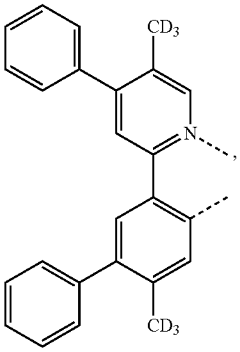
L$_{B236}$
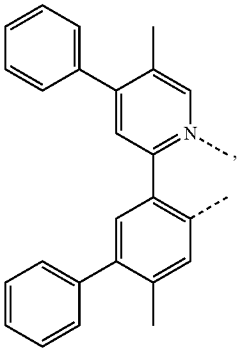
L$_{B237}$
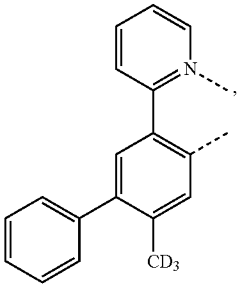
L$_{B238}$
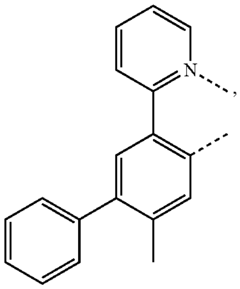
-continued
L$_{B239}$
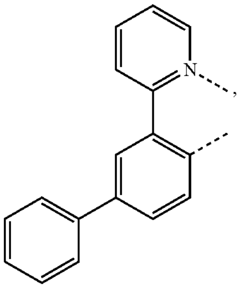
L$_{B240}$
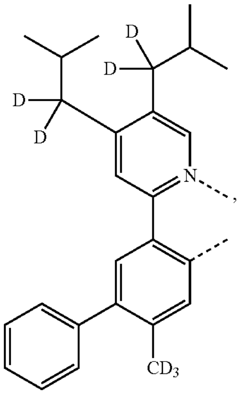
L$_{B241}$
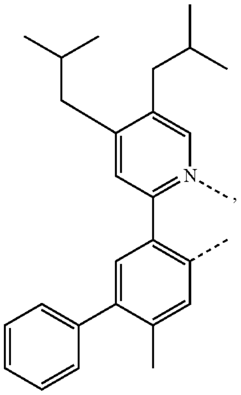
L$_{B242}$
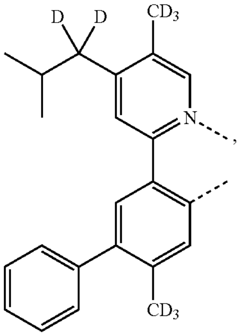

-continued
$L_{B243}$
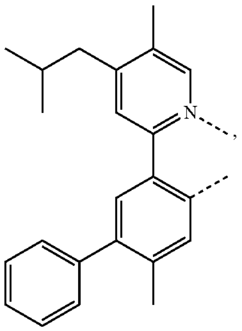
$L_{B244}$
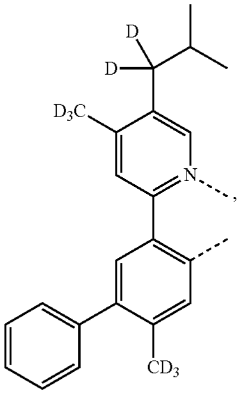
$L_{B245}$
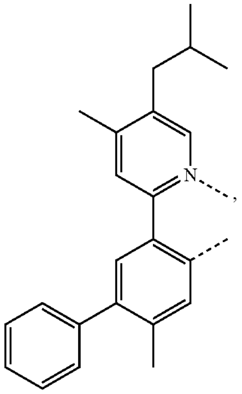
$L_{B246}$
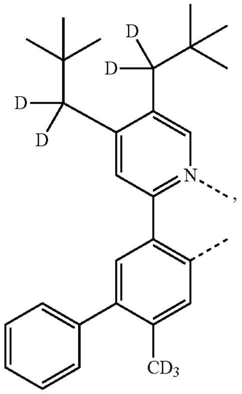
-continued
$L_{B247}$
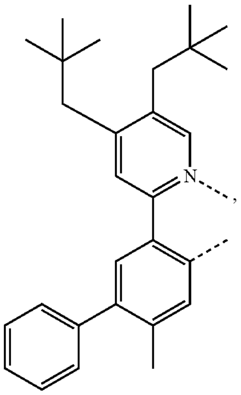
$L_{B248}$
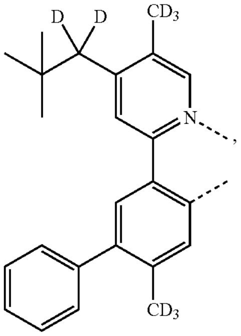
$L_{B249}$
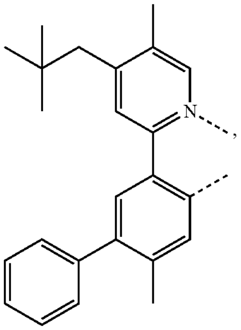
$L_{B250}$
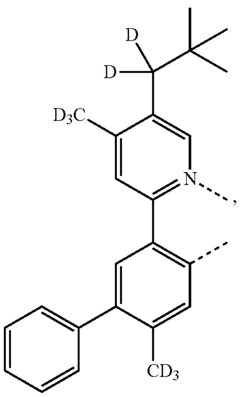

-continued
$L_{B251}$
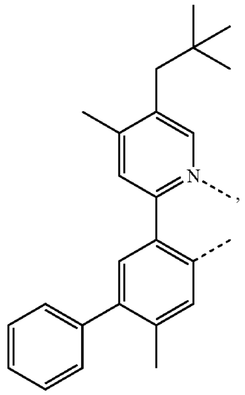
$L_{B252}$
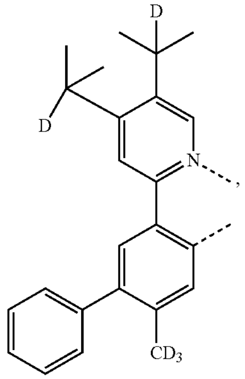
$L_{B253}$
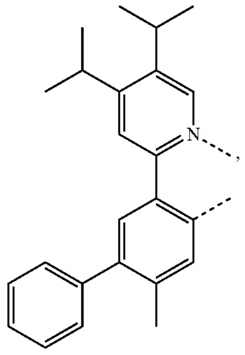
$L_{B254}$
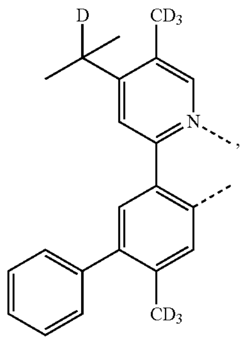
-continued
$L_{B255}$
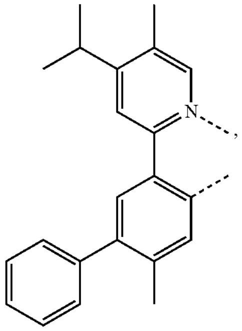
$L_{B256}$
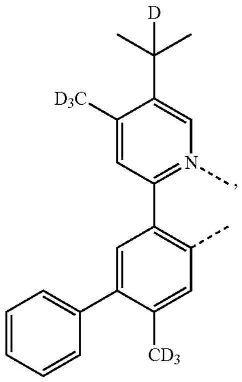
$L_{B257}$
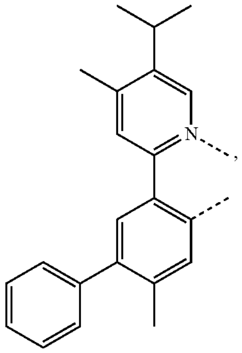
$L_{B258}$
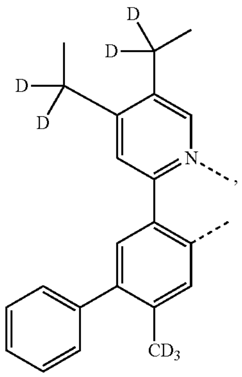

-continued
$L_{B259}$
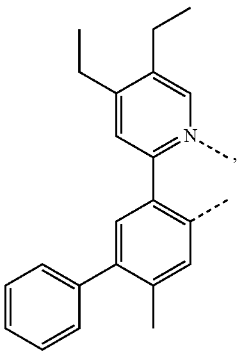
$L_{B260}$
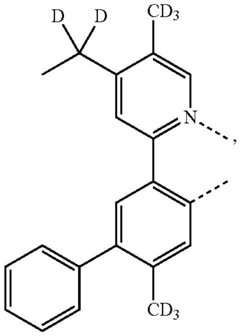
$L_{B261}$
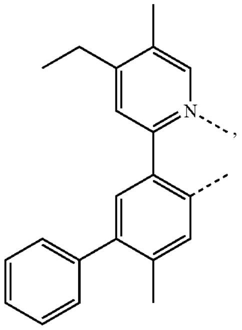
$L_{B262}$
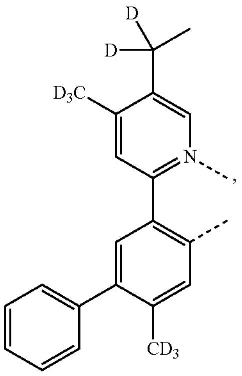
-continued
$L_{B263}$
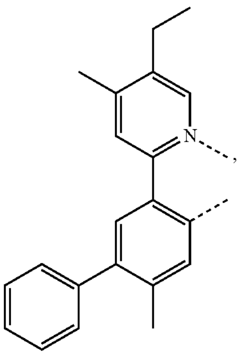
$L_{B264}$
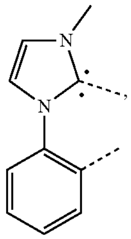
$L_{B265}$
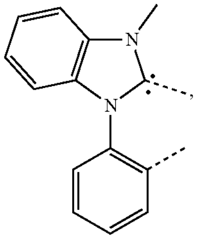
$L_{B266}$
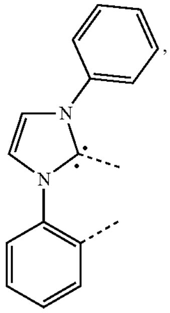
$L_{B267}$
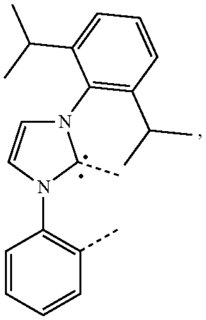

-continued
$L_{B268}$
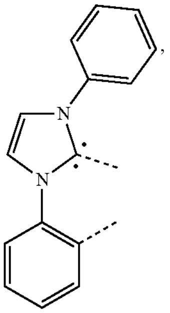
$L_{B269}$
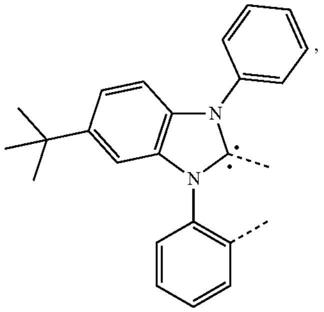
$L_{B270}$
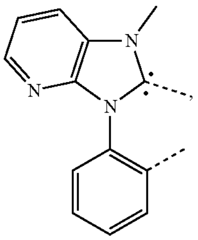
$L_{B271}$
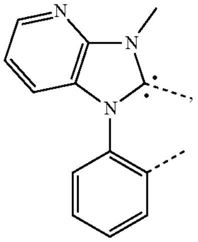
$L_{B272}$
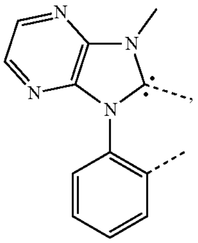
-continued
$L_{B273}$
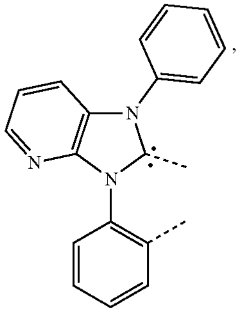
$L_{B274}$
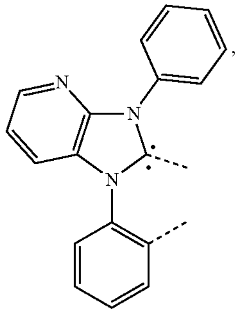
$L_{B275}$
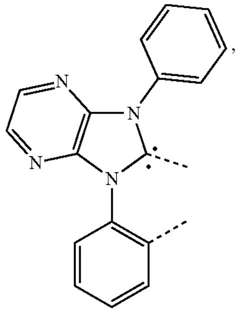
$L_{B276}$
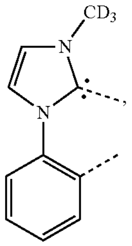
$L_{B277}$
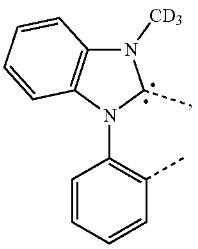

-continued
LB278
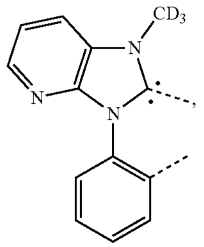
LB279
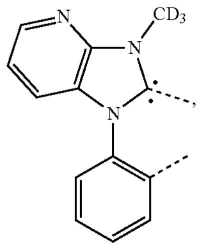
LB280
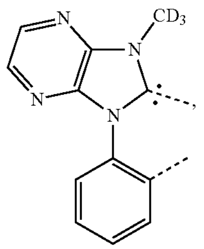
LB281
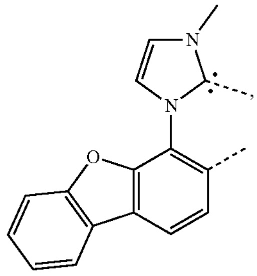
LB282
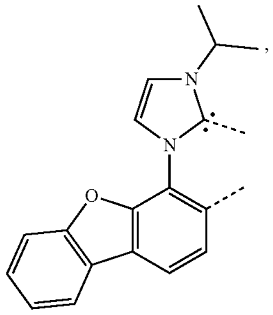
-continued
LB283
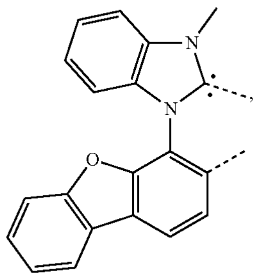
LB284
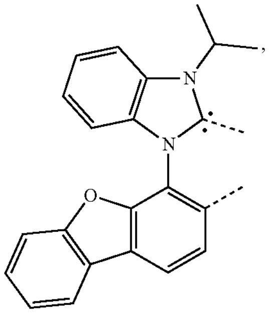
LB285
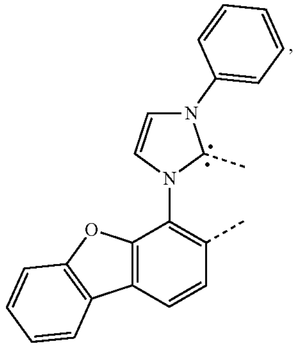
LB286
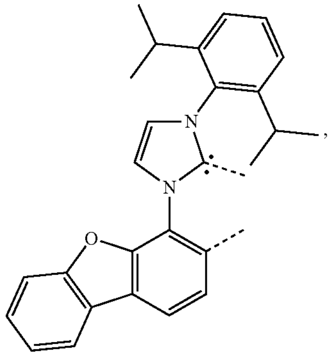

-continued
$L_{B287}$
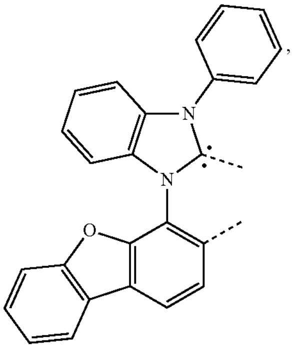
$L_{B288}$
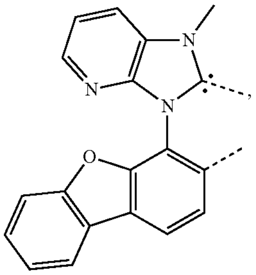
$L_{B289}$
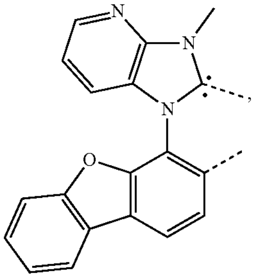
$L_{B290}$
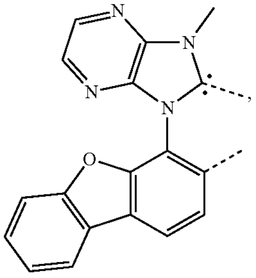
$L_{B291}$
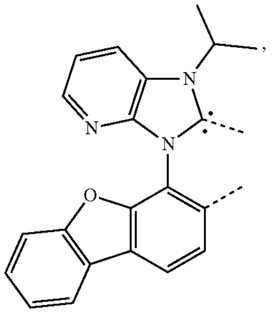
-continued
$L_{B292}$
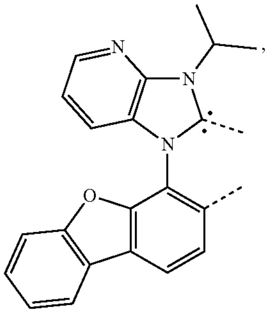
$L_{B293}$
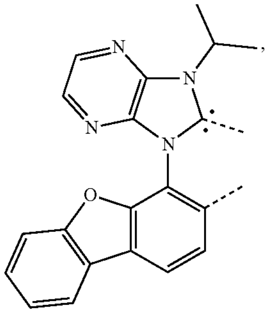
$L_{B294}$
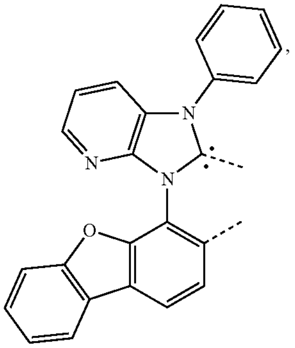
$L_{B295}$
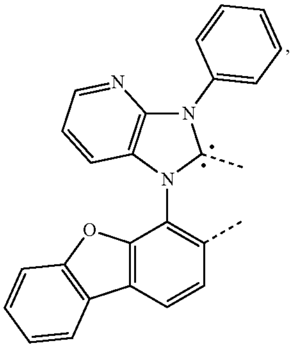

-continued
$L_{B296}$
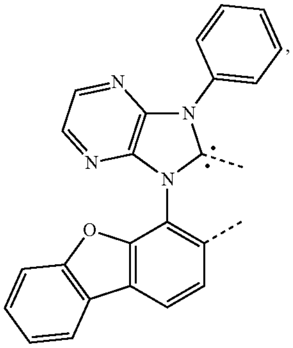
$L_{B297}$
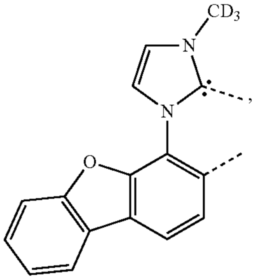
$L_{B298}$
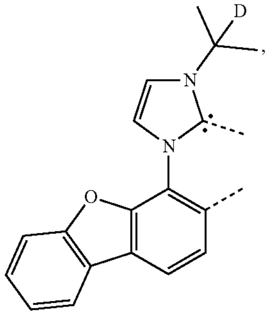
$L_{B299}$
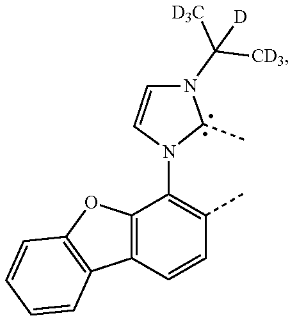
$L_{B300}$
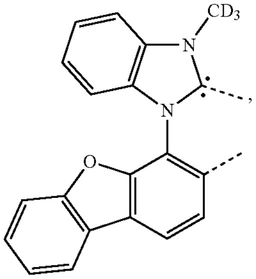
-continued
$L_{B301}$
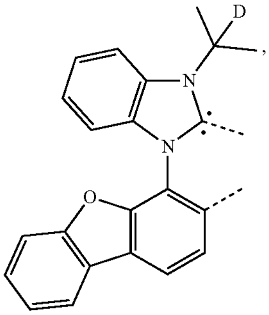
$L_{B302}$
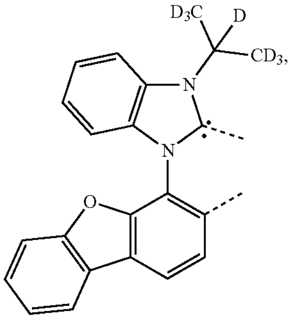
$L_{B303}$
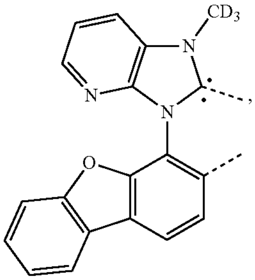
$L_{B304}$
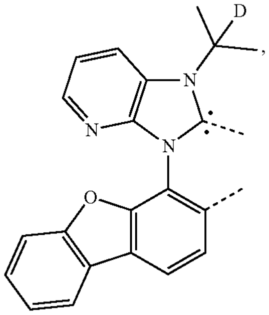
$L_{B305}$
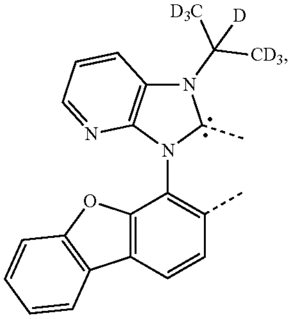

-continued
$L_{B306}$
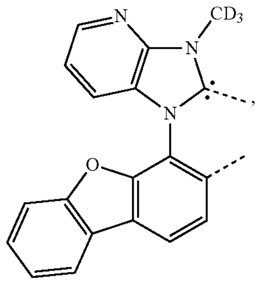
$L_{B307}$
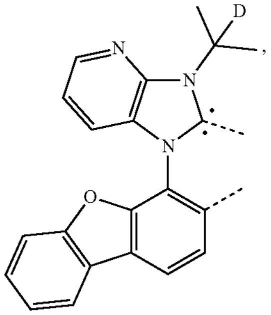
$L_{B308}$
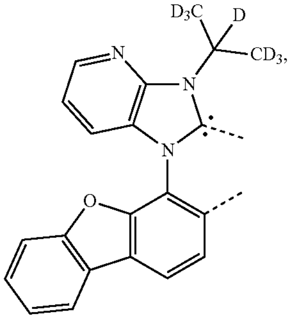
$L_{B309}$
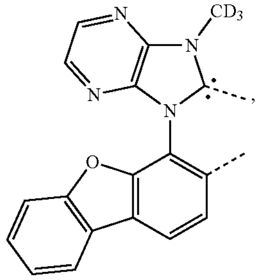
$L_{B310}$
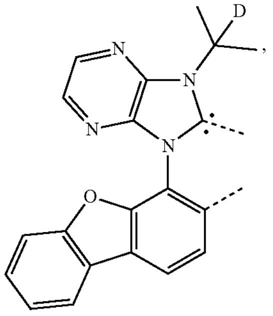
-continued
$L_{B311}$
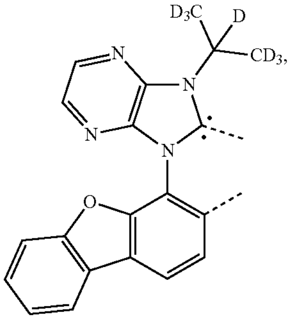
$L_{B312}$
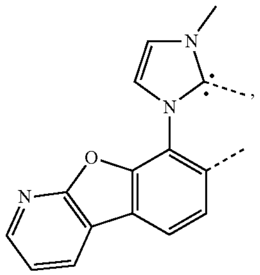
$L_{B313}$
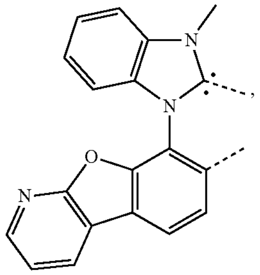
$L_{B314}$
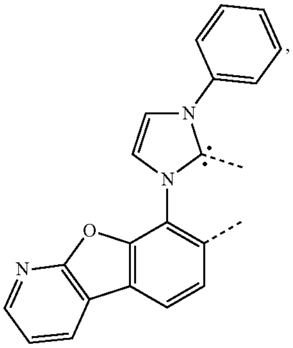
$L_{B315}$
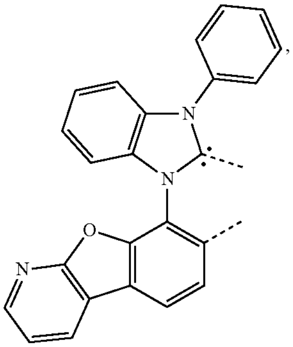

-continued
$L_{B316}$
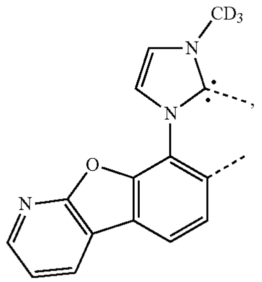
$L_{B317}$
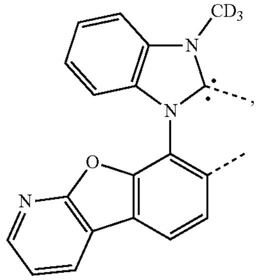
$L_{B318}$
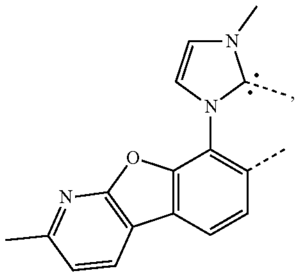
$L_{B319}$
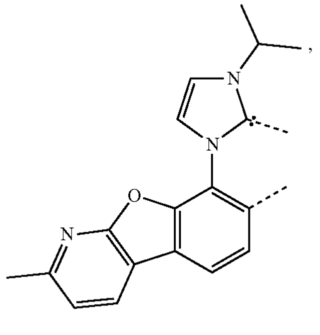
$L_{B320}$
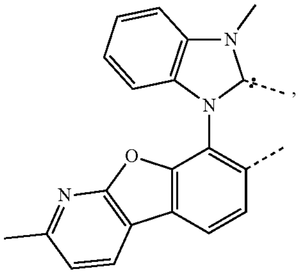
-continued
$L_{B321}$
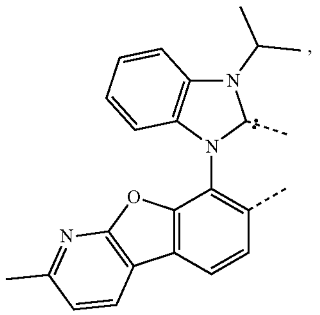
$L_{B322}$
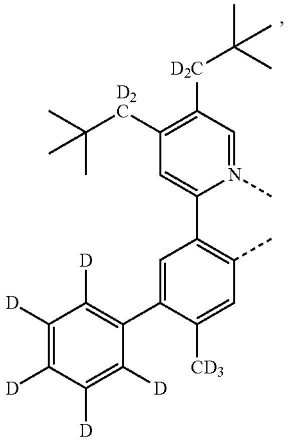
$L_{B323}$
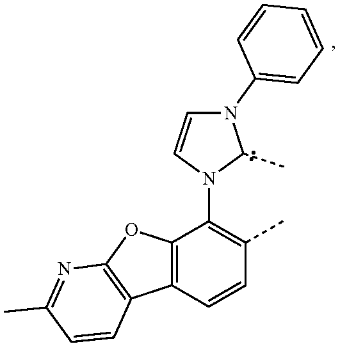
$L_{B324}$
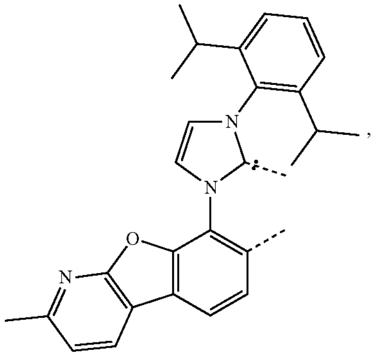

-continued
$L_{B325}$
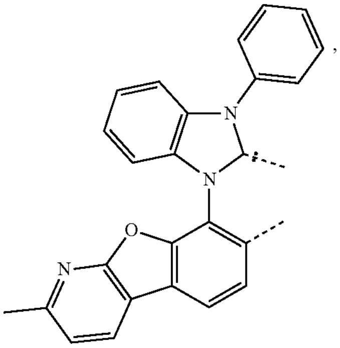
$L_{B326}$
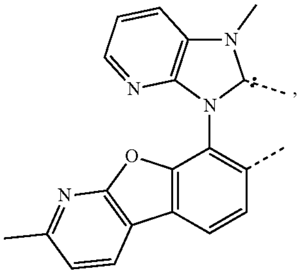
$L_{B327}$
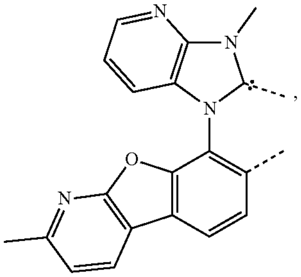
$L_{B328}$
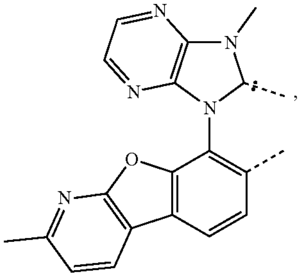
$L_{B329}$
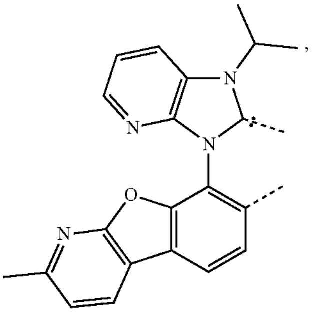
-continued
$L_{B330}$
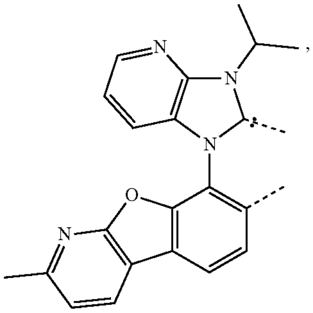
$L_{B331}$
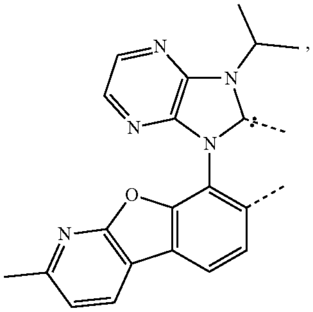
$L_{B332}$
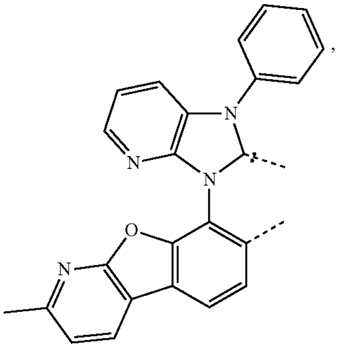
$L_{B333}$
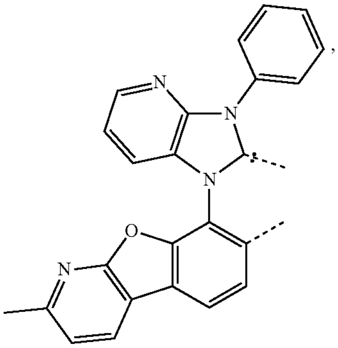

-continued
$L_{B334}$
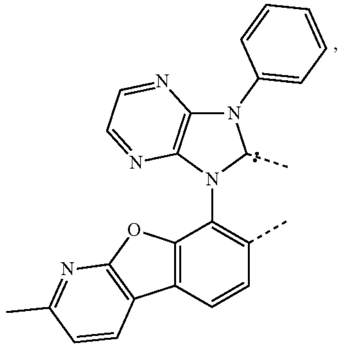
$L_{B335}$
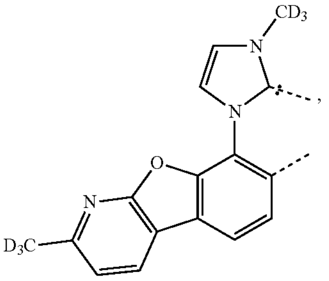
$L_{B336}$
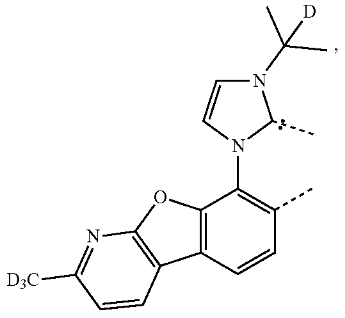
$L_{B337}$
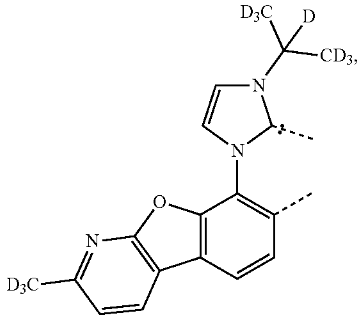
$L_{B338}$
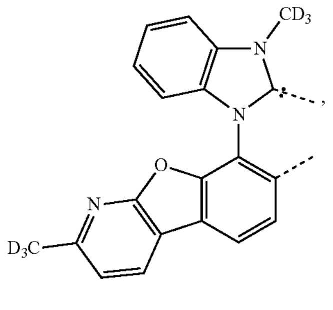
-continued
$L_{B339}$
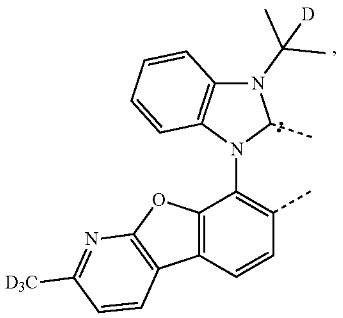
$L_{B340}$
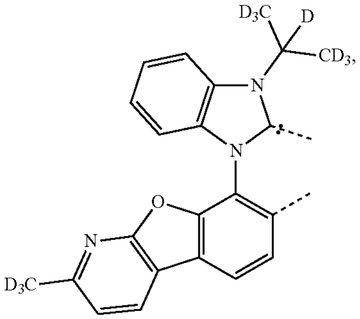
$L_{B341}$
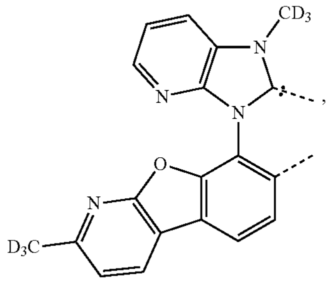
$L_{B342}$
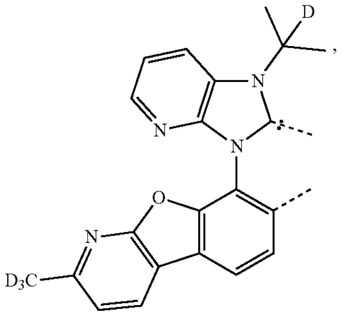
$L_{B343}$
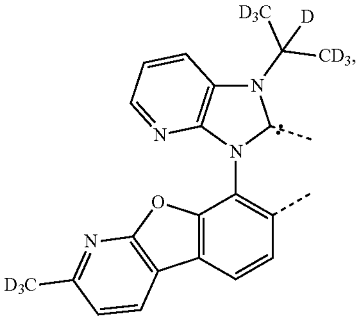

-continued
$L_{B344}$
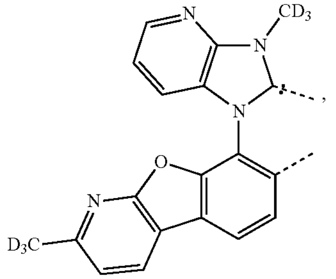
$L_{B345}$
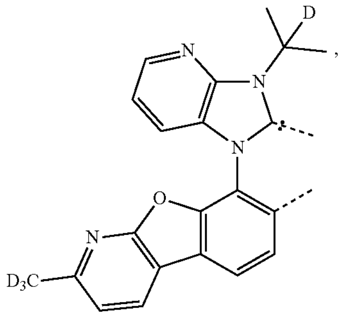
$L_{B346}$
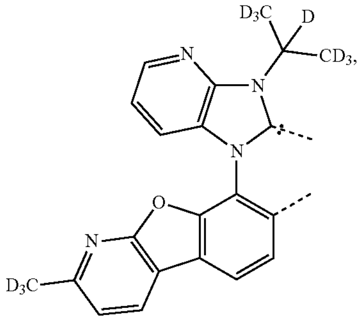
$L_{B347}$
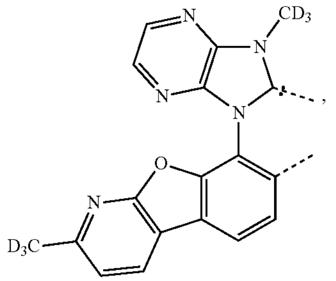
$L_{B348}$
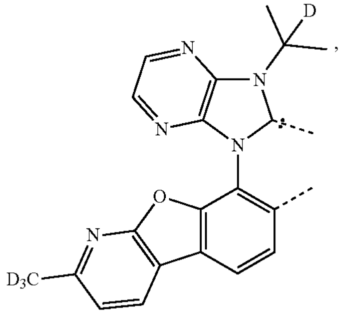
-continued
$L_{B349}$
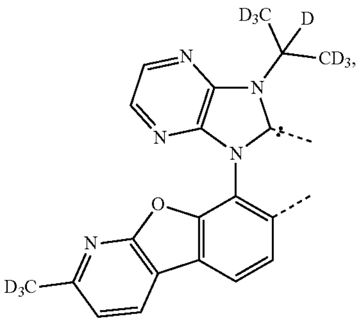
$L_{B350}$
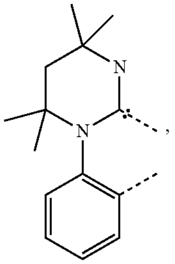
$L_{B351}$
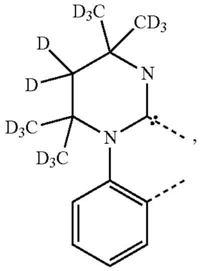
$L_{B352}$
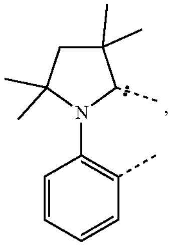
$L_{B353}$
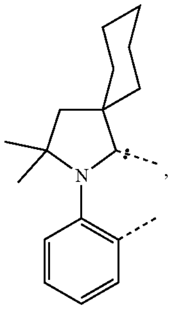

-continued
$L_{B354}$
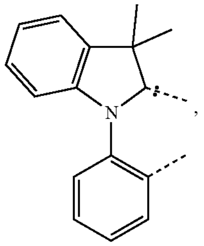
$L_{B355}$
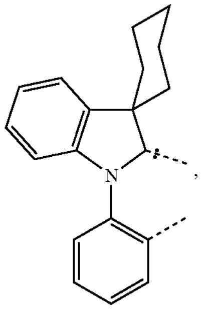
$L_{B356}$
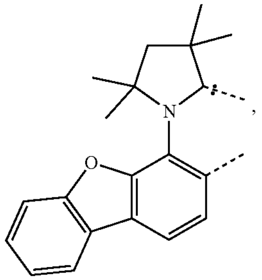
$L_{B357}$
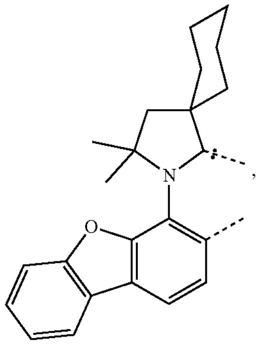
$L_{B358}$
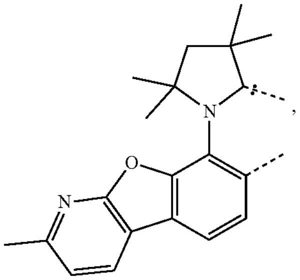
-continued
$L_{B359}$
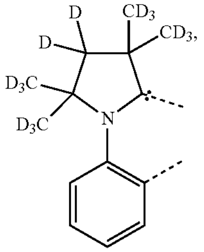
$L_{B360}$
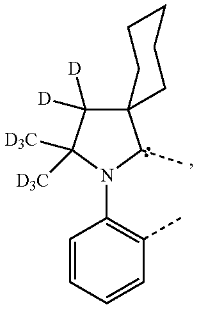
$L_{B361}$
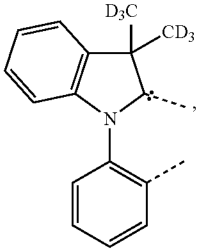
$L_{B362}$
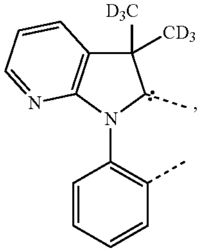
$L_{B363}$
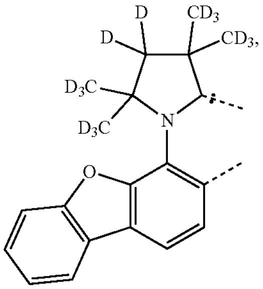

-continued
$L_{B364}$
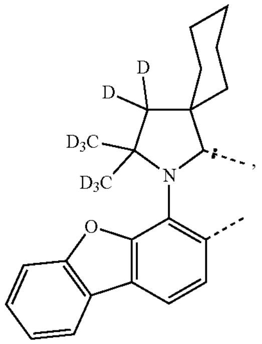
$L_{B365}$
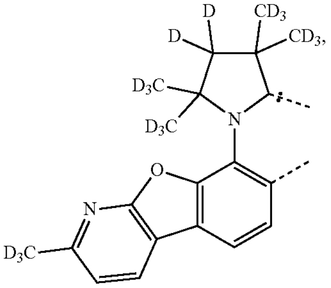
$L_{B366}$
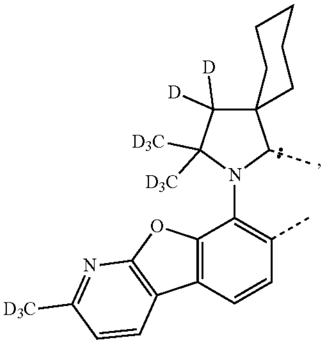
$L_{B367}$
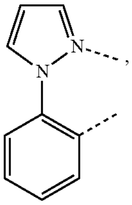
$L_{B368}$
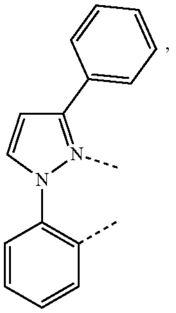
-continued
$L_{B369}$
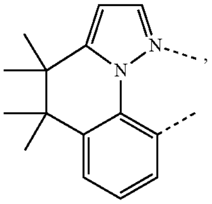
$L_{B370}$
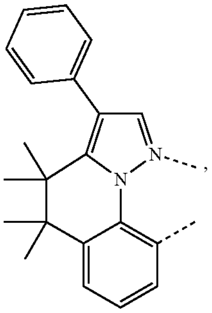
$L_{B371}$
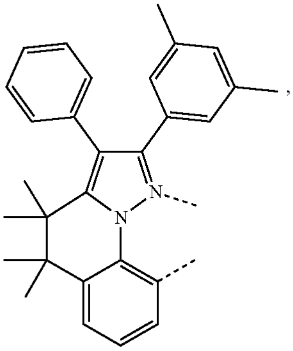
$L_{B372}$
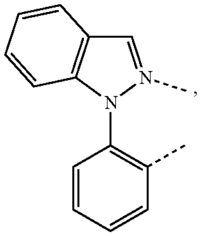
$L_{B373}$
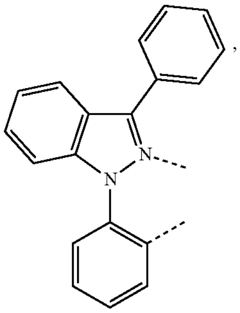

-continued
$L_{B374}$
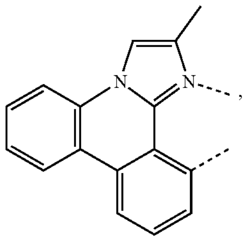
$L_{B375}$
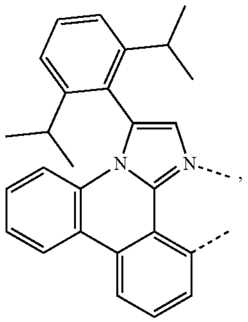
$L_{B376}$
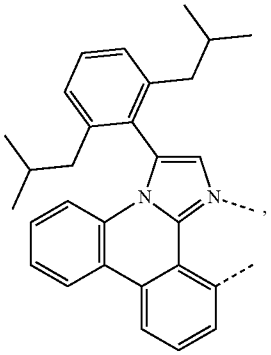
$L_{B377}$
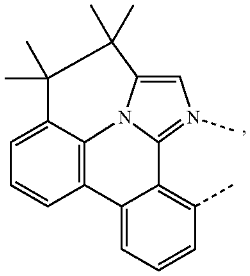
$L_{B378}$
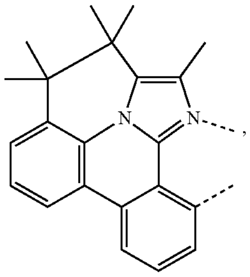
-continued
$L_{B379}$
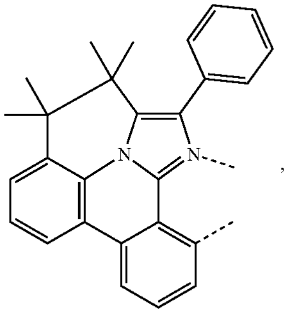
$L_{B380}$
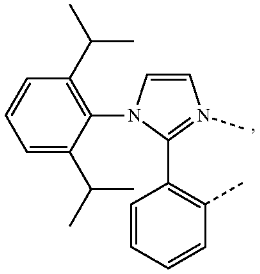
$L_{B381}$
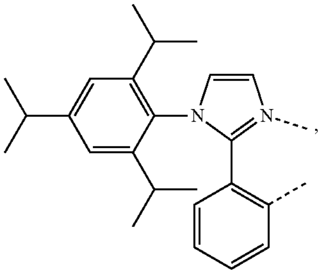
$L_{B382}$
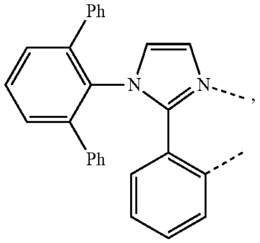
$L_{B383}$
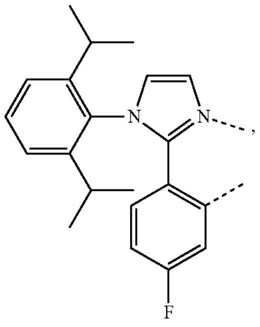

-continued
$L_{B384}$
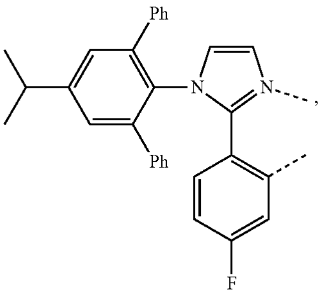
$L_{B385}$
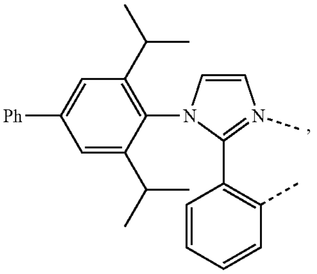
$L_{B386}$
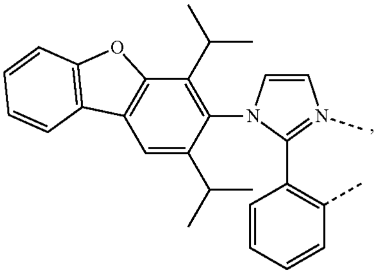
$L_{B387}$
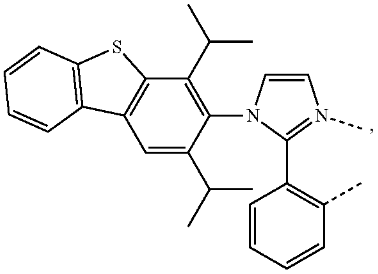
$L_{B388}$
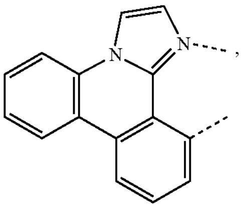
$L_{B389}$
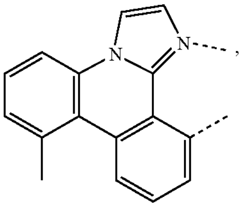
-continued
$L_{B390}$
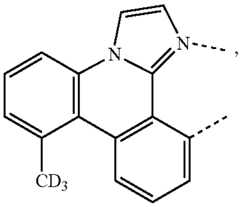
$L_{B391}$
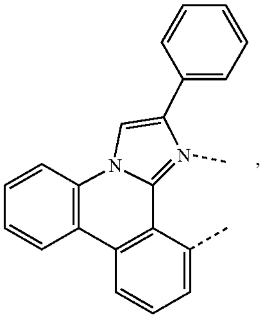
$L_{B392}$
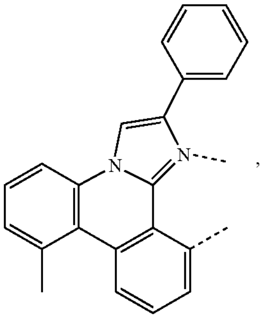
$L_{B393}$
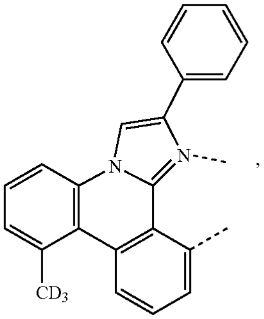
$L_{B394}$
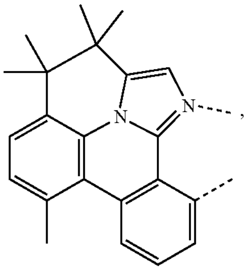

-continued
$L_{B395}$
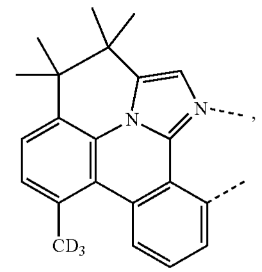
$L_{B396}$
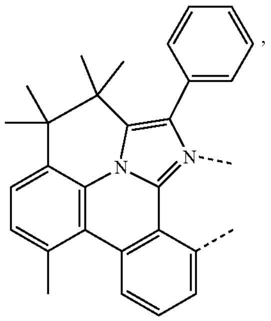
$L_{B397}$
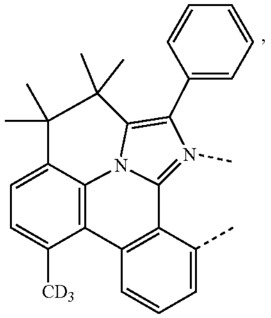
$L_{B398}$
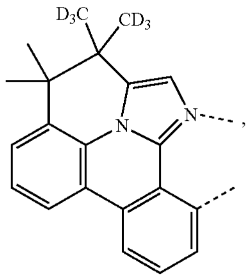
$L_{B399}$
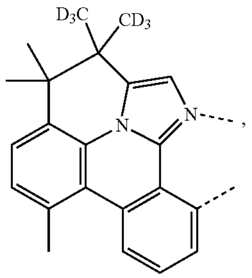
-continued
$L_{B400}$
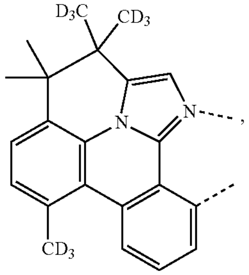
$L_{B401}$
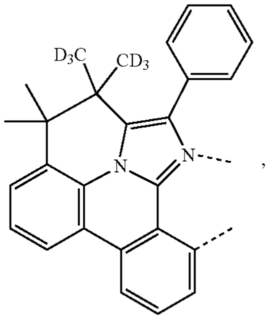
$L_{B402}$
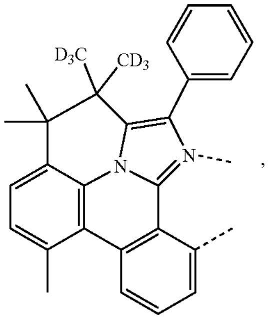
$L_{B403}$
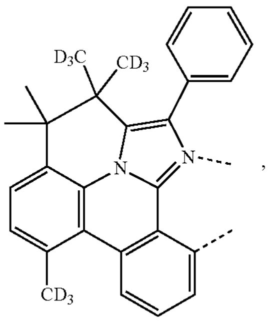
$L_{B404}$
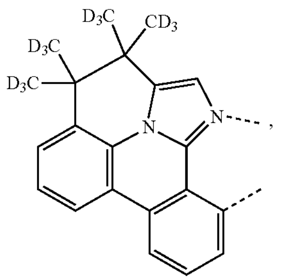

-continued
$L_{B405}$
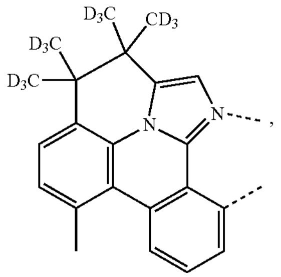
$L_{B406}$
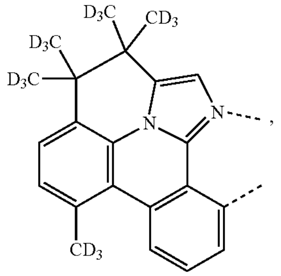
$L_{B407}$
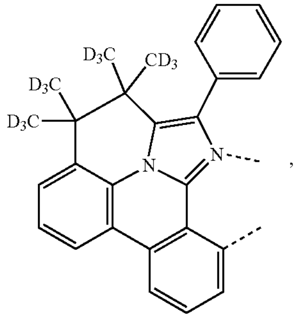
$L_{B408}$
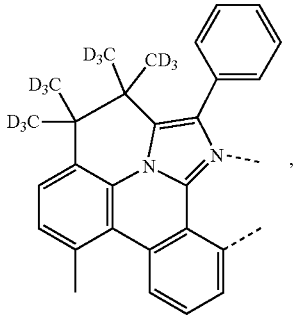
$L_{B409}$
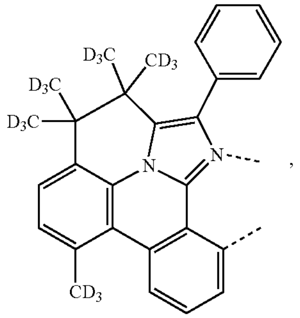
-continued
$L_{B410}$
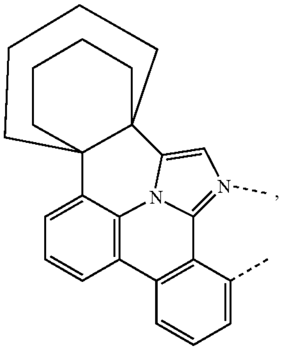
$L_{B411}$
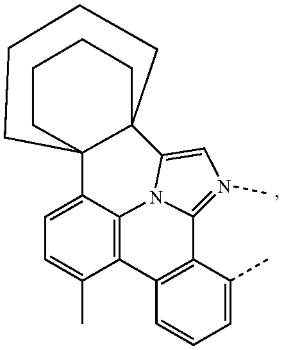
$L_{B412}$
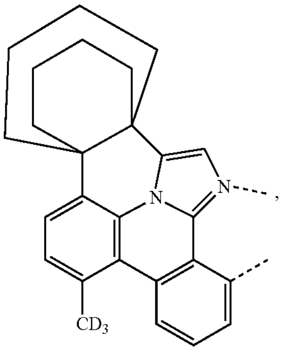
$L_{B413}$
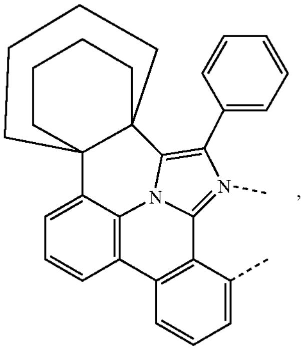

-continued
$L_{B414}$
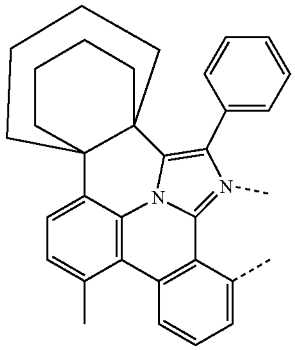
,
$L_{B415}$
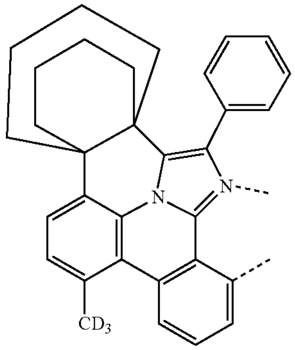
,
$L_{B416}$
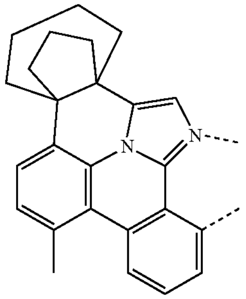
,
$L_{B417}$
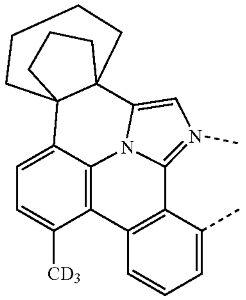
,
-continued
$L_{B418}$
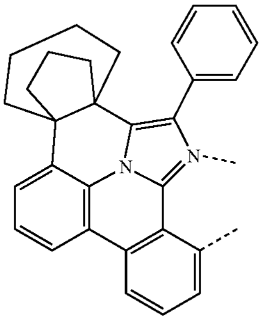
,
$L_{B419}$
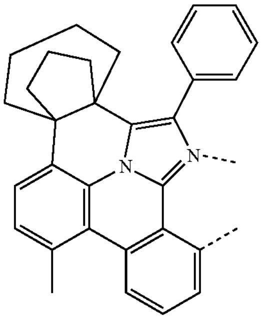
,
$L_{B420}$
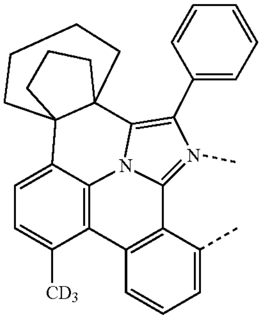
,
$L_{B421}$
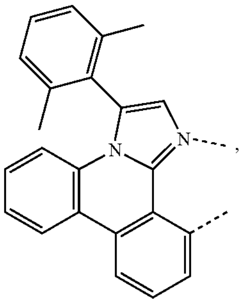
,
$L_{B422}$
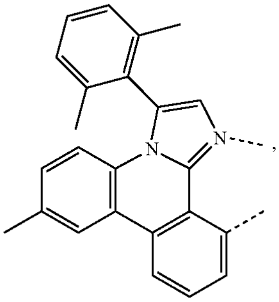
, -continued
$L_{B423}$
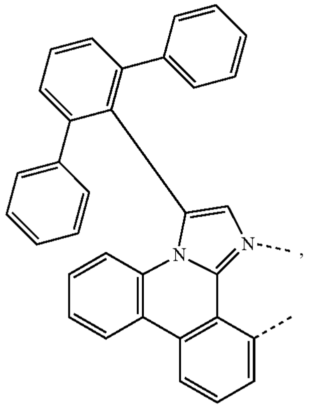
$L_{B424}$
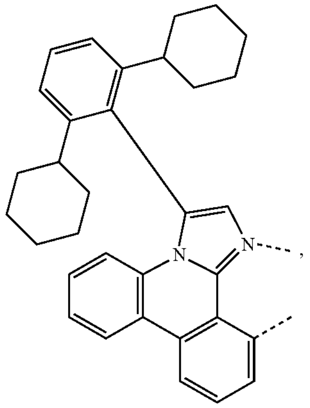
$L_{B425}$
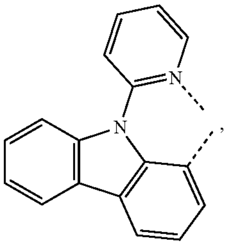
$L_{B426}$
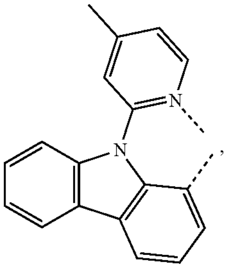
-continued
$L_{B427}$
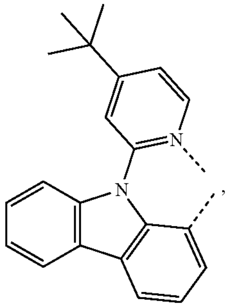
$L_{B428}$
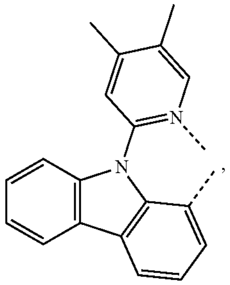
$L_{B429}$
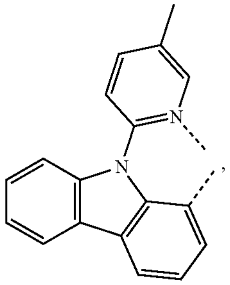
$L_{B430}$
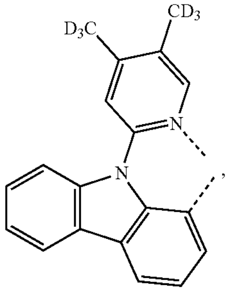
$L_{B431}$
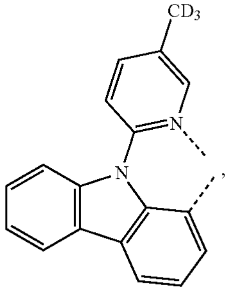

-continued
L$_{B432}$
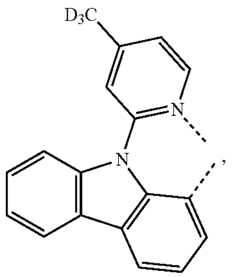
L$_{B433}$
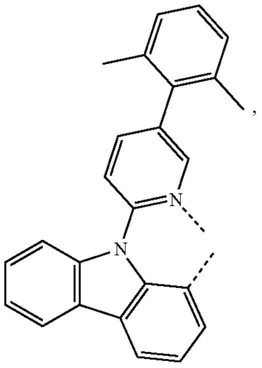
L$_{B434}$
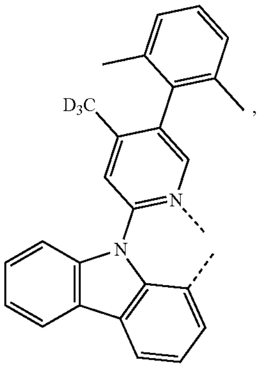
L$_{B345}$
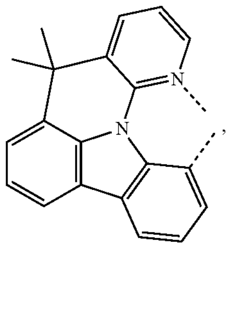
-continued
L$_{B346}$
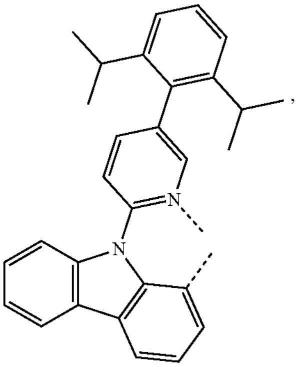
L$_{B347}$
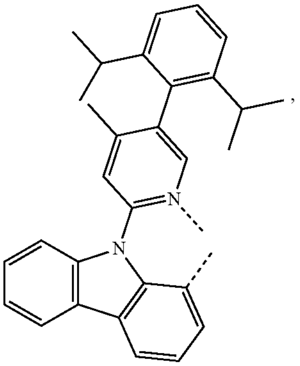
L$_{B348}$
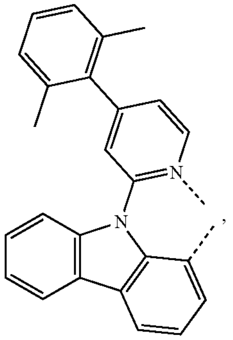
L$_{B349}$
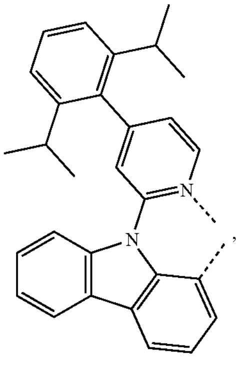

-continued
L$_{B440}$
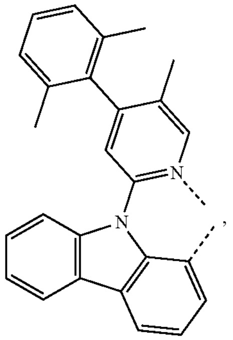
L$_{B441}$
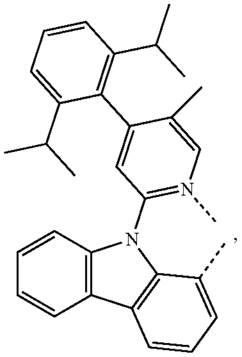
L$_{B442}$
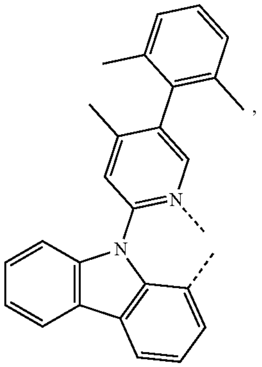
L$_{B443}$
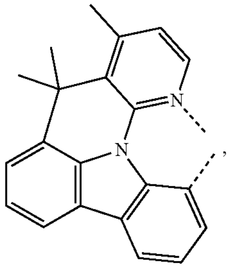
-continued
L$_{B444}$
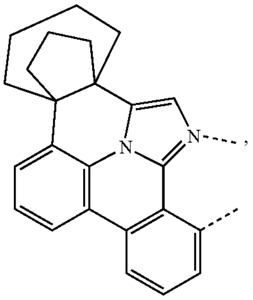
L$_{B445}$
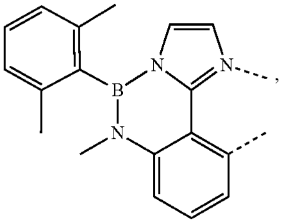
L$_{B446}$
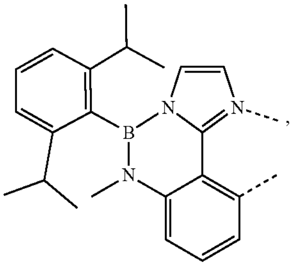
L$_{B447}$
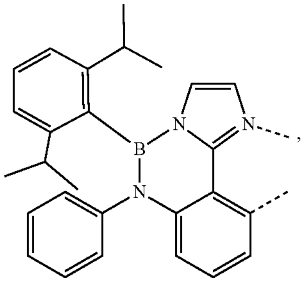
L$_{B448}$
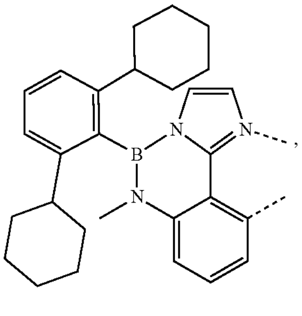

-continued
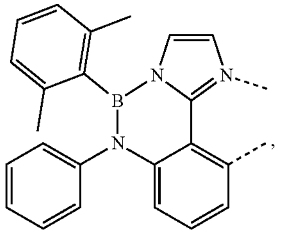
$L_{B449}$
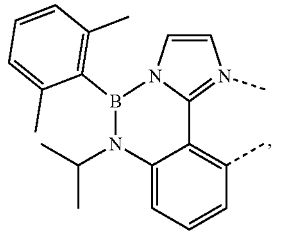
$L_{B450}$
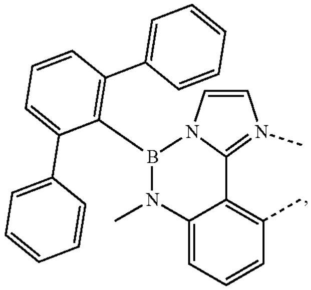
$L_{B451}$
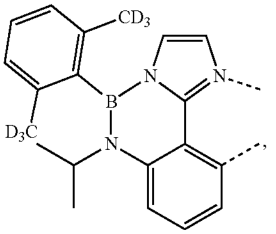
$L_{B452}$
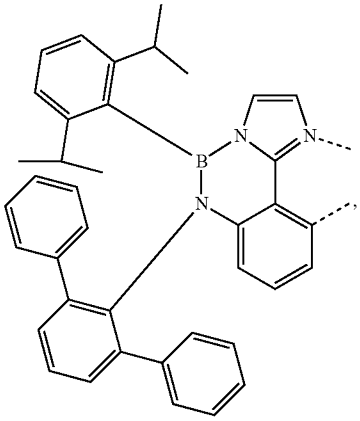
$L_{B453}$
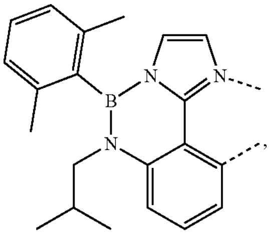
$L_{B454}$
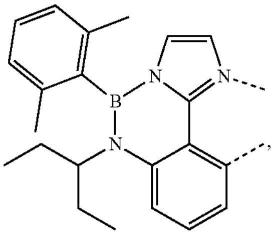
$L_{B455}$
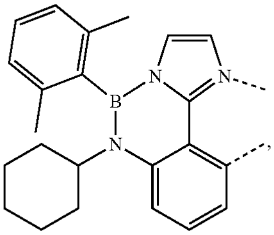
$L_{B456}$
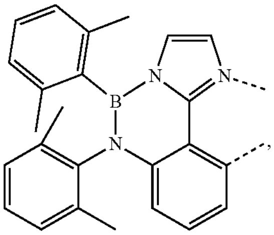
$L_{B457}$
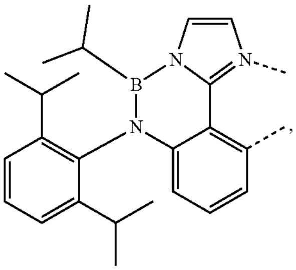
$L_{B458}$
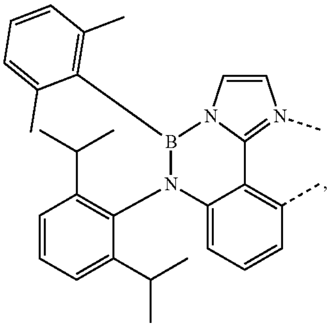
$L_{B459}$ -continued
L$_{B460}$
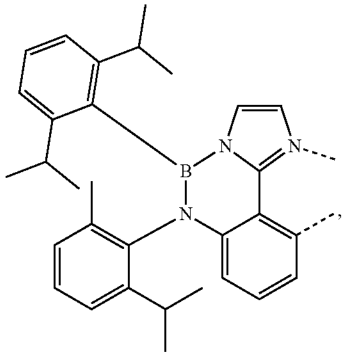
L$_{B461}$
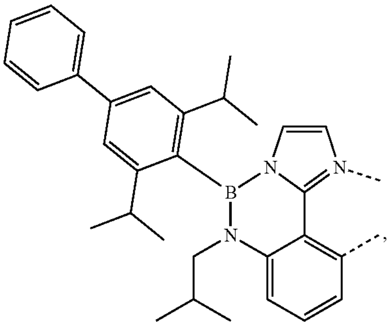
L$_{B462}$
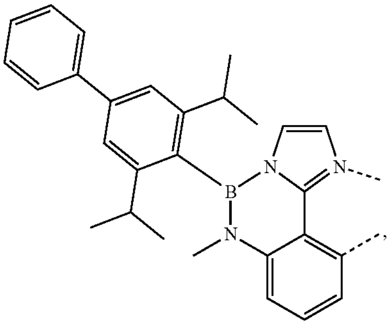
L$_{B463}$
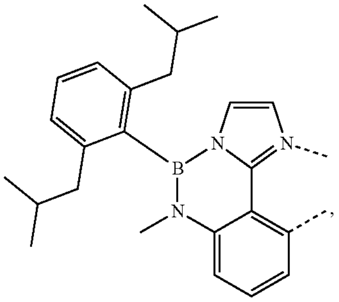
L$_{B464}$
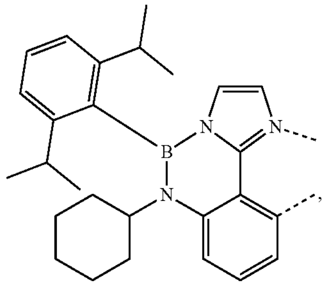
-continued
L$_{B465}$
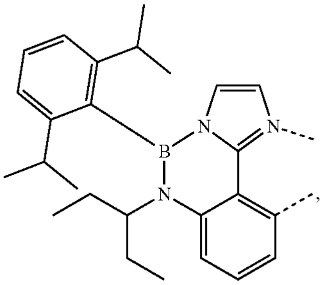
L$_{B466}$
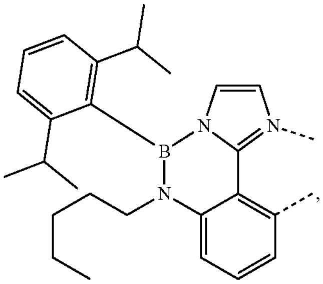
L$_{B467}$
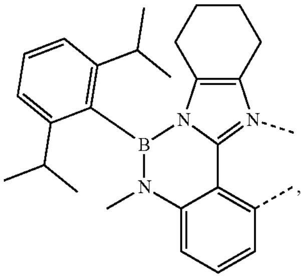
L$_{B468}$
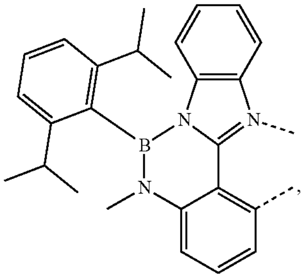
L$_{B469}$
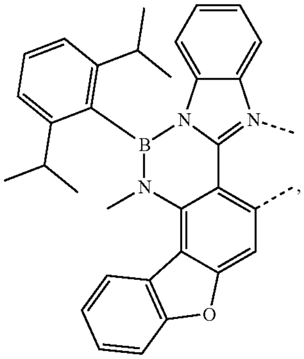

-continued
$L_{B470}$
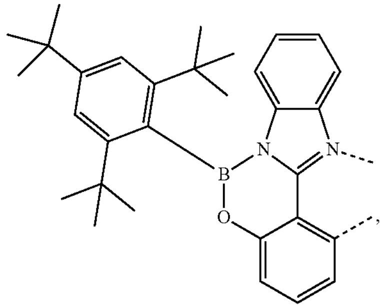
$L_{B471}$
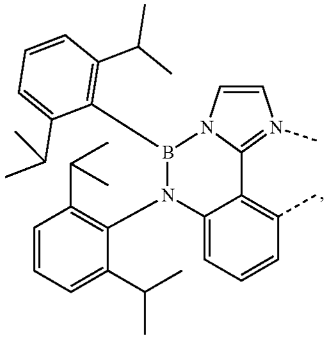
$L_{B472}$
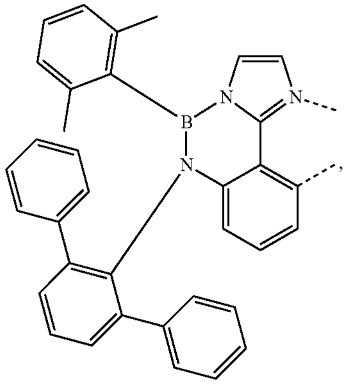
$L_{B473}$
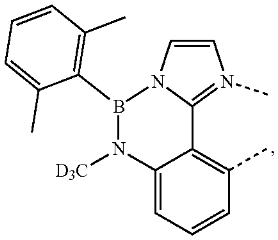
$L_{B474}$
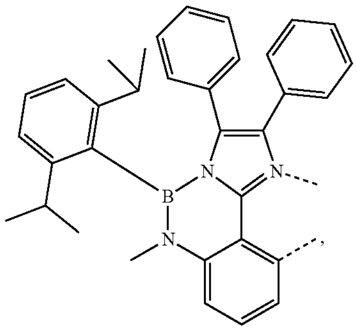
-continued
$L_{B475}$
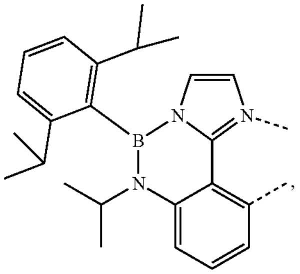
$L_{B476}$
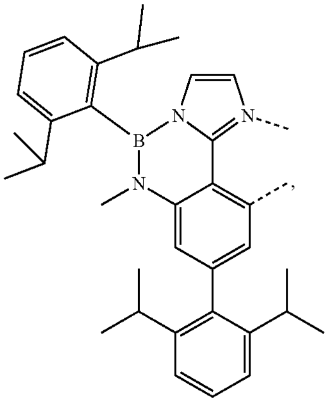
$L_{B477}$
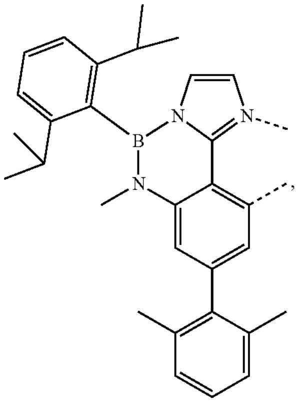
$L_{B478}$
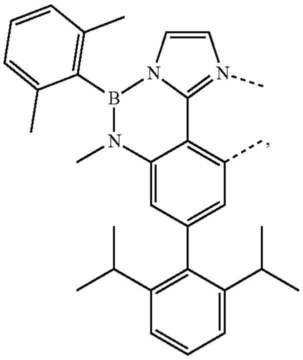

-continued
$L_{B479}$
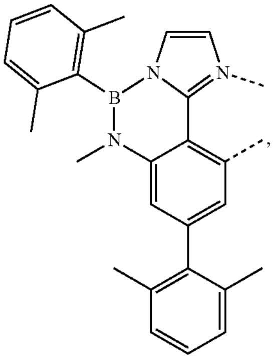
$L_{B480}$
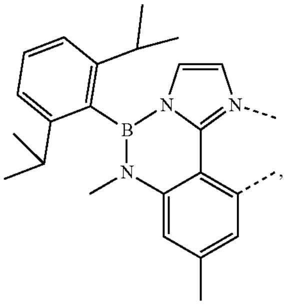
$L_{B481}$
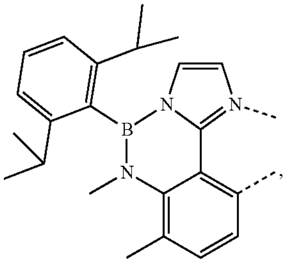
$L_{B482}$
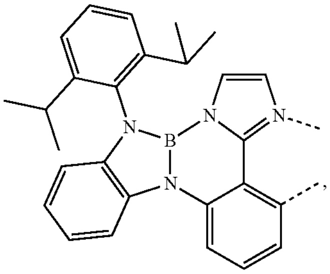
$L_{B483}$
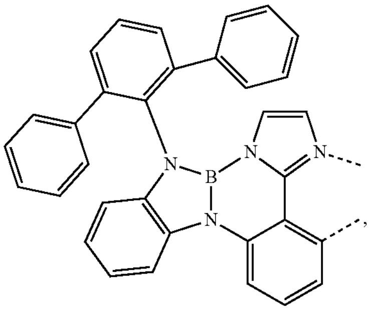
-continued
$L_{B484}$
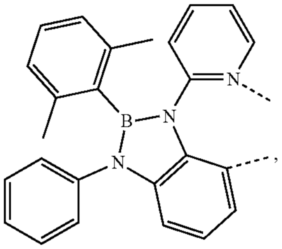
$L_{B485}$
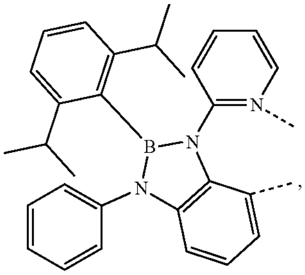
$L_{B486}$
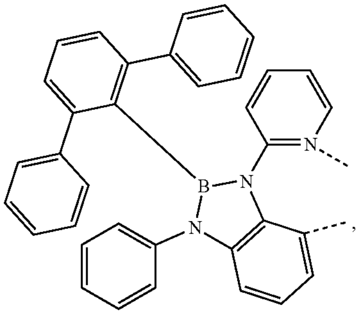
$L_{B487}$
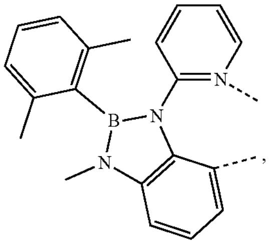
$L_{B488}$
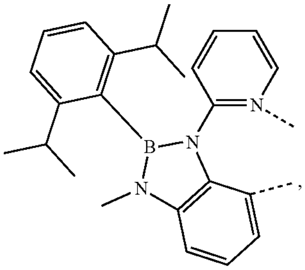

$L_{B489}$
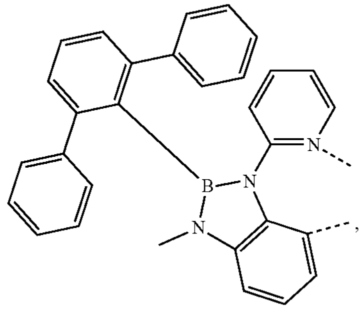
$L_{B490}$
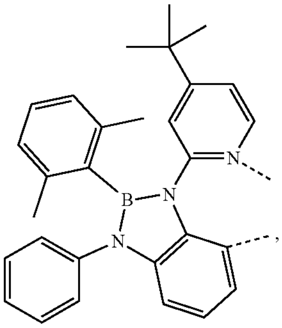
$L_{B491}$
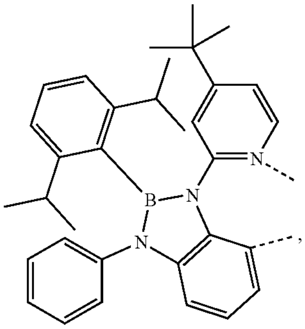
$L_{B492}$
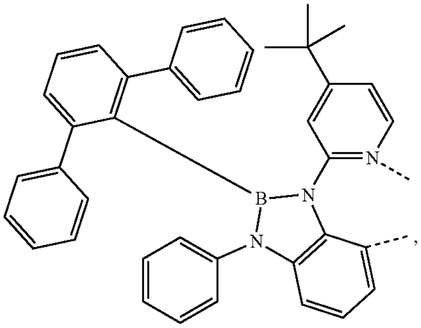
$L_{B493}$
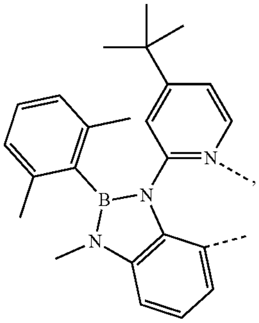
$L_{B494}$
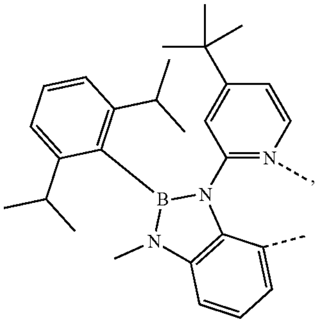
$L_{B495}$
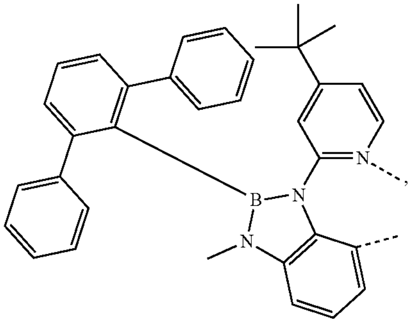
$L_{B496}$
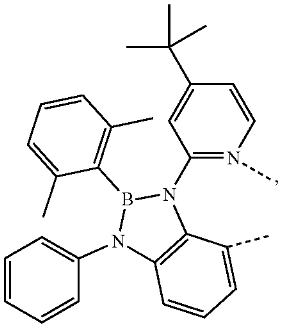
$L_{B497}$
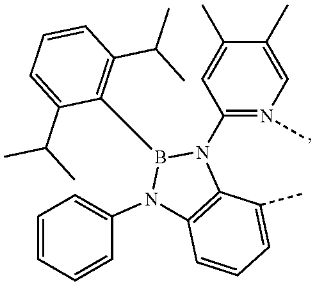

-continued
$L_{B498}$
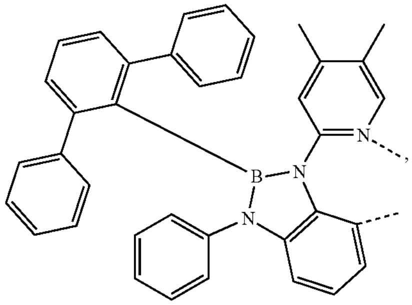
$L_{B499}$
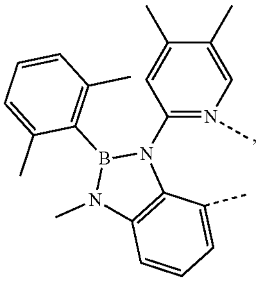
$L_{B500}$
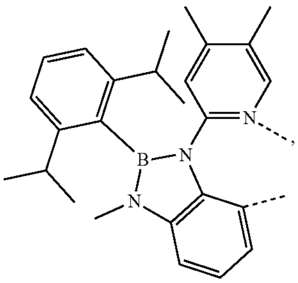
$L_{B501}$
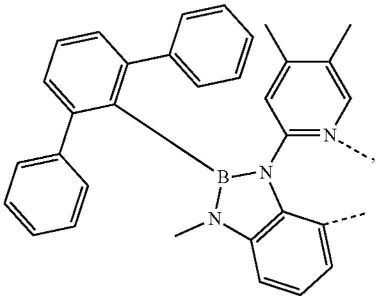
$L_{B502}$
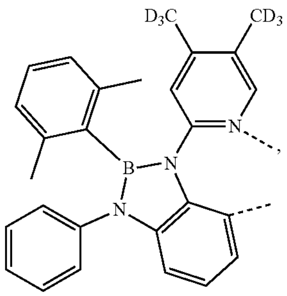
-continued
$L_{B503}$
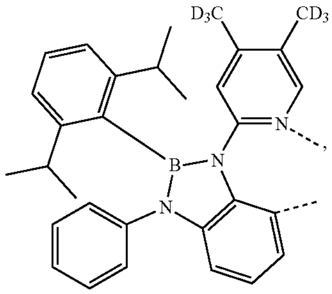
$L_{B504}$
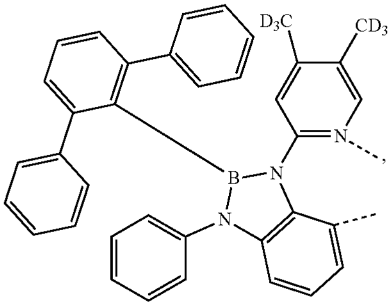
$L_{B505}$
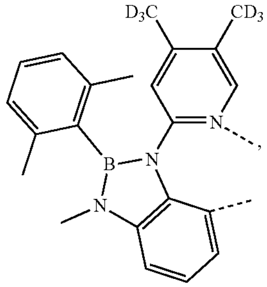
$L_{B506}$
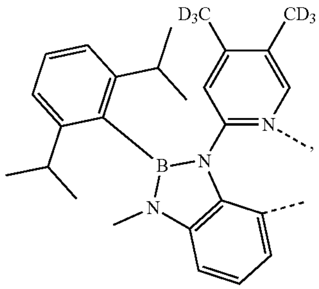
$L_{B507}$
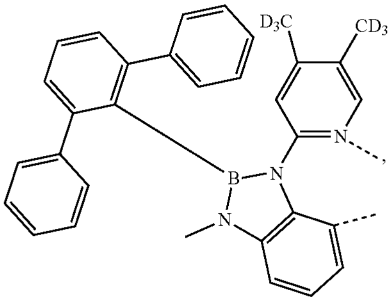

-continued
$L_{B508}$
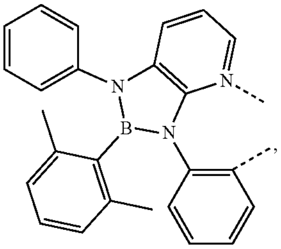
$L_{B509}$
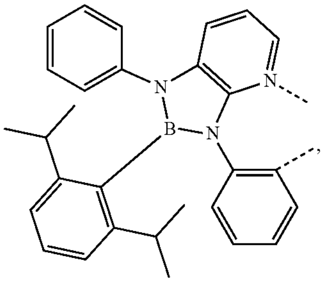
$L_{B510}$
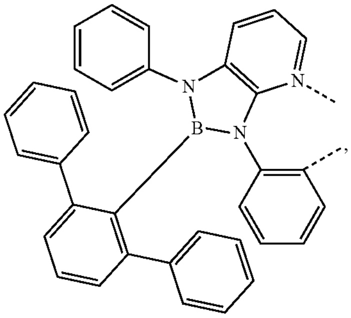
$L_{B511}$
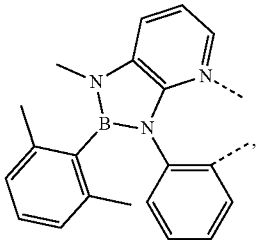
$L_{B512}$
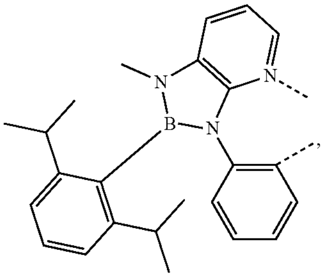
-continued
$L_{B513}$
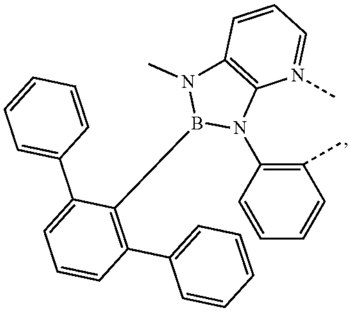
$L_{B514}$
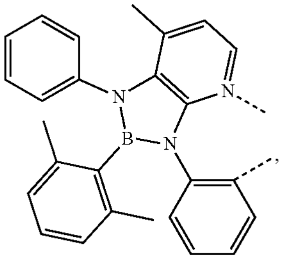
$L_{B515}$
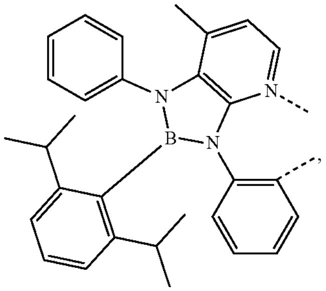
$L_{B516}$
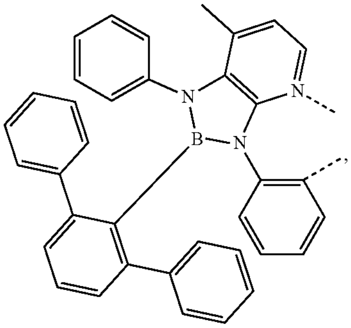
$L_{B517}$
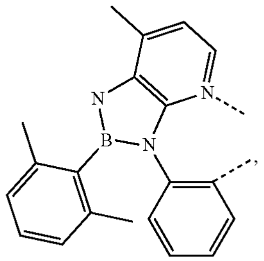

-continued
$L_{B518}$
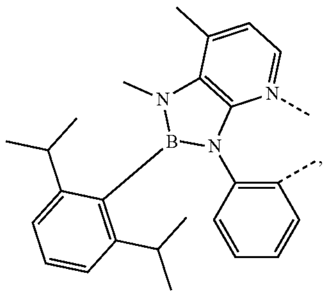
$L_{B519}$
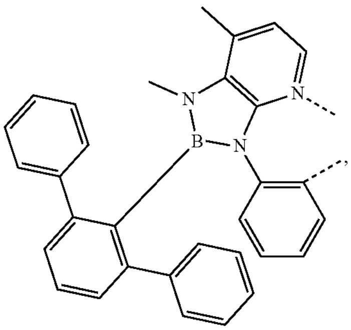
$L_{B520}$
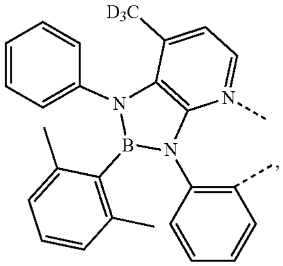
$L_{B521}$
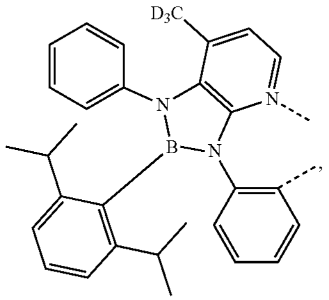
$L_{B522}$
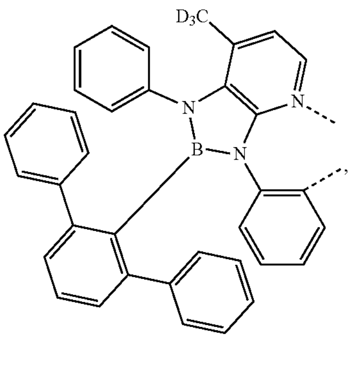
-continued
$L_{B523}$
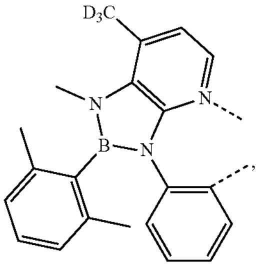
$L_{B524}$
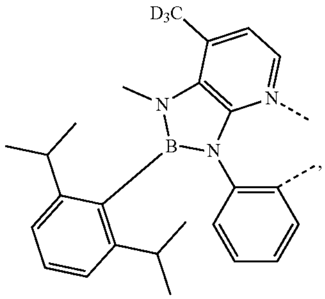
$L_{B525}$
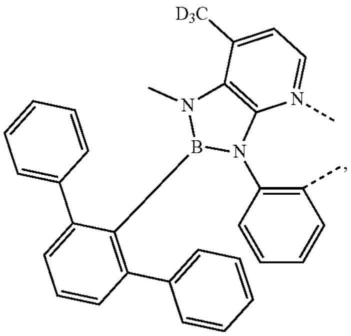
$L_{B526}$
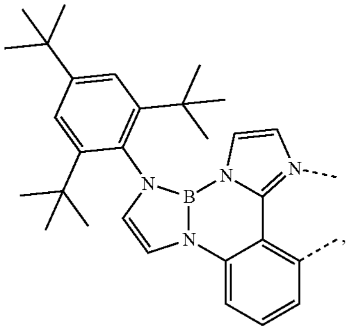
$L_{B527}$
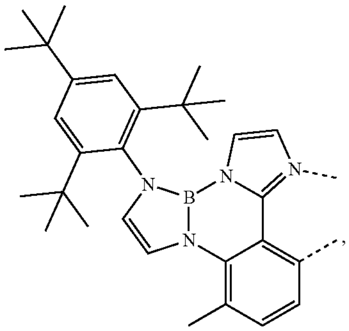

-continued
$L_{B528}$
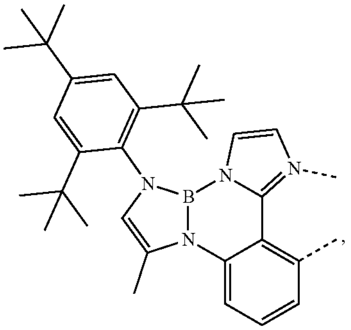
$L_{B529}$
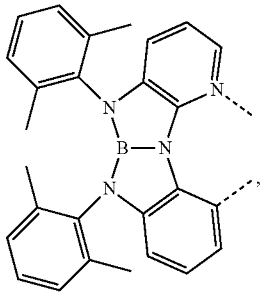
$L_{B530}$
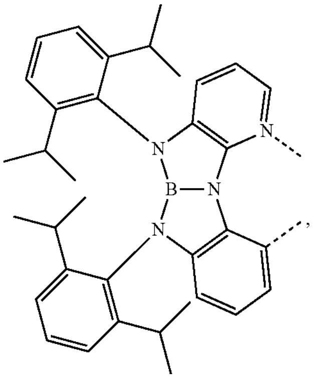
$L_{B531}$
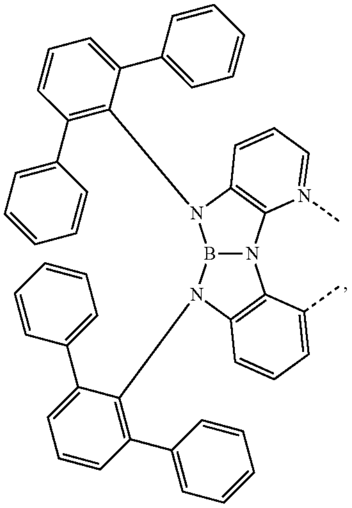
-continued
$L_{B532}$
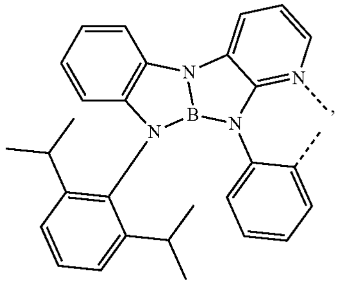
$L_{B533}$
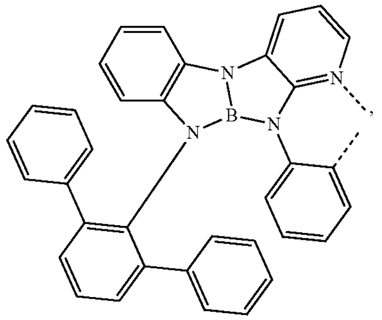
$L_{B534}$
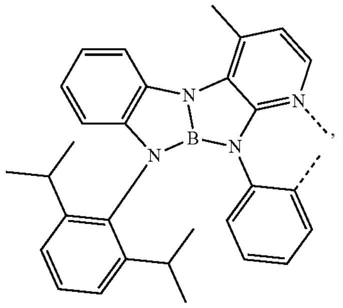
$L_{B535}$
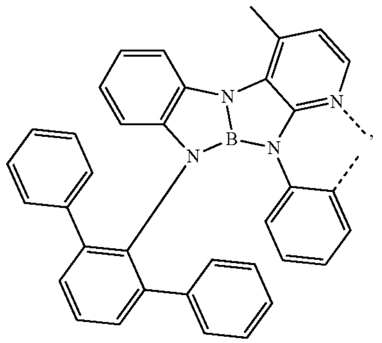
$L_{B536}$
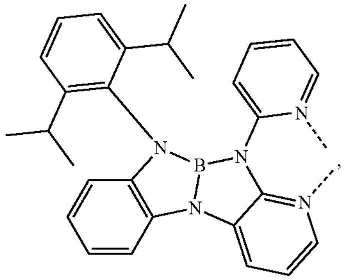

-continued
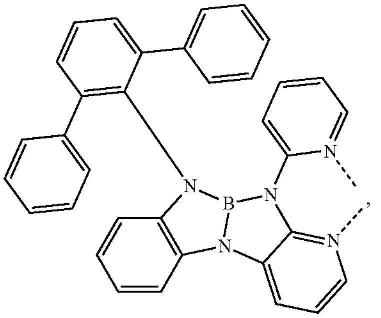
$L_{B537}$
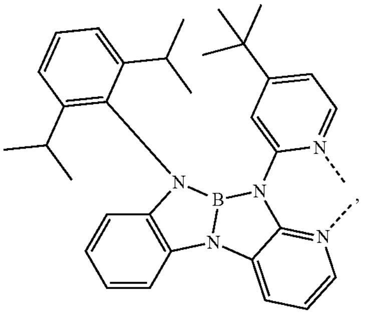
$L_{B538}$
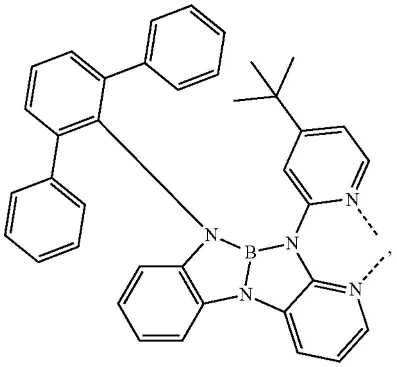
$L_{B539}$
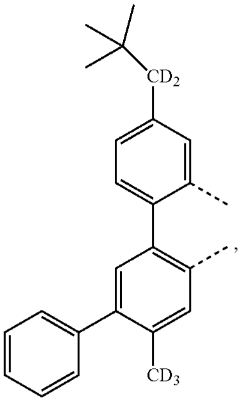
$L_{B540}$
-continued
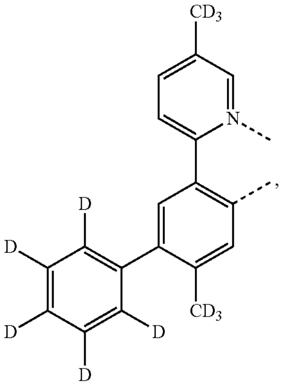
$L_{B541}$
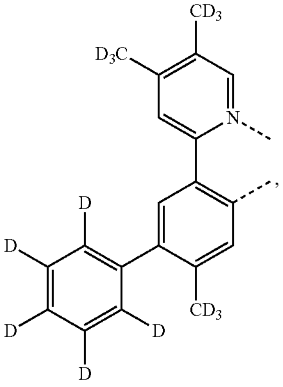
$L_{B542}$
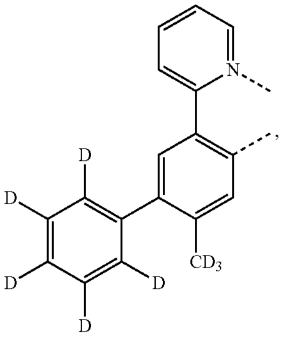
$L_{B543}$
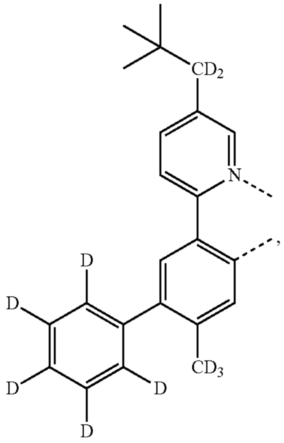
$L_{B544}$
and -continued $L_{B545}$

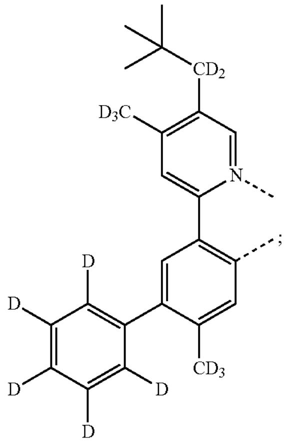

wherein each $L_{Cj-I}$ has a structure based on formula

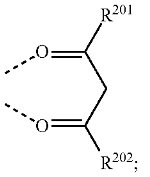

and each $L_{Cj-II}$ has a structure based on formula

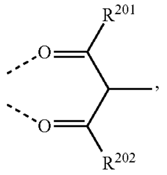

wherein for each $L_{Cj}$ in $L_{Cj-I}$ and $L_{Cj-II}$, $R^{201}$ and $R^{202}$ are each independently defined as follows in LIST 4:

| $L_{Cj}$ | $R^{201}$ | $R^{202}$ | $L_{Cj}$ | $R^{201}$ | $R^{202}$ | $L_{Cj}$ | $R^{201}$ | $R^{202}$ | $L_{Cj}$ | $R^{201}$ | $R^{202}$ |
|---|---|---|---|---|---|---|---|---|---|---|---|
| $L_{C1}$ | $R^{D1}$ | $R^{D1}$ | $L_{C193}$ | $R^{D1}$ | $R^{D3}$ | $L_{C385}$ | $R^{D17}$ | $R^{D40}$ | $L_{C577}$ | $R^{D143}$ | $R^{D120}$ |
| $L_{C2}$ | $R^{D2}$ | $R^{D2}$ | $L_{C194}$ | $R^{D1}$ | $R^{D4}$ | $L_{C386}$ | $R^{D17}$ | $R^{D41}$ | $L_{C578}$ | $R^{D143}$ | $R^{D133}$ |
| $L_{C3}$ | $R^{D3}$ | $R^{D3}$ | $L_{C195}$ | $R^{D1}$ | $R^{D5}$ | $L_{C387}$ | $R^{D17}$ | $R^{D42}$ | $L_{C579}$ | $R^{D143}$ | $R^{D134}$ |
| $L_{C4}$ | $R^{D4}$ | $R^{D4}$ | $L_{C196}$ | $R^{D1}$ | $R^{D9}$ | $L_{C388}$ | $R^{D17}$ | $R^{D43}$ | $L_{C580}$ | $R^{D143}$ | $R^{D135}$ |
| $L_{C5}$ | $R^{D5}$ | $R^{D5}$ | $L_{C197}$ | $R^{D1}$ | $R^{D10}$ | $L_{C389}$ | $R^{D17}$ | $R^{D48}$ | $L_{C581}$ | $R^{D143}$ | $R^{D136}$ |
| $L_{C6}$ | $R^{D6}$ | $R^{D6}$ | $L_{C198}$ | $R^{D1}$ | $R^{D17}$ | $L_{C390}$ | $R^{D17}$ | $R^{D49}$ | $L_{C582}$ | $R^{D143}$ | $R^{D144}$ |
| $L_{C7}$ | $R^{D7}$ | $R^{D7}$ | $L_{C199}$ | $R^{D1}$ | $R^{D18}$ | $L_{C391}$ | $R^{D17}$ | $R^{D50}$ | $L_{C583}$ | $R^{D143}$ | $R^{D145}$ |
| $L_{C8}$ | $R^{D8}$ | $R^{D8}$ | $L_{C200}$ | $R^{D1}$ | $R^{D20}$ | $L_{C392}$ | $R^{D17}$ | $R^{D54}$ | $L_{C584}$ | $R^{D143}$ | $R^{D146}$ |
| $L_{C9}$ | $R^{D9}$ | $R^{D9}$ | $L_{C201}$ | $R^{D1}$ | $R^{D22}$ | $L_{C393}$ | $R^{D17}$ | $R^{D55}$ | $L_{C585}$ | $R^{D143}$ | $R^{D147}$ |
| $L_{C10}$ | $R^{D10}$ | $R^{D10}$ | $L_{C202}$ | $R^{D1}$ | $R^{D37}$ | $L_{C394}$ | $R^{D17}$ | $R^{D58}$ | $L_{C586}$ | $R^{D143}$ | $R^{D149}$ |
| $L_{C11}$ | $R^{D11}$ | $R^{D11}$ | $L_{C203}$ | $R^{D1}$ | $R^{D40}$ | $L_{C395}$ | $R^{D17}$ | $R^{D59}$ | $L_{C587}$ | $R^{D143}$ | $R^{D151}$ |
| $L_{C12}$ | $R^{D12}$ | $R^{D12}$ | $L_{C204}$ | $R^{D1}$ | $R^{D41}$ | $L_{C396}$ | $R^{D17}$ | $R^{D78}$ | $L_{C588}$ | $R^{D143}$ | $R^{D154}$ |
| $L_{C13}$ | $R^{D13}$ | $R^{D13}$ | $L_{C205}$ | $R^{D1}$ | $R^{D42}$ | $L_{C397}$ | $R^{D17}$ | $R^{D79}$ | $L_{C589}$ | $R^{D143}$ | $R^{D155}$ |
| $L_{C14}$ | $R^{D14}$ | $R^{D14}$ | $L_{C206}$ | $R^{D1}$ | $R^{D43}$ | $L_{C398}$ | $R^{D17}$ | $R^{D81}$ | $L_{C590}$ | $R^{D143}$ | $R^{D161}$ |
| $L_{C15}$ | $R^{D15}$ | $R^{D15}$ | $L_{C207}$ | $R^{D1}$ | $R^{D48}$ | $L_{C399}$ | $R^{D17}$ | $R^{D87}$ | $L_{C591}$ | $R^{D143}$ | $R^{D175}$ |
| $L_{C16}$ | $R^{D16}$ | $R^{D16}$ | $L_{C208}$ | $R^{D1}$ | $R^{D49}$ | $L_{C400}$ | $R^{D17}$ | $R^{D88}$ | $L_{C592}$ | $R^{D144}$ | $R^{D3}$ |
| $L_{C17}$ | $R^{D17}$ | $R^{D17}$ | $L_{C209}$ | $R^{D1}$ | $R^{D50}$ | $L_{C401}$ | $R^{D17}$ | $R^{D89}$ | $L_{C593}$ | $R^{D144}$ | $R^{D5}$ |
| $L_{C18}$ | $R^{D18}$ | $R^{D18}$ | $L_{C210}$ | $R^{D1}$ | $R^{D54}$ | $L_{C402}$ | $R^{D17}$ | $R^{D93}$ | $L_{C594}$ | $R^{D144}$ | $R^{D17}$ |
| $L_{C19}$ | $R^{D19}$ | $R^{D19}$ | $L_{C211}$ | $R^{D1}$ | $R^{D55}$ | $L_{C403}$ | $R^{D17}$ | $R^{D116}$ | $L_{C595}$ | $R^{D144}$ | $R^{D18}$ |
| $L_{C20}$ | $R^{D20}$ | $R^{D20}$ | $L_{C212}$ | $R^{D1}$ | $R^{D58}$ | $L_{C404}$ | $R^{D17}$ | $R^{D117}$ | $L_{C596}$ | $R^{D144}$ | $R^{D20}$ |
| $L_{C21}$ | $R^{D21}$ | $R^{D21}$ | $L_{C213}$ | $R^{D1}$ | $R^{D59}$ | $L_{C405}$ | $R^{D17}$ | $R^{D118}$ | $L_{C597}$ | $R^{D144}$ | $R^{D22}$ |
| $L_{C22}$ | $R^{D22}$ | $R^{D22}$ | $L_{C214}$ | $R^{D1}$ | $R^{D78}$ | $L_{C406}$ | $R^{D17}$ | $R^{D119}$ | $L_{C598}$ | $R^{D144}$ | $R^{D37}$ |
| $L_{C23}$ | $R^{D23}$ | $R^{D23}$ | $L_{C215}$ | $R^{D1}$ | $R^{D79}$ | $L_{C407}$ | $R^{D17}$ | $R^{D120}$ | $L_{C599}$ | $R^{D144}$ | $R^{D40}$ |
| $L_{C24}$ | $R^{D24}$ | $R^{D24}$ | $L_{C216}$ | $R^{D1}$ | $R^{D81}$ | $L_{C408}$ | $R^{D17}$ | $R^{D133}$ | $L_{C600}$ | $R^{D144}$ | $R^{D41}$ |
| $L_{C25}$ | $R^{D25}$ | $R^{D25}$ | $L_{C217}$ | $R^{D1}$ | $R^{D87}$ | $L_{C409}$ | $R^{D17}$ | $R^{D134}$ | $L_{C601}$ | $R^{D144}$ | $R^{D42}$ |
| $L_{C26}$ | $R^{D26}$ | $R^{D26}$ | $L_{C218}$ | $R^{D1}$ | $R^{D88}$ | $L_{C410}$ | $R^{D17}$ | $R^{D135}$ | $L_{C602}$ | $R^{D144}$ | $R^{D43}$ |
| $L_{C27}$ | $R^{D27}$ | $R^{D27}$ | $L_{C219}$ | $R^{D1}$ | $R^{D89}$ | $L_{C411}$ | $R^{D17}$ | $R^{D136}$ | $L_{C603}$ | $R^{D144}$ | $R^{D48}$ |
| $L_{C28}$ | $R^{D28}$ | $R^{D28}$ | $L_{C220}$ | $R^{D1}$ | $R^{D93}$ | $L_{C412}$ | $R^{D17}$ | $R^{D143}$ | $L_{C604}$ | $R^{D144}$ | $R^{D49}$ |
| $L_{C29}$ | $R^{D29}$ | $R^{D29}$ | $L_{C221}$ | $R^{D1}$ | $R^{D116}$ | $L_{C413}$ | $R^{D17}$ | $R^{D144}$ | $L_{C605}$ | $R^{D144}$ | $R^{D54}$ |
| $L_{C30}$ | $R^{D30}$ | $R^{D30}$ | $L_{C222}$ | $R^{D1}$ | $R^{D117}$ | $L_{C414}$ | $R^{D17}$ | $R^{D145}$ | $L_{C606}$ | $R^{D144}$ | $R^{D58}$ |
| $L_{C31}$ | $R^{D31}$ | $R^{D31}$ | $L_{C223}$ | $R^{D1}$ | $R^{D118}$ | $L_{C415}$ | $R^{D17}$ | $R^{D146}$ | $L_{C607}$ | $R^{D144}$ | $R^{D59}$ |
| $L_{C32}$ | $R^{D32}$ | $R^{D32}$ | $L_{C224}$ | $R^{D1}$ | $R^{D119}$ | $L_{C416}$ | $R^{D17}$ | $R^{D147}$ | $L_{C608}$ | $R^{D144}$ | $R^{D78}$ |
| $L_{C33}$ | $R^{D33}$ | $R^{D33}$ | $L_{C225}$ | $R^{D1}$ | $R^{D120}$ | $L_{C417}$ | $R^{D17}$ | $R^{D149}$ | $L_{C609}$ | $R^{D144}$ | $R^{D79}$ |
| $L_{C34}$ | $R^{D34}$ | $R^{D34}$ | $L_{C226}$ | $R^{D1}$ | $R^{D133}$ | $L_{C418}$ | $R^{D17}$ | $R^{D151}$ | $L_{C610}$ | $R^{D144}$ | $R^{D81}$ |
| $L_{C35}$ | $R^{D35}$ | $R^{D35}$ | $L_{C227}$ | $R^{D1}$ | $R^{D134}$ | $L_{C419}$ | $R^{D17}$ | $R^{D154}$ | $L_{C611}$ | $R^{D144}$ | $R^{D87}$ |
| $L_{C36}$ | $R^{D36}$ | $R^{D36}$ | $L_{C228}$ | $R^{D1}$ | $R^{D135}$ | $L_{C420}$ | $R^{D17}$ | $R^{D155}$ | $L_{C612}$ | $R^{D144}$ | $R^{D88}$ |
| $L_{C37}$ | $R^{D37}$ | $R^{D37}$ | $L_{C229}$ | $R^{D1}$ | $R^{D136}$ | $L_{C421}$ | $R^{D17}$ | $R^{D161}$ | $L_{C613}$ | $R^{D144}$ | $R^{D89}$ |
| $L_{C38}$ | $R^{D38}$ | $R^{D38}$ | $L_{C230}$ | $R^{D1}$ | $R^{D143}$ | $L_{C422}$ | $R^{D17}$ | $R^{D175}$ | $L_{C614}$ | $R^{D144}$ | $R^{D93}$ |
| $L_{C39}$ | $R^{D39}$ | $R^{D39}$ | $L_{C231}$ | $R^{D1}$ | $R^{D144}$ | $L_{C423}$ | $R^{D50}$ | $R^{D3}$ | $L_{C615}$ | $R^{D144}$ | $R^{D116}$ |

-continued

| $L_{Cj}$ | $R^{201}$ | $R^{202}$ | $L_{Cj}$ | $R^{201}$ | $R^{202}$ | $L_{Cj}$ | $R^{201}$ | $R^{202}$ | $L_{Cj}$ | $R^{201}$ | $R^{202}$ |
|---|---|---|---|---|---|---|---|---|---|---|---|
| $L_{C40}$ | $R^{D40}$ | $R^{D40}$ | $L_{C232}$ | $R^{D1}$ | $R^{D145}$ | $L_{C424}$ | $R^{D50}$ | $R^{D5}$ | $L_{C616}$ | $R^{D144}$ | $R^{D117}$ |
| $L_{C41}$ | $R^{D41}$ | $R^{D41}$ | $L_{C233}$ | $R^{D1}$ | $R^{D146}$ | $L_{C425}$ | $R^{D50}$ | $R^{D18}$ | $L_{C617}$ | $R^{D144}$ | $R^{D118}$ |
| $L_{C42}$ | $R^{D42}$ | $R^{D42}$ | $L_{C234}$ | $R^{D1}$ | $R^{D147}$ | $L_{C426}$ | $R^{D50}$ | $R^{D20}$ | $L_{C618}$ | $R^{D144}$ | $R^{D119}$ |
| $L_{C43}$ | $R^{D43}$ | $R^{D43}$ | $L_{C235}$ | $R^{D1}$ | $R^{D149}$ | $L_{C427}$ | $R^{D50}$ | $R^{D22}$ | $L_{C619}$ | $R^{D144}$ | $R^{D120}$ |
| $L_{C44}$ | $R^{D44}$ | $R^{D44}$ | $L_{C236}$ | $R^{D1}$ | $R^{D151}$ | $L_{C428}$ | $R^{D50}$ | $R^{D37}$ | $L_{C620}$ | $R^{D144}$ | $R^{D133}$ |
| $L_{C45}$ | $R^{D45}$ | $R^{D45}$ | $L_{C237}$ | $R^{D1}$ | $R^{D154}$ | $L_{C429}$ | $R^{D50}$ | $R^{D40}$ | $L_{C621}$ | $R^{D144}$ | $R^{D134}$ |
| $L_{C46}$ | $R^{D46}$ | $R^{D46}$ | $L_{C238}$ | $R^{D1}$ | $R^{D155}$ | $L_{C430}$ | $R^{D50}$ | $R^{D41}$ | $L_{C622}$ | $R^{D144}$ | $R^{D135}$ |
| $L_{C47}$ | $R^{D47}$ | $R^{D47}$ | $L_{C239}$ | $R^{D1}$ | $R^{D161}$ | $L_{C431}$ | $R^{D50}$ | $R^{D42}$ | $L_{C623}$ | $R^{D144}$ | $R^{D136}$ |
| $L_{C48}$ | $R^{D48}$ | $R^{D48}$ | $L_{C240}$ | $R^{D1}$ | $R^{D175}$ | $L_{C432}$ | $R^{D50}$ | $R^{D43}$ | $L_{C624}$ | $R^{D144}$ | $R^{D145}$ |
| $L_{C49}$ | $R^{D49}$ | $R^{D49}$ | $L_{C241}$ | $R^{D4}$ | $R^{D3}$ | $L_{C433}$ | $R^{D50}$ | $R^{D48}$ | $L_{C625}$ | $R^{D144}$ | $R^{D146}$ |
| $L_{C50}$ | $R^{D50}$ | $R^{D50}$ | $L_{C242}$ | $R^{D4}$ | $R^{D5}$ | $L_{C434}$ | $R^{D50}$ | $R^{D49}$ | $L_{C626}$ | $R^{D144}$ | $R^{D147}$ |
| $L_{C51}$ | $R^{D51}$ | $R^{D51}$ | $L_{C243}$ | $R^{D4}$ | $R^{D9}$ | $L_{C435}$ | $R^{D50}$ | $R^{D54}$ | $L_{C627}$ | $R^{D144}$ | $R^{D149}$ |
| $L_{C52}$ | $R^{D52}$ | $R^{D52}$ | $L_{C244}$ | $R^{D4}$ | $R^{D10}$ | $L_{C436}$ | $R^{D50}$ | $R^{D55}$ | $L_{C628}$ | $R^{D144}$ | $R^{D151}$ |
| $L_{C53}$ | $R^{D53}$ | $R^{D53}$ | $L_{C245}$ | $R^{D4}$ | $R^{D17}$ | $L_{C437}$ | $R^{D50}$ | $R^{D58}$ | $L_{C629}$ | $R^{D144}$ | $R^{D154}$ |
| $L_{C54}$ | $R^{D54}$ | $R^{D54}$ | $L_{C246}$ | $R^{D4}$ | $R^{D18}$ | $L_{C438}$ | $R^{D50}$ | $R^{D59}$ | $L_{C630}$ | $R^{D144}$ | $R^{D155}$ |
| $L_{C55}$ | $R^{D55}$ | $R^{D55}$ | $L_{C247}$ | $R^{D4}$ | $R^{D20}$ | $L_{C439}$ | $R^{D50}$ | $R^{D78}$ | $L_{C631}$ | $R^{D144}$ | $R^{D161}$ |
| $L_{C56}$ | $R^{D56}$ | $R^{D56}$ | $L_{C248}$ | $R^{D4}$ | $R^{D22}$ | $L_{C440}$ | $R^{D50}$ | $R^{D79}$ | $L_{C632}$ | $R^{D144}$ | $R^{D175}$ |
| $L_{C57}$ | $R^{D57}$ | $R^{D57}$ | $L_{C249}$ | $R^{D4}$ | $R^{D37}$ | $L_{C441}$ | $R^{D50}$ | $R^{D81}$ | $L_{C633}$ | $R^{D145}$ | $R^{D3}$ |
| $L_{C58}$ | $R^{D58}$ | $R^{D58}$ | $L_{C250}$ | $R^{D4}$ | $R^{D40}$ | $L_{C442}$ | $R^{D50}$ | $R^{D87}$ | $L_{C634}$ | $R^{D145}$ | $R^{D5}$ |
| $L_{C59}$ | $R^{D59}$ | $R^{D59}$ | $L_{C251}$ | $R^{D4}$ | $R^{D41}$ | $L_{C443}$ | $R^{D50}$ | $R^{D88}$ | $L_{C635}$ | $R^{D145}$ | $R^{D17}$ |
| $L_{C60}$ | $R^{D60}$ | $R^{D60}$ | $L_{C252}$ | $R^{D4}$ | $R^{D42}$ | $L_{C444}$ | $R^{D50}$ | $R^{D89}$ | $L_{C636}$ | $R^{D145}$ | $R^{D18}$ |
| $L_{C61}$ | $R^{D61}$ | $R^{D61}$ | $L_{C253}$ | $R^{D4}$ | $R^{D43}$ | $L_{C445}$ | $R^{D50}$ | $R^{D93}$ | $L_{C637}$ | $R^{D145}$ | $R^{D20}$ |
| $L_{C62}$ | $R^{D62}$ | $R^{D62}$ | $L_{C254}$ | $R^{D4}$ | $R^{D48}$ | $L_{C446}$ | $R^{D50}$ | $R^{D116}$ | $L_{C638}$ | $R^{D145}$ | $R^{D22}$ |
| $L_{C63}$ | $R^{D63}$ | $R^{D63}$ | $L_{C255}$ | $R^{D4}$ | $R^{D49}$ | $L_{C447}$ | $R^{D50}$ | $R^{D117}$ | $L_{C639}$ | $R^{D145}$ | $R^{D37}$ |
| $L_{C64}$ | $R^{D64}$ | $R^{D64}$ | $L_{C256}$ | $R^{D4}$ | $R^{D50}$ | $L_{C448}$ | $R^{D50}$ | $R^{D118}$ | $L_{C640}$ | $R^{D145}$ | $R^{D40}$ |
| $L_{C65}$ | $R^{D65}$ | $R^{D65}$ | $L_{C257}$ | $R^{D4}$ | $R^{D54}$ | $L_{C449}$ | $R^{D50}$ | $R^{D119}$ | $L_{C641}$ | $R^{D145}$ | $R^{D41}$ |
| $L_{C66}$ | $R^{D66}$ | $R^{D66}$ | $L_{C258}$ | $R^{D4}$ | $R^{D55}$ | $L_{C450}$ | $R^{D50}$ | $R^{D120}$ | $L_{C642}$ | $R^{D145}$ | $R^{D42}$ |
| $L_{C67}$ | $R^{D67}$ | $R^{D67}$ | $L_{C259}$ | $R^{D4}$ | $R^{D58}$ | $L_{C451}$ | $R^{D50}$ | $R^{D133}$ | $L_{C643}$ | $R^{D145}$ | $R^{D43}$ |
| $L_{C68}$ | $R^{D68}$ | $R^{D68}$ | $L_{C260}$ | $R^{D4}$ | $R^{D59}$ | $L_{C452}$ | $R^{D50}$ | $R^{D134}$ | $L_{C644}$ | $R^{D145}$ | $R^{D48}$ |
| $L_{C69}$ | $R^{D69}$ | $R^{D69}$ | $L_{C261}$ | $R^{D4}$ | $R^{D78}$ | $L_{C453}$ | $R^{D50}$ | $R^{D135}$ | $L_{C645}$ | $R^{D145}$ | $R^{D49}$ |
| $L_{C70}$ | $R^{D70}$ | $R^{D70}$ | $L_{C262}$ | $R^{D4}$ | $R^{D79}$ | $L_{C454}$ | $R^{D50}$ | $R^{D136}$ | $L_{C646}$ | $R^{D145}$ | $R^{D54}$ |
| $L_{C71}$ | $R^{D71}$ | $R^{D71}$ | $L_{C263}$ | $R^{D4}$ | $R^{D81}$ | $L_{C455}$ | $R^{D50}$ | $R^{D143}$ | $L_{C647}$ | $R^{D145}$ | $R^{D58}$ |
| $L_{C72}$ | $R^{D72}$ | $R^{D72}$ | $L_{C264}$ | $R^{D4}$ | $R^{D87}$ | $L_{C456}$ | $R^{D50}$ | $R^{D144}$ | $L_{C648}$ | $R^{D145}$ | $R^{D59}$ |
| $L_{C73}$ | $R^{D73}$ | $R^{D73}$ | $L_{C265}$ | $R^{D4}$ | $R^{D88}$ | $L_{C457}$ | $R^{D50}$ | $R^{D145}$ | $L_{C649}$ | $R^{D145}$ | $R^{D78}$ |
| $L_{C74}$ | $R^{D74}$ | $R^{D74}$ | $L_{C266}$ | $R^{D4}$ | $R^{D89}$ | $L_{C458}$ | $R^{D50}$ | $R^{D146}$ | $L_{C650}$ | $R^{D145}$ | $R^{D79}$ |
| $L_{C75}$ | $R^{D75}$ | $R^{D75}$ | $L_{C267}$ | $R^{D4}$ | $R^{D93}$ | $L_{C459}$ | $R^{D50}$ | $R^{D147}$ | $L_{C651}$ | $R^{D145}$ | $R^{D81}$ |
| $L_{C76}$ | $R^{D76}$ | $R^{D76}$ | $L_{C268}$ | $R^{D4}$ | $R^{D116}$ | $L_{C460}$ | $R^{D50}$ | $R^{D149}$ | $L_{C652}$ | $R^{D145}$ | $R^{D87}$ |
| $L_{C77}$ | $R^{D77}$ | $R^{D77}$ | $L_{C269}$ | $R^{D4}$ | $R^{D117}$ | $L_{C461}$ | $R^{D50}$ | $R^{D151}$ | $L_{C653}$ | $R^{D145}$ | $R^{D88}$ |
| $L_{C78}$ | $R^{D78}$ | $R^{D78}$ | $L_{C270}$ | $R^{D4}$ | $R^{D118}$ | $L_{C462}$ | $R^{D50}$ | $R^{D154}$ | $L_{C654}$ | $R^{D145}$ | $R^{D89}$ |
| $L_{C79}$ | $R^{D79}$ | $R^{D79}$ | $L_{C271}$ | $R^{D4}$ | $R^{D119}$ | $L_{C463}$ | $R^{D50}$ | $R^{D155}$ | $L_{C655}$ | $R^{D145}$ | $R^{D93}$ |
| $L_{C80}$ | $R^{D80}$ | $R^{D80}$ | $L_{C272}$ | $R^{D4}$ | $R^{D120}$ | $L_{C464}$ | $R^{D50}$ | $R^{D161}$ | $L_{C656}$ | $R^{D145}$ | $R^{D116}$ |
| $L_{C81}$ | $R^{D81}$ | $R^{D81}$ | $L_{C273}$ | $R^{D4}$ | $R^{D133}$ | $L_{C465}$ | $R^{D50}$ | $R^{D175}$ | $L_{C657}$ | $R^{D145}$ | $R^{D117}$ |
| $L_{C82}$ | $R^{D82}$ | $R^{D82}$ | $L_{C274}$ | $R^{D4}$ | $R^{D134}$ | $L_{C466}$ | $R^{D55}$ | $R^{D3}$ | $L_{C658}$ | $R^{D145}$ | $R^{D118}$ |
| $L_{C83}$ | $R^{D83}$ | $R^{D83}$ | $L_{C275}$ | $R^{D4}$ | $R^{D135}$ | $L_{C467}$ | $R^{D55}$ | $R^{D5}$ | $L_{C659}$ | $R^{D145}$ | $R^{D119}$ |
| $L_{C84}$ | $R^{D84}$ | $R^{D84}$ | $L_{C276}$ | $R^{D4}$ | $R^{D136}$ | $L_{C468}$ | $R^{D55}$ | $R^{D18}$ | $L_{C660}$ | $R^{D145}$ | $R^{D120}$ |
| $L_{C85}$ | $R^{D85}$ | $R^{D85}$ | $L_{C277}$ | $R^{D4}$ | $R^{D143}$ | $L_{C469}$ | $R^{D55}$ | $R^{D20}$ | $L_{C661}$ | $R^{D145}$ | $R^{D133}$ |
| $L_{C86}$ | $R^{D86}$ | $R^{D86}$ | $L_{C278}$ | $R^{D4}$ | $R^{D144}$ | $L_{C470}$ | $R^{D55}$ | $R^{D22}$ | $L_{C662}$ | $R^{D145}$ | $R^{D134}$ |
| $L_{C87}$ | $R^{D87}$ | $R^{D87}$ | $L_{C279}$ | $R^{D4}$ | $R^{D145}$ | $L_{C471}$ | $R^{D55}$ | $R^{D37}$ | $L_{C663}$ | $R^{D145}$ | $R^{D135}$ |
| $L_{C88}$ | $R^{D88}$ | $R^{D88}$ | $L_{C280}$ | $R^{D4}$ | $R^{D146}$ | $L_{C472}$ | $R^{D55}$ | $R^{D40}$ | $L_{C664}$ | $R^{D145}$ | $R^{D136}$ |
| $L_{C89}$ | $R^{D89}$ | $R^{D89}$ | $L_{C281}$ | $R^{D4}$ | $R^{D147}$ | $L_{C473}$ | $R^{D55}$ | $R^{D41}$ | $L_{C665}$ | $R^{D145}$ | $R^{D146}$ |
| $L_{C90}$ | $R^{D90}$ | $R^{D90}$ | $L_{C282}$ | $R^{D4}$ | $R^{D149}$ | $L_{C474}$ | $R^{D55}$ | $R^{D42}$ | $L_{C666}$ | $R^{D145}$ | $R^{D147}$ |
| $L_{C91}$ | $R^{D91}$ | $R^{D91}$ | $L_{C283}$ | $R^{D4}$ | $R^{D155}$ | $L_{C475}$ | $R^{D55}$ | $R^{D43}$ | $L_{C667}$ | $R^{D145}$ | $R^{D149}$ |
| $L_{C92}$ | $R^{D92}$ | $R^{D92}$ | $L_{C284}$ | $R^{D4}$ | $R^{D154}$ | $L_{C476}$ | $R^{D55}$ | $R^{D48}$ | $L_{C668}$ | $R^{D145}$ | $R^{D151}$ |
| $L_{C93}$ | $R^{D93}$ | $R^{D93}$ | $L_{C285}$ | $R^{D4}$ | $R^{D155}$ | $L_{C477}$ | $R^{D55}$ | $R^{D49}$ | $L_{C669}$ | $R^{D145}$ | $R^{D154}$ |
| $L_{C94}$ | $R^{D94}$ | $R^{D94}$ | $L_{C286}$ | $R^{D4}$ | $R^{D161}$ | $L_{C478}$ | $R^{D55}$ | $R^{D54}$ | $L_{C670}$ | $R^{D145}$ | $R^{D155}$ |
| $L_{C95}$ | $R^{D95}$ | $R^{D95}$ | $L_{C287}$ | $R^{D4}$ | $R^{D175}$ | $L_{C479}$ | $R^{D55}$ | $R^{D58}$ | $L_{C671}$ | $R^{D145}$ | $R^{D161}$ |
| $L_{C96}$ | $R^{D96}$ | $R^{D96}$ | $L_{C288}$ | $R^{D9}$ | $R^{D3}$ | $L_{C480}$ | $R^{D55}$ | $R^{D59}$ | $L_{C672}$ | $R^{D145}$ | $R^{D175}$ |
| $L_{C97}$ | $R^{D97}$ | $R^{D97}$ | $L_{C289}$ | $R^{D9}$ | $R^{D5}$ | $L_{C481}$ | $R^{D55}$ | $R^{D78}$ | $L_{C673}$ | $R^{D146}$ | $R^{D3}$ |
| $L_{C98}$ | $R^{D98}$ | $R^{D98}$ | $L_{C290}$ | $R^{D9}$ | $R^{D10}$ | $L_{C482}$ | $R^{D55}$ | $R^{D79}$ | $L_{C674}$ | $R^{D146}$ | $R^{D5}$ |
| $L_{C99}$ | $R^{D99}$ | $R^{D99}$ | $L_{C291}$ | $R^{D9}$ | $R^{D17}$ | $L_{C483}$ | $R^{D55}$ | $R^{D81}$ | $L_{C675}$ | $R^{D146}$ | $R^{D17}$ |
| $L_{C100}$ | $R^{D100}$ | $R^{D100}$ | $L_{C292}$ | $R^{D9}$ | $R^{D18}$ | $L_{C484}$ | $R^{D55}$ | $R^{D87}$ | $L_{C676}$ | $R^{D146}$ | $R^{D18}$ |
| $L_{C101}$ | $R^{D101}$ | $R^{D101}$ | $L_{C293}$ | $R^{D9}$ | $R^{D20}$ | $L_{C485}$ | $R^{D55}$ | $R^{D88}$ | $L_{C677}$ | $R^{D146}$ | $R^{D20}$ |
| $L_{C102}$ | $R^{D102}$ | $R^{D102}$ | $L_{C294}$ | $R^{D9}$ | $R^{D22}$ | $L_{C486}$ | $R^{D55}$ | $R^{D89}$ | $L_{C678}$ | $R^{D146}$ | $R^{D22}$ |
| $L_{C103}$ | $R^{D103}$ | $R^{D103}$ | $L_{C295}$ | $R^{D9}$ | $R^{D37}$ | $L_{C487}$ | $R^{D55}$ | $R^{D93}$ | $L_{C679}$ | $R^{D146}$ | $R^{D37}$ |
| $L_{C104}$ | $R^{D104}$ | $R^{D104}$ | $L_{C296}$ | $R^{D9}$ | $R^{D40}$ | $L_{C488}$ | $R^{D55}$ | $R^{D116}$ | $L_{C680}$ | $R^{D146}$ | $R^{D40}$ |
| $L_{C105}$ | $R^{D105}$ | $R^{D105}$ | $L_{C297}$ | $R^{D9}$ | $R^{D41}$ | $L_{C489}$ | $R^{D55}$ | $R^{D117}$ | $L_{C681}$ | $R^{D146}$ | $R^{D41}$ |
| $L_{C106}$ | $R^{D106}$ | $R^{D106}$ | $L_{C298}$ | $R^{D9}$ | $R^{D42}$ | $L_{C490}$ | $R^{D55}$ | $R^{D118}$ | $L_{C682}$ | $R^{D146}$ | $R^{D42}$ |
| $L_{C107}$ | $R^{D107}$ | $R^{D107}$ | $L_{C299}$ | $R^{D9}$ | $R^{D43}$ | $L_{C491}$ | $R^{D55}$ | $R^{D119}$ | $L_{C683}$ | $R^{D146}$ | $R^{D43}$ |
| $L_{C108}$ | $R^{D108}$ | $R^{D108}$ | $L_{C300}$ | $R^{D9}$ | $R^{D48}$ | $L_{C492}$ | $R^{D55}$ | $R^{D120}$ | $L_{C684}$ | $R^{D146}$ | $R^{D48}$ |
| $L_{C109}$ | $R^{D109}$ | $R^{D109}$ | $L_{C301}$ | $R^{D9}$ | $R^{D49}$ | $L_{C493}$ | $R^{D55}$ | $R^{D133}$ | $L_{C685}$ | $R^{D146}$ | $R^{D49}$ |
| $L_{C110}$ | $R^{D110}$ | $R^{D110}$ | $L_{C302}$ | $R^{D9}$ | $R^{D50}$ | $L_{C494}$ | $R^{D55}$ | $R^{D134}$ | $L_{C686}$ | $R^{D146}$ | $R^{D54}$ |
| $L_{C111}$ | $R^{D111}$ | $R^{D111}$ | $L_{C303}$ | $R^{D9}$ | $R^{D54}$ | $L_{C495}$ | $R^{D55}$ | $R^{D135}$ | $L_{C687}$ | $R^{D146}$ | $R^{D58}$ |
| $L_{C112}$ | $R^{D112}$ | $R^{D112}$ | $L_{C304}$ | $R^{D9}$ | $R^{D55}$ | $L_{C496}$ | $R^{D55}$ | $R^{D136}$ | $L_{C688}$ | $R^{D146}$ | $R^{D59}$ |
| $L_{C113}$ | $R^{D113}$ | $R^{D113}$ | $L_{C305}$ | $R^{D9}$ | $R^{D58}$ | $L_{C497}$ | $R^{D55}$ | $R^{D143}$ | $L_{C689}$ | $R^{D146}$ | $R^{D78}$ |
| $L_{C114}$ | $R^{D114}$ | $R^{D114}$ | $L_{C306}$ | $R^{D9}$ | $R^{D59}$ | $L_{C498}$ | $R^{D55}$ | $R^{D144}$ | $L_{C690}$ | $R^{D146}$ | $R^{D79}$ |
| $L_{C115}$ | $R^{D115}$ | $R^{D115}$ | $L_{C307}$ | $R^{D9}$ | $R^{D78}$ | $L_{C499}$ | $R^{D55}$ | $R^{D145}$ | $L_{C691}$ | $R^{D146}$ | $R^{D81}$ |
| $L_{C116}$ | $R^{D116}$ | $R^{D116}$ | $L_{C308}$ | $R^{D9}$ | $R^{D79}$ | $L_{C500}$ | $R^{D55}$ | $R^{D146}$ | $L_{C692}$ | $R^{D146}$ | $R^{D87}$ |

-continued

| $L_{Cj}$ | $R^{201}$ | $R^{202}$ | $L_{Cj}$ | $R^{201}$ | $R^{202}$ | $L_{Cj}$ | $R^{201}$ | $R^{202}$ | $L_{Cj}$ | $R^{201}$ | $R^{202}$ |
|---|---|---|---|---|---|---|---|---|---|---|---|
| $L_{C117}$ | $R^{D117}$ | $R^{D117}$ | $L_{C309}$ | $R^{D9}$ | $R^{D81}$ | $L_{C501}$ | $R^{D55}$ | $R^{D147}$ | $L_{C693}$ | $R^{D146}$ | $R^{D88}$ |
| $L_{C118}$ | $R^{D118}$ | $R^{D118}$ | $L_{C310}$ | $R^{D9}$ | $R^{D87}$ | $L_{C502}$ | $R^{D55}$ | $R^{D149}$ | $L_{C694}$ | $R^{D146}$ | $R^{D89}$ |
| $L_{C119}$ | $R^{D119}$ | $R^{D119}$ | $L_{C311}$ | $R^{D9}$ | $R^{D55}$ | $L_{C503}$ | $R^{D88}$ | $R^{D151}$ | $L_{C695}$ | $R^{D146}$ | $R^{D93}$ |
| $L_{C120}$ | $R^{D120}$ | $R^{D120}$ | $L_{C312}$ | $R^{D9}$ | $R^{D89}$ | $L_{C504}$ | $R^{D55}$ | $R^{D154}$ | $L_{C696}$ | $R^{D146}$ | $R^{D117}$ |
| $L_{C121}$ | $R^{D121}$ | $R^{D121}$ | $L_{C313}$ | $R^{D9}$ | $R^{D93}$ | $L_{C505}$ | $R^{D55}$ | $R^{D155}$ | $L_{C697}$ | $R^{D146}$ | $R^{D118}$ |
| $L_{C122}$ | $R^{D122}$ | $R^{D122}$ | $L_{C314}$ | $R^{D9}$ | $R^{D116}$ | $L_{C506}$ | $R^{D55}$ | $R^{D161}$ | $L_{C698}$ | $R^{D146}$ | $R^{D119}$ |
| $L_{C123}$ | $R^{D123}$ | $R^{D123}$ | $L_{C315}$ | $R^{D9}$ | $R^{D117}$ | $L_{C507}$ | $R^{D55}$ | $R^{D175}$ | $L_{C699}$ | $R^{D146}$ | $R^{D120}$ |
| $L_{C124}$ | $R^{D124}$ | $R^{D124}$ | $L_{C316}$ | $R^{D9}$ | $R^{D118}$ | $L_{C508}$ | $R^{D116}$ | $R^{D3}$ | $L_{C700}$ | $R^{D146}$ | $R^{D133}$ |
| $L_{C125}$ | $R^{D125}$ | $R^{D125}$ | $L_{C317}$ | $R^{D9}$ | $R^{D119}$ | $L_{C509}$ | $R^{D116}$ | $R^{D5}$ | $L_{C701}$ | $R^{D146}$ | $R^{D134}$ |
| $L_{C126}$ | $R^{D126}$ | $R^{D126}$ | $L_{C318}$ | $R^{D9}$ | $R^{D120}$ | $L_{C510}$ | $R^{D116}$ | $R^{D17}$ | $L_{C702}$ | $R^{D146}$ | $R^{D135}$ |
| $L_{C127}$ | $R^{D127}$ | $R^{D127}$ | $L_{C319}$ | $R^{D9}$ | $R^{D133}$ | $L_{C511}$ | $R^{D116}$ | $R^{D18}$ | $L_{C703}$ | $R^{D146}$ | $R^{D136}$ |
| $L_{C128}$ | $R^{D128}$ | $R^{D128}$ | $L_{C320}$ | $R^{D9}$ | $R^{D134}$ | $L_{C512}$ | $R^{D116}$ | $R^{D20}$ | $L_{C704}$ | $R^{D146}$ | $R^{D146}$ |
| $L_{C129}$ | $R^{D129}$ | $R^{D129}$ | $L_{C321}$ | $R^{D9}$ | $R^{D135}$ | $L_{C513}$ | $R^{D116}$ | $R^{D22}$ | $L_{C705}$ | $R^{D146}$ | $R^{D147}$ |
| $L_{C130}$ | $R^{D130}$ | $R^{D130}$ | $L_{C322}$ | $R^{D9}$ | $R^{D136}$ | $L_{C514}$ | $R^{D116}$ | $R^{D37}$ | $L_{C706}$ | $R^{D146}$ | $R^{D149}$ |
| $L_{C131}$ | $R^{D131}$ | $R^{D131}$ | $L_{C323}$ | $R^{D9}$ | $R^{D143}$ | $L_{C515}$ | $R^{D116}$ | $R^{D40}$ | $L_{C707}$ | $R^{D146}$ | $R^{D151}$ |
| $L_{C132}$ | $R^{D132}$ | $R^{D132}$ | $L_{C324}$ | $R^{D9}$ | $R^{D144}$ | $L_{C516}$ | $R^{D116}$ | $R^{D41}$ | $L_{C708}$ | $R^{D146}$ | $R^{D154}$ |
| $L_{C133}$ | $R^{D133}$ | $R^{D133}$ | $L_{C325}$ | $R^{D9}$ | $R^{D145}$ | $L_{C517}$ | $R^{D116}$ | $R^{D42}$ | $L_{C709}$ | $R^{D146}$ | $R^{D155}$ |
| $L_{C134}$ | $R^{D134}$ | $R^{D134}$ | $L_{C326}$ | $R^{D9}$ | $R^{D146}$ | $L_{C518}$ | $R^{D116}$ | $R^{D43}$ | $L_{C710}$ | $R^{D146}$ | $R^{D161}$ |
| $L_{C135}$ | $R^{D135}$ | $R^{D135}$ | $L_{C327}$ | $R^{D9}$ | $R^{D147}$ | $L_{C519}$ | $R^{D116}$ | $R^{D48}$ | $L_{C711}$ | $R^{D146}$ | $R^{D175}$ |
| $L_{C136}$ | $R^{D136}$ | $R^{D136}$ | $L_{C328}$ | $R^{D9}$ | $R^{D149}$ | $L_{C520}$ | $R^{D116}$ | $R^{D49}$ | $L_{C712}$ | $R^{D133}$ | $R^{D3}$ |
| $L_{C137}$ | $R^{D137}$ | $R^{D137}$ | $L_{C329}$ | $R^{D9}$ | $R^{D151}$ | $L_{C521}$ | $R^{D116}$ | $R^{D54}$ | $L_{C713}$ | $R^{D133}$ | $R^{D5}$ |
| $L_{C138}$ | $R^{D138}$ | $R^{D138}$ | $L_{C330}$ | $R^{D9}$ | $R^{D154}$ | $L_{C522}$ | $R^{D116}$ | $R^{D58}$ | $L_{C714}$ | $R^{D133}$ | $R^{D3}$ |
| $L_{C139}$ | $R^{D139}$ | $R^{D139}$ | $L_{C331}$ | $R^{D9}$ | $R^{D155}$ | $L_{C523}$ | $R^{D116}$ | $R^{D59}$ | $L_{C715}$ | $R^{D133}$ | $R^{D18}$ |
| $L_{C140}$ | $R^{D140}$ | $R^{D140}$ | $L_{C332}$ | $R^{D9}$ | $R^{D161}$ | $L_{C524}$ | $R^{D116}$ | $R^{D78}$ | $L_{C716}$ | $R^{D133}$ | $R^{D20}$ |
| $L_{C141}$ | $R^{D141}$ | $R^{D141}$ | $L_{C333}$ | $R^{D9}$ | $R^{D175}$ | $L_{C525}$ | $R^{D116}$ | $R^{D79}$ | $L_{C717}$ | $R^{D133}$ | $R^{D22}$ |
| $L_{C142}$ | $R^{D142}$ | $R^{D142}$ | $L_{C334}$ | $R^{D10}$ | $R^{D3}$ | $L_{C526}$ | $R^{D116}$ | $R^{D81}$ | $L_{C718}$ | $R^{D133}$ | $R^{D37}$ |
| $L_{C143}$ | $R^{D143}$ | $R^{D143}$ | $L_{C335}$ | $R^{D10}$ | $R^{D5}$ | $L_{C527}$ | $R^{D116}$ | $R^{D87}$ | $L_{C719}$ | $R^{D133}$ | $R^{D40}$ |
| $L_{C144}$ | $R^{D144}$ | $R^{D144}$ | $L_{C336}$ | $R^{D10}$ | $R^{D17}$ | $L_{C528}$ | $R^{D116}$ | $R^{D88}$ | $L_{C720}$ | $R^{D133}$ | $R^{D41}$ |
| $L_{C145}$ | $R^{D145}$ | $R^{D145}$ | $L_{C337}$ | $R^{D10}$ | $R^{D18}$ | $L_{C529}$ | $R^{D116}$ | $R^{D89}$ | $L_{C721}$ | $R^{D133}$ | $R^{D42}$ |
| $L_{C146}$ | $R^{D146}$ | $R^{D146}$ | $L_{C338}$ | $R^{D10}$ | $R^{D20}$ | $L_{C530}$ | $R^{D116}$ | $R^{D93}$ | $L_{C722}$ | $R^{D133}$ | $R^{D43}$ |
| $L_{C147}$ | $R^{D147}$ | $R^{D147}$ | $L_{C339}$ | $R^{D10}$ | $R^{D22}$ | $L_{C531}$ | $R^{D116}$ | $R^{D117}$ | $L_{C723}$ | $R^{D133}$ | $R^{D48}$ |
| $L_{C148}$ | $R^{D148}$ | $R^{D148}$ | $L_{C340}$ | $R^{D10}$ | $R^{D37}$ | $L_{C532}$ | $R^{D116}$ | $R^{D118}$ | $L_{C724}$ | $R^{D133}$ | $R^{D49}$ |
| $L_{C149}$ | $R^{D149}$ | $R^{D149}$ | $L_{C341}$ | $R^{D10}$ | $R^{D40}$ | $L_{C533}$ | $R^{D116}$ | $R^{D119}$ | $L_{C725}$ | $R^{D133}$ | $R^{D54}$ |
| $L_{C150}$ | $R^{D150}$ | $R^{D150}$ | $L_{C342}$ | $R^{D10}$ | $R^{D41}$ | $L_{C534}$ | $R^{D116}$ | $R^{D120}$ | $L_{C726}$ | $R^{D133}$ | $R^{D58}$ |
| $L_{C151}$ | $R^{D151}$ | $R^{D151}$ | $L_{C343}$ | $R^{D10}$ | $R^{D42}$ | $L_{C535}$ | $R^{D116}$ | $R^{D133}$ | $L_{C727}$ | $R^{D133}$ | $R^{D59}$ |
| $L_{C152}$ | $R^{D152}$ | $R^{D152}$ | $L_{C344}$ | $R^{D10}$ | $R^{D43}$ | $L_{C536}$ | $R^{D116}$ | $R^{D134}$ | $L_{C728}$ | $R^{D133}$ | $R^{D78}$ |
| $L_{C153}$ | $R^{D153}$ | $R^{D153}$ | $L_{C345}$ | $R^{D10}$ | $R^{D48}$ | $L_{C537}$ | $R^{D116}$ | $R^{D135}$ | $L_{C729}$ | $R^{D133}$ | $R^{D79}$ |
| $L_{C154}$ | $R^{D154}$ | $R^{D154}$ | $L_{C346}$ | $R^{D10}$ | $R^{D49}$ | $L_{C538}$ | $R^{D116}$ | $R^{D136}$ | $L_{C730}$ | $R^{D133}$ | $R^{D81}$ |
| $L_{C155}$ | $R^{D155}$ | $R^{D155}$ | $L_{C347}$ | $R^{D10}$ | $R^{D50}$ | $L_{C539}$ | $R^{D116}$ | $R^{D143}$ | $L_{C731}$ | $R^{D133}$ | $R^{D87}$ |
| $L_{C156}$ | $R^{D156}$ | $R^{D156}$ | $L_{C348}$ | $R^{D10}$ | $R^{D54}$ | $L_{C540}$ | $R^{D116}$ | $R^{D144}$ | $L_{C732}$ | $R^{D133}$ | $R^{D88}$ |
| $L_{C157}$ | $R^{D157}$ | $R^{D157}$ | $L_{C349}$ | $R^{D10}$ | $R^{D55}$ | $L_{C541}$ | $R^{D116}$ | $R^{D145}$ | $L_{C733}$ | $R^{D133}$ | $R^{D89}$ |
| $L_{C158}$ | $R^{D158}$ | $R^{D158}$ | $L_{C350}$ | $R^{D10}$ | $R^{D58}$ | $L_{C542}$ | $R^{D116}$ | $R^{D146}$ | $L_{C734}$ | $R^{D133}$ | $R^{D93}$ |
| $L_{C159}$ | $R^{D159}$ | $R^{D159}$ | $L_{C351}$ | $R^{D10}$ | $R^{D59}$ | $L_{C543}$ | $R^{D116}$ | $R^{D147}$ | $L_{C735}$ | $R^{D133}$ | $R^{D117}$ |
| $L_{C160}$ | $R^{D160}$ | $R^{D160}$ | $L_{C352}$ | $R^{D10}$ | $R^{D78}$ | $L_{C544}$ | $R^{D116}$ | $R^{D149}$ | $L_{C736}$ | $R^{D133}$ | $R^{D118}$ |
| $L_{C161}$ | $R^{D161}$ | $R^{D161}$ | $L_{C353}$ | $R^{D10}$ | $R^{D79}$ | $L_{C545}$ | $R^{D116}$ | $R^{D151}$ | $L_{C737}$ | $R^{D133}$ | $R^{D119}$ |
| $L_{C162}$ | $R^{D162}$ | $R^{D162}$ | $L_{C354}$ | $R^{D10}$ | $R^{D81}$ | $L_{C546}$ | $R^{D116}$ | $R^{D154}$ | $L_{C738}$ | $R^{D133}$ | $R^{D120}$ |
| $L_{C163}$ | $R^{D163}$ | $R^{D163}$ | $L_{C355}$ | $R^{D10}$ | $R^{D87}$ | $L_{C547}$ | $R^{D116}$ | $R^{D155}$ | $L_{C739}$ | $R^{D133}$ | $R^{D133}$ |
| $L_{C164}$ | $R^{D164}$ | $R^{D164}$ | $L_{C356}$ | $R^{D10}$ | $R^{D88}$ | $L_{C548}$ | $R^{D116}$ | $R^{D161}$ | $L_{C740}$ | $R^{D133}$ | $R^{D134}$ |
| $L_{C165}$ | $R^{D165}$ | $R^{D165}$ | $L_{C357}$ | $R^{D10}$ | $R^{D89}$ | $L_{C549}$ | $R^{D116}$ | $R^{D175}$ | $L_{C741}$ | $R^{D133}$ | $R^{D135}$ |
| $L_{C166}$ | $R^{D166}$ | $R^{D166}$ | $L_{C358}$ | $R^{D10}$ | $R^{D93}$ | $L_{C550}$ | $R^{D143}$ | $R^{D3}$ | $L_{C742}$ | $R^{D133}$ | $R^{D136}$ |
| $L_{C167}$ | $R^{D167}$ | $R^{D167}$ | $L_{C359}$ | $R^{D10}$ | $R^{D116}$ | $L_{C551}$ | $R^{D143}$ | $R^{D5}$ | $L_{C743}$ | $R^{D133}$ | $R^{D146}$ |
| $L_{C168}$ | $R^{D168}$ | $R^{D168}$ | $L_{C360}$ | $R^{D10}$ | $R^{D117}$ | $L_{C552}$ | $R^{D143}$ | $R^{D17}$ | $L_{C744}$ | $R^{D133}$ | $R^{D147}$ |
| $L_{C169}$ | $R^{D169}$ | $R^{D169}$ | $L_{C361}$ | $R^{D10}$ | $R^{D118}$ | $L_{C553}$ | $R^{D143}$ | $R^{D18}$ | $L_{C745}$ | $R^{D133}$ | $R^{D149}$ |
| $L_{C170}$ | $R^{D170}$ | $R^{D170}$ | $L_{C362}$ | $R^{D10}$ | $R^{D119}$ | $L_{C554}$ | $R^{D143}$ | $R^{D20}$ | $L_{C746}$ | $R^{D133}$ | $R^{D151}$ |
| $L_{C171}$ | $R^{D171}$ | $R^{D171}$ | $L_{C363}$ | $R^{D10}$ | $R^{D120}$ | $L_{C555}$ | $R^{D143}$ | $R^{D22}$ | $L_{C747}$ | $R^{D133}$ | $R^{D154}$ |
| $L_{C172}$ | $R^{D172}$ | $R^{D172}$ | $L_{C364}$ | $R^{D10}$ | $R^{D133}$ | $L_{C556}$ | $R^{D143}$ | $R^{D37}$ | $L_{C748}$ | $R^{D133}$ | $R^{D155}$ |
| $L_{C173}$ | $R^{D173}$ | $R^{D173}$ | $L_{C365}$ | $R^{D10}$ | $R^{D134}$ | $L_{C557}$ | $R^{D143}$ | $R^{D40}$ | $L_{C749}$ | $R^{D133}$ | $R^{D161}$ |
| $L_{C174}$ | $R^{D174}$ | $R^{D174}$ | $L_{C366}$ | $R^{D10}$ | $R^{D135}$ | $L_{C558}$ | $R^{D143}$ | $R^{D41}$ | $L_{C750}$ | $R^{D133}$ | $R^{D175}$ |
| $L_{C175}$ | $R^{D175}$ | $R^{D175}$ | $L_{C367}$ | $R^{D10}$ | $R^{D136}$ | $L_{C559}$ | $R^{D143}$ | $R^{D42}$ | $L_{C751}$ | $R^{D175}$ | $R^{D3}$ |
| $L_{C176}$ | $R^{D176}$ | $R^{D176}$ | $L_{C368}$ | $R^{D10}$ | $R^{D143}$ | $L_{C560}$ | $R^{D143}$ | $R^{D43}$ | $L_{C752}$ | $R^{D175}$ | $R^{D5}$ |
| $L_{C177}$ | $R^{D177}$ | $R^{D177}$ | $L_{C369}$ | $R^{D10}$ | $R^{D144}$ | $L_{C561}$ | $R^{D143}$ | $R^{D48}$ | $L_{C753}$ | $R^{D175}$ | $R^{D18}$ |
| $L_{C178}$ | $R^{D178}$ | $R^{D178}$ | $L_{C370}$ | $R^{D10}$ | $R^{D145}$ | $L_{C562}$ | $R^{D143}$ | $R^{D49}$ | $L_{C754}$ | $R^{D175}$ | $R^{D20}$ |
| $L_{C179}$ | $R^{D179}$ | $R^{D179}$ | $L_{C371}$ | $R^{D10}$ | $R^{D146}$ | $L_{C563}$ | $R^{D143}$ | $R^{D54}$ | $L_{C755}$ | $R^{D175}$ | $R^{D22}$ |
| $L_{C180}$ | $R^{D180}$ | $R^{D180}$ | $L_{C372}$ | $R^{D10}$ | $R^{D147}$ | $L_{C564}$ | $R^{D143}$ | $R^{D58}$ | $L_{C756}$ | $R^{D175}$ | $R^{D37}$ |
| $L_{C181}$ | $R^{D181}$ | $R^{D181}$ | $L_{C373}$ | $R^{D10}$ | $R^{D149}$ | $L_{C565}$ | $R^{D143}$ | $R^{D59}$ | $L_{C757}$ | $R^{D175}$ | $R^{D40}$ |
| $L_{C182}$ | $R^{D182}$ | $R^{D182}$ | $L_{C374}$ | $R^{D10}$ | $R^{D151}$ | $L_{C566}$ | $R^{D143}$ | $R^{D78}$ | $L_{C758}$ | $R^{D175}$ | $R^{D41}$ |
| $L_{C183}$ | $R^{D183}$ | $R^{D183}$ | $L_{C375}$ | $R^{D10}$ | $R^{D154}$ | $L_{C567}$ | $R^{D143}$ | $R^{D79}$ | $L_{C759}$ | $R^{D175}$ | $R^{D42}$ |
| $L_{C184}$ | $R^{D184}$ | $R^{D184}$ | $L_{C376}$ | $R^{D10}$ | $R^{D155}$ | $L_{C568}$ | $R^{D143}$ | $R^{D81}$ | $L_{C760}$ | $R^{D175}$ | $R^{D43}$ |
| $L_{C185}$ | $R^{D185}$ | $R^{D185}$ | $L_{C377}$ | $R^{D10}$ | $R^{D161}$ | $L_{C569}$ | $R^{D143}$ | $R^{D87}$ | $L_{C761}$ | $R^{D175}$ | $R^{D48}$ |
| $L_{C186}$ | $R^{D186}$ | $R^{D186}$ | $L_{C378}$ | $R^{D10}$ | $R^{D175}$ | $L_{C570}$ | $R^{D143}$ | $R^{D88}$ | $L_{C762}$ | $R^{D175}$ | $R^{D49}$ |
| $L_{C187}$ | $R^{D187}$ | $R^{D187}$ | $L_{C379}$ | $R^{D17}$ | $R^{D3}$ | $L_{C571}$ | $R^{D143}$ | $R^{D89}$ | $L_{C763}$ | $R^{D175}$ | $R^{D54}$ |
| $L_{C188}$ | $R^{D188}$ | $R^{D188}$ | $L_{C380}$ | $R^{D17}$ | $R^{D5}$ | $L_{C572}$ | $R^{D143}$ | $R^{D93}$ | $L_{C764}$ | $R^{D175}$ | $R^{D58}$ |
| $L_{C189}$ | $R^{D189}$ | $R^{D189}$ | $L_{C381}$ | $R^{D17}$ | $R^{D18}$ | $L_{C573}$ | $R^{D143}$ | $R^{D116}$ | $L_{C765}$ | $R^{D175}$ | $R^{D59}$ |
| $L_{C190}$ | $R^{D190}$ | $R^{D190}$ | $L_{C382}$ | $R^{D17}$ | $R^{D20}$ | $L_{C574}$ | $R^{D143}$ | $R^{D117}$ | $L_{C766}$ | $R^{D175}$ | $R^{D78}$ |
| $L_{C191}$ | $R^{D191}$ | $R^{D191}$ | $L_{C383}$ | $R^{D17}$ | $R^{D22}$ | $L_{C575}$ | $R^{D143}$ | $R^{D118}$ | $L_{C767}$ | $R^{D175}$ | $R^{D79}$ |
| $L_{C192}$ | $R^{D192}$ | $R^{D192}$ | $L_{C384}$ | $R^{D17}$ | $R^{D37}$ | $L_{C576}$ | $R^{D143}$ | $R^{D119}$ | $L_{C768}$ | $R^{D175}$ | $R^{D81}$ |
| $L_{C769}$ | $R^{D193}$ | $R^{D193}$ | $L_{C877}$ | $R^{D1}$ | $R^{D193}$ | $L_{C985}$ | $R^{D4}$ | $R^{D193}$ | $L_{C1093}$ | $R^{D9}$ | $R^{D193}$ |

-continued

| $L_{Cj}$ | $R^{201}$ | $R^{202}$ | $L_{Cj}$ | $R^{201}$ | $R^{202}$ | $L_{Cj}$ | $R^{201}$ | $R^{202}$ | $L_{Cj}$ | $R^{201}$ | $R^{202}$ |
|---|---|---|---|---|---|---|---|---|---|---|---|
| $L_{C770}$ | $R^{D194}$ | $R^{D194}$ | $L_{C878}$ | $R^{D1}$ | $R^{D194}$ | $L_{C986}$ | $R^{D4}$ | $R^{D194}$ | $L_{C1094}$ | $R^{D9}$ | $R^{D194}$ |
| $L_{C771}$ | $R^{D195}$ | $R^{D195}$ | $L_{C879}$ | $R^{D1}$ | $R^{D195}$ | $L_{C987}$ | $R^{D4}$ | $R^{D195}$ | $L_{C1095}$ | $R^{D9}$ | $R^{D195}$ |
| $L_{C772}$ | $R^{D196}$ | $R^{D196}$ | $L_{C880}$ | $R^{D1}$ | $R^{D196}$ | $L_{C988}$ | $R^{D4}$ | $R^{D196}$ | $L_{C1096}$ | $R^{D9}$ | $R^{D196}$ |
| $L_{C773}$ | $R^{D197}$ | $R^{D197}$ | $L_{C881}$ | $R^{D1}$ | $R^{D197}$ | $L_{C989}$ | $R^{D4}$ | $R^{D197}$ | $L_{C1097}$ | $R^{D9}$ | $R^{D197}$ |
| $L_{C774}$ | $R^{D198}$ | $R^{D198}$ | $L_{C882}$ | $R^{D1}$ | $R^{D198}$ | $L_{C990}$ | $R^{D4}$ | $R^{D198}$ | $L_{C1098}$ | $R^{D9}$ | $R^{D198}$ |
| $L_{C775}$ | $R^{D199}$ | $R^{D199}$ | $L_{C883}$ | $R^{D1}$ | $R^{D199}$ | $L_{C991}$ | $R^{D4}$ | $R^{D199}$ | $L_{C1099}$ | $R^{D9}$ | $R^{D199}$ |
| $L_{C776}$ | $R^{D200}$ | $R^{D200}$ | $L_{C884}$ | $R^{D1}$ | $R^{D200}$ | $L_{C992}$ | $R^{D4}$ | $R^{D200}$ | $L_{C1100}$ | $R^{D9}$ | $R^{D200}$ |
| $L_{C777}$ | $R^{D201}$ | $R^{D201}$ | $L_{C885}$ | $R^{D1}$ | $R^{D201}$ | $L_{C993}$ | $R^{D4}$ | $R^{D201}$ | $L_{C1101}$ | $R^{D9}$ | $R^{D201}$ |
| $L_{C778}$ | $R^{D202}$ | $R^{D202}$ | $L_{C886}$ | $R^{D1}$ | $R^{D202}$ | $L_{C994}$ | $R^{D4}$ | $R^{D202}$ | $L_{C1102}$ | $R^{D9}$ | $R^{D202}$ |
| $L_{C779}$ | $R^{D203}$ | $R^{D203}$ | $L_{C887}$ | $R^{D1}$ | $R^{D203}$ | $L_{C995}$ | $R^{D4}$ | $R^{D203}$ | $L_{C1103}$ | $R^{D9}$ | $R^{D203}$ |
| $L_{C780}$ | $R^{D204}$ | $R^{D204}$ | $L_{C888}$ | $R^{D1}$ | $R^{D204}$ | $L_{C996}$ | $R^{D4}$ | $R^{D204}$ | $L_{C1104}$ | $R^{D9}$ | $R^{D204}$ |
| $L_{C781}$ | $R^{D205}$ | $R^{D205}$ | $L_{C889}$ | $R^{D1}$ | $R^{D205}$ | $L_{C997}$ | $R^{D4}$ | $R^{D205}$ | $L_{C1105}$ | $R^{D9}$ | $R^{D205}$ |
| $L_{C782}$ | $R^{D206}$ | $R^{D206}$ | $L_{C890}$ | $R^{D1}$ | $R^{D206}$ | $L_{C998}$ | $R^{D4}$ | $R^{D206}$ | $L_{C1106}$ | $R^{D9}$ | $R^{D206}$ |
| $L_{C783}$ | $R^{D207}$ | $R^{D207}$ | $L_{C891}$ | $R^{D1}$ | $R^{D207}$ | $L_{C999}$ | $R^{D4}$ | $R^{D207}$ | $L_{C1107}$ | $R^{D9}$ | $R^{D207}$ |
| $L_{C784}$ | $R^{D208}$ | $R^{D208}$ | $L_{C892}$ | $R^{D1}$ | $R^{D208}$ | $L_{C1000}$ | $R^{D4}$ | $R^{D208}$ | $L_{C1108}$ | $R^{D9}$ | $R^{D208}$ |
| $L_{C785}$ | $R^{D209}$ | $R^{D209}$ | $L_{C893}$ | $R^{D1}$ | $R^{D209}$ | $L_{C1001}$ | $R^{D4}$ | $R^{D209}$ | $L_{C1109}$ | $R^{D9}$ | $R^{D209}$ |
| $L_{C786}$ | $R^{D210}$ | $R^{D210}$ | $L_{C894}$ | $R^{D1}$ | $R^{D210}$ | $L_{C1002}$ | $R^{D4}$ | $R^{D210}$ | $L_{C1110}$ | $R^{D9}$ | $R^{D210}$ |
| $L_{C787}$ | $R^{D211}$ | $R^{D211}$ | $L_{C895}$ | $R^{D1}$ | $R^{D211}$ | $L_{C1003}$ | $R^{D4}$ | $R^{D211}$ | $L_{C1111}$ | $R^{D9}$ | $R^{D211}$ |
| $L_{C788}$ | $R^{D212}$ | $R^{D212}$ | $L_{C896}$ | $R^{D1}$ | $R^{D212}$ | $L_{C1004}$ | $R^{D4}$ | $R^{D212}$ | $L_{C1112}$ | $R^{D9}$ | $R^{D212}$ |
| $L_{C789}$ | $R^{D213}$ | $R^{D213}$ | $L_{C897}$ | $R^{D1}$ | $R^{D213}$ | $L_{C1005}$ | $R^{D4}$ | $R^{D213}$ | $L_{C1113}$ | $R^{D9}$ | $R^{D213}$ |
| $L_{C790}$ | $R^{D214}$ | $R^{D214}$ | $L_{C898}$ | $R^{D1}$ | $R^{D214}$ | $L_{C1006}$ | $R^{D4}$ | $R^{D214}$ | $L_{C1114}$ | $R^{D9}$ | $R^{D214}$ |
| $L_{C791}$ | $R^{D215}$ | $R^{D215}$ | $L_{C899}$ | $R^{D1}$ | $R^{D215}$ | $L_{C1007}$ | $R^{D4}$ | $R^{D215}$ | $L_{C1115}$ | $R^{D9}$ | $R^{D215}$ |
| $L_{C792}$ | $R^{D216}$ | $R^{D216}$ | $L_{C900}$ | $R^{D1}$ | $R^{D216}$ | $L_{C1008}$ | $R^{D4}$ | $R^{D216}$ | $L_{C1116}$ | $R^{D9}$ | $R^{D216}$ |
| $L_{C793}$ | $R^{D217}$ | $R^{D217}$ | $L_{C901}$ | $R^{D1}$ | $R^{D217}$ | $L_{C1009}$ | $R^{D4}$ | $R^{D217}$ | $L_{C1117}$ | $R^{D9}$ | $R^{D217}$ |
| $L_{C794}$ | $R^{D218}$ | $R^{D218}$ | $L_{C902}$ | $R^{D1}$ | $R^{D218}$ | $L_{C1010}$ | $R^{D4}$ | $R^{D218}$ | $L_{C1118}$ | $R^{D9}$ | $R^{D218}$ |
| $L_{C795}$ | $R^{D219}$ | $R^{D219}$ | $L_{C903}$ | $R^{D1}$ | $R^{D219}$ | $L_{C1011}$ | $R^{D4}$ | $R^{D219}$ | $L_{C1119}$ | $R^{D9}$ | $R^{D219}$ |
| $L_{C796}$ | $R^{D220}$ | $R^{D220}$ | $L_{C904}$ | $R^{D1}$ | $R^{D220}$ | $L_{C1012}$ | $R^{D4}$ | $R^{D220}$ | $L_{C1120}$ | $R^{D9}$ | $R^{D220}$ |
| $L_{C797}$ | $R^{D221}$ | $R^{D221}$ | $L_{C905}$ | $R^{D1}$ | $R^{D221}$ | $L_{C1013}$ | $R^{D4}$ | $R^{D221}$ | $L_{C1121}$ | $R^{D9}$ | $R^{D221}$ |
| $L_{C798}$ | $R^{D222}$ | $R^{D222}$ | $L_{C906}$ | $R^{D1}$ | $R^{D222}$ | $L_{C1014}$ | $R^{D4}$ | $R^{D222}$ | $L_{C1122}$ | $R^{D9}$ | $R^{D222}$ |
| $L_{C799}$ | $R^{D223}$ | $R^{D223}$ | $L_{C907}$ | $R^{D1}$ | $R^{D223}$ | $L_{C1015}$ | $R^{D4}$ | $R^{D223}$ | $L_{C1123}$ | $R^{D9}$ | $R^{D223}$ |
| $L_{C800}$ | $R^{D224}$ | $R^{D224}$ | $L_{C908}$ | $R^{D1}$ | $R^{D224}$ | $L_{C1016}$ | $R^{D4}$ | $R^{D224}$ | $L_{C1124}$ | $R^{D9}$ | $R^{D224}$ |
| $L_{C801}$ | $R^{D225}$ | $R^{D225}$ | $L_{C909}$ | $R^{D1}$ | $R^{D225}$ | $L_{C1017}$ | $R^{D4}$ | $R^{D225}$ | $L_{C1125}$ | $R^{D9}$ | $R^{D225}$ |
| $L_{C802}$ | $R^{D226}$ | $R^{D226}$ | $L_{C910}$ | $R^{D1}$ | $R^{D226}$ | $L_{C1018}$ | $R^{D4}$ | $R^{D226}$ | $L_{C1126}$ | $R^{D9}$ | $R^{D226}$ |
| $L_{C803}$ | $R^{D227}$ | $R^{D227}$ | $L_{C911}$ | $R^{D1}$ | $R^{D227}$ | $L_{C1019}$ | $R^{D4}$ | $R^{D227}$ | $L_{C1127}$ | $R^{D9}$ | $R^{D227}$ |
| $L_{C804}$ | $R^{D228}$ | $R^{D228}$ | $L_{C912}$ | $R^{D1}$ | $R^{D228}$ | $L_{C1020}$ | $R^{D4}$ | $R^{D228}$ | $L_{C1128}$ | $R^{D9}$ | $R^{D228}$ |
| $L_{C805}$ | $R^{D229}$ | $R^{D229}$ | $L_{C913}$ | $R^{D1}$ | $R^{D229}$ | $L_{C1021}$ | $R^{D4}$ | $R^{D229}$ | $L_{C1129}$ | $R^{D9}$ | $R^{D229}$ |
| $L_{C806}$ | $R^{D230}$ | $R^{D230}$ | $L_{C914}$ | $R^{D1}$ | $R^{D230}$ | $L_{C1022}$ | $R^{D4}$ | $R^{D230}$ | $L_{C1130}$ | $R^{D9}$ | $R^{D230}$ |
| $L_{C807}$ | $R^{D231}$ | $R^{D231}$ | $L_{C915}$ | $R^{D1}$ | $R^{D231}$ | $L_{C1023}$ | $R^{D4}$ | $R^{D231}$ | $L_{C1131}$ | $R^{D9}$ | $R^{D231}$ |
| $L_{C808}$ | $R^{D232}$ | $R^{D232}$ | $L_{C916}$ | $R^{D1}$ | $R^{D232}$ | $L_{C1024}$ | $R^{D4}$ | $R^{D232}$ | $L_{C1132}$ | $R^{D9}$ | $R^{D232}$ |
| $L_{C809}$ | $R^{D233}$ | $R^{D233}$ | $L_{C917}$ | $R^{D1}$ | $R^{D233}$ | $L_{C1025}$ | $R^{D4}$ | $R^{D233}$ | $L_{C1133}$ | $R^{D9}$ | $R^{D233}$ |
| $L_{C810}$ | $R^{D234}$ | $R^{D234}$ | $L_{C918}$ | $R^{D1}$ | $R^{D234}$ | $L_{C1026}$ | $R^{D4}$ | $R^{D234}$ | $L_{C1134}$ | $R^{D9}$ | $R^{D234}$ |
| $L_{C811}$ | $R^{D235}$ | $R^{D235}$ | $L_{C919}$ | $R^{D1}$ | $R^{D235}$ | $L_{C1027}$ | $R^{D4}$ | $R^{D235}$ | $L_{C1135}$ | $R^{D9}$ | $R^{D235}$ |
| $L_{C812}$ | $R^{D236}$ | $R^{D236}$ | $L_{C920}$ | $R^{D1}$ | $R^{D236}$ | $L_{C1028}$ | $R^{D4}$ | $R^{D236}$ | $L_{C1136}$ | $R^{D9}$ | $R^{D236}$ |
| $L_{C813}$ | $R^{D237}$ | $R^{D237}$ | $L_{C921}$ | $R^{D1}$ | $R^{D237}$ | $L_{C1029}$ | $R^{D4}$ | $R^{D237}$ | $L_{C1137}$ | $R^{D9}$ | $R^{D237}$ |
| $L_{C814}$ | $R^{D238}$ | $R^{D238}$ | $L_{C922}$ | $R^{D1}$ | $R^{D238}$ | $L_{C1030}$ | $R^{D4}$ | $R^{D238}$ | $L_{C1138}$ | $R^{D9}$ | $R^{D238}$ |
| $L_{C815}$ | $R^{D239}$ | $R^{D239}$ | $L_{C923}$ | $R^{D1}$ | $R^{D239}$ | $L_{C1031}$ | $R^{D4}$ | $R^{D239}$ | $L_{C1139}$ | $R^{D9}$ | $R^{D239}$ |
| $L_{C816}$ | $R^{D240}$ | $R^{D240}$ | $L_{C924}$ | $R^{D1}$ | $R^{D240}$ | $L_{C1032}$ | $R^{D4}$ | $R^{D240}$ | $L_{C1140}$ | $R^{D9}$ | $R^{D240}$ |
| $L_{C817}$ | $R^{D241}$ | $R^{D241}$ | $L_{C925}$ | $R^{D1}$ | $R^{D241}$ | $L_{C1033}$ | $R^{D4}$ | $R^{D241}$ | $L_{C1141}$ | $R^{D9}$ | $R^{D241}$ |
| $L_{C818}$ | $R^{D242}$ | $R^{D242}$ | $L_{C926}$ | $R^{D1}$ | $R^{D242}$ | $L_{C1034}$ | $R^{D4}$ | $R^{D242}$ | $L_{C1142}$ | $R^{D9}$ | $R^{D242}$ |
| $L_{C819}$ | $R^{D243}$ | $R^{D243}$ | $L_{C927}$ | $R^{D1}$ | $R^{D243}$ | $L_{C1035}$ | $R^{D4}$ | $R^{D243}$ | $L_{C1143}$ | $R^{D9}$ | $R^{D243}$ |
| $L_{C820}$ | $R^{D244}$ | $R^{D244}$ | $L_{C928}$ | $R^{D1}$ | $R^{D244}$ | $L_{C1036}$ | $R^{D4}$ | $R^{D244}$ | $L_{C1144}$ | $R^{D9}$ | $R^{D244}$ |
| $L_{C821}$ | $R^{D245}$ | $R^{D245}$ | $L_{C929}$ | $R^{D1}$ | $R^{D245}$ | $L_{C1037}$ | $R^{D4}$ | $R^{D245}$ | $L_{C1145}$ | $R^{D9}$ | $R^{D245}$ |
| $L_{C822}$ | $R^{D246}$ | $R^{D246}$ | $L_{C930}$ | $R^{D1}$ | $R^{D246}$ | $L_{C1038}$ | $R^{D4}$ | $R^{D246}$ | $L_{C1146}$ | $R^{D9}$ | $R^{D246}$ |
| $L_{C823}$ | $R^{D17}$ | $R^{D193}$ | $L_{C931}$ | $R^{D50}$ | $R^{D193}$ | $L_{C1039}$ | $R^{D145}$ | $R^{D193}$ | $L_{C1147}$ | $R^{D168}$ | $R^{D193}$ |
| $L_{C824}$ | $R^{D17}$ | $R^{D194}$ | $L_{C932}$ | $R^{D50}$ | $R^{D194}$ | $L_{C1040}$ | $R^{D145}$ | $R^{D194}$ | $L_{C1148}$ | $R^{D168}$ | $R^{D194}$ |
| $L_{C825}$ | $R^{D17}$ | $R^{D195}$ | $L_{C933}$ | $R^{D50}$ | $R^{D195}$ | $L_{C1041}$ | $R^{D145}$ | $R^{D195}$ | $L_{C1149}$ | $R^{D168}$ | $R^{D195}$ |
| $L_{C826}$ | $R^{D17}$ | $R^{D196}$ | $L_{C934}$ | $R^{D50}$ | $R^{D196}$ | $L_{C1042}$ | $R^{D145}$ | $R^{D196}$ | $L_{C1150}$ | $R^{D168}$ | $R^{D196}$ |
| $L_{C827}$ | $R^{D17}$ | $R^{D197}$ | $L_{C935}$ | $R^{D50}$ | $R^{D197}$ | $L_{C1043}$ | $R^{D145}$ | $R^{D197}$ | $L_{C1151}$ | $R^{D168}$ | $R^{D197}$ |
| $L_{C828}$ | $R^{D17}$ | $R^{D198}$ | $L_{C936}$ | $R^{D50}$ | $R^{D198}$ | $L_{C1044}$ | $R^{D145}$ | $R^{D198}$ | $L_{C1152}$ | $R^{D168}$ | $R^{D198}$ |
| $L_{C829}$ | $R^{D17}$ | $R^{D199}$ | $L_{C937}$ | $R^{D50}$ | $R^{D199}$ | $L_{C1045}$ | $R^{D145}$ | $R^{D199}$ | $L_{C1153}$ | $R^{D168}$ | $R^{D199}$ |
| $L_{C830}$ | $R^{D17}$ | $R^{D200}$ | $L_{C938}$ | $R^{D50}$ | $R^{D200}$ | $L_{C1046}$ | $R^{D145}$ | $R^{D200}$ | $L_{C1154}$ | $R^{D168}$ | $R^{D200}$ |
| $L_{C831}$ | $R^{D17}$ | $R^{D201}$ | $L_{C939}$ | $R^{D50}$ | $R^{D201}$ | $L_{C1047}$ | $R^{D145}$ | $R^{D201}$ | $L_{C1155}$ | $R^{D168}$ | $R^{D201}$ |
| $L_{C832}$ | $R^{D17}$ | $R^{D202}$ | $L_{C940}$ | $R^{D50}$ | $R^{D202}$ | $L_{C1048}$ | $R^{D145}$ | $R^{D202}$ | $L_{C1156}$ | $R^{D168}$ | $R^{D202}$ |
| $L_{C833}$ | $R^{D17}$ | $R^{D203}$ | $L_{C941}$ | $R^{D50}$ | $R^{D203}$ | $L_{C1049}$ | $R^{D145}$ | $R^{D203}$ | $L_{C1157}$ | $R^{D168}$ | $R^{D203}$ |
| $L_{C834}$ | $R^{D17}$ | $R^{D204}$ | $L_{C942}$ | $R^{D50}$ | $R^{D204}$ | $L_{C1050}$ | $R^{D145}$ | $R^{D204}$ | $L_{C1158}$ | $R^{D168}$ | $R^{D204}$ |
| $L_{C835}$ | $R^{D17}$ | $R^{D205}$ | $L_{C943}$ | $R^{D50}$ | $R^{D205}$ | $L_{C1051}$ | $R^{D145}$ | $R^{D205}$ | $L_{C1159}$ | $R^{D168}$ | $R^{D205}$ |
| $L_{C836}$ | $R^{D17}$ | $R^{D206}$ | $L_{C944}$ | $R^{D50}$ | $R^{D206}$ | $L_{C1052}$ | $R^{D145}$ | $R^{D206}$ | $L_{C1160}$ | $R^{D168}$ | $R^{D206}$ |
| $L_{C837}$ | $R^{D17}$ | $R^{D207}$ | $L_{C945}$ | $R^{D50}$ | $R^{D207}$ | $L_{C1053}$ | $R^{D145}$ | $R^{D207}$ | $L_{C1161}$ | $R^{D168}$ | $R^{D207}$ |
| $L_{C838}$ | $R^{D17}$ | $R^{D208}$ | $L_{C946}$ | $R^{D50}$ | $R^{D208}$ | $L_{C1054}$ | $R^{D145}$ | $R^{D208}$ | $L_{C1162}$ | $R^{D168}$ | $R^{D208}$ |
| $L_{C839}$ | $R^{D17}$ | $R^{D209}$ | $L_{C947}$ | $R^{D50}$ | $R^{D209}$ | $L_{C1055}$ | $R^{D145}$ | $R^{D209}$ | $L_{C1163}$ | $R^{D168}$ | $R^{D209}$ |
| $L_{C840}$ | $R^{D17}$ | $R^{D210}$ | $L_{C948}$ | $R^{D50}$ | $R^{D210}$ | $L_{C1056}$ | $R^{D145}$ | $R^{D210}$ | $L_{C1164}$ | $R^{D168}$ | $R^{D210}$ |
| $L_{C841}$ | $R^{D17}$ | $R^{D211}$ | $L_{C949}$ | $R^{D50}$ | $R^{D211}$ | $L_{C1057}$ | $R^{D145}$ | $R^{D211}$ | $L_{C1165}$ | $R^{D168}$ | $R^{D211}$ |
| $L_{C842}$ | $R^{D17}$ | $R^{D212}$ | $L_{C950}$ | $R^{D50}$ | $R^{D212}$ | $L_{C1058}$ | $R^{D145}$ | $R^{D212}$ | $L_{C1166}$ | $R^{D168}$ | $R^{D212}$ |
| $L_{C843}$ | $R^{D17}$ | $R^{D213}$ | $L_{C951}$ | $R^{D50}$ | $R^{D213}$ | $L_{C1059}$ | $R^{D145}$ | $R^{D213}$ | $L_{C1167}$ | $R^{D168}$ | $R^{D213}$ |
| $L_{C844}$ | $R^{D17}$ | $R^{D214}$ | $L_{C952}$ | $R^{D50}$ | $R^{D214}$ | $L_{C1060}$ | $R^{D145}$ | $R^{D214}$ | $L_{C1168}$ | $R^{D168}$ | $R^{D214}$ |
| $L_{C845}$ | $R^{D17}$ | $R^{D215}$ | $L_{C953}$ | $R^{D50}$ | $R^{D215}$ | $L_{C1061}$ | $R^{D145}$ | $R^{D215}$ | $L_{C1169}$ | $R^{D168}$ | $R^{D215}$ |
| $L_{C846}$ | $R^{D17}$ | $R^{D216}$ | $L_{C954}$ | $R^{D50}$ | $R^{D216}$ | $L_{C1062}$ | $R^{D145}$ | $R^{D216}$ | $L_{C1170}$ | $R^{D168}$ | $R^{D216}$ |

-continued

| $L_{Cj}$ | $R^{201}$ | $R^{202}$ | $L_{Cj}$ | $R^{201}$ | $R^{202}$ | $L_{Cj}$ | $R^{201}$ | $R^{202}$ | $L_{Cj}$ | $R^{201}$ | $R^{202}$ |
|---|---|---|---|---|---|---|---|---|---|---|---|
| $L_{C847}$ | $R^{D17}$ | $R^{D217}$ | $L_{C955}$ | $R^{D50}$ | $R^{D217}$ | $L_{C1063}$ | $R^{D145}$ | $R^{D217}$ | $L_{C1171}$ | $R^{D168}$ | $R^{D217}$ |
| $L_{C848}$ | $R^{D17}$ | $R^{D218}$ | $L_{C956}$ | $R^{D50}$ | $R^{D218}$ | $L_{C1064}$ | $R^{D145}$ | $R^{D218}$ | $L_{C1172}$ | $R^{D168}$ | $R^{D218}$ |
| $L_{C849}$ | $R^{D17}$ | $R^{D219}$ | $L_{C957}$ | $R^{D50}$ | $R^{D219}$ | $L_{C1065}$ | $R^{D145}$ | $R^{D219}$ | $L_{C1173}$ | $R^{D168}$ | $R^{D219}$ |
| $L_{C850}$ | $R^{D17}$ | $R^{D220}$ | $L_{C958}$ | $R^{D50}$ | $R^{D220}$ | $L_{C1066}$ | $R^{D145}$ | $R^{D220}$ | $L_{C1174}$ | $R^{D168}$ | $R^{D220}$ |
| $L_{C851}$ | $R^{D17}$ | $R^{D221}$ | $L_{C959}$ | $R^{D50}$ | $R^{D221}$ | $L_{C1067}$ | $R^{D145}$ | $R^{D221}$ | $L_{C1175}$ | $R^{D168}$ | $R^{D221}$ |
| $L_{C852}$ | $R^{D17}$ | $R^{D222}$ | $L_{C960}$ | $R^{D50}$ | $R^{D222}$ | $L_{C1068}$ | $R^{D145}$ | $R^{D222}$ | $L_{C1176}$ | $R^{D168}$ | $R^{D222}$ |
| $L_{C853}$ | $R^{D17}$ | $R^{D223}$ | $L_{C961}$ | $R^{D50}$ | $R^{D223}$ | $L_{C1069}$ | $R^{D145}$ | $R^{D223}$ | $L_{C1177}$ | $R^{D168}$ | $R^{D223}$ |
| $L_{C854}$ | $R^{D17}$ | $R^{D224}$ | $L_{C962}$ | $R^{D50}$ | $R^{D224}$ | $L_{C1070}$ | $R^{D145}$ | $R^{D224}$ | $L_{C1178}$ | $R^{D168}$ | $R^{D224}$ |
| $L_{C855}$ | $R^{D17}$ | $R^{D225}$ | $L_{C963}$ | $R^{D50}$ | $R^{D225}$ | $L_{C1071}$ | $R^{D145}$ | $R^{D225}$ | $L_{C1179}$ | $R^{D168}$ | $R^{D225}$ |
| $L_{C856}$ | $R^{D17}$ | $R^{D226}$ | $L_{C964}$ | $R^{D50}$ | $R^{D226}$ | $L_{C1072}$ | $R^{D145}$ | $R^{D226}$ | $L_{C1180}$ | $R^{D168}$ | $R^{D226}$ |
| $L_{C857}$ | $R^{D17}$ | $R^{D227}$ | $L_{C965}$ | $R^{D50}$ | $R^{D227}$ | $L_{C1073}$ | $R^{D145}$ | $R^{D227}$ | $L_{C1181}$ | $R^{D168}$ | $R^{D227}$ |
| $L_{C858}$ | $R^{D17}$ | $R^{D228}$ | $L_{C966}$ | $R^{D50}$ | $R^{D228}$ | $L_{C1074}$ | $R^{D145}$ | $R^{D228}$ | $L_{C1182}$ | $R^{D168}$ | $R^{D228}$ |
| $L_{C859}$ | $R^{D17}$ | $R^{D229}$ | $L_{C967}$ | $R^{D50}$ | $R^{D229}$ | $L_{C1075}$ | $R^{D145}$ | $R^{D229}$ | $L_{C1183}$ | $R^{D168}$ | $R^{D229}$ |
| $L_{C860}$ | $R^{D17}$ | $R^{D230}$ | $L_{C968}$ | $R^{D50}$ | $R^{D230}$ | $L_{C1076}$ | $R^{D145}$ | $R^{D230}$ | $L_{C1184}$ | $R^{D168}$ | $R^{D230}$ |
| $L_{C861}$ | $R^{D17}$ | $R^{D231}$ | $L_{C969}$ | $R^{D50}$ | $R^{D231}$ | $L_{C1077}$ | $R^{D145}$ | $R^{D231}$ | $L_{C1185}$ | $R^{D168}$ | $R^{D231}$ |
| $L_{C862}$ | $R^{D17}$ | $R^{D232}$ | $L_{C970}$ | $R^{D50}$ | $R^{D232}$ | $L_{C1078}$ | $R^{D145}$ | $R^{D232}$ | $L_{C1186}$ | $R^{D168}$ | $R^{D232}$ |
| $L_{C863}$ | $R^{D17}$ | $R^{D233}$ | $L_{C971}$ | $R^{D50}$ | $R^{D233}$ | $L_{C1079}$ | $R^{D145}$ | $R^{D233}$ | $L_{C1187}$ | $R^{D168}$ | $R^{D233}$ |
| $L_{C864}$ | $R^{D17}$ | $R^{D234}$ | $L_{C972}$ | $R^{D50}$ | $R^{D234}$ | $L_{C1080}$ | $R^{D145}$ | $R^{D234}$ | $L_{C1188}$ | $R^{D168}$ | $R^{D234}$ |
| $L_{C865}$ | $R^{D17}$ | $R^{D235}$ | $L_{C973}$ | $R^{D50}$ | $R^{D235}$ | $L_{C1081}$ | $R^{D145}$ | $R^{D235}$ | $L_{C1189}$ | $R^{D168}$ | $R^{D235}$ |
| $L_{C866}$ | $R^{D17}$ | $R^{D236}$ | $L_{C974}$ | $R^{D50}$ | $R^{D236}$ | $L_{C1082}$ | $R^{D145}$ | $R^{D236}$ | $L_{C1190}$ | $R^{D168}$ | $R^{D236}$ |
| $L_{C867}$ | $R^{D17}$ | $R^{D237}$ | $L_{C975}$ | $R^{D50}$ | $R^{D237}$ | $L_{C1083}$ | $R^{D145}$ | $R^{D237}$ | $L_{C1191}$ | $R^{D168}$ | $R^{D237}$ |
| $L_{C868}$ | $R^{D17}$ | $R^{D238}$ | $L_{C976}$ | $R^{D50}$ | $R^{D238}$ | $L_{C1084}$ | $R^{D145}$ | $R^{D238}$ | $L_{C1192}$ | $R^{D168}$ | $R^{D238}$ |
| $L_{C869}$ | $R^{D17}$ | $R^{D239}$ | $L_{C977}$ | $R^{D50}$ | $R^{D239}$ | $L_{C1085}$ | $R^{D145}$ | $R^{D239}$ | $L_{C1193}$ | $R^{D168}$ | $R^{D239}$ |
| $L_{C870}$ | $R^{D17}$ | $R^{D240}$ | $L_{C978}$ | $R^{D50}$ | $R^{D240}$ | $L_{C1086}$ | $R^{D145}$ | $R^{D240}$ | $L_{C1194}$ | $R^{D168}$ | $R^{D240}$ |
| $L_{C871}$ | $R^{D17}$ | $R^{D241}$ | $L_{C979}$ | $R^{D50}$ | $R^{D241}$ | $L_{C1087}$ | $R^{D145}$ | $R^{D241}$ | $L_{C1195}$ | $R^{D168}$ | $R^{D241}$ |
| $L_{C872}$ | $R^{D17}$ | $R^{D242}$ | $L_{C980}$ | $R^{D50}$ | $R^{D242}$ | $L_{C1088}$ | $R^{D145}$ | $R^{D242}$ | $L_{C1196}$ | $R^{D168}$ | $R^{D242}$ |
| $L_{C873}$ | $R^{D17}$ | $R^{D243}$ | $L_{C981}$ | $R^{D50}$ | $R^{D243}$ | $L_{C1089}$ | $R^{D145}$ | $R^{D243}$ | $L_{C1197}$ | $R^{D168}$ | $R^{D243}$ |
| $L_{C874}$ | $R^{D17}$ | $R^{D244}$ | $L_{C982}$ | $R^{D50}$ | $R^{D244}$ | $L_{C1090}$ | $R^{D145}$ | $R^{D244}$ | $L_{C1198}$ | $R^{D168}$ | $R^{D244}$ |
| $L_{C875}$ | $R^{D17}$ | $R^{D245}$ | $L_{C983}$ | $R^{D50}$ | $R^{D245}$ | $L_{C1091}$ | $R^{D145}$ | $R^{D245}$ | $L_{C1199}$ | $R^{D168}$ | $R^{D245}$ |
| $L_{C876}$ | $R^{D17}$ | $R^{D246}$ | $L_{C984}$ | $R^{D50}$ | $R^{D246}$ | $L_{C1092}$ | $R^{D145}$ | $R^{D246}$ | $L_{C1200}$ | $R^{D168}$ | $R^{D246}$ |
| $L_{C1201}$ | $R^{D10}$ | $R^{D193}$ | $L_{C1255}$ | $R^{D55}$ | $R^{D193}$ | $L_{C1309}$ | $R^{D37}$ | $R^{D193}$ | $L_{C1363}$ | $R^{D143}$ | $R^{D193}$ |
| $L_{C1202}$ | $R^{D10}$ | $R^{D194}$ | $L_{C1256}$ | $R^{D55}$ | $R^{D194}$ | $L_{C1310}$ | $R^{D37}$ | $R^{D194}$ | $L_{C1364}$ | $R^{D143}$ | $R^{D194}$ |
| $L_{C1203}$ | $R^{D10}$ | $R^{D195}$ | $L_{C1257}$ | $R^{D55}$ | $R^{D195}$ | $L_{C1311}$ | $R^{D37}$ | $R^{D195}$ | $L_{C1365}$ | $R^{D143}$ | $R^{D195}$ |
| $L_{C1204}$ | $R^{D10}$ | $R^{D196}$ | $L_{C1258}$ | $R^{D55}$ | $R^{D196}$ | $L_{C1312}$ | $R^{D37}$ | $R^{D196}$ | $L_{C1366}$ | $R^{D143}$ | $R^{D196}$ |
| $L_{C1205}$ | $R^{D10}$ | $R^{D197}$ | $L_{C1259}$ | $R^{D55}$ | $R^{D197}$ | $L_{C1313}$ | $R^{D37}$ | $R^{D197}$ | $L_{C1367}$ | $R^{D143}$ | $R^{D197}$ |
| $L_{C1206}$ | $R^{D10}$ | $R^{D198}$ | $L_{C1260}$ | $R^{D55}$ | $R^{D198}$ | $L_{C1314}$ | $R^{D37}$ | $R^{D198}$ | $L_{C1368}$ | $R^{D143}$ | $R^{D198}$ |
| $L_{C1207}$ | $R^{D10}$ | $R^{D199}$ | $L_{C1261}$ | $R^{D55}$ | $R^{D199}$ | $L_{C1315}$ | $R^{D37}$ | $R^{D199}$ | $L_{C1369}$ | $R^{D143}$ | $R^{D199}$ |
| $L_{C1208}$ | $R^{D10}$ | $R^{D200}$ | $L_{C1262}$ | $R^{D55}$ | $R^{D200}$ | $L_{C1316}$ | $R^{D37}$ | $R^{D200}$ | $L_{C1370}$ | $R^{D143}$ | $R^{D200}$ |
| $L_{C1209}$ | $R^{D10}$ | $R^{D201}$ | $L_{C1263}$ | $R^{D55}$ | $R^{D201}$ | $L_{C1317}$ | $R^{D37}$ | $R^{D201}$ | $L_{C1371}$ | $R^{D143}$ | $R^{D201}$ |
| $L_{C1210}$ | $R^{D10}$ | $R^{D202}$ | $L_{C1264}$ | $R^{D55}$ | $R^{D202}$ | $L_{C1318}$ | $R^{D37}$ | $R^{D202}$ | $L_{C1372}$ | $R^{D143}$ | $R^{D202}$ |
| $L_{C1211}$ | $R^{D10}$ | $R^{D203}$ | $L_{C1265}$ | $R^{D55}$ | $R^{D203}$ | $L_{C1319}$ | $R^{D37}$ | $R^{D203}$ | $L_{C1373}$ | $R^{D143}$ | $R^{D203}$ |
| $L_{C1212}$ | $R^{D10}$ | $R^{D204}$ | $L_{C1266}$ | $R^{D55}$ | $R^{D204}$ | $L_{C1320}$ | $R^{D37}$ | $R^{D204}$ | $L_{C1374}$ | $R^{D143}$ | $R^{D204}$ |
| $L_{C1213}$ | $R^{D10}$ | $R^{D205}$ | $L_{C1267}$ | $R^{D55}$ | $R^{D205}$ | $L_{C1321}$ | $R^{D37}$ | $R^{D205}$ | $L_{C1375}$ | $R^{D143}$ | $R^{D205}$ |
| $L_{C1214}$ | $R^{D10}$ | $R^{D206}$ | $L_{C1268}$ | $R^{D55}$ | $R^{D206}$ | $L_{C1322}$ | $R^{D37}$ | $R^{D206}$ | $L_{C1376}$ | $R^{D143}$ | $R^{D206}$ |
| $L_{C1215}$ | $R^{D10}$ | $R^{D207}$ | $L_{C1269}$ | $R^{D55}$ | $R^{D207}$ | $L_{C1323}$ | $R^{D37}$ | $R^{D207}$ | $L_{C1377}$ | $R^{D143}$ | $R^{D207}$ |
| $L_{C1216}$ | $R^{D10}$ | $R^{D208}$ | $L_{C1270}$ | $R^{D55}$ | $R^{D208}$ | $L_{C1324}$ | $R^{D37}$ | $R^{D208}$ | $L_{C1378}$ | $R^{D143}$ | $R^{D208}$ |
| $L_{C1217}$ | $R^{D10}$ | $R^{D209}$ | $L_{C1271}$ | $R^{D55}$ | $R^{D209}$ | $L_{C1325}$ | $R^{D37}$ | $R^{D209}$ | $L_{C1379}$ | $R^{D143}$ | $R^{D209}$ |
| $L_{C1218}$ | $R^{D10}$ | $R^{D210}$ | $L_{C1272}$ | $R^{D55}$ | $R^{D210}$ | $L_{C1326}$ | $R^{D37}$ | $R^{D210}$ | $L_{C1380}$ | $R^{D143}$ | $R^{D210}$ |
| $L_{C1219}$ | $R^{D10}$ | $R^{D211}$ | $L_{C1273}$ | $R^{D55}$ | $R^{D211}$ | $L_{C1327}$ | $R^{D37}$ | $R^{D211}$ | $L_{C1381}$ | $R^{D143}$ | $R^{D211}$ |
| $L_{C1220}$ | $R^{D10}$ | $R^{D212}$ | $L_{C1274}$ | $R^{D55}$ | $R^{D212}$ | $L_{C1328}$ | $R^{D37}$ | $R^{D212}$ | $L_{C1382}$ | $R^{D143}$ | $R^{D212}$ |
| $L_{C1221}$ | $R^{D10}$ | $R^{D213}$ | $L_{C1275}$ | $R^{D55}$ | $R^{D213}$ | $L_{C1329}$ | $R^{D37}$ | $R^{D213}$ | $L_{C1383}$ | $R^{D143}$ | $R^{D213}$ |
| $L_{C1222}$ | $R^{D10}$ | $R^{D214}$ | $L_{C1276}$ | $R^{D55}$ | $R^{D214}$ | $L_{C1330}$ | $R^{D37}$ | $R^{D214}$ | $L_{C1384}$ | $R^{D143}$ | $R^{D214}$ |
| $L_{C1223}$ | $R^{D10}$ | $R^{D215}$ | $L_{C1277}$ | $R^{D55}$ | $R^{D215}$ | $L_{C1331}$ | $R^{D37}$ | $R^{D215}$ | $L_{C1385}$ | $R^{D143}$ | $R^{D215}$ |
| $L_{C1224}$ | $R^{D10}$ | $R^{D216}$ | $L_{C1278}$ | $R^{D55}$ | $R^{D216}$ | $L_{C1332}$ | $R^{D37}$ | $R^{D216}$ | $L_{C1386}$ | $R^{D143}$ | $R^{D216}$ |
| $L_{C1225}$ | $R^{D10}$ | $R^{D217}$ | $L_{C1279}$ | $R^{D55}$ | $R^{D217}$ | $L_{C1333}$ | $R^{D37}$ | $R^{D217}$ | $L_{C1387}$ | $R^{D143}$ | $R^{D217}$ |
| $L_{C1226}$ | $R^{D10}$ | $R^{D218}$ | $L_{C1280}$ | $R^{D55}$ | $R^{D218}$ | $L_{C1334}$ | $R^{D37}$ | $R^{D218}$ | $L_{C1388}$ | $R^{D143}$ | $R^{D218}$ |
| $L_{C1227}$ | $R^{D10}$ | $R^{D219}$ | $L_{C1281}$ | $R^{D55}$ | $R^{D219}$ | $L_{C1335}$ | $R^{D37}$ | $R^{D219}$ | $L_{C1389}$ | $R^{D143}$ | $R^{D219}$ |
| $L_{C1228}$ | $R^{D10}$ | $R^{D220}$ | $L_{C1282}$ | $R^{D55}$ | $R^{D220}$ | $L_{C1336}$ | $R^{D37}$ | $R^{D220}$ | $L_{C1390}$ | $R^{D143}$ | $R^{D220}$ |
| $L_{C1229}$ | $R^{D10}$ | $R^{D221}$ | $L_{C1283}$ | $R^{D55}$ | $R^{D221}$ | $L_{C1337}$ | $R^{D37}$ | $R^{D221}$ | $L_{C1391}$ | $R^{D143}$ | $R^{D221}$ |
| $L_{C1230}$ | $R^{D10}$ | $R^{D222}$ | $L_{C1284}$ | $R^{D55}$ | $R^{D222}$ | $L_{C1338}$ | $R^{D37}$ | $R^{D222}$ | $L_{C1392}$ | $R^{D143}$ | $R^{D222}$ |
| $L_{C1231}$ | $R^{D10}$ | $R^{D223}$ | $L_{C1285}$ | $R^{D55}$ | $R^{D223}$ | $L_{C1339}$ | $R^{D37}$ | $R^{D223}$ | $L_{C1393}$ | $R^{D143}$ | $R^{D223}$ |
| $L_{C1232}$ | $R^{D10}$ | $R^{D224}$ | $L_{C1286}$ | $R^{D55}$ | $R^{D224}$ | $L_{C1340}$ | $R^{D37}$ | $R^{D224}$ | $L_{C1394}$ | $R^{D143}$ | $R^{D224}$ |
| $L_{C1233}$ | $R^{D10}$ | $R^{D225}$ | $L_{C1287}$ | $R^{D55}$ | $R^{D225}$ | $L_{C1341}$ | $R^{D37}$ | $R^{D225}$ | $L_{C1395}$ | $R^{D143}$ | $R^{D225}$ |
| $L_{C1234}$ | $R^{D10}$ | $R^{D226}$ | $L_{C1288}$ | $R^{D55}$ | $R^{D226}$ | $L_{C1342}$ | $R^{D37}$ | $R^{D226}$ | $L_{C1396}$ | $R^{D143}$ | $R^{D226}$ |
| $L_{C1235}$ | $R^{D10}$ | $R^{D227}$ | $L_{C1289}$ | $R^{D55}$ | $R^{D227}$ | $L_{C1343}$ | $R^{D37}$ | $R^{D227}$ | $L_{C1397}$ | $R^{D143}$ | $R^{D227}$ |
| $L_{C1236}$ | $R^{D10}$ | $R^{D228}$ | $L_{C1290}$ | $R^{D55}$ | $R^{D228}$ | $L_{C1344}$ | $R^{D37}$ | $R^{D228}$ | $L_{C1398}$ | $R^{D143}$ | $R^{D228}$ |
| $L_{C1237}$ | $R^{D10}$ | $R^{D229}$ | $L_{C1291}$ | $R^{D55}$ | $R^{D229}$ | $L_{C1345}$ | $R^{D37}$ | $R^{D229}$ | $L_{C1399}$ | $R^{D143}$ | $R^{D229}$ |
| $L_{C1238}$ | $R^{D10}$ | $R^{D230}$ | $L_{C1292}$ | $R^{D55}$ | $R^{D230}$ | $L_{C1346}$ | $R^{D37}$ | $R^{D230}$ | $L_{C1400}$ | $R^{D143}$ | $R^{D230}$ |
| $L_{C1239}$ | $R^{D10}$ | $R^{D231}$ | $L_{C1293}$ | $R^{D55}$ | $R^{D231}$ | $L_{C1347}$ | $R^{D37}$ | $R^{D231}$ | $L_{C1401}$ | $R^{D143}$ | $R^{D231}$ |
| $L_{C1240}$ | $R^{D10}$ | $R^{D232}$ | $L_{C1294}$ | $R^{D55}$ | $R^{D232}$ | $L_{C1348}$ | $R^{D37}$ | $R^{D232}$ | $L_{C1402}$ | $R^{D143}$ | $R^{D232}$ |
| $L_{C1241}$ | $R^{D10}$ | $R^{D233}$ | $L_{C1295}$ | $R^{D55}$ | $R^{D233}$ | $L_{C1349}$ | $R^{D37}$ | $R^{D233}$ | $L_{C1403}$ | $R^{D143}$ | $R^{D233}$ |
| $L_{C1242}$ | $R^{D10}$ | $R^{D234}$ | $L_{C1296}$ | $R^{D55}$ | $R^{D234}$ | $L_{C1350}$ | $R^{D37}$ | $R^{D234}$ | $L_{C1404}$ | $R^{D143}$ | $R^{D234}$ |
| $L_{C1243}$ | $R^{D10}$ | $R^{D235}$ | $L_{C1297}$ | $R^{D55}$ | $R^{D235}$ | $L_{C1351}$ | $R^{D37}$ | $R^{D235}$ | $L_{C1405}$ | $R^{D143}$ | $R^{D235}$ |
| $L_{C1244}$ | $R^{D10}$ | $R^{D236}$ | $L_{C1298}$ | $R^{D55}$ | $R^{D236}$ | $L_{C1352}$ | $R^{D37}$ | $R^{D236}$ | $L_{C1406}$ | $R^{D143}$ | $R^{D236}$ |
| $L_{C1245}$ | $R^{D10}$ | $R^{D237}$ | $L_{C1299}$ | $R^{D55}$ | $R^{D237}$ | $L_{C1353}$ | $R^{D37}$ | $R^{D237}$ | $L_{C1407}$ | $R^{D143}$ | $R^{D237}$ |
| $L_{C1246}$ | $R^{D10}$ | $R^{D238}$ | $L_{C1300}$ | $R^{D55}$ | $R^{D238}$ | $L_{C1354}$ | $R^{D37}$ | $R^{D238}$ | $L_{C1408}$ | $R^{D143}$ | $R^{D238}$ |
| $L_{C1247}$ | $R^{D10}$ | $R^{D239}$ | $L_{C1301}$ | $R^{D55}$ | $R^{D239}$ | $L_{C1355}$ | $R^{D37}$ | $R^{D239}$ | $L_{C1409}$ | $R^{D143}$ | $R^{D239}$ |

-continued

| $L_{Cj}$ | $R^{201}$ | $R^{202}$ | $L_{Cj}$ | $R^{201}$ | $R^{202}$ | $L_{Cj}$ | $R^{201}$ | $R^{202}$ | $L_{Cj}$ | $R^{201}$ | $R^{202}$ |
|---|---|---|---|---|---|---|---|---|---|---|---|
| $L_{C1248}$ | $R^{D10}$ | $R^{D240}$ | $L_{C1302}$ | $R^{D55}$ | $R^{D240}$ | $L_{C1356}$ | $R^{D37}$ | $R^{D240}$ | $L_{C1410}$ | $R^{D143}$ | $R^{D240}$ |
| $L_{C1249}$ | $R^{D10}$ | $R^{D241}$ | $L_{C1303}$ | $R^{D55}$ | $R^{D241}$ | $L_{C1357}$ | $R^{D37}$ | $R^{D241}$ | $L_{C1411}$ | $R^{D143}$ | $R^{D241}$ |
| $L_{C1250}$ | $R^{D10}$ | $R^{D242}$ | $L_{C1304}$ | $R^{D55}$ | $R^{D242}$ | $L_{C1358}$ | $R^{D37}$ | $R^{D242}$ | $L_{C1412}$ | $R^{D143}$ | $R^{D242}$ |
| $L_{C1251}$ | $R^{D10}$ | $R^{D243}$ | $L_{C1305}$ | $R^{D55}$ | $R^{D243}$ | $L_{C1359}$ | $R^{D37}$ | $R^{D243}$ | $L_{C1413}$ | $R^{D143}$ | $R^{D243}$ |
| $L_{C1252}$ | $R^{D10}$ | $R^{D244}$ | $L_{C1306}$ | $R^{D55}$ | $R^{D244}$ | $L_{C1360}$ | $R^{D37}$ | $R^{D244}$ | $L_{C1414}$ | $R^{D143}$ | $R^{D244}$ |
| $L_{C1253}$ | $R^{D10}$ | $R^{D245}$ | $L_{C1307}$ | $R^{D55}$ | $R^{D245}$ | $L_{C1361}$ | $R^{D37}$ | $R^{D245}$ | $L_{C1415}$ | $R^{D143}$ | $R^{D245}$ |
| $L_{C1254}$ | $R^{D10}$ | $R^{D246}$ | $L_{C1308}$ | $R^{D55}$ | $R^{D246}$ | $L_{C1362}$ | $R^{D37}$ | $R^{D246}$ | $L_{C1416}$ | $R^{D143}$ | $R^{D246}$ |

wherein $R^{D1}$ to $R^{D246}$ have the following structures:

$R^{D1}$

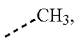

$R^{D2}$

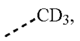

$R^{D3}$

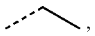

$R^{D4}$

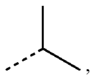

$R^{D5}$

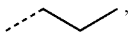

$R^{D6}$

$R^{D7}$

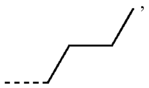

$R^{D8}$

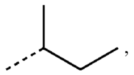

$R^{D9}$

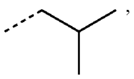

$R^{D10}$

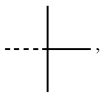

$R^{D11}$

$R^{D12}$

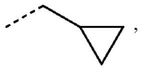

$R^{D13}$

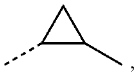

$R^{D14}$

-continued $R^{D15}$

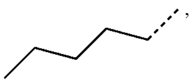

$R^{D16}$

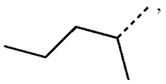

$R^{D17}$

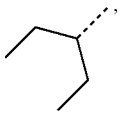

$R^{D18}$

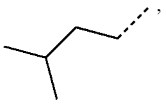

$R^{D19}$

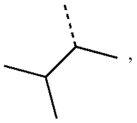

$R^{D20}$

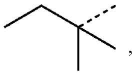

$R^{D21}$

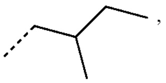

$R^{D22}$

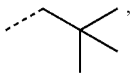

$R^{D23}$

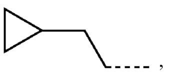

$R^{D24}$

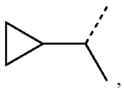

$R^{D25}$

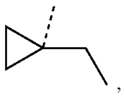

-continued
$R^{D26}$
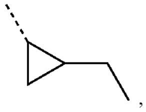,
$R^{D27}$
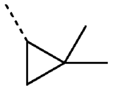,
$R^{D28}$
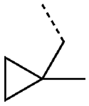,
$R^{D29}$
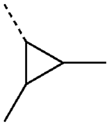,
$R^{D30}$
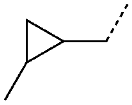,
$R^{D31}$
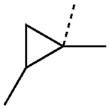,
$R^{D32}$
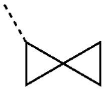,
$R^{D33}$
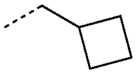,
$R^{D34}$
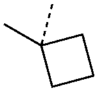,
$R^{D35}$
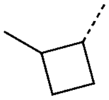,
$R^{D36}$
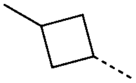,
$R^{D37}$
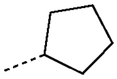,
$R^{D38}$
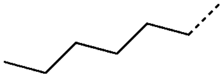
$R^{D39}$
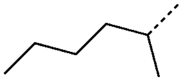
-continued
$R^{D40}$
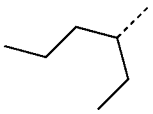,
$R^{D41}$
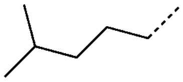,
$R^{D42}$
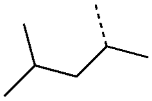,
$R^{D43}$
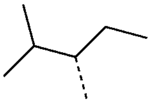,
$R^{D44}$
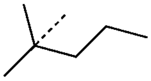,
$R^{D45}$
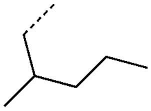,
$R^{D46}$
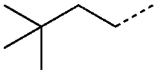,
$R^{D47}$
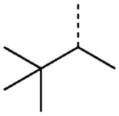,
$R^{D48}$
,
$R^{D49}$
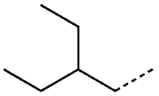,
$R^{D50}$
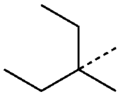,
$R^{D51}$
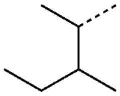,
$R^{D52}$
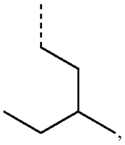, -continued
$R^{D53}$
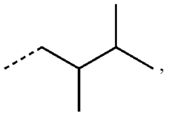
$R^{D54}$
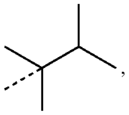
$R^{D55}$
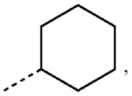
$R^{D56}$
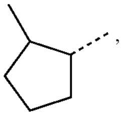
$R^{D57}$
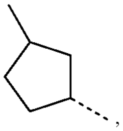
$R^{D58}$
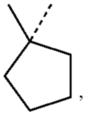
$R^{D59}$
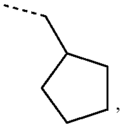
$R^{D60}$
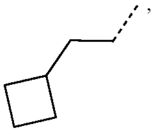
$R^{D61}$
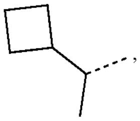
$R^{D62}$
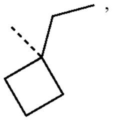
$R^{D63}$
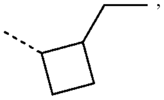
-continued
$R^{D64}$
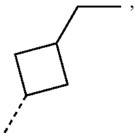
$R^{D65}$
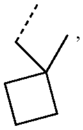
$R^{D66}$
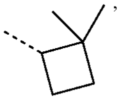
$R^{D67}$
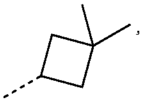
$R^{D68}$
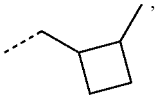
$R^{D69}$
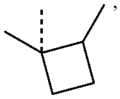
$R^{D70}$
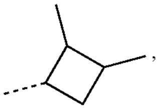
$R^{D71}$
$R^{D72}$
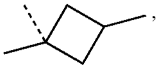
$R^{D73}$
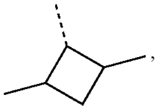
$R^{D74}$
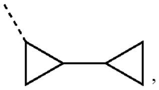
$R^{D75}$
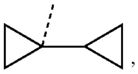
$R^{D76}$
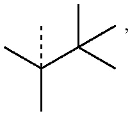

-continued
$R^{D77}$
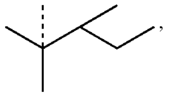
,
$R^{D78}$
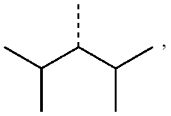
,
$R^{D79}$
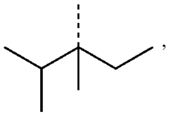
,
$R^{D80}$
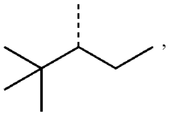
,
$R^{D81}$
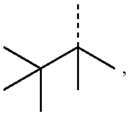
,
$R^{D82}$
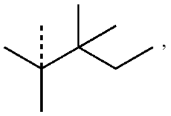
,
$R^{D83}$
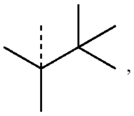
,
$R^{D84}$
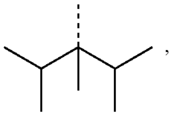
,
$R^{D85}$
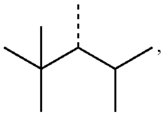
,
$R^{D86}$
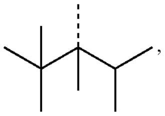
,
$R^{D87}$
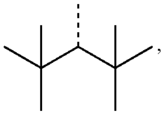
,
$R^{D88}$
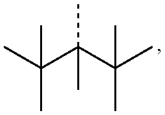
,
-continued
RD89
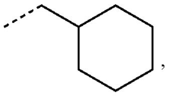
,
$R^{D90}$
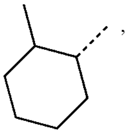
,
$R^{D91}$
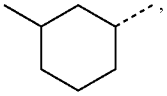
,
$R^{D92}$
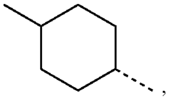
,
$R^{D93}$
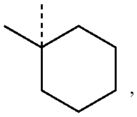
,
$R^{D94}$
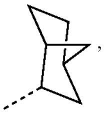
,
$R^{D95}$
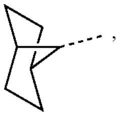
,
$R^{D96}$
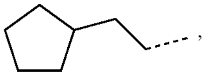
,
$R^{D97}$
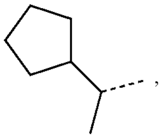
,
$R^{D98}$
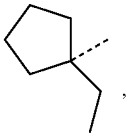
,
$R^{D99}$
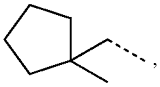
,
$R^{D100}$
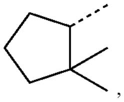
, -continued
$R^{D101}$
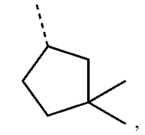
$R^{D102}$
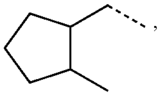
$R^{D103}$
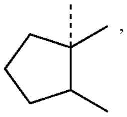
$R^{D104}$
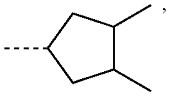
$R^{D105}$
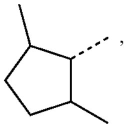
$R^{D106}$
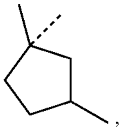
$R^{D107}$
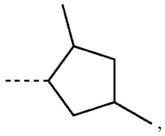
$R^{D108}$
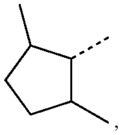
$R^{D109}$
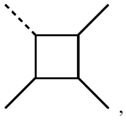
$R^{D110}$
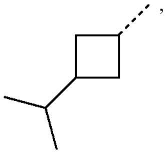
$R^{D111}$
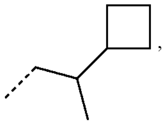
-continued
$R^{D112}$
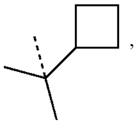
$R^{D113}$
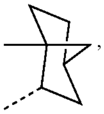
$R^{D114}$
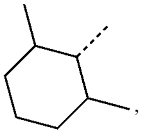
$R^{D115}$
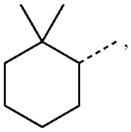
$R^{D116}$
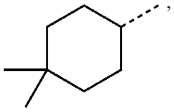
$R^{D117}$
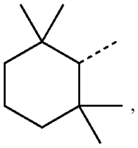
$R^{D118}$
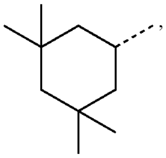
$R^{D119}$
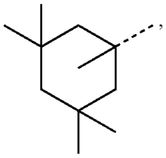
$R^{D120}$
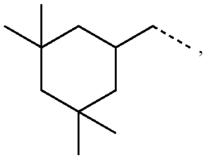
$R^{D121}$
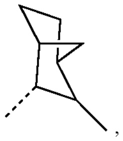

-continued
$R^{D122}$
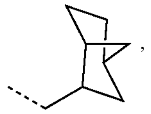
$R^{D123}$
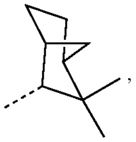
$R^{D124}$
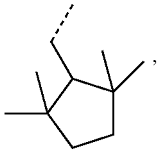
$R^{D125}$
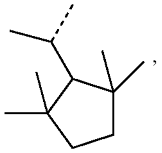
$R^{D126}$
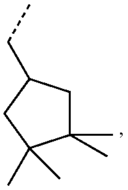
$R^{D127}$
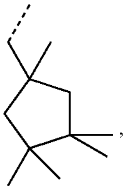
$R^{D128}$
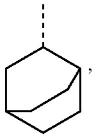
$R^{D129}$
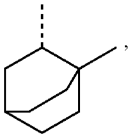
$R^{D130}$
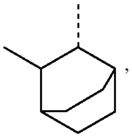
-continued
$R^{D131}$
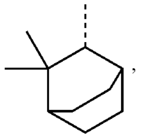
$R^{D132}$
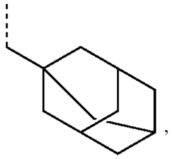
$R^{D133}$
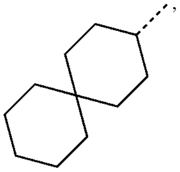
$R^{D134}$
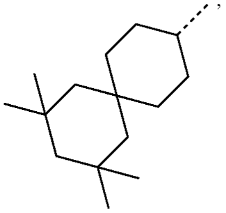
$R^{D135}$
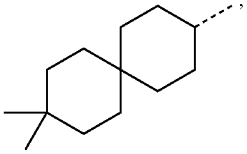
$R^{D136}$
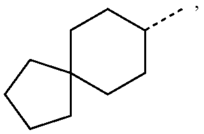
$R^{D137}$
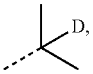
$R^{D138}$
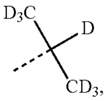
$R^{D139}$
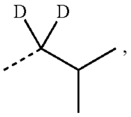
$R^{D140}$
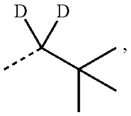

-continued
$R^{D141}$
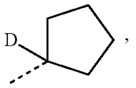
$R^{D142}$
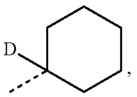
$R^{D143}$
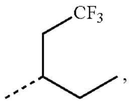
$R^{D144}$
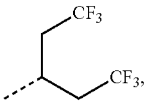
$R^{D145}$
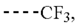
$R^{D146}$
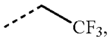
$R^{D147}$
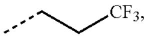
$R^{D148}$
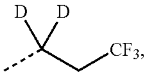
$R^{D149}$
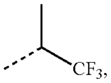
$R^{D150}$
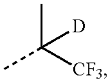
$R^{D151}$
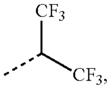
$R^{D152}$
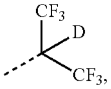
$R^{D153}$
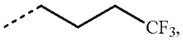
$R^{D154}$
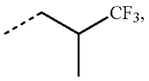
$R^{D155}$
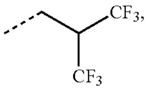
$R^{D156}$
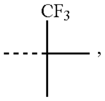
-continued
$R^{D157}$
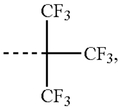
$R^{D158}$
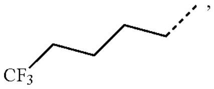
$R^{D159}$
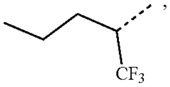
$R^{D160}$
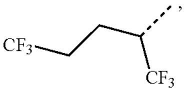
$R^{D161}$
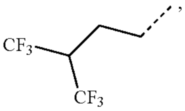
$R^{D162}$
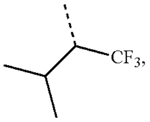
$R^{D163}$
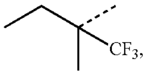
$R^{D164}$
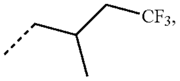
$R^{D165}$
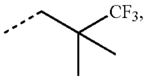
$R^{D166}$
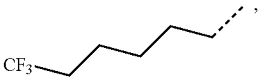
$R^{D167}$
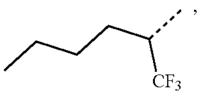
$R^{D168}$
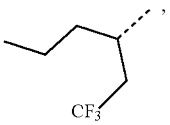
$R^{D169}$
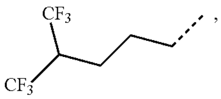

-continued
$R^{D170}$
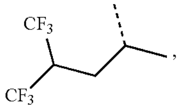
$R^{D171}$
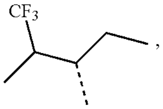
$R^{D172}$
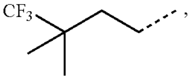
$R^{D173}$
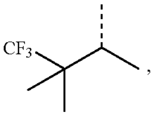
$R^{D174}$
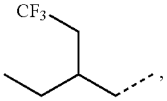
$R^{D175}$
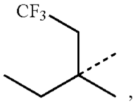
$R^{D176}$
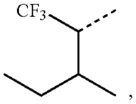
$R^{D177}$
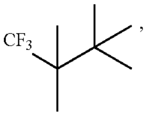
$R^{D178}$
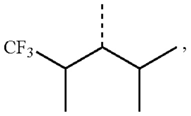
$R^{D179}$
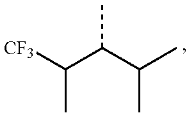
$R^{D180}$
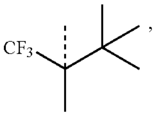
$R^{D181}$
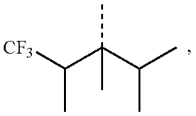
-continued
$R^{D182}$
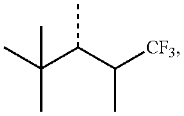
$R^{D183}$
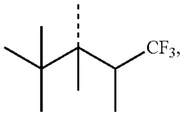
$R^{D184}$
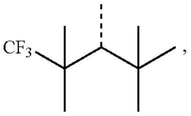
$R^{D185}$
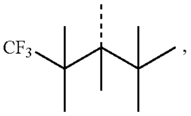
$R^{D186}$
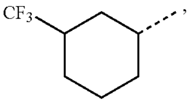
$R^{D187}$
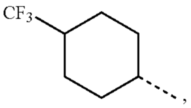
$R^{D188}$
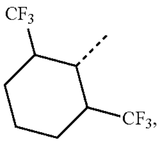
$R^{D189}$
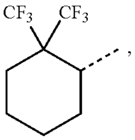
$R^{D190}$
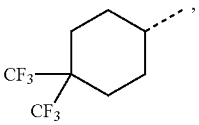
$R^{D191}$
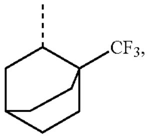
$R^{D192}$
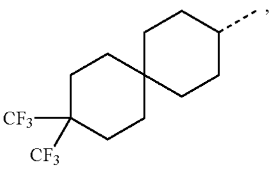

-continued
$R^{D193}$
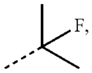,
$R^{D194}$
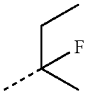,
$R^{D195}$
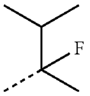,
$R^{D196}$
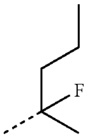,
$R^{D197}$
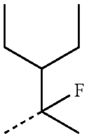,
$R^{D198}$
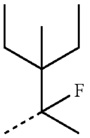,
$R^{D199}$
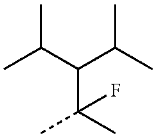,
$R^{D200}$
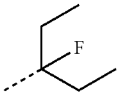,
$R^{D201}$
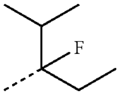,
$R^{D202}$
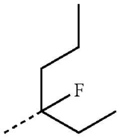,
$R^{D203}$
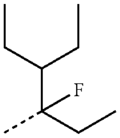,
-continued
$R^{D204}$
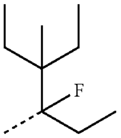,
$R^{D205}$
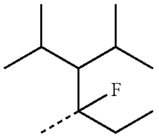,
$R^{D206}$
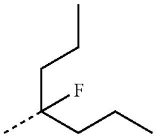,
$R^{D207}$
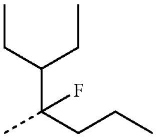,
$R^{D208}$
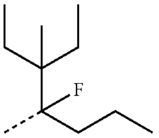,
$R^{D209}$
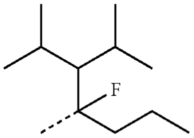,
$R^{D210}$
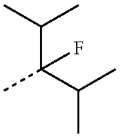,
$R^{D211}$
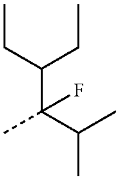,
$R^{D212}$
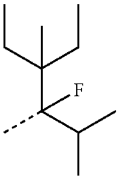, -continued
$R^{D213}$
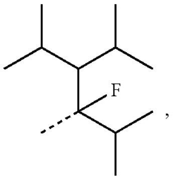
$R^{D214}$
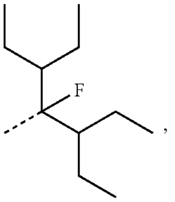
$R^{D215}$
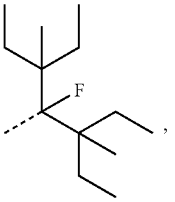
$R^{D216}$
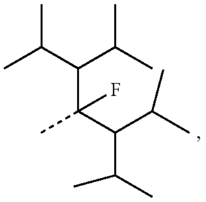
$R^{D217}$
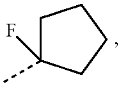
$R^{D218}$
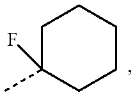
$R^{D219}$
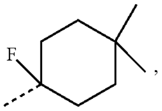
$R^{D220}$
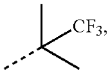
$R^{D221}$
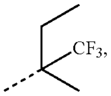
$R^{D222}$
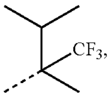
-continued
$R^{D223}$
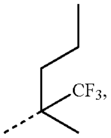
$R^{D224}$
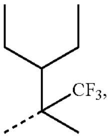
$R^{D225}$
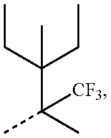
$R^{D226}$
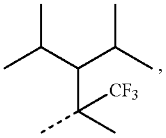
$R^{D227}$
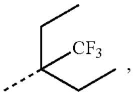
$R^{D228}$
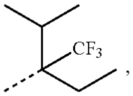
$R^{D229}$
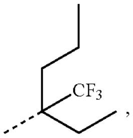
$R^{D230}$
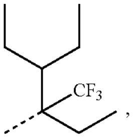
$R^{D231}$
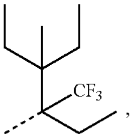
$R^{D232}$
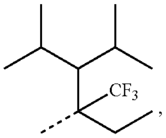
$R^{D233}$
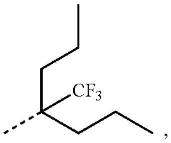

-continued $R^{D234}$

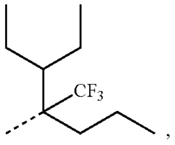

$R^{D235}$

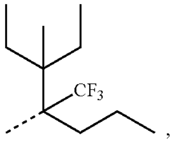

$R^{D236}$

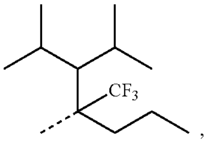

$R^{D237}$

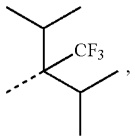

$R^{D238}$

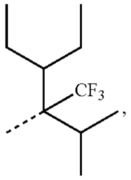

$R^{D239}$

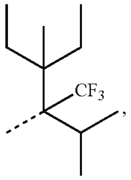

$R^{D240}$

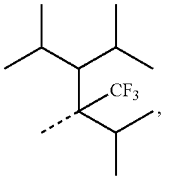

$R^{D241}$

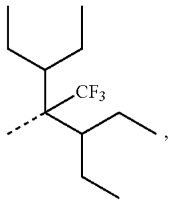

-continued $R^{D242}$

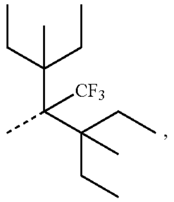

$R^{D243}$

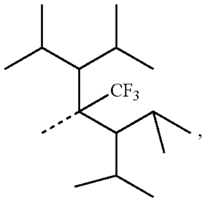

$R^{D244}$

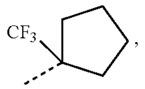

$R^{D245}$

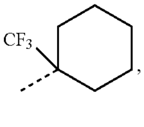

, and $R^{D246}$

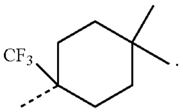

In some embodiments, the compound can have the formula $Ir(L_A)(L_{Bk})_2$, $Ir(L_A)(L_{BBn})_2$, $Ir(L_A)_2(L_{Bk})$, or $Ir(L_A)_2(L_{BBn})$, wherein the compound consists of only one of the following structures for the $L_{Bk}$ or $L_{BBn}$ ligand: $L_{B1}$, $L_{B2}$, $L_{B18}$, $L_{B28}$, $L_{B38}$, $L_{B108}$, $L_{B118}$, $L_{B122}$, $L_{B124}$, $L_{B126}$, $L_{B128}$, $L_{B130}$, $L_{B132}$, $L_{B134}$, $L_{B136}$, $L_{B138}$, $L_{B140}$, $L_{B142}$, $L_{B144}$, $L_{B156}$, $L_{B158}$, $L_{B160}$, $L_{B162}$, $L_{B164}$, $L_{B168}$, $L_{B172}$, $L_{B175}$, $L_{B204}$, $L_{B206}$, $L_{B214}$, $L_{B216}$, $L_{B218}$, $L_{B220}$, $L_{B222}$, $L_{B231}$, $L_{B233}$, $L_{B235}$, $L_{B237}$, $L_{B240}$, $L_{B242}$, $L_{B244}$, $L_{B246}$, $L_{B248}$, $L_{B250}$, $L_{B252}$, $L_{B254}$, $L_{B256}$, $L_{B258}$, $L_{B260}$, $L_{B262}$, $L_{B264}$, $L_{B265}$, $L_{B266}$, $L_{B267}$, $L_{B268}$, $L_{B269}$, and $L_{B270}$.

In some embodiments, the compound can have the formula $Ir(L_A)(L_{Bk})_2$, $Ir(L_A)(L_{BBn})_2$, $Ir(L_A)_2(L_{Bk})$, or $Ir(L_A)_2(L_{BBn})$, wherein the compound consists of only one of the following structures for the $L_{Bk}$ or $L_{BBn}$ ligand: $L_{B1}$, $L_{B2}$, $L_{B18}$, $L_{B28}$, $L_{B38}$, $L_{B108}$, $L_{B118}$, $L_{B122}$, $L_{B126}$, $L_{B128}$, $L_{B132}$, $L_{B136}$, $L_{B138}$, $L_{B142}$, $L_{B156}$, $L_{B162}$, $L_{B204}$, $L_{B206}$, $L_{B214}$, $L_{B216}$, $L_{B218}$, $L_{B220}$, $L_{B231}$, $L_{B233}$, $L_{B237}$, $L_{B264}$, $L_{B265}$, $L_{B266}$, $L_{B267}$, $L_{B268}$, $L_{B269}$, and $L_{B270}$.

In some embodiments, the compound can have the formula $Ir(L_A)_2(L_{Cj-I})$, or $Ir(L_A)_2(L_{Cj-II})$, wherein for ligands $L_{Cj-I}$ and $L_{Cj-II}$, the compound comprises only those $L_{Cj-I}$ and $L_{Cj-II}$ ligands whose corresponding $R^{201}$ and $R^{202}$ are defined to be one the following structures: $R^{D1}$, $R^{D3}$, $R^{D4}$, $R_{D5}$, $R^{D9}$, $R^{D10}$, $R^{D17}$, $R^{D18}$, $R^{D20}$, $R^{D22}$, $R^{D37}$, $R^{D40}$, $R^{D41}$, $R^{D42}$, $R^{D43}$, $R^{D48}$, $R^{D49}$, $R^{D50}$, $R^{D54}$, $R^{D55}$, $R^{D58}$, $R^{D59}$, $R^{D78}$, $R^{D79}$, $R^{D81}$, $R^{D87}$, $R^{D88}$, $R^{D89}$, $R^{D93}$, $R^{D116}$, $R^{D117}$, $R^{D118}$, $R^{D119}$, $R^{D120}$, $R^{D133}$, $R^{D134}$, $R^{D135}$, $R^{D136}$, $R^{D143}$, $R^{D144}$, $R^{D145}$, $R^{D146}$, $R^{D147}$, $R^{D149}$, $R^{D151}$, $R^{D154}$, $R^{D155}$, $R^{D161}$, $R^{D175}$, $R^{D190}$, $R^{D193}$, $R^{D200}$, $R^{D201}$, $R^{D206}$, $R^{D210}$, $R^{D214}$, $R^{D215}$, $R^{D216}$, $R^{D218}$, $R^{D219}$, $R^{D220}$, $R^{D227}$, $R_{D237}$, $R^{D241}$, $R^{D242}$, $R^{D245}$, and $R^{D246}$.

In some embodiments, the compound can have the formula $Ir(L_A)_2(L_{Cj-I})$, or $Ir(L_A)_2(L_{Cj-II})$, wherein for ligands $L_{Cj-I}$ and $L_{Cj-II}$, the compound comprises only those $L_{Cj-I}$ and $L_{Cj-II}$ ligands whose corresponding $R^{201}$ and $R^{202}$ are defined to be one the following structures:

$R^{D1}$, $R^{D3}$, $R^{D4}$, $R^{D5}$, $R^{D9}$, $R^{D10}$, $R^{D17}$, $R^{D22}$, $R^{D43}$, $R^{D50}$, $R^{D78}$, $R^{D116}$, $R^{D118}$, $R^{D133}$, $R^{D134}$, $R^{D135}$, $R^{D136}$, $R^{D143}$, $R^{D144}$, $R^{D145}$, $R^{D146}$, $R^{D149}$, $R^{D151}$, $R^{D154}$, $R^{D155}$, $R^{D190}$, $R^{D193}$, $R^{D200}$, $R^{D201}$, $R^{D206}$, $R^{D210}$, $R^{D214}$, $R^{D215}$, $R^{D216}$, $R^{D218}$, $R^{D219}$, $R^{D220}$, $R^{D227}$, $R^{D237}$, $R^{D241}$, $R^{D242}$, $R^{D245}$, and $R^{D246}$.

In some embodiments, the compound can have the formula $Ir(L_A)_2(L_{Cj-I})$, and the compound consists of only one of the following structures for the $L_{Cj-I}$ ligand:

$L_{C1-I}$

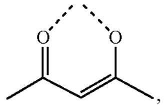, $L_{C4-I}$

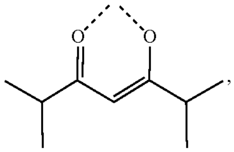, $L_{C9-I}$

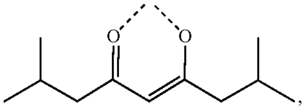, $L_{C10-I}$

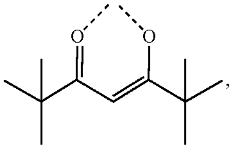, $L_{C17-I}$

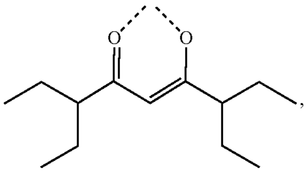, $L_{C55-I}$

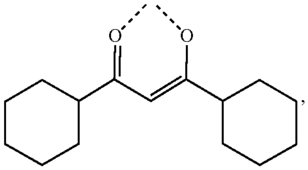, $L_{C116-I}$

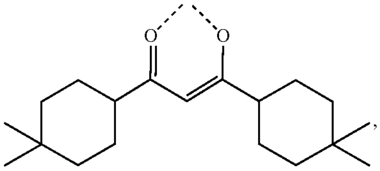,

-continued $L_{C50-I}$

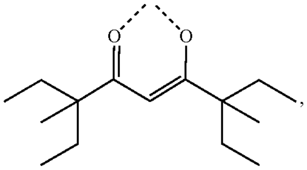, $L_{C190-I}$

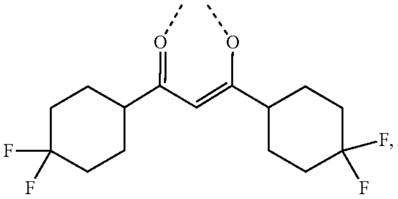

$L_{C144-I}$

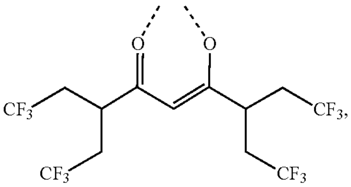

$L_{C145-I}$

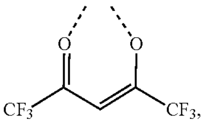

$L_{C143-I}$

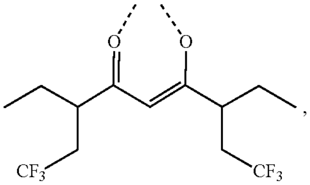, $L_{C232-I}$

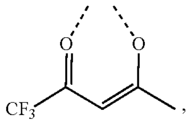, $L_{C279-I}$

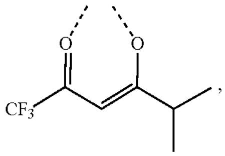, $L_{C325-I}$

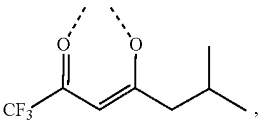, $L_{C414-I}$

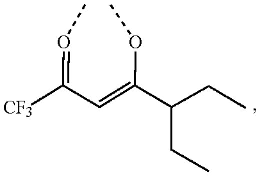, $L_{C457\text{-}I}$
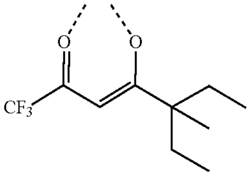
,
$L_{C230\text{-}I}$
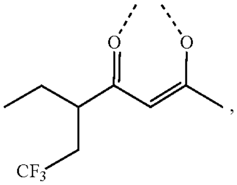
,
$L_{C277\text{-}I}$
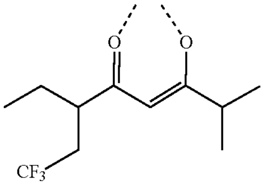
,
$L_{C412\text{-}I}$
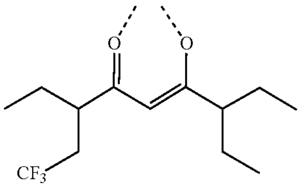
,
$L_{C231\text{-}I}$
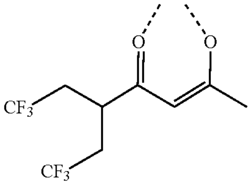
,
$L_{C278\text{-}I}$
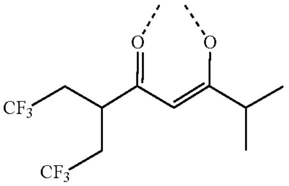
,
$L_{C413\text{-}I}$
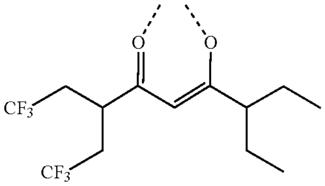
,
$L_{C985\text{-}I}$
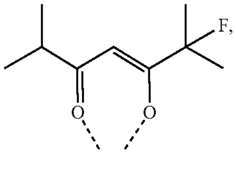
$L_{C1093\text{-}I}$
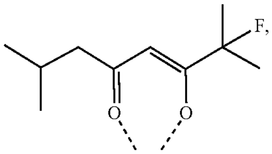
$L_{C823\text{-}I}$
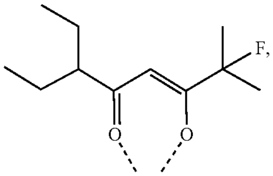
$L_{C1039\text{-}I}$
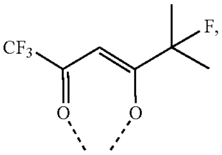
$L_{C1147\text{-}I}$
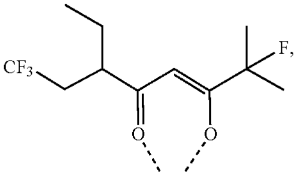
$L_{C1012\text{-}I}$
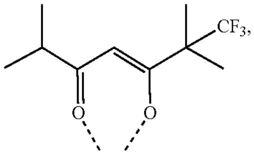
$L_{C1120\text{-}I}$
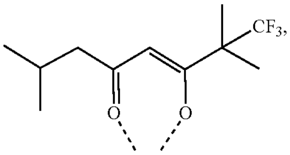
$L_{C850\text{-}I}$
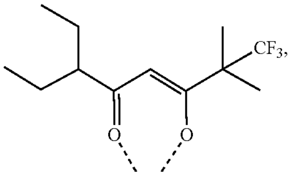
$L_{C1066\text{-}I}$
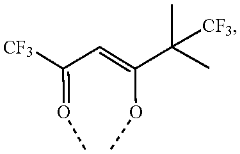
$L_{C1174\text{-}I}$
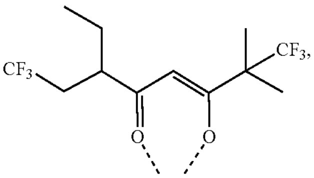

-continued
$L_{C769-I}$
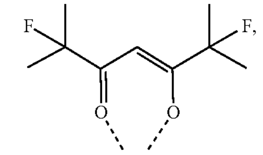
$L_{C1201-I}$
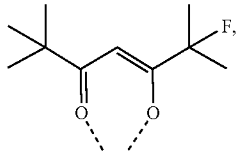
$L_{C796-I}$
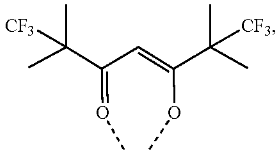
$L_{C1228-I}$
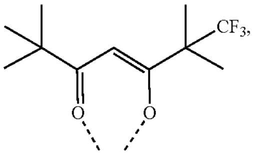
-continued
$L_{C803-I}$
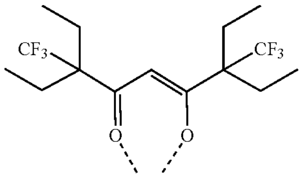
, and
$L_{C776-I}$
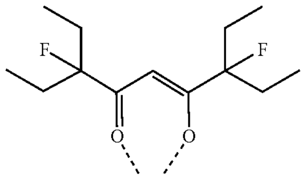
.
In some embodiments, the compound can be selected from the group consisting of:
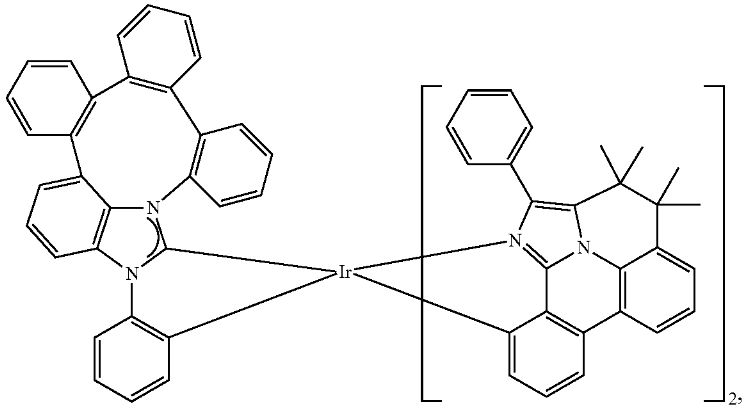
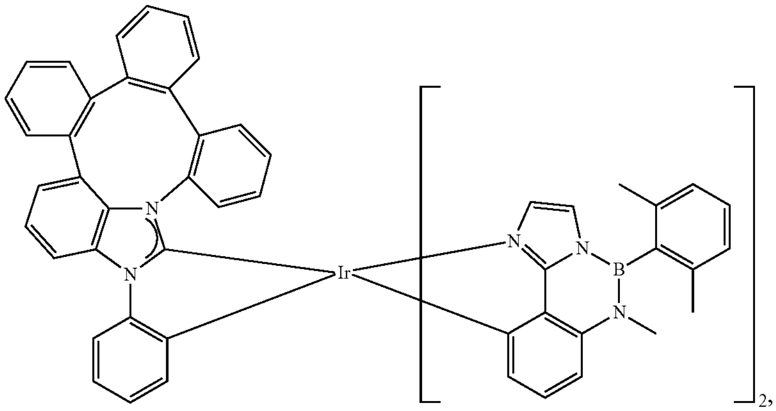

-continued
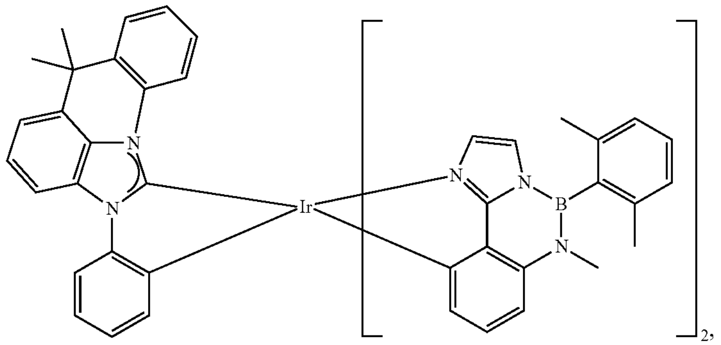
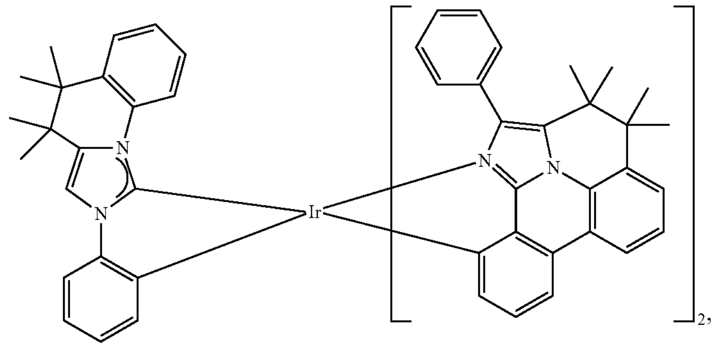
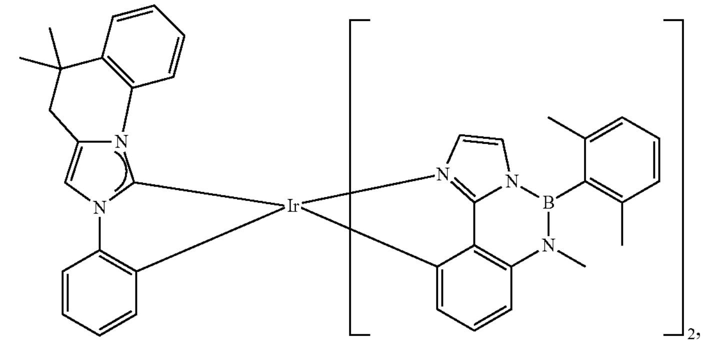
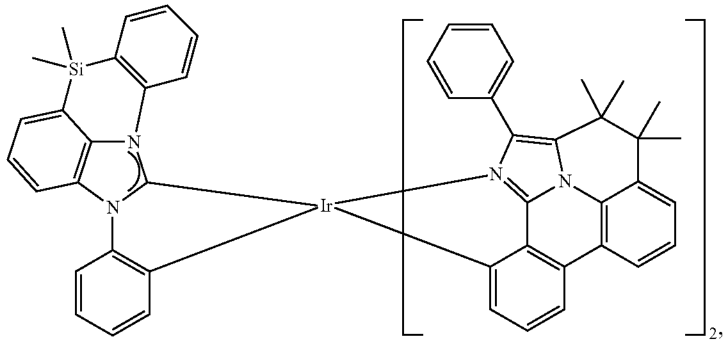

-continued
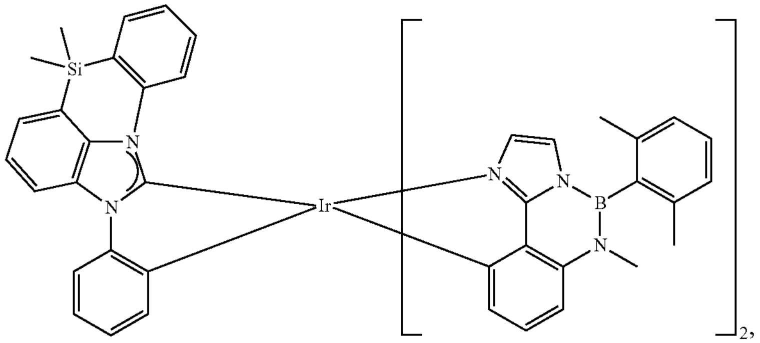
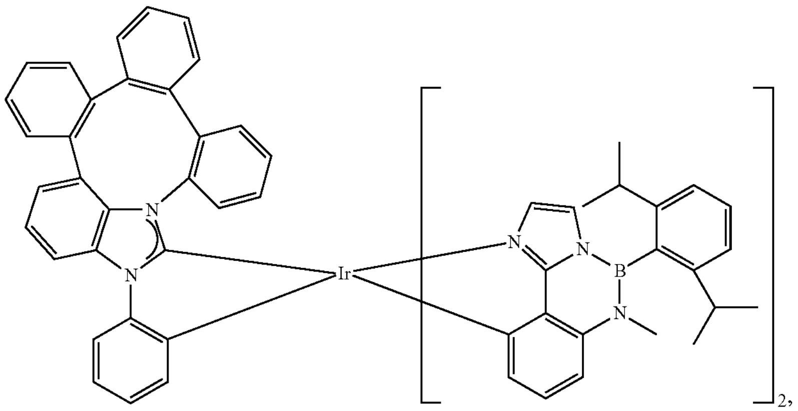
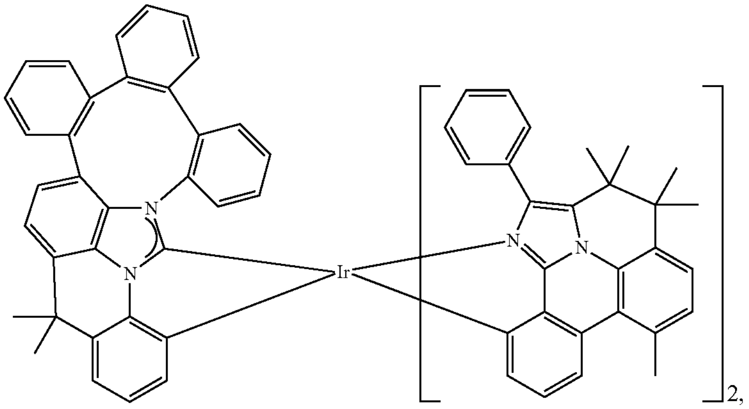
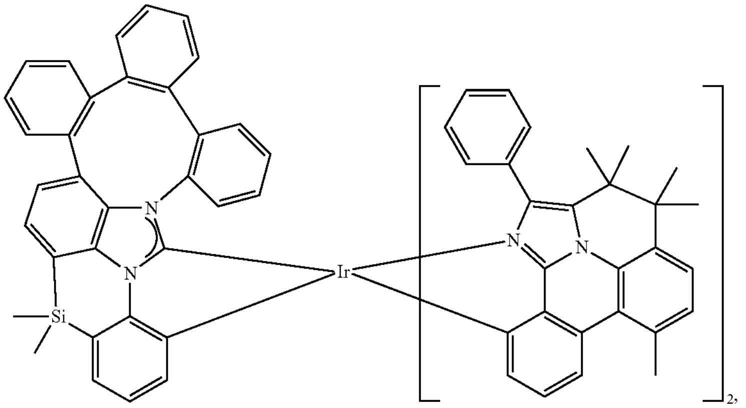

-continued
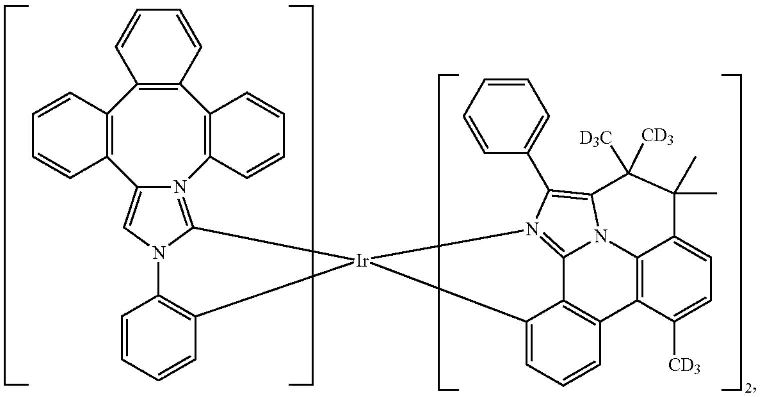
,
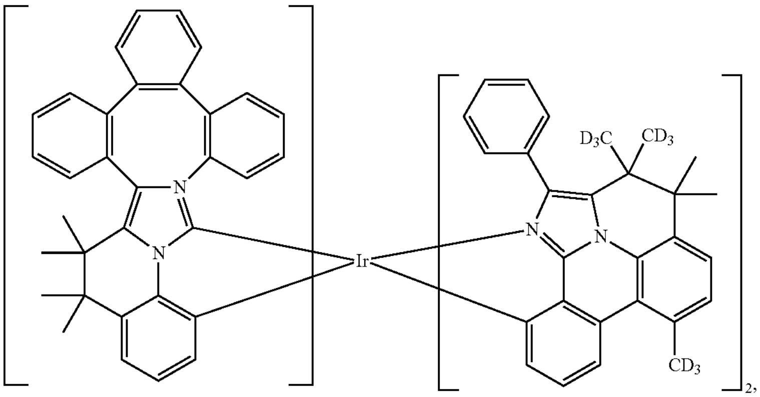
,
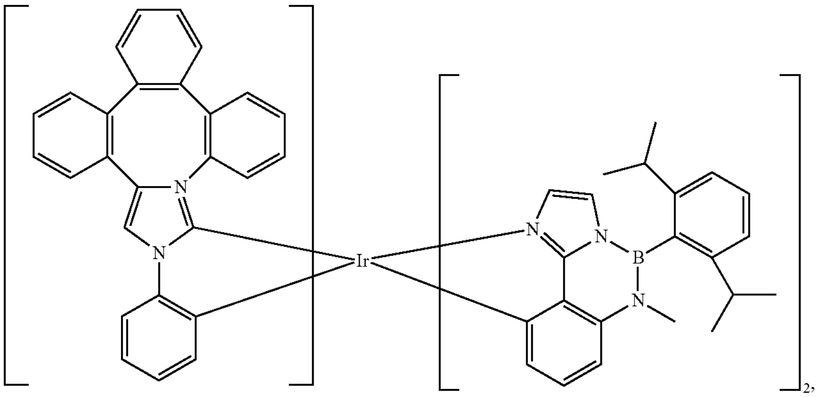
, and
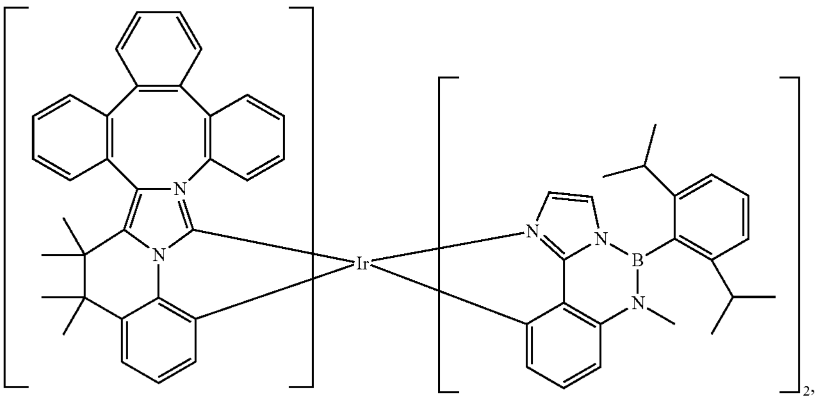
,

In some embodiments, the compound can have a structure of

Formula III

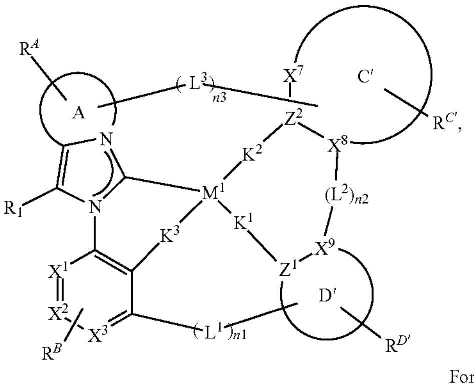

, or

Formula IV

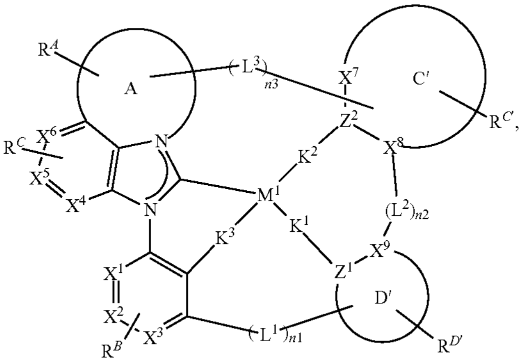

, wherein:

$M^1$ is Pd or Pt;

moieties C' and D' are each independently a monocyclic or polycyclic ring structure comprising 5-membered and/or 6-membered carbocyclic or heterocyclic rings;

$Z^1$ and $Z^2$ are each independently C or N;

$K^1$, $K^2$, and $K^3$ are each independently selected from the group consisting of a direct bond, O, and S, wherein at least two of $K^1$, $K^2$, or $K^3$ are direct bonds;

$L^1$, $L^2$, and $L^3$ are each independently selected from the group consisting of a direct bond, BR, BRR', NR, PR, O, S, Se, C═O, S═O, $SO_2$, C═CRR', CRR', C═Se, C═CRR', C═NR, P(O)R', SiRR', GeRR', alkyl, cycloalkyl, and combinations thereof, wherein at least one of $L^1$ and $L^2$ is present;

n1, n2, and n3 each are 0 or 1 with n1+n2+n3=2 or 3;

$X^7$-$X^9$ are each independently C or N;

$R^{C'}$ and $R^{D'}$ each independently represents zero, mono, or up to the maximum allowed number of substitutions to its associated ring;

each of $R^{C'}$, and $R^{D'}$ is independently a hydrogen or a substituent selected from the group consisting of deuterium, fluorine, alkyl, cycloalkyl, heteroalkyl, alkoxy, aryloxy, amino, silyl, boryl, alkenyl, cycloalkenyl, heteroalkenyl, aryl, heteroaryl, nitrile, isonitrile, sulfanyl, and combinations thereof;

any two $R^A$, $R^B$, $R^{C'}$, $R^{D'}$, or R' can be joined or fused together to form a ring where chemically feasible; and $X^1$-$X^6$, $R^A$, $R^B$ and ring A are all the same as previously defined.

In some embodiments, moiety C' and moiety D' can be both 6-membered aromatic rings. In some embodiments, moiety C' can be a 5-membered or 6-membered heteroaromatic ring.

In some embodiments, $Z^2$ is N and $Z^1$ is C. In some embodiments, $Z^2$ can be C and $Z^1$ can be N.

In some embodiments, $L^1$ can be O or CR'R". In some embodiments, $L^2$ can be a direct bond. In some embodiments, $L^2$ can be NR'.

In some embodiments, each $K^1$, $K^2$, and $K^3$ can be a direct bond. In some embodiments, one of $K^1$, $K^2$, or $K^3$ can be O. In some embodiments, one of $K^1$, or $K^2$ can be O. In some embodiments, $K^3$ can be O.

In some embodiments, $X^7$-$X^9$ can be all C.

In some embodiments, the compound can have a structure of

Formula V

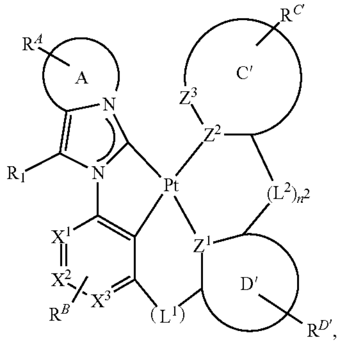

, or

Formula VI

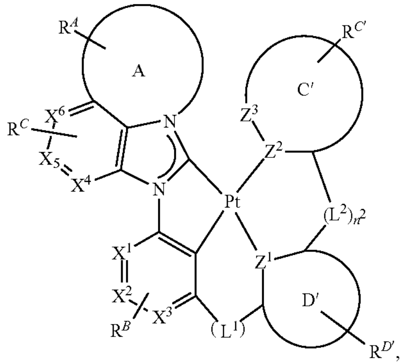

, wherein $Z^3$ is C or N; the remaining variables are the same as defined for Formula I and Formula II; and any two $R^A$, $R^B$, $R^{C'}$, $R^{D'}$, or $R^1$ can be joined or fused together to form a ring.

In some embodiments of Formula V or Formula VI, each of $R_1$, $R^A$ and $R^B$ can be independently a hydrogen or a substituent selected from the group consisting of deuterium, fluorine, alkyl, cycloalkyl, heteroalkyl, alkoxy, aryloxy, amino, silyl, boryl, alkenyl, cycloalkenyl, heteroalkenyl, aryl, heteroaryl, nitrile, isonitrile, sulfanyl, and combinations thereof.

In some embodiments, each $X^1$-$X^3$ can be C. In some embodiments, each $X^4$-$X^6$ can be C. In some embodiments, each $X^1$-$X^6$ can be C.

In some embodiments, two adjacent $R^A$ substituents can be joined to form a fused ring to ring A. In some embodiments, two additional adjacent $R^A$ substituents can be joined to form an additional fused ring to ring A when ring A is a 7-membered, 8-membered, 9-membered, or 10-membered ring. In some embodiments, a total of 6 adjacent $R^A$ substituents can be joined to form three separate rings all fused to ring A. In some embodiments, all the fused rings can be 5-membered or 6-membered aromatic rings. In some embodiments, the fused rings can be each independently benzene, pyridine, pyrimidine, pyridazine, pyrazine, imidazole, pyrazole, pyrrole, oxazole, furan, thiophene, or thiazole. In some embodiments, all the fused rings can be each benzene.

In some embodiments, $R_1$ and one $R^B$ substituent of Formula V can be joined to form a ring. In some embodiments, $R_1$ and one $R^A$ substituent of Formula V can be joined to form a ring. In some embodiments, one $R^{C'}$ substituent and one $R^B$ substituent of Formula VI can be joined to form a ring. In some embodiments, one $R_{C'}$ substituent and one $R^A$ substituent of Formula VI can be joined to form a ring. In some embodiments, two adjacent $R^B$ substituents can be joined to form a fused ring. In some embodiments, two adjacent $R^{C'}$ substituents can be joined to form a fused ring.

In some embodiments, moiety C' and moiety D' can be each independently benzene, pyridine, pyrimidine, pyridazine, pyrazine, imidazole, pyrazole, pyrrole, oxazole, furan, thiophene, or thiazole.

In some embodiments, the compound can have a structure of

Formula V

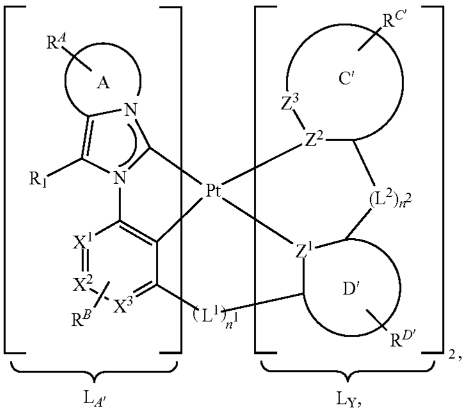

or

Formula VI

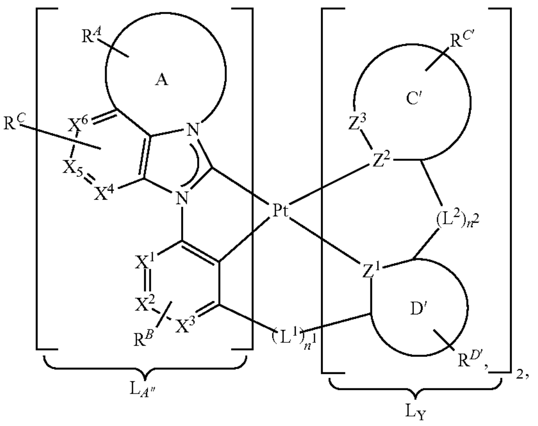

wherein $L_{A'}$ is selected from

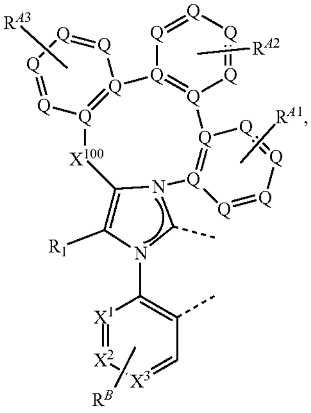

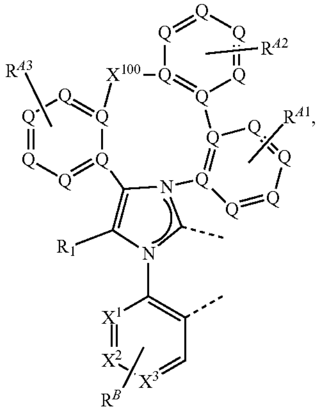

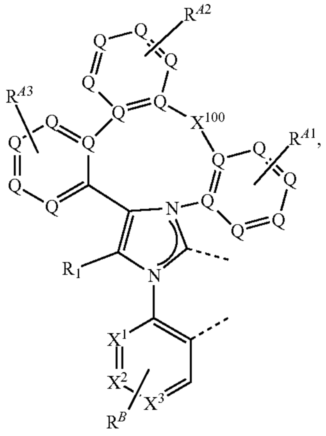

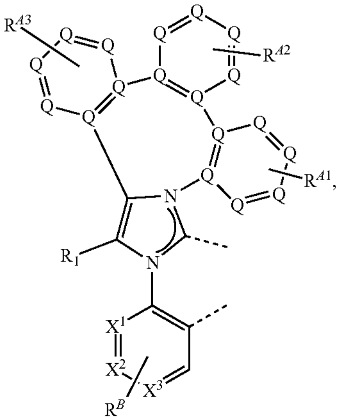

-continued
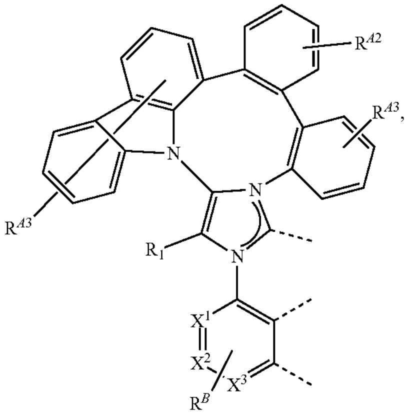
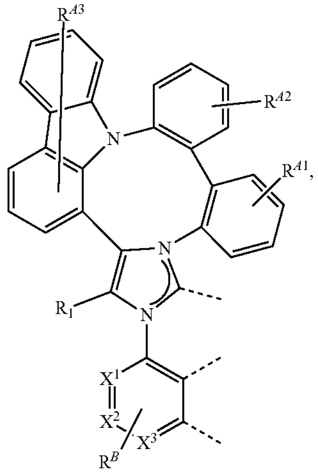
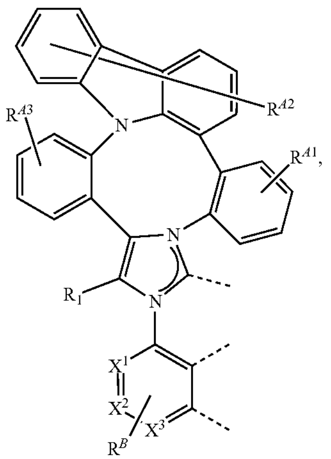
-continued
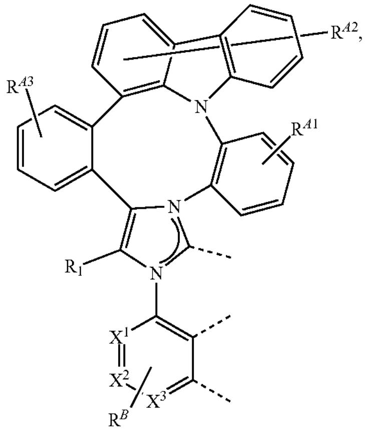
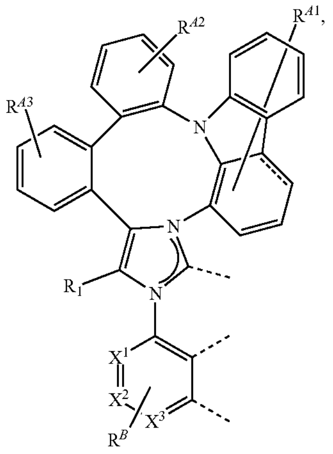
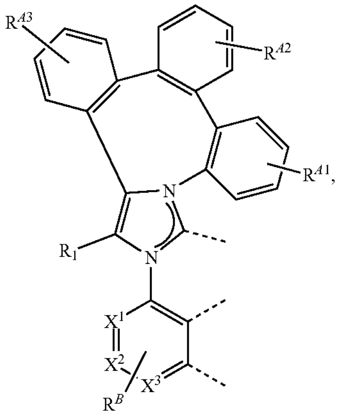
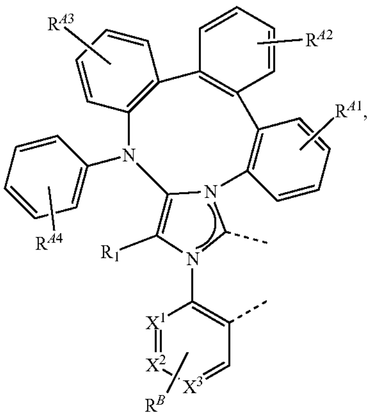

-continued
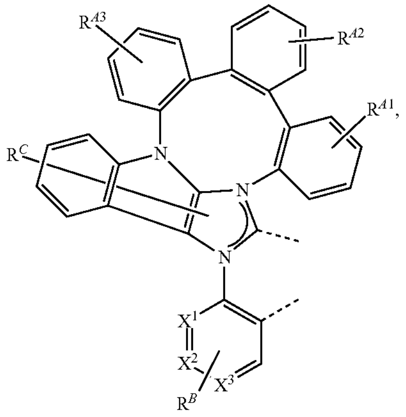
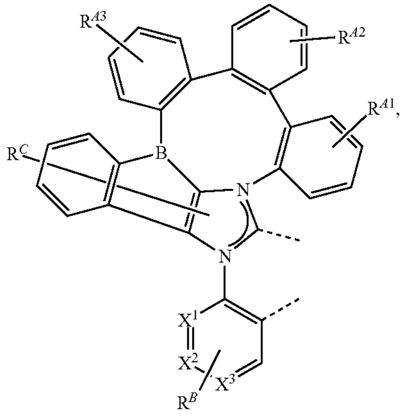
and
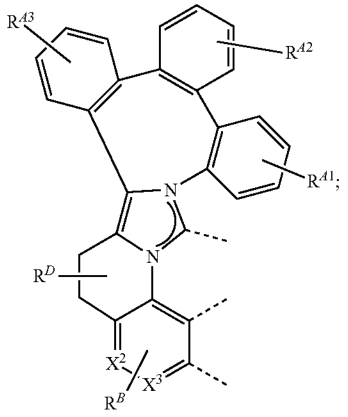
$L_A$" is selected from
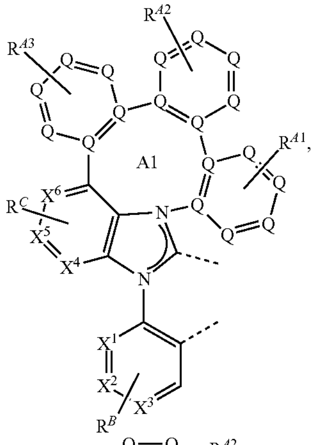
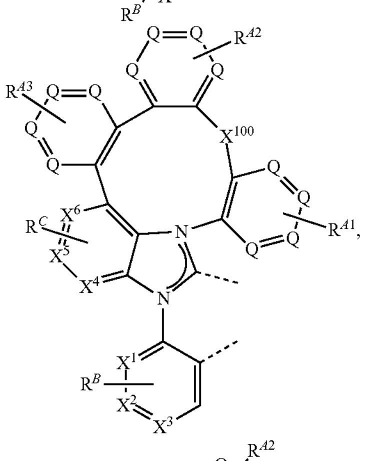
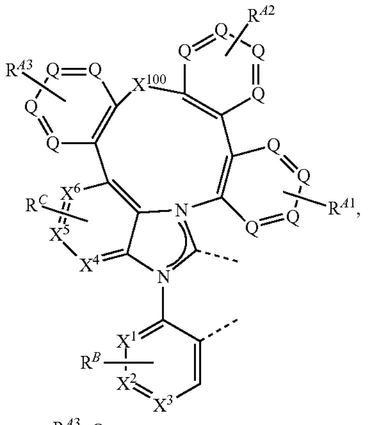
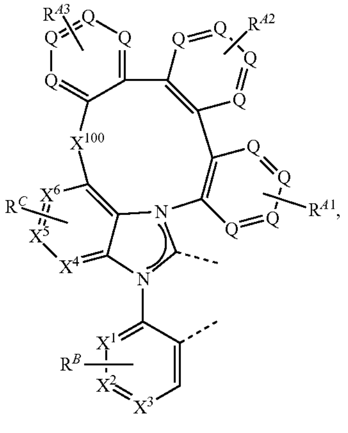

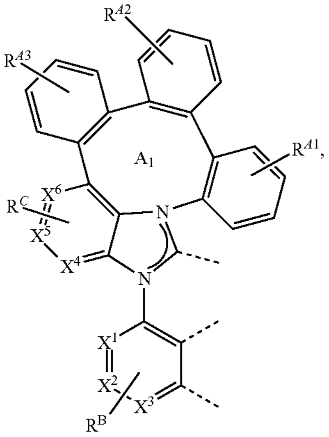
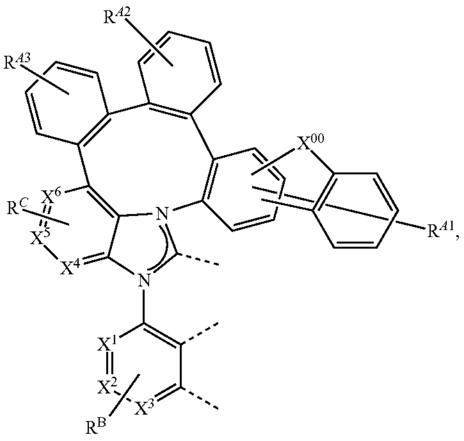
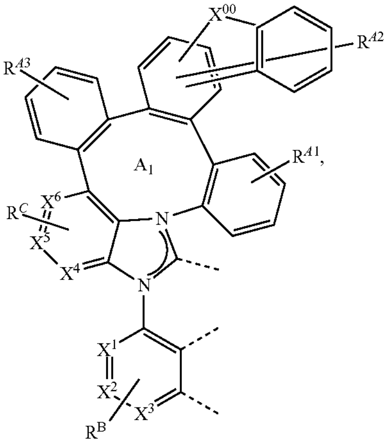
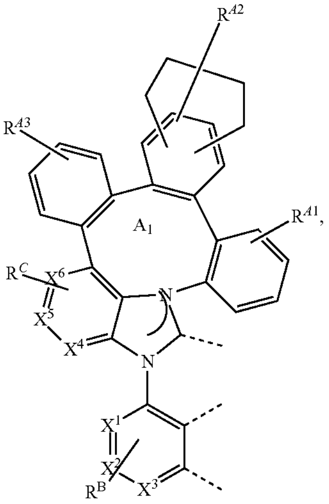
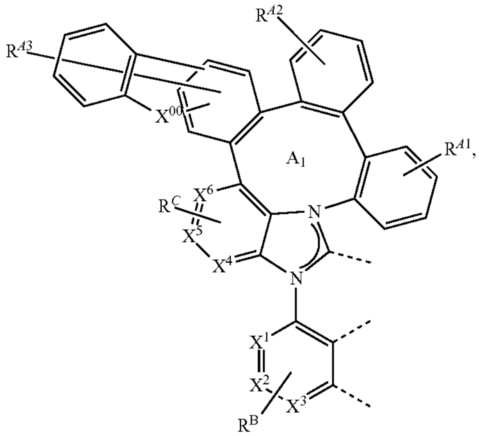
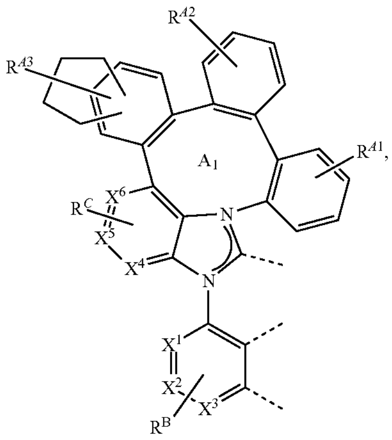

-continued
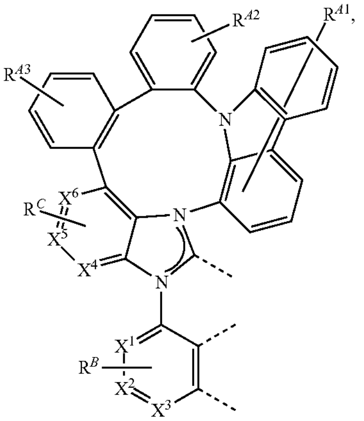
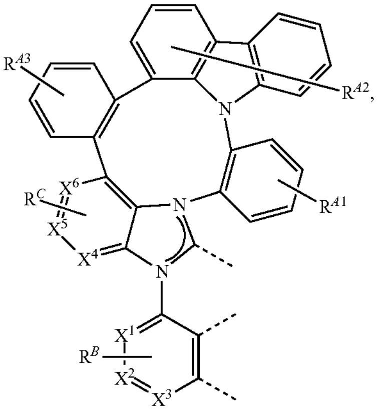
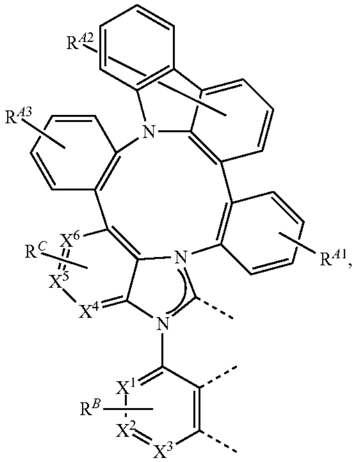
-continued
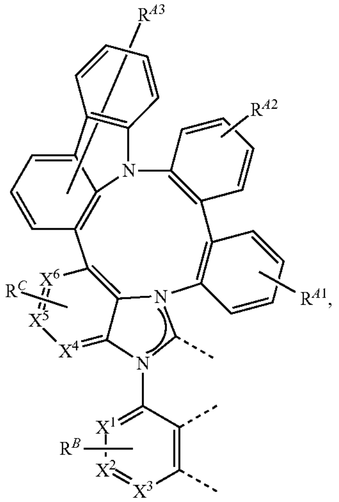
and
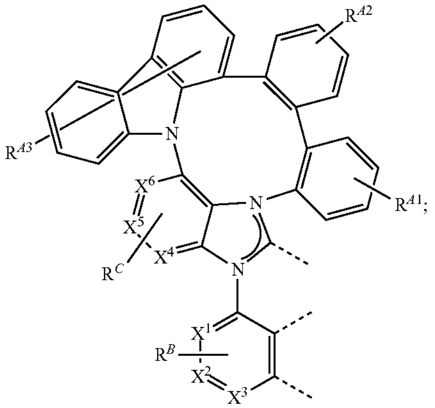
wherein $L_y$ is selected from the group consisting of the structures shown below:
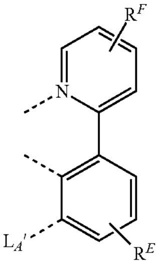
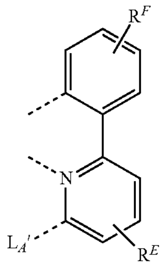
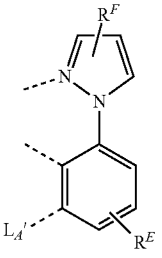
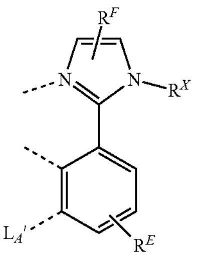
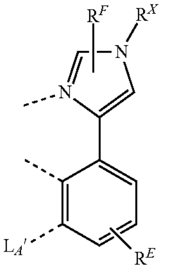
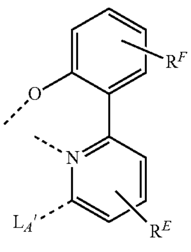

-continued
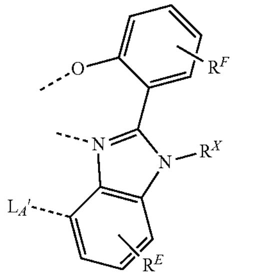
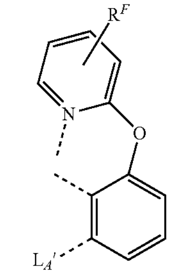
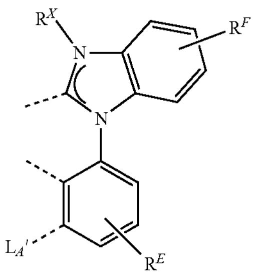
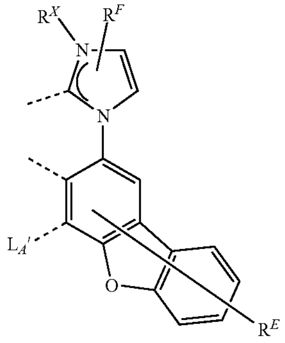
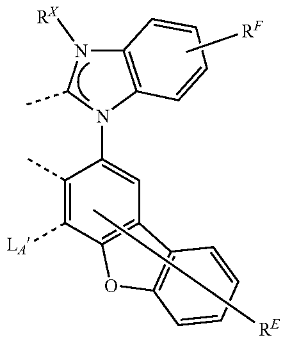
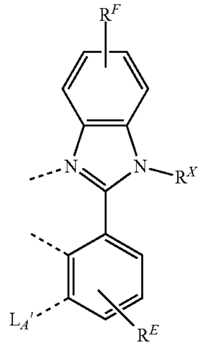
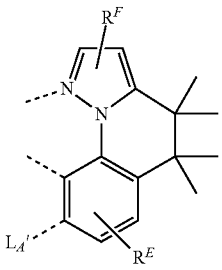
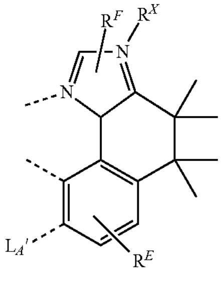
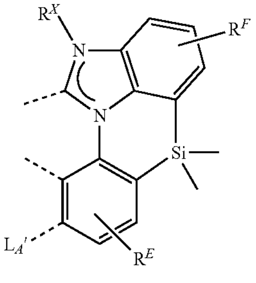
-continued
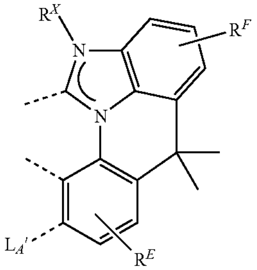
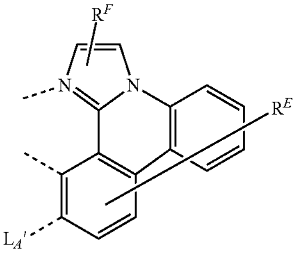
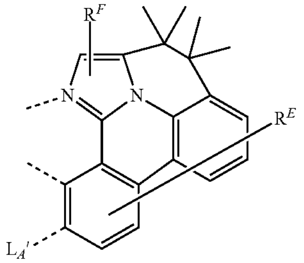
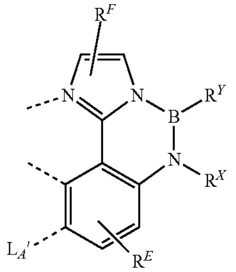
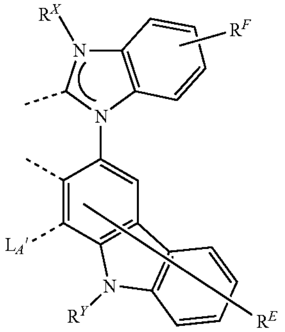
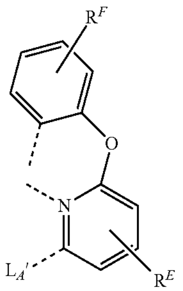
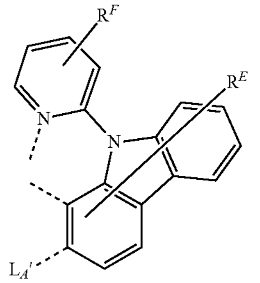
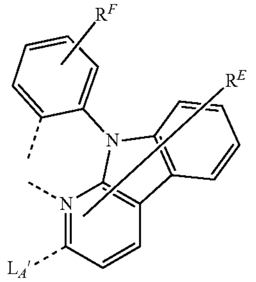

-continued
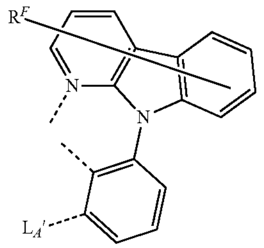
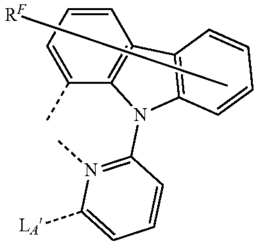
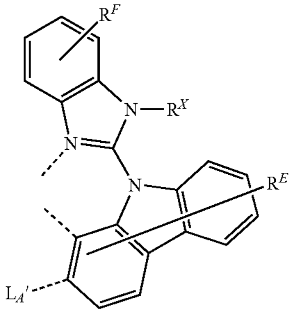
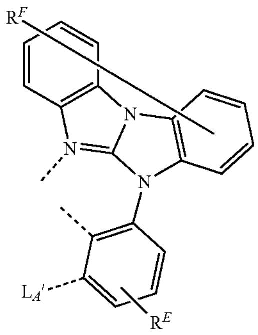
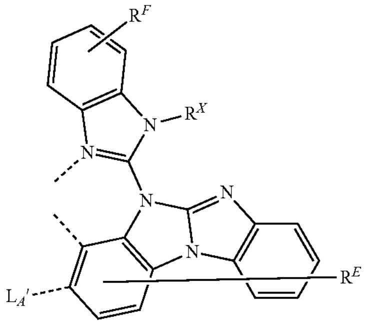
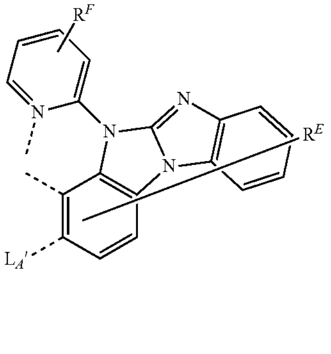
-continued
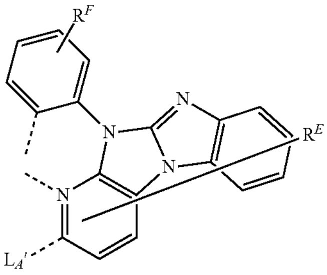
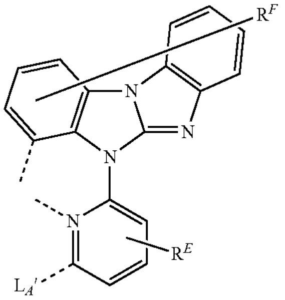
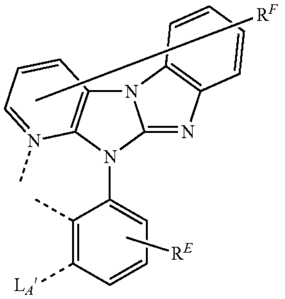
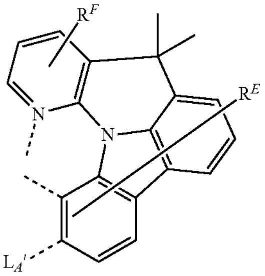
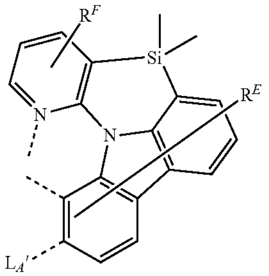
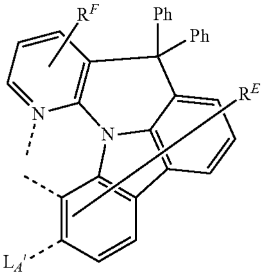
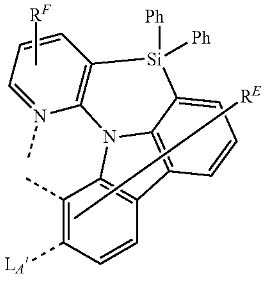
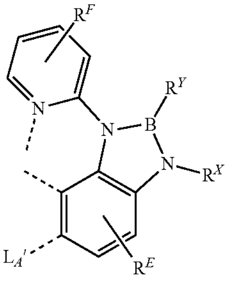
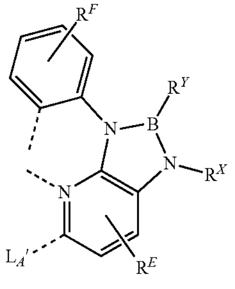

-continued
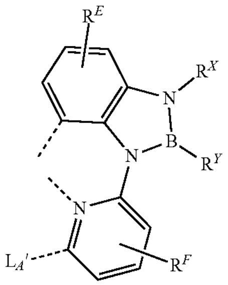
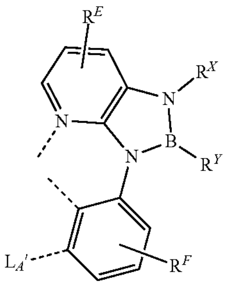
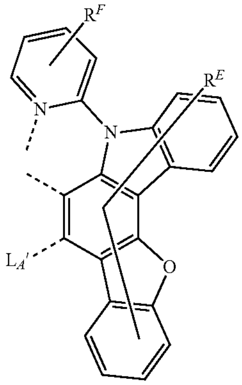
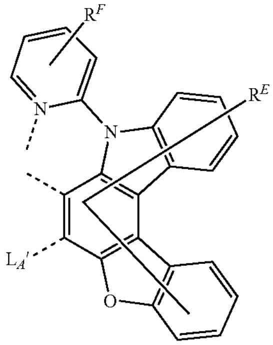
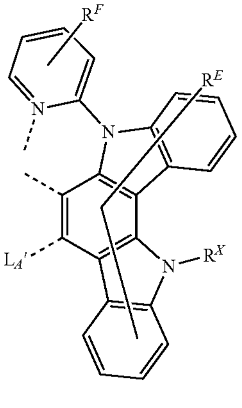
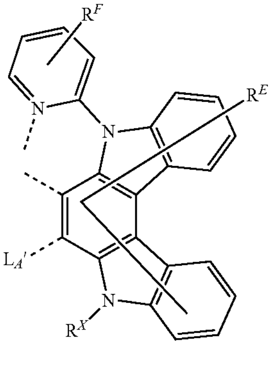
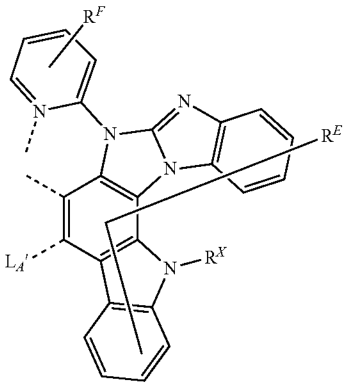
-continued
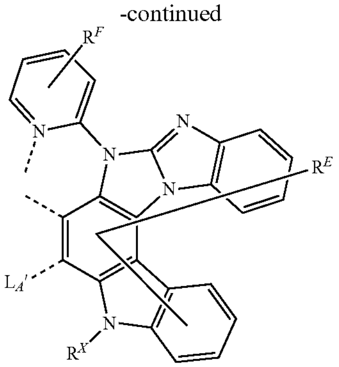
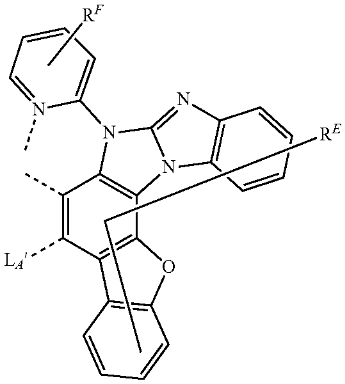
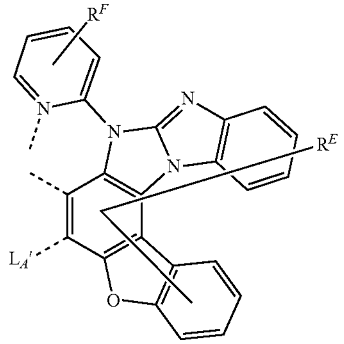
wherein each $R^E$, $R^F$, $R^X$, and $R^Y$ is independently selected from the group consisting of:
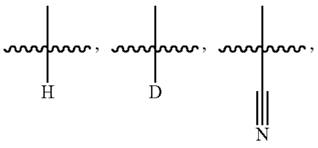
Me, iPr, tBu, $CD_3$,
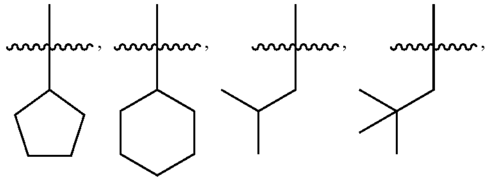
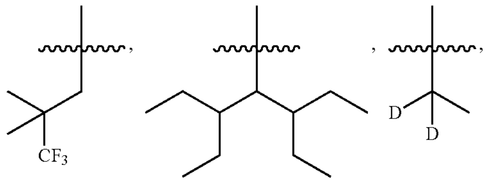

-continued
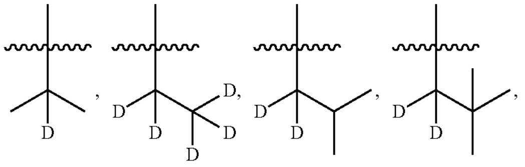
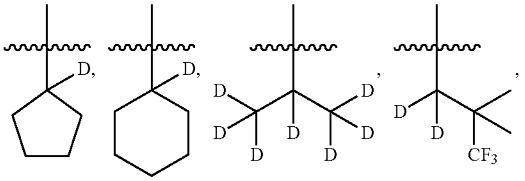
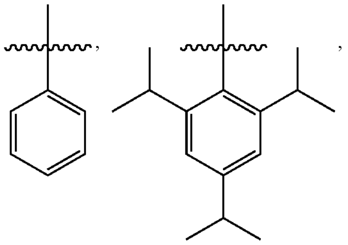
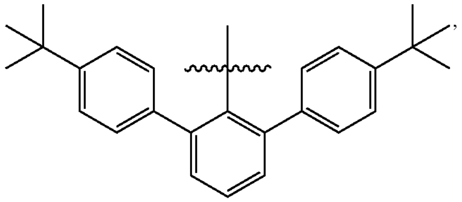
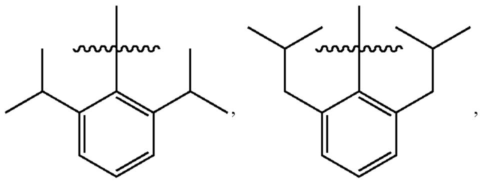
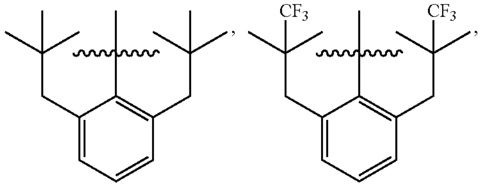
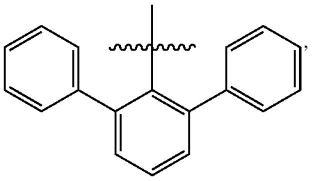
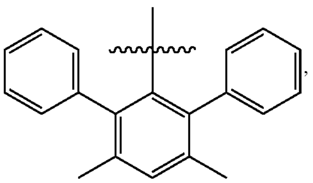
-continued
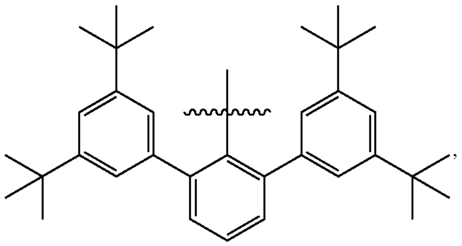
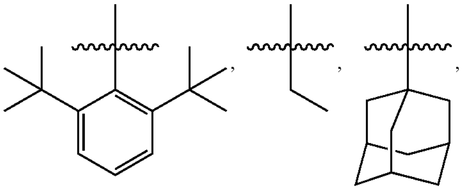
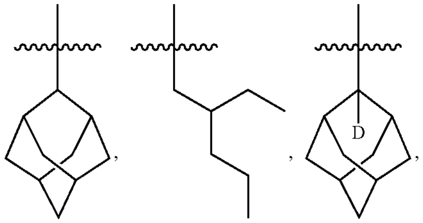
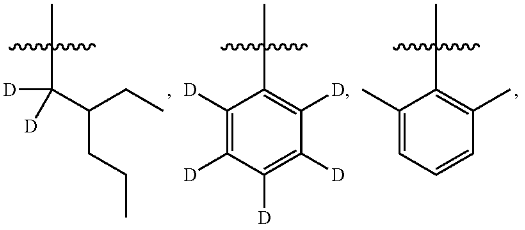
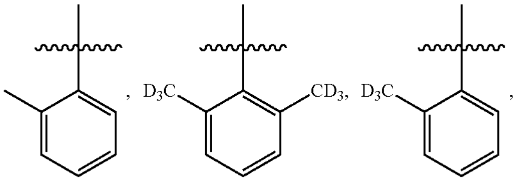
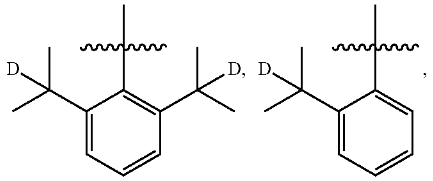
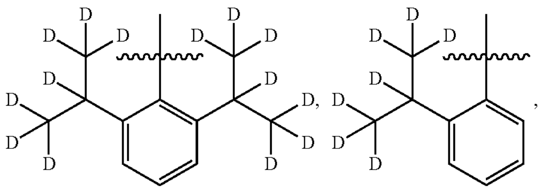
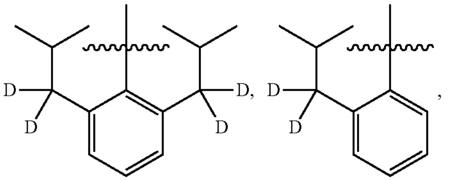

-continued
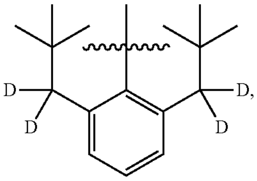, 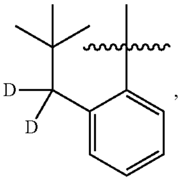,
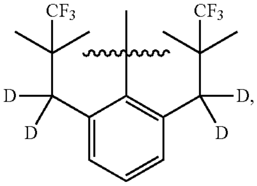, 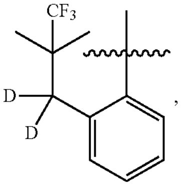,
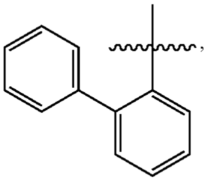,
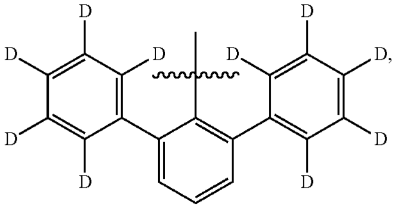,
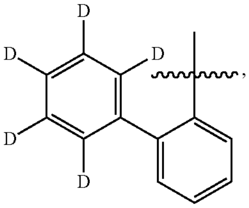, 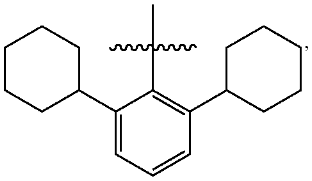,
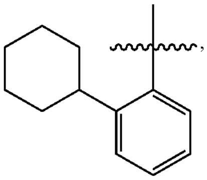, 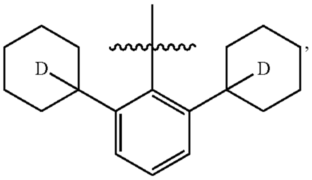,
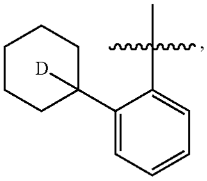, 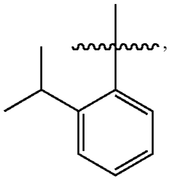, 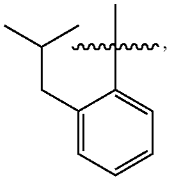,
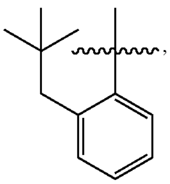, 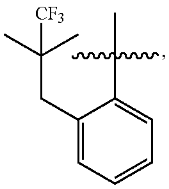,
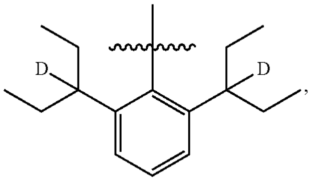, 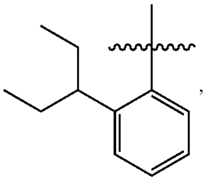,
-continued
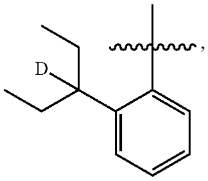, 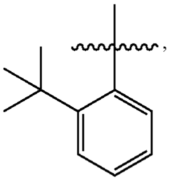,
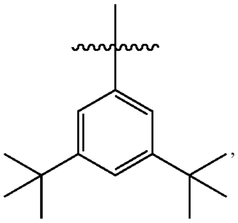, 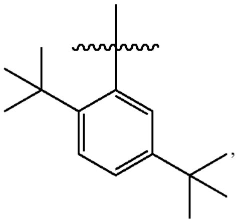,
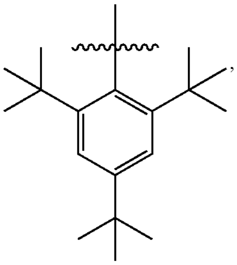, 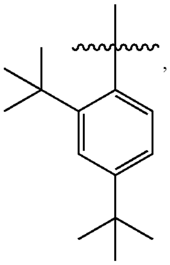,
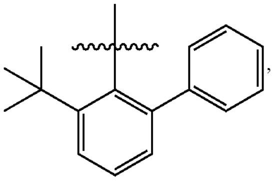,
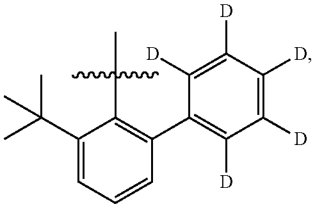,
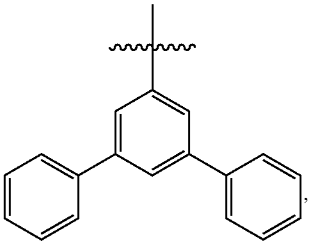,
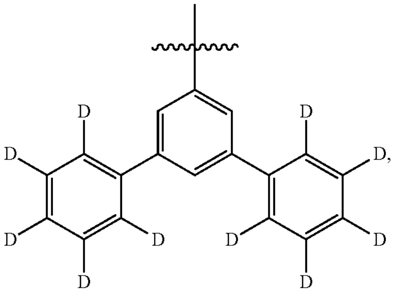, -continued
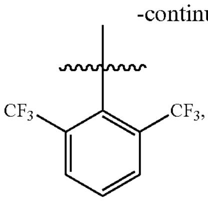
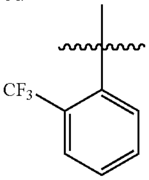,
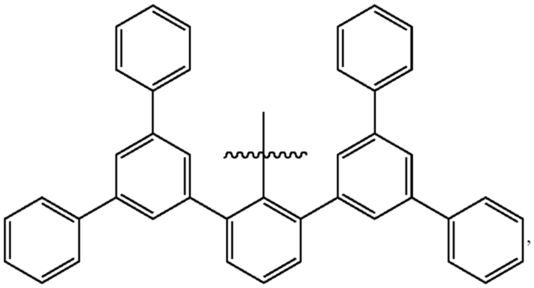,
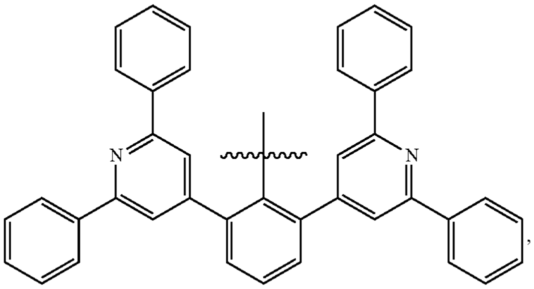,
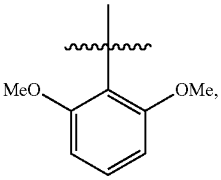
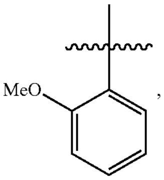,
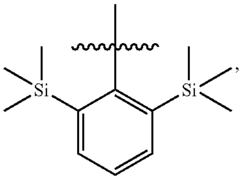,
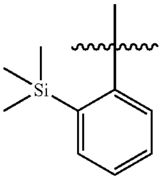,
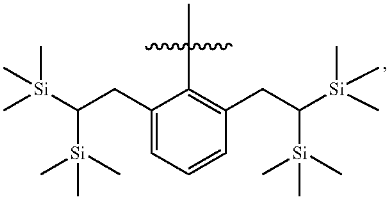,
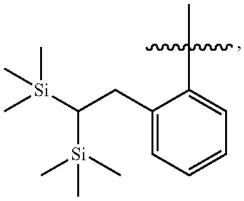,
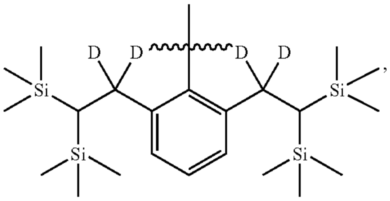,
-continued
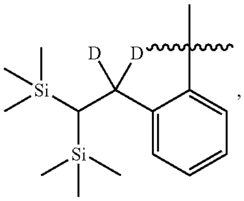,
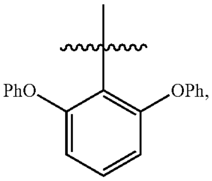
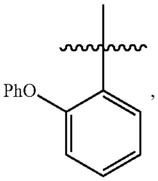,
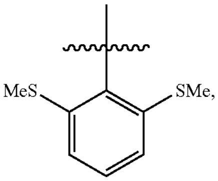
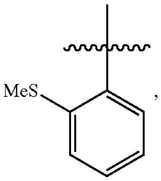,
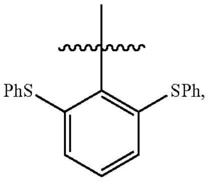
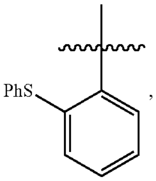,
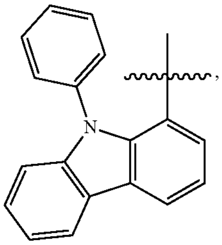,
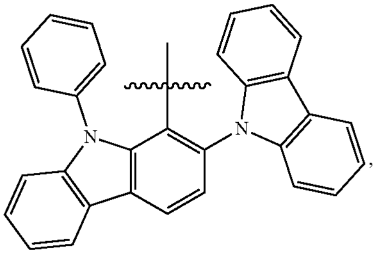,
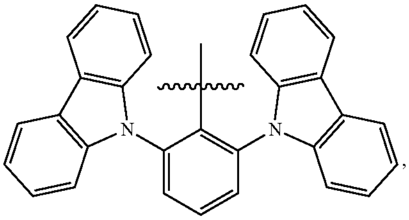,
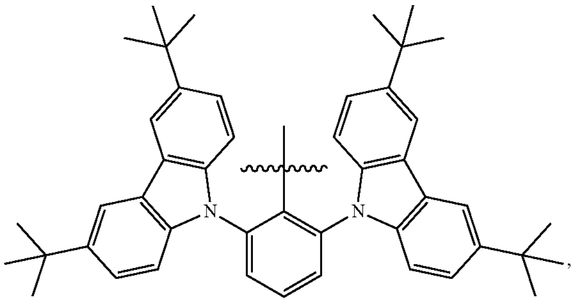, -continued
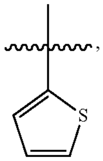, 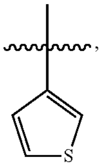, 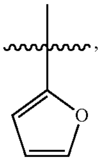, 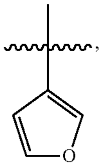,
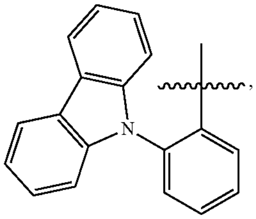,
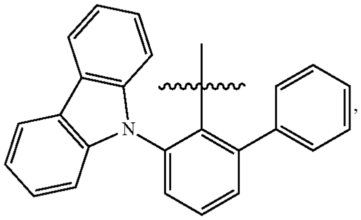,
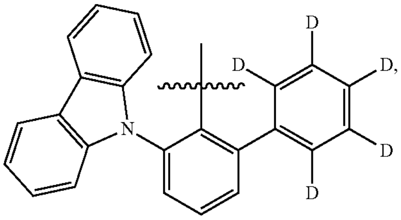
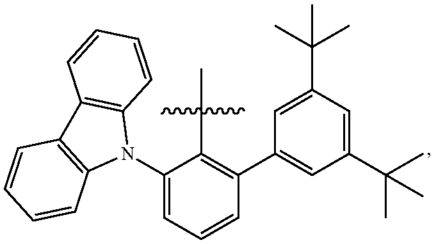,
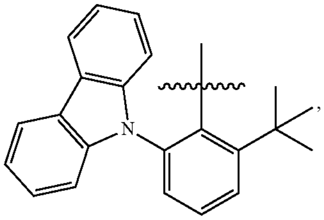,
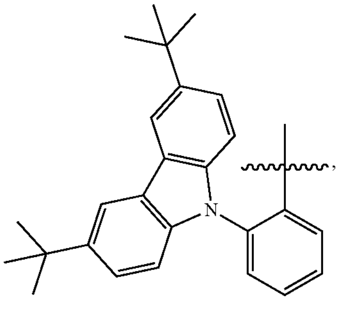,
-continued
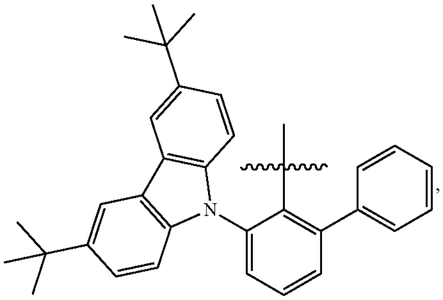,
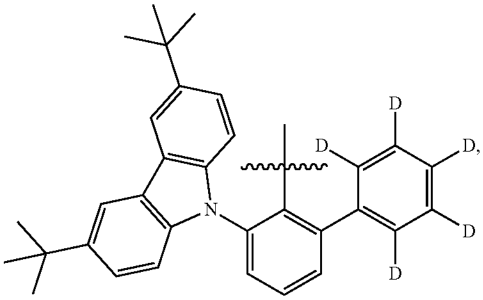
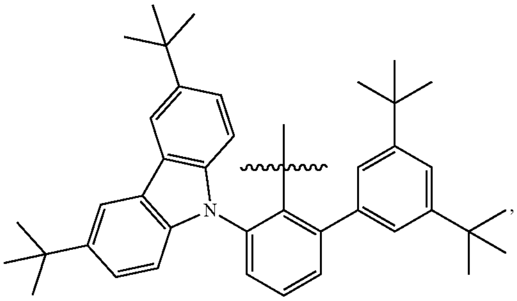,
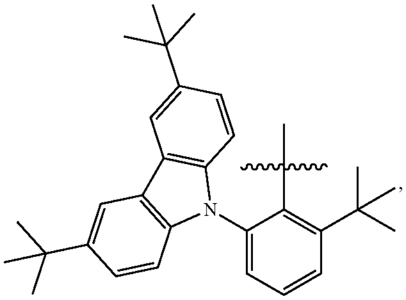,
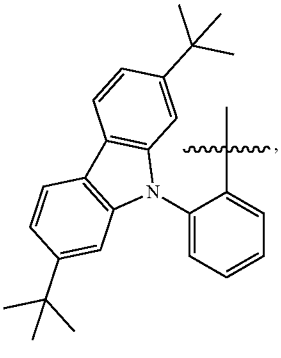, -continued
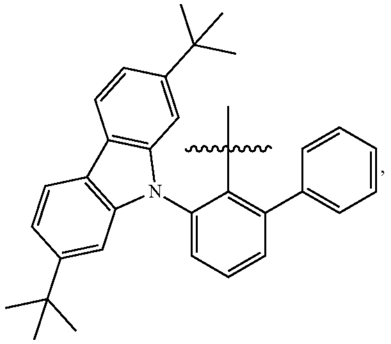
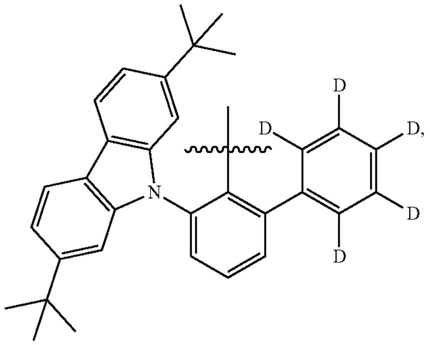
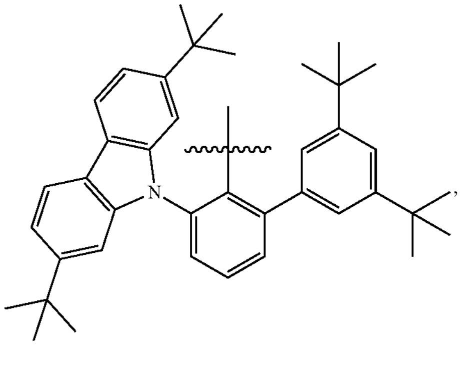
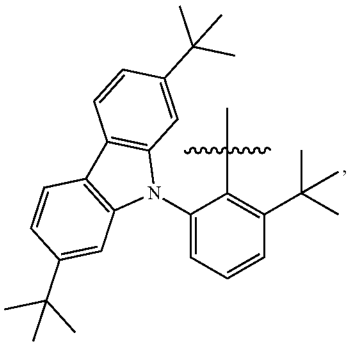
-continued
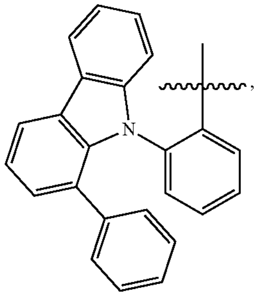
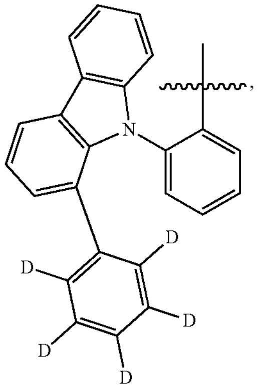
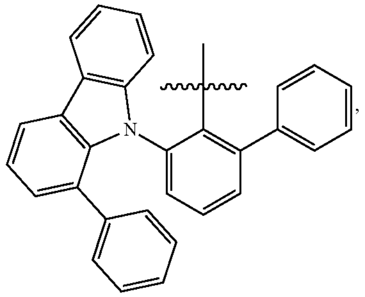
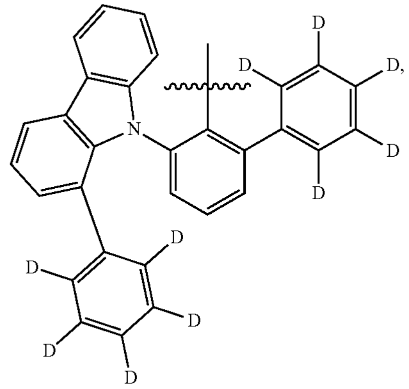
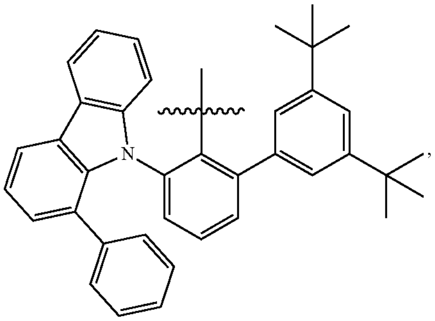

-continued
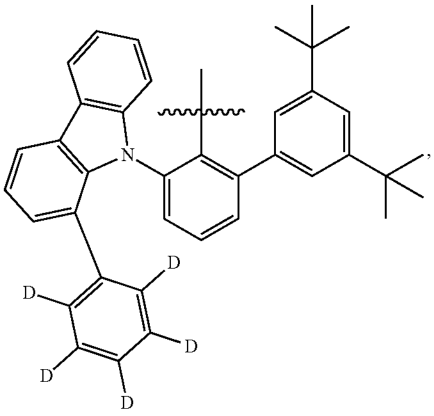
,
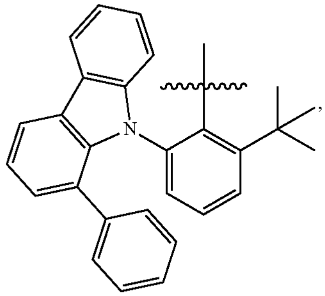
,
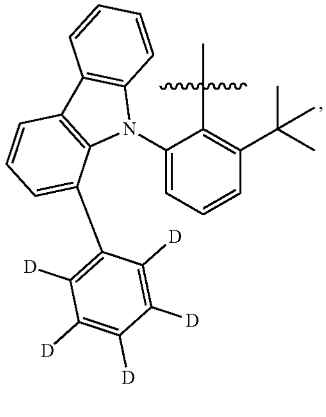
,
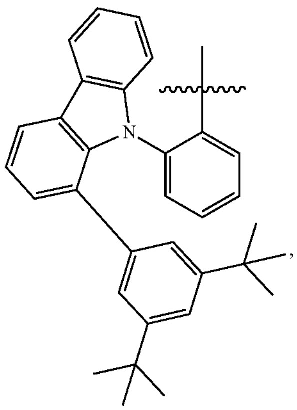
,
-continued
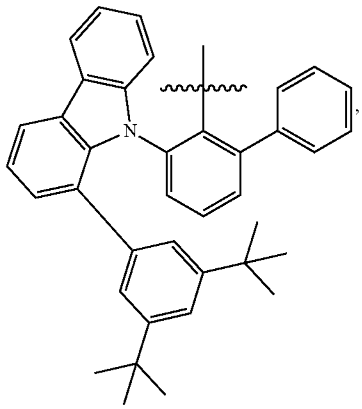
,
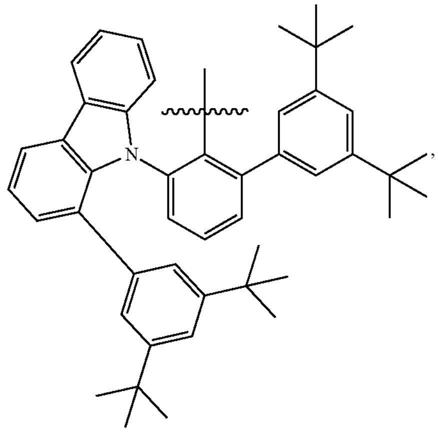
,
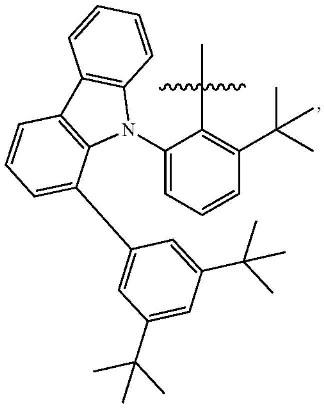
,
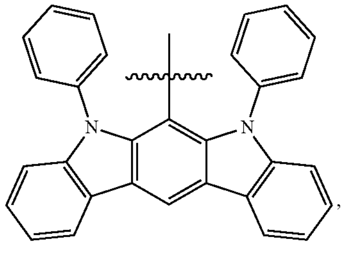
, -continued
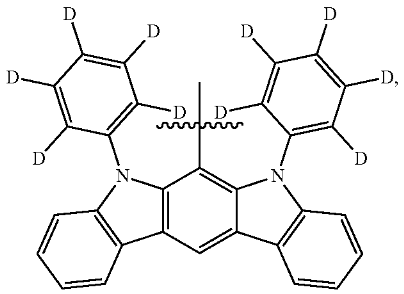
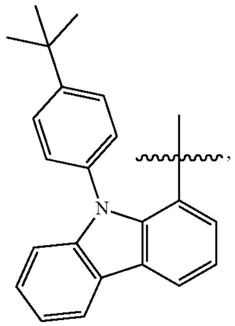
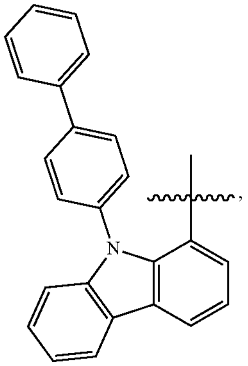
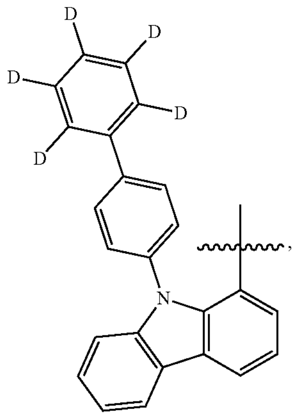
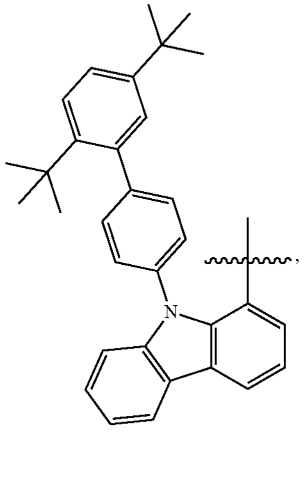
-continued
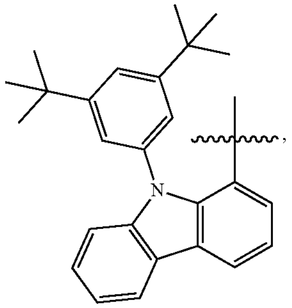
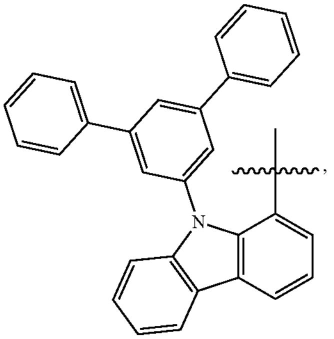
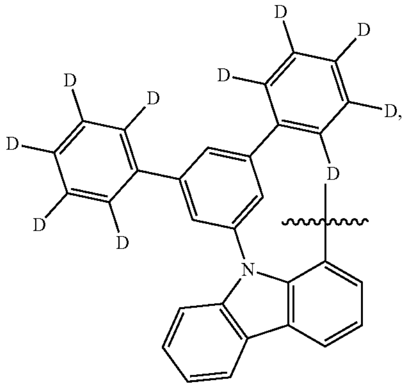
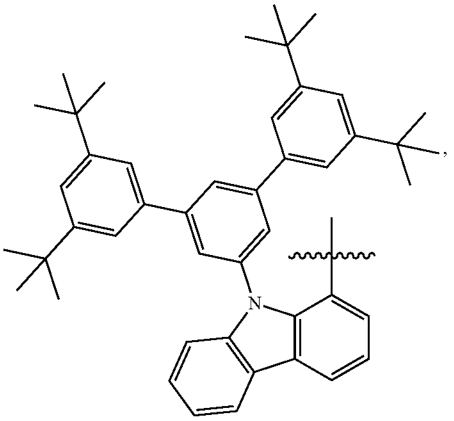

-continued
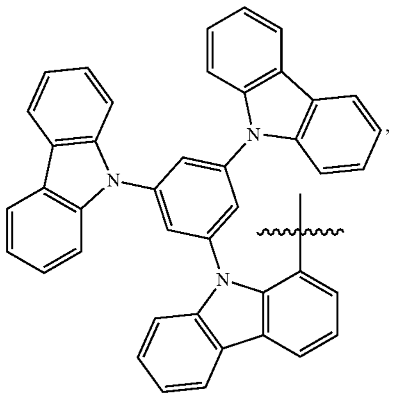
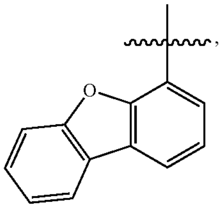
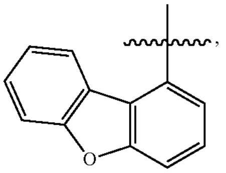
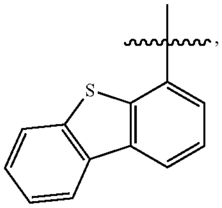
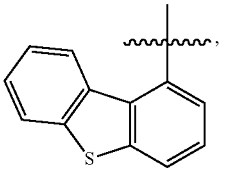
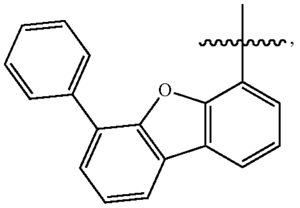
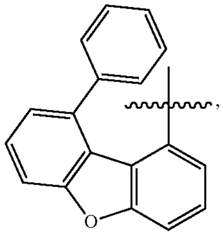
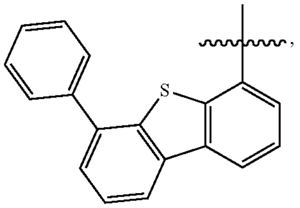
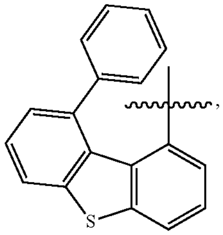
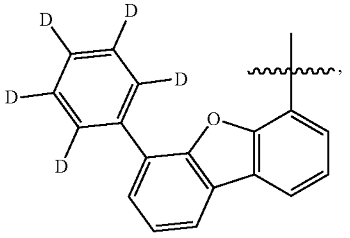
-continued
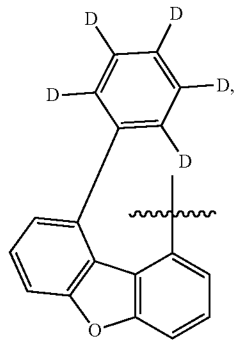
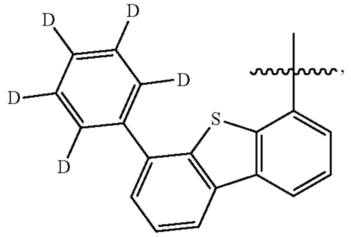
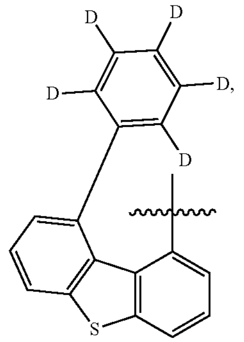
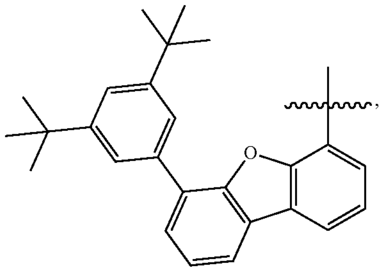
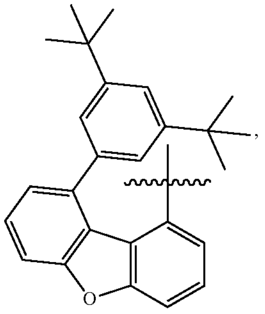

-continued
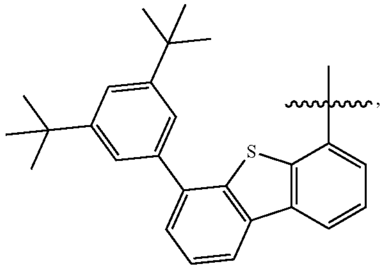
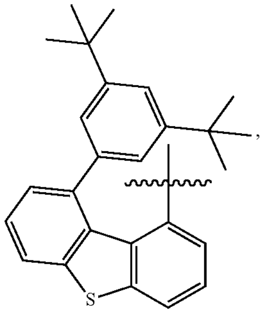
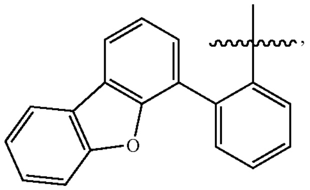
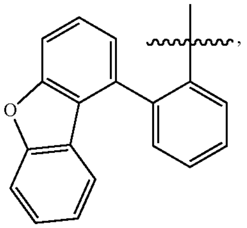
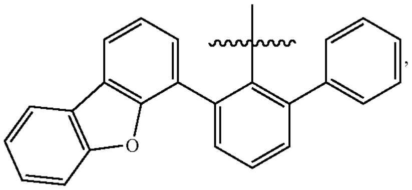
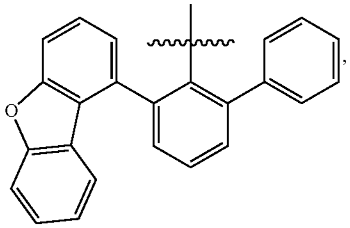
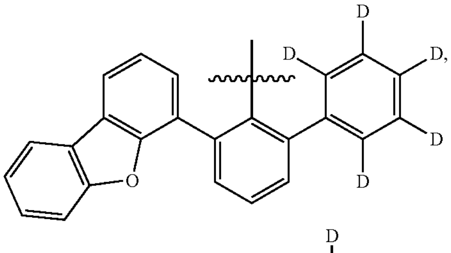
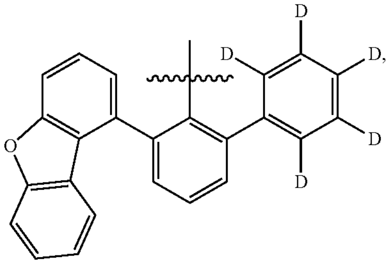
-continued
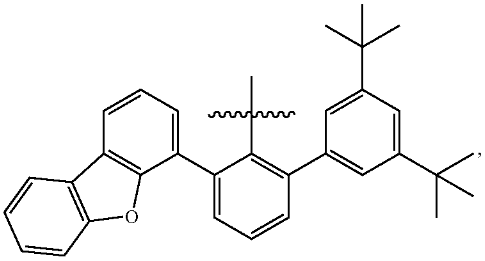
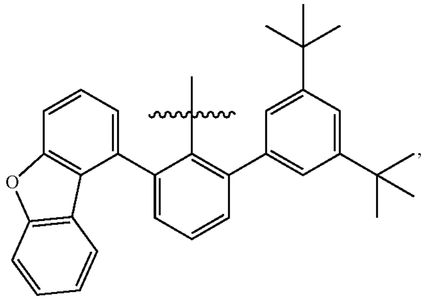
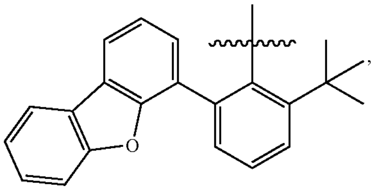
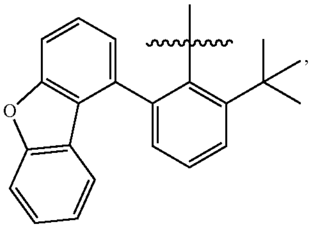
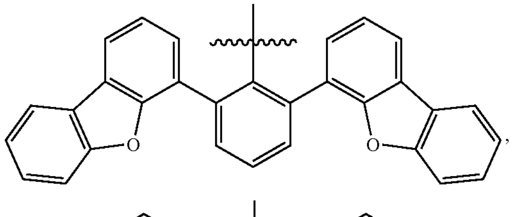
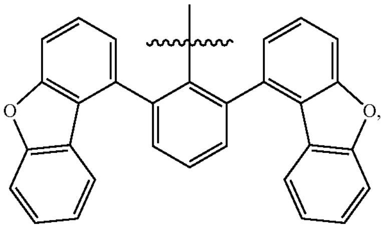
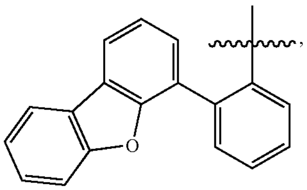
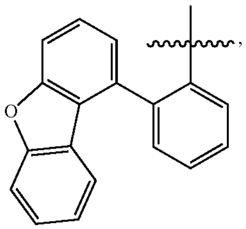

-continued
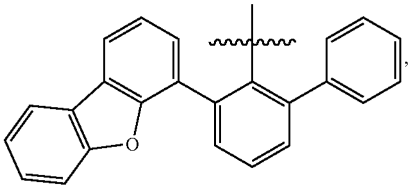
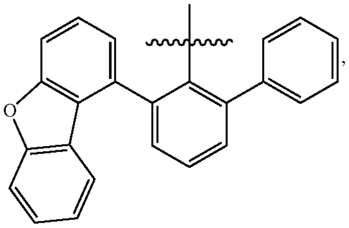
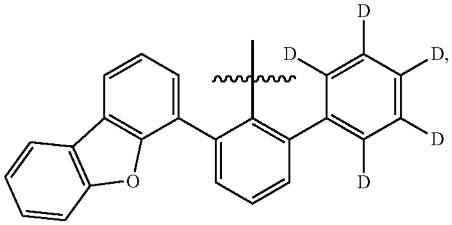
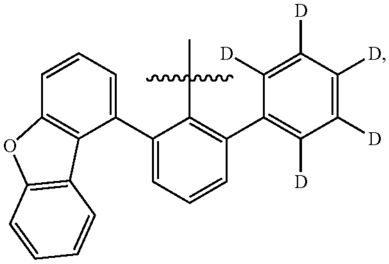
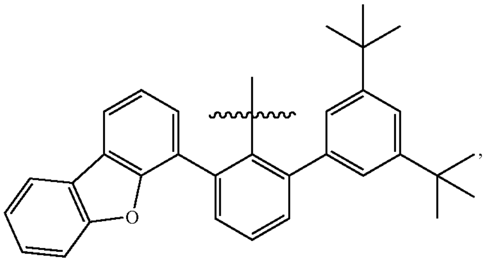
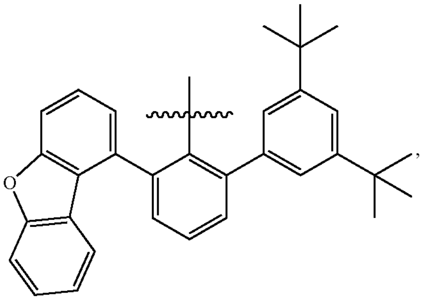
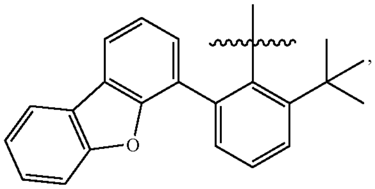
-continued
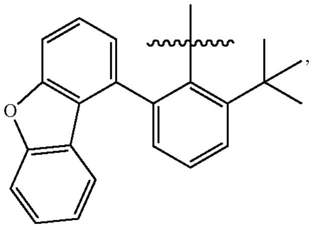
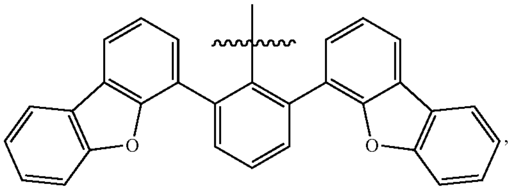
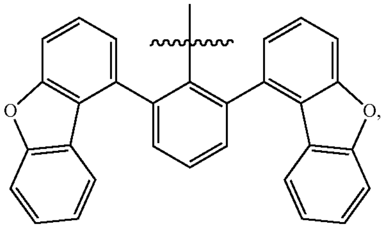
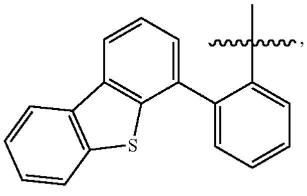
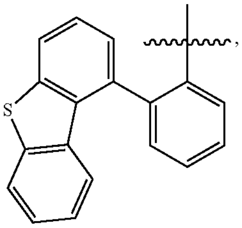
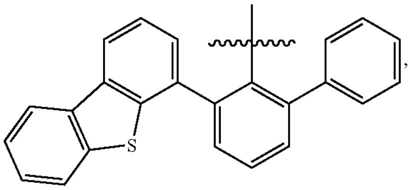
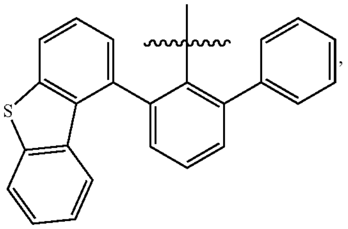
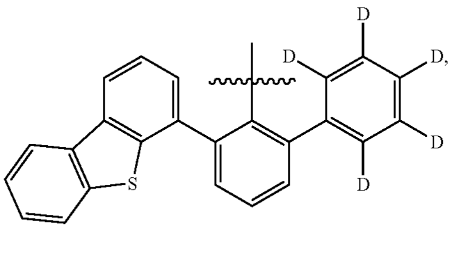

-continued
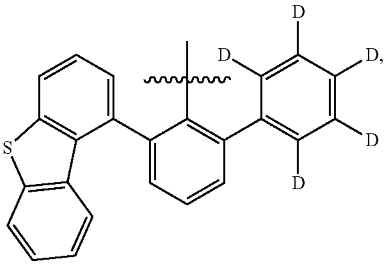
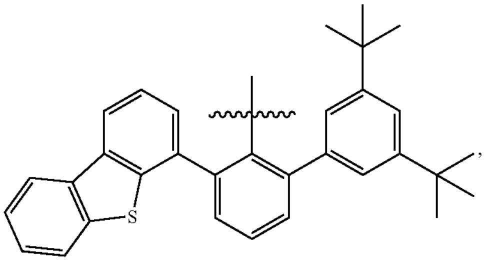
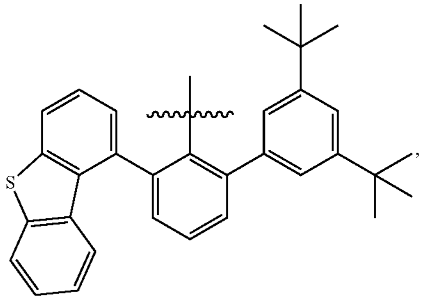
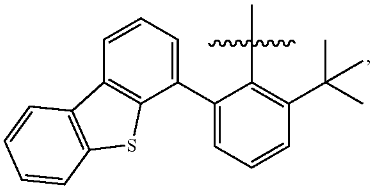
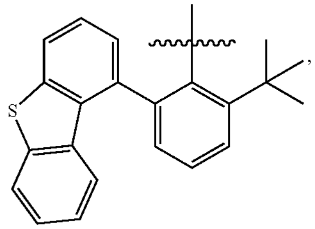
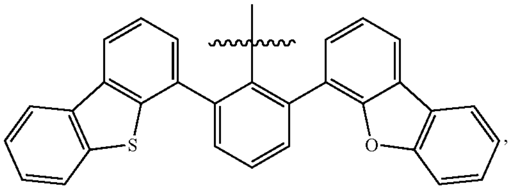
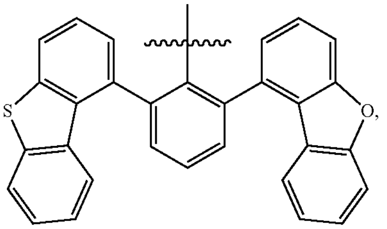
-continued
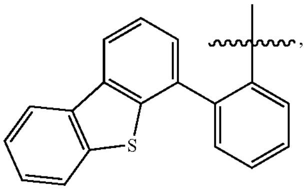
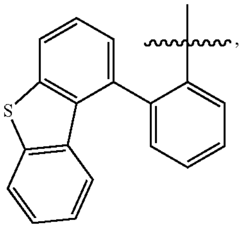
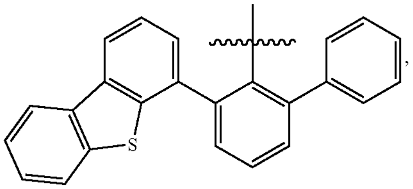
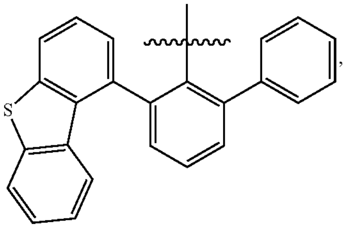
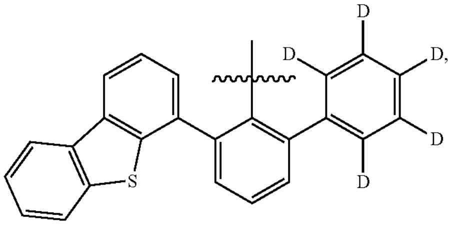
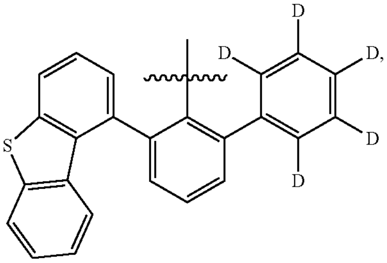
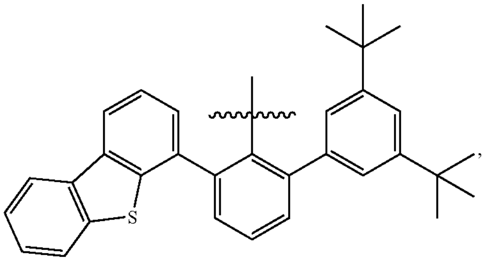
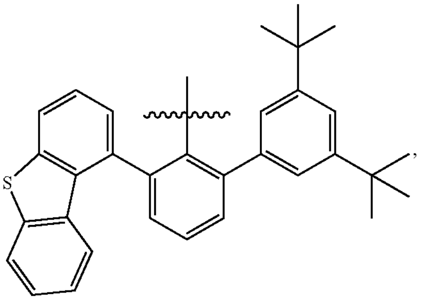

-continued
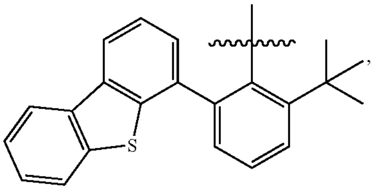
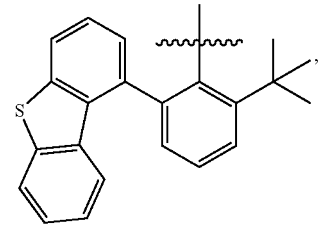
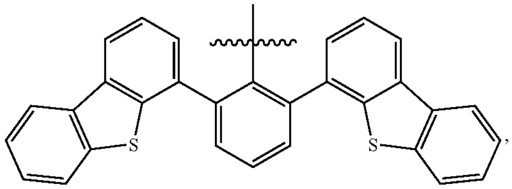
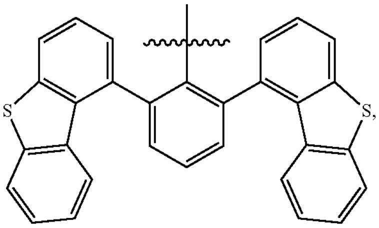
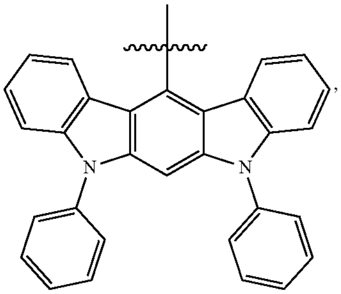
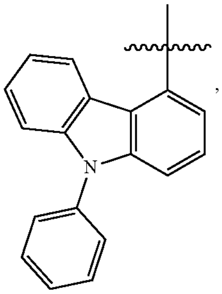
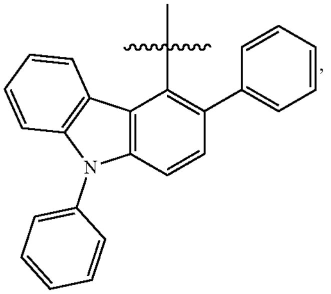
-continued
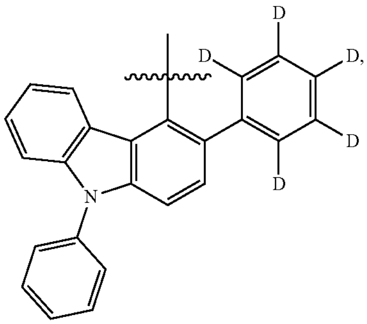
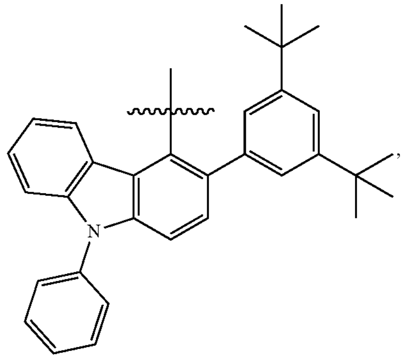
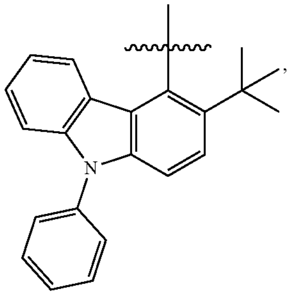
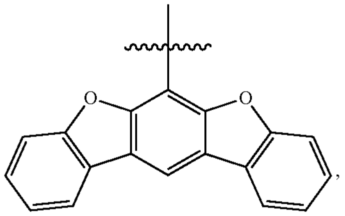
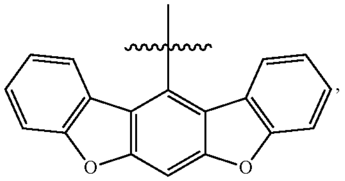
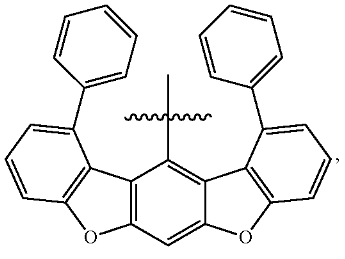

-continued
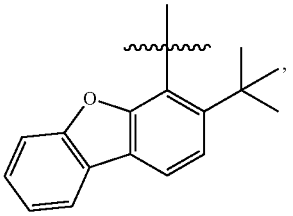
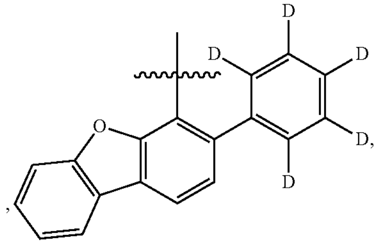
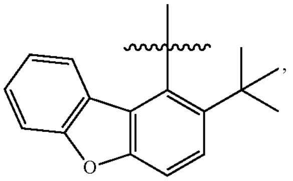
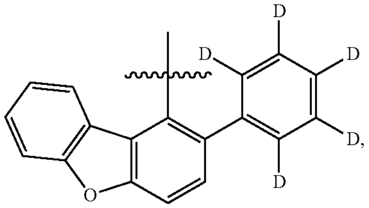
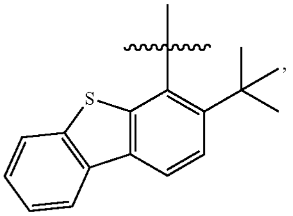
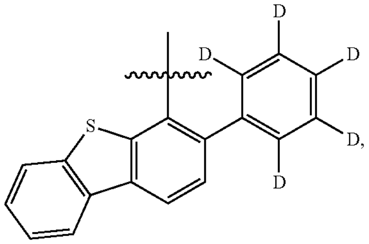
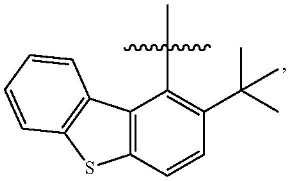
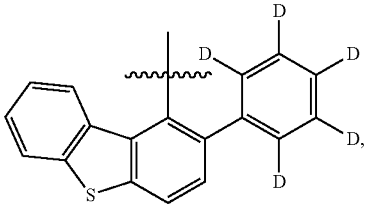
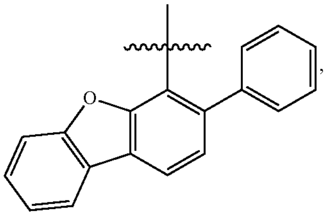
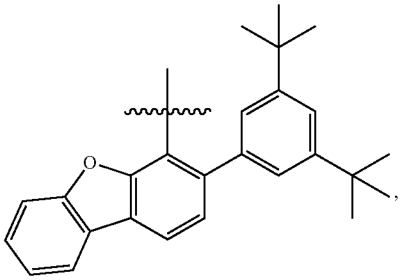
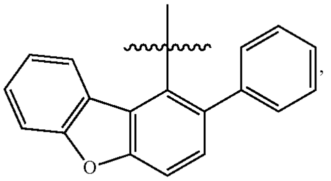
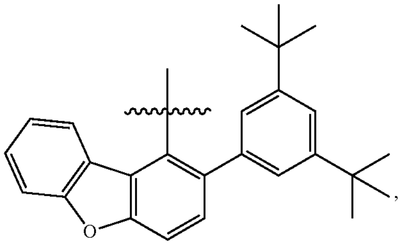
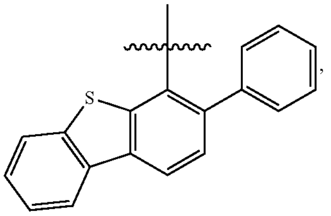
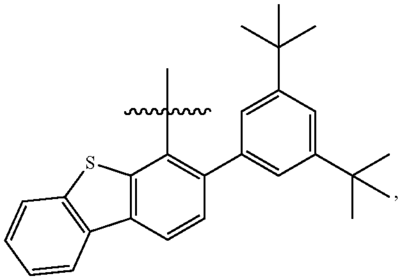
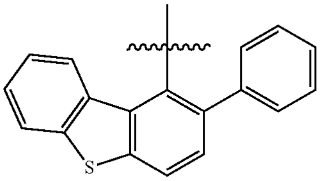 [SMILES: *c1c(-c2ccccc2)ccc2sc3ccccc3c12]

-continued
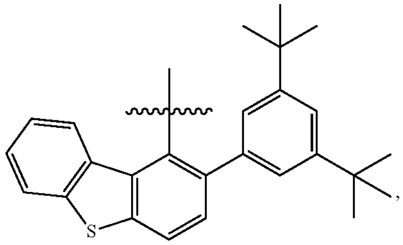
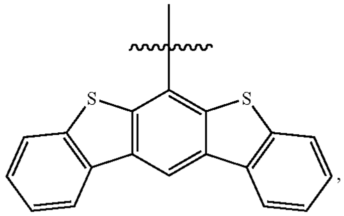
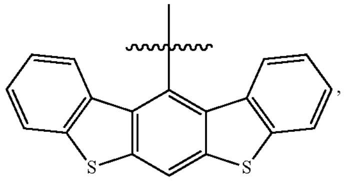
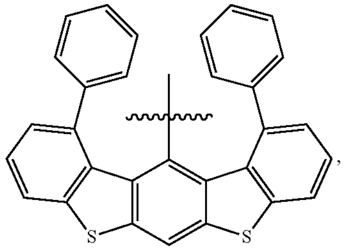
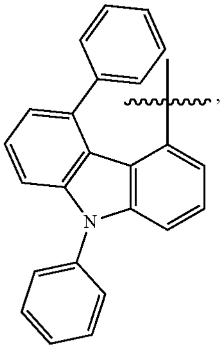
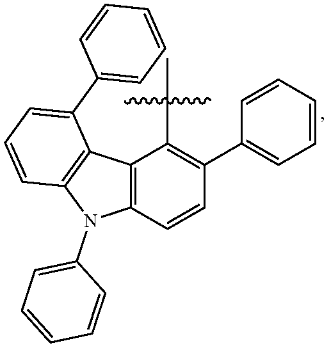
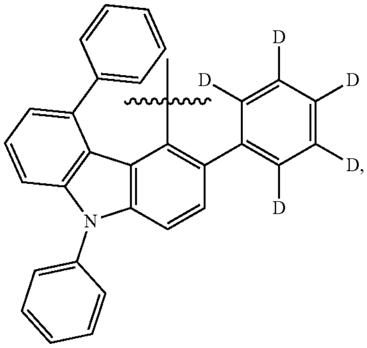
-continued
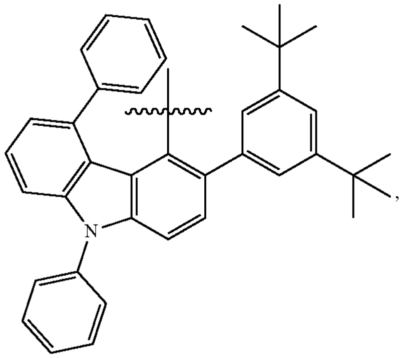
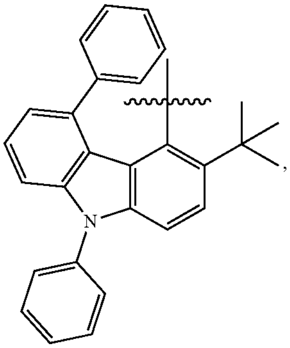
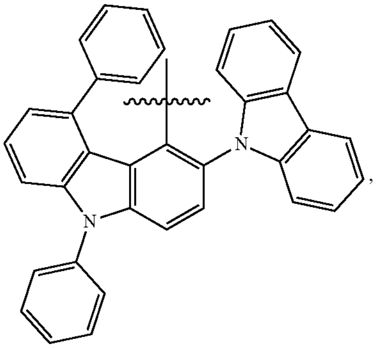
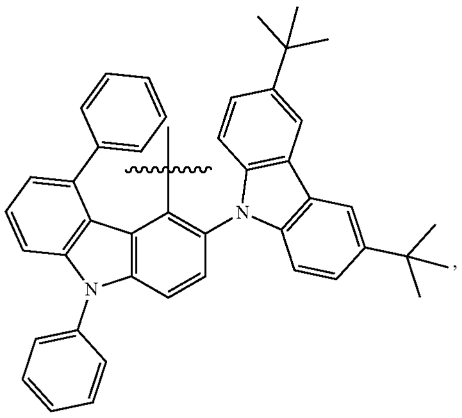

-continued
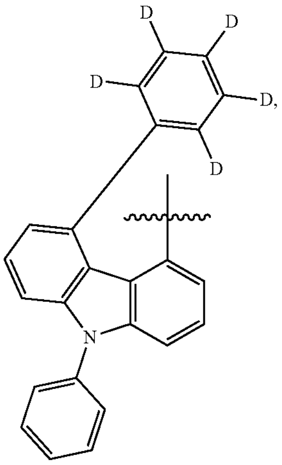
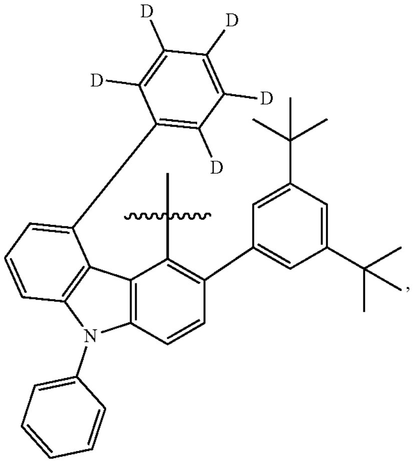
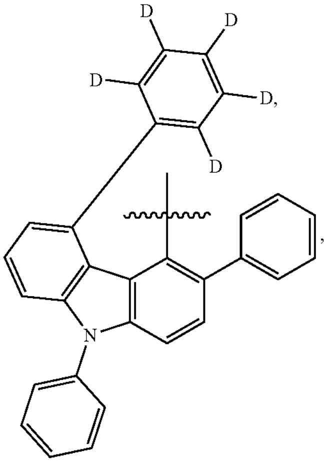
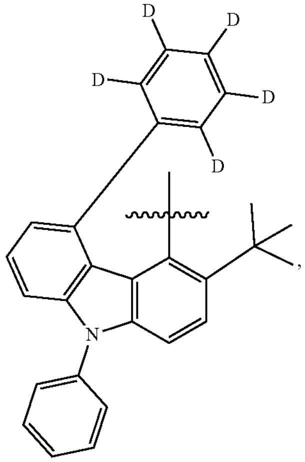
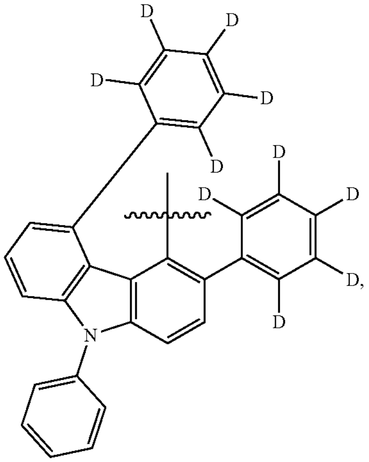
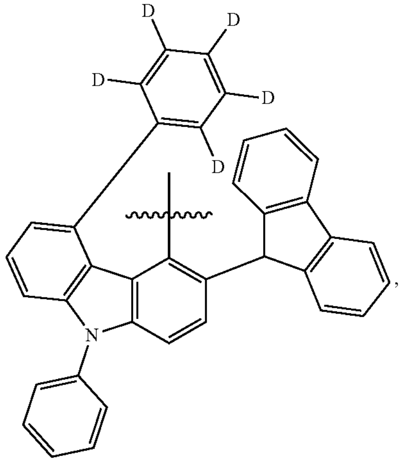
-continued

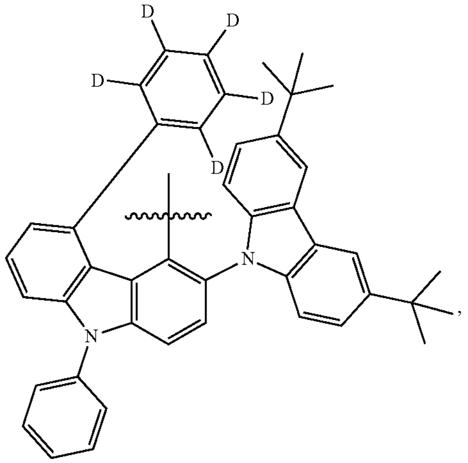
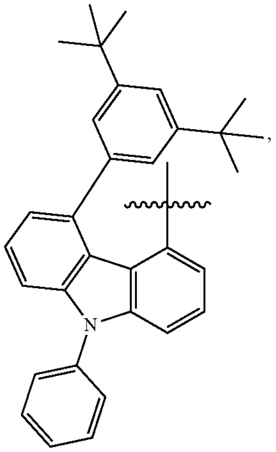
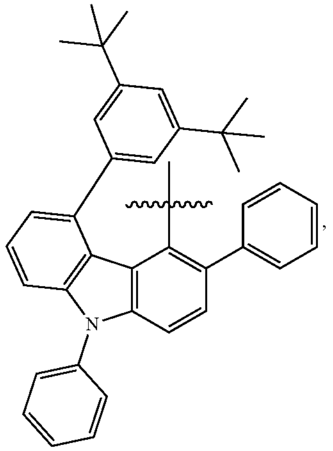
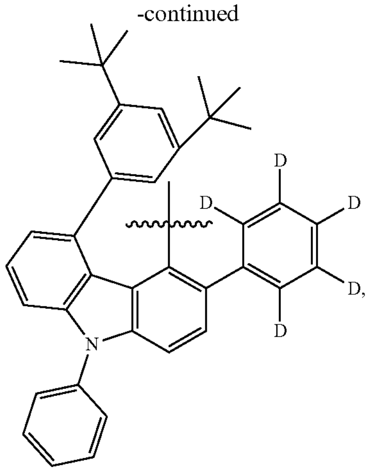
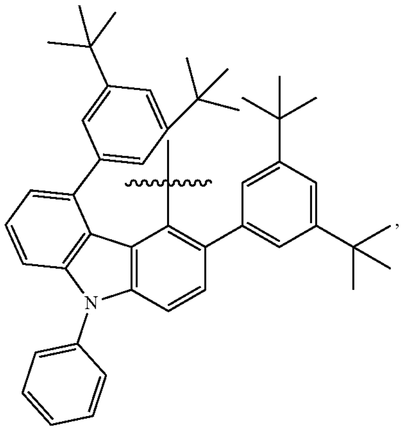
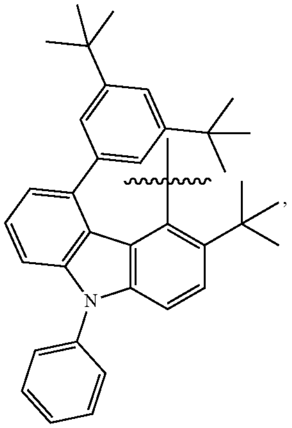
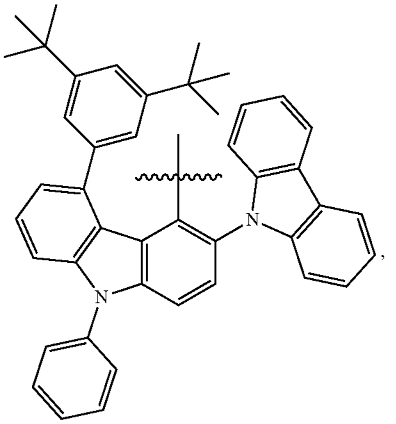

-continued
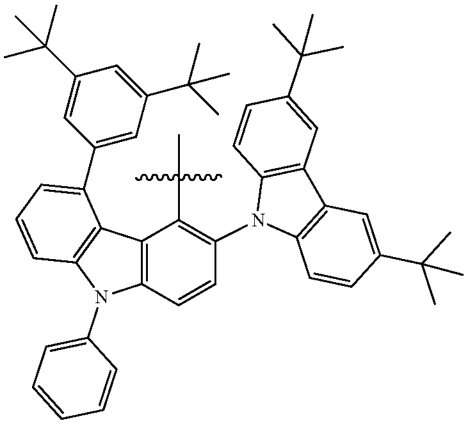
,
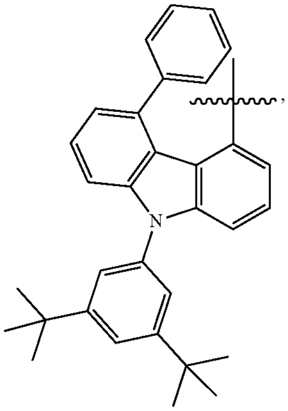
,
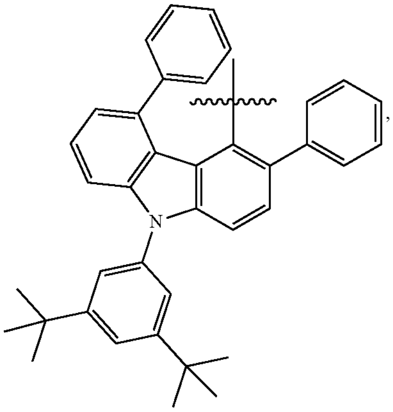
,
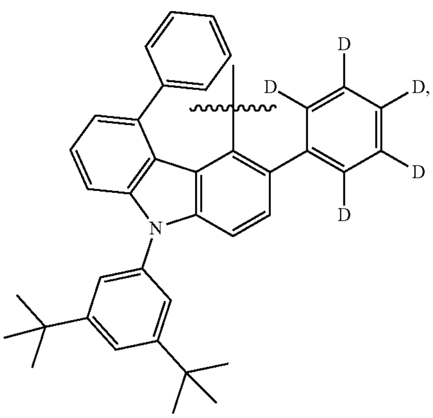
,
-continued
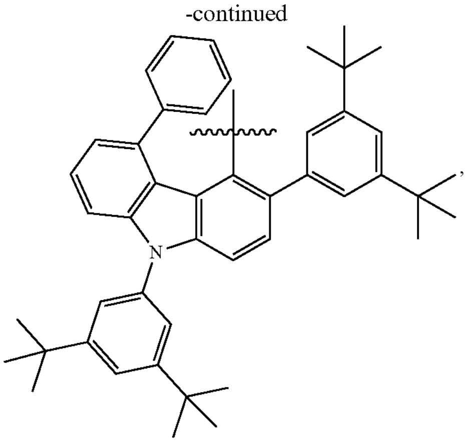
,
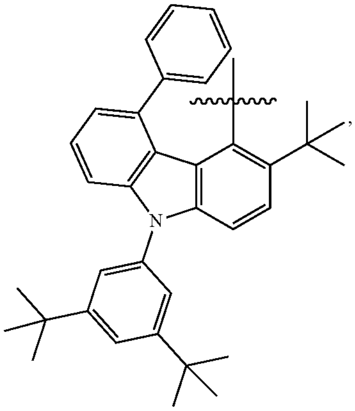
,
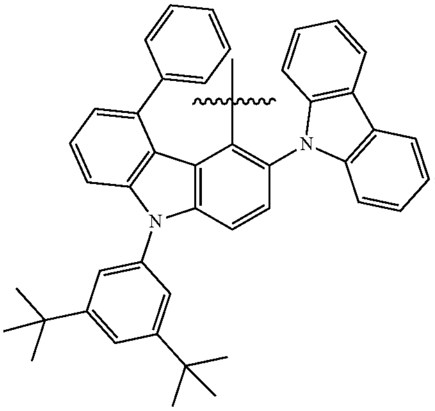
,
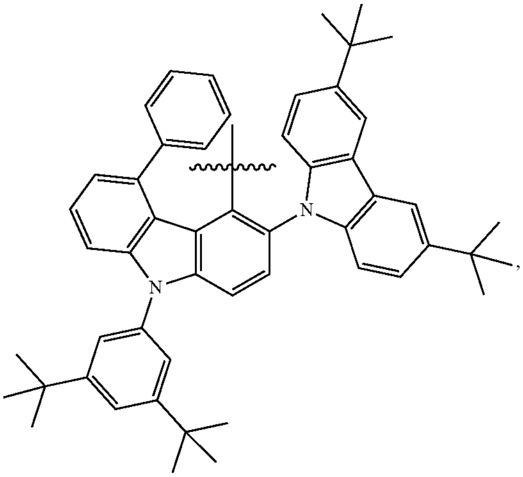
, -continued
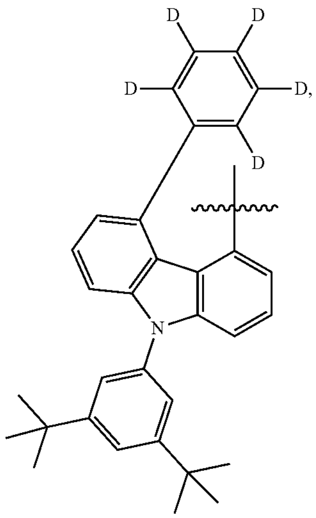
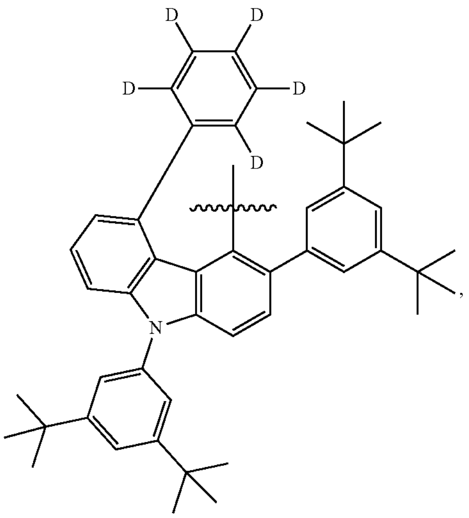
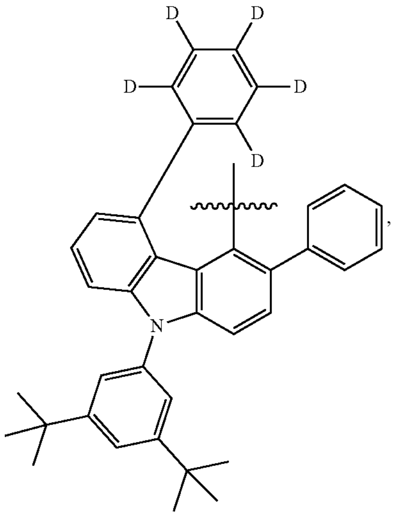
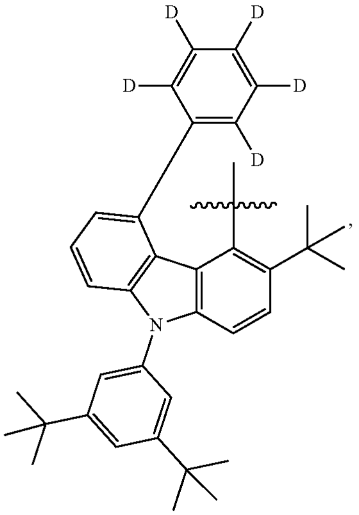
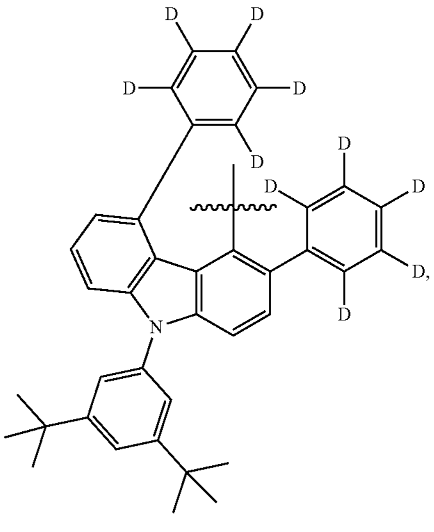
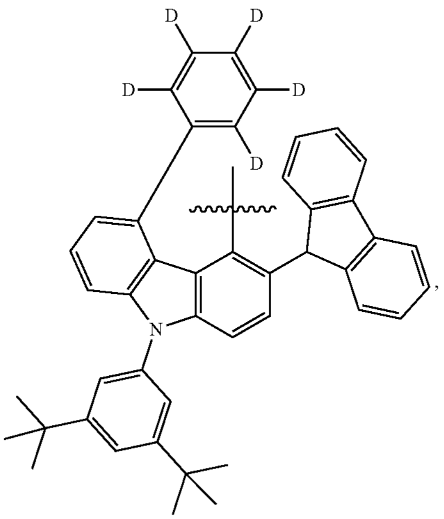

-continued
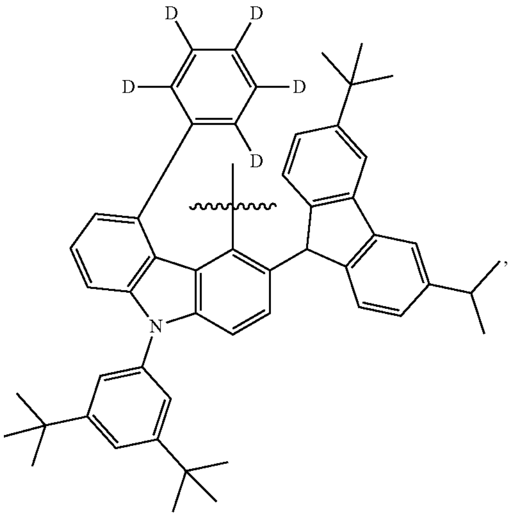
,
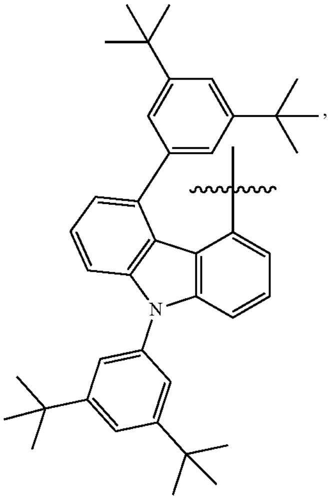
,
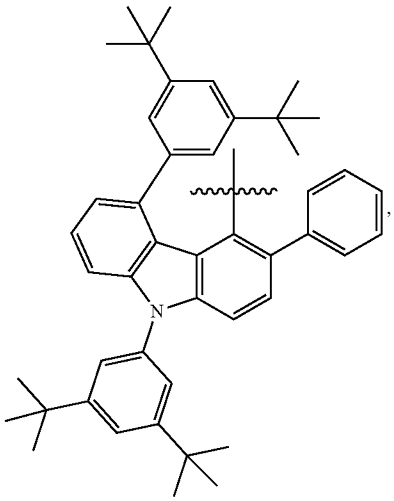
,
-continued
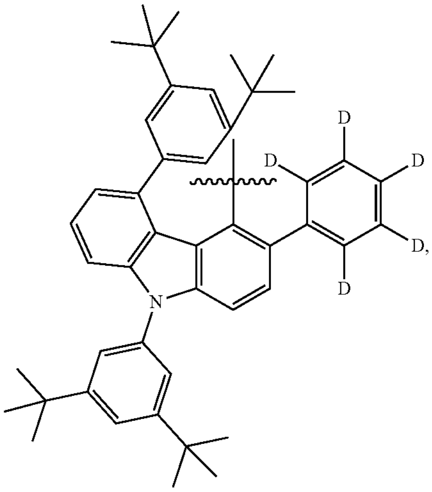
,
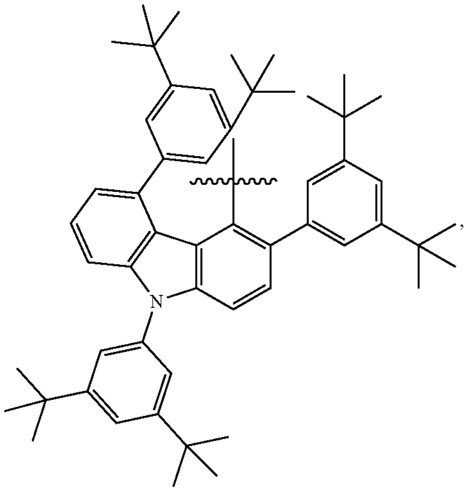
,
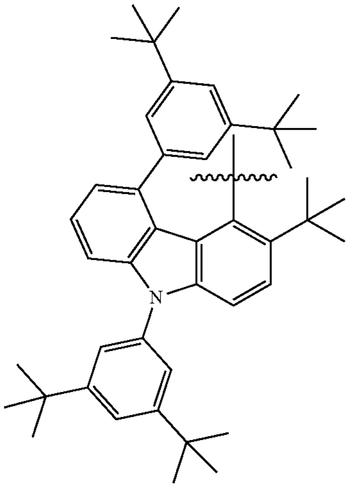
, -continued
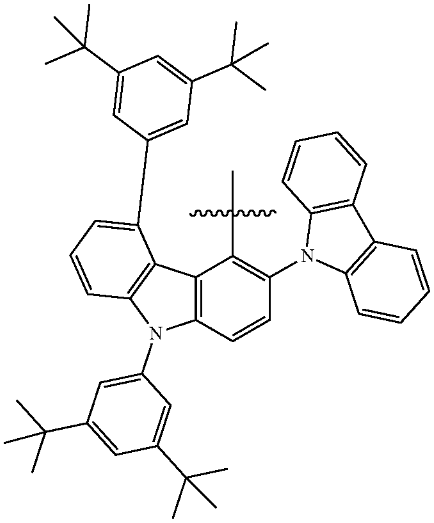
,
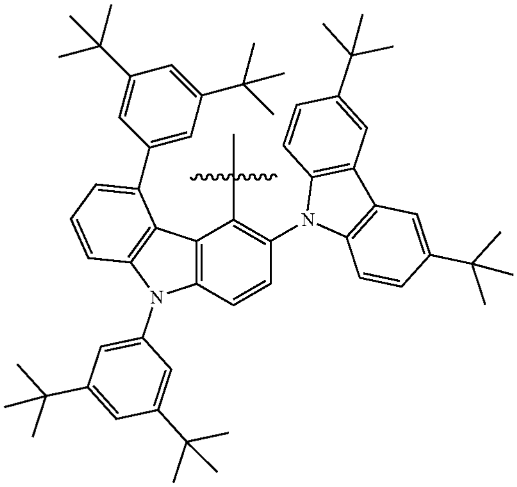
,
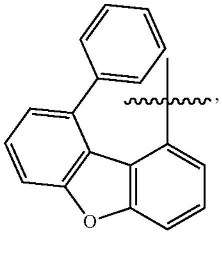
,
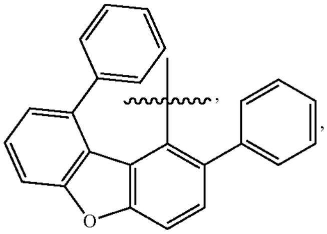
,
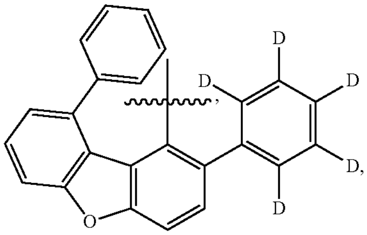
,
-continued
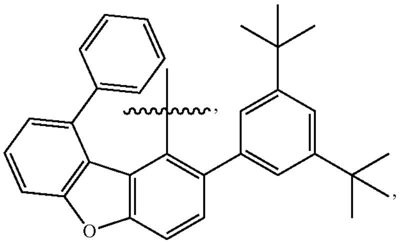
,
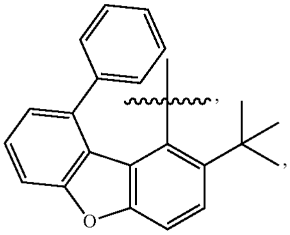
,
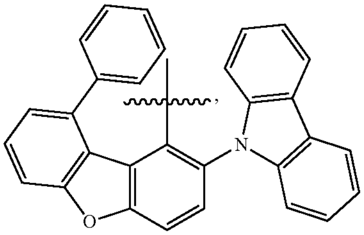
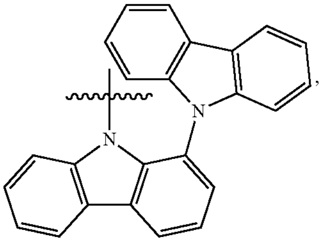
,
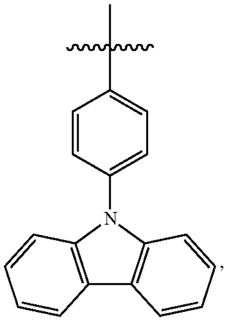
,
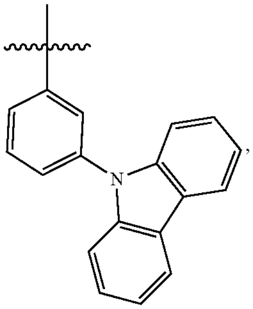
,
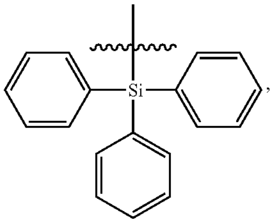
,
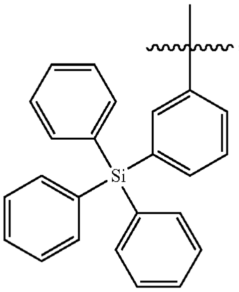

-continued
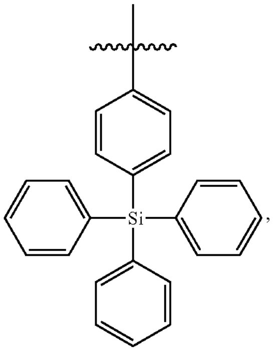
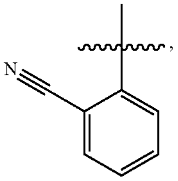
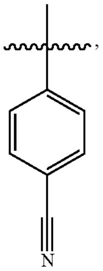
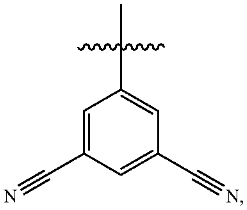
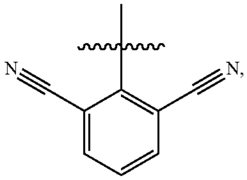
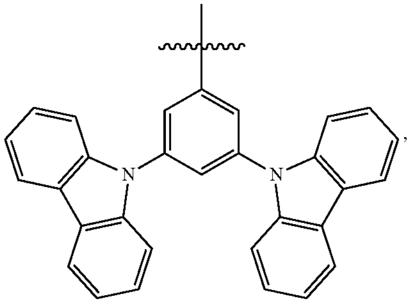
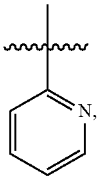
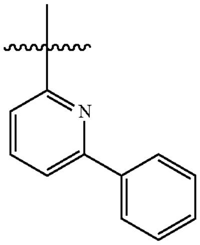
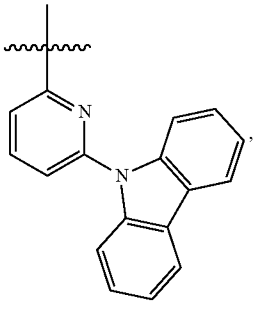
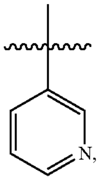
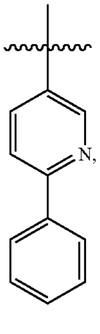
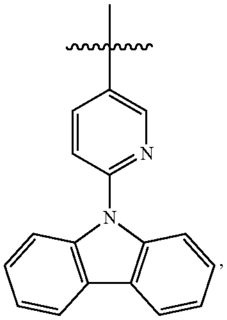
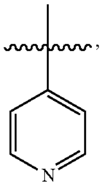
-continued
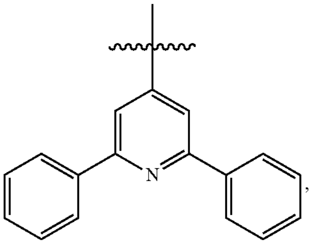
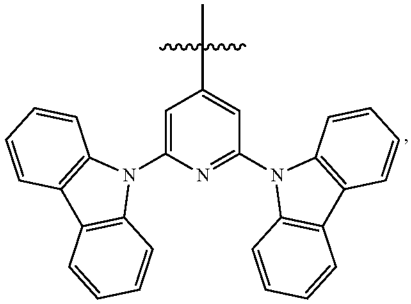
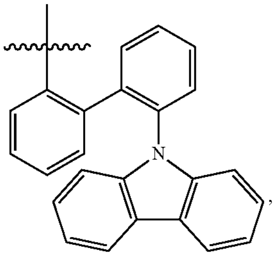
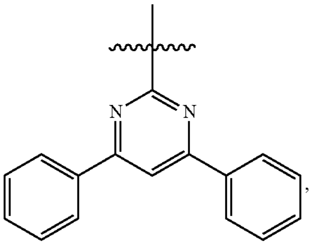
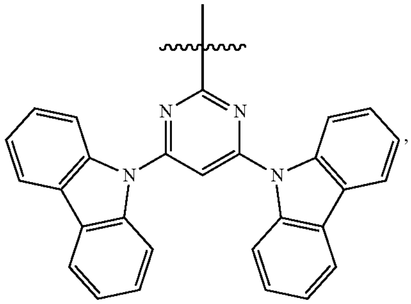
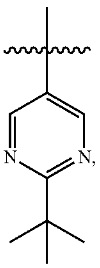
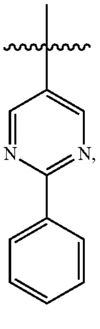
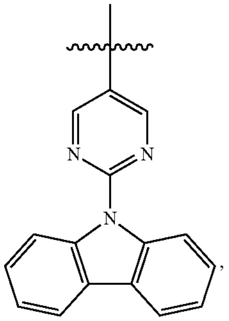

-continued
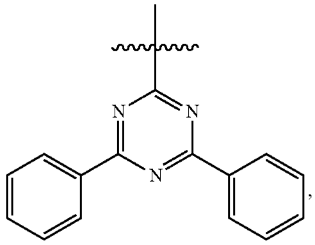
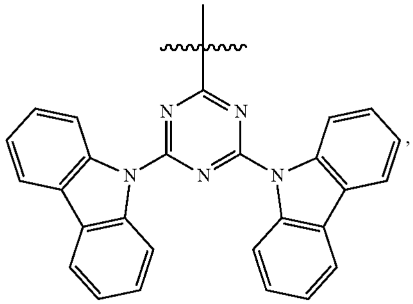
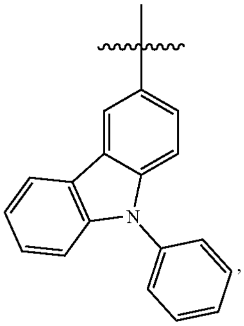
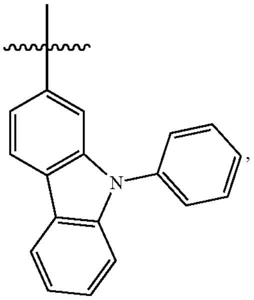
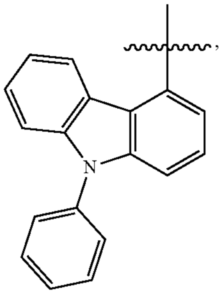
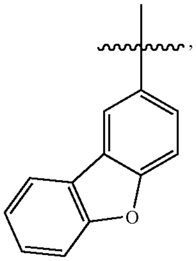
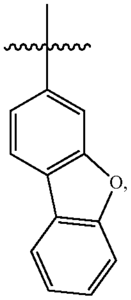
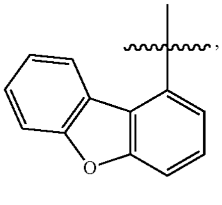
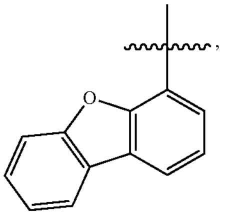
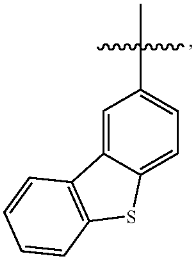
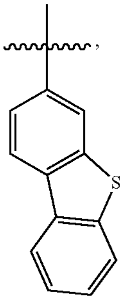
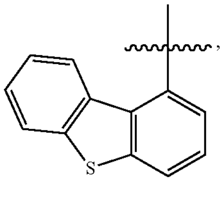
-continued
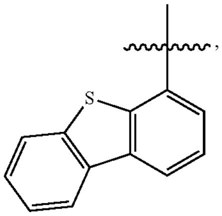
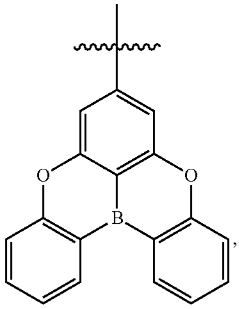
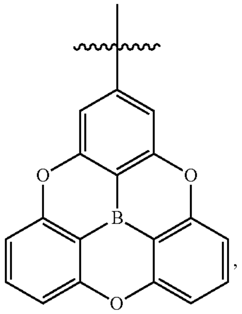
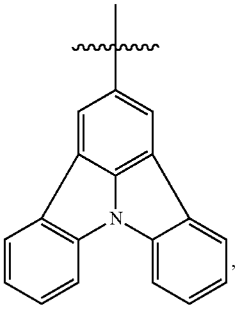
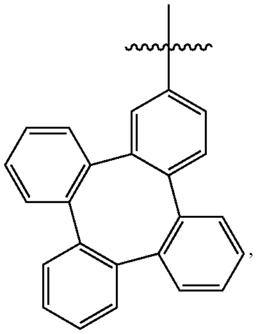
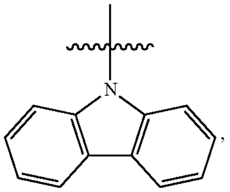
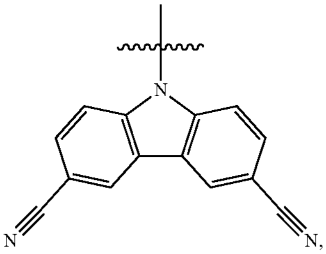
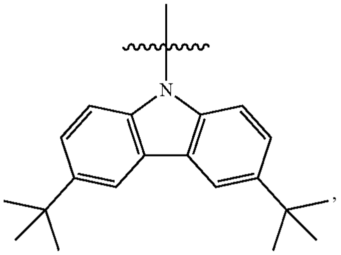

-continued
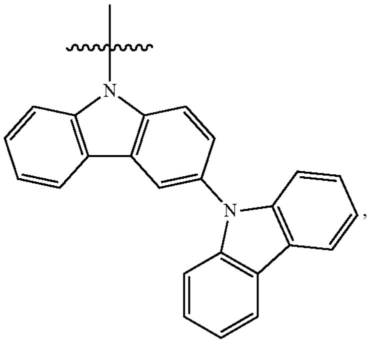
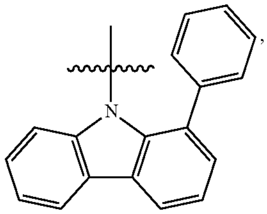
, and
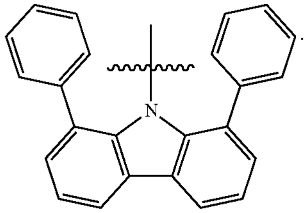
.
In some embodiments, the compound can be selected from the group consisting of the structures below in LIST 5:
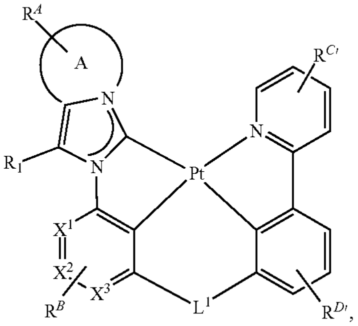
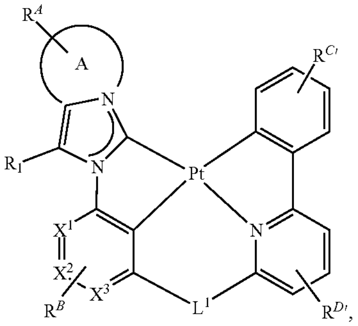
-continued
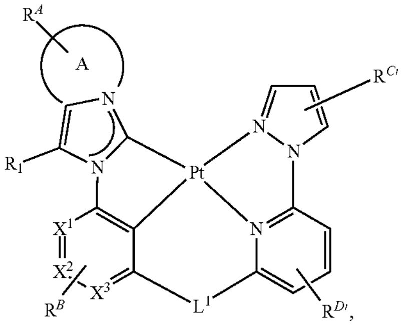
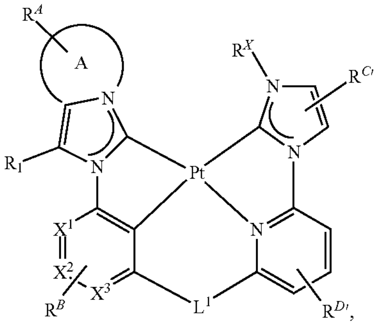
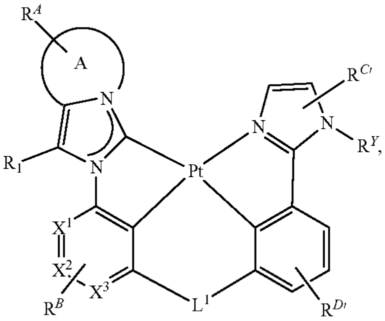
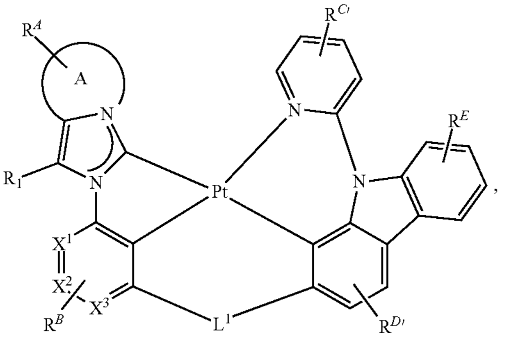
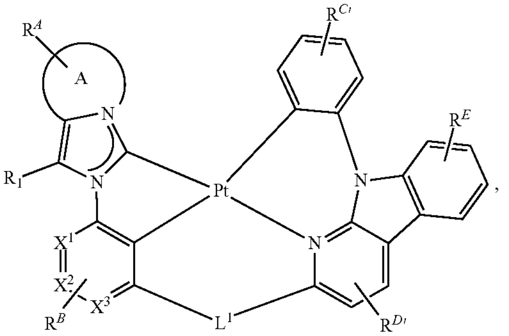

-continued
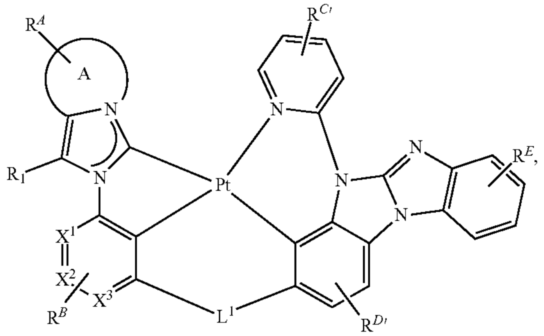
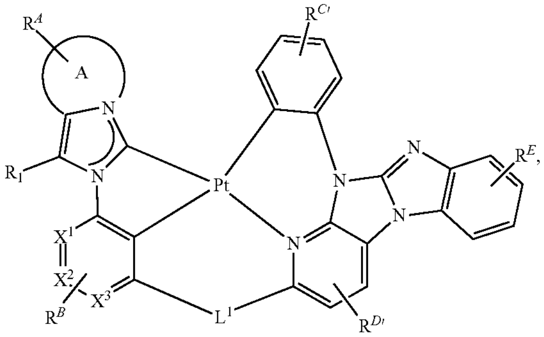
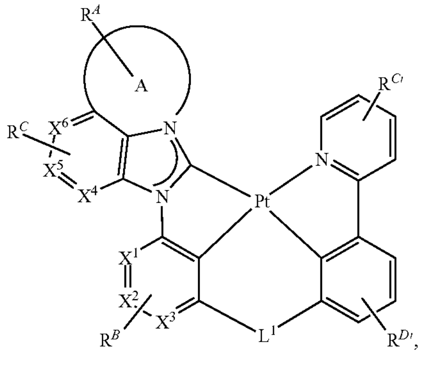
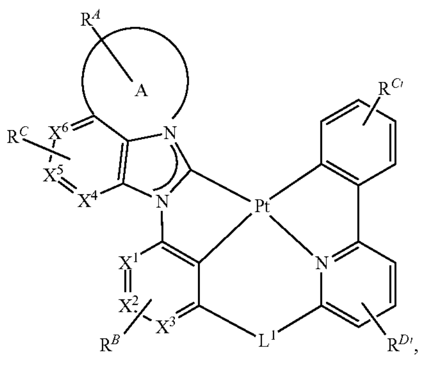
-continued
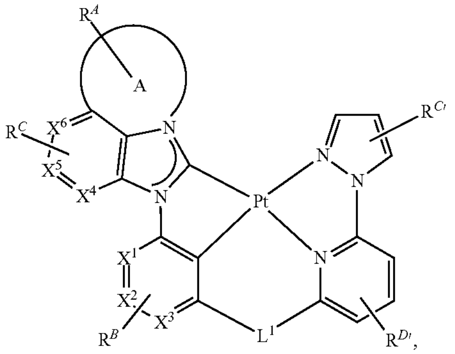
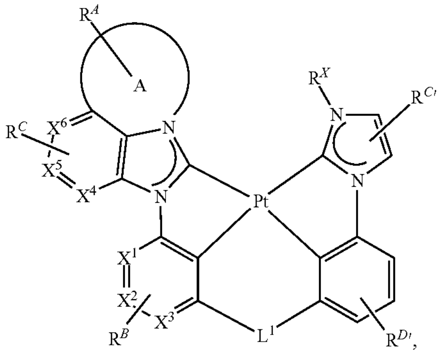
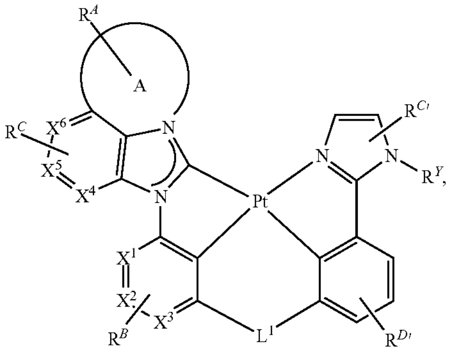
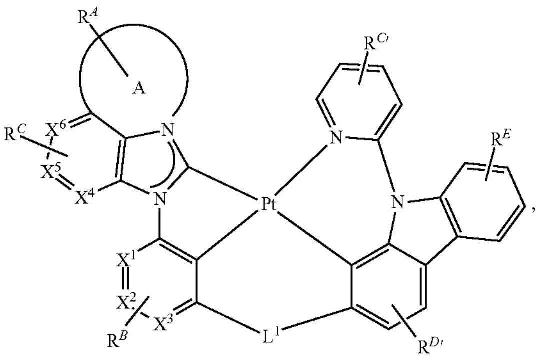

-continued

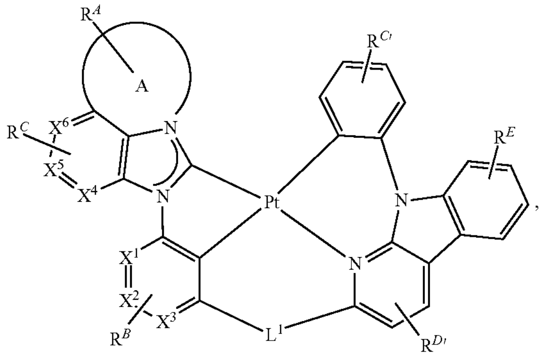

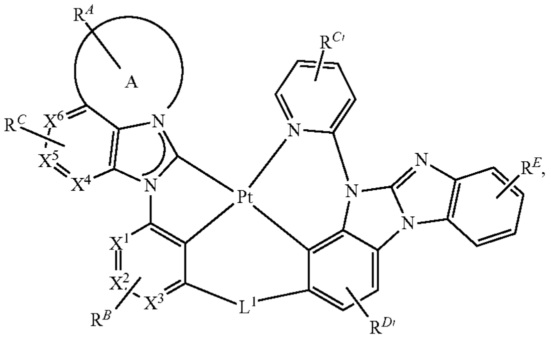

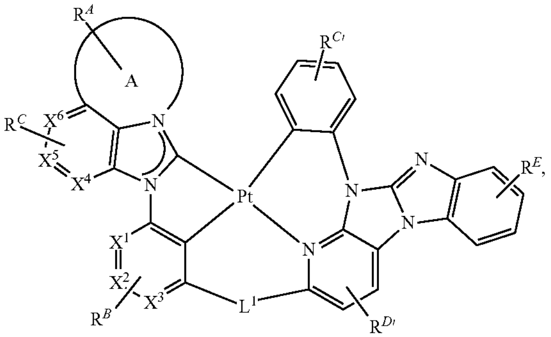

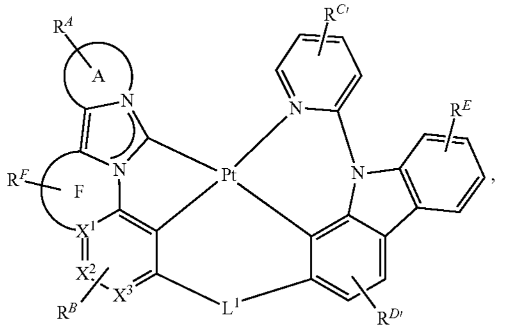

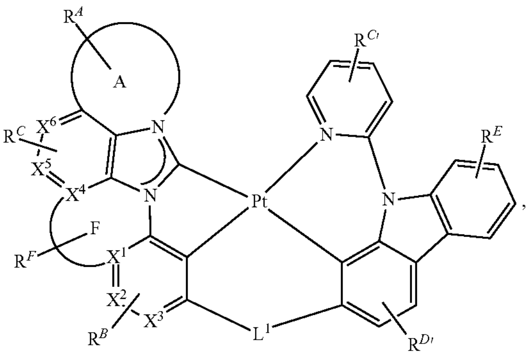

-continued

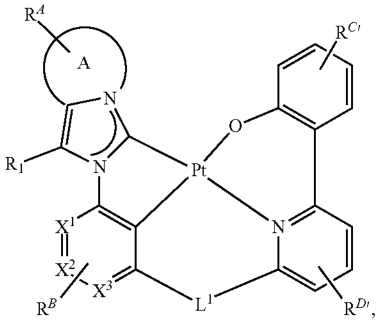

and

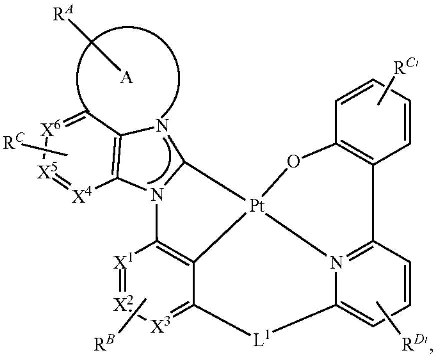

wherein: $R^x$ and $R^y$ are each selected from the group consisting of alkyl, cycloalkyl, heteroalkyl, heterocycloalkyl, aryl, heteroaryl, and combinations thereof; $R^G$ for each occurrence is independently a hydrogen or a substituent selected from the group consisting of deuterium, fluorine, alkyl, cycloalkyl, heteroalkyl, alkoxy, aryloxy, amino, silyl, boryl, alkenyl, cycloalkenyl, heteroalkenyl, aryl, heteroaryl, nitrile, isonitrile, sulfanyl, and combinations thereof; and $X^1$-$X^6$, R1, $R^A$, $R^B$, $R^{C'}$, $R^{D'}$, $R^E$, $R^F$, $L^1$, and ring A are all defined the same as above.

In some embodiments, the compound can have a structure of

Formula V

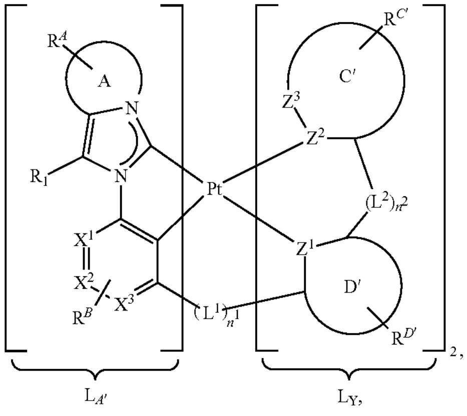

or

-continued

Formula VI

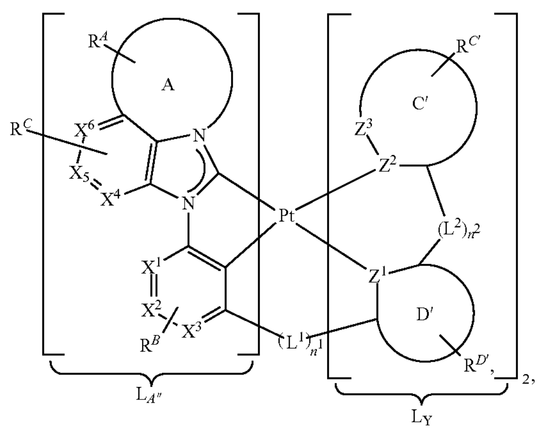

wherein $L_{A'}$ is selected from the group consisting of: $L_{A'}$1-(Rs)(Rt)(Ru), $L_{A'}$2-(Rs)(Rt)(Ru), $L_{A'}$3-(Rs)(Rt)(Ru), $L_{A'}$4-(Rs)(Rt)(Ru), $L_{A'}$5-(Rs)(Rt)(Ru), $L_{A'}$6-(Rs)(Rt)(Ru), $L_{A'}$7-(Rs)(Rt)(Ru), $L_{A'}$8-(Rs)(Rt)(Ru), $L_{A'}$9-(Rs)(Rt)(Ru), $L_{A'}$10-(Rs)(Rt)(Ru), $L_{A'}$11-(Rs)(Rt)(Ru), $L_{A'}$12-(Rs)(Rt)(Ru), $L_{A'}$13-(Rs)(Rt)(Ru), $L_{A'}$14-(Rs)(Rt)(Ru), $L_{A'}$15-(Rs)(Rt)(Ru), $L_{A'}$16-(Rs)(Rt)(Ru), $L_{A'}$ 17-(Rs)(Rt)(Ru), $L_{A'}$18-(Rs)(Rt)(Ru), $L_{A'}$19-(Rs)(Rt)(Ru) wherein s, t, and u are each independently an integer from 1 to 132; and the structure of each of $L_{A'}$1-(R1)(R1)(R1) to $L_{A'}$21-(R132)(R132)(R132) is defined in the following LIST 6:

| Ligand $L_{A'}$ | Structure of $L_{A'}$ |
|---|---|
| $L_{A'}$1-(R1)(R1)(R1) to $L_{A'}$1-(R132)(R132)(R132) having the structure | 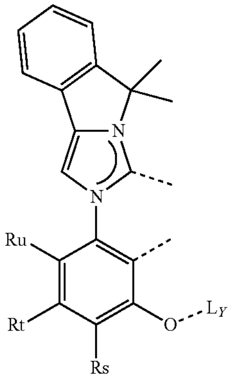 |
| $L_{A'}$2-(R1)(R1)(R1) to $L_{A'}$2-(R132)(R132)(R132) having the structure | 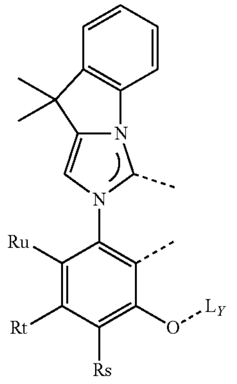 |

-continued

| Ligand $L_{A'}$ | Structure of $L_{A'}$ |
|---|---|
| $L_{A'}$3-(R1)(R1)(R1) to $L_{A'}$3-(R132)(R132)(R132) having the structure | 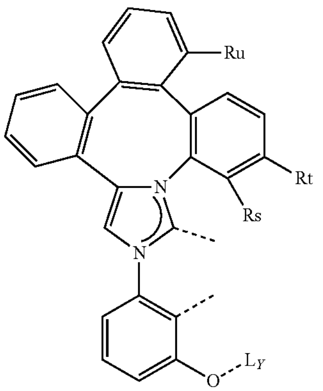 |
| $L_{A'}$4-(R1)(R1)(R1) to $L_{A'}$4-(R132)(R132)(R132) having the structure | 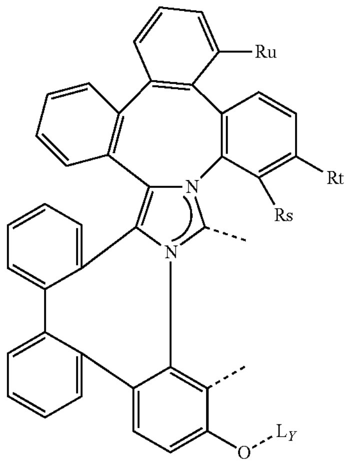 |
| $L_{A'}$5-(R1)(R1)(R1) to $L_{A'}$5-(R132)(R132)(R132) having the structure | 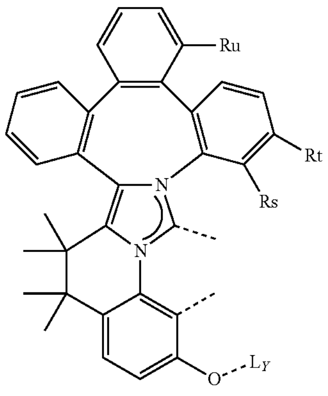 |
| $L_{A'}$6-(R1)(R1)(R1) to $L_{A'}$6-(R132)(R132)(R132) having the structure | 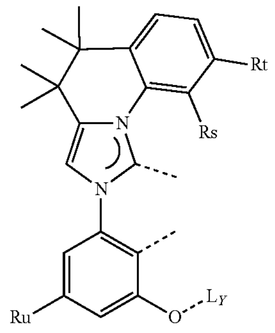 |

-continued
| Ligand $L_{A'}$ | Structure of $L_{A'}$ |
| --- | --- |
| $L_{A'}$7-(R1)(R1)(R1) to $L_{A'}$7-(R132)(R132)(R132) having the structure | 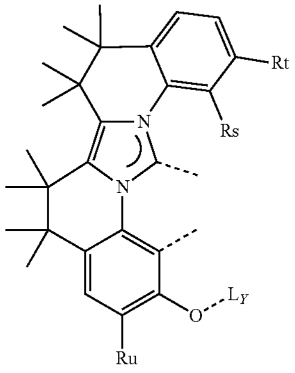 |
| $L_{A'}$8-(R1)(R1)(R1) to $L_{A'}$8-(R132)(R132)(R132) having the structure | 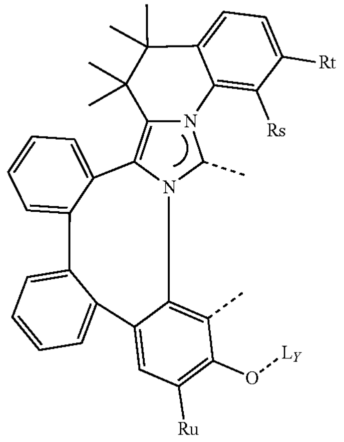 |
| $L_{A'}$9-(R1)(R1)(R1) to $L_{A'}$9-(R132)(R132)(R132) having the structure | 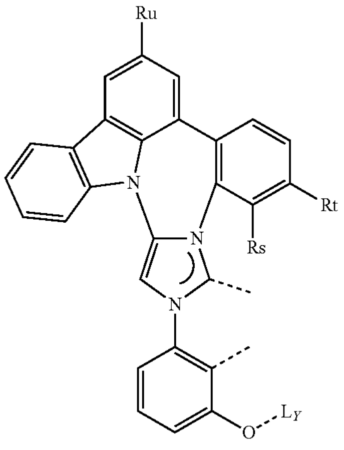 |
-continued
| Ligand $L_{A'}$ | Structure of $L_{A'}$ |
| --- | --- |
| $L_{A'}$10-(R1)(R1)(R1) to $L_{A'}$10-(R132)(R132)(R132) having the structure | 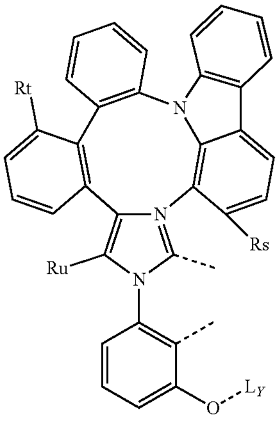 |
| $L_{A'}$11-(R1)(R1)(R1) to $L_{A'}$11-(R132)(R132)(R132) having the structure | 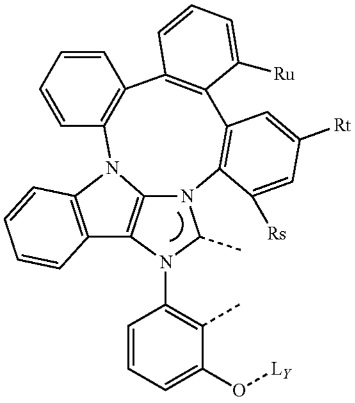 |
| $L_{A'}$12-(R1)(R1)(R1) to $L_{A'}$12-(R132)(R132)(R132) having the structure | 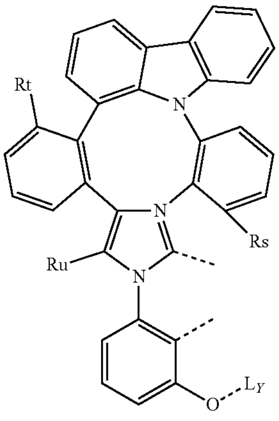 |

-continued
| Ligand $L_{A'}$ | Structure of $L_{A'}$ |
| --- | --- |
| $L_{A'}$13-(R1)(R1)(R1) to $L_{A'}$13-(R132)(R132)(R132) having the structure | 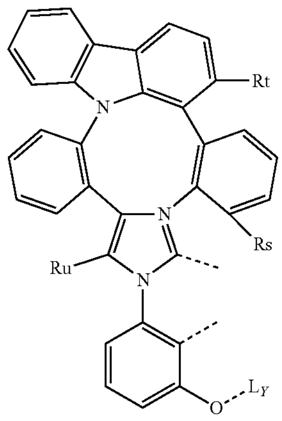 |
| $L_{A'}$14-(R1)(R1)(R1) to $L_{A'}$14-(R132)(R132)(R132) having the structure | 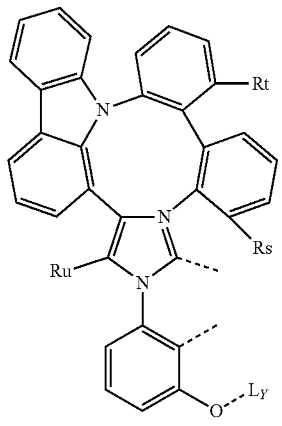 |
| $L_{A'}$15-(R1)(R1)(R1) to $L_{A'}$15-(R132)(R132)(R132) having the structure | 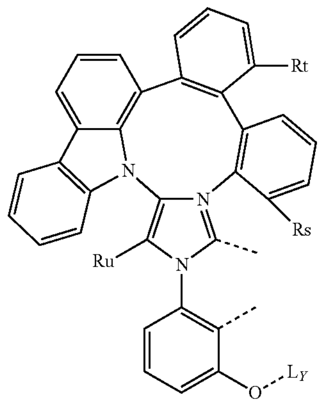 |
-continued
| Ligand $L_{A'}$ | Structure of $L_{A'}$ |
| --- | --- |
| $L_{A'}$16-(R1)(R1)(R1) to $L_{A'}$16-(R132)(R132)(R132) having the structure | 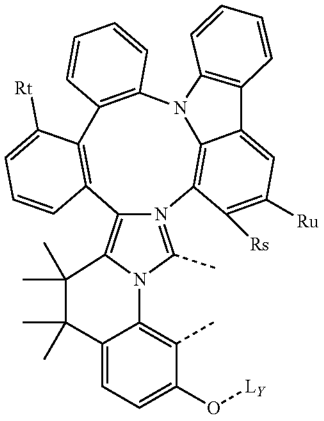 |
| $L_{A'}$17-(R1)(R1)(R1) to $L_{A'}$17-(R132)(R132)(R132) having the structure | 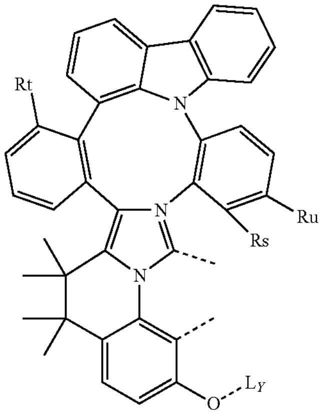 |
| $L_{A'}$18-(R1)(R1)(R1) to $L_{A'}$18-(R132)(R132)(R132) having the structure | 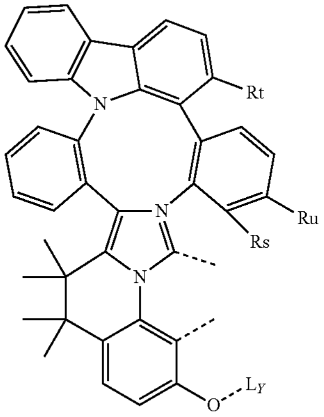 |

-continued

| Ligand $L_{A'}$ | Structure of $L_{A'}$ |
|---|---|
| $L_{A'}$19-(R1)(R1)(R1) to $L_{A'}$19-(R132)(R132)(R132) having the structure | 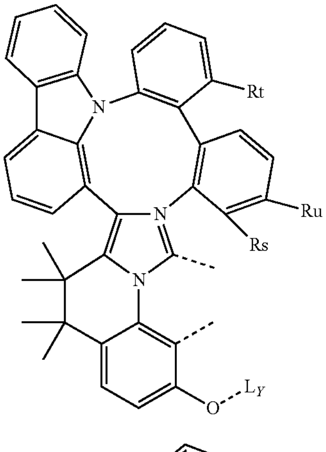 |
| $L_{A'}$20-(R1)(R1)(R1) to $L_{A'}$20-(R132)(R132)(R132) having the structure | 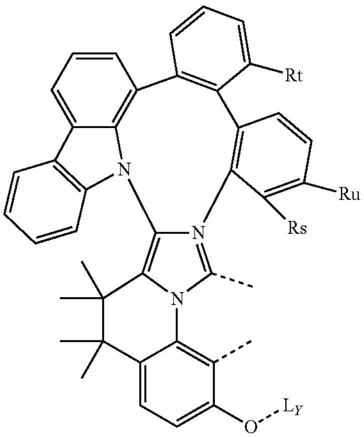 |
| $L_{A'}$21-(R1)(R1)(R1) to $L_{A'}$21-(R132)(R132)(R132) having the structure | 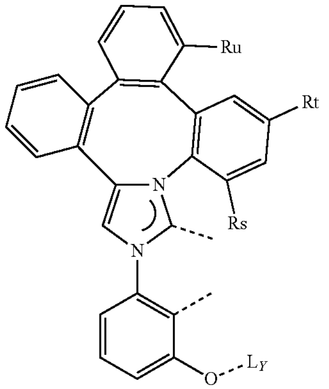 |

wherein $L_{A''}$ is selected from the group consisting of: $L_{A''}$1-(Rs)(Rt)(Ru), $L_{A''}$2-(Rs)(Rt)(Ru), $L_{A''}$3-(Rs)(Rt)(Ru), $L_{A''}$4-(Rs)(Rt)(Ru), $L_{A''}$5-(Rs)(Rt)(Ru), $L_{A''}$6-(Rs)(Rt)(Ru), $L_{A''}$7-(Rs)(Rt)(Ru), $L_{A}$-8-(Rs)(Rt)(Ru), $L_{A''}$9-(Rs)(Rt)(Ru), $L_{A''}$10-(Rs)(Rt)(Ru), $L_{A}$11-(Rs)(Rt)(Ru), $L_{A''}$12-(Rs)(Rt)(Ru), $L_{A''}$13-(Rs)(Rt)(Ru), $L_{A''}$14-(Rs)(Rt)(Ru), $L_{A''}$15-(Rs)(Rt)(Ru), $L_{A''}$16-(Rs)(Rt)(Ru), $L_{A''}$17-(Rs)(Rt)(Ru), $L_{A''}$18-(Rs)(Rt)(Ru), $L_{A''}$19-(Rs)(Rt)(Ru), $L_{A''}$20-(Rs)(Rt)(Ru), $L_{A''}$21-(Rs)(Rt)(Ru), $L_{A''}$22-(Rs)(Rt)(Ru), $L_{A''}$23-(Rs)(Rt)(Ru), $L_{A''}$24-(Rs)(Rt)(Ru), $L_{A''}$25-(Rs)(Rt)(Ru), $L_{A''}$26-(Rs)(Rt)(Ru), $L_{A''}$27-(Rs)(Rt)(Ru), $L_{A''}$28-(Rs)(Rt)(Ru), $L_{A''}$29-(Rs)(Rt)(Ru), $L_{A''}$30-(Rs)(Rt)(Ru), $L_{A}$° 31-(Rs)(Rt)(Ru), $L_{A''}$32-(Rs)(Rt)(Ru), $L_{A''}$33-(Rs)(Rt)(Ru), $L_{A''}$34-(Rs)(Rt)(Ru), $L_{A''}$35-(Rs)(Rt)(Ru), $L_{A''}$36-(Rs)(Rt)(Ru), $L_{A''}$37-(Rs)(Rt)(Ru), $L_{A''}$38-(Rs)(Rt)(Ru), $L_{A''}$39-(Rs)(Rt)(Ru), $L_{A''}$40-(Rs)(Rt)(Ru), $L_{A''}$41-(Rs)(Rt)(Ru), $L_{A''}$42-(Rs)(Rt)(Ru), $L_{A''}$43-(Rs)(Rt)(Ru), $L_{A''}$44-(Rs)(Rt)(Ru), $L_{A''}$45-(Rs)(Rt)(Ru), $L_{A''}$46-(Rs)(Rt)(Ru), $L_{A''}$47-(Rs)(Rt)(Ru), $L_{A''}$48-(Rs)(Rt)(Ru), $L_{A''}$49-(Rs)(Rt)(Ru), $L_{A''}$50-(Rs)(Rt)(Ru), $L_{A''}$51-(Rs)(Rt)(Ru), $L_{A''}$52-(Rs)(Rt)(Ru), $L_{A''}$53-(Rs)(Rt)(Ru), $L_{A''}$54-(Rs)(Rt)(Ru), $L_{A''}$55-(Rs)(Rt)(Ru), $L_{A''}$56-(Rs)(Rt)(Ru), $L_{A''}$57-(Rs)(Rt)(Ru), $L_{A''}$58-(Rs)(Rt)(Ru), $L_{A''}$59-(Rs)(Rt)(Ru), $L_{A''}$60-(Rs)(Rt)(Ru), $L_{A''}$61-(Rs)(Rt)(Ru), $L_{A''}$62-(Rs)(Rt)(Ru), $L_{A''}$63-(Rs)(Rt)(Ru), $L_{A''}$64-(Rs)(Rt)(Ru), $L_{A''}$65-(Rs)(Rt)(Ru), $L_{A''}$66-(Rs)(Rt)(Ru), $L_{A''}$67-(Rs)(Rt)(Ru), $L_{A''}$68-(Rs)(Rt)(Ru), $L_{A''}$69-(Rs)(Rt)(Ru), $L_{A''}$70-(Rs)(Rt)(Ru), $L_{A''}$71-(Rs)(Rt)(Ru), $L_{A''}$72-(Rs)(Rt)(Ru), $L_{A''}$73-(Rs)(Rt)(Ru), $L_{A''}$74-(Rs)(Rt)(Ru), $L_{A''}$75-(Rs)(Rt)(Ru), $L_{A''}$76-(Rs)(Rt)(Ru), $L_{A''}$77-(Rs)(Rt)(Ru), $L_{A''}$78-(Rs)(Rt)(Ru), $L_{A''}$79-(Rs)(Rt)(Ru), $L_{A''}$80-(Rs)(Rt)(Ru), $L_{A''}$81-(Rs)(Rt)(Ru), $L_{A''}$82-(Rs)(Rt)(Ru), $L_{A''}$83-(Rs)(Rt)(Ru), $L_{A''}$84-(Rs)(Rt)(Ru), $L_{A''}$85-(Rs)(Rt)(Ru), $L_{A''}$86-(Rs)(Rt)(Ru), $L_{A''}$87-(Rs)(Rt)(Ru), $L_{A''}$88-(Rs)(Rt)(Ru), $L_{A''}$89-(Rs)(Rt)(Ru), $L_{A''}$90-(Rs)(Rt)(Ru), $L_{A''}$91-(Rs)(Rt)(Ru), $L_{A''}$92-(Rs)(Rt)(Ru), $L_{A''}$93-(Rs)(Rt)(Ru), $L_{A''}$94-(Rs)(Rt)(Ru), $L_{A''}$95-(Rs)(Rt)(Ru), $L_{A''}$96-(Rs)(Rt)(Ru), $L_{A''}$97-(Rs)(Rt)(Ru), $L_{A''}$98-(Rs)(Rt)(Ru), $L_{A''}$99-(Rs)(Rt)(Ru), $L_{A''}$100-(Rs)(Rt)(Ru), $L_{A''}$101-(Rs)(Rt)(Ru), $L_{A''}$102-(Rs)(Rt)(Ru), $L_{A}$-103-(Rs)(Rt)(Ru), $L_{A''}$104-(Rs)(Rt)(Ru), $L_{A''}$105-(Rs)(Rt)(Ru), $L_{A''}$106-(Rs)(Rt)(Ru), $L_{A''}$107-(Rs)(Rt)(Ru), $L_{A''}$108-(Rs)(Rt)(Ru), $L_{A''}$109-(Rs)(Rt)(Ru), $L_{A''}$110-(Rs)(Rt)(Ru), $L_{A''}$111-(Rs)(Rt)(RU), $L_{A''}$112-(Rs)(Rt)(Ru), $L_{A''}$113-(Rs)(Rt)(Ru), $L_{A''}$114-(Rs)(Rt)(Ru), $L_{A''}$115-(Rs)(Rt)(Ru), $L_{A''}$116-(Rs)(Rt)(Ru), $L_{A''}$117-(Rs)(Rt)(Ru), $L_{A''}$118-(Rs)(Rt)(Ru), $L_{A''}$119-(Rs)(Rt)(Ru), $L_{A''}$120-(Rs)(Rt)(Ru), $L_{A''}$121-(Rs)(Rt)(Ru), $L_{A''}$122-(Rs)(Rt)(Ru), $L_{A''}$123-(Rs)(Rt)(Ru), $L_{A''}$124-(Rs)(Rt)(Ru), $L_{A''}$125-(Rs)(Rt)(Ru), $L_{A''}$126-(Rs)(Rt)(Ru), $L_{A''}$127-(Rs)(Rt)(Ru), $L_{A''}$128-(Rs)(Rt)(Ru), $L_{A''}$129-(Rs)(Rt)(Ru), $L_{A''}$130-(Rs)(Rt)(Ru), $L_{A''}$131-(Rs)(Rt)(Ru), $L_{A''}$132-(Rs)(Rt)(Ru), $L_{A''}$133-(Rs)(Rt)(Ru), $L_{A''}$134-(Rs)(Rt)(Ru), $L_{A''}$135-(Rs)(Rt)(Ru), $L_{A''}$136-(Rs)(Rt)(Ru), $L_{A''}$137-(Rs)(Rt)(Ru), $L_{A''}$138-(Rs)(Rt)(Ru), $L_{A''}$139-(Rs)(Rt)(Ru), $L_{A''}$140-(Rs)(Rt)(Ru), $L_{A''}$141-(Rs)(Rt)(Ru), $L_{A''}$142-(Rs)(Rt)(Ru), $L_{A''}$143-(Rs)(Rt)(Ru), $L_{A''}$144-(Rs)(Rt)(Ru), $L_{A''}$145-(Rs)(Rt)(Ru), $L_{A''}$146-(Rs)(Rt)(Ru), $L_{A''}$147-(Rs)(Rt)(Ru), $L_{A''}$148-(Rs)(Rt)(Ru), $L_{A''}$149-(Rs)(Rt)(Ru), $L_{A''}$150-(Rs)(Rt)(Ru), $L_{A''}$151-(Rs)(Rt)(Ru), $L_{A''}$152-(Rs)(Rt)(Ru), $L_{A''}$153-(Rs)(Rt)(Ru), $L_{A''}$154-(Rs)(Rt)(Ru), $L_{A''}$155-(Rs)(Rt)(Ru), $L_{A''}$156-(Rs)(Rt)(Ru), $L_{A''}$157-(Rs)(Rt)(Ru), $L_{A''}$158-(Rs)(Rt)(Ru), $L_{A''}$159-(Rs)(Rt)(Ru), $L_{A''}$160-(Rs)(Rt)(Ru), $L_{A''}$161-(Rs)(Rt)(Ru), $L_{A''}$162-(Rs)(Rt)(Ru), $L_{A''}$163-(Rs)(Rt)(Ru), $L_{A''}$164-(Rs)(Rt)(Ru), $L_{A''}$165-(Rs)(Rt)(Ru), $L_{A''}$166-(Rs)(Rt)(Ru), $L_{A''}$167-(Rs)(Rt)(Ru), $L_{A''}$168-(Rs)(Rt)(Ru), $L_{A''}$169-(Rs)(Rt)(Ru), $L_{A''}$170-(Rs)(Rt)(Ru), $L_{A''}$171-(Rs)(Rt)(Ru), $L_{A''}$172-(Rs)(Rt)(Ru), $L_{A''}$173-(Rs)(Rt)(Ru), $L_{A''}$174-(Rs)(Rt)(Ru), $L_{A''}$175-(Rs)(Rt)(Ru), $L_{A''}$176-(Rs)(Rt)(Ru), $L_{A''}$177-(Rs)(Rt)(Ru), $L_{A''}$178-(Rs)(Rt)(Ru), $L_{A''}$179-(Rs)(Rt)(Ru), $L_{A''}$180-(Rs)(Rt)(Ru), $L_{A''}$181-(Rs)(Rt)(Ru), $L_{A''}$182-(Rs)(Rt)(Ru), $L_{A''}$183-(Rs)(Rt)(Ru), $L_{A''}$184-(Rs)(Rt)(Ru), $L_{A''}$185-(Rs)(Rt)(Ru), $L_{A''}$186-(Rs)(Rt)(Ru), $L_{A''}$187-(Rs)(Rt)(Ru), $L_{A}$188-(Rs)(Rt)(Ru), $L_{A''}$189-(Rs)(Rt)(Ru), $L_{A''}$190-(Rs)(Rt)(Ru), $L_{A''}$191-(Rs)(Rt)(RU), $L_{A''}$192-(Rs)(Rt)(Ru), $L_{A}$-193-(Rs)(Rt)(Ru), $L_{A''}$194-(Rs)(Rt)(Ru), $L_{A''}$195-(Rs)(Rt)(Ru), $L_{A''}$196-(Rs)(Rt)(Ru), $L_{A''}$197-(Rs)(Rt)(Ru), $L_{A''}$198-(Rs)(Rt)(Ru), $L_{A''}$199-(Rs)(Rt)(Ru), $L_{A''}$200-(Rs)(Rt)(Ru), $L_{A''}$201-(Rs)(Rt)(Ru), $L_{A''}$202-(Rs)(Rt)(Ru), $L_{A''}$203-(Rs)(Rt)(Ru), $L_{A''}$204-(Rs)(Rt)(Ru), $L_{A''}$205-(Rs)(Rt)(Ru), $L_{A''}$206-(Rs)(Rt)(Ru), $L_{A''}$207-(Rs)(Rt)(Ru), $L_{A''}$208-(Rs)(Rt)(Ru), $L_{A''}$209-(Rs)(Rt)(Ru), $L_{A''}$210-(Rs)(Rt)(Ru), $L_{A''}$211-(Rs)

(Rt)(Ru), $L_{A''}$212-(Rs)(Rt)(Ru), $L_{A''}$213-(Rs)(Rt)(Ru), $L_{A''}$214-(Rs)(Rt)(Ru), $L_{A''}$215-(Rs)(Rt)(Ru), $L_{A''}$216-(Rs)(Rt)(Ru), $L_{A''}$217-(Rs)(Rt)(Ru), $L_{A''}$218-(Rs)(Rt)(Ru), $L_{A''}$219-(Rs)(Rt)(Ru), $L_{A''}$220-(Rs)(Rt)(Ru), $L_{A''}$221-(Rs)(Rt)(Ru), $L_{A''}$222-(Rs)(Rt)(Ru), $L_{A''}$223-(Rs)(Rt)(Ru), $L_{A''}$224-(Rs)(Rt)(Ru), $L_{A''}$225-(Rs)(Rt)(Ru), $L_{A''}$226-(Rs)(Rt)(Ru), $L_{A''}$227-(Rs)(Rt)(Ru), $L_{A''}$228-(Rs)(Rt)(Ru), $L_{A''}$229-(Rs)(Rt)(Ru), $L_{A''}$230-(Rs)(Rt)(Ru), $L_{A''}$231-(Rs)(Rt)(Ru), $L_{A''}$232-(Rs)(Rt)(Ru), $L_{A''}$-233-(Rs)(Rt)(Ru), $L_{A''}$234-(Rs)(Rt)(Ru), $L_{A''}$235-(Rs)(Rt)(Ru), $L_{A''}$236-(Rs)(Rt)(Ru), $L_{A''}$237-(Rs)(Rt)(Ru), $L_{A''}$238-(Rs)(Rt)(Ru), $L_{A''}$239-(Rs)(Rt)(Ru), $L_{A''}$240-(Rs)(Rt)(Ru), $L_{A''}$241-(Rs)(Rt)(Ru), $L_{A''}$242-(Rs)(Rt)(Ru), $L_{A''}$243-(Rs)(Rt)(Ru), $L_{A''}$244-(Rs)(Rt)(Ru), $L_{A''}$245-(Rs)(Rt)(Ru), $L_{A''}$246-(Rs)(Rt)(Ru), $L_{A''}$247-(Rs)(Rt)(Ru), $L_{A''}$248-(Rs)(Rt)(Ru), $L_{A''}$249-(Rs)(Rt)(Ru), $L_{A''}$250-(Rs)(Rt)(Ru), $L_{A''}$251-(Rs)(Rt)(Ru), $L_{A''}$252-(Rs)(Rt)(Ru), $L_{A''}$253-(Rs)(Rt)(Ru), $L_{A''}$254-(Rs)(Rt)(Ru), $L_{A''}$255-(Rs)(Rt)(Ru), $L_{A''}$256-(Rs)(Rt)(Ru), $L_{A''}$257-(Rs)(Rt)(Ru), $L_{A''}$258-(Rs)(Rt)(Ru), and $L_{A''}$259-(Rs)(Rt)(Ru), wherein s, t, and u are each independently an integer from 1 to 132, and the structure of each of $L_{A''}$1-(R1)(R1)(R1) to $L_{A''}$262-(R132)(R132)(R132) is defined in the following LIST 7:

| Ligand $L_{A''}$ | Structure of $L_{A''}$ |
|---|---|
| $L_{A''}$1-(R1)(R1)(R1) to $L_{A''}$1-(R132)(R132)(R132) having the structure | 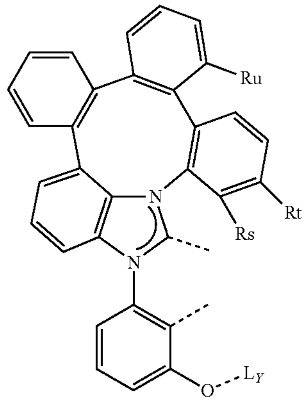 |
| $L_{A''}$2-(R1)(R1)(R1) to $L_{A''}$2-(R132)(R132)(R132) having the structure | 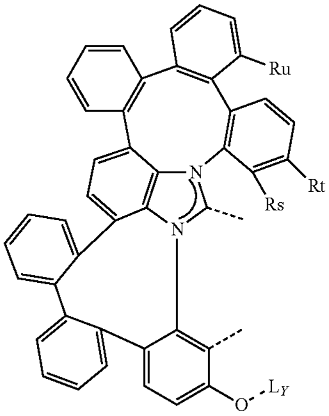 |

-continued

| Ligand $L_{A''}$ | Structure of $L_{A''}$ |
|---|---|
| $L_{A''}$3-(R1)(R1)(R1) to $L_{A''}$3-(R132)(R132)(R132) having the structure | 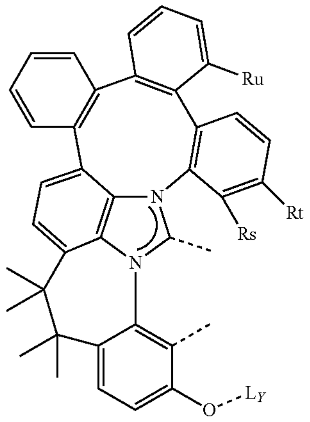 |
| $L_{A''}$4-(R1)(R1)(R1) to $L_{A''}$4-(R132)(R132)(R132) having the structure | 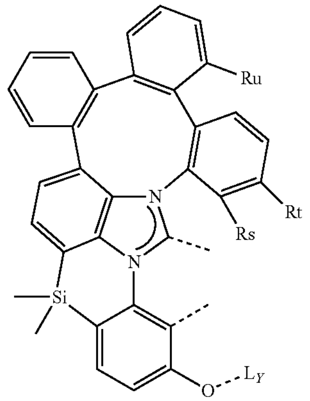 |
| $L_{A''}$5-(R1)(R1)(R1) to $L_{A''}$5-(R132)(R132)(R132) having the structure | 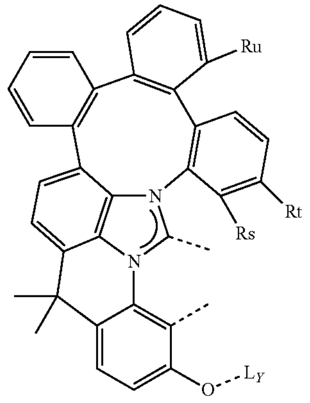 |
| $L_{A''}$6-(R1)(R1)(R1) to $L_{A''}$6-(R132)(R132)(R132) having the structure | 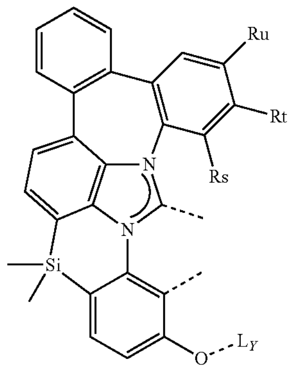 |

-continued

| Ligand $L_{A''}$ | Structure of $L_{A''}$ |
| --- | --- |
| $L_{A''}$7-(R1)(R1)(R1) to $L_{A''}$7-(R132)(R132)(R132) having the structure | 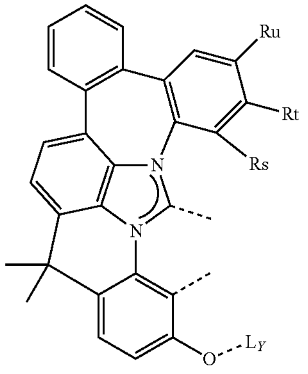 |
| $L_{A''}$8-(R1)(R1)(R1) to $L_{A''}$8-(R132)(R132)(R132) having the structure | 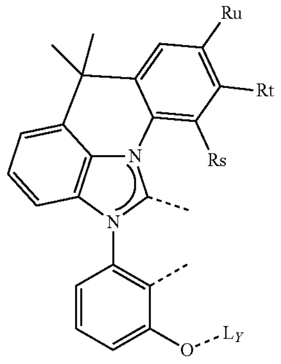 |
| $L_{A''}$9-(R1)(R1)(R1) to $L_{A''}$9-(R132)(R132)(R132) having the structure | 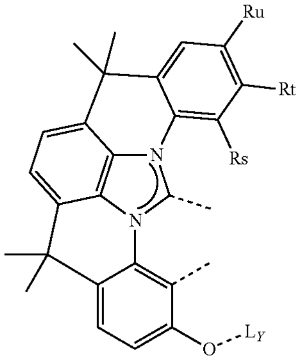 |
| $L_{A''}$10-(R1)(R1)(R1) to $L_{A''}$10-(R132)(R132)(R132) having the structure | 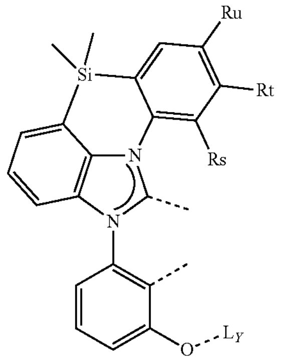 |

-continued

| Ligand $L_{A''}$ | Structure of $L_{A''}$ |
| --- | --- |
| $L_{A''}$11-(R1)(R1)(R1) to $L_{A''}$11-(R132)(R132)(R132) having the structure | 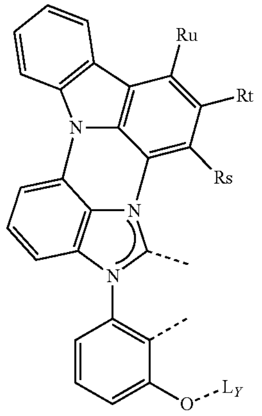 |
| $L_{A''}$12-(R1)(R1)(R1) to $L_{A''}$12-(R132)(R132)(R132) having the structure | 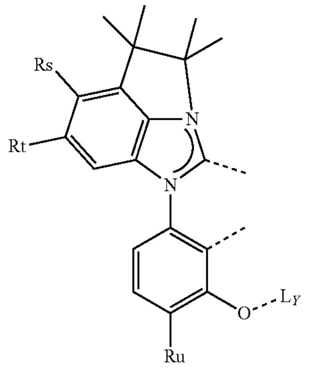 |
| $L_{A''}$13-(R1)(R1)(R1) to $L_{A''}$13-(R132)(R132)(R132) having the structure | 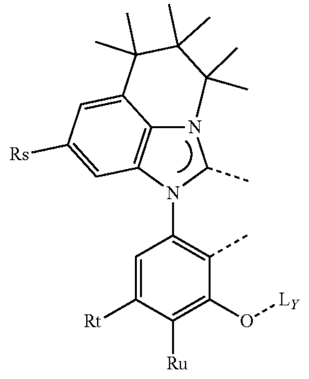 |
| $L_{A''}$14-(R1)(R1)(R1) to $L_{A''}$14-( R132)(R132)(R132) having the structure | 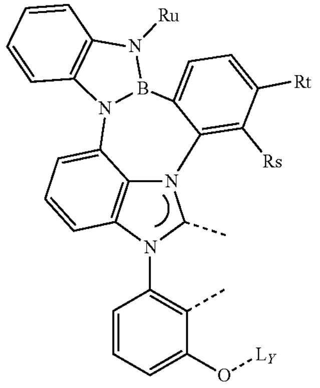 |

-continued

| Ligand $L_{A''}$ | Structure of $L_{A''}$ |
|---|---|
| $L_{A''}$15-(R1)(R1)(R1) to $L_{A''}$15-(R132)(R132)(R132) having the structure | 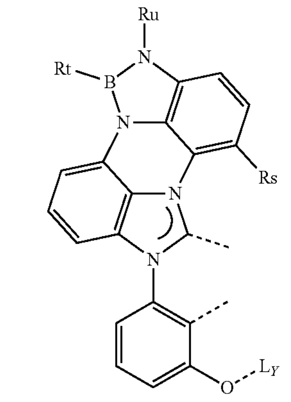 |
| $L_{A''}$16-(R1)(R1)(R1) to $L_{A''}$16-(R132)(R132)(R132) having the structure | 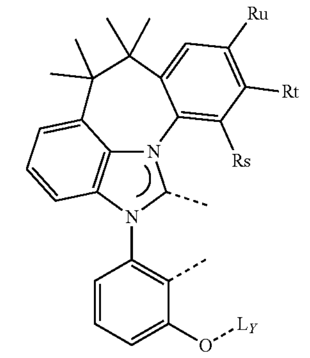 |
| $L_{A''}$17-(R1)(R1)(R1) to $L_{A''}$17-(R132)(R132)(R132) having the structure | 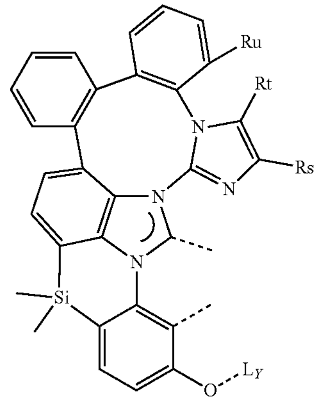 |
| $L_{A''}$18-(R1)(R1)(R1) to $L_{A''}$18-(R132)(R132)(R132) having the structure | 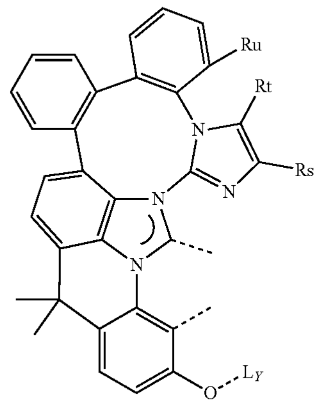 |

-continued

| Ligand $L_{A''}$ | Structure of $L_{A''}$ |
|---|---|
| $L_{A''}$19-(R1)(R1)(R1) to $L_{A''}$19-(R132)(R132)(R132) having the structure | 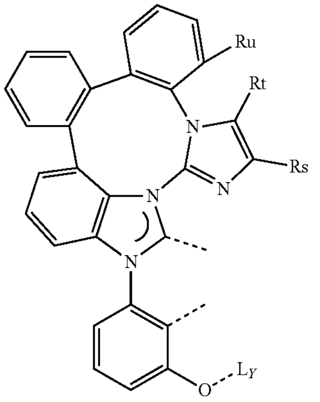 |
| $L_{A''}$20-(R1)(R1)(R1) to $L_{A''}$20-(R132)(R132)(R132) having the structure | 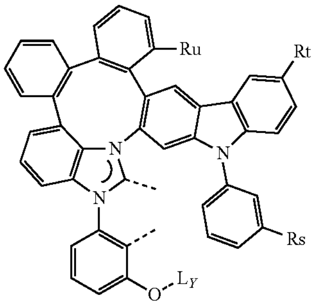 |
| $L_{A''}$21-(R1)(R1)(R1) to $L_{A''}$21-(R132)(R132)(R132) having the structure | 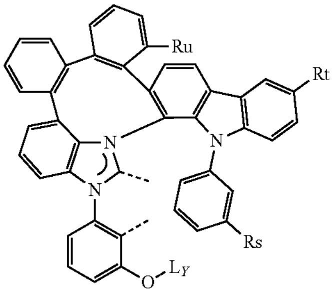 |
| $L_{A''}$22-(R1)(R1)(R1) to $L_{A''}$22-(R132)(R132)(R132) having the structure | 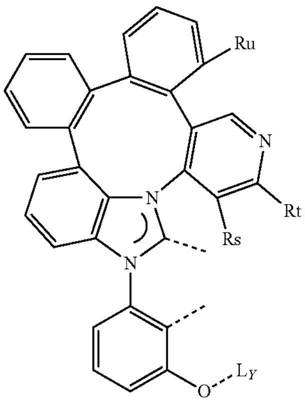 |

-continued

| Ligand $L_{A''}$ | Structure of $L_{A''}$ |
| --- | --- |
| $L_{A''}$23-(R1)(R1)(R1) to $L_{A''}$23-(R132)(R132)(R132) having the structure | 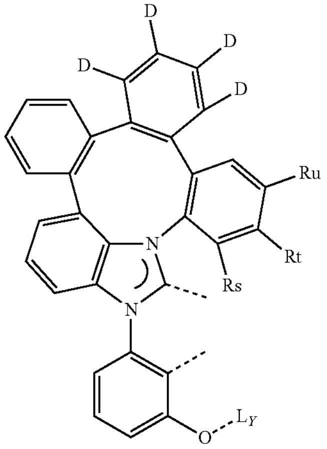 |
| $L_{A''}$24-(R1)(R1)(R1) to $L_{A''}$24-(R132)(R132)(R132) having the structure | 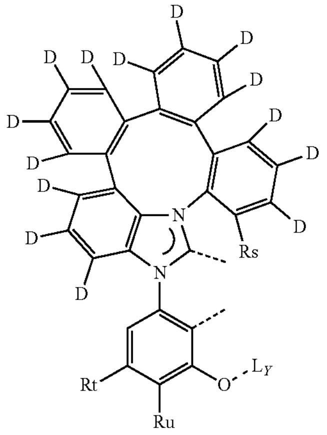 |
| $L_{A''}$25-(R1)(R1)(R1) to $L_{A''}$25-(R132)(R132)(R132) having the structure | 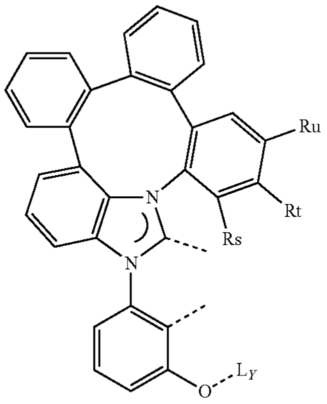 |

-continued

| Ligand $L_{A''}$ | Structure of $L_{A''}$ |
| --- | --- |
| $L_{A''}$26-(R1)(R1)(R1) to $L_{A''}$26-(R132)(R132)(R132) having the structure | 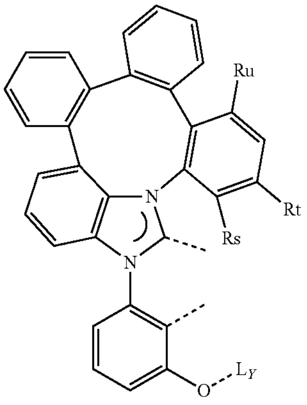 |
| $L_{A''}$27-(R1)(R1)(R1) to $L_{A''}$27-(R132)(R132)(R132) having the structure | 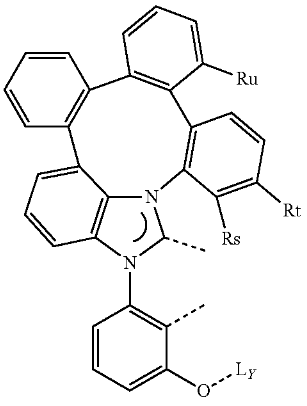 |
| $L_{A''}$28-(R1)(R1)(R1) to $L_{A''}$28-(R132)(R132)(R132) having the structure | 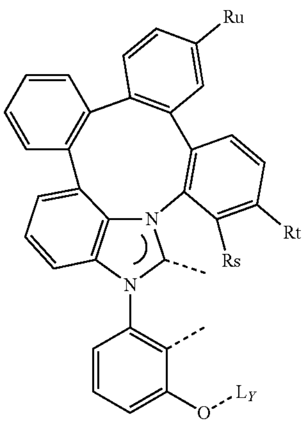 |

| Ligand $L_{A''}$ | Structure of $L_{A''}$ |
|---|---|
| $L_{A''}$29-(R1)(R1)(R1) to $L_{A''}$29-(R132)(R132)(R132) having the structure | 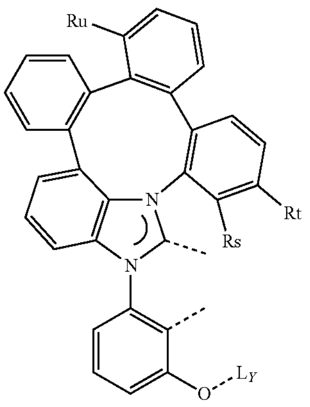 |
| $L_{A''}$30-(R1)(R1)(R1) to $L_{A''}$30-(R132)(R132)(R132) having the structure | 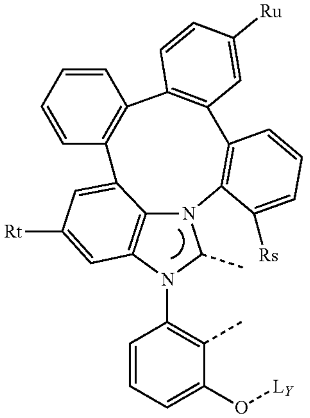 |
| $L_{A''}$31-(R1)(R1)(R1) to $L_{A''}$31-(R132)(R132)(R132) having the structure | 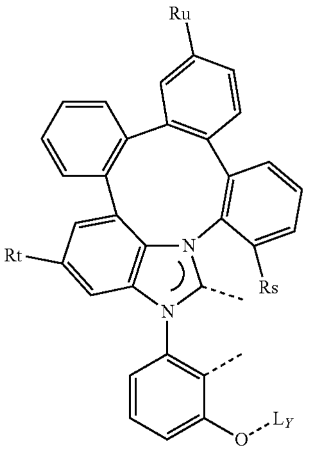 |
| Ligand $L_{A''}$ | Structure of $L_{A''}$ |
|---|---|
| $L_{A''}$32-(R1)(R1)(R1) to $L_{A''}$32-(R132)(R132)(R132) having the structure | 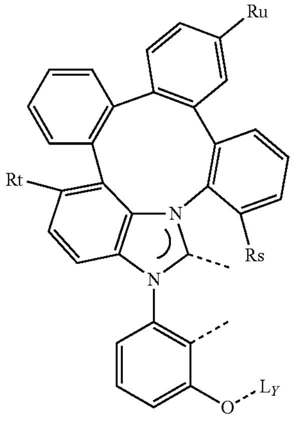 |
| $L_{A''}$33-(R1)(R1)(R1) to $L_{A''}$33-(R132)(R132)(R132) having the structure | 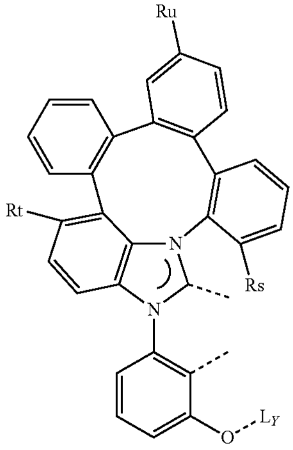 |
| $L_{A''}$34-(R1)(R1)(R1) to $L_{A''}$34-(R132)(R132)(R132) having the structure | 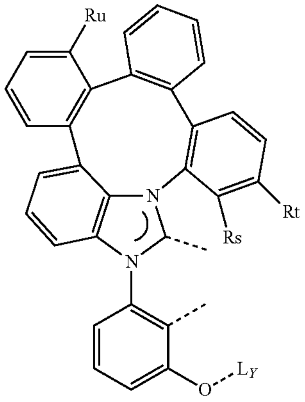 |

-continued

| Ligand $L_{A''}$ | Structure of $L_{A''}$ |
| --- | --- |
| $L_{A''}$35-(R1)(R1)(R1) to $L_{A''}$35-(R132)(R132)(R132) having the structure | 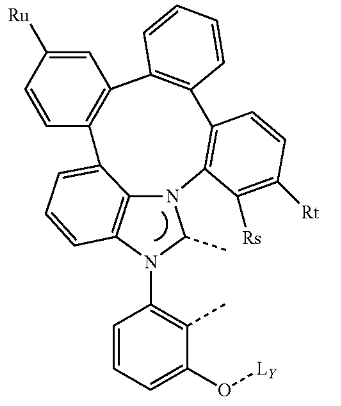 |
| $L_{A''}$36-(R1)(R1)(R1) to $L_{A''}$36-(R132)(R132)(R132) having the structure | 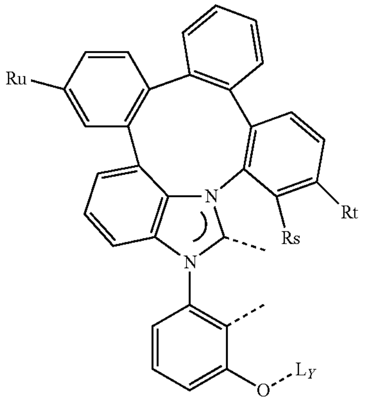 |
| $L_{A''}$37-(R1)(R1)(R1) to $L_{A''}$37-(R132)(R132)(R132) having the structure | 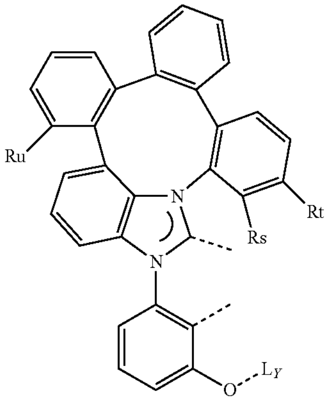 |

-continued

| Ligand $L_{A''}$ | Structure of $L_{A''}$ |
| --- | --- |
| $L_{A''}$38-(R1)(R1)(R1) to $L_{A''}$38-(R132)(R132)(R132) having the structure | 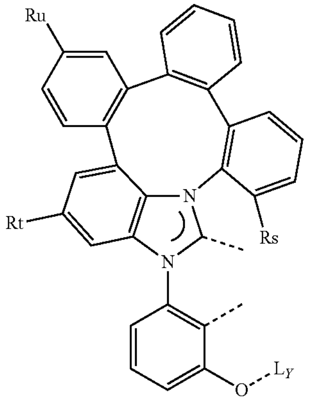 |
| $L_{A''}$39-(R1)(R1)(R1) to $L_{A''}$39-(R132)(R132)(R132) having the structure | 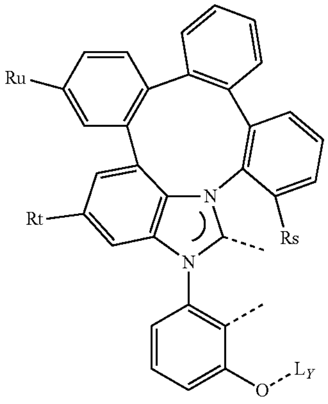 |
| $L_{A''}$40-(R1)(R1)(R1) to $L_{A''}$40-(R132)(R132)(R132) having the structure | 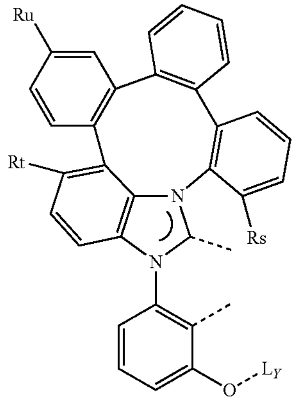 |
| $L_{A''}$41-(R1)(R1)(R1) to $L_{A''}$41-(R132)(R132)(R132) having the structure | 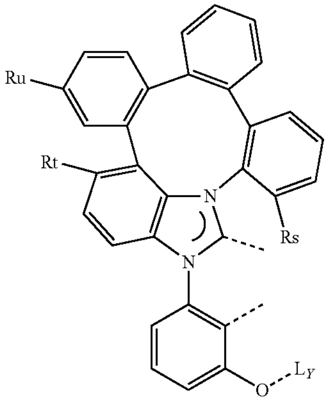 |

-continued

| Ligand $L_{A''}$ | Structure of $L_{A''}$ |
|---|---|
| $L_{A''}$42-(R1)(R1)(R1) to $L_{A''}$42-(R132)(R132)(R132) having the structure | 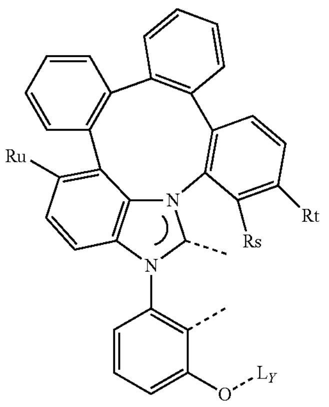 |
| $L_{A''}$43-(R1)(R1)(R1) to $L_{A''}$43-(R132)(R132)(R132) having the structure | 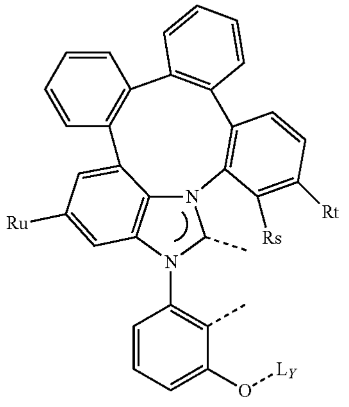 |
| $L_{A''}$44-(R1)(R1)(R1) to $L_{A''}$44-(R132)(R132)(R132) having the structure | 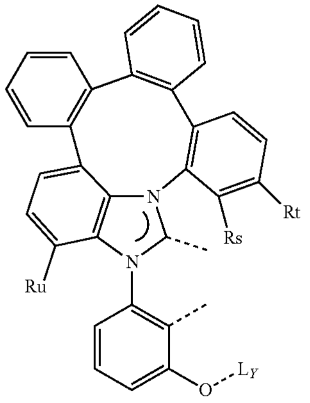 |
| $L_{A''}$45-(R1)(R1)(R1) to $L_{A''}$45-(R132)(R132)(R132) having the structure | 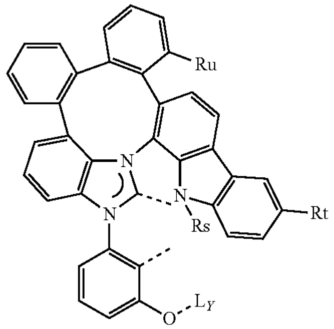 |

-continued

| Ligand $L_{A''}$ | Structure of $L_{A''}$ |
|---|---|
| $L_{A''}$46-(R1)(R1)(R1) to $L_{A''}$46-(R132)(R132)(R132) having the structure | 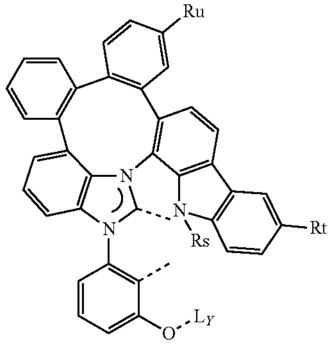 |
| $L_{A''}$47-(R1)(R1)(R1) to $L_{A''}$47-(R132)(R132)(R132) having the structure | 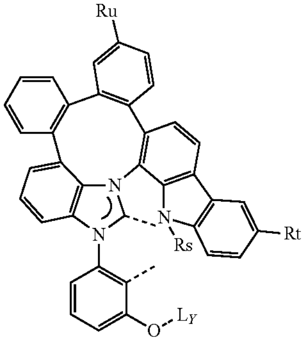 |
| $L_{A''}$48-(R1)(R1)(R1) to $L_{A''}$48-(R132)(R132)(R132) having the structure | 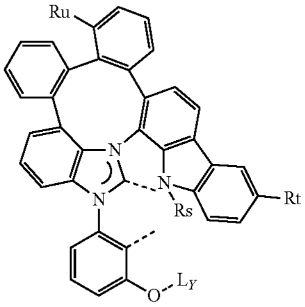 |
| $L_{A''}$49-(R1)(R1)(R1) to $L_{A''}$49-(R132)(R132)(R132) having the structure | 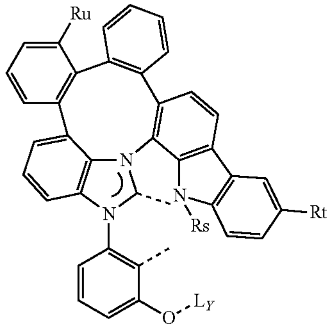 |

| Ligand $L_{A''}$ | Structure of $L_{A''}$ |
|---|---|
| $L_{A''}$50-(R1)(R1)(R1) to $L_{A''}$50-(R132)(R132)(R132) having the structure | 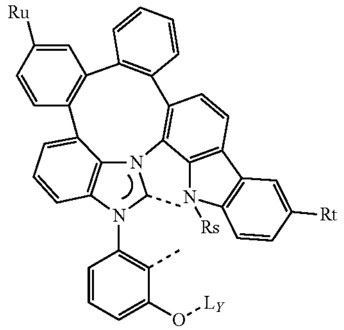 |
| $L_{A''}$51-(R1)(R1)(R1) to $L_{A''}$51-(R132)(R132)(R132) having the structure | 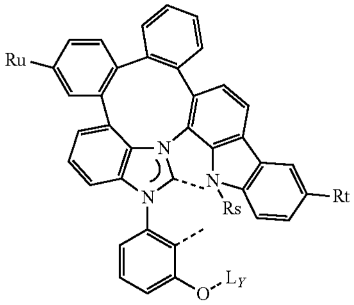 |
| $L_{A''}$52-(R1)(R1)(R1) to $L_{A''}$52-(R132)(R132)(R132) having the structure | 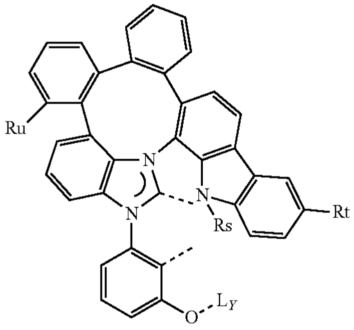 |
| $L_{A''}$53-(R1)(R1)(R1) to $L_{A''}$53-(R132)(R132)(R132) having the structure | 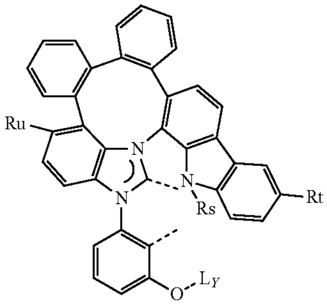 |
| $L_{A''}$54-(R1)(R1)(R1) to $L_{A''}$54-(R132)(R132)(R132) having the structure | 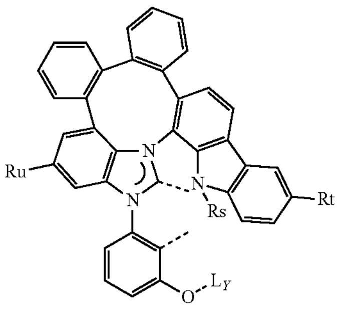 |

| Ligand $L_{A''}$ | Structure of $L_{A''}$ |
|---|---|
| $L_{A''}$55-(R1)(R1)(R1) to $L_{A''}$55-(R132)(R132)(R132) having the structure | 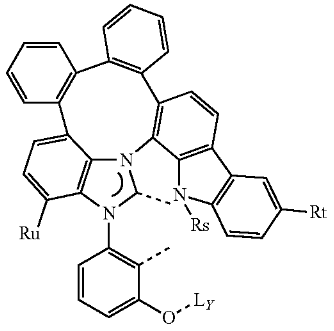 |
| $L_{A''}$56-(R1)(R1)(R1) to $L_{A''}$56-(R132)(R132)(R132) having the structure | 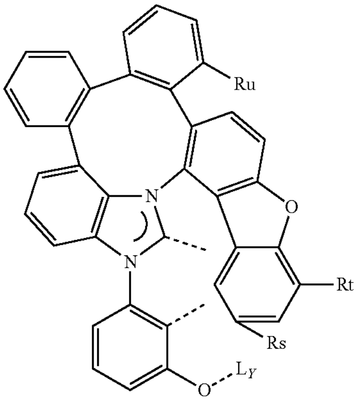 |
| $L_{A''}$57-(R1)(R1)(R1) to $L_{A''}$57-(R132)(R132)(R132) having the structure | 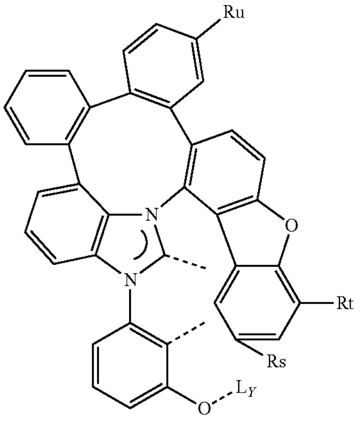 |

-continued

| Ligand $L_{A''}$ | Structure of $L_{A''}$ |
|---|---|
| $L_{A''}$58-(R1)(R1)(R1) to $L_{A''}$58-(R132)(R132)(R132) having the structure | 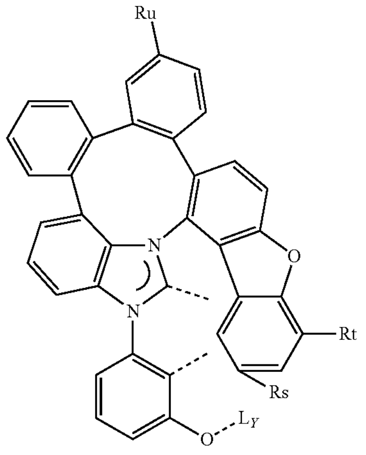 |
| $L_{A''}$59-(R1)(R1)(R1) to $L_{A''}$59-(R132)(R132)(R132) having the structure | 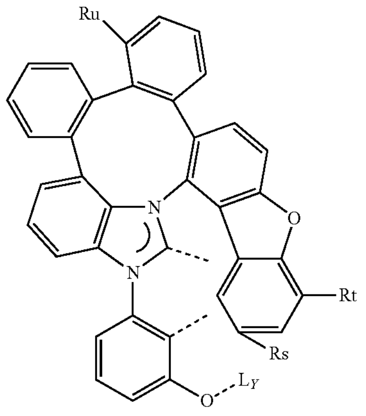 |
| $L_{A''}$60-(R1)(R1)(R1) to $L_{A''}$60-(R132)(R132)(R132) having the structure | 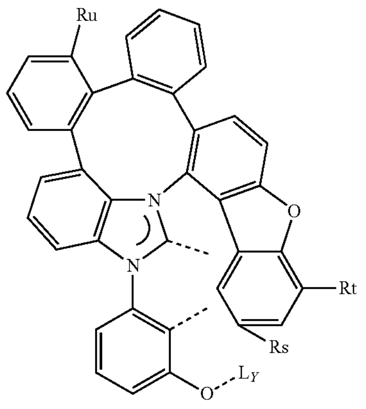 |
| $L_{A''}$61-(R1)(R1)(R1) to $L_{A''}$61-(R132)(R132)(R132) having the structure | 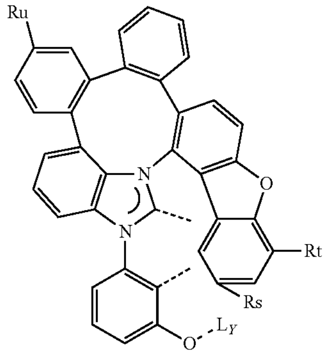 |
| $L_{A''}$62-(R1)(R1)(R1) to $L_{A''}$62-(R132)(R132)(R132) having the structure | 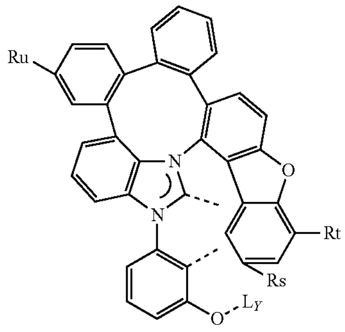 |
| $L_{A''}$63-(R1)(R1)(R1) to $L_{A''}$63-(R132)(R132)(R132) having the structure | 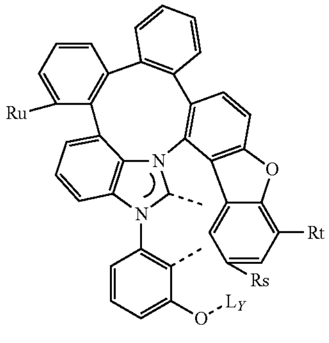 |
| $L_{A''}$64-(R1)(R1)(R1) to $L_{A''}$64-(R132)(R132)(R132) having the structure | 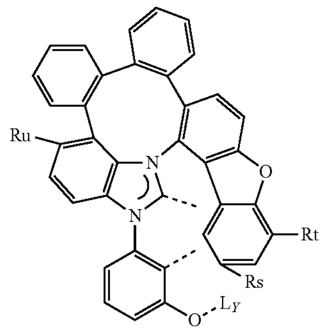 |

| Ligand $L_{A''}$ | Structure of $L_{A''}$ |
|---|---|
| $L_{A''}$65-(R1)(R1)(R1) to $L_{A''}$65-(R132)(R132)(R132) having the structure | 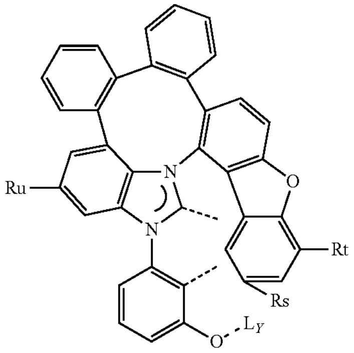 |
| $L_{A''}$66-(R1)(R1)(R1) to $L_{A''}$66-(R132)(R132)(R132) having the structure | 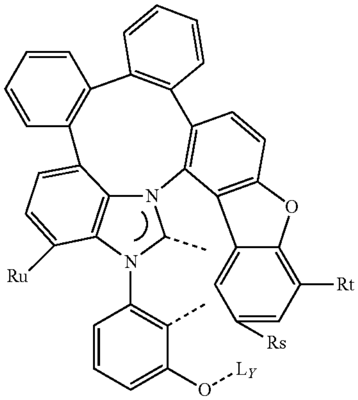 |
| $L_{A''}$67-(R1)(R1)(R1) to $L_{A''}$67-(R132)(R132)(R132) having the structure | 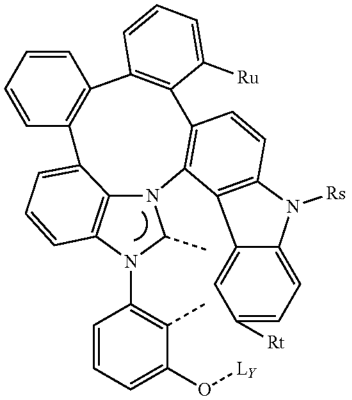 |
| $L_{A''}$68-(R1)(R1)(R1) to $L_{A''}$68-(R132)(R132)(R132) having the structure | 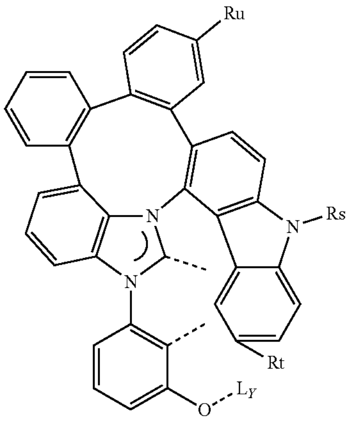 |

| Ligand $L_{A''}$ | Structure of $L_{A''}$ |
|---|---|
| $L_{A''}$69-(R1)(R1)(R1) to $L_{A''}$69-(R132)(R132)(R132) having the structure | 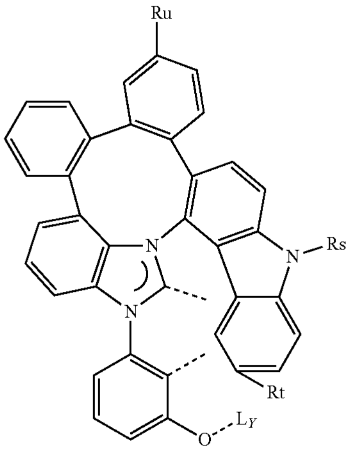 |
| $L_{A''}$70-(R1)(R1)(R1) to $L_{A''}$70-(R132)(R132)(R132) having the structure | 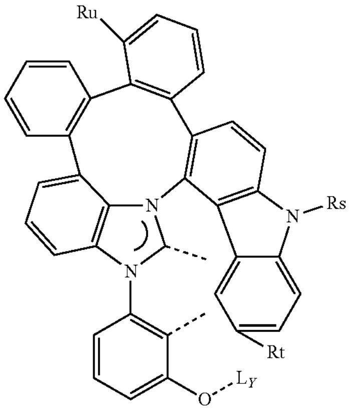 |
| $L_{A''}$71-(R1)(R1)(R1) to $L_{A''}$71-(R132)(R132)(R132) having the structure | 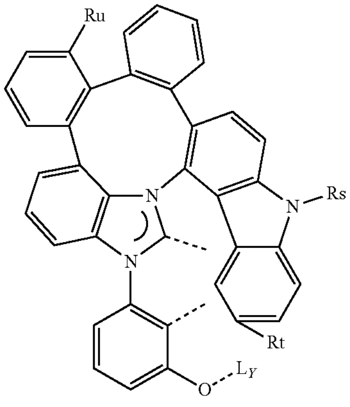 |

-continued

| Ligand $L_{A''}$ | Structure of $L_{A''}$ |
| --- | --- |
| $L_{A''}$72-(R1)(R1)(R1) to $L_{A''}$72-(R132)(R132)(R132) having the structure | 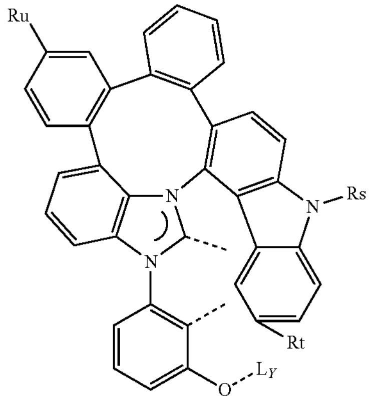 |
| $L_{A''}$73-(R1)(R1)(R1) to $L_{A''}$73-(R132)(R132)(R132) having the structure | 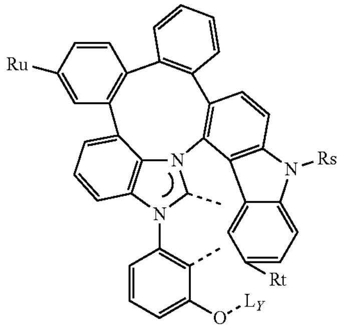 |
| $L_{A''}$74-(R1)(R1)(R1) to $L_{A''}$74-(R132)(R132)(R132) having the structure | 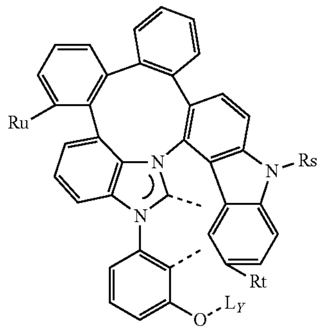 |
| $L_{A''}$75-(R1)(R1)(R1) to $L_{A''}$75-(R132)(R132)(R132) having the structure | 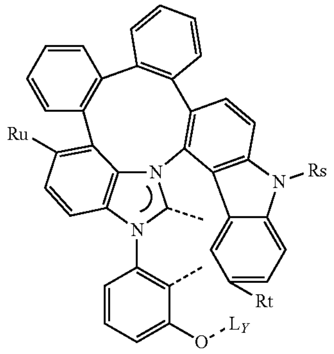 |
| $L_{A''}$76-(R1)(R1)(R1) to $L_{A''}$76-(R132)(R132)(R132) having the structure | 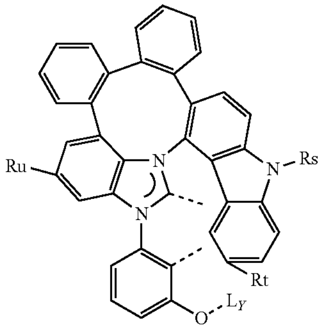 |
| $L_{A''}$77-(R1)(R1)(R1) to $L_{A''}$77-(R132)(R132)(R132) having the structure | 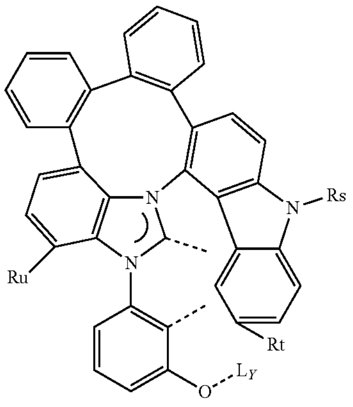 |
| $L_{A''}$78-(R1)(R1)(R1) to $L_{A''}$78-(R132)(R132)(R132) having the structure | 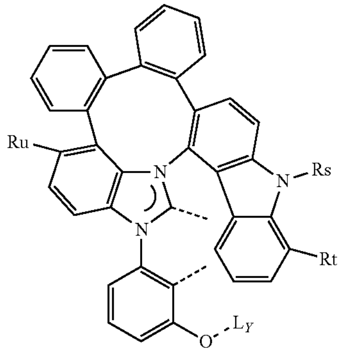 |
| $L_{A''}$79-(R1)(R1)(R1) to $L_{A''}$79-(R132)(R132)(R132) having the structure | 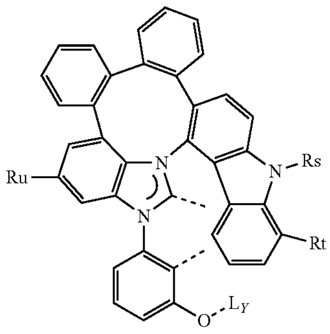 |

-continued
| Ligand $L_{A''}$ | Structure of $L_{A''}$ |
|---|---|
| $L_{A''}$80-(R1)(R1)(R1) to $L_{A''}$80-(R132)(R132)(R132) having the structure | 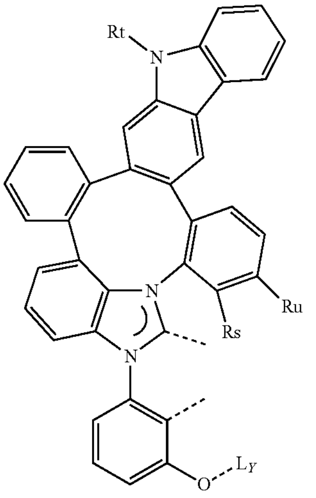 |
| $L_{A''}$81-(R1)(R1)(R1) to $L_{A''}$81-(R132)(R132)(R132) having the structure | 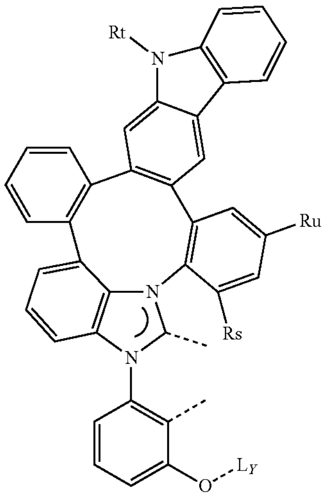 |
| $L_{A''}$82-(R1)(R1)(R1) to $L_{A''}$82-(R132)(R132)(R132) having the structure | 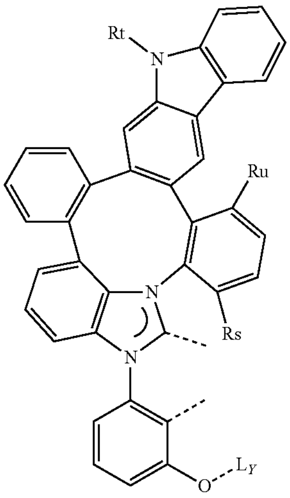 |
| $L_{A''}$83-(R1)(R1)(R1) to $L_{A''}$83-(R132)(R132)(R132) having the structure | 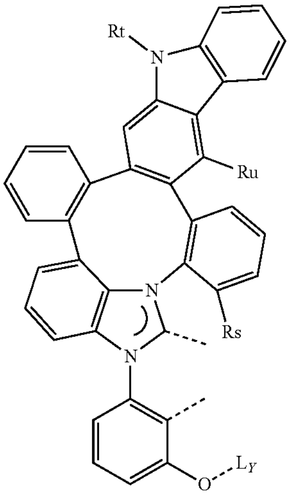 |
| $L_{A''}$84-(R1)(R1)(R1) to $L_{A''}$84-(R132)(R132)(R132) having the structure | 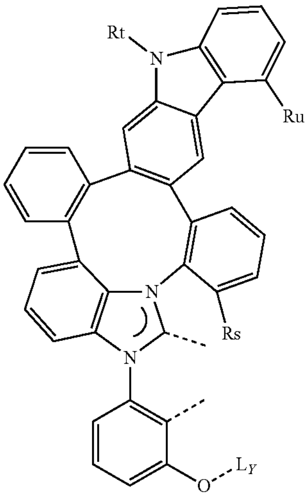 |
| $L_{A''}$85-(R1)(R1)(R1) to $L_{A''}$85-(R132)(R132)(R132) having the structure | 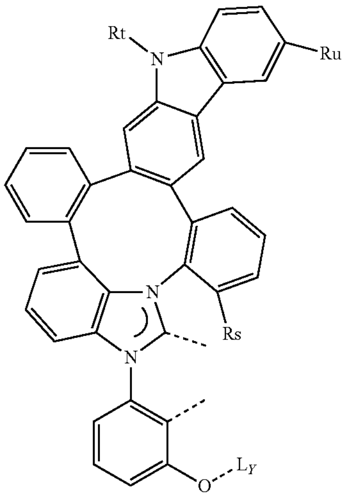 |

-continued

| Ligand $L_{A''}$ | Structure of $L_{A''}$ |
|---|---|
| $L_{A''}$86-(R1)(R1)(R1) to $L_{A''}$86-(R132)(R132)(R132) having the structure | 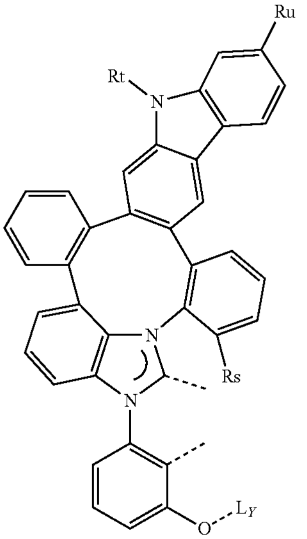 |
| $L_{A''}$87-(R1)(R1)(R1) to $L_{A''}$87-(R132)(R132)(R132) having the structure | 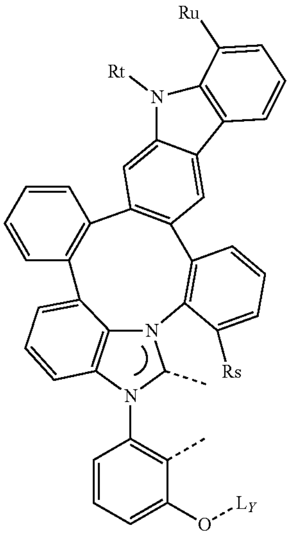 |
| $L_{A''}$88-(R1)(R1)(R1) to $L_{A''}$88-(R132)(R132)(R132) having the structure | 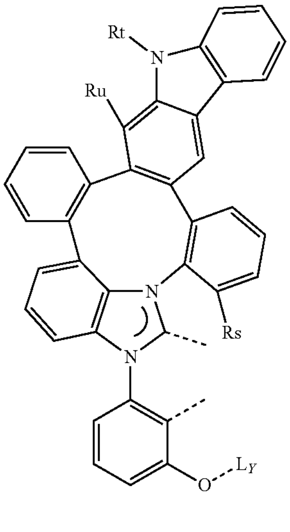 |

-continued

| Ligand $L_{A''}$ | Structure of $L_{A''}$ |
|---|---|
| $L_{A''}$89-(R1)(R1)(R1) to $L_{A''}$89-(R132)(R132)(R132) having the structure | 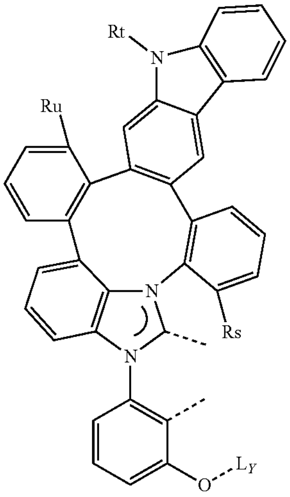 |
| $L_{A''}$90-(R1)(R1)(R1) to $L_{A''}$90-(R132)(R132)(R132) having the structure | 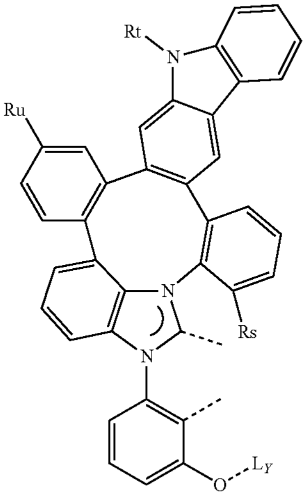 |
| $L_{A''}$91-(R1)(R1)(R1) to $L_{A''}$91-(R132)(R132)(R132) having the structure | 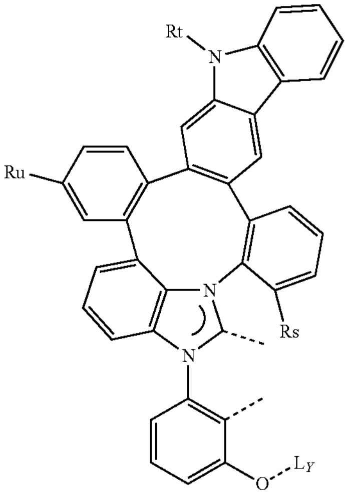 |

-continued

| Ligand $L_{A''}$ | Structure of $L_{A''}$ |
|---|---|
| $L_{A''}$92-(R1)(R1)(R1) to $L_{A''}$92-(R132)(R132)(R132) having the structure | 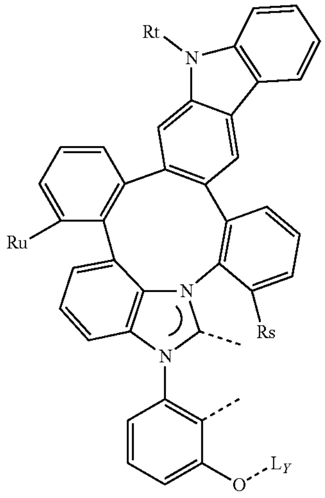 |
| $L_{A''}$93-(R1)(R1)(R1) to $L_{A''}$93-(R132)(R132)(R132) having the structure | 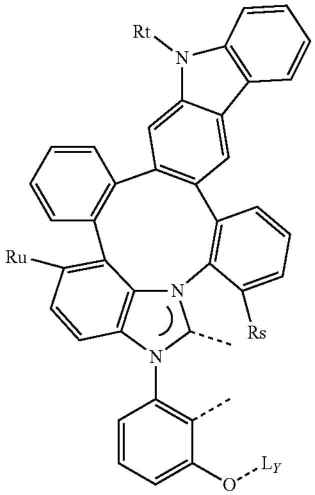 |
| $L_{A''}$94-(R1)(R1)(R1) to $L_{A''}$94-(R132)(R132)(R132) having the structure | 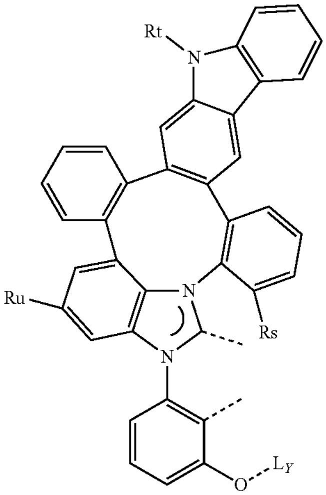 |

-continued

| Ligand $L_{A''}$ | Structure of $L_{A''}$ |
|---|---|
| $L_{A''}$95-(R1)(R1)(R1) to $L_{A''}$95-(R132)(R132)(R132) having the structure | 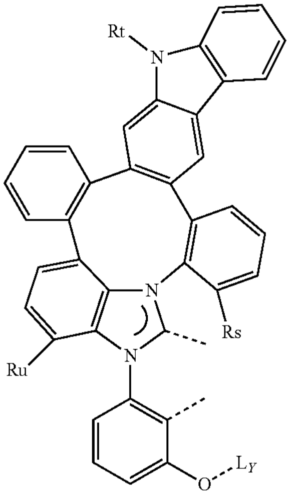 |
| $L_{A''}$96-(R1)(R1)(R1) to $L_{A''}$96-(R132)(R132)(R132) having the structure | 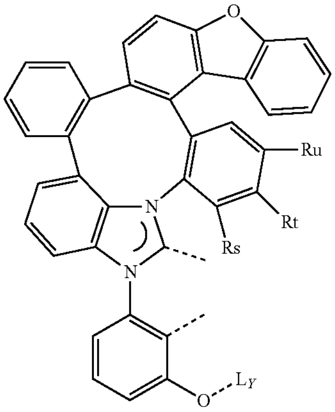 |
| $L_{A''}$97-(R1)(R1)(R1) to $L_{A''}$97-(R132)(R132)(R132) having the structure | 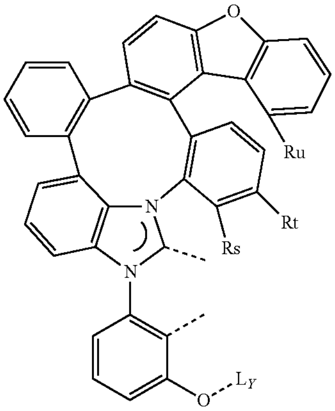 |

-continued

| Ligand $L_{A''}$ | Structure of $L_{A''}$ |
| --- | --- |
| $L_{A''}$98-(R1)(R1)(R1) to $L_{A''}$98-(R132)(R132)(R132) having the structure | 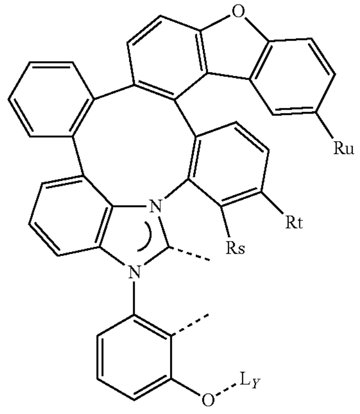 |
| $L_{A''}$99-(R1)(R1)(R1) to $L_{A''}$99-(R132)(R132)(R132) having the structure | 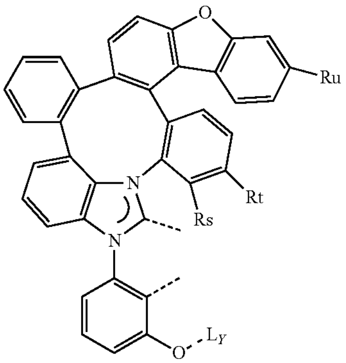 |
| $L_{A''}$100-(R1)(R1)(R1) to $L_{A''}$100-(R132)(R132)(R132) having the structure | 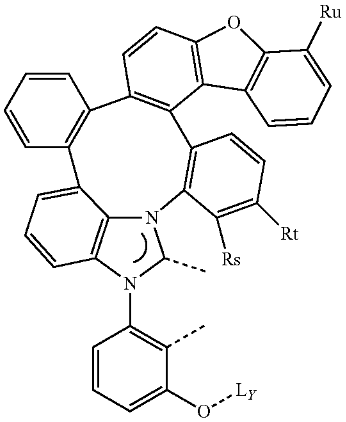 |

-continued

| Ligand $L_{A''}$ | Structure of $L_{A''}$ |
| --- | --- |
| $L_{A''}$101-(R1)(R1)(R1) to $L_{A''}$101-(R132)(R132)(R132) having the structure | 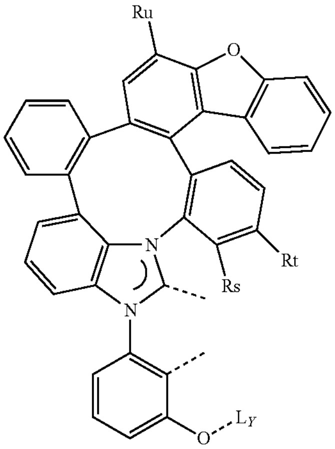 |
| $L_{A''}$102-(R1)(R1)(R1) to $L_{A''}$102-(R132)(R132)(R132) having the structure | 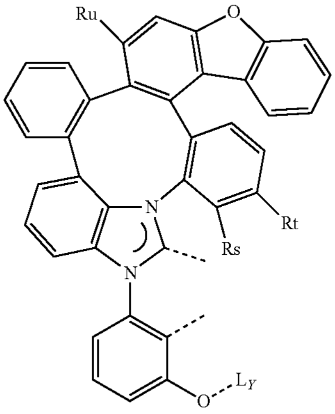 |
| $L_{A''}$103-(R1)(R1)(R1) to $L_{A''}$103-(R132)(R132)(R132) having the structure | 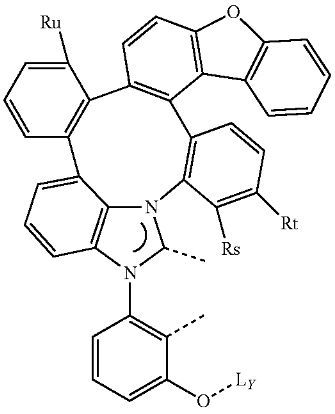 |

-continued

| Ligand $L_{A''}$ | Structure of $L_{A''}$ |
|---|---|
| $L_{A''}$104-(R1)(R1)(R1) to $L_{A''}$104-(R132)(R132)(R132) having the structure | 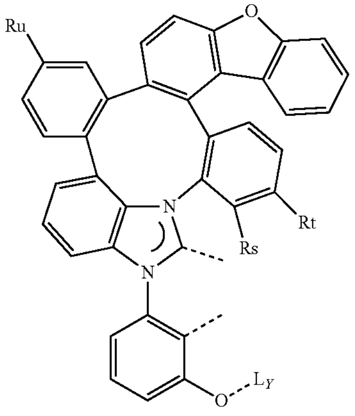 |
| $L_{A''}$105-(R1)(R1)(R1) to $L_{A''}$105-(R132)(R132)(R132) having the structure | 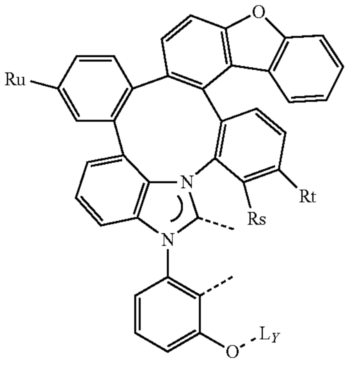 |
| $L_{A''}$106-(R1)(R1)(R1) to $L_{A''}$106-(R132)(R132)(R132) having the structure | 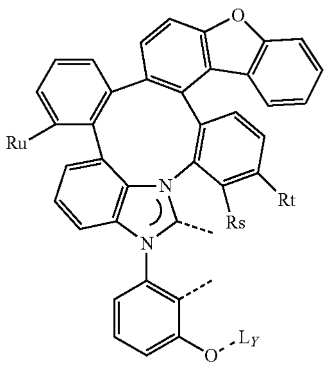 |
| $L_{A''}$107-(R1)(R1)(R1) to $L_{A''}$107-(R132)(R132)(R132) having the structure | 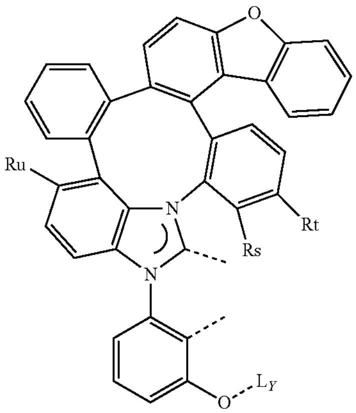 |

-continued

| Ligand $L_{A''}$ | Structure of $L_{A''}$ |
|---|---|
| $L_{A''}$108-(R1)(R1)(R1) to $L_{A''}$108-(R132)(R132)(R132) having the structure | 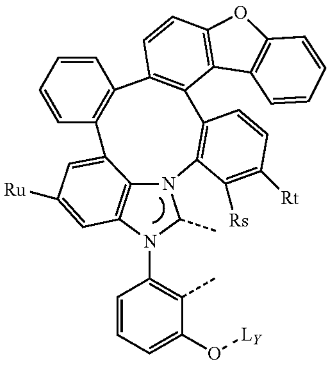 |
| $L_{A''}$109-(R1)(R1)(R1) to $L_{A''}$109-(R132)(R132)(R132) having the structure | 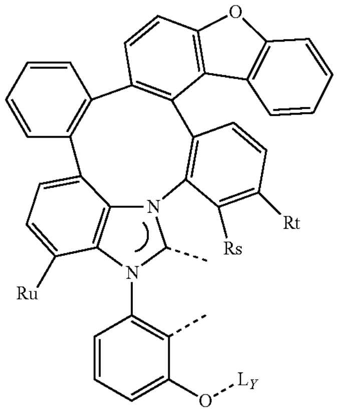 |
| $L_{A''}$110-(R1)(R1)(R1) to $L_{A''}$110-(R132)(R132)(R132) having the structure | 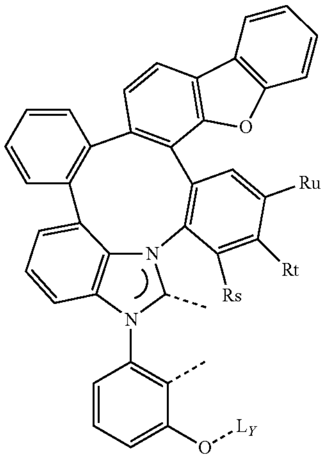 |

-continued
| Ligand $L_{A''}$ | Structure of $L_{A''}$ |
| --- | --- |
| $L_{A''}$111-(R1)(R1)(R1) to $L_{A''}$111-(R132)(R132)(R132) having the structure | 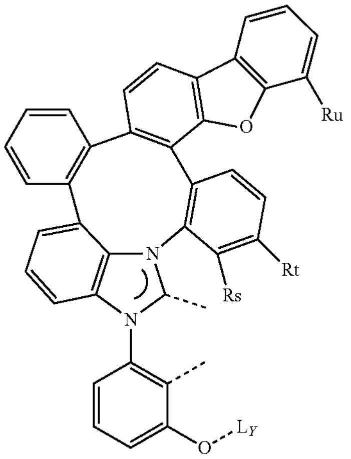 |
| $L_{A''}$112-(R1)(R1)(R1) to $L_{A''}$112-(R132)(R132)(R132) having the structure | 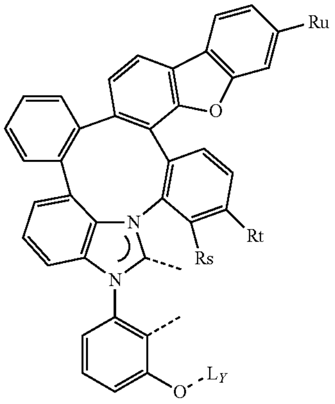 |
| $L_{A''}$113-(R1)(R1)(R1) to $L_{A''}$113-(R132)(R132)(R132) having the structure | 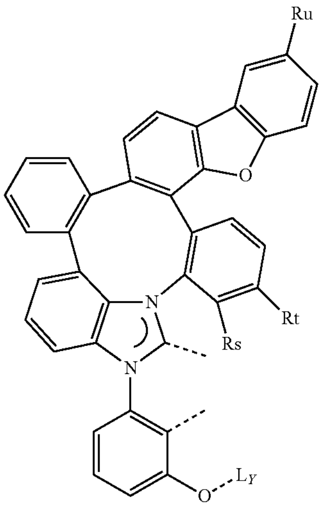 |
| $L_{A''}$114-(R1)(R1)(R1) to $L_{A''}$114-(R132)(R132)(R132) having the structure | 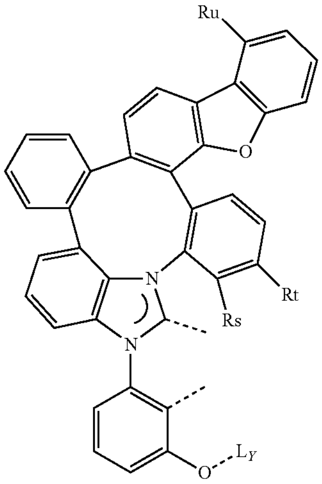 |
| $L_{A''}$115-(R1)(R1)(R1) to $L_{A''}$115-(R132)(R132)(R132) having the structure | 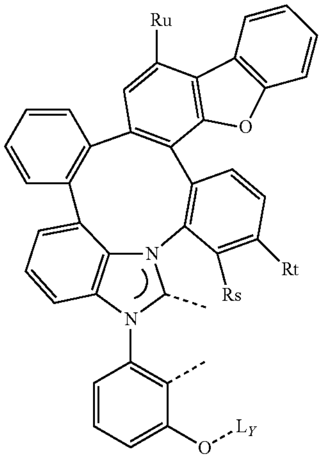 |
| $L_{A''}$116-(R1)(R1)(R1) to $L_{A''}$116-(R132)(R132)(R132) having the structure | 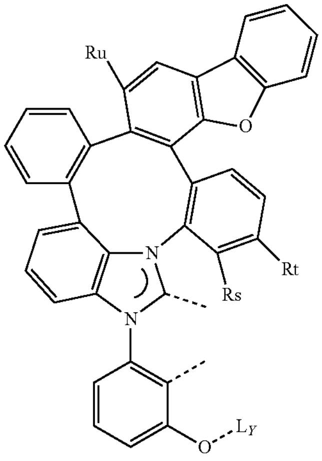 |

-continued

| Ligand $L_{A''}$ | Structure of $L_{A''}$ |
|---|---|
| $L_{A''}$117-(R1)(R1)(R1) to $L_{A''}$117-(R132)(R132)(R132) having the structure | 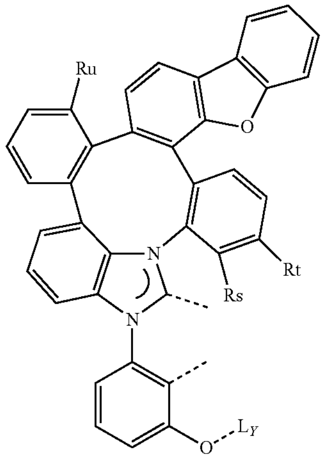 |
| $L_{A''}$118-(R1)(R1)(R1) to $L_{A''}$118-(R132)(R132)(R132) having the structure | 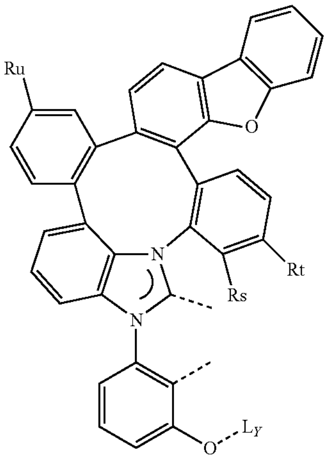 |
| $L_{A''}$132-(R1)(R1)(R1) to $L_{A''}$132-(R132)(R132)(R132) having the structure | 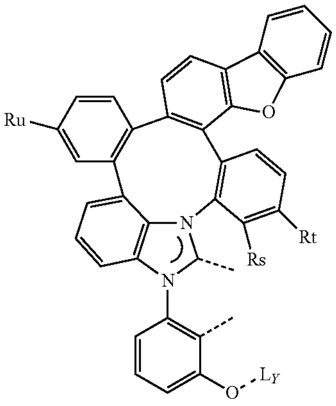 |

-continued

| Ligand $L_{A''}$ | Structure of $L_{A''}$ |
|---|---|
| $L_{A''}$120-(R1)(R1)(R1) to $L_{A''}$120-(R132)(R132)(R132) having the structure | 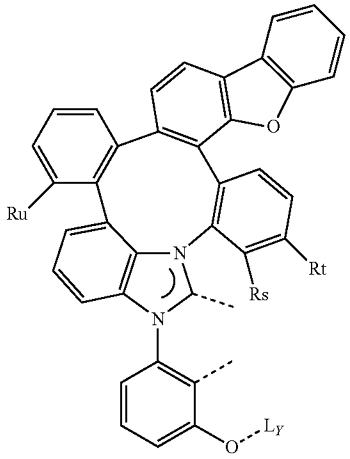 |
| $L_{A''}$121-(R1)(R1)(R1) to $L_{A''}$121-(R132)(R132)(R132) having the structure | 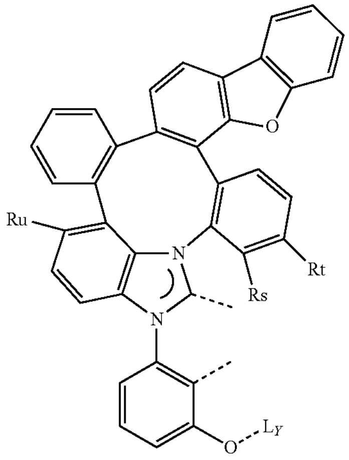 |
| $L_{A''}$122-(R1)(R1)(R1) to $L_{A''}$122-(R132)(R132)(R132) having the structure | 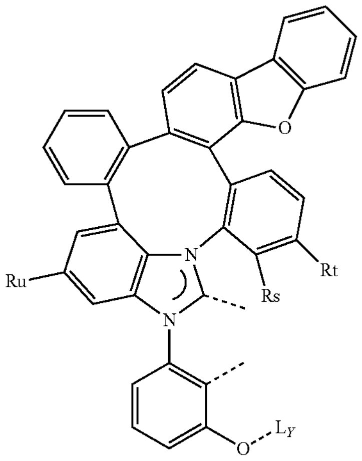 |

-continued
| Ligand $L_{A''}$ | Structure of $L_{A''}$ |
| --- | --- |
| $L_{A''}$123-(R1)(R1)(R1) to $L_{A''}$123-(R132)(R132)(R132) having the structure | 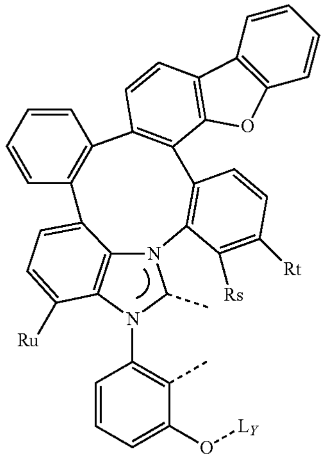 |
| $L_{A''}$124-(R1)(R1)(R1) to $L_{A''}$124-(R132)(R132)(R132) having the structure | 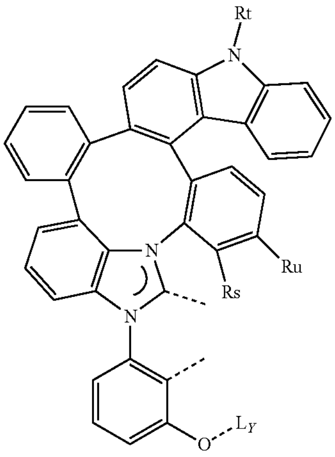 |
| $L_{A''}$125-(R1)(R1)(R1) to $L_{A''}$125-(R132)(R132)(R132) having the structure | 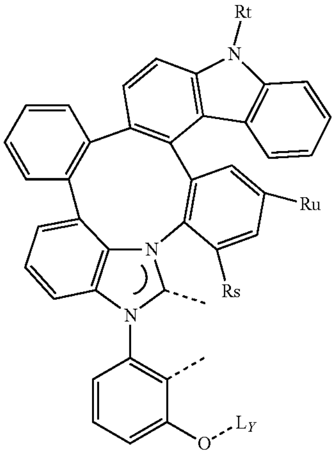 |
| $L_{A''}$126-(R1)(R1)(R1) to $L_{A''}$126-(R132)(R132)(R132) having the structure | 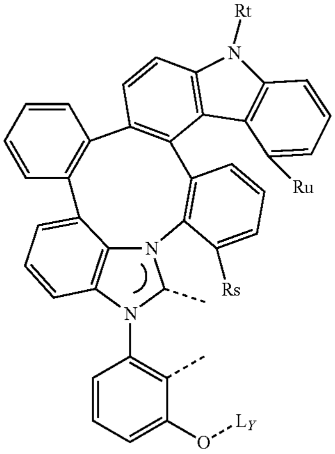 |
| $L_{A''}$127-(R1)(R1)(R1) to $L_{A''}$127-(R132)(R132)(R132) having the structure | 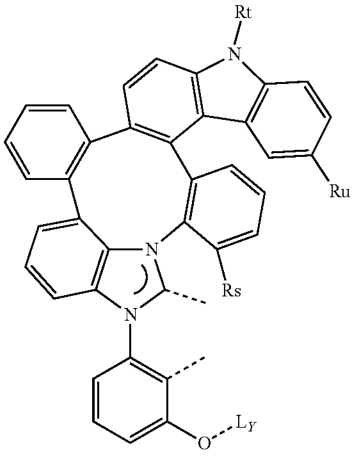 |
| $L_{A''}$128-(R1)(R1)(R1) to $L_{A''}$128-(R132)(R132)(R132) having the structure | 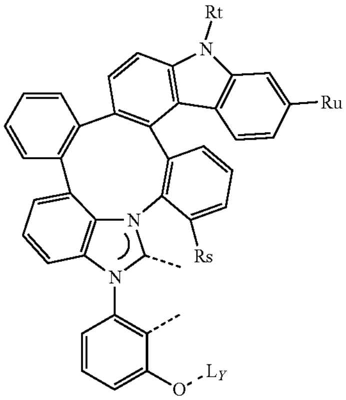 |

-continued

| Ligand $L_{A''}$ | Structure of $L_{A''}$ |
| --- | --- |
| $L_{A''}$129-(R1)(R1)(R1) to $L_{A''}$129-(R132)(R132)(R132) having the structure | 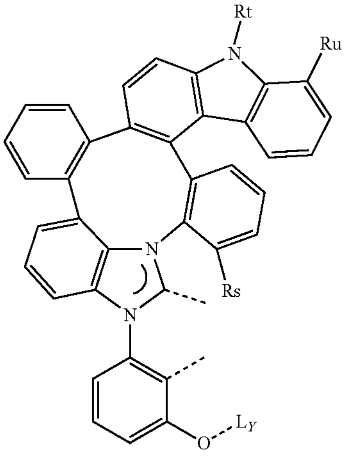 |
| $L_{A''}$130-(R1)(R1)(R1) to $L_{A''}$130-(R132)(R132)(R132) having the structure | 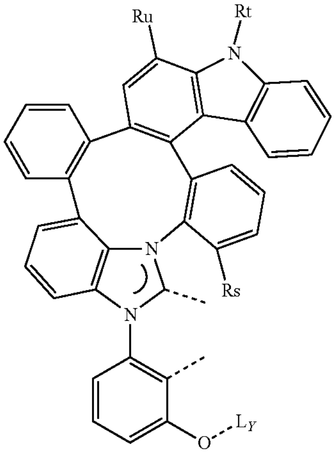 |
| $L_{A''}$131-(R1)(R1)(R1) to $L_{A''}$131-(R132)(R132)(R132) having the structure | 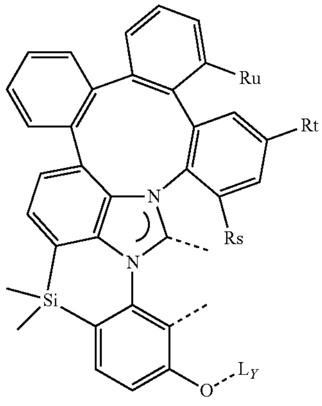 |

-continued

| Ligand $L_{A''}$ | Structure of $L_{A''}$ |
| --- | --- |
| $L_{A''}$132-(R1)(R1)(R1) to $L_{A''}$132-(R132)(R132)(R132) having the structure | 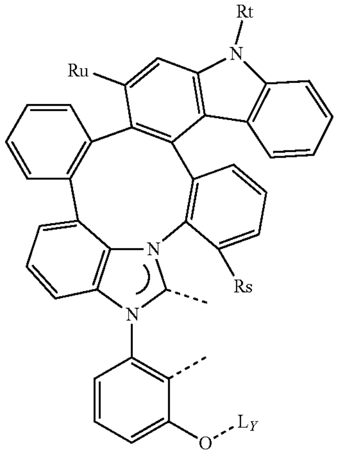 |
| $L_{A''}$133-(R1)(R1)(R1) to $L_{A''}$133-(R132)(R132)(R132) having the structure | 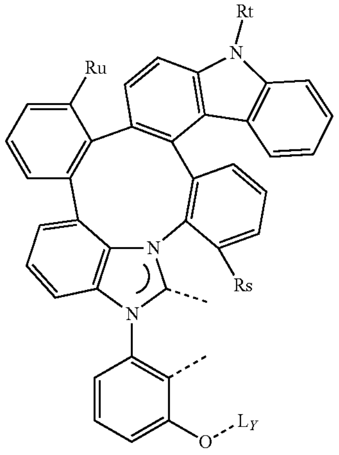 |
| $L_{A''}$134-(R1)(R1)(R1) to $L_{A''}$134-(R132)(R132)(R132) having the structure | 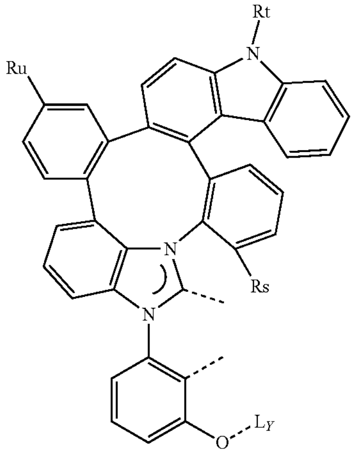 |

-continued

| Ligand $L_{A''}$ | Structure of $L_{A''}$ |
|---|---|
| $L_{A''}$15-(R1)(R1)(R1) to $L_{A''}$135-(R132)(R132)(R132) having the structure | 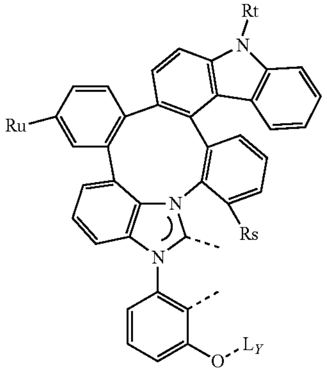 |
| $L_{A''}$136-(R1)(R1)(R1) to $L_{A''}$136-(R132)(R132)(R132) having the structure | 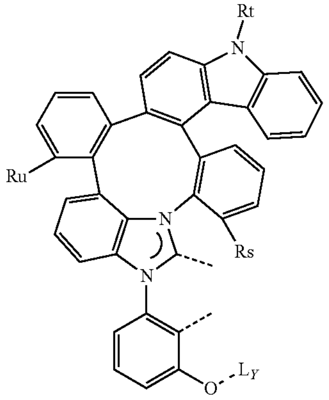 |
| $L_{A''}$137-(R1)(R1)(R1) to $L_{A''}$137-(R132)(R132)(R132) having the structure | 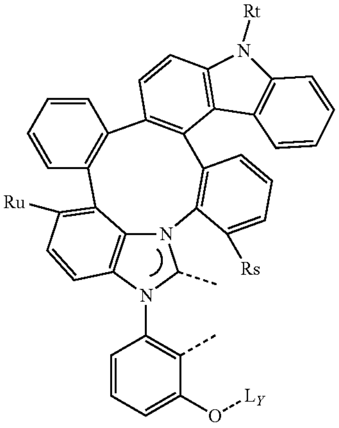 |
| $L_{A''}$138-(R1)(R1)(R1) to $L_{A''}$138-(R132)(R132)(R132) having the structure | 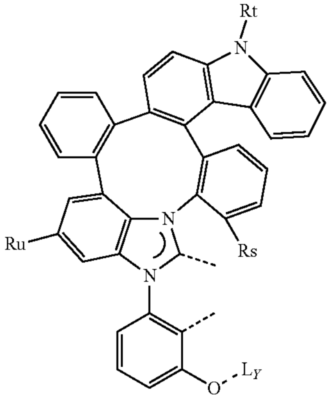 |
| $L_{A''}$139-(R1)(R1)(R1) to $L_{A''}$139-(R132)(R132)(R132) having the structure | 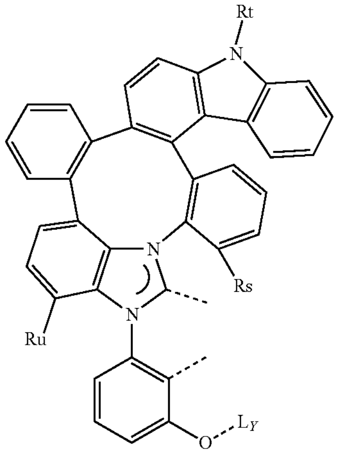 |
| $L_{A''}$140-(R1)(R1)(R1) to $L_{A''}$140-(R132)(R132)(R132) having the structure | 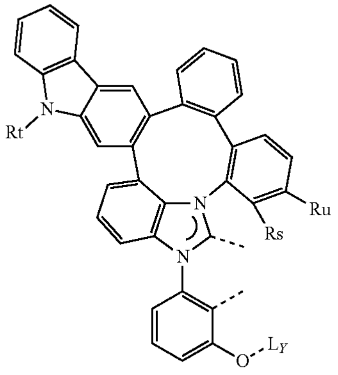 |
| $L_{A''}$141-(R1)(R1)(R1) to $L_{A''}$141-(R132)(R132)(R132) having the structure | 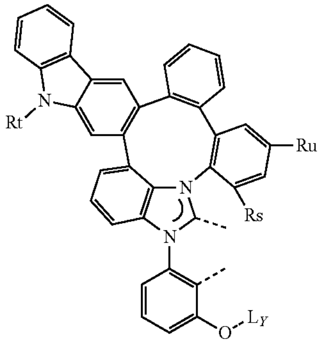 |
| $L_{A''}$142-(R1)(R1)(R1) to $L_{A''}$142-(R132)(R132)(R132) having the structure | 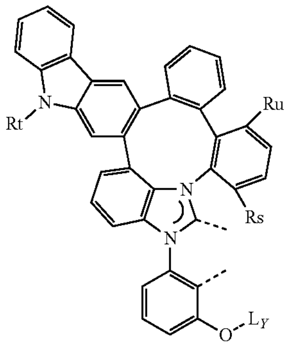 |

-continued

| Ligand $L_{A''}$ | Structure of $L_{A''}$ |
|---|---|
| $L_{A''}$143-(R1)(R1)(R1) to $L_{A''}$143-(R132)(R132)(R132) having the structure | 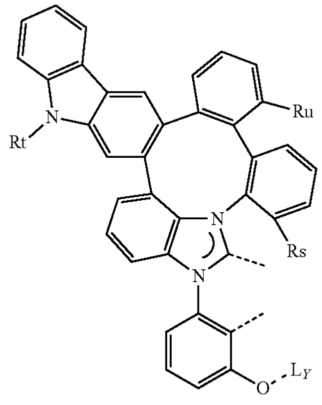 |
| $L_{A''}$144-(R1)(R1)(R1) to $L_{A''}$144-(R132)(R132)(R132) having the structure | 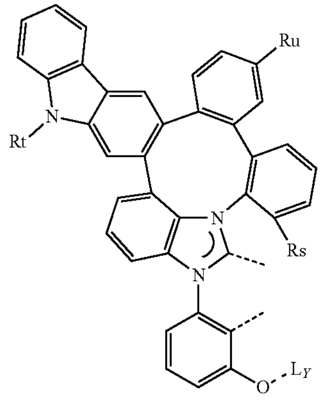 |
| $L_{A''}$145-(R1)(R1)(R1) to $L_{A''}$145-(R132)(R132)(R132) having the structure | 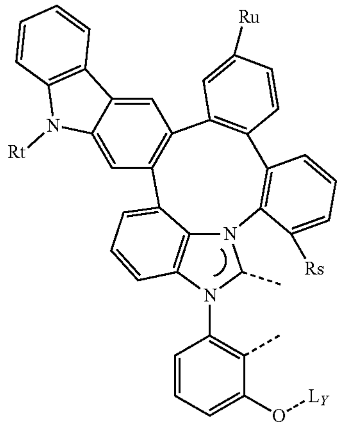 |

-continued

| Ligand $L_{A''}$ | Structure of $L_{A''}$ |
|---|---|
| $L_{A''}$146-(R1)(R1)(R1) to $L_{A''}$146-(R132)(R132)(R132) having the structure | 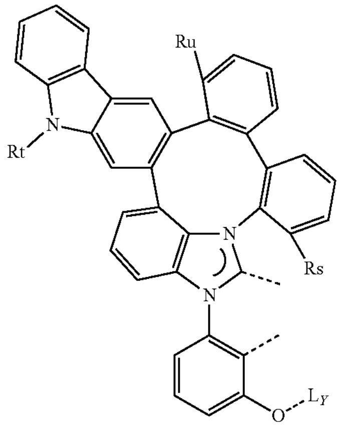 |
| $L_{A''}$147-(R1)(R1)(R1) to $L_{A''}$147-(R132)(R132)(R132) having the structure | 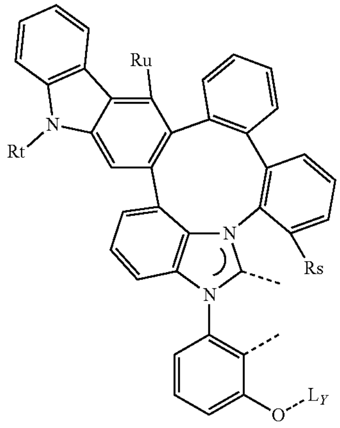 |
| $L_{A''}$148-(R1)(R1)(R1) to $L_{A''}$148-(R132)(R132)(R132) having the structure | 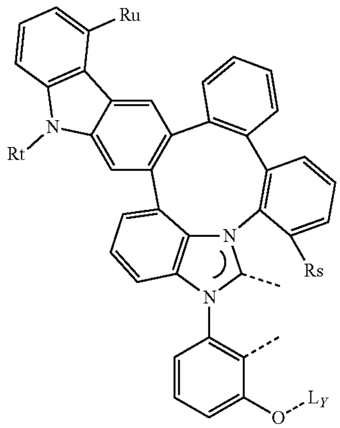 |

-continued

| Ligand $L_{A''}$ | Structure of $L_{A''}$ |
|---|---|
| $L_{A''}$149-(R1)(R1)(R1) to $L_{A''}$149-(R132)(R132)(R132) having the structure | 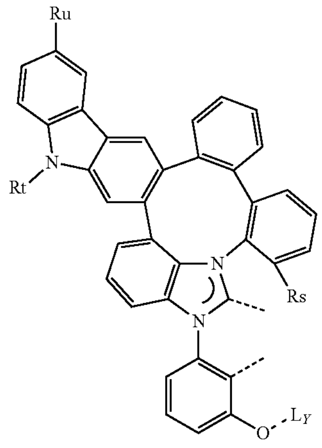 |
| $L_{A''}$150-(R1)(R1)(R1) to $L_{A''}$150-(R132)(R132)(R132) having the structure | 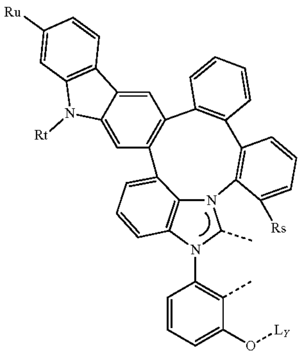 |
| $L_{A''}$151-(R1)(R1)(R1) to $L_{A''}$151-(R132)(R132)(R132) having the structure | 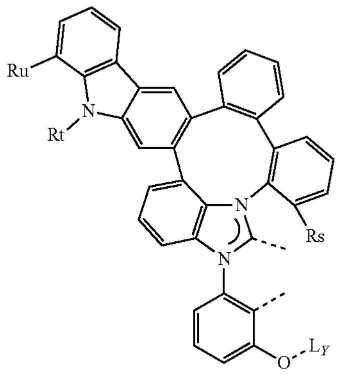 |
| $L_{A''}$152-(R1)(R1)(R1) to $L_{A''}$152-(R132)(R132)(R132) having the structure | 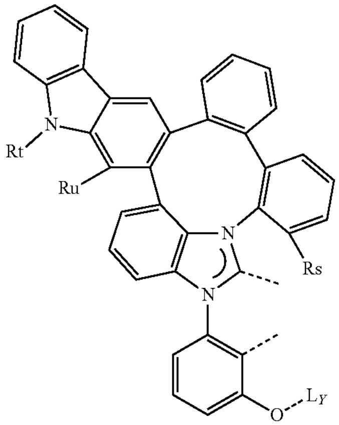 |

-continued

| Ligand $L_{A''}$ | Structure of $L_{A''}$ |
|---|---|
| $L_{A''}$153-(R1)(R1)(R1) to $L_{A''}$153-(R132)(R132)(R132) having the structure | 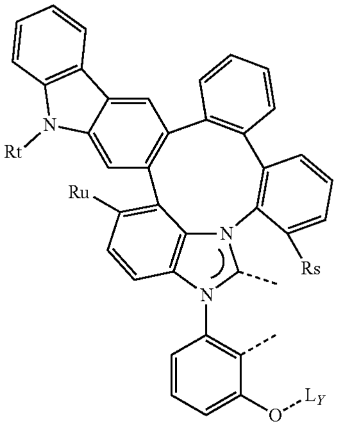 |
| $L_{A''}$154-(R1)(R1)(R1) to $L_{A''}$154-(R132)(R132)(R132) having the structure | 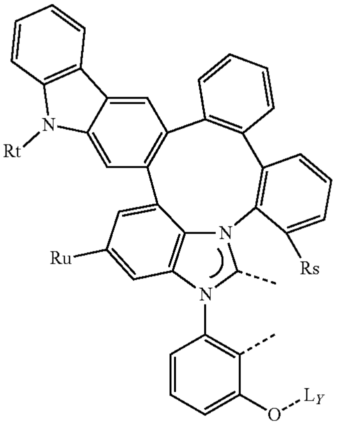 |
| $L_{A''}$155-(R1)(R1)(R1) to $L_{A''}$155-(R132)(R132)(R132) having the structure | 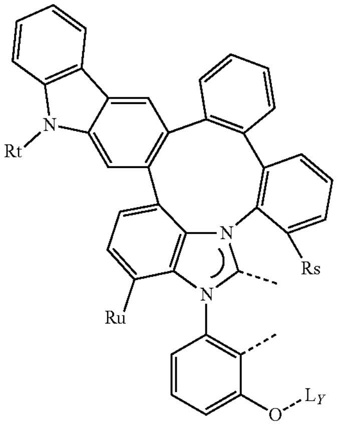 |

-continued

| Ligand $L_{A''}$ | Structure of $L_{A''}$ |
|---|---|
| $L_{A''}$156-(R1)(R1)(R1) to $L_{A''}$156-(R132)(R132)(R132) having the structure | 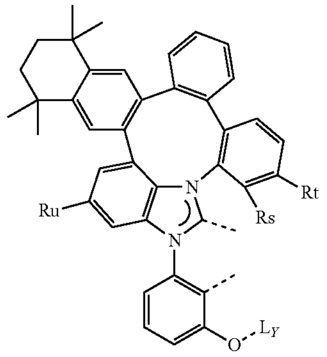 |
| $L_{A''}$157-(R1)(R1)(R1) to $L_{A''}$157-(R132)(R132)(R132) having the structure | 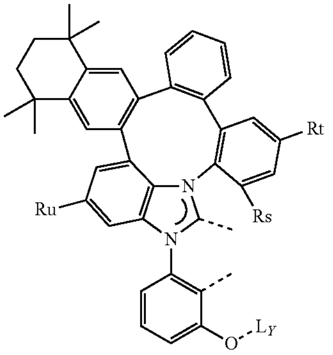 |
| $L_{A''}$158-(R1)(R1)(R1) to $L_{A''}$158-(R132)(R132)(R132) having the structure | 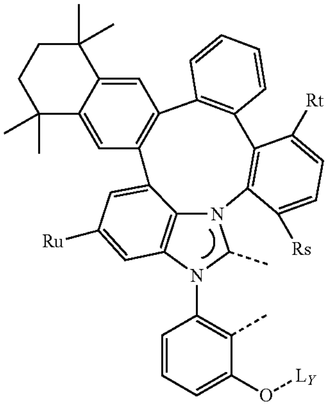 |
| $L_{A''}$159-(R1)(R1)(R1) to $L_{A''}$159-(R132)(R132)(R132) having the structure | 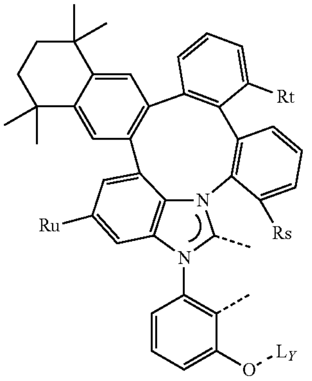 |
| $L_{A''}$160-(R1)(R1)(R1) to $L_{A''}$160-(R132)(R132)(R132) having the structure | 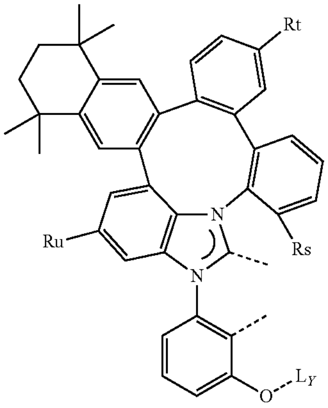 |
| $L_{A''}$161-(R1)(R1)(R1) to $L_{A''}$161-(R132)(R132)(R132) having the structure | 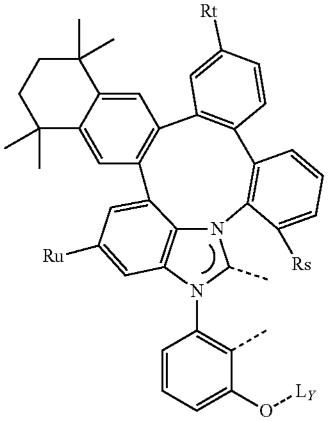 |
| $L_{A''}$162-(R1)(R1)(R1) to $L_{A''}$162-(R132)(R132)(R132) having the structure | 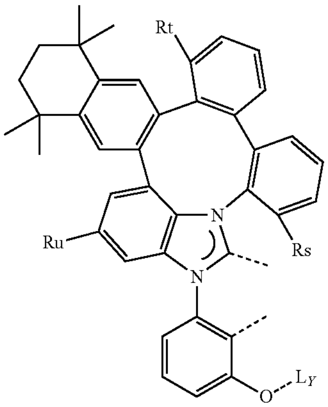 |
| $L_{A''}$163-(R1)(R1)(R1) to $L_{A''}$163-(R132)(R132)(R132) having the structure | 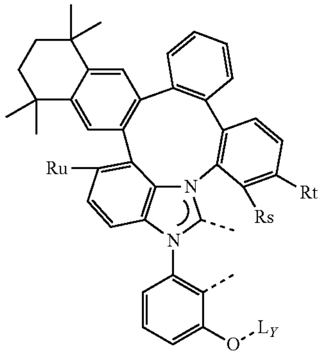 |

-continued

| Ligand $L_{A''}$ | Structure of $L_{A''}$ |
|---|---|
| $L_{A''}$164-(R1)(R1)(R1) to $L_{A''}$164-(R132)(R132)(R132) having the structure | 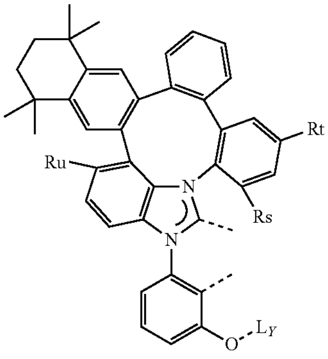 |
| $L_{A''}$165-(R1)(R1)(R1) to $L_{A''}$165-(R132)(R132)(R132) having the structure | 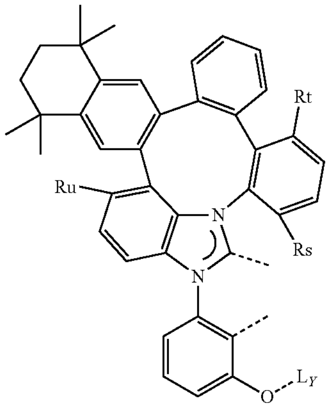 |
| $L_{A''}$166-(R1)(R1)(R1) to $L_{A''}$166-(R132)(R132)(R132) having the structure | 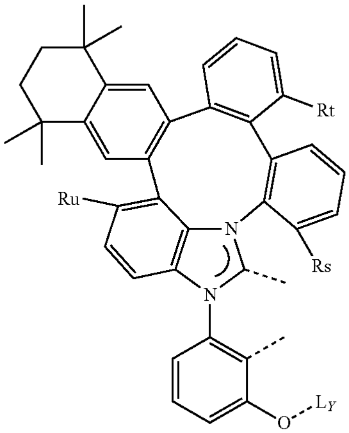 |

-continued

| Ligand $L_{A''}$ | Structure of $L_{A''}$ |
|---|---|
| $L_{A''}$167-(R1)(R1)(R1) to $L_{A''}$167-(R132)(R132)(R132) having the structure | 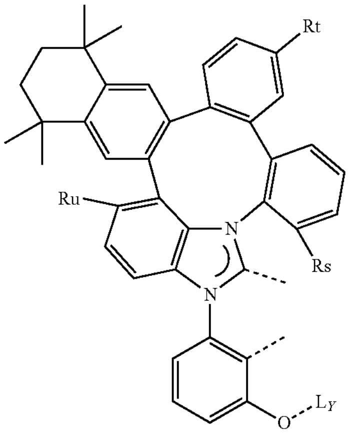 |
| $L_{A''}$168-(R1)(R1)(R1) to $L_{A''}$168-(R132)(R132)(R132) having the structure | 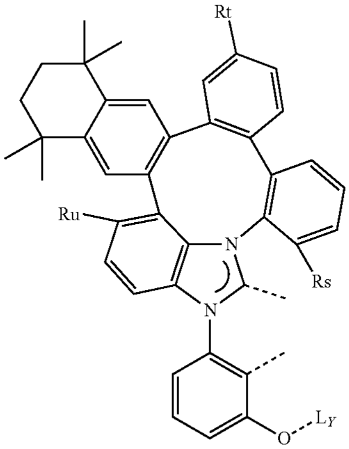 |
| $L_{A''}$169-(R1)(R1)(R1) to $L_{A''}$169-(R132)(R132)(R132) having the structure | 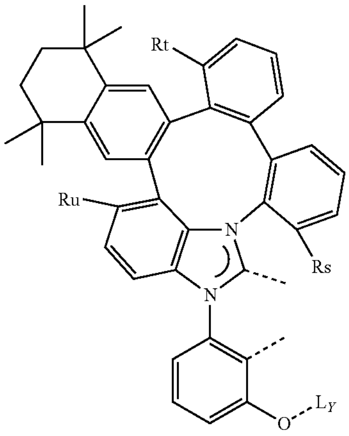 |

-continued

| Ligand $L_{A''}$ | Structure of $L_{A''}$ |
| --- | --- |
| $L_{A''}$170-(R1)(R1)(R1) to $L_{A''}$170-(R132)(R132)(R132) having the structure | 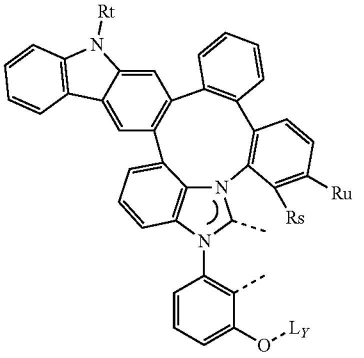 |
| $L_{A''}$171-(R1)(R1)(R1) to $L_{A''}$171-(R132)(R132)(R132) having the structure | 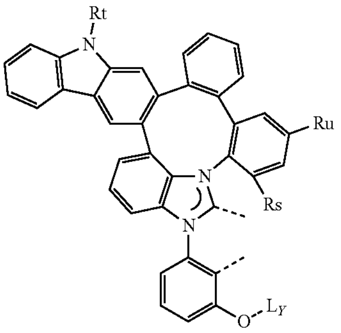 |
| $L_{A''}$172-(R1)(R1)(R1) to $L_{A''}$172-(R132)(R132)(R132) having the structure | 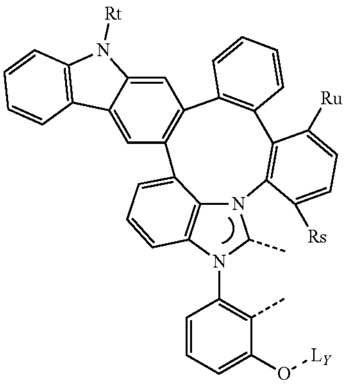 |
| $L_{A''}$173-(R1)(R1)(R1) to $L_{A''}$173-(R132)(R132)(R132) having the structure | 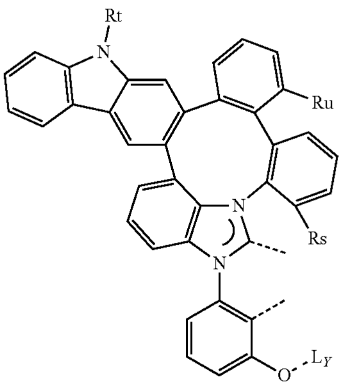 |
| $L_{A''}$174-(R1)(R1)(R1) to $L_{A''}$174-(R132)(R132)(R132) having the structure | 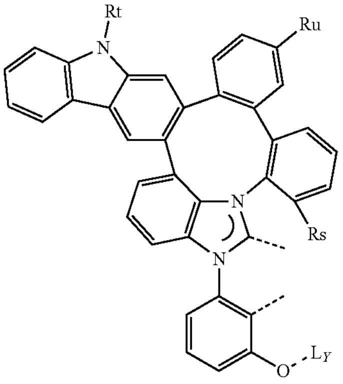 |
| $L_{A''}$175-(R1)(R1)(R1) to $L_{A''}$175-(R132)(R132)(R132) having the structure | 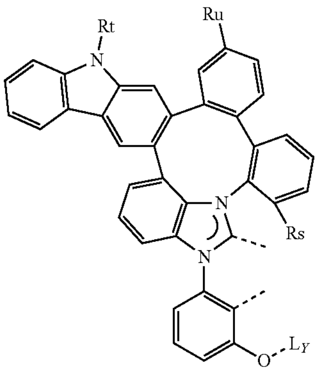 |
| $L_{A''}$176-(R1)(R1)(R1) to $L_{A''}$176-(R132)(R132)(R132) having the structure | 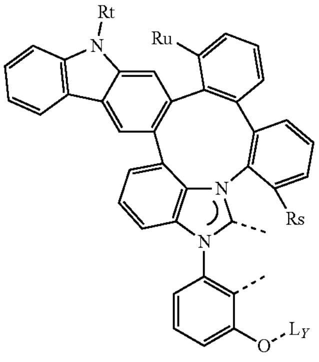 |
| $L_{A''}$177-(R1)(R1)(R1) to $L_{A''}$177-(R132)(R132)(R132) having the structure | 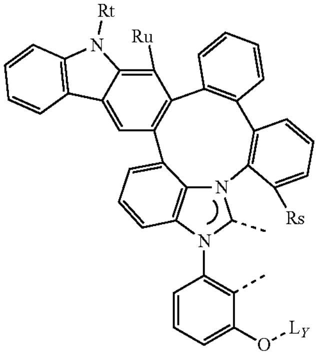 |

-continued

| Ligand $L_{A''}$ | Structure of $L_{A''}$ |
|---|---|
| $L_{A''}$178-(R1)(R1)(R1) to $L_{A''}$178-(R132)(R132)(R132) having the structure | 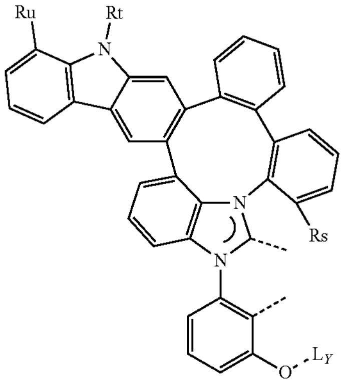 |
| $L_{A''}$179-(R1)(R1)(R1) to $L_{A''}$179-(R132)(R132)(R132) having the structure | 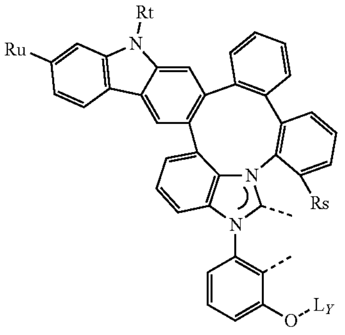 |
| $L_{A''}$180-(R1)(R1)(R1) to $L_{A''}$180-(R132)(R132)(R132) having the structure | 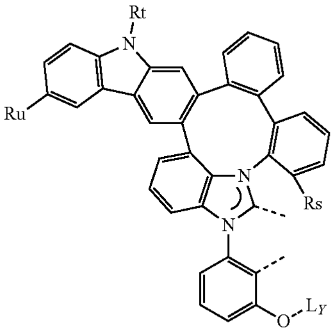 |
| $L_{A''}$181-(R1)(R1)(R1) to $L_{A''}$181-(R132)(R132)(R132) having the structure | 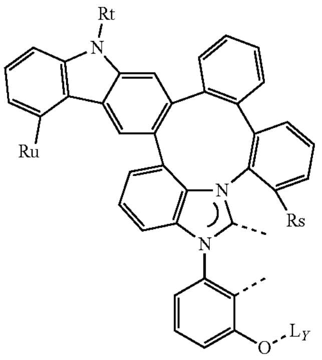 |
| $L_{A''}$182-(R1)(R1)(R1) to $L_{A''}$182-(R132)(R132)(R132) having the structure | 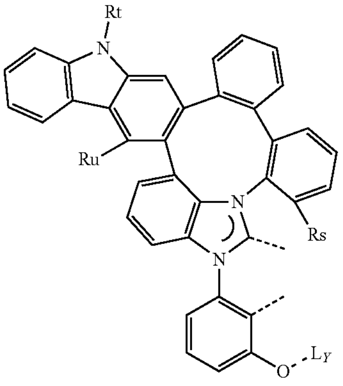 |
| $L_{A''}$183-(R1)(R1)(R1) to $L_{A''}$183-(R132)(R132)(R132) having the structure | 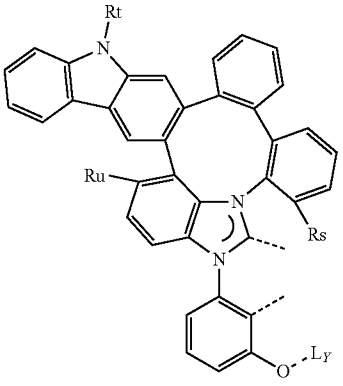 |
| $L_{A''}$184-(R1)(R1)(R1) to $L_{A''}$184-(R132)(R132)(R132) having the structure | 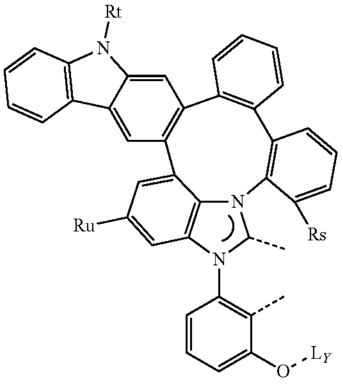 |
| $L_{A''}$185-(R1)(R1)(R1) to $L_{A''}$185-(R132)(R132)(R132) having the structure | 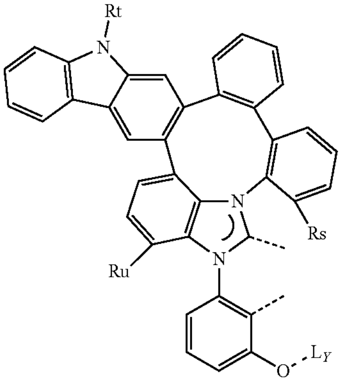 |

-continued

| Ligand $L_{A''}$ | Structure of $L_{A''}$ |
|---|---|
| $L_{A''}$186-(R1)(R1)(R1) to $L_{A''}$186-(R132)(R132)(R132) having the structure | 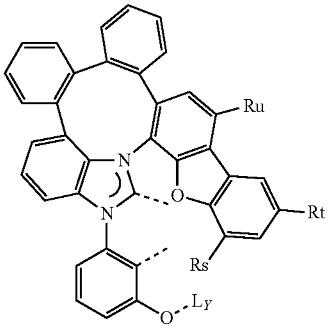 |
| $L_{A''}$187-(R1)(R1)(R1) to $L_{A''}$187-(R132)(R132)(R132) having the structure | 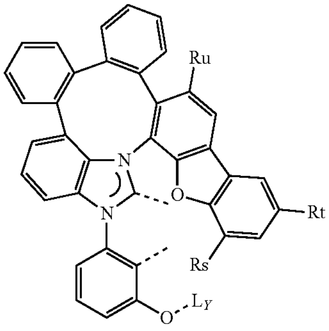 |
| $L_{A''}$188-(R1)(R1)(R1) to $L_{A''}$188-(R132)(R132)(R132) having the structure | 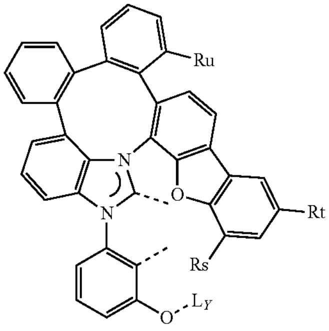 |
| $L_{A''}$189-(R1)(R1)(R1) to $L_{A''}$189-(R132)(R132)(R132) having the structure | 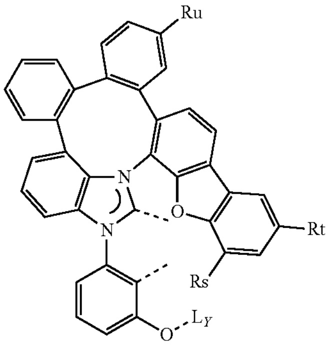 |

-continued

| Ligand $L_{A''}$ | Structure of $L_{A''}$ |
|---|---|
| $L_{A''}$190-(R1)(R1)(R1) to $L_{A''}$190-(R132)(R132)(R132) having the structure | 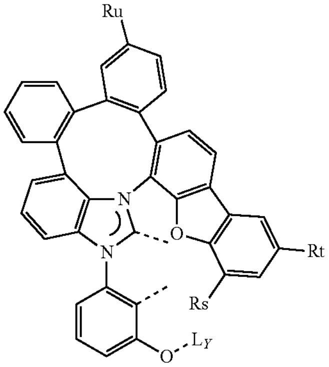 |
| $L_{A''}$191-(R1)(R1)(R1) to $L_{A''}$191-(R132)(R132)(R132) having the structure | |
| $L_{A''}$192-(R1)(R1)(R1) to $L_{A''}$192-(R132)(R132)(R132) having the structure | 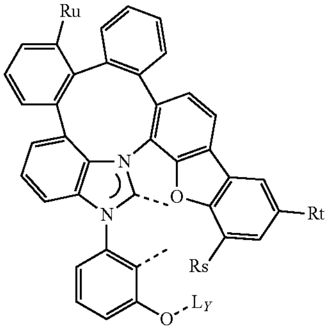 |
| $L_{A''}$193-(R1)(R1)(R1) to $L_{A''}$193-(R132)(R132)(R132) having the structure | 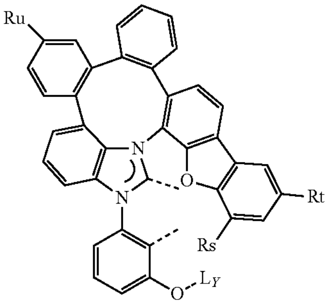 |
| $L_{A''}$194-(R1)(R1)(R1) to $L_{A''}$194-(R132)(R132)(R132) having the structure | 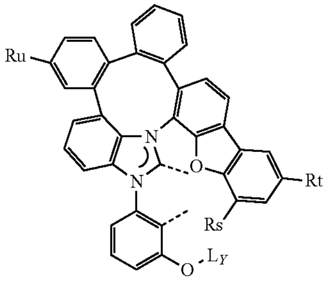 |

-continued

| Ligand $L_{A''}$ | Structure of $L_{A''}$ |
|---|---|
| $L_{A''}$195-(R1)(R1)(R1) to $L_{A''}$195-(R132)(R132)(R132) having the structure | 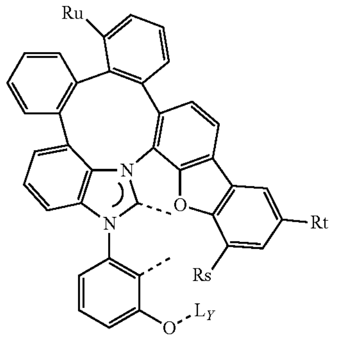 |
| $L_{A''}$196-(R1)(R1)(R1) to $L_{A''}$196-(R132)(R132)(R132) having the structure | 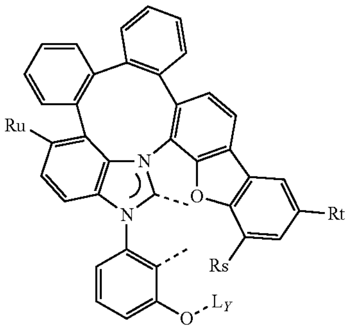 |
| $L_{A''}$197-(R1)(R1)(R1) to $L_{A''}$197-(R132)(R132)(R132) having the structure | 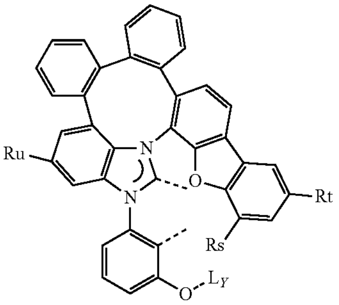 |
| $L_{A''}$198-(R1)(R1)(R1) to $L_{A''}$198-(R132)(R132)(R132) having the structure | 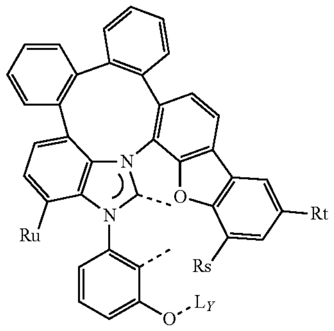 |

-continued

| Ligand $L_{A''}$ | Structure of $L_{A''}$ |
|---|---|
| $L_{A''}$199-(R1)(R1)(R1) to $L_{A''}$199-(R132)(R132)(R132) having the structure | 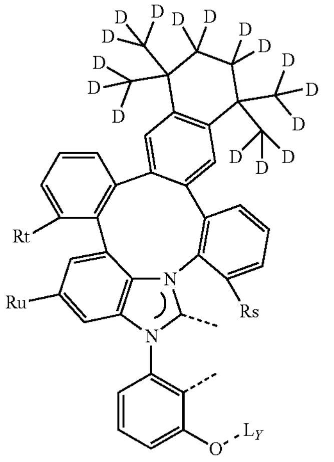 |
| $L_{A''}$200-(R1)(R1)(R1) to $L_{A''}$200-(R132)(R132)(R132) having the structure | 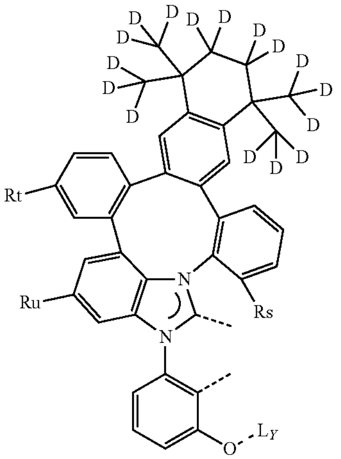 |
| $L_{A''}$201-(R1)(R1)(R1) to $L_{A''}$201-(R132)(R132)(R132) having the structure | 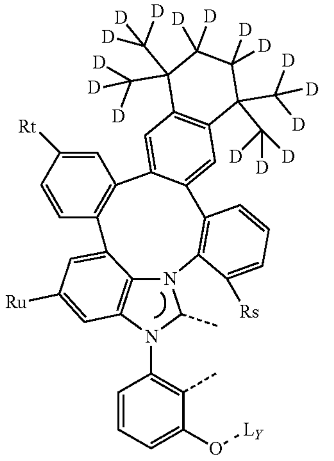 |

-continued
| Ligand $L_{A''}$ | Structure of $L_{A''}$ |
|---|---|
| $L_{A''}$202-(R1)(R1)(R1) to $L_{A''}$202-(R132)(R132)(R132) having the structure | 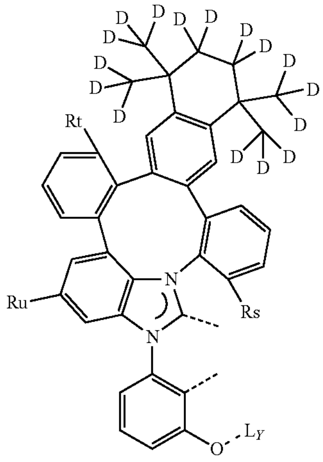 |
| $L_{A''}$203-(R1)(R1)(R1) to $L_{A''}$203-(R132)(R132)(R132) having the structure | 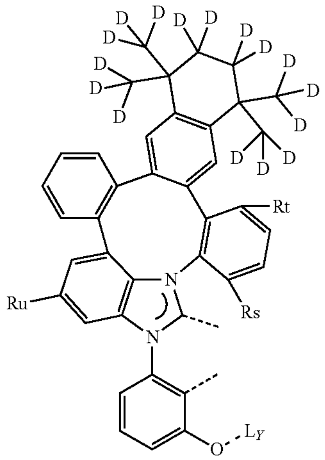 |
| $L_{A''}$204-(R1)(R1)(R1) to $L_{A''}$204-(R132)(R132)(R132) having the structure | 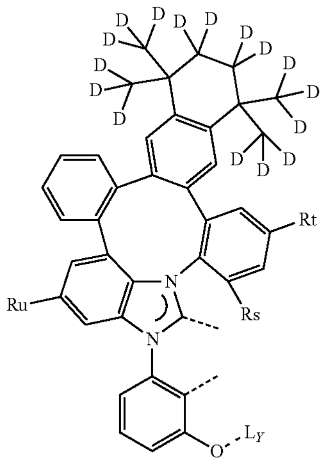 |
| $L_{A''}$205-(R1)(R1)(R1) to $L_{A''}$205-(R132)(R132)(R132) having the structure | 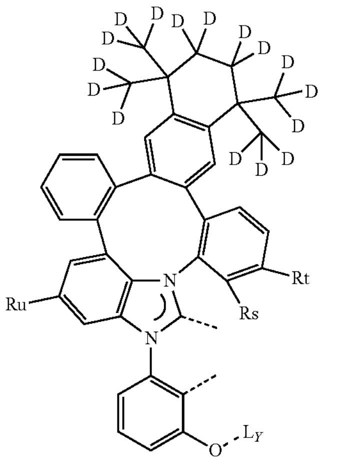 |
| $L_{A''}$206-(R1)(R1)(R1) to $L_{A''}$206-(R132)(R132)(R132) having the structure | 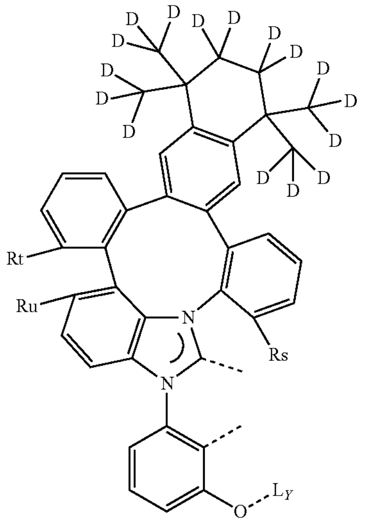 |
| $L_{A''}$207-(R1)(R1)(R1) to $L_{A''}$207-(R132)(R132)(R132) having the structure | 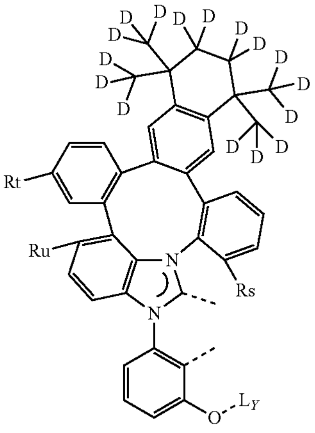 |

-continued
| Ligand $L_{A''}$ | Structure of $L_{A''}$ |
| --- | --- |
| $L_{A''}$208-(R1)(R1)(R1) to $L_{A''}$208-(R132)(R132)(R132) having the structure | 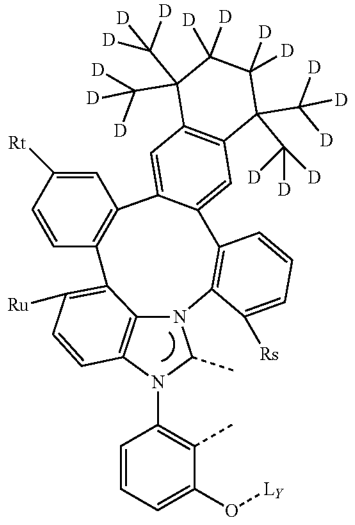 |
| $L_{A''}$209-(R1)(R1)(R1) to $L_{A''}$209-(R132)(R132)(R132) having the structure | 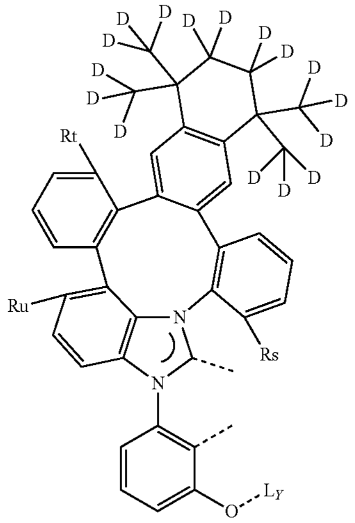 |
| $L_{A''}$210-(R1)(R1)(R1) to $L_{A''}$210-(R132)(R132)(R132) having the structure | 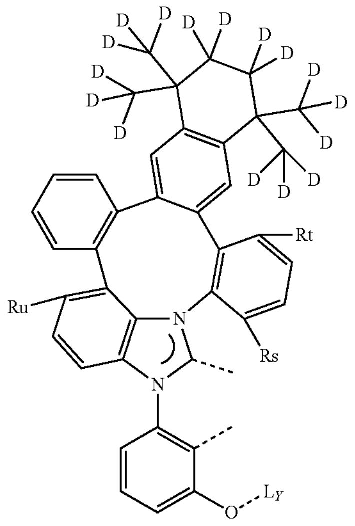 |
| $L_{A''}$211-(R1)(R1)(R1) to $L_{A''}$211-(R132)(R132)(R132) having the structure | 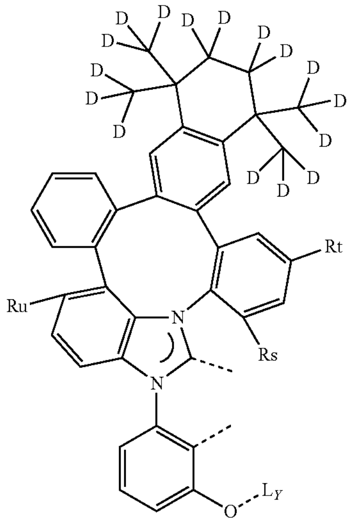 |
| $L_{A''}$212-(R1)(R1)(R1) to $L_{A''}$212-(R132)(R132)(R132) having the structure | 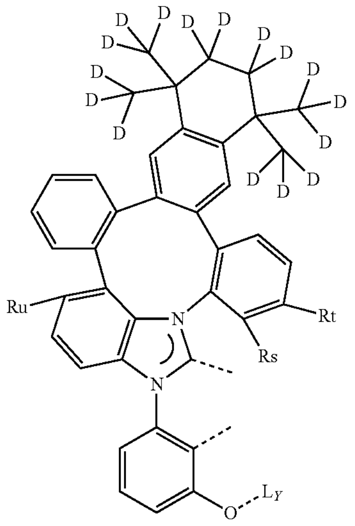 |
| $L_{A''}$213-(R1)(R1)(R1) to $L_{A''}$213-(R132)(R132)(R132) having the structure | 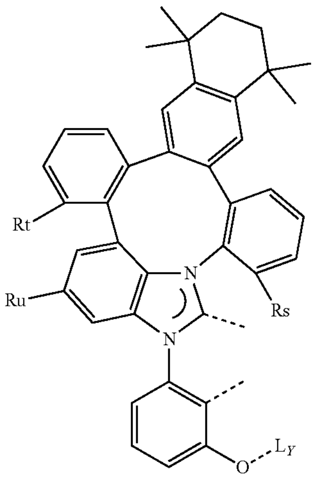 |

-continued

| Ligand $L_{A''}$ | Structure of $L_{A''}$ |
| --- | --- |
| $L_{A''}$214-(R1)(R1)(R1) to $L_{A''}$214-(R132)(R132)(R132) having the structure | 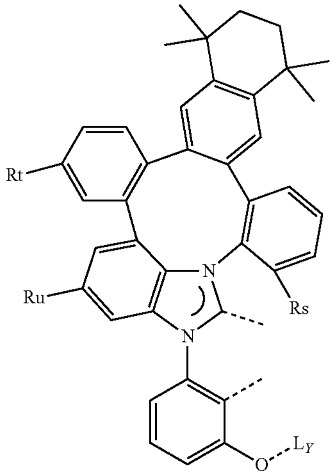 |
| $L_{A''}$215-(R1)(R1)(R1) to $L_{A''}$215-(R132)(R132)(R132) having the structure | 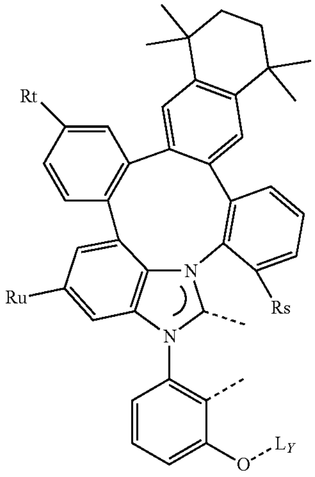 |
| $L_{A''}$216-(R1)(R1)(R1) to $L_{A''}$216-(R132)(R132)(R132) having the structure | 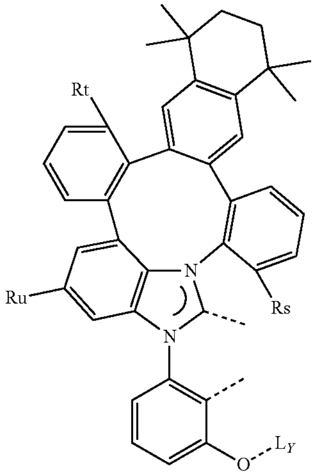 |

-continued

| Ligand $L_{A''}$ | Structure of $L_{A''}$ |
| --- | --- |
| $L_{A''}$217-(R1)(R1)(R1) to $L_{A''}$217-(R132)(R132)(R132) having the structure | 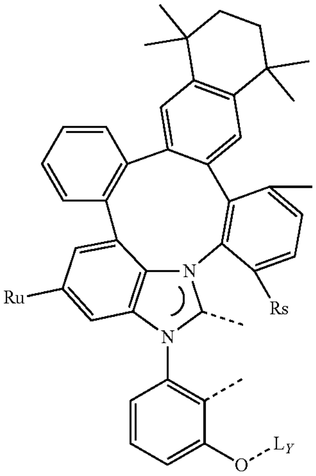 |
| $L_{A''}$218-(R1)(R1)(R1) to $L_{A''}$218-(R132)(R132)(R132) having the structure | 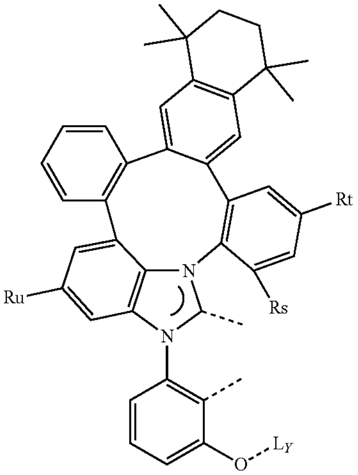 |
| $L_{A''}$219-(R1)(R1)(R1) to $L_{A''}$219-(R132)(R132)(R132) having the structure | 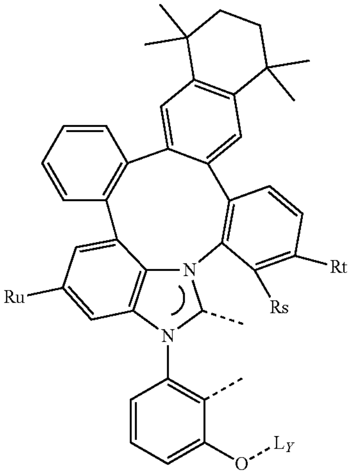 |

-continued

| Ligand $L_{A''}$ | Structure of $L_{A''}$ |
|---|---|
| $L_{A''}$229-(R1)(R1)(R1) to $L_{A''}$220-(R132)(R132)(R132) having the structure | 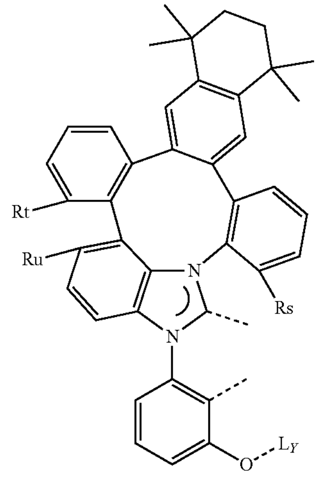 |
| $L_{A''}$221-(R1)(R1)(R1) to $L_{A''}$221-(R132)(R132)(R132) having the structure | 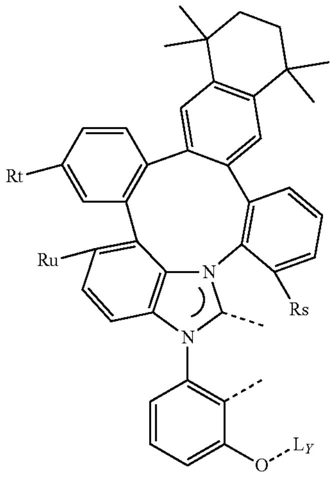 |
| $L_{A''}$222-(R1)(R1)(R1) to $L_{A''}$222-(R132)(R132)(R132) having the structure | 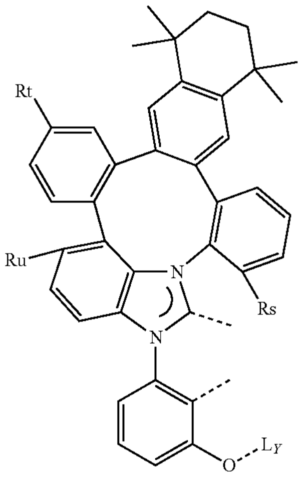 |

-continued

| Ligand $L_{A''}$ | Structure of $L_{A''}$ |
|---|---|
| $L_{A''}$223-(R1)(R1)(R1) to $L_{A''}$223-(R132)(R132)(R132) having the structure | 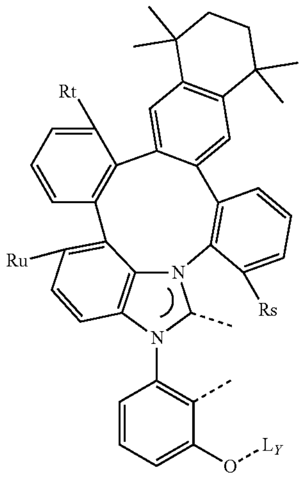 |
| $L_{A''}$224-(R1)(R1)(R1) to $L_{A''}$224-(R132)(R132)(R132) having the structure | 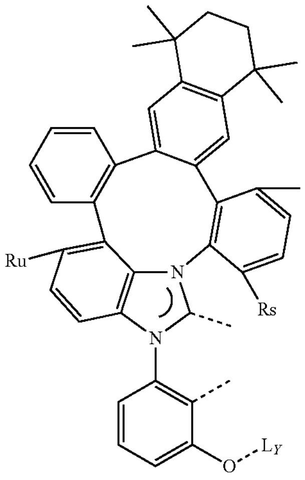 |
| $L_{A''}$225-(R1)(R1)(R1) to $L_{A''}$225-(R132)(R132)(R132) having the structure | 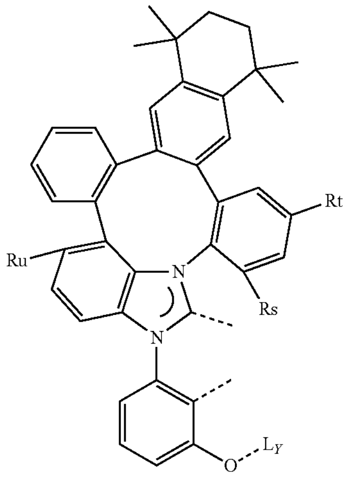 |

-continued

| Ligand $L_{A''}$ | Structure of $L_{A''}$ |
|---|---|
| $L_{A''}$226-(R1)(R1)(R1) to $L_{A''}$226-(R132)(R132)(R132) having the structure | 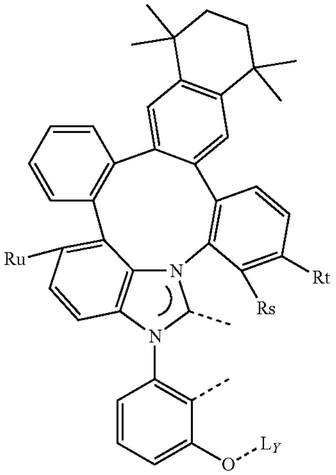 |
| $L_{A''}$227-(R1)(R1)(R1) to $L_{A''}$227-(R132)(R132)(R132) having the structure | 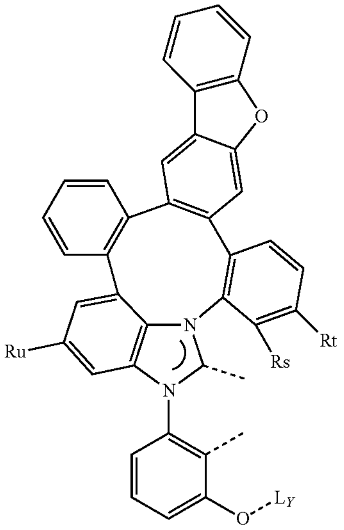 |
| $L_{A''}$228-(R1)(R1)(R1) to $L_{A''}$228-(R132)(R132)(R132) having the structure | 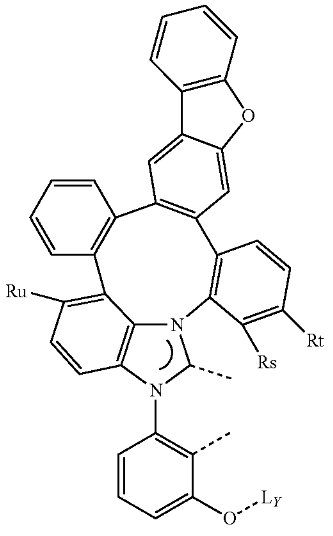 |

-continued

| Ligand $L_{A''}$ | Structure of $L_{A''}$ |
|---|---|
| $L_{A''}$229-(R1)(R1)(R1) to $L_{A''}$229-(R132)(R132)(R132) having the structure | 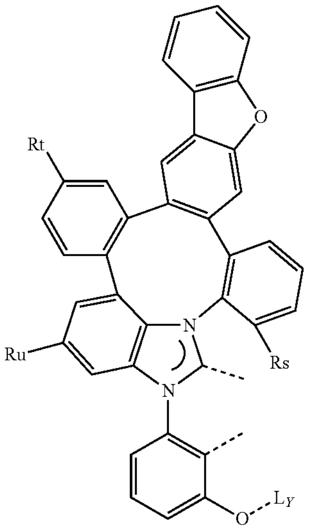 |
| $L_{A''}$230-(R1)(R1)(R1) to $L_{A''}$230-(R132)(R132)(R132) having the structure | 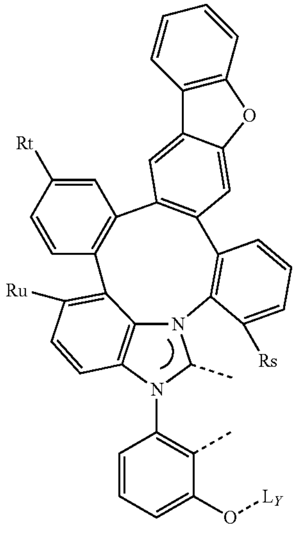 |
| $L_{A''}$231-(R1)(R1)(R1) to $L_{A''}$231-(R132)(R132)(R132) having the structure | 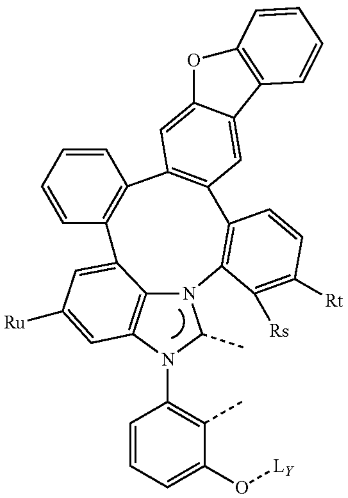 |

| Ligand $L_{A''}$ | Structure of $L_{A''}$ |
|---|---|
| $L_{A''}$232-(R1)(R1)(R1) to $L_{A''}$232-(R132)(R132)(R132) having the structure | 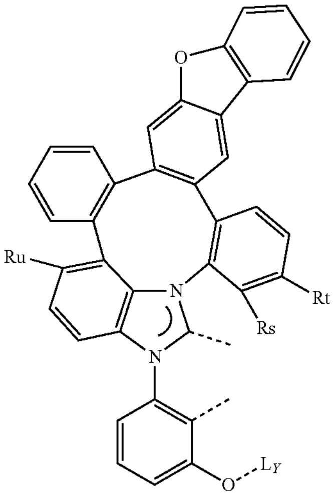 |
| $L_{A''}$233-(R1)(R1)(R1) to $L_{A''}$233-(R132)(R132)(R132) having the structure | 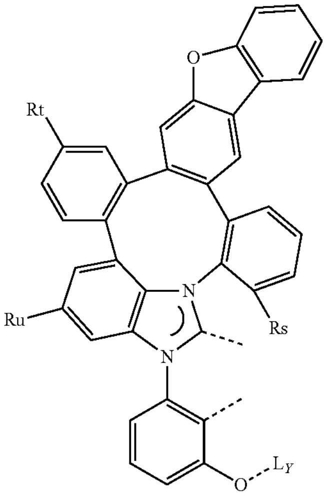 |
| $L_{A''}$234-(R1)(R1)(R1) to $L_{A''}$234-(R132)(R132)(R132) having the structure | 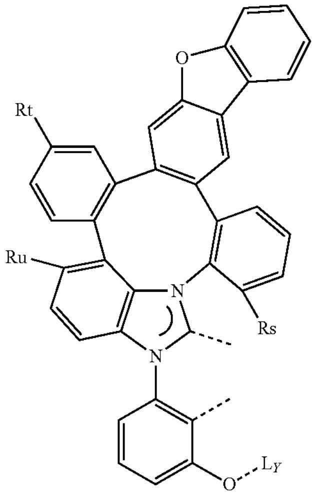 |
| Ligand $L_{A''}$ | Structure of $L_{A''}$ |
|---|---|
| $L_{A''}$235-(R1)(R1)(R1) to $L_{A''}$235-(R132)(R132)(R132) having the structure | 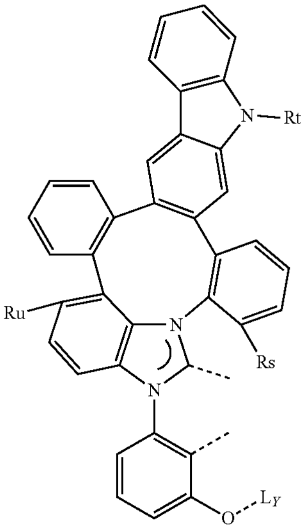 |
| $L_{A''}$236-(R1)(R1)(R1) to $L_{A''}$236-(R132)(R132)(R132) having the structure | 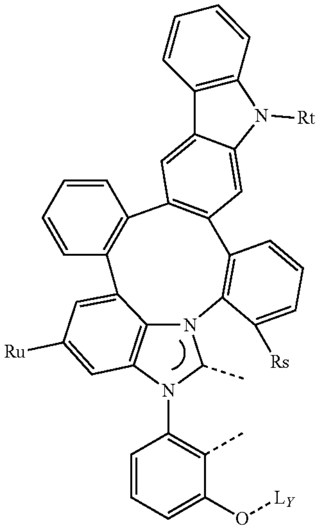 |
| $L_{A''}$237-(R1)(R1)(R1) to $L_{A''}$237-(R132)(R132)(R132) having the structure | 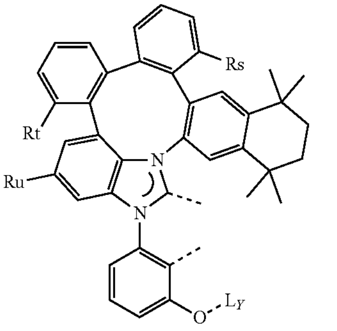 |

-continued

| Ligand $L_{A''}$ | Structure of $L_{A''}$ |
|---|---|
| $L_{A''}$238-(R1)(R1)(R1) to $L_{A''}$238-(R132)(R132)(R132) having the structure | 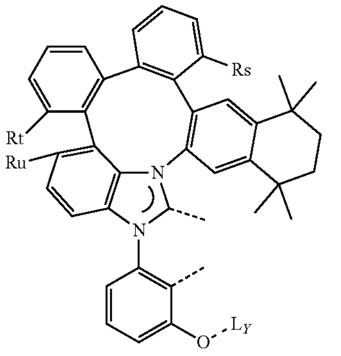 |
| $L_{A''}$239-(R1)(R1)(R1) to $L_{A''}$239-(R132)(R132)(R132) having the structure | 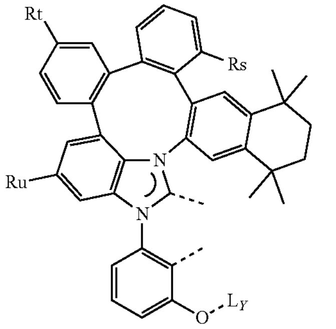 |
| $L_{A''}$240-(R1)(R1)(R1) to $L_{A''}$240-(R132)(R132)(R132) having the structure | 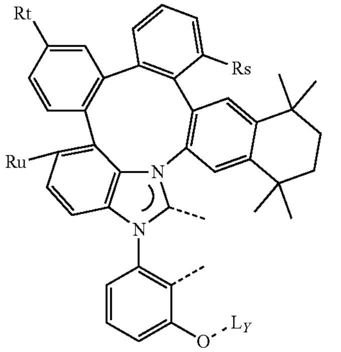 |
| $L_{A''}$241-(R1)(R1)(R1) to $L_{A''}$241-(R132)(R132)(R132) having the structure | 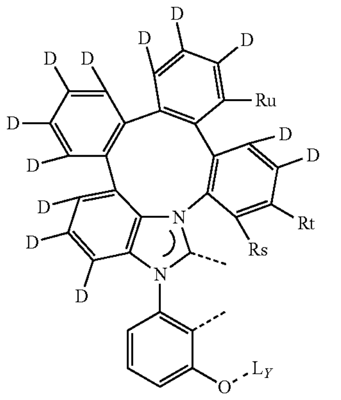 |

-continued

| Ligand $L_{A''}$ | Structure of $L_{A''}$ |
|---|---|
| $L_{A''}$242-(R1)(R1)(R1) to $L_{A''}$242-(R132)(R132)(R132) having the structure | 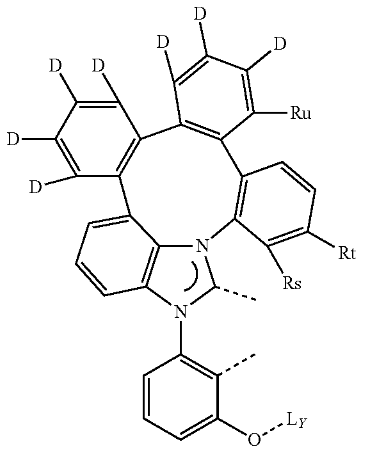 |
| $L_{A''}$243-(R1)(R1)(R1) to $L_{A''}$243-(R132)(R132)(R132) having the structure | 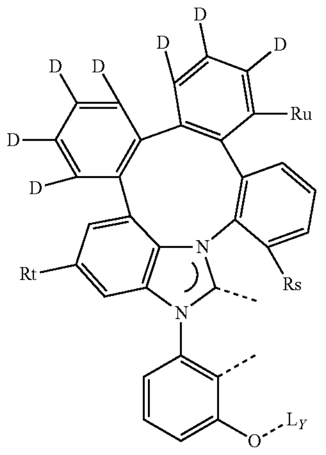 |
| $L_{A''}$244-(R1)(R1)(R1) to $L_{A''}$244-(R132)(R132)(R132) having the structure | 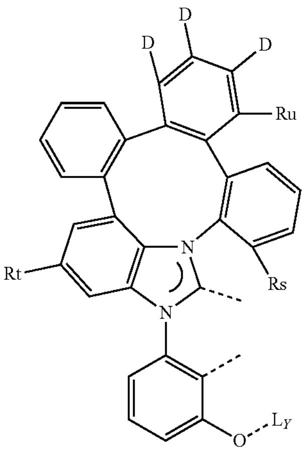 |

-continued

| Ligand $L_{A''}$ | Structure of $L_{A''}$ |
|---|---|
| $L_{A''}$245-(R1)(R1)(R1) to $L_{A''}$245-(R132)(R132)(R132) having the structure | 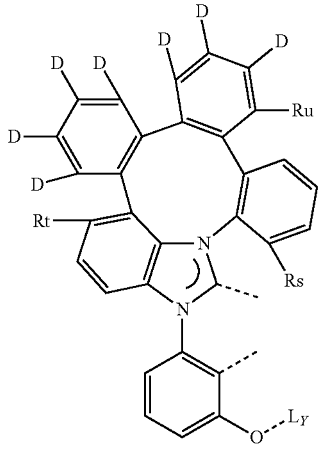 |
| $L_{A''}$246-(R1)(R1)(R1) to $L_{A''}$246-(R132)(R132)(R132) having the structure | 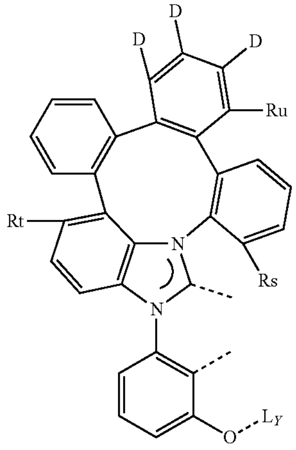 |
| $L_{A''}$247-(R1)(R1)(R1) to $L_{A''}$247-(R132)(R132)(R132) having the structure | 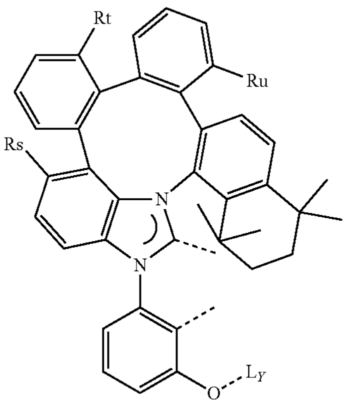 |

-continued

| Ligand $L_{A''}$ | Structure of $L_{A''}$ |
|---|---|
| $L_{A''}$248(R1)(R1)(R1) to $L_{A''}$248-(R132)(R132)(R132) having the structure | 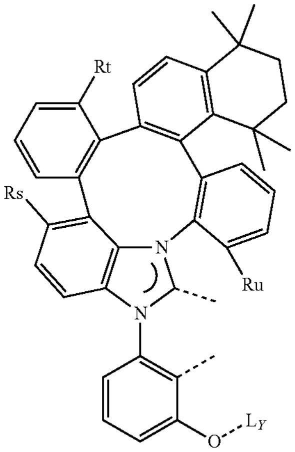 |
| $L_{A''}$249-(R1)(R1)(R1) to $L_{A''}$249-(R132)(R132)(R132) having the structure | 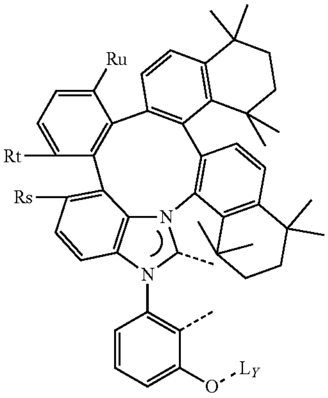 |
| $L_{A''}$250-(R1)(R1)(R1) to $L_{A''}$250-(R132)(R132)(R132) having the structure | 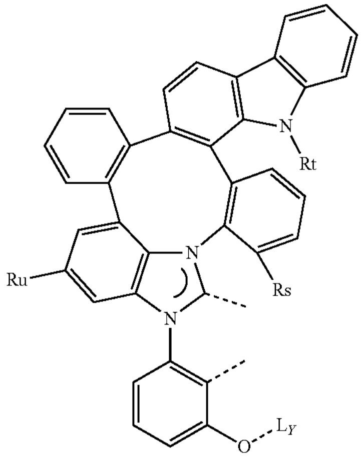 |

-continued

| Ligand $L_{A''}$ | Structure of $L_{A''}$ |
| --- | --- |
| $L_{A''}$251-(R1)(R1)(R1) to $L_{A''}$251-(R132)(R132)(R132) having the structure | 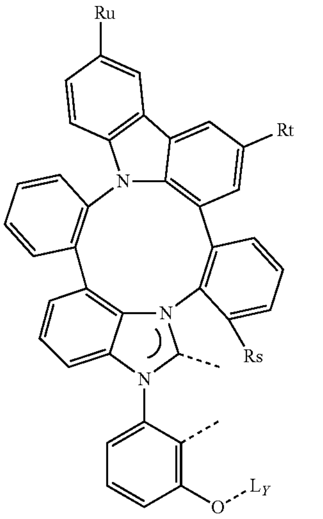 |
| $L_{A''}$252-(R1)(R1)(R1) to $L_{A''}$252-(R132)(R132)(R132) having the structure | 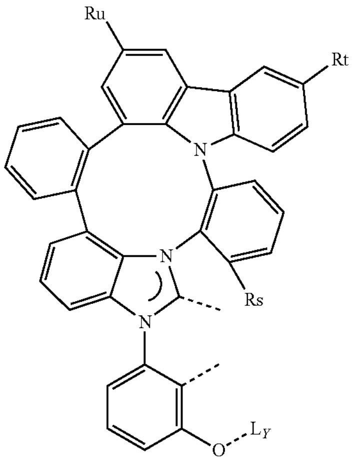 |
| $L_{A''}$253-(R1)(R1)(R1) to $L_{A''}$253-(R132)(R132)(R132) having the structure | 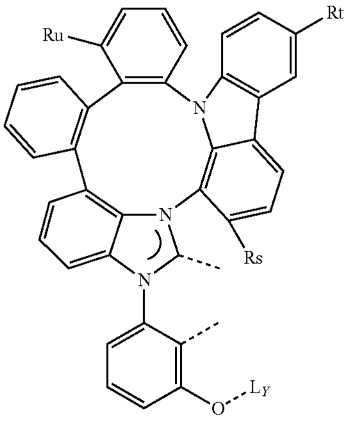 |

-continued

| Ligand $L_{A''}$ | Structure of $L_{A''}$ |
| --- | --- |
| $L_{A''}$254-(R1)(R1)(R1) to $L_{A''}$254-(R132)(R132)(R132) having the structure | 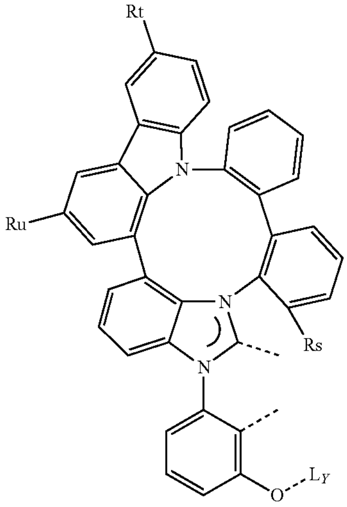 |
| $L_{A''}$255-(R1)(R1)(R1) to $L_{A''}$255-(R132)(R132)(R132) having the structure | 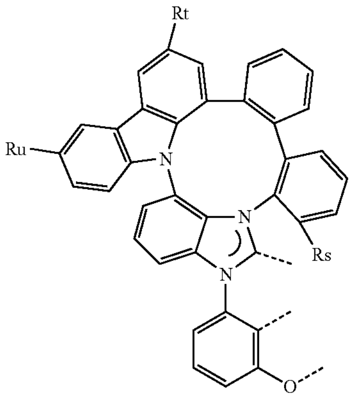 |
| $L_{A''}$256-(R1)(R1)(R1) to $L_{A''}$256-(R132)(R132)(R132) having the structure | 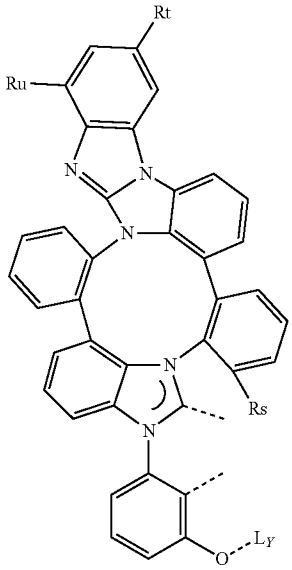 |

-continued

| Ligand $L_{A''}$ | Structure of $L_{A''}$ |
|---|---|
| $L_{A''}$257-(R1)(R1)(R1) to $L_{A''}$257-(R132)(R132)(R132) having the structure | 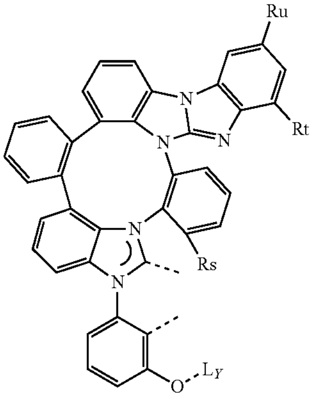 |
| $L_{A''}$258-(R1)(R1)(R1) to $L_{A''}$258-(R132)(R132)(R132) having the structure | 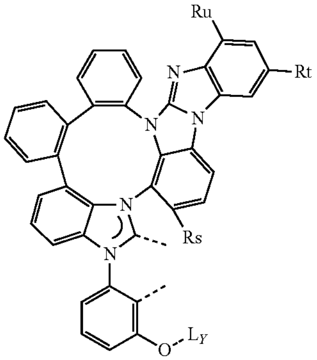 |
| $L_{A''}$259-(R1)(R1)(R1) to $L_{A''}$259-(R132)(R132)(R132) having the structure | 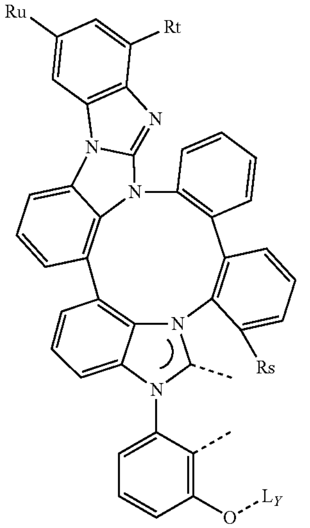 |
| $L_{A''}$260-(R1)(R1)(R1) to $L_{A''}$260-(R132)(R132)(R132) having the structure | 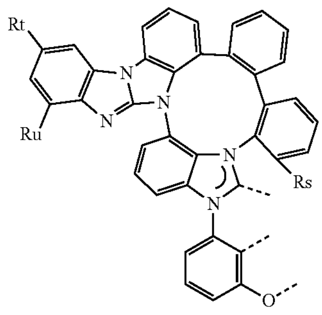 |

-continued

| Ligand $L_{A''}$ | Structure of $L_{A''}$ |
|---|---|
| $L_{A''}$261-(R1)(R1)(R1) to $L_{A''}$261-(R132)(R132)(R132) having the structure | 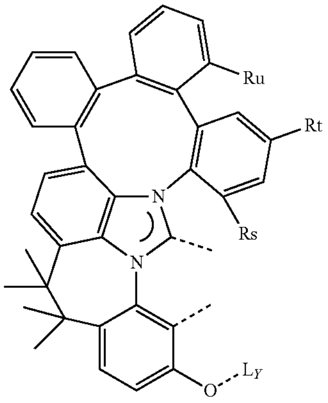 |
| $L_{A''}$262-(R1)(R1)(R1) to $L_{A''}$262-(R132)(R132)(R132) having the structure | 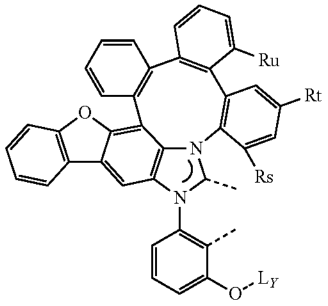 |

wherein the ligand $L_Y$ can be selected from the group consisting of: $L_Y$1-(Rs)(Rt)(Ru), $L_Y$2-(Rs)(Rt)(Ru), $L_Y$3-(Rs)(Rt)(Ru), $L_Y$4-(Rs)(Rt)(Ru), $L_Y$5-(Rs)(Rt)(Ru), $L_Y$6-(Rs)(Rt)(Ru), $L_Y$7-(Rs)(Rt)(Ru), $L_Y$8-(Rs)(Rt)(Ru), $L_Y$9-(Rs)(Rt)(Ru), $L_Y$10-(Rs)(Rt)(Ru), $L_Y$11-(Rs)(Rt)(Ru), $L_Y$12-(Rs)(Rt)(Ru), $L_Y$13-(Rs)(Rt)(Ru), $L_y$14-(Rs)(Rt)(Ru), $L_Y$15-(Rs)(Rt)(Ru), $L_Y$16-(Rs)(Rt)(Ru), $L_Y$17-(Rs)(Rt)(Ru), $L_Y$18-(Rs)(Rt)(Ru), $L_Y$19-(Rs)(Rt)(Ru), $L_Y$20-(Rs)(Rt)(Ru), $L_Y$21-(Rs)(Rt)(Ru), $L_Y$22-(Rs)(Rt)(Ru), $L_Y$23-(Rs)(Rt)(Ru), $L_Y$24-(Rs)(Rt)(Ru), $L_Y$25-(Rs)(Rt)(Ru), $L_Y$26-(Rs)(Rt)(Ru), $L^Y$27-(Rs)(Rt)(Ru), $L_Y$28-(Rs)(Rt)(Ru), $L_Y$29-(Rs)(Rt)(Ru), $L_Y$30-(Rs)(Rt)(Ru), $L_Y$31-(Rs)(Rt)(Ru), $L_Y$32-(Rs)(Rt)(Ru), $L_Y$33-(Rs)(Rt)(Ru), wherein s, t, and u are each independently an integer from 1 to 132, and the structure of each of $L_Y$1-(R1)(R1)(R1) to $L_Y$33-(R132)(R132)(R132) is defined in the following LIST 8:

| $L_Y$ | Structure of $L_Y$ |
|---|---|
| $L_Y$1-(R1)(R1)(R1) to $L_Y$1-(R132)(R132)(R132), having the structure | 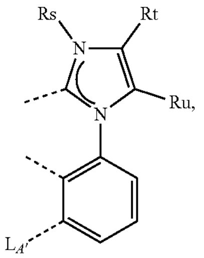 |

-continued

| $L_Y$ | Structure of $L_Y$ |
|---|---|
| $L_Y$2-(R1)(R1)(R1) to $L_Y$2-(R132)(R132)(R132), having the structure | 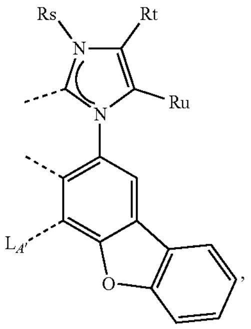 |
| $L_Y$3-(R1)(R1)(R1) to $L_Y$3-(R132)(R132)(R132) having the structure | 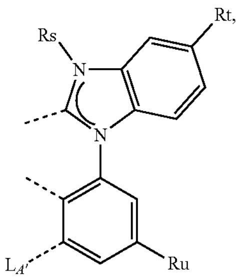 |
| $L_Y$4-(R1)(R1)(R1) to $L_Y$4-(R132)(R132)(R132) having the structure | 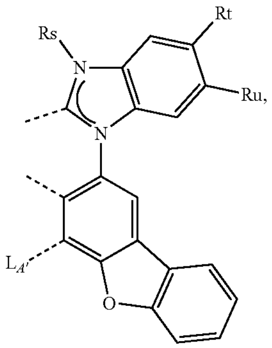 |
| $L_Y$5-(R1)(R1)(R1) to $L_Y$5-(R132)(R132)(R132) having the structure | 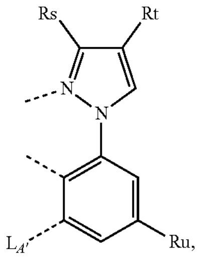 |
| $L_Y$6-(R1)(R1)(R1) to $L_Y$6-(R132)(R132)(R132) having the structure | 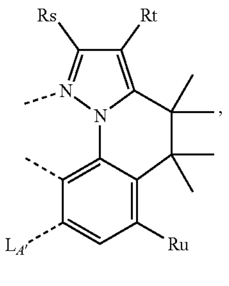 |

-continued

| $L_Y$ | Structure of $L_Y$ |
|---|---|
| $L_Y$7-(R1)(R1)(R1) to $L_Y$7-(R132)(R132)(R132) having the structure | 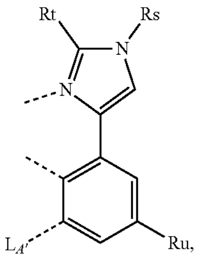 |
| $L_Y$8-(R1)(R1)(R1) to $L_Y$8-(R132)(R132)(R132) having the structure | 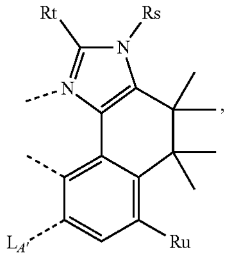 |
| $L_Y$9-(R1)(R1)(R1) to $L_Y$9-(R132)(R132)(R132) having the structure | 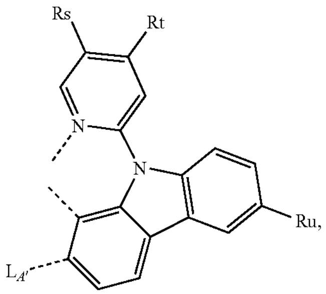 |
| $L_Y$10-(R1)(R1)(R1) to $L_Y$10-(R132)(R132)(R132) having the structure | 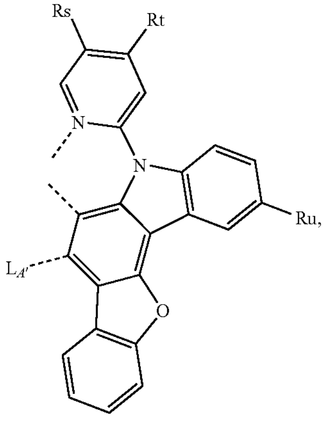 |

-continued

| $L_Y$ | Structure of $L_Y$ |
| --- | --- |
| $L_Y$11-(R1)(R1)(R1) to $L_Y$11-(R132)(R132)(R132) having the structure | 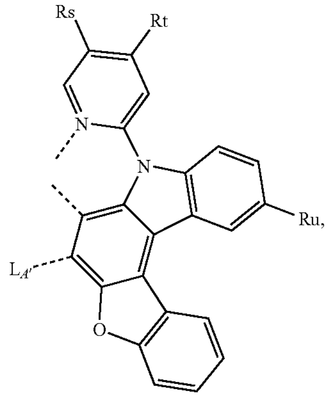 |
| $L_Y$12-(R1)(R1)(R1) to $L_Y$12-(R132)(R132)(R132) having the structure | 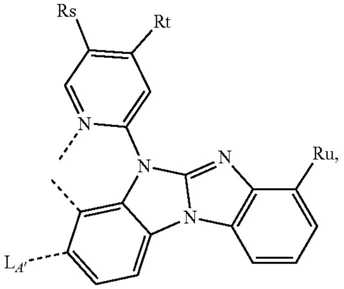 |
| $L_Y$13-(R1)(R1)(R1) to $L_Y$13-(R132)(R132)(R132) having the structure | 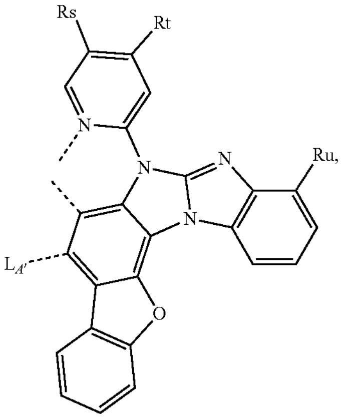 |
| $L_Y$14-(R1)(R1)(R1) to $L_Y$14-(R132)(R132)(R132) having the structure | 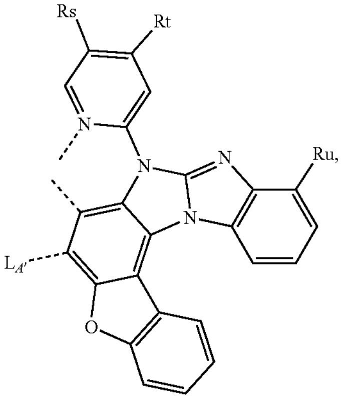 |

-continued

| $L_Y$ | Structure of $L_Y$ |
| --- | --- |
| $L_Y$15-(R1)(R1)(R1) to $L_Y$15-(R132)(R132)(R132) having the structure | 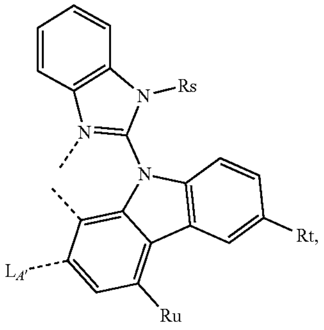 |
| $L_Y$16-(R1)(R1)(R1) to $L_Y$16-(R132)(R132)(R132) having the structure | 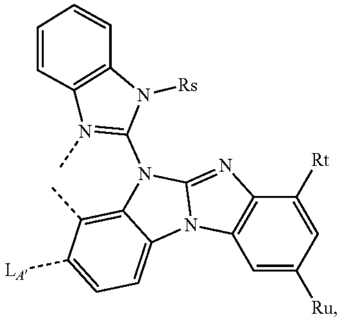 |
| $L_Y$17-(R1)(R1)(R1) to $L_Y$17-(R132)(R132)(R132) having the structure | 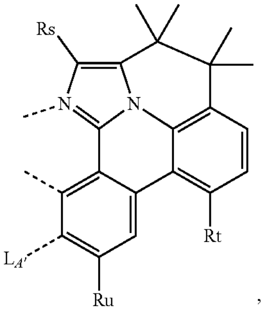 , |
| $L_Y$18-(R1)(R1)(R1) to $L_Y$18-(R132)(R132)(R132), having the structure | 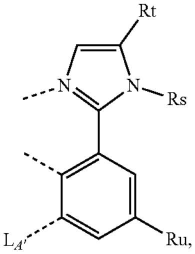 |
| $L_Y$19-(R1)(R1)(R1) to $L_Y$19-(R132)(R132)(R132) having the structure | 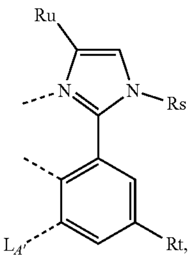 |

-continued

| $L_Y$ | Structure of $L_Y$ |
|---|---|
| $L_Y$20-(R1)(R1)(R1) to $L_Y$20-(R132)(R132)(R132) having the structure | 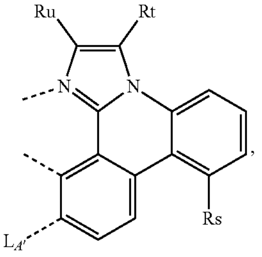 |
| $L_Y$21-(R1)(R1)(R1) to $L_Y$21-(R132)(R132)(R132) having the structure | 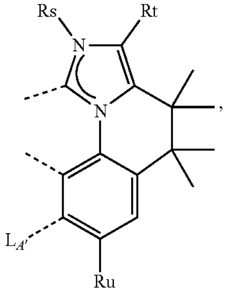 |
| $L_Y$22-(R1)(R1)(R1) to $L_Y$22-(R132)(R132)(R132) having the structure | 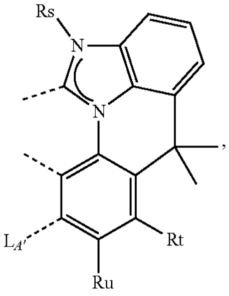 |
| $L_Y$23-(R1)(R1)(R1) to $L_Y$23-(R132)(R132)(R132) having the structure | 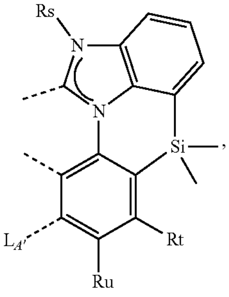 |
| $L_Y$24-(R1)(R1)(R1) to $L_Y$24-(R132)(R132)(R132) having the structure | 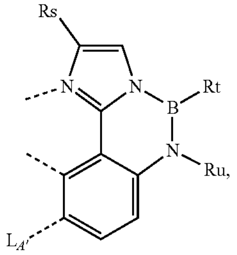 |

-continued

| $L_Y$ | Structure of $L_Y$ |
|---|---|
| $L_Y$25-(R1)(R1)(R1) to $L_Y$25-(R132)(R132)(R132) having the structure | 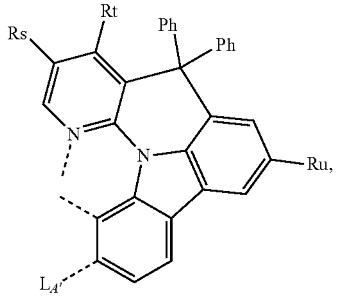 |
| $L_Y$26-(R1)(R1)(R1) to $L_Y$26-(R132)(R132)(R132) having the structure | 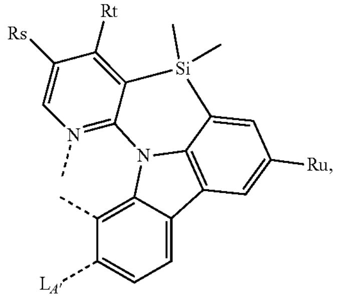 |
| $L_Y$27-(R1)(R1)(R1) to $L_Y$27-(R132)(R132)(R132) having the structure | 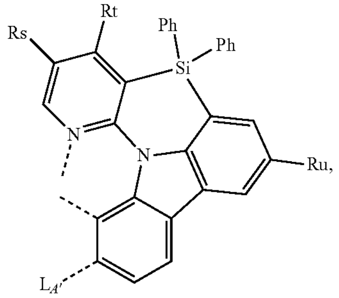 |
| $L_Y$28-(R1)(R1)(R1) to $L_Y$28-(R132)(R132)(R132) having the structure | 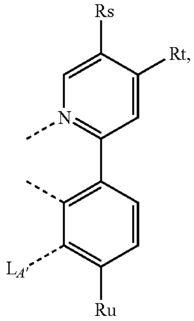 |
| $L_Y$29-(R1)(R1)(R1) to $L_Y$29-(R132)(R132)(R132) having the structure | 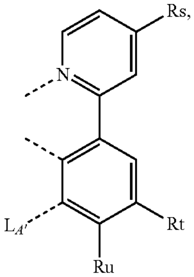 |

-continued
| $L_Y$ | Structure of $L_Y$ |
|---|---|
| $L_Y$30-(R1)(R1)(R1) to $L_Y$30-(R132)(R132)(R132) having the structure | 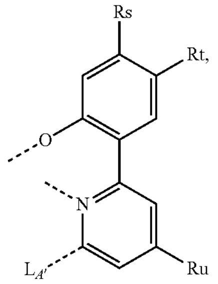 |
| $L_Y$31-(R1)(R1)(R1) to $L_Y$31-(R132) R132)(R132) having the structure | 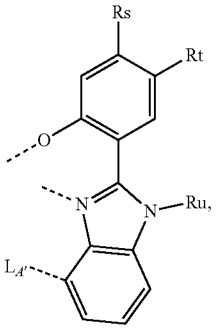 |
| $L_Y$32-(R1)(R1)(R1) to $L_Y$32-(R132)(R132)(R132) having the structure | 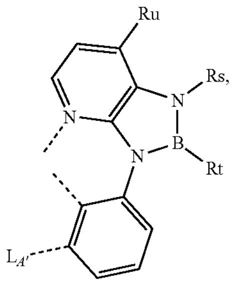 |
| $L_Y$33-(R1)(R1)(R1) to $L_Y$33-(R132)(R132)(R132) having the structure | 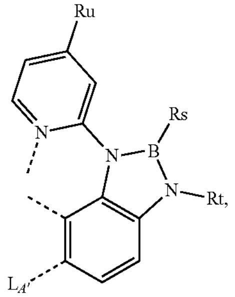 |
wherein R1 to R132 have the structures defined in LIST 1.
In some embodiments, the compound can be selected from the group consisting of the structures below in LIST 9:
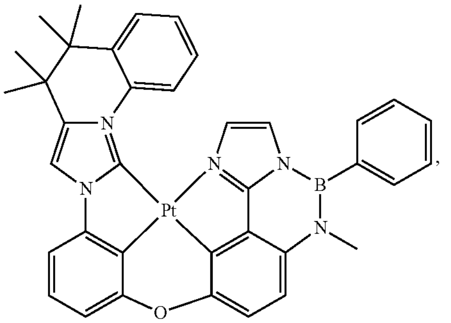
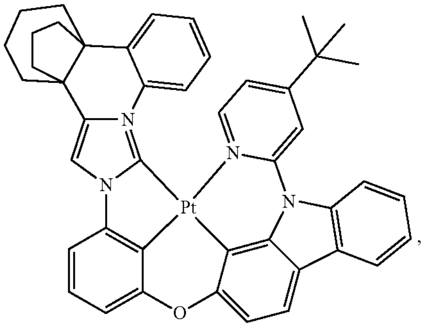
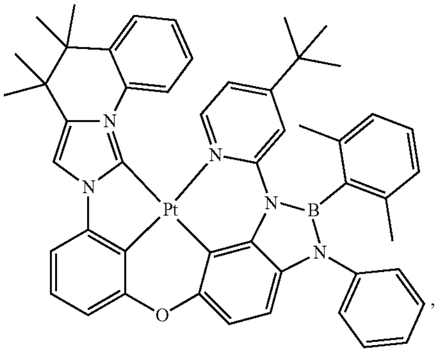
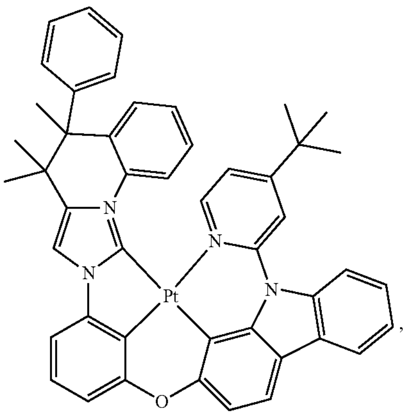

-continued
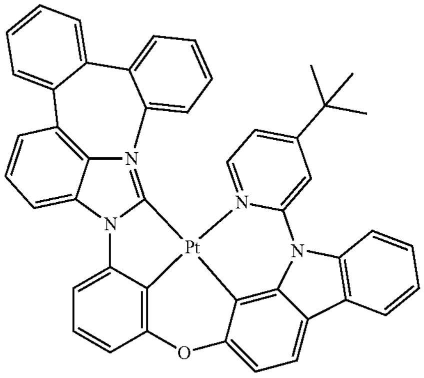
,
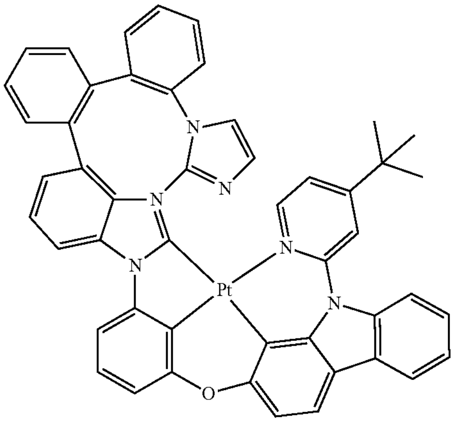
,
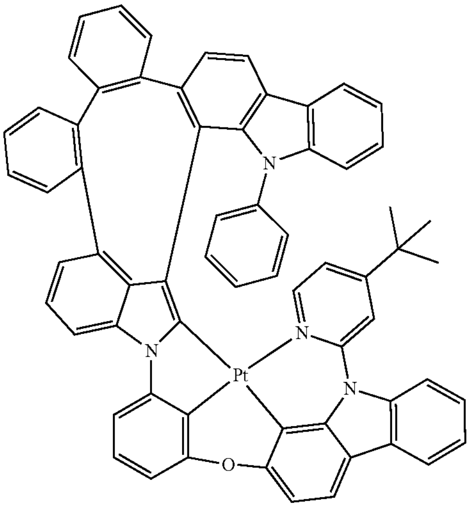
,
-continued
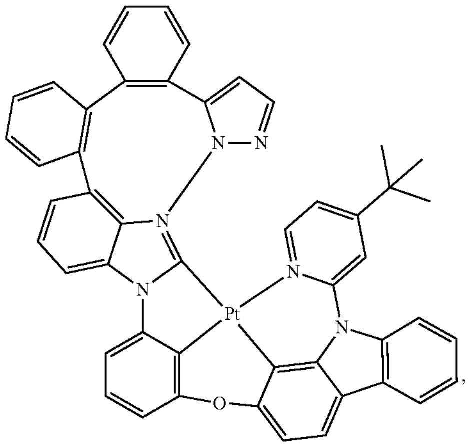
,
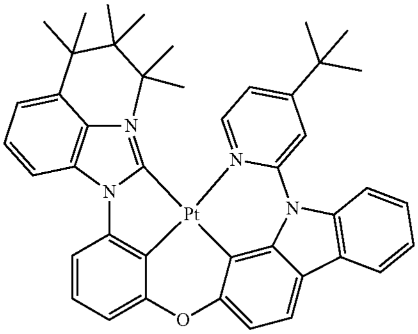
,
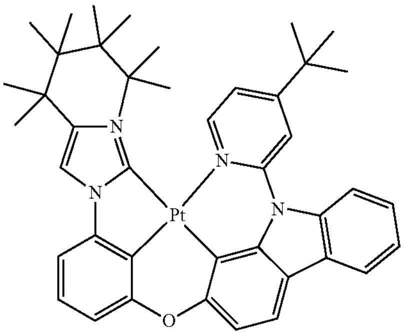
,
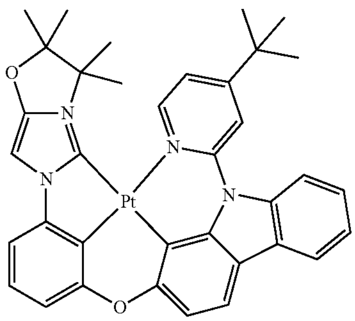
, -continued
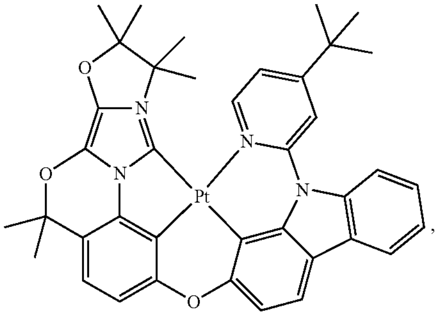,
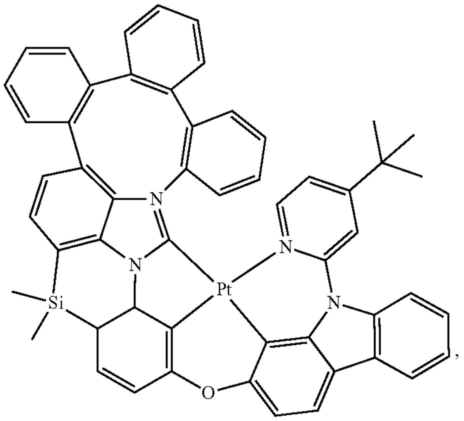,
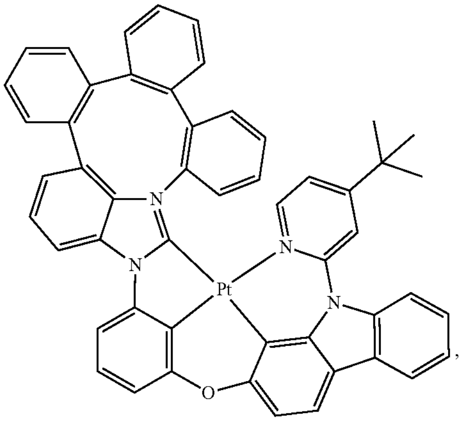,
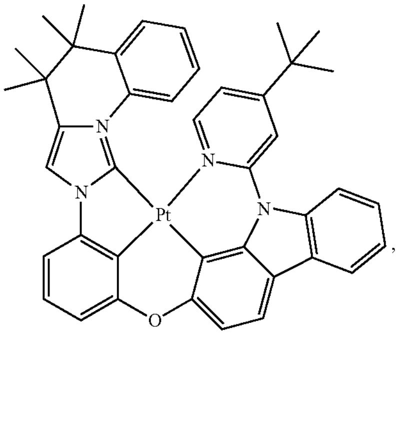,
-continued
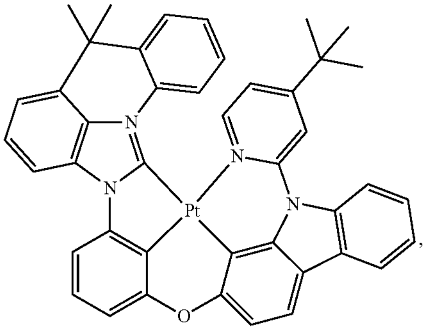,
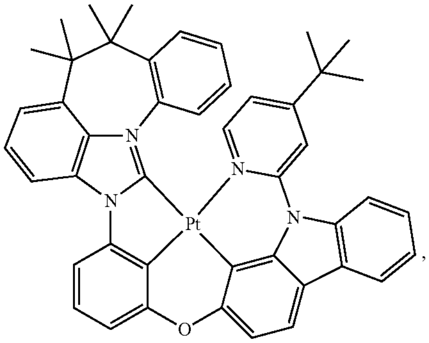,
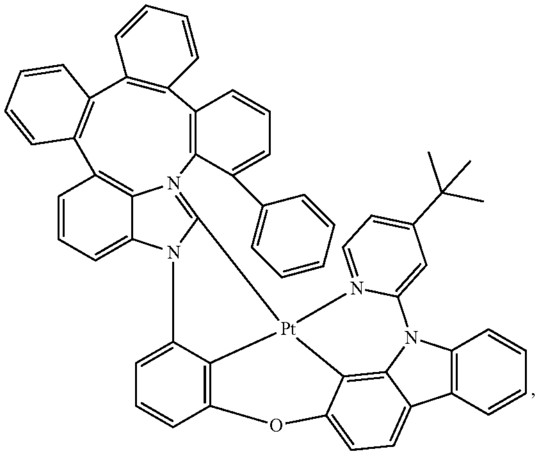,
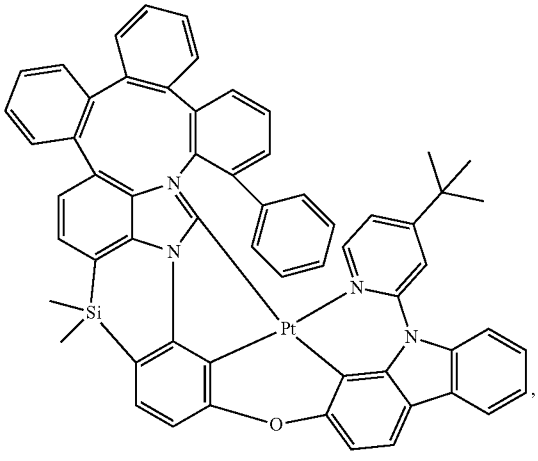, -continued
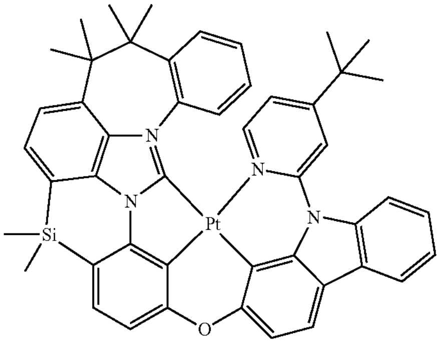
,
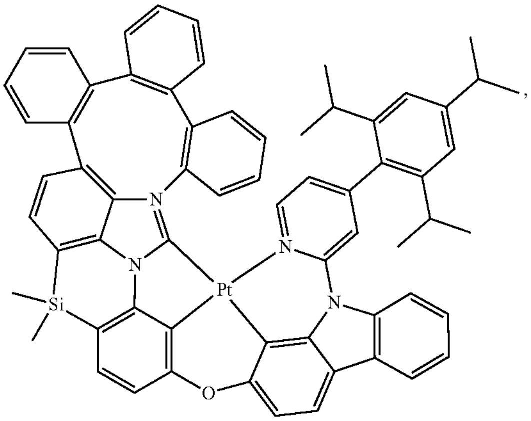
,
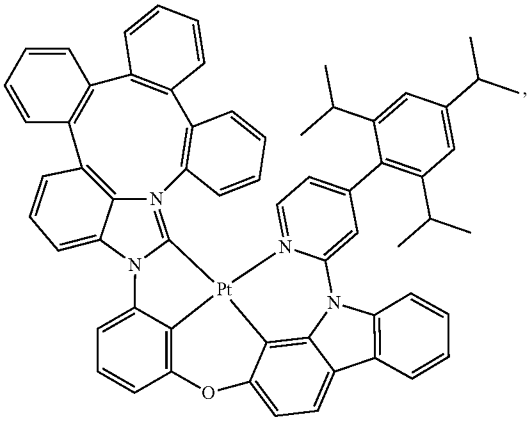
,
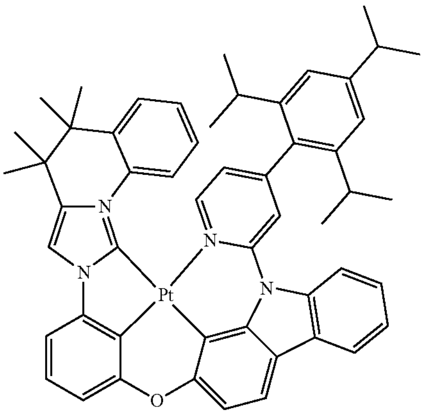
,
-continued
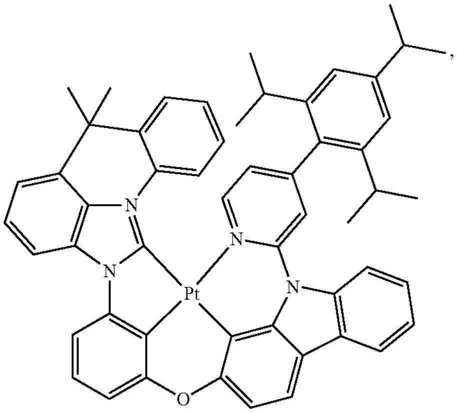
,
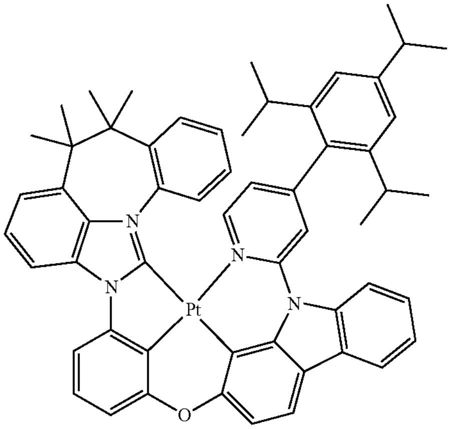
,
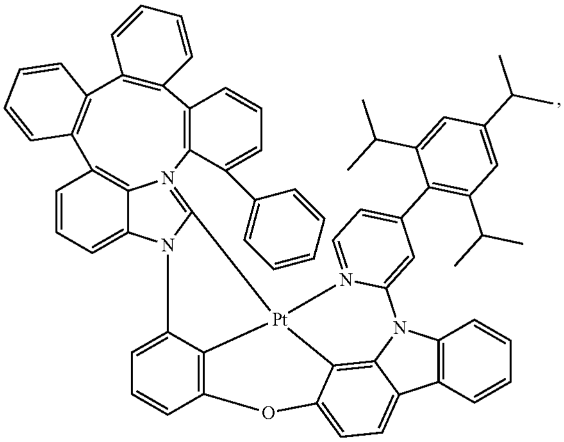
,
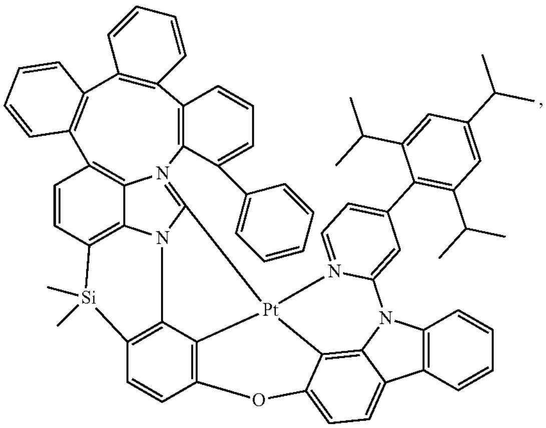
, -continued
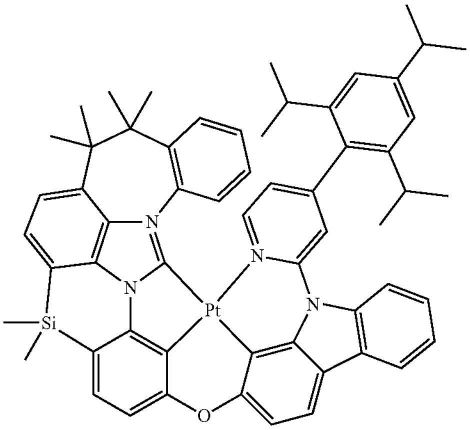
,
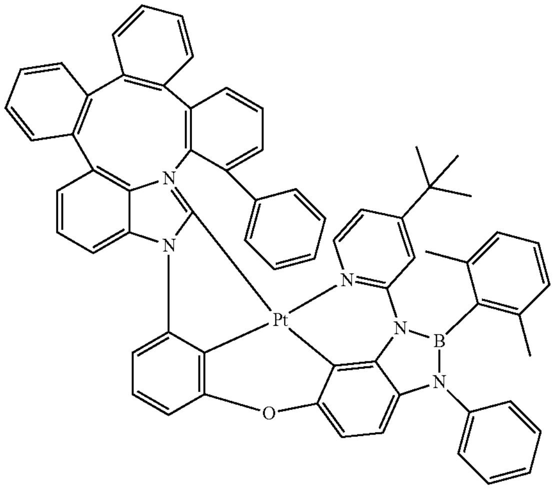
,
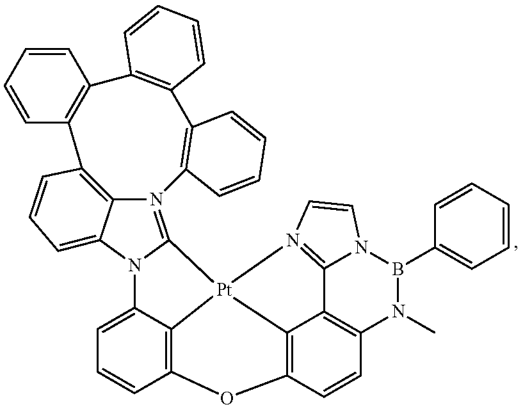
,
-continued
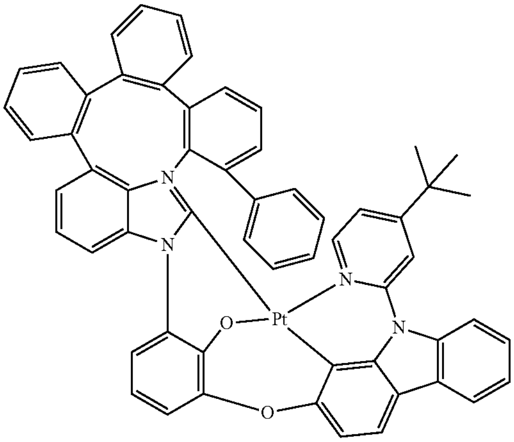
,
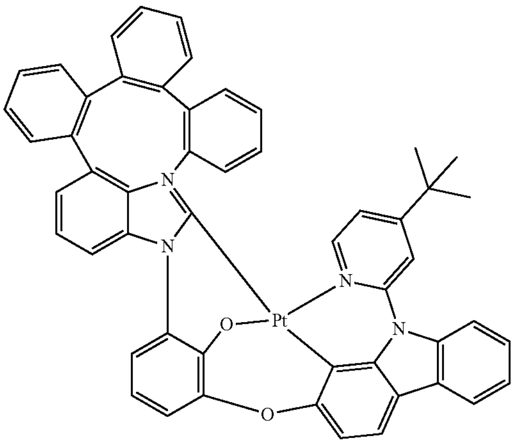
,
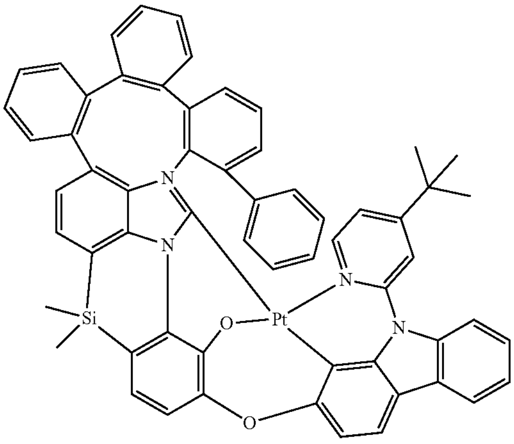
, -continued
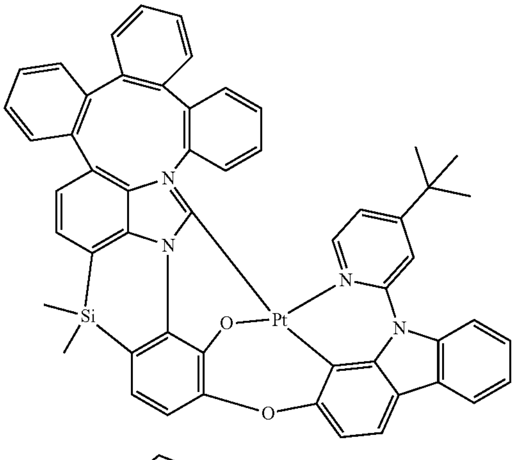
,
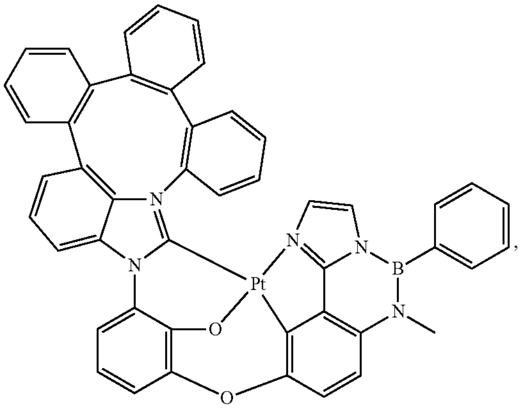
,
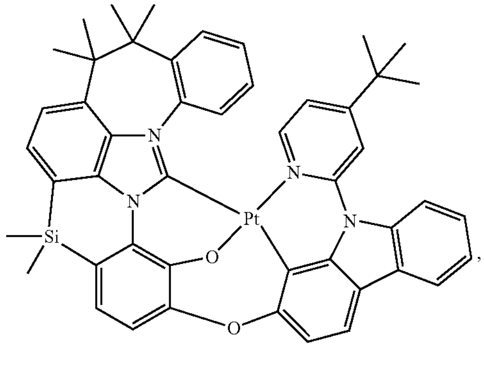
,
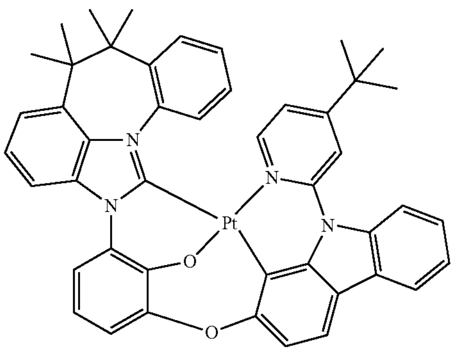
,
-continued
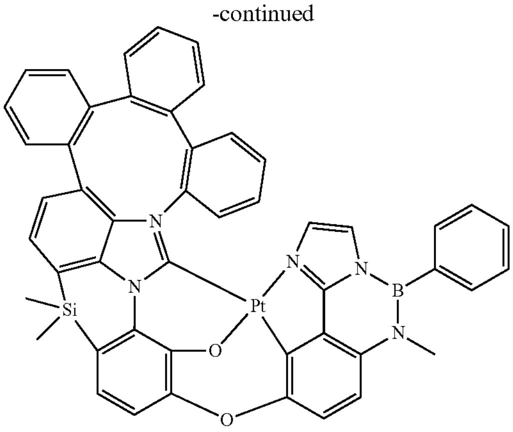
,
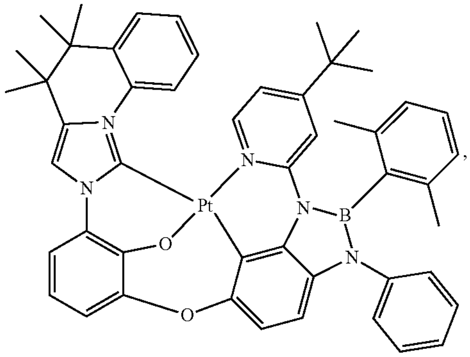
,
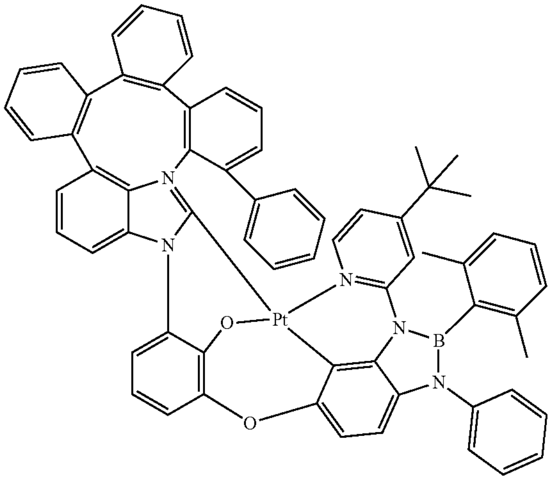
,
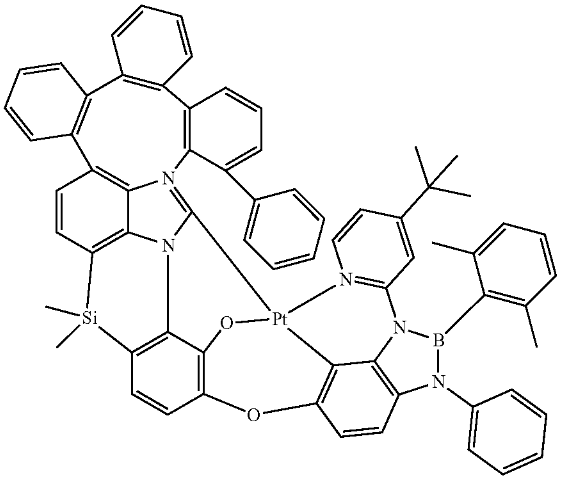
, -continued
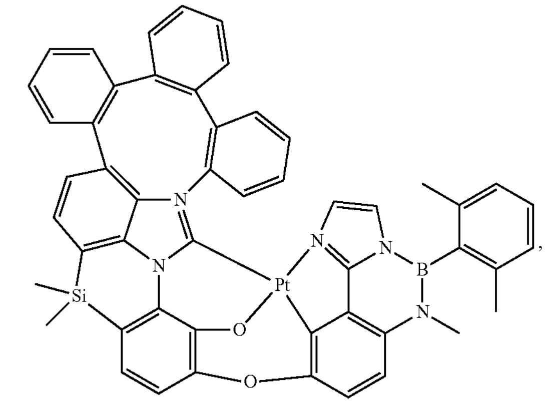
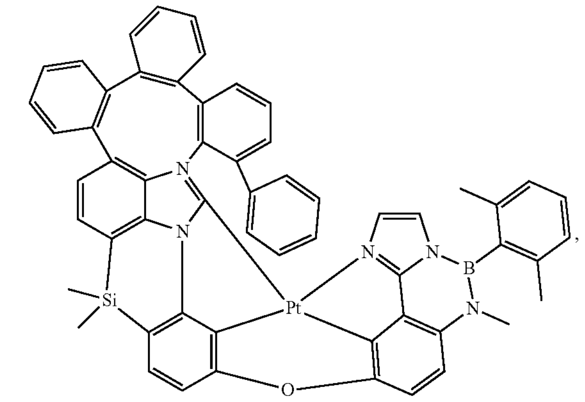
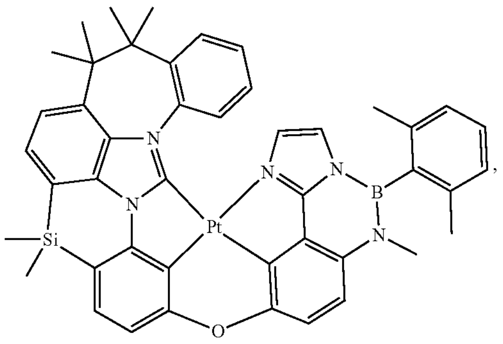
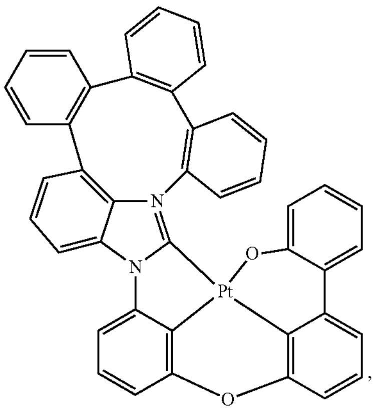
-continued
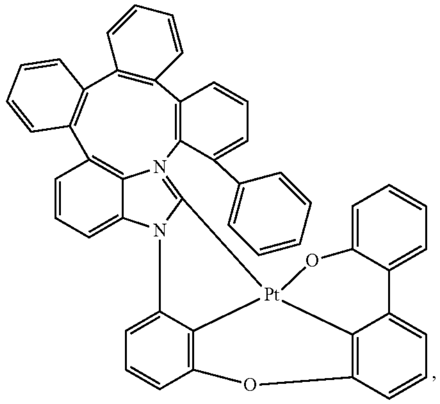
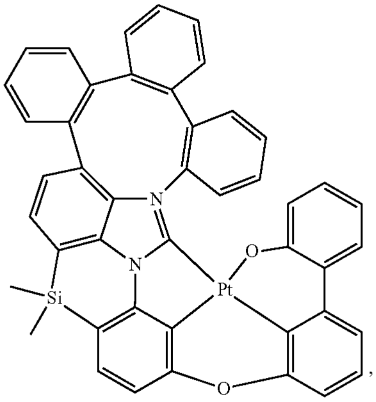
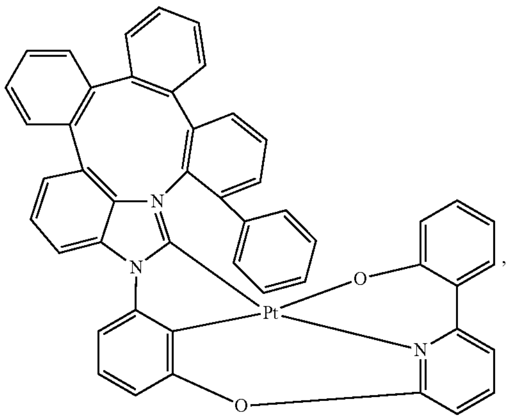
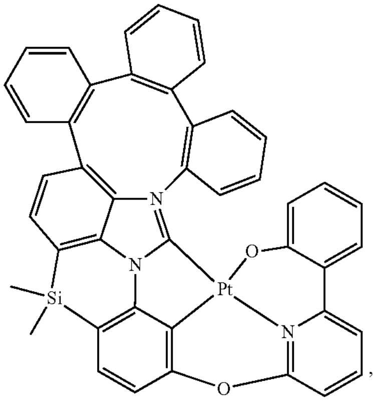

-continued
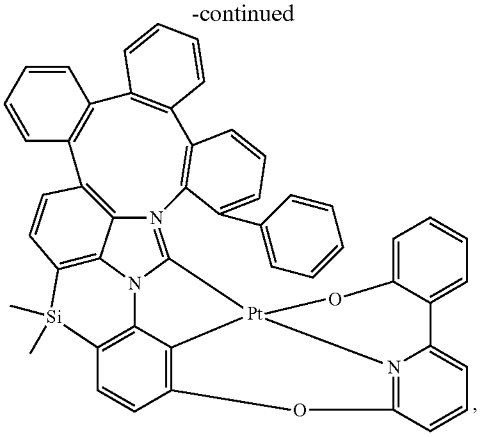
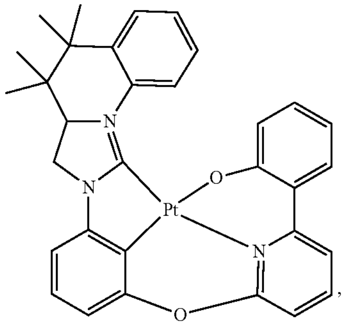
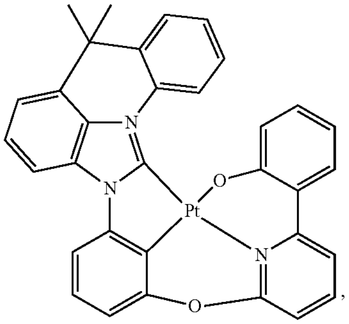
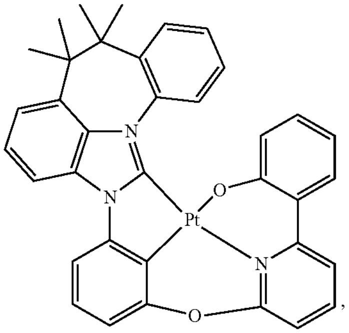
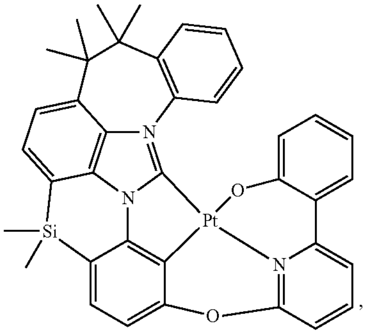
-continued
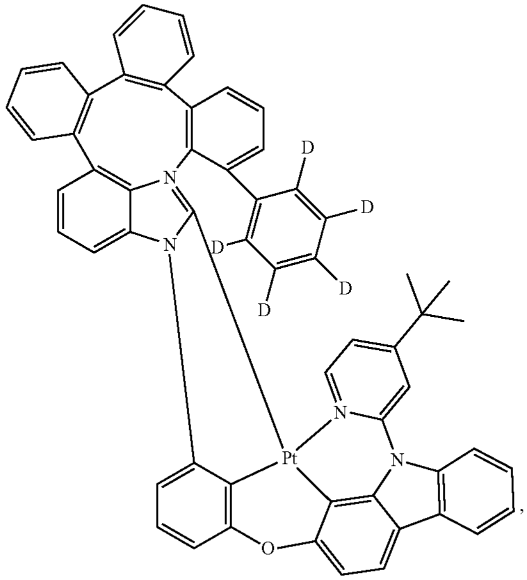
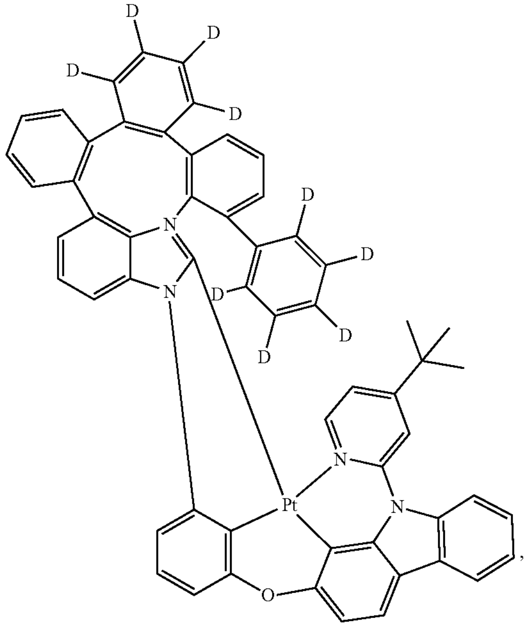

-continued
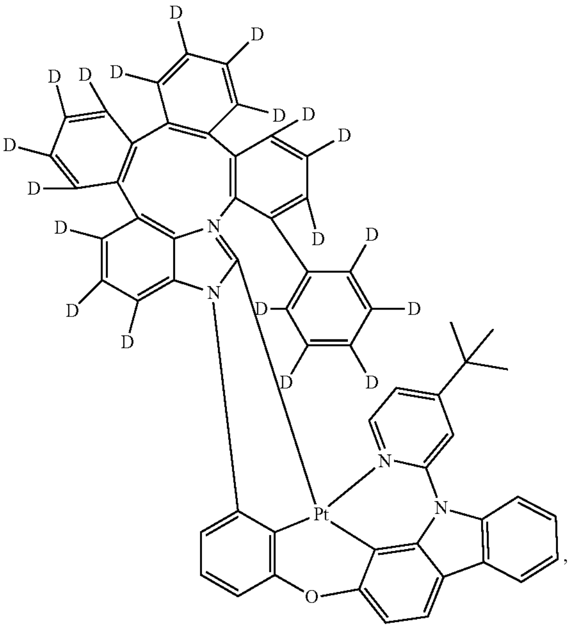
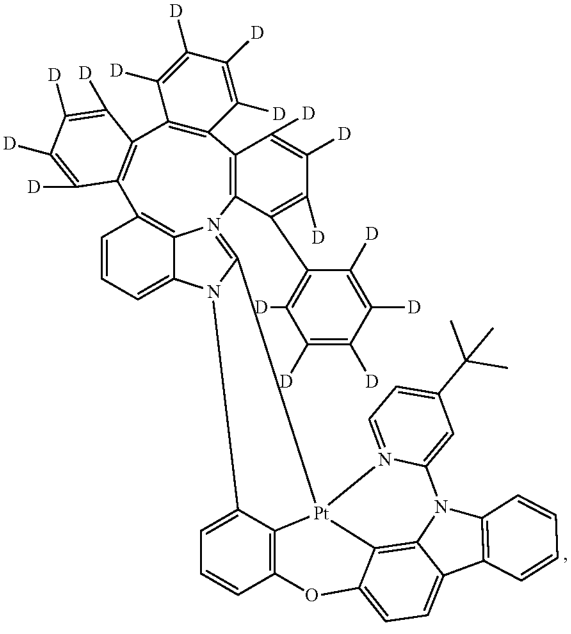
-continued
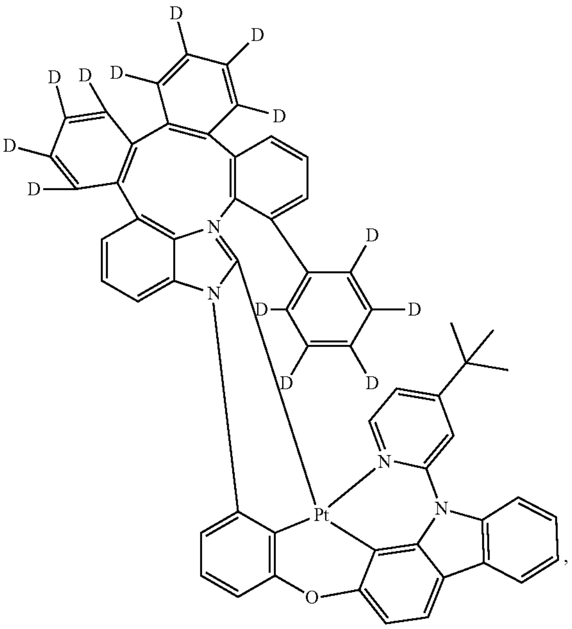
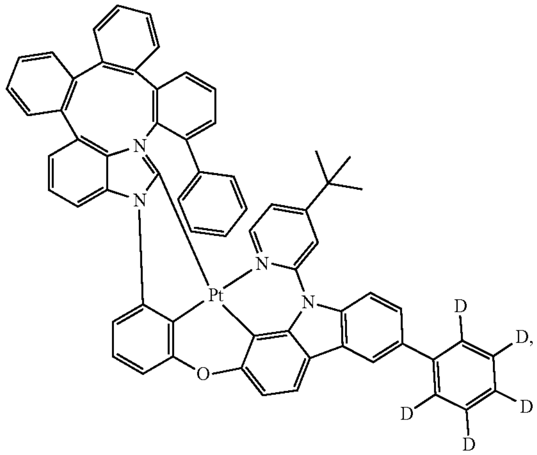
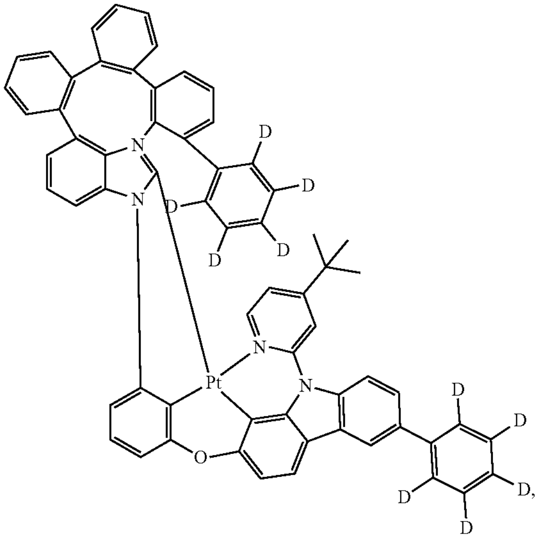

-continued
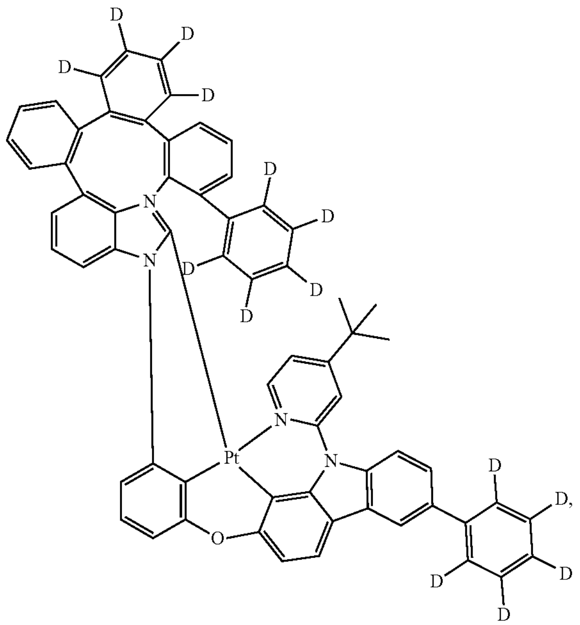
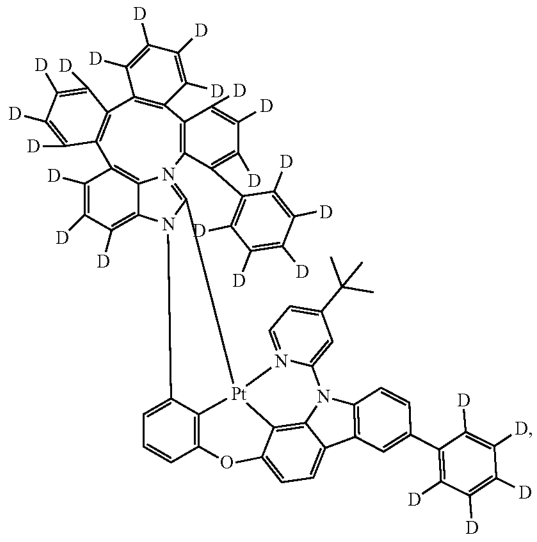
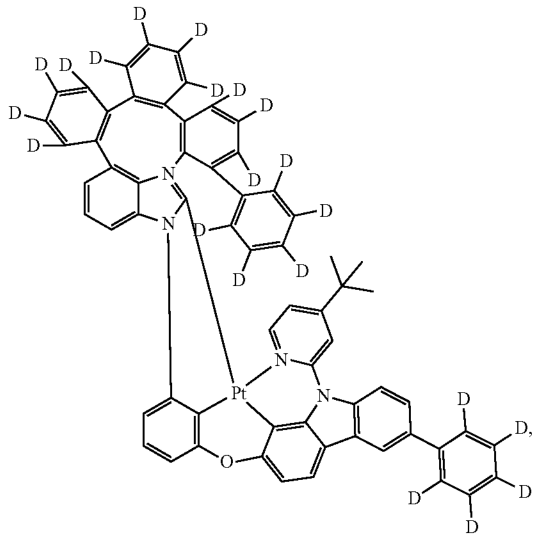
-continued
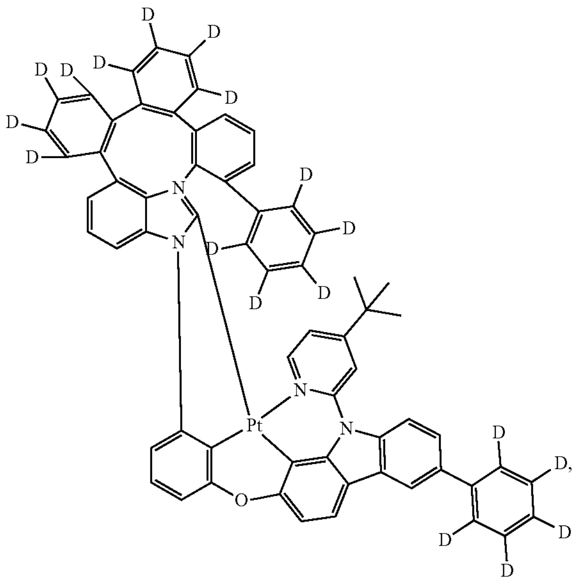
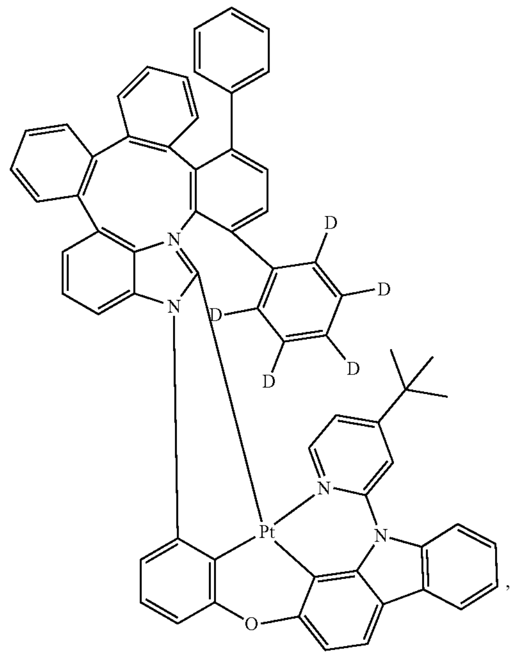
, -continued
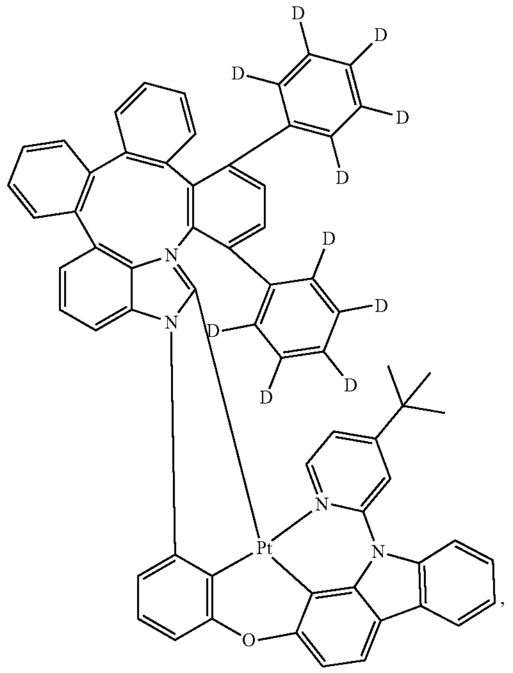
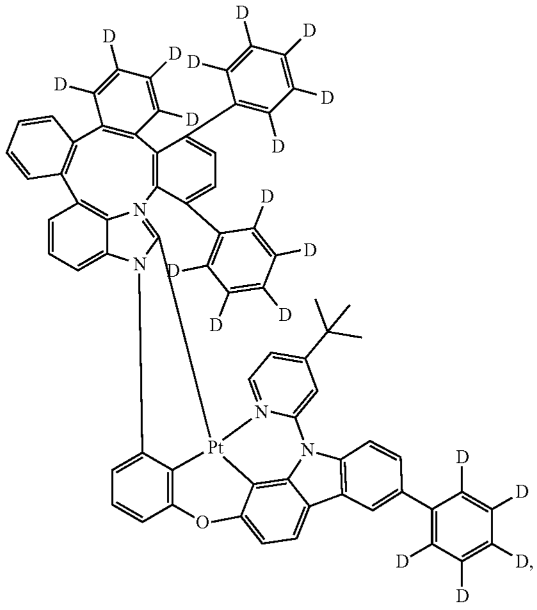
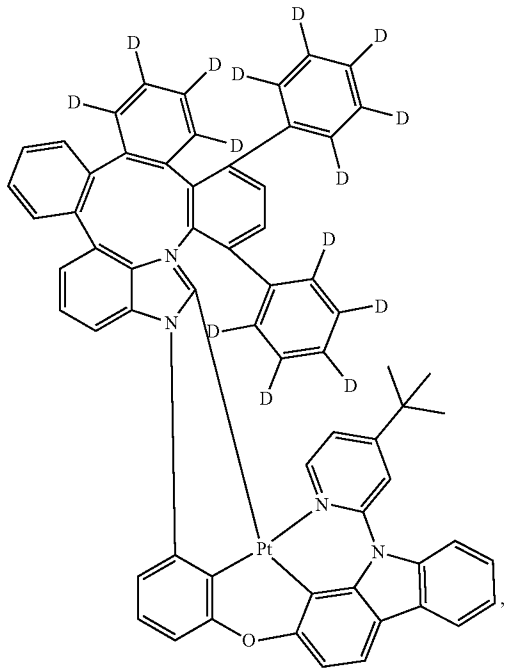
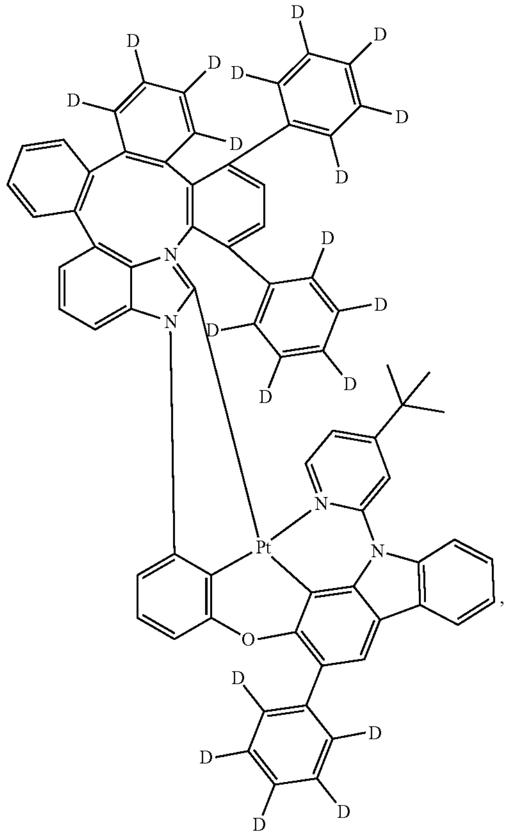

-continued
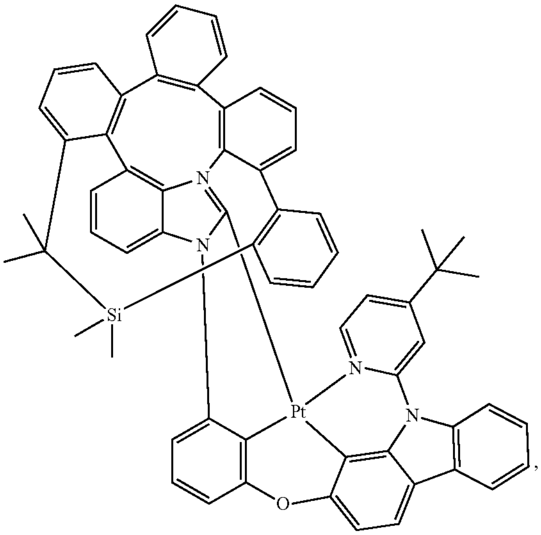
,
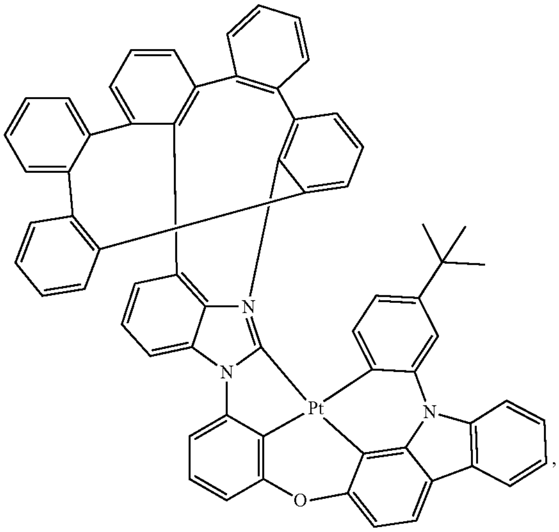
,
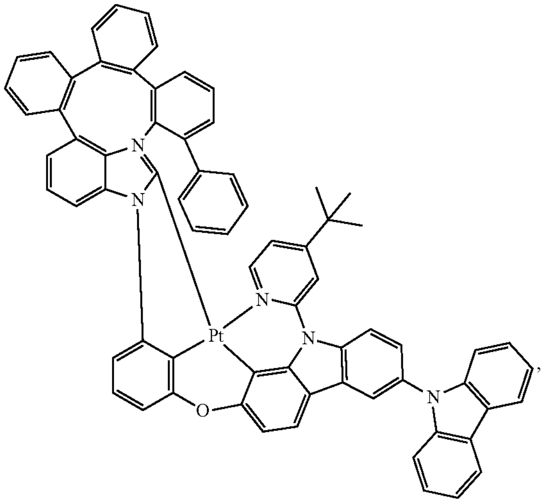
,
-continued
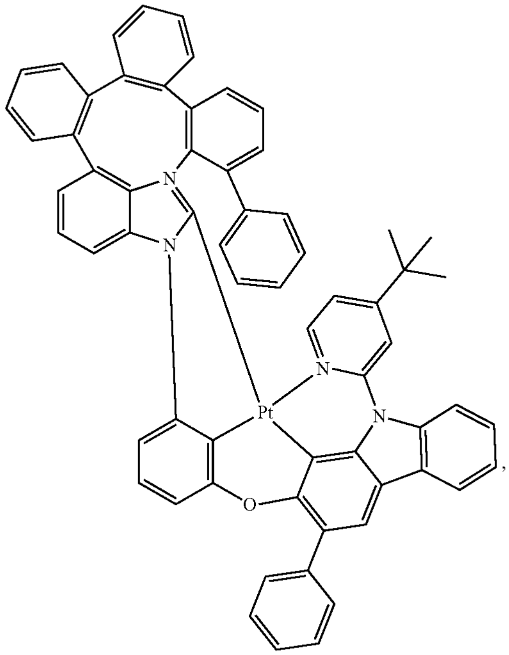
,
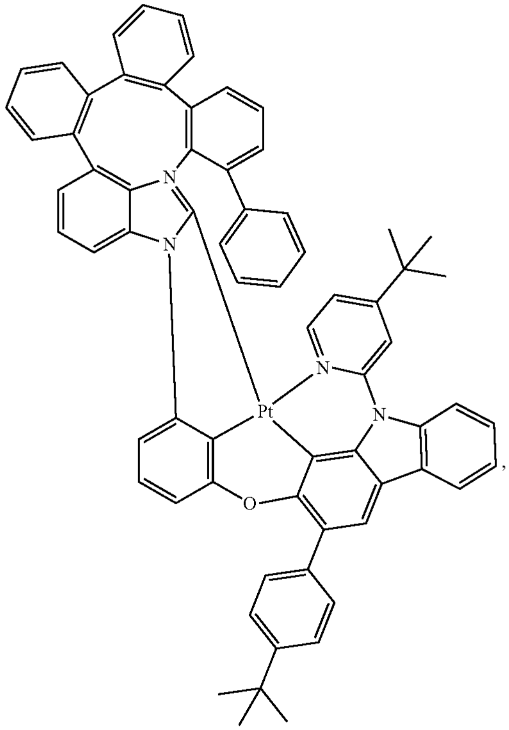
, -continued
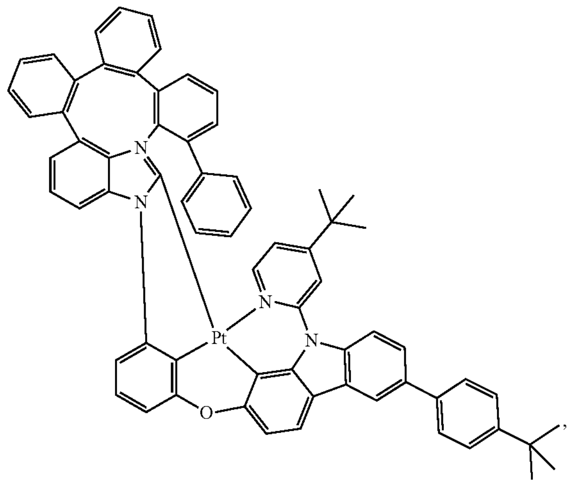
,
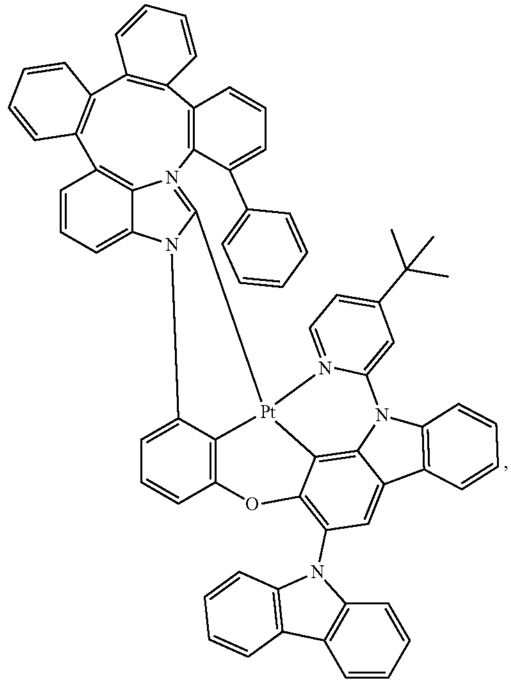
,
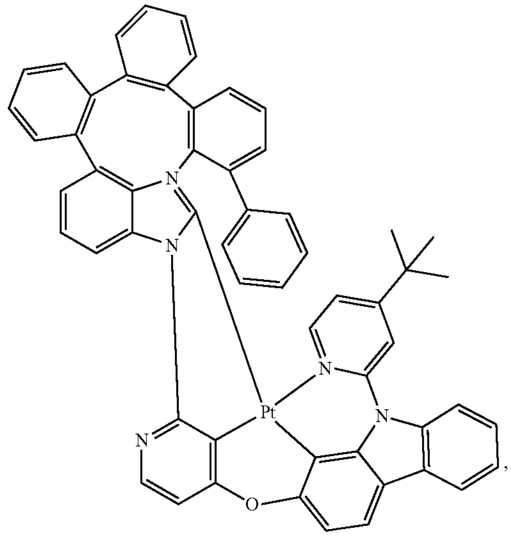
,
-continued
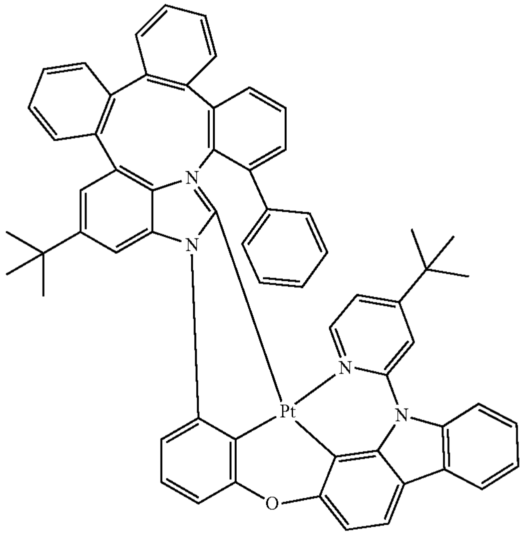
,
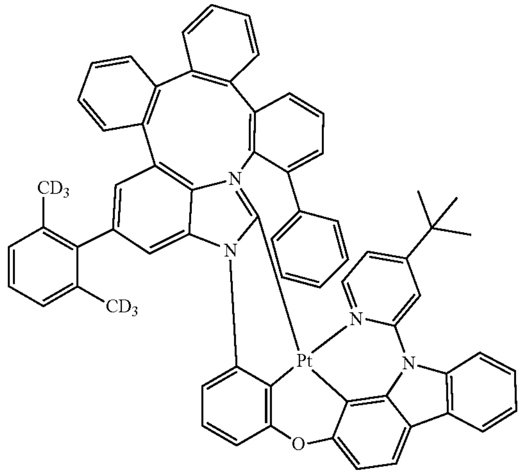
,
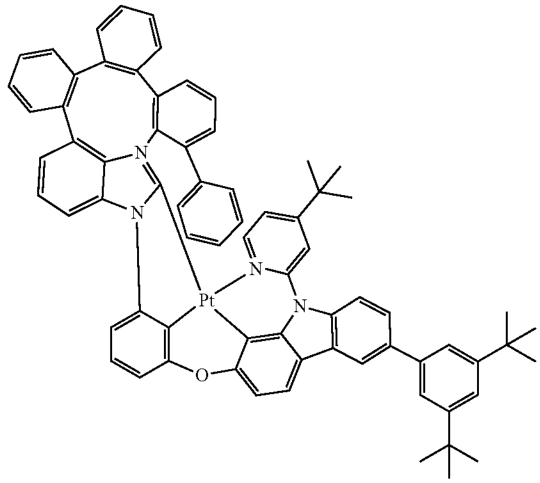
, -continued
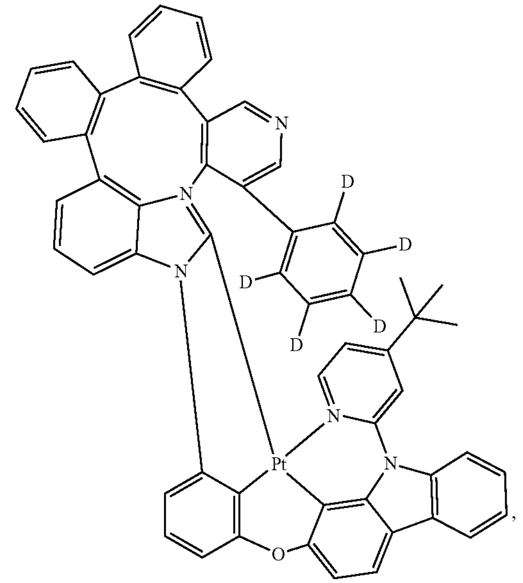
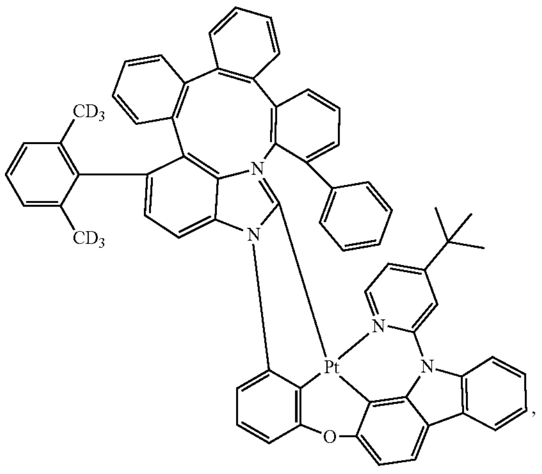
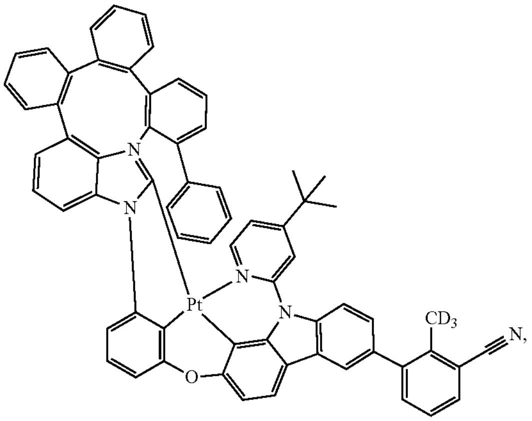
-continued
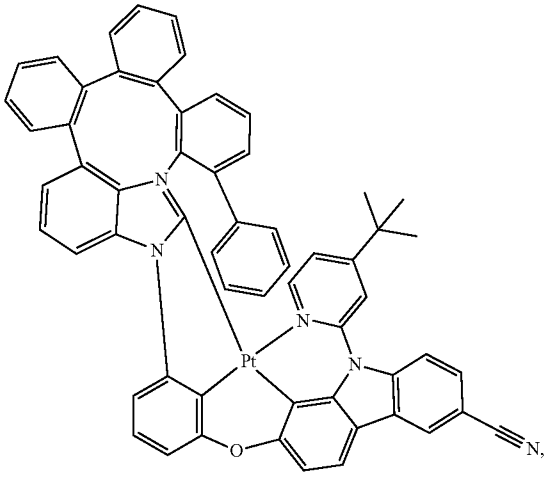
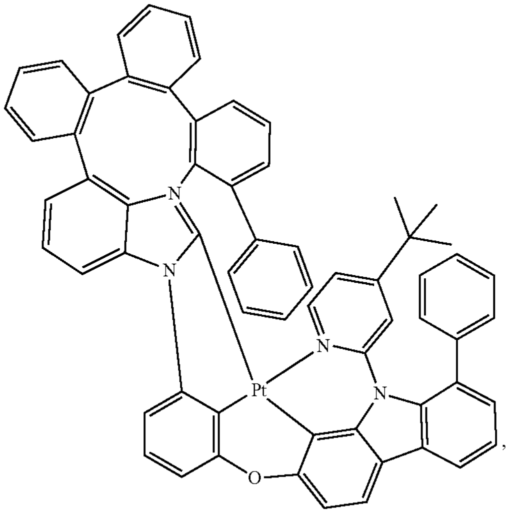
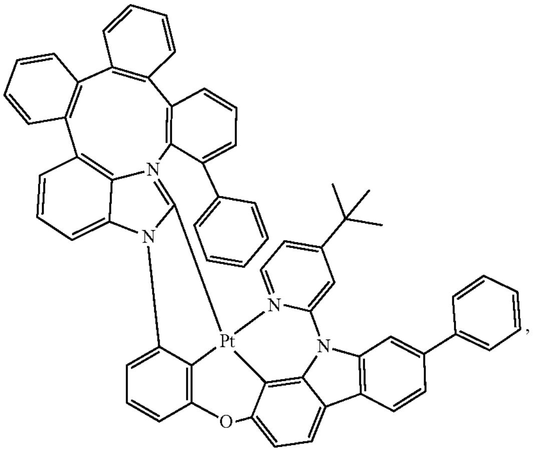

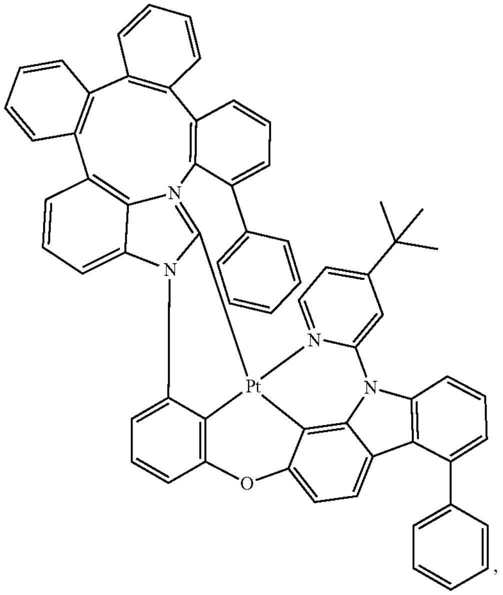
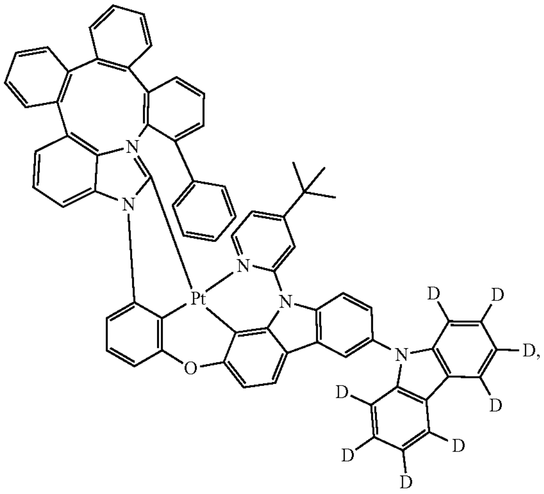
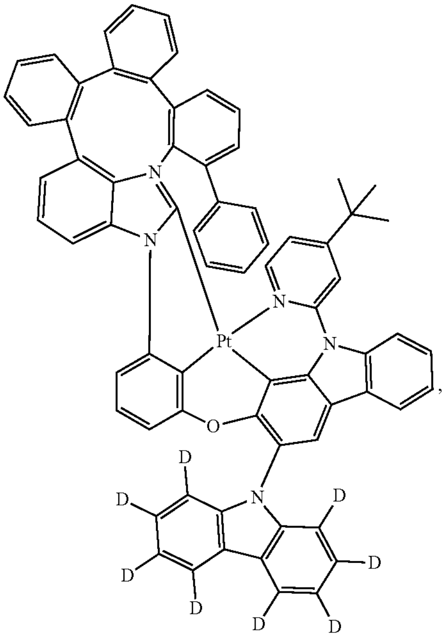
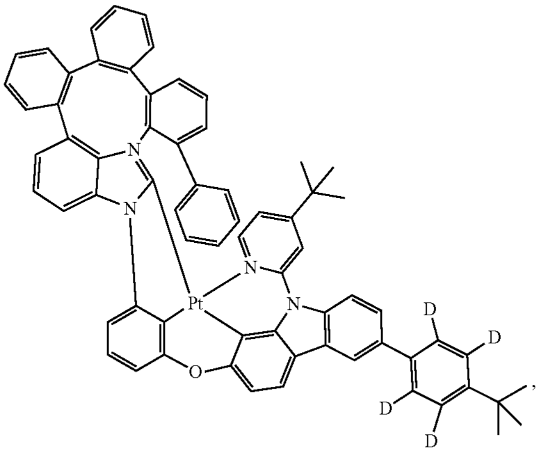
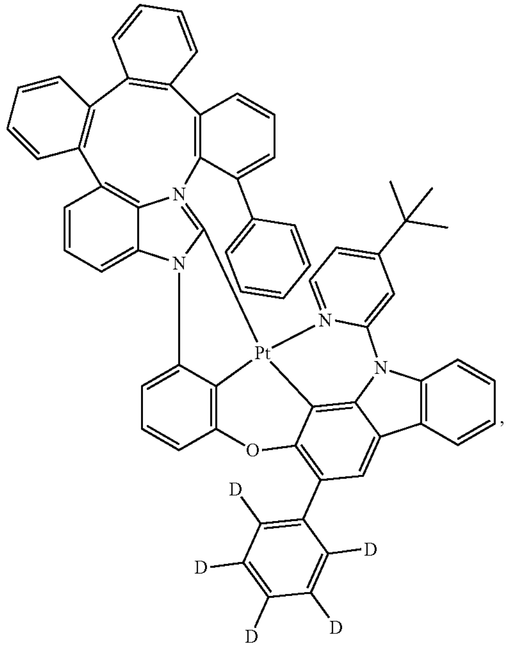
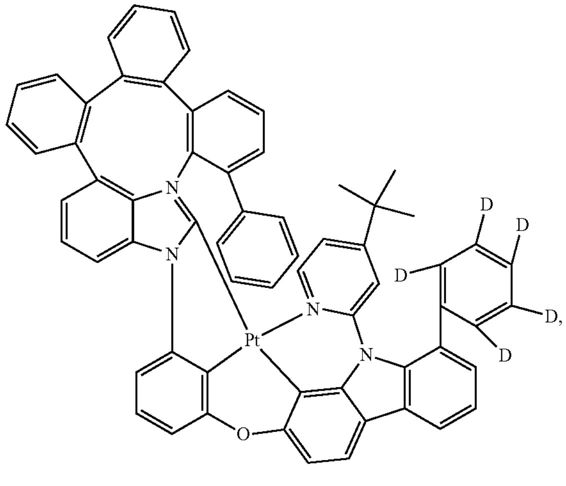

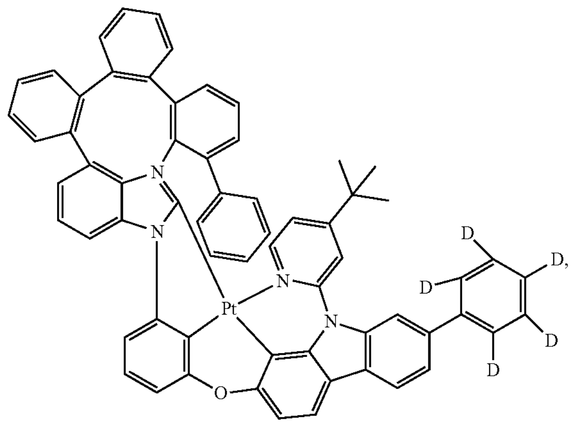
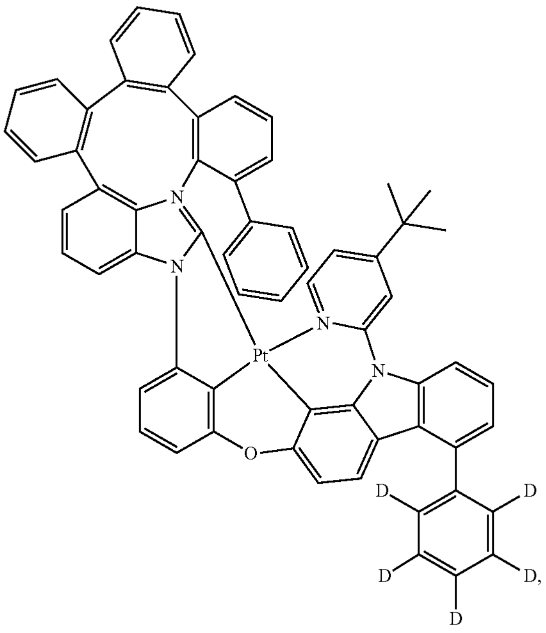
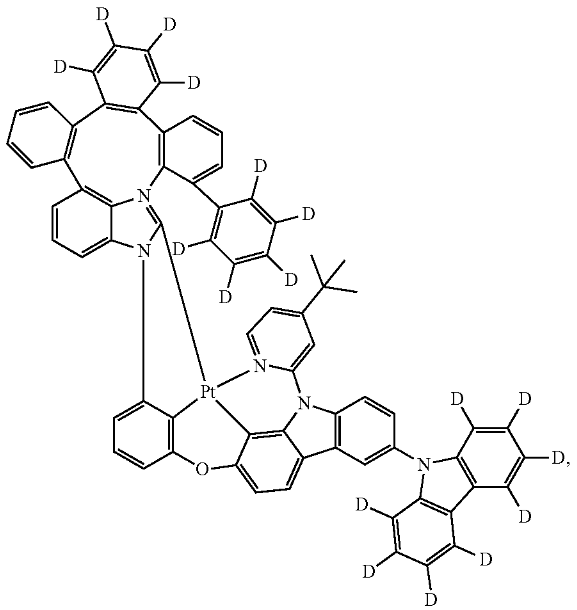
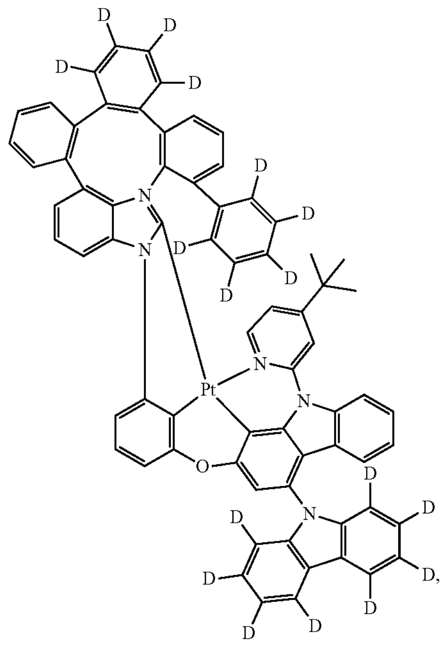
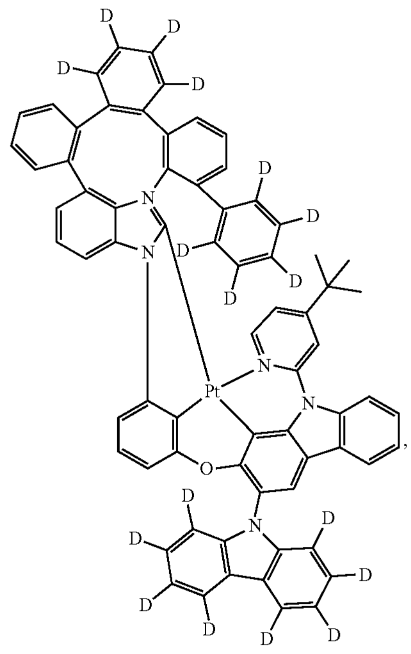

-continued
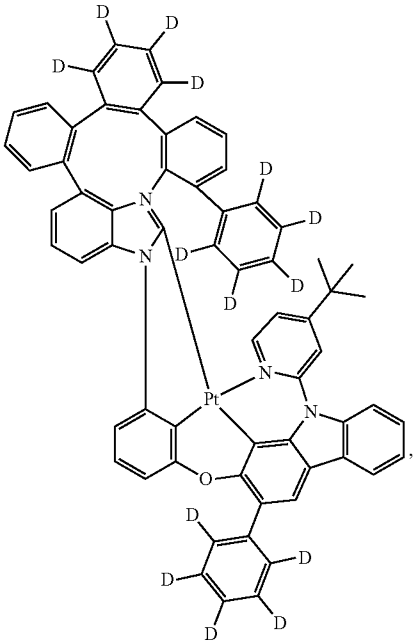
,
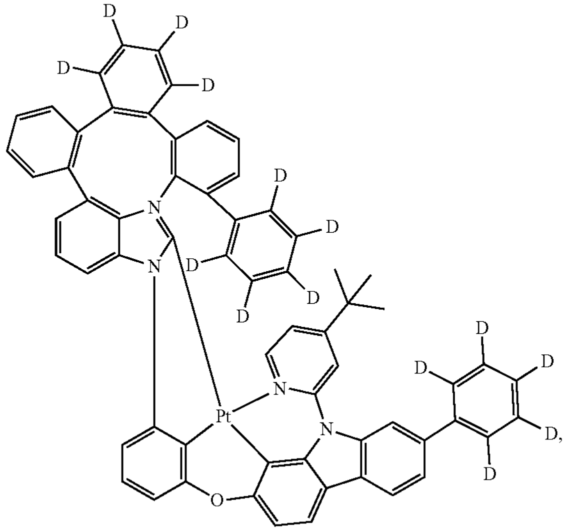
,
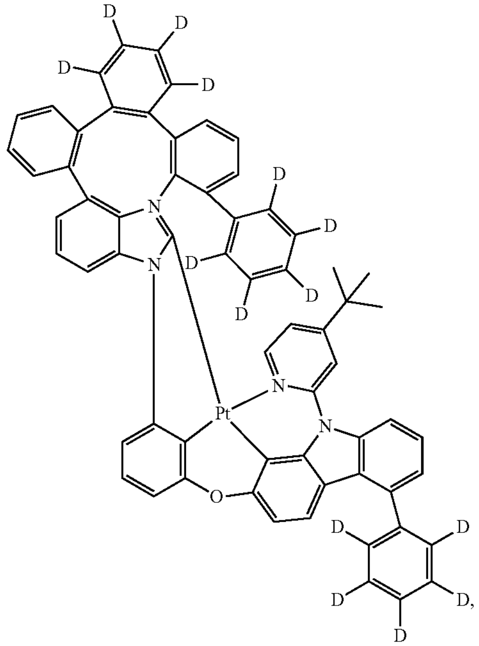
,
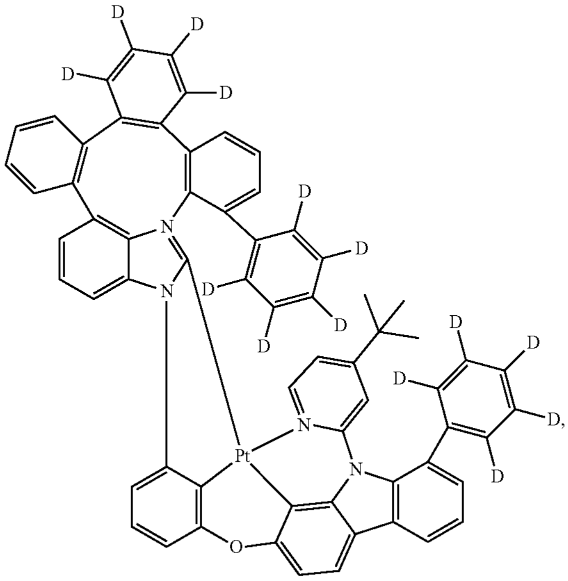
,
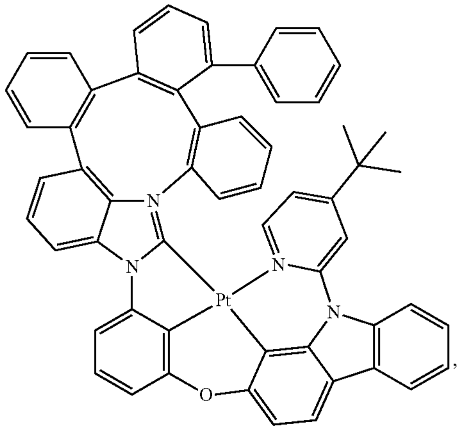
, -continued
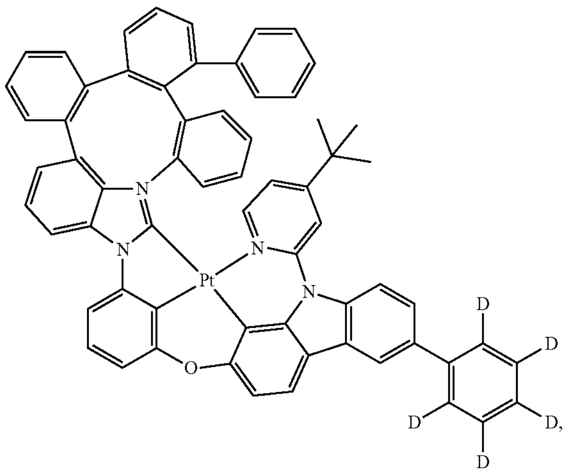
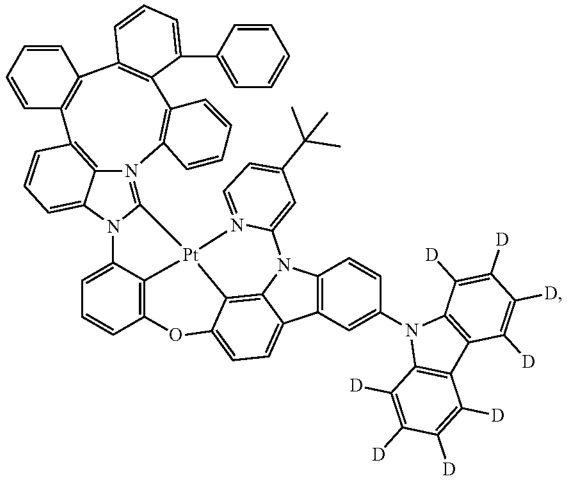
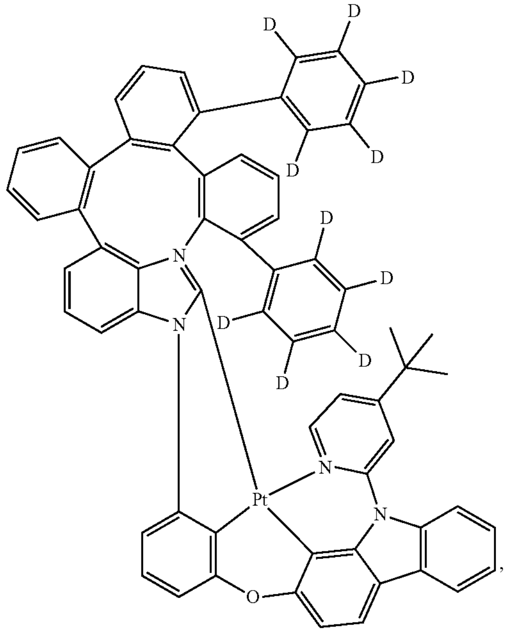
-continued
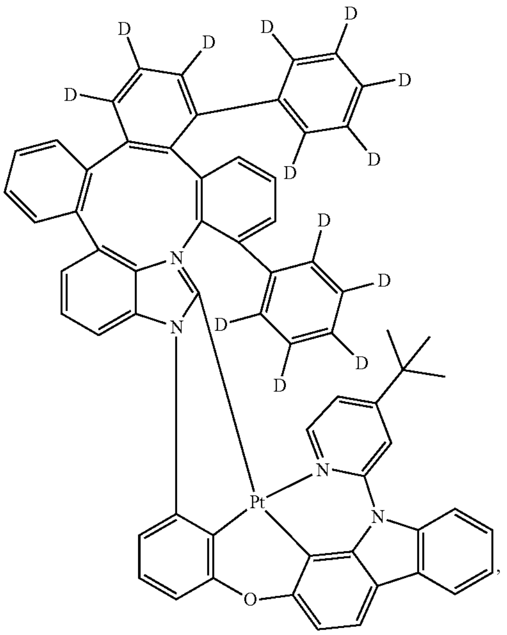
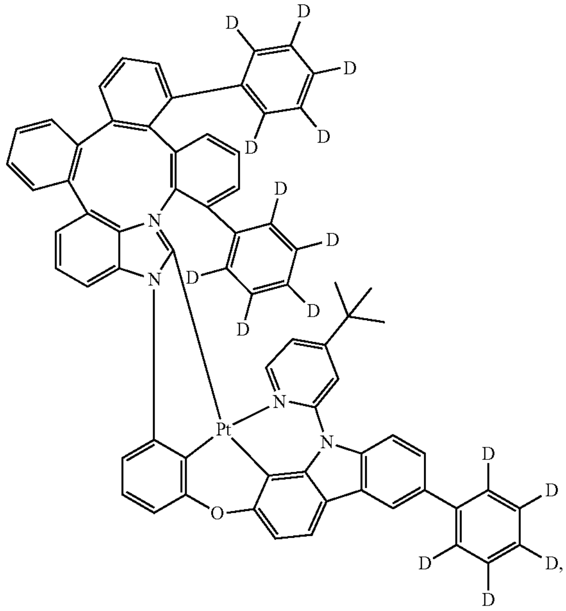

-continued
-continued
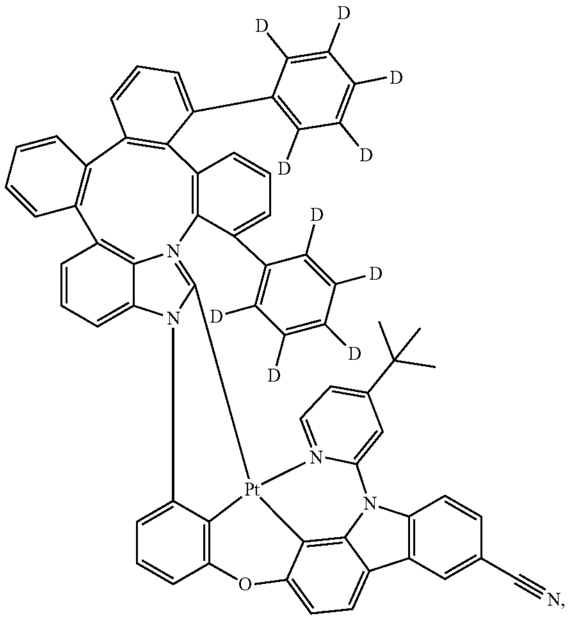
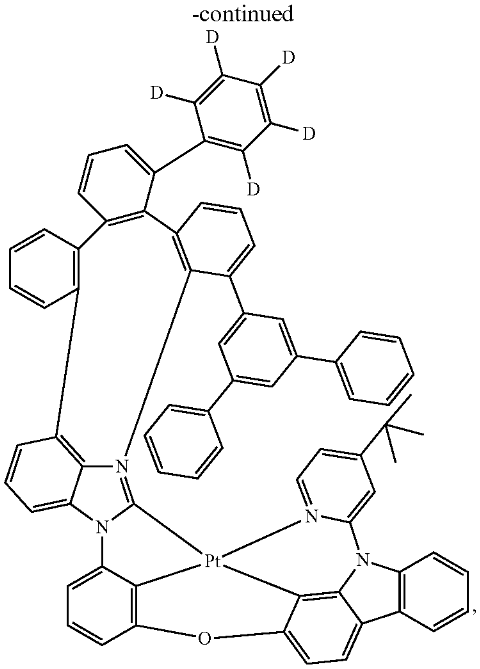
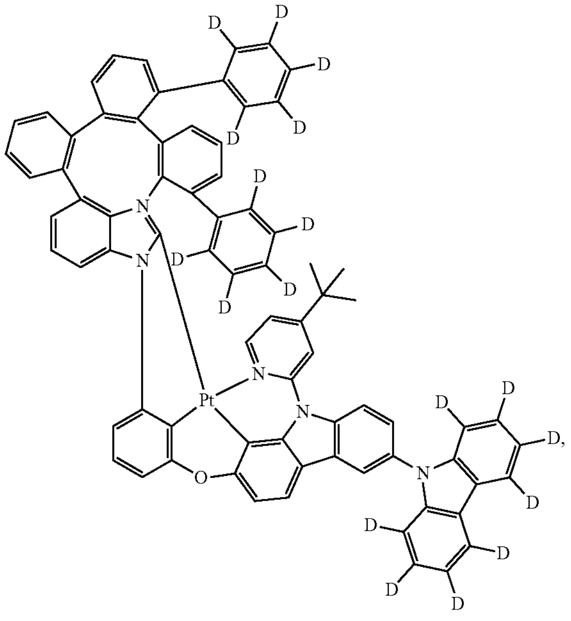
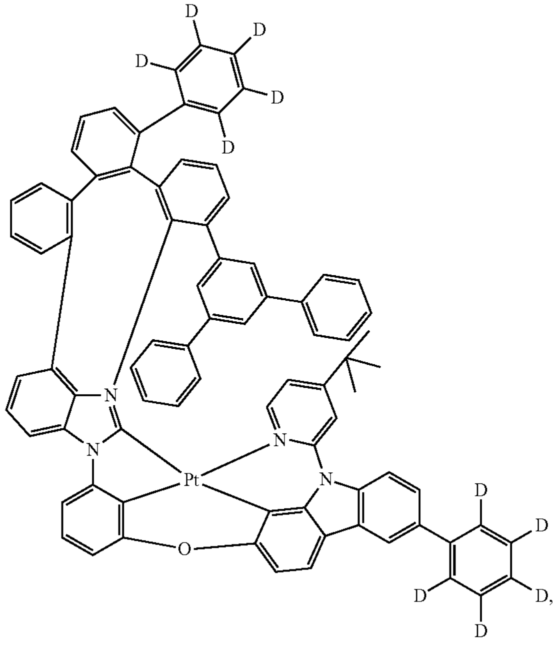

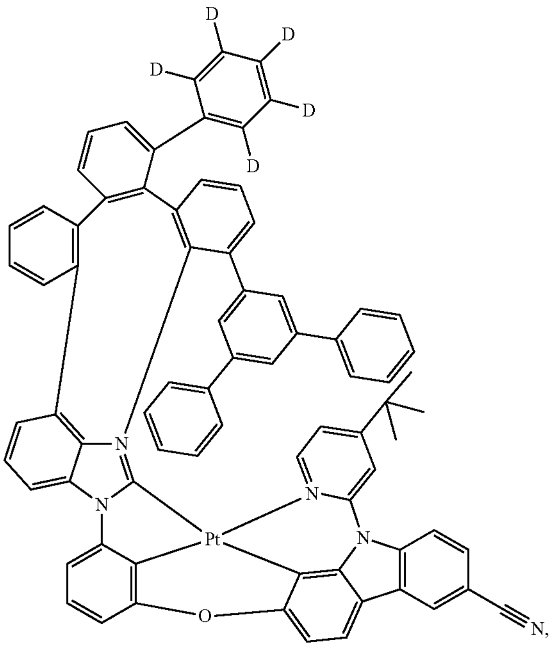
,
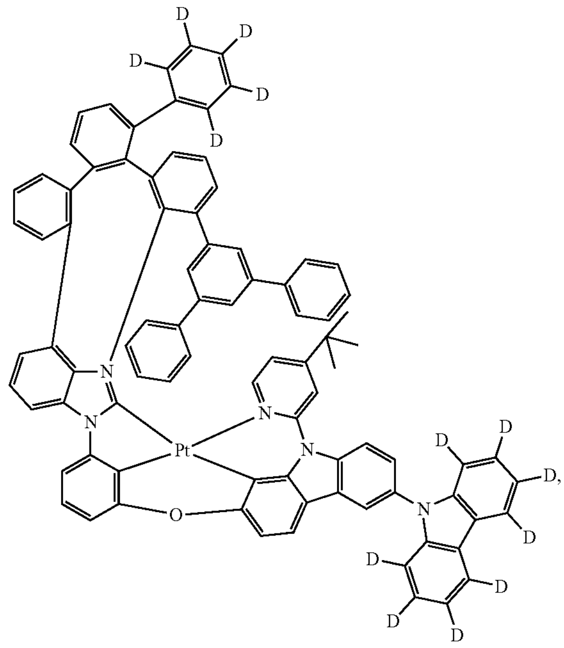
,
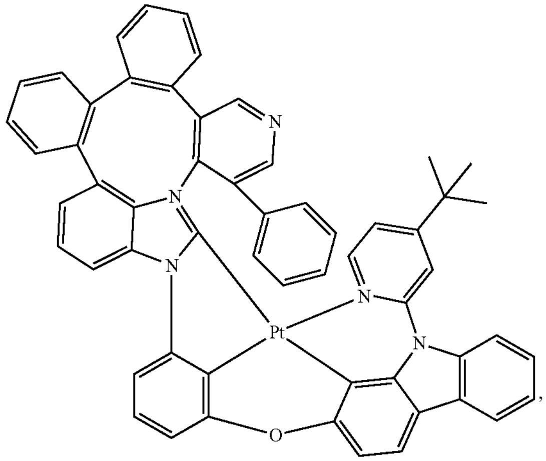
,
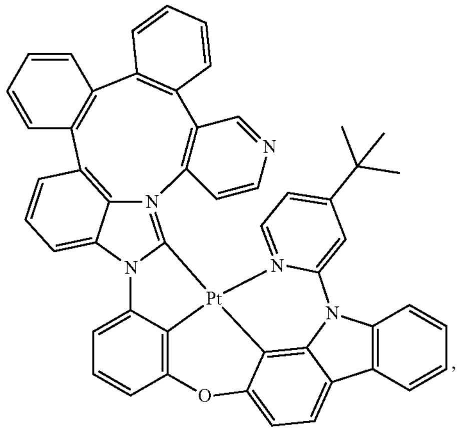
,
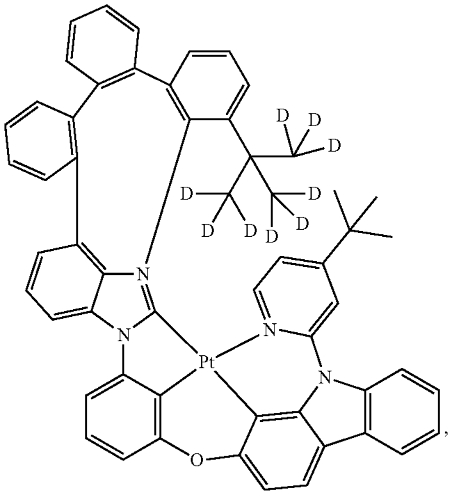
,

-continued
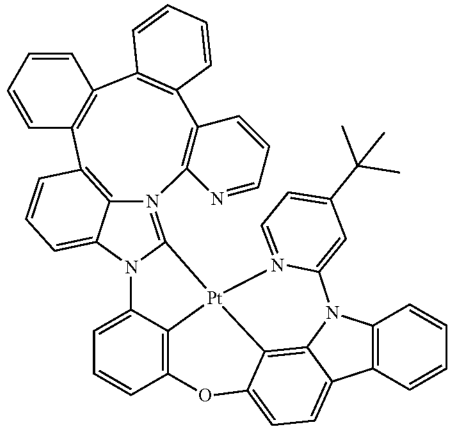
,
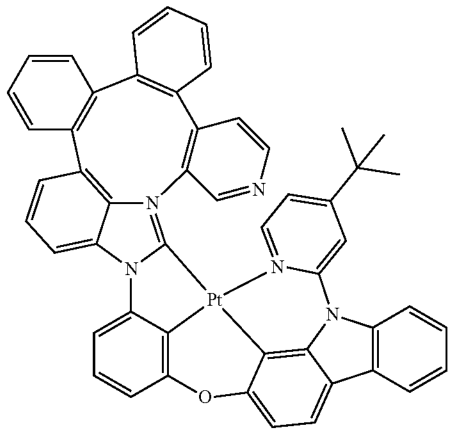
,
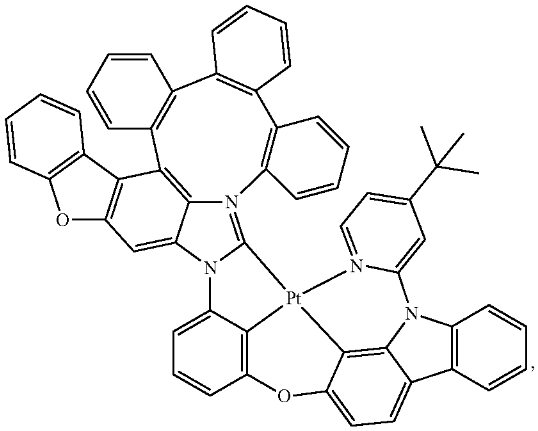
,
-continued
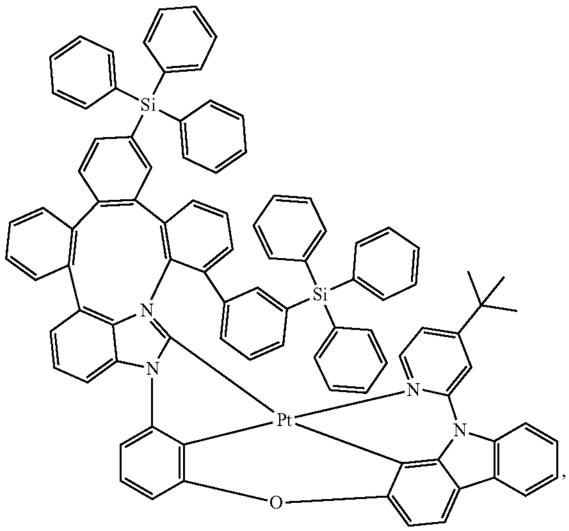
,
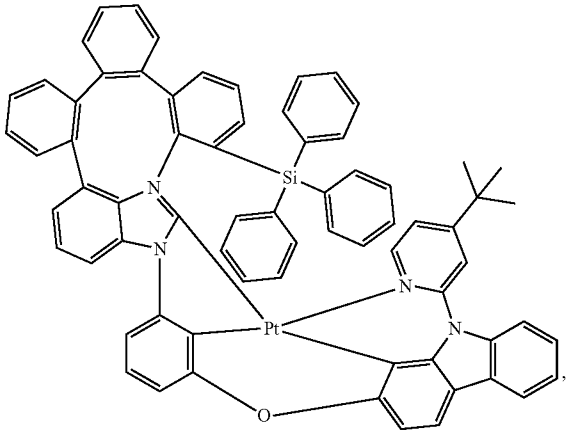
,
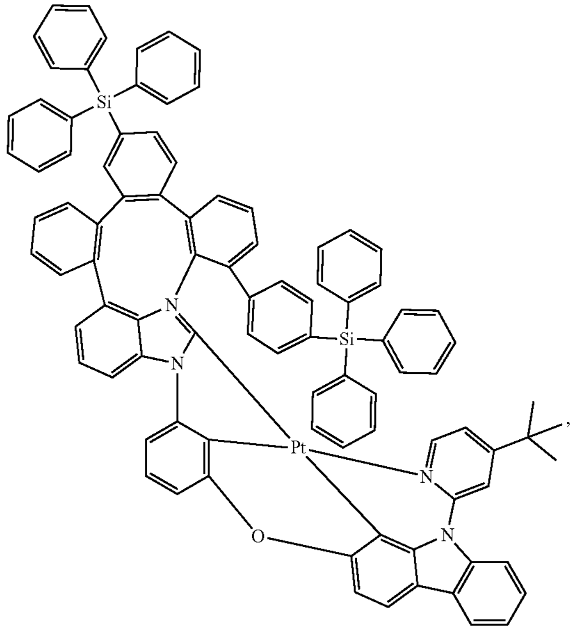
, -continued
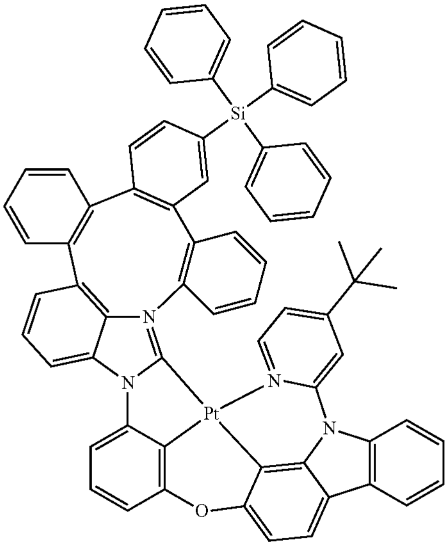
,
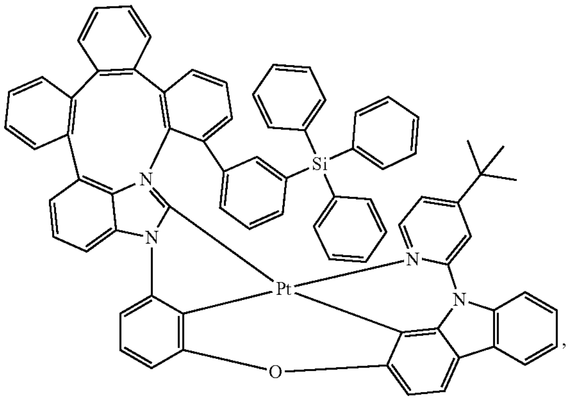
,
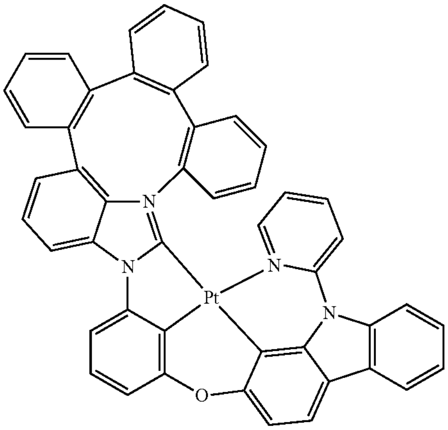
,
-continued
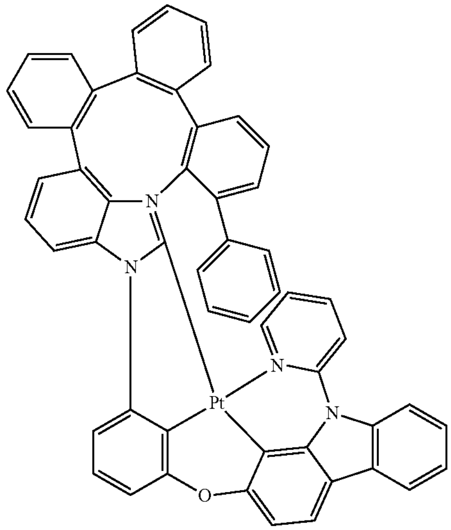
,
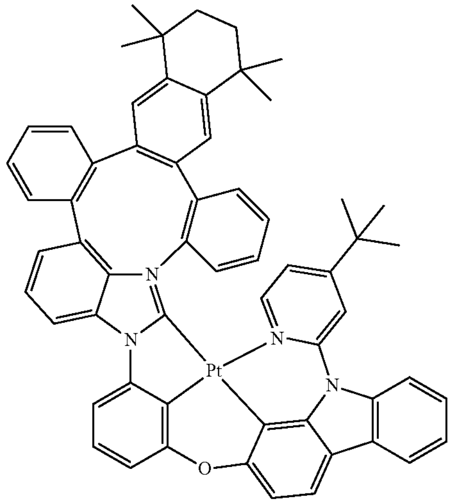
,
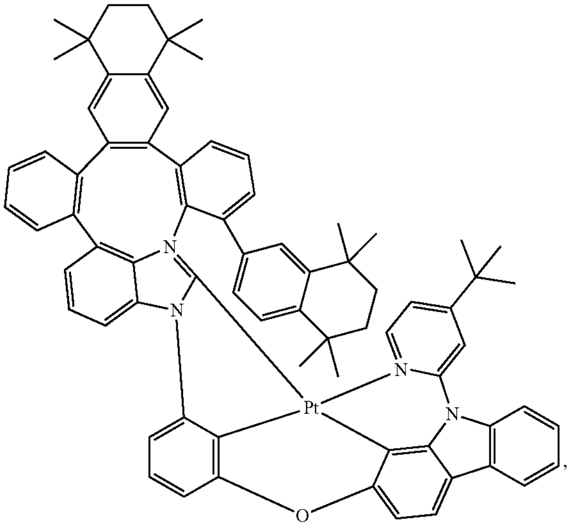
,

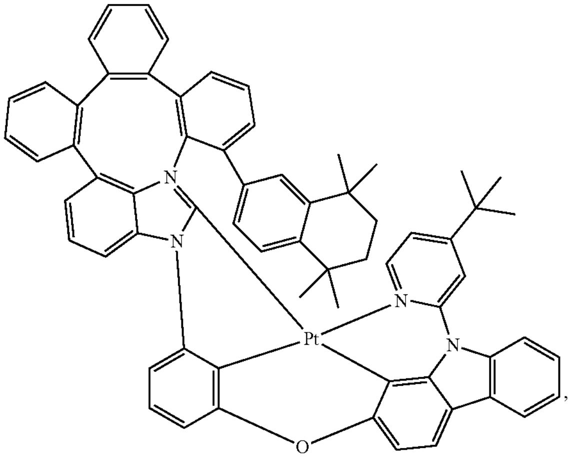
,
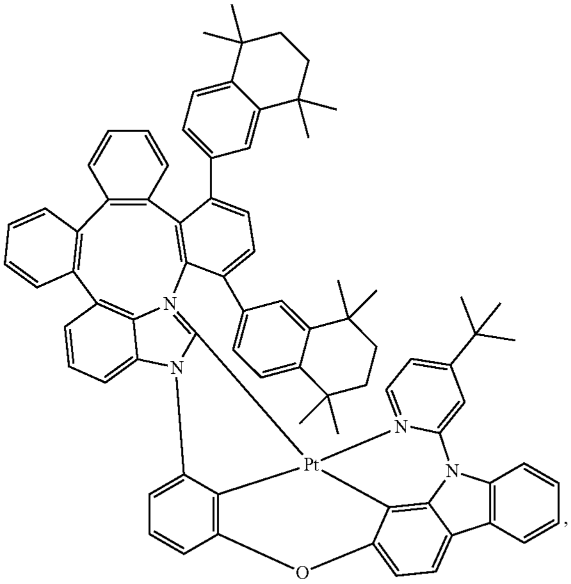
,
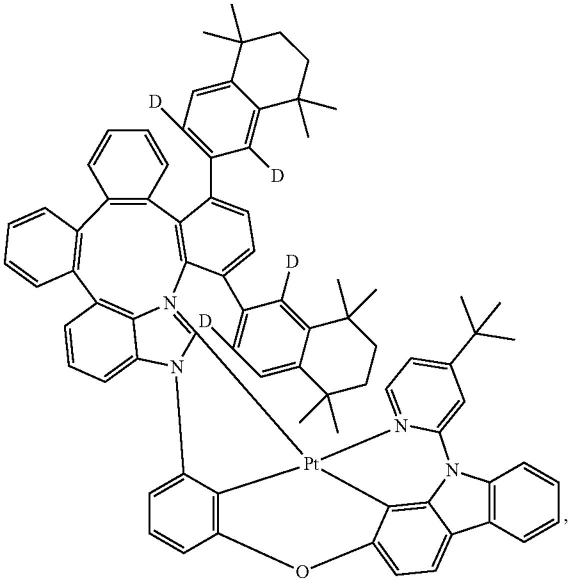
,
-continued
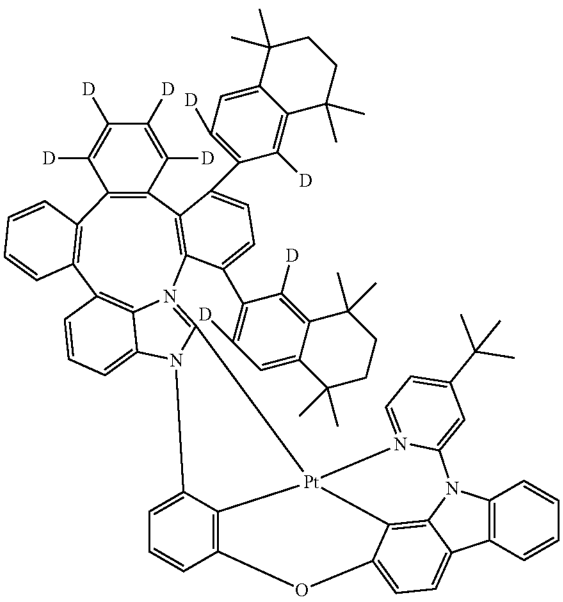
,
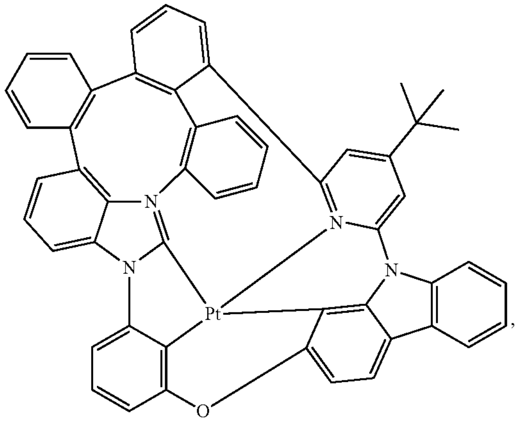
,
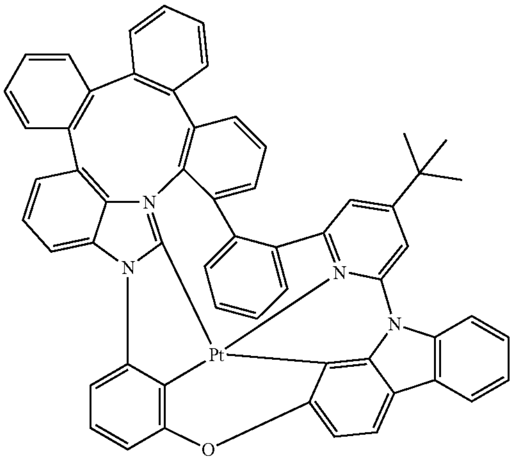
, -continued
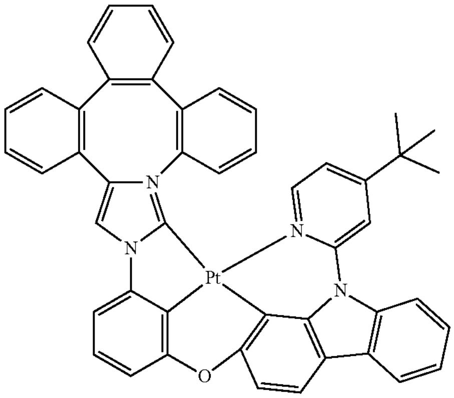
,
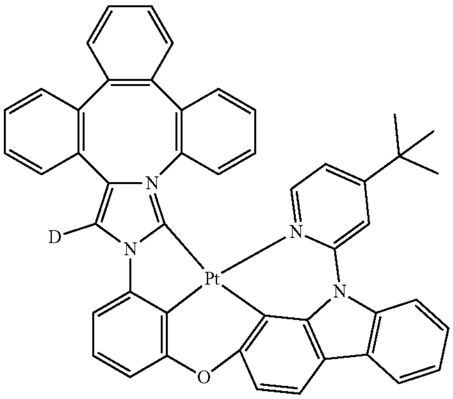
,
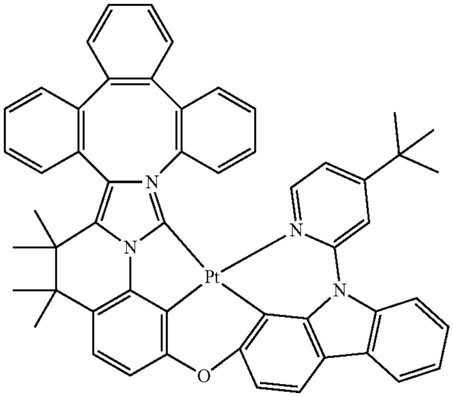
,
-continued
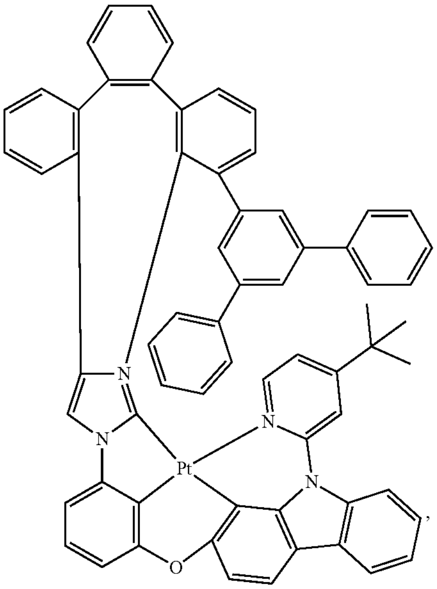
,
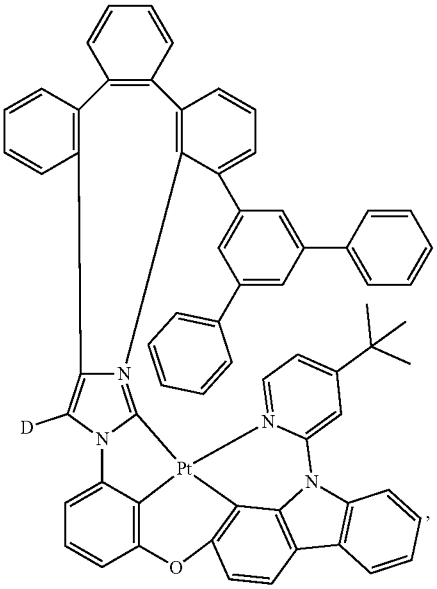
,
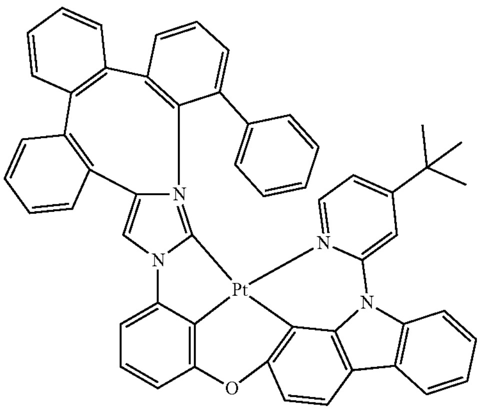
,

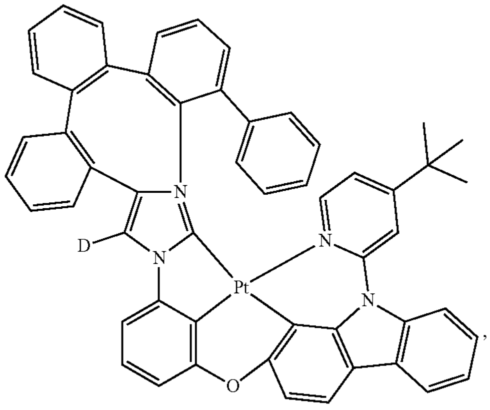,
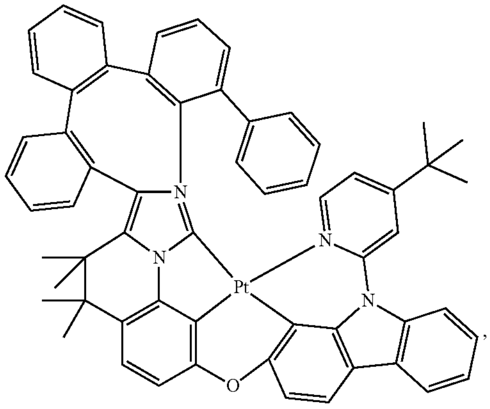,
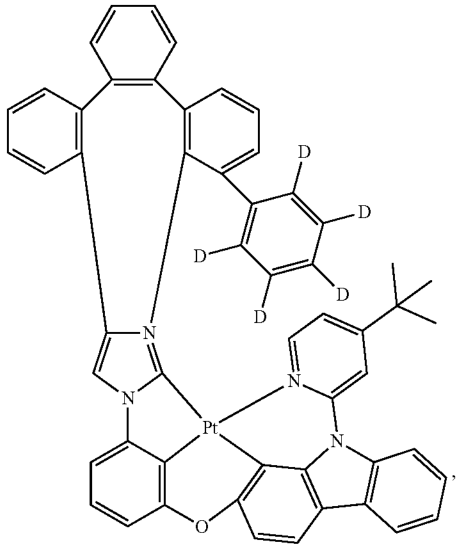,
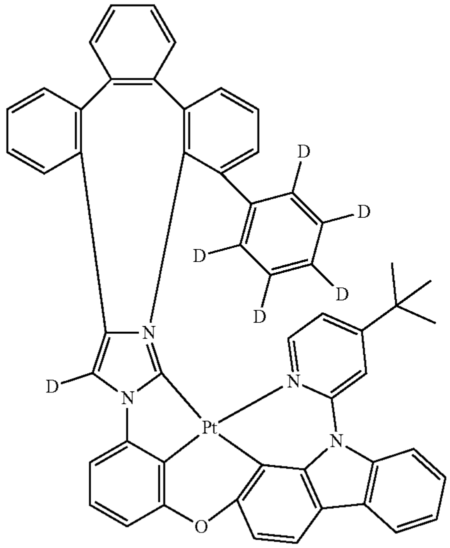,
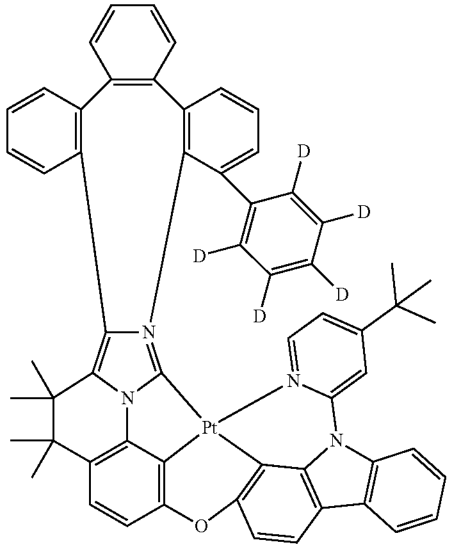,
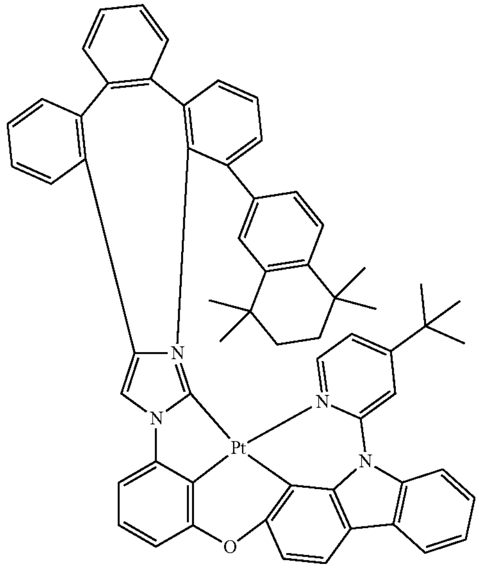, -continued
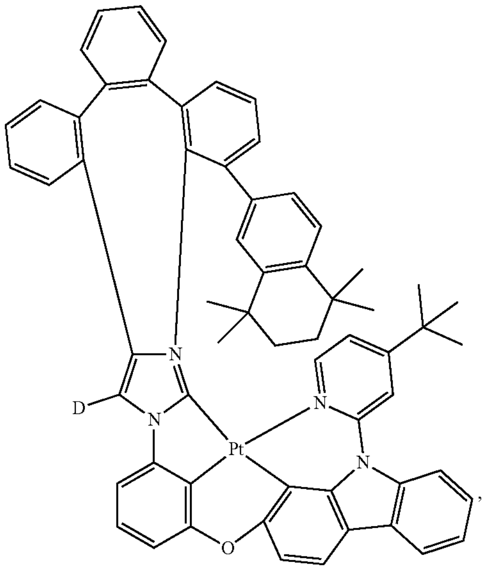
,
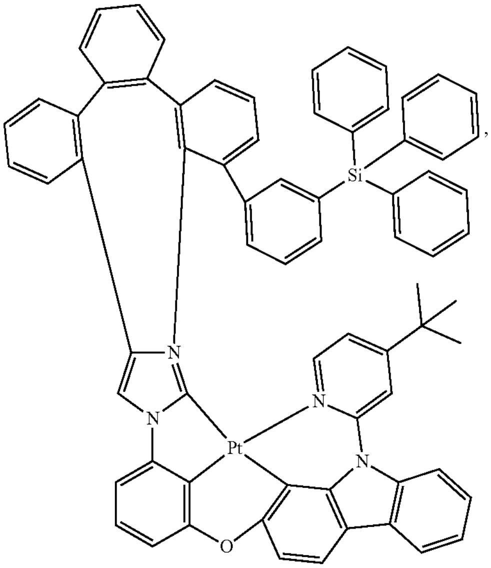
,
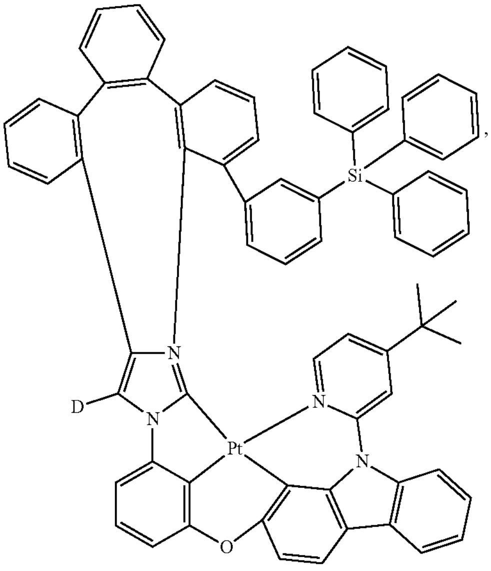
,
-continued
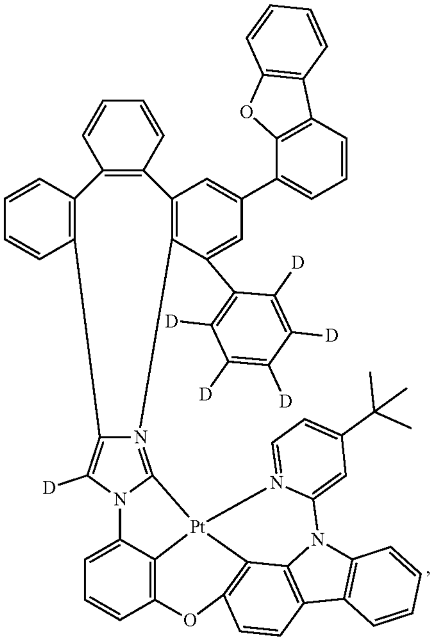
,
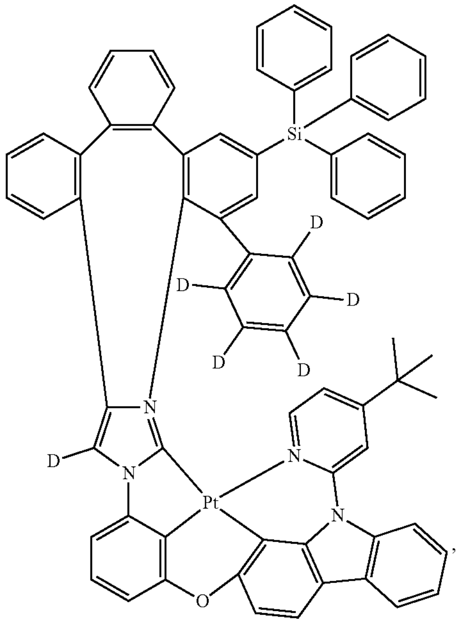
, -continued
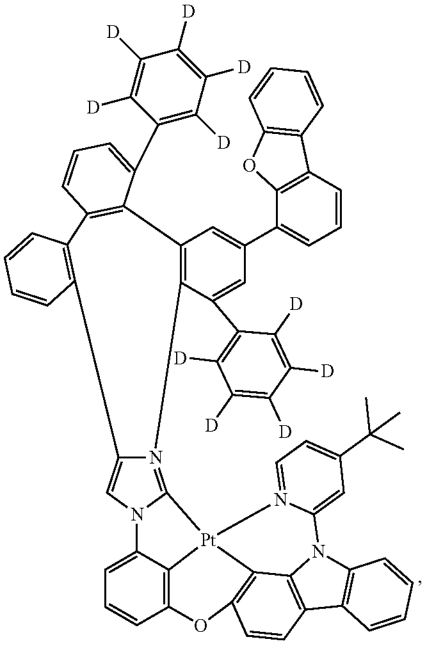
,
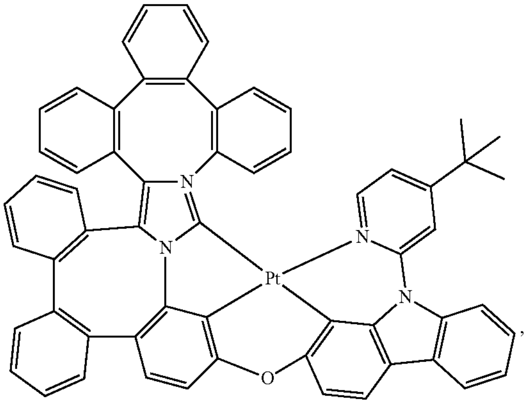
,
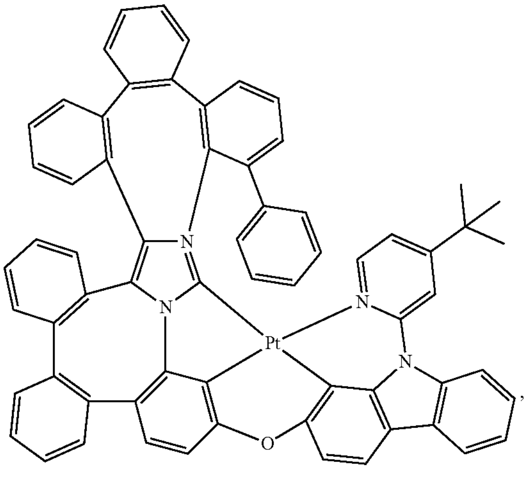
,
-continued
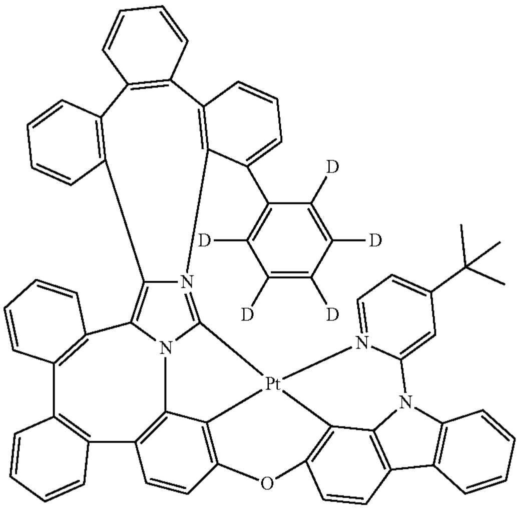
,
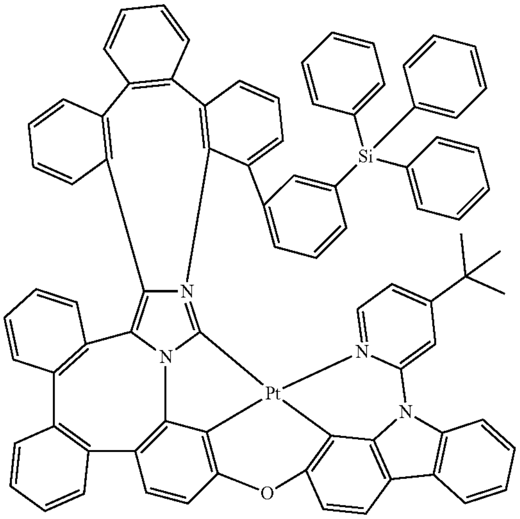
,
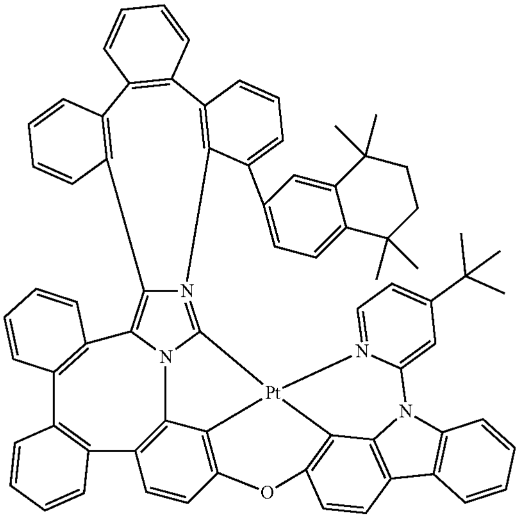
, -continued
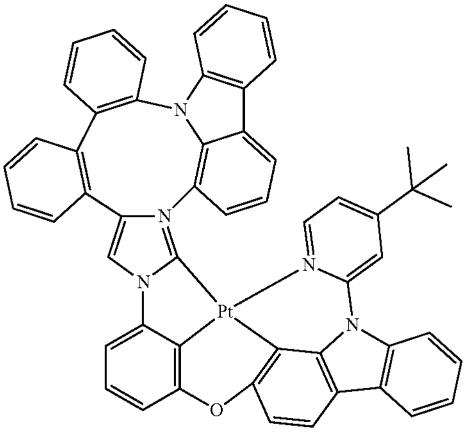
,
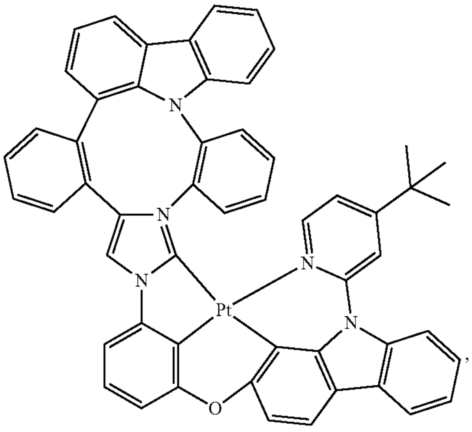
,
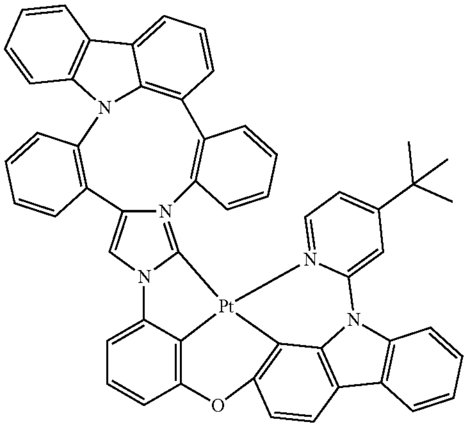
,
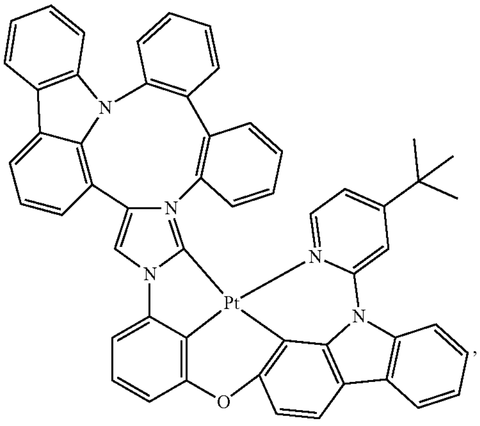
,
-continued
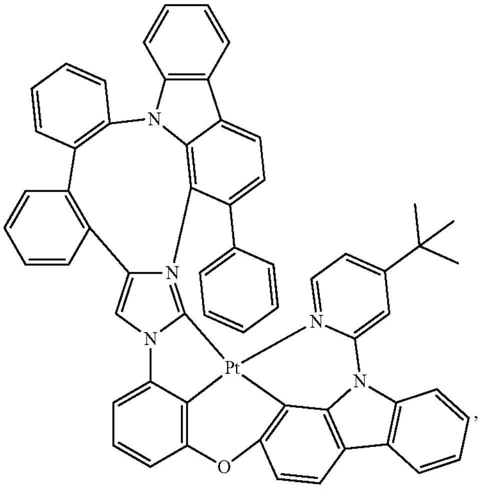
,
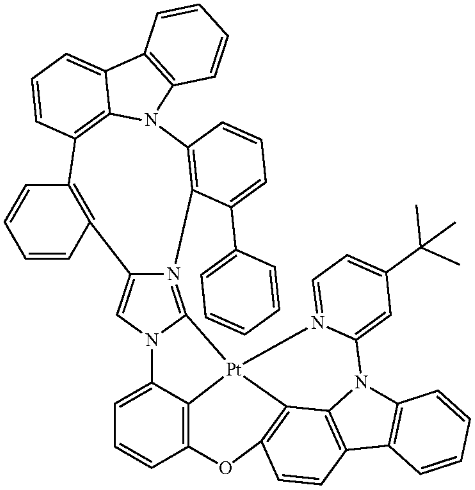
,
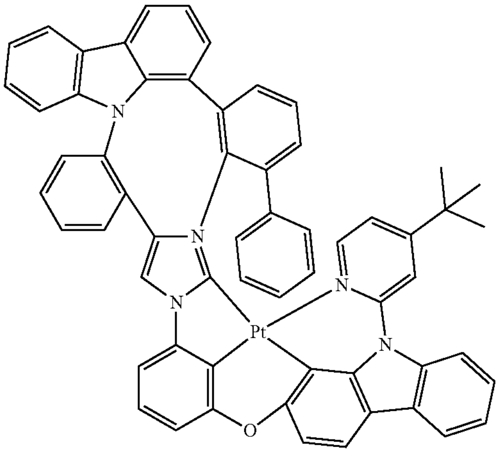
,

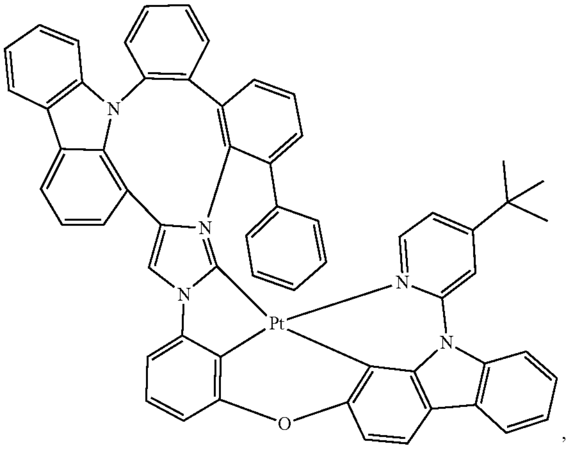
,
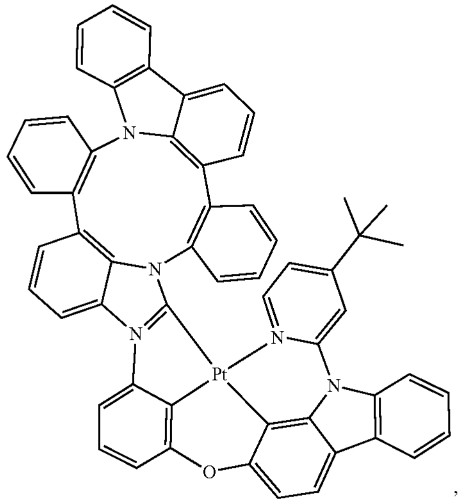
,
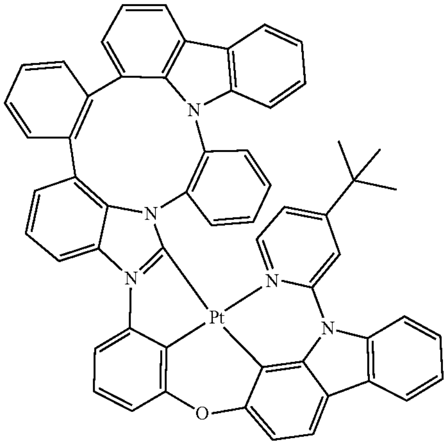
,
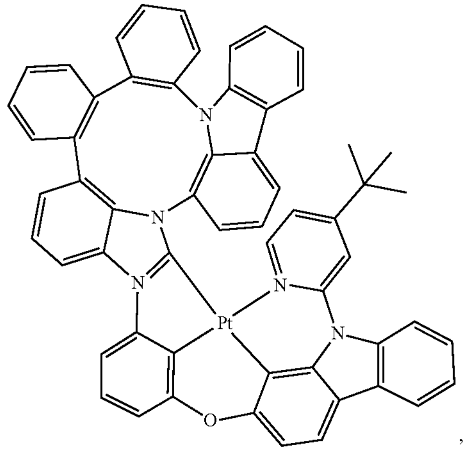
,
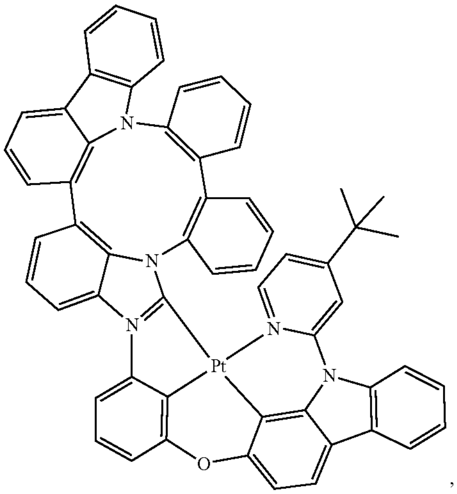
,
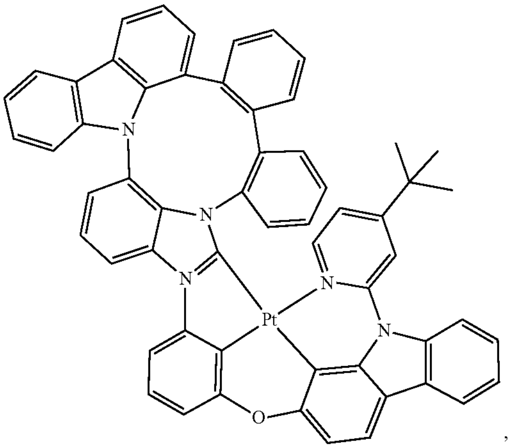
, -continued
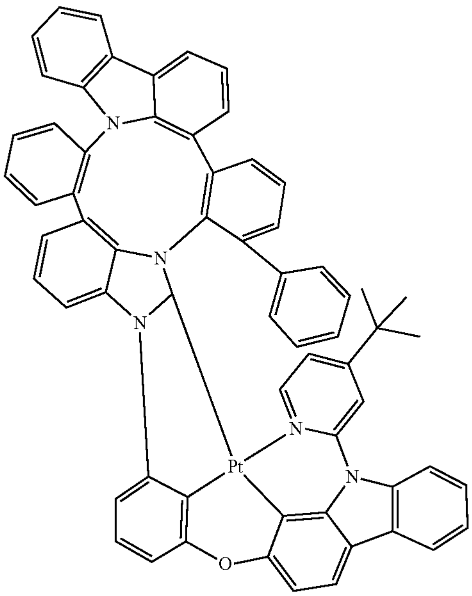
,
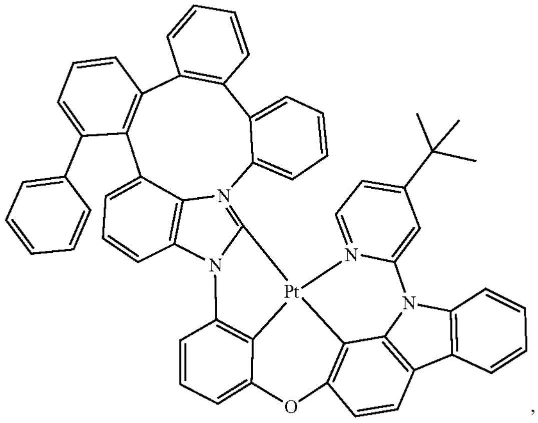
,
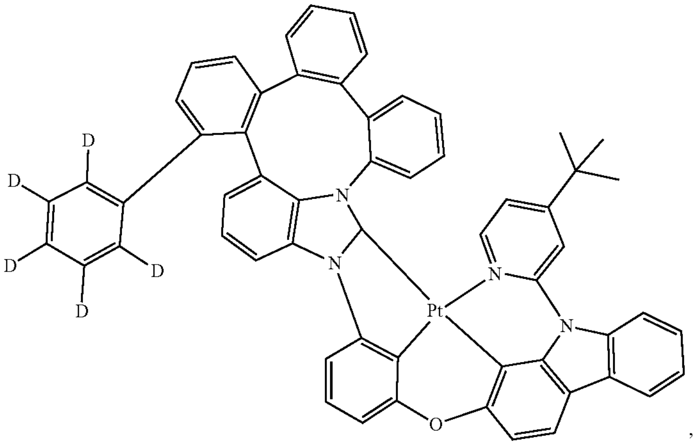
,
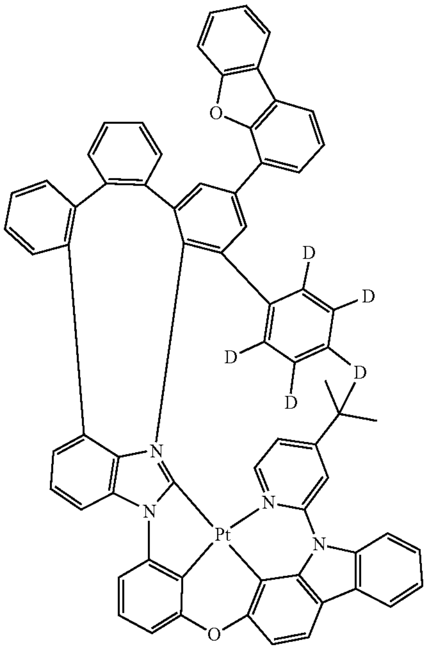
,
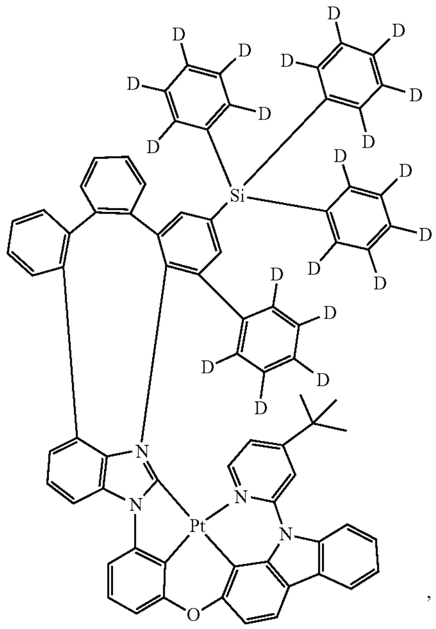
, -continued
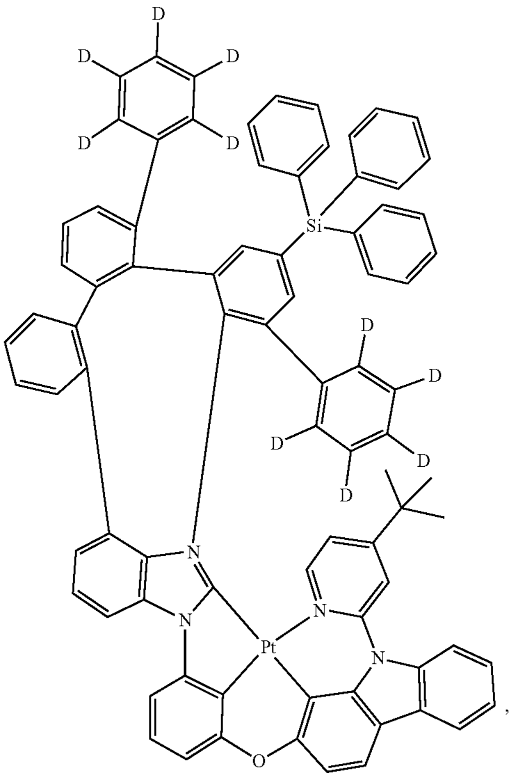
,
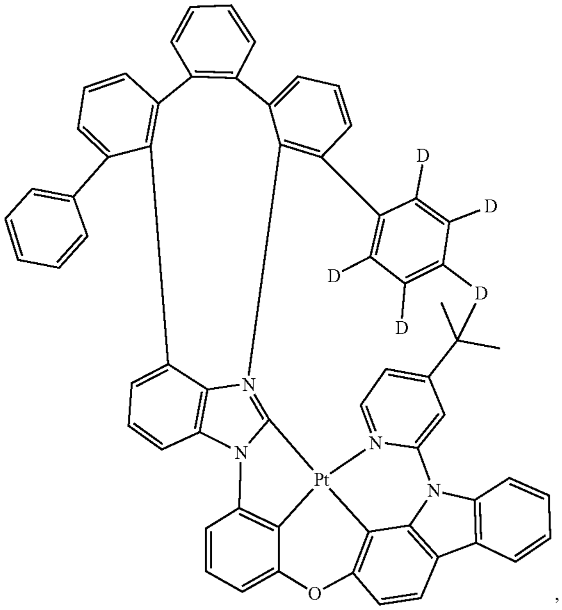
,
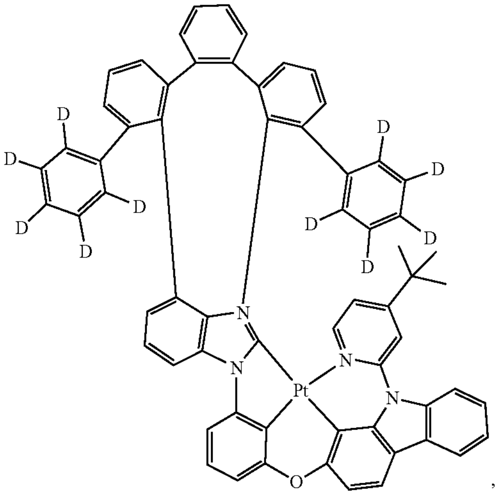
,
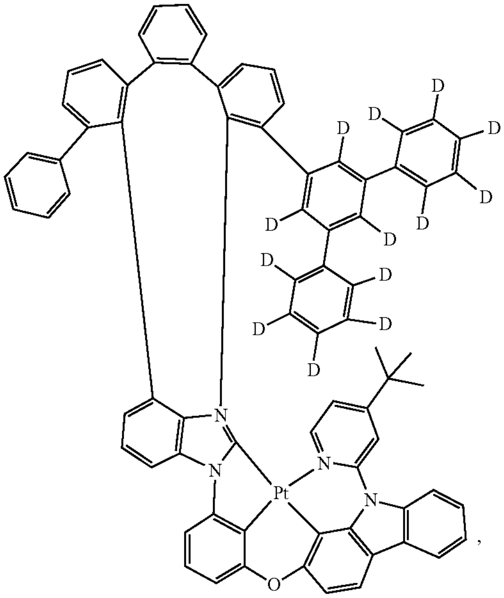
, -continued
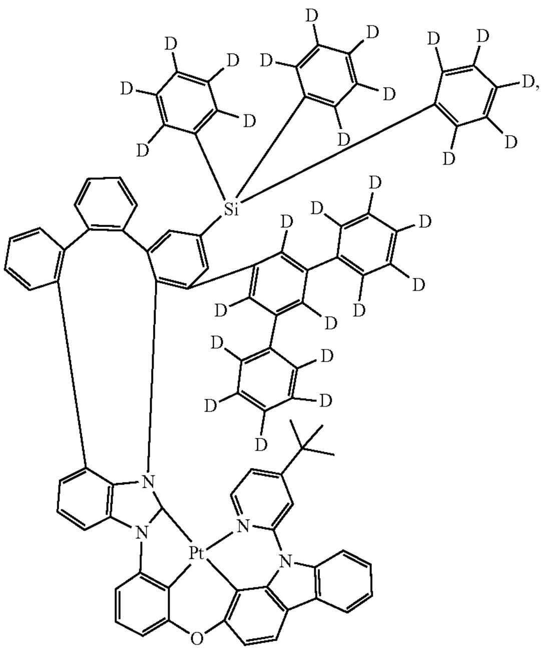
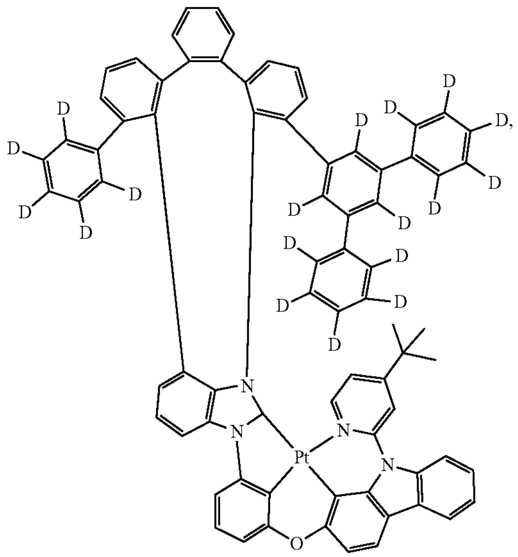
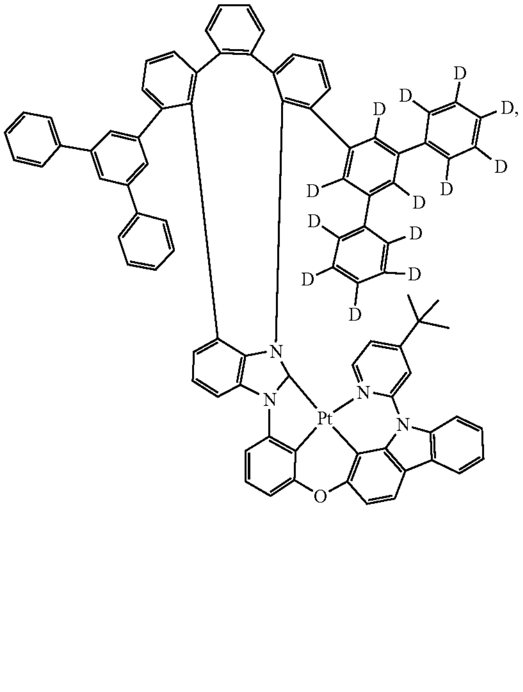
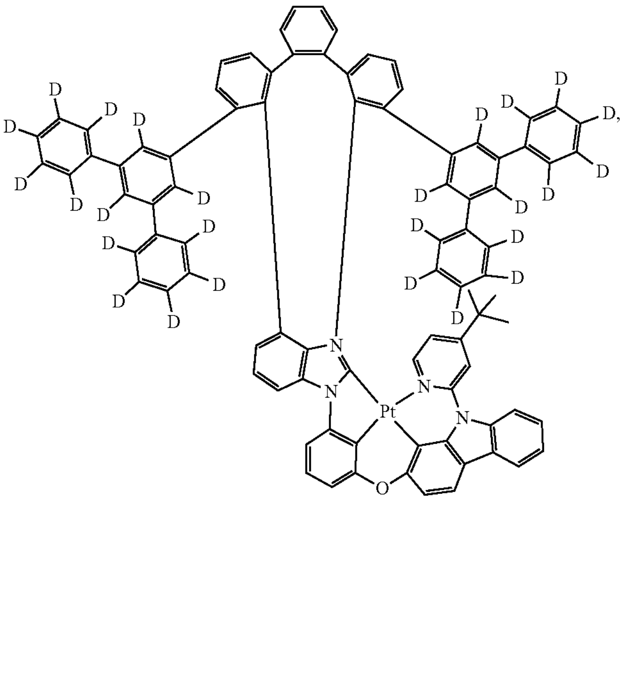

-continued
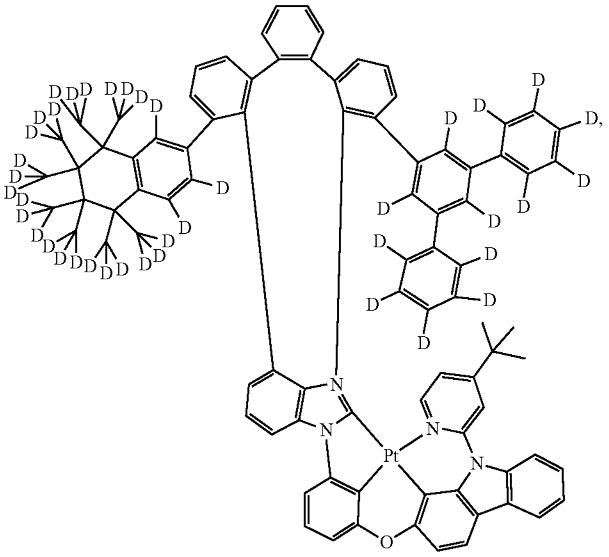
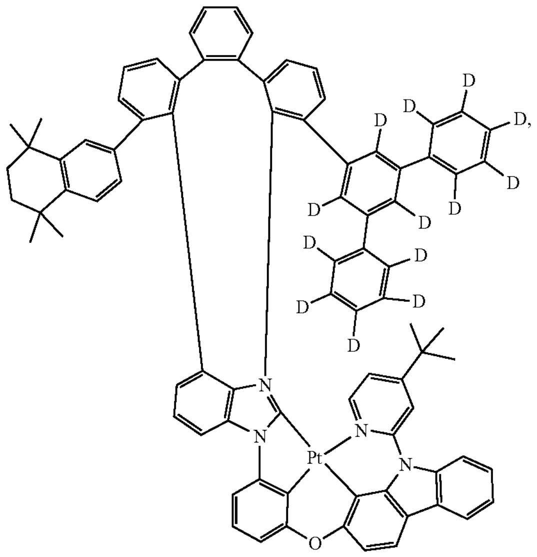
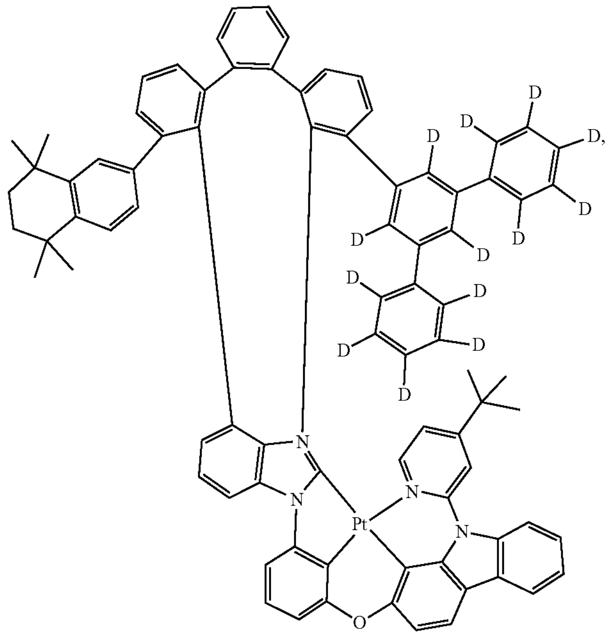

-continued
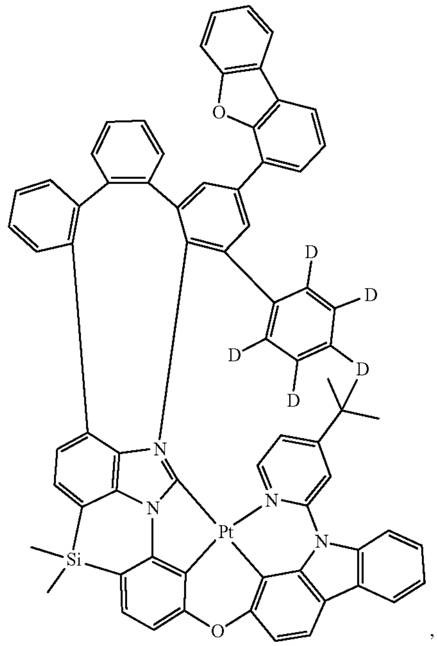
,
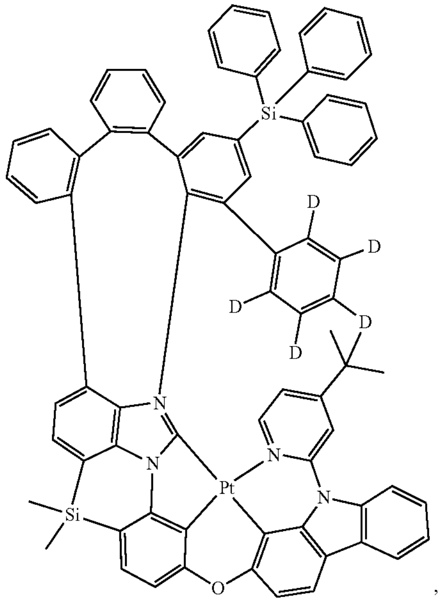
,
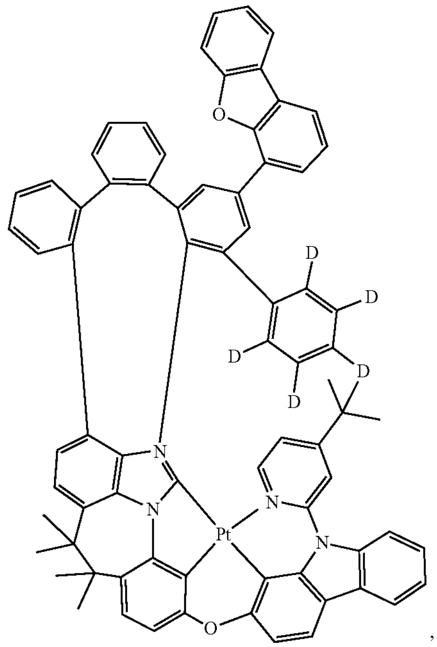
,

-continued
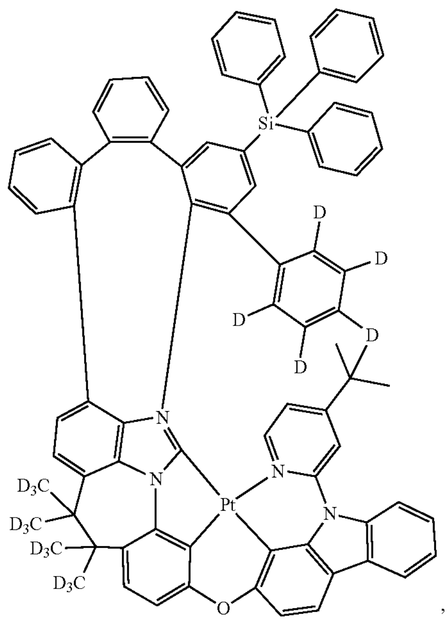
,
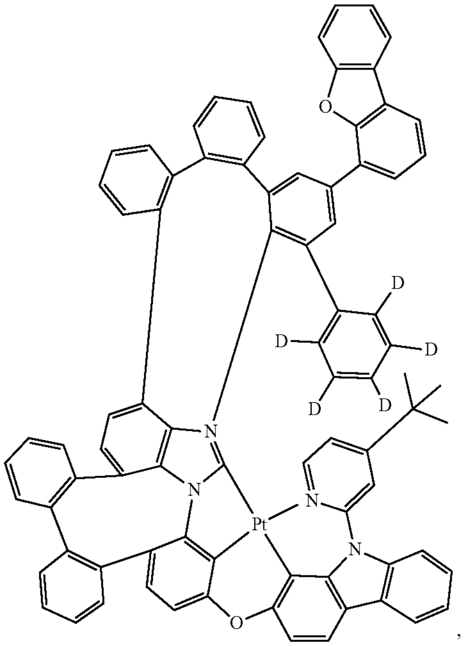
,
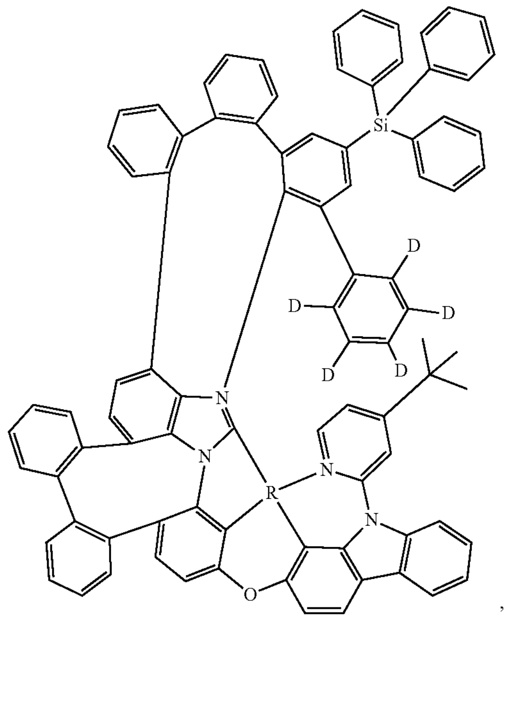
,

-continued
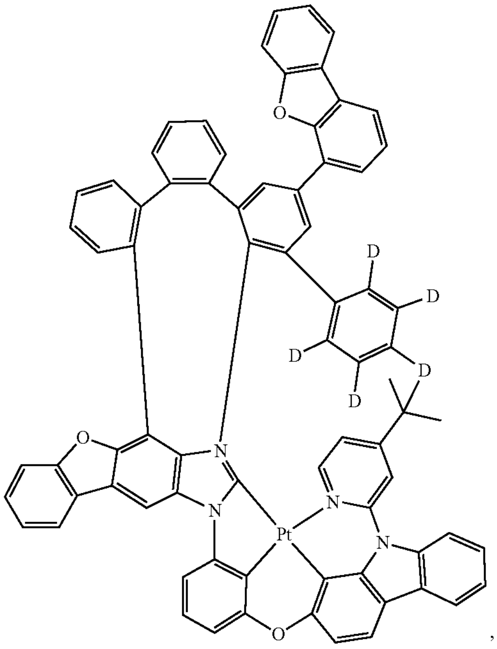
,
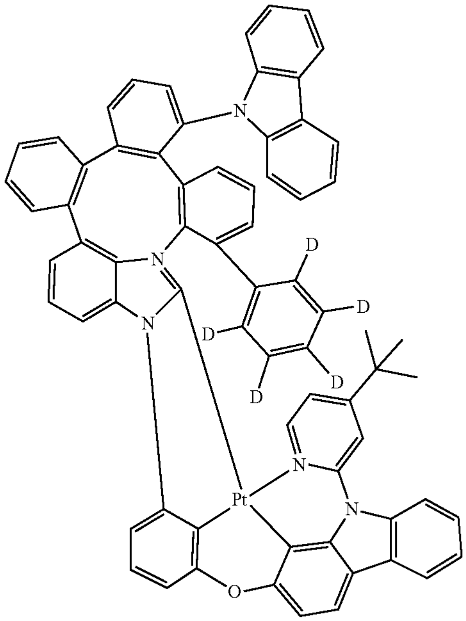
,
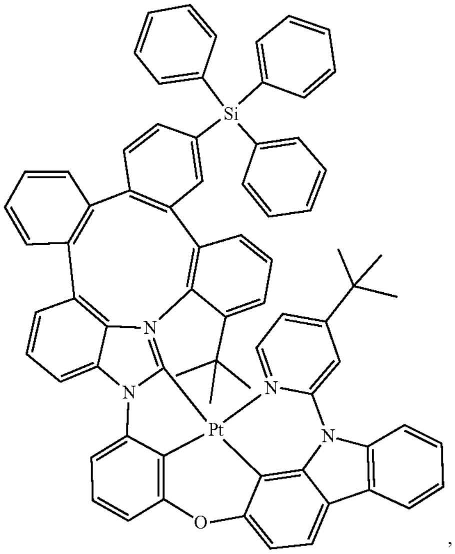
,
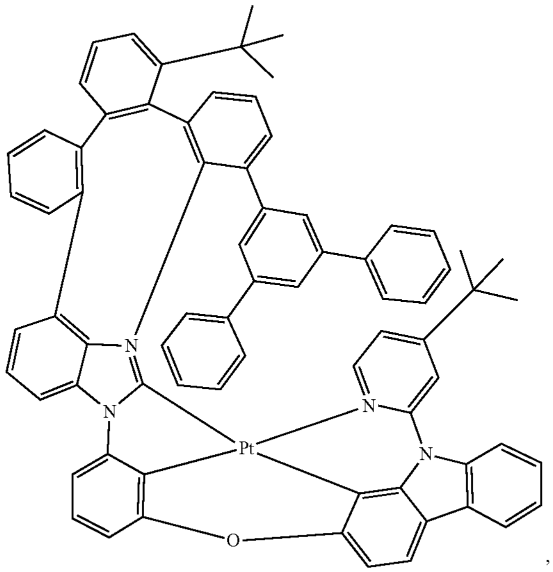
,

-continued
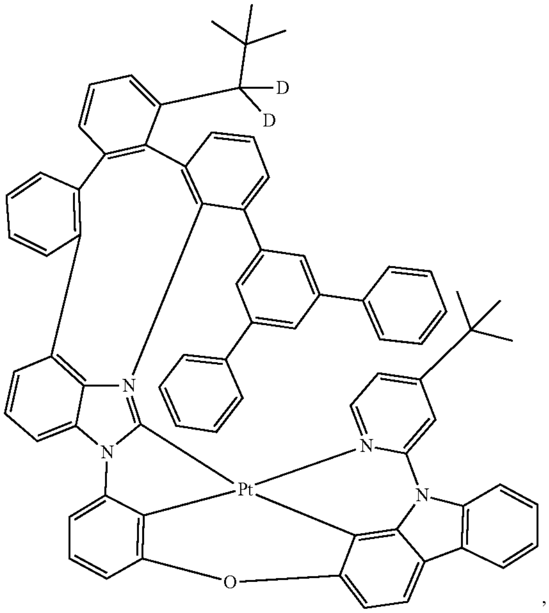
,
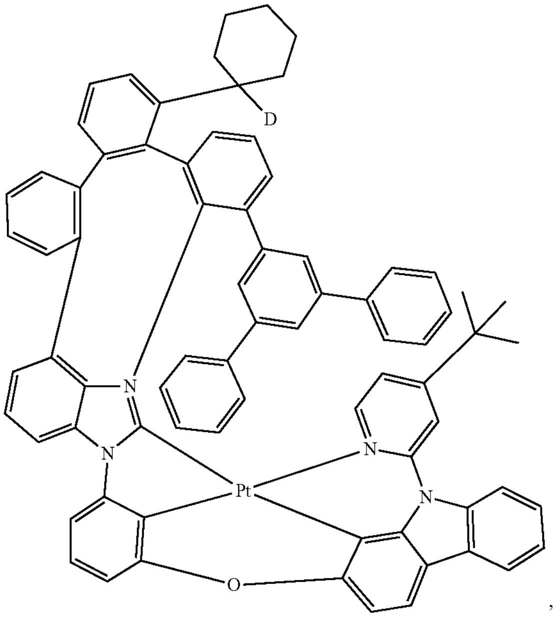
,
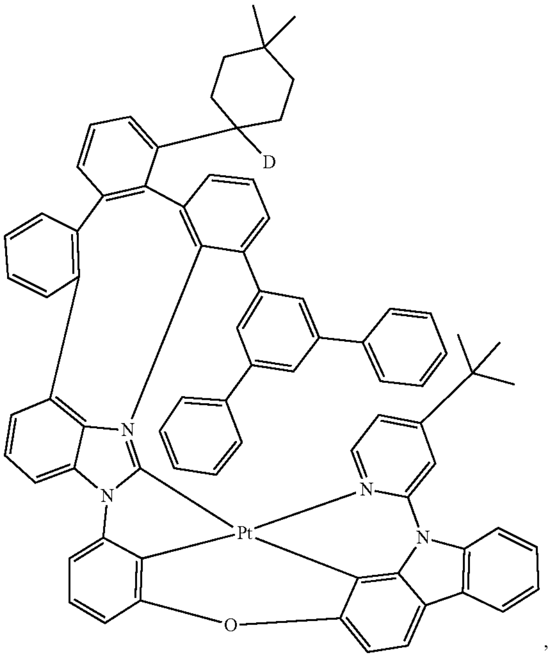
,
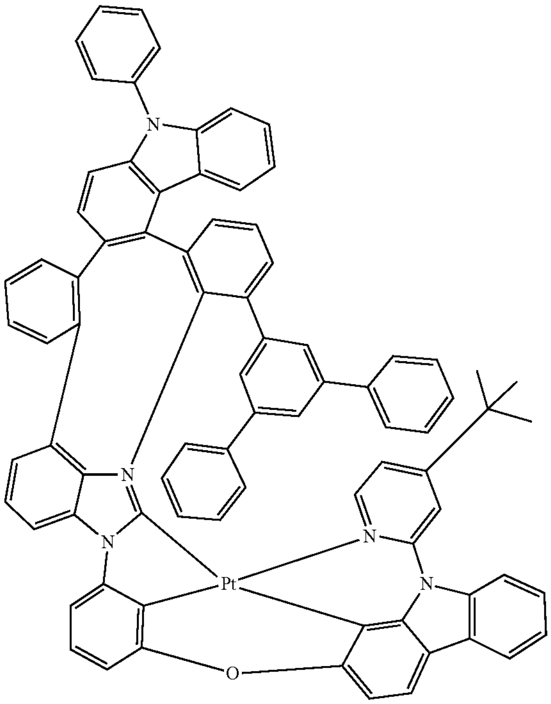
,

-continued
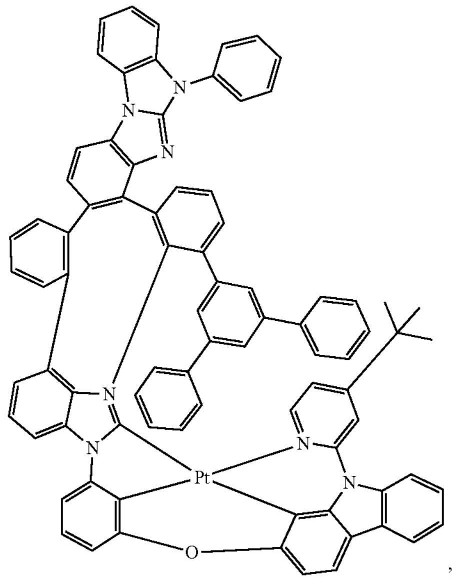
,
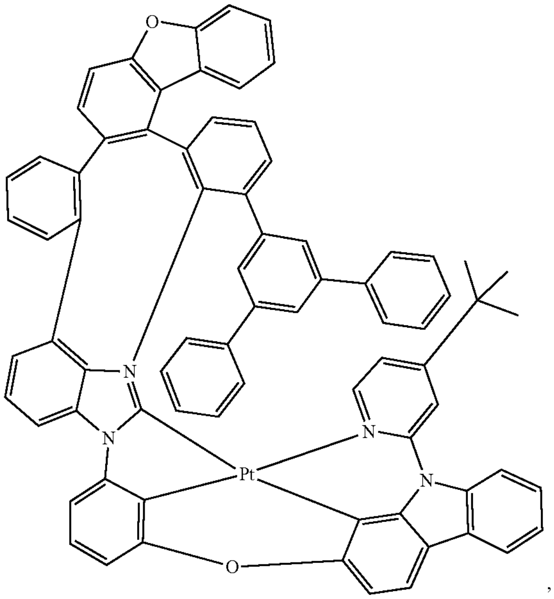
,
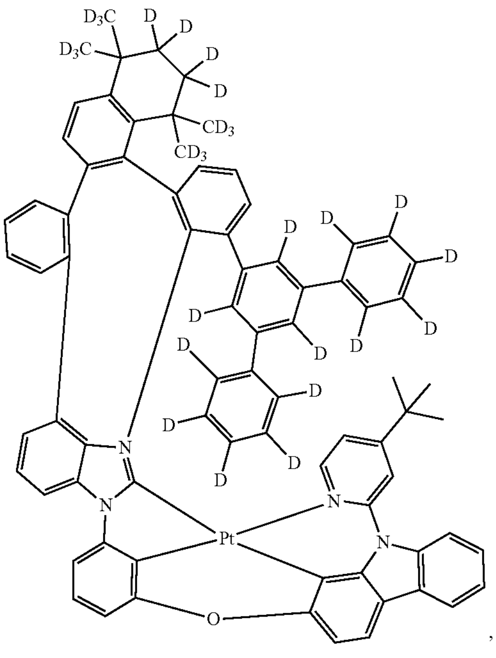
,

-continued
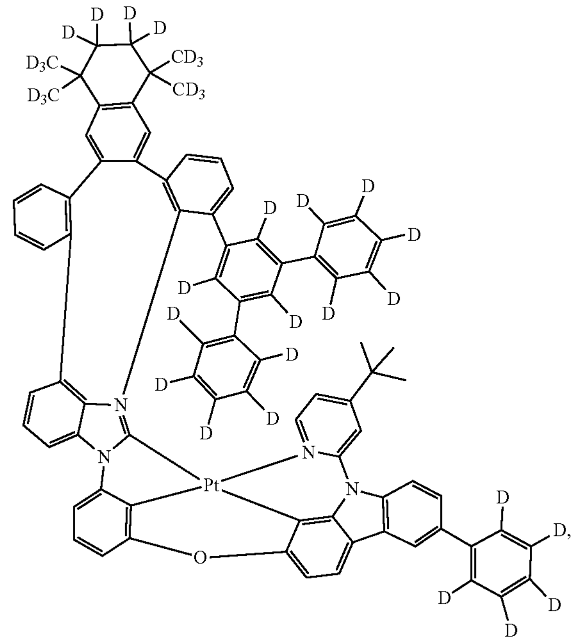
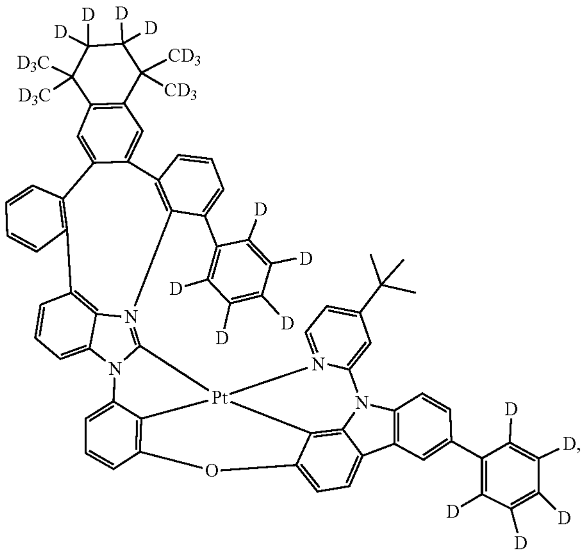
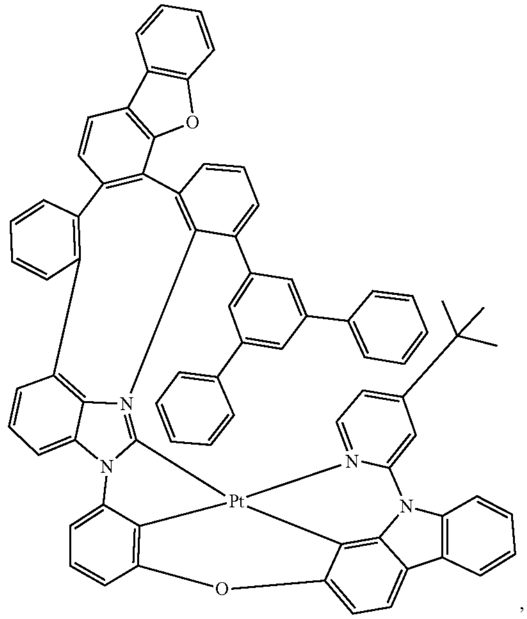
,

-continued
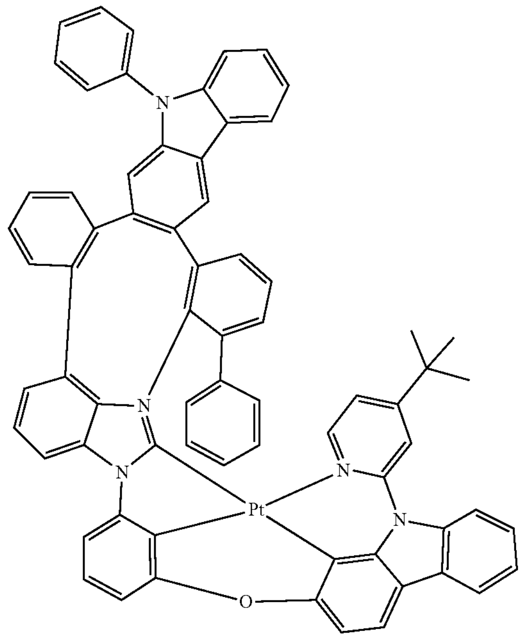
,
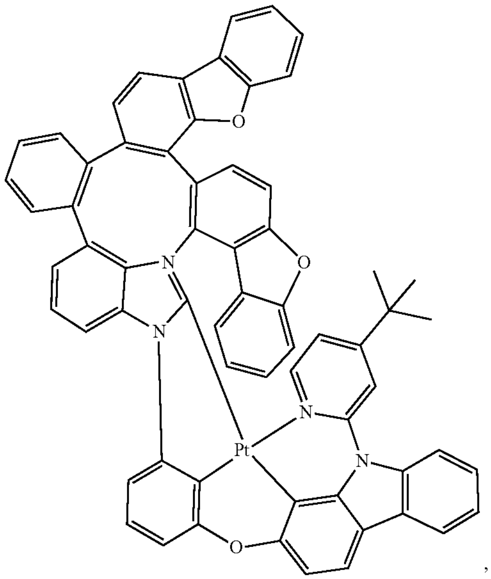
,
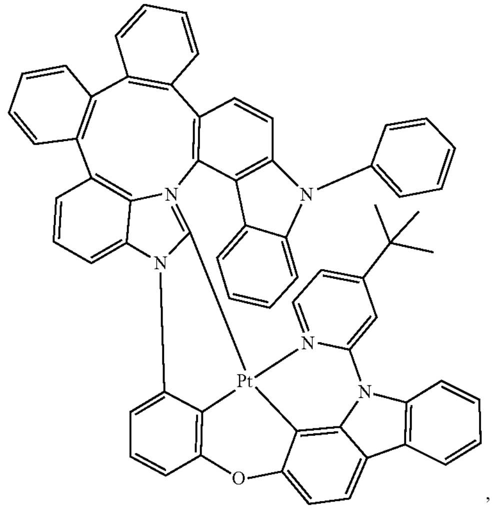
,
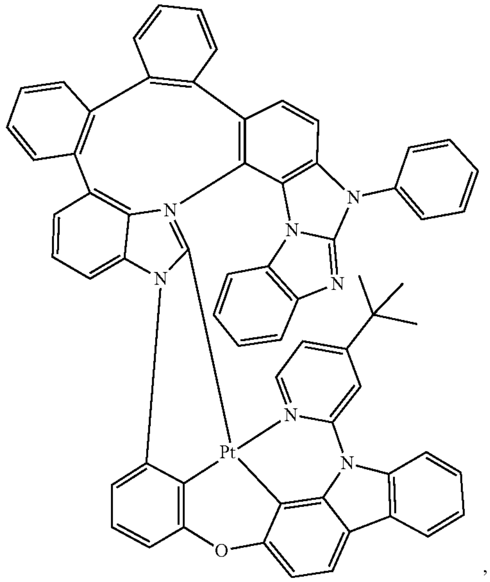
,

-continued
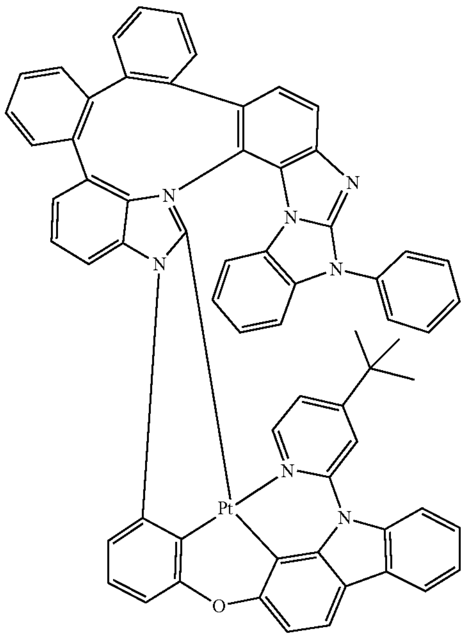
,
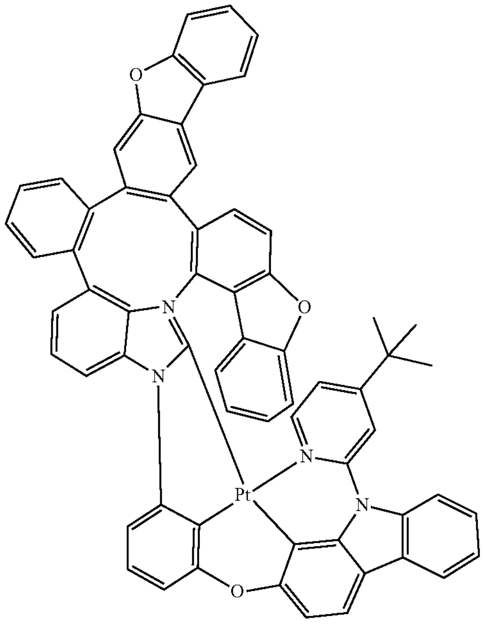
,
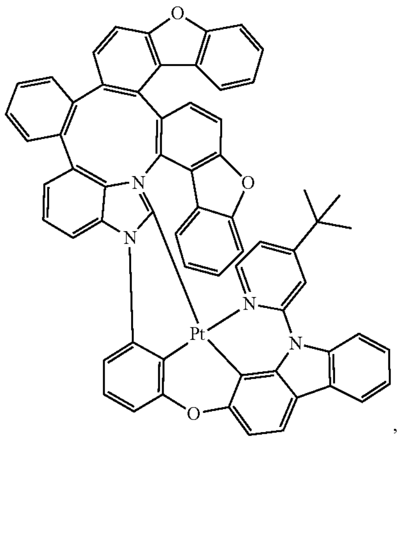
,
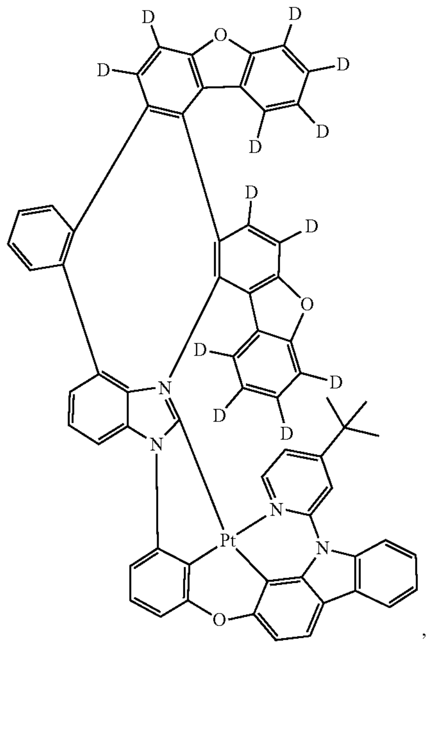
,

-continued
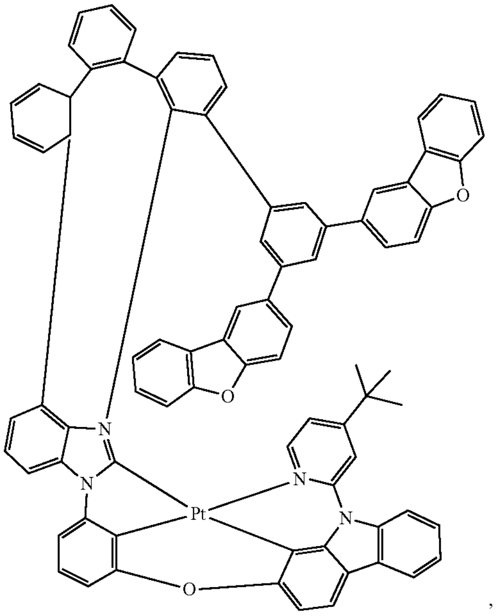
,
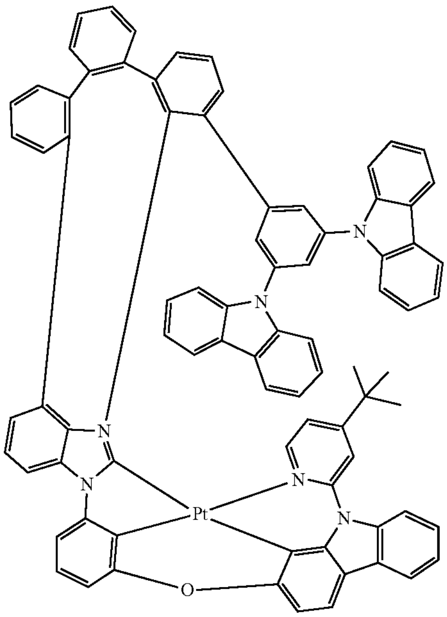
,
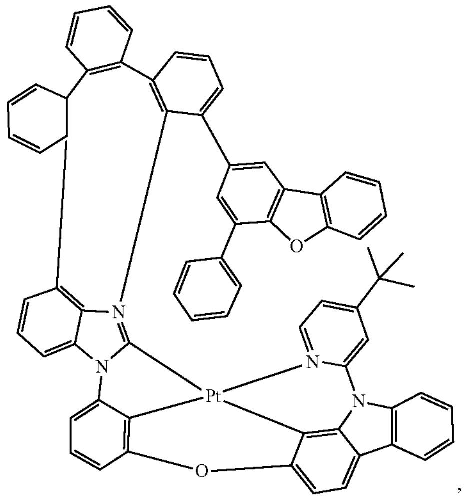
,

-continued
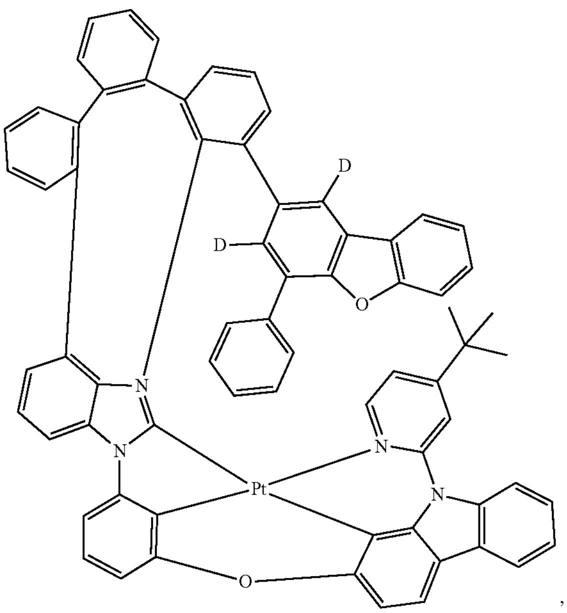
,
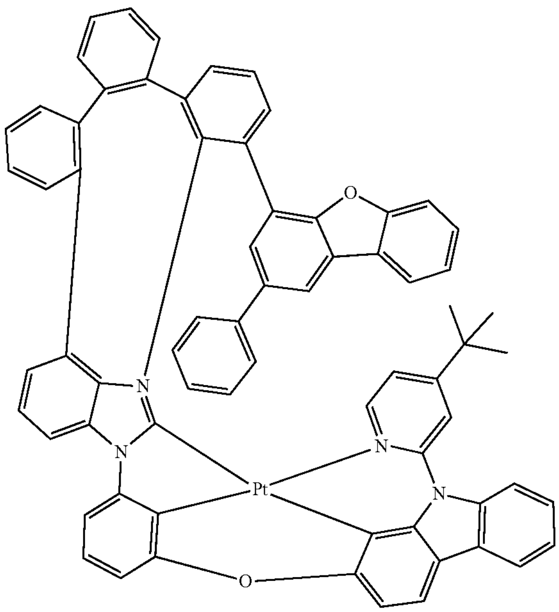
,
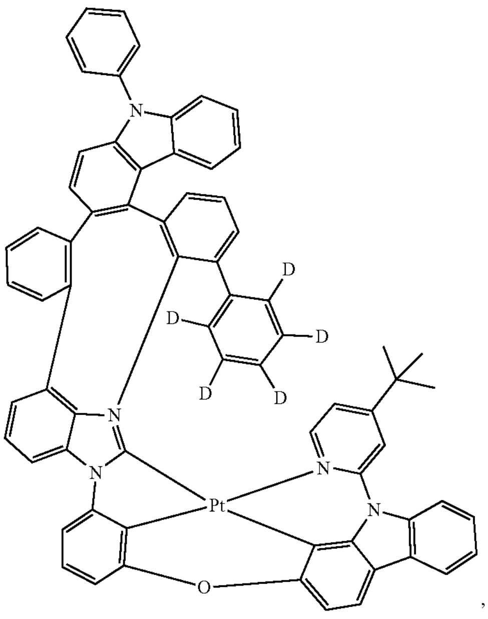
,
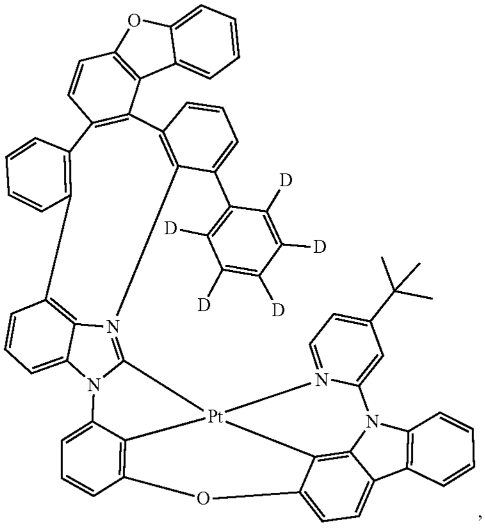
,

-continued
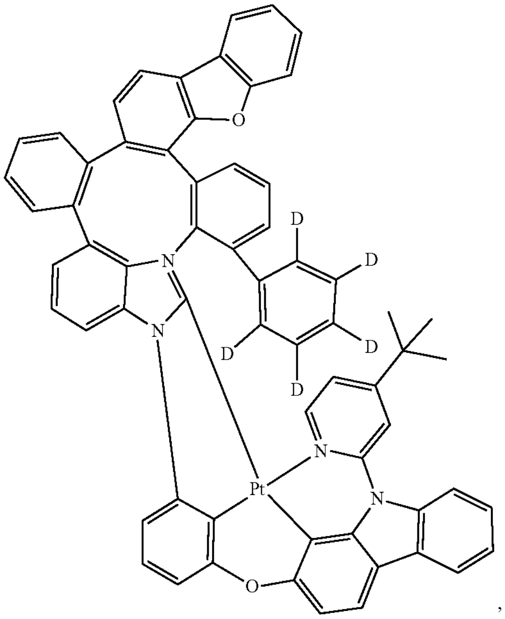
,
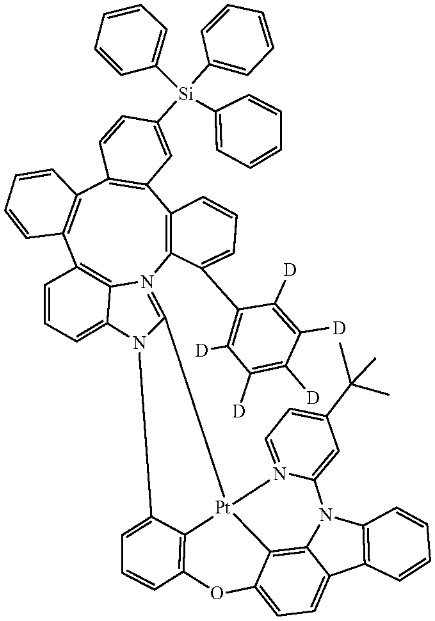
,
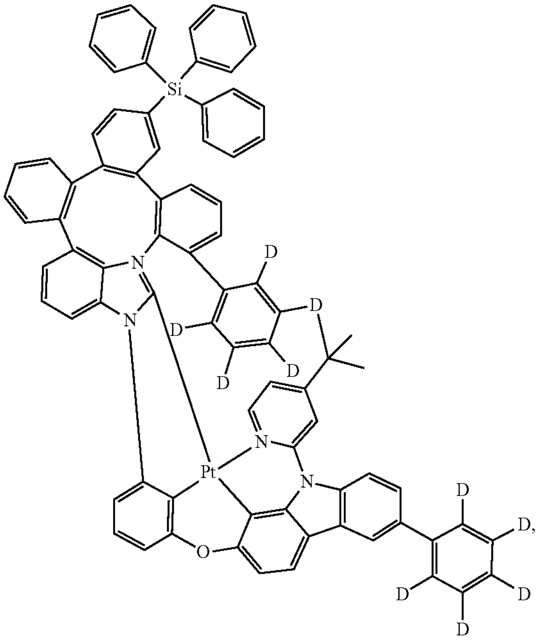
,

-continued
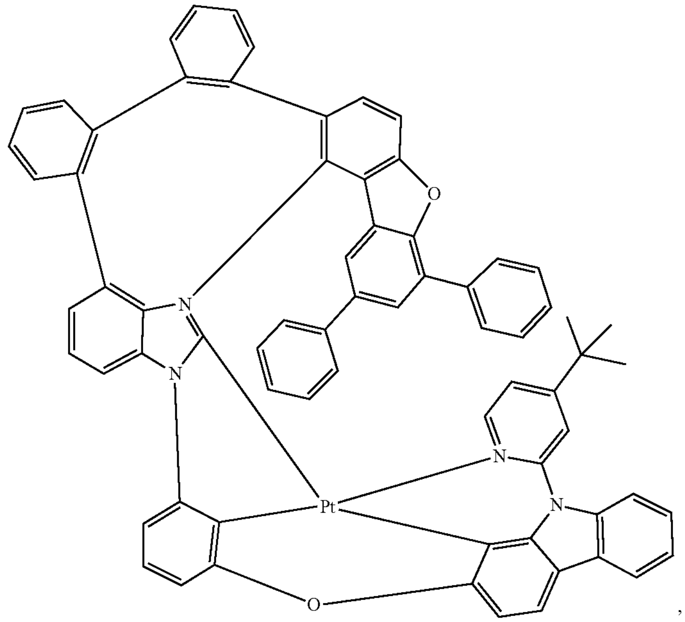
,
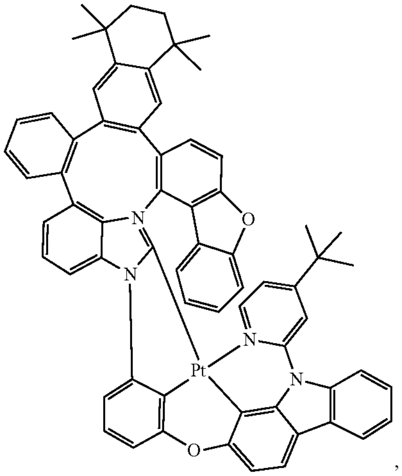
,
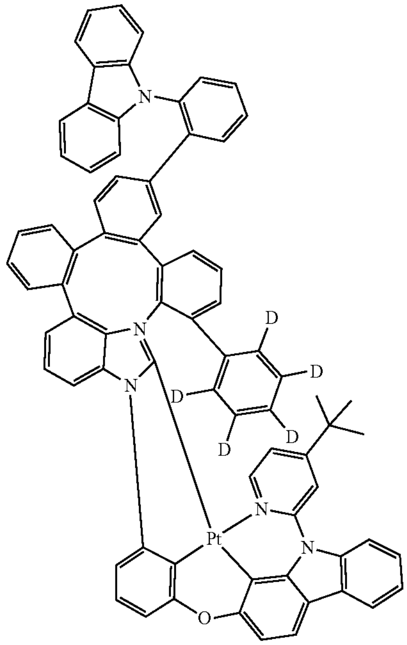
,

-continued
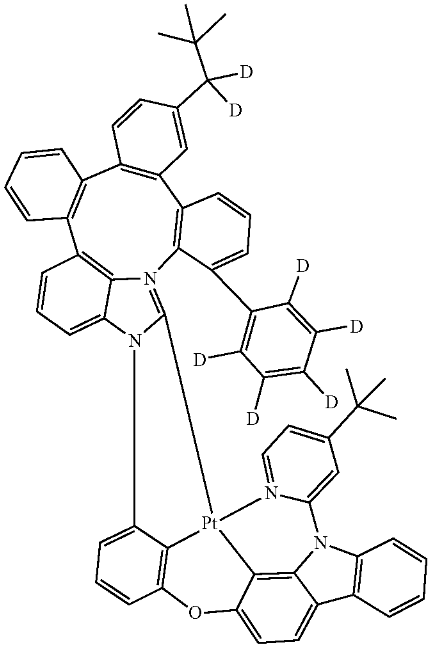
,
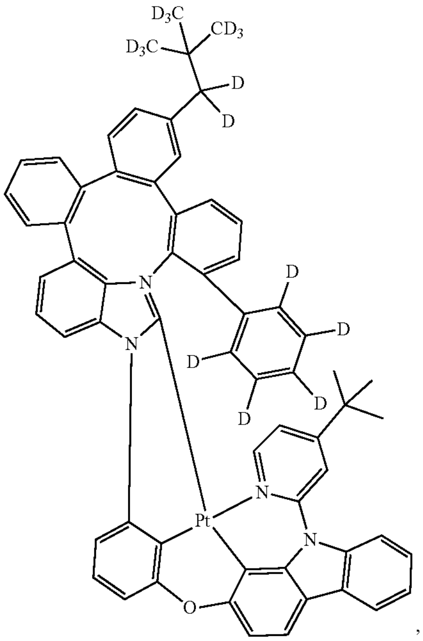
,
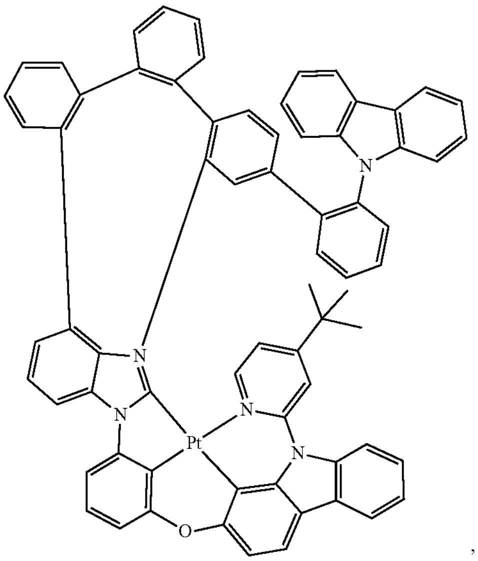
,

-continued
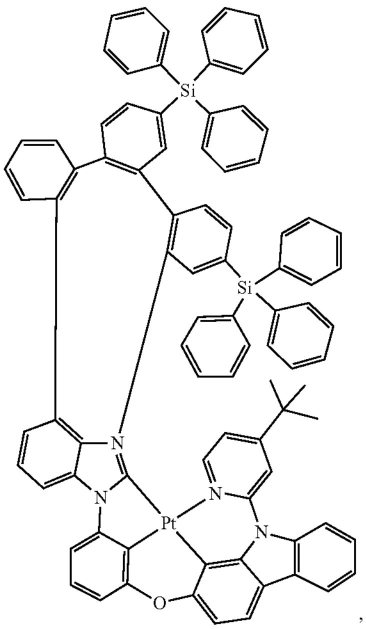
,
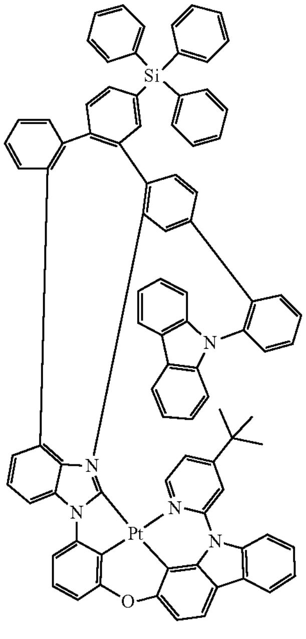
,
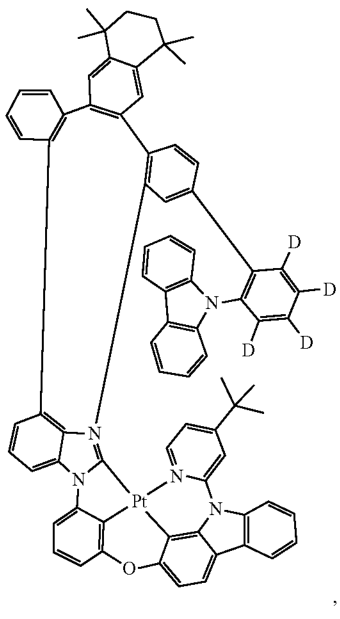
,

-continued
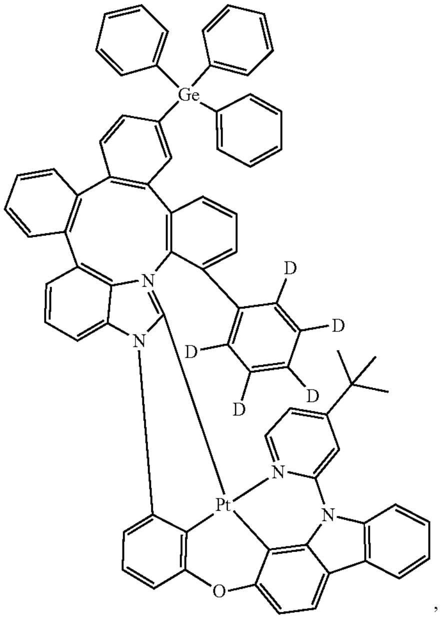
,
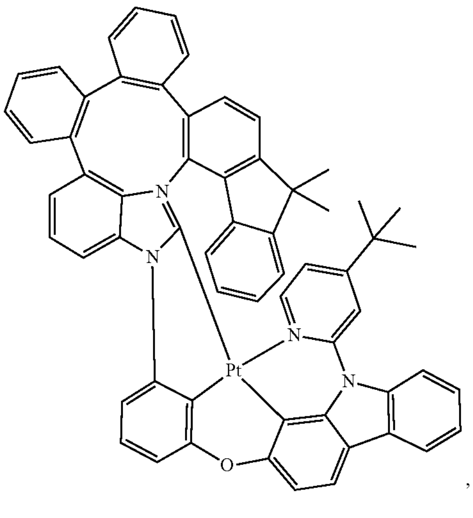
,
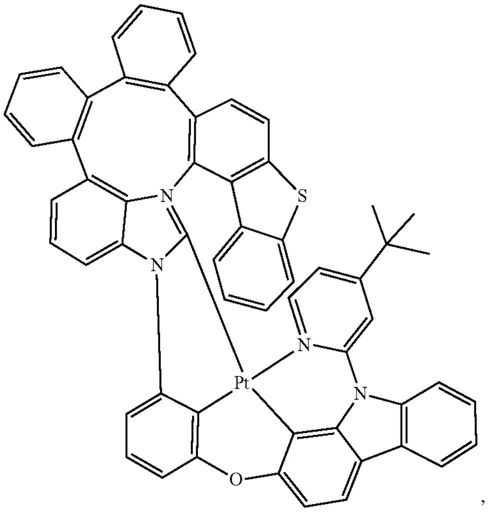
,

-continued
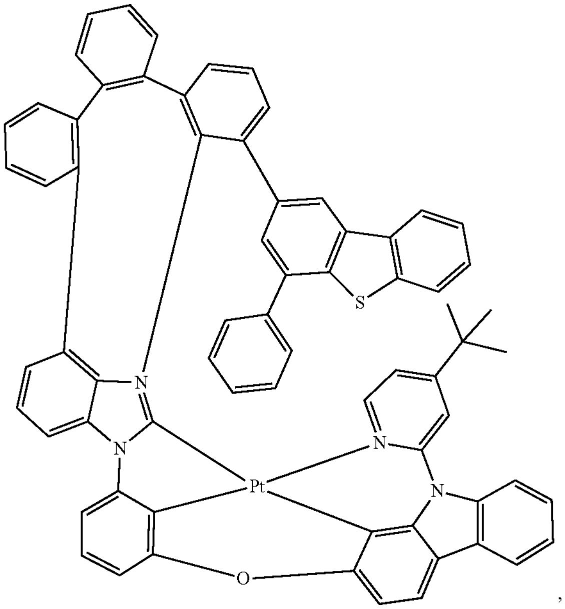
,
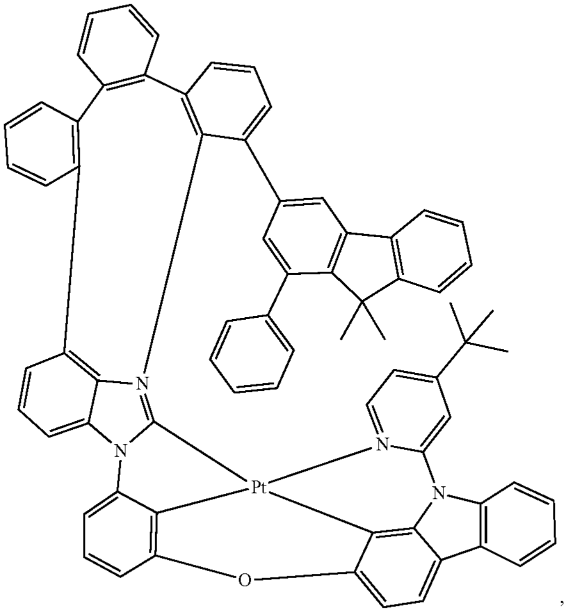
,
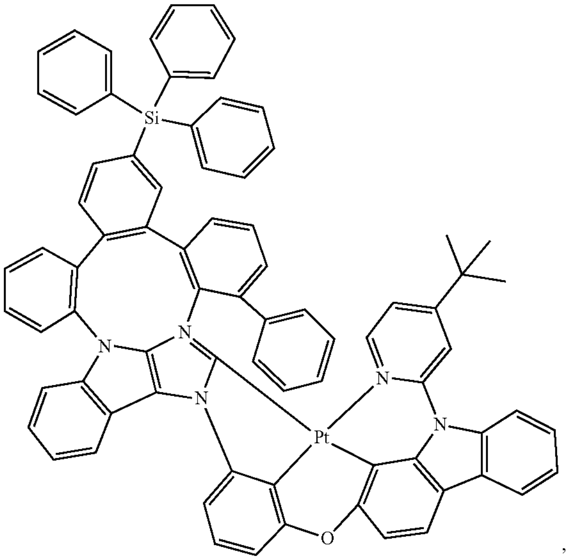
,

-continued
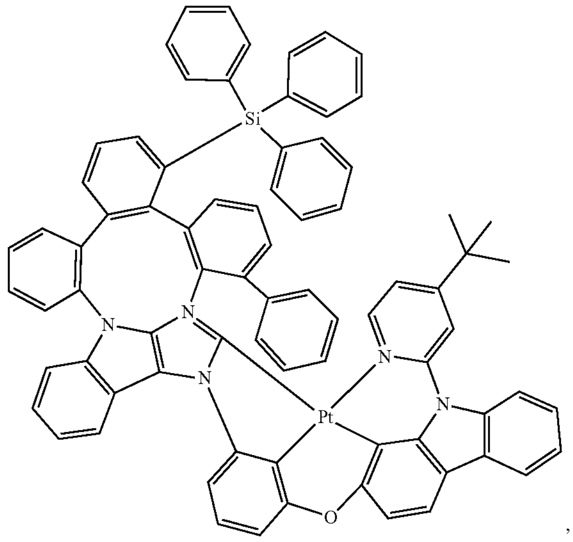
,
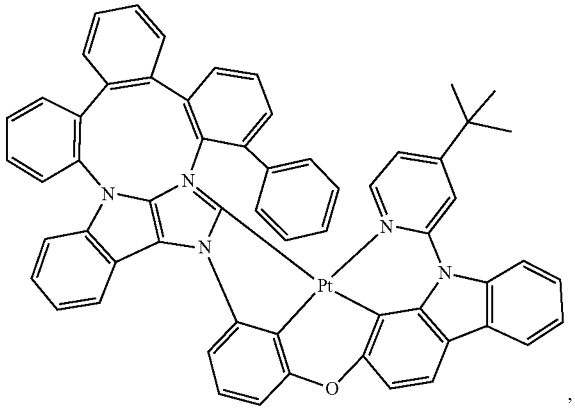
,
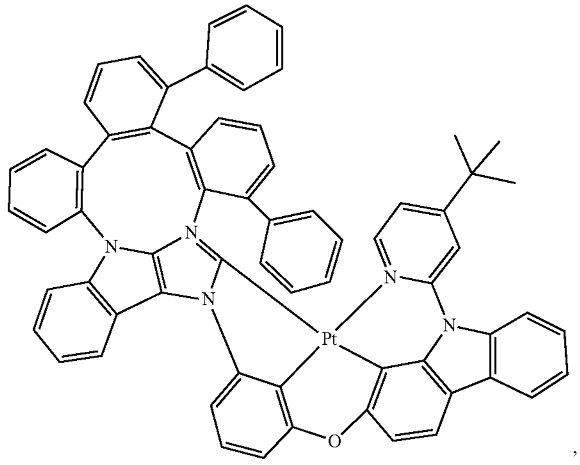
,
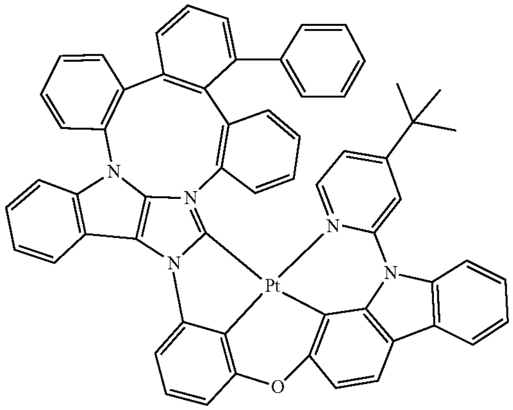
,
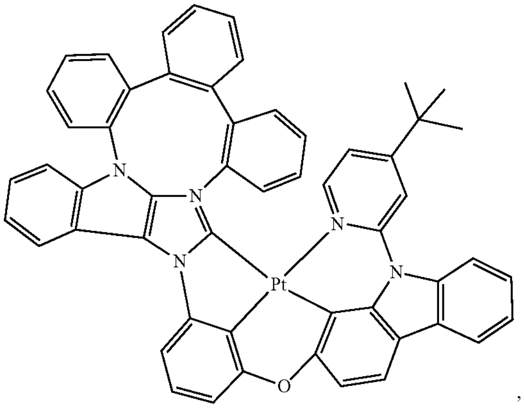
,
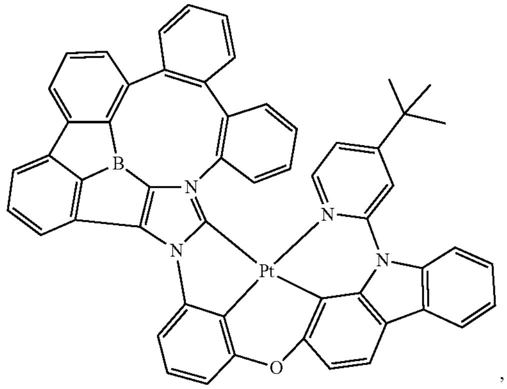
, -continued
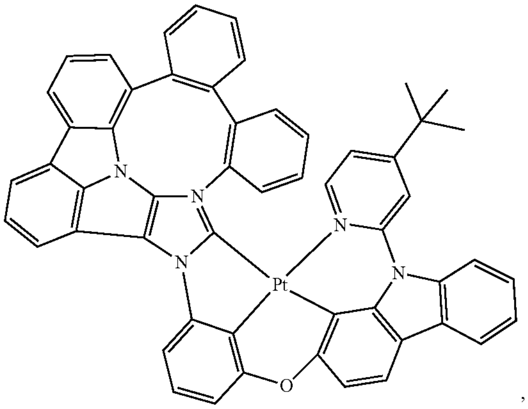
, and
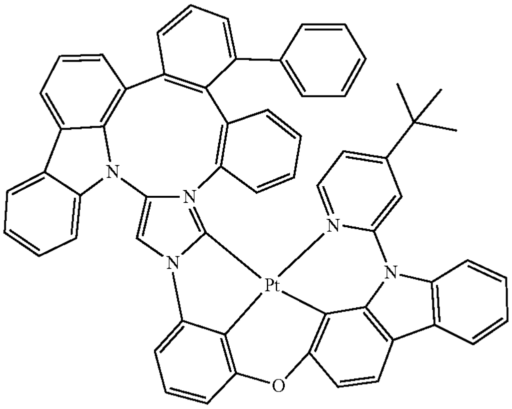
.
In some embodiments, the compound can be selected from the group consisting of:
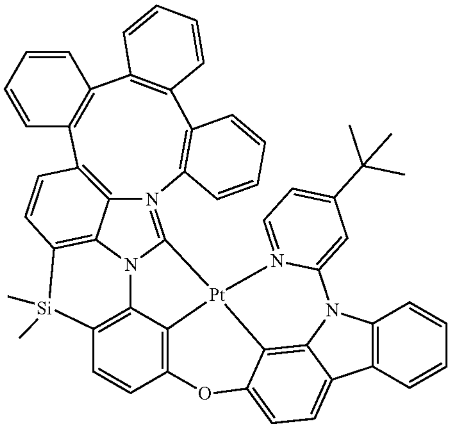
,
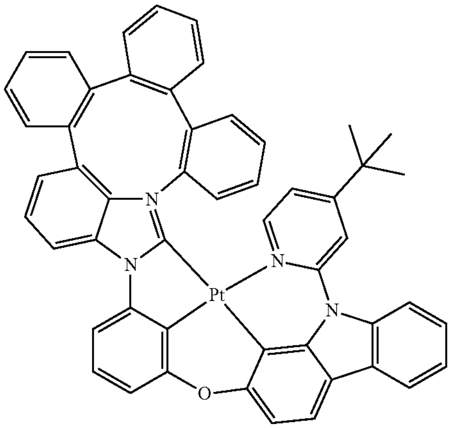
,
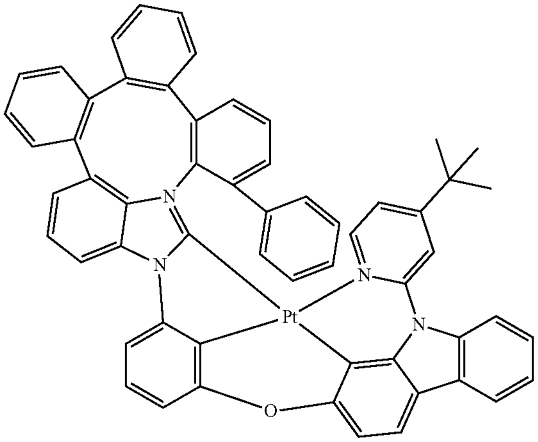
,
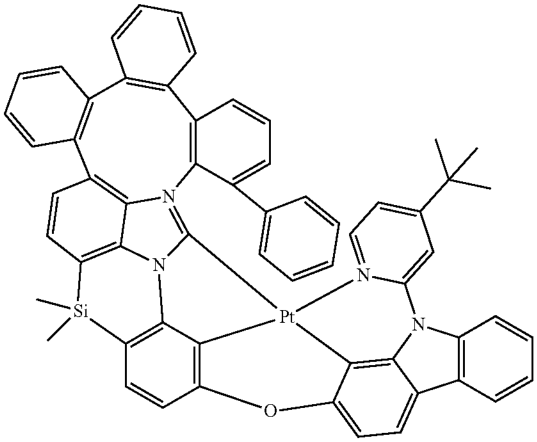
, -continued
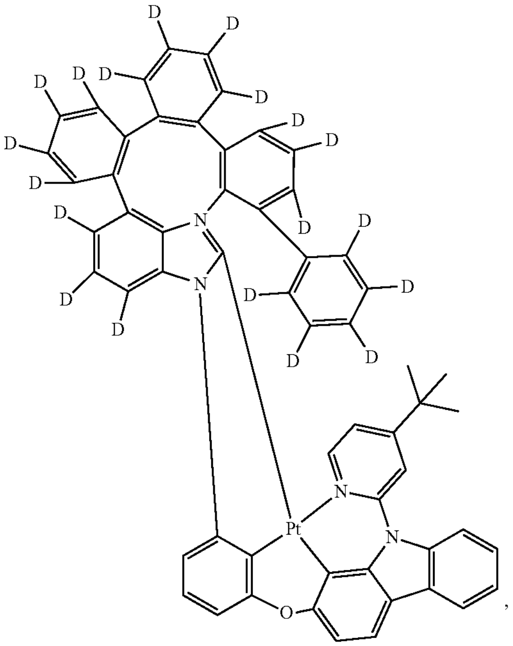
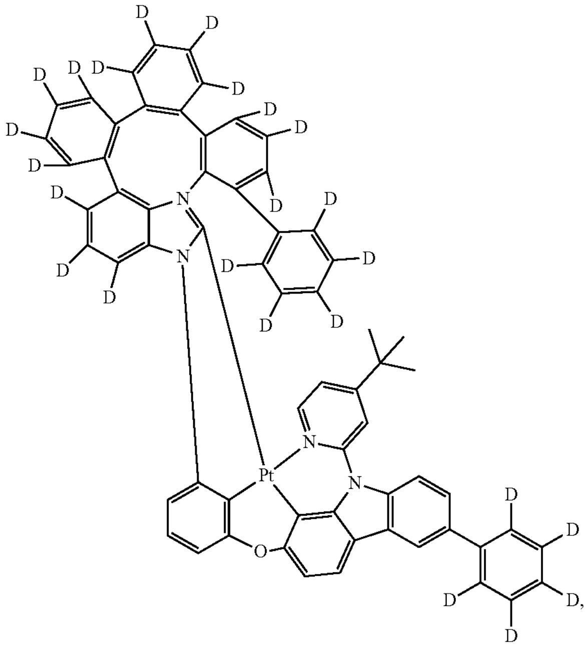
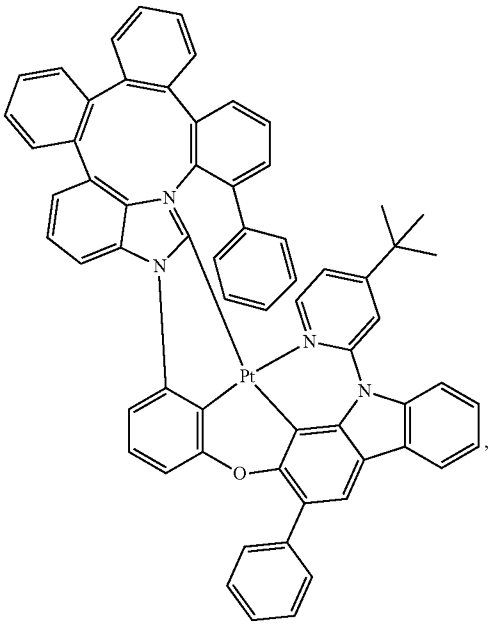
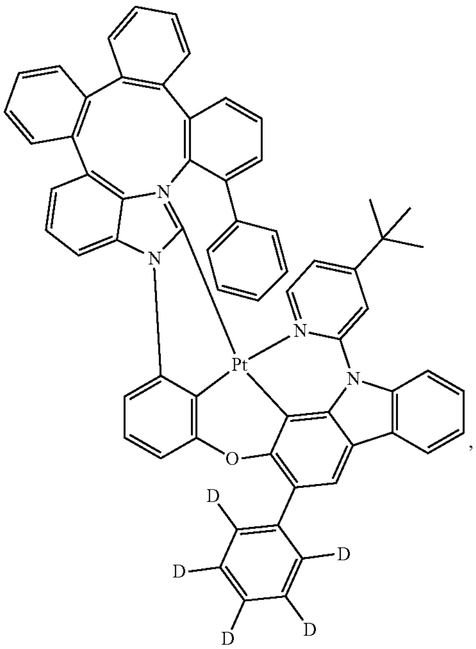

-continued
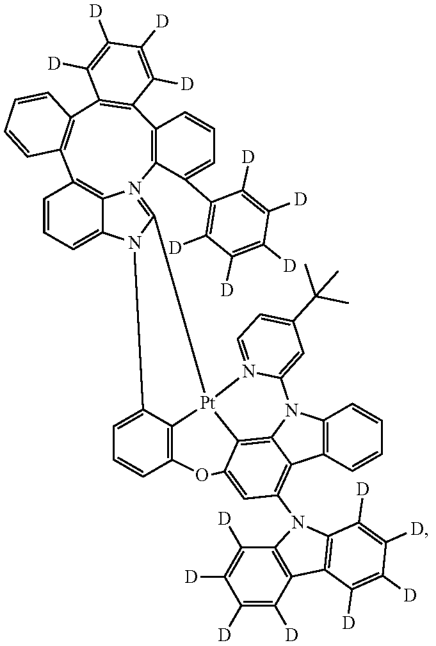
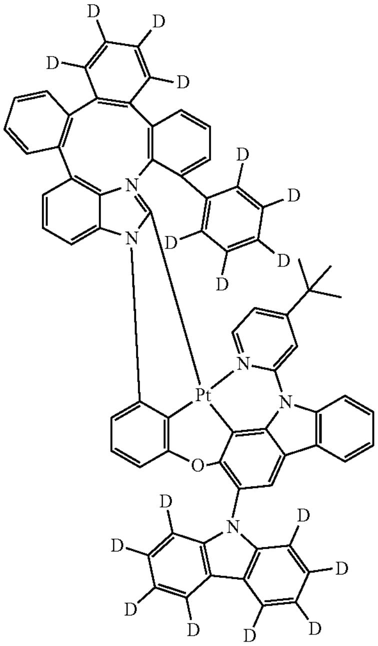
,
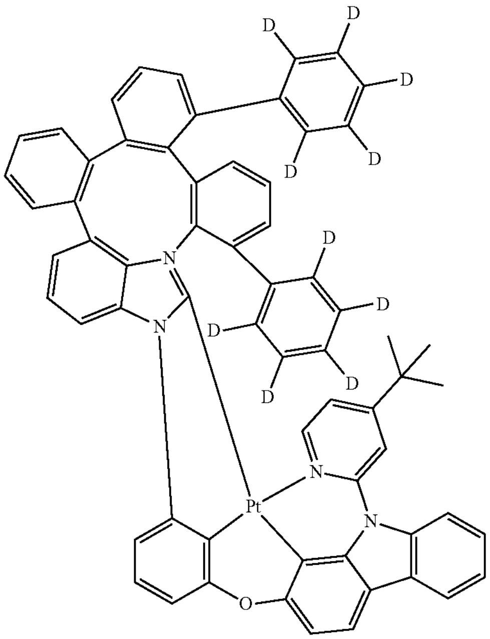
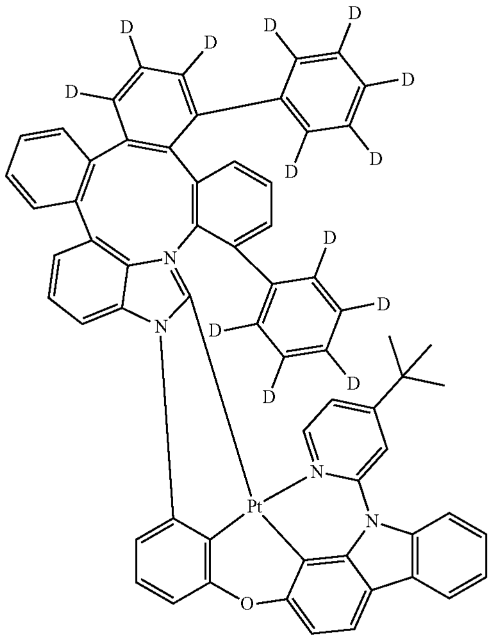

-continued
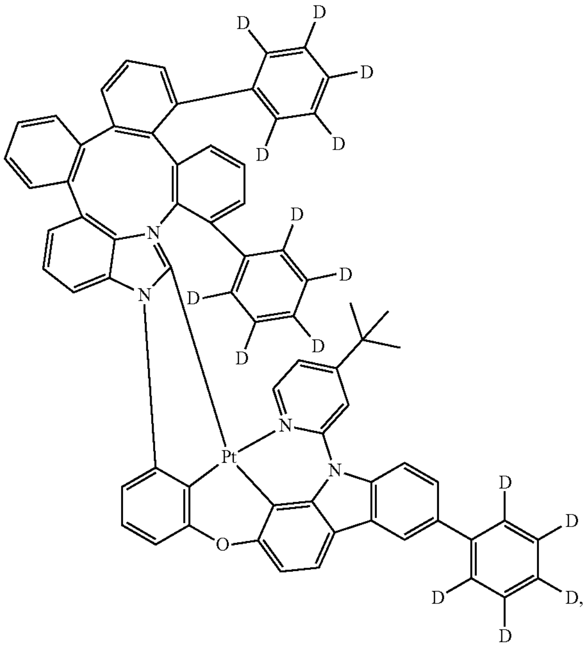
D,
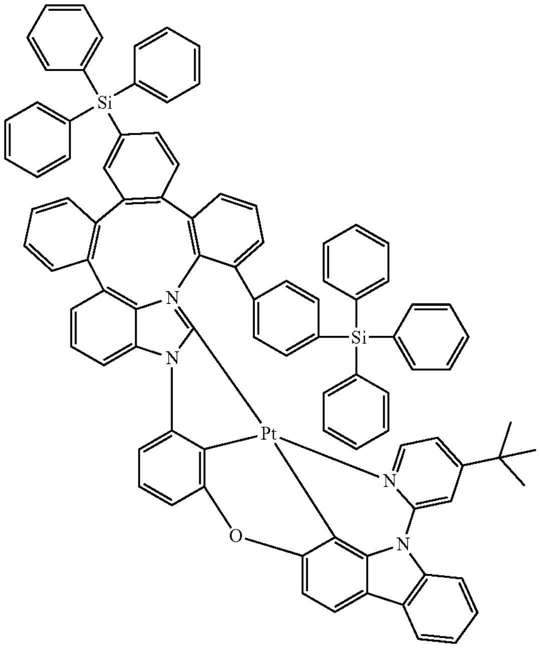
,
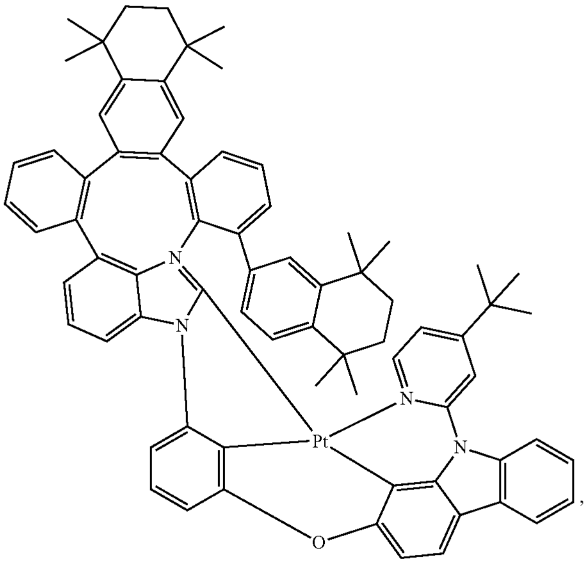
,
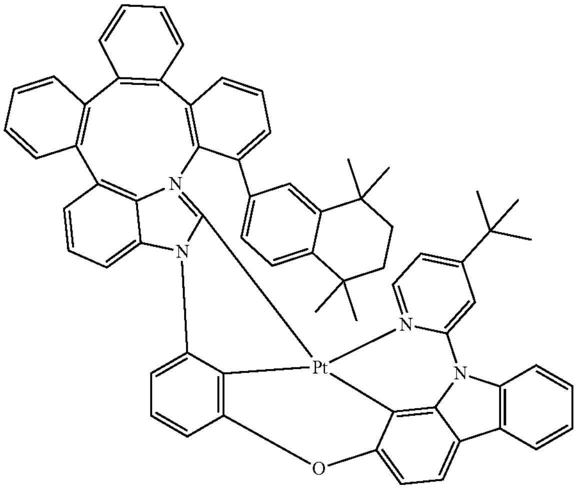
,

-continued
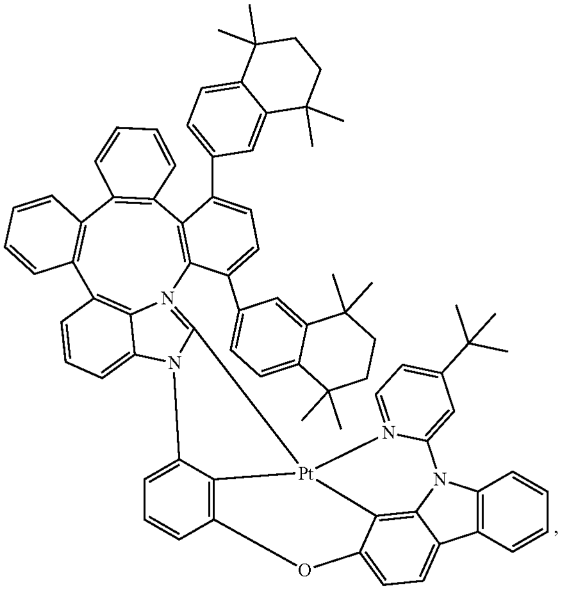
,
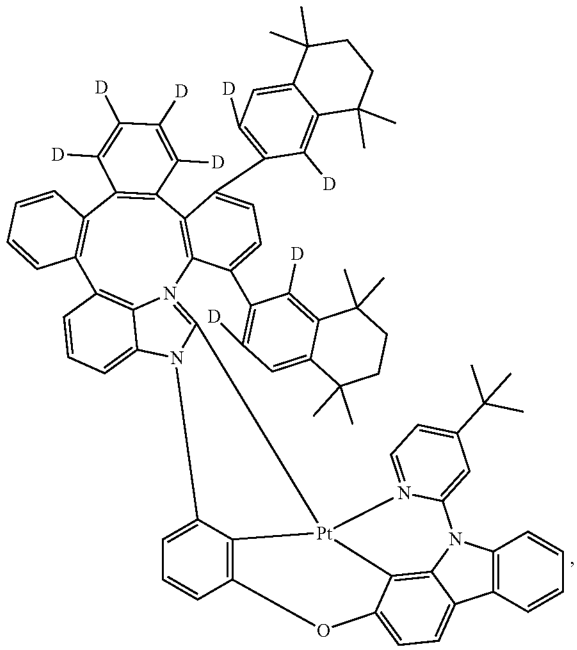
,
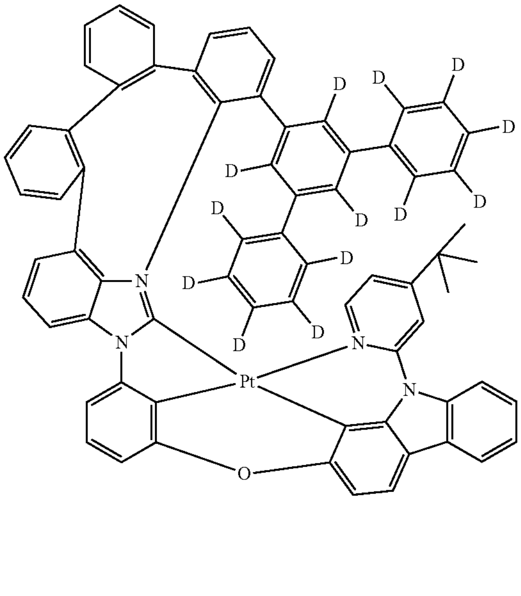
,
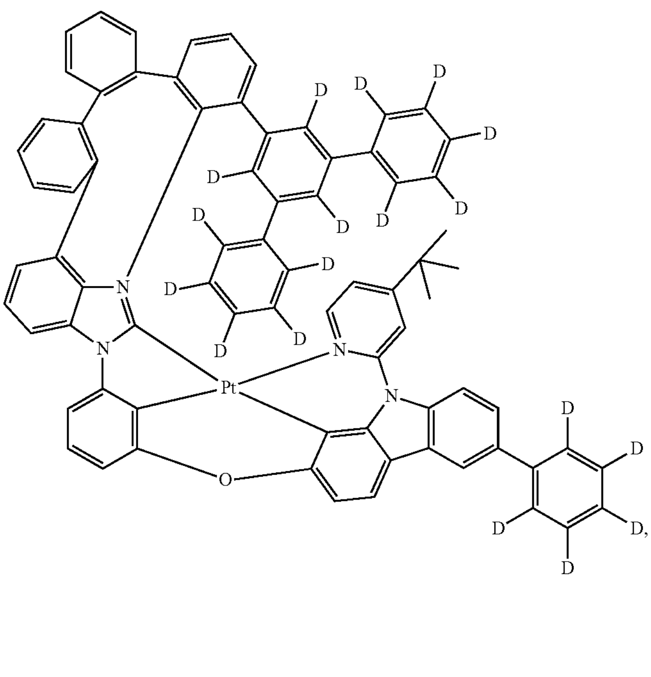
,

-continued
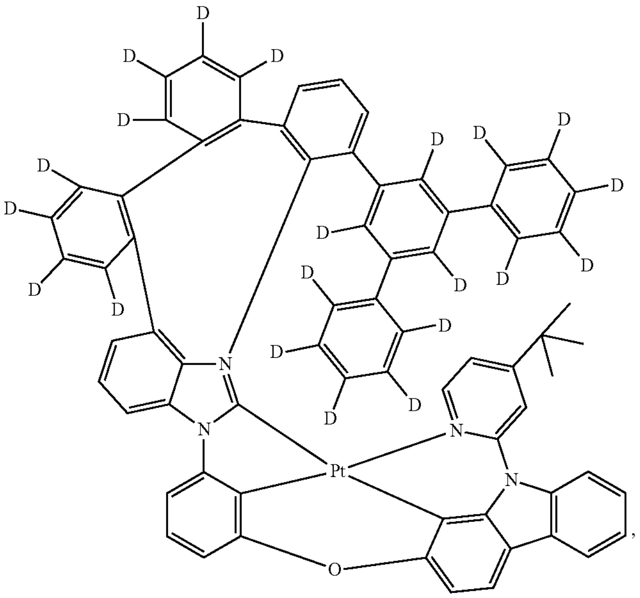
,
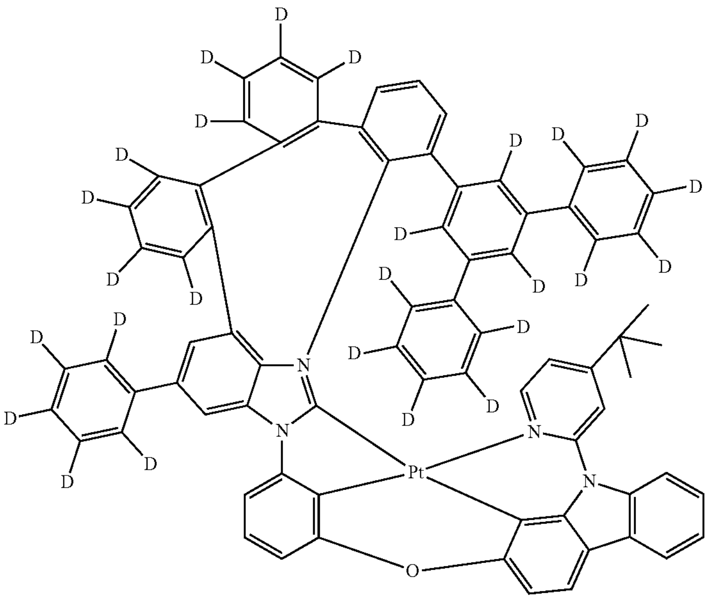

-continued
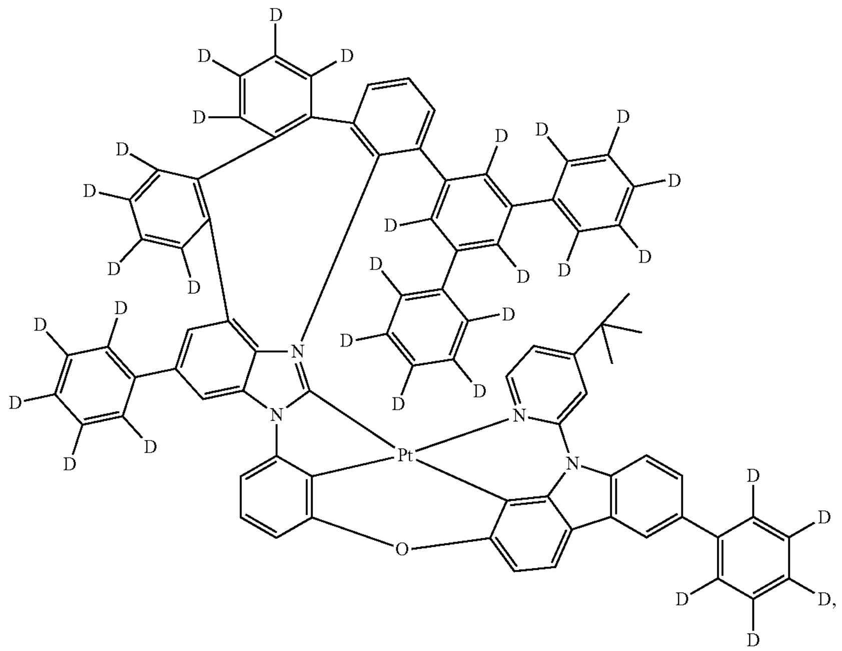
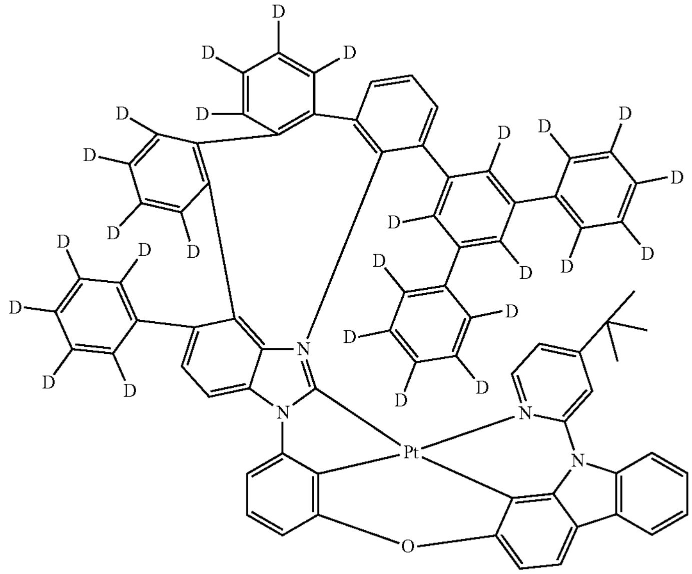

-continued
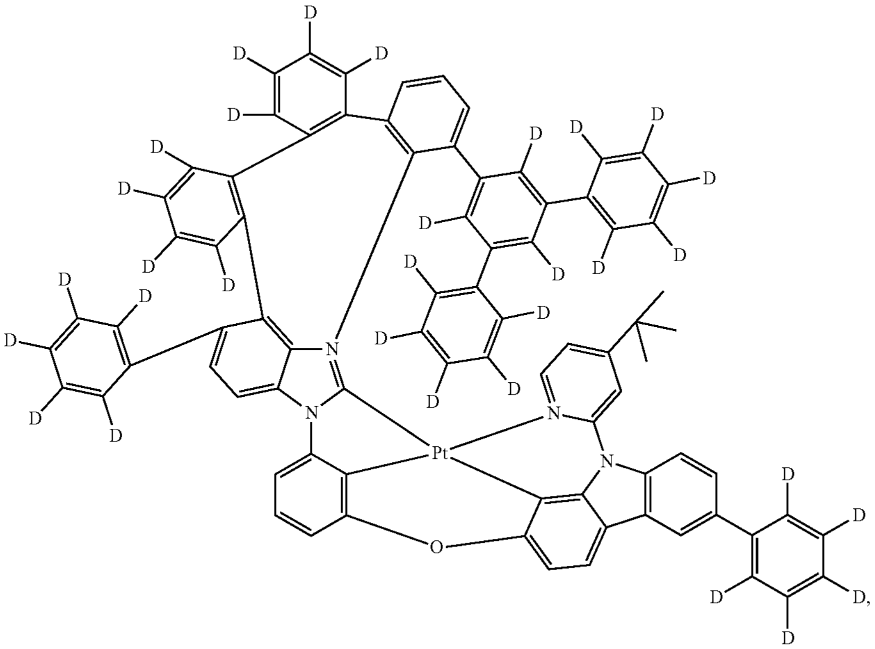
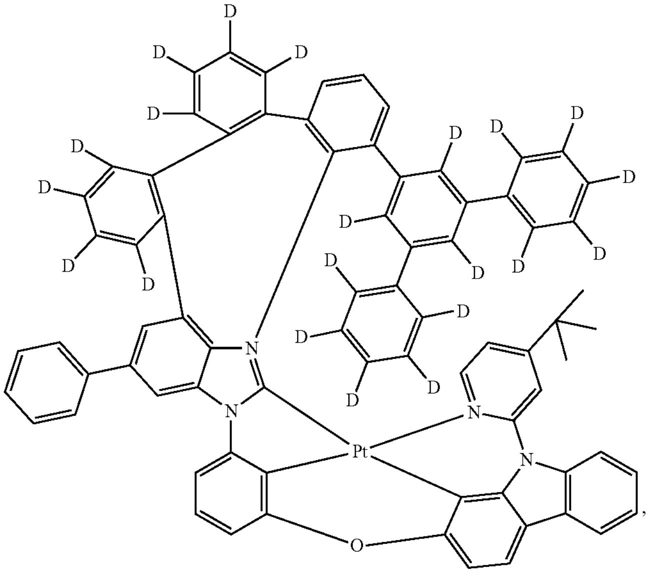
, and

-continued

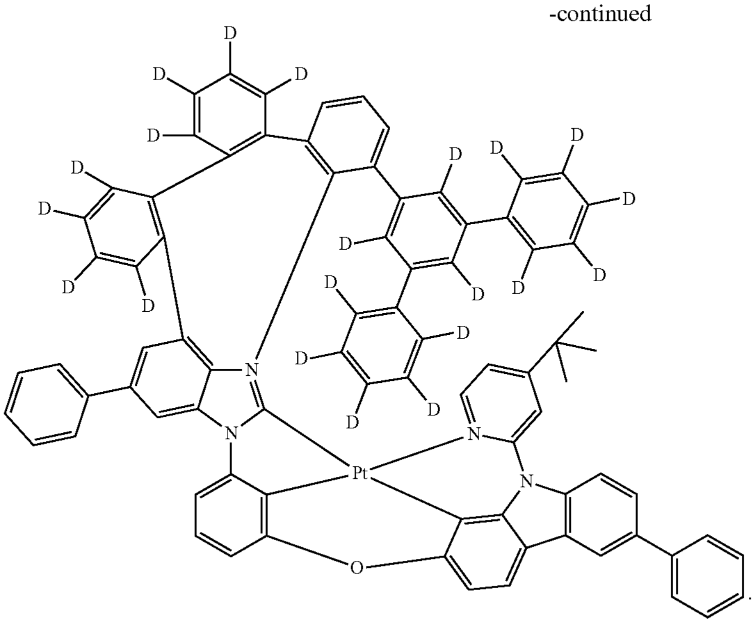

In some embodiments, the compound having a ligand $L_A$ of Formula I or Formula II described herein can be at least 30% deuterated, at least 40% deuterated, at least 50% deuterated, at least 60% deuterated, at least 70% deuterated, at least 80% deuterated, at least 90% deuterated, at least 95% deuterated, at least 99% deuterated, or 100% deuterated. As used herein, percent deuteration has its ordinary meaning and includes the percent of possible hydrogen atoms (e.g., positions that are hydrogen, or deuterium) that are replaced by deuterium atoms.

C. The OLEDs and the Devices of the Present Disclosure

In another aspect, the present disclosure also provides an OLED device comprising an organic layer that contains a compound as disclosed in the above compounds section of the present disclosure.

In some embodiments, the organic layer may comprise a compound comprising a ligand $L_A$ Of Formula I

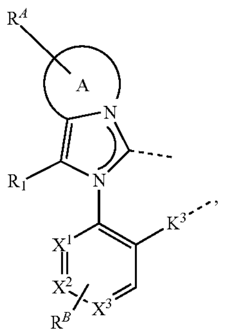

or

-continued

Formula II

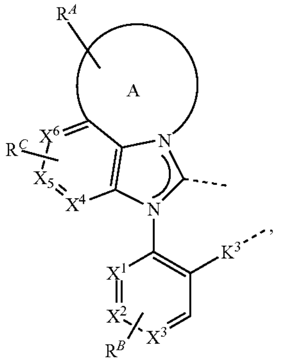

wherein ring A is independently a 5-membered to 10-membered heterocyclic ring; $X^1$-$X^6$ are each independently C or N; $K^3$ is a direct bond, O, or S; the maximum number of N atoms that connect to each other within a ring is two; $R^A$, $R^B$, and $R^C$ each independently represents zero, mono, or up to the maximum allowed number of substitutions to its associated ring; and each of $R_1$, $R^A$, $R^B$, $R^C$ is independently a hydrogen or a substituent selected from the group consisting of the general substituents defined herein, wherein the ligand $L_A$ is complexed to a metal M through the two indicated dashed lines; M is Ir, Rh, Re, Ru, Os, Pt, Pd, Ag, Au, or Cu, and can be coordinated to other ligands; the ligand $L_A$ can be joined with other ligands to form a tridentate, tetradentate, pentadentate, or hexadentate ligand; and any two $R^A$, $R^B$, $R^C$, or $R^1$ can be joined or fused to form a ring, with a condition that the compound does not comprise either one of the structures indicated below:

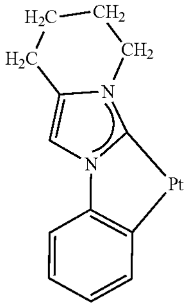

or

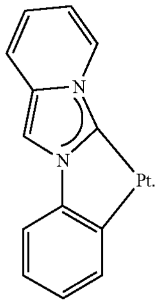

In some embodiments, the organic layer may be an emissive layer and the compound as described herein may be an emissive dopant or a non-emissive dopant.

In some embodiments, the organic layer may further comprise a host, wherein the host comprises a triphenylene containing benzo-fused thiophene or benzo-fused furan, wherein any substituent in the host is an unfused substituent independently selected from the group consisting of $C_nH_{2n+1}$, $OC_nH_{2n+1}$, $OAr_1$, $N(C_nH_{2n+1})_2$, $N(Ar_1)(Ar_2)$, $CH{=}CH{-}C_nH_{2n+1}$, $C{\equiv}CC_nH_{2n+1}$, $Ar_1$, $Ar_1{-}Ar_2$, $C_nH_{2n}{-}Ar_1$, or no substitution, wherein n is from 1 to 10; and wherein $Ar_1$ and $Ar_2$ are independently selected from the group consisting of benzene, biphenyl, naphthalene, triphenylene, carbazole, and heteroaromatic analogs thereof.

In some embodiments, the organic layer may further comprise a host, wherein host comprises at least one chemical moiety selected from the group consisting of triphenylene, carbazole, indolocarbazole, dibenzothiophene, dibenzofuran, dibenzoselenophene, 5$\lambda^2$-benzo[d]benzo[4,5]imidazo[3,2-a]imidazole, 5,9-dioxa-13b-boranaphtho[3,2,1-de]anthracene, triazine, boryl, silyl, aza-triphenylene, aza-carbazole, aza-indolocarbazole, aza-dibenzothiophene, aza-dibenzofuran, aza-dibenzoselenophene, aza-5$\lambda^2$-benzo[d]benzo[4,5]imidazo[3,2-a]imidazole, and aza-(5,9-dioxa-13b-boranaphtho[3,2,1-de]anthracene).

In some embodiments, the host may be selected from the group consisting of:

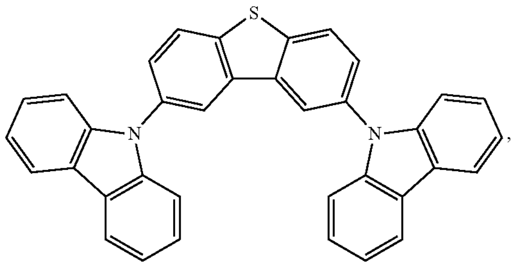

,

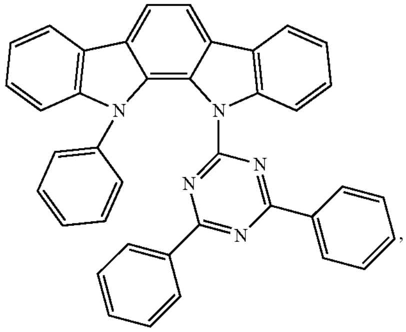

,

-continued

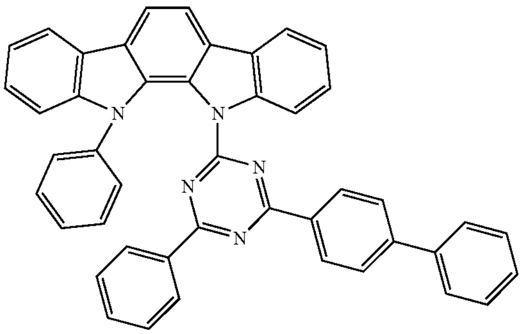

,

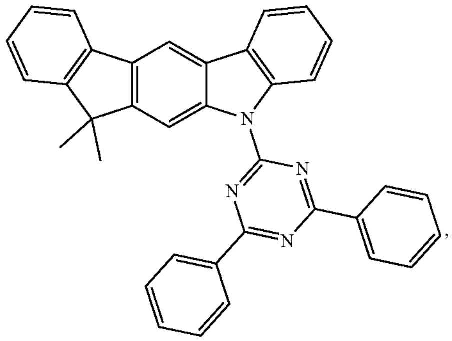

,

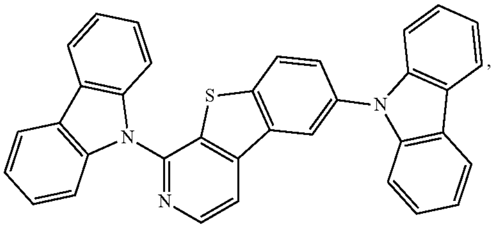

,

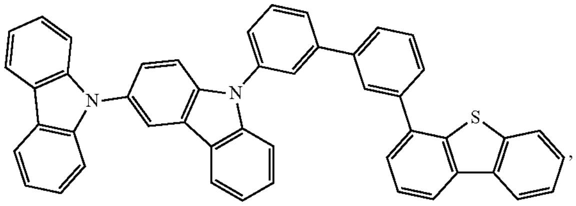

,

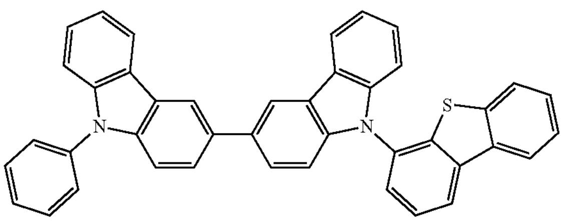

,

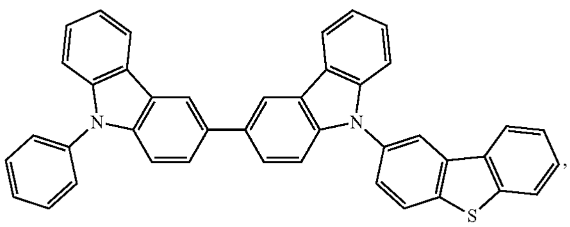

,

-continued
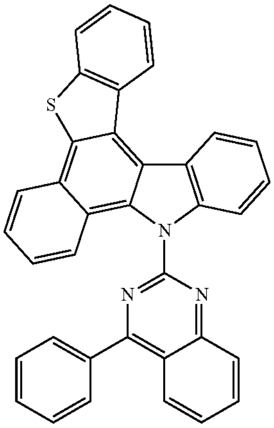
,
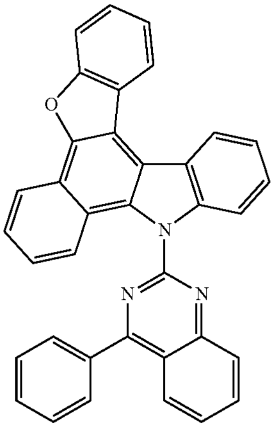
,
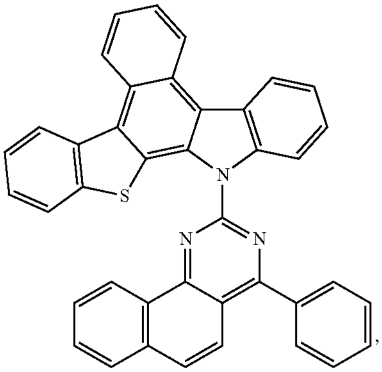
,
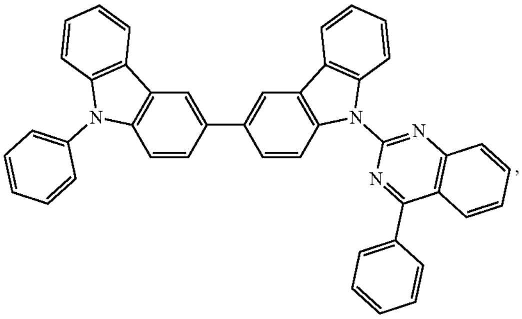
,
-continued
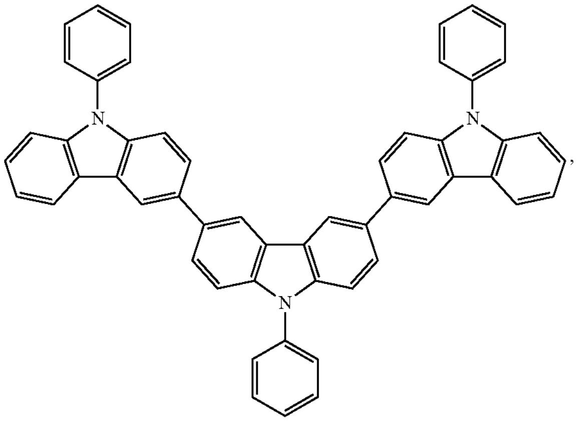
,
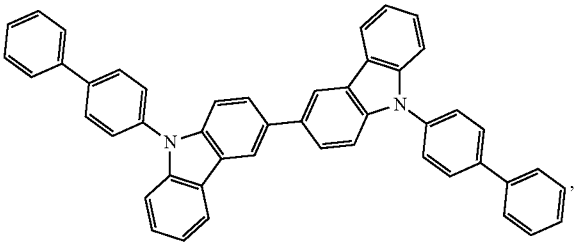
,
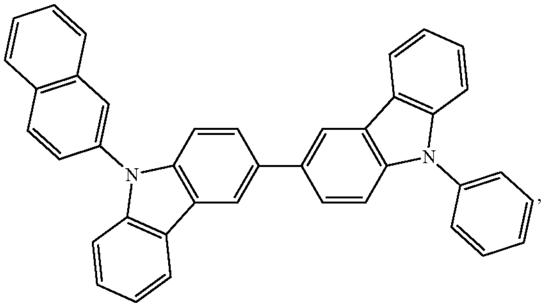
,
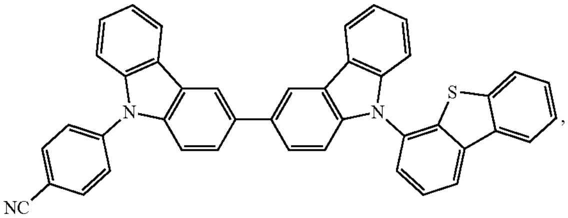
,
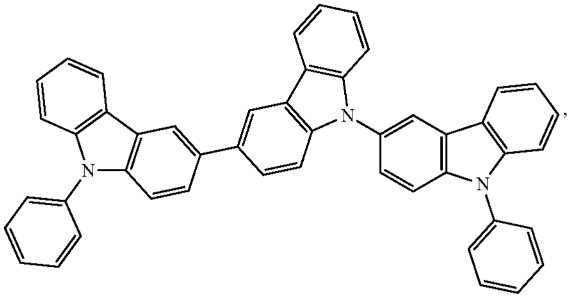
, -continued
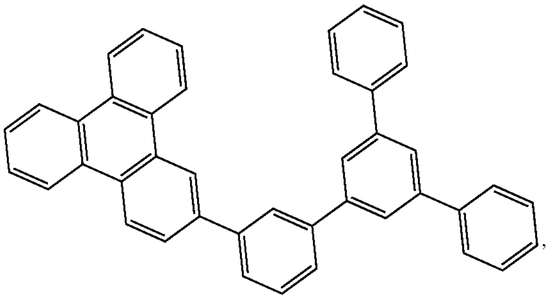
,
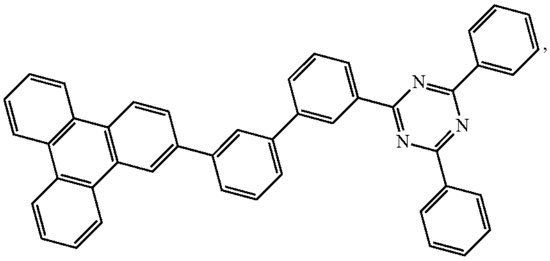
,
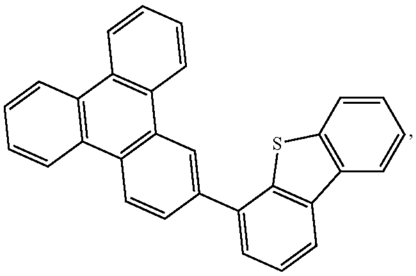
,
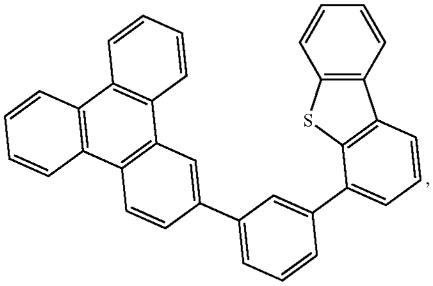
,
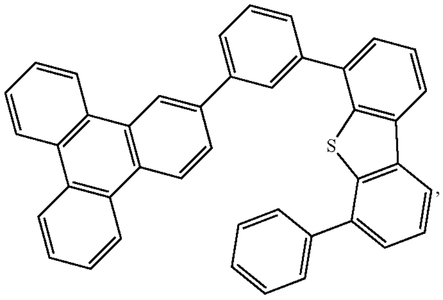
,
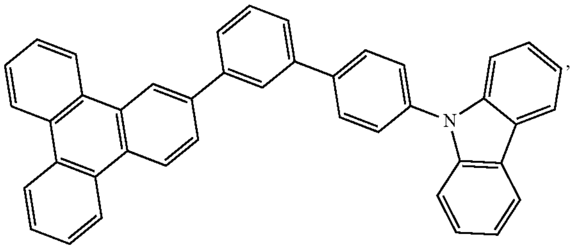
,
-continued
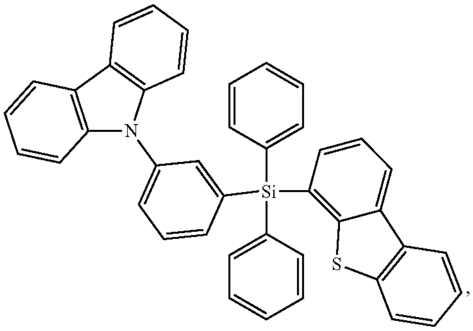
,
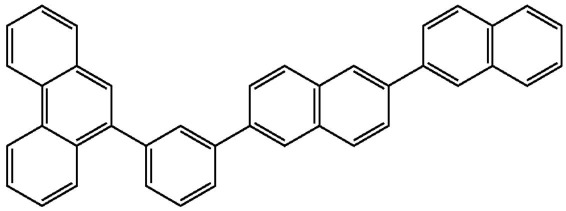
,
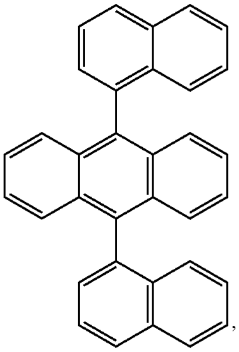
,
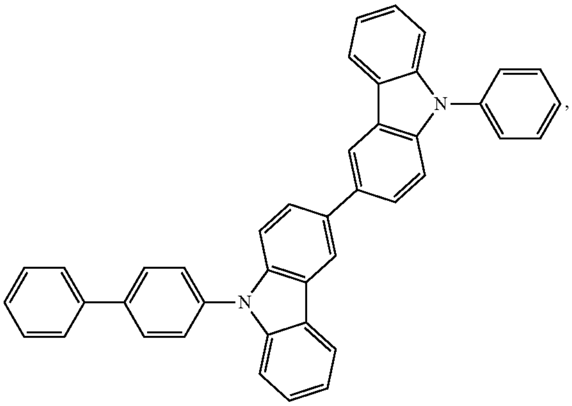
,
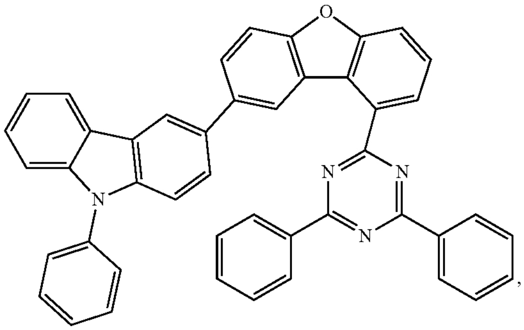
, -continued

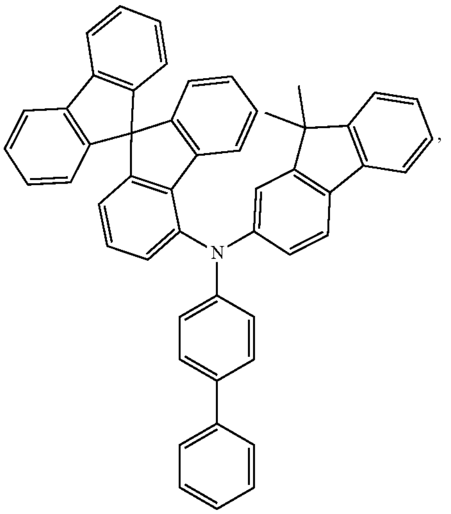

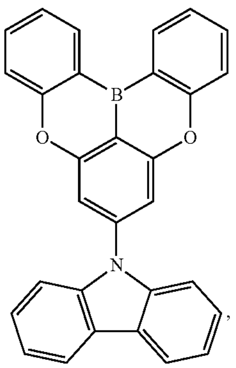

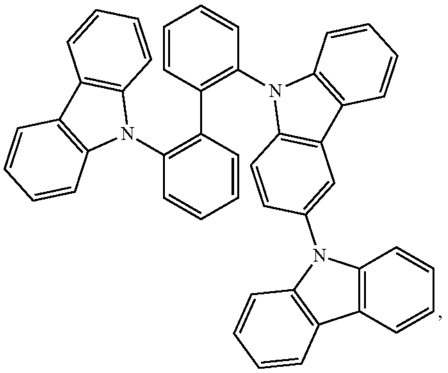

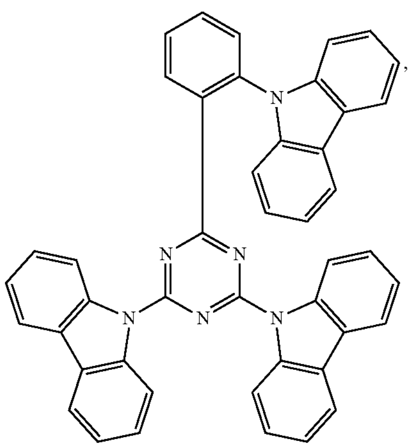

-continued

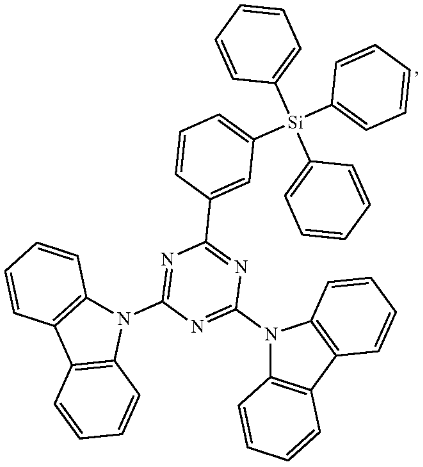

and combinations thereof.

In some embodiments, the organic layer may further comprise a host, wherein the host comprises a metal complex.

In some embodiments, the emissive layer can comprise two hosts, a first host and a second host. In some embodiments, the first host is a hole transporting host, and the second host is an electron transporting host. In some embodiments, the first host and the second host can form an exciplex.

In some embodiments, the compound as described herein may be a sensitizer; wherein the device may further comprise an acceptor; and wherein the acceptor may be selected from the group consisting of fluorescent emitter, delayed fluorescence emitter, and combination thereof.

In yet another aspect, the OLED of the present disclosure may also comprise an emissive region containing a compound as disclosed in the above compounds section of the present disclosure.

In some embodiments, the emissive region may comprise a compound comprising a ligand $L_A$ of Formula I

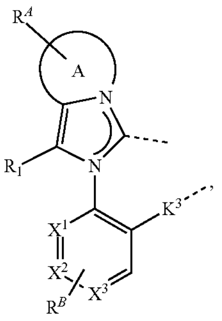

or

-continued

Formula II

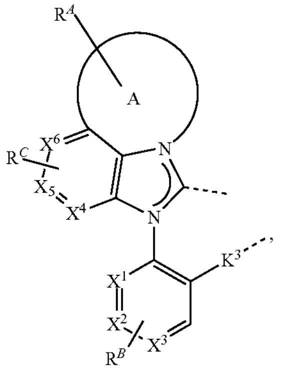

wherein ring A is independently a 5-membered to 10-membered heterocyclic ring; $X^1$-$X^6$ are each independently C or N; $K^3$ is a direct bond, O, or S; the maximum number of N atoms that connect to each other within a ring is two; $R^A$, $R^B$, and $R^C$ each independently represents zero, mono, or up to the maximum allowed number of substitutions to its associated ring; and each of $R_1$, $R^A$, $R^B$, $R^C$ is independently a hydrogen or a substituent selected from the group consisting of the general substituents defined herein, wherein the ligand $L_A$ is complexed to a metal M through the two indicated dashed lines; M is Ir, Rh, Re, Ru, Os, Pt, Pd, Ag, Au, or Cu, and can be coordinated to other ligands; the ligand $L_A$ can be joined with other ligands to form a tridentate, tetradentate, pentadentate, or hexadentate ligand; and any two $R^A$, $R^B$, $R^C$, or $R^1$ can be joined or fused to form a ring, with a condition that the compound does not comprise either one of the structures indicated below:

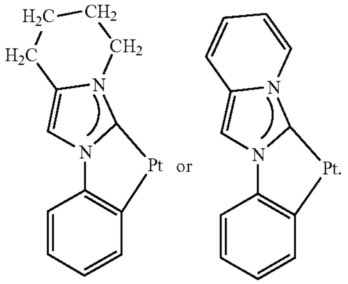

In some embodiments, at least one of the anode, the cathode, or a new layer disposed over the organic emissive layer functions as an enhancement layer. The enhancement layer comprises a plasmonic material exhibiting surface plasmon resonance that non-radiatively couples to the emitter material and transfers excited state energy from the emitter material to non-radiative mode of surface plasmon polariton. The enhancement layer is provided no more than a threshold distance away from the organic emissive layer, wherein the emitter material has a total non-radiative decay rate constant and a total radiative decay rate constant due to the presence of the enhancement layer and the threshold distance is where the total non-radiative decay rate constant is equal to the total radiative decay rate constant. In some embodiments, the OLED further comprises an outcoupling layer. In some embodiments, the outcoupling layer is disposed over the enhancement layer on the opposite side of the organic emissive layer. In some embodiments, the outcoupling layer is disposed on opposite side of the emissive layer from the enhancement layer but still outcouples energy from the surface plasmon mode of the enhancement layer. The outcoupling layer scatters the energy from the surface plasmon polaritons. In some embodiments this energy is scattered as photons to free space. In other embodiments, the energy is scattered from the surface plasmon mode into other modes of the device such as but not limited to the organic waveguide mode, the substrate mode, or another waveguiding mode. If energy is scattered to the non-free space mode of the OLED other outcoupling schemes could be incorporated to extract that energy to free space. In some embodiments, one or more intervening layer can be disposed between the enhancement layer and the outcoupling layer. The examples for interventing layer(s) can be dielectric materials, including organic, inorganic, perovskites, oxides, and may include stacks and/or mixtures of these materials.

The enhancement layer modifies the effective properties of the medium in which the emitter material resides resulting in any or all of the following: a decreased rate of emission, a modification of emission line-shape, a change in emission intensity with angle, a change in the stability of the emitter material, a change in the efficiency of the OLED, and reduced efficiency roll-off of the OLED device. Placement of the enhancement layer on the cathode side, anode side, or on both sides results in OLED devices which take advantage of any of the above-mentioned effects. In addition to the specific functional layers mentioned herein and illustrated in the various OLED examples shown in the figures, the OLEDs according to the present disclosure may include any of the other functional layers often found in OLEDs.

The enhancement layer can be comprised of plasmonic materials, optically active metamaterials, or hyperbolic metamaterials. As used herein, a plasmonic material is a material in which the real part of the dielectric constant crosses zero in the visible or ultraviolet region of the electromagnetic spectrum. In some embodiments, the plasmonic material includes at least one metal. In such embodiments the metal may include at least one of Ag, Al, Au, Ir, Pt, Ni, Cu, W, Ta, Fe, Cr, Mg, Ga, Rh, Ti, Ru, Pd, In, Bi, Ca alloys or mixtures of these materials, and stacks of these materials. In general, a metamaterial is a medium composed of different materials where the medium as a whole acts differently than the sum of its material parts. In particular, we define optically active metamaterials as materials which have both negative permittivity and negative permeability. Hyperbolic metamaterials, on the other hand, are anisotropic media in which the permittivity or permeability are of different sign for different spatial directions. Optically active metamaterials and hyperbolic metamaterials are strictly distinguished from many other photonic structures such as Distributed Bragg Reflectors ("DBRs") in that the medium should appear uniform in the direction of propagation on the length scale of the wavelength of light. Using terminology that one skilled in the art can understand: the dielectric constant of the metamaterials in the direction of propagation can be described with the effective medium approximation. Plasmonic materials and metamaterials provide methods for controlling the propagation of light that can enhance OLED performance in a number of ways.

In some embodiments, the enhancement layer is provided as a planar layer. In other embodiments, the enhancement layer has wavelength-sized features that are arranged periodically, quasi-periodically, or randomly, or sub-wavelength-sized features that are arranged periodically, quasi-periodically, or randomly. In some embodiments, the wavelength-sized features and the sub-wavelength-sized features have sharp edges.

In some embodiments, the outcoupling layer has wavelength-sized features that are arranged periodically, quasi-periodically, or randomly, or sub-wavelength-sized features that are arranged periodically, quasi-periodically, or randomly. In some embodiments, the outcoupling layer may be composed of a plurality of nanoparticles and in other embodiments the outcoupling layer is composed of a plurality of nanoparticles disposed over a material. In these embodiments the outcoupling may be tunable by at least one of varying a size of the plurality of nanoparticles, varying a shape of the plurality of nanoparticles, changing a material of the plurality of nanoparticles, adjusting a thickness of the material, changing the refractive index of the material or an additional layer disposed on the plurality of nanoparticles, varying a thickness of the enhancement layer, and/or varying the material of the enhancement layer. The plurality of nanoparticles of the device may be formed from at least one of metal, dielectric material, semiconductor materials, an alloy of metal, a mixture of dielectric materials, a stack or layering of one or more materials, and/or a core of one type of material and that is coated with a shell of a different type of material. In some embodiments, the outcoupling layer is composed of at least metal nanoparticles wherein the metal is selected from the group consisting of Ag, Al, Au, Ir, Pt, Ni, Cu, W, Ta, Fe, Cr, Mg, Ga, Rh, Ti, Ru, Pd, In, Bi, Ca, alloys or mixtures of these materials, and stacks of these materials. The plurality of nanoparticles may have additional layer disposed over them. In some embodiments, the polarization of the emission can be tuned using the outcoupling layer. Varying the dimensionality and periodicity of the outcoupling layer can select a type of polarization that is preferentially outcoupled to air. In some embodiments the outcoupling layer also acts as an electrode of the device.

In yet another aspect, the present disclosure also provides a consumer product comprising an organic light-emitting device (OLED) having an anode; a cathode; and an organic layer disposed between the anode and the cathode, wherein the organic layer may comprise a compound as disclosed in the above compounds section of the present disclosure.

In some embodiments, the consumer product comprises an organic light-emitting device (OLED) having an anode; a cathode; and an organic layer disposed between the anode and the cathode, wherein the organic layer may comprise a compound comprising a ligand $L_A$ of Formula I

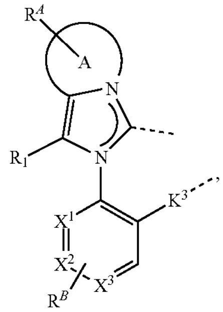

or

-continued

Formula II

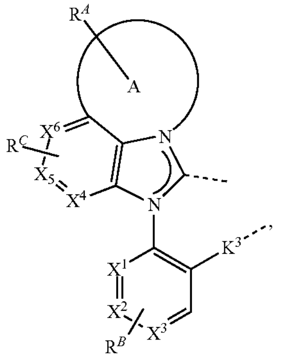

wherein ring A is independently a 5-membered to 10-membered heterocyclic ring; $X^1$-$X^6$ are each independently C or N; $K^3$ is a direct bond, O, or S; the maximum number of N atoms that connect to each other within a ring is two; $R^A$, $R^B$, and $R^C$ each independently represents zero, mono, or up to the maximum allowed number of substitutions to its associated ring; and each of $R_1$, $R^A$, $R^B$, $R^C$ is independently a hydrogen or a substituent selected from the group consisting of the general substituents defined herein, wherein the ligand $L_A$ is complexed to a metal M through the two indicated dashed lines; M is Ir, Rh, Re, Ru, Os, Pt, Pd, Ag, Au, or Cu, and can be coordinated to other ligands; the ligand $L_A$ can be joined with other ligands to form a tridentate, tetradentate, pentadentate, or hexadentate ligand; and any two $R^A$, $R^B$, $R^C$, or $R^1$ can be joined or fused to form a ring, with a condition that the compound does not comprise either one of the structures indicated below:

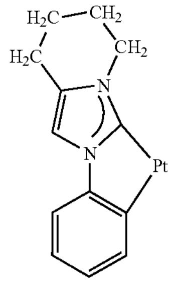

or

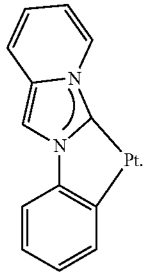

In some embodiments, the consumer product can be one of a flat panel display, a computer monitor, a medical monitor, a television, a billboard, a light for interior or exterior illumination and/or signaling, a heads-up display, a fully or partially transparent display, a flexible display, a laser printer, a telephone, a cell phone, tablet, a phablet, a personal digital assistant (PDA), a wearable device, a laptop computer, a digital camera, a camcorder, a viewfinder, a micro-display that is less than 2 inches diagonal, a 3-D display, a virtual reality or augmented reality display, a vehicle, a video wall comprising multiple displays tiled together, a theater or stadium screen, a light therapy device, and a sign.

Generally, an OLED comprises at least one organic layer disposed between and electrically connected to an anode and a cathode. When a current is applied, the anode injects holes and the cathode injects electrons into the organic layer(s). The injected holes and electrons each migrate toward the oppositely charged electrode. When an electron and hole localize on the same molecule, an "exciton," which is a localized electron-hole pair having an excited energy state, is formed. Light is emitted when the exciton relaxes via a photoemissive mechanism. In some cases, the exciton may be localized on an excimer or an exciplex. Non-radiative mechanisms, such as thermal relaxation, may also occur, but are generally considered undesirable.

Several OLED materials and configurations are described in U.S. Pat. Nos. 5,844,363, 6,303,238, and 5,707,745, which are incorporated herein by reference in their entirety.

The initial OLEDs used emissive molecules that emitted light from their singlet states ("fluorescence") as disclosed, for example, in U.S. Pat. No. 4,769,292, which is incorporated by reference in its entirety. Fluorescent emission generally occurs in a time frame of less than 10 nanoseconds.

More recently, OLEDs having emissive materials that emit light from triplet states ("phosphorescence") have been demonstrated. Baldo et al., "Highly Efficient Phosphorescent Emission from Organic Electroluminescent Devices," Nature, vol. 395, 151-154, 1998; ("Baldo-I") and Baldo et al., "Very high-efficiency green organic light-emitting devices based on electrophosphorescence," Appl. Phys. Lett., vol. 75, No. 3, 4-6 (1999) ("Baldo-II"), are incorporated by reference in their entireties. Phosphorescence is described in more detail in U.S. Pat. No. 7,279,704 at cols. 5-6, which are incorporated by reference.

FIG. 1 shows an organic light emitting device 100. The figures are not necessarily drawn to scale. Device 100 may include a substrate 110, an anode 115, a hole injection layer 120, a hole transport layer 125, an electron blocking layer 130, an emissive layer 135, a hole blocking layer 140, an electron transport layer 145, an electron injection layer 150, a protective layer 155, a cathode 160, and a barrier layer 170. Cathode 160 is a compound cathode having a first conductive layer 162 and a second conductive layer 164. Device 100 may be fabricated by depositing the layers described, in order. The properties and functions of these various layers, as well as example materials, are described in more detail in U.S. Pat. No. 7,279,704 at cols. 6-10, which are incorporated by reference.

More examples for each of these layers are available. For example, a flexible and transparent substrate-anode combination is disclosed in U.S. Pat. No. 5,844,363, which is incorporated by reference in its entirety. An example of a p-doped hole transport layer is m-MTDATA doped with $F_4$-TCNQ at a molar ratio of 50:1, as disclosed in U.S. Patent Application Publication No. 2003/0230980, which is incorporated by reference in its entirety. Examples of emissive and host materials are disclosed in U.S. Pat. No. 6,303,238 to Thompson et al., which is incorporated by reference in its entirety. An example of an n-doped electron transport layer is BPhen doped with Li at a molar ratio of 1:1, as disclosed in U.S. Patent Application Publication No. 2003/0230980, which is incorporated by reference in its entirety. U.S. Pat. Nos. 5,703,436 and 5,707,745, which are incorporated by reference in their entireties, disclose examples of cathodes including compound cathodes having a thin layer of metal such as Mg:Ag with an overlying transparent, electrically-conductive, sputter-deposited ITO layer. The theory and use of blocking layers is described in more detail in U.S. Pat. No. 6,097,147 and U.S. Patent Application Publication No. 2003/0230980, which are incorporated by reference in their entireties. Examples of injection layers are provided in U.S. Patent Application Publication No. 2004/0174116, which is incorporated by reference in its entirety. A description of protective layers may be found in U.S. Patent Application Publication No. 2004/0174116, which is incorporated by reference in its entirety.

Figure 2:
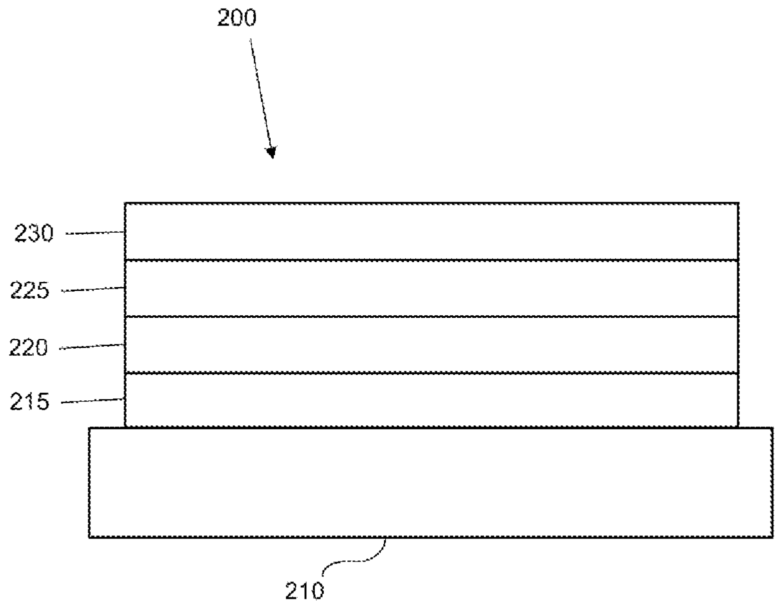
FIG. 2 shows an inverted organic light emitting device that does not have a separate electron transport layer.

FIG. 2 shows an inverted OLED 200. The device includes a substrate 210, a cathode 215, an emissive layer 220, a hole transport layer 225, and an anode 230. Device 200 may be fabricated by depositing the layers described, in order. Because the most common OLED configuration has a cathode disposed over the anode, and device 200 has cathode 215 disposed under anode 230, device 200 may be referred to as an "inverted" OLED. Materials similar to those described with respect to device 100 may be used in the corresponding layers of device 200. FIG. 2 provides one example of how some layers may be omitted from the structure of device 100.

The simple layered structure illustrated in FIGS. 1 and 2 is provided by way of non-limiting example, and it is understood that embodiments of the present disclosure may be used in connection with a wide variety of other structures. The specific materials and structures described are exemplary in nature, and other materials and structures may be used. Functional OLEDs may be achieved by combining the various layers described in different ways, or layers may be omitted entirely, based on design, performance, and cost factors. Other layers not specifically described may also be included. Materials other than those specifically described may be used. Although many of the examples provided herein describe various layers as comprising a single material, it is understood that combinations of materials, such as a mixture of host and dopant, or more generally a mixture, may be used. Also, the layers may have various sublayers. The names given to the various layers herein are not intended to be strictly limiting. For example, in device 200, hole transport layer 225 transports holes and injects holes into emissive layer 220, and may be described as a hole transport layer or a hole injection layer. In one embodiment, an OLED may be described as having an "organic layer" disposed between a cathode and an anode. This organic layer may comprise a single layer, or may further comprise multiple layers of different organic materials as described, for example, with respect to FIGS. 1 and 2.

Structures and materials not specifically described may also be used, such as OLEDs comprised of polymeric materials (PLEDs) such as disclosed in U.S. Pat. No. 5,247,190 to Friend et al., which is incorporated by reference in its entirety. By way of further example, OLEDs having a single organic layer may be used. OLEDs may be stacked, for example as described in U.S. Pat. No. 5,707,745 to Forrest et al, which is incorporated by reference in its entirety. The OLED structure may deviate from the simple layered structure illustrated in FIGS. 1 and 2. For example, the substrate may include an angled reflective surface to improve outcoupling, such as a mesa structure as described in U.S. Pat. No. 6,091,195 to Forrest et al., and/or a pit structure as described in U.S. Pat. No. 5,834,893 to Bulovic et al., which are incorporated by reference in their entireties.

Unless otherwise specified, any of the layers of the various embodiments may be deposited by any suitable method. For the organic layers, preferred methods include thermal evaporation, ink-jet, such as described in U.S. Pat. Nos. 6,013,982 and 6,087,196, which are incorporated by reference in their entireties, organic vapor phase deposition (OVPD), such as described in U.S. Pat. No. 6,337,102 to Forrest et al., which is incorporated by reference in its entirety, and deposition by organic vapor jet printing (OVJP), such as described in U.S. Pat. No. 7,431,968, which is incorporated by reference in its entirety. Other suitable deposition methods include spin coating and other solution based processes. Solution based processes are preferably carried out in nitrogen or an inert atmosphere. For the other layers, preferred methods include thermal evaporation. Preferred patterning methods include deposition through a mask, cold welding such as described in U.S. Pat. Nos. 6,294,398 and 6,468,819, which are incorporated by reference in their entireties, and patterning associated with some of the deposition methods such as ink-jet and organic vapor jet printing (OVJP). Other methods may also be used. The materials to be deposited may be modified to make them compatible with a particular deposition method. For example, substituents such as alkyl and aryl groups, branched or unbranched, and preferably containing at least 3 carbons, may be used in small molecules to enhance their ability to undergo solution processing. Substituents having 20 carbons or more may be used, and 3-20 carbons are a preferred range. Materials with asymmetric structures may have better solution processability than those having symmetric structures, because asymmetric materials may have a lower tendency to recrystallize. Dendrimer substituents may be used to enhance the ability of small molecules to undergo solution processing.

Devices fabricated in accordance with embodiments of the present disclosure may further optionally comprise a barrier layer. One purpose of the barrier layer is to protect the electrodes and organic layers from damaging exposure to harmful species in the environment including moisture, vapor and/or gases, etc. The barrier layer may be deposited over, under or next to a substrate, an electrode, or over any other parts of a device including an edge. The barrier layer may comprise a single layer, or multiple layers. The barrier layer may be formed by various known chemical vapor deposition techniques and may include compositions having a single phase as well as compositions having multiple phases. Any suitable material or combination of materials may be used for the barrier layer. The barrier layer may incorporate an inorganic or an organic compound or both. The preferred barrier layer comprises a mixture of a polymeric material and a non-polymeric material as described in U.S. Pat. No. 7,968,146, PCT Pat. Application Nos. PCT/US2007/023098 and PCT/US2009/042829, which are herein incorporated by reference in their entireties. To be considered a "mixture", the aforesaid polymeric and non-polymeric materials comprising the barrier layer should be deposited under the same reaction conditions and/or at the same time. The weight ratio of polymeric to non-polymeric material may be in the range of 95:5 to 5:95. The polymeric material and the non-polymeric material may be created from the same precursor material. In one example, the mixture of a polymeric material and a non-polymeric material consists essentially of polymeric silicon and inorganic silicon.

Devices fabricated in accordance with embodiments of the present disclosure can be incorporated into a wide variety of electronic component modules (or units) that can be incorporated into a variety of electronic products or intermediate components. Examples of such electronic products or intermediate components include display screens, lighting devices such as discrete light source devices or lighting panels, etc. that can be utilized by the end-user product manufacturers. Such electronic component modules can optionally include the driving electronics and/or power source(s). Devices fabricated in accordance with embodiments of the present disclosure can be incorporated into a wide variety of consumer products that have one or more of the electronic component modules (or units) incorporated therein. A consumer product comprising an OLED that includes the compound of the present disclosure in the organic layer in the OLED is disclosed. Such consumer products would include any kind of products that include one or more light source(s) and/or one or more of some type of visual displays. Some examples of such consumer products include flat panel displays, curved displays, computer monitors, medical monitors, televisions, billboards, lights for interior or exterior illumination and/or signaling, heads-up displays, fully or partially transparent displays, flexible displays, rollable displays, foldable displays, stretchable displays, laser printers, telephones, mobile phones, tablets, phablets, personal digital assistants (PDAs), wearable devices, laptop computers, digital cameras, camcorders, viewfinders, micro-displays (displays that are less than 2 inches diagonal), 3-D displays, virtual reality or augmented reality displays, vehicles, video walls comprising multiple displays tiled together, theater or stadium screen, a light therapy device, and a sign. Various control mechanisms may be used to control devices fabricated in accordance with the present disclosure, including passive matrix and active matrix. Many of the devices are intended for use in a temperature range comfortable to humans, such as 18 degrees C. to 30 degrees C., and more preferably at room temperature (20-25° C.), but could be used outside this temperature range, for example, from −40 degree C. to +80° C.

More details on OLEDs, and the definitions described above, can be found in U.S. Pat. No. 7,279,704, which is incorporated herein by reference in its entirety.

The materials and structures described herein may have applications in devices other than OLEDs. For example, other optoelectronic devices such as organic solar cells and organic photodetectors may employ the materials and structures. More generally, organic devices, such as organic transistors, may employ the materials and structures.

In some embodiments, the OLED has one or more characteristics selected from the group consisting of being flexible, being rollable, being foldable, being stretchable, and being curved. In some embodiments, the OLED is transparent or semi-transparent. In some embodiments, the OLED further comprises a layer comprising carbon nanotubes.

In some embodiments, the OLED further comprises a layer comprising a delayed fluorescent emitter. In some embodiments, the OLED comprises a RGB pixel arrangement or white plus color filter pixel arrangement. In some embodiments, the OLED is a mobile device, a hand held device, or a wearable device. In some embodiments, the OLED is a display panel having less than 10 inch diagonal or 50 square inch area. In some embodiments, the OLED is a display panel having at least 10 inch diagonal or 50 square inch area. In some embodiments, the OLED is a lighting panel.

In some embodiments, the compound can be an emissive dopant. In some embodiments, the compound can produce emissions via phosphorescence, fluorescence, thermally activated delayed fluorescence, i.e., TADF (also referred to as E-type delayed fluorescence; see, e.g., U.S. application Ser. No. 15/700,352, which is hereby incorporated by reference in its entirety), triplet-triplet annihilation, or combinations of these processes. In some embodiments, the emissive dopant can be a racemic mixture, or can be enriched in one enantiomer. In some embodiments, the compound can be homoleptic (each ligand is the same). In some embodiments, the compound can be heteroleptic (at least one ligand is different from others). When there are more than one ligand coordinated to a metal, the ligands can all be the same in some embodiments. In some other embodiments, at least one ligand is different from the other ligands. In some embodiments, every ligand can be different from each other. This is also true in embodiments where a ligand being coordinated to a metal can be linked with other ligands being coordinated to that metal to form a tridentate, tetradentate, pentadentate, or hexadentate ligands. Thus, where the coordinating ligands are being linked together, all of the ligands can be the same in some embodiments, and at least one of the ligands being linked can be different from the other ligand(s) in some other embodiments.

In some embodiments, the compound can be used as a phosphorescent sensitizer in an OLED where one or multiple layers in the OLED contains an acceptor in the form of one or more fluorescent and/or delayed fluorescence emitters. In some embodiments, the compound can be used as one component of an exciplex to be used as a sensitizer. As a phosphorescent sensitizer, the compound must be capable of energy transfer to the acceptor and the acceptor will emit the energy or further transfer energy to a final emitter. The acceptor concentrations can range from 0.001% to 100%. The acceptor could be in either the same layer as the phosphorescent sensitizer or in one or more different layers. In some embodiments, the acceptor is a TADF emitter. In some embodiments, the acceptor is a fluorescent emitter. In some embodiments, the emission can arise from any or all of the sensitizer, acceptor, and final emitter.

According to another aspect, a formulation comprising the compound described herein is also disclosed.

The OLED disclosed herein can be incorporated into one or more of a consumer product, an electronic component module, and a lighting panel. The organic layer can be an emissive layer and the compound can be an emissive dopant in some embodiments, while the compound can be a non-emissive dopant in other embodiments.

In yet another aspect of the present disclosure, a formulation that comprises the novel compound disclosed herein is described. The formulation can include one or more components selected from the group consisting of a solvent, a host, a hole injection material, hole transport material, electron blocking material, hole blocking material, and an electron transport material, disclosed herein.

The present disclosure encompasses any chemical structure comprising the novel compound of the present disclosure, or a monovalent or polyvalent variant thereof. In other words, the inventive compound, or a monovalent or polyvalent variant thereof, can be a part of a larger chemical structure. Such chemical structure can be selected from the group consisting of a monomer, a polymer, a macromolecule, and a supramolecule (also known as supermolecule). As used herein, a "monovalent variant of a compound" refers to a moiety that is identical to the compound except that one hydrogen has been removed and replaced with a bond to the rest of the chemical structure. As used herein, a "polyvalent variant of a compound" refers to a moiety that is identical to the compound except that more than one hydrogen has been removed and replaced with a bond or bonds to the rest of the chemical structure. In the instance of a supramolecule, the inventive compound can also be incorporated into the supramolecule complex without covalent bonds.

D. Combination of the Compounds of the Present Disclosure with Other Materials The materials described herein as useful for a particular layer in an organic light emitting device may be used in combination with a wide variety of other materials present in the device. For example, emissive dopants disclosed herein may be used in conjunction with a wide variety of hosts, transport layers, blocking layers, injection layers, electrodes and other layers that may be present. The materials described or referred to below are non-limiting examples of materials that may be useful in combination with the compounds disclosed herein, and one of skill in the art can readily consult the literature to identify other materials that may be useful in combination.

a) Conductivity Dopants:

A charge transport layer can be doped with conductivity dopants to substantially alter its density of charge carriers, which will in turn alter its conductivity. The conductivity is increased by generating charge carriers in the matrix material, and depending on the type of dopant, a change in the Fermi level of the semiconductor may also be achieved. Hole-transporting layer can be doped by p-type conductivity dopants and n-type conductivity dopants are used in the electron-transporting layer.

Non-limiting examples of the conductivity dopants that may be used in an OLED in combination with materials disclosed herein are exemplified below together with references that disclose those materials: EP01617493, EP01968131, EP2020694, EP2684932, US20050139810, US20070160905, US20090167167, US2010288362, WO06081780, WO2009003455, WO2009008277, WO2009011327, WO2014009310, US2007252140, US2015060804, US20150123047, and US2012146012.

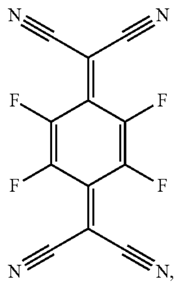

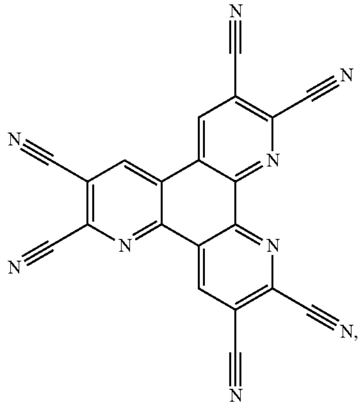

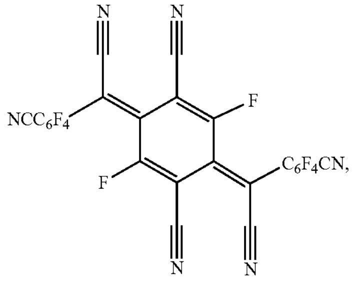

-continued

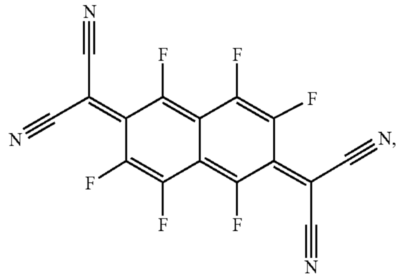

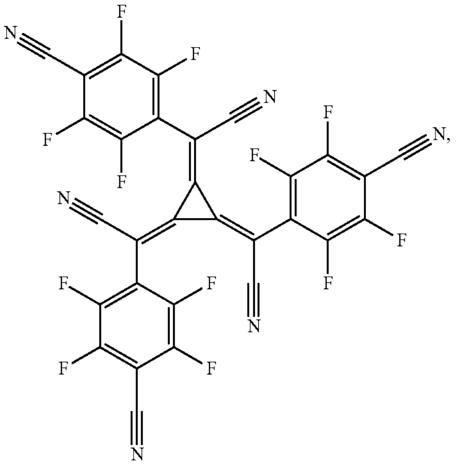

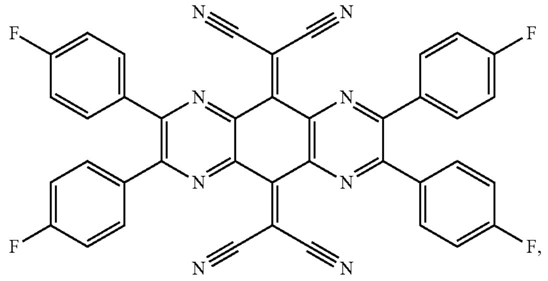

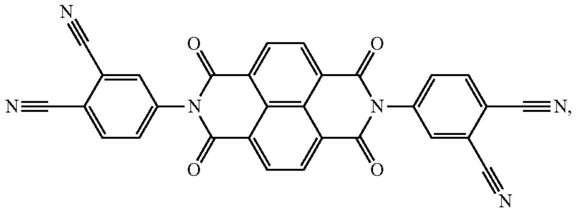

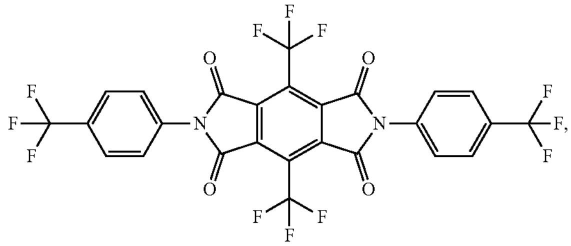

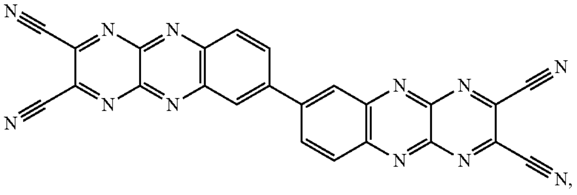

-continued

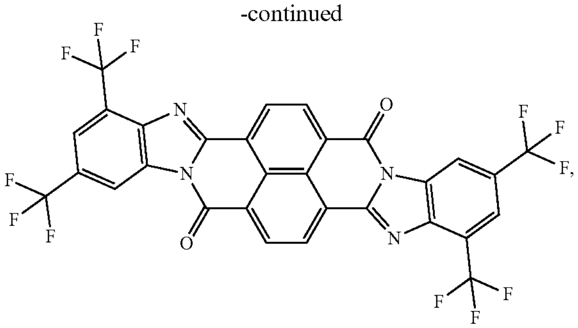

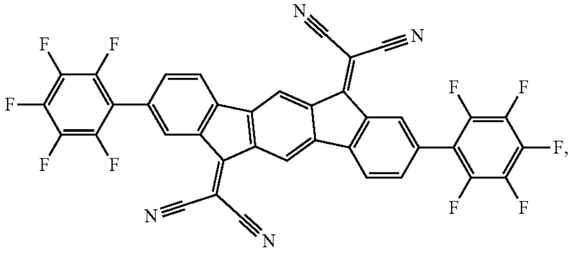

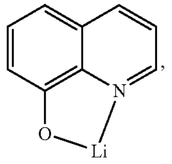

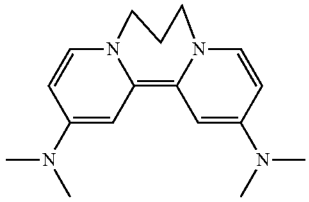

and

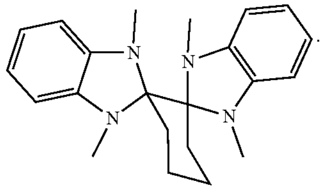

b) HIL/HTL:

A hole injecting/transporting material to be used in the present disclosure is not particularly limited, and any compound may be used as long as the compound is typically used as a hole injecting/transporting material. Examples of the material include, but are not limited to: a phthalocyanine or porphyrin derivative; an aromatic amine derivative; an indolocarbazole derivative; a polymer containing fluorohydrocarbon; a polymer with conductivity dopants; a conducting polymer, such as PEDOT/PSS; a self-assembly monomer derived from compounds such as phosphonic acid and silane derivatives; a metal oxide derivative, such as $MoO_x$; a p-type semiconducting organic compound, such as 1,4,5,8,9,12-Hexaazatriphenylenehexacarbonitrile; a metal complex, and a cross-linkable compounds.

HIL/HTL examples can be found in paragraphs [0111] through [0117] of Universal Display Corporation's US application publication number US2020/0,295,281A1, and the contents of these paragraphs and the whole publication are herein incorporated by reference in their entireties.

c) EBL:

An electron blocking layer (EBL) may be used to reduce the number of electrons and/or excitons that leave the emissive layer. The presence of such a blocking layer in a device may result in substantially higher efficiencies, and/or longer lifetime, as compared to a similar device lacking a blocking layer. Also, a blocking layer may be used to confine emission to a desired region of an OLED. In some embodiments, the EBL material has a higher LUMO (closer to the vacuum level) and/or higher triplet energy than the emitter closest to the EBL interface. In some embodiments, the EBL material has a higher LUMO (closer to the vacuum level) and/or higher triplet energy than one or more of the hosts closest to the EBL interface. In one aspect, the compound used in EBL contains the same molecule or the same functional groups used as one of the hosts described below.

d) Hosts:

The light emitting layer of the organic EL device of the present disclosure preferably contains at least a metal complex as light emitting material, and may contain a host material using the metal complex as a dopant material. Examples of the host material are not particularly limited, and any metal complexes or organic compounds may be used as long as the triplet energy of the host is larger than that of the dopant. Any host material may be used with any dopant so long as the triplet criteria is satisfied.

Hosts examples can be found in paragraphs [0119] through [0125] of Universal Display Corporation's US application publication number US2020/0,295,281A1, and the contents of these paragraphs and the whole publication are herein incorporated by reference in their entireties.

e) Additional Emitters:

One or more additional emitter dopants may be used in conjunction with the compound of the present disclosure. Examples of the additional emitter dopants are not particularly limited, and any compounds may be used as long as the compounds are typically used as emitter materials. Examples of suitable emitter materials include, but are not limited to, compounds which can produce emissions via phosphorescence, fluorescence, thermally activated delayed fluorescence, i.e., TADF (also referred to as E-type delayed fluorescence), triplet-triplet annihilation, or combinations of these processes.

Non-limiting examples of the emitter materials that may be used in an OLED in combination with materials disclosed herein are exemplified in paragraphs [0126] through [0127] of Universal Display Corporation's US application publication number US2020/0,295,281A1, and the contents of these paragraphs and the whole publication are herein incorporated by reference in their entireties.

f) HBL:

A hole blocking layer (HBL) may be used to reduce the number of holes and/or excitons that leave the emissive layer. The presence of such a blocking layer in a device may result in substantially higher efficiencies and/or longer lifetime as compared to a similar device lacking a blocking layer. Also, a blocking layer may be used to confine emission to a desired region of an OLED. In some embodiments, the HBL material has a lower HOMO (further from the vacuum level) and/or higher triplet energy than the emitter closest to the HBL interface. In some embodiments, the HBL material has a lower HOMO (further from the vacuum level) and/or higher triplet energy than one or more of the hosts closest to the HBL interface.

In one aspect, compound used in HBL contains the same molecule or the same functional groups used as host described above.

In another aspect, compound used in HBL contains at least one of the following groups in the molecule:

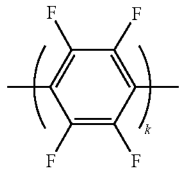
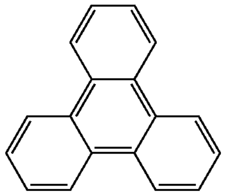
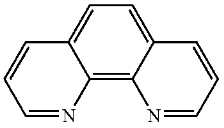
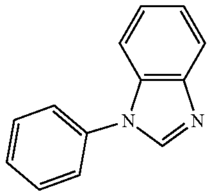
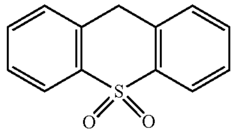
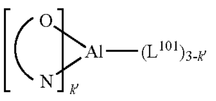

wherein k is an integer from 1 to 20; $L^{101}$ is another ligand, k' is an integer from 1 to 3.

g) ETL:

Electron transport layer (ETL) may include a material capable of transporting electrons. Electron transport layer may be intrinsic (undoped), or doped. Doping may be used to enhance conductivity. Examples of the ETL material are not particularly limited, and any metal complexes or organic compounds may be used as long as they are typically used to transport electrons.

In one aspect, compound used in ETL contains at least one of the following groups in the molecule:

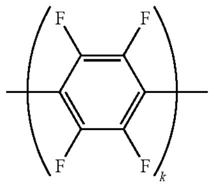
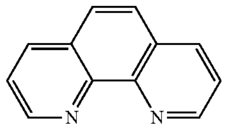
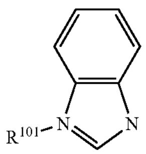
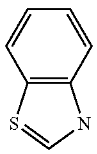
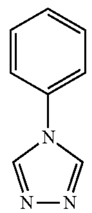
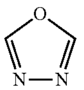
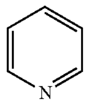
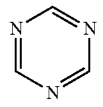
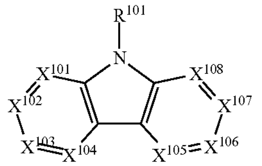
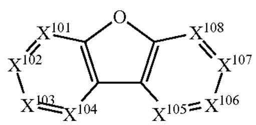
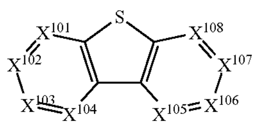

-continued

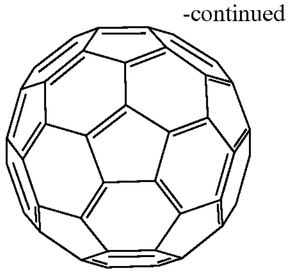

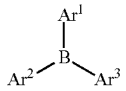

wherein $R^{101}$ is selected from the group consisting of hydrogen, deuterium, halogen, alkyl, cycloalkyl, heteroalkyl, heterocycloalkyl, arylalkyl, alkoxy, aryloxy, amino, silyl, alkenyl, cycloalkenyl, heteroalkenyl, alkynyl, aryl, heteroaryl, acyl, carboxylic acids, ether, ester, nitrile, isonitrile, sulfanyl, sulfinyl, sulfonyl, phosphino, and combinations thereof, when it is aryl or heteroaryl, it has the similar definition as Ar's mentioned above. $Ar^1$ to $Ar^3$ has the similar definition as Ar's mentioned above. k is an integer from 1 to 20. $X^{101}$ to $X^{108}$ is selected from C (including CH) or N.

In another aspect, the metal complexes used in ETL contains, but not limit to the following general formula:

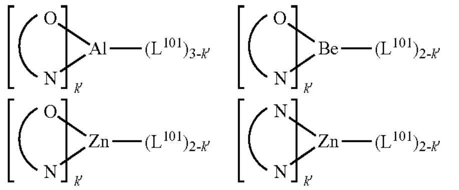

wherein (O—N) or (N—N) is a bidentate ligand, having metal coordinated to atoms O, N or N, N; $L^{101}$ is another ligand; k' is an integer value from 1 to the maximum number of ligands that may be attached to the metal. Non-limiting examples of the ETL materials that may be used in an OLED in combination with materials disclosed herein are exemplified in paragraphs [0131] through [0134] of Universal Display Corporation's US application publication number US2020/0,295,281A1, and the contents of these paragraphs and the whole publication are herein incorporated by reference in their entireties.

h) Charge Generation Layer (CGL)

In tandem or stacked OLEDs, the CGL plays an essential role in the performance, which is composed of an n-doped layer and a p-doped layer for injection of electrons and holes, respectively. Electrons and holes are supplied from the CGL and electrodes. The consumed electrons and holes in the CGL are refilled by the electrons and holes injected from the cathode and anode, respectively; then, the bipolar currents reach a steady state gradually. Typical CGL materials include n and p conductivity dopants used in the transport layers.

In any above-mentioned compounds used in each layer of the OLED device, the hydrogen atoms can be partially or fully deuterated. The minimum amount of hydrogen of the compound being deuterated is selected from the group consisting of 30%, 40%, 50%, 60%, 70%, 80%, 90%, 95%, 99%, and 100%. Thus, any specifically listed substituent, such as, without limitation, methyl, phenyl, pyridyl, etc. may be undeuterated, partially deuterated, and fully deuterated versions thereof. Similarly, classes of substituents such as, without limitation, alkyl, aryl, cycloalkyl, heteroaryl, etc. also may be undeuterated, partially deuterated, and fully deuterated versions thereof.

It is understood that the various embodiments described herein are by way of example only and are not intended to limit the scope of the invention. For example, many of the materials and structures described herein may be substituted with other materials and structures without deviating from the spirit of the invention. The present invention as claimed may therefore include variations from the particular examples and preferred embodiments described herein, as will be apparent to one of skill in the art. It is understood that various theories as to why the invention works are not intended to be limiting.

Experimental Section

Synthesis of Emitter 1

Synthesis of 2-(2-((2-nitrophenyl)amino)phenyl) propan-2-ol

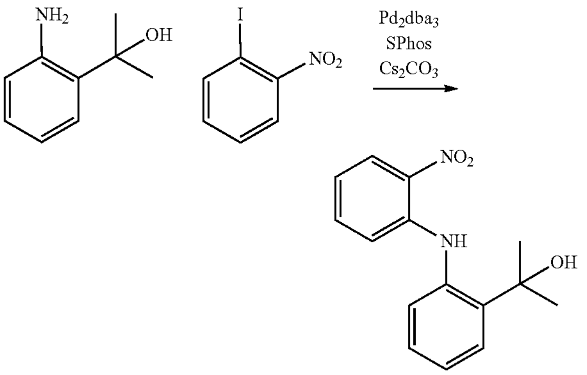

1-iodo-2-nitrobenzene (3.75 g, 15.1 mmol), 2-(2-aminophenyl)propan-2-ol (2.28 g, 15.1 mmol), cesium carbonate (7.37 g, 22.6 mmol), $Pd_2dba_3$ (028 g, 0.30 mmol), and SPhos (0.49 g, 12 mmol) were added to a flask with toluene (120 mL) and refluxed overnight. The reaction was cooled to room temperature (RT) and filtered through Celite (diatomaceous earth). The residue was purified via column chromatography (10-20% ethyl acetate in heptane) to give the desired product as an orange solid (95% yield).

Synthesis of 9,9-dimethyl-4-nitro-9,10-dihydroacridine

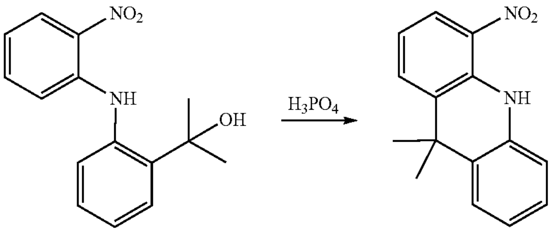 [SMILES: CC(C)(O)c1ccccc1Nc1ccccc1[N+](=O)[O-] ; "H3PO4" ; CC1(C)c2ccccc2Nc2c([N+](=O)[O-])cccc21]

2-(2-((2-nitrophenyl)amino)phenyl) propan-2-ol (2.0 g, 7.3 mmol) and phosphoric acid (0.72 g, 7.34 mmol) were added to a flask and heated to 50° C. for 12 hours. The reaction was cooled and poured into ice water. A red solid was collected via filtration (96% yield).

Synthesis of 9,9-dimethyl-9,10-dihydroacridin-4-amine

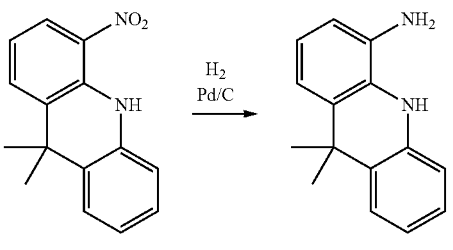 [SMILES: CC1(C)c2ccccc2Nc2c([N+](=O)[O-])cccc21 ; CC1(C)c2ccccc2Nc2c(N)cccc21]

9,9-dimethyl-4-nitro-9,10-dihydroacridine (8.0 g, 31.4 mmol) and palladium on carbon (2.0 g) were added to a flask with ethyl acetate and stirred overnight. The reaction was filtered and evaporated to give the desired compound (86% yield).

Synthesis of 6,6-dimethyl-6H-2l2,11l4-imidazo[5,4,3-de]acridine

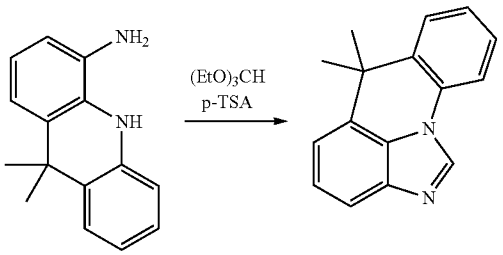 [SMILES: CC1(C)c2ccccc2Nc2c(N)cccc21 ; CC1(C)c2ccccc2-n2cnc3cccc1c32]

9,9-dimethyl-9,10-dihydroacridin-4-amine (12.0 g, 53.5 mmol), triethoxymethane (7.93 g, 53.5 mmol), and para-toluene sulfonic acid (1.02 g, 535 mmol) were added to a flask with a stir bar and stirred at 80° C. overnight. The reaction was cooled to r.t., diluted with ethyl acetate, and washed with aq. Sodium bicarbonate. The organic layers were combined, dried, and evaporated, and the residue was purified by column chromatography (2% MeOH in DCM) to give an oil (89% yield).

Synthesis of 2-(3-((9-(4-(tert-butyl)pyridin-2-yl)-9H-carbazol-2-yl)oxy)phenyl)-6,6-dimethyl-2,6-dihydroimidazo[4,5,1-de]acridin-11-ium tetrafluoroborate

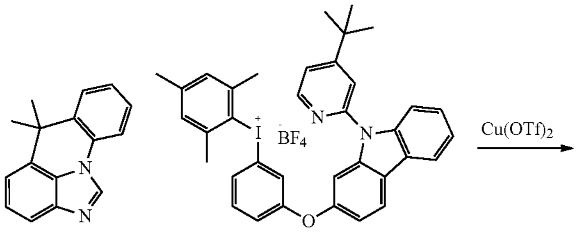

-continued

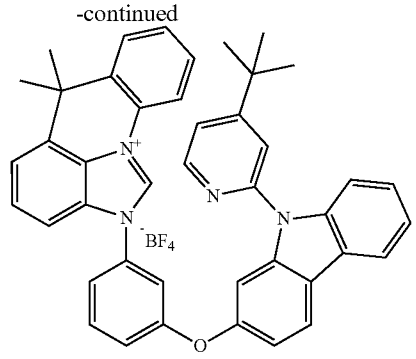

6,6-dimethyl-6H-2l2,11l4-imidazo[5,4,3-de]acridine (156 mg, 0.666 mmol), (3-((9-(4-(tert-butyl)pyridin-2-yl)-9H-carbazol-2-yl)oxy)phenyl)(mesityl)iodonium tetrafluoroborate (531 mg, 0.732 mmol), and bis(((trifluoromethyl)sulfonyl)oxy)copper (24.08 mg, 0.067 mmol) were added to a 25 mL tube with a stir bar and cycled onto the line. Anhydrous DMF (6.658 mL) was added and the reaction was heated to 120° C. overnight. The reaction was cooled to RT and water was added to give a white precipitate. The aqueous layer was extracted with ethyl acetate three times. The organic layers were combined, washed with a saturated LiCl solution, dried over $MgSO_4$, filtered, and pumped down. Isolated by column chromatography using 1:1 $CH_3CN$:DCM as eluent. Pure fractions were combined and evaporated to give the desired compound as a white solid (55% yield).

Synthesis of Emitter 1

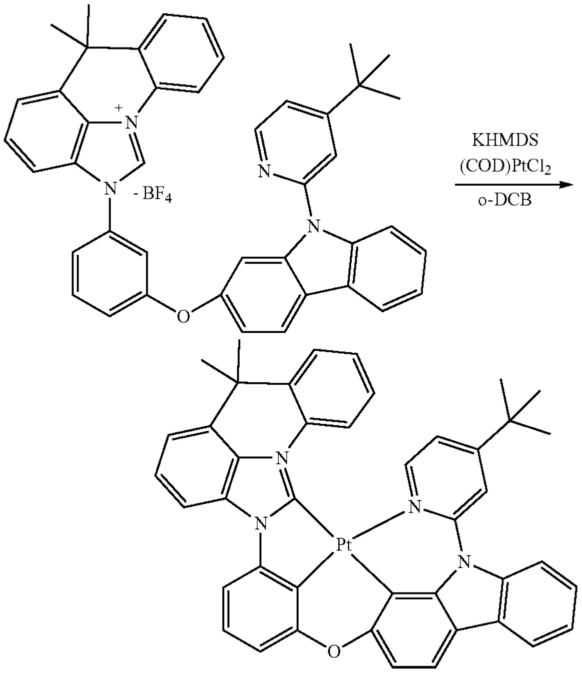

Emitter 1

2-(3-((9-(4-(tert-butyl)pyridin-2-yl)-9H-carbazol-2-yl)oxy)phenyl)-6,6-dimethyl-2,6-dihydroimidazo[4,5,1-de]acridin-11-ium tetrafluoroborate (194 mg, 0.272 mmol) was added to a 25 mL flask with a stir bar. Ortho-dichlorobenzene (5 ml) was added followed by potassium bis(trimethylsilyl) amide (0272 ml, 0.272 mmol) via syringe. $(COD)PtCl_2$ (102 mg, 0272 mmol) was added as a solid and the reaction was heated to reflux. Thin layer chromatography (TLC) in 1:1 Hep:DCM showed an emissive spot around rf 0.5. A color gradient was observed from top to bottom of the spot. The reaction was heated overnight. The reaction was cooled to RT and the solvent was removed by evaporation. The residue was purified by column chromatography to give the desired compound as a yellow solid (22% yield).

Synthesis of Emitter 2

Synthesis of 5-iodo-1-phenyl-1H-imidazole

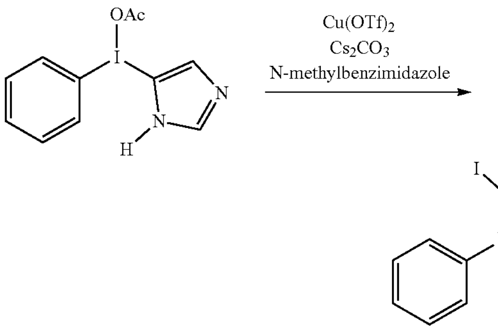

A dry 1000 mL reaction tube was charged with $Cu(OTf)_2$ (3.15 g, 8.66 mmol, 5 mol %), cesium carbonate (85 g, 260 mmol) and 1-methylbenzimidazole (4.60 g, 34.7 mmol, 20 mol %). Hexafluoroisopropanol (700 mL) was added and the mixture allowed to stir at r.t. for 30 min, before (1H-imidazol-5-yl)(phenyl)-13-iodanyl acetate (57.5 g, 173 mmol, 1.0 equivalent) was added. The tube was capped and the mixture was heated to 55° C. for 26 hours. The solvent was removed and the product isolated by column chromatography eluting with a hexane:EtOAc mixture (100% hexanes to 50% hexanes/EtOAc) to give the desired product (40% yield).

Synthesis of 2,2-dimethyl-1-(1-phenyl-1H-imidazol-5-yl)propan-1-one

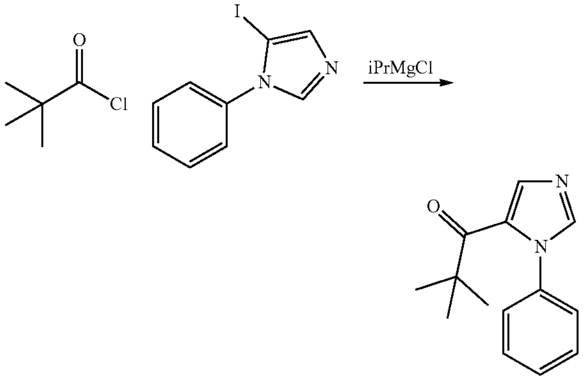

5-iodo-1-phenyl-1H-imidazole (0320 g, 1.185 mmol, 1.0 equiv) and THF (4 mL) were added to a round bottom flask. The solution was cooled to −78° C. for 30 minutes. Isopropylmagnesium chloride (1.03 mL, 1.303 mmole, 1.1 equiv) was added to the stirring mixture dropwise over 2 minutes and stirred for 3 hours at room temperature. The reaction was cooled to −78° C. and pivaloyl chloride (0.290 mL, 2.37 mmol, 2.0 equiv) was added drop wise over 2 minutes. The reaction mixture was allowed to stir over night at 23° C. The reaction was quenched with saturated $NH_4Cl$, diluted with EtOAc, washed with saturated NaCl, DI water, and dried over $Na_2SO_4$. The crude material was purified by column chromatography (50% ethyl acetate:hexane) to give the desired product (42% yield).

Synthesis of 3,3-dimethyl-2-(1-phenyl-1H-imidazol-5-yl)butan-2-ol

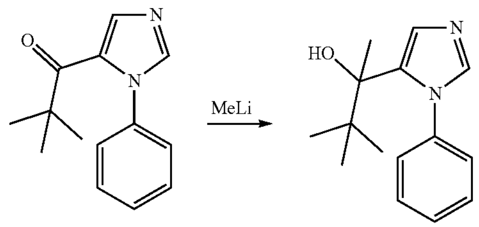 [SMILES: "MeLi" ; CC(C)(C)C(=O)c1cncn1-c1ccccc1 ; CC(C)(C)C(C)(O)c1cncn1-c1ccccc1]

2,2-dimethyl-1-(1-phenyl-1H-imidazol-5-yl)propan-1-one (0.150 g, 0.657 mmol, 1 equiv) and THF (3 mL) were added to a round bottom flask. The mixture was cooled to −78° C. for 15 minutes with stirring. Methyl lithium (1.00 mL, 1.64 mmol, 2.5 equiv) was added dropwise to the solution. The reaction was allowed to stir at −78° C. for 1 hour then warmed to room temperature for 4 hours. The reaction was quenched at 0° C. with saturated $NH_4Cl$ and diluted with EtOAc, washed with saturated $NH_4Cl$, saturated brine and DI water. The reaction was purified by column chromatography to give the desired product (65% EtOAc in hexanes) to give the desired product (78% yield).

Synthesis of 4,4,5,5-tetramethyl-4,5-dihydroimidazo[1,5-a]quinoline

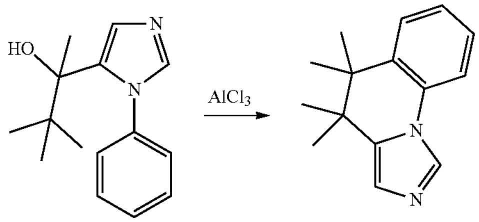

3,3-dimethyl-2-(1-phenyl-1H-imidazol-5-yl)butan-2-ol (0100 g, 0.409 mmol, 1 equiv) and DCM (6 mL) were added to a flask with a stir bar. The mixture was stirred at 0° C. for 30 min then aluminum trichloride (0.546 g, 4.09 mmol 10 equiv) was added in one portion. The reaction was stirred at 0° C. for 1 hour then warmed to room temperature for 5 hours. The reaction was cooled to 0° C. and quenched with saturated $Na_2CO_3$, diluted with ethyl acetate, and washed with brine and DI water. The reaction was purified by column chromatography (60% ethyl acetate in hexanes) to give the desired product (96% yield).

Synthesis of 2-(3-((9-(4-(tert-butyl)pyridin-2-yl)-9H-carbazol-2-yl)oxy)phenyl)-4,4,5,5-tetramethyl-4,5-dihydro-2H-1014-imidazo[1,5-a]quinoline, tetrafluoroborate salt

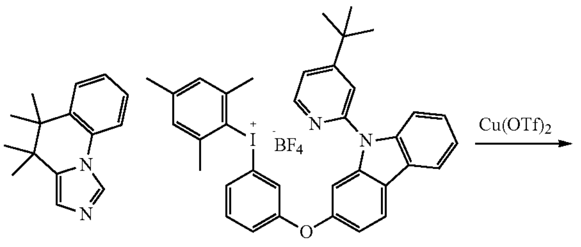

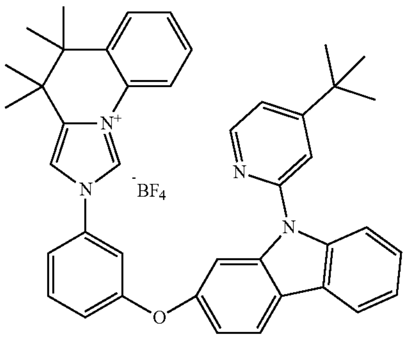

4,4,5,5-tetramethyl-4,5-dihydroimidazo[1,5-a]quinoline (0.40 g, 1.75 mmol), (3-((9-(4-(tert-butyl)pyridin-2-yl)-9H-carbazol-2-yl)oxy)phenyl)(mesityl)iodonium tetrafluoroborate (1.4 g, 1.933 mmol), and bis(((trifluoromethyl)sulfonyl)oxy)copper (0.064 g, 0.176 mmol) were added to a Schlenk tube with a stir bar. Anhydrous DMF (6.658 mL) was added and the reaction was heated to 120° C. overnight. The reaction was cooled to RT and the solvent was evaporated. The residue was dissolved in a minimum amount of DCM and added $Et_2O$ to give an off-white solid that was collected by filtration (97% yield).

Synthesis of Emitter 2

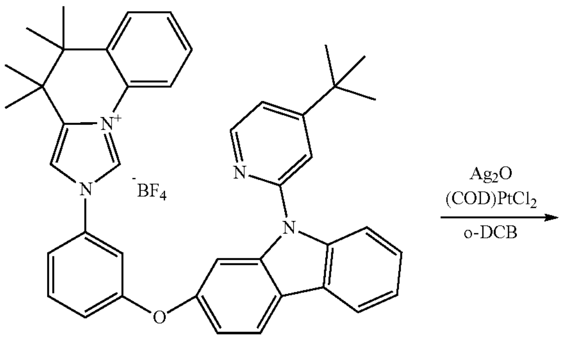

-continued

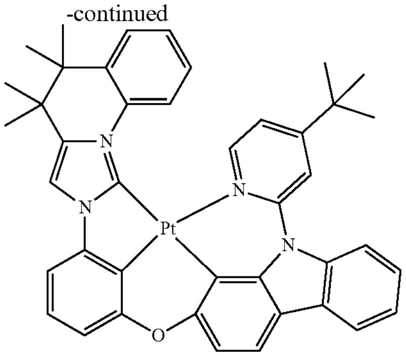

2-(3-((9-(4-(tert-butyl)pyridin-2-yl)-9H-carbazol-2-yl)oxy)phenyl)-4,4,5,5-tetramethyl-4,5-dihydro-2H-imidazo[1,5-a]quinolin-10-ium tetrafluoroborate (100 mg, 0.142 mmol) and monosilver(I) monosilver(III) monoxide (16.44 mg, 0.071 mmol) were added to a 100 mL round bottom flask with a stir bar. 1,2-dichloroethane (3 mL) was added and the reaction was allowed to stir at RT overnight. The reaction solvent was evaporated to give a foam. This was reacted with $(COD)PtCl_2$ (53.1 mg, 0.142 mmol) in ortho-dichlorobenzene (3.00 mL) at reflux overnight. The reaction solvent was evaporated and the residue was coated onto Celite. The product was purified via column chromatography (2:1 DCM:Heptanes) to give a yellow solid (33% yield).

Synthesis of Emitter 3

Synthesis of 2-(2'-chloro-[1,1'-biphenyl]-2-yl)-4,4,5,5-tetramethyl-1,3,2-dioxaborolane

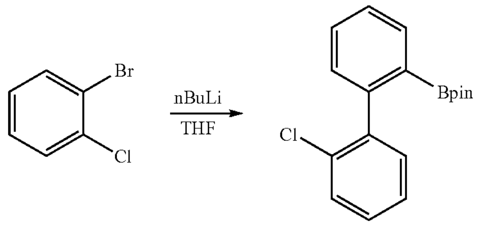

To a 2 L three neck round bottom flask, 1-bromo-2-chlorobenzene and anhydrous tetrahydrofuran were added under nitrogen and cooled to −72° C. n-BuLi was added and the solution was allowed to warm to RT. It was again cooled to −72° C. nBuLi was added and the reaction was stirred for 1 hour. 2-isopropoxy-4,4,5,5-tetramethyl-1,3,2-dioxaborolane was added and the solution was allowed to warm up to RT and stirred overnight. The reaction was diluted with diethyl ether and aq. HCl, the aq. phase was extracted with and the combined organics were dried with $MgSO_4$ and filtered. The residue was purified by column chromatography to give 2-(2'-chloro-[1,1'-biphenyl]-2-yl)-4,4,5,5-tetramethyl-1,3,2-dioxaborolane as a clear yellow oil 80% yield.

Synthesis of 2"-chloro-2-fluoro-3-nitro-1,1':2',1"-terphenyl

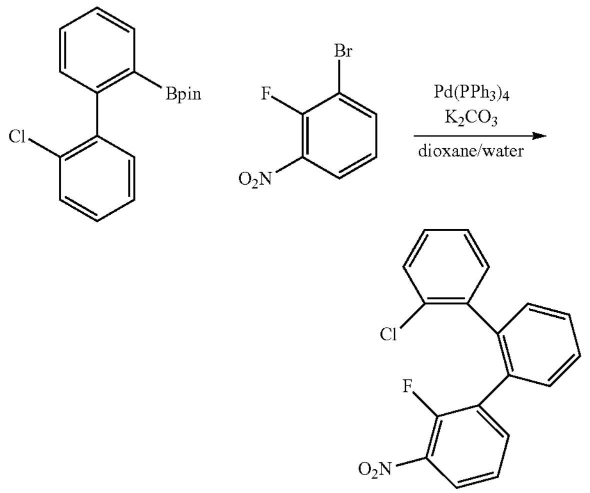

To a 2 L three neck round bottom flask equipped a solution of 2-(2'-chloro-[1,1'-biphenyl]-2-yl)-4,4,5,5-tetramethyl-1,3,2-dioxaborolane in dioxane and water was added, and the mixture was bubbled with nitrogen for 2 h. Then 1-bromo-2-fluoro-3-nitrobenzene, $K_2CO_3$, and $Pd(PPh_3)_4$ were added together. The reaction mixture was vigorously stirred at 95° C. After 24 h, the reaction was cooled down to room temperature and diluted with EtOAc and brine. The aq. phase was extracted with EtOAc. The combined organics were dried with $MgSO_4$, filtered, and concentrated under vacuum to give a dark oil (63%).

Synthesis of 2'''-fluoro-3'''-nitro-[1,1':2',1":2",1'''-quaterphenyl]-2-amine

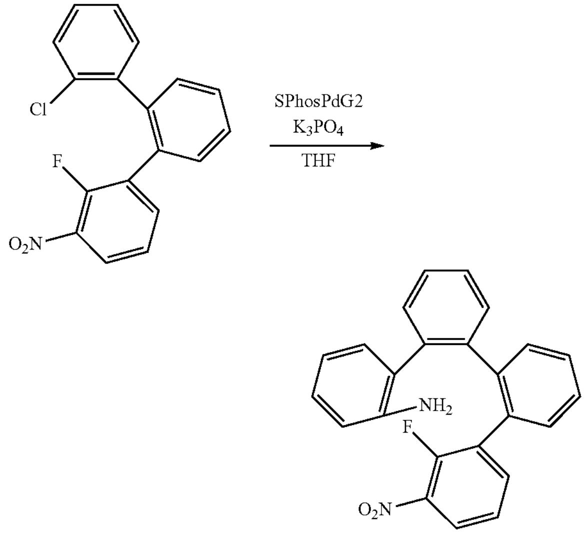

To a 2 L three neck round bottom flask equipped with septa and a stir bar, THF and $K_3PO_4$ were added. Then 2"-chloro-2-fluoro-3-nitro-1,1':2',1"-terphenyl, 2-(4,4,5,5-tetramethyl-1,3,2-dioxaborolan-2-yl)aniline, and SPhosPdG2 were added together. The reaction mixture was vigorously stirred at 60° C. After 24 hours, the reaction mixture was cooled to RT, and EtOAc was added. The aq. phase was extracted with EtOAc, the combined organics were dried with $MgSO_4$, filtered, and concentrated under vacuum to give a thick black oil. It was dissolved in dichloromethane and loaded on a large silica gel plug to give 2'''-fluoro-3'''-nitro-[1,1':2',1":2",1'''-quaterphenyl]-2-amine was obtained as a brown solid (83%).

Synthesis of 8-nitro-9H-tetrabenzo[b,d,f,h]azonine

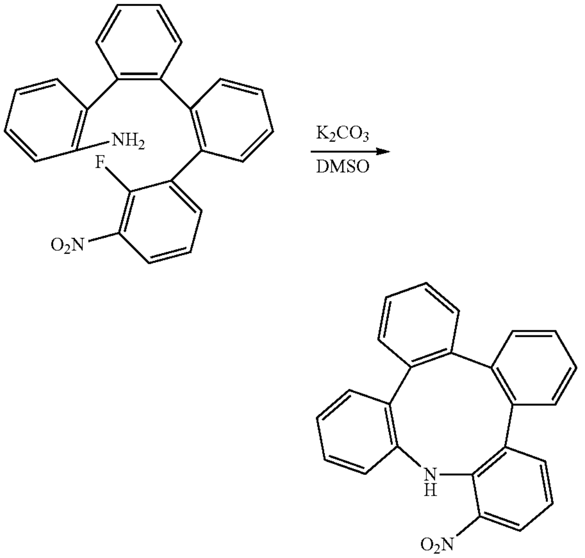

In a 2 L round bottom flask equipped with septa and a stir bar, a solution of 2'''-fluoro-3'''-nitro-[1,1':2',1":2",1'''-quaterphenyl]-2-amine in DMSO was prepared and stirred under nitrogen. $K_2CO_3$ was added and the reaction mixture was stirred vigorously at 150-160° C. After 9 hours, the reaction was cooled to RT and poured into DI water. The aq. Layer was extracted with EtOAc. The combined organics were washed with brine and dried with $MgSO_4$. The reaction was filtered and concentrated under vacuum to give 8-nitro-9H-tetrabenzo[b,d,f,h]azonine as an orange-red solid (85%).

Synthesis of 9H-tetrabenzo[b,d,f,h]azonin-8-amine

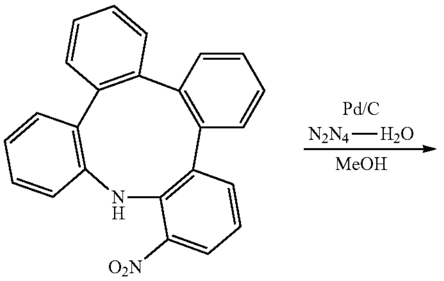

-continued

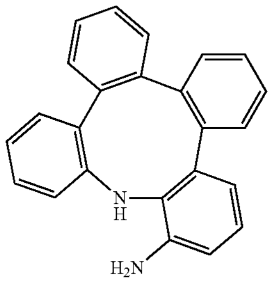

In a 2 L round bottom flask equipped with septa and a stir bar, a suspension of 8-nitro-9H-tetrabenzo[b,d,f,h]azonine in MeOH was prepared. Pd/C and hydrazine hydrate were added under nitrogen and the mixture stirred vigorously at 60-65° C. After 3 hours, it was cooled and filtered through a short pad of Celite. The filtrate was concentrated under vacuum to give a cream suspension. It was diluted with water and the aq. phase was extracted with dichloromethane. The combined organics were washed with water and brine and dried with $MgSO_4$. The residue was filtered and concentrated under vacuum to give 9H-tetrabenzo[b,d,f,h]azonin-8-amine as a brown solid, (84%).

Synthesis of 1,2a-diazatribenzo[4,5:6,7:8,9]cyclonona[1,2,3-cd]indene

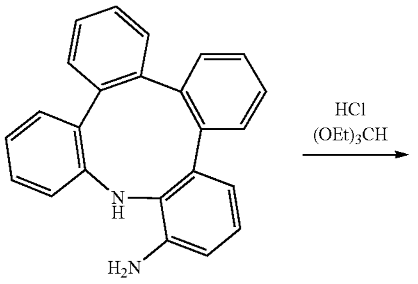

-continued

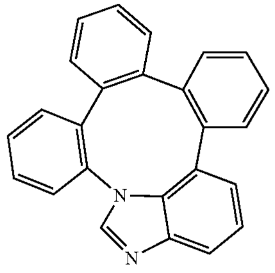

9H-tetrabenzo[b,d,f,h]azonin-8-amine (1 g, 2.99 mmol) was dissolved in triethoxymethane (24.90 ml, 150 mmol), sparged with argon for 5 minutes and hydrogen chloride (0.295 ml, 3.59 mmol) (37% aqueous solution) was added in one portion at room temperature. The reaction was heated to 80° C. for 16 hours. The reaction was cooled to room temperature and concentrated under reduced pressure. The residue was diluted with ether and stirred for 30 min. the solid was filtered off to give the product (0.9 g, 89%) as a white solid.

Synthesis 1-(4-((9-(4-(tert-butyl)pyridin-2-yl)-9H-carbazol-2-yl)oxy)phenyl)-1-(tetrafluoro-5-boranyl)-1,2-dihydro-1,2a-diazatribenzo[4,5:6,7:8,9]cyclonona[1,2,3-cd]inden-2-id-1-ium-2-ide

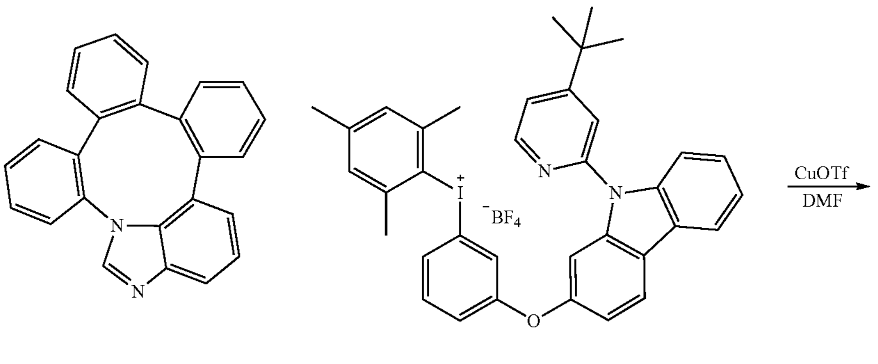

-continued

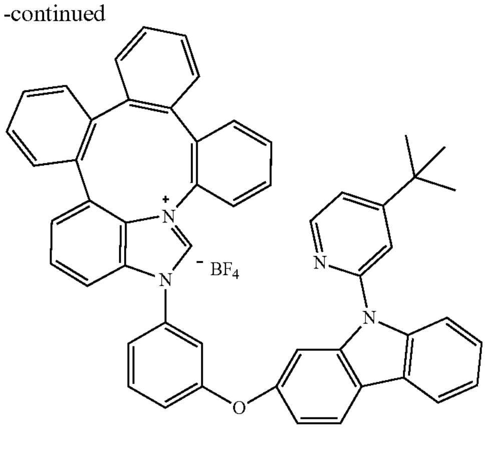

1,2a-diazatribenzo[4,5:6,7:8,9]cyclonona[1,2,3-cd]indene (0.85 g, 2.468 mmol) and 9-(4-(tert-butyl)pyridin-2-yl)-2-(4-(mesityl(tetrafluoro-15-boranyl)-13-iodanyl)phenoxy)-9H-carbazole (2.324 g, 3.21 mmol) were mixed in DMF (6 ml) in a pressure tube and sparged with nitrogen for five minutes. bis(((trifluoromethyl)sulfonyl)oxy)copper (0.045 g, 0.123 mmol) was added to the mixture and sparged for three minutes. The tube was sealed and left stirring for 1 hour at 110° C. The reaction was cooled to RT, diluted with DCM and evaporated to dryness to give a brown oil. The material was purified by column chromatography to give the product (2.05 g, 95%).

Synthesis of Emitter 3

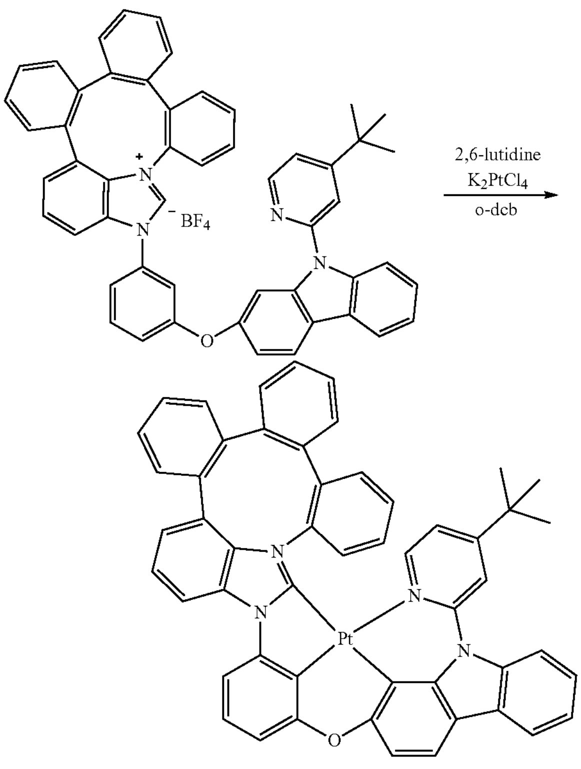

1-(3-((9-(4-(tert-butyl)pyridin-2-yl)-9H-carbazol-2-yl)oxy)phenyl)-1-(tetrafluoro-15-boranyl)-1,2-dihydro-1,2a-diazatribenzo[4,5:6,7:8,9]cyclonona[1,2,3-cd]inden-2-id-1-ium-2-ide (250 mg, 0.304 mmol), potassium tetrachloroplatinate (126 mg, 0.304 mmol) and 2,6-dimethylpyridine (130 mg, 1.215 mmol) were suspended in 1,2-dichlorobenzene (15 ml) and sparged with nitrogen for five minutes in a round bottom flask. The flask was equipped with a condenser and the reaction mixture was left stirring at 125° C. for 24 hours under nitrogen. The reaction was cooled to RT and the product was purified column chromatography (0.1 g, 36%).

Synthesis of Emitter 4

Synthesis of 3-bromo-[1,1'-biphenyl]-2-amine

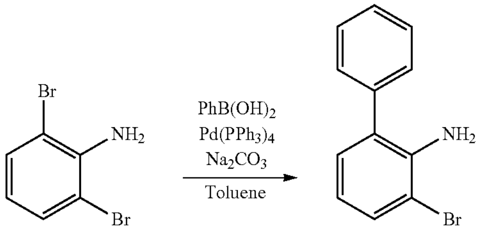 [SMILES: Nc1c(Br)cccc1Br ; "PhB(OH)2Pd(PPh3)4Na2CO3" ; "Toluene" ; Nc1c(Br)cccc1-c1ccccc1]

To a suspension of 2,6-dibromoaniline (30 g, 117 mmol), phenylboronic acid (14.43 g, 117 mmol), sodium carbonate (74.6 g, 703 mmol) and $Pd(PPh_3)_4$ (6.84 g, 5.86 mmol) in toluene (1.2 L), in a 2 L round bottom flask, ethanol (300 ml) and water (300 ml) were added. The flask was purged with nitrogen for 20 minutes and the reaction mixture was stirred at reflux for 5 hours. The reaction was cooled to RT, water was added (750 ml) and the 2 layers were separated. The aqueous layer was extracted with ethyl acetate and the combined organic layers were dried over $MgSO_4$, filtered and concentrated under vacuum. The residue was purified by column chromatography to give a white solid (86.31 g, 72%).

Synthesis of 3-(4,4,5,5-tetramethyl-1,3,2-dioxaborolan-2-yl)-[1,1'-biphenyl]-2-amine

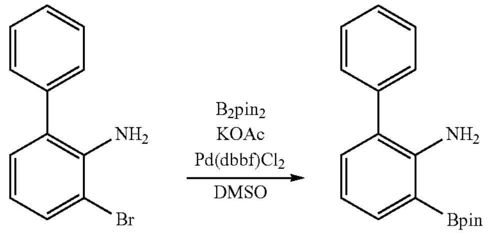

In a 2 L round bottom flask, were introduced 3-bromo-[1,1'-biphenyl]-2-amine (40 g, 156 mmol), potassium acetate (23.18 g, 234 mmol), 4,4,4',4',5,5,5',5'-octamethyl-2,2'-bi(1,3,2-dioxaborolane) (84 g, 327 mmol), Pd(dppf)$Cl_2$.$CH_2Cl_2$ (6.41 g, 7.79 mmol) and dimethyl sulfoxide (1 L) and the mixture was purged with nitrogen for 20 minutes before being heated at 80° C. for 3.5 hours. The reaction was cooled to RT and saturated aqueous ammonium chloride and ethyl acetate were added to the reaction mixture. The two layers were separated and the aqueous layer was extracted with ethyl acetate. The combined organic layers were washed with 1 L of NaCl solution, dried over $MgSO_4$, filtered and concentrated under vacuum an oil that was purified by column chromatography to give the product as a light yellow solid (37.7 g, 77%).

Synthesis of 2-fluoro-3-nitro-[1,1':2',1'':2'',1''':3''',1''''-quinquephenyl]-2''''-amine

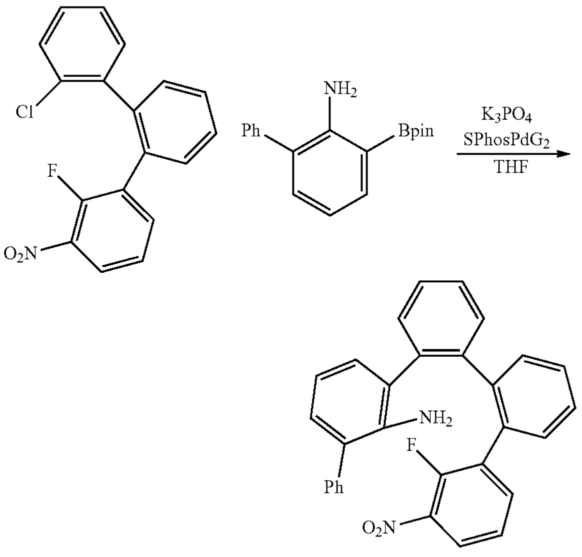

In a 2 L round-bottom flask, tetrahydrofuran (380 ml), tripotassium phosphate (573 ml, 287 mmol) (0.5M solution in water), 2''-chloro-2-fluoro-3-nitro-1,1':2',1''-terphenyl (40 g, 110 mmol), 3-(4,4,5,5-tetramethyl-1,3,2-dioxaborolan-2-yl)-[1,1'-biphenyl]-2-amine (44.9 g, 144 mmol), and Sphos-Pd-G2 (4.12 g, 5.60 mmol) were added and the reaction mixture was stirred at 60° C. under nitrogen overnight. The reaction was cooled to RT. Ethyl acetate was added, the two layers were separated, then the aqueous layer was extracted with ethyl acetate. The combined organic layers were dried with $MgSO_4$, filtered and concentrated. The residue was purified by column chromatography to give the product as a yellow solid. This solid was suspended in heptane and stirred for 3 hours. The suspension was filtered and washed with heptanes to afford the product as a yellow solid (47.85 g, 92%).

Synthesis of 8-nitro-10-phenyl-9H-tetrabenzo[b,d,f,h]azonine

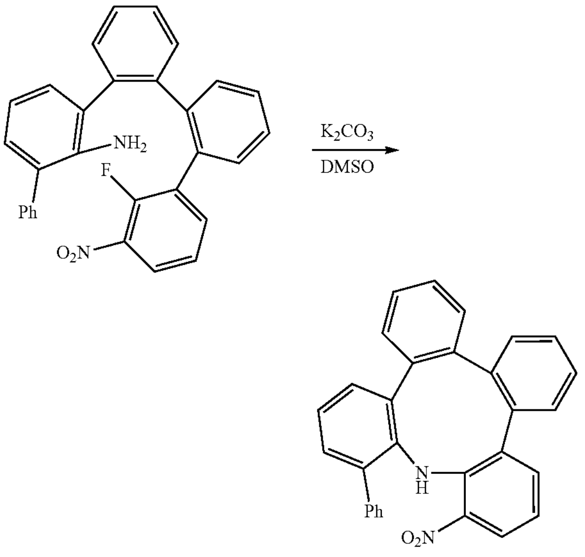

To a 2 L round-bottom flask containing 2-fluoro-3-nitro-[1,1':2',1'':2'',1''':3''',1''''-quinquephenyl]-2''''-amine (32 g, 66.0 mmol) in dimethyl sulfoxide (1000 ml) was added potassium carbonate (1825 g, 132 mmol) and the flask was purged with nitrogen for 30 minutes. The reaction mixture was then stirred at 155° C. overnight. The reaction was cooled to RT and cold aq. saturated sodium chloride as well as ethyl acetate were added. The aq. layer was extracted with ethyl acetate several times. The organic layers were combined and pumped down to give an oil that was purified by column chromatography. The solid was suspended in heptanes and stirred for two days. The suspension was filtered and the solid was washed twice with heptanes to give the product as an orange solid (37.15 g, 64%).

Synthesis of 10-phenyl-9H-tetrabenzo[b,d,f,h]azonin-8-amine

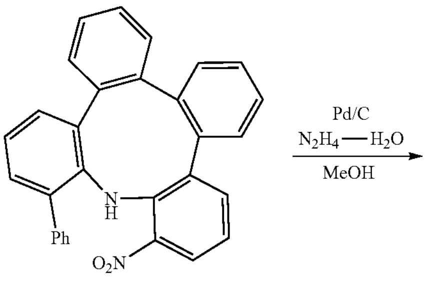

-continued

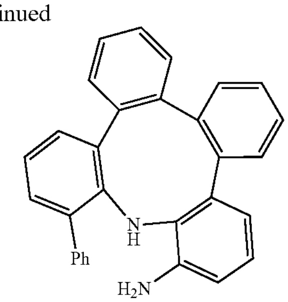

To a 2 L round-bottom flask, containing a suspension of 8-nitro-10-phenyl-9H-tetrabenzo[b,d,f,h]azonine (36.5 g, 81 mmol) in methanol (1.25 L) under $N_2$, was added Pd/C (8.62 g, 8.10 mmol, 10 wt. %) followed by hydrazine hydrate (101 ml, 1619 mmol) and the mixture was stirred vigorously at 70° C. (oil bath) under nitrogen for 5 hours. The reaction was cooled down to RT and the mixture was filtered through a short pad of Celite, washed with methanol (100 ml), and then dichloromethane (4×250 ml). The product was purified via column chromatography to give an off-white solid (31.55 g, 94%).

Synthesis of N-(3-((9-(4-(tert-butyl)pyridin-2-yl)-9H-carbazol-2-yl)oxy)phenyl)-10-phenyl-9H-tetrabenzo[b,d,f,h]azonin-8-amine

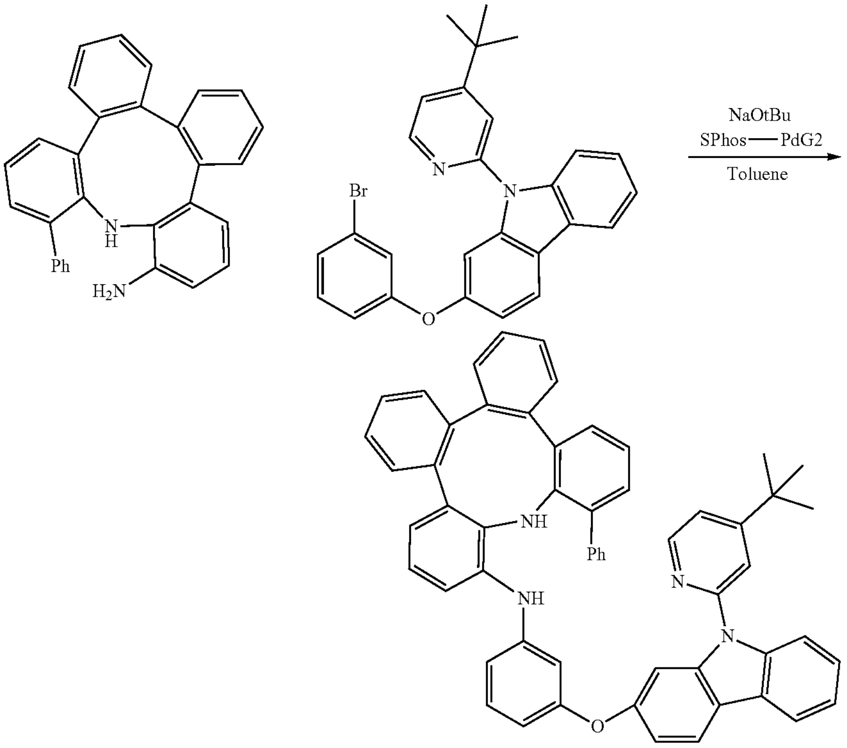

Sodium tert-butoxide (0.489 g, 5.09 mmol), 10-phenyl-9H-tetrabenzo[b,d,f,h]azonin-8-amine (0.697 g, 1.697 mmol), and 2-(3-bromophenoxy)-9-(4-(tert-butyl)pyridin-2-yl)-9H-carbazole (0.8 g, 1.697 mmol) were charged to a 250 mL round-bottom flask and flushed with N2. Toluene (6.79 ml) and Sphos-Pd-G2 (0.066 g, 0.085 mmol) were then added and the reaction was stirred at reflux. The reaction was cooled to RT (room temperature), filtered, and pumped down. The product was purified by column chromatography (1.3 g, 88% yield).

Synthesis of 1-(3-((9-(4-(tert-butyl)pyridin-2-yl)-9H-carbazol-2-yl)oxy)phenyl)-3-phenyl-1H-1,2a-diazatribenzo[4,5:6,7:8,9]cyclonona[1,2,3-cd]inden-2a-ium bromide

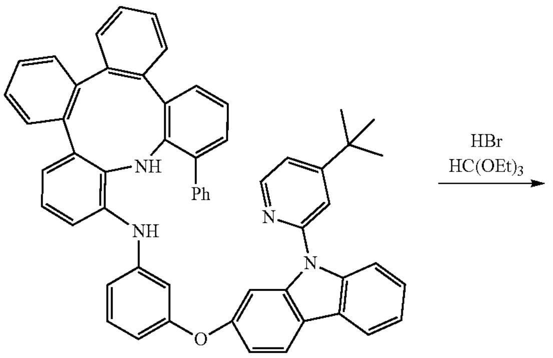

-continued

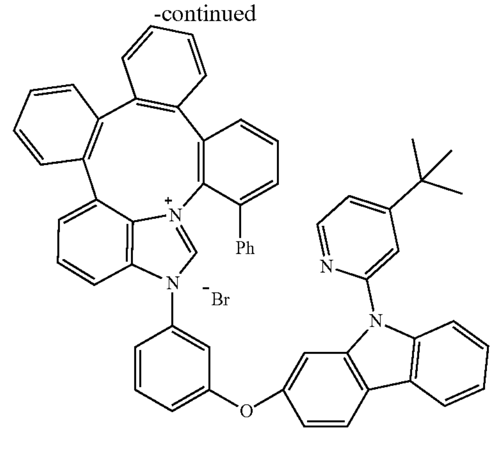

N-(3-((9-(4-(tert-butyl)pyridin-2-yl)-9H-carbazol-2-yl)oxy)phenyl)-10-phenyl-9H-tetrabenzo[b,d,f,h]azonin-8-amine (45.9 g, 57.3 mmol) was dissolved in refluxing triethoxymethane (95 ml, 573 mmol) and cooled to RT. Hydrogen bromide (7.08 ml, 63.0 mmol) was added and the mixture was stirred at RT overnight. Solvent was removed in vacuo and the material was purified by column chromatography to give the product as an off-white solid (34.22 g, 63.6% yield).

Synthesis of Emitter 4

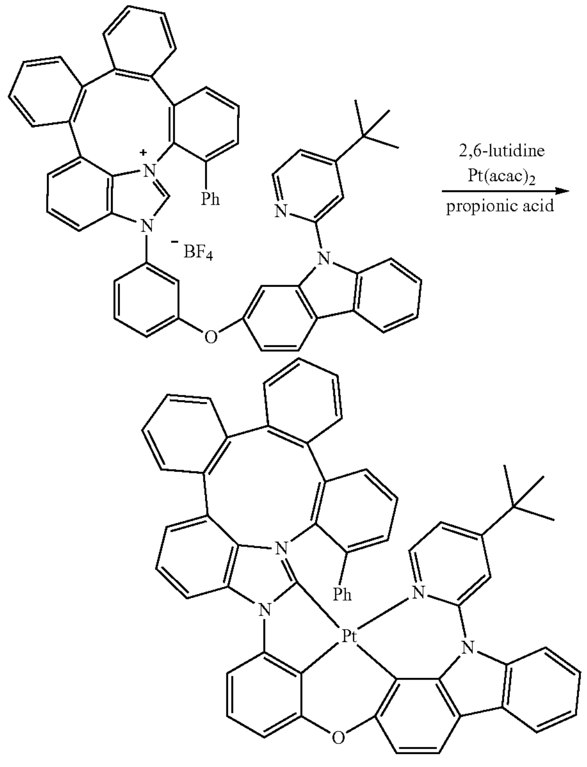

In a 250 mL round-bottom flask, 1,3,5-trimethoxybenzene (0.489 g, 2.90 mmol), 2,6-dimethylpyridine (2.243 ml, 1936 mmol), 2-bromo-1-(3-((9-(4-(tert-butyl)pyridin-2-yl)-9H-carbazol-2-yl)oxy)phenyl)-3-phenyl-1,2-dihydro-1,2a-diazatribenzo[4,5:6,7:8,9]cyclonona[1,2,3-cd]indene (15.7 g, 17.60 mmol), and Pt(acac)2 (6.92 g, 17.60 mmol) were dissolved/suspended in propionic acid (37 ml, 17.60 mmol). The reaction was heated at 150° C. overnight. The reaction was filtered and the filtered solids were re-dissolved in DCM and partitioned with water. The organic layer was kept and concentrated and isolated via column chromatography to give a yellow solid (12.1 g, 67.6% yield).

Synthesis of Emitter 5

Synthesis of 4-bromo-2-(tert-butyl)aniline

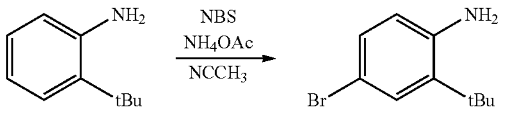 [SMILES: CC(C)(C)c1ccccc1N ; "NCCH3" ; CC(C)(C)c1cc(Br)ccc1N ; "NBSNH4OAc"]

In a 1 L round bottom flask, 2-(tert-butyl)aniline (50 g, 328 mmol) was solubilized in acetonitrile (1.3 L) and the flask was purged with nitrogen for 20 minutes. Ammonium acetate (2.61 g, 32.8 mmol) was then added followed by the addition of NBS (62.0 g, 345 mmol) in ten fractions of 6.2 g each every ten minutes. A saturated aqueous solution of $Na_2S_2O_3$ was added (1.5 L) along with ethyl acetate and the layers were separated. The aqueous layer was extracted with ethyl acetate and the combined organic layers were dried over $MgSO_4$, filtered and concentrated under vacuum. The residue was purified by column chromatography to give the product as a red oil (72.5 g, 97%).

Synthesis of 4-bromo-2-(tert-butyl)-6-chloroaniline

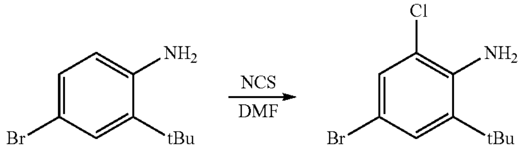

In a 2 L round bottom flask, was introduced 4-bromo-2-(tert-butyl)aniline (63 g, 276 mmol) and DMF (1.05 l). The reaction mixture was purged with nitrogen for 20 minutes. NCS (41.4 g, 304 mmol) was then added in one portion and the flask was purged with nitrogen for 5 minutes. The reaction mixture was then stirred at 73° C. under nitrogen for 4 hours. A saturated aqueous solution of $Na_2S_2O_3$ was added as well as ethyl acetate and the layers were separated. The organic layer was washed with water, dried over $MgSO_4$, filtered and concentrated under vacuum to give the product as a red oil (69.4 g, 94%).

Synthesis of 2-(tert-butyl)-6-chloroaniline

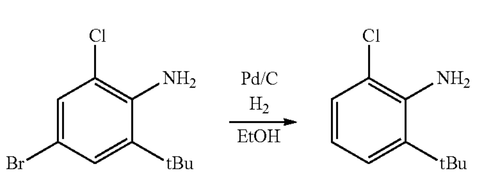 [SMILES: "EtOH" ; CC(C)(C)c1cc(Br)cc(Cl)c1N ; "Pd/CH2" ; CC(C)(C)c1cccc(Cl)c1N]

In a 350 mL pressure vessel, was introduced 4-bromo-2-(tert-butyl)-6-chloroaniline (20 g, 76 mmol), palladium on carbon (8.11 g, 7.62 mmol) and ethanol (160 mL). The reaction mixture was placed under 10 psi of $H_2$ for 4 hours. The mixture was filtered through a Celite pad and washed with ethanol. The filtrate was concentrated under vacuum. A saturated aqueous solution of sodium bicarbonate and ethyl acetate were added and the layers were separated. The aqueous layer was extracted with ethyl acetate. The combined organic layers were dried over $MgSO_4$, filtered and concentrated under vacuum to give the product as an orange oil (14.05 g, 81%).

Synthesis of 2-(tert-butyl)-6-(4,4,5,5-tetramethyl-1,3,2-dioxaborolan-2-yl)aniline

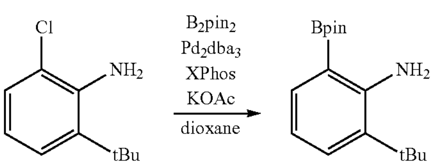

In a 2 L round bottom flask, was introduced 2-(tert-butyl)-6-chloroaniline (25 g, 136 mmol) and 1,4-dioxane (550 ml), followed by $Pd_2dba_3$ (321 g, 3.40 mmol), dicyclohexyl(2',4',6'-triisopropyl-[1,1'-biphenyl]-2-yl)phosphane (6.62 g, 13.61 mmol), 4,4,4',4',5,5,5',5'-octamethyl-2,2'-bi(1,3,2-dioxaborolane) (105 g, 408 mmol) and potassium acetate (40.5 g, 408 mmol). The flask was purged with nitrogen for 20 minutes and then the reaction mixture was stirred under nitrogen for 4 hours at reflux. After four hours, the mixture was filtered through a thin pad of Celite and washed with ethyl acetate, and the filtrate was concentrated under vacuum. The product was purified by column chromatography as an orange oil (26.2 g, 63%).

Synthesis of 3-(tert-butyl)-2'''-fluoro-3'''-nitro-[1,1':2',1'':2'',1'''-quaterphenyl]-2-amine

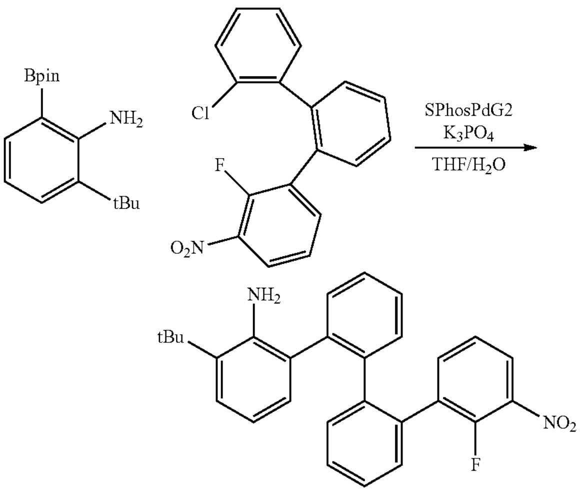

In a 500 mL round-bottom flask, tetrahydrofuran (63 ml), a freshly prepared aqueous tripotassium phosphate (96 ml, 47.8 mmol) (0.5M solution in water), 2''-chloro-2-fluoro-3-nitro-1,1':2',1''-terphenyl (6 g, 18.31 mmol), 2-(tert-butyl)-6-(4,4,5,5-tetramethyl-1,3,2-dioxaborolan-2-yl)aniline (13.99 g, 45.8 mmol), and Sphos Pd G2 (0.673 g, 0.934 mmol) were introduced and the flask was purged with nitrogen for 30 minutes. Then, the reaction mixture was vigorously stirred at 60° C. under nitrogen for 20 hours. The reaction was then cooled to RT and ethyl acetate was added, the layers were separated, then the aqueous layer was additionally extracted with ethyl acetate. The combined organic layers were dried with $MgSO_4$, filtered and concentrated under vacuum. The product was purified by column chromatography to give the product as a yellow solid (9.63 g, 78%).

Synthesis of 8-(tert-butyl)-10-nitro-9H-tetrabenzo[b,d,f,h]azonine

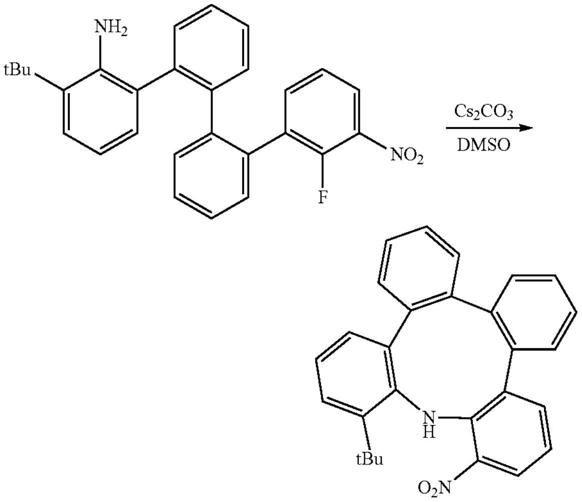

To a 1 L round-bottom flask containing 3-(tert-butyl)-2'''-fluoro-3'''-nitro-[1,1':2',1'':2'',1'''-quaterphenyl]-2-amine (11 g, 23.75 mmol) solution in an anhydrous dimethyl sulfoxide (385 ml) was added cesium carbonate (23.45 g, 71.2 mmol) and the flask was purged with nitrogen for 20 minutes. The reaction mixture was then stirred vigorously at 150° C. for 5 hours. The reaction was cooled down to RT. An ice cold aqueous saturated sodium chloride solution was added followed by of ethyl acetate. The layers were separated, and the aqueous layer was extracted with ethyl acetate. The combined organic layers were dried over $MgSO_4$, filtered and then concentrated under vacuum to give an oil, which was purified by column chromatography to give the product as an orange solid (4.79 g, 48%).

Synthesis of 10-(tert-butyl)-9H-tetrabenzo[b,d,f,h]azonin-8-amine

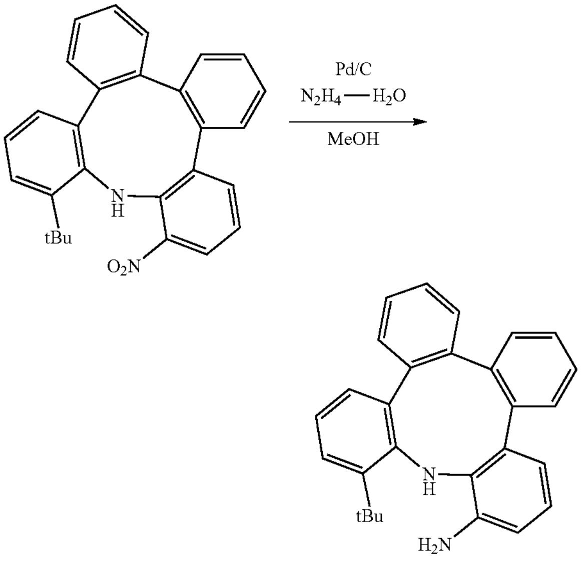

To a 1 L round-bottom flask equipped with a condenser and a septa, containing a suspension of 8-(tert-butyl)-10-nitro-9H-tetrabenzo[b,d,f,h]azonine (8.8 g, 20.93 mmol) in methanol (325 ml) under nitrogen, was added palladium on carbon (2.227 g, 2093 mmol, 10 wt %) followed by hydrazine hydrate (26.1 ml, 419 mmol) and the mixture was stirred vigorously at 65° C. under nitrogen overnight. The mixture was filtered through a short pad of Celite, washing with methanol and dichloromethane. A pale orange solid was obtained, which was purified by column chromatography to give the product as an off-white solid (7.29 g, 89%).

Synthesis of 10-(tert-butyl)-N-(3-((9-(4-(tert-butyl) pyridin-2-yl)-9H-carbazol-2-yl)oxy)phenyl)-9H-tetrabenzo[b,d,f,h]azonin-8-amine

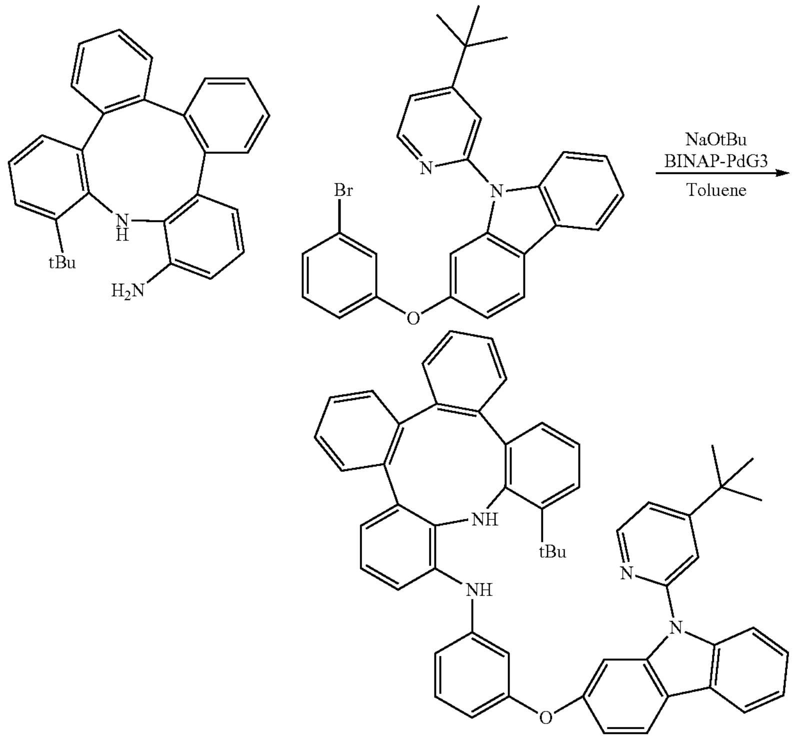

A mixture of 10-(tert-butyl)-9H-tetrabenzo[b,d,f,h]azonin-8-amine (2.0 g, 5.12 mmol), 2-(3-bromophenoxy)-9-(4-(tert-butyl)pyridin-2-yl)-9H-carbazole (2.66 g, 5.63 mmol) and BINAP Pd Gen3 (0.254 g, 0.256 mmol) in anhydrous toluene was sparged with nitrogen for 30 min. Sodium 2-methylpropan-2-olate (0.984 g, 10.24 mmol) was added, and the reaction was then refluxed for 20 hours. The reaction was quenched with saturated ammonium chloride and diluted with ethyl acetate. The combined organic layers were washed with saturated brine, dried over anhydrous sodium sulfate and concentrated. The residue was purified by column chromatography to give 10-(tert-butyl)-N-(3-((9-(4-(tert-butyl)pyridin-2-yl)-9H-carbazol-2-yl)oxy)phenyl)-9H-tetrabenzo[b,d,f,h]azonin-8-amine (3 g, 75%) as an off-white solid.

Synthesis of 3-(tert-butyl)-1-(3-((9-(4-(tert-butyl) pyridin-2-yl)-9H-carbazol-2-yl)oxy)phenyl)-1H-1, 2a-diazatribenzo[4,5:6,7:8,9]cyclonona[1,2,3-cd] inden-2a-ium chloride

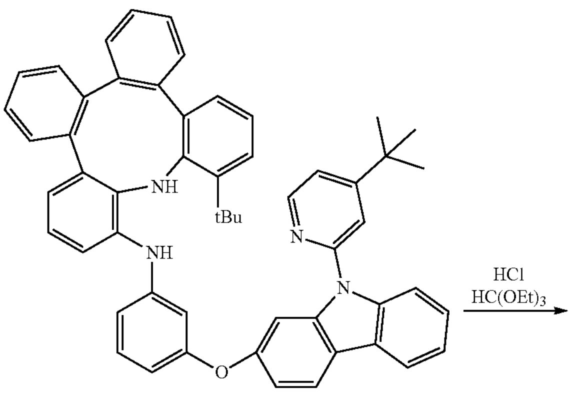

-continued

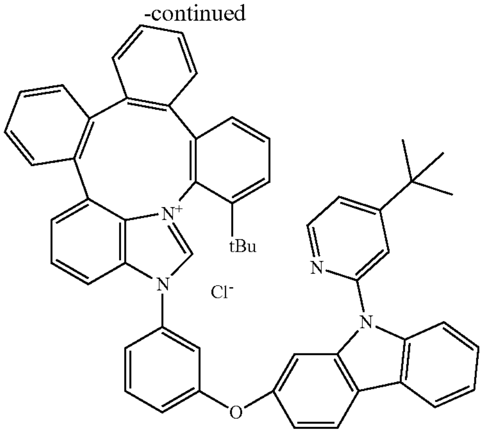

Hydrochloric acid (0.533 ml, 6.15 mmol) was added to a solution of 10-(tert-butyl)-N-(3-((9-(4-(tert-butyl)pyridin-2-yl)-9H-carbazol-2-yl)oxy)phenyl)-9H-tetrabenzo[b,d,f,h]azonin-8-amine (3 g, 3.84 mmol) in triethyl orthoformate (32.0 ml, 192 mmol). The reaction was heated at 100° C. for two hours. The volatiles were removed under reduced pressure, and the residue was triturated with hexanes to give the product as an off-white solid (2.7 g, 85%).

Synthesis of Emitter 5

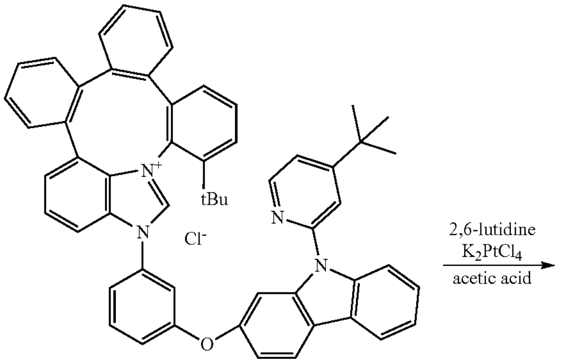

-continued

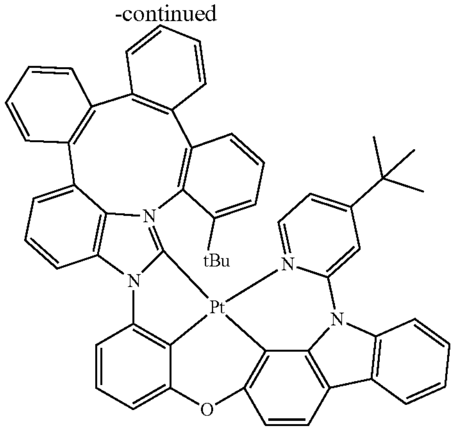

A mixture of potassium tetrachloroplatinate(II) (1.104 g, 2.66 mmol), ligand (2.0 g, 2.417 mmol) and 2,6-lutidine (0.929 ml, 7.98 mmol) in glacial acetic acid (48.3 ml) was sparged with nitrogen for 40 min. The reaction then was refluxed overnight. The reaction mixture was diluted with a mixture of methanol/water. The precipitate was filtered off, washed on a filter and dried. The product was purified by column chromatography (1.1 g) to give a yellow solid.

Synthesis of Emitter 6

Synthesis of N-(3-((9-(4-(2,4,6-triisopropylphenyl)pyridin-2-yl)-9H-carbazol-2-yl)oxy)phenyl)-9H-tetrabenzo[b,d,f,h]azonin-8-amine

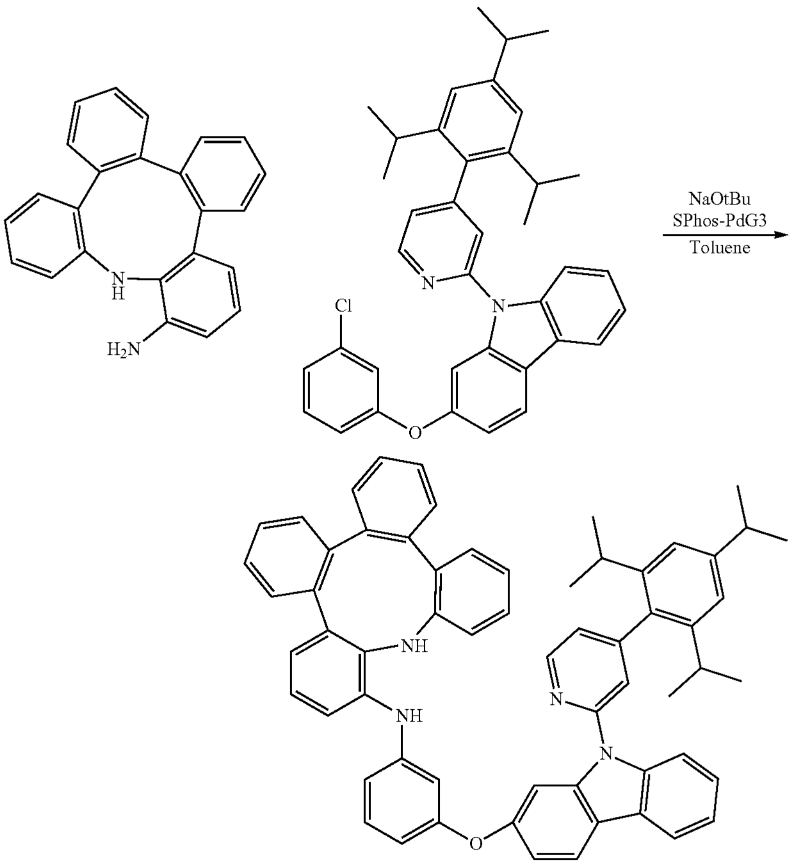

Sodium tert-butoxide (3.27 g, 34.0 mmol), 9H-tetrabenzo[b,d,f,h]azonin-8-amine (3.77 g, 11.27 mmol), and 2-(3-chlorophenoxy)-9-(4-(2,4,6-triisopropylphenyl)pyridin-2-yl)-9H-carbazole (6.5 g, 1134 mmol) were added to a 250 mL round bottom flask and flushed with nitrogen. Toluene (90 ml) the reaction was heated to 80° C. SphosPdG3 (0.442 g, 0.567 mmol) was then added and the reaction was brought to reflux. After 2 hours, the reaction was cooled, filtered through Celite, and purified by column chromatography to give a purple solid (8 g, 79%).

Synthesis of 1-(3-((9-(4-(2,4,6-triisopropylphenyl)pyridin-2-yl)-9H-carbazol-2-yl)oxy)phenyl)-1H-1,2a-diazatribenzo[4,5:6,7:8,9]cyclonona[1,2,3-cd]inden-2a-ium

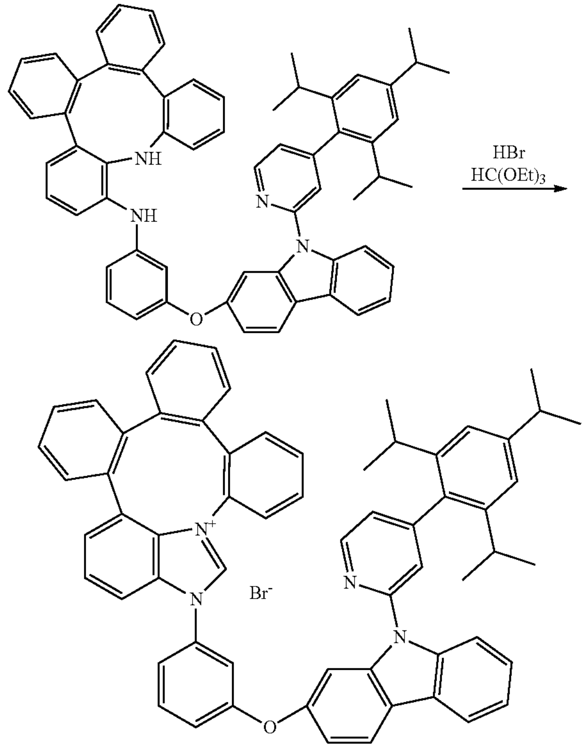

N-(3-((9-(4-(2,4,6-triisopropylphenyl)pyridin-2-yl)-9H-carbazol-2-yl)oxy)phenyl)-9H-tetrabenzo[b,d,f,h]azonin-8-amine (8 g, 9.18 mmol) was dissolved in triethoxymethane (24 mL, 144 mmol), brought to reflux and cooled to RT. Hydrogen bromide (1.341 mL, 11.94 mmol) was then added giving a suspension after two hours. The suspension was heated to 65° C. and MTBE (50 mL) was added. The suspension was cooled and the product was purified by column chromatography to give an off-white solid (2.5 g, 28.3%).

Synthesis of Emitter 6

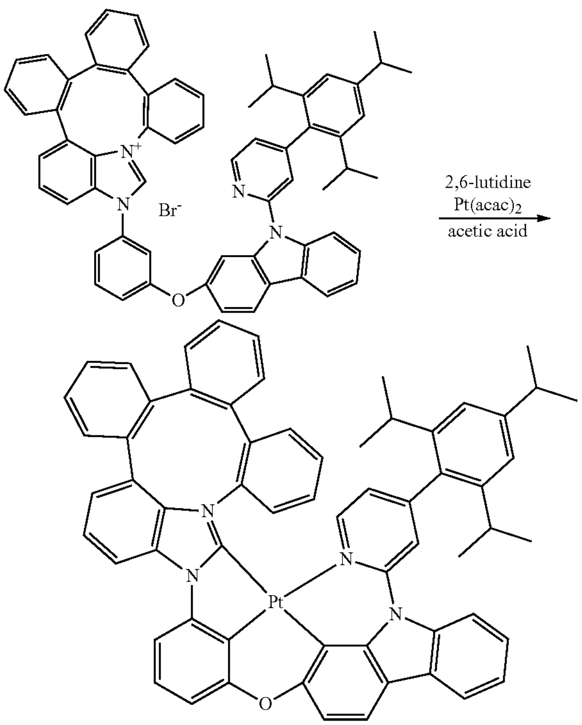

A mixture of $Pt(acac)_2$ (2.1 g, 5.34 mmol), 2,6-dimethylpyridine (0.292 mL, 2.52 mmol), and 2-bromo-1-(3-((9-(4-(2,4,6-triisopropylphenyl)pyridin-2-yl)-9H-carbazol-2-yl)oxy)phenyl)-1,2-dihydro-1,2a-diazatribenzo[4,5:6,7:8,9]cyclonona[1,2,3-cd]indene (2.02 g, 2.1 mmol) in AcOH (20 mL) was sparged with nitrogen and then the reaction was heated to reflux overnight. The reaction was cooled to RT and water was added giving a precipitate. The precipitate was purified by column chromatography to give a yellow solid (0.96 g, 46%).

Synthesis of Emitter 7

Synthesis of N-(3-((9-(4-(tert-butyl)pyridin-2-yl)-6-chloro-9H-carbazol-2-yl)oxy)phenyl)-10-phenyl-9H-tetrabenzo[b,d,f,h]azonin-8-amine

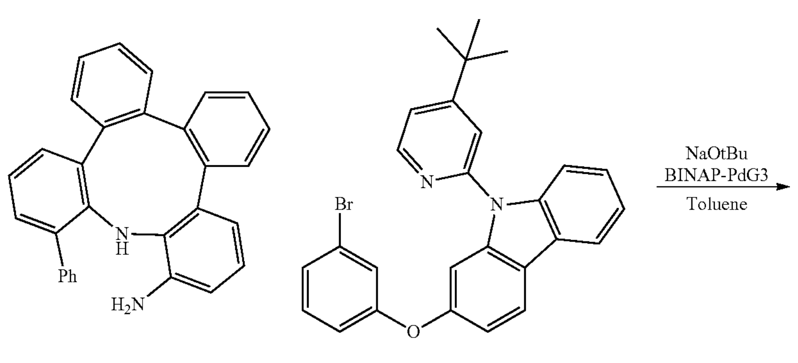

-continued

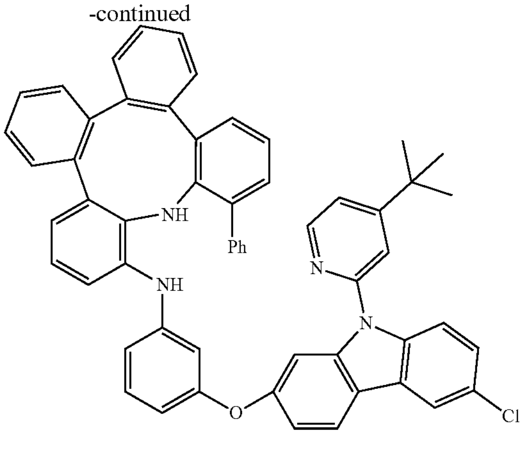

A mixture of 2-(3-bromophenoxy)-9-(4-(tert-butyl)pyridin-2-yl)-6-chloro-9H-carbazole (2.59 g, 5.12 mmol), 10-phenyl-9H-tetrabenzo[b,d,f,h]azonin-8-amine (2.0 g, 4.87 mmol) and sodium 2-methylpropan-2-olate (0.936 g, 9.74 mmol) was sparged with nitrogen and then BINAP-PdG3 (0.242 g, 0244 mmol) was added. The reaction was heated at 95° C. overnight. The reaction mixture was quenched with saturated ammonium chloride. The resulting slurry was filtered through a plug of Celite and washed with dichloromethane. The filtrate was partitioned between water/DCM and the aqueous layer was extracted with DCM three times. The combined organic layers were dried over sodium sulfate and purified by column chromatography to give an off-white solid (2.43 g, 59%).

Synthesis of 1-(3-((9-(4-(tert-butyl)pyridin-2-yl)-6-chloro-9H-carbazol-2-yl)oxy)phenyl)-3-phenyl-1H-1,2a-diazatribenzo[4,5:6,7:8,9]cyclonona[1,2,3-cd]inden-2a-ium chloride -continued

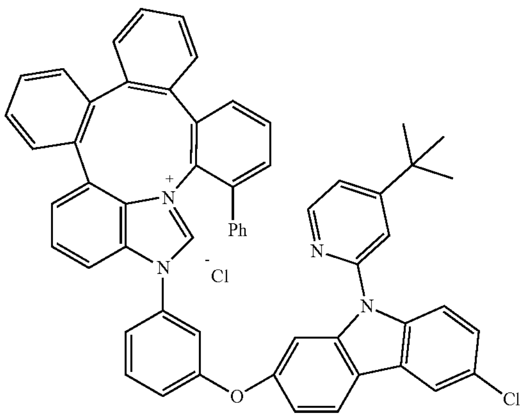

Hydrochloric acid (0388 ml, 4.65 mmol) was added to a mixture of N-(3-((9-(4-(tert-butyl)pyridin-2-yl)-6-chloro-9H-carbazol-2-yl)oxy)phenyl)-10-phenyl-9H-tetrabenzo[b,d,f,h]azonin-8-amine (2.43 g, 2.91 mmol) in triethyl orthoformate (24.22 ml, 145 mmol). The reaction mixture was heated at 100° C. for one hour. The solvent was removed under reduced pressure and the residue was triturated with heptanes and dried in vacuo to give an off-white solid (1.8 g, 70.2%).

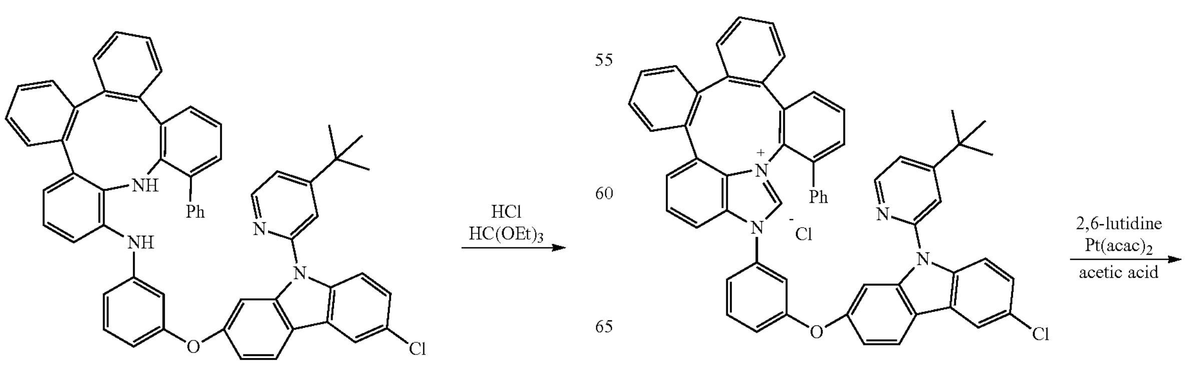

-continued

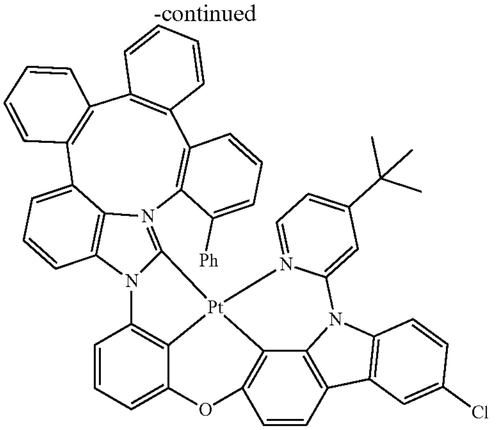

A mixture of 1-(3-((9-(4-(tert-butyl)pyridin-2-yl)-6-chloro-9H-carbazol-2-yl)oxy)phenyl)-3-phenyl-1,2a-diazatribenzo[4,5:6,7:8,9]cyclonona[1,2,3-cd]inden-1-ium chloride (1.8 g, 2.041 mmol), potassium tetrachloroplatinate(II) (0.932 g, 2.245 mmol) and 2,6-lutidine (0.785 ml, 6.74 mmol) in acetic acid (40.8 ml) was sparged with nitrogen. The reaction was then refluxed overnight. The reaction mixture was cooled to RT and water was added to give a precipitate. The precipitate was filtered off and the filter cake was washed with water and dried by suction filtration. The solid was purified by column chromatography to give a yellow solid (1.2 g, 56.6%)

Synthesis of Emitter 7

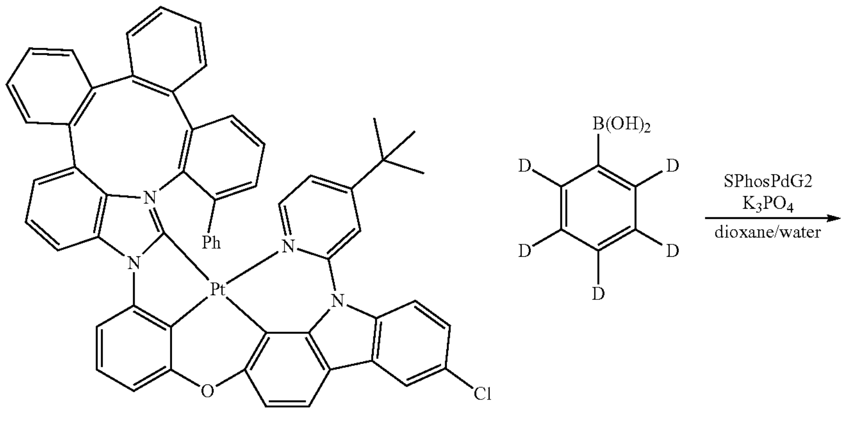

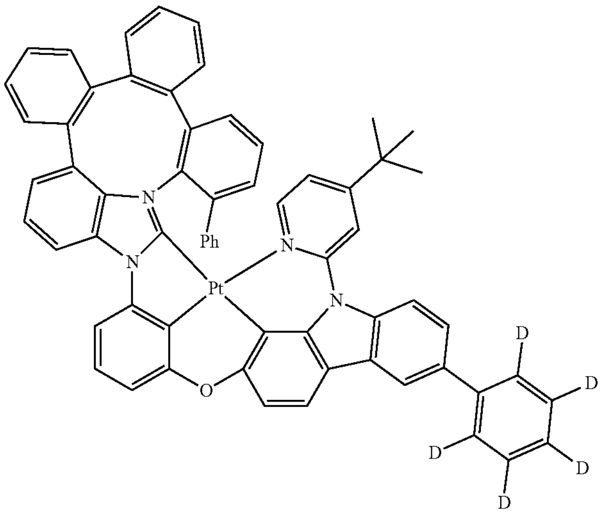

Potassium phosphate hydrate (0.532 g, 2311 mmol) in 1,4-dioxane (7.43 ml) and water (0.825 ml) was sparged with nitrogen. The platinum complex (0.6 g, 0.578 mmol), SPhos-PdG2 (0.048 g, 0.058 mmol), and (phenyl-$d_5$)boronic acid (0293 g, 2311 mmol) were added. The resulting slurry was sparged with nitrogen, and the reaction was heated at 100° C. overnight. The reaction was cooled to RT and the solvent was removed in vacuo. The product was purified by column chromatography a yellow solid (0.44 g, 70.2%).

Synthesis of Emitter 8

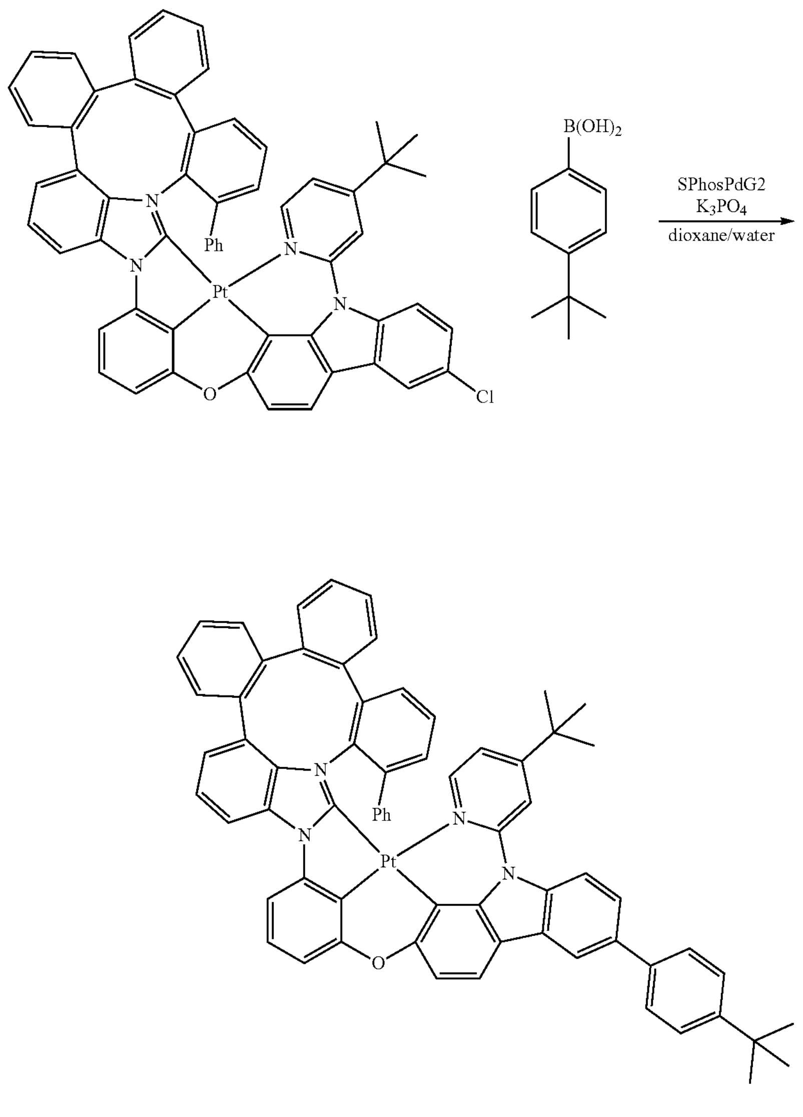

To a 20 mL vial with a stir bar was added (4-(tert-butyl) phenyl)boronic acid (0.411 g, 2.311 mmol), SPhos-PdG2 (0.042 g, 0.058 mmol), potassium phosphate monohydrate (0.532 g, 2.311 mmol) in 1,4-dioxane (5.59 ml) and water (0.621 ml) (10:1). The mixture was sparged with nitrogen for and then heated to 100° C. overnight. The reaction was cooled to RT and filtered through Celite. The filtrate was concentrated under reduced pressure and purified by column chromatography to give a yellow solid (0.58 g, 88%).

Synthesis of Emitter 9

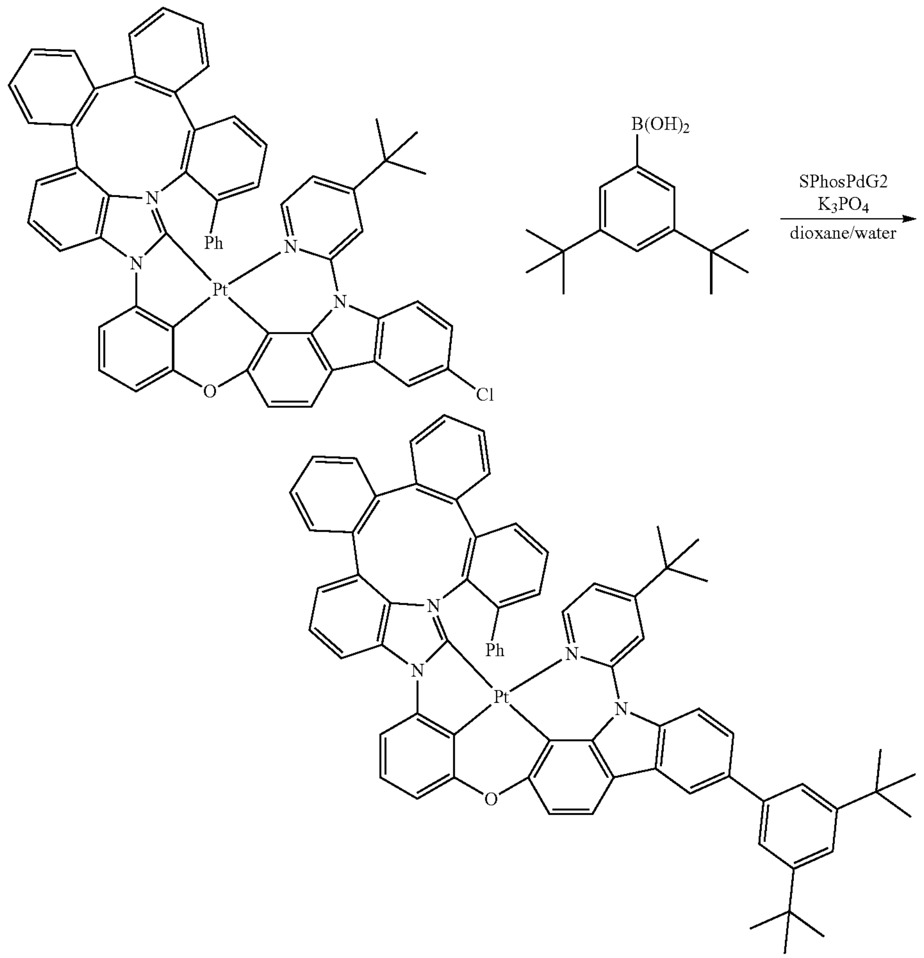

To a 20 mL vial with a stirbar was added, (3,5-di-tert-butylphenyl)boronic acid (0.541 g, 2311 mmol), SPhos-PdG2 (0.042 g, 0.058 mmol), potassium phosphate monohydrate (0.532 g, 2.311 mmol) in 1,4-dioxane (5.59 ml) and water (0.621 ml) (10:1). The reaction was sparged with nitrogen and heated to 100° C. overnight. The reaction was cooled to RT and filtered through Celite. The filtrate was concentrated under reduced pressure and purified by column chromatography to give a yellow solid (0.61 g, 87%).

Synthesis of Emitter 10

Synthesis of 2'-bromo-2-fluoro-3-nitro-1,1'-biphenyl

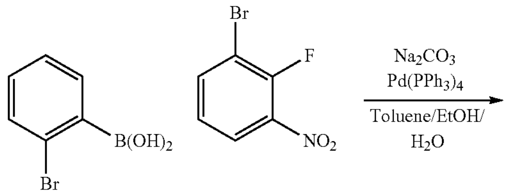

-continued

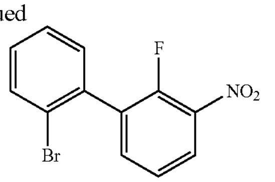

In a 1 L round bottom flask, were introduced (2-bromophenyl)boronic acid (21.90 g, 106 mmol), 1-bromo-2-fluoro-3-nitrobenzene (25 g, 111 mmol), sodium carbonate (472 g, 445 mmol), $Pd(PPh_3)_4$ (6.43 g, 5.57 mmol), toluene (255 mL), ethanol (85 mL) and water (170 mL). The reaction mixture was purged with nitrogen for 30 minutes while stirring vigorously and then the reaction mixture was stirred at 85° C. overnight. The reaction was cooled to RT. After the addition of water the two layers were separated. The aqueous layer was extracted with ethyl acetate. The combined organic layers were dried over $MgSO_4$, filtered and concentrated under vacuum. The product was purified by column chromatography to give a white solid (86 g, 91%).

Synthesis of 2-chloro-2"-fluoro-3-methoxy-3"-nitro-1,1':2',1"-terphenyl

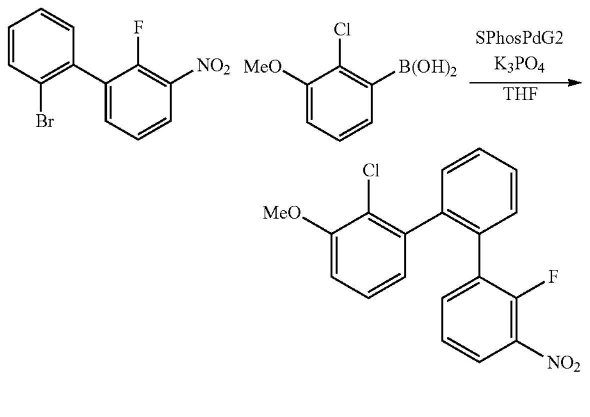

In a 2 L round bottom flask, were introduced 2'-bromo-2-fluoro-3-nitro-1,1'-biphenyl (40.4 g, 137 mmol), (2-chloro-3-methoxyphenyl)boronic acid (25 g, 130 mmol), SPhos-PdG2 (2.81 g, 3.90 mmol), tetrahydrofuran (600 mL) and potassium phosphate (800 mL, 400 mmol, 0.5M in water). The reaction mixture was purged with nitrogen for 30 minutes and then stirred at 60° C. for five hours under nitrogen. The reaction was cooled to RT. After the addition of water (1 L), the two layers were separated. The aqueous layer was extracted with ethyl acetate (3×300 mL). The combined organic layers were dried over $MgSO_4$, filtered and concentrated under vacuum. The crude material was purified by column chromatography to give a white solid (80.3 g, 95%).

Synthesis of 2'''-fluoro-6'-methoxy-3'''-nitro-[1,1':2',1":2",1'''-quaterphenyl]-2-amine

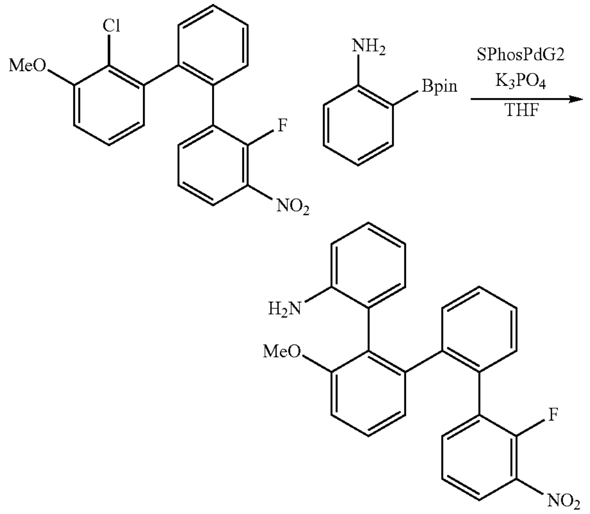

In a 2 L round-bottom flask, were introduced 2-chloro-2"-fluoro-3-methoxy-3"-nitro-1,1':2',1"-terphenyl (40 g, 112 mmol), dioxane (450 mL) and potassium phosphate at 0.5 M (700 mL, 350 mmol). The reaction mixture was purged with nitrogen for 30 minutes. Then 2-(4,4,5,5-tetramethyl-1,3,2-dioxaborolan-2-yl)aniline (62.5 g, 280 mmol), and SPhos-PdG2 (4.11 g, 5.59 mmol) were added and the reaction mixture was stirred for 16 hours at 90° C. The reaction was cooled to RT. After the addition of water (2 L) and ethyl acetate (500 mL), the 2 layers were separated. The aqueous layer was extracted with ethyl acetate (3×500 mL). The combined organic layers were dried over $MgSO_4$, filtered and concentrated under vacuum. The crude material was purified by column chromatography to give an off-white solid (61.3 g, 67%).

Synthesis of 4-methoxy-10-nitro-9H-tetrabenzo[b,d,f,h]azonine

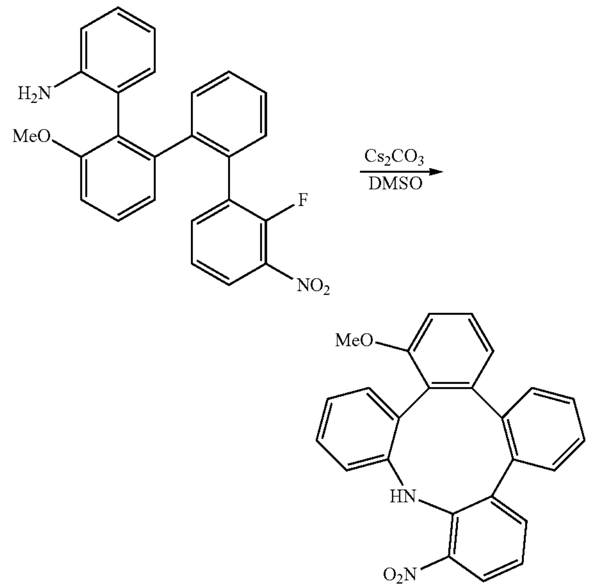

To a 2 L round-bottom flask containing 2'''-fluoro-6'-methoxy-3'''-nitro-[1,1':2',1":2",1'''-quaterphenyl]-2-amine (28 g, 61.8 mmol) in dry DMSO (1 L) was added cesium carbonate (61.0 g, 185 mmol) and the flask was purged with nitrogen. The reaction mixture was then stirred at 160° C. for three hours. The reaction was allowed to cool down to room temperature. 4 L of ice cold saturated NaCl solution was added followed by 750 mL of ethyl acetate and the two layers were separated. The aqueous layer was extracted with ethyl acetate (4×500 mL). The combined organic layers were dried over $MgSO_4$, filtered and concentrated under vacuum at 45° C. to give a dark red thick oil. The crude material was purified by column chromatography to give an orange solid, (51.4 g, 85%).

Synthesis of 10-nitro-9H-tetrabenzo[b,d,f,h]azonin-4-ol

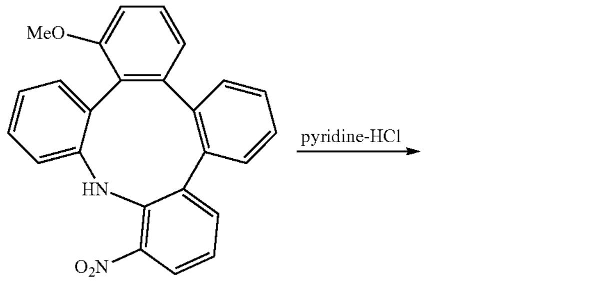

-continued

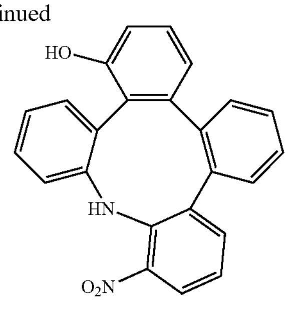

In a 1 L round bottom flask, to a heated pyridine hydrochloride (200 g, 1731 mmol) liquid at 165° C., was added 4-methoxy-10-nitro-9H-tetrabenzo[b,d,f,h]azonine (20 g, 50.7 mmol) with stirring. The reaction mixture was stirred for four hours at 170° C. After four hours, the hot solution was directly poured into water (1 L). The obtained suspension was filtered and washed with water (2×200 mL) to give a brown solid. The crude material was purified by column chromatography to give a red solid, (35.7 g, 68%).

Synthesis of 10-nitro-9H-tetrabenzo[b,d,f,h]azonin-4-yl trifluoromethanesulfonate

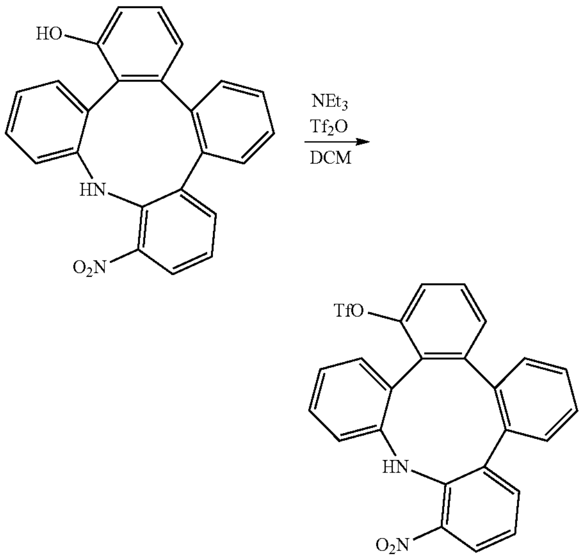

In a 2 L round bottom flask, were introduced 10-nitro-9H-tetrabenzo[b,d,f,h]azonin-4-ol (25 g, 63.7 mmol) and dry dichloromethane (600 mL). The flask was purged with nitrogen for and then triethylamine (17.77 ml, 127 mmol) was added. The reaction mixture was stirred at RT for 15 minutes and then was cooled down to 0° C. using an ice water bath. Trifluoromethanesulfonic anhydride (11.26 ml, 66.9 mmol) was then added dropwise over 50 minutes. The reaction mixture was allowed to warm up slowly to RT and was stirred for 16 hours at room temperature. A saturated aqueous solution of sodium bicarbonate (1 L) was added and the two layers were separated. The aqueous layer was extracted with dichloromethane (3×300 mL). The combined organic layers were dried over $MgSO_4$, filtered and concentrated under vacuum. The crude material was purified by column chromatography to give an orange solid (50.7 g, 97%).

Synthesis of 10-nitro-4-phenyl-9H-tetrabenzo[b,d,f,h]azonine

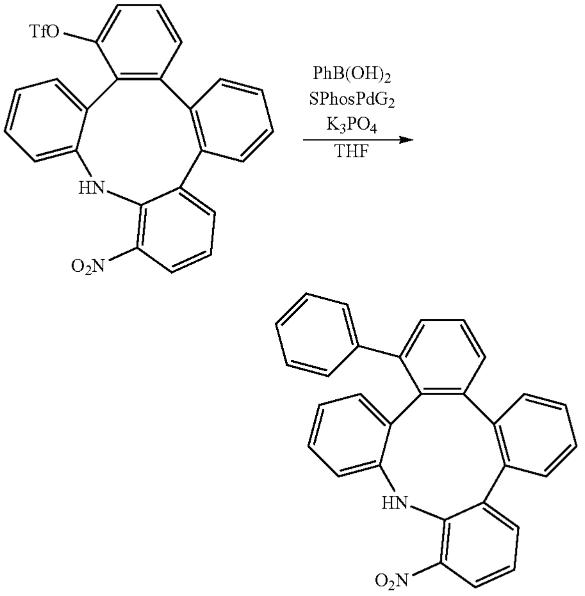

In a 1 L round bottom flask, were introduced 10-nitro-9H-tetrabenzo[b,d,f,h]azonin-4-yl trifluoromethanesulfonate (15 g, 29.3 mmol), phenylboronic acid (7.14 g, 58.5 mmol), SPhosPdG2 (0.633 g, 0.878 mmol), tetrahydrofuran (135 mL) and potassium phosphate (180 mL, 90 mmol, 0.5 M in water). The flask was purged with nitrogen for 20 minutes and then the reaction mixture was stirred at 60° C. for three hours under nitrogen. After 3 hours, the reaction was cooled to RT. After the addition of water (500 mL), the two layers were separated. The aqueous layer was extracted with ethyl acetate (3×250 mL). The combined organic layers were dried over $MgSO_4$, filtered and concentrated under vacuum. The crude material was purified by column chromatography to give a red solid (16.8 g, 96%).

Synthesis of 14-phenyl-9H-tetrabenzo[b,d,f,h]azonin-8-amine

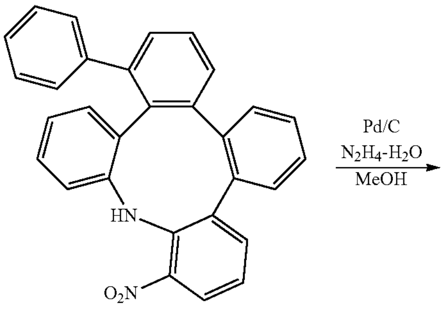

-continued

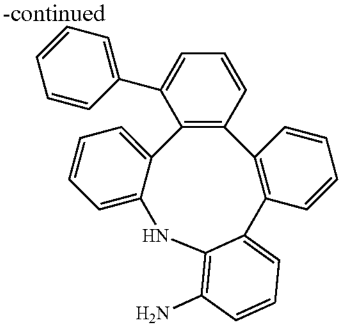

To a 2 L round-bottom flask containing a suspension of 8-nitro-4-phenyl-9H-tetrabenzo[b,d,f,h]azonine (16.8 g, 38.1 mmol) in methanol (650 mL), was added under nitrogen Pd/C (4.06 g, 3.81 mmol) followed by hydrazine hydrate (47.5 ml, 763 mmol) and the mixture was stirred at 66° C. under nitrogen for 2 hours. After 2 hours, the reaction was cooled down to RT. The mixture was filtered through a short pad of Celite, washed with methanol (100 mL), and then dichloromethane (4×200 mL). The filtrate was concentrated under vacuum, and the obtained solid was purified by column chromatography to give an off-white solid (15.42 g, 97%).

Synthesis of N-(3-((9-(4-(tert-butyl)pyridin-2-yl)-9H-carbazol-2-yl)oxy)phenyl)-14-phenyl-9H-tetrabenzo[b,d,f,h]azonin-8-amine A mixture of 10-phenyl-9H-tetrabenzo[b,d,f,h]azonin-8-amine (1.5 g, 2.60 mmol), 2-(3-bromophenoxy)-9-(4-(tert-butyl)pyridin-2-yl)-9H-carbazole (1.756 g, 3.39 mmol) and BINAPPdG3 (0.153 g, 0.154 mmol) in anhydrous toluene was sparged with nitrogen for 30 minutes. Sodium 2-methylpropan-2-olate (0.592 g, 6.17 mmol) was then added and the reaction was refluxed for 20 hours. The reaction crude was filtered through Celite, rinsed with DCM (25 mL) and concentrated under reduced pressure to give a light green solid (3.4 g, 87%).

Synthesis of 1-(3-((9-(4-(tert-butyl)pyridin-2-yl)-9H-carbazol-2-yl)oxy)phenyl)-7-phenyl-1H-1,2a-diazatribenzo[4,5:6,7:8,9]cyclonona[1,2,3-cd]inden-2a-ium

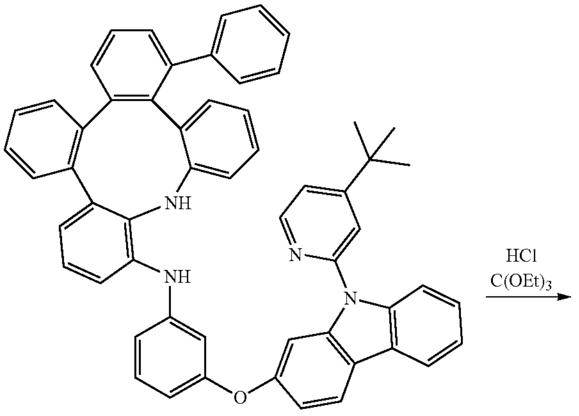

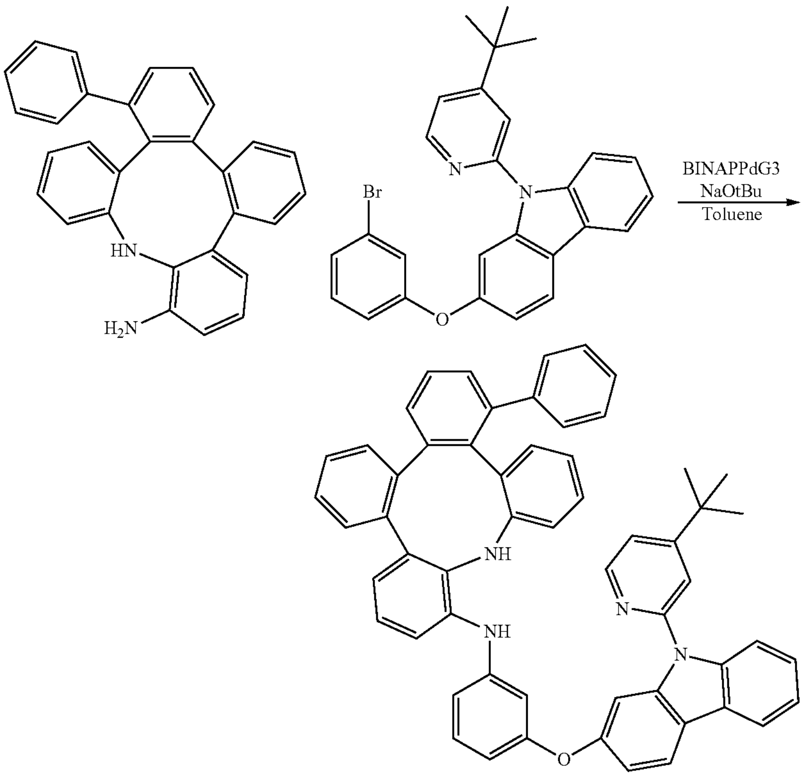

-continued

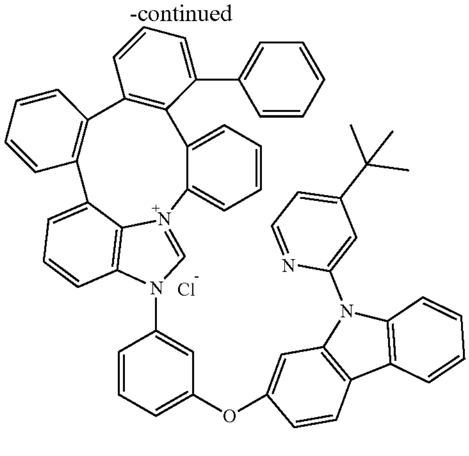

Hydrochloric acid (0.531 ml, 6.37 mmol) was added to a mixture of N-(3-((9-(4-(tert-butyl)pyridin-2-yl)-9H-carbazol-2-yl)oxy)phenyl)-13-phenyl-9H-tetrabenzo[b,d,f,h]azonin-8-amine (3.4 g, 4.24 mmol) in triethyl orthoformate (21.20 ml, 127 mmol). The reaction mixture was heated at 100° C. for one hour. The solvent was removed under reduced pressure and the residue was triturated with heptanes and dried in vacuo to give an off-white solid (3.0 g, 83%).

Synthesis of Emitter 10

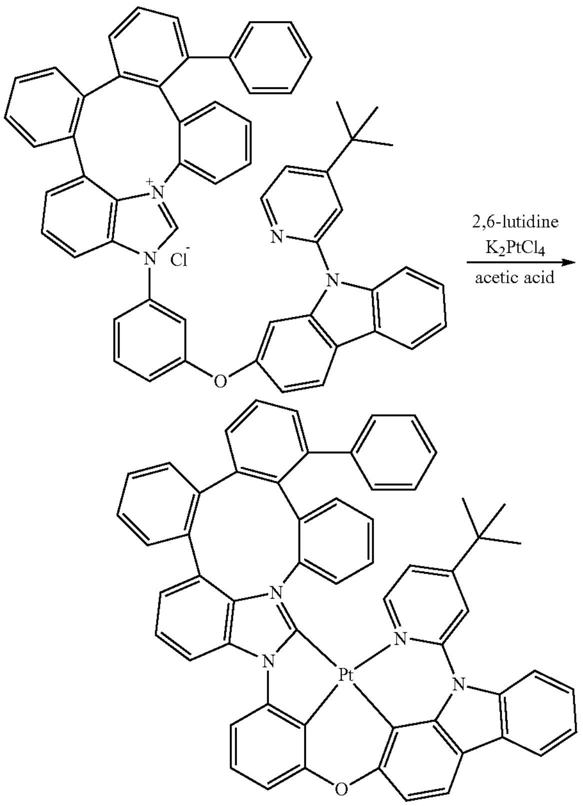

A mixture of 1-(3-((9-(4-(tert-butyl)pyridin-2-yl)-9H-carbazol-2-yl)oxy)phenyl)-6-phenyl-1,2a-diazatribenzo[4,5:6,7:8,9]cyclonona[1,2,3-cd]inden-1-ium chloride (2.5 g, 2.95 mmol), potassium tetrachloroplatinate(II) (1.347 g, 3.24 mmol) and 2,6-dimethylpyridine (1.134 ml, 9.73 mmol) in acetic acid (59.0 ml) was sparged with nitrogen for 40 min. Reaction then was refluxed overnight. The reaction was cooled to RT and a mixture of water and methanol was added. The precipitate was collected by filtration and purified by column chromatography to give a yellow solid (2.6 g, 87%).

Synthesis of Emitter 11

Synthesis of 2-fluoro-3''-methoxy-3-nitro-[1,1':2',1'':2''1''':3''',1'''-quinquephenyl]-2'''-amine

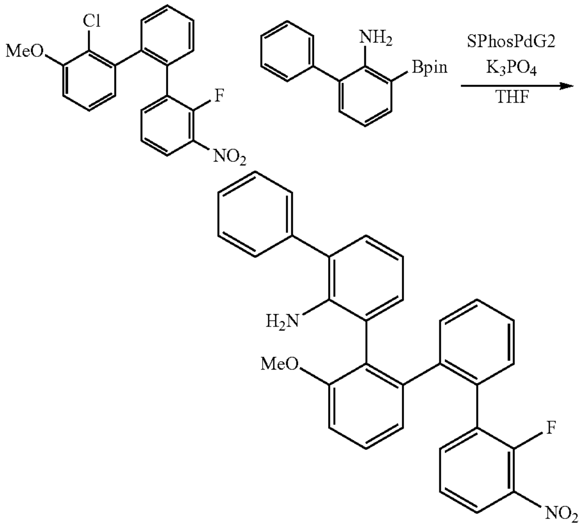

To a suspension of 3-(4,4,5,5-tetramethyl-1,3,2-dioxaborolan-2-yl)-[1,1'-biphenyl]-2-amine (23.60 g, 80 mmol), 2-chloro-2''-fluoro-3-methoxy-3''-nitro-1,1':2',1''-terphenyl (14.3 g, 40.0 mmol), and SPhosPdG2 (1.440 g, 1.999 mmol) in dioxane (240 ml), was added potassium phosphate (480 ml, 240 mmol) under nitrogen. The reaction mixture was heated to 90° C. for three hours. After cooling down, the reaction mixture was quenched with water (50 mL), and extracted with ethyl acetate (50 mL). The organic layer was collected, and aqueous layer was extracted with ethyl acetate (50 mL). Combined organic layers were concentrated under vacuum and the residue was purified by column chromatography to give the desired product (13.4 g, 68%).

Synthesis of 4-methoxy-10-nitro-8-phenyl-9H-tetrabenzo[b,d,f,h]azonine

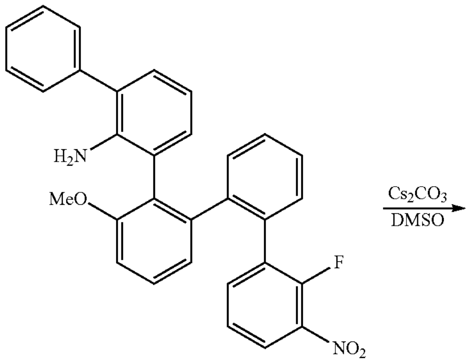

-continued

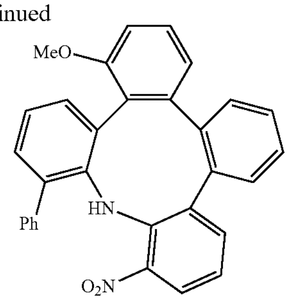

A mixture of 2-fluoro-3''-methoxy-3-nitro-[1,1':2',1'':2''1''':3''',1''''-quinquephenyl]-2'''-amine (13.4 g, 273 mmol) and cesium carbonate (26.7 g, 82 mmol) in DMSO (500 mL) was heated to 150° C. for three hours. After cooling down, the reaction was quenched with water (300 mL), and then extracted with ethyl acetate (300 mL). Organic layer was collected, and aqueous layer was extracted with ethyl acetate (300 mL). The organic layers were combined and concentrated and the residue was purified by column chromatography to give the desired product as an orange solid (8.76 g, 68%).

Synthesis of 10-nitro-8-phenyl-9H-tetrabenzo[b,d,f,h]azonin-4-ol

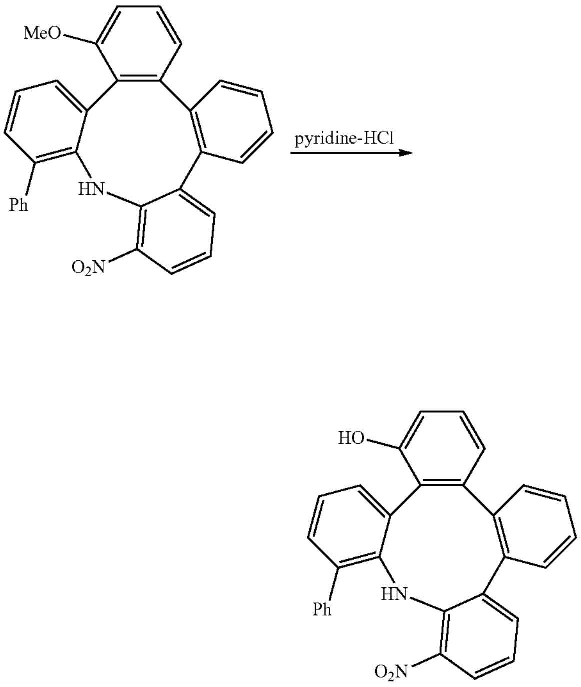

A mixture of pyridine hydrochloride (246 g, 2125 mmol) and 4-methoxy-10-nitro-8-phenyl-9H-tetrabenzo[b,d,f,h]azonine (10 g, 2125 mmol) was heated to 165° C. for three hours. After cooling down, water (200 mL) and ethyl acetate (200 mL) was added with stirring. The organic layer was collected, and the solvent was removed. The residue was purified by column chromatography to give an orange powder (6.5 g, 67%).

Synthesis of 10-nitro-8-phenyl-9H-tetrabenzo[b,d,f,h]azonin-4-yl trifluoromethanesulfonate

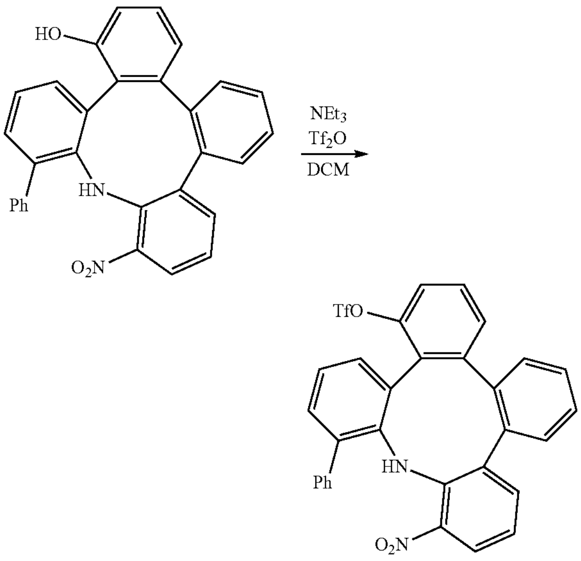

To a solution of 10-nitro-8-phenyl-9H-tetrabenzo[b,d,f,h]azonin-4-ol (7 g, 15.33 mmol) and triethylamine (4.66 g, 46.0 mmol) in $CH_2Cl_2$ (200 ml), was added trifluoromethanesulfonic anhydride (8.65 g, 30.7 mmol) at 0° C. The reaction mixture was then diluted with $CH_2Cl_2$ (100 mL), and washed with water (100 mL×2). Then the solvent was removed, and the residue was purified by column chromatography to give an orange solid (8.1 g, 90%).

Synthesis of 10-nitro-4,8-diphenyl-9H-tetrabenzo[b,d,f,h]azonine

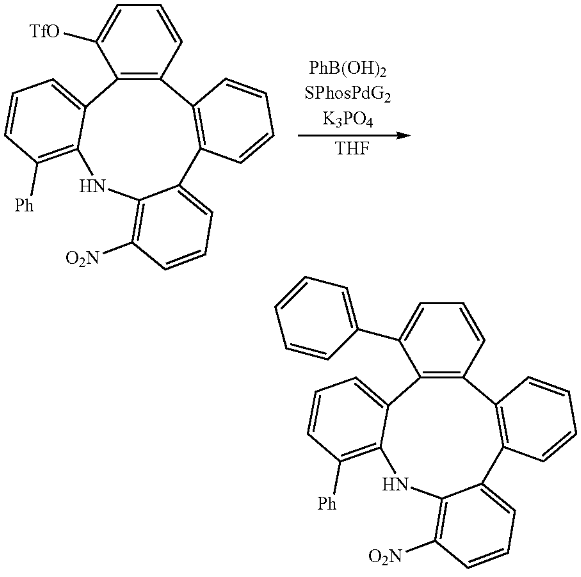

To a solution of 10-nitro-8-phenyl-9H-tetrabenzo[b,d,f,h]azonin-4-yl trifluoromethanesulfonate (3.6 g, 6.12 mmol), phenylboronic acid (1.492 g, 12.23 mmol), and SphosPdG2

(0.220 g, 0.306 mmol) in dioxane (60 ml), was added potassium phosphate (122 ml, 612 mmol) aqueous solution under nitrogen. The reaction mixture was heated to 80° C. for three hours. After cooling down, ethyl acetate (100 mL) and water (50 mL) were added with stirring. The organic layer was collected, and aqueous layer was extracted with methylene chloride (100 mL). The combined organic layer was concentrated and the residue was purified by column chromatography to give the desired compound (2 g, 60%).

Synthesis of 10,14-diphenyl-9H-tetrabenzo[b,d,f,h]azonin-8-amine

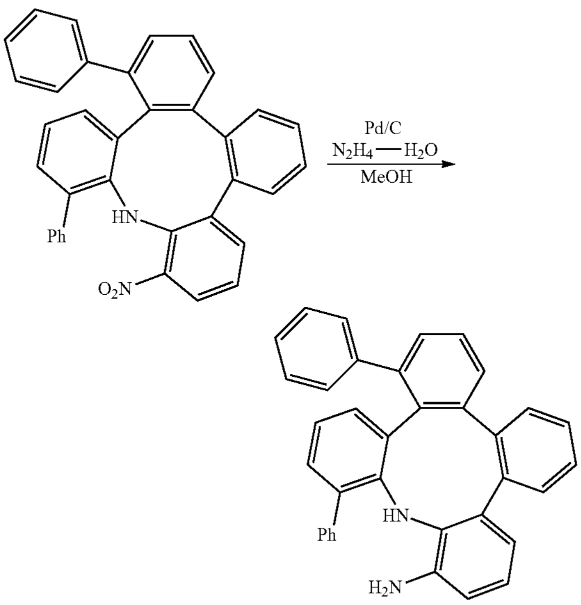

A mixture of 10-nitro-4,8-diphenyl-9H-tetrabenzo[b,d,f,h]azonine (2 g, 3.87 mmol), hydrazine hydrate (3.88 g, 77 mmol) and palladium (0.412 g, 0.387 mmol) on carbon in EtOH (200 ml) and $CH_2Cl_2$ (20 mL) was heated to 90° C. for three hours. After cooling down, the reaction mixture was filtered through Celite, and washed with ethyl acetate. All solvents were removed, and the residue was purified by column chromatography to give the desired product (1.2 g, 63%).

Synthesis of N-(3-((9-(4-(tert-butyl)pyridin-2-yl)-9H-carbazol-2-yl)oxy)phenyl)-10,14-diphenyl-9H-tetrabenzo[b,d,f,h]azonin-8-amine

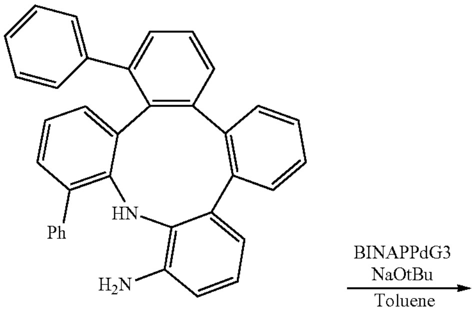

-continued

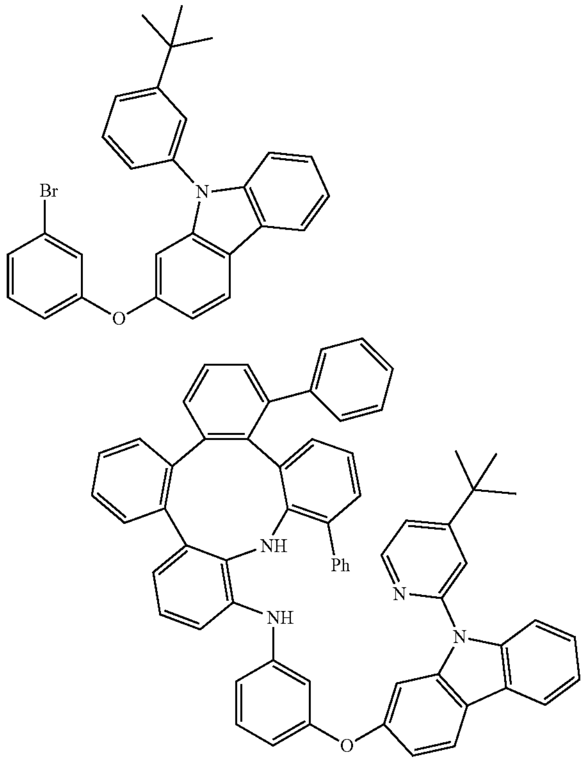

A mixture of 10,14-diphenyl-9H-tetrabenzo[b,d,f,h]azonin-8-amine (1.5 g, 3.08 mmol), 2-(3-bromophenoxy)-9-(4-(tert-butyl)pyridin-2-yl)-9H-carbazole (1.756 g, 3.39 mmol) and BINAP Pd Gen3 (0.153 g, 0.154 mmol) in anhydrous toluene was sparged with nitrogen for 30 min. Sodium 2-methylpropan-2-olate (0.592 g, 6.17 mmol) was added, and sparging continued for 10 min. Reaction was then refluxed for 20 hours. The reaction crude was filtered through Celite, rinsed with DCM (25 mL) and concentrated under reduced pressure to give a light green solid (1.8 g, 58%).

Synthesis of 1-(3-((9-(4-(tert-butyl)pyridin-2-yl)-9H-carbazol-2-yl)oxy)phenyl)-3,7-diphenyl-1H-1,2a-diazatribenzo[4,5:6,7:8,9]cyclonona[1,2,3-cd]inden-2a-ium

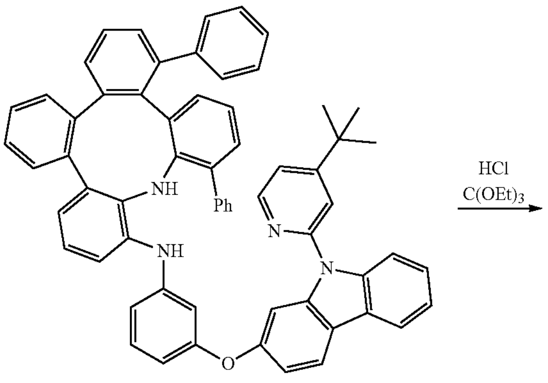

-continued

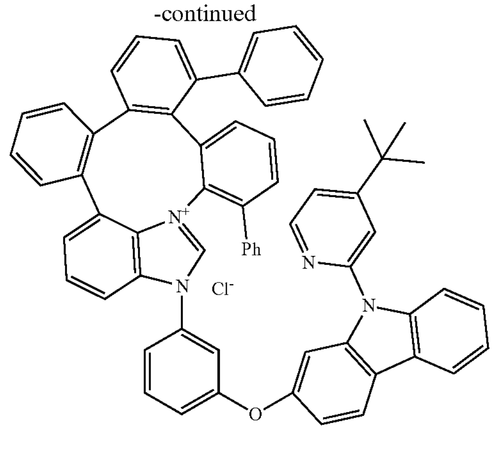

HCl (0.222 ml, 7.30 mmol) was added to a solution of N-(3-((9-(4-(tert-butyl)pyridin-2-yl)-9H-carbazol-2-yl)oxy) phenyl)-10,14-diphenyl-9H-tetrabenzo[b,d,f,h]azonin-8-amine (4 g, 4.56 mmol) in triethyl orthoformate (38.0 ml, 228 mmol). Reaction was heated at 100° C. for 3 hours resulting in full conversion. The volatiles were removed under reduced pressure to give a white solid (5.1 g, 4.25 mmol, 93%).

Synthesis of Emitter 11

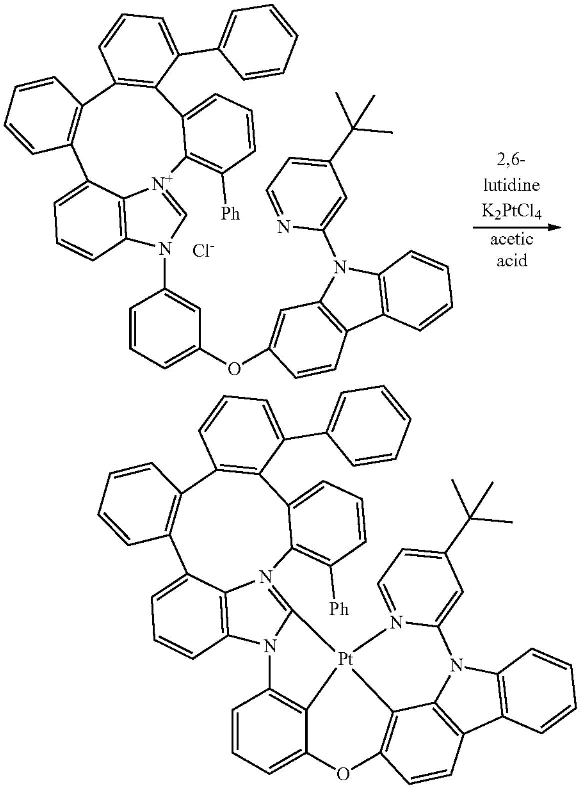

A mixture of potassium tetrachloroplatinate (2.52 g, 6.07 mmol), 1-(3-((9-(4-(tert-butyl)pyridin-2-yl)-9H-carbazol-2-yl)oxy)phenyl)-3,7-diphenyl-1H-1,2a-diazatribenzo[4,5:6,7:8,9]cyclonona[1,2,3-cd]inden-2a-ium chloride (5.1 g, 5.52 mmol) and 2,6-dimethylpyridine (2.100 ml, 18.22 mmol) in AcOH (110 ml) was sparged with nitrogen for 40 min. The reaction then was refluxed at 120° C. for 18 hours. The combined mixture was diluted with water (150 mL) and extracted with DCM (3×150 mL). Crude material was concentrated and the product was purified by column chromatography to give a yellow solid (1.2 g, 18.11%).

Synthesis of Emitter 12

Synthesis of 2-chloro-6-(4,4,5,5-tetramethyl-1,3,2-dioxaborolan-2-yl)aniline

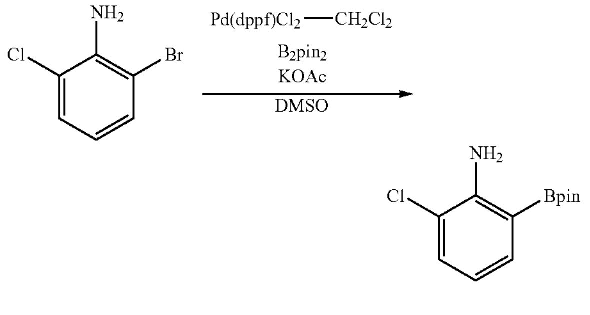

To a suspension of 2-bromo-6-chloroaniline (8.2 g, 39.7 mmol), bis(pinacolato)diboron (30.3 g, 119 mmol), and KOAc (15.59 g, 159 mmol) in DMSO (80 mL), was added $Pd(dppf)Cl_2*CH_2Cl_2$ (1.622 g, 2 mmol) under nitrogen. The reaction mixture was then heated to 90° C. under nitrogen for 20 hours. After cooling down, ethyl acetate (200 mL) and aqueous HCl solution (0.5 M, 100 mL) were added with stirring. The organic layer was collected, and the aqueous layer was extracted with ethyl acetate (100 mL). The combined organic layer was washed with brine (100 ml×2). Then the organic solution was dried over $Na_2SO_4$. After removal of solvent, the residue was purified by column chromatography to give a white solid (8.1 g, 80%).

Synthesis of 2-(2'-bromo-[1,1'-biphenyl]-2-yl)-4,4,5,5-tetramethyl-1,3,2-dioxaborolane

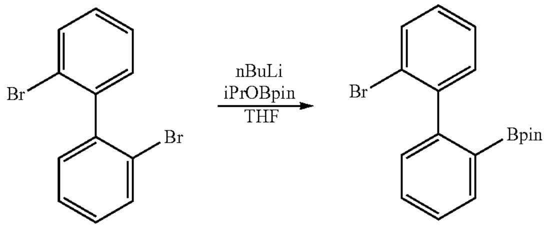

To a solution of 2,2'-dibromo-1,1'-biphenyl (15 g, 48.1 mmol) in anhydrous THF (500 mL), was added n-BuLi (23 mL, 2.5 M, 27.5 mmol) dropwise at −78° C. under nitrogen. After addition, the reaction mixture was stirred for 1 hour, and then 2-isopropoxy-4,4,5,5-tetramethyl-1,3,2-dioxaborolane (11.63 g, 62.5 mmol) in anhydrous THF (10 mL) was added slowly at −78° C. After addition, the reaction temperature was brought up to room temperature gradually and stirred for another 2 hrs. Water (200 mL) and ethyl acetate (200 mL) were added with stirring. The organic layer was collected, and the aqueous layer was extracted with ethyl acetate (200 mL). The combined organic layer solvents were removed, and the residue was purified column chromatography to give the desired product (11 g, 64%).

Synthesis of 2"-bromo-2-fluoro-3-nitro-1,1':2',1"-terphenyl

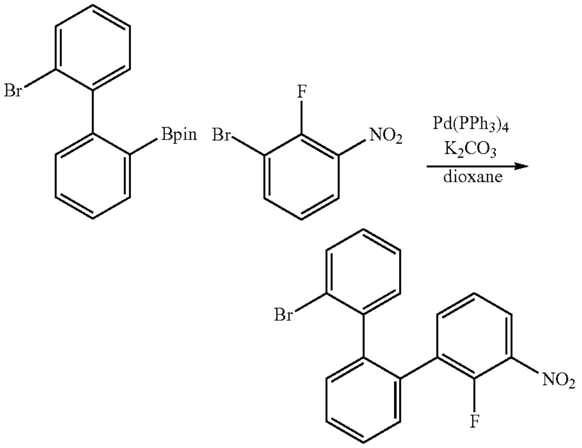

To a suspension of 1-bromo-2-fluoro-3-nitrobenzene (10.04 g, 45.6 mmol), boronate 268-4 (12.6 g, 35.1 mmol), aqueous $K_2CO_3$ solution (70.2 mL, 2M, 140.4 mmol) in dioxane (140 mL), was added $Pd(Ph_3P)_4$ (2028 g, 1.755 mmol) under $N_2$. The reaction mixture was heated to 85° C. overnight under nitrogen. After cooling down, ethyl acetate (150 mL) and water (150 mL) were added with stirring. The organic layer was collected, and the aqueous layer was extracted with ethyl acetate (150 mL). The combined organic layer solvents were removed, and the residue was purified by column chromatography (9 g, 68%).

Synthesis of 3-chloro-2'''-fluoro-3'''-nitro-[1,1':2',1":2",1'''-quaterphenyl]-2-amine

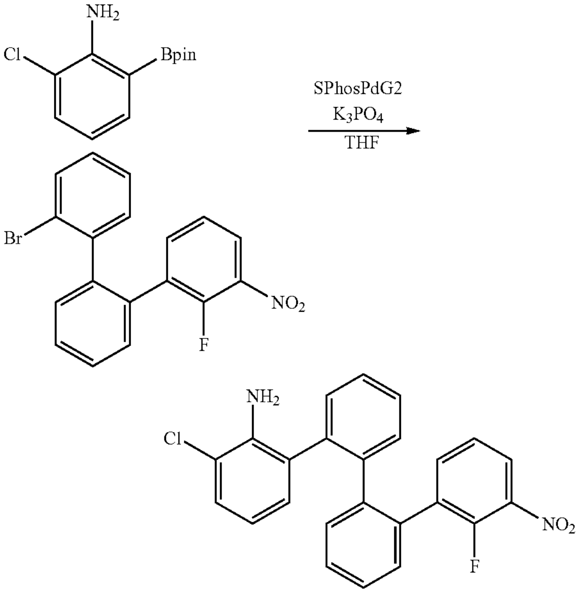

To a solution of 2-chloro-6-(4,4,5,5-tetramethyl-1,3,2-dioxaborolan-2-yl)aniline (2.4 g, 9.46 mmol), 2"-bromo-2-fluoro-3-nitro-1,1':2',1"-terphenyl (3.2 g, 8.6 mmol), and SphosPdG2 (031 g, 0.43 mmol) in THF (55 mL), was added an aqueous solution of $K_3PO_4$ (103 mL, 0.5 M, 51.6 mmol) under $N_2$. The reaction mixture was heated to 60° C. for 3 hrs. After cooling down, ethyl acetate (50 mL) and water (50 mL) were added with stirring. The organic layer was collected, and the aqueous layer was extracted with ethyl acetate (50 mL). The combined organic layers solvents were removed. The residue was purified by column chromatography to give the desired product (2.8 g, 78%).

Synthesis of 8-chloro-10-nitro-9H-tetrabenzo[b,d,f,h]azonine

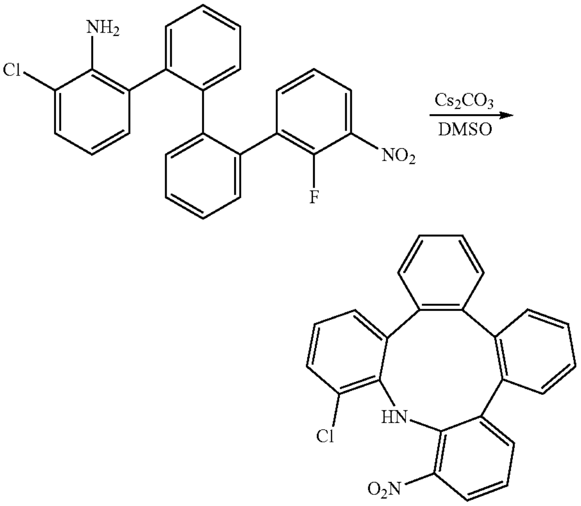

$Cs_2CO_3$ (17.5 g, 53.7 mmol) was added to a solution of 3-chloro-2'''-fluoro-3'''-nitro-[1,1':2',1":2",1'''-quaterphenyl]-2-amine (7.5 g, 17.9 mmol) in DMSO. The reaction mixture was heated to 150° C. (an oil bath temperature) for 3 hours. After cooling down, the reaction was quenched with water (100 mL), and then extracted with ethyl acetate (100 mL×2). The combined organic solution was washed with brine (100 mL×2). Then the solvent was removed under vacuum, and the residue was purified by column chromatography to give an orange solid product (52 g, 72.8%).

Synthesis of 8-([1,1':3',1"-terphenyl]-5'-yl)-10-nitro-9H-tetrabenzo[b,d,f,h]azonine

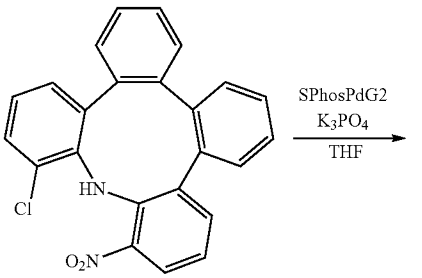

-continued

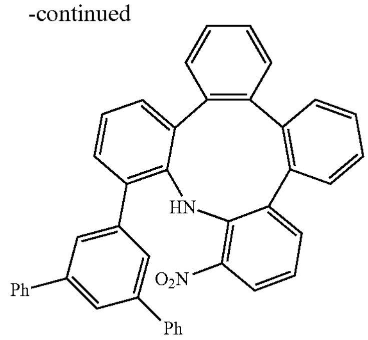

An aqueous solution of $K_3PO_4$ (211 mL, 0.5 M, 105 mmol) under $N_2$ was added to a suspension of 8-chloro-10-nitro-9H-tetrabenzo[b,d,f,h]azonine (6 g, 15.04 mmol), terphenyl boronic acid 268-8 (8.25 g, 30.1 mmol), and SphosPdG2 (1.084 g, 1.5 mmol) in dioxane (100 mL). The reaction mixture was heated to 90° C. for three hours. After cooling down, ethyl acetate (100 mL) and water (50 mL) were added with stirring. The organic layer was collected, and the aqueous layer was extracted with ethyl acetate (100 mL). The combined organic layer solvents were removed, and the residue was purified by column chromatography to give a solid product (8.92 g, 100%).

Synthesis of 10-([1,1':3',1"-terphenyl]-5'-yl)-9H-tetrabenzo[b,d,f,h]azonin-8-amine

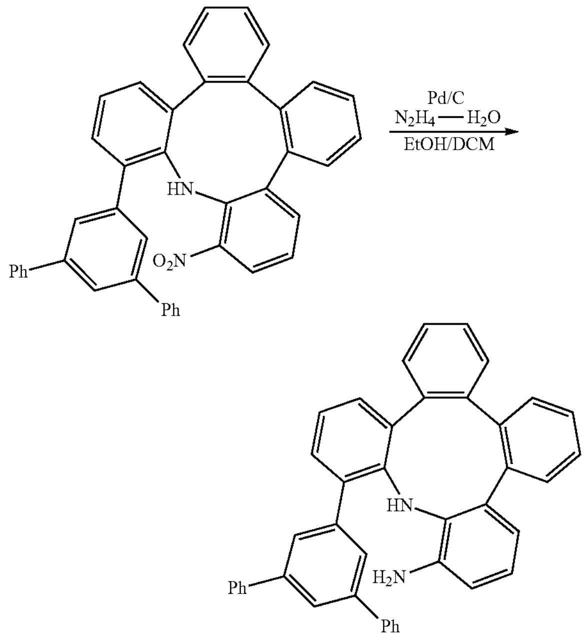

Pd/C (1 g, 10%, 0.945 mmol) was added to a solution of 8-([1,1':3',1"-terphenyl]-5'-yl)-10-nitro-9H-tetrabenzo[b,d,f,h]azonine (2.8 g, 4.72 mmol) and hydrazine hydrate (11.82 g, 236 mmol) in a mixed solvent system of ethanol (100 mL) and $CH_2Cl_2$ (20 mL). The reaction mixture was heated to reflux for 3 hours. After cooling down, the reaction mixture was filtered through Celite, and washed with $CH_2Cl_2$ (20 ml×5). The solvents were removed, and the residue was purified by column chromatography to give an off-white solid product (1.35 g, 50%).

Synthesis of 10-([1,1':3',1"-terphenyl]-5'-yl)-N-(3-((9-(4-(tert-butyl)pyridin-2-yl)-9H-carbazol-2-yl)oxy)phenyl)-9H-tetrabenzo[b,d,f,h]azonin-8-amine

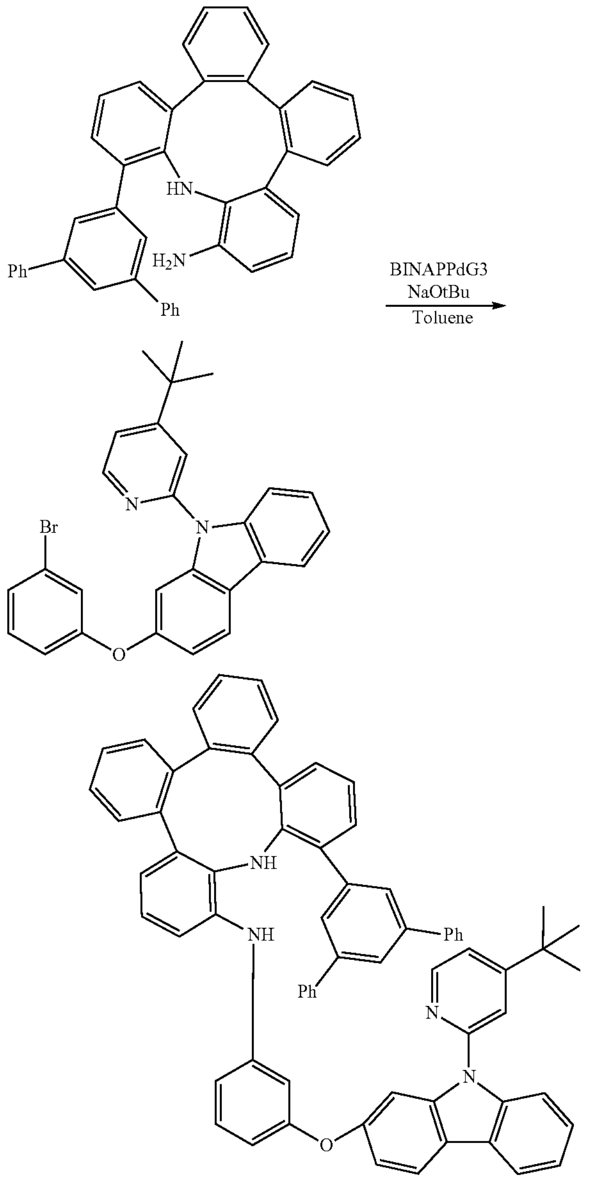

A mixture of 10-([1,1':3',1"-terphenyl]-5'-yl)-9H-tetrabenzo[b,d,f,h]azonin-8-amine (1.5 g, 2.67 mmol), 2-(3-bromophenoxy)-9-(4-(tert-butyl)pyridin-2-yl)-9H-carbazole (1.519 g, 2.93 mmol) and BINAPPdG3 (0.132 g, 0.133 mmol) in anhydrous toluene was sparged with nitrogen for 30 min. Then, sodium 2-methylpropan-2-olate (0.512 g, 533 mmol) was added, and sparging continued for 10 min. The reaction was then refluxed for 20 hours. The reaction was quenched with saturated ammonium chloride (20 mL) and diluted with ethyl acetate (20 mL). The resulting slurry was filtered through a plug of Celite (0.5"). The organic layer was separated, and the aqueous layer was extracted with ethyl acetate (2×20 mL). The combined organic layers were washed with saturated brine (50 mL), dried over anhydrous sodium sulfate (12 g) and concentrated. The residue was purified by column chromatography to give an off-white solid (2.32 g, 89%).

Synthesis of 3-([1,1':3',1"-terphenyl]-5'-yl)-1-(3-((9-(4-(tert-butyl)pyridin-2-yl)-9H-carbazol-2-yl)oxy)phenyl)-1H-1,2a-diazatribenzo[4,5:6,7:8,9]cyclonona[1,2,3-cd]inden-2a-ium

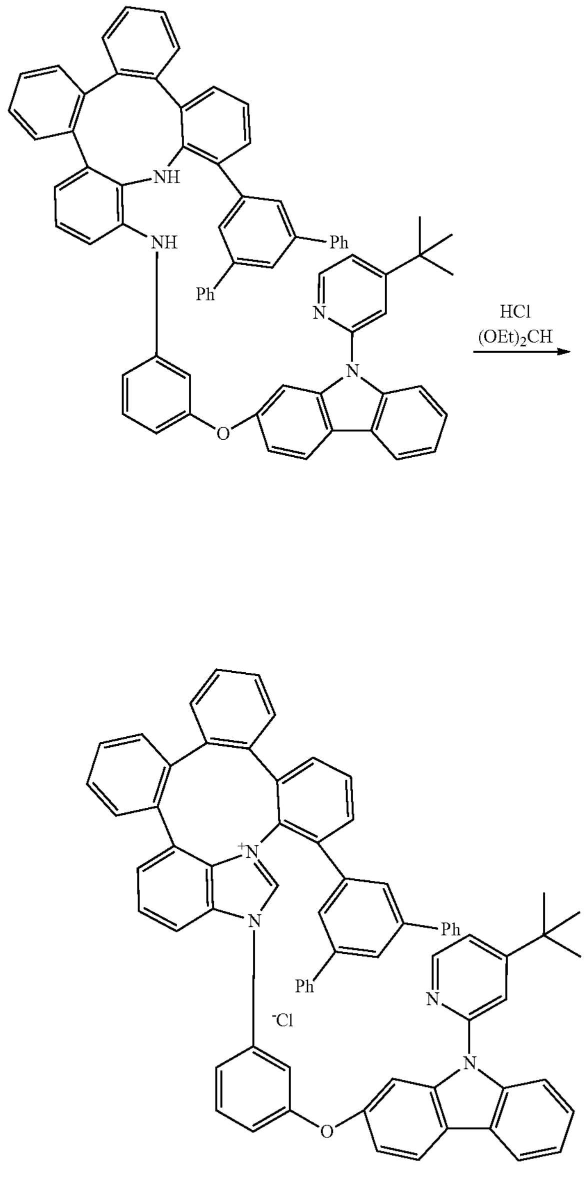

HCl (0.118 ml, 3.89 mmol) was added to a solution of 10-([1,1':3',1"-terphenyl]-5'-yl)-N-(3-((9-(4-(tert-butyl)pyridin-2-yl)-9H-carbazol-2-yl)oxy)phenyl)-9H-tetrabenzo[b,d,f,h]azonin-8-amine (2.32 g, 2.434 mmol) in triethyl orthoformate (20.26 ml, 122 mmol). The reaction was heated at 100° C. for 16 hours. The volatiles were removed under reduced pressure and the residue was triturated with warm hexanes (2×25 mL) to give an off-white solid (2.35 g, 85% yield).

Synthesis of Emitter 12

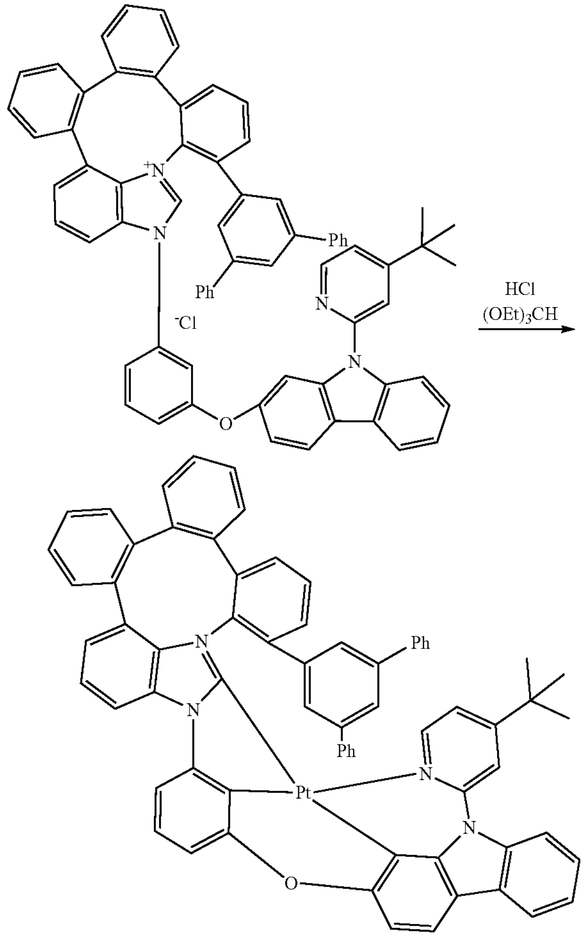

A mixture of potassium tetrachloroplatinate (0.228 g, 0.550 mmol), 3-([1,1':3',1"-terphenyl]-5'-yl)-1-(3-((9-(4-(tert-butyl)pyridin-2-yl)-9H-carbazol-2-yl)oxy)phenyl)-1H-1,2a-diazatribenzo[4,5:6,7:8,9]cyclonona [1,2,3-cd]inden-2a-ium chloride (0.5 g, 0.500 mmol) and 2,6-dimethylpyridine (0.190 ml, 1.651 mmol) in AcOH (10.00 ml) was sparged with nitrogen for 40 min. The reaction was refluxed at 120° C. overnight. The reaction mixture was diluted with water and the aqueous layer was extracted with DCM several times. The organic layers were combined, dried, and concentrated, and the residue was purified by column chromatography to give a yellow solid (1.6 g, 73%).

Device Data

For comparing the performance of some inventive compound examples against Comparative Compound in OLED application, eight OLED devices were fabricated. OLED 1 through OLED 7 contained the inventive compound examples Emitter 2, Emitter 3, Emitter 6, Emitter 4, Emitter 5, and Emitter 7, respectively, as their emitter compound and OLED 8 contained the Comparative Compound as its emitter compound. The device performance data is presented in Table 1 below.

The OLEDs were grown on a glass substrate pre-coated with an indium-tin-oxide (ITO) layer having a sheet resistance of 15-Ω/sq. Prior to any organic layer deposition or coating, the substrate was degreased with solvents and then treated with an oxygen plasma for 1.5 minutes with 50 W at 100 mTorr and with UV ozone for 5 minutes.

The OLEDs were fabricated in high vacuum (<$10^{-6}$ Torr) by thermal evaporation. The anode electrode was 750 Å of indium tin oxide (ITO). The device example had organic layers consisting of, sequentially, from the ITO surface, 100 Å of Compound 1 (HIL), 250 Å of Compound 2 (HTL), 50A of Compound 3 (EBL), 300 Å of Compound 3 doped 50% of Compound 4 and 12% of emitter (EML), 50 Å of Compound 4 (BL), 300 Å of Compound 5 doped with 35% of Compound 6 (ETL), 10 Å of Compound 5 (EIL) followed by 1,000 Å of A1 (Cathode). All devices were encapsulated with a glass lid sealed with an epoxy resin in a nitrogen glove box (<1 ppm of $H_2O$ and $O_2$) immediately after fabrication with a moisture getter incorporated inside the package. Doping percentages are in volume percent.

TABLE 1

Summary of OLED performance

| | | 1931 CIE | | at 10 mA/cm$^2$ | | | |
|---|---|---|---|---|---|---|---|
| Device | emitter compound | x | y | λ max [nm] | FWHM [nm] | Voltage [V] | EQE [%] |
| OLED 1 | 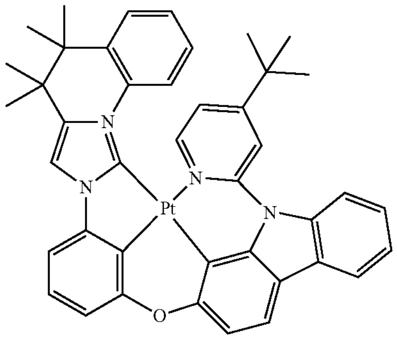 Emitter 2 | 0.186 | 0.328 | 467 | 58 | 1.08 | 1.36 |
| OLED 2 | 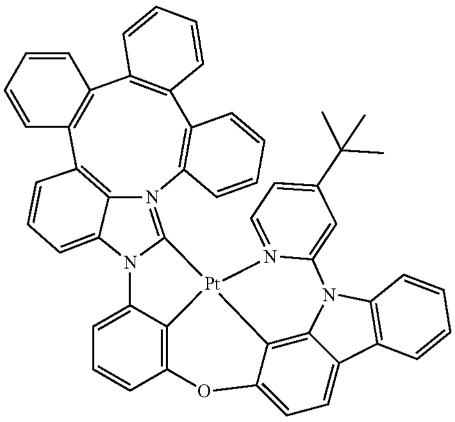 Emitter 3 | 0.150 | 0.190 | 461 | 39 | 0.96 | 1.63 |
| OLED 3 | 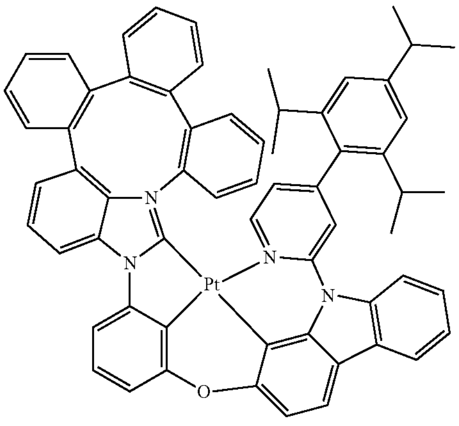 Emitter 6 | 0.133 | 0.184 | 466 | 37 | 0.95 | 2.12 |

TABLE 1-continued
| Summary of OLED performance | | | | | | | |
|---|---|---|---|---|---|---|---|
| | | 1931 CIE | | at 10 mA/cm$^2$ | | | |
| Device | emitter compound | x | y | λ max [nm] | FWHM [nm] | Voltage [V] | EQE [%] |
| OLED 4 | 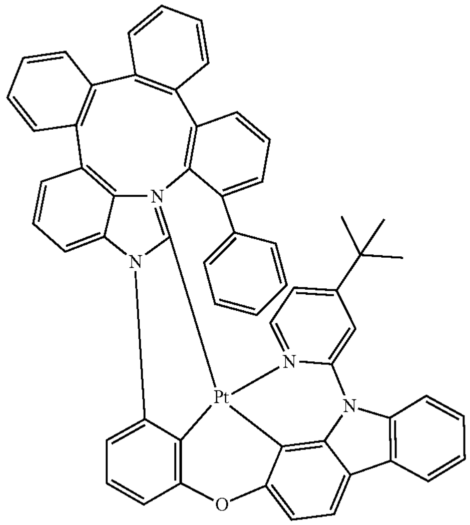 Emitter 4 | 0.144 | 0.178 | 461 | 36 | 0.98 | 1.85 |
| OLED 5 | 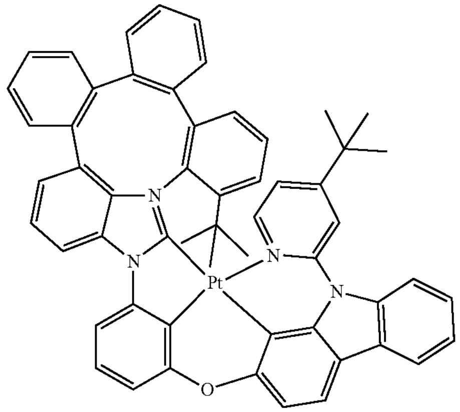 Emitter 5 | 0.145 | 0.144 | 457 | 21 | 0.92 | 1.78 |

TABLE 1-continued
| Summary of OLED performance | | | | | | | |
|---|---|---|---|---|---|---|---|
| | | 1931 CIE | | at 10 mA/cm$^2$ | | | |
| Device | emitter compound | x | y | λ max [nm] | FWHM [nm] | Voltage [V] | EQE [%] |
| OLED 6 | 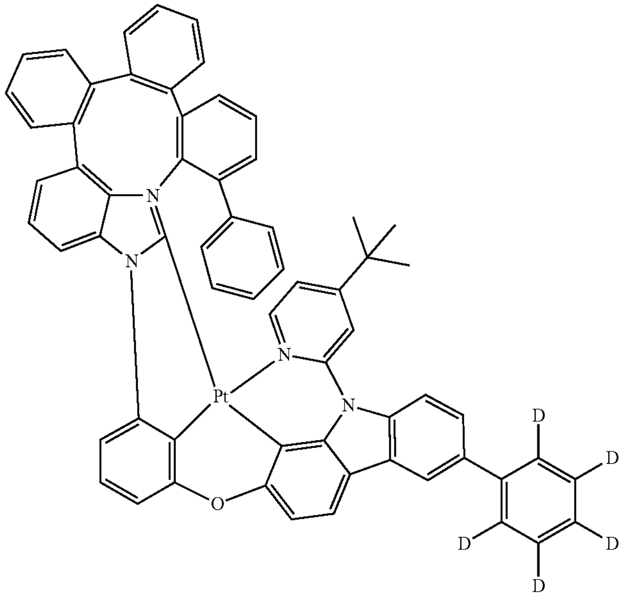 Emitter 7 | 0.137 | 0.154 | 462 | 20 | 0.97 | 2.11 |
| OLED 7 | 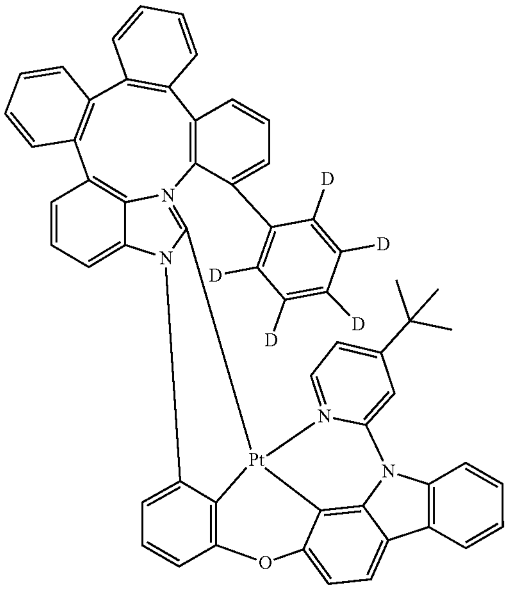 Emitter 13 | 0.142 | 0.156 | 461 | 21 | 0.98 | 2.05 |

TABLE 1-continued
Summary of OLED performance
| Device | emitter compound | 1931 CIE x | y | at 10 mA/cm² λ max [nm] | FWHM [nm] | Voltage [V] | EQE [%] |
|---|---|---|---|---|---|---|---|
| OLED 8 | 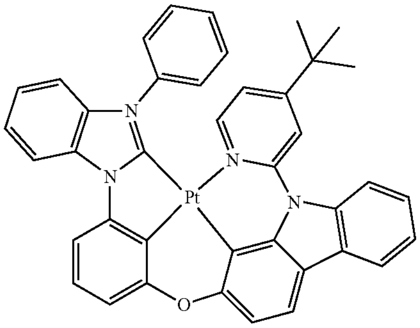 Comparative Compound | 0.175 | 0.280 | 465 | 53 | 1.00 | 1.00 |
Compounds utilized in the device are the following:
Compound 1
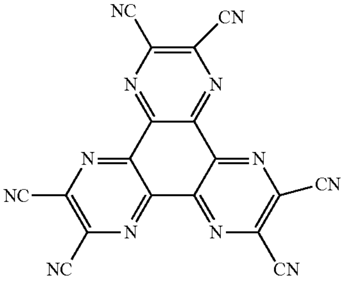
Compound 2
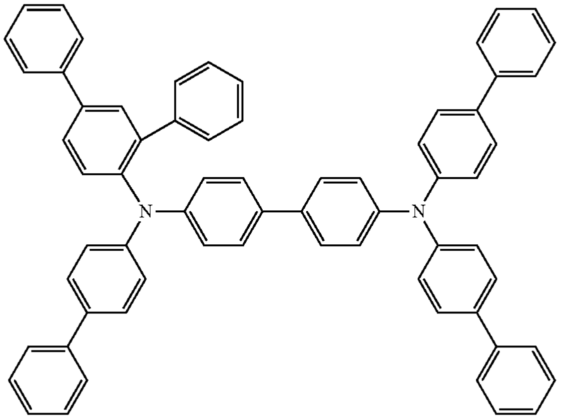
-continued
Compound 3
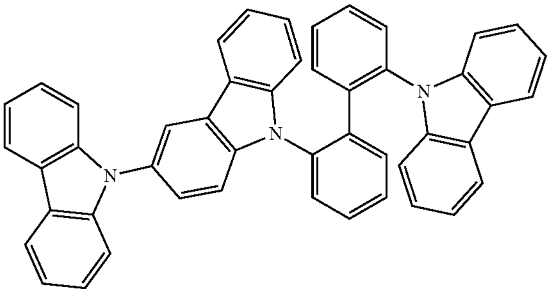
Compound 4
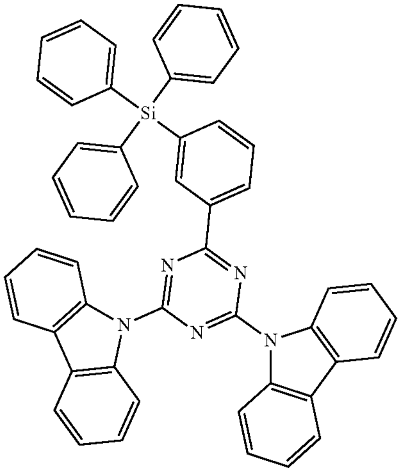
Compound 5
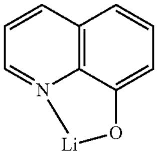

-continued

Compound 6

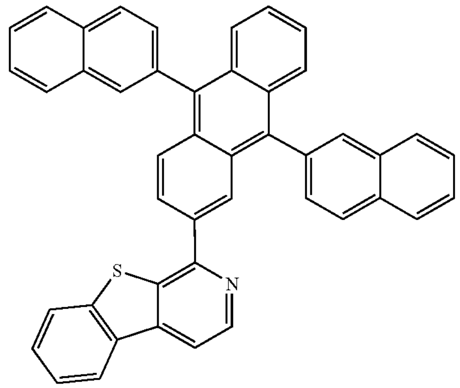

This application discloses platinum N-heterocyclic carbene (NHC) complexes which feature a carbene-N substituent that is connected or "strapped" to the back portion of the NHC. Strapping the carbene-N substituent results in greatly improved photophysical properties and device performance over the comparative compound in which the carbene-N phenyl substituent is not strapped to the carbene. In most cases the spectral shape is much narrower for the strapped NHCs over the comparative compound which allows for improved color purity. In general, the FWHM of the emission spectrum of a phosphorescent emitter complex is broad, normally above 50 nm as shown in the comparative example here. It has been a long-sought goal to achieve the narrow FWHM. The narrower FWHM, the better color purity for the display application. In the OLED researches of the past, narrowing line-shape has been achieved slowly nanometer by nanometer. As can be seen here, the current inventive compounds with the strapping can significantly reduce the FWHM number to below 40 nm, or even 30 nm. The inventive compounds have also blue shifted to more desirable bluer color, which can make the device more efficient with purer color. Another remarkable improvement is that the strapping compounds improve the device efficiency by nearly two-fold for almost all examples. Such improvement is considered to be huge and is a significant step towards commercialization of these inventive emitters. Based on the fact that the inventive compounds examples (Emitter 2, Emitter 3, Emitter 4, Emitter 5, Emitter 6, Emitter 7, Emitter 13) have similar structured as the Comparative Compound with the only difference being the additional strapped moiety, the significant performance improvement observed in the above data was unexpected.

What is claimed is:

1. A compound comprising a ligand $L_A$ of Formula II,

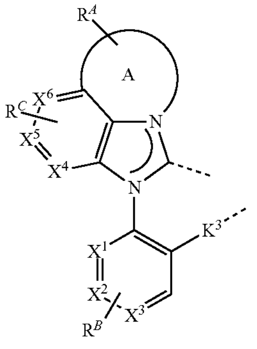

wherein:

ring A is independently a 5-membered to 10-membered heterocyclic ring;

$X^1$-$X^6$ are each independently C or N;

$K^3$ is a direct bond, O, or S;

$R^A$, $R^B$, and $R^C$ each independently represent zero, mono, or up to the maximum allowed number of substitutions to its associated ring; and each of $R^A$, $R^B$, $R^C$ is independently a hydrogen or a substituent selected from the group consisting of deuterium, halogen, alkyl, cycloalkyl, heteroalkyl, heterocycloalkyl, arylalkyl, alkoxy, aryloxy, amino, silyl, germyl, boryl, selenyl, alkenyl, cycloalkenyl, heteroalkenyl, alkynyl, aryl, heteroaryl, acyl, carboxylic acid, ether, ester, nitrile, isonitrile, sulfanyl, sulfinyl, sulfonyl, phosphino, and combinations thereof, wherein:

the ligand $L_A$ is complexed to a metal M through the two indicated dashed lines;

M is Ir, Rh, Re, Ru, Os, Pt, Pd, Ag, Au, or Cu, and can be coordinated to other ligands;

the ligand $L_A$ can be joined with other ligands to form a tridentate, tetradentate, pentadentate, or hexadentate ligand; and any two $R^A$, $R^B$, $R^C$, or $R^1$ can be joined or fused to form a ring.

2. The compound of claim 1, wherein each $R^A$ and $R^B$ is independently a hydrogen or a substituent selected from the group consisting of deuterium, fluorine, alkyl, cycloalkyl, heteroalkyl, alkoxy, aryloxy, amino, silyl, boryl, alkenyl, cycloalkenyl, heteroalkenyl, aryl, heteroaryl, nitrile, isonitrile, sulfanyl, and combinations thereof.

3. The compound of claim 1, wherein $X^1$-$X^3$ are each C, and/or wherein $X^4$-$X^6$ are each C.

4. The compound of claim 1, wherein any two $R^A$ substituents are joined to form a fused ring to ring A.

5. The compound of claim 1, wherein two pairs of $R^A$ substituents are joined to form two fused rings to ring A when ring A is a 7-membered, 8-membered, 9-membered, or 10-membered ring.

6. The compound of claim 1, wherein the compound has a structure of Formula IV:

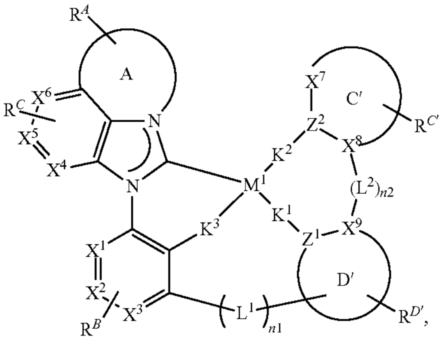

wherein:

$M^1$ is Pd or Pt;

moieties C' and D' are each independently a monocyclic or polycyclic ring structure comprising 5-membered and/or 6-membered carbocyclic or heterocyclic rings;

$Z^1$ and $Z^2$ are each independently C or N;

$K^1$, $K^2$, and $K^3$ are each independently selected from the group consisting of a direct bond, O, and S, wherein at least two of $K^1$, $K^2$, or $K^3$ are direct bonds;

$L^1$, $L^2$, and $L^3$ are each independently selected from the group consisting of a direct bond, BR, BRR', NR, PR, O, S, Se, C=O, S=O, $SO_2$, CRR', C=Se, C=CRR', C=NR, P(O)R', SiRR', GeRR', alkyl, cycloalkyl, and combinations thereof, wherein at least one of $L^1$ and $L^2$ is present;

n1, n2, and n3 each are 0 or 1 with n1+n2+n3=2 or 3;

$X^7$-$X^9$ are each independently C or N;

$R^{C'}$ and $R^{D'}$ each independently represents zero, mono, or up to the maximum allowed number of substitutions to its associated ring;

each of $R^{C'}$, and $R^{D'}$ is independently a hydrogen or a substituent selected from the group consisting of deuterium, fluorine, alkyl, cycloalkyl, heteroalkyl, alkoxy, aryloxy, amino, silyl, boryl, alkenyl, cycloalkenyl, heteroalkenyl, aryl, heteroaryl, nitrile, isonitrile, sulfanyl, and combinations thereof;

any two $R^A$, $R^B$, $R^{C'}$, $R^{D'}$, or $R^1$ can be joined or fused together to form a ring where chemically feasible; and $X^1$-$X^6$, $R^A$, $R^B$ and ring A are all the same as previously defined.

7. The compound of claim 6, wherein moiety C' and moiety D' are both 6-membered aromatic rings; or wherein moiety C' is a 5-membered or 6-membered heteroaromatic ring.

8. The compound of claim 6, wherein $L^1$ is O, SiRR', or CRR'.

9. The compound of claim 6, wherein $Z^2$ is N and $Z^1$ is C; or wherein $Z^2$ is C and $Z^1$ is N.

10. The compound of claim 6, wherein $L^2$ is a direct bond, or NR'.

11. The compound of claim 6, wherein $K^1$, $K^2$, and $K^3$ are each direct bonds; or wherein one of $K^1$, $K^2$, or $K^3$ is O.

12. The compound of claim 6, wherein the compound has a structure of:

Formula VI

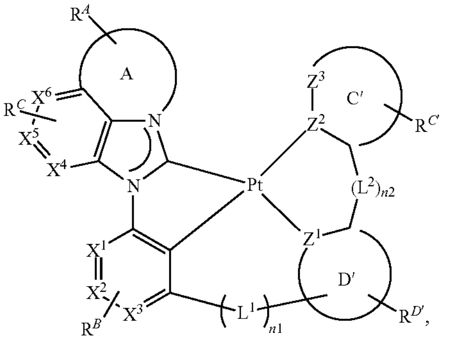

wherein $Z^3$ is C or N; the rest variables are the same as previously defined; and any two $R^A$, $R^B$, $R^{C'}$, $R^{D'}$, or $R^1$ can be joined or fused together to form a ring.

13. The compound of claim 6, wherein the compound is selected from the group consisting of:

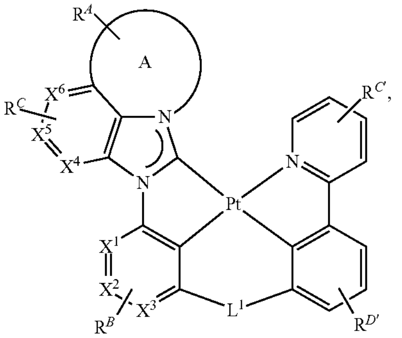

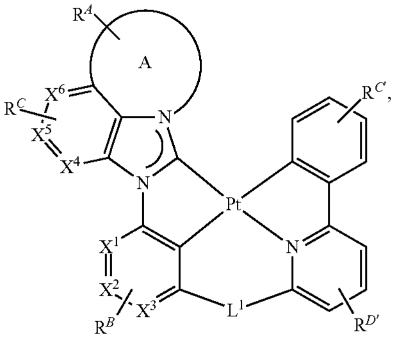

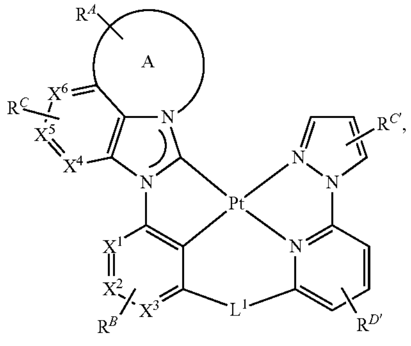

-continued
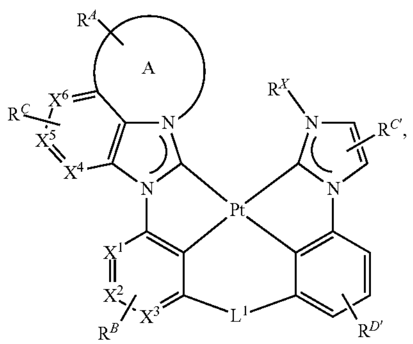
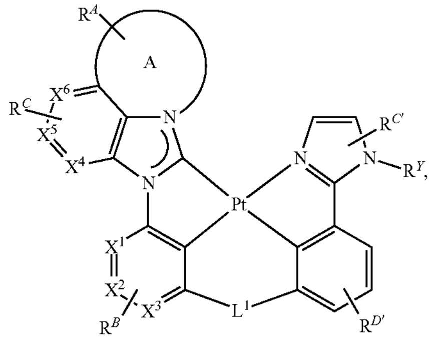
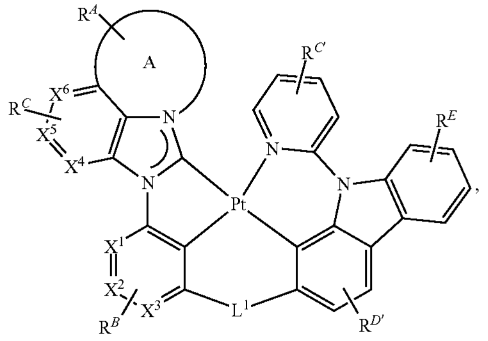
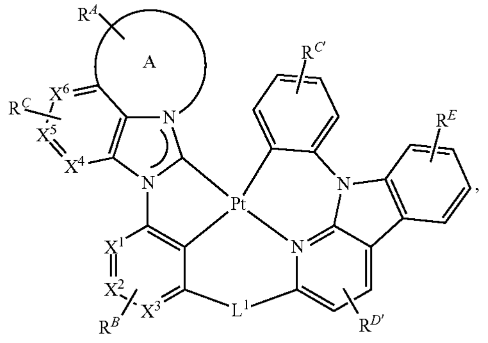
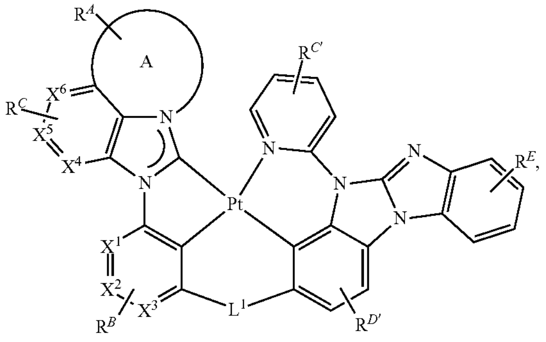
-continued
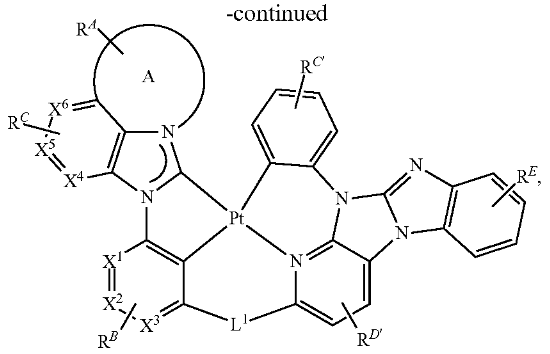
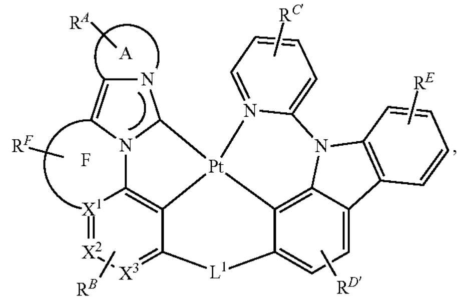
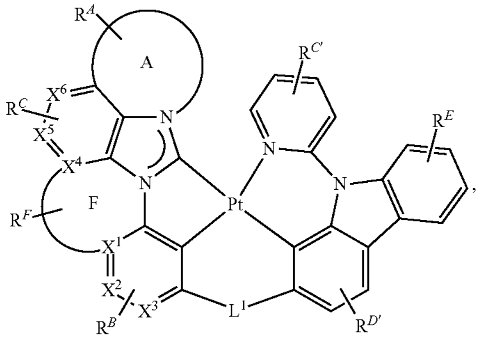
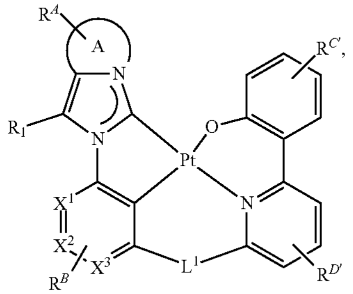
and
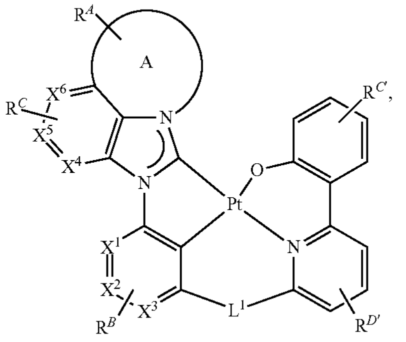
wherein:
$R^x$ and $R^y$ are each selected from the group consisting of alkyl, cycloalkyl, heteroalkyl, heterocycloalkyl, aryl, heteroaryl, and combinations thereof; and $R^G$ for each occurrence is independently a hydrogen or a substituent selected from the group consisting of deuterium, fluorine, alkyl, cycloalkyl, heteroalkyl, alkoxy, aryloxy, amino, silyl, boryl, alkenyl, cycloalkenyl, heteroalkenyl, aryl, heteroaryl, nitrile, isonitrile, sulfanyl, and combinations thereof.

14. The compound of claim 6, wherein the compound has a structure of

Formula VI

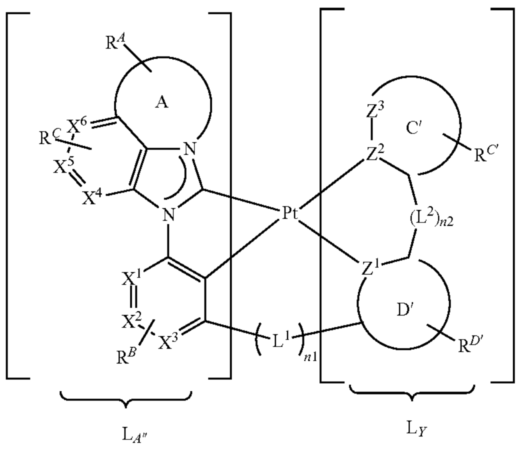

wherein $L_{A''}$ is selected from the group consisting of:

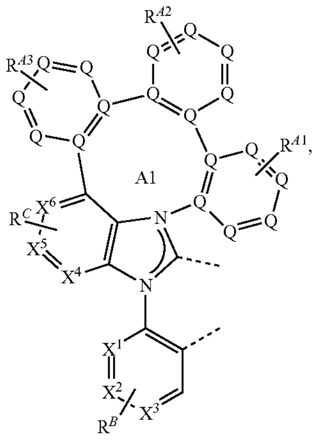

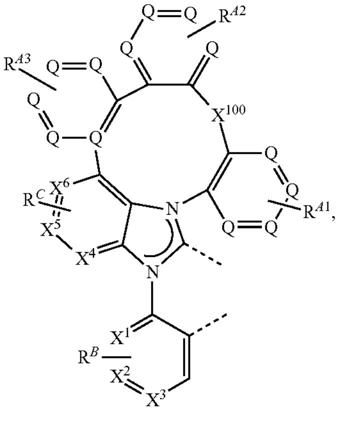

-continued

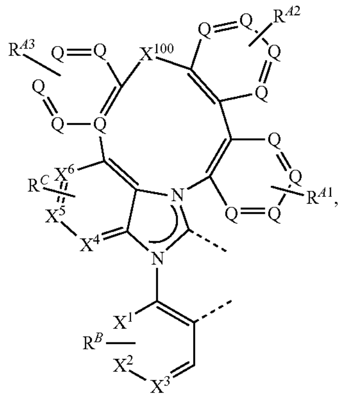

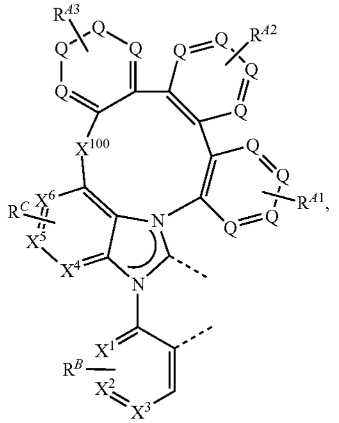

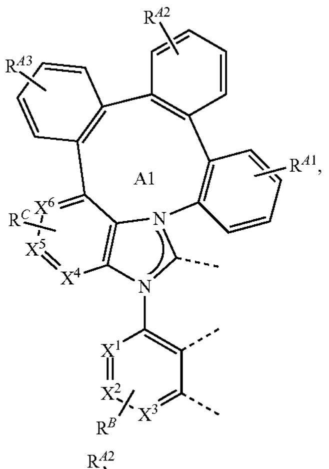

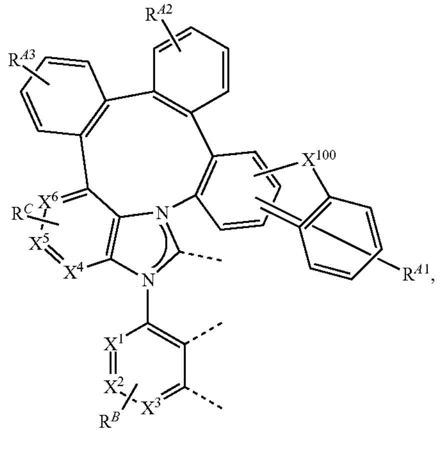

-continued
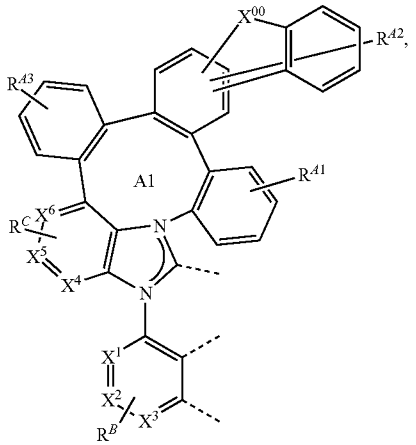
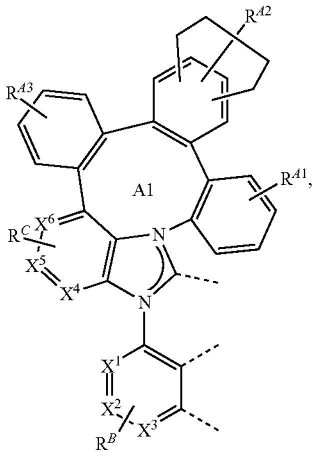
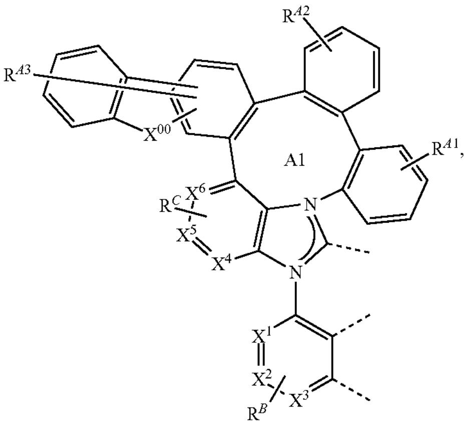
-continued
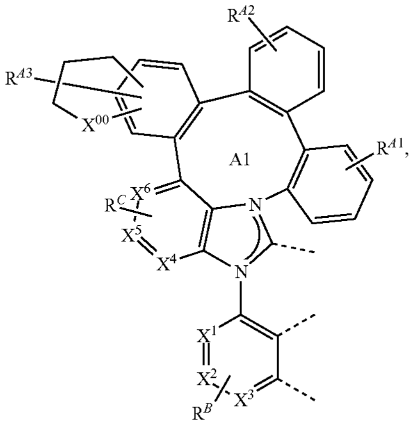
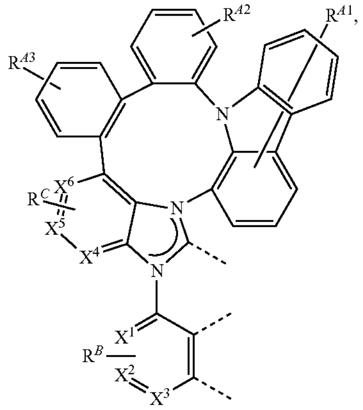
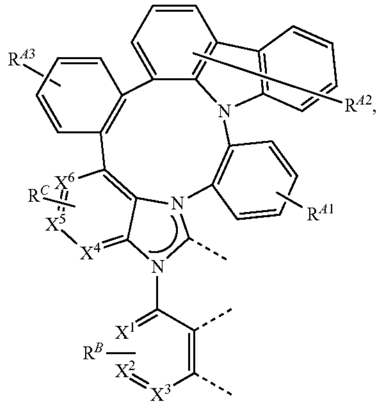
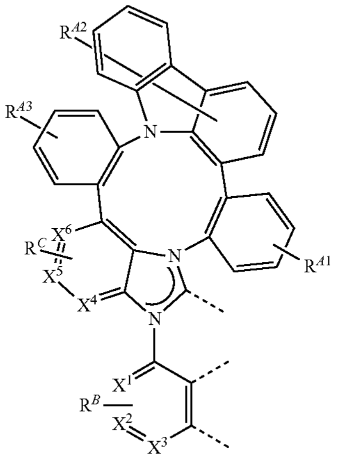

-continued

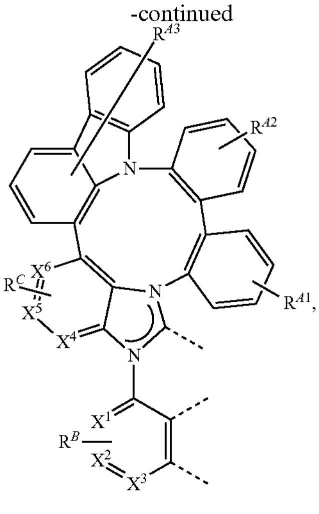

, and

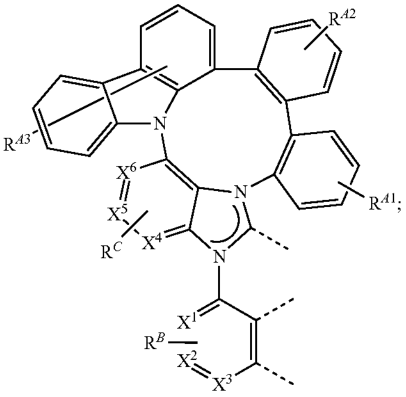

;

wherein:

each Q is independently C, N, B, Si, or O;

$X^{00}$ is NR, S, O, or Se;

for each occurrence, $X^{100}$ is independently BR, BRR', NR, PR, O, S, Se, C═O, S═O, $SO_2$, C═CRR', C═NR, CRR', SiRR', or GeRR';

each of $R^{A1}$, $R^{A2}$, and $R^{A3}$ independently represents zero, mono, or up to the maximum allowed number of substitutions;

each $R^{A1}$, $R^{A2}$, and $R^{A3}$ is independently a hydrogen or a substituent selected from the group consisting of deuterium, halogen, alkyl, cycloalkyl, heteroalkyl, heterocycloalkyl, arylalkyl, alkoxy, aryloxy, amino, silyl, germyl, boryl, selenyl, alkenyl, cycloalkenyl, heteroalkenyl, alkynyl, aryl, heteroaryl, acyl, carboxylic acid, ether, ester, nitrile, isonitrile, sulfanyl, sulfinyl, sulfonyl, phosphino, and combinations thereof; and any two substituents can be joined or fused to form a ring; and wherein $L_y$ is selected from the group consisting of the structures shown below:

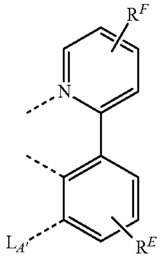

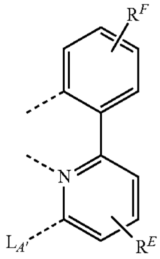

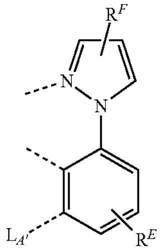

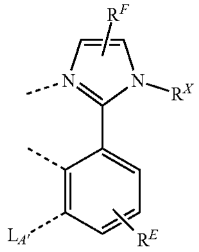

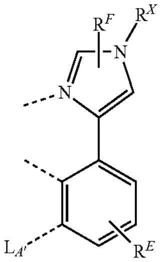

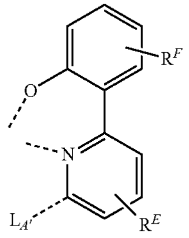

-continued
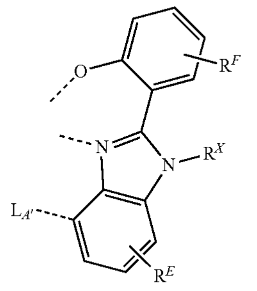
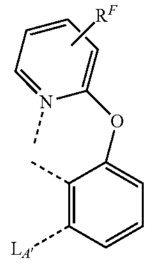
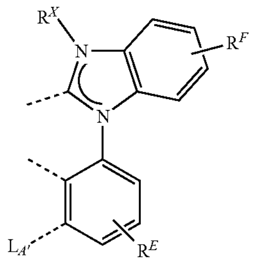
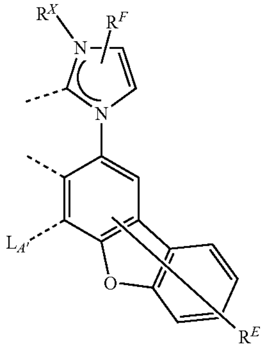
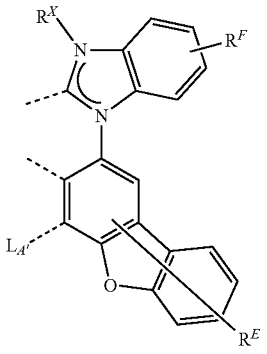
-continued
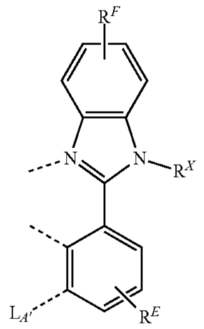
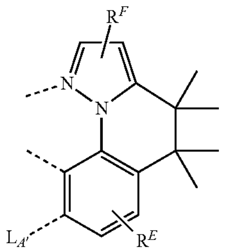
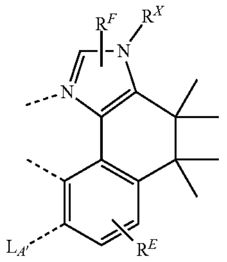
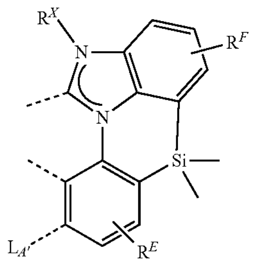
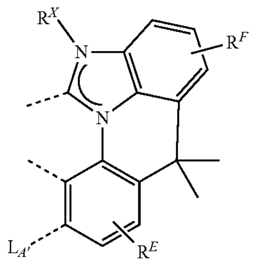
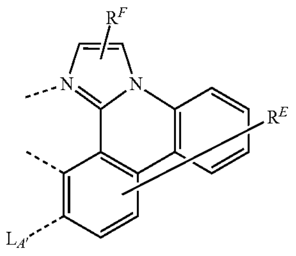

-continued
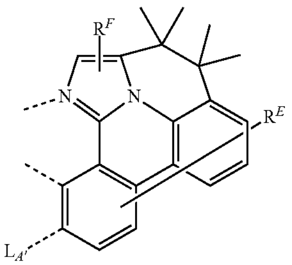
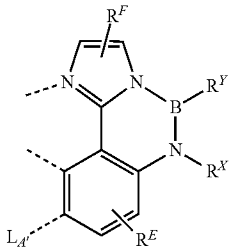
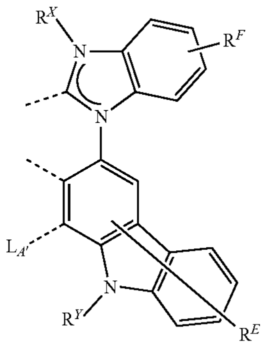
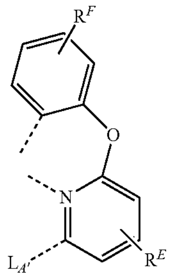
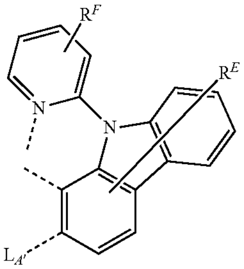
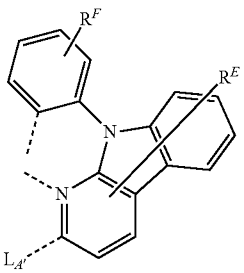
-continued
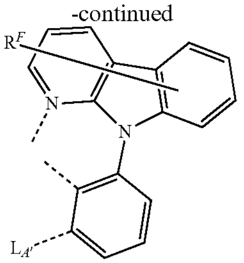
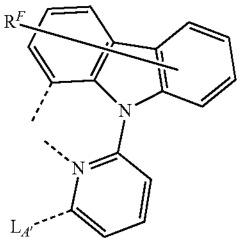
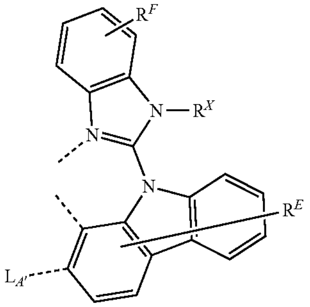
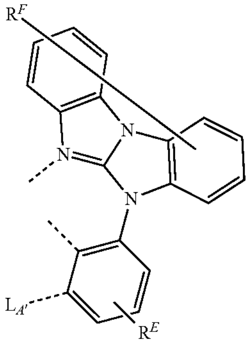
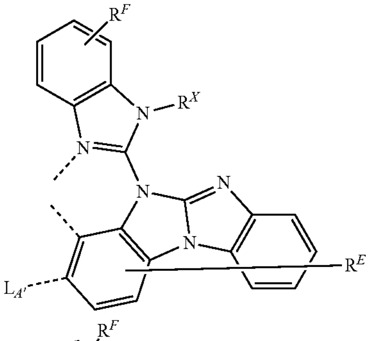
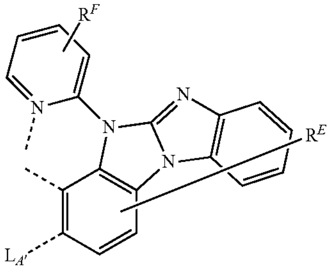

-continued
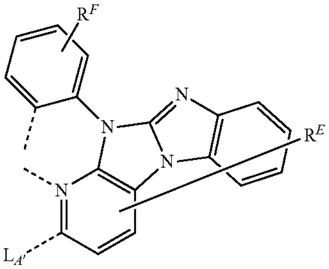
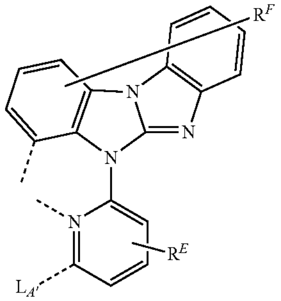
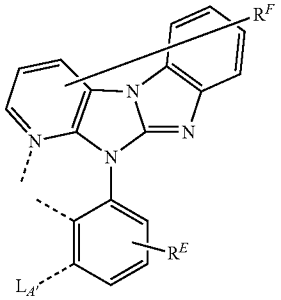
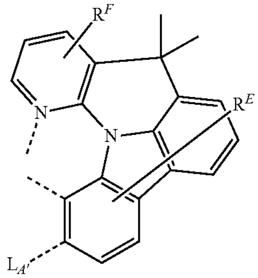
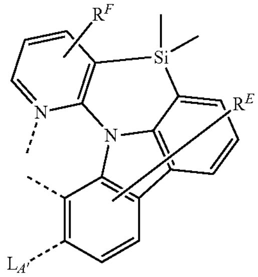
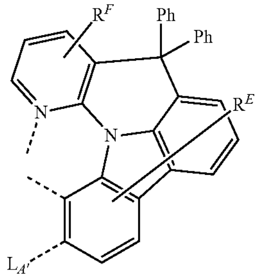
-continued
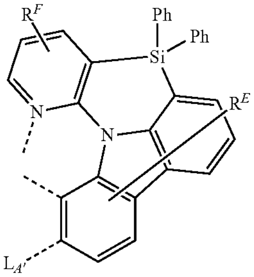
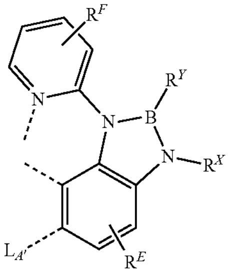
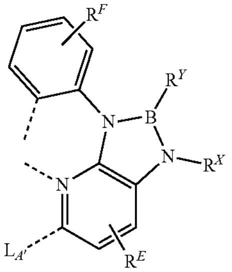
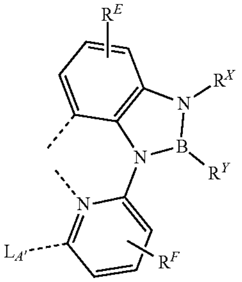
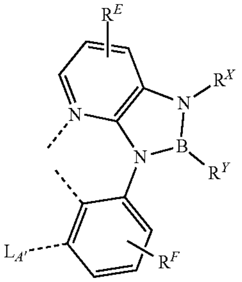

-continued
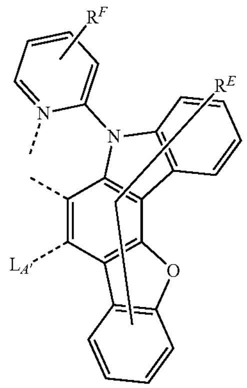
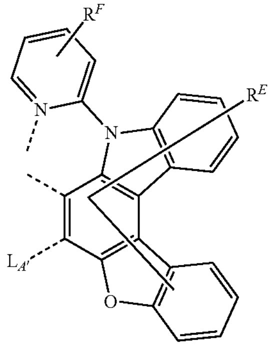
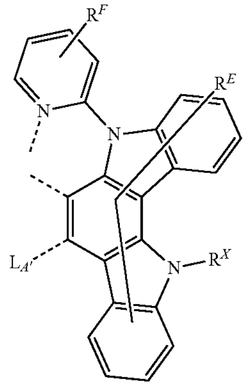
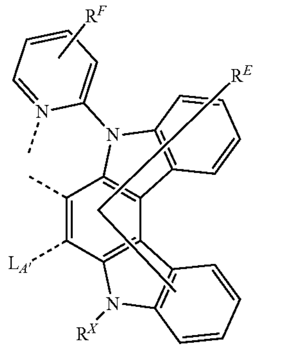
-continued
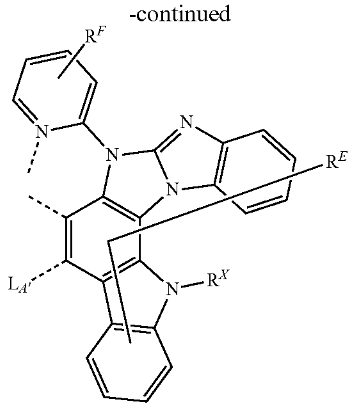
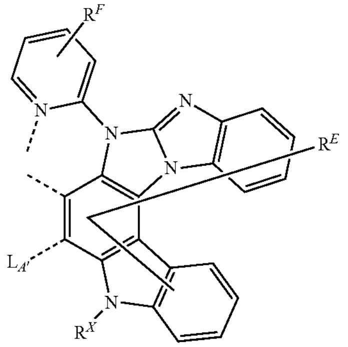
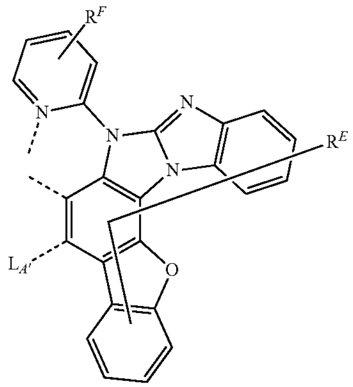
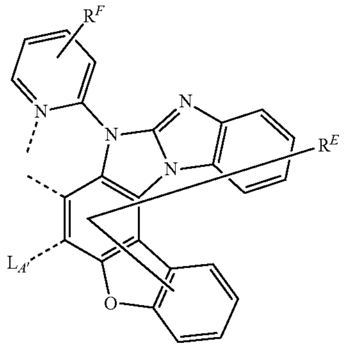
wherein each $R^E$, $R^F$, $R^X$, and $R^Y$ is independently selected from the list consisting of:

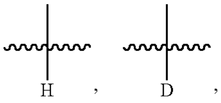, 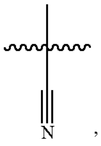, Me, iPr, tBu, $CD_3$,
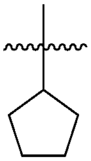, 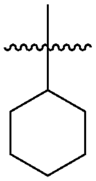, 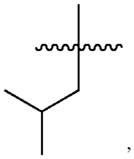, 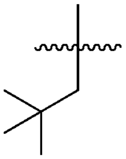,
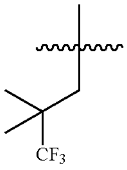, 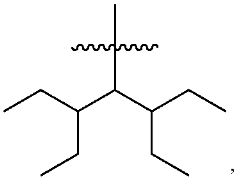, 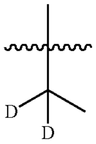,
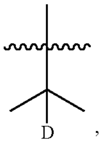, 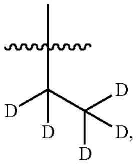, 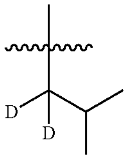, 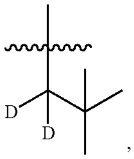,
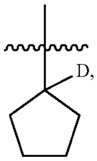 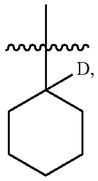 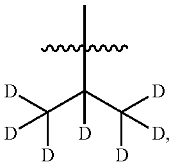 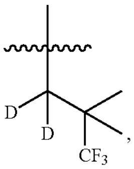,
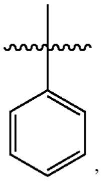, 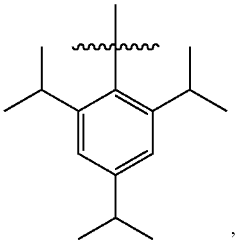,
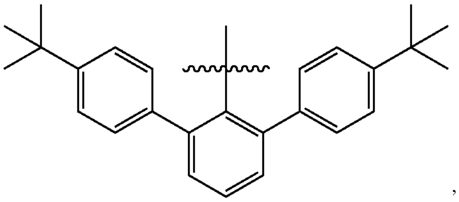,
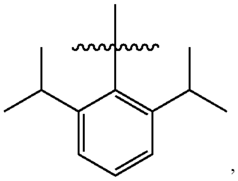, 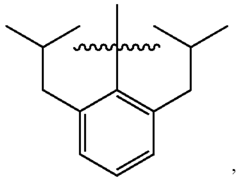,
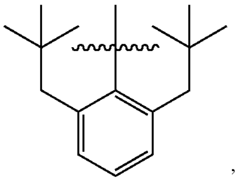, 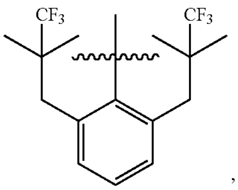,
-continued
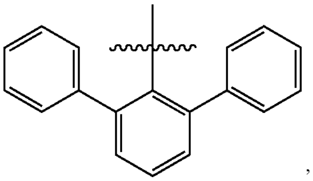,
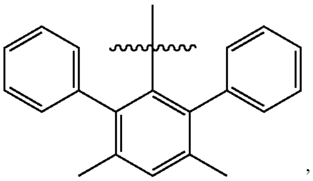,
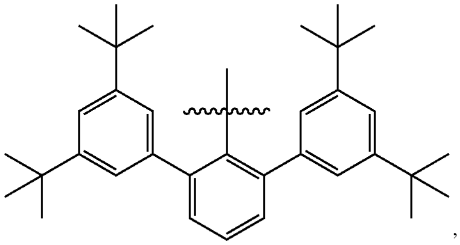,
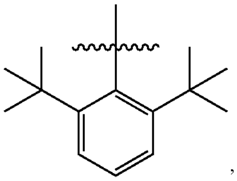, 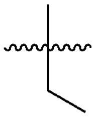, 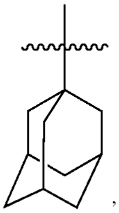,
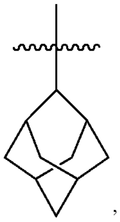, 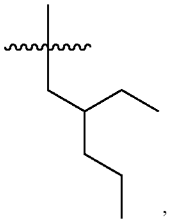, 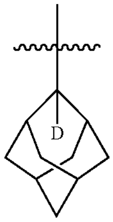,
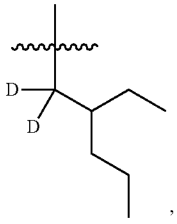 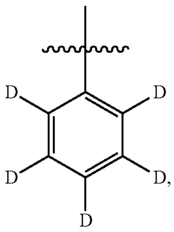 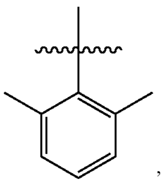,
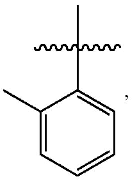, 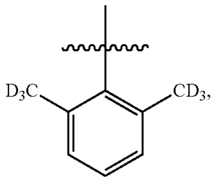 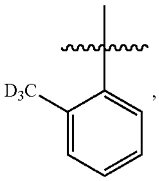,
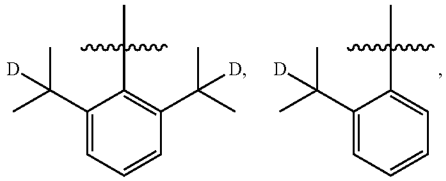, -continued
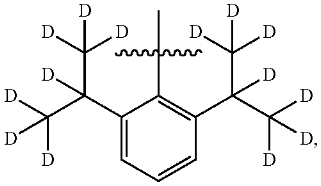
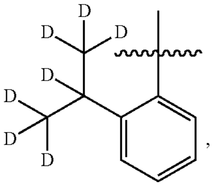
,
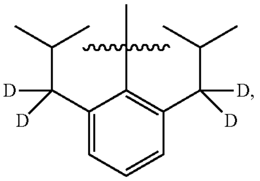
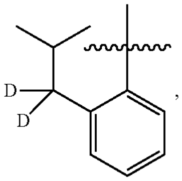
,
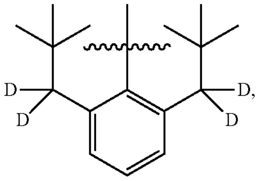
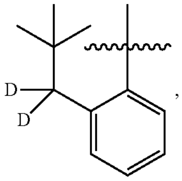
,
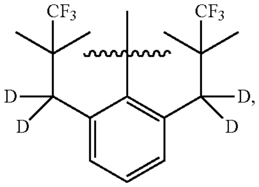
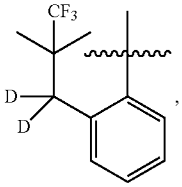
,
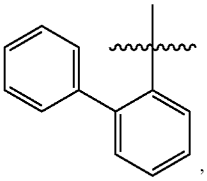
,
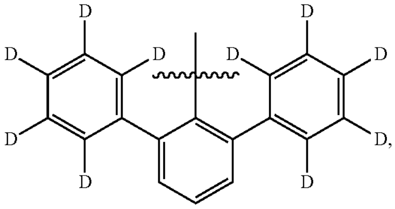
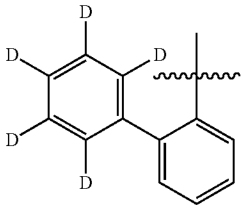
,
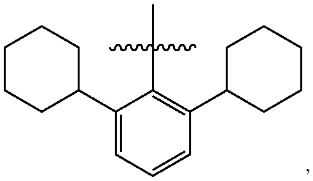
,
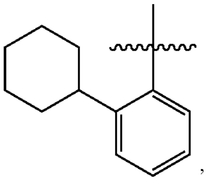
,
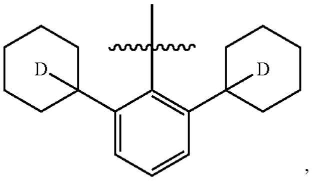
,
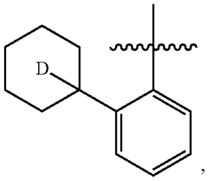
,
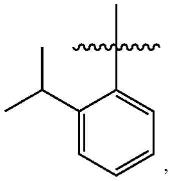
,
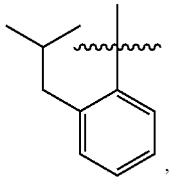
,
-continued
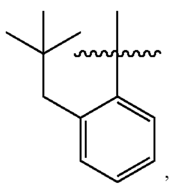
,
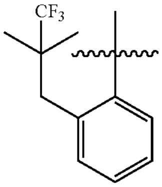
,
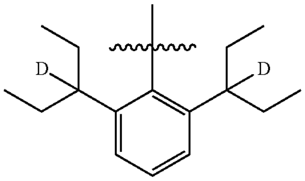
,
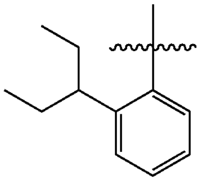
,
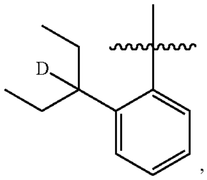
,
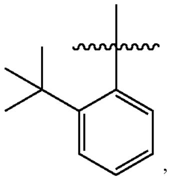
,
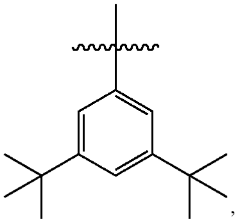
,
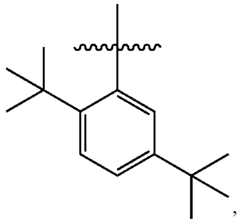
,
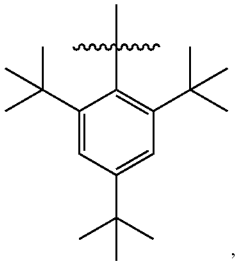
,
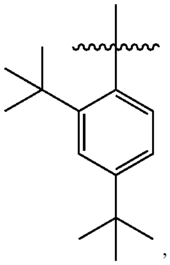
,
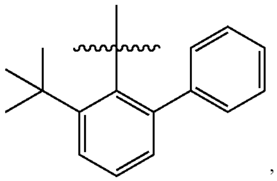
,
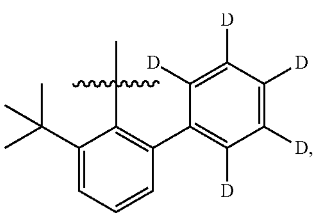
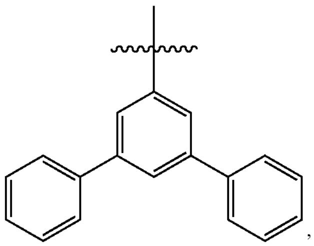
, -continued
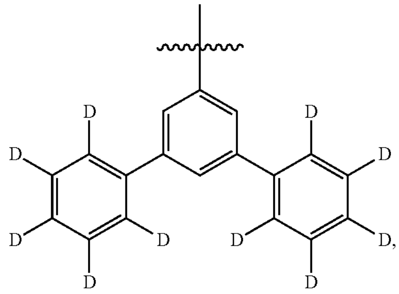
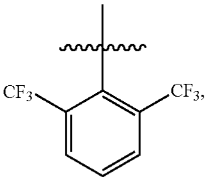
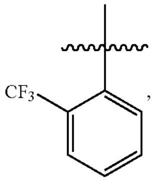
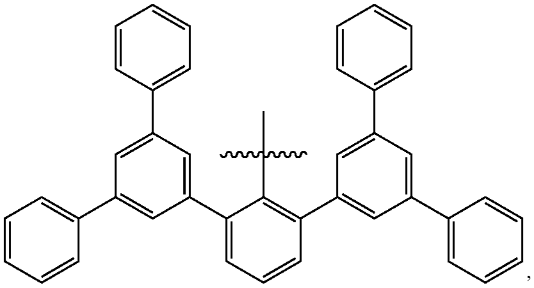
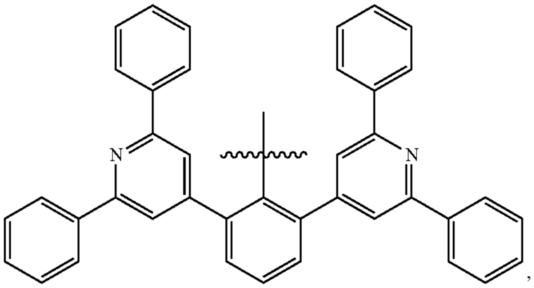
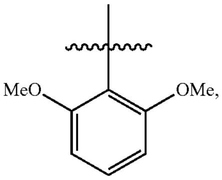
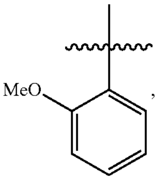
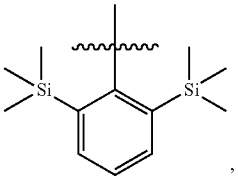
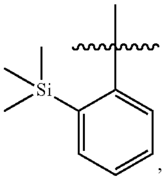
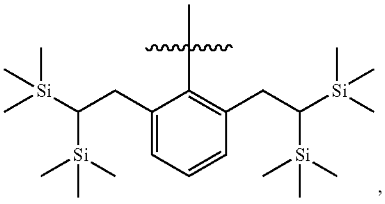
-continued
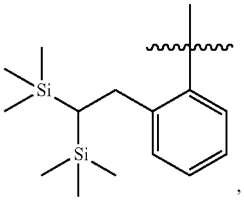
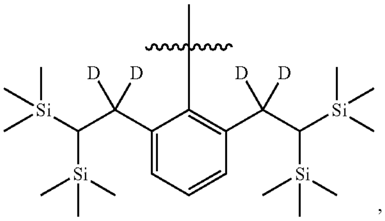
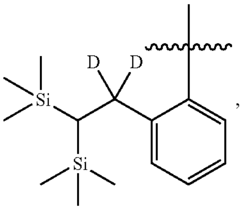
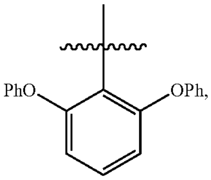
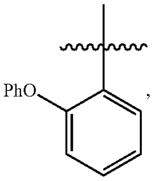
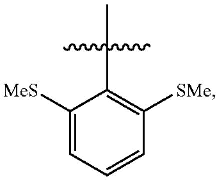
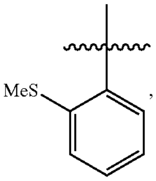
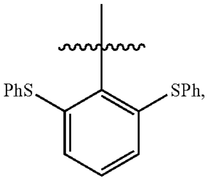
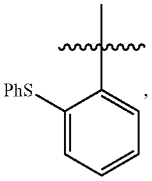
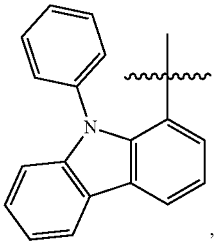
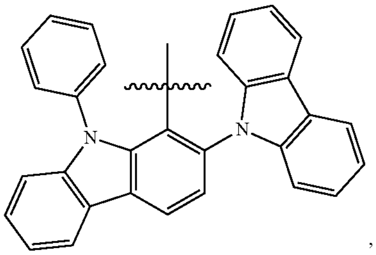
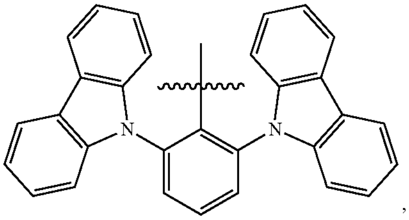

-continued
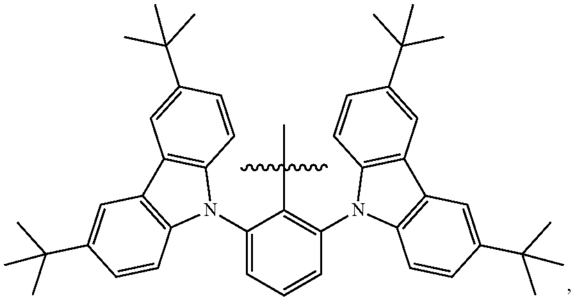,
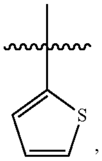, 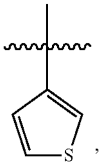, 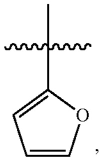, 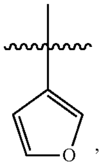,
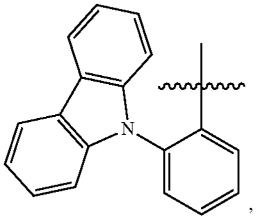,
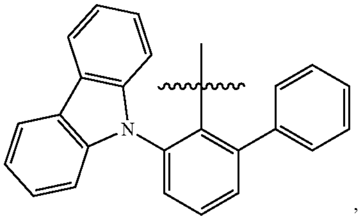,
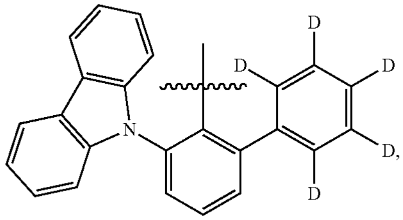
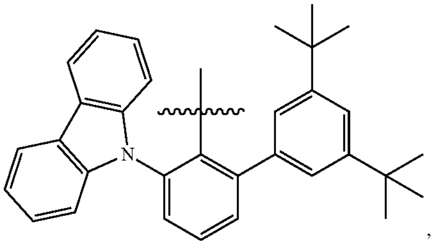,
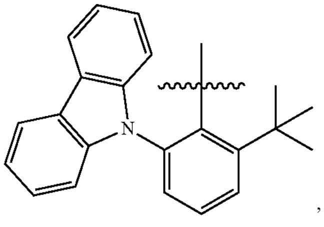,
-continued
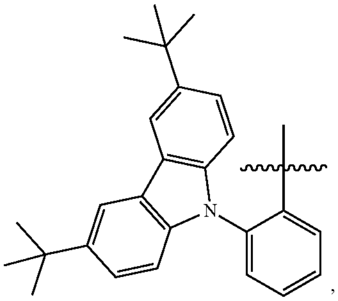,
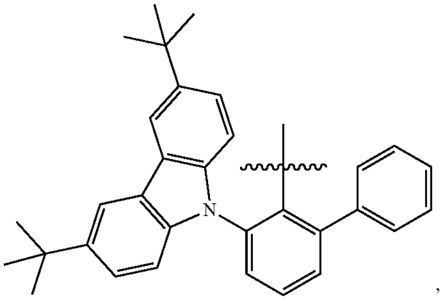,
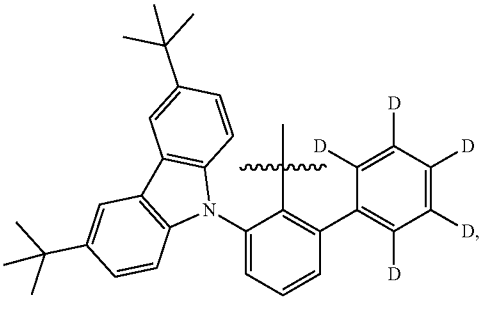
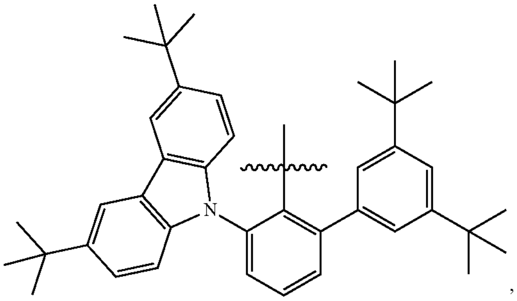,
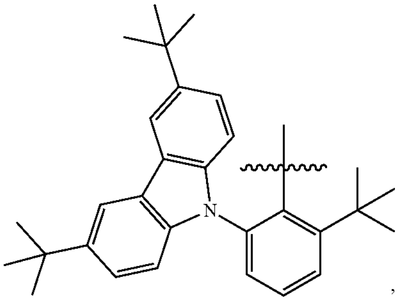, -continued
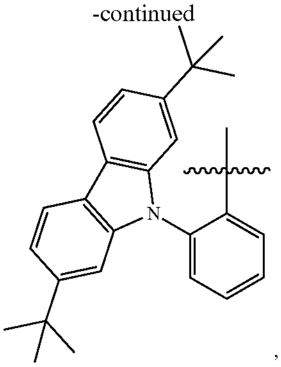
,
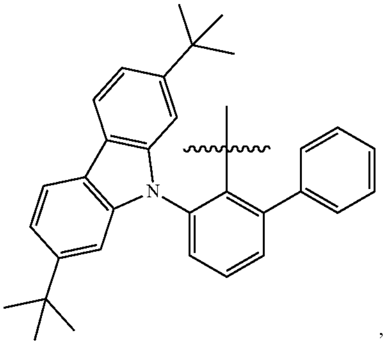
,
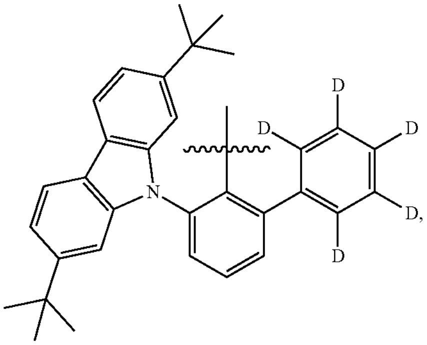
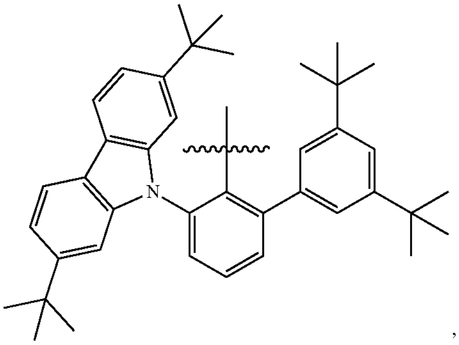
,
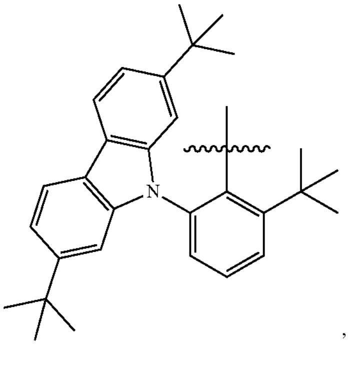
,
-continued
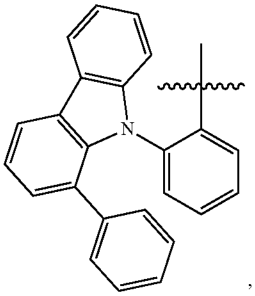
,
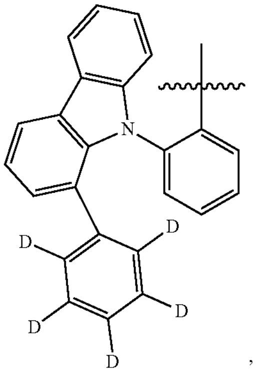
,
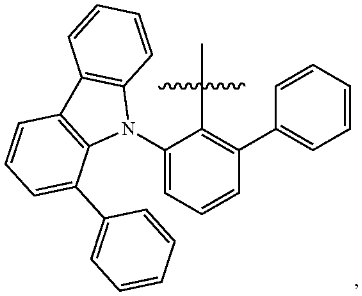
,
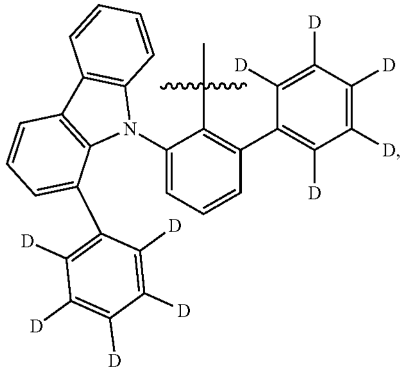
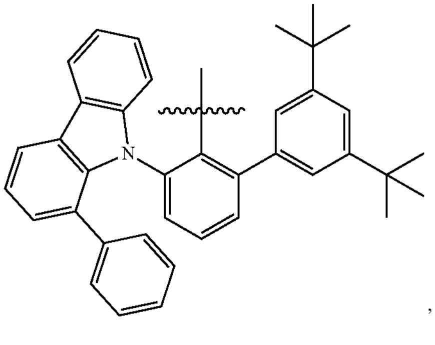
,

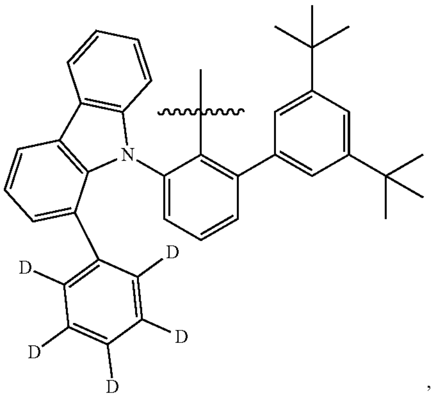
,
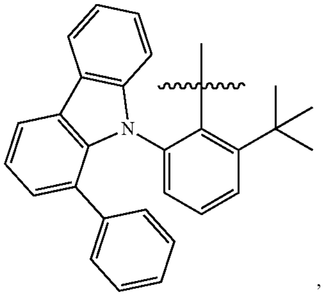
,
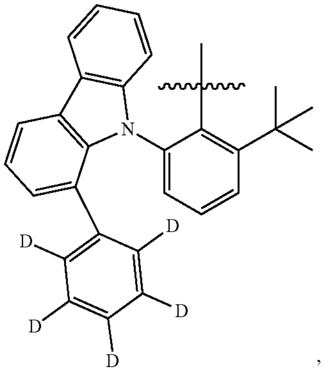
,
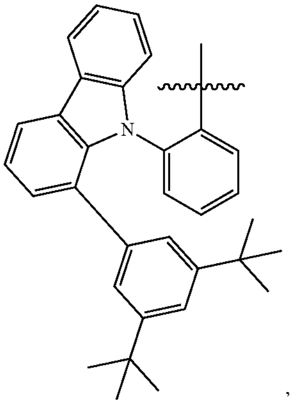
,
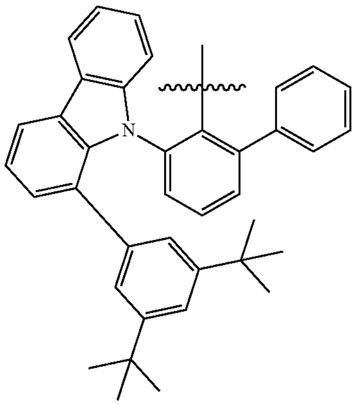
,
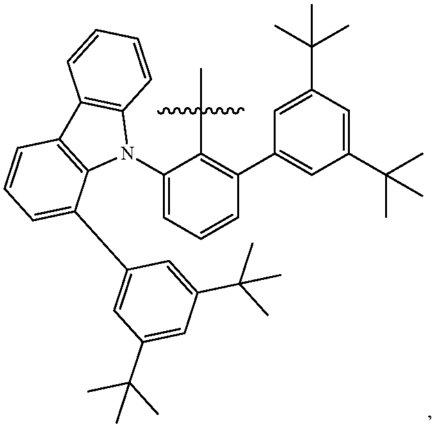
,
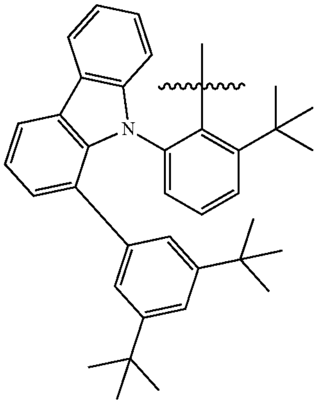
,
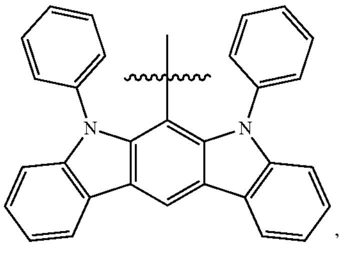
, -continued
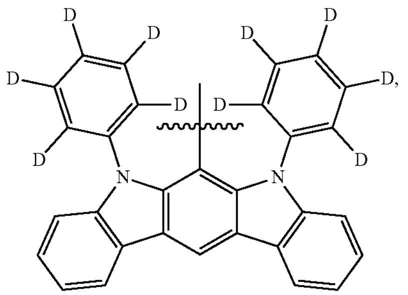
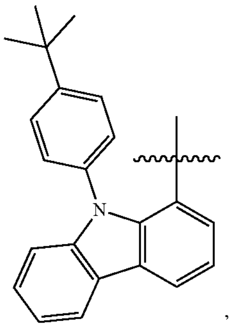
,
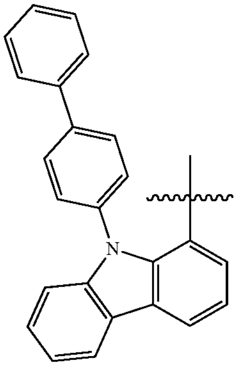
,
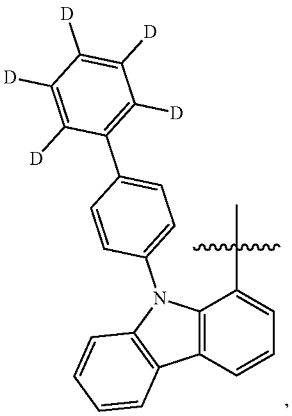
,
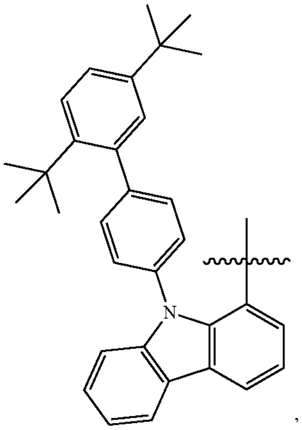
,
-continued
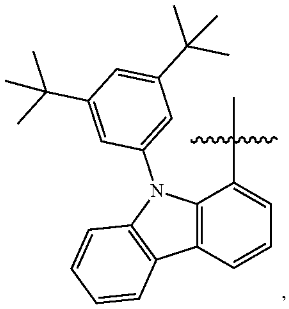
,
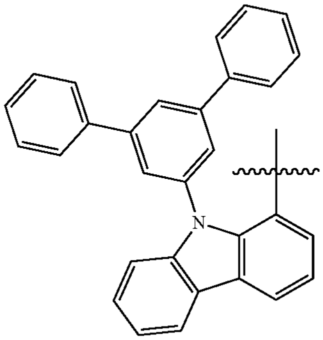
,
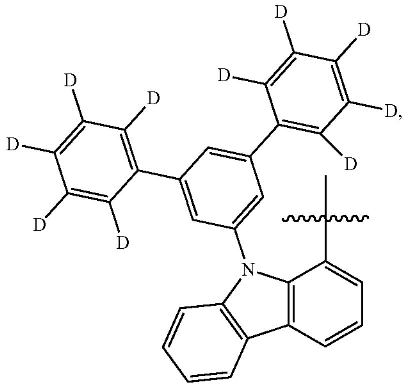
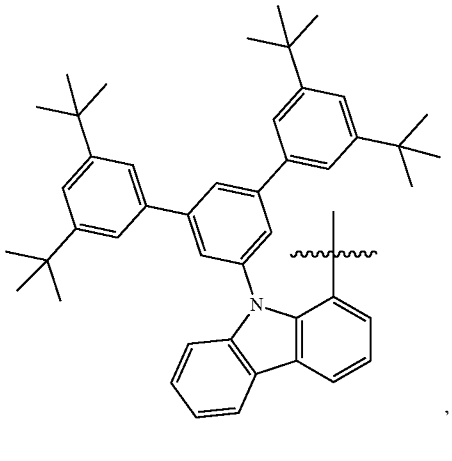
, -continued
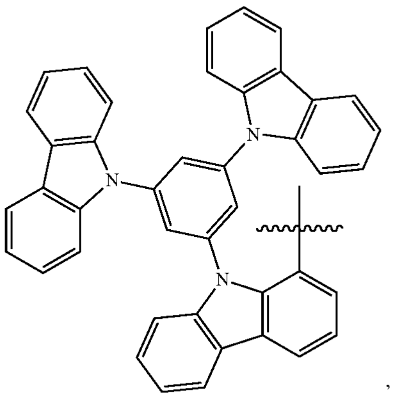
,
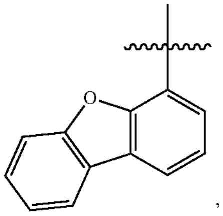
,
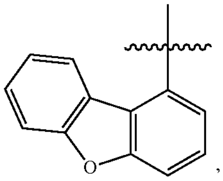
,
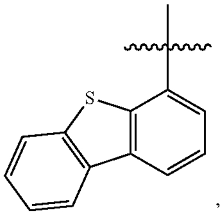
,
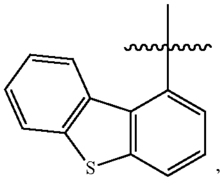
,
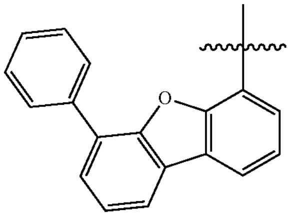
,
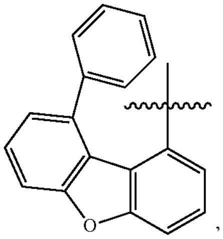
,
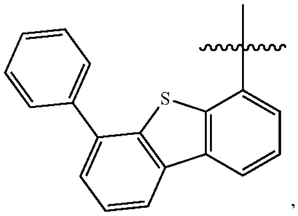
,
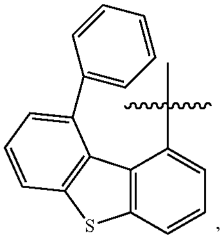
,
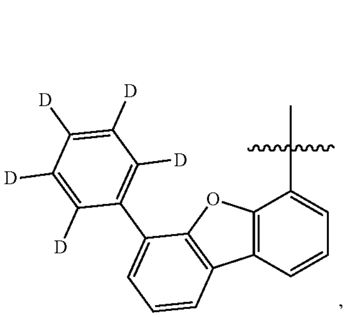
,
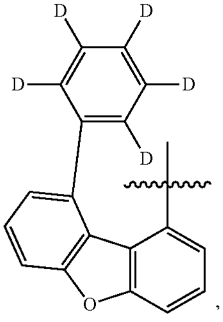
,
-continued
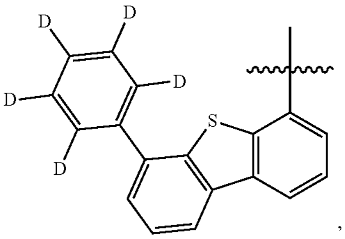
,
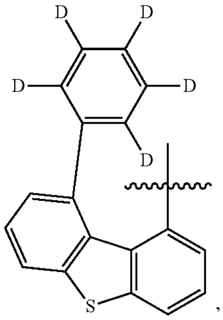
,
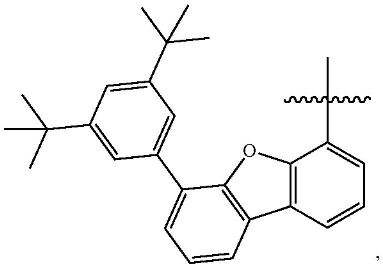
,
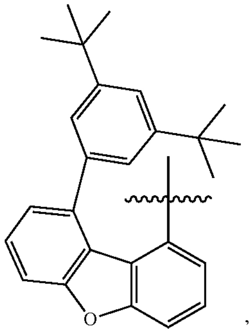
,
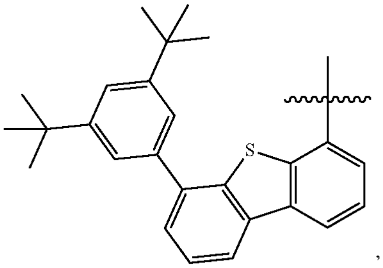
,
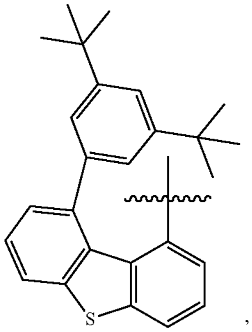
,
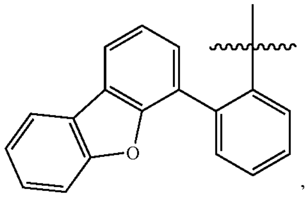
, -continued
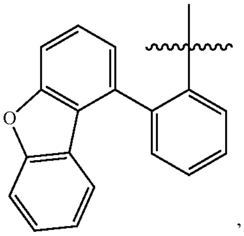
,
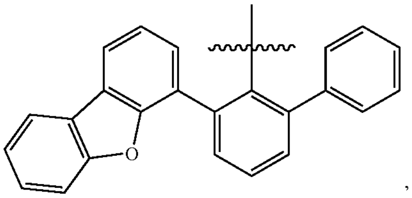
,
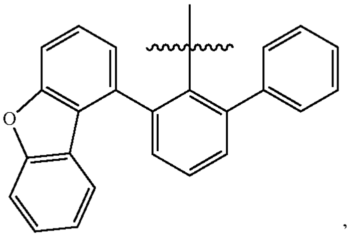
,
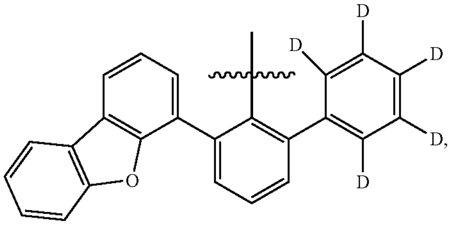
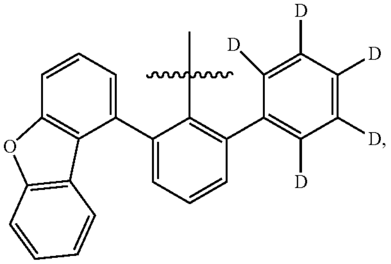
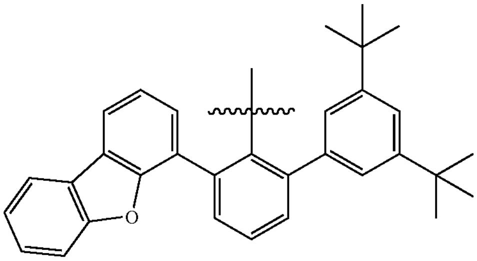
,
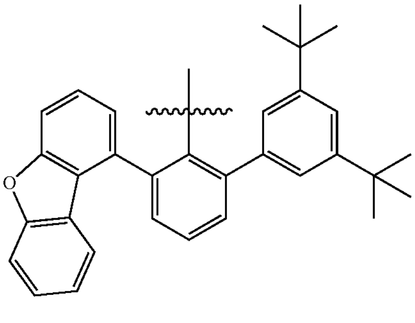
,
-continued
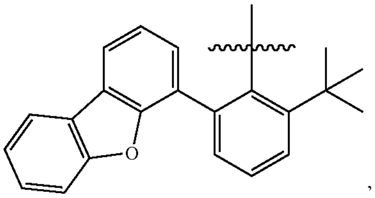
,
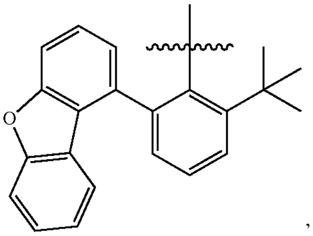
,
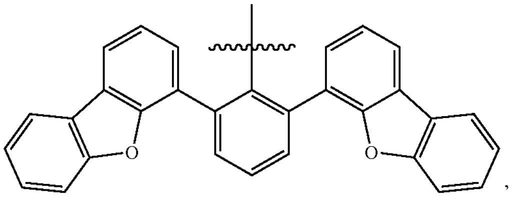
,
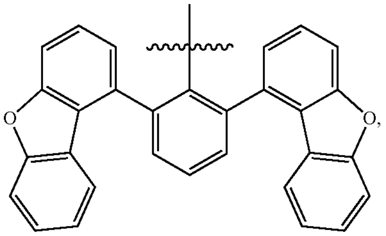
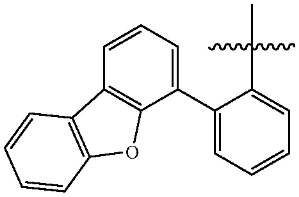
,
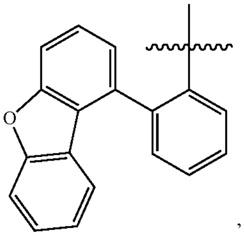
,
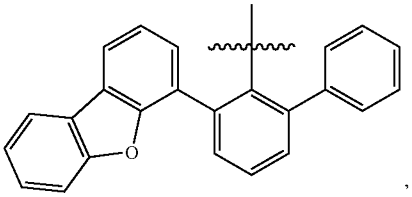
,
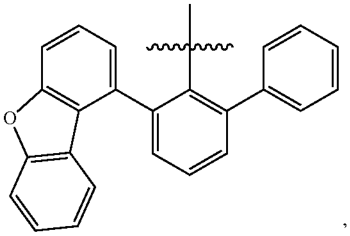
, -continued
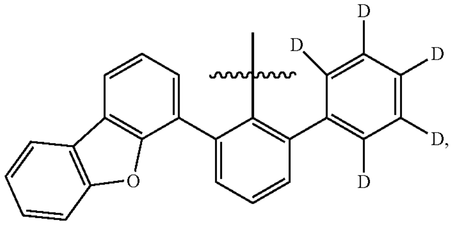
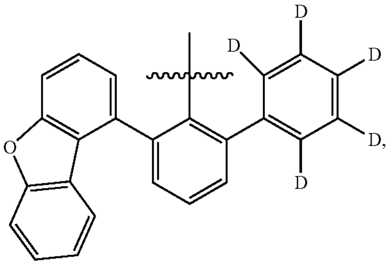
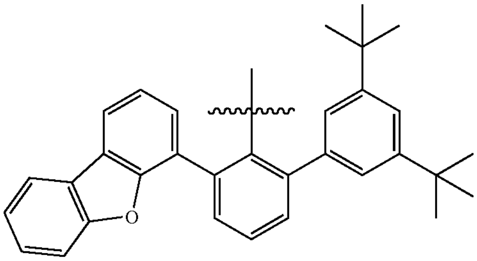
,
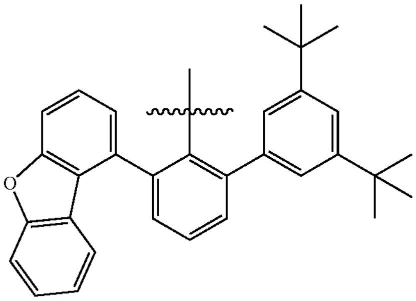
,
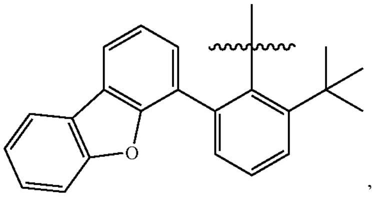
,
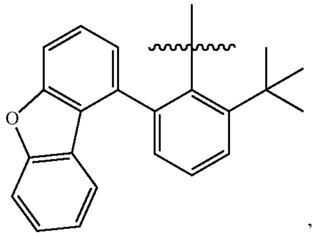
,
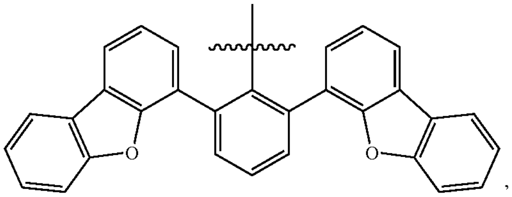
,
-continued
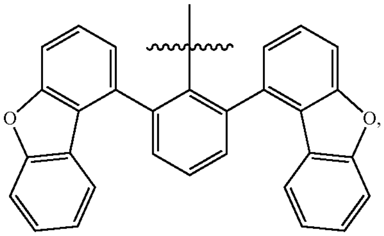
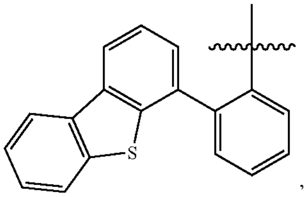
,
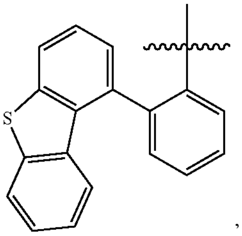
,
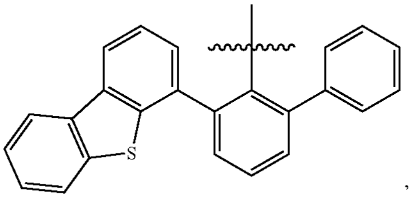
,
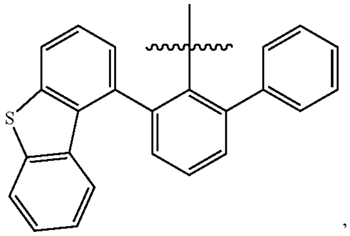
,
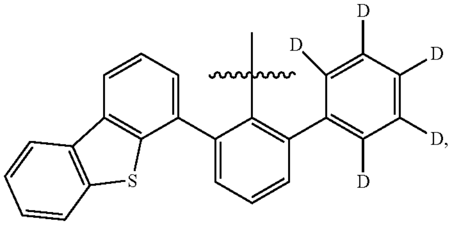
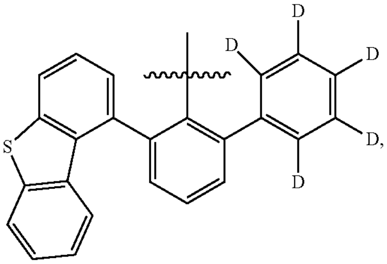
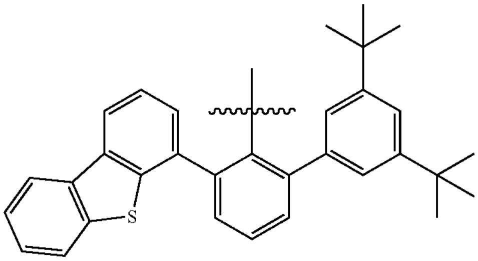
, -continued
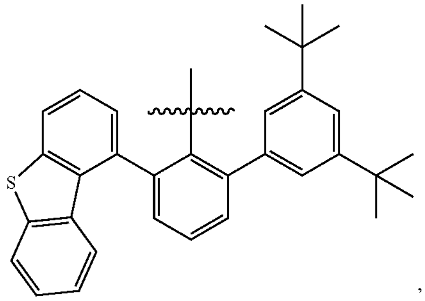
,
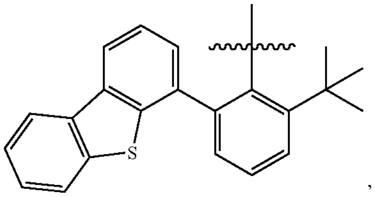
,
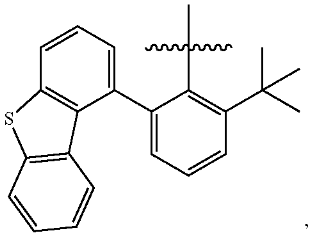
,
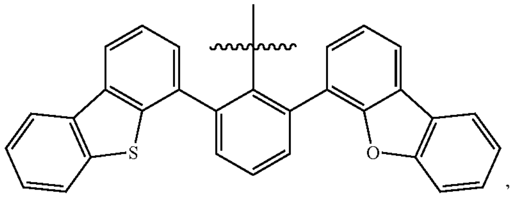
,
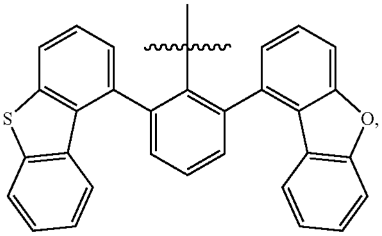
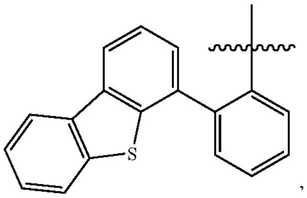
,
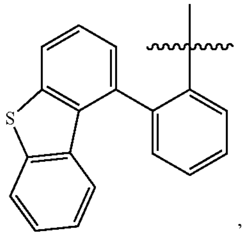
,
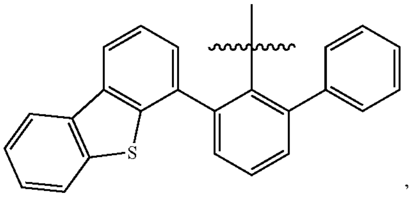
,
-continued
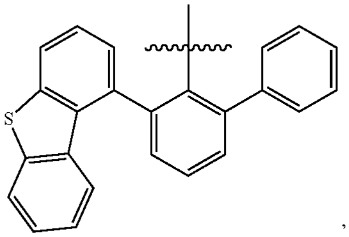
,
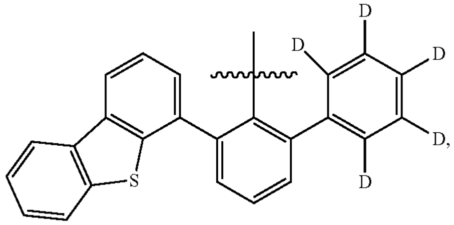
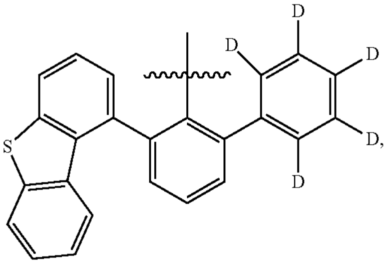
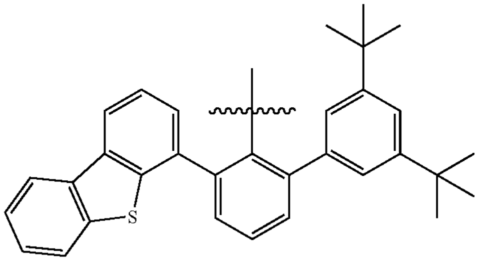
,
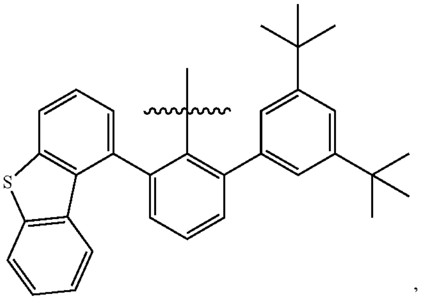
,
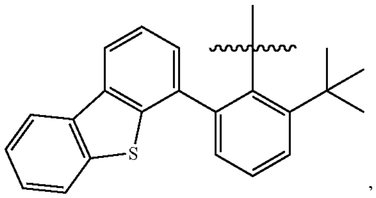
,
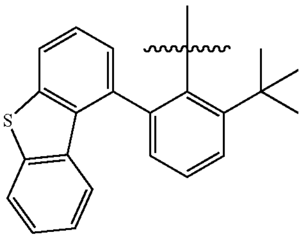
, -continued
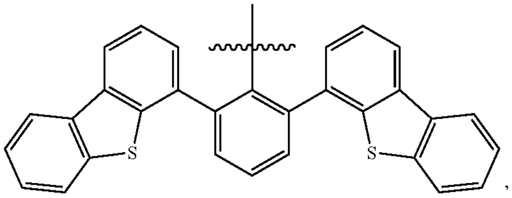
,
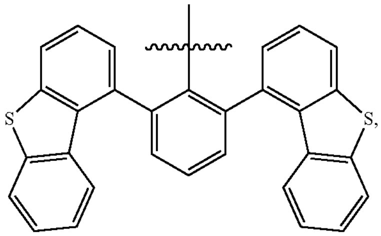
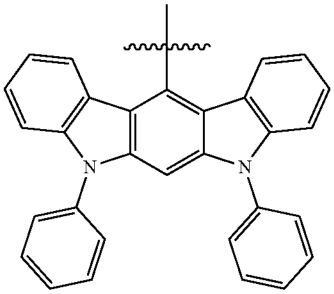
,
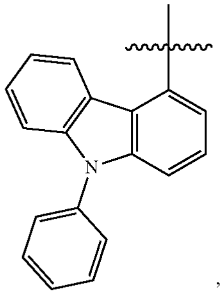
,
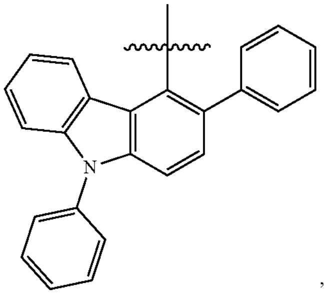
,
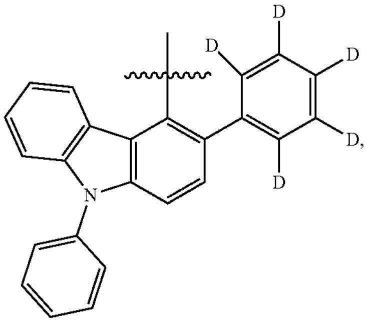
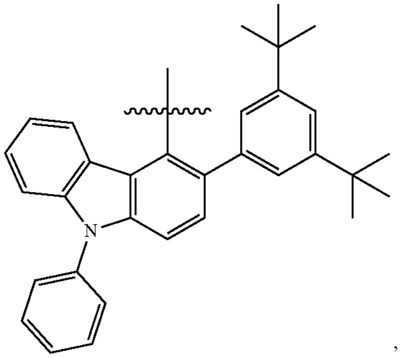
,
-continued
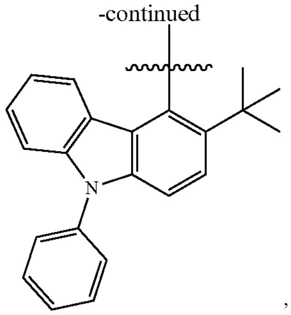
,
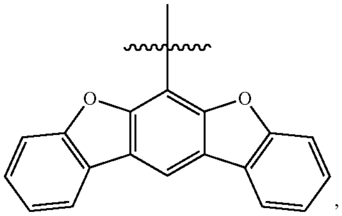
,
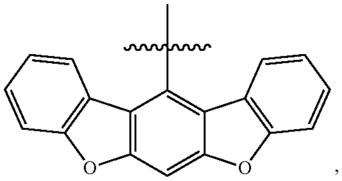
,
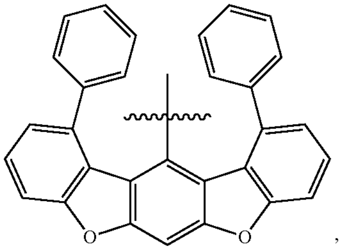
,
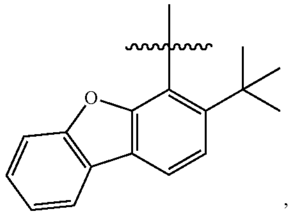
,
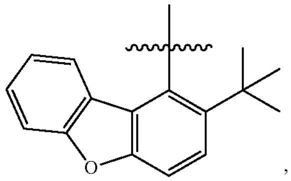
,
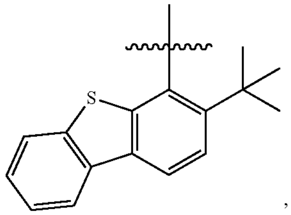
,
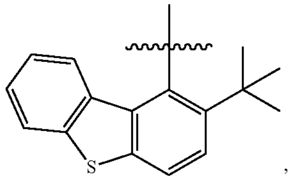
, -continued
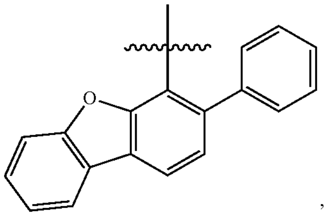
,
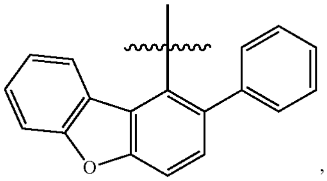
,
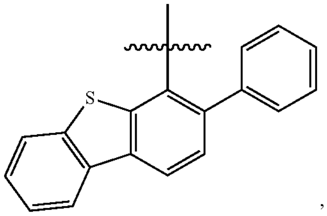
,
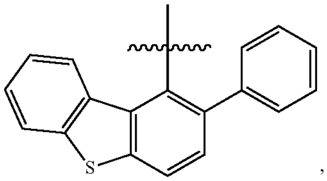
,
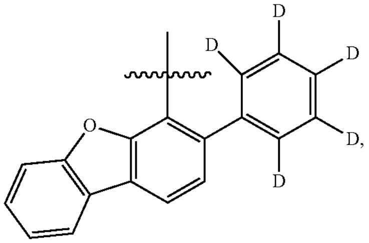
,
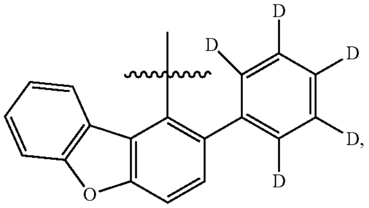
,
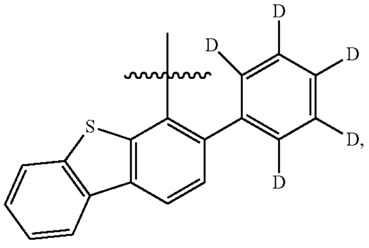
,
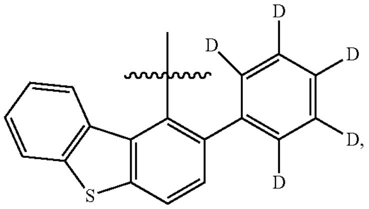
,
-continued
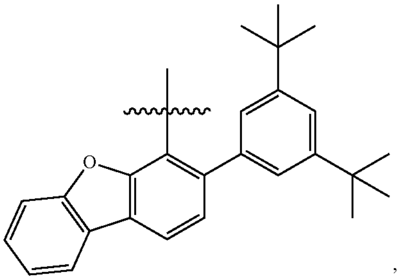
,
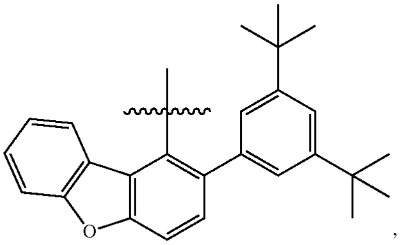
,
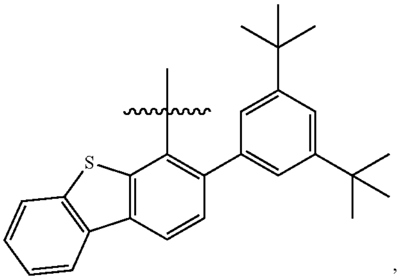
,
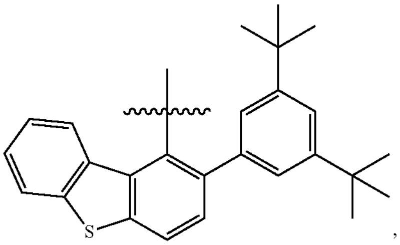
,
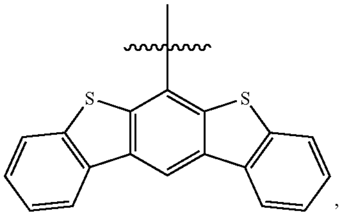
,
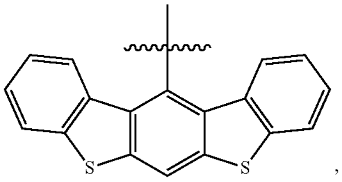
,
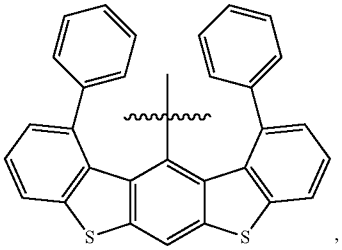
, -continued
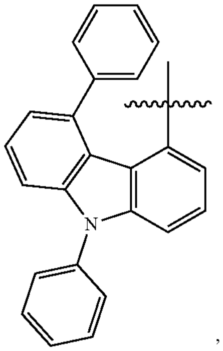
,
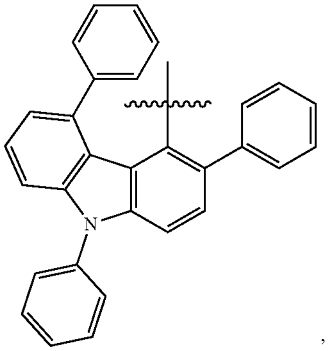
,
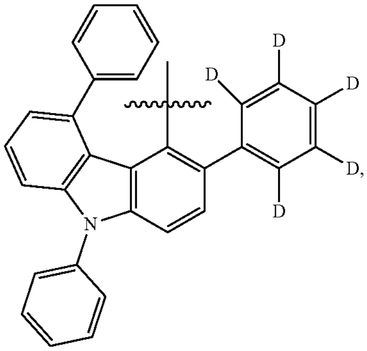
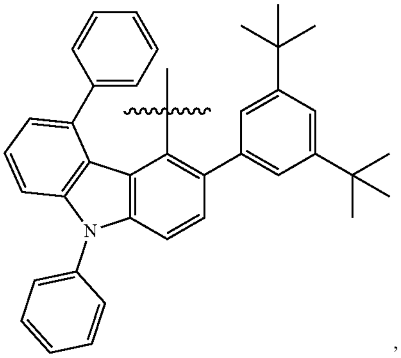
,
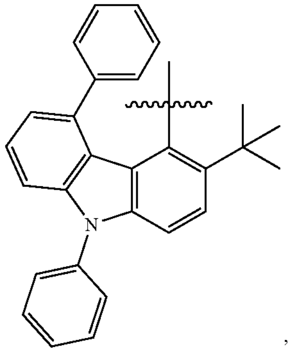
,
-continued
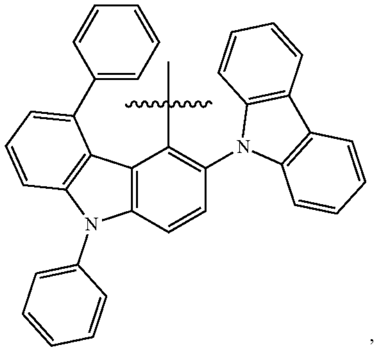
,
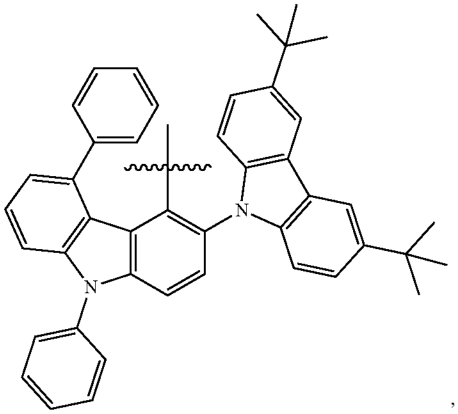
,
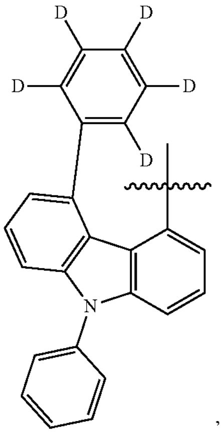
,
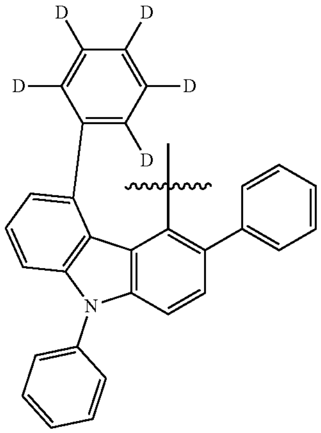
,
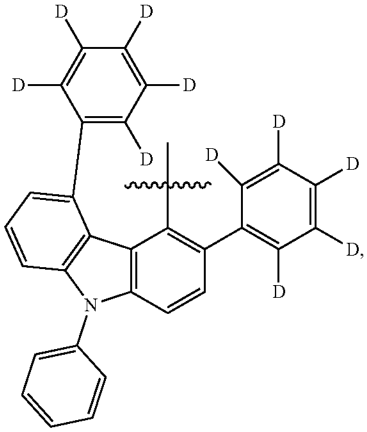

-continued
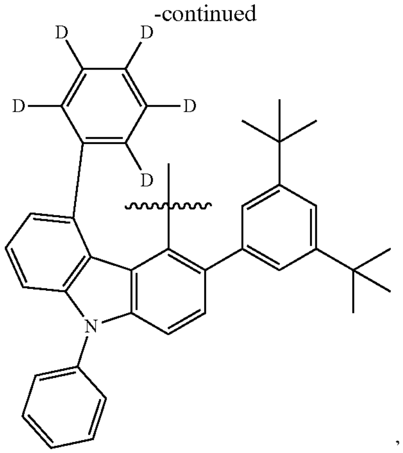
,
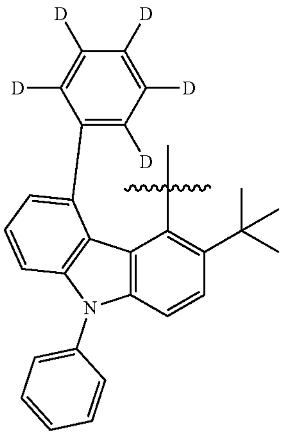
,
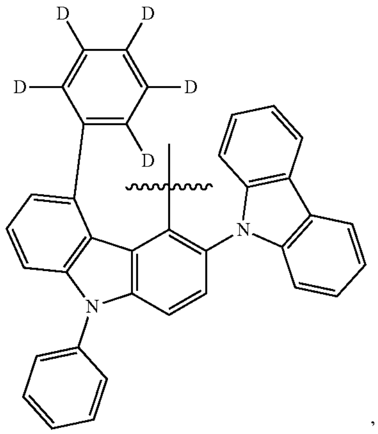
,
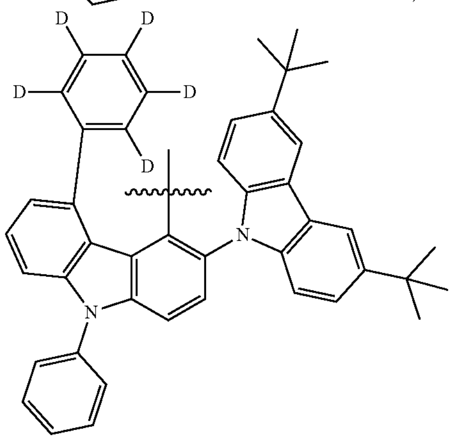
,
-continued
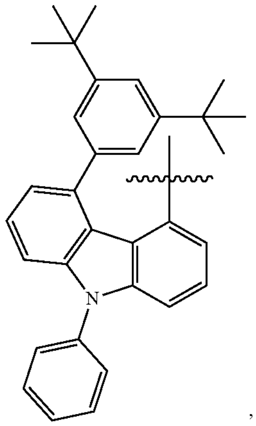
,
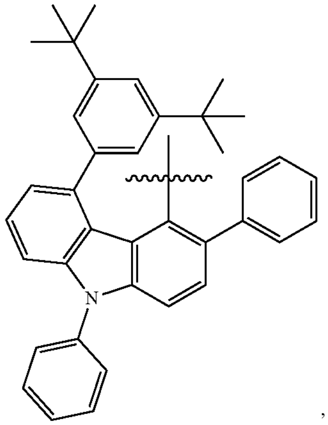
,
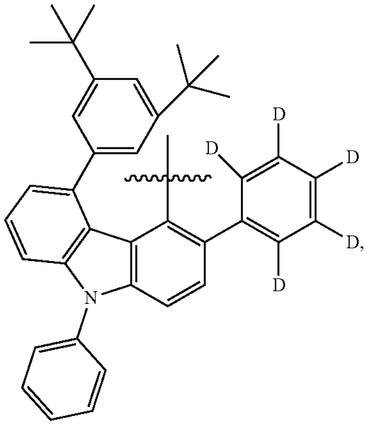
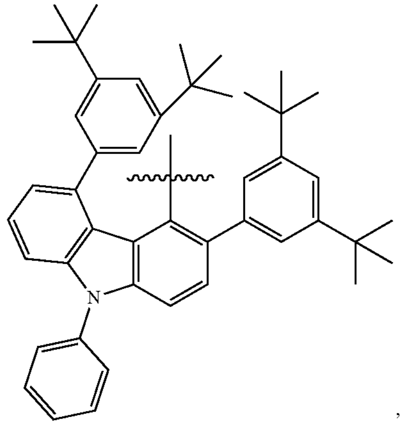
, -continued
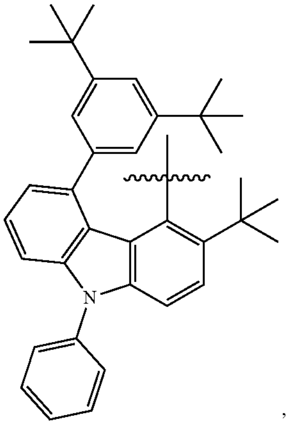
,
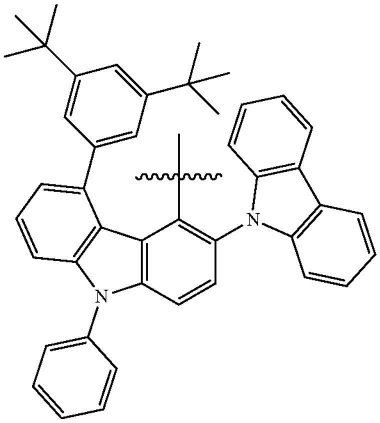
,
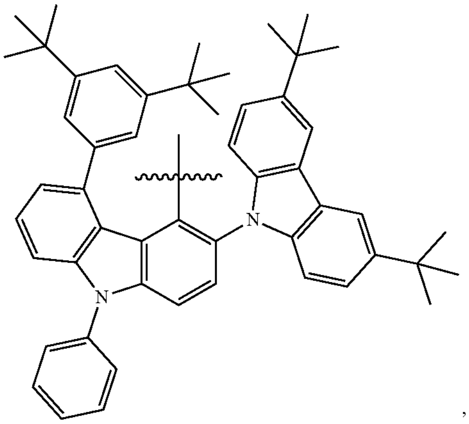
,
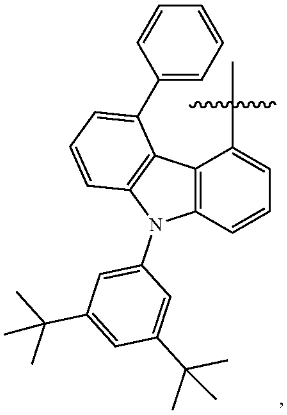
,
-continued
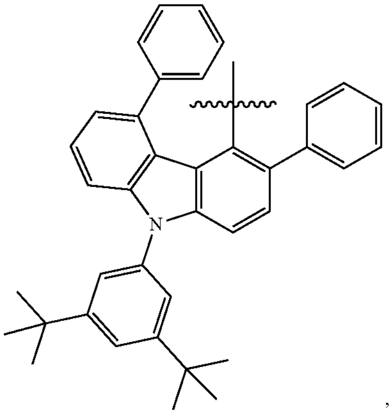
,
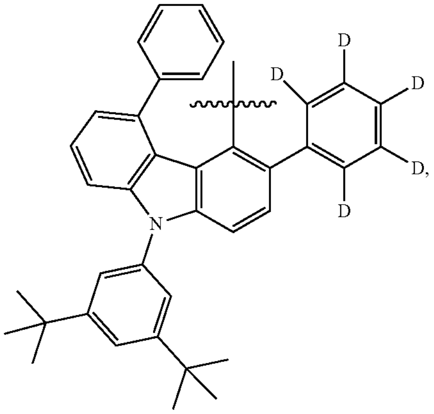
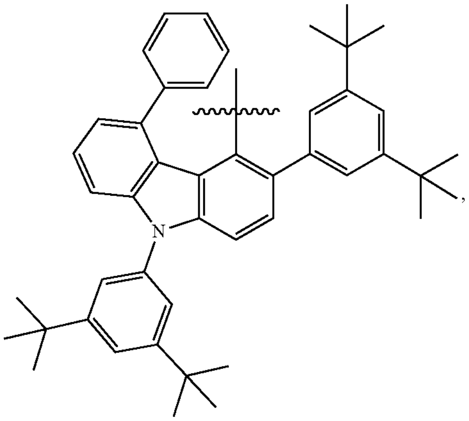

-continued
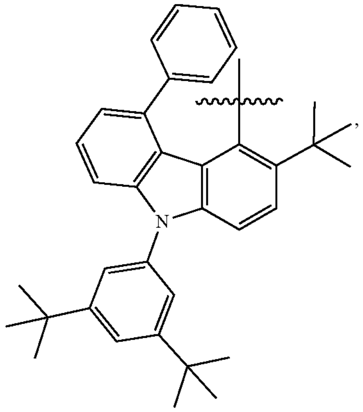
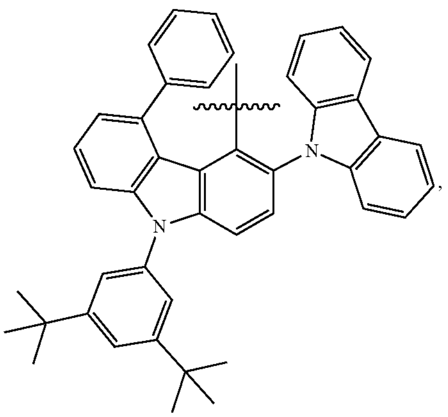
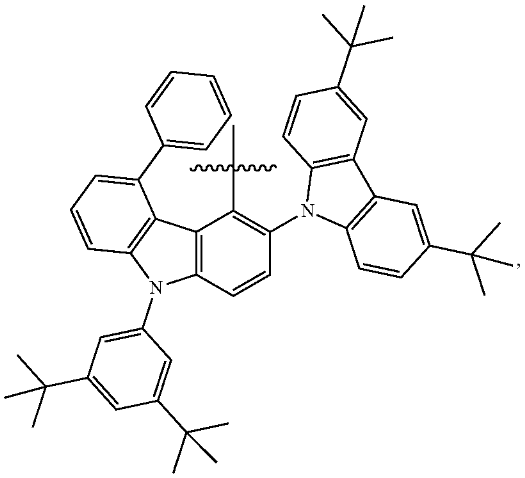
-continued
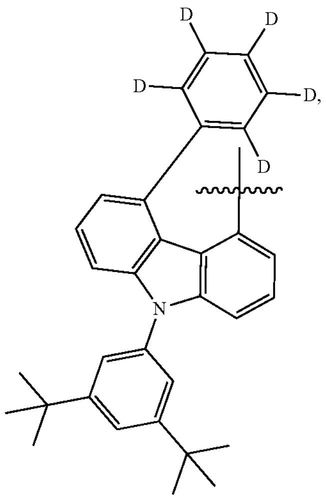
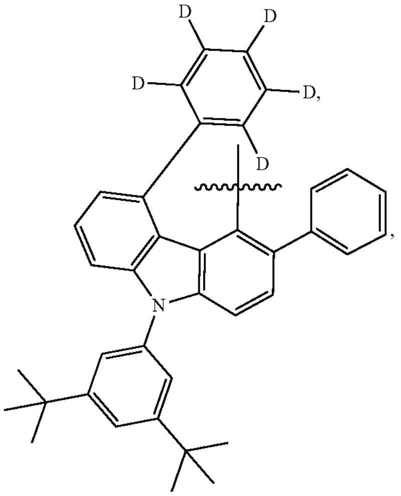
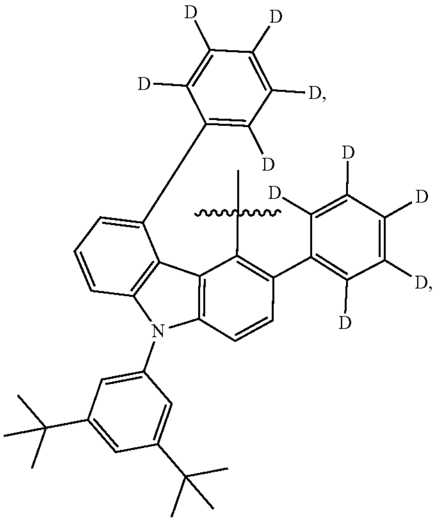

-continued
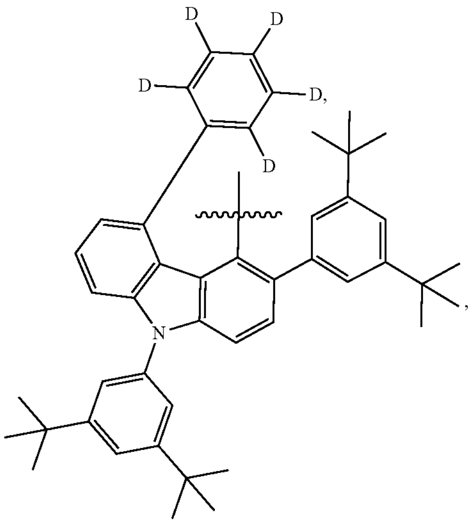
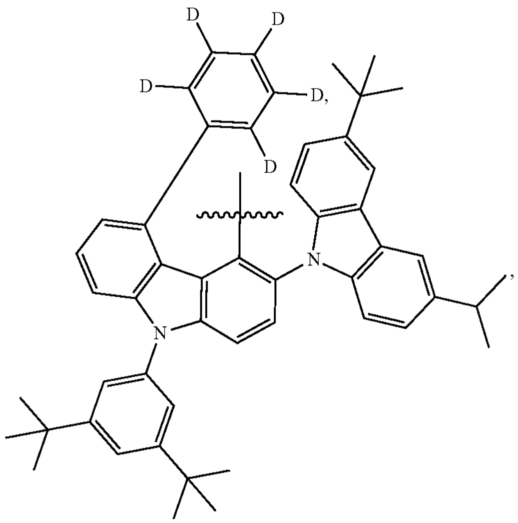
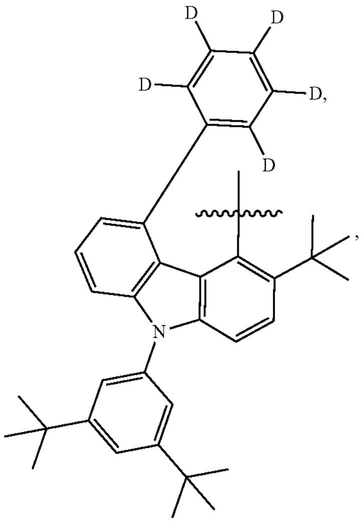
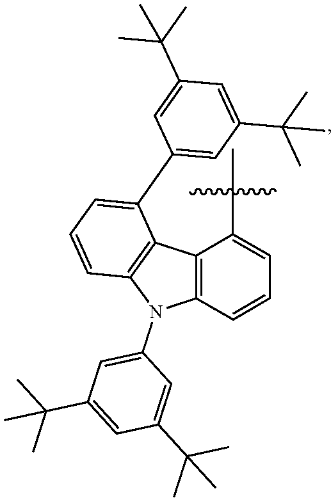
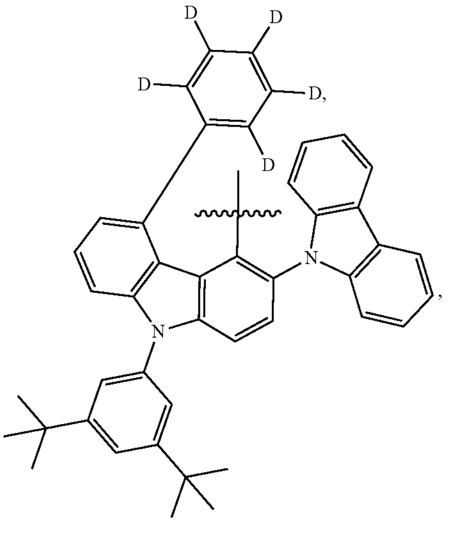
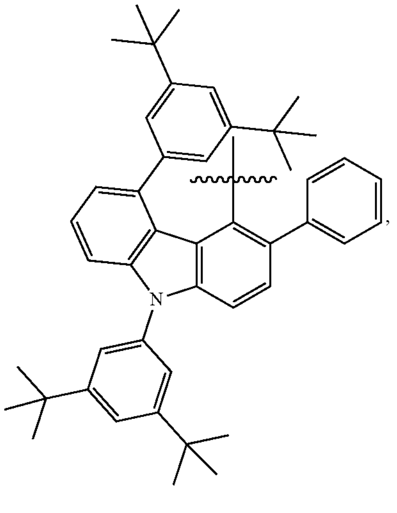

-continued
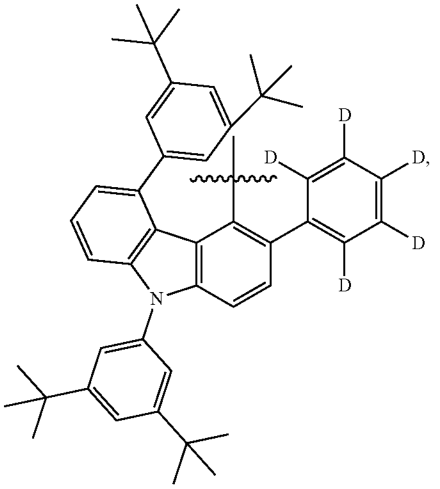
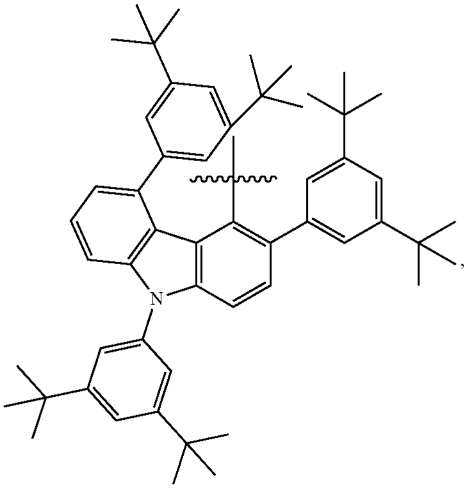
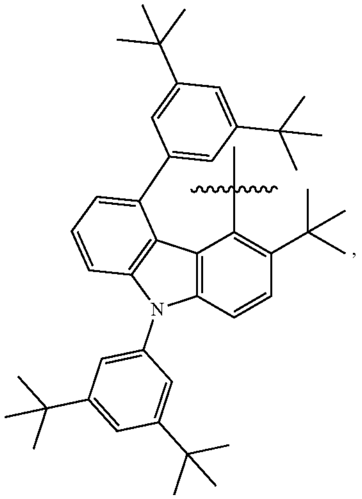
-continued
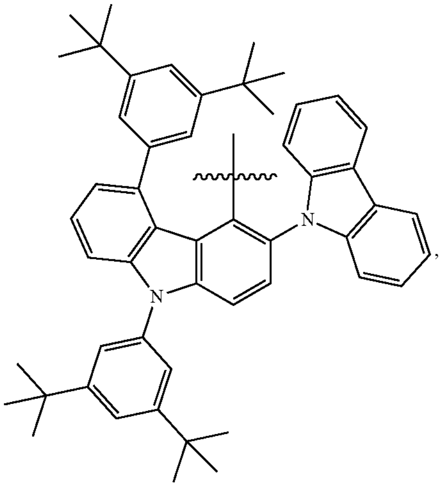
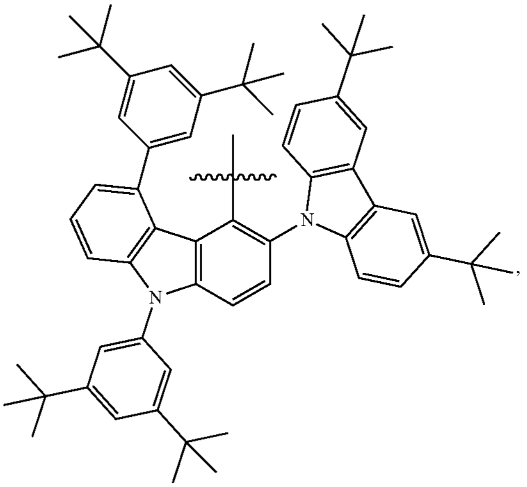
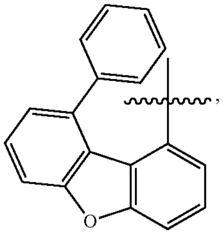
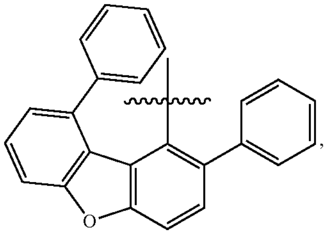
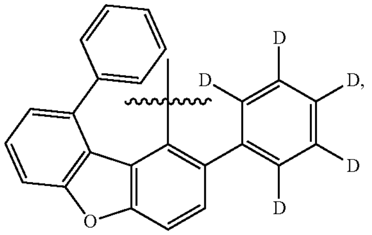
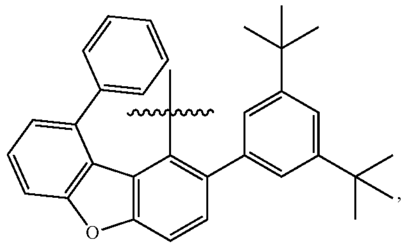

-continued
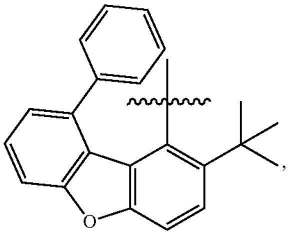,
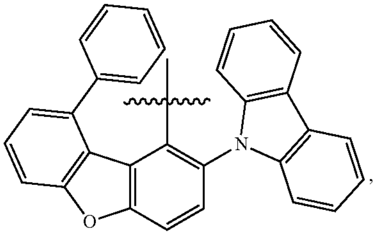,
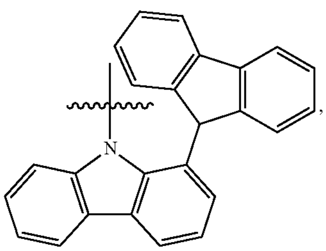, 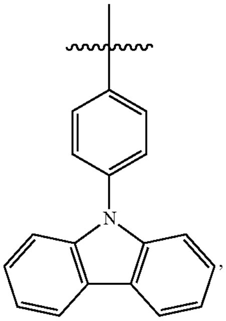,
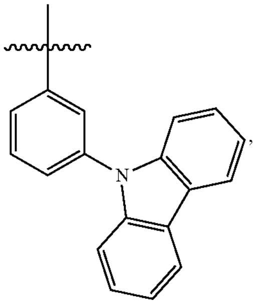, 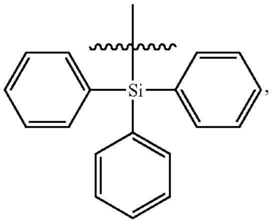,
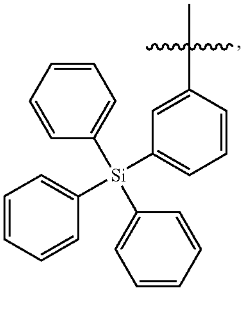, 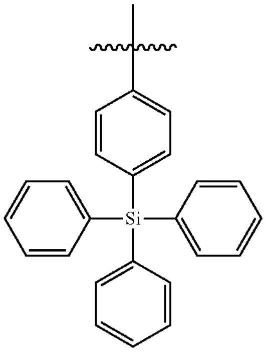,
-continued
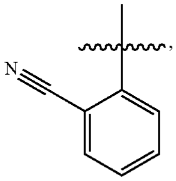, 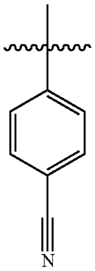, 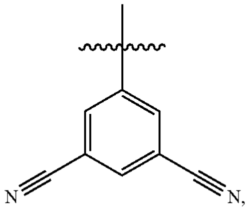
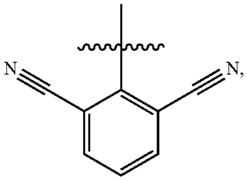
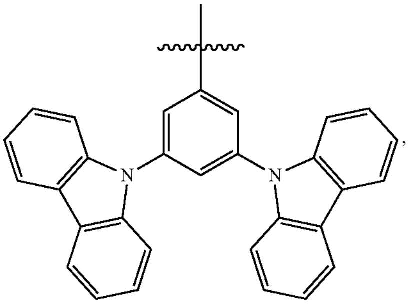, 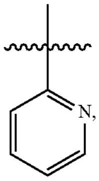
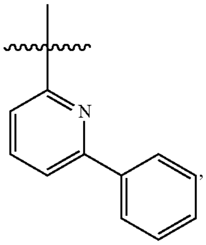, 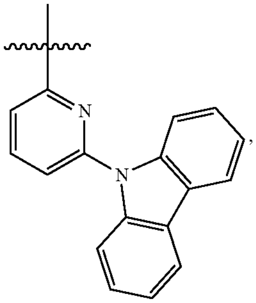, 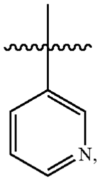
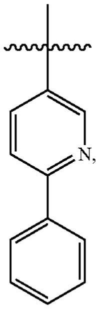 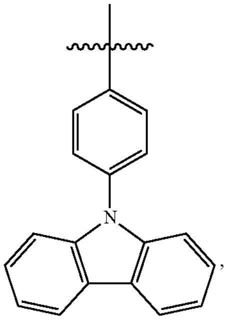, 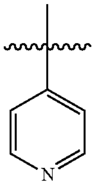, -continued
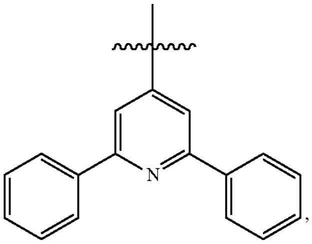
,
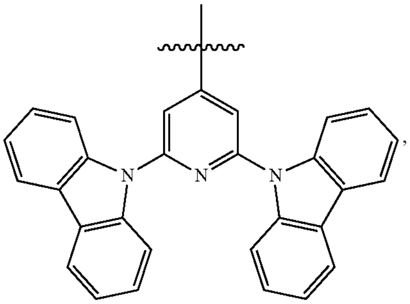
,
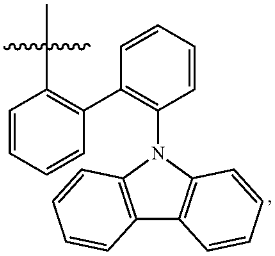
,
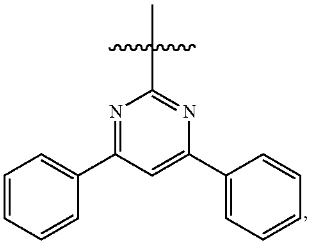
,
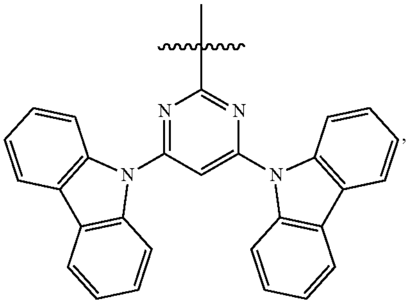
,
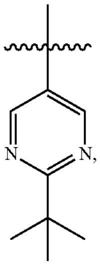
,
-continued
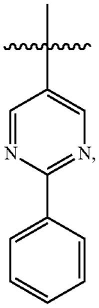
,
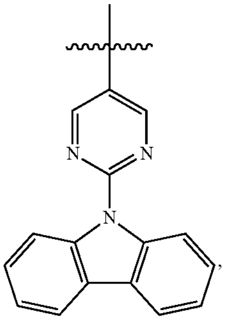
,
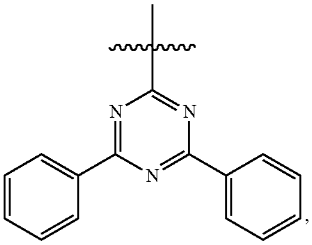
,
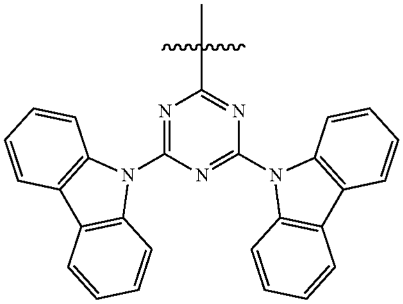
,
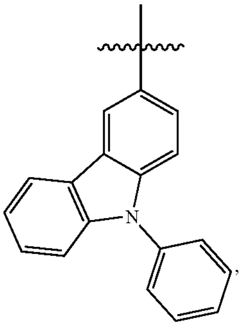
,
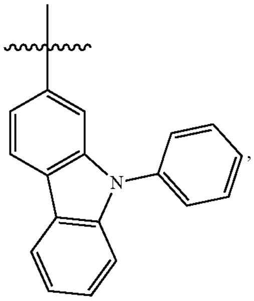
,
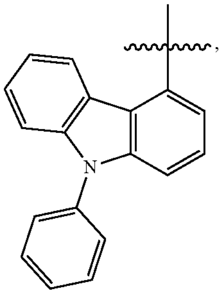
,
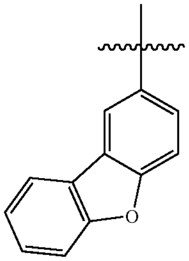
, -continued
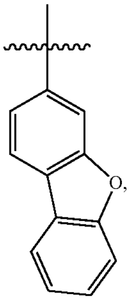
,
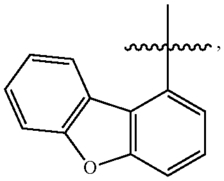
,
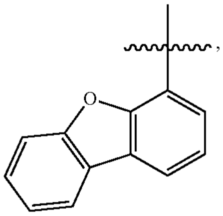
,
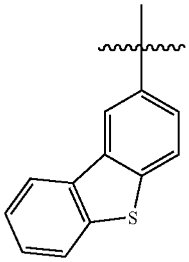
,
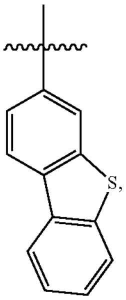
,
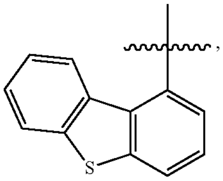
,
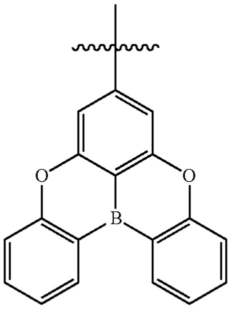
,
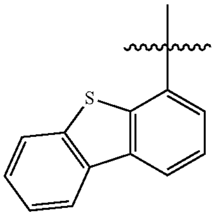
,
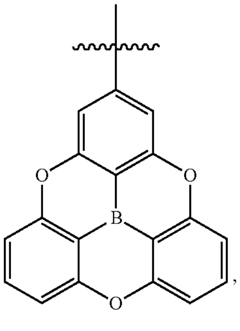
,
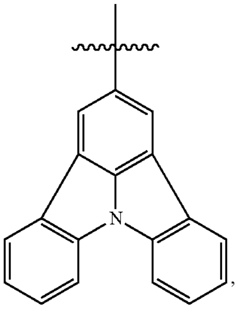
,
-continued
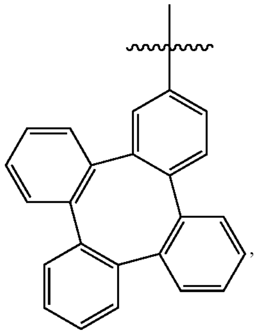
,
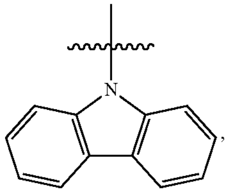
,
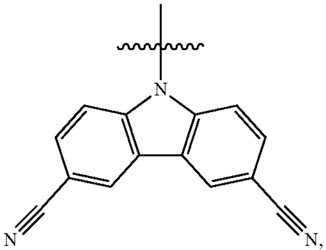
,
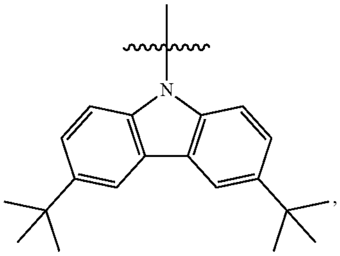
,
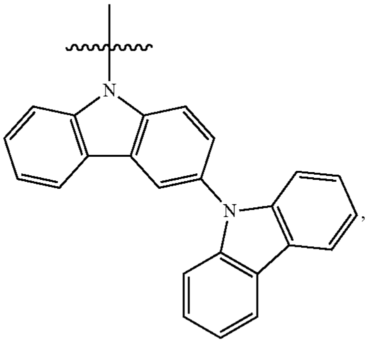
,
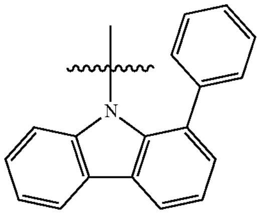
, and
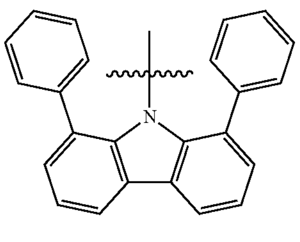
.
15. The compound of claim 6, wherein the compound has a structure of Formula VI

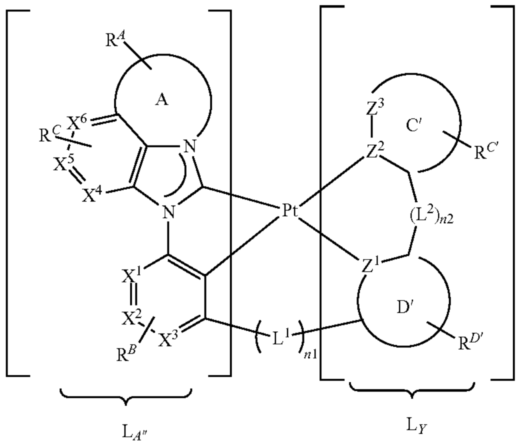

wherein $L_{A''}$ is selected from the group consisting of:

-continued

| Ligand $L_{A''}$ | Structure of $L_{A''}$ |
|---|---|
| $L_{A''}$1-(R1)(R1)(R1) to $L_{A''}$1-(R132)(R132)(R132) having the structure | 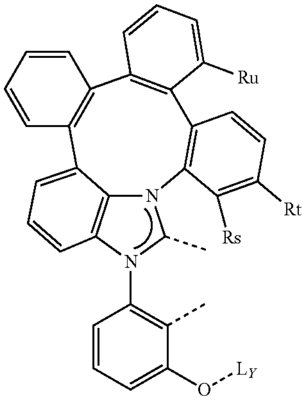 |
| $L_{A''}$2-(R1)(R1)(R1) to $L_{A''}$2-(R132)(R132)(R132) having the structure | 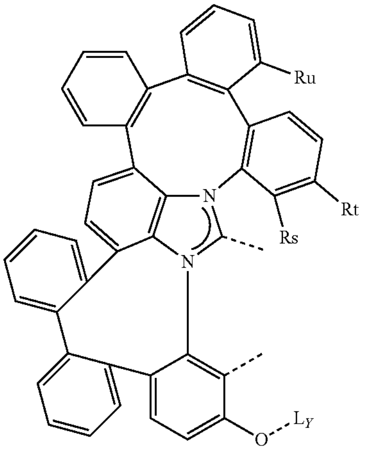 |
| $L_{A''}$3-(R1)(R1)(R1) to $L_{A''}$3-(R132)(R132)(R132) having the structure | 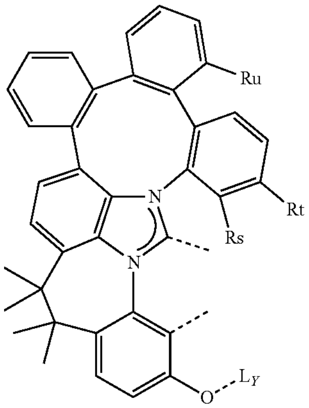 |
| $L_{A''}$4-(R1)(R1)(R1) to $L_{A''}$4-(R132)(R132)(R132) having the structure | 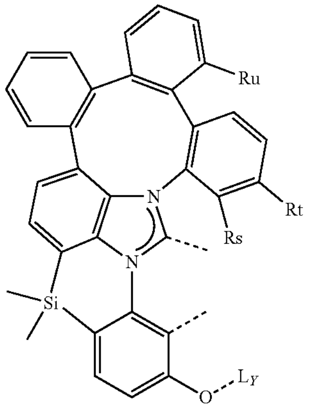 |
| $L_{A''}$5-(R1)(R1)(R1) to $L_{A''}$5-(R132)(R132)(R132) having the structure | 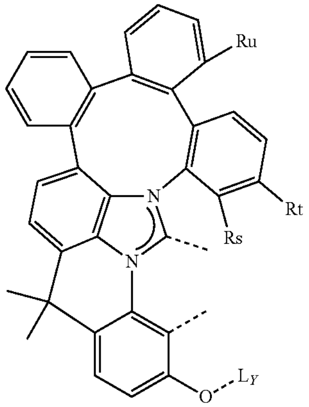 |
| $L_{A''}$6-(R1)(R1)(R1) to $L_{A''}$6-(R132)(R132)(R132) having the structure | 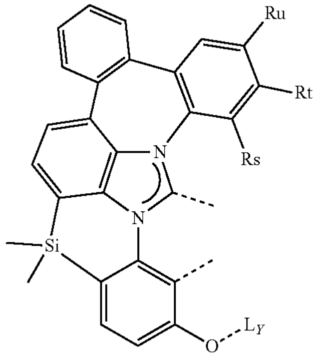 |

-continued

| Ligand $L_{A''}$ | Structure of $L_{A''}$ |
|---|---|
| $L_{A''}$7-(R1)(R1)(R1) to $L_{A''}$7-(R132)(R132)(R132) having the structure | 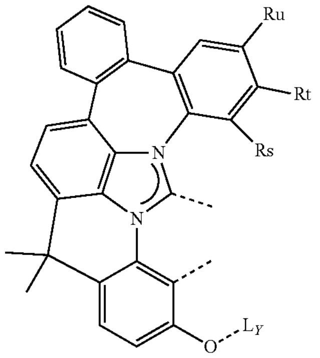 |
| $L_{A''}$8-(R1)(R1)(R1) to $L_{A''}$8-(R132)(R132)(R132) having the structure | 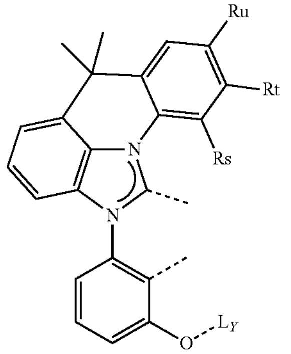 |
| $L_{A''}$9-(R1)(R1)(R1) to $L_{A''}$9-(R132)(R132)(R132) having the structure | 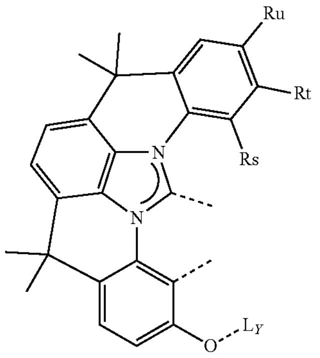 |
| $L_{A''}$10-(R1)(R1)(R1) to $L_{A''}$10-(R132)(R132)(R132) having the structure | 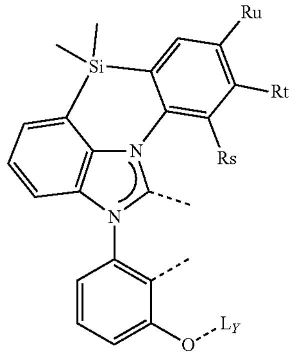 |

-continued

| Ligand $L_{A''}$ | Structure of $L_{A''}$ |
|---|---|
| $L_{A''}$11-(R1)(R1)(R1) to $L_{A''}$11-(R132)(R132)(R132) having the structure | 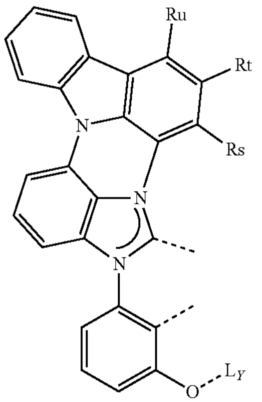 |
| $L_{A''}$12-(R1)(R1)(R1) to $L_{A''}$12-(R132)(R132)(R132) having the structure | 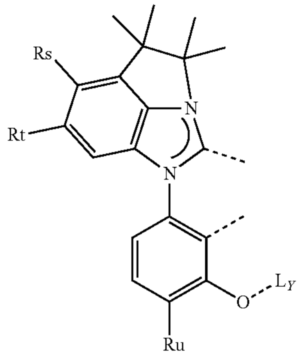 |
| $L_{A''}$13-(R1)(R1)(R1) to $L_{A''}$13-(R132)(R132)(R132) having the structure | 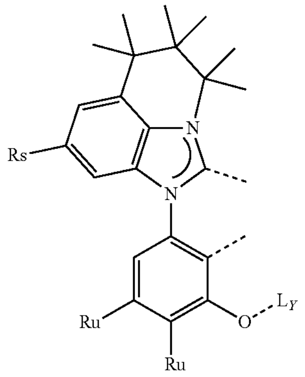 |
| $L_{A''}$14-(R1)(R1)(R1) to $L_{A''}$14-(R132)(R132)(R132) having the structure | 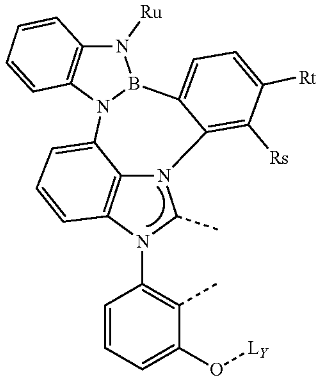 |

-continued

| Ligand $L_{A''}$ | Structure of $L_{A''}$ |
|---|---|
| $L_{A''}$15-(R1)(R1)(R1) to $L_{A''}$15-(R132)(R132)(R132) having the structure | 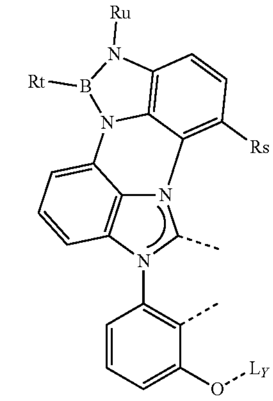 |
| $L_{A''}$16-(R1)(R1)(R1) to $L_{A''}$16-(R132)(R132)(R132) having the structure | 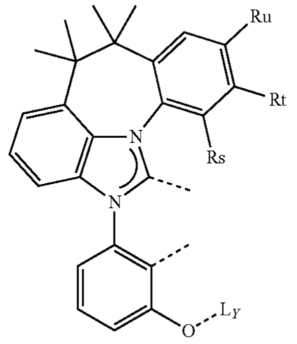 |
| $L_{A''}$17-(R1)(R1)(R1) to $L_{A''}$17-(R132)(R132)(R132) having the structure | 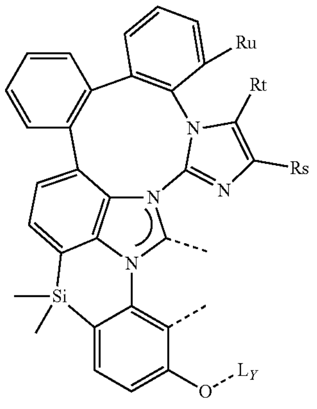 |
| $L_{A''}$18-(R1)(R1)(R1) to $L_{A''}$18-(R132)(R132)(R132) having the structure | 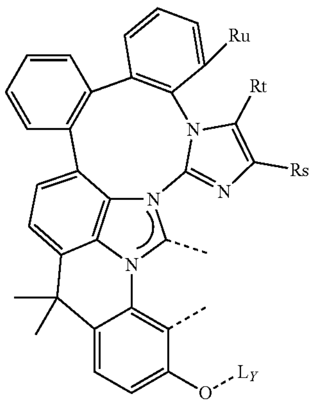 |

-continued

| Ligand $L_{A''}$ | Structure of $L_{A''}$ |
|---|---|
| $L_{A''}$19-(R1)(R1)(R1) to $L_{A''}$19-(R132)(R132)(R132) having the structure | 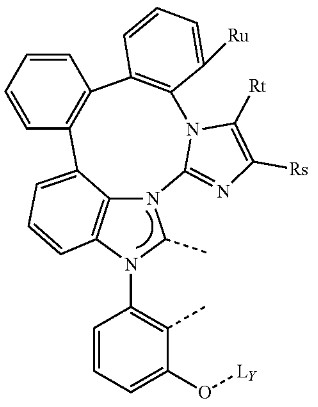 |
| $L_{A''}$20-(R1)(R1)(R1) to $L_{A''}$20-(R132)(R132)(R132) having the structure | 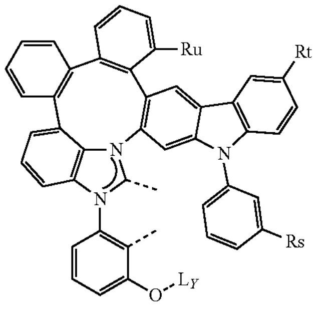 |
| $L_{A''}$21-(R1)(R1)(R1) to $L_{A''}$21-(R132)(R132)(R132) having the structure | 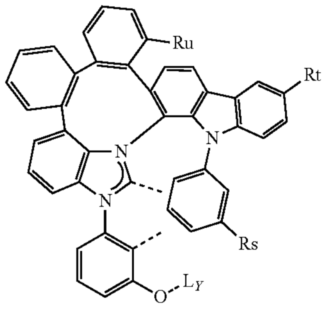 |
| $L_{A''}$22-(R1)(R1)(R1) to $L_{A''}$22-(R132)(R132)(R132) having the structure | 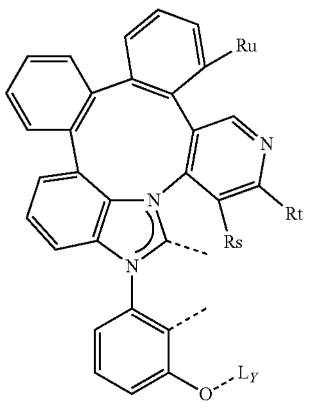 |

-continued

| Ligand $L_{A''}$ | Structure of $L_{A''}$ |
|---|---|
| $L_{A''}$23-(R1)(R1)(R1) to $L_{A''}$23-(R132)(R132)(R132) having the structure | 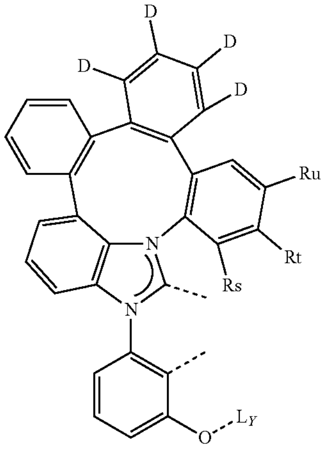 |
| $L_{A''}$24-(R1)(R1)(R1) to $L_{A''}$24-(R132)(R132)(R132) having the structure | 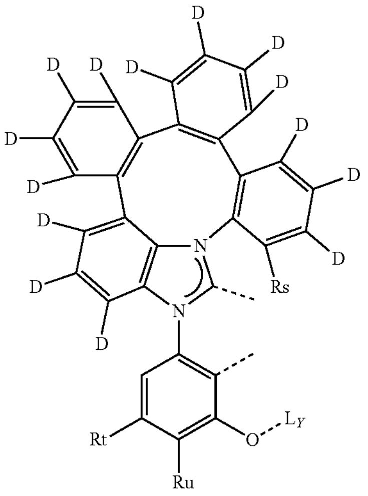 |
| $L_{A''}$25-(R1)(R1)(R1) to $L_{A''}$25-(R132)(R132)(R132) having the structure | 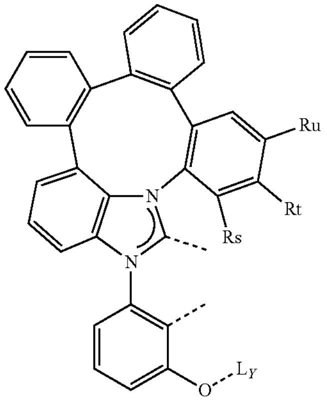 |

-continued

| Ligand $L_{A''}$ | Structure of $L_{A''}$ |
|---|---|
| $L_{A''}$26-(R1)(R1)(R1) to $L_{A''}$26-(R132)(R132)(R132) having the structure | 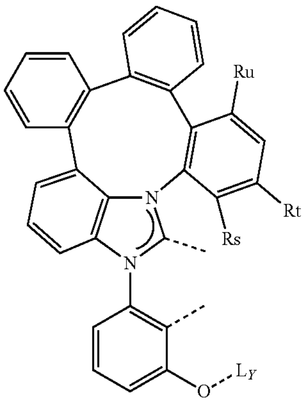 |
| $L_{A''}$27-(R1)(R1)(R1) to $L_{A''}$27-(R132)(R132)(R132) having the structure | 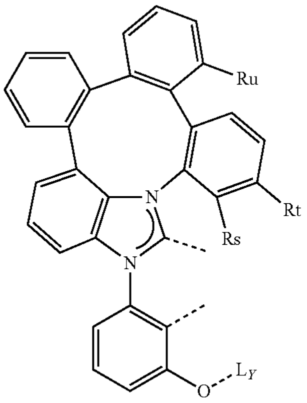 |
| $L_{A''}$28-(R1)(R1)(R1) to $L_{A''}$28-(R132)(R132)(R132) having the structure | 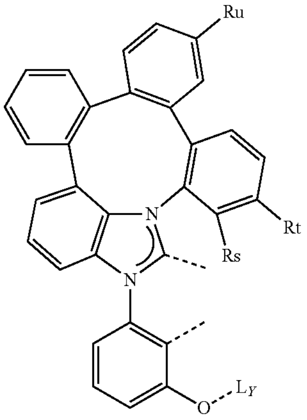 |

-continued
| Ligand $L_{A''}$ | Structure of $L_{A''}$ |
|---|---|
| $L_{A''}$29-(R1)(R1)(R1) to $L_{A''}$29-(R132)(R132)(R132) having the structure | 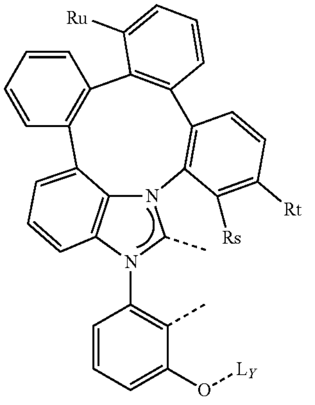 |
| $L_{A''}$30-(R1)(R1)(R1) to $L_{A''}$30-(R132)(R132)(R132) having the structure | 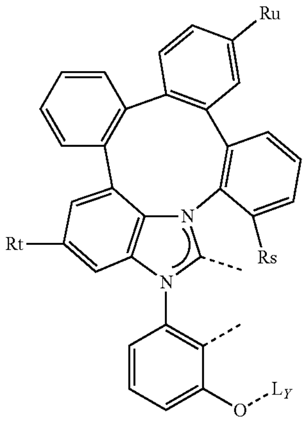 |
| $L_{A''}$31-(R1)(R1)(R1) to $L_{A''}$31-(R132)(R132)(R132) having the structure | 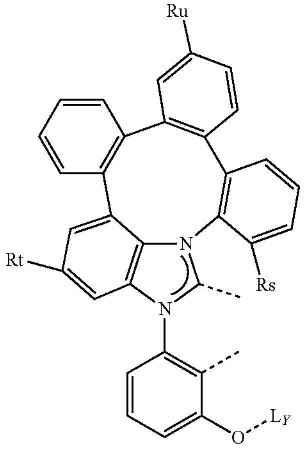 |
| $L_{A''}$32-(R1)(R1)(R1) to $L_{A''}$32-(R132)(R132)(R132) having the structure | 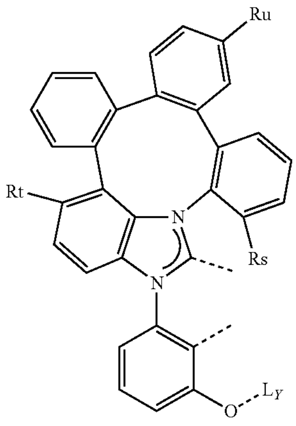 |
| $L_{A''}$33-(R1)(R1)(R1) to $L_{A''}$33-(R132)(R132)(R132) having the structure | 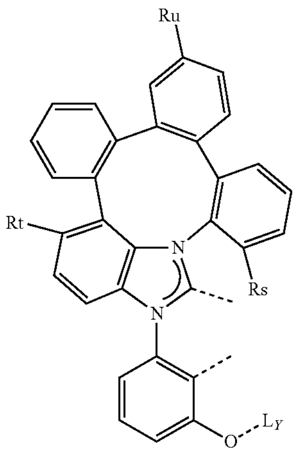 |
| $L_{A''}$34-(R1)(R1)(R1) to $L_{A''}$34-(R132)(R132)(R132) having the structure | 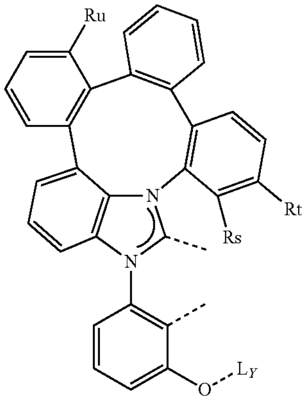 |

-continued

| Ligand $L_{A''}$ | Structure of $L_{A''}$ |
|---|---|
| $L_{A''}$35-(R1)(R1)(R1) to $L_{A''}$35-(R132)(R132)(R132) having the structure | 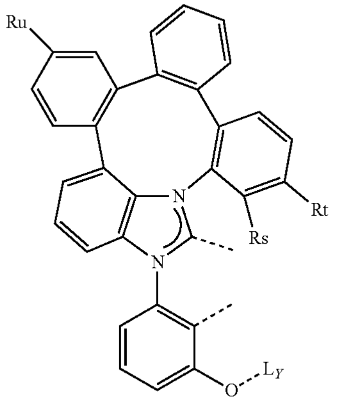 |
| $L_{A''}$36-(R1)(R1)(R1) to $L_{A''}$36-(R132)(R132)(R132) having the structure | 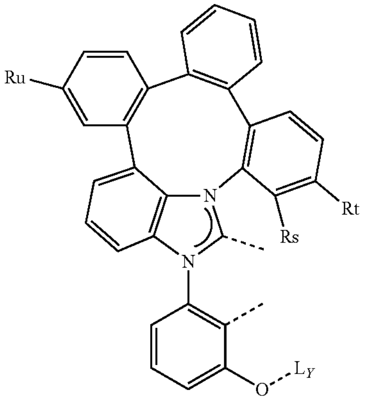 |
| $L_{A''}$37-(R1)(R1)(R1) to $L_{A''}$37-(R132)(R132)(R132) having the structure | 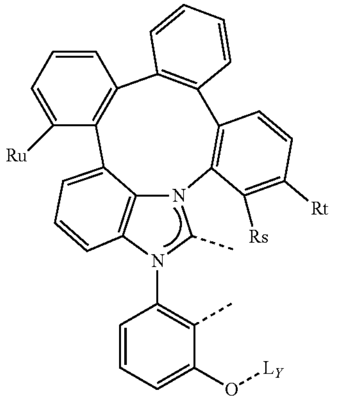 |
| $L_{A''}$38-(R1)(R1)(R1) to $L_{A''}$38-(R132)(R132)(R132) having the structure | 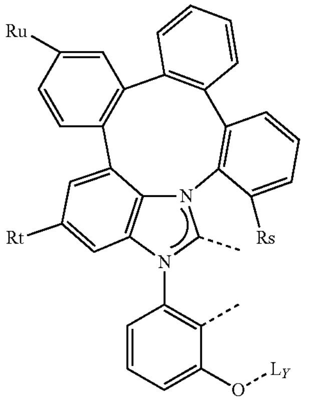 |
| $L_{A''}$39-(R1)(R1)(R1) to $L_{A''}$39-(R132)(R132)(R132) having the structure | 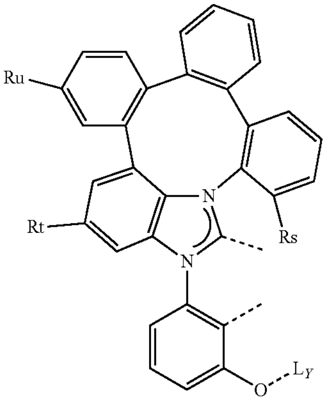 |
| $L_{A''}$40-(R1)(R1)(R1) to $L_{A''}$40-(R132)(R132)(R132) having the structure | 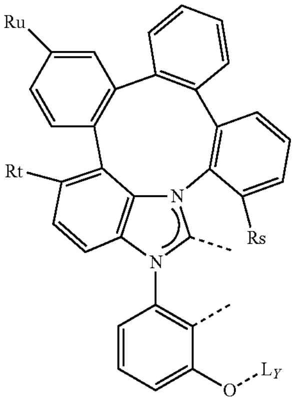 |
| $L_{A''}$41-(R1)(R1)(R1) to $L_{A''}$41-(R132)(R132)(R132) having the structure | 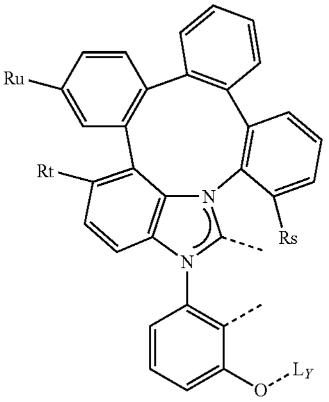 |

-continued

| Ligand $L_{A''}$ | Structure of $L_{A''}$ |
|---|---|
| $L_{A''}$42-(R1)(R1)(R1) to $L_{A''}$42-(R132)(R132)(R132) having the structure | 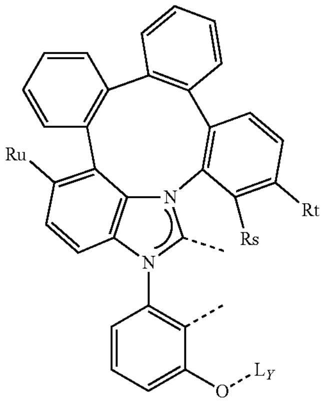 |
| $L_{A''}$43-(R1)(R1)(R1) to $L_{A''}$43-(R132)(R132)(R132) having the structure | 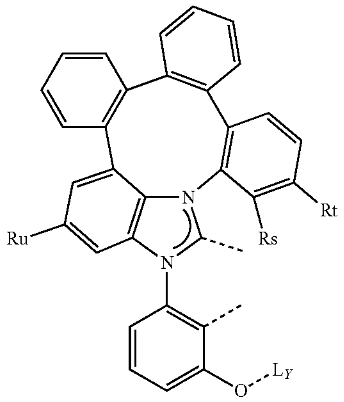 |
| $L_{A''}$44-(R1)(R1)(R1) to $L_{A''}$44-(R132)(R132)(R132) having the structure | 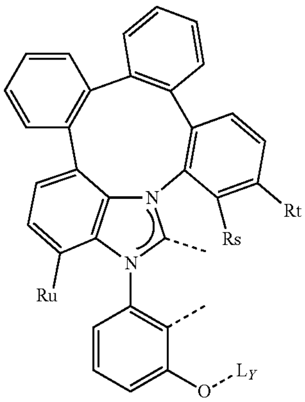 |

-continued

| Ligand $L_{A''}$ | Structure of $L_{A''}$ |
|---|---|
| $L_{A''}$45-(R1)(R1)(R1) to $L_{A''}$45-(R132)(R132)(R132) having the structure | 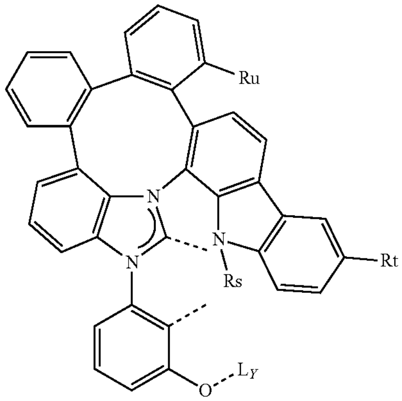 |
| $L_{A''}$46-(R1)(R1)(R1) to $L_{A''}$46-(R132)(R132)(R132) having the structure | 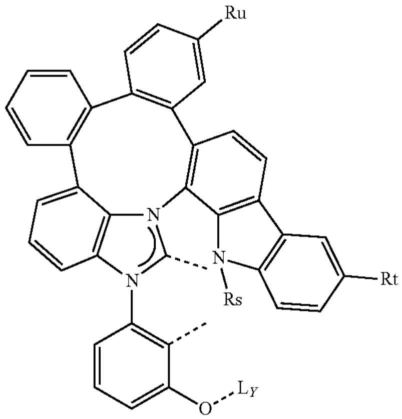 |
| $L_{A''}$47-(R1)(R1)(R1) to $L_{A''}$47-(R132)(R132)(R132) having the structure | 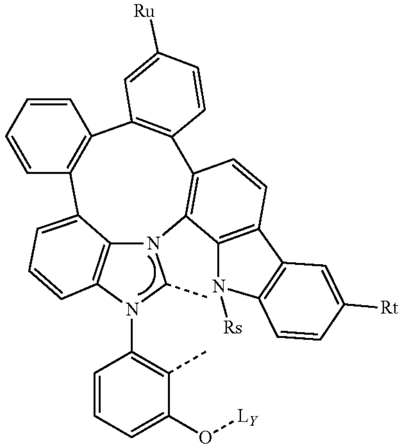 |

-continued

| Ligand $L_{A''}$ | Structure of $L_{A''}$ |
|---|---|
| $L_{A''}$48-(R1)(R1)(R1) to $L_{A''}$48-(R132)(R132)(R132) having the structure | 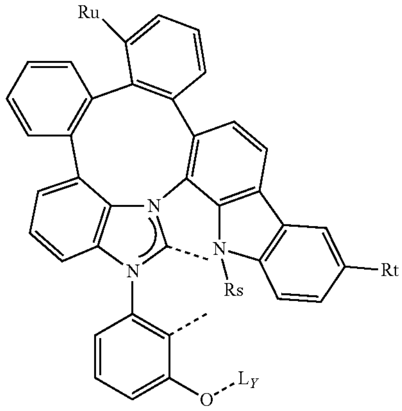 |
| $L_{A''}$49-(R1)(R1)(R1) to $L_{A''}$49-(R132)(R132)(R132) having the structure | 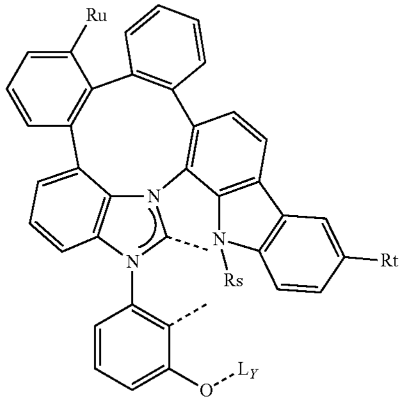 |
| $L_{A''}$50-(R1)(R1)(R1) to $L_{A''}$50-(R132)(R132)(R132) having the structure | 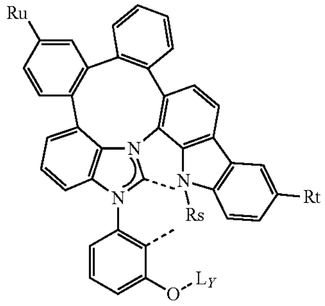 |
| $L_{A''}$51-(R1)(R1)(R1) to $L_{A''}$51-(R132)(R132)(R132) having the structure | 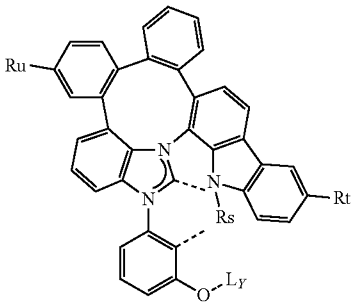 |

-continued

| Ligand $L_{A''}$ | Structure of $L_{A''}$ |
|---|---|
| $L_{A''}$52-(R1)(R1)(R1) to $L_{A''}$52-(R132)(R132)(R132) having the structure | 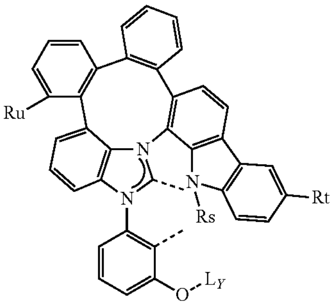 |
| $L_{A''}$53-(R1)(R1)(R1) to $L_{A''}$53-(R132)(R132)(R132) having the structure | 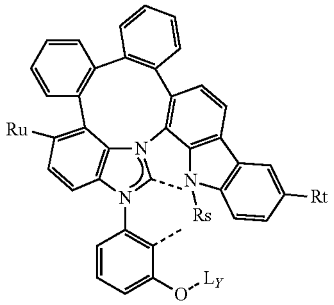 |
| $L_{A''}$54-(R1)(R1)(R1) to $L_{A''}$54-(R132)(R132)(R132) having the structure | 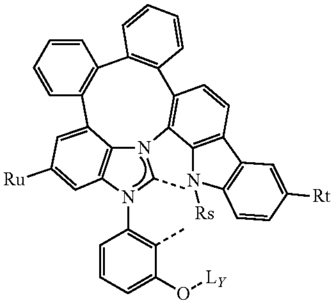 |
| $L_{A''}$55-(R1)(R1)(R1) to $L_{A''}$55-(R132)(R132)(R132) having the structure | 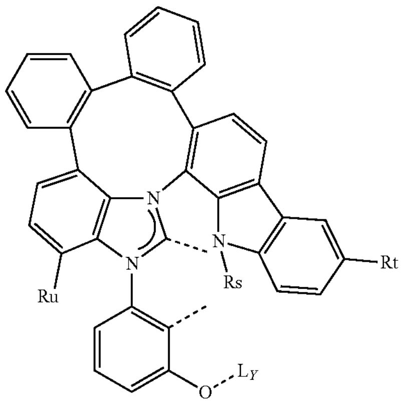 |

-continued

| Ligand $L_{A''}$ | Structure of $L_{A''}$ |
| --- | --- |
| $L_{A''}$56-(R1)(R1)(R1) to $L_{A''}$56-(R132)(R132)(R132) having the structure | 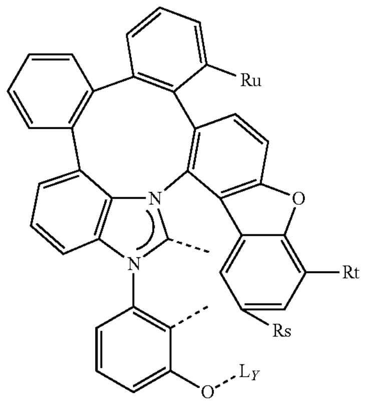 |
| $L_{A''}$57-(R1)(R1)(R1) to $L_{A''}$57-(R132)(R132)(R132) having the structure | 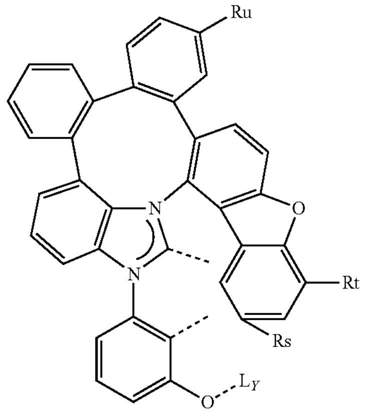 |
| $L_{A''}$58-(R1)(R1)(R1) to $L_{A''}$58-(R132)(R132)(R132) having the structure | 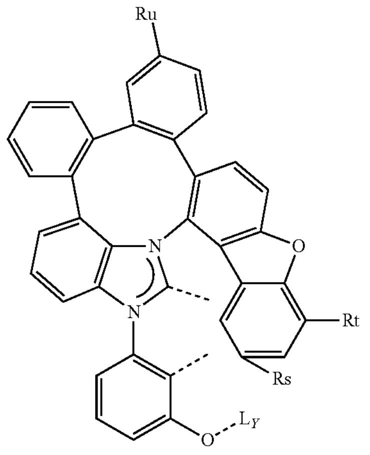 |

-continued

| Ligand $L_{A''}$ | Structure of $L_{A''}$ |
| --- | --- |
| $L_{A''}$59-(R1)(R1)(R1) to $L_{A''}$59-(R132)(R132)(R132) having the structure | 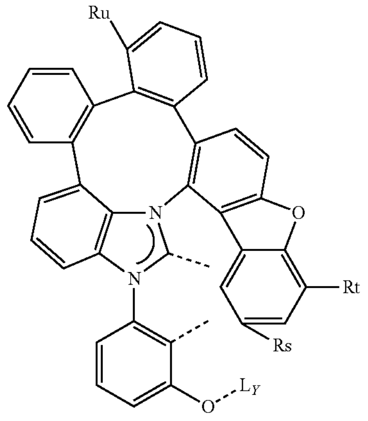 |
| $L_{A''}$60-(R1)(R1)(R1) to $L_{A''}$60-(R132)(R132)(R132) having the structure | 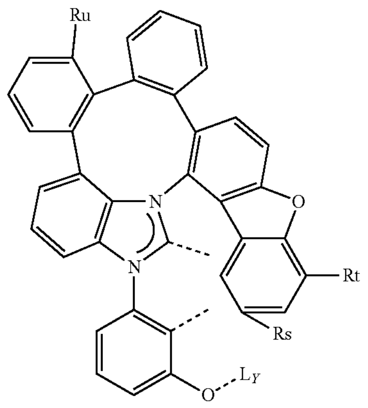 |
| $L_{A''}$61-(R1)(R1)(R1) to $L_{A''}$61-(R132)(R132)(R132) having the structure | 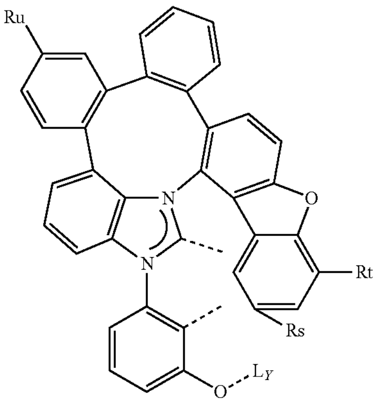 |
| $L_{A''}$62-(R1)(R1)(R1) to $L_{A''}$62-(R132)(R132)(R132) having the structure | 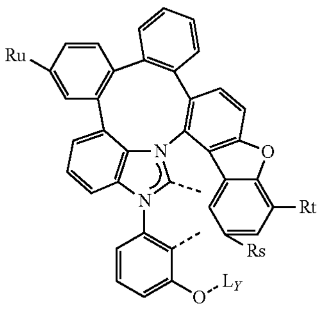 |

-continued

| Ligand $L_{A''}$ | Structure of $L_{A''}$ |
| --- | --- |
| $L_{A''}$63-(R1)(R1)(R1) to $L_{A''}$63-(R132)(R132)(R132) having the structure | 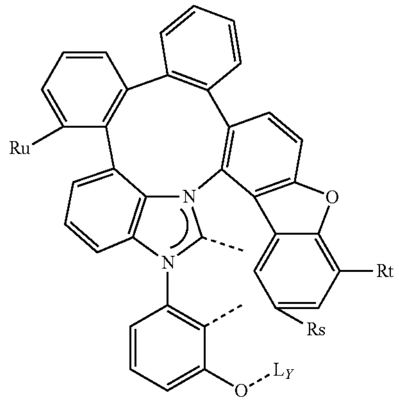 |
| $L_{A''}$64-(R1)(R1)(R1) to $L_{A''}$64-(R132)(R132)(R132) having the structure | 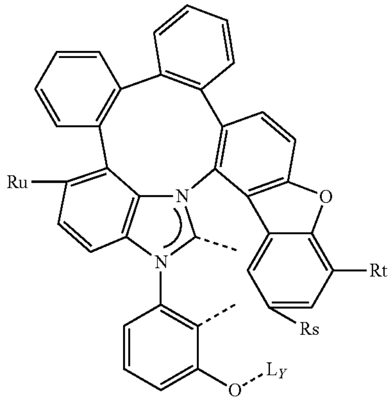 |
| $L_{A''}$65-(R1)(R1)(R1) to $L_{A''}$65-(R132)(R132)(R132) having the structure | 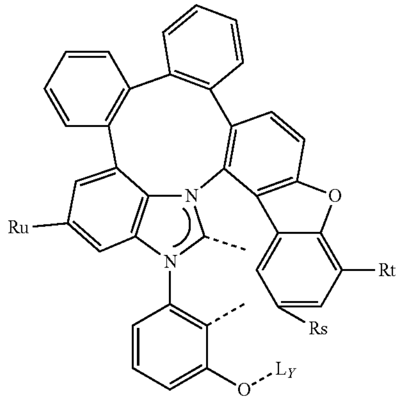 |

-continued

| Ligand $L_{A''}$ | Structure of $L_{A''}$ |
| --- | --- |
| $L_{A''}$66-(R1)(R1)(R1) to $L_{A''}$66-(R132)(R132)(R132) having the structure | 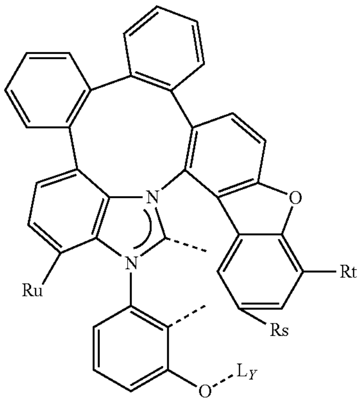 |
| $L_{A''}$67-(R1)(R1)(R1) to $L_{A''}$67-(R132)(R132)(R132) having the structure | 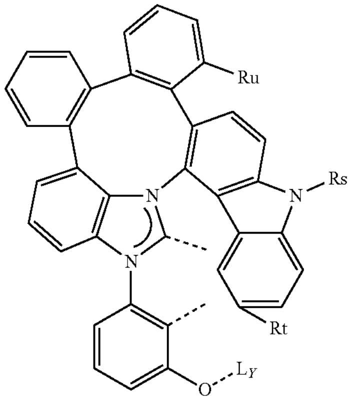 |
| $L_{A''}$68-(R1)(R1)(R1) to $L_{A''}$68-(R132)(R132)(R132) having the structure | 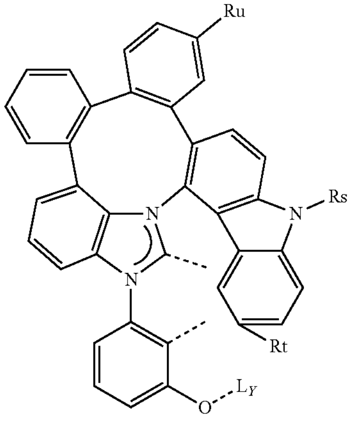 |

-continued

| Ligand $L_{A''}$ | Structure of $L_{A''}$ |
|---|---|
| $L_{A''}$69-(R1)(R1)(R1) to $L_{A''}$69-(R132)(R132)(R132) having the structure | 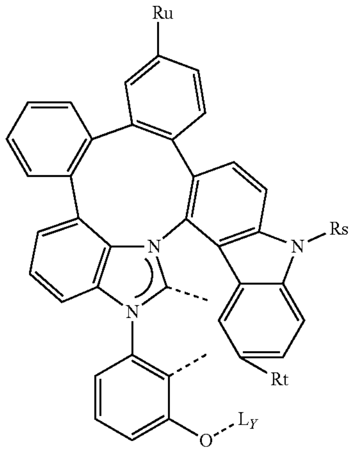 |
| $L_{A''}$70-(R1)(R1)(R1) to $L_{A''}$70-(R132)(R132)(R132) having the structure | 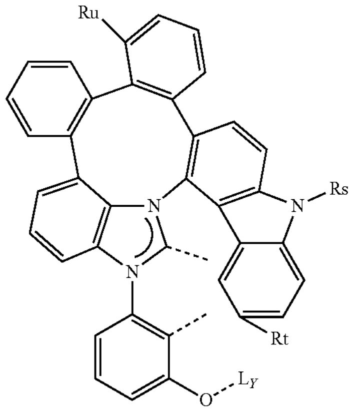 |
| $L_{A''}$71-(R1)(R1)(R1) to $L_{A''}$71-(R132)(R132)(R132) having the structure | 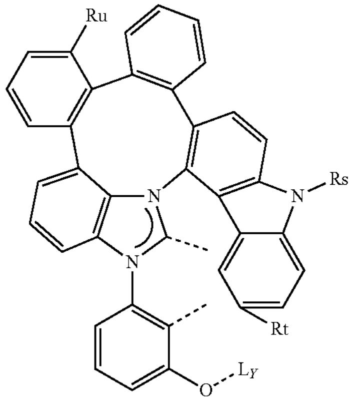 |

-continued

| Ligand $L_{A''}$ | Structure of $L_{A''}$ |
|---|---|
| $L_{A''}$72-(R1)(R1)(R1) to $L_{A''}$72-(R132)(R132)(R132) having the structure | 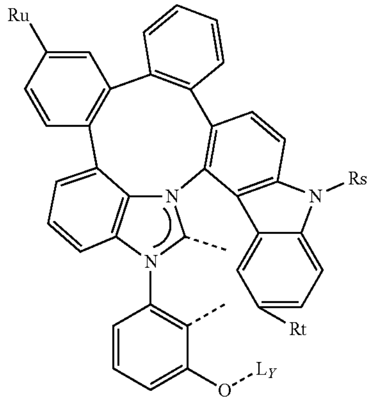 |
| $L_{A''}$73-(R1)(R1)(R1) to $L_{A''}$73-(R132)(R132)(R132) having the structure | 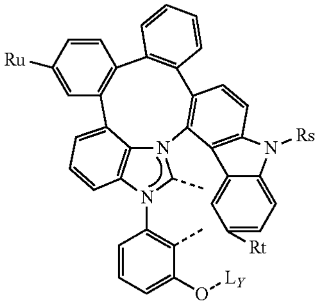 |
| $L_{A''}$74-(R1)(R1)(R1) to $L_{A''}$74-(R132)(R132)(R132) having the structure | 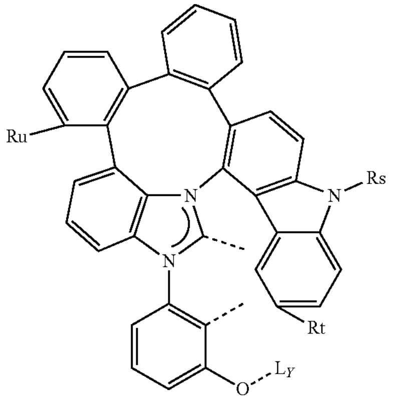 |
| $L_{A''}$75-(R1)(R1)(R1) to $L_{A''}$75-(R132)(R132)(R132) having the structure | 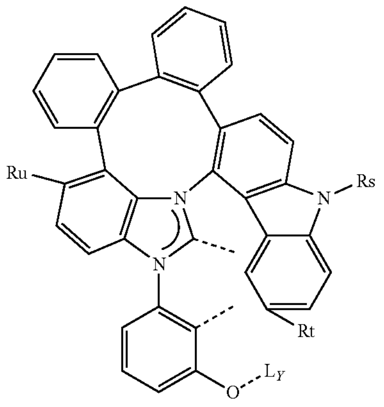 |

-continued

| Ligand $L_{A''}$ | Structure of $L_{A''}$ |
|---|---|
| $L_{A''}$76-(R1)(R1)(R1) to $L_{A''}$76-(R132)(R132)(R132) having the structure | 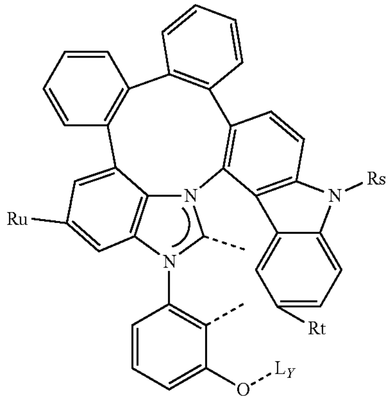 |
| $L_{A''}$77-(R1)(R1)(R1) to $L_{A''}$77-(R132)(R132)(R132) having the structure | 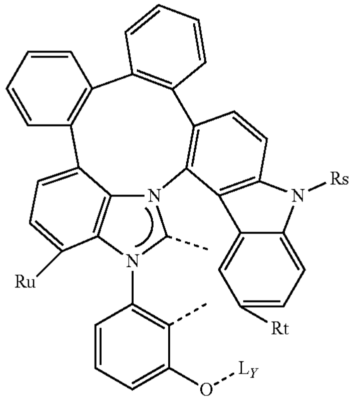 |
| $L_{A''}$78-(R1)(R1)(R1) to $L_{A''}$78-(R132)(R132)(R132) having the structure | 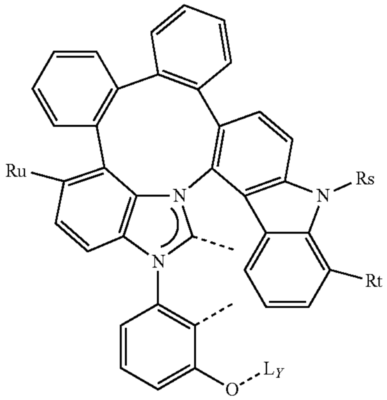 |
| $L_{A''}$79-(R1)(R1)(R1) to $L_{A''}$79-(R132)(R132)(R132) having the structure | 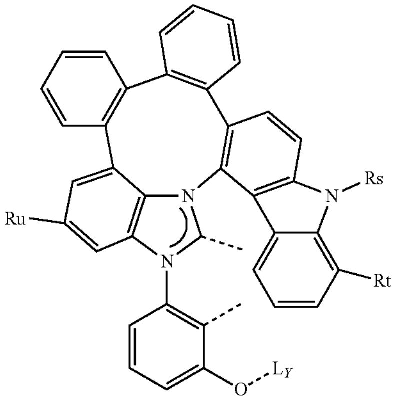 |

-continued

| Ligand $L_{A''}$ | Structure of $L_{A''}$ |
|---|---|
| $L_{A''}$80-(R1)(R1)(R1) to $L_{A''}$80-(R132)(R132)(R132) having the structure | 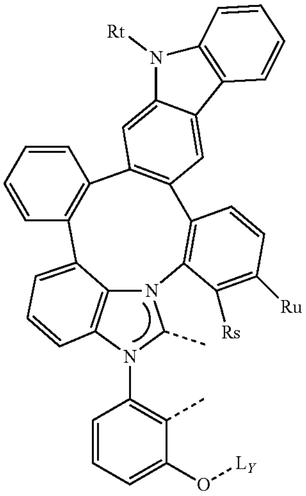 |
| $L_{A''}$81-(R1)(R1)(R1) to $L_{A''}$81-(R132)(R132)(R132) having the structure | 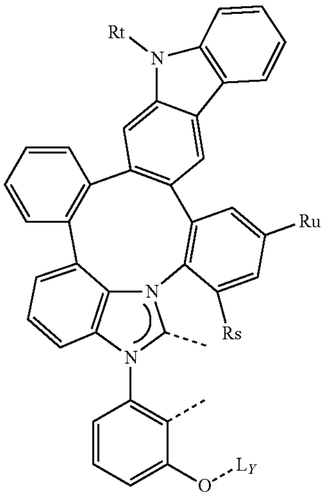 |
| $L_{A''}$82-(R1)(R1)(R1) to $L_{A''}$82-(R132)(R132)(R132) having the structure | 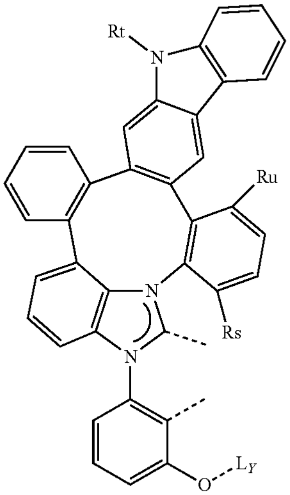 |

-continued

| Ligand $L_{A''}$ | Structure of $L_{A''}$ |
|---|---|
| $L_{A''}$83-(R1)(R1)(R1) to $L_{A''}$83-(R132)(R132)(R132) having the structure | 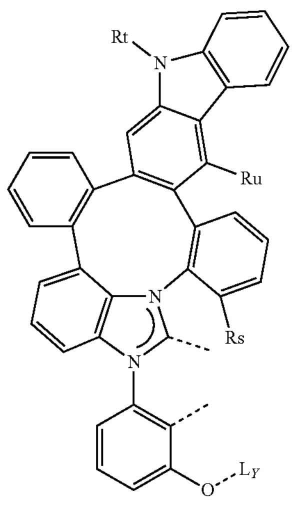 |
| $L_{A''}$84-(R1)(R1)(R1) to $L_{A''}$84-(R132)(R132)(R132) having the structure | 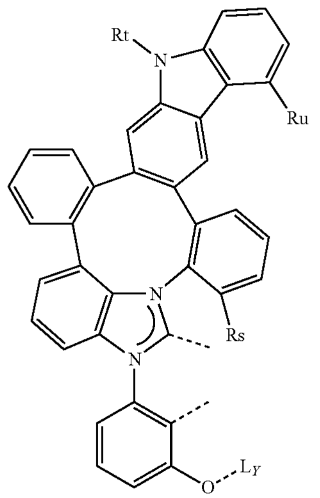 |
| $L_{A''}$85-(R1)(R1)(R1) to $L_{A''}$85-(R132)(R132)(R132) having the structure | 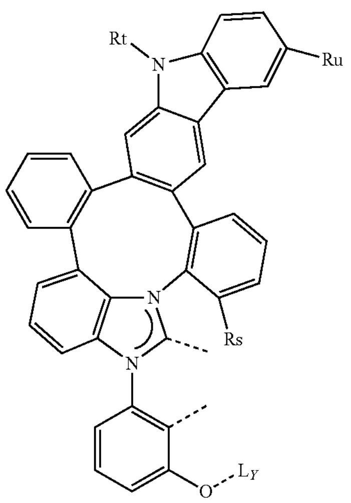 |

-continued

| Ligand $L_{A''}$ | Structure of $L_{A''}$ |
|---|---|
| $L_{A''}$86-(R1)(R1)(R1) to $L_{A''}$86-(R132)(R132)(R132) having the structure | 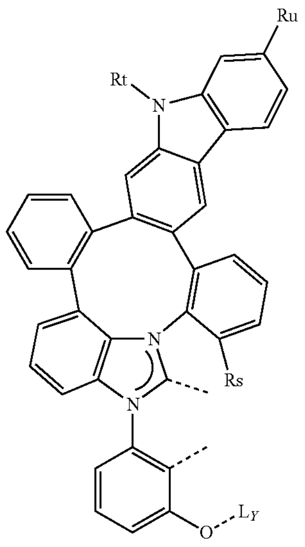 |
| $L_{A''}$87-(R1)(R1)(R1) to $L_{A''}$87-(R132)(R132)(R132) having the structure | 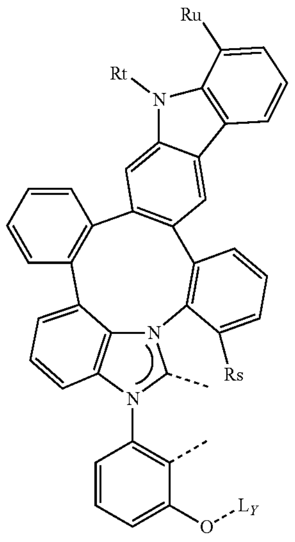 |
| $L_{A''}$88-(R1)(R1)(R1) to $L_{A''}$88-(R132)(R132)(R132) having the structure | 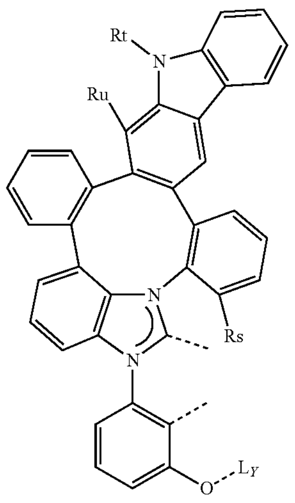 |

-continued

| Ligand $L_{A''}$ | Structure of $L_{A''}$ |
|---|---|
| $L_{A''}$89-(R1)(R1)(R1) to $L_{A''}$89-(R132)(R132)(R132) having the structure | 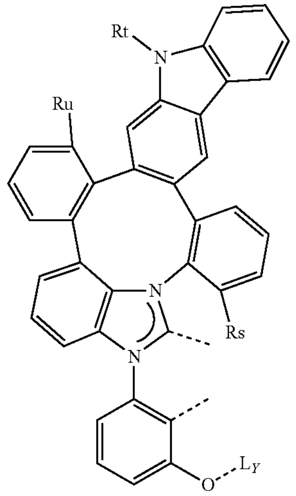 |
| $L_{A''}$90-(R1)(R1)(R1) to $L_{A''}$90-(R132)(R132)(R132) having the structure | 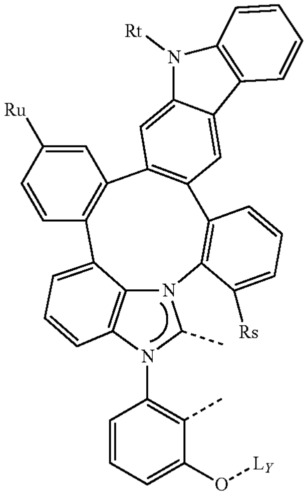 |
| $L_{A''}$91-(R1)(R1)(R1) to $L_{A''}$91-(R132)(R132)(R132) having the structure | 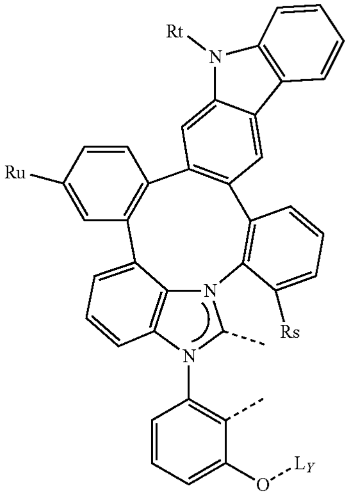 |

-continued

| Ligand $L_{A''}$ | Structure of $L_{A''}$ |
|---|---|
| $L_{A''}$92-(R1)(R1)(R1) to $L_{A''}$92-(R132)(R132)(R132) having the structure | 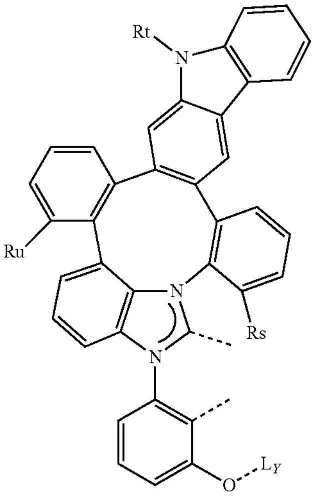 |
| $L_{A''}$93-(R1)(R1)(R1) to $L_{A''}$93-(R132)(R132)(R132) having the structure | 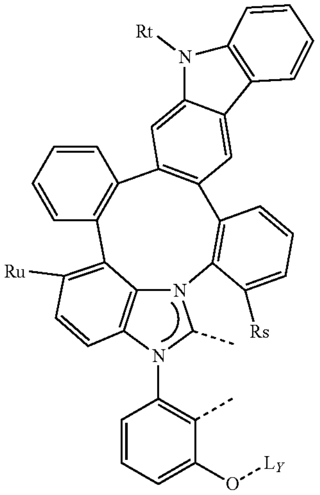 |
| $L_{A''}$94-(R1)(R1)(R1) to $L_{A''}$94-(R132)(R132)(R132) having the structure | 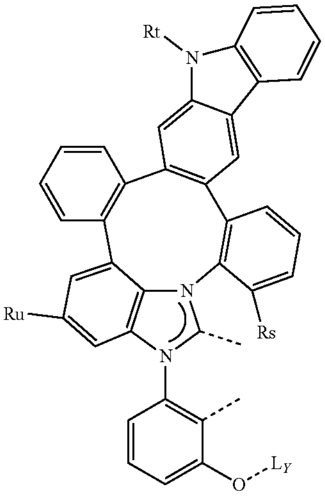 |

-continued

| Ligand $L_{A''}$ | Structure of $L_{A''}$ |
|---|---|
| $L_{A''}$95-(R1)(R1)(R1) to $L_{A''}$95-(R132)(R132)(R132) having the structure | 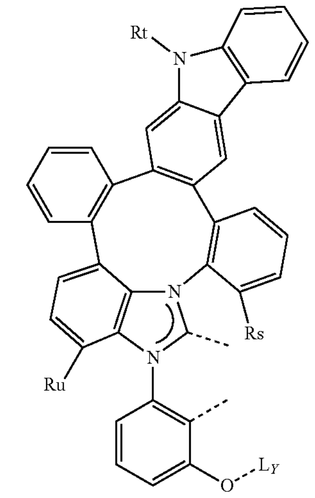 |
| $L_{A''}$96-(R1)(R1)(R1) to $L_{A''}$96-(R132)(R132)(R132) having the structure | 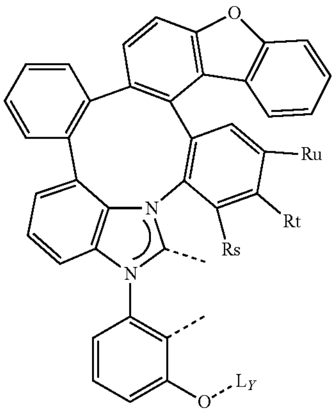 |
| $L_{A''}$97-(R1)(R1)(R1) to $L_{A''}$97-(R132)(R132)(R132) having the structure | 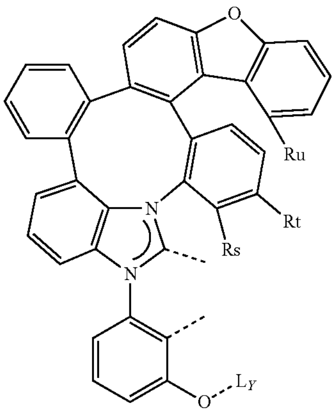 |

-continued

| Ligand $L_{A''}$ | Structure of $L_{A''}$ |
|---|---|
| $L_{A''}$98-(R1)(R1)(R1) to $L_{A''}$98-(R132)(R132)(R132) having the structure | 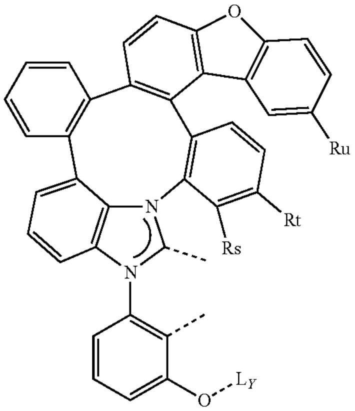 |
| $L_{A''}$99-(R1)(R1)(R1) to $L_{A''}$99-(R132)(R132)(R132) having the structure | 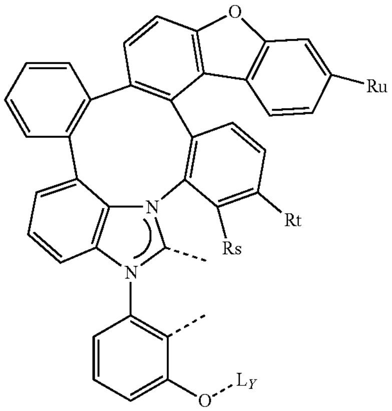 |
| $L_{A''}$100-(R1)(R1)(R1) to $L_{A''}$100-(R132)(R132)(R132) having the structure | 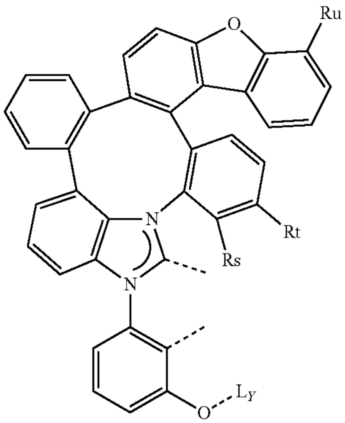 |

-continued

| Ligand $L_{A''}$ | Structure of $L_{A''}$ |
| --- | --- |
| $L_{A''}$101-(R1)(R1)(R1) to $L_{A''}$101-(R132)(R132)(R132) having the structure | 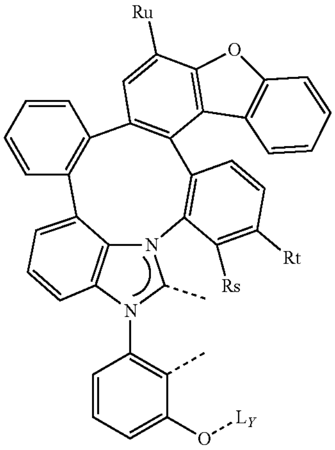 |
| $L_{A''}$102-(R1)(R1)(R1) to $L_{A''}$102-(R132)(R132)(R132) having the structure | 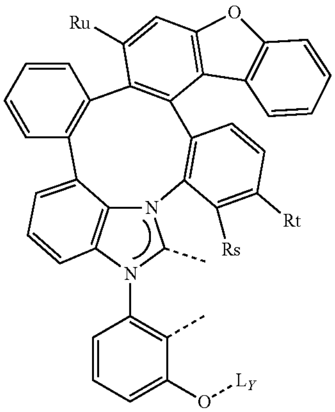 |
| $L_{A''}$103-(R1)(R1)(R1) to $L_{A''}$103-(R132)(R132)(R132) having the structure | 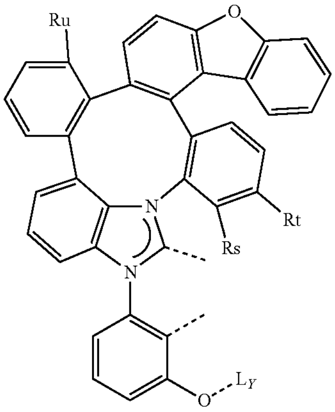 |

-continued

| Ligand $L_{A''}$ | Structure of $L_{A''}$ |
| --- | --- |
| $L_{A''}$104-(R1)(R1)(R1) to $L_{A''}$104-(R132)(R132)(R132) having the structure | 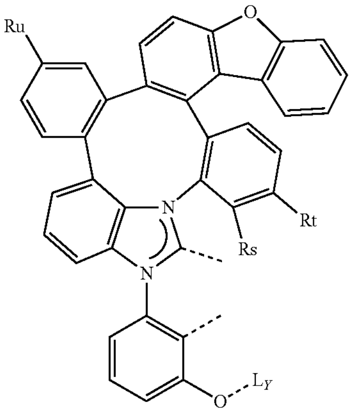 |
| $L_{A''}$105-(R1)(R1)(R1) to $L_{A''}$105-(R132)(R132)(R132) having the structure | 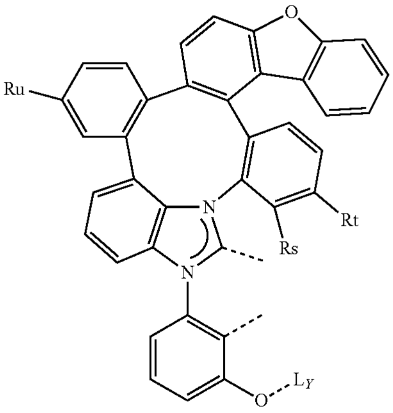 |
| $L_{A''}$106-(R1)(R1)(R1) to $L_{A''}$106-(R132)(R132)(R132) having the structure | 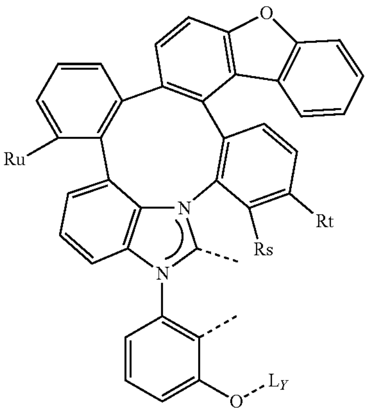 |

-continued
| Ligand $L_{A''}$ | Structure of $L_{A''}$ |
| --- | --- |
| $L_{A''}$107-(R1)(R1)(R1) to $L_{A''}$107-(R132)(R132)(R132) having the structure | 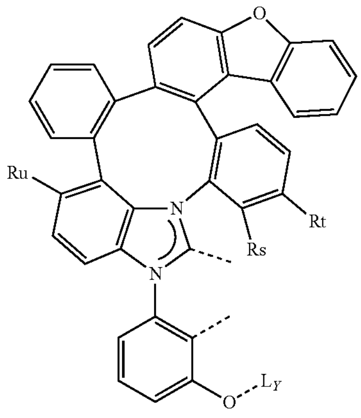 |
| $L_{A''}$108-(R1)(R1)(R1) to $L_{A''}$108-(R132)(R132)(R132) having the structure | 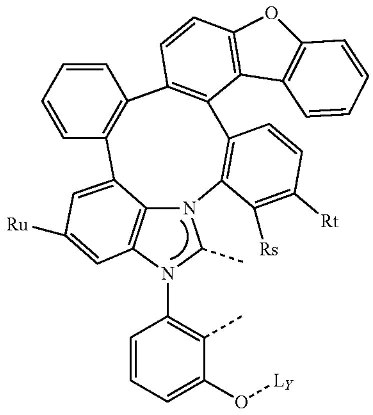 |
| $L_{A''}$109-(R1)(R1)(R1) to $L_{A''}$109-(R132)(R132)(R132) having the structure | 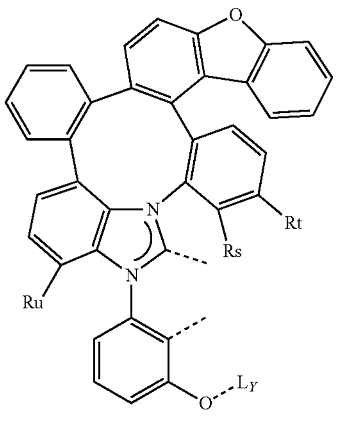 |
| $L_{A''}$110-(R1)(R1)(R1) to $L_{A''}$110-(R132)(R132)(R132) having the structure | 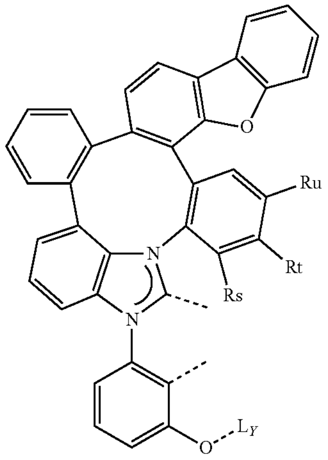 |
| $L_{A''}$111-(R1)(R1)(R1) to $L_{A''}$111-(R132)(R132)(R132) having the structure | 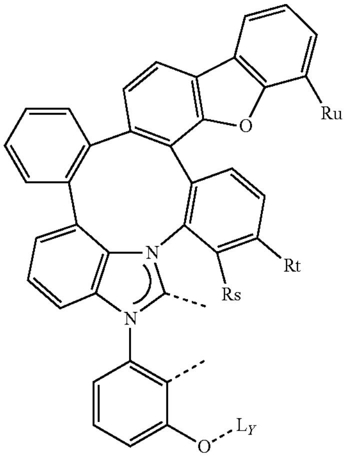 |
| $L_{A''}$112-(R1)(R1)(R1) to $L_{A''}$112-(R132)(R132)(R132) having the structure | 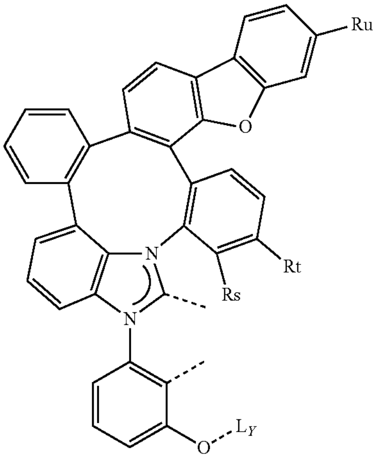 |

-continued

| Ligand $L_{A''}$ | Structure of $L_{A''}$ |
|---|---|
| $L_{A''}$113-(R1)(R1)(R1) to $L_{A''}$113-(R132)(R132)(R132) having the structure | 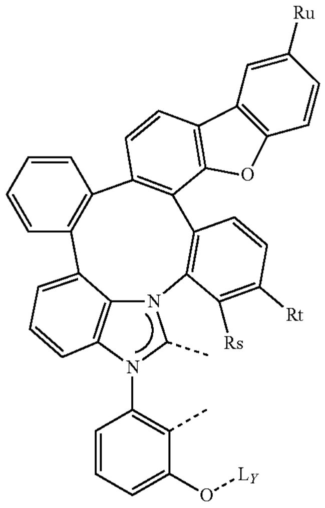 |
| $L_{A''}$114-(R1)(R1)(R1) to $L_{A''}$114-(R132)(R132)(R132) having the structure | 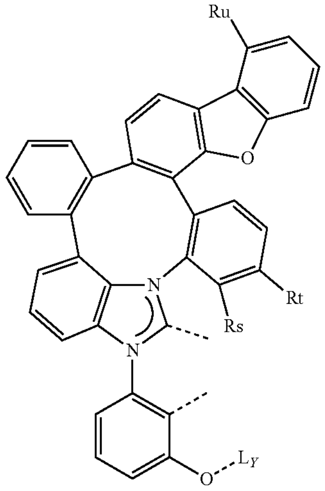 |
| $L_{A''}$115-(R1)(R1)(R1) to $L_{A''}$115-(R132)(R132)(R132) having the structure | 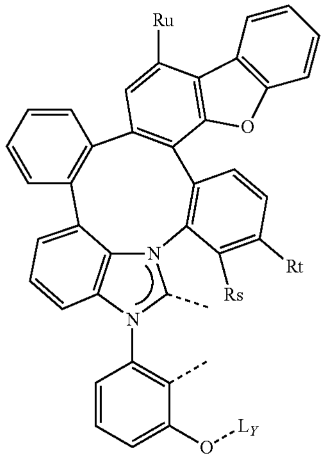 |

-continued

| Ligand $L_{A''}$ | Structure of $L_{A''}$ |
|---|---|
| $L_{A''}$116-(R1)(R1)(R1) to $L_{A''}$116-(R132)(R132)(R132) having the structure | 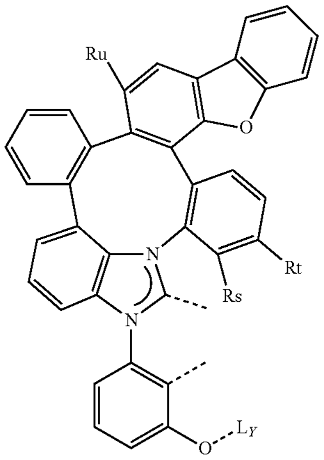 |
| $L_{A''}$117-(R1)(R1)(R1) to $L_{A''}$117-(R132)(R132)(R132) having the structure | 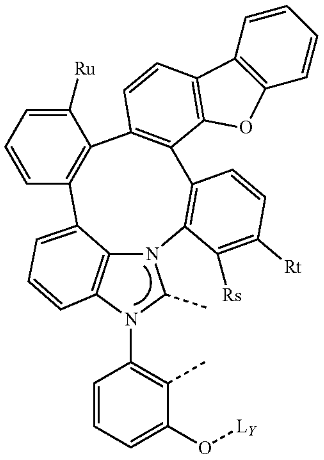 |
| $L_{A''}$118-(R1)(R1)(R1) to $L_{A''}$118-(R132)(R132)(R132) having the structure | 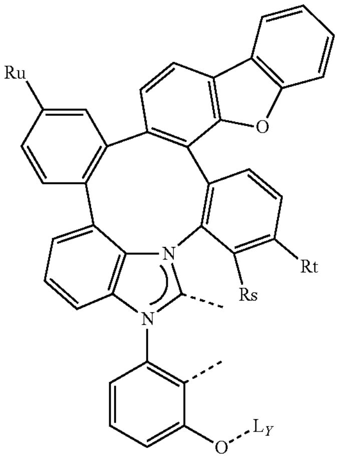 |

-continued

| Ligand $L_{A''}$ | Structure of $L_{A''}$ |
|---|---|
| $L_{A''}$132-(R1)(R1)(R1) to $L_{A''}$132-(R132)(R132)(R132) having the structure | 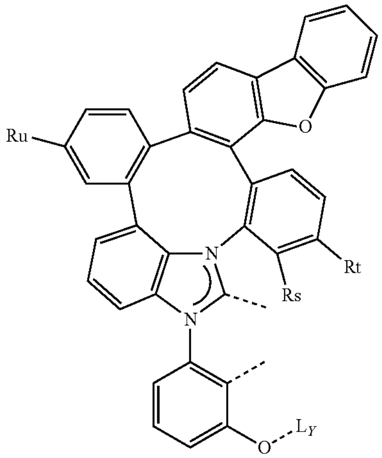 |
| $L_{A''}$120-(R1)(R1)(R1) to $L_{A''}$120-(R132)(R132)(R132) having the structure | 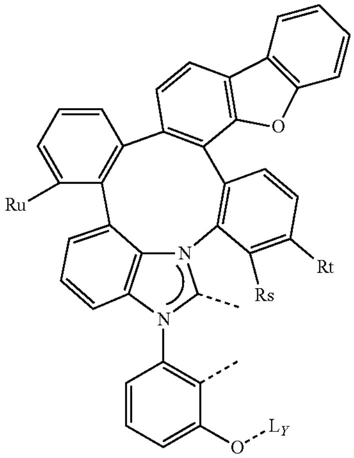 |
| $L_{A''}$121-(R1)(R1)(R1) to $L_{A''}$121-(R132)(R132)(R132) having the structure | 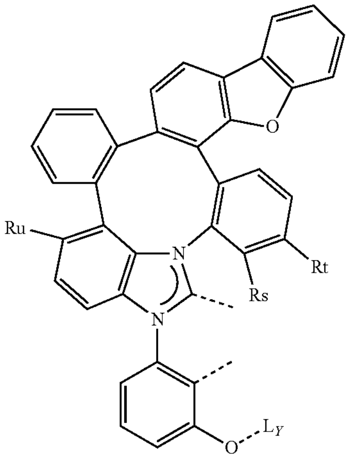 |

-continued

| Ligand $L_{A''}$ | Structure of $L_{A''}$ |
|---|---|
| $L_{A''}$122-(R1)(R1)(R1) to $L_{A''}$122-(R132)(R132)(R132) having the structure | 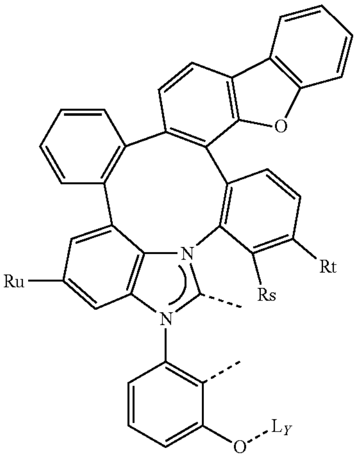 |
| $L_{A''}$123-(R1)(R1)(R1) to $L_{A''}$123-(R132)(R132)(R132) having the structure | 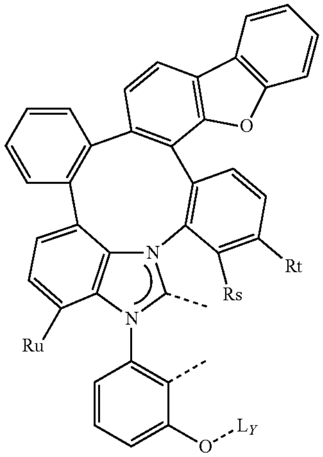 |
| $L_{A''}$124-(R1)(R1)(R1) to $L_{A''}$124-(R132)(R132)(R132) having the structure | 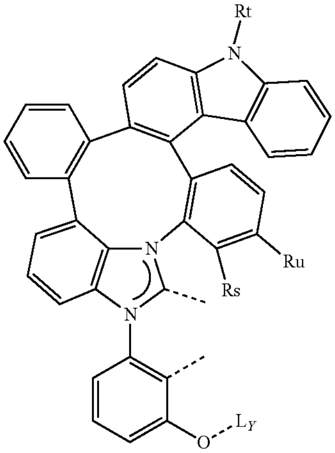 |

-continued

| Ligand $L_{A''}$ | Structure of $L_{A''}$ |
| --- | --- |
| $L_{A''}$125-(R1)(R1)(R1) to $L_{A''}$125-(R132)(R132)(R132) having the structure | 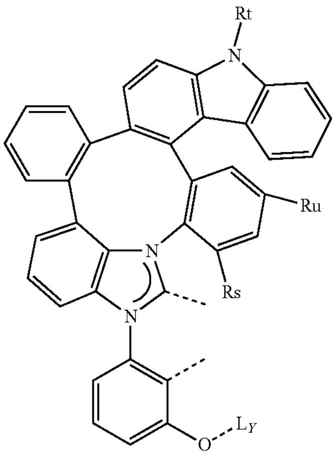 |
| $L_{A''}$126-(R1)(R1)(R1) to $L_{A''}$126-(R132)(R132)(R132) having the structure | 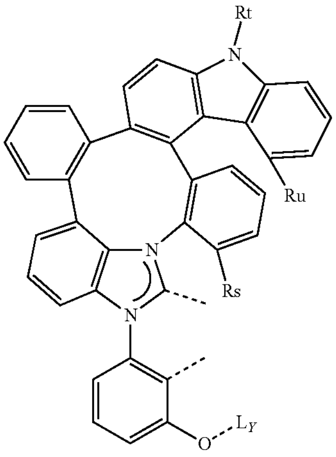 |
| $L_{A''}$127-(R1)(R1)(R1) to $L_{A''}$127-(R132)(R132)(R132) having the structure | 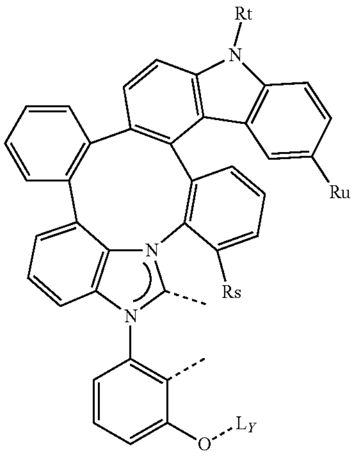 |

-continued

| Ligand $L_{A''}$ | Structure of $L_{A''}$ |
| --- | --- |
| $L_{A''}$128-(R1)(R1)(R1) to $L_{A''}$128-(R132)(R132)(R132) having the structure | 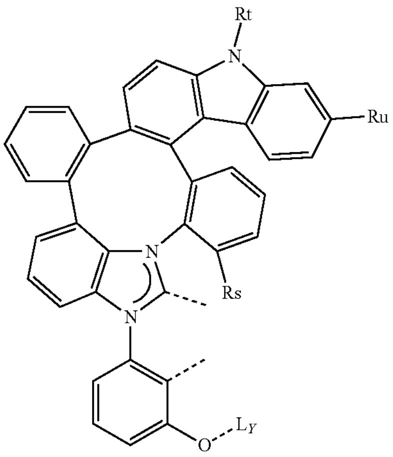 |
| $L_{A''}$129-(R1)(R1)(R1) to $L_{A''}$129-(R132)(R132)(R132) having the structure | 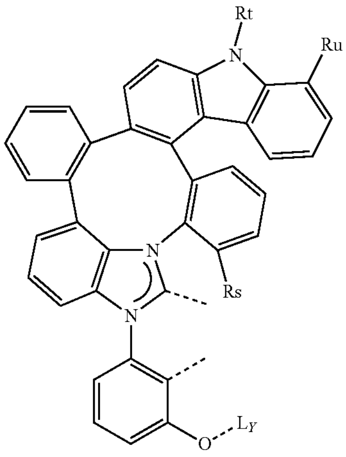 |
| $L_{A''}$130-(R1)(R1)(R1) to $L_{A''}$130-(R132)(R132)(R132) having the structure | 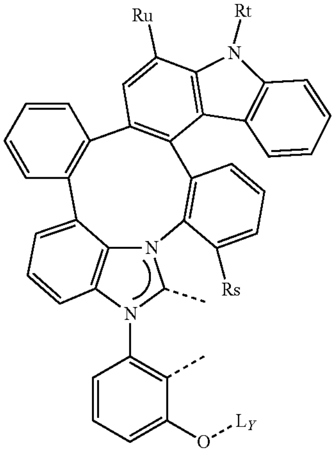 |

-continued

| Ligand $L_{A''}$ | Structure of $L_{A''}$ |
|---|---|
| $L_{A''}$131-(R1)(R1)(R1) to $L_{A''}$131-(R132)(R132)(R132) having the structure | 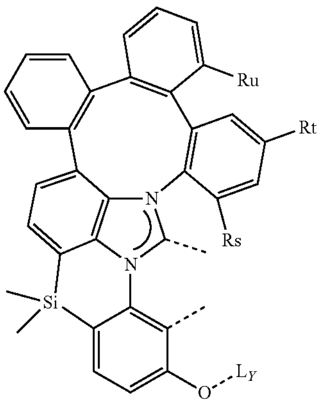 |
| $L_{A''}$132-(R1)(R1)(R1) to $L_{A''}$132-(R132)(R132)(R132) having the structure | 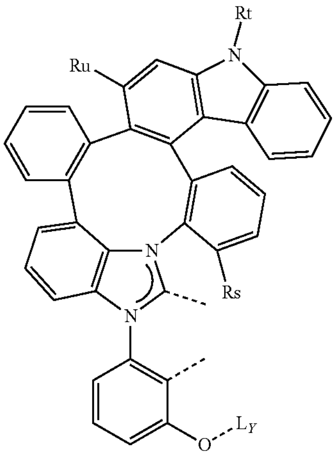 |
| $L_{A''}$133-(R1)(R1)(R1) to $L_{A''}$133-(R132)(R132)(R132) having the structure | 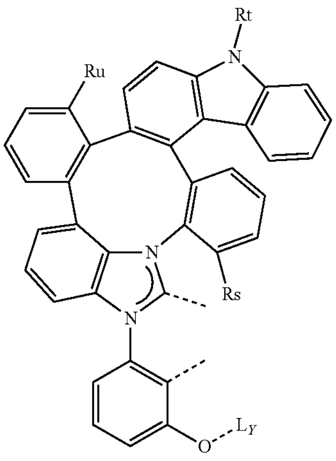 |

-continued

| Ligand $L_{A''}$ | Structure of $L_{A''}$ |
|---|---|
| $L_{A''}$134-(R1)(R1)(R1) to $L_{A''}$134-(R132)(R132)(R132) having the structure | 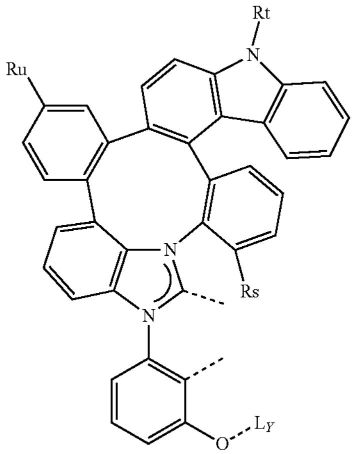 |
| $L_{A''}$15-(R1)(R1)(R1) to $L_{A''}$135-(R132)(R132)(R132) having the structure | 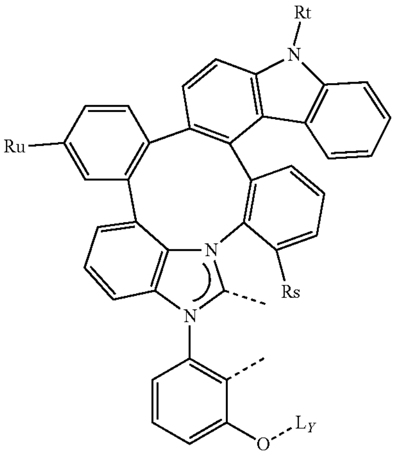 |
| $L_{A''}$136-(R1)(R1)(R1) to $L_{A''}$136-(R132)(R132)(R132) having the structure | 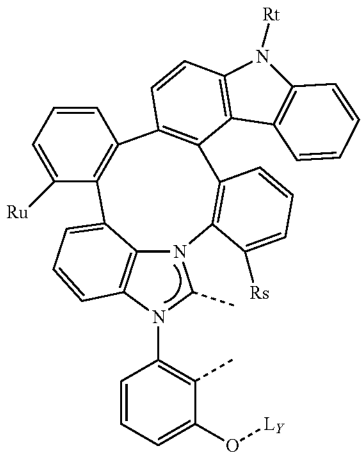 |

-continued

| Ligand $L_{A''}$ | Structure of $L_{A''}$ |
| --- | --- |
| $L_{A''}$137-(R1)(R1)(R1) to $L_{A''}$137-(R132)(R132)(R132) having the structure | 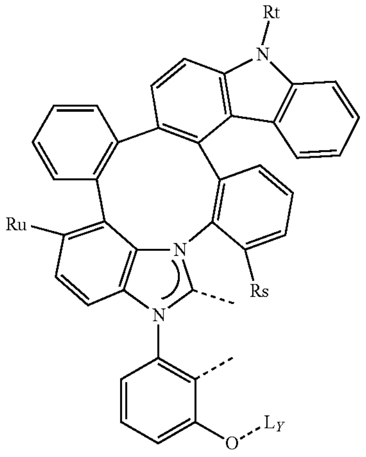 |
| $L_{A''}$138-(R1)(R1)(R1) to $L_{A''}$138-(R132)(R132)(R132) having the structure | 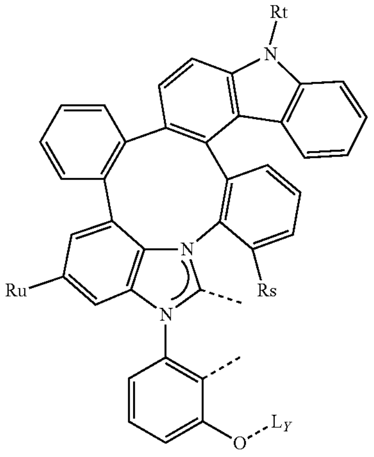 |
| $L_{A''}$139-(R1)(R1)(R1) to $L_{A''}$139-(R132)(R132)(R132) having the structure | 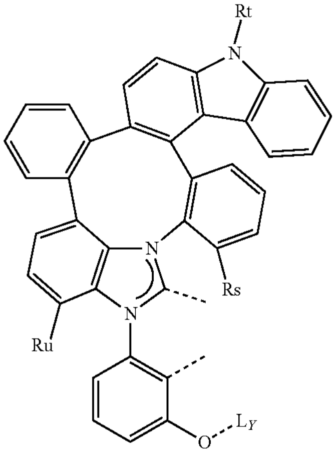 |

-continued

| Ligand $L_{A''}$ | Structure of $L_{A''}$ |
| --- | --- |
| $L_{A''}$140-(R1)(R1)(R1) to $L_{A''}$140-(R132)(R132)(R132) having the structure | 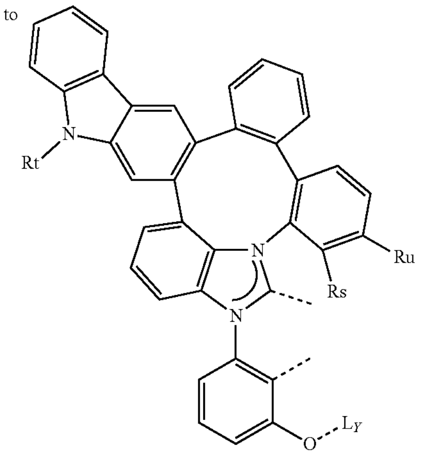 |
| $L_{A''}$141-(R1)(R1)(R1) to $L_{A''}$141-(R132)(R132)(R132) having the structure | 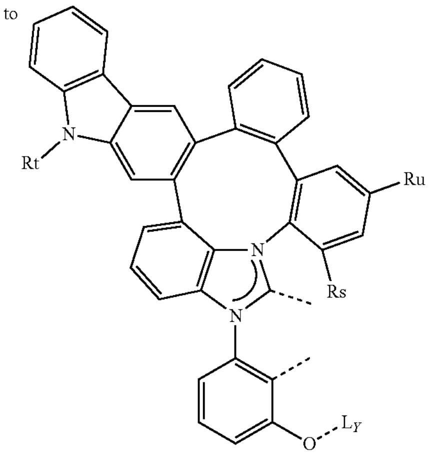 |
| $L_{A''}$142-(R1)(R1)(R1) to $L_{A''}$142-(R132)(R132)(R132) having the structure | 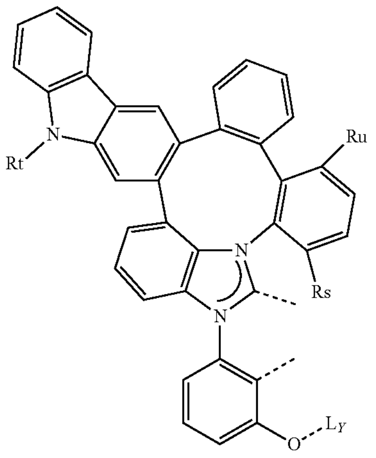 |

-continued

| Ligand $L_{A''}$ | Structure of $L_{A''}$ |
|---|---|
| $L_{A''}$143-(R1)(R1)(R1) to $L_{A''}$143-(R132)(R132)(R132) having the structure | 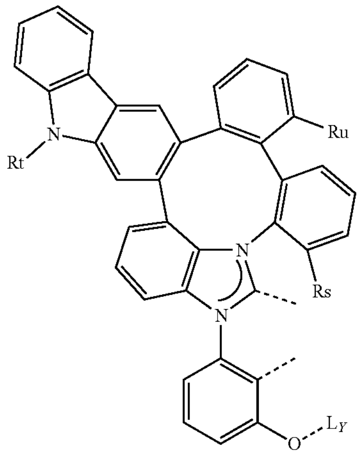 |
| $L_{A''}$144-(R1)(R1)(R1) to $L_{A''}$144-(R132)(R132)(R132) having the structure | 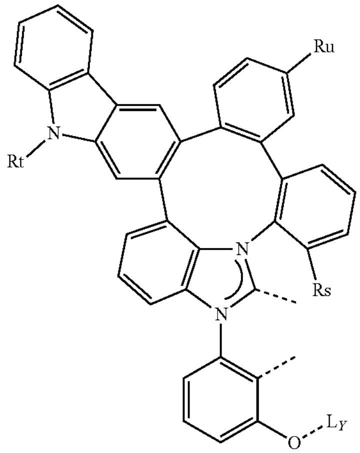 |
| $L_{A''}$145-(R1)(R1)(R1) to $L_{A''}$145-(R132)(R132)(R132) having the structure | 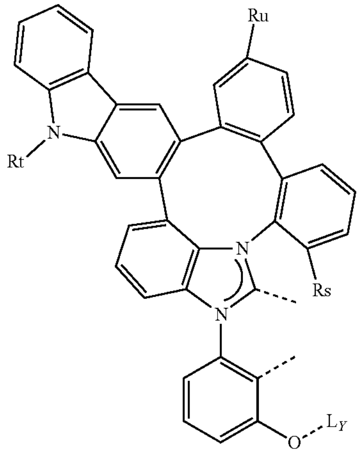 |

-continued

| Ligand $L_{A''}$ | Structure of $L_{A''}$ |
|---|---|
| $L_{A''}$146-(R1)(R1)(R1) to $L_{A''}$146-(R132)(R132)(R132) having the structure | 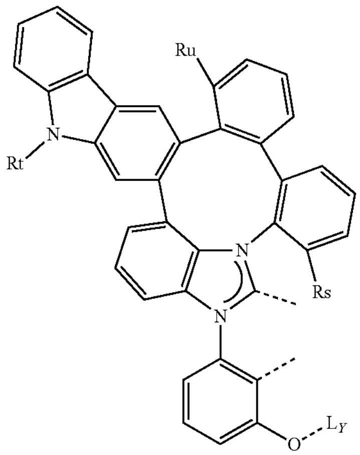 |
| $L_{A''}$147-(R1)(R1)(R1) to $L_{A''}$147-(R132)(R132)(R132) having the structure | 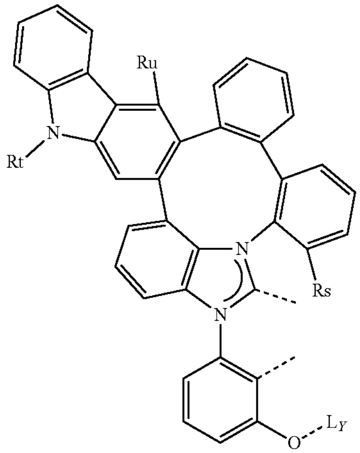 |
| $L_{A''}$148-(R1)(R1)(R1) to $L_{A''}$148-(R132)(R132)(R132) having the structure | 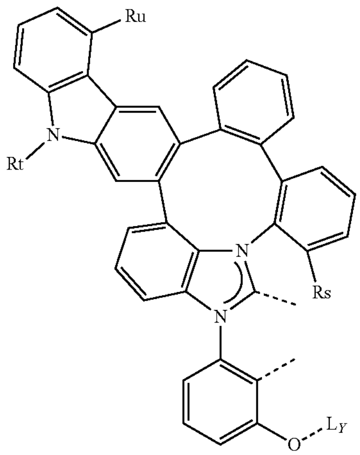 |

-continued
| Ligand $L_{A''}$ | Structure of $L_{A''}$ |
| --- | --- |
| $L_{A''}$149-(R1)(R1)(R1) to $L_{A''}$149-(R132)(R132)(R132) having the structure | 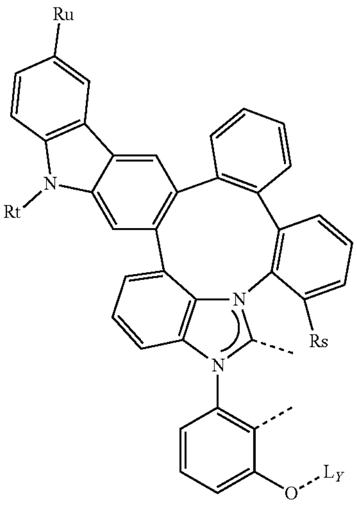 |
| $L_{A''}$150-(R1)(R1)(R1) to $L_{A''}$150-(R132)(R132)(R132) having the structure | 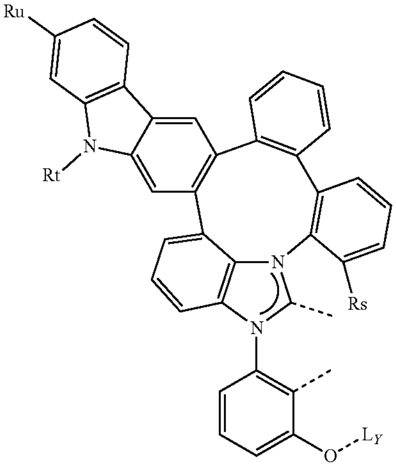 |
| $L_{A''}$151-(R1)(R1)(R1) to $L_{A''}$151-(R132)(R132)(R132) having the structure | 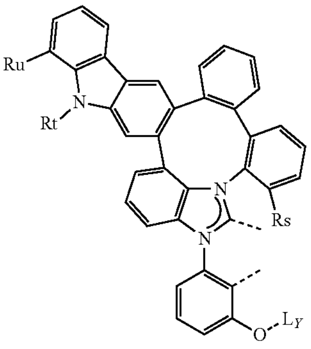 |
| $L_{A''}$152-(R1)(R1)(R1) to $L_{A''}$152-(R132)(R132)(R132) having the structure | 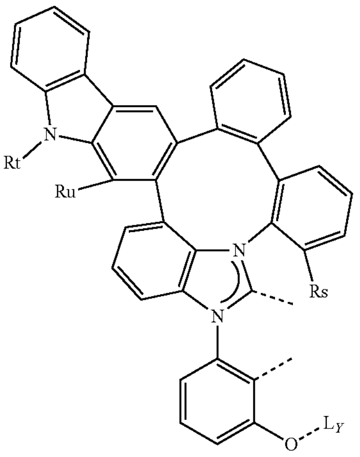 |
| $L_{A''}$153-(R1)(R1)(R1) to $L_{A''}$153-(R132)(R132)(R132) having the structure | 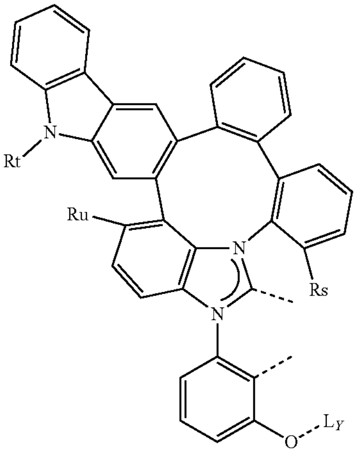 |
| $L_{A''}$154-(R1)(R1)(R1) to $L_{A''}$154-(R132)(R132)(R132) having the structure | 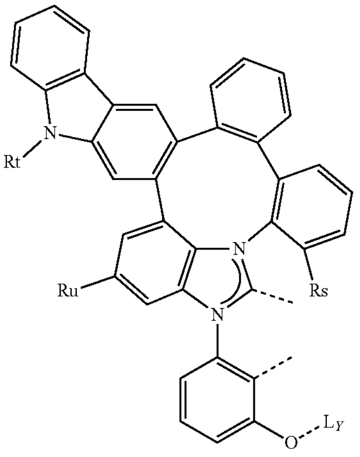 |

-continued

| Ligand $L_{A''}$ | Structure of $L_{A''}$ |
|---|---|
| $L_{A''}$155-(R1)(R1)(R1) to $L_{A''}$155-(R132)(R132)(R132) having the structure | 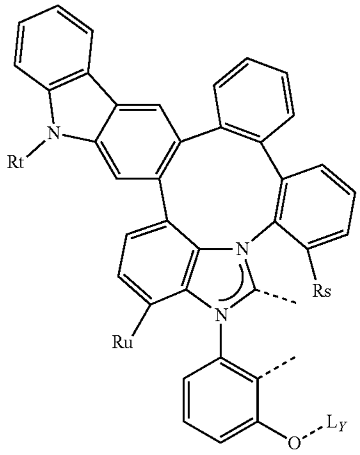 |
| $L_{A''}$156-(R1)(R1)(R1) to $L_{A''}$156-(R132)(R132)(R132) having the structure | 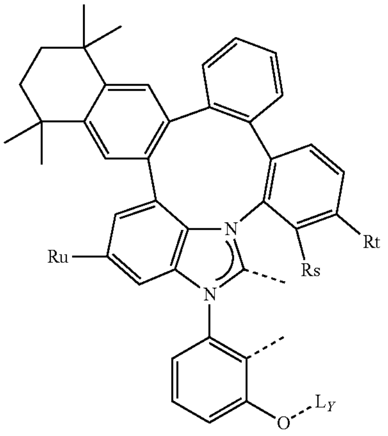 |
| $L_{A''}$157-(R1)(R1)(R1) to $L_{A''}$157-(R132)(R132)(R132) having the structure | 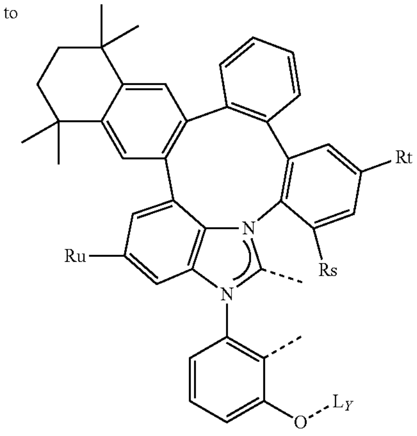 |

-continued

| Ligand $L_{A''}$ | Structure of $L_{A''}$ |
|---|---|
| $L_{A''}$158-(R1)(R1)(R1) to $L_{A''}$158-(R132)(R132)(R132) having the structure | 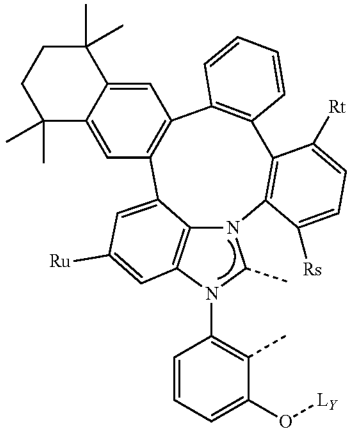 |
| $L_{A''}$159-(R1)(R1)(R1) to $L_{A''}$159-(R132)(R132)(R132) having the structure | 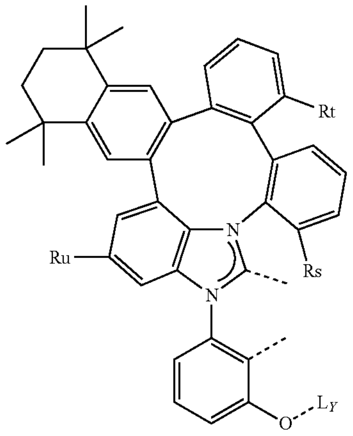 |
| $L_{A''}$160-(R1)(R1)(R1) to $L_{A''}$160-(R132)(R132)(R132) having the structure | 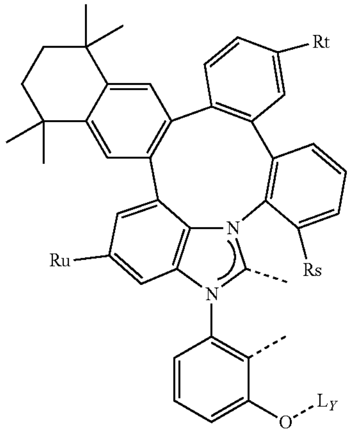 |

-continued

| Ligand $L_{A''}$ | Structure of $L_{A''}$ |
|---|---|
| $L_{A''}$161-(R1)(R1)(R1) to $L_{A''}$161-(R132)(R132)(R132) having the structure | 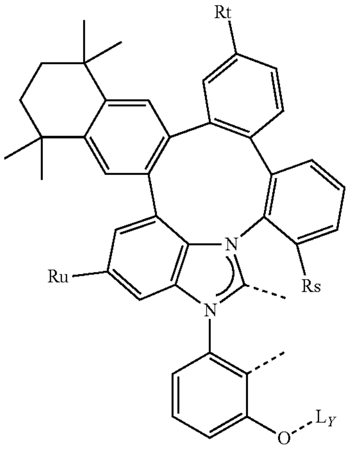 |
| $L_{A''}$162-(R1)(R1)(R1) to $L_{A''}$162-(R132)(R132)(R132) having the structure | 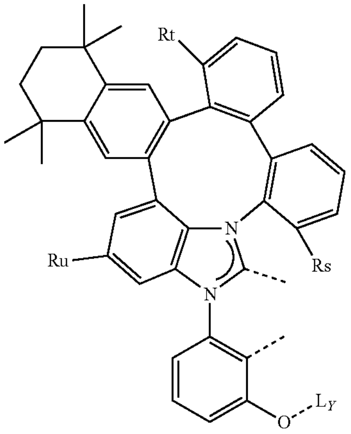 |
| $L_{A''}$163-(R1)(R1)(R1) to $L_{A''}$163-(R132)(R132)(R132) having the structure | 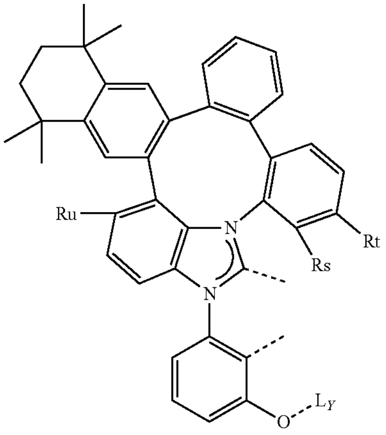 |

-continued

| Ligand $L_{A''}$ | Structure of $L_{A''}$ |
|---|---|
| $L_{A''}$164-(R1)(R1)(R1) to $L_{A''}$164-(R132)(R132)(R132) having the structure | 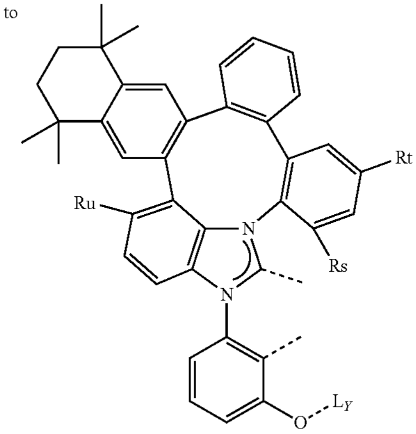 |
| $L_{A''}$165-(R1)(R1)(R1) to $L_{A''}$165-(R132)(R132)(R132) having the structure | 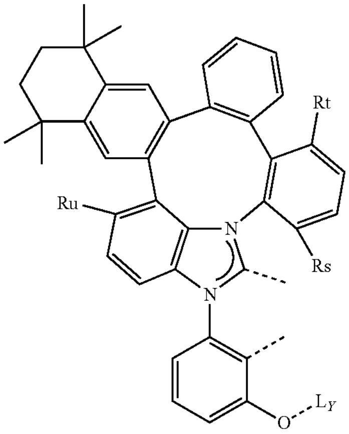 |
| $L_{A''}$166-(R1)(R1)(R1) to $L_{A''}$166-(R132)(R132)(R132) having the structure | 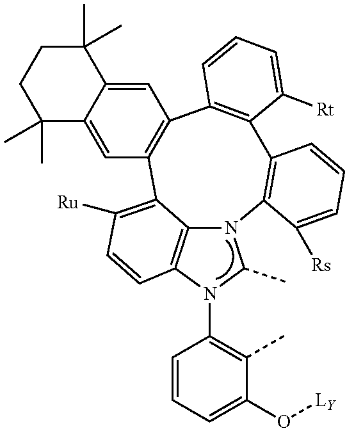 |

-continued

| Ligand $L_{A''}$ | Structure of $L_{A''}$ |
|---|---|
| $L_{A''}$167-(R1)(R1)(R1) to $L_{A''}$167-(R132)(R132)(R132) having the structure | 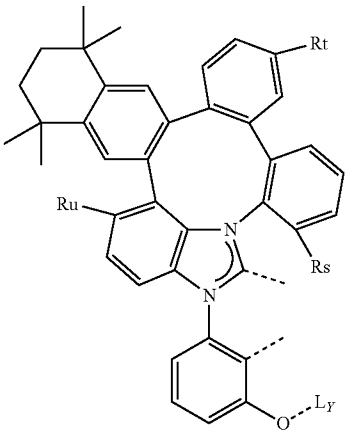 |
| $L_{A''}$168-(R1)(R1)(R1) to $L_{A''}$168-(R132)(R132)(R132) having the structure | 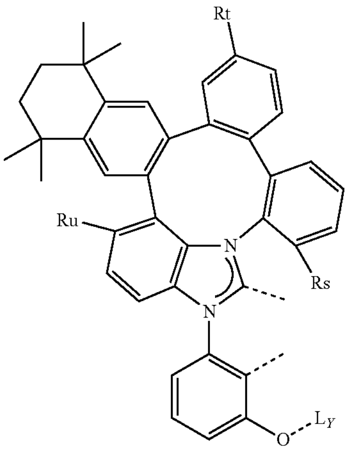 |
| $L_{A''}$169-(R1)(R1)(R1) to $L_{A''}$169-(R132)(R132)(R132) having the structure | 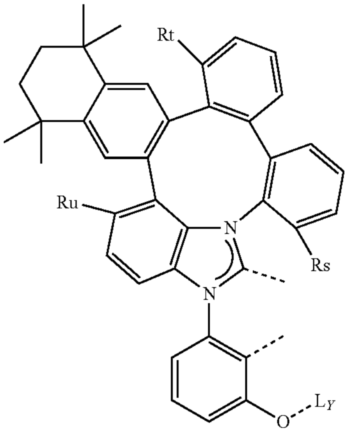 |

-continued

| Ligand $L_{A''}$ | Structure of $L_{A''}$ |
|---|---|
| $L_{A''}$170-(R1)(R1)(R1) to $L_{A''}$170-(R132)(R132)(R132) having the structure | 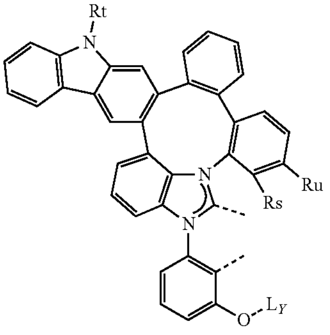 |
| $L_{A''}$171-(R1)(R1)(R1) to $L_{A''}$171-(R132)(R132)(R132) having the structure | 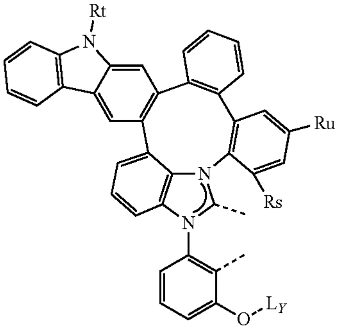 |
| $L_{A''}$172-(R1)(R1)(R1) to $L_{A''}$172-(R132)(R132)(R132) having the structure | 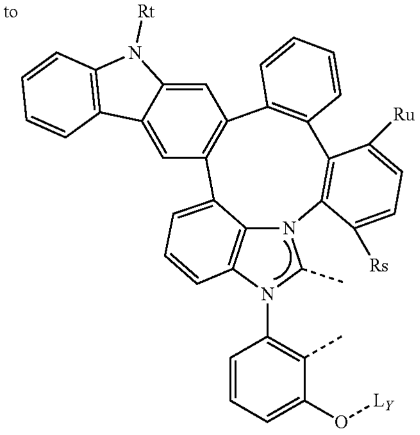 |
| $L_{A''}$173-(R1)(R1)(R1) to $L_{A''}$173-(R132)(R132)(R132) having the structure | 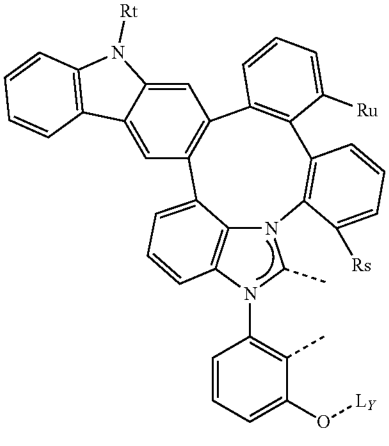 |

-continued

| Ligand $L_{A''}$ | Structure of $L_{A''}$ |
|---|---|
| $L_{A''}$174-(R1)(R1)(R1) to $L_{A''}$174-(R132)(R132)(R132) having the structure | 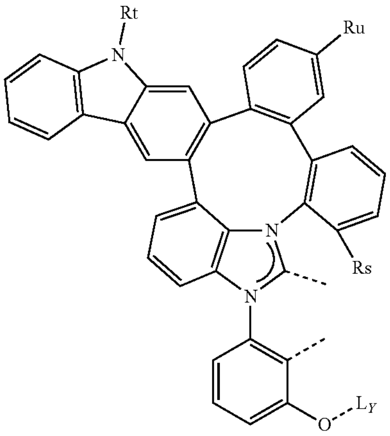 |
| $L_{A''}$175-(R1)(R1)(R1) to $L_{A''}$175-(R132)(R132)(R132) having the structure | 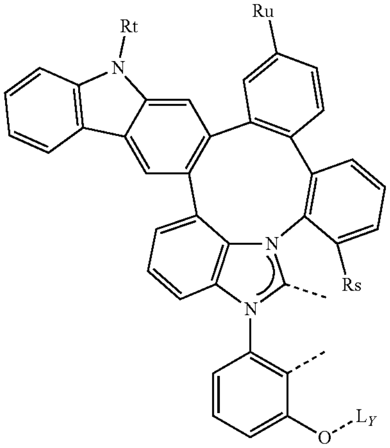 |
| $L_{A''}$176-(R1)(R1)(R1) to $L_{A''}$176-(R132)(R132)(R132) having the structure | 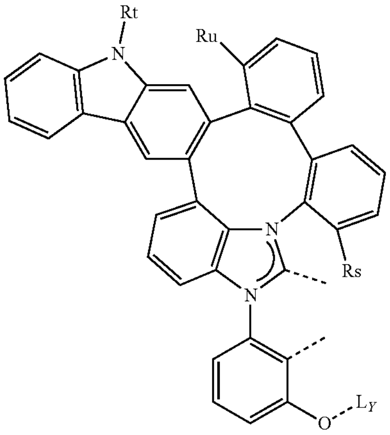 |

-continued

| Ligand $L_{A''}$ | Structure of $L_{A''}$ |
|---|---|
| $L_{A''}$177-(R1)(R1)(R1) to $L_{A''}$177-(R132)(R132)(R132) having the structure | 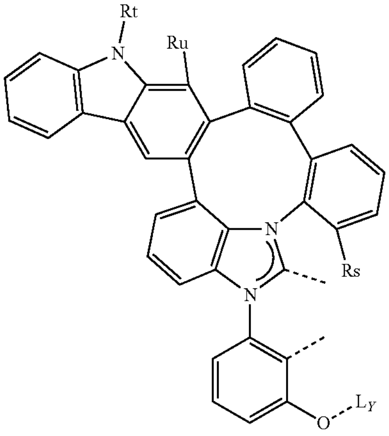 |
| $L_{A''}$178-(R1)(R1)(R1) to $L_{A''}$178-(R132)(R132)(R132) having the structure | 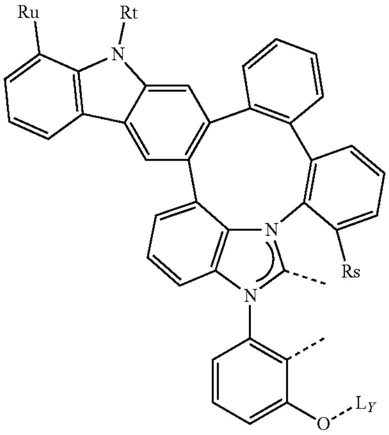 |
| $L_{A''}$179-(R1)(R1)(R1) to $L_{A''}$179-(R132)(R132)(R132) having the structure | 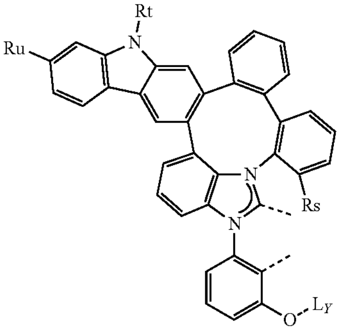 |
| $L_{A''}$180-(R1)(R1)(R1) to $L_{A''}$180-(R132)(R132)(R132) having the structure | 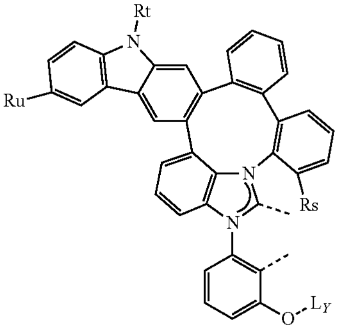 |

-continued

| Ligand $L_{A''}$ | Structure of $L_{A''}$ |
|---|---|
| $L_{A''}$181-(R1)(R1)(R1) to $L_{A''}$181-(R132)(R132)(R132) having the structure | 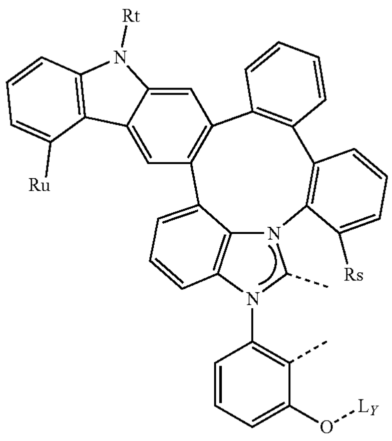 |
| $L_{A''}$182-(R1)(R1)(R1) to $L_{A''}$182-(R132)(R132)(R132) having the structure | 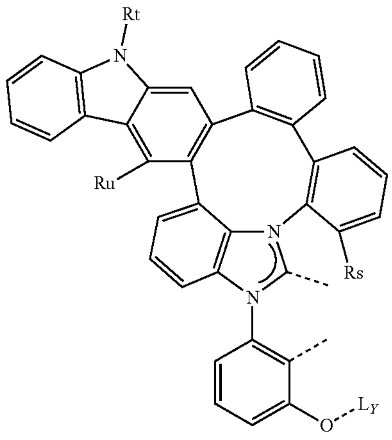 |
| $L_{A''}$183-(R1)(R1)(R1) to $L_{A''}$183-(R132)(R132)(R132) having the structure | 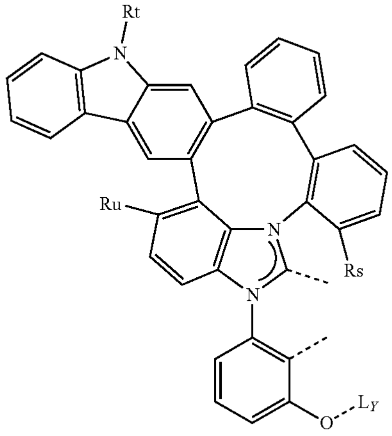 |

-continued

| Ligand $L_{A''}$ | Structure of $L_{A''}$ |
|---|---|
| $L_{A''}$184-(R1)(R1)(R1) to $L_{A''}$184-(R132)(R132)(R132) having the structure | 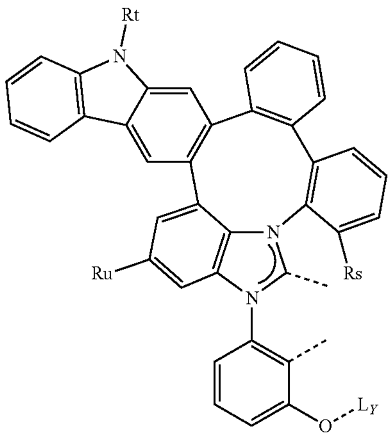 |
| $L_{A''}$185-(R1)(R1)(R1) to $L_{A''}$185-(R132)(R132)(R132) having the structure | 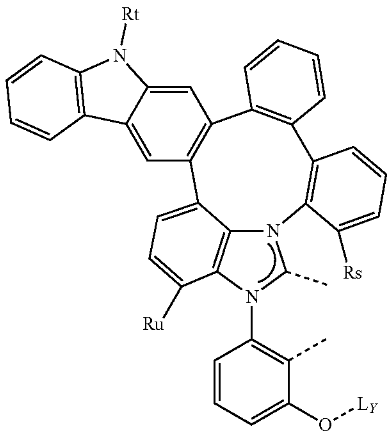 |
| $L_{A''}$186-(R1)(R1)(R1) to $L_{A''}$186-(R132)(R132)(R132) having the structure | 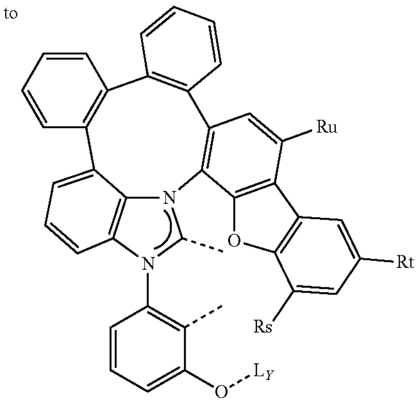 |

-continued

| Ligand $L_{A''}$ | Structure of $L_{A''}$ |
|---|---|
| $L_{A''}$187-(R1)(R1)(R1) to $L_{A''}$187-(R132)(R132)(R132) having the structure | 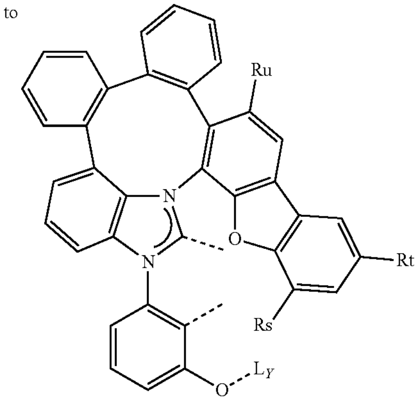 |
| $L_{A''}$188-(R1)(R1)(R1) to $L_{A''}$188-(R132)(R132)(R132) having the structure | 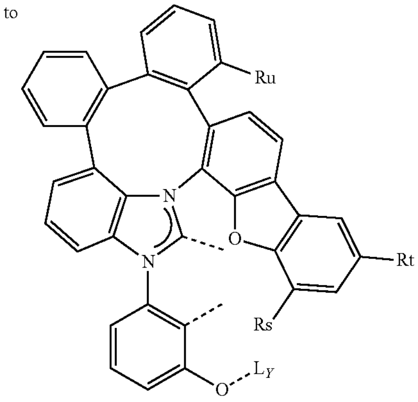 |
| $L_{A''}$189-(R1)(R1)(R1) to $L_{A''}$189-(R132)(R132)(R132) having the structure | 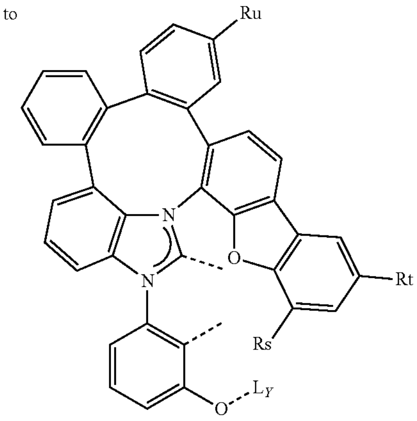 |

-continued

| Ligand $L_{A''}$ | Structure of $L_{A''}$ |
|---|---|
| $L_{A''}$190-(R1)(R1)(R1) to $L_{A''}$190-(R132)(R132)(R132) having the structure | 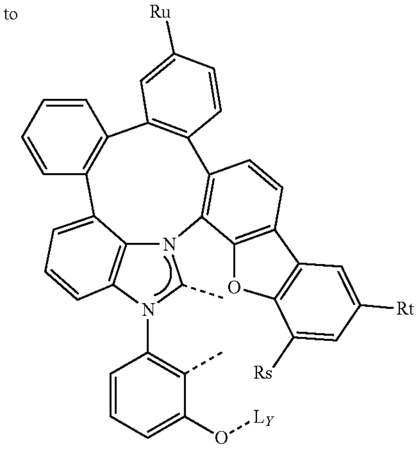 |
| $L_{A''}$191-(R1)(R1)(R1) to $L_{A''}$191-(R132)(R132)(R132) having the structure | 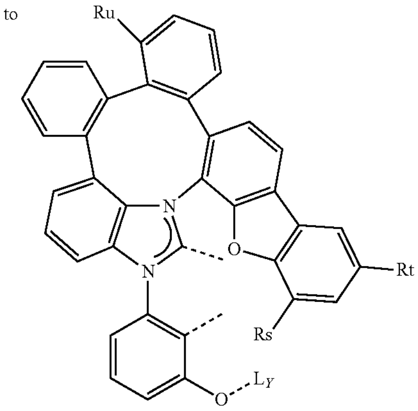 |
| $L_{A''}$192-(R1)(R1)(R1) to $L_{A''}$192-(R132)(R132)(R132) having the structure | 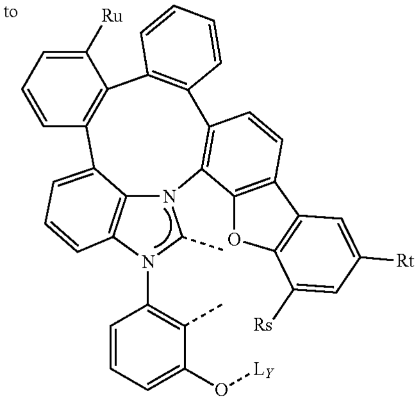 |
| $L_{A''}$193-(R1)(R1)(R1) to $L_{A''}$193-(R132)(R132)(R132) having the structure | 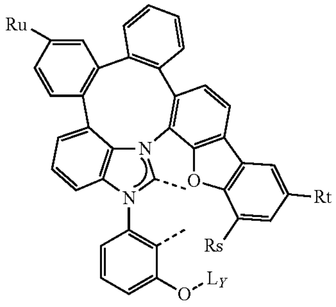 |

-continued

| Ligand $L_{A''}$ | Structure of $L_{A''}$ |
|---|---|
| $L_{A''}$194-(R1)(R1)(R1) to $L_{A''}$194-(R132)(R132)(R132) having the structure | 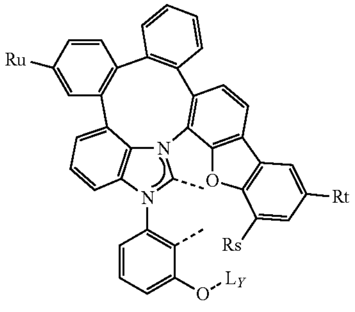 |
| $L_{A''}$195-(R1)(R1)(R1) to $L_{A''}$195-(R132)(R132)(R132) having the structure | 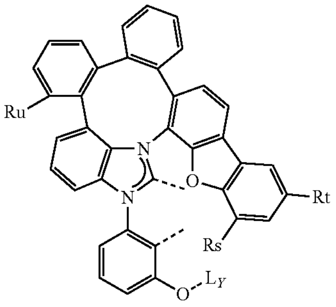 |
| $L_{A''}$196-(R1)(R1)(R1) to $L_{A''}$196-(R132)(R132)(R132) having the structure | 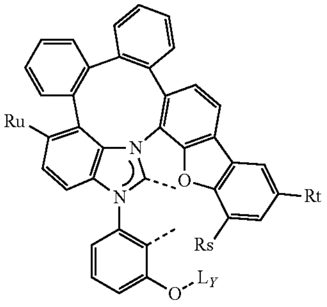 |
| $L_{A''}$197-(R1)(R1)(R1) to $L_{A''}$197-(R132)(R132)(R132) having the structure | 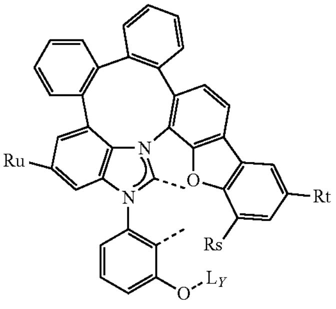 |
| $L_{A''}$198-(R1)(R1)(R1) to $L_{A''}$198-(R132)(R132)(R132) having the structure | 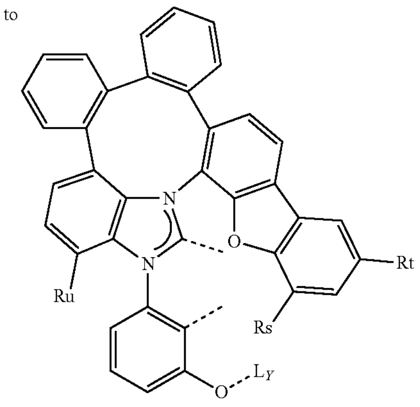 |
| $L_{A''}$199-(R1)(R1)(R1) to $L_{A''}$199-(R132)(R132)(R132) having the structure | 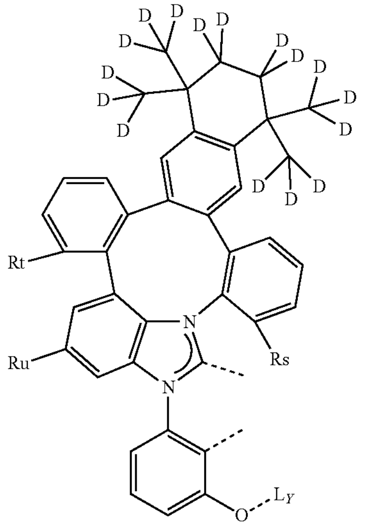 |
| $L_{A''}$200-(R1)(R1)(R1) to $L_{A''}$200-(R132)(R132)(R132) having the structure | 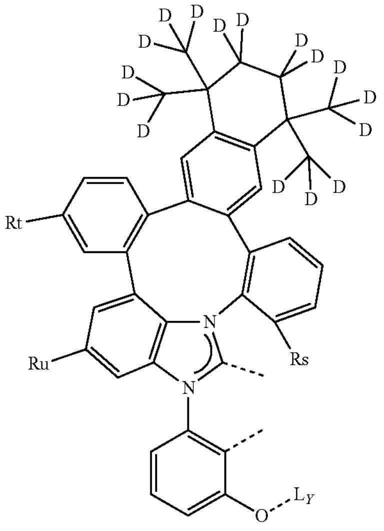 |

-continued
| Ligand $L_{A''}$ | Structure of $L_{A''}$ |
|---|---|
| $L_{A''}$201-(R1)(R1)(R1) to $L_{A''}$201-(R132)(R132)(R132) having the structure | 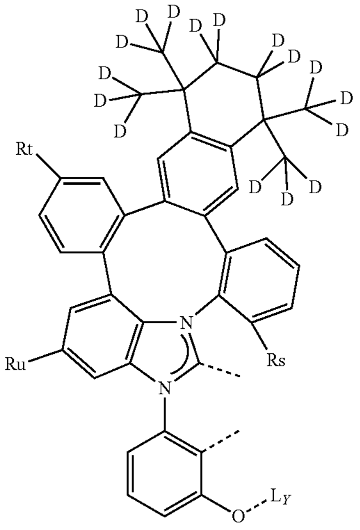 |
| $L_{A''}$202-(R1)(R1)(R1) to $L_{A''}$202-(R132)(R132)(R132) having the structure | 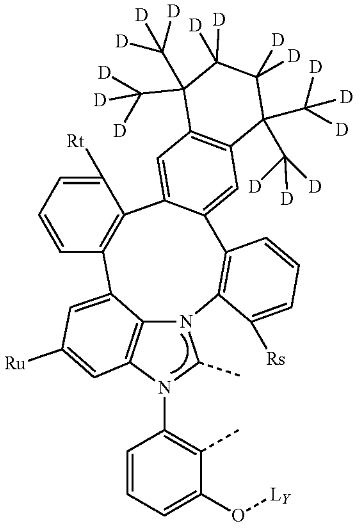 |
| $L_{A''}$203-(R1)(R1)(R1) to $L_{A''}$203-(R132)(R132)(R132) having the structure | 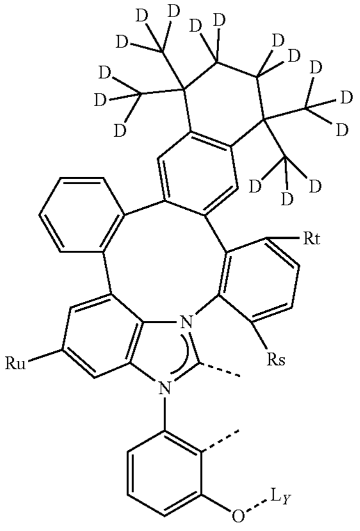 |
| $L_{A''}$204-(R1)(R1)(R1) to $L_{A''}$204-(R132)(R132)(R132) having the structure | 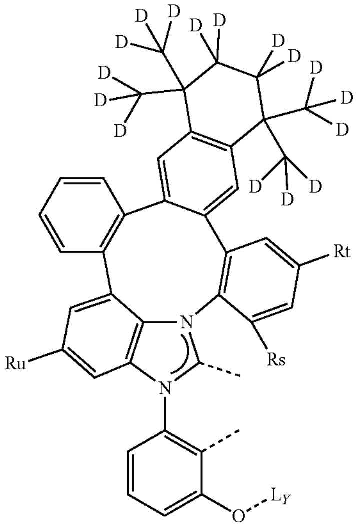 |
| $L_{A''}$205-(R1)(R1)(R1) to $L_{A''}$205-(R132)(R132)(R132) having the structure | 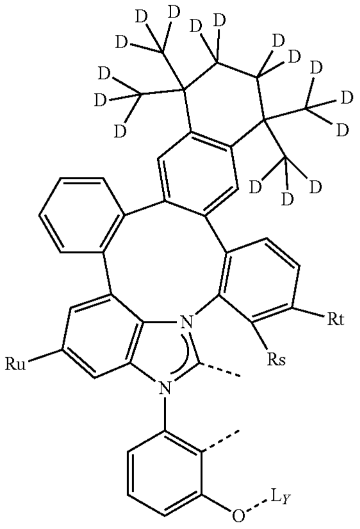 |
| $L_{A''}$206-(R1)(R1)(R1) to $L_{A''}$206-(R132)(R132)(R132) having the structure | 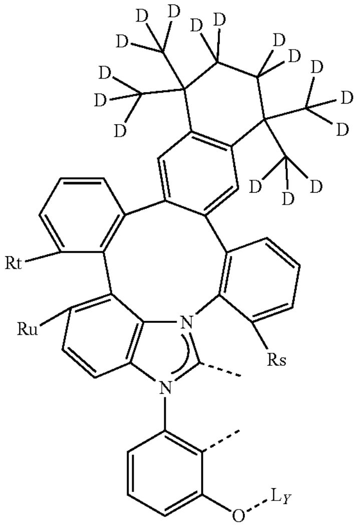 |

-continued
| Ligand $L_{A''}$ | Structure of $L_{A''}$ |
| --- | --- |
| $L_{A''}$207-(R1)(R1)(R1) to $L_{A''}$207-(R132)(R132)(R132) having the structure | 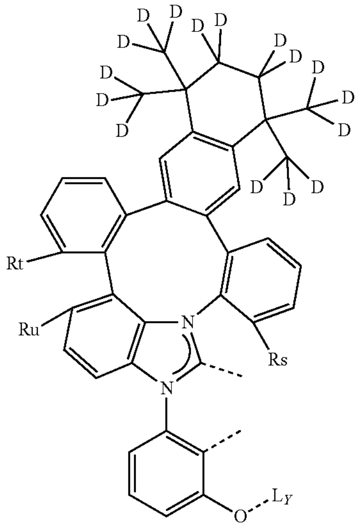 |
| $L_{A''}$208-(R1)(R1)(R1) to $L_{A''}$208-(R132)(R132)(R132) having the structure | 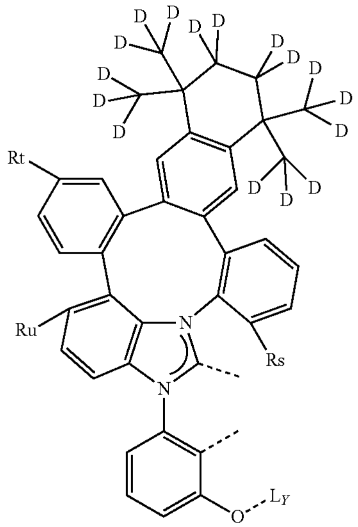 |
| $L_{A''}$209-(R1)(R1)(R1) to $L_{A''}$209-(R132)(R132)(R132) having the structure | 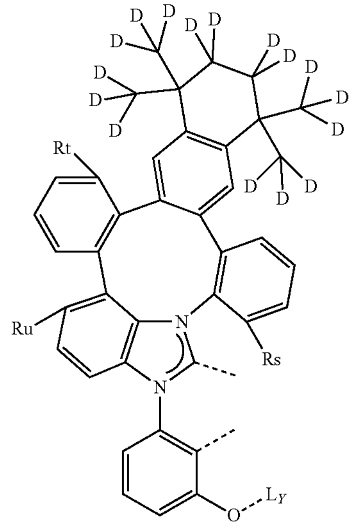 |
| $L_{A''}$210-(R1)(R1)(R1) to $L_{A''}$210-(R132)(R132)(R132) having the structure | 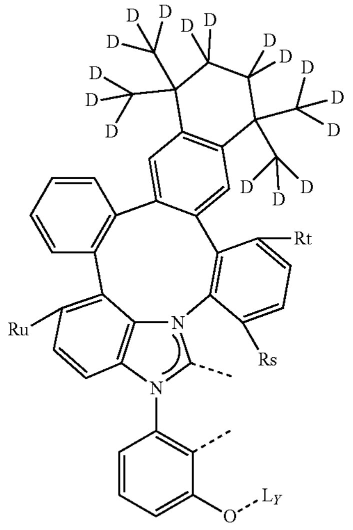 |
| $L_{A''}$211-(R1)(R1)(R1) to $L_{A''}$211-(R132)(R132)(R132) having the structure | 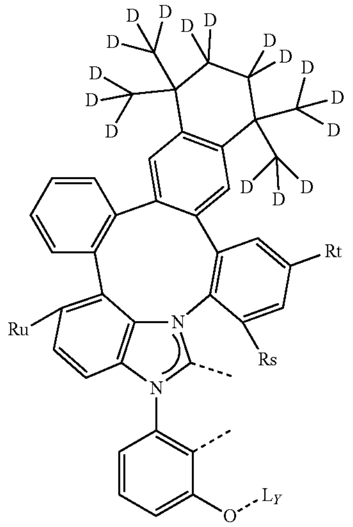 |
| $L_{A''}$212-(R1)(R1)(R1) to $L_{A''}$212-(R132)(R132)(R132) having the structure | 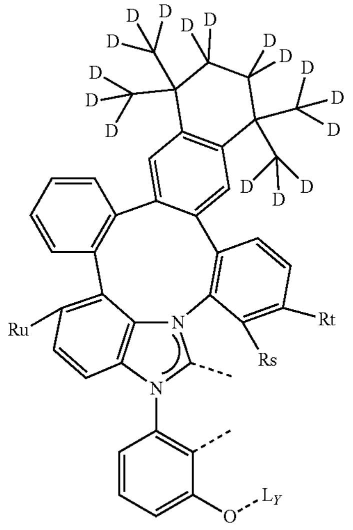 |

-continued

| Ligand $L_{A''}$ | Structure of $L_{A''}$ |
|---|---|
| $L_{A''}$213-(R1)(R1)(R1) to $L_{A''}$213-(R132)(R132)(R132) having the structure | 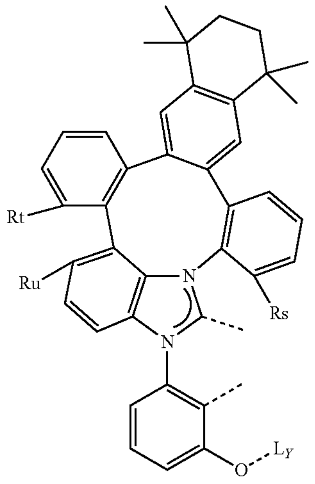 |
| $L_{A''}$214-(R1)(R1)(R1) to $L_{A''}$214 (R132)(R132)(R132) having the structure | 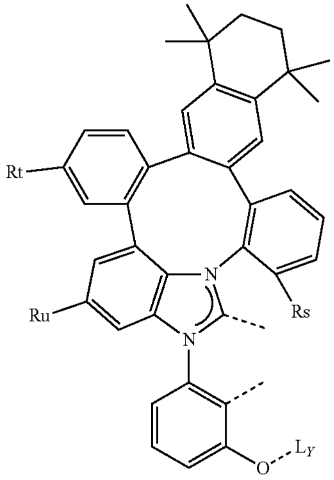 |
| $L_{A''}$215-(R1)(R1)(R1) to $L_{A''}$215-(R132)(R132)(R132) having the structure | 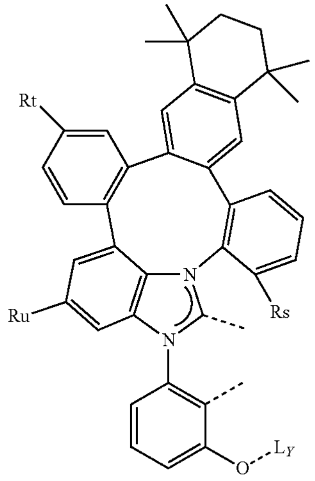 |

-continued

| Ligand $L_{A''}$ | Structure of $L_{A''}$ |
|---|---|
| $L_{A''}$216-(R1)(R1)(R1) to $L_{A''}$216-(R132)(R132)(R132) having the structure | 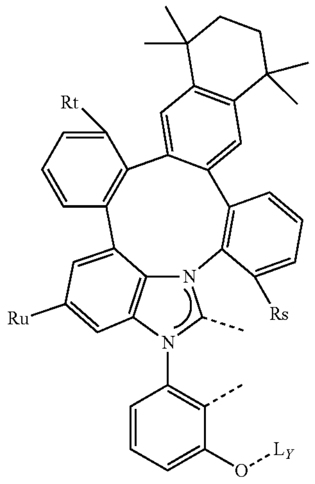 |
| $L_{A''}$217-(R1)(R1)(R1) to $L_{A''}$217-(R132)(R132)(R132) having the structure | 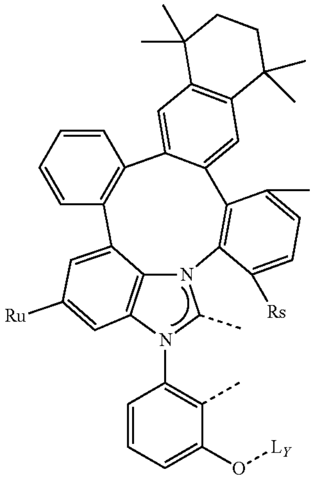 |
| $L_{A''}$218-(R1)(R1)(R1) to $L_{A''}$218-(R132)(R132)(R132) having the structure | 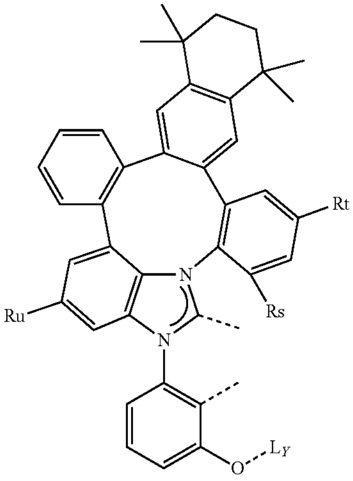 |

-continued

| Ligand $L_{A''}$ | Structure of $L_{A''}$ |
| --- | --- |
| $L_{A''}$219-(R1)(R1)(R1) to $L_{A''}$219-(R132)(R132)(R132) having the structure | 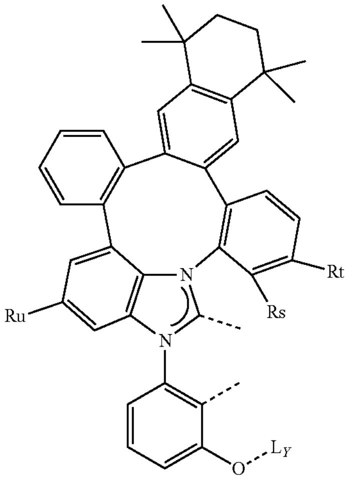 |
| $L_{A''}$229-(R1)(R1)(R1) to $L_{A''}$220-(R132)(R132)(R132) having the structure | 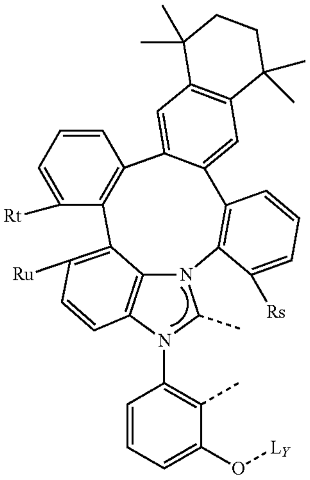 |
| $L_{A''}$221-(R1)(R1)(R1) to $L_{A''}$221-(R132)(R132)(R132) having the structure | 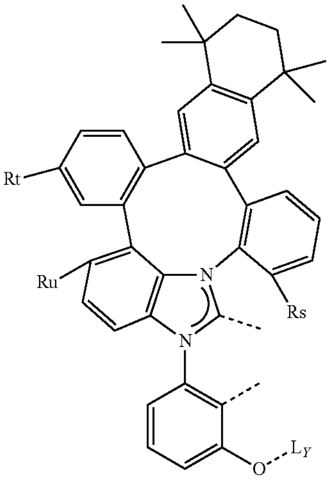 |

-continued

| Ligand $L_{A''}$ | Structure of $L_{A''}$ |
| --- | --- |
| $L_{A''}$222-(R1)(R1)(R1) to $L_{A''}$222-(R132)(R132)(R132) having the structure | 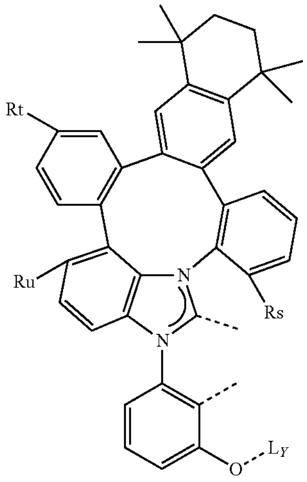 |
| $L_{A''}$223-(R1)(R1)(R1) to $L_{A''}$223-(R132)(R132)(R132) having the structure | 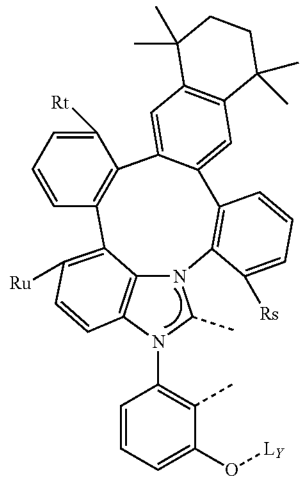 |
| $L_{A''}$224-(R1)(R1)(R1) to $L_{A''}$224-(R132)(R132)(R132) having the structure | 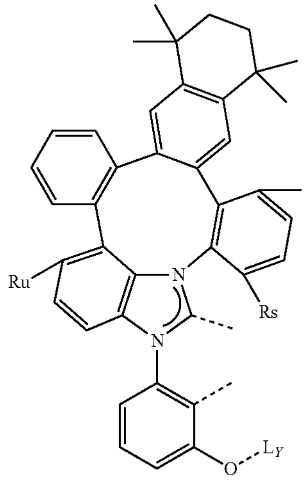 |

-continued

| Ligand $L_{A''}$ | Structure of $L_{A''}$ |
| --- | --- |
| $L_{A''}$225-(R1)(R1)(R1) to $L_{A''}$225-(R132)(R132)(R132) having the structure | 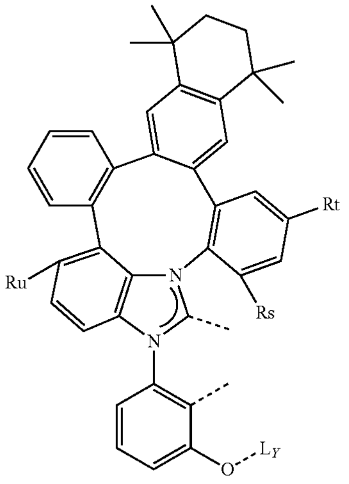 |
| $L_{A''}$226-(R1)(R1)(R1) to $L_{A''}$226-(R132)(R132)(R132) having the structure | 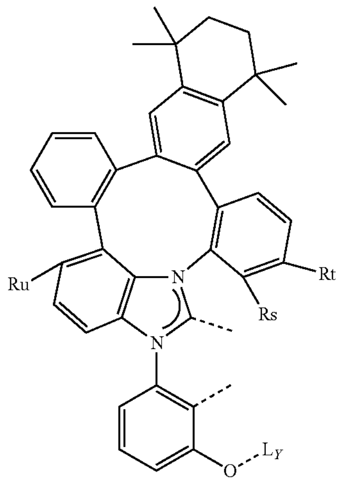 |
| $L_{A''}$227-(R1)(R1)(R1) to $L_{A''}$227-(R132)(R132)(R132) having the structure | 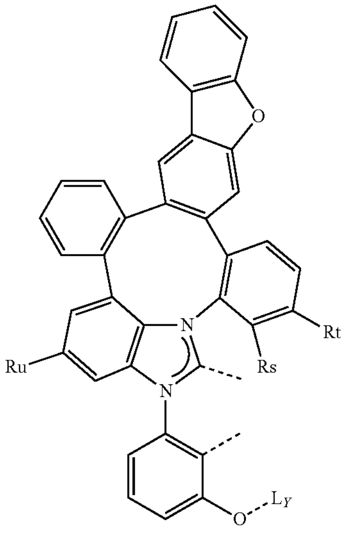 |

-continued

| Ligand $L_{A''}$ | Structure of $L_{A''}$ |
| --- | --- |
| $L_{A''}$228-(R1)(R1)(R1) to $L_{A''}$228-(R132)(R132)(R132) having the structure | 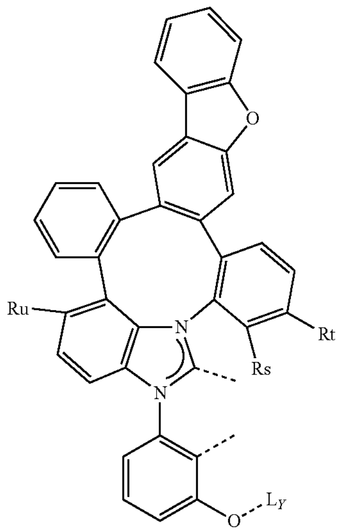 |
| $L_{A''}$229-(R1)(R1)(R1) to $L_{A''}$229-(R132)(R132)(R132) having the structure | 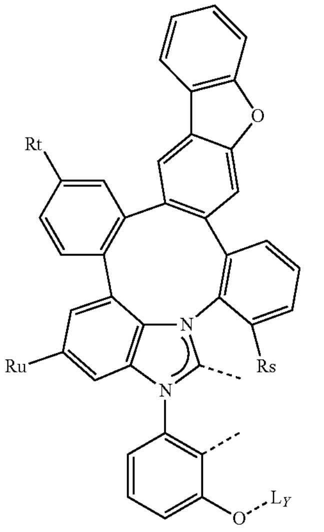 |
| $L_{A''}$230-(R1)(R1)(R1) to $L_{A''}$230-(R132)(R132)(R132) having the structure | 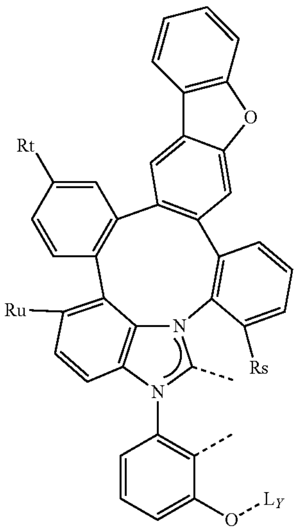 |

-continued

| Ligand $L_{A''}$ | Structure of $L_{A''}$ |
|---|---|
| $L_{A''}$231-(R1)(R1)(R1) to $L_{A''}$231-(R132)(R132)(R132) having the structure | 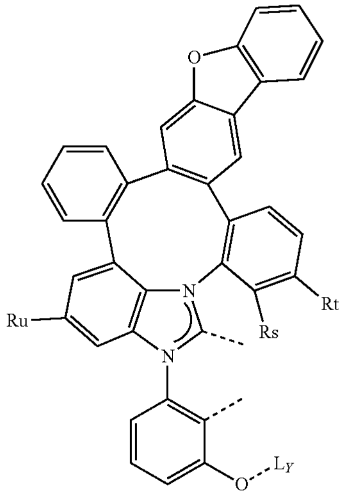 |
| $L_{A''}$232-(R1)(R1)(R1) to $L_{A''}$232-(R132)(R132)(R132) having the structure | 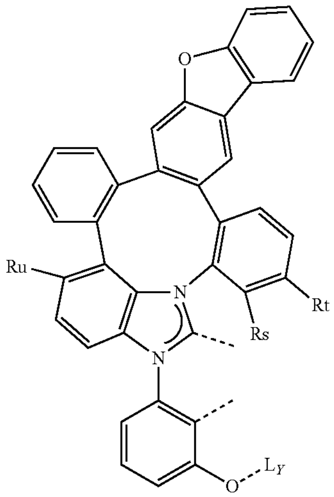 |
| $L_{A''}$233-(R1)(R1)(R1) to $L_{A''}$233-(R132)(R132)(R132) having the structure | 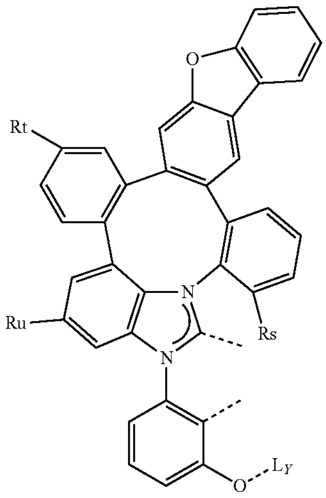 |

-continued

| Ligand $L_{A''}$ | Structure of $L_{A''}$ |
|---|---|
| $L_{A''}$234-(R1)(R1)(R1) to $L_{A''}$234-(R132)(R132)(R132) having the structure | 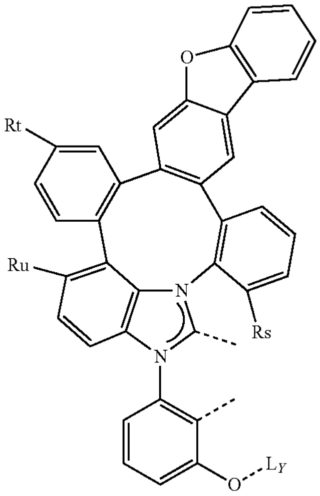 |
| $L_{A''}$235-(R1)(R1)(R1) to $L_{A''}$235-(R132)(R132)(R132) having the structure | 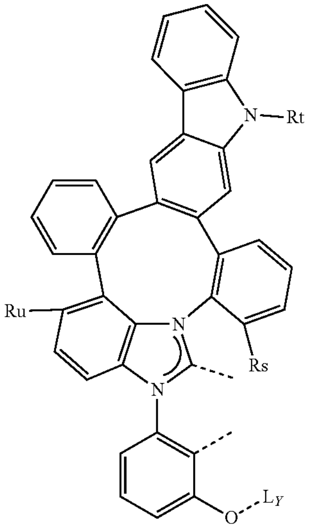 |
| $L_{A''}$236-(R1)(R1)(R1) to $L_{A''}$236-(R132)(R132)(R132) having the structure | 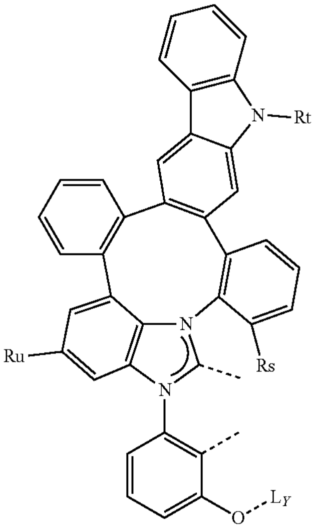 |

-continued

| Ligand $L_{A''}$ | Structure of $L_{A''}$ |
|---|---|
| $L_{A''}$237-(R1)(R1)(R1) to $L_{A''}$237-(R132)(R132)(R132) having the structure | 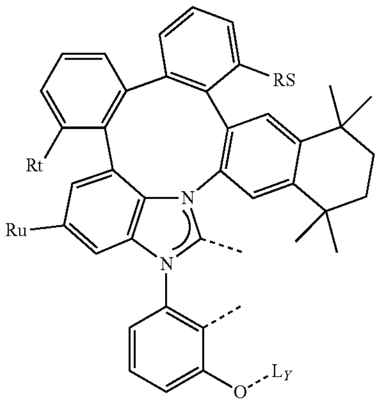 |
| $L_{A''}$238-(R1)(R1)(R1) to $L_{A''}$238-(R132)(R132)(R132) having the structure | 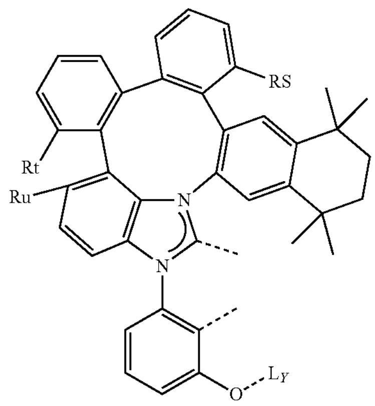 |
| $L_{A''}$239-(R1)(R1)(R1) to $L_{A''}$239-(R132)(R132)(R132) having the structure | 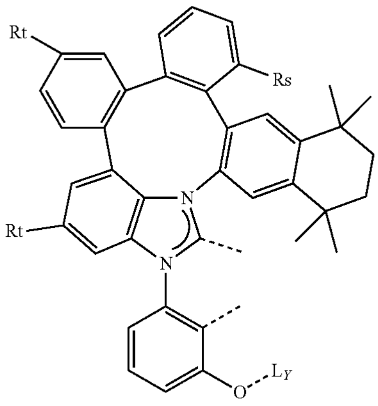 |

-continued

| Ligand $L_{A''}$ | Structure of $L_{A''}$ |
|---|---|
| $L_{A''}$240-(R1)(R1)(R1) to $L_{A''}$240-(R132)(R132)(R132) having the structure | 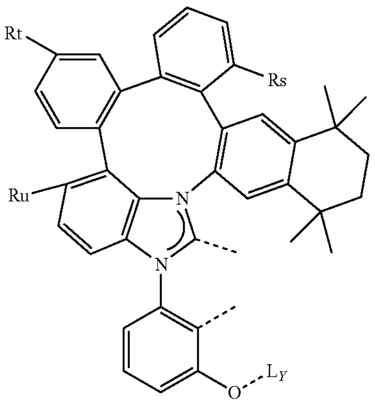 |
| $L_{A''}$241-(R1)(R1)(R1) to $L_{A''}$241-(R132)(R132)(R132) having the structure | 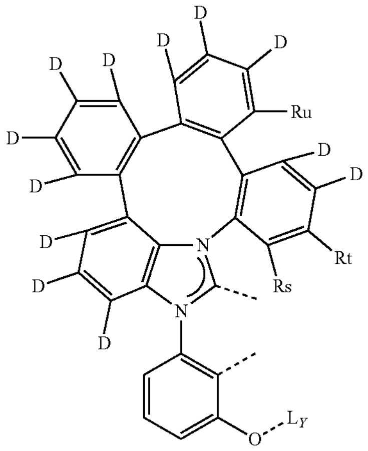 |
| $L_{A''}$242-(R1)(R1)(R1) to $L_{A''}$242-(R132)(R132)(R132) having the structure | 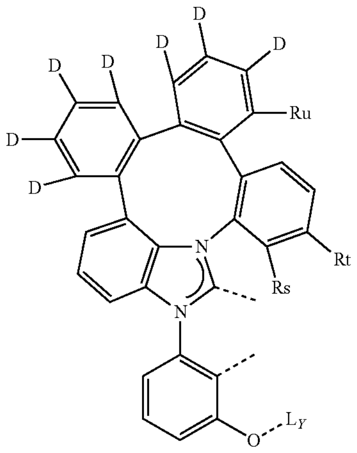 |

-continued

| Ligand $L_{A''}$ | Structure of $L_{A''}$ |
|---|---|
| $L_{A''}$243-(R1)(R1)(R1) to $L_{A''}$243-(R132)(R132)(R132) having the structure | 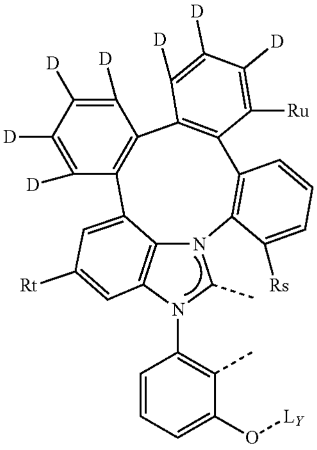 |
| $L_{A''}$244-(R1)(R1)(R1) to $L_{A''}$244-(R132)(R132)(R132) having the structure | 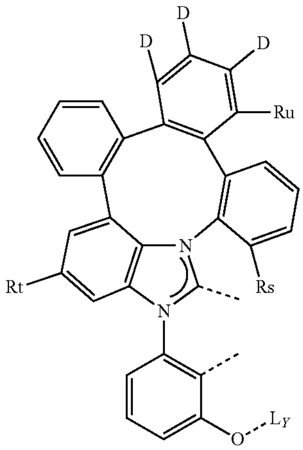 |
| $L_{A''}$245-(R1)(R1)(R1) to $L_{A''}$245-(R132)(R132)(R132) having the structure | 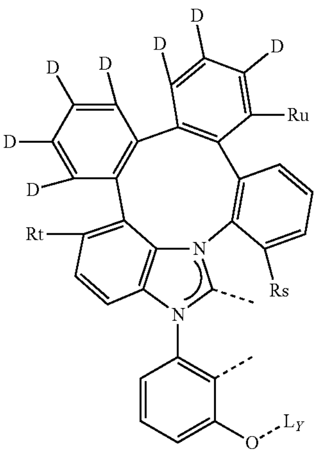 |

-continued

| Ligand $L_{A''}$ | Structure of $L_{A''}$ |
|---|---|
| $L_{A''}$246-(R1)(R1)(R1) to $L_{A''}$246-(R132)(R132)(R132) having the structure | 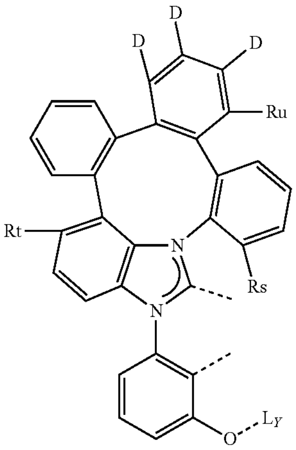 |
| $L_{A''}$247-(R1)(R1)(R1) to $L_{A''}$247-(R132)(R132)(R132) having the structure | 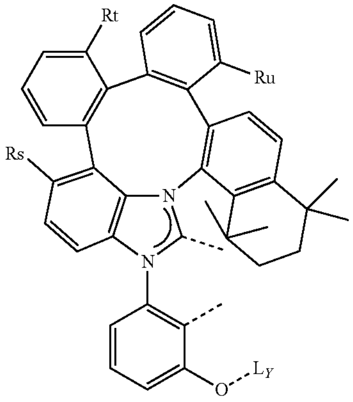 |
| $L_{A''}$248(R1)(R1)(R1) to $L_{A''}$248-(R132)(R132)(R132) having the structure | 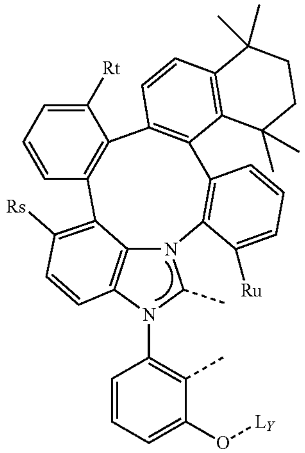 |

-continued

| Ligand $L_{A''}$ | Structure of $L_{A''}$ |
|---|---|
| $L_{A''}$249-(R1)(R1)(R1) to $L_{A''}$249-(R132)(R132)(R132) having the structure | 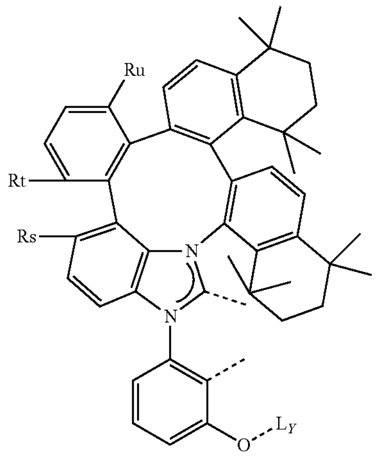 |
| $L_{A''}$250-(R1)(R1)(R1) to $L_{A''}$250-(R132)(R132)(R132) having the structure | 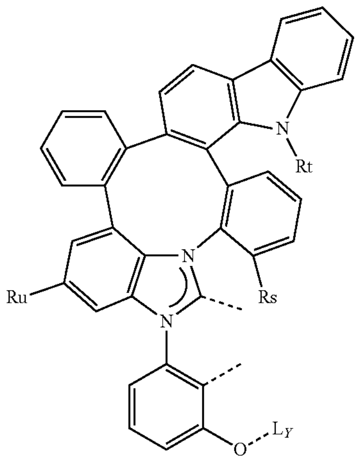 |
| $L_{A''}$251-(R1)(R1)(R1) to $L_{A''}$251-(R132)(R132)(R132) having the structure | 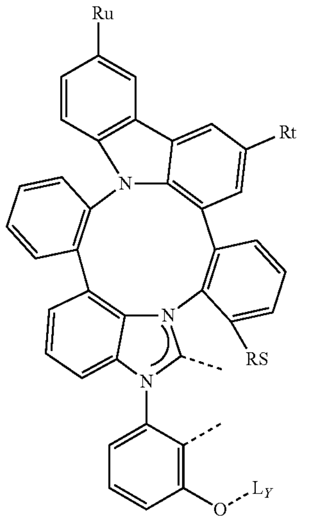 |

-continued

| Ligand $L_{A''}$ | Structure of $L_{A''}$ |
|---|---|
| $L_{A''}$252-(R1)(R1)(R1) to $L_{A''}$252-(R132)(R132)(R132) having the structure | 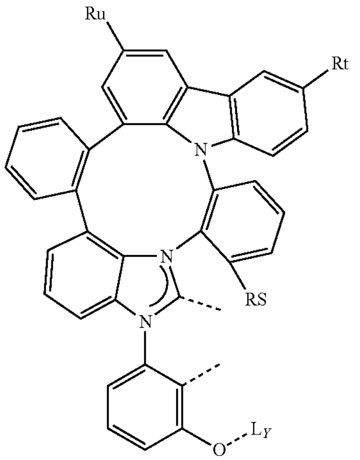 |
| $L_{A''}$253-(R1)(R1)(R1) to $L_{A''}$253-(R132)(R132)(R132) having the structure | 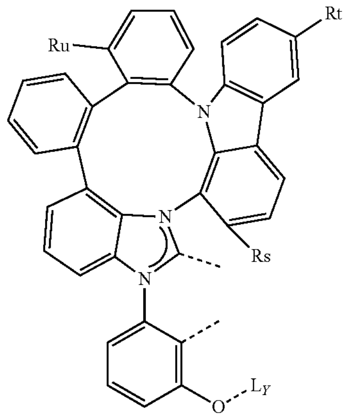 |
| $L_{A''}$254-(R1)(R1)(R1) to $L_{A''}$254-(R132)(R132)(R132) having the structure | 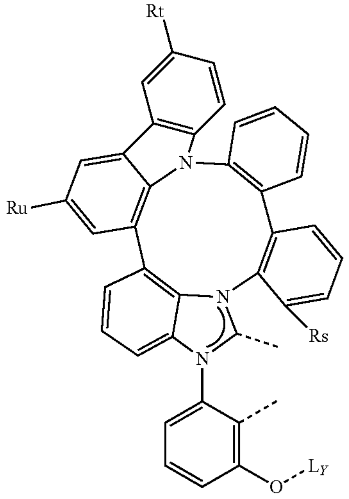 |

-continued

| Ligand $L_{A''}$ | Structure of $L_{A''}$ |
| --- | --- |
| $L_{A''}$255-(R1)(R1)(R1) to $L_{A''}$255-(R132)(R132)(R132) having the structure | 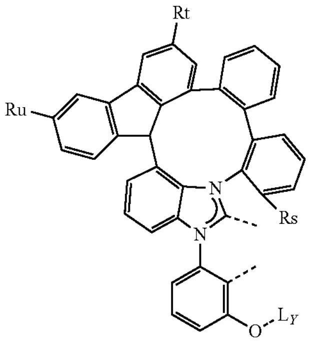 |
| $L_{A''}$256-(R1)(R1)(R1) to $L_{A''}$256-(R132)(R132)(R132) having the structure | 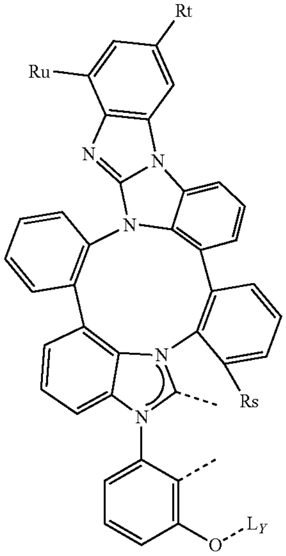 |
| $L_{A''}$257-(R1)(R1)(R1) to $L_{A''}$257-(R132)(R132)(R132) having the structure | 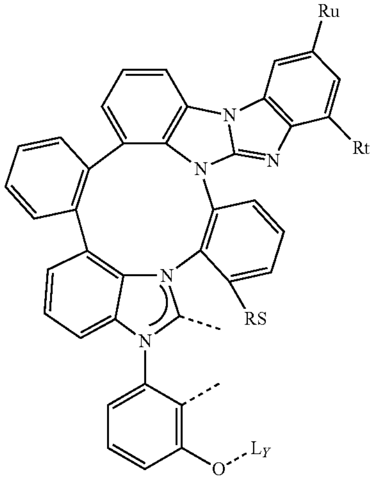 |

-continued

| Ligand $L_{A''}$ | Structure of $L_{A''}$ |
| --- | --- |
| $L_{A''}$258-(R1)(R1)(R1) to $L_{A''}$258-(R132)(R132)(R132) having the structure | 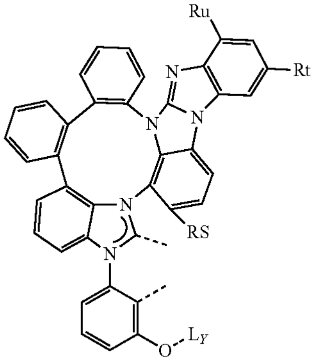 |
| $L_{A''}$259-(R1)(R1)(R1) to $L_{A''}$259-(R132)(R132)(R132) having the structure | 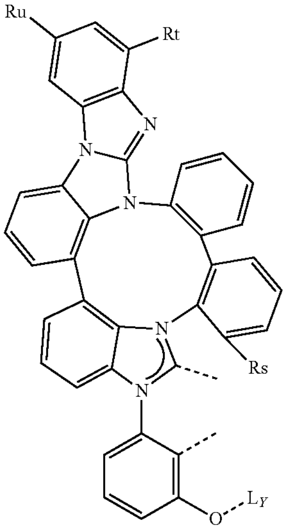 |
| $L_{A''}$260-(R1)(R1)(R1) to $L_{A''}$260-(R132)(R132)(R132) having the structure | 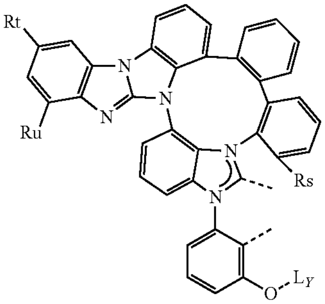 |
| $L_{A''}$261-(R1)(R1)(R1) to $L_{A''}$261-(R132)(R132)(R132) having the structure | 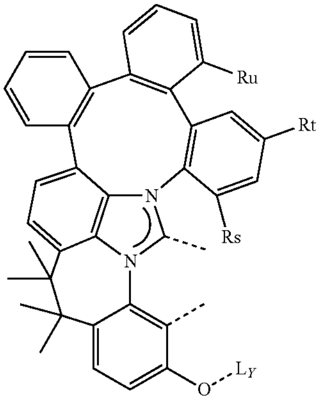 |

-continued

| Ligand $L_{A''}$ | Structure of $L_{A''}$ |
|---|---|
| $L_{A''}$262-(R1)(R1)(R1) to $L_{A''}$262-(R132)(R132)(R132) having the structure | 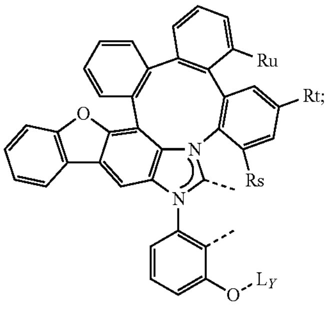 |

and wherein $L_Y$ is selected from the group consisting of:

| $L_Y$ | Structure of $L_y$ |
|---|---|
| $L_Y$1-(R1)(R1)(R1) to $L_Y$1-(R132)(R132)(R132), having the structure | 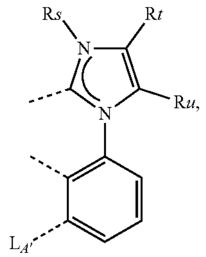 |
| $L_Y$2-(R1)(R1)(R1) to $L_Y$2-(R132)(R132)(R132), having the structure | 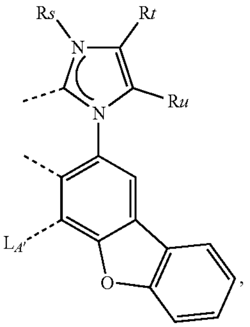 |
| $L_Y$3-(R1)(R1)(R1) to $L_Y$3-(R132)(R132)(R132) having the structure | 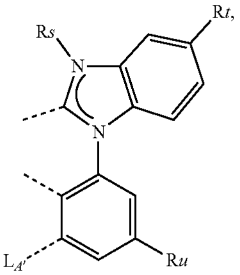 |

-continued

| $L_Y$ | Structure of $L_y$ |
|---|---|
| $L_Y$4-(R1)(R1)(R1) to $L_{Y4}$-(R132)(R132)(R132) having the structure | 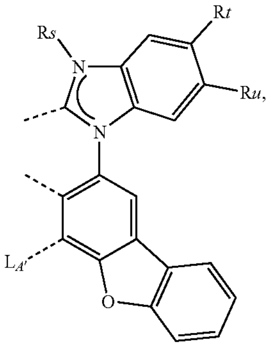 |
| $L_Y$5-(R1)(R1)(R1) to $L_Y$5-(R132)(R132)(R132) having the structure | 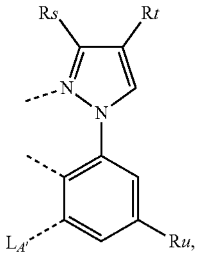 |
| $L_Y$6-(R1)(R1)(R1) to $L_Y$6-(R132)(R132)(R132) having the structure | 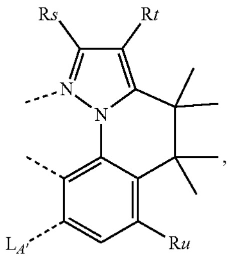 |
| $L_Y$7-(R1)(R1)(R1) to $L_Y$7-(R132)(R132)(R132) having the structure | 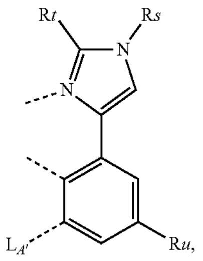 |
| $L_Y$8-(R1)(R1)(R1) to $L_Y$8-(R132)(R132)(R132) having the structure | 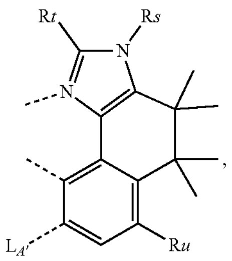 |

-continued

| $L_Y$ | Structure of $L_y$ |
| --- | --- |
| $L_Y$9-(R1)(R1)(R1) to $L_Y$9-(R132)(R132)(R132) having the structure | 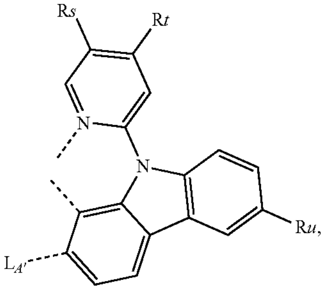 |
| $L_Y$10-(R1)(R1)(R1) to $L_Y$10-(R132)(R132)(R132) having the structure | 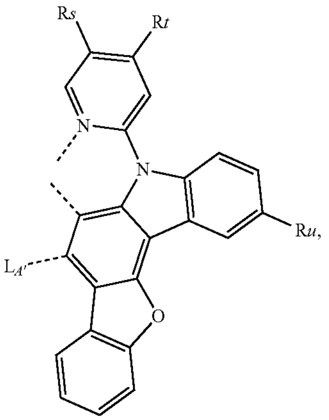 |
| $L_Y$11-(R1)(R1)(R1) to $L_Y$11-(R132)(R132)(R132) having the structure | 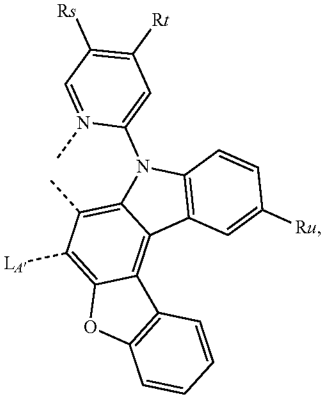 |
| $L_Y$12-(R1)(R1)(R1) to $L_Y$12-(R132)(R132)(R132) having the structure | 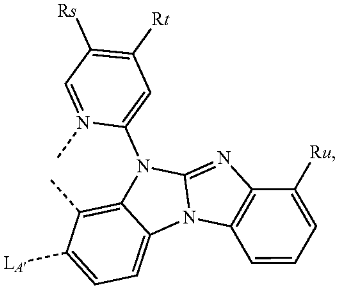 |

-continued

| $L_Y$ | Structure of $L_y$ |
| --- | --- |
| $L_Y$13-(R1)(R1)(R1) to $L_Y$13-(R132)(R132)(R132) having the structure | 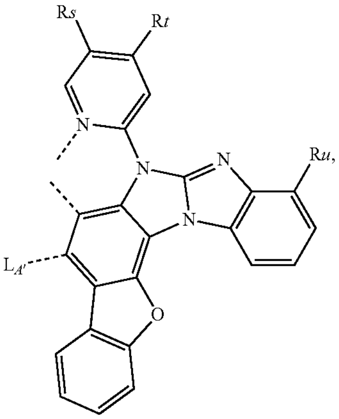 |
| $L_Y$14-(R1)(R1)(R1) to $L_Y$14-(R132)(R132)(R132) having the structure | 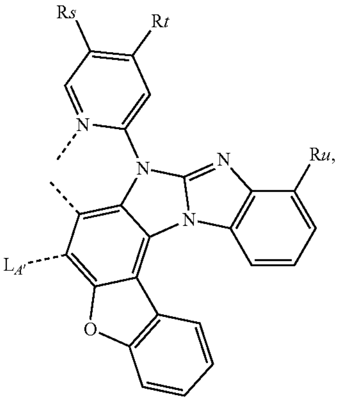 |
| $L_Y$15-(R1)(R1)(R1) to $L_Y$15-(R132)(R132)(R132) having the structure | 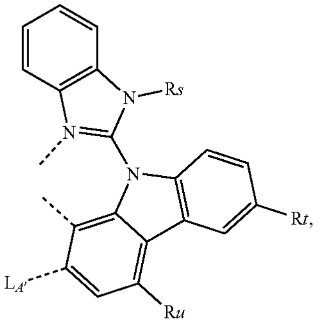 |
| $L_Y$16-(R1)(R1)(R1) to $L_Y$16-(R132)(R132)(R132) having the structure | 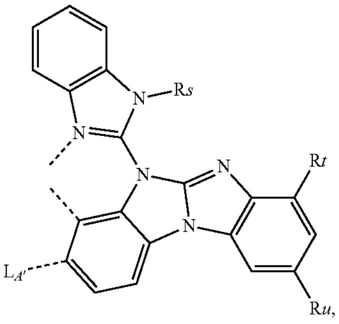 |

-continued

| $L_Y$ | Structure of $L_y$ |
|---|---|
| $L_Y$17-(R1)(R1)(R1) to $L_Y$17-(R132)(R132)(R132) having the structure | 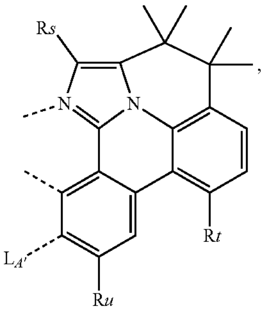 |
| $L_Y$18-(R1)(R1)(R1) to $L_Y$18-(R132)(R132)(R132), having the structure | 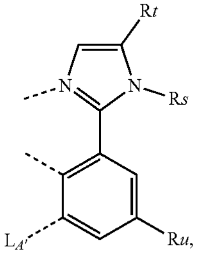 |
| $L_Y$19-(R1)(R1)(R1) to $L_Y$19-(R132)(R132)(R132) having the structure | 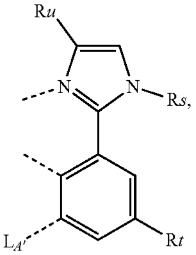 |
| $L_Y$20-(R1)(R1)(R1) to $L_Y$20-(R132)(R132)(R132) having the structure | 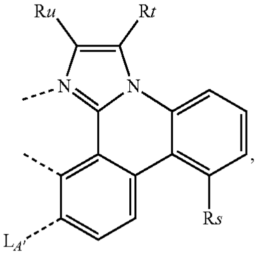 |
| $L_Y$21-(R1)(R1)(R1) to $L_Y$21-(R132)(R132)(R132) having the structure | 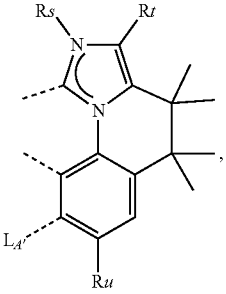 |
| $L_Y$22-(R1)(R1)(R1) to $L_Y$22-(R132)(R132)(R132) having the structure | 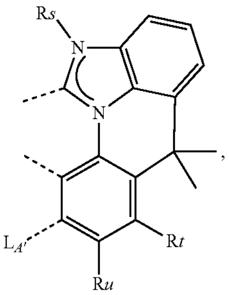 |
| $L_Y$23-(R1)(R1)(R1) to $L_Y$23-(R132)(R132)(R132) having the structure | 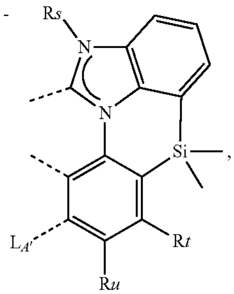 |
| $L_Y$24-(R1)(R1)(R1) to $L_Y$24-(R132)(R132)(R132) having the structure | 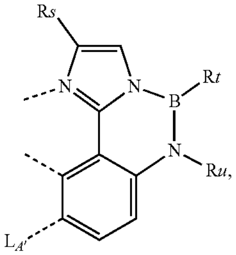 |
| $L_Y$25-(R1)(R1)(R1) to $L_Y$25-(R132)(R132)(R132) having the structure | 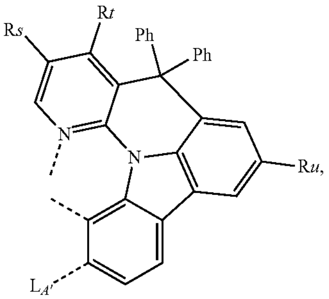 |
| $L_Y$26-(R1)(R1)(R1) to $L_Y$26-(R132)(R132)(R132) having the structure | 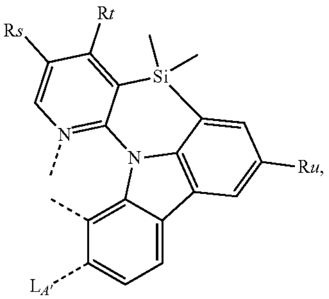 |

-continued

| $L_Y$ | Structure of $L_y$ |
| --- | --- |
| $L_Y$27-(R1)(R1)(R1) to $L_Y$27-(R132)(R132)(R132) having the structure | 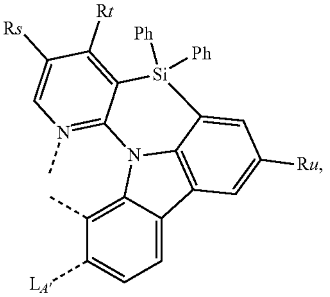 |
| $L_Y$28-(R1)(R1)(R1) to $L_Y$28-(R132)(R132)(R132) having the structure | 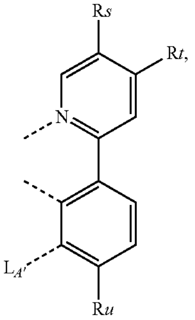 |
| $L_Y$29-(R1)(R1)(R1) to $L_Y$29-(R132)(R132)(R132) having the structure | 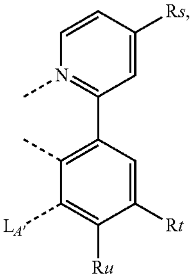 |
| $L_Y$30-(R1)(R1)(R1) to $L_Y$30-(R132)(R132)(R132) having the structure | 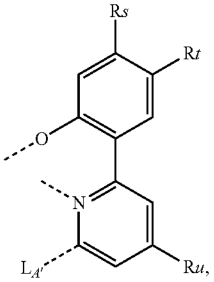 |
| $L_Y$31-(R1)(R1)(R1) to $L_Y$31-(R132)(R132)(R132) having the structure | 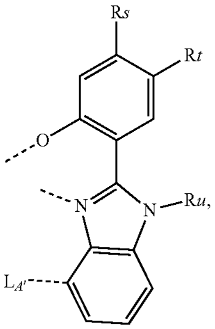 |

-continued

| $L_Y$ | Structure of $L_y$ |
| --- | --- |
| $L_Y$32-(R1)(R1)(R1) to $L_Y$32-(R132)(R132)(R132) having the structure | 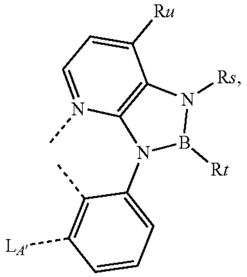 |
| $L_Y$33-(R1)(R1)(R1) to $L_Y$33-(R132)(R132)(R132) having the structure | 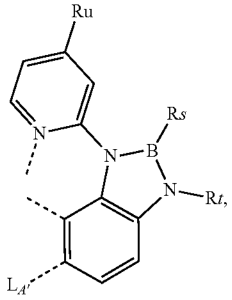 |

wherein R1 to R132 have the following structures:

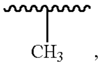
R1

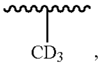
R2

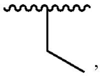
R3

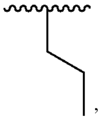
R4

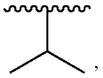
R5

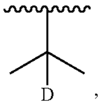
R6

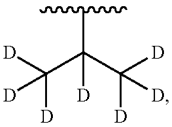
R7

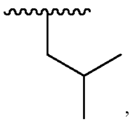
R8

-continued
R9
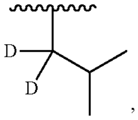,
R10
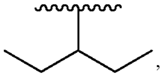,
R11
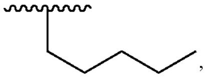,
R12
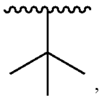,
R13
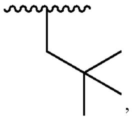,
R14
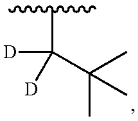,
R15
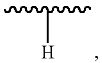,
R16
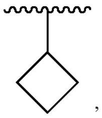,
R17
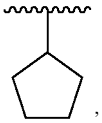,
R18
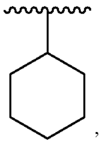,
R19
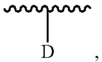,
R20
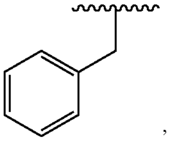,
R21
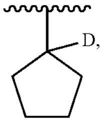
-continued
R22
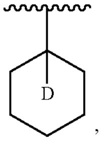,
R23
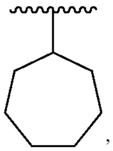,
R24
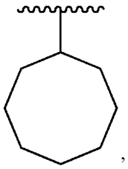,
R25
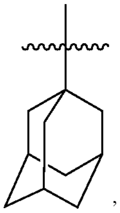,
R26
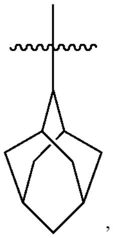,
R27
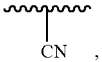,
R28
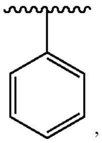,
R29
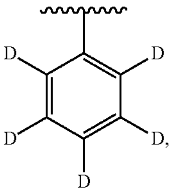
R30
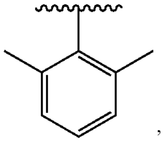, -continued
R31
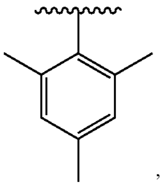
,
R32
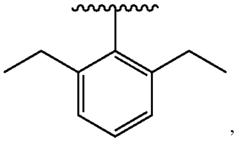
,
R33
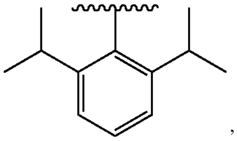
,
R34
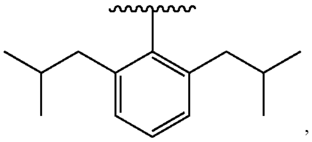
,
R35
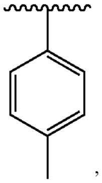
,
R36
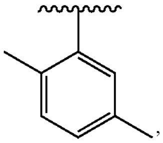
,
R37
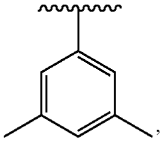
,
R38
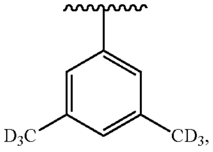
R39
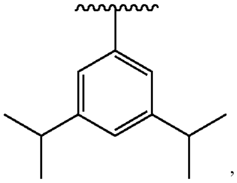
,
-continued
R40
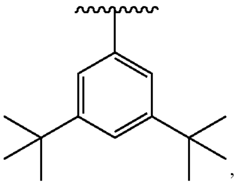
,
R41
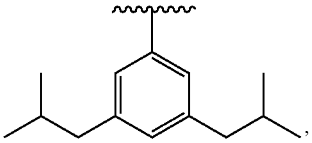
,
R42
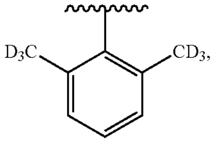
R43
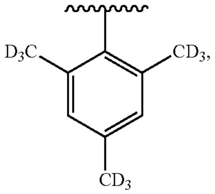
R44
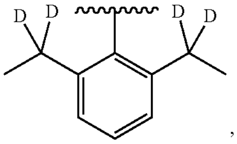
,
R45
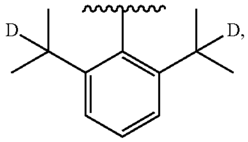
R46
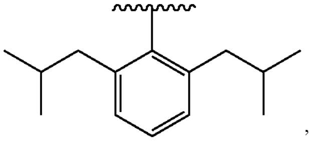
,
R47
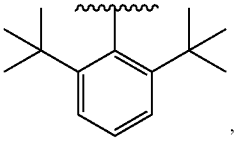
,
R48
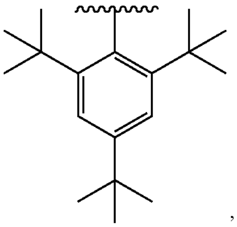
, -continued
R49
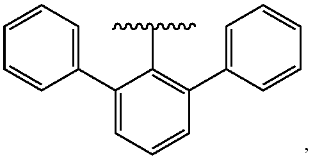
,
R50
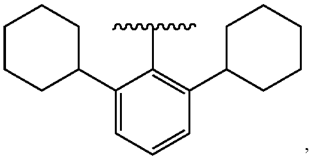
,
R51
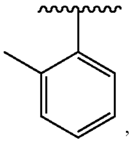
,
R52
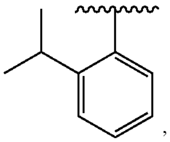
,
R53
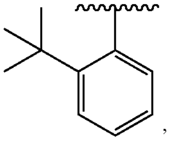
,
R54
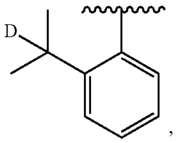
,
R55
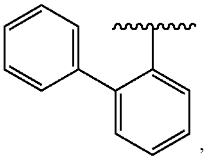
,
R56
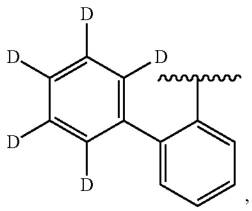
,
R57
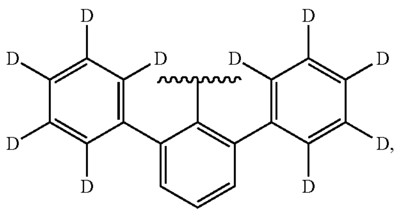
,
-continued
R58
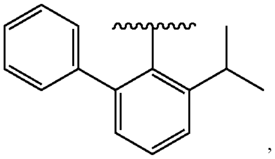
,
R59
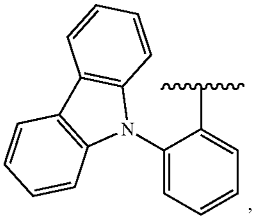
,
R60
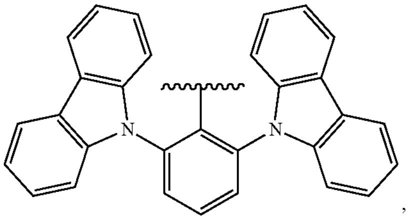
,
R61
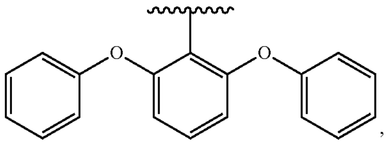
,
R62
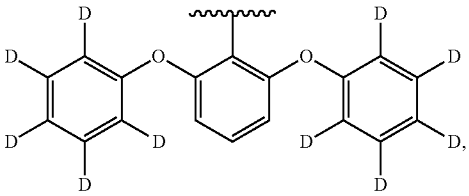
,
R63
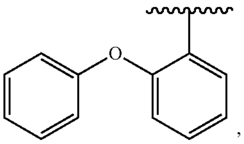
,
R64
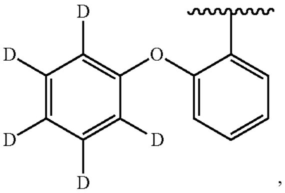
, -continued
R65
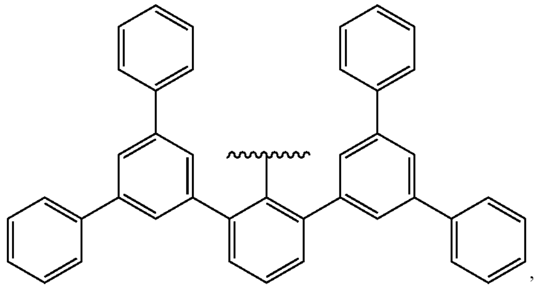
,
R66
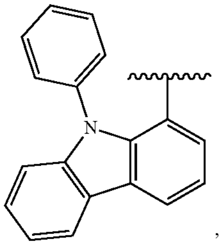
,
R67
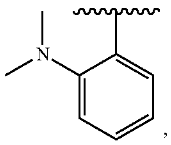
,
R68
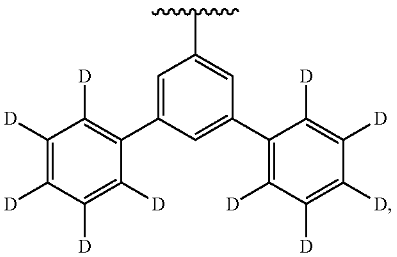
R69
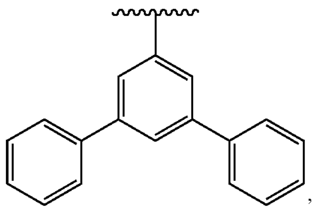
,
R70
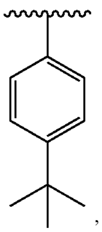
,
R71
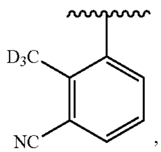
,
-continued
R72
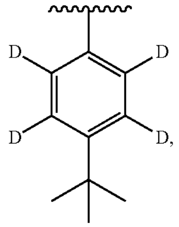
R73
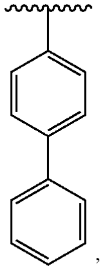
,
R74
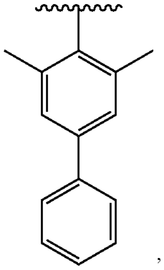
,
R75
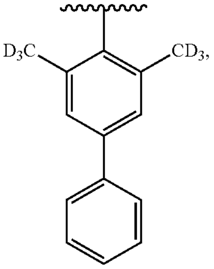
R76
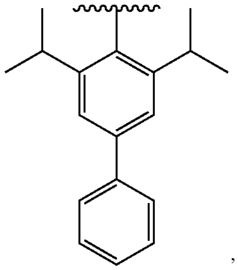
,
R77
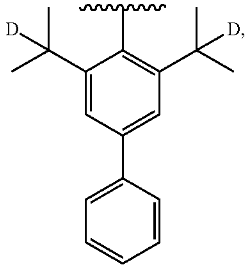

-continued
R78
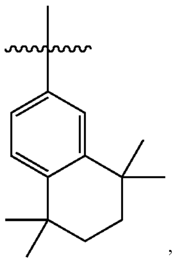
R79
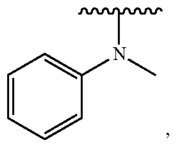
R80
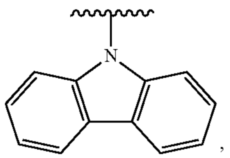
R81
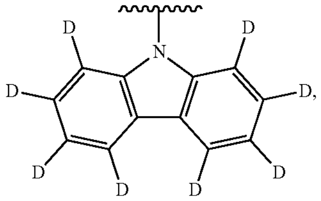
R82
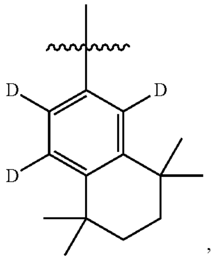
R83
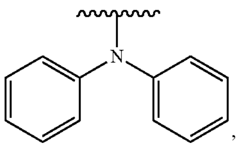
R84
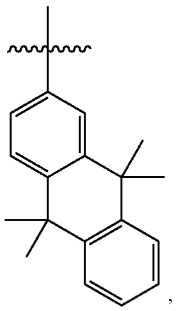
-continued
R85
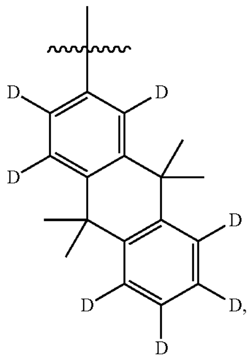
R86
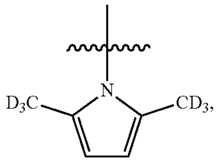
R87
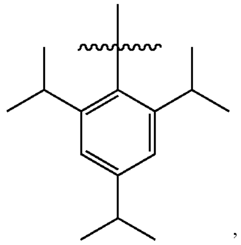
R88
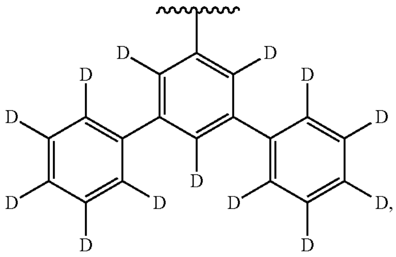
R89
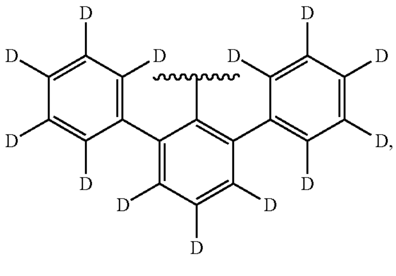
R90
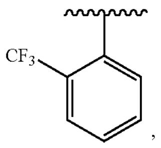

-continued
R91
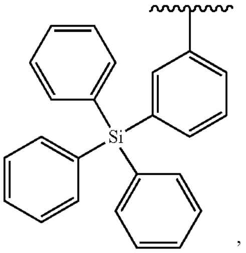
R92
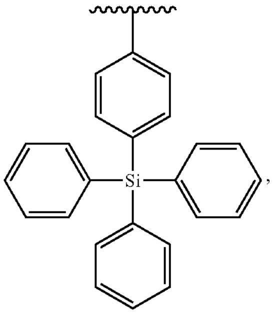
R93
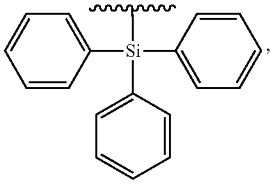
R94
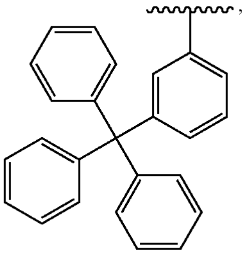
R95
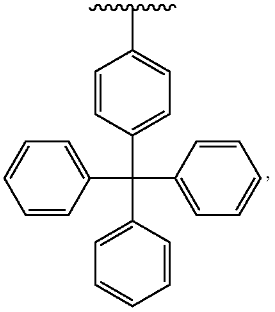
R96
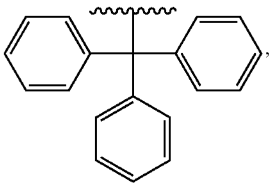
-continued
R97
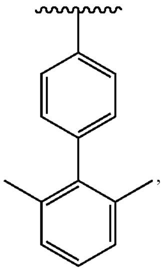
R98
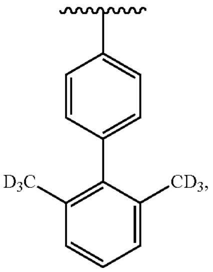
R99
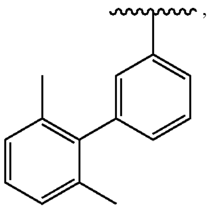
R100
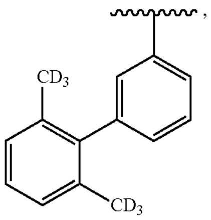
R101
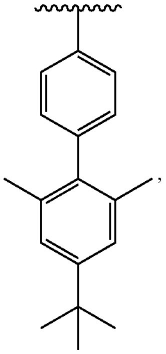

-continued
R102
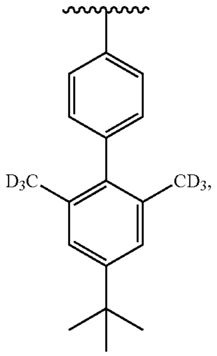
R103
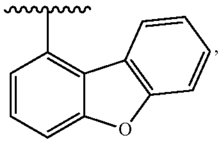
R104
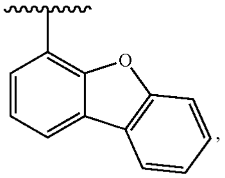
R105
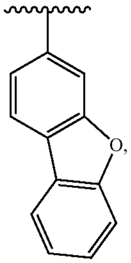
R106
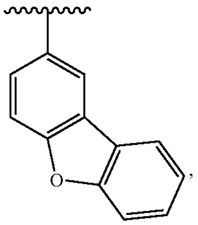
R107
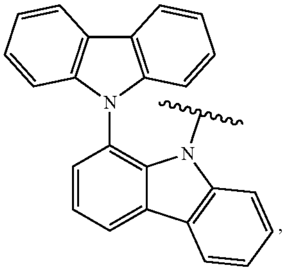
-continued
R108
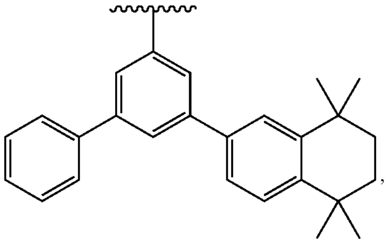
R109
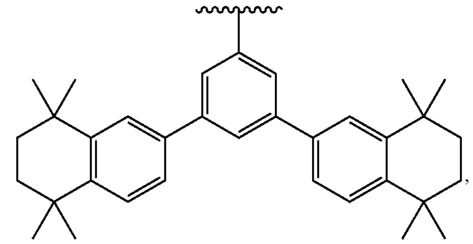
R110
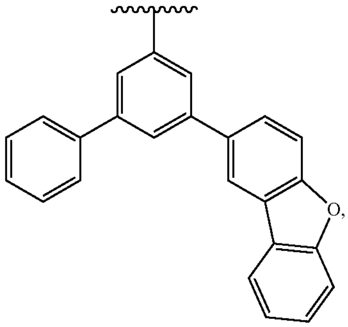
R111
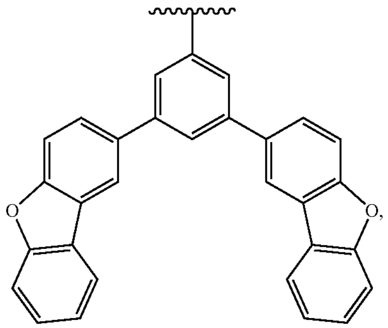
R112
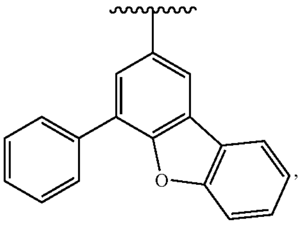
R113
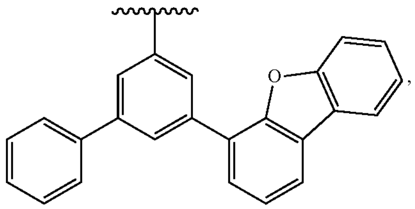

-continued
R114
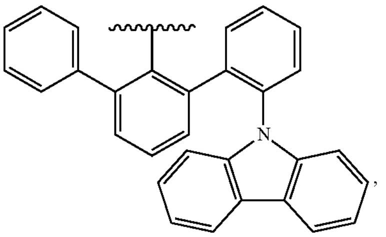
R115
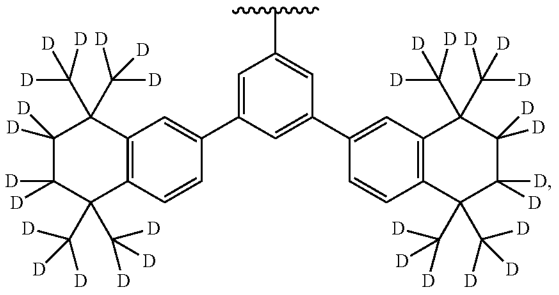
R116
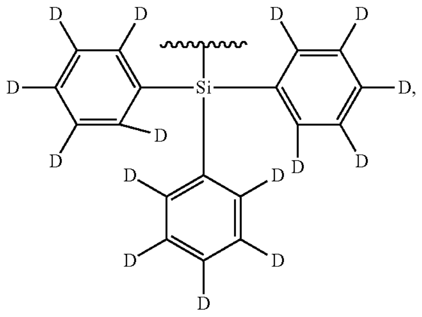
R117
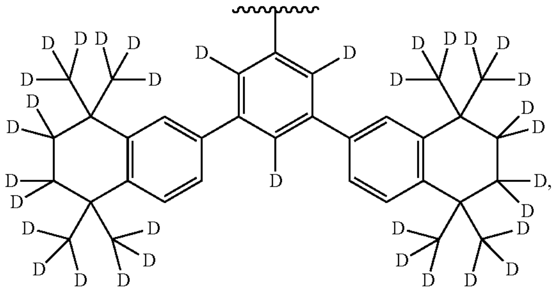
R118
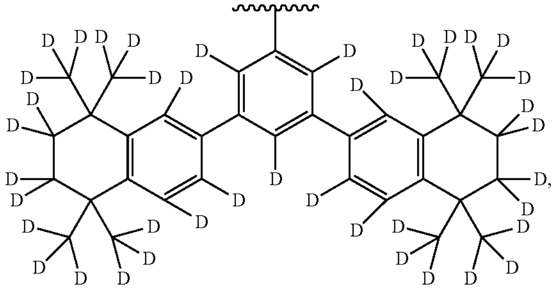
-continued
R119
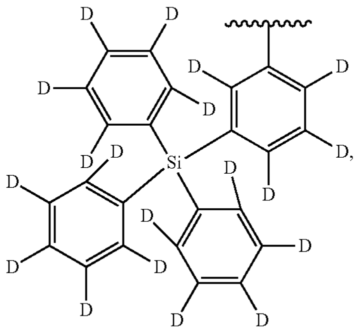
R120
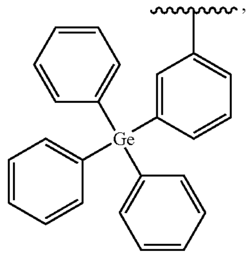
R121
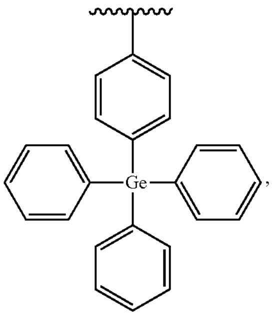
R122
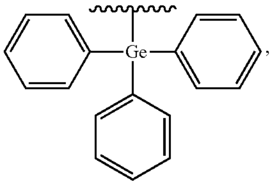
R123
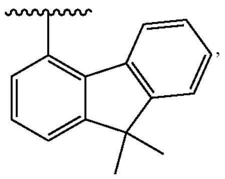
R124
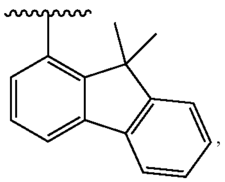

-continued
R125
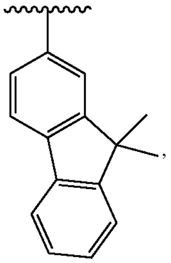
R126
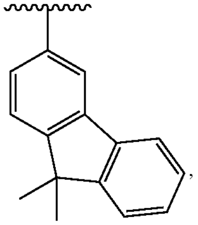
R127
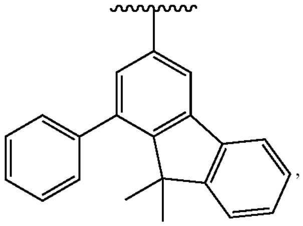
R128
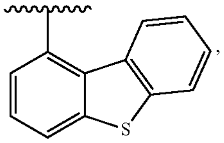
R129
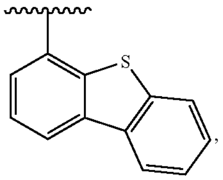
R130
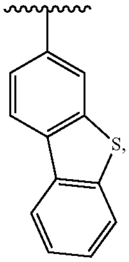
R131
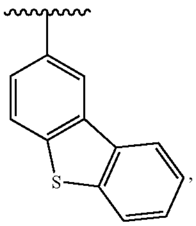
and
-continued
R132
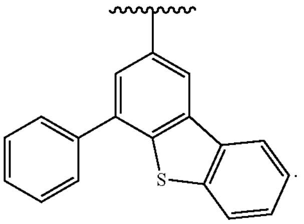
16. The compound of claim 6, wherein the compound is selected from the group consisting of:
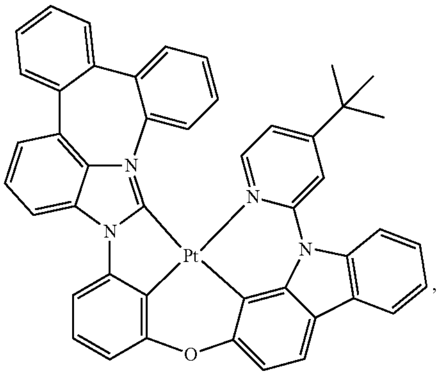
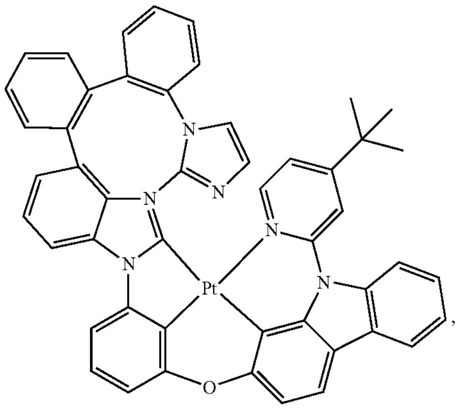
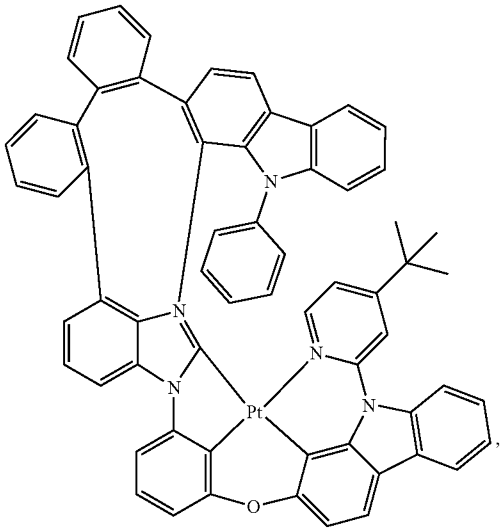

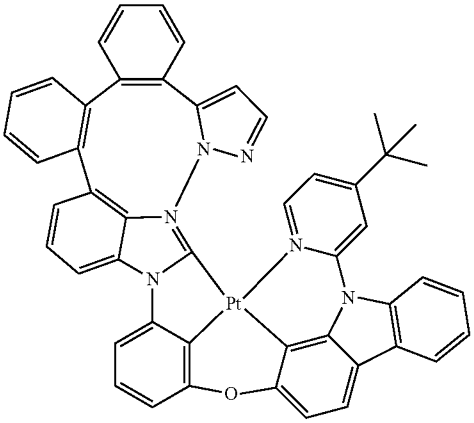
,
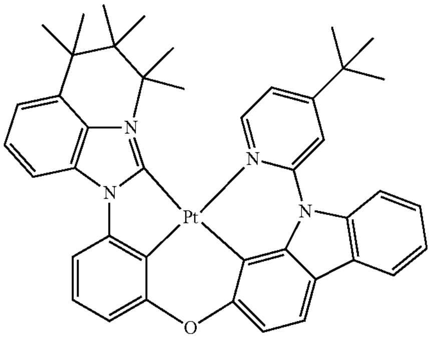
,
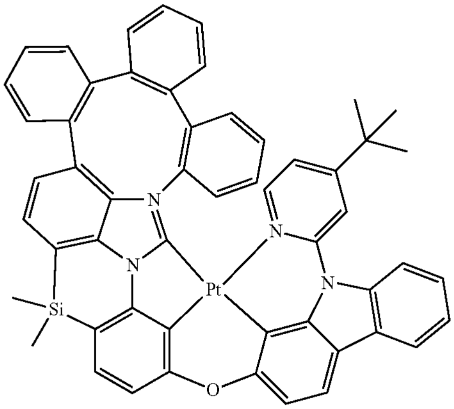
,
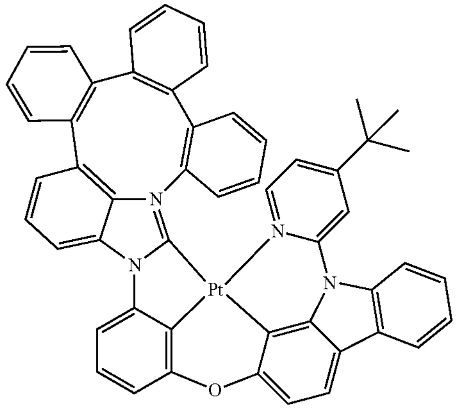
,
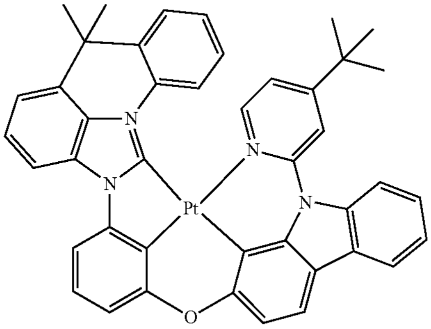
,
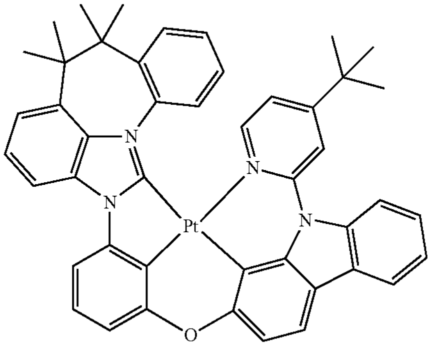
,
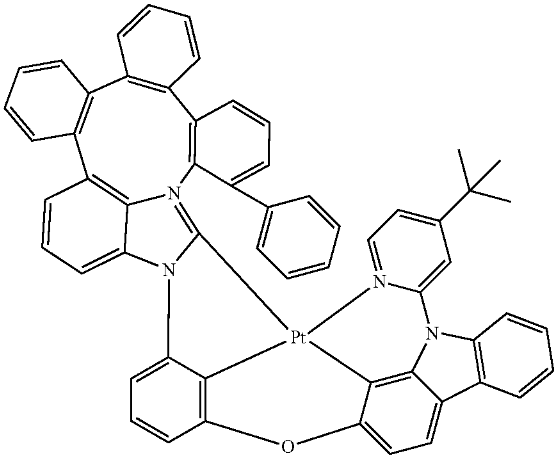
,
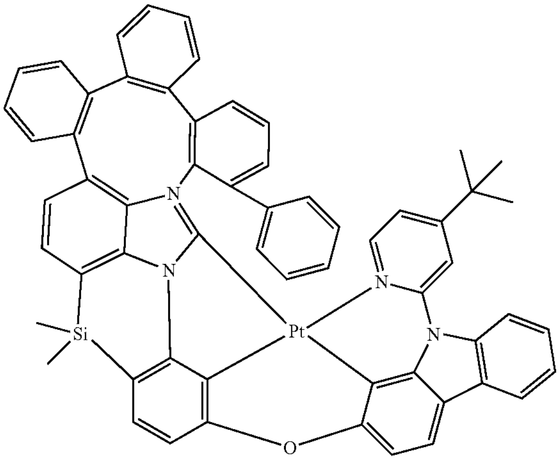
, -continued
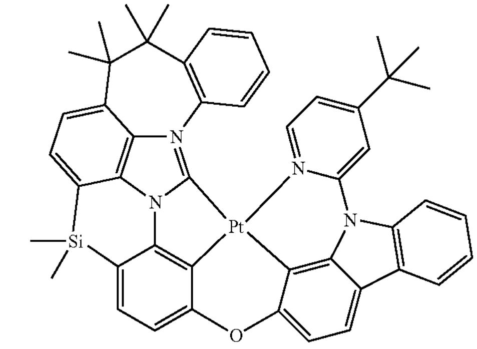
,
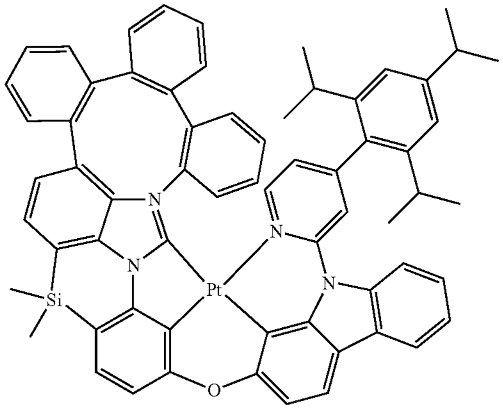
,
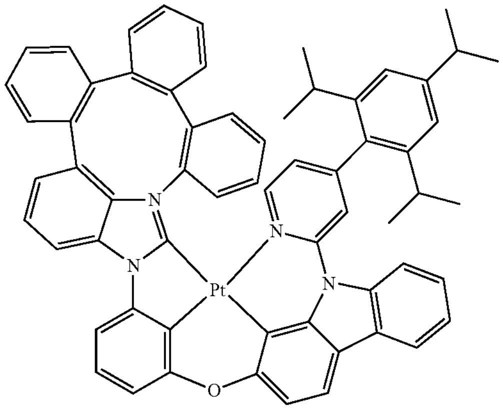
,
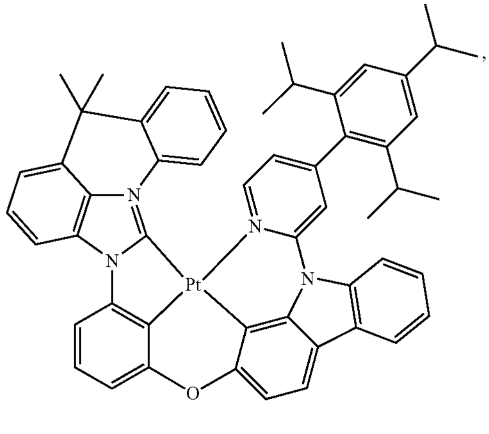
,
-continued
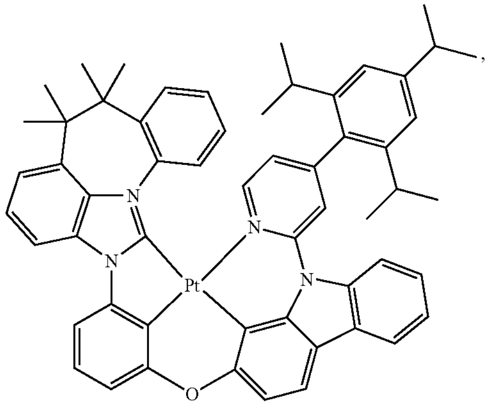
,
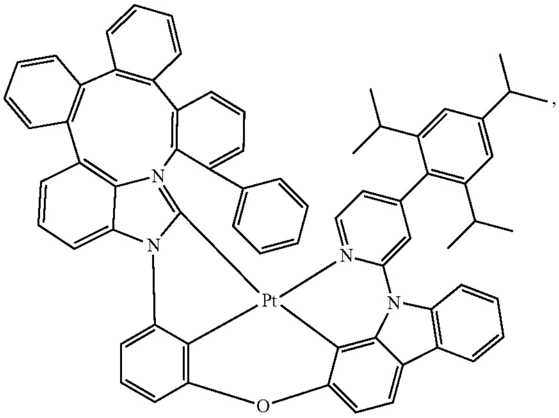
,
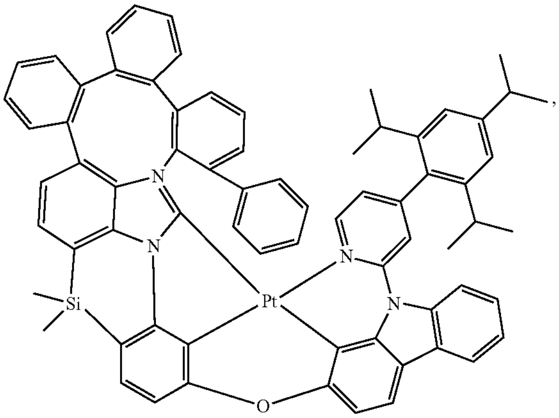
,
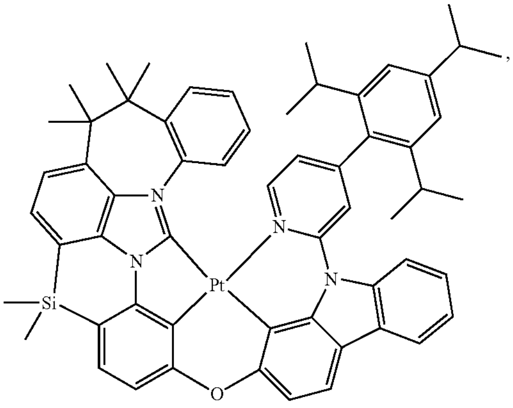
, -continued
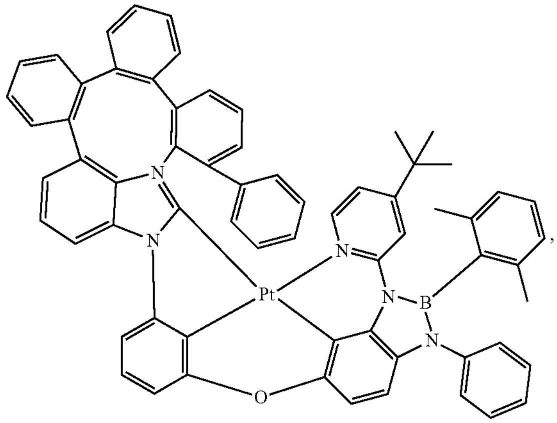
,
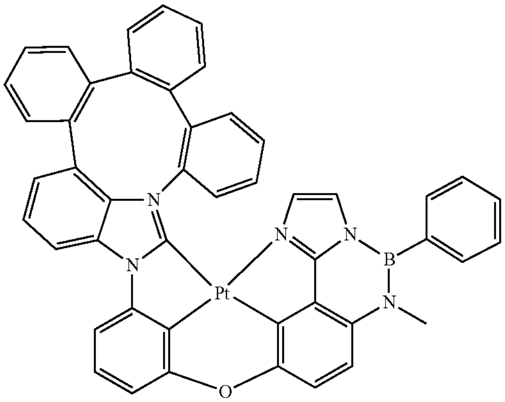
,
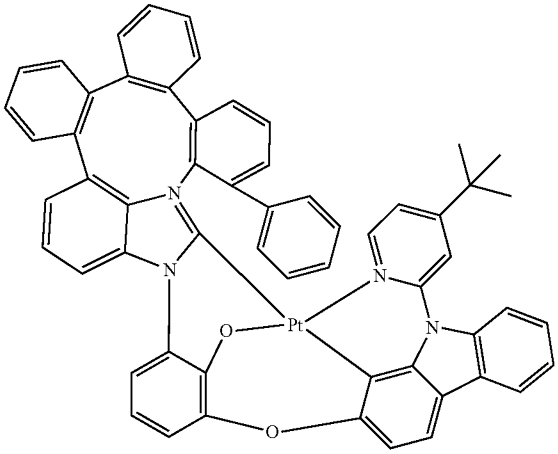
,
-continued
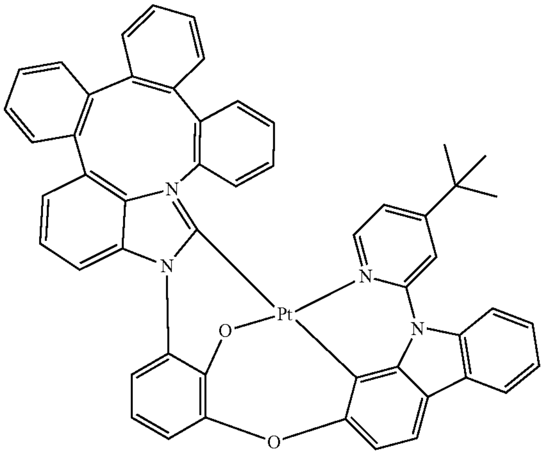
,
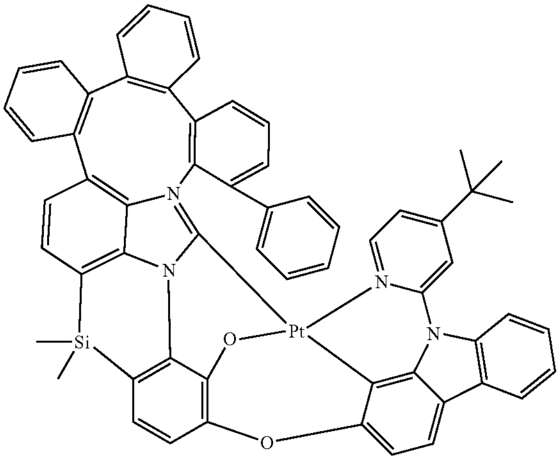
,
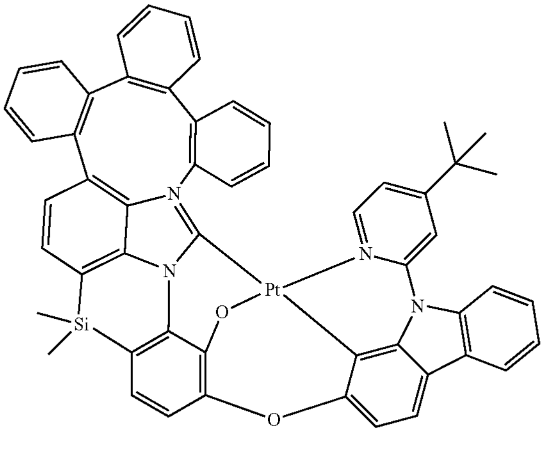
, -continued
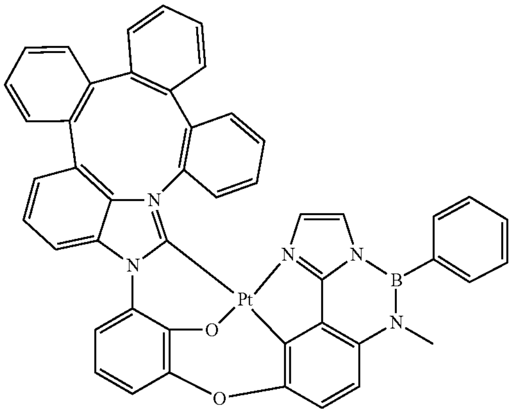
,
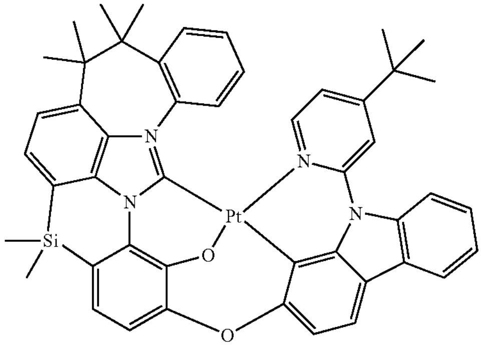
,
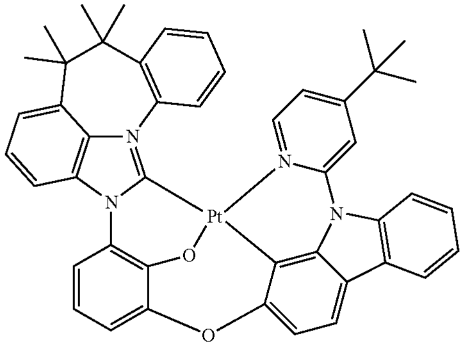
,
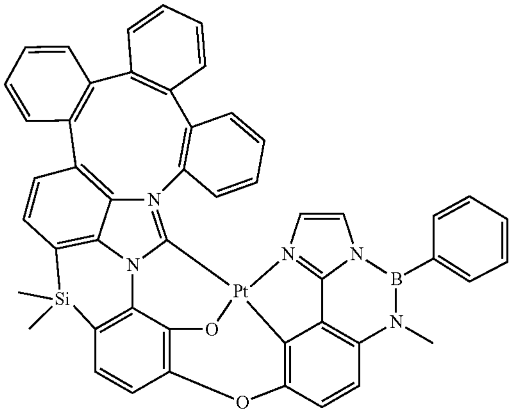
,
-continued
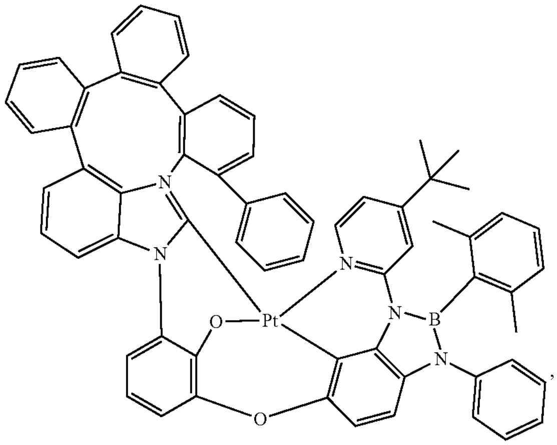
,
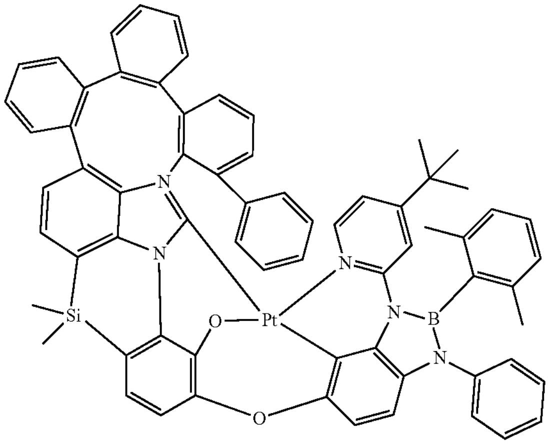
,
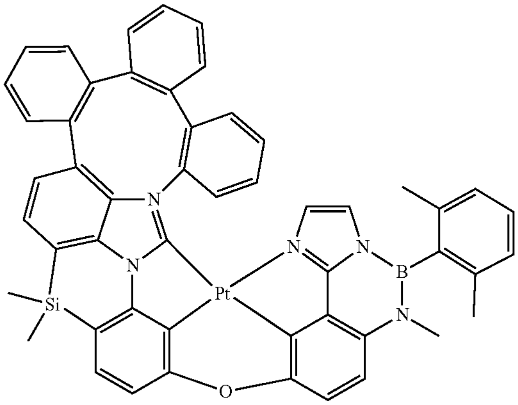
,
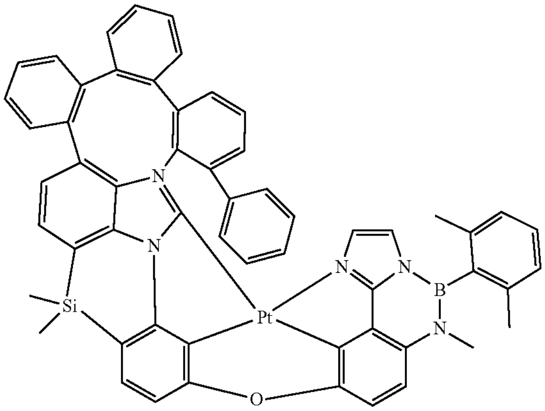

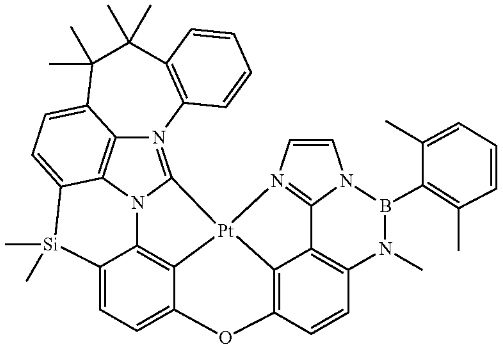
,
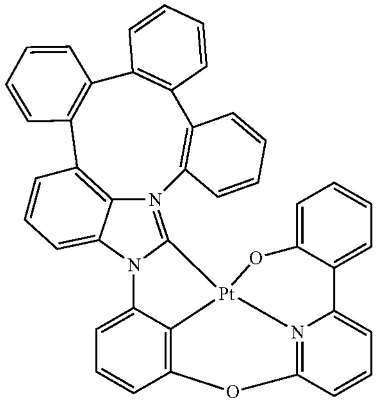
,
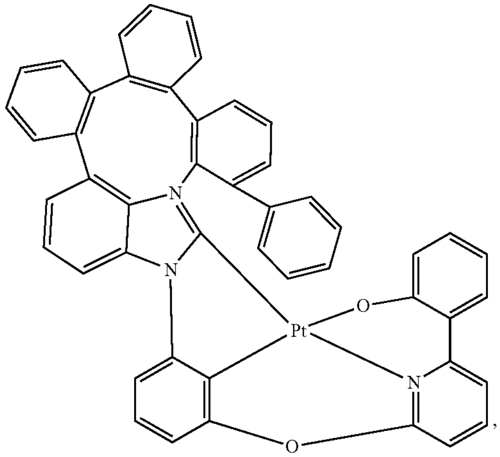
,
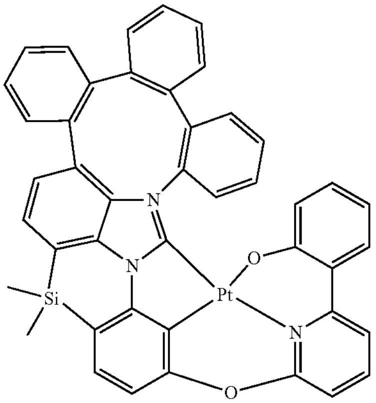
,
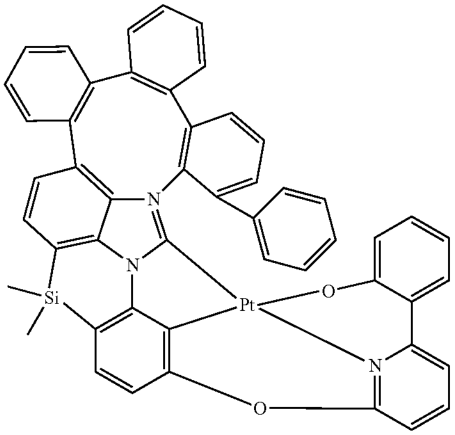
,
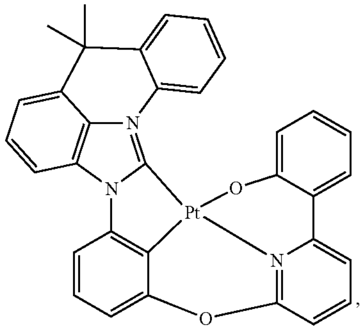
,
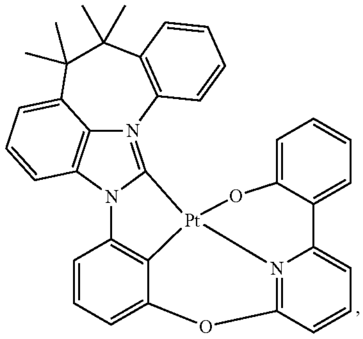
,
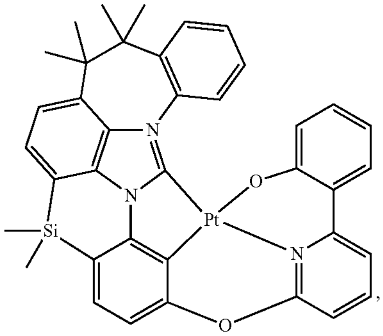
, -continued
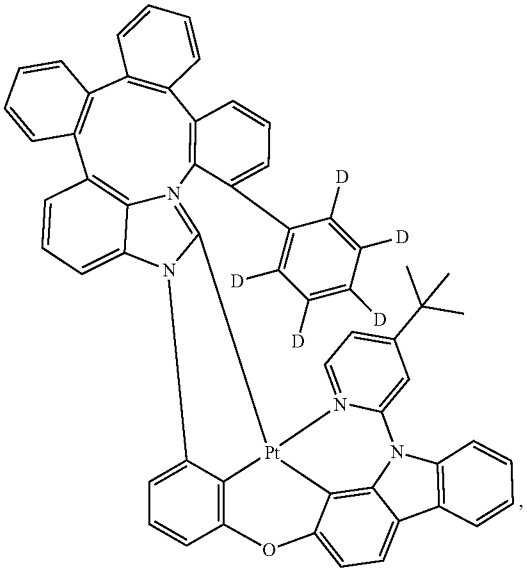
-continued
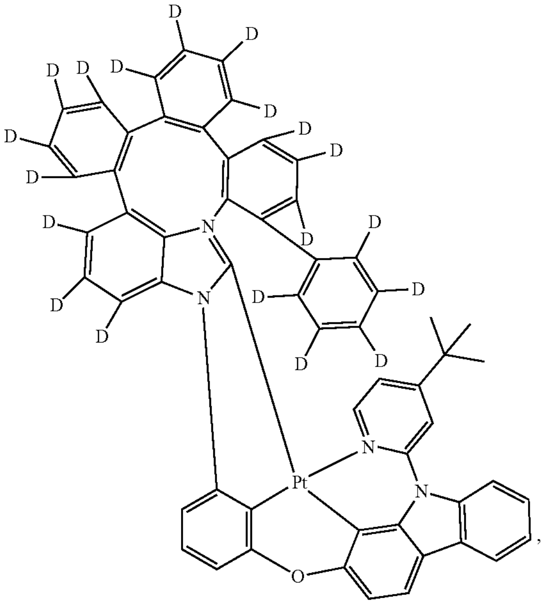
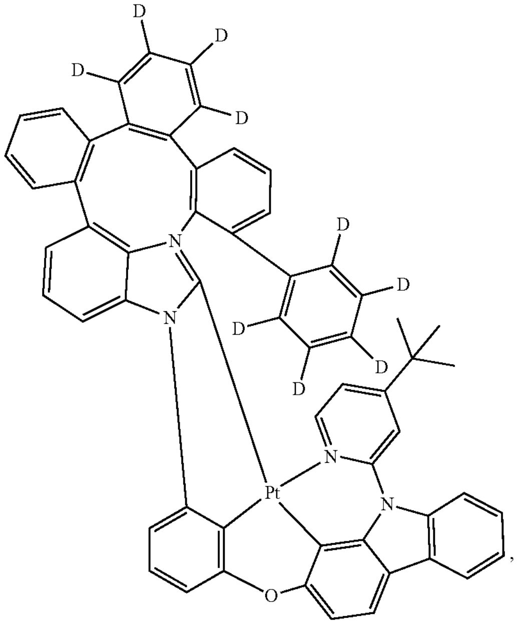
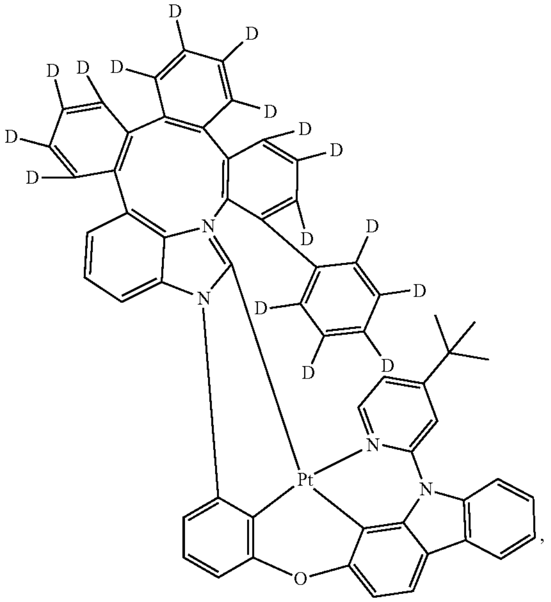

-continued
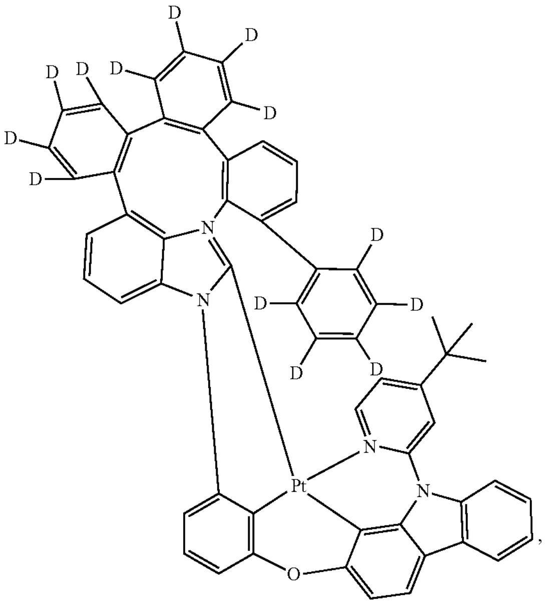
,
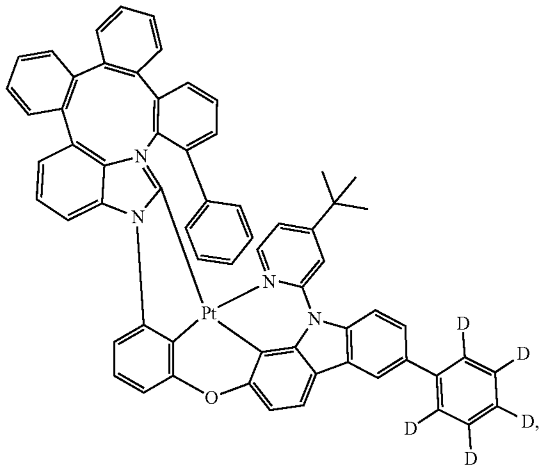
,
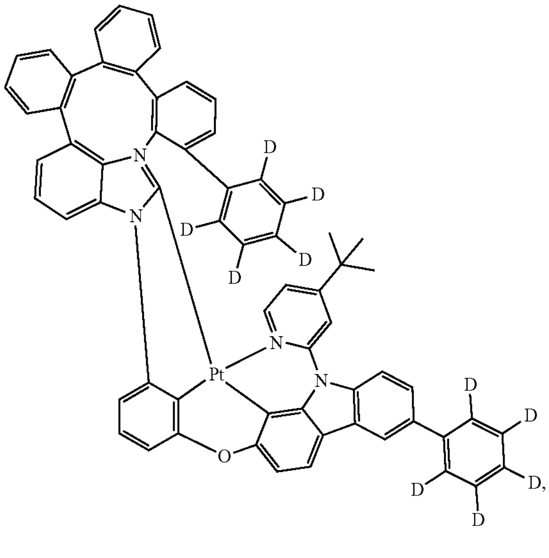
,
-continued
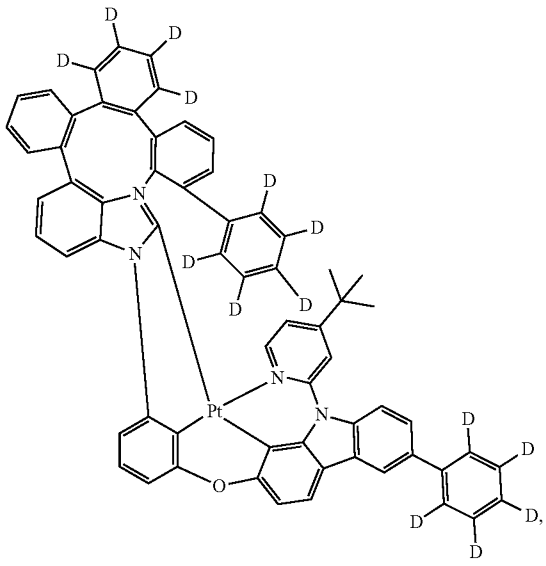
,
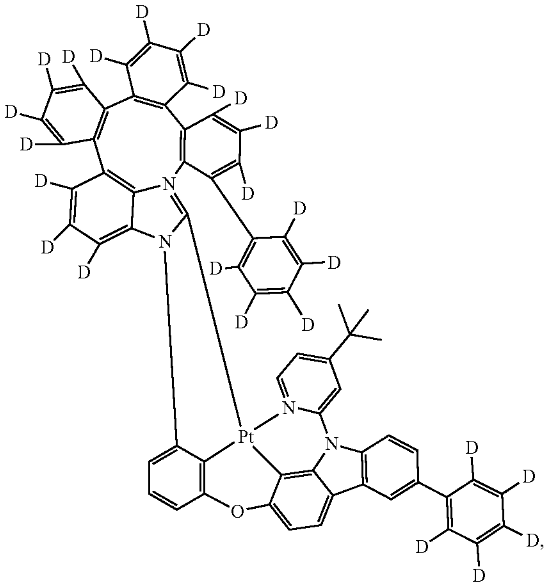
,
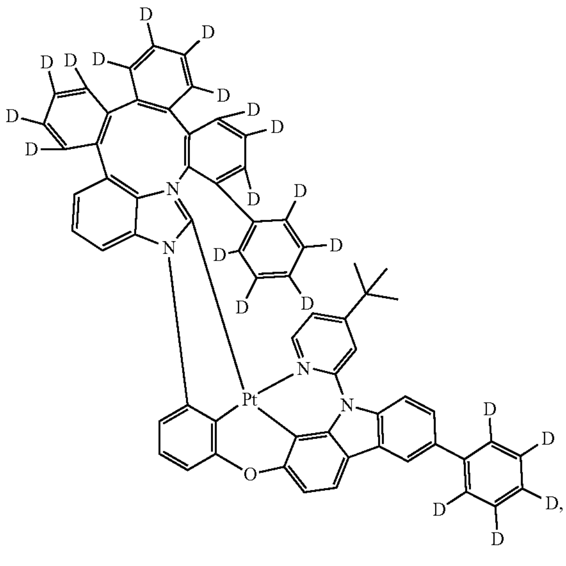
, -continued
-continued
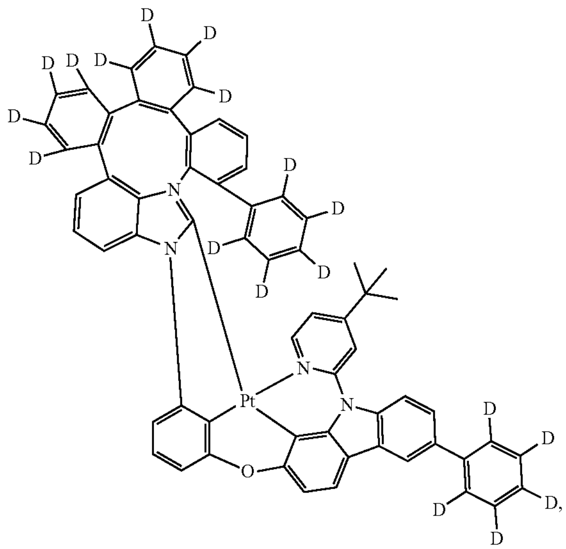
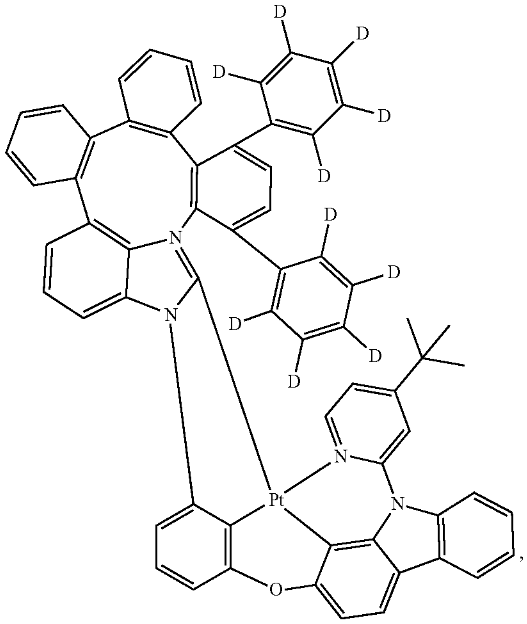
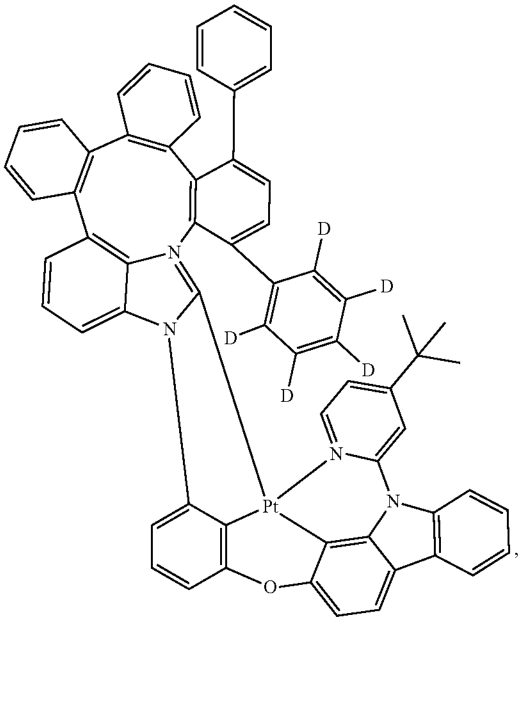
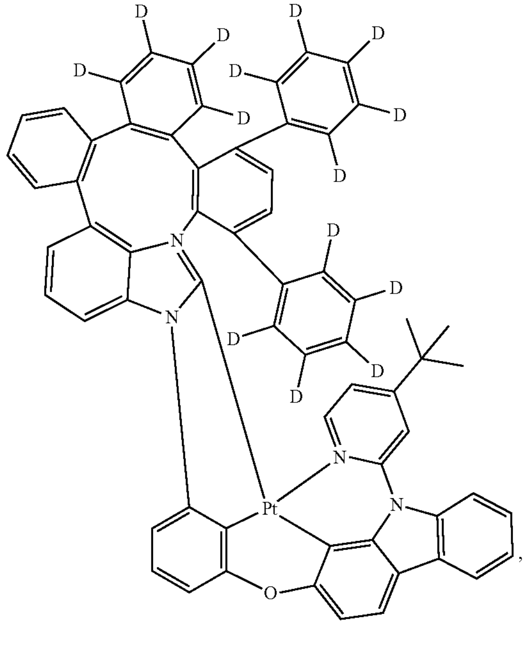

-continued
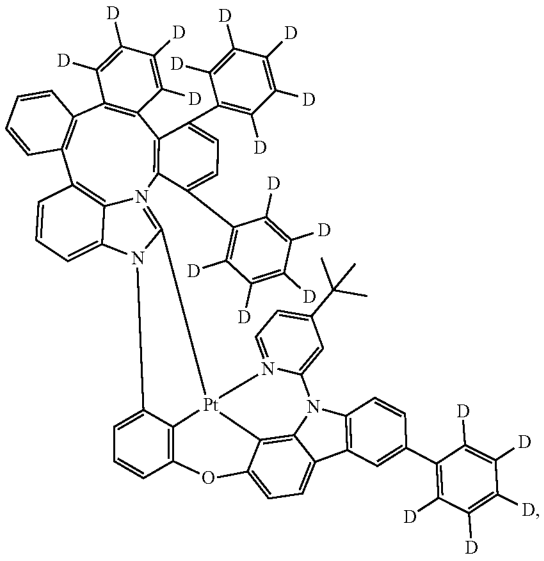
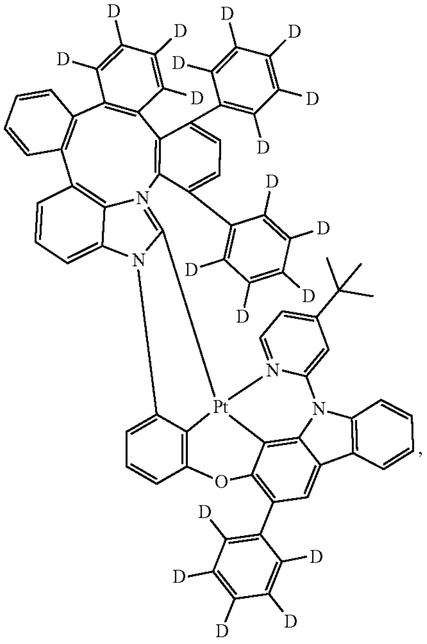
-continued
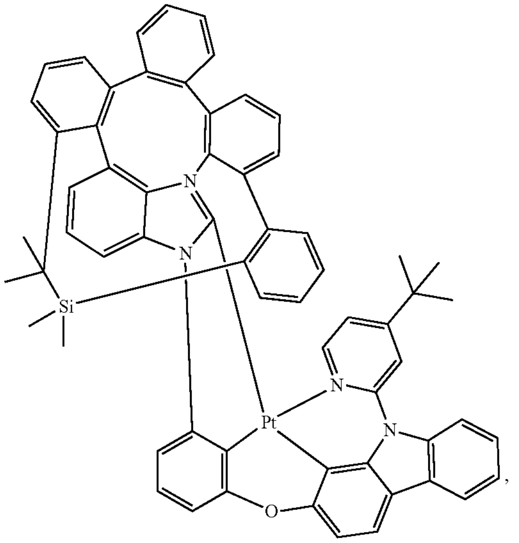
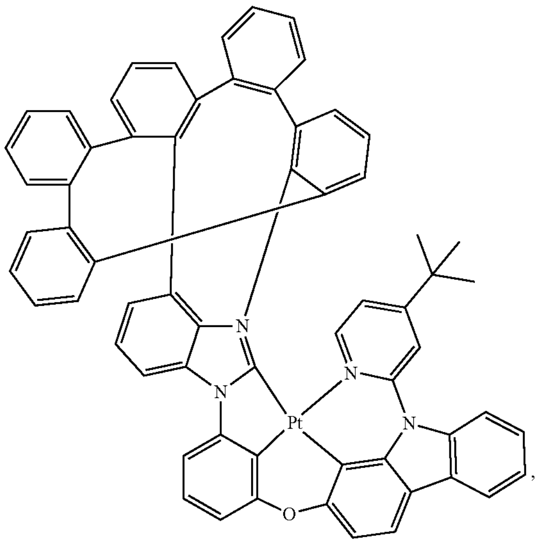
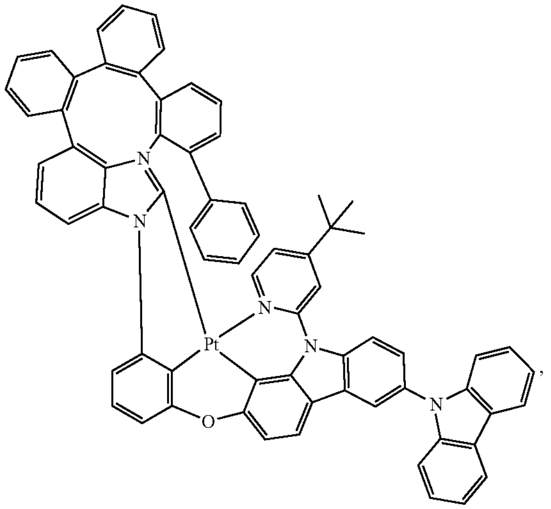

-continued
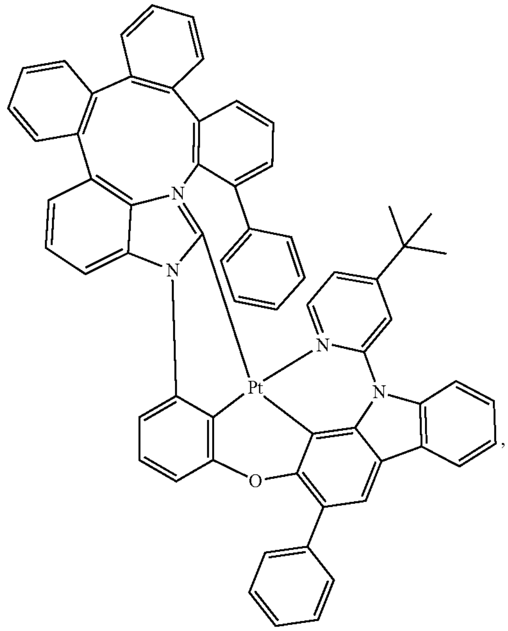
,
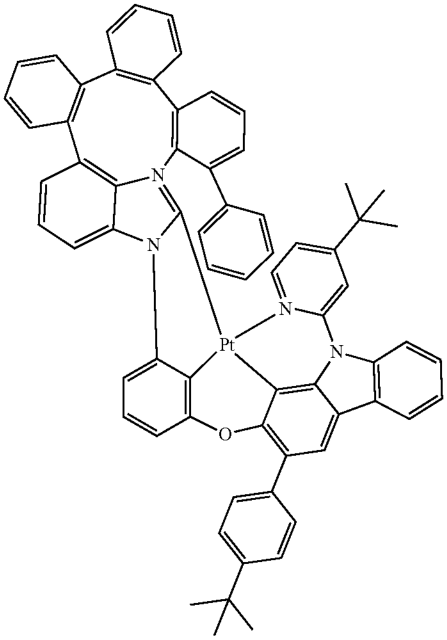
,
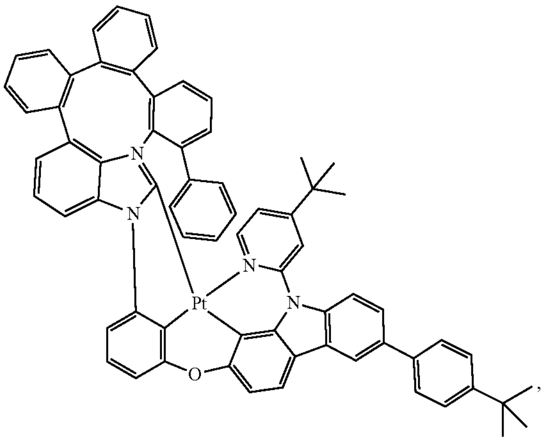
,
-continued
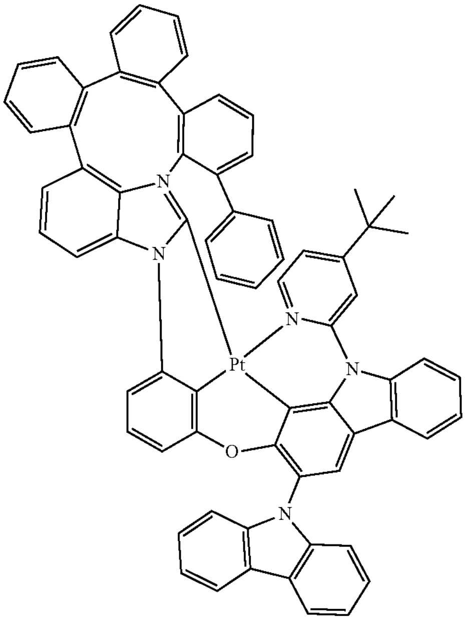
,
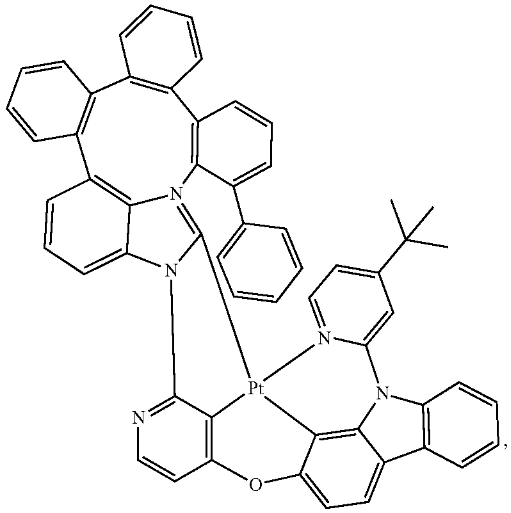
,
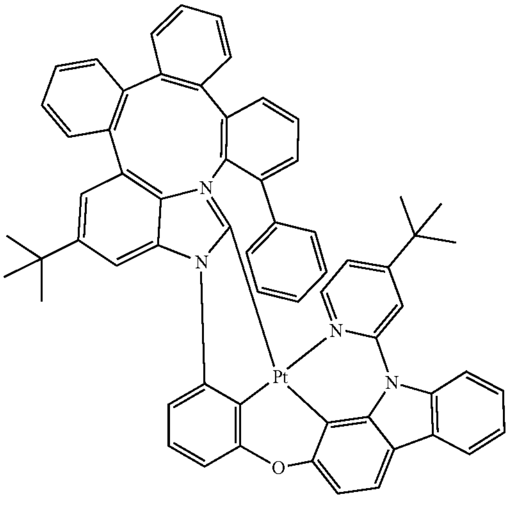
, -continued
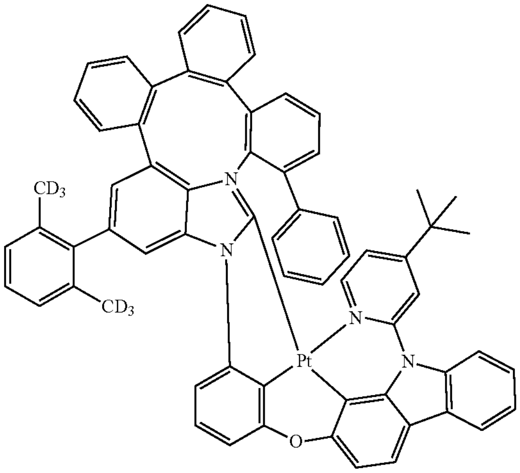
,
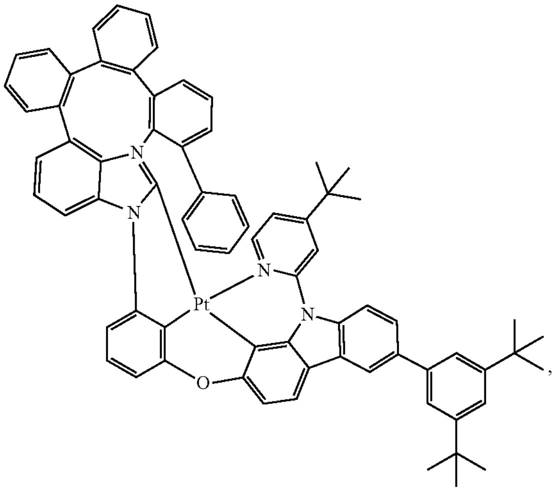
,
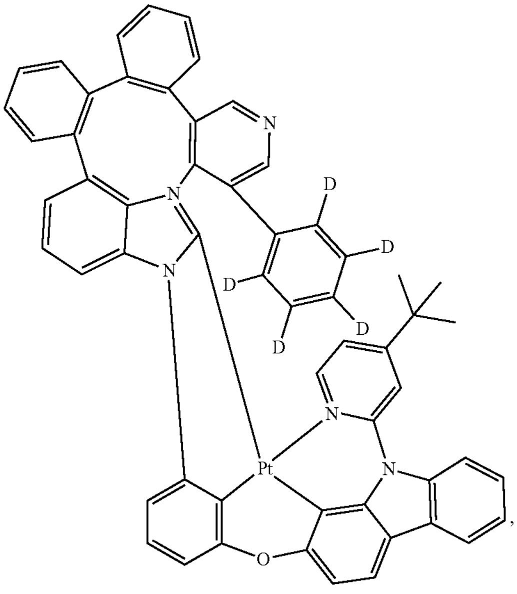
,
-continued
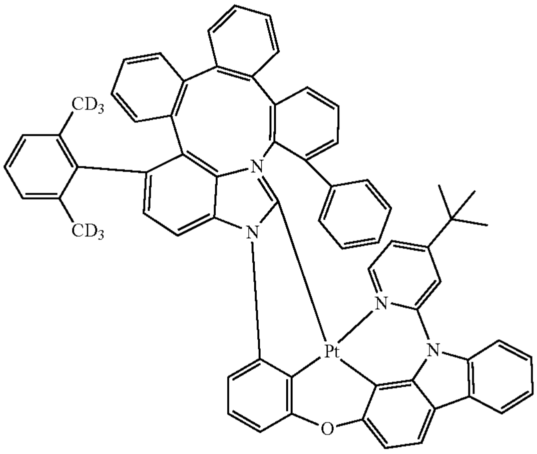
,
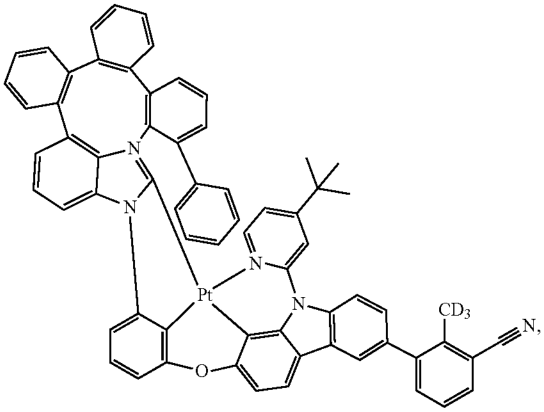
N,
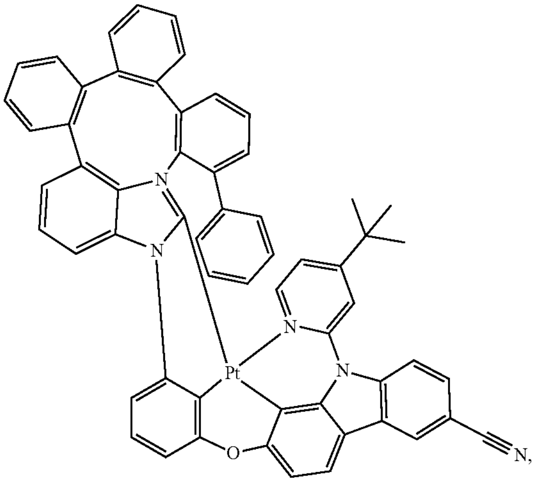
N, -continued
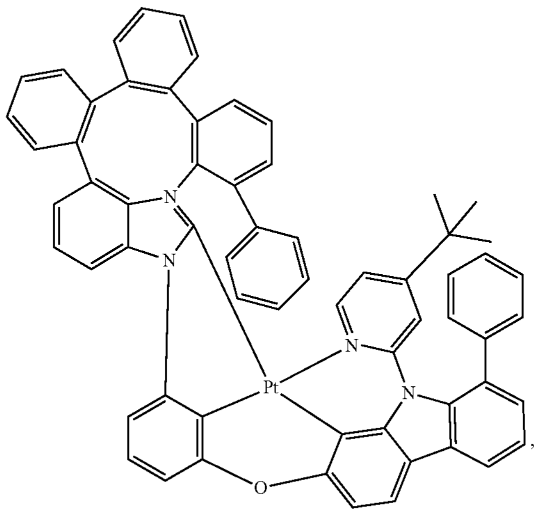
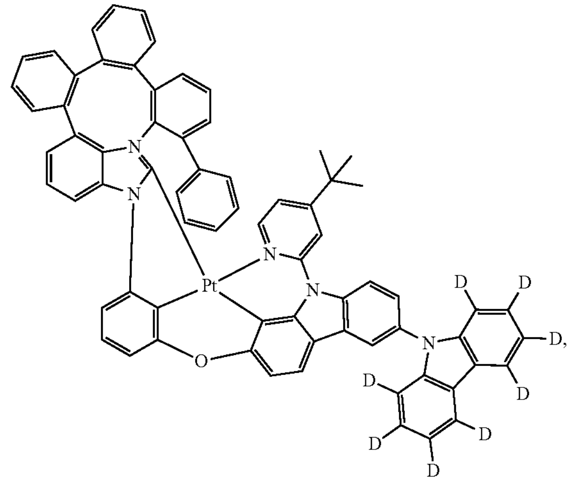
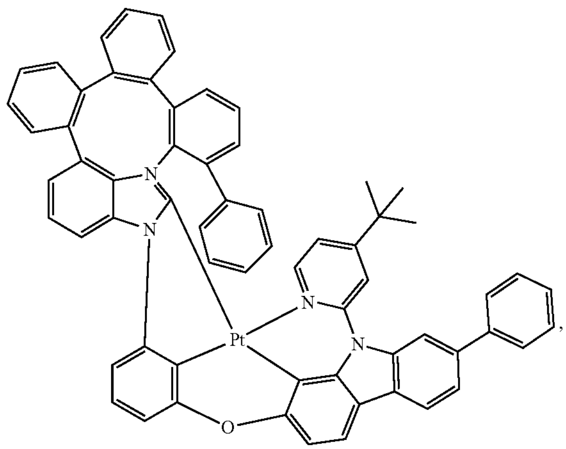
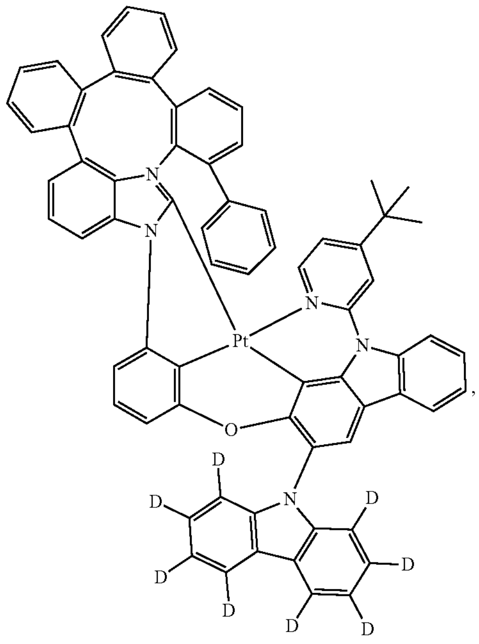
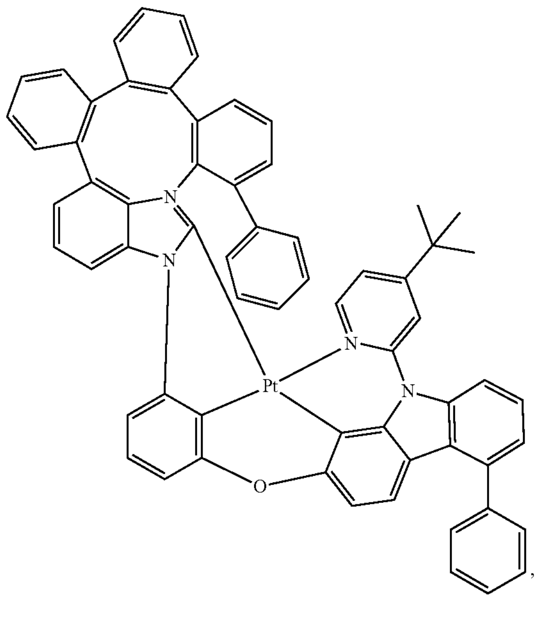
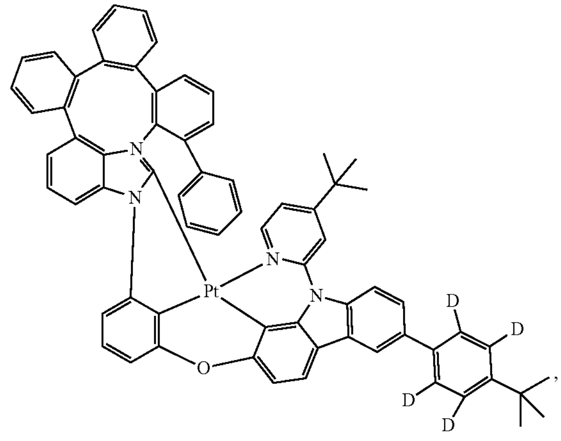

-continued
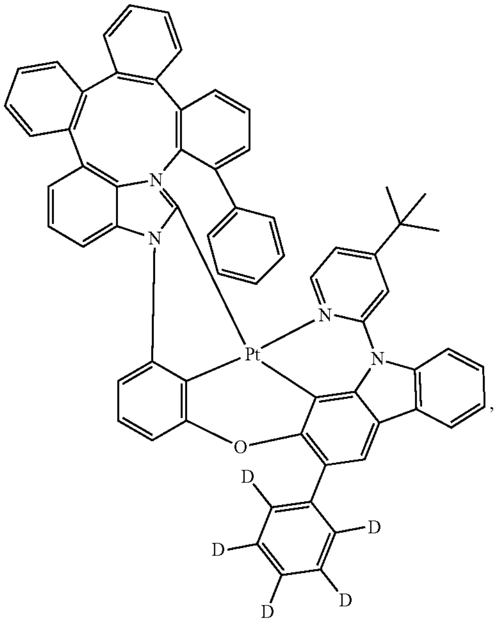
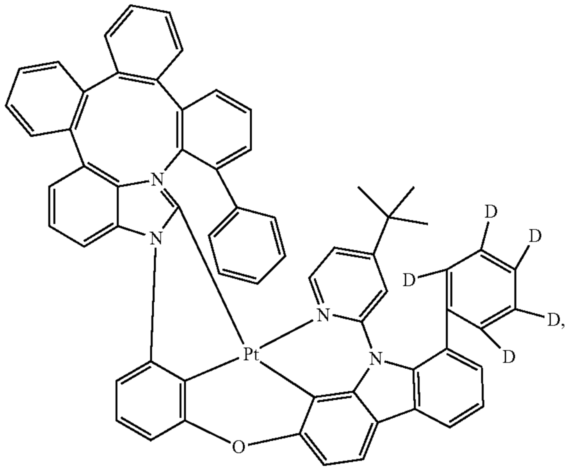
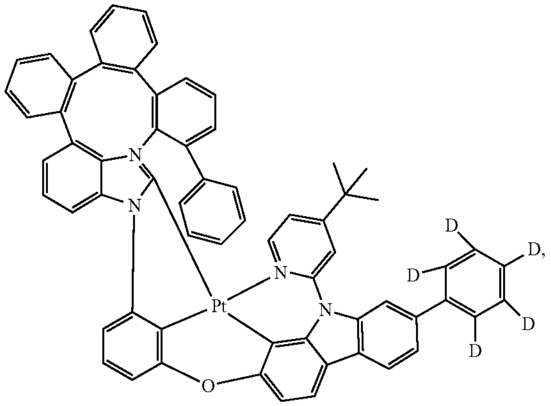
-continued
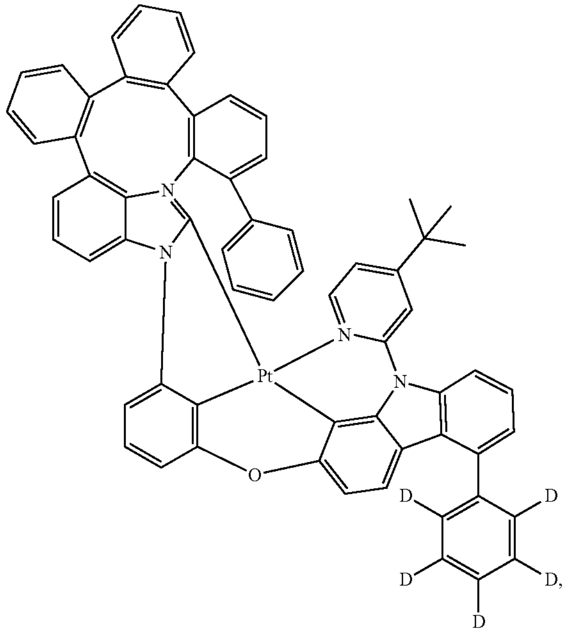
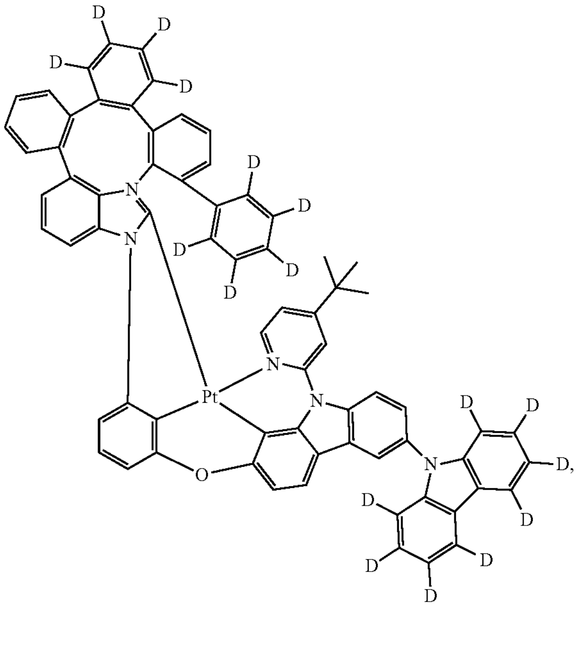

-continued
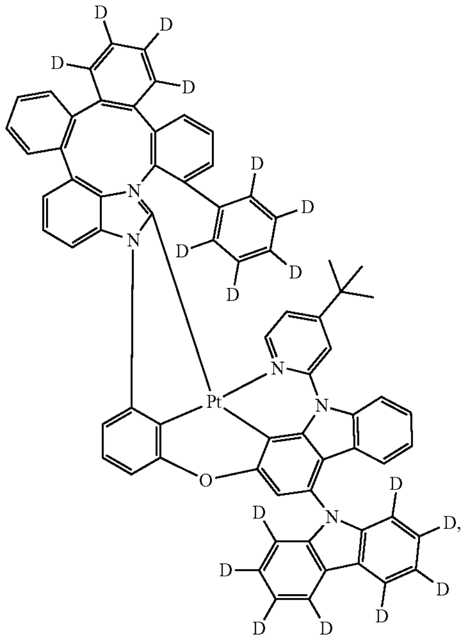
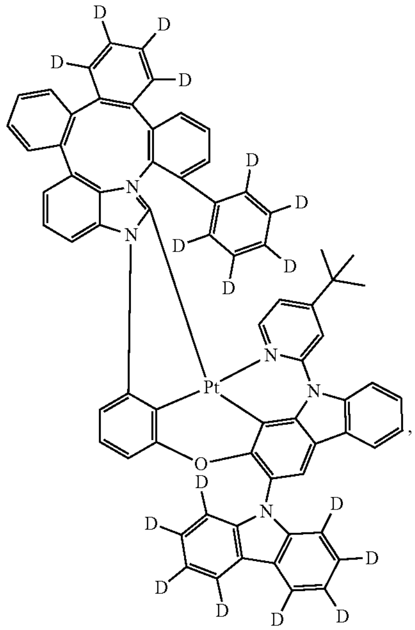
-continued
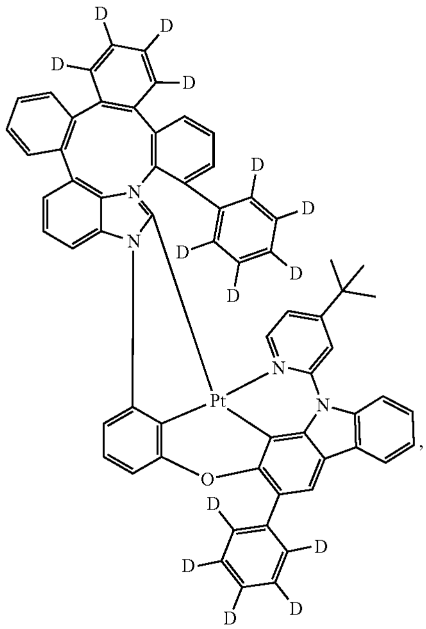
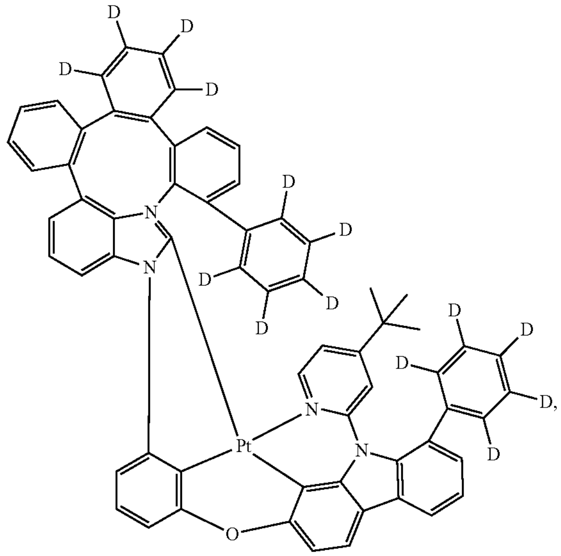
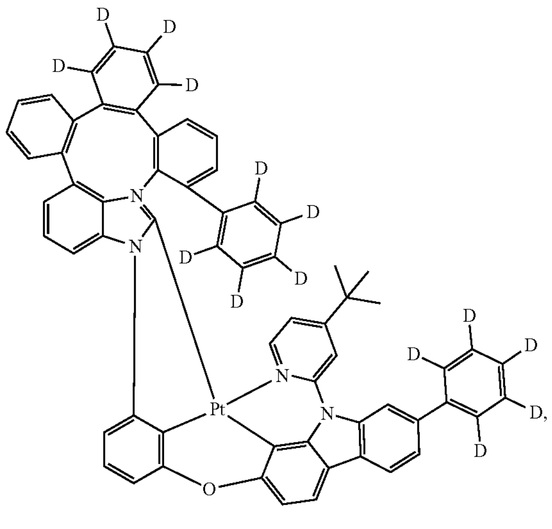

-continued
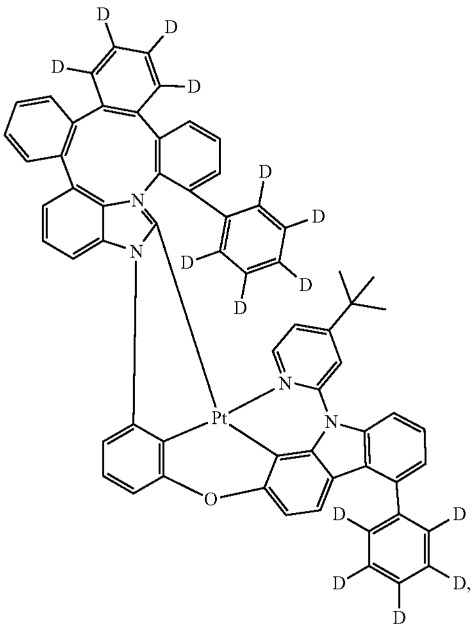
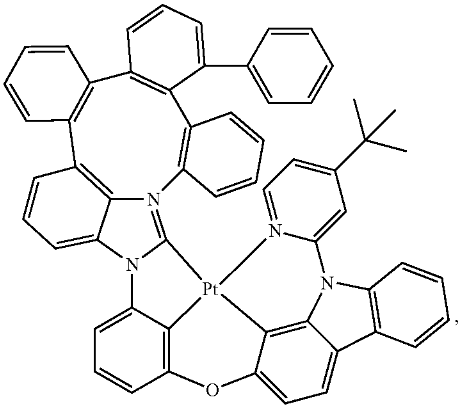
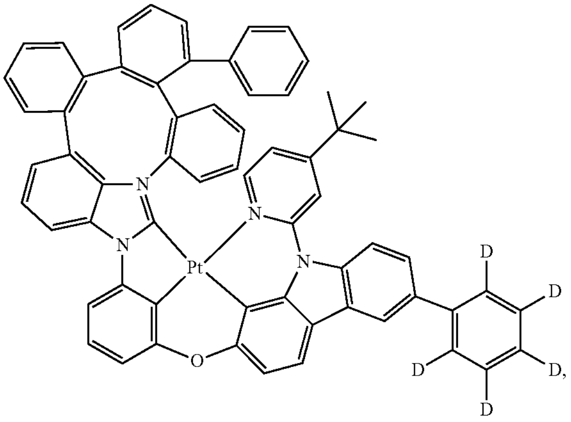
-continued
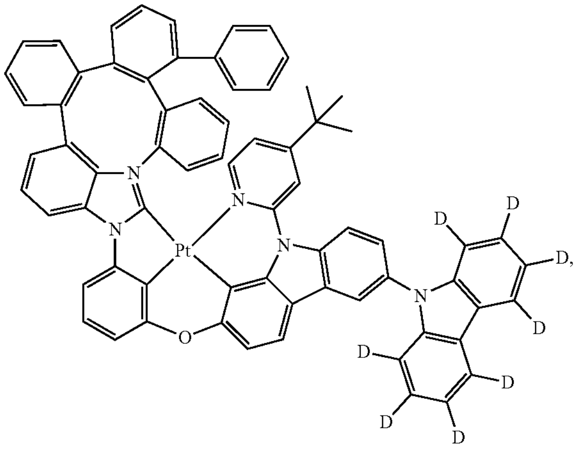
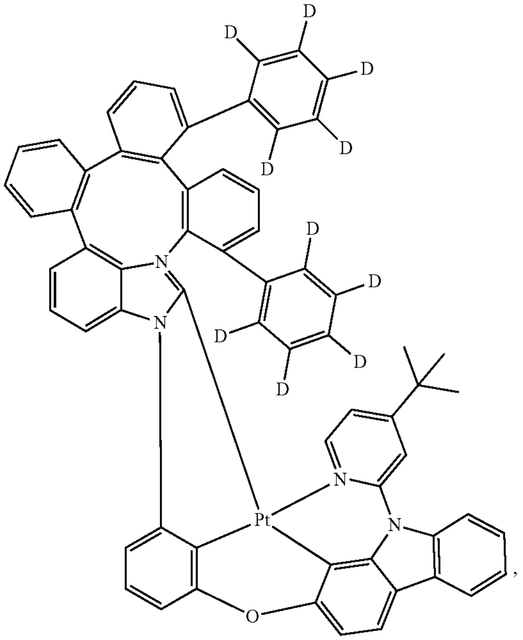
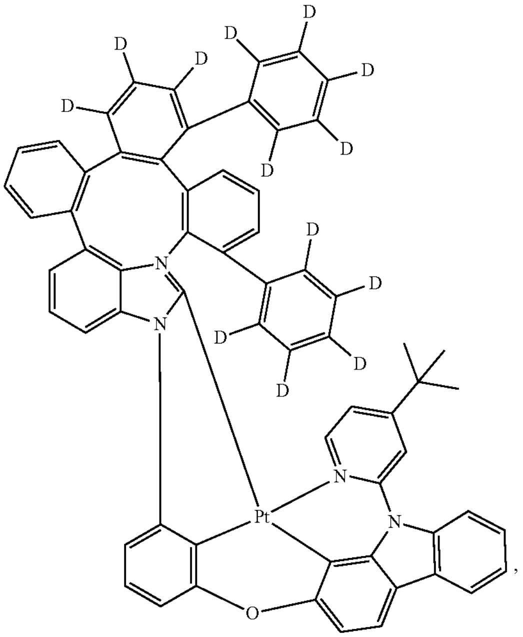

-continued
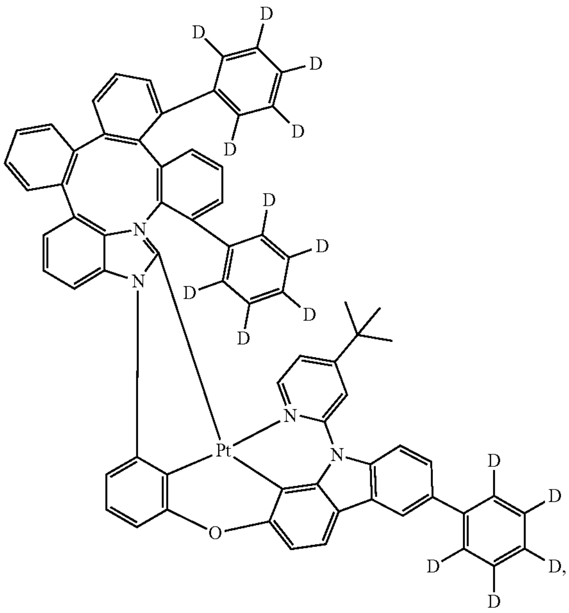
,
-continued
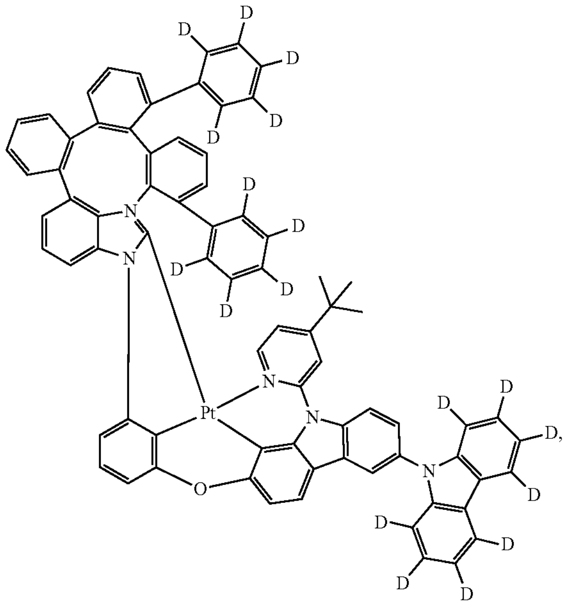
,
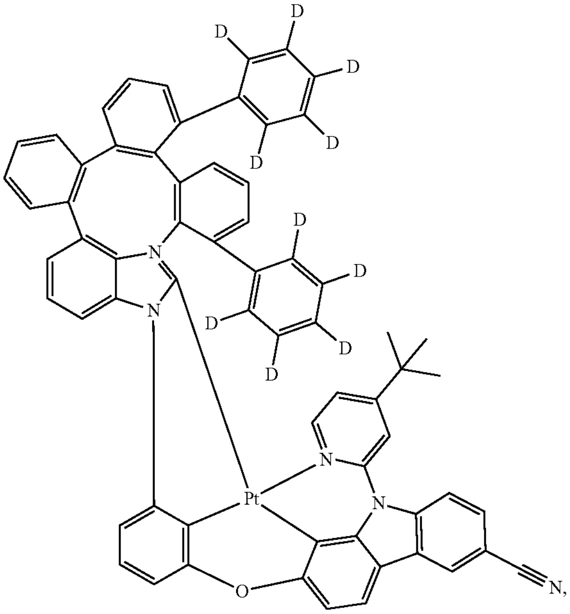
,
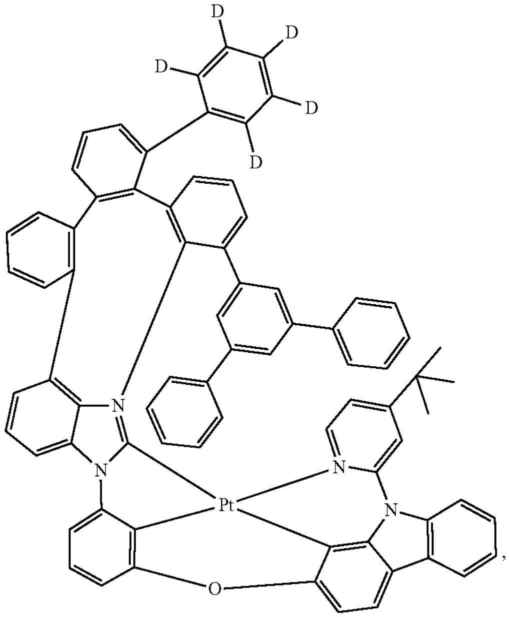
,

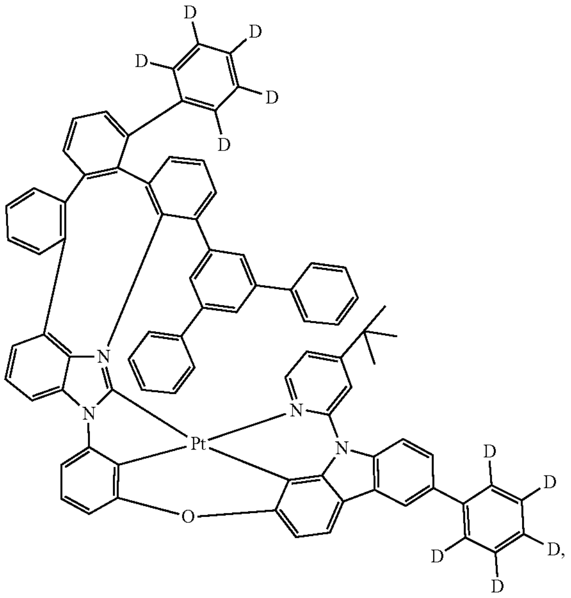
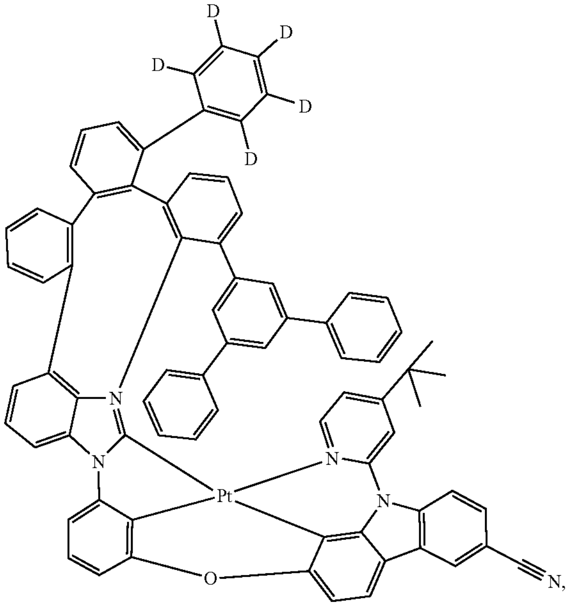
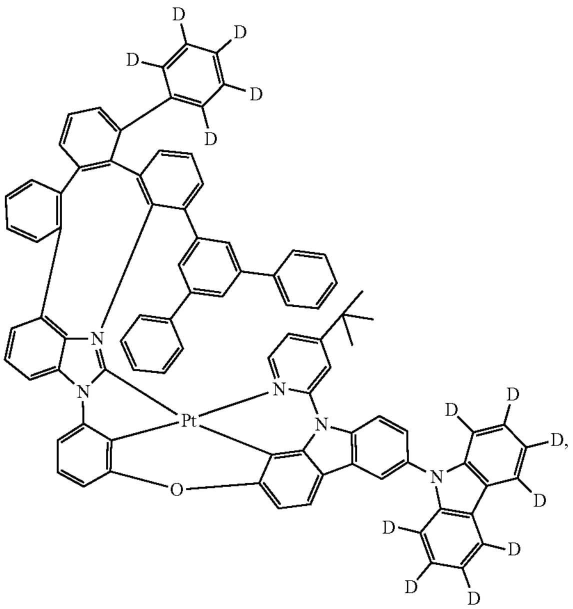
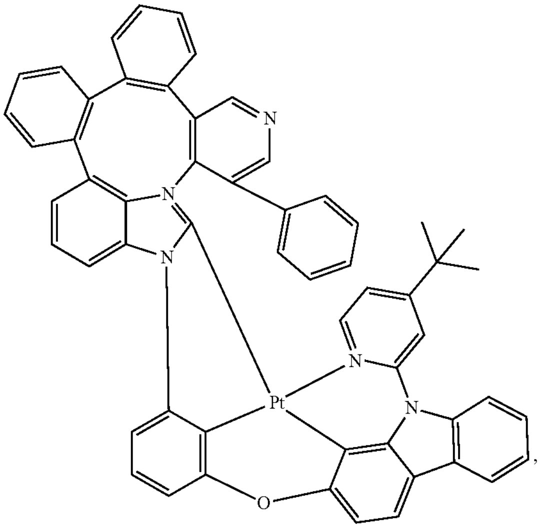
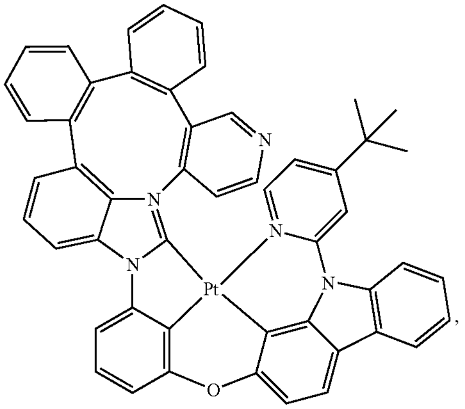

-continued
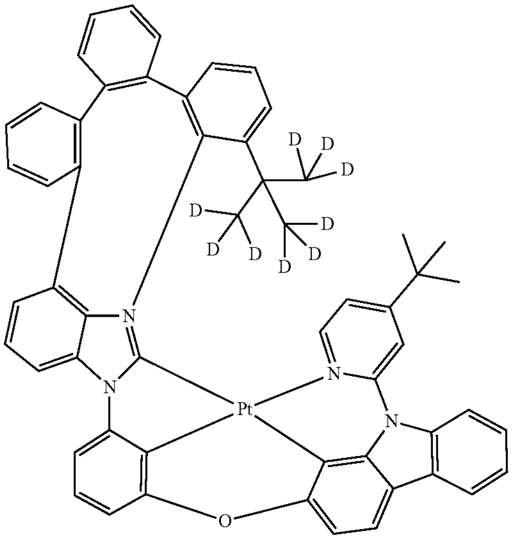,
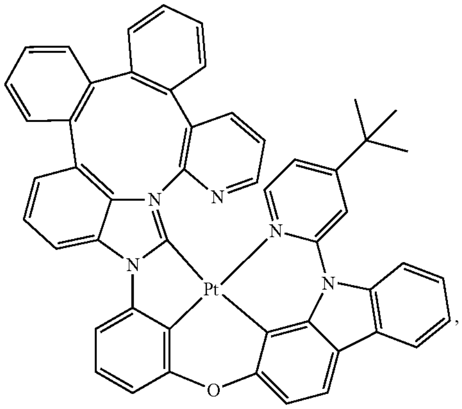,
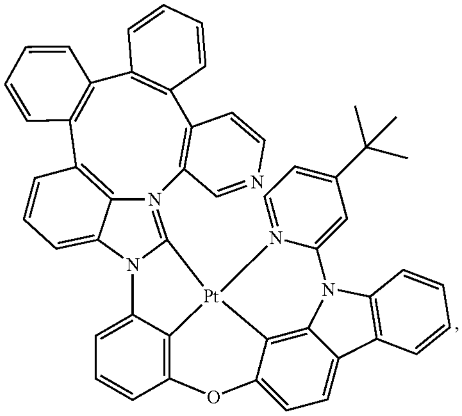,
-continued
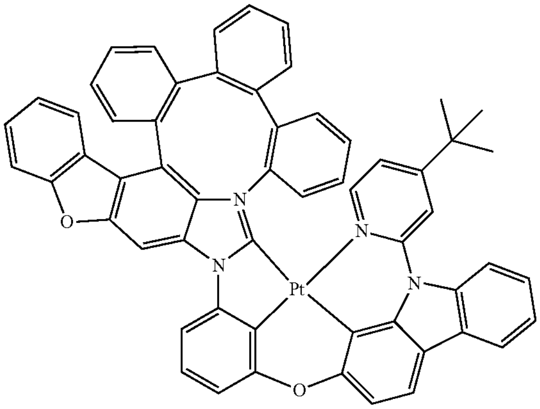,
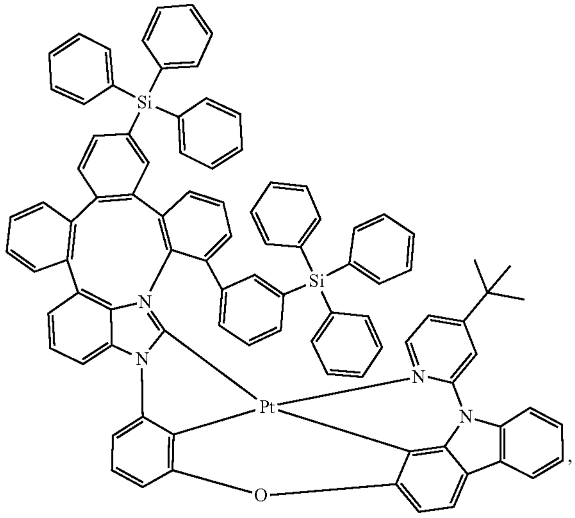,
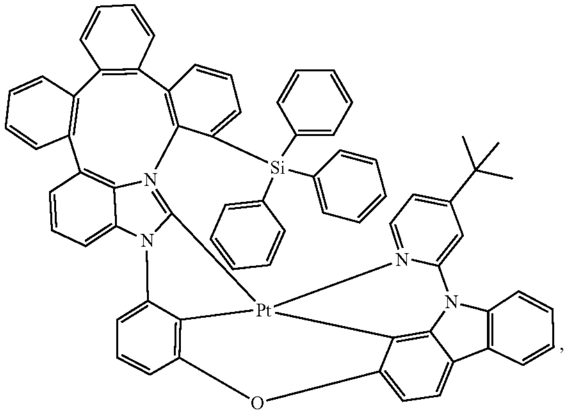, -continued
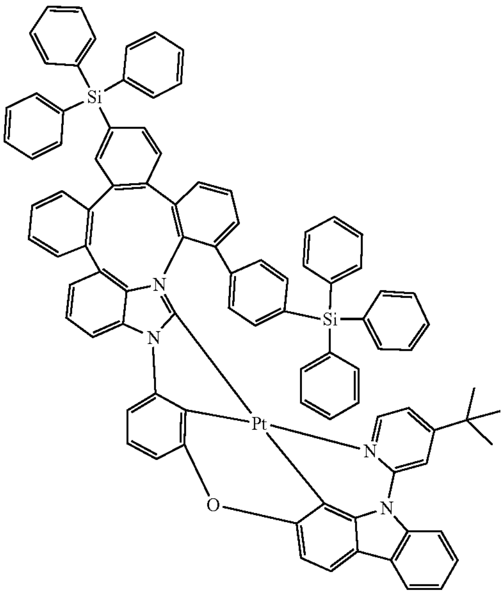
,
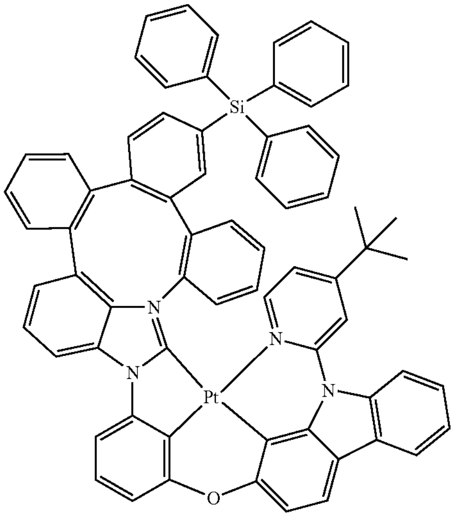
,
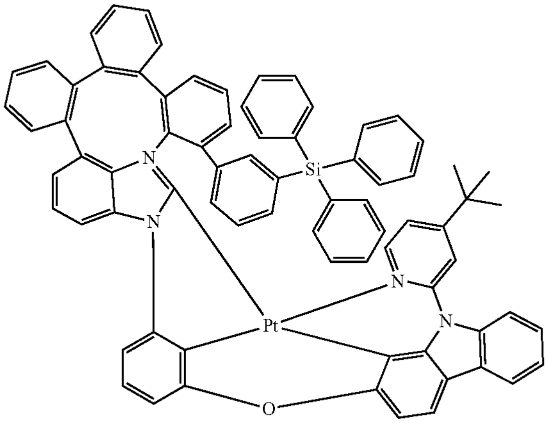
,
-continued
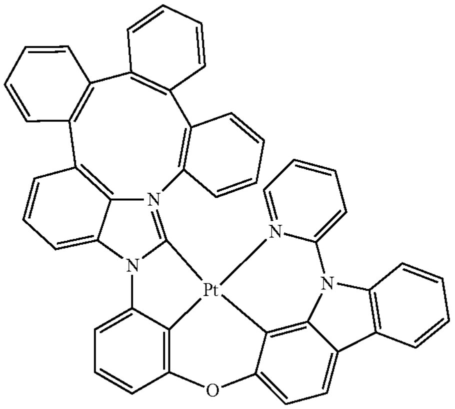
,
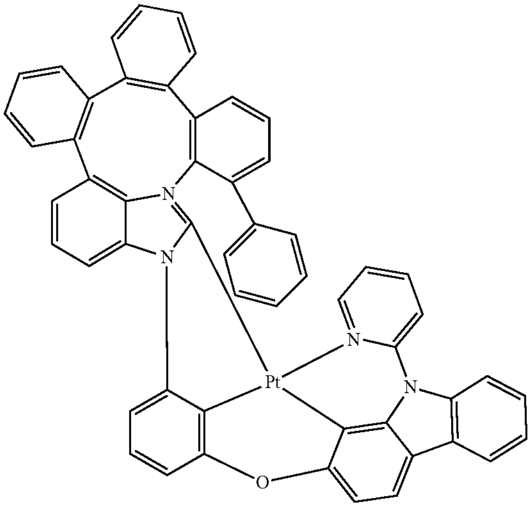
,
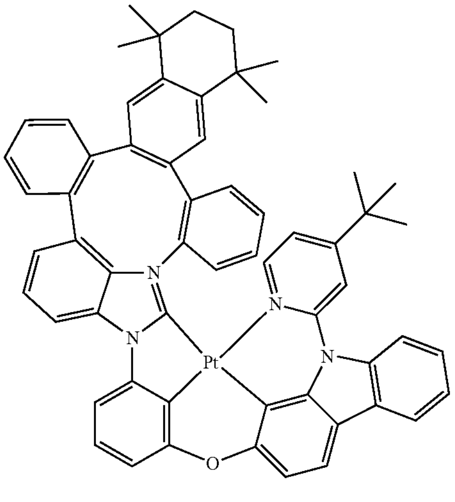
, -continued
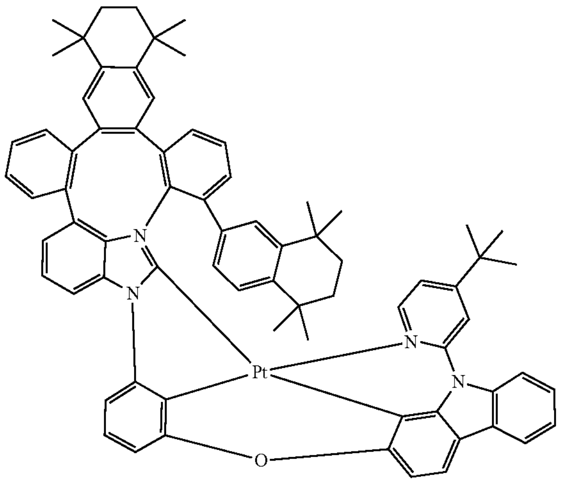
,
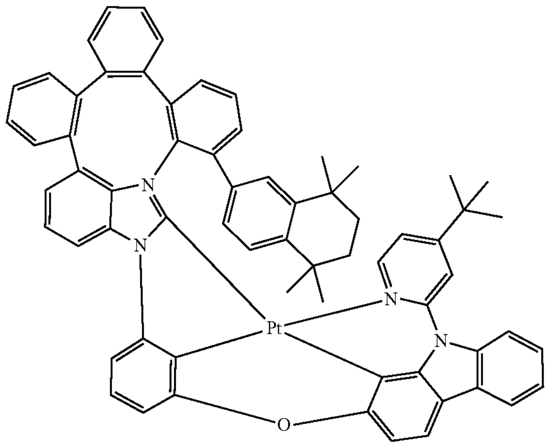
,
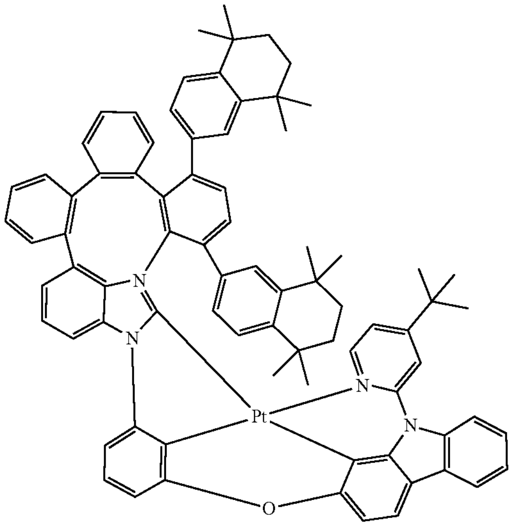
,
-continued
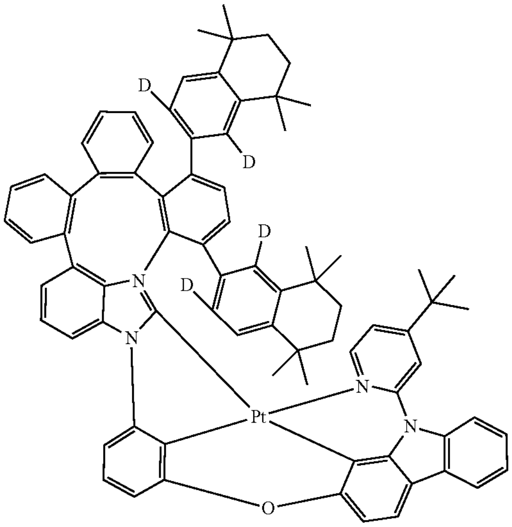
,
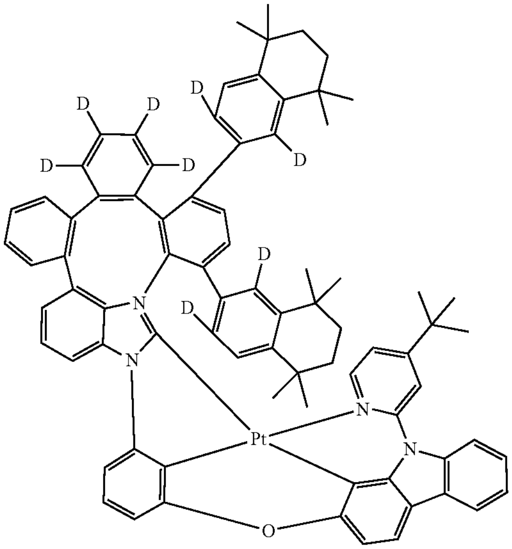
,
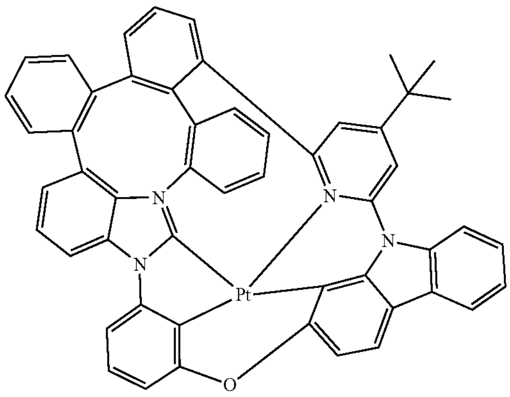
, -continued
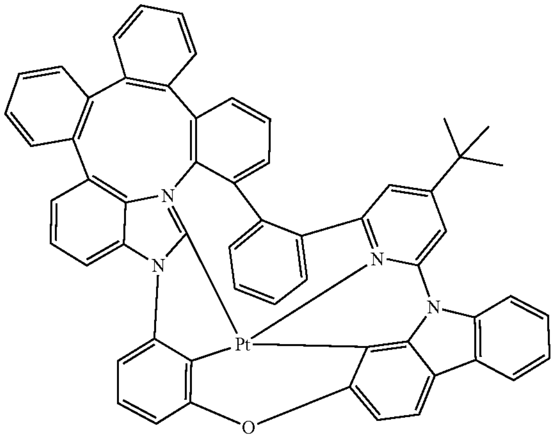
,
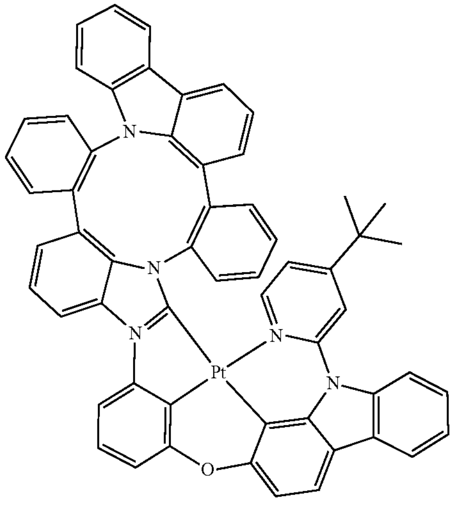
,
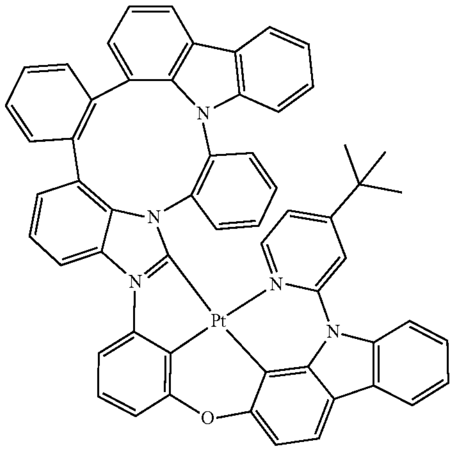
,
-continued
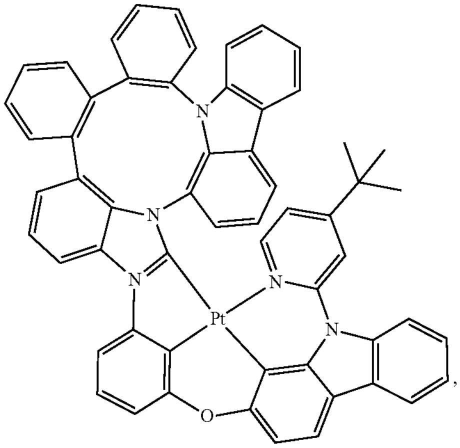
,
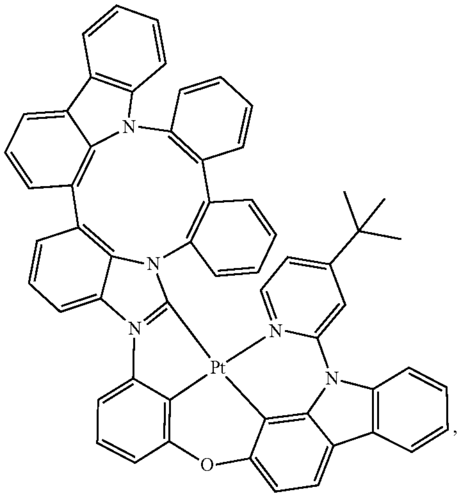
,
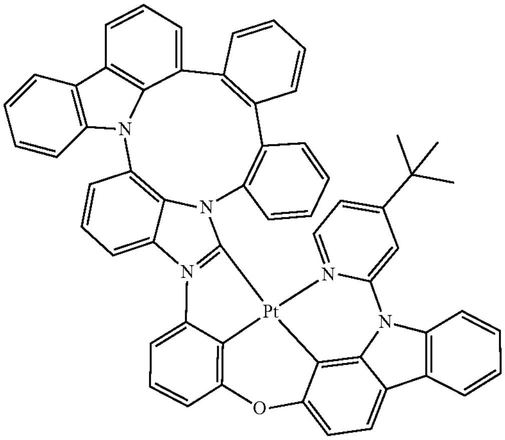
, -continued
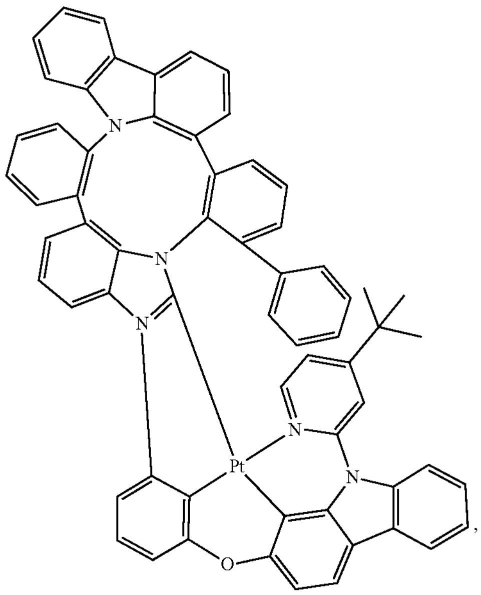
,
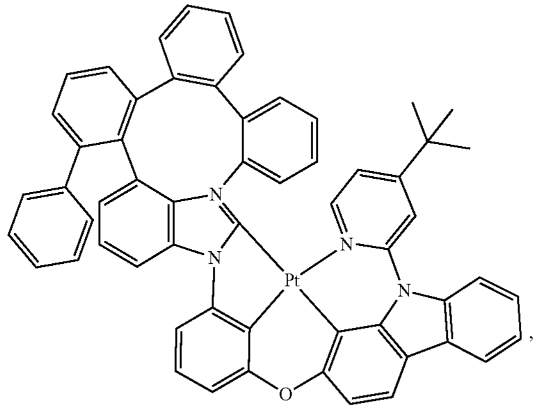
,
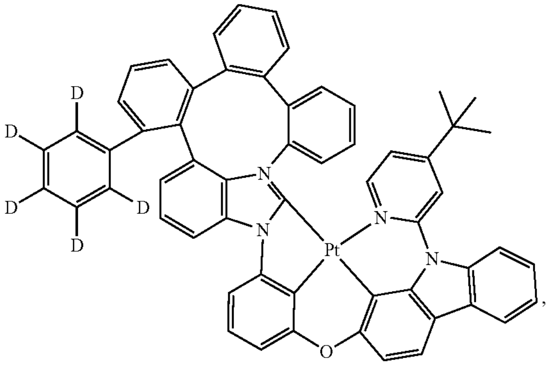
,
-continued
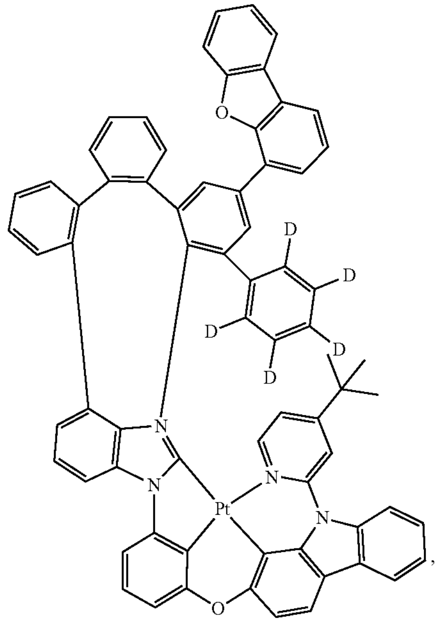
,
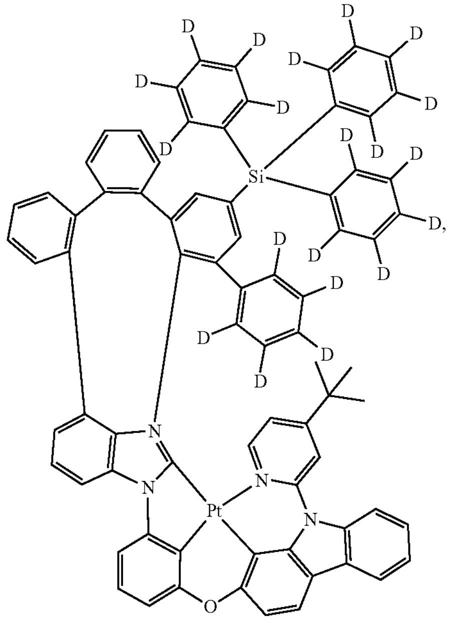
, -continued
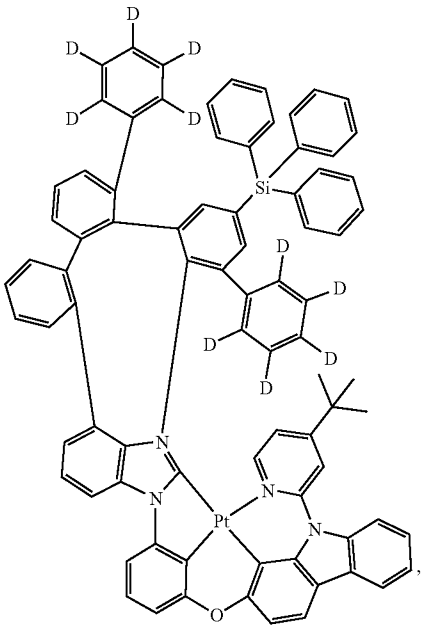
,
-continued
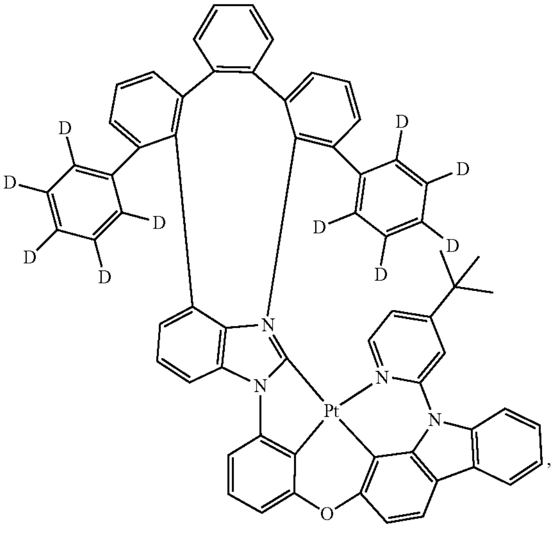
,
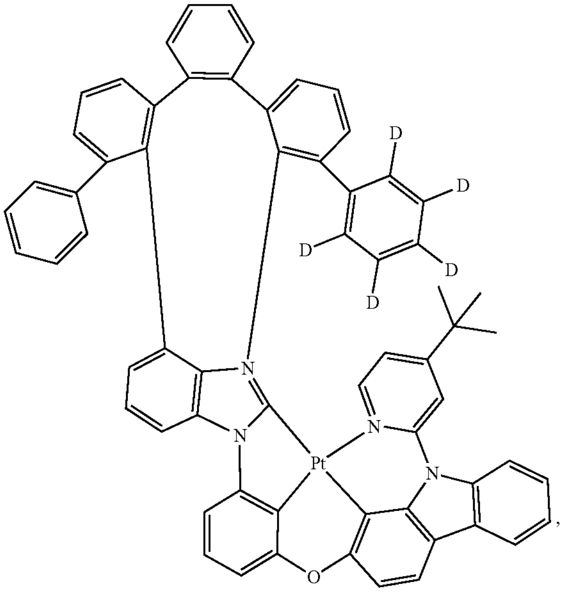
,
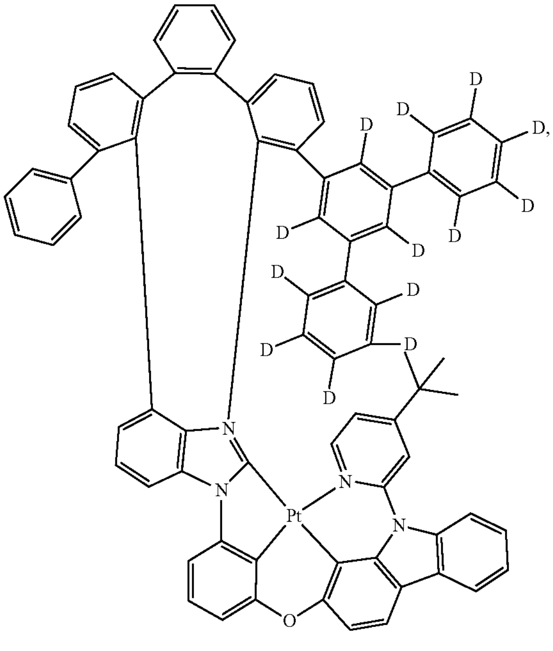

-continued
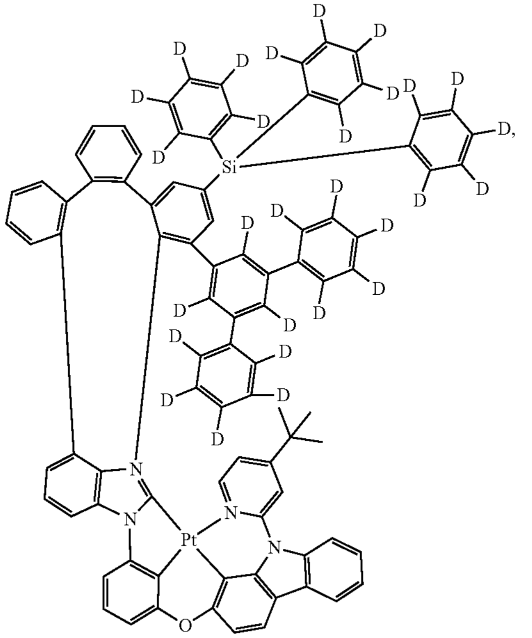
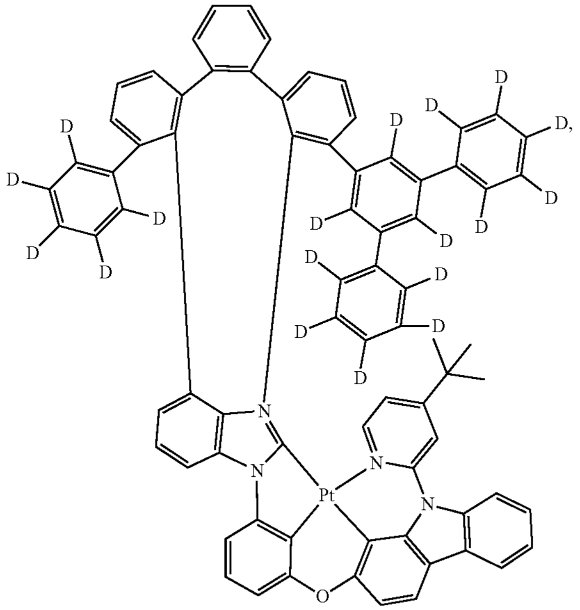
-continued
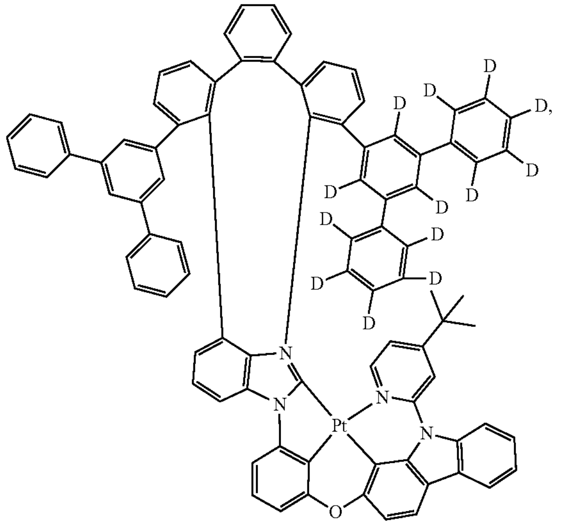
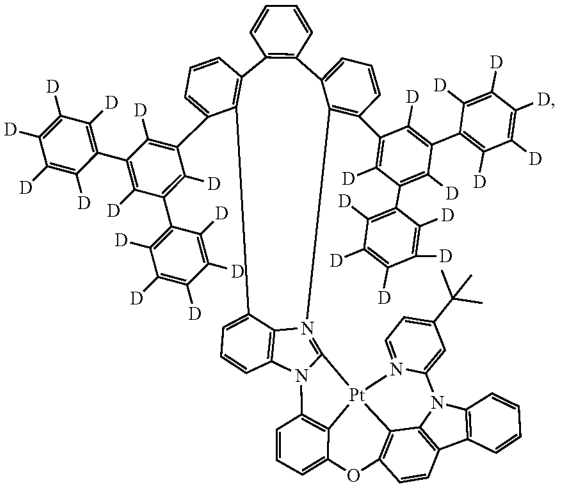
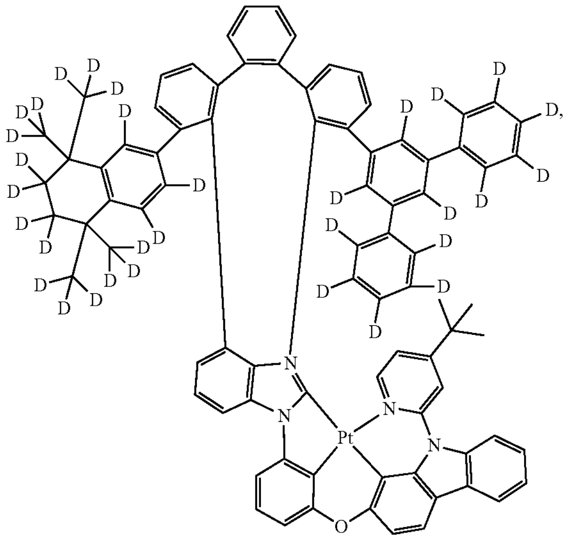

-continued
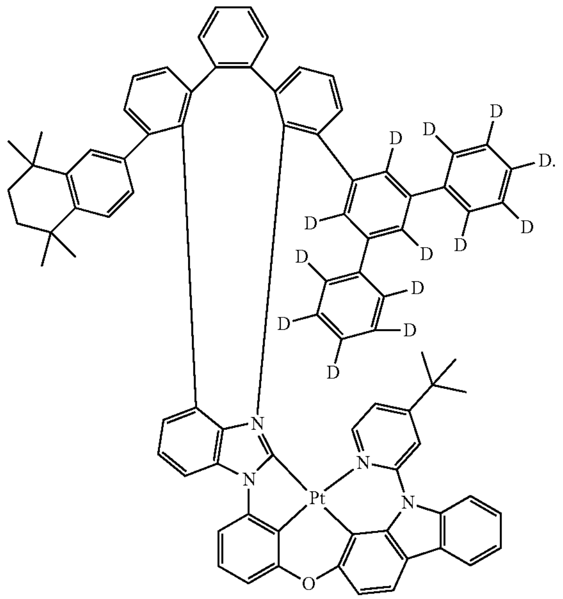
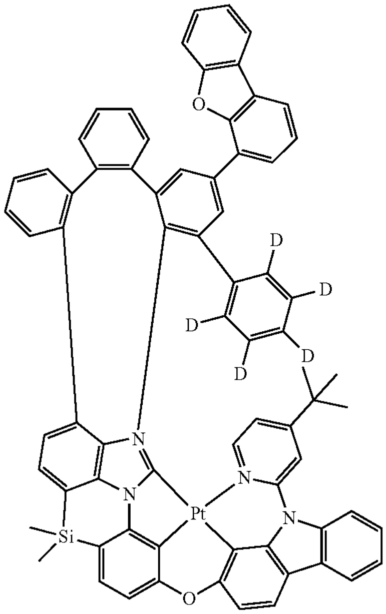
,
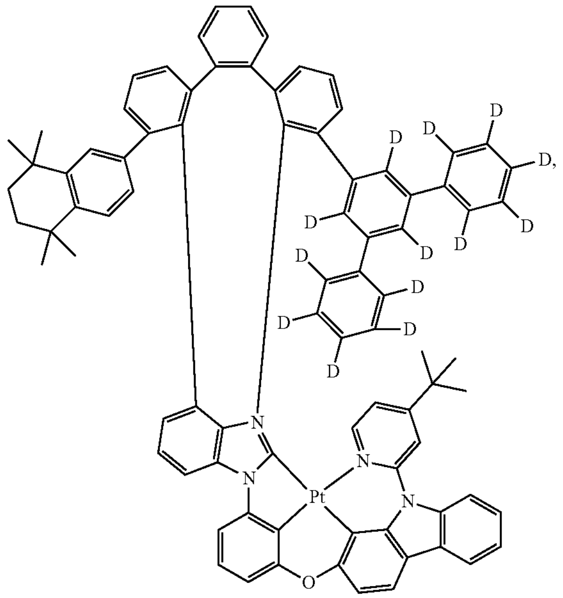
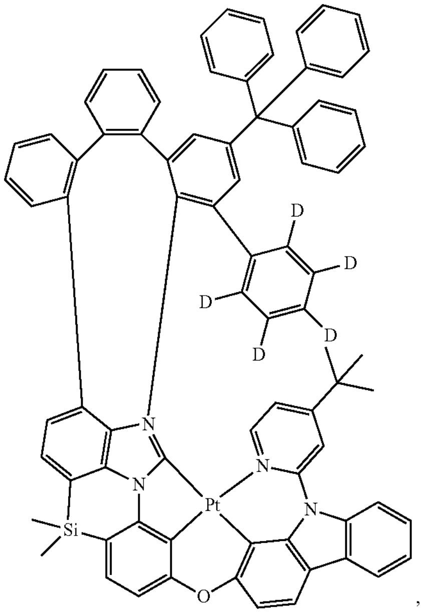
,

-continued
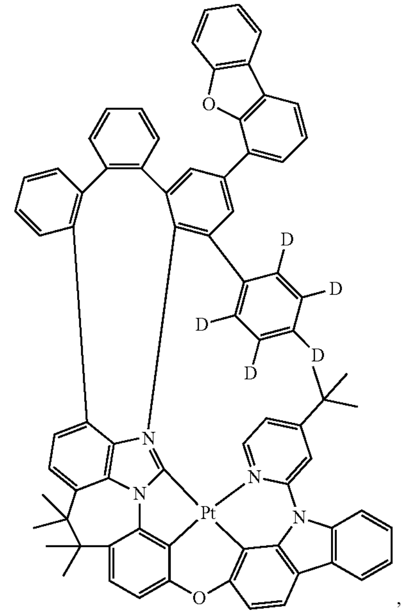
,
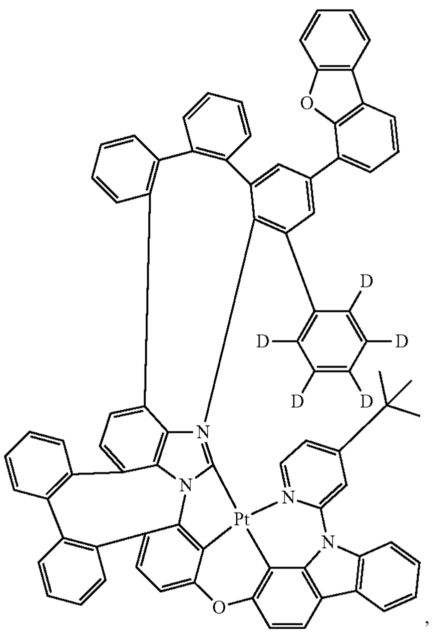
,
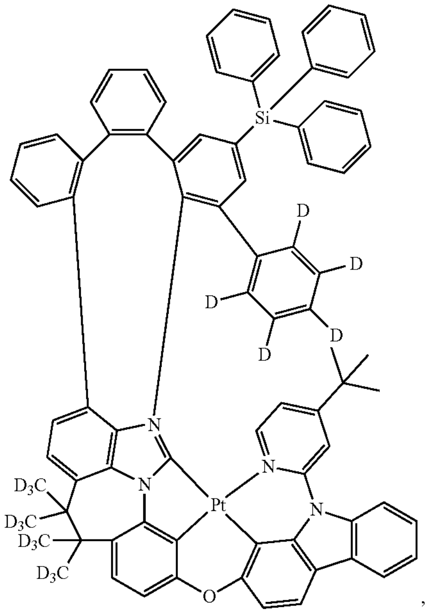
,
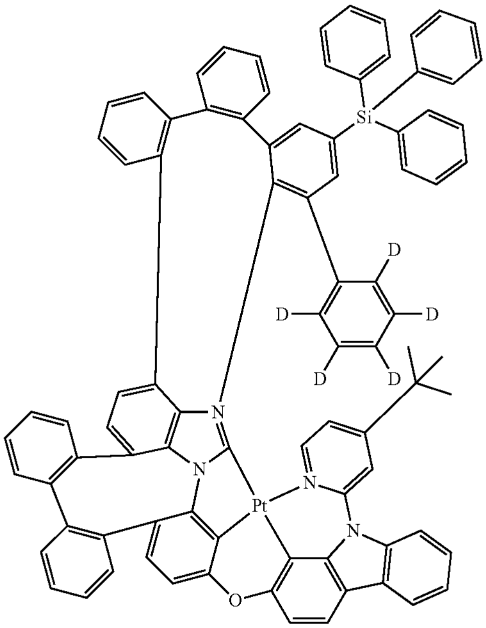
,

-continued
-continued
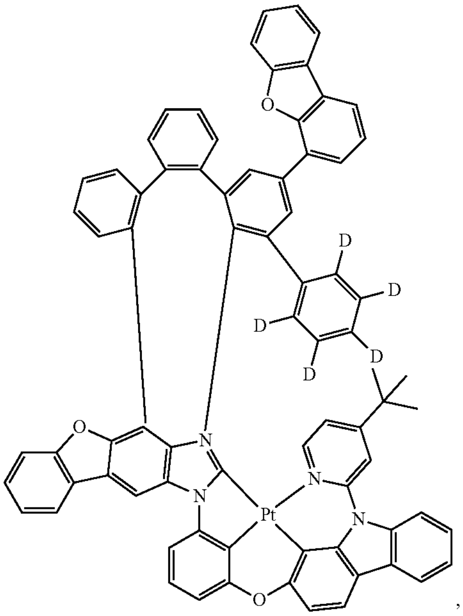
,
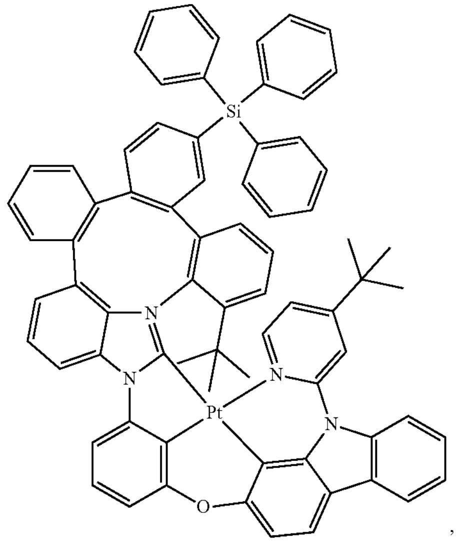
,
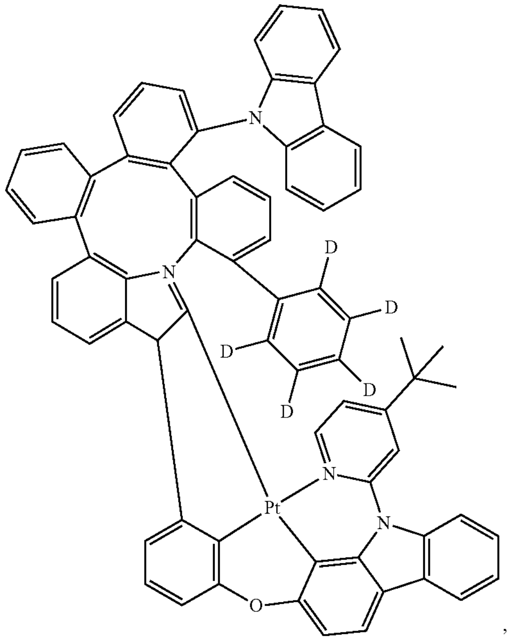
,
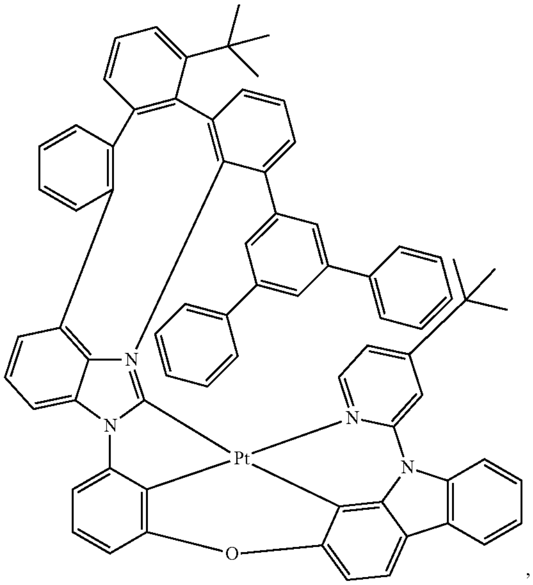
, -continued
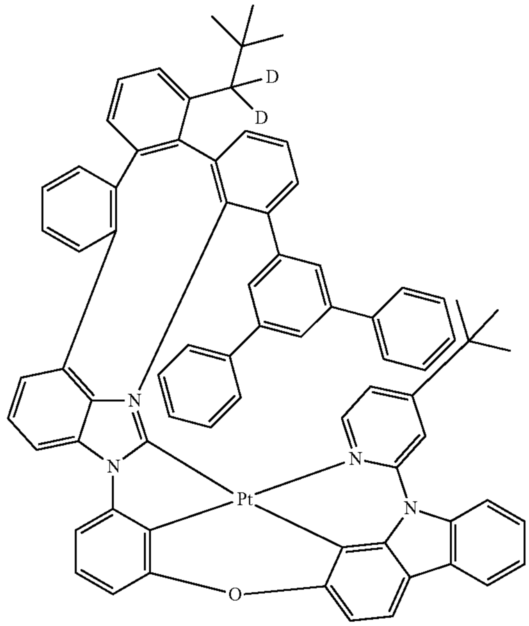
,
-continued
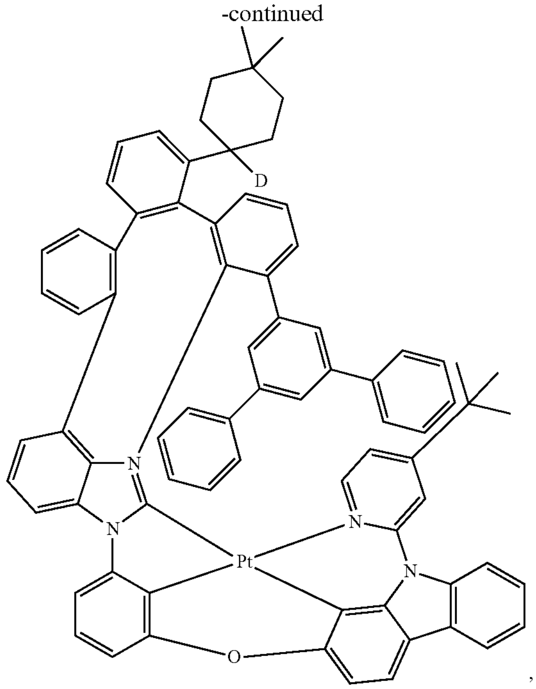
,
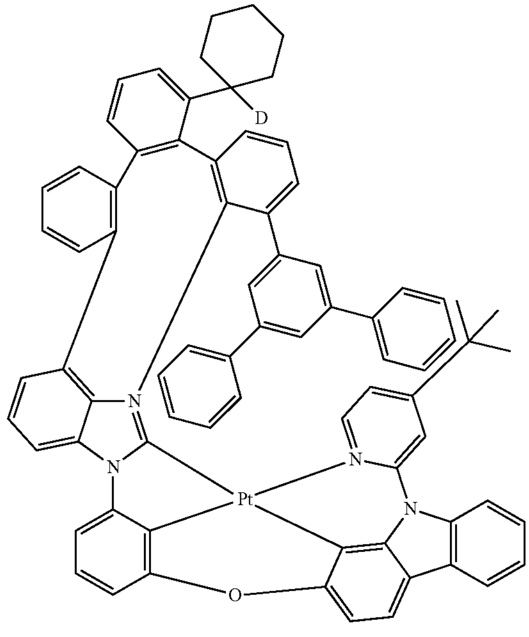
,
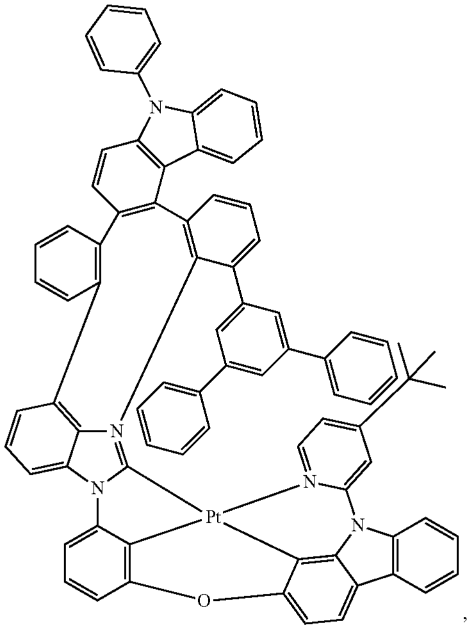
, -continued
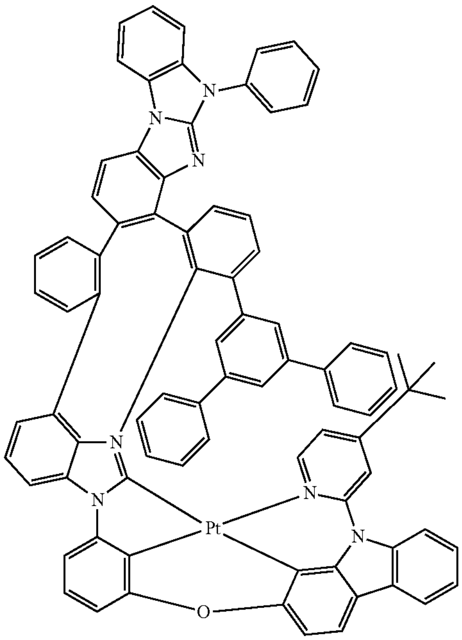
,
-continued
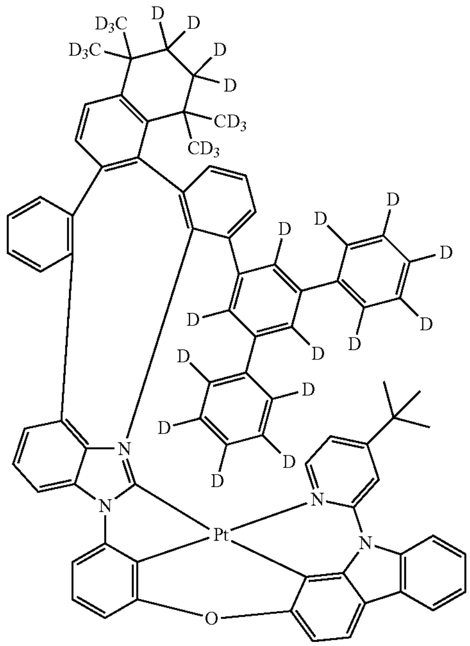
,
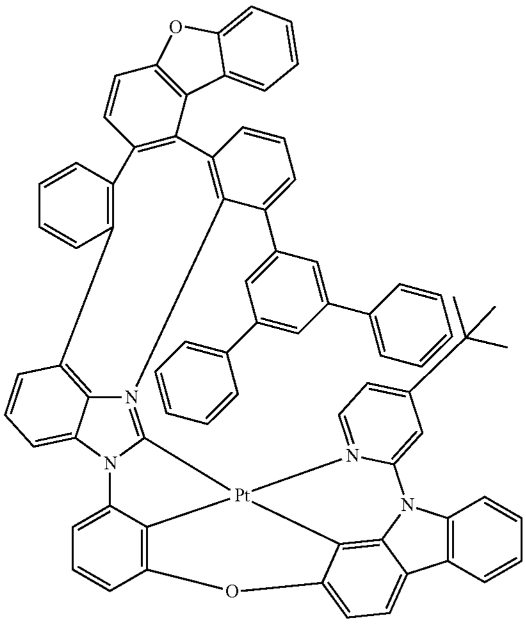
,
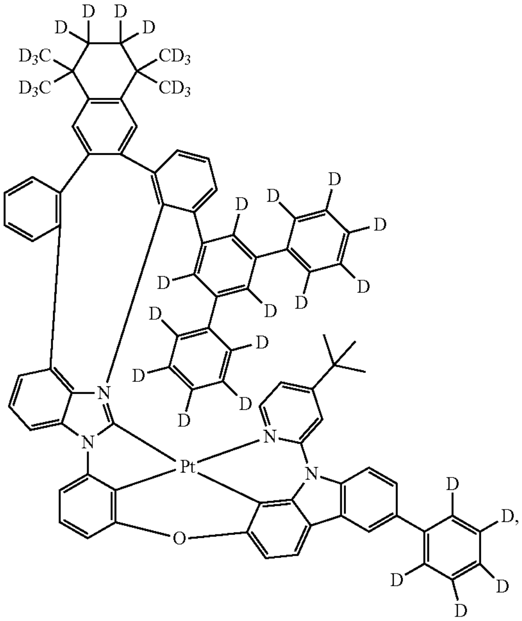
D, -continued
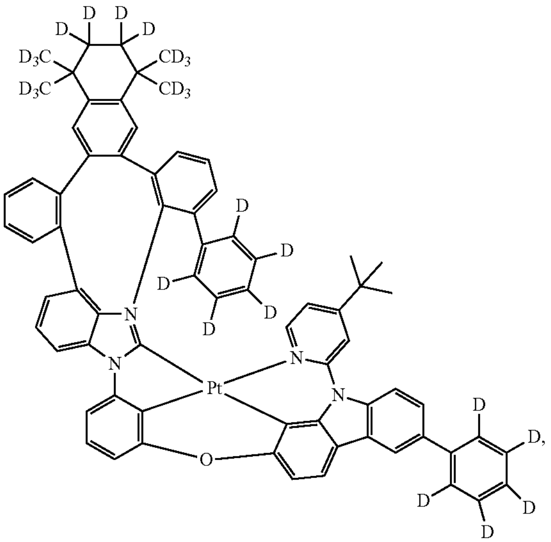
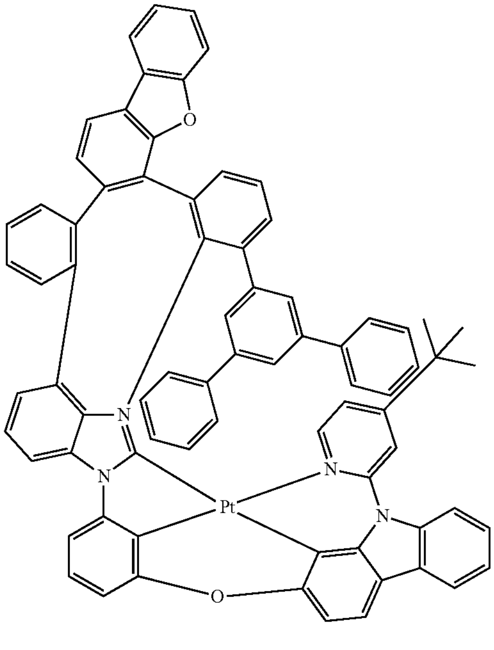
,
-continued
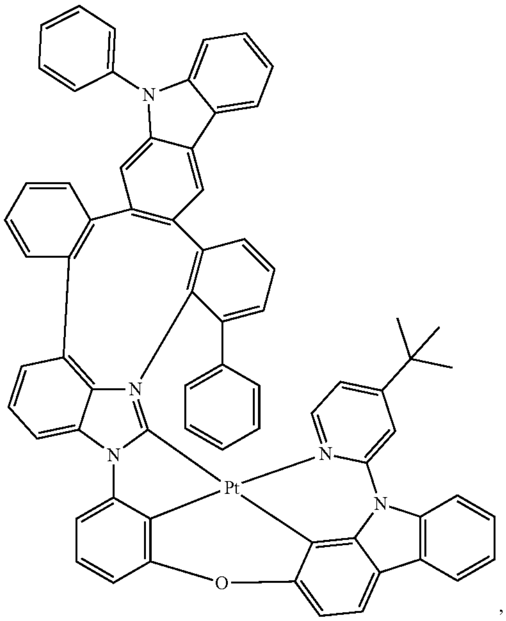
,
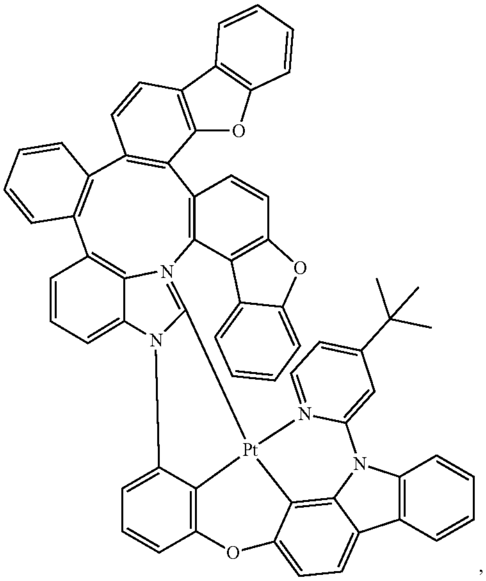
,
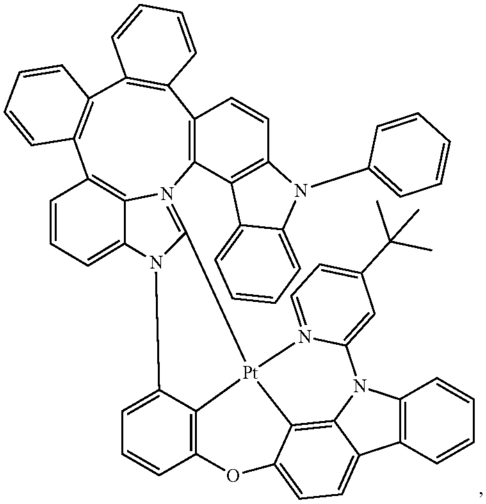
, -continued
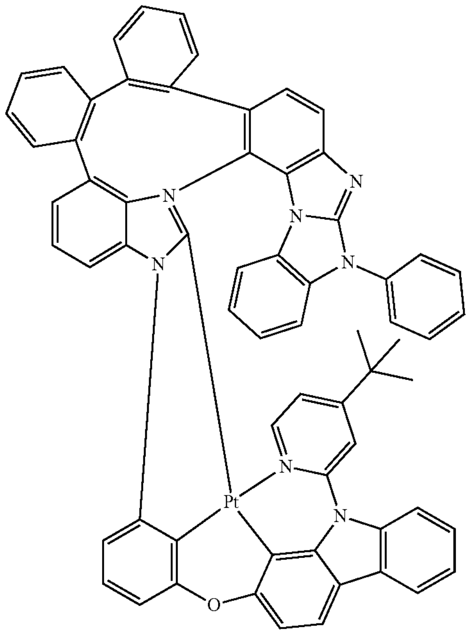
,
-continued
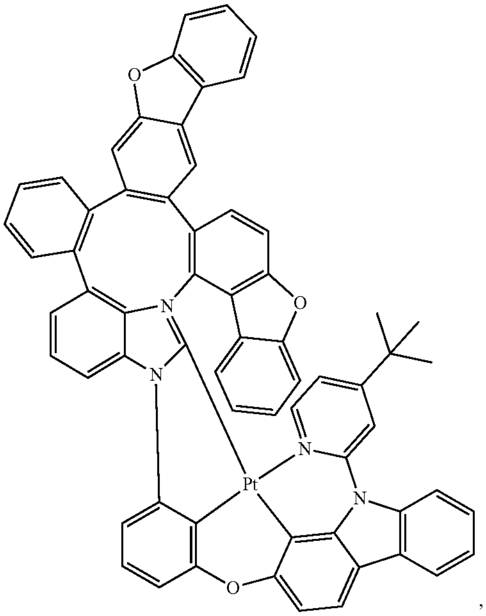
,
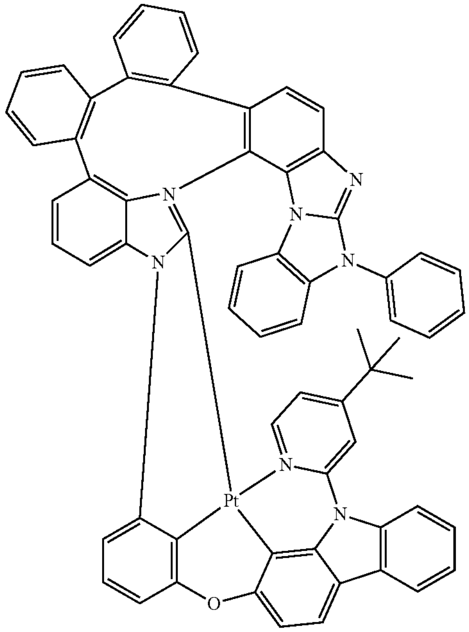
,
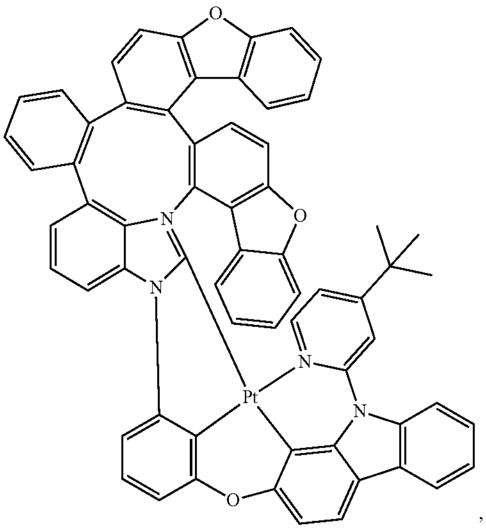
, -continued
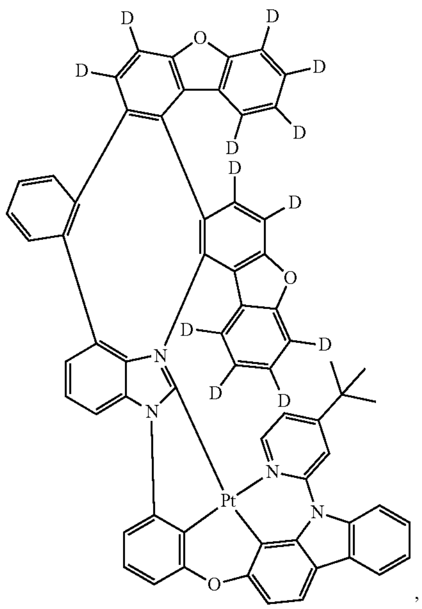
,
-continued
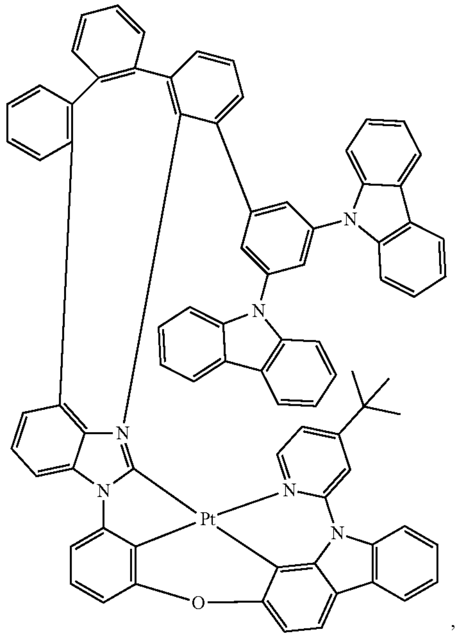
,
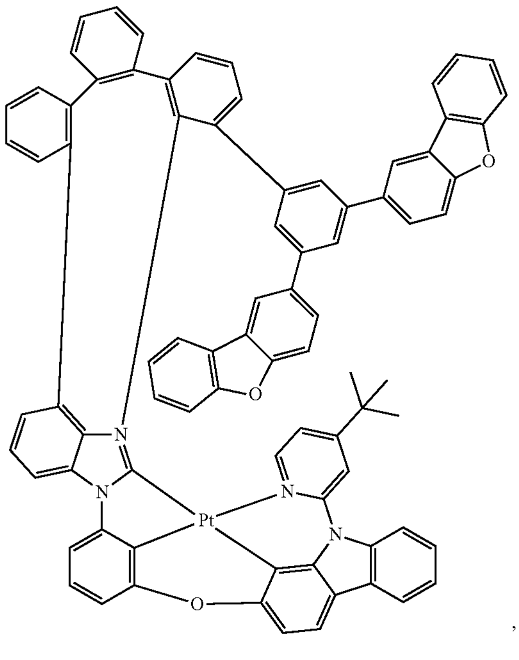
,
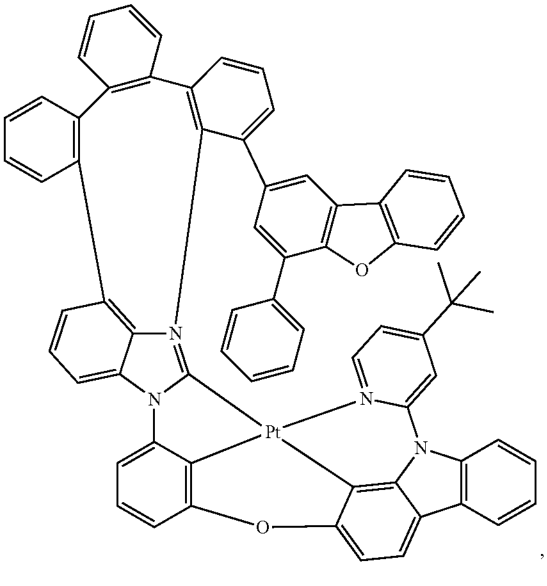
,

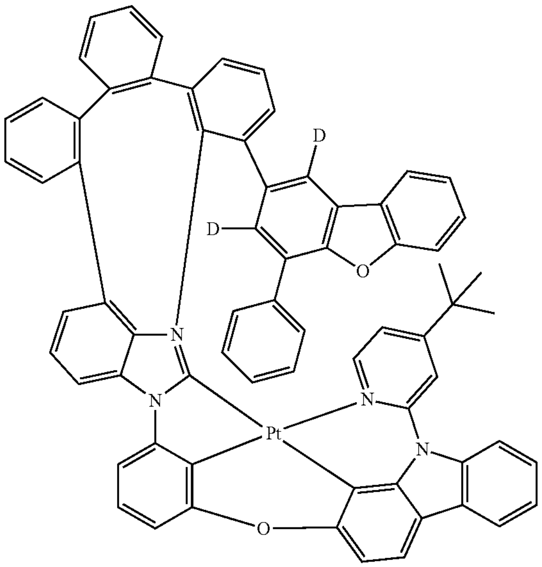
,
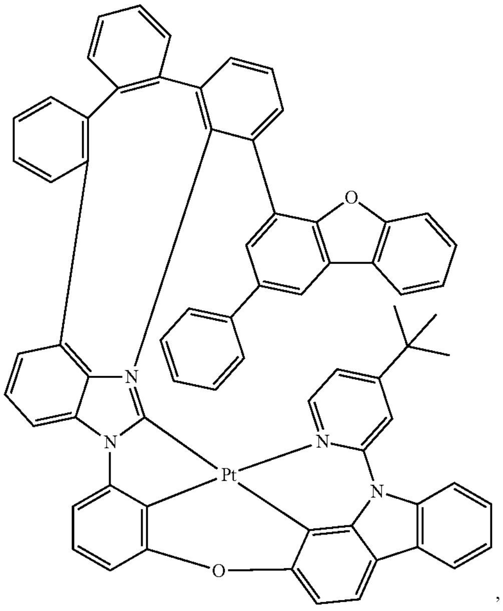
,
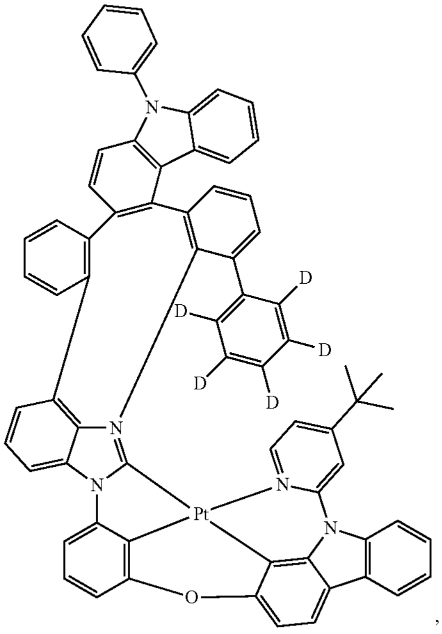
,
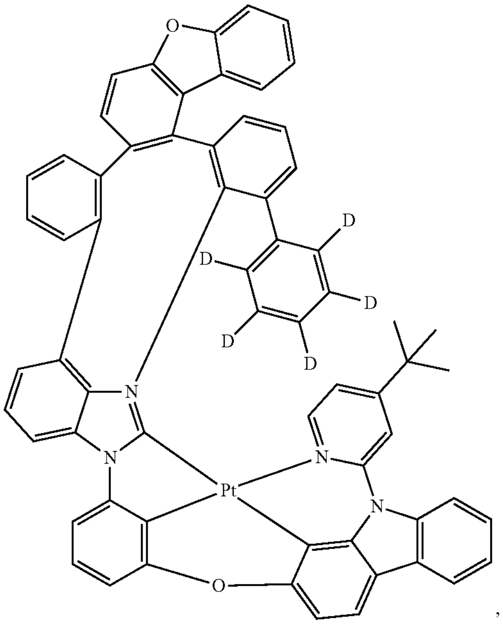
,

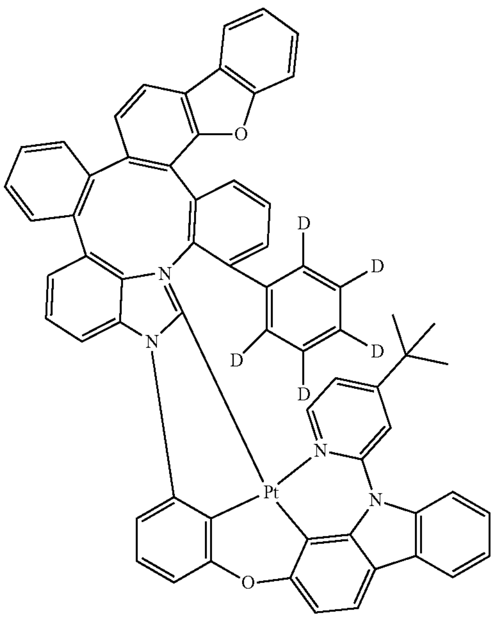
,
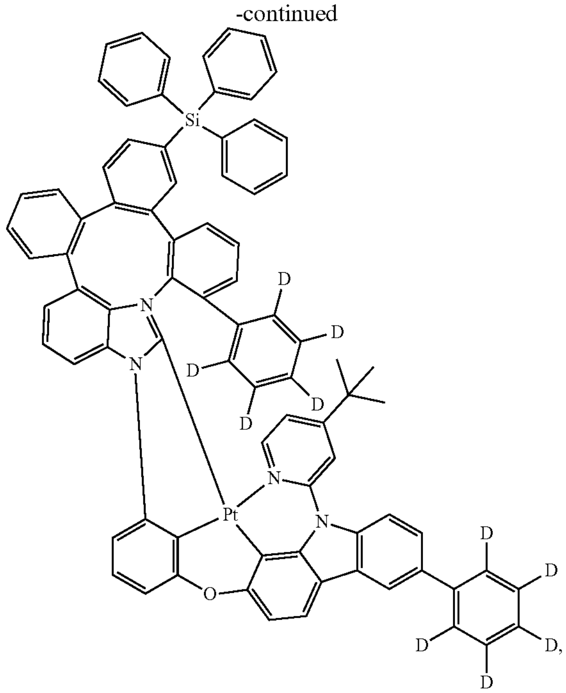
,
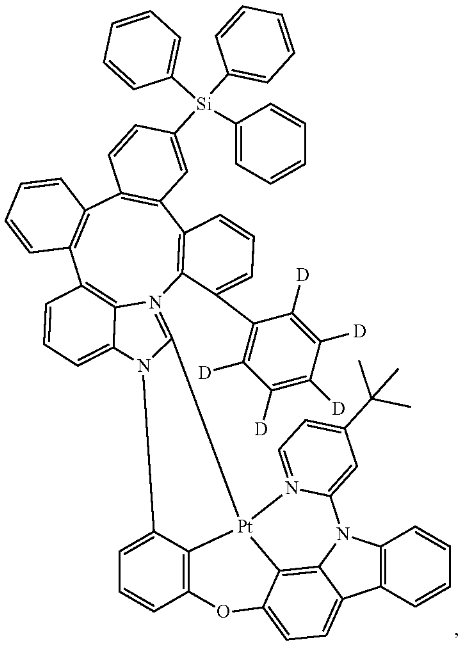
,
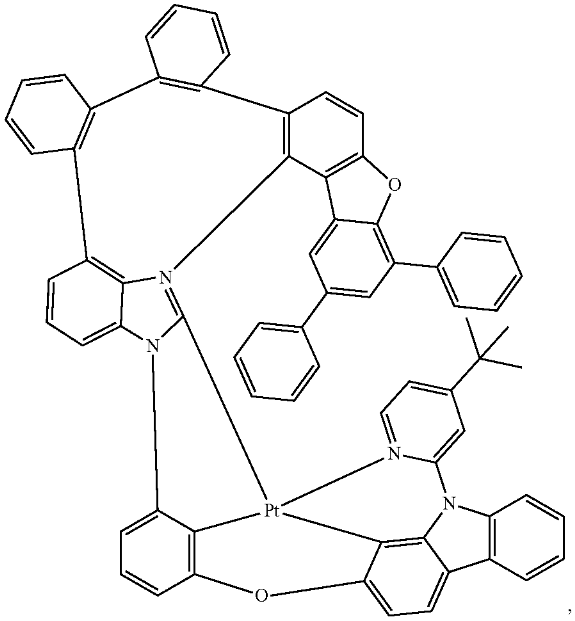
,

-continued
-continued
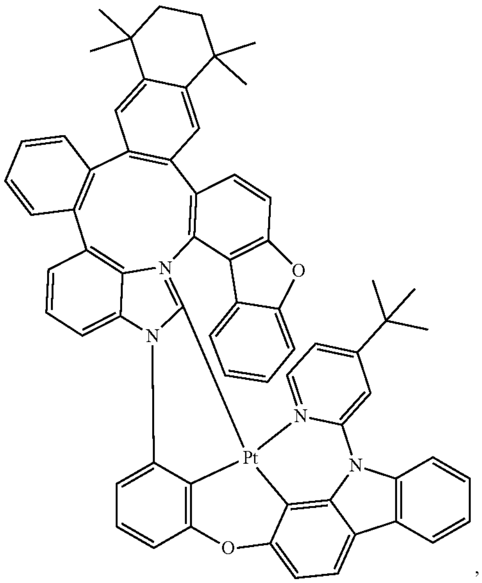
,
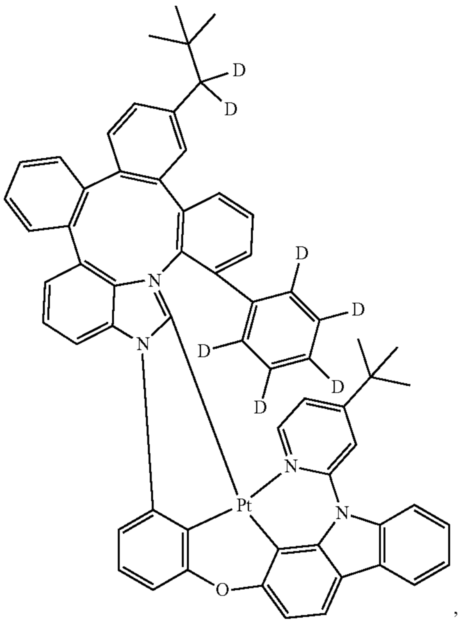
,
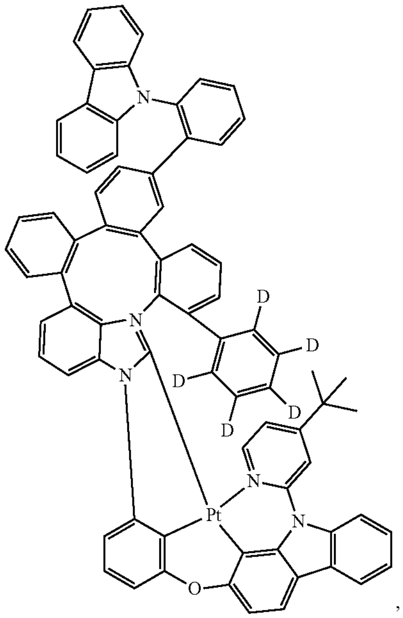
,
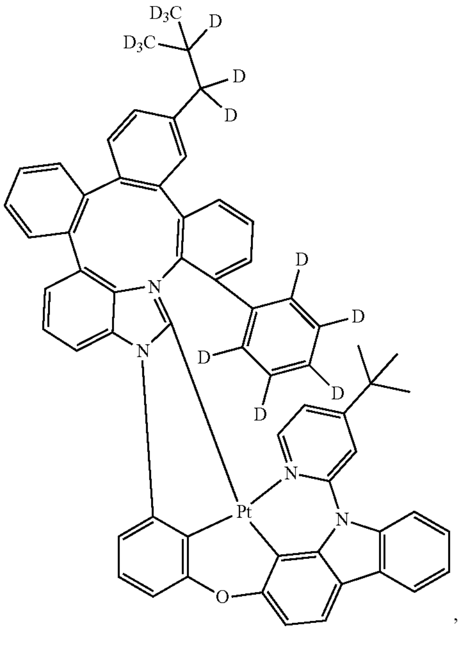
, -continued
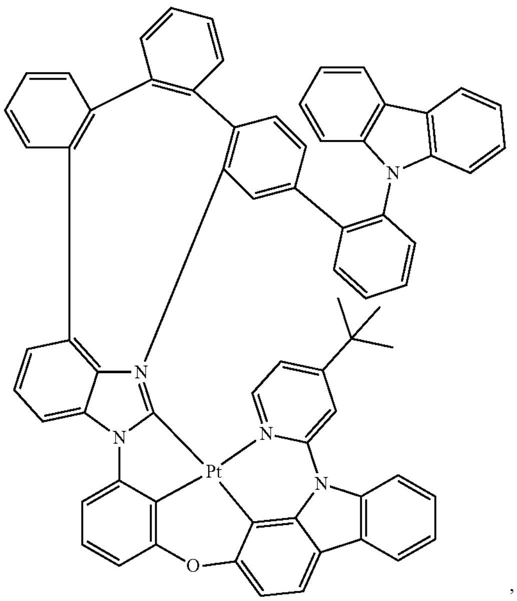
,
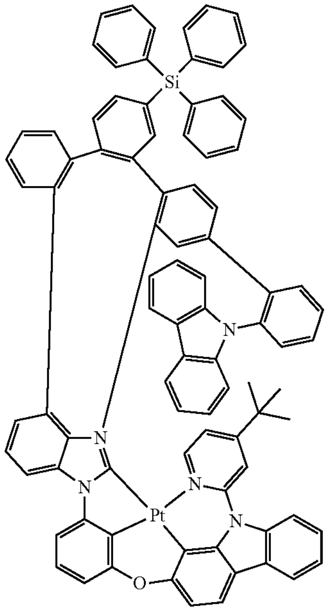
,
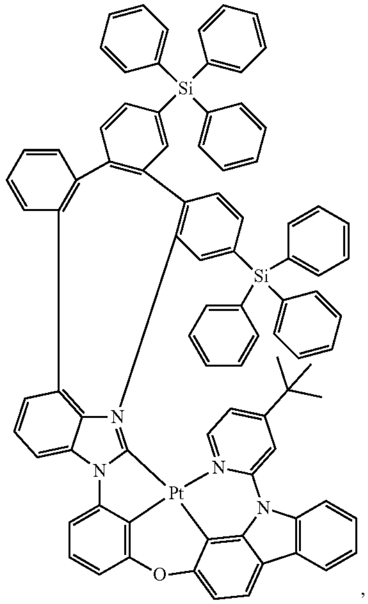
,
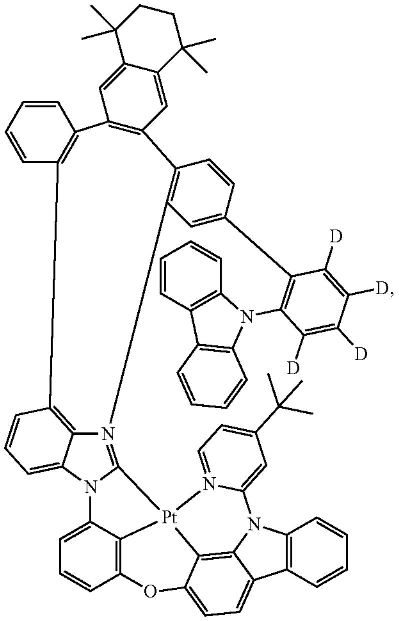
-continued -continued
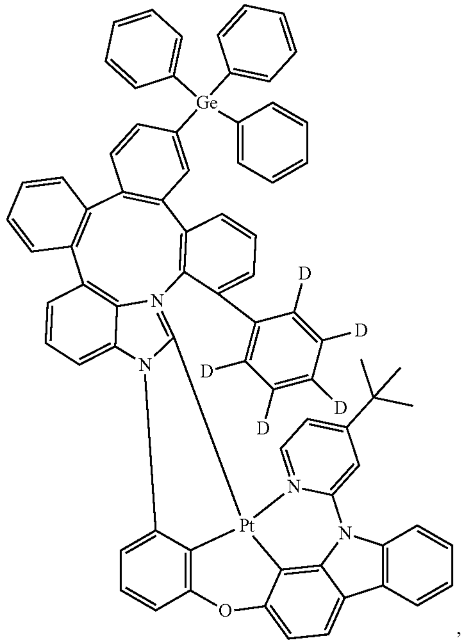
,
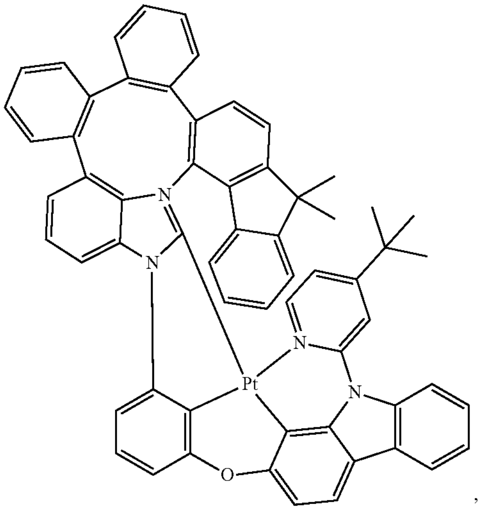
,
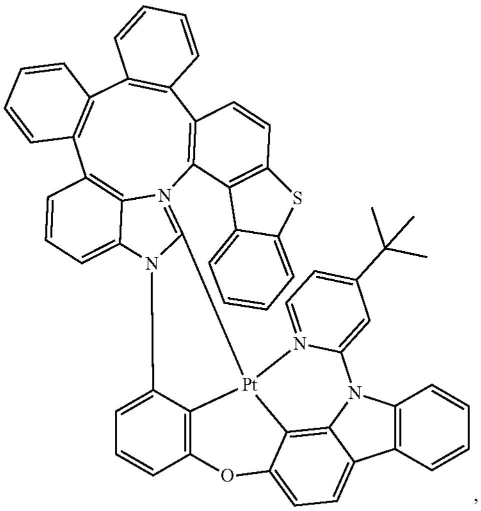
,
-continued
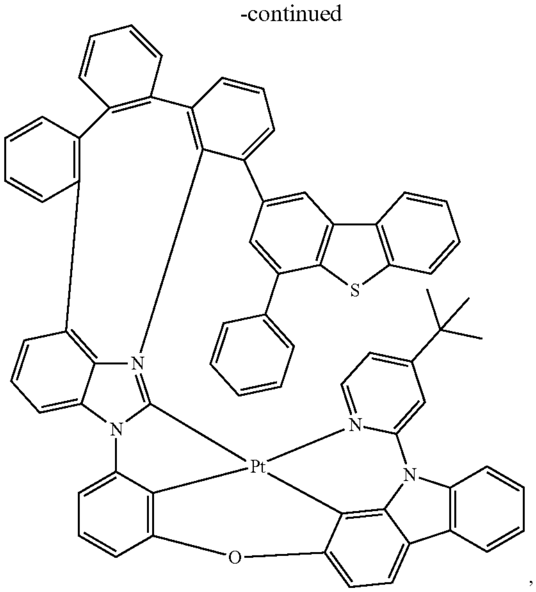
, and
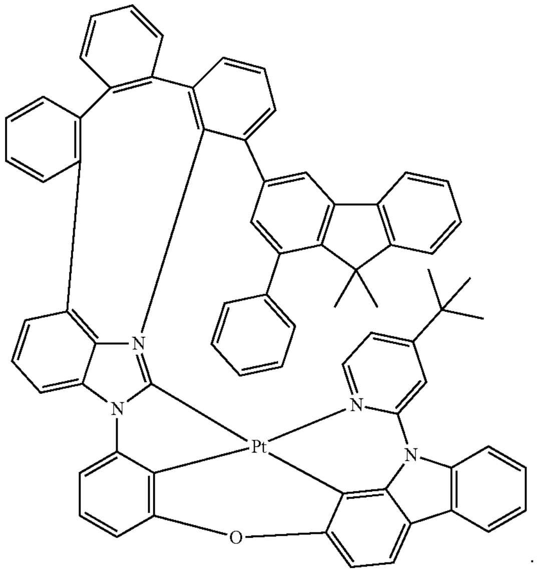
.
17. An organic light emitting device (OLED) comprising:
an anode;
a cathode; and
an organic layer disposed between the anode and the cathode,
wherein the organic layer comprises a compound comprising a ligand $L_A$ of Formula II

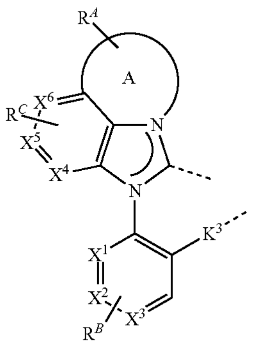

wherein:

ring A is independently a 5-membered to 10-membered heterocyclic ring;

$X^1$-$X^6$ are each independently C or N;

$K^3$ is a direct bond, O, or S;

$R^A$, $R^B$, and $R^C$ each independently represents zero, mono, or up to the maximum allowed number of substitutions to its associated ring; and each of $R^A$, $R^B$, $R^C$ is independently a hydrogen or a substituent selected from the group consisting of deuterium, halogen, alkyl, cycloalkyl, heteroalkyl, heterocycloalkyl, arylalkyl, alkoxy, aryloxy, amino, silyl, germyl, boryl, selenyl, alkenyl, cycloalkenyl, heteroalkenyl, alkynyl, aryl, heteroaryl, acyl, carboxylic acid, ether, ester, nitrile, isonitrile, sulfanyl, sulfinyl, sulfonyl, phosphino, and combinations thereof, wherein:

the ligand $L_A$ is complexed to a metal M through the two indicated dashed lines;

M is Ir, Rh, Re, Ru, Os, Pt, Pd, Ag, Au, or Cu and can be coordinated to other ligands;

the ligand $L_A$ can be joined with other ligands to form a tridentate, tetradentate, pentadentate, or hexadentate ligand; and any two $R^A$, $R^B$, $R^C$, or $R^1$ can be joined or fused to form a ring.

18. The OLED of claim 17, wherein the organic layer further comprises a host, wherein host comprises at least one chemical moiety selected from the group consisting of triphenylene, carbazole, indolocarbazole, dibenzothiophene, dibenzofuran, dibenzoselenophene, 5λ²-benzo[d]benzo[4,5]imidazo[3,2-a]imidazole, 5,9-dioxa-13b-boranaphtho[3,2,1-de]anthracene, triazine, aza-triphenylene, aza-carbazole, aza-indolocarbazole, aza-dibenzothiophene, aza-dibenzofuran, aza-dibenzoselenophene, aza-5λ²-benzo[d]benzo[4,5]imidazo[3,2-a]imidazole, and aza-(5,9-dioxa-13b-boranaphtho[3,2,1-de]anthracene).

19. The OLED of claim 17, wherein the compound is a sensitizer;

wherein the OLED further comprises an acceptor; and wherein the acceptor is a fluorescent emitter, a delayed fluorescence emitter, or a combination thereof.

20. A consumer product comprising an organic light-emitting device (OLED) comprising:

an anode;

a cathode; and an organic layer disposed between the anode and the cathode, wherein the organic layer comprises a compound comprising a ligand $L_A$ of Formula II

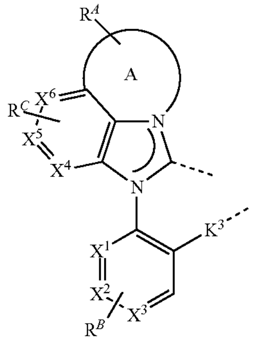

wherein:

ring A is independently a 5-membered to 10-membered heterocyclic ring;

$X^1$-$X^6$ are each independently C or N;

$K^3$ is a direct bond, O, or S;

$R^A$, $R^B$, and $R^C$ each independently represents zero, mono, or up to the maximum allowed number of substitutions to its associated ring; and each of $R^A$, $R^B$, $R^C$ is independently a hydrogen or a substituent selected from the group consisting of deuterium, halogen, alkyl, cycloalkyl, heteroalkyl, heterocycloalkyl, arylalkyl, alkoxy, aryloxy, amino, silyl, germyl, boryl, selenyl, alkenyl, cycloalkenyl, heteroalkenyl, alkynyl, aryl, heteroaryl, acyl, carboxylic acid, ether, ester, nitrile, isonitrile, sulfanyl, sulfinyl, sulfonyl, phosphino, and combinations thereof, wherein:

the ligand $L_A$ is complexed to a metal M through the two indicated dashed lines;

M is Ir, Rh, Re, Ru, Os, Pt, Pd, Ag, Au, or Cu, and can be coordinated to other ligands;

the ligand $L_A$ can be joined with other ligands to form a tridentate, tetradentate, pentadentate, or hexadentate ligand; and any two $R^A$, $R^B$, $R^C$, or $R^1$ can be joined or fused to form a ring.

* * * * *